US012108671B2

(12) United States Patent
Lee et al.

(10) Patent No.: US 12,108,671 B2
(45) Date of Patent: Oct. 1, 2024

(54) ORGANIC ELECTRIC ELEMENT COMPRISING A PLURALITY OF EMISSION-AUXILIARY LAYERS AND ELECTRONIC DEVICE COMPRISING IT

(71) Applicant: DUK SAN NEOLUX CO., LTD., Chungcheongnam-do (KR)

(72) Inventors: Bum Sung Lee, Chungcheongnam-do (KR); Hyun Ji Oh, Chungcheongnam-do (KR); Soung Yun Mun, Chungcheongnam-do (KR); Sun Hee Lee, Chungcheongnam-do (KR); Won Sam Kim, Chungcheongnam-do (KR); Guang Ming Li, Chungcheongnam-do (KR); Min Ji Jo, Chungcheongnam-do (KR)

(73) Assignee: DUK SAN NEOLUX CO., LTD., Chungcheongnam-do (KR)

( * ) Notice: Subject to any disclaimer, the term of this patent is extended or adjusted under 35 U.S.C. 154(b) by 2 days.

(21) Appl. No.: 17/773,732

(22) PCT Filed: Oct. 27, 2020

(86) PCT No.: PCT/KR2020/014745

§ 371 (c)(1),
(2) Date: May 2, 2022

(87) PCT Pub. No.: WO2021/085982

PCT Pub. Date: May 6, 2021

(65) Prior Publication Data

US 2023/0009845 A1 Jan. 12, 2023

(30) Foreign Application Priority Data

Nov. 1, 2019 (KR) ........................ 10-2019-0138801
Oct. 23, 2020 (KR) ........................ 10-2020-0138278

(51) Int. Cl.
*H10K 85/60* (2023.01)
*H10K 50/11* (2023.01)
(Continued)

(52) U.S. Cl.
CPC ....... *H10K 85/6576* (2023.02); *H10K 85/657* (2023.02); *H10K 85/6572* (2023.02);
(Continued)

(58) Field of Classification Search
CPC .... H10K 50/131; H10K 50/18; H10K 50/181; H10K 50/156; H10K 2101/40
See application file for complete search history.

(56) References Cited

U.S. PATENT DOCUMENTS

2011/0073844 A1* 3/2011 Pieh ..................... H10K 50/125 257/40
2016/0204370 A1* 7/2016 Park ....................... H10K 50/11 438/46
2021/0202844 A1* 7/2021 Hur ....................... C07F 7/0812

FOREIGN PATENT DOCUMENTS

KR 10-2013-0039671 A 4/2013
KR 10-2014-0001581 A 1/2014
KR 10-2014-0073458 A 6/2014
KR 10-2015-0023174 A 3/2015
(Continued)

OTHER PUBLICATIONS

Perumal et al., Adv. Mater. 2015, 27, 93-100.*
(Continued)

*Primary Examiner* — Vu A Nguyen
(74) *Attorney, Agent, or Firm* — The PL Law Group, PLLC

(57) ABSTRACT

An organic electric element according to an embodiment of the present disclosure includes a first electrode, a second electrode, and an organic material layer formed between the first electrode and the second electrode. The organic material layer includes a plurality of emission-auxiliary layers, and
(Continued)

the HOMO energy levels of the plurality of emission-auxiliary layers are limited to specific conditions in relation to the neighboring organic material layers, thereby the driving voltage, the luminous efficiency and the life time of the organic electric element can be improved.

21 Claims, 1 Drawing Sheet

(51) Int. Cl.

| | |
|---|---|
| ***H10K 50/13*** | (2023.01) |
| ***H10K 101/30*** | (2023.01) |
| ***H10K 101/40*** | (2023.01) |
| ***H10K 102/00*** | (2023.01) |

(52) U.S. Cl.

CPC ......... *H10K 85/6574* (2023.02); *H10K 50/11* (2023.02); *H10K 50/13* (2023.02); *H10K 2101/30* (2023.02); *H10K 2101/40* (2023.02); *H10K 2102/351* (2023.02)

(56) References Cited

FOREIGN PATENT DOCUMENTS

| | | | |
|---|---|---|---|
| KR | 10-2016-0037778 | A | 4/2016 |
| KR | 10-1614739 | B1 | 4/2016 |
| KR | 10-2016-0053561 | A | 5/2016 |
| KR | 10-2016-0059602 | A | 5/2016 |
| KR | 10-2016-0087991 | A | 7/2016 |
| KR | 10-2017-0112913 | A | 10/2017 |
| KR | 10-1786749 | B1 | 10/2017 |
| KR | 10-2018-0017901 | A | 2/2018 |
| KR | 10-2019-0078040 | A | 7/2019 |
| WO | WO 2016/072691 | A1 | 5/2016 |
| WO | WO 2017/123008 | A1 | 7/2017 |

OTHER PUBLICATIONS

Ossila's CBP Product Data available at https://www.ossila.com/en-us/products/cbp (Year: 2023).*

Lundberg et al., Nature Communications (2019) 10:5307.*

International Search Report for PCT/KR2020/014745 mailed on Feb. 24, 2021.

* cited by examiner

ORGANIC ELECTRIC ELEMENT COMPRISING A PLURALITY OF EMISSION-AUXILIARY LAYERS AND ELECTRONIC DEVICE COMPRISING IT

CROSS-REFERENCE TO RELATED APPLICATION AND CLAIM OF PRIORITY

This application claims benefit under 35 U.S.C. 119, 120, 121, or 365(c), and is a National Stage entry from International Application No. PCT/KR2020/014745, filed Oct. 27, 2020, which claims priority to the benefit of Korean Patent Application Nos. 10-2019-0138801 filed on Nov. 1, 2019 and 10-2020-0138278 filed on Oct. 23, 2020 in the Korean Intellectual Property Office, the entire contents of which are incorporated herein by reference.

BACKGROUND

1. Technical Field

The present invention relates to an organic electric device comprising a plurality of emission-auxiliary layers and an electronic device including the same, and more particularly, to an organic electric element comprising a plurality of emission-auxiliary layers having the highest occupied molecular orbital (HOMO) energy level lower than that of a hole transport layer and higher than that of a light-emitting layer, and an electronic device including the same.

2. Background Art

In general, an organic light emitting phenomenon refers to a phenomenon in which electric energy is converted into light energy of an organic material. An organic electric element utilizing the organic light emitting phenomenon usually has a structure including an anode, a cathode, and an organic material layer interposed therebetween. In many cases, the organic material layer has a multi-layered structure having respectively different materials in order to improve efficiency and stability of an organic electric element, and for example, may include a hole injection layer, a hole transport layer, a light-emitting layer, an electron transport layer, an electron injection layer, or the like.

In general, an electron is transferred from an electron transport layer to a light-emitting layer and a hole is transferred from a hole transport layer to the light-emitting layer, as a result, an exciton is formed by the recombination of the electron and hole.

However, the material used for the hole transport layer has a low HOMO value and therefore has a low T1 value. As a result, the exciton generated in the light-emitting layer is transferred to the hole transport layer, resulting in a charge unbalance in the light-emitting layer and there is a problem in that light is emitted at the interface of the hole transport layer.

Therefore, in order to solve the problem of light emission from a hole transport layer, an organic electric element that has a plurality of hole transport layers or an emission-auxiliary layer formed between a hole transport layer and a light-emitting layer has been proposed.

Korean Patent Publication Nos. 10-2014-0001581 and 10-2015-0023174 disclose an organic electric element including a hole transport layer of a multilayer structure. Such organic electric elements are intended to improve hole injection characteristics by doping a p-type doping material in a hole transport layer having one type of hole transporting material or by mixing a hole injection material with high conductivity to reduce the driving voltage of the element.

However, in this method, although the driving voltage of the device is reduced, the lifetime of the device is reduced and the hole transporting material is easily degraded by electrons injected into the device since a high-conductivity hole-transporting material is used and charge is injected excessively. As a result, light emission occurs near the interface between a hole transport layer and a light-emitting layer, and non-emission quenching increases, so that the efficiency and lifespan of the device are still deteriorated.

SUMMARY

Therefore, the present invention is to solve the problems of the prior art, an object of the present invention is to provide an organic electric element having the improved luminous efficiency and lifetime by forming a plurality of emission-auxiliary layers having a predetermined thickness between a hole transport layer and a light-emitting layer, and by appropriately adjusting the HOMO energy level of the emission-auxiliary layers in consideration of the HOMO energy level of the adjacent organic material layer without using a p-type doping material when forming a plurality of emission-auxiliary layers, and an electronic device including the same.

In one aspect of the present invention, the present invention provides an organic electric element comprising a plurality of emission-auxiliary layers having a predetermined thickness, wherein the plurality of emission-auxiliary layers have the HOMO energy level lower than the HOMO energy level of a hole transport layer and higher than the HOMO energy level of a light-emitting layer.

In another aspect of the present invention, the present invention provides an electronic device comprising the organic electric element.

According to the present invention, even if each of emission-auxiliary layers is formed using only a single material without using a p-type doping material, it is possible to provide an organic electric element having the improved stability, luminous efficiency and lifetime without non-luminous quenching, and an electronic device including the same by forming a plurality of emission-auxiliary layers having a predetermined thickness between a hole transport layer and a light-emitting layer and by adjusting the energy level so that the HOMO energy level of the emission-auxiliary layers are lower than the HOMO energy level of a hole transport layer and higher than the HOMO energy level of a light-emitting layer.

DETAILED DESCRIPTION

Figure 1:
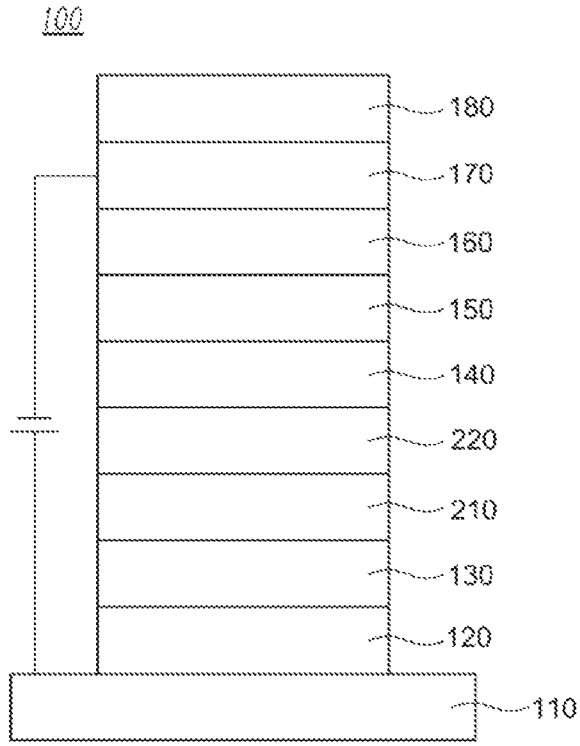
FIG. 1 is a schematic configuration diagram of an organic electric device according to an embodiment of the present invention.

Hereinafter, the present invention will be described with reference to the accompanying drawings.

In the reference numbers assigned to the components of each drawing, it should be noted that the same elements will be designated by the same reference numerals although they are shown in different drawings. In addition, in the following description of the present invention, a detailed description of known functions and configurations incorporated herein will be omitted when it may make the subject matter of the present invention rather unclear.

In describing the components of the present invention, terms such as first, second, A, B, (a), (b) or the like may be used. Each of these terminologies is not used for defining an essence, order or sequence of a corresponding component but used merely to distinguish the corresponding component from other component(s). It will be understood that the expression "one component is "connected," "coupled" or "joined" to another component" comprises the case where a third component may be "connected," "coupled," and "joined" between the first and second components as well as the case where the first component may be directly connected, coupled or joined to the second component.

In addition, it will be understood that when an element such as a layer, film, region or substrate is referred to as being "on" or "over" another element, it can be directly on the other element or intervening elements may also be present. In contrast, when an element is referred to as being "directly on" another element, there are no intervening elements present.

Unless otherwise stated, the term "aryl group" and "arylene group" as used herein has, but not limited to, 6 to 60 carbon atoms. The aryl group or arylene group in the present invention may comprise a monocyclic ring, ring assemblies, a fused polycyclic system, spiro compounds and the like. In addition, unless otherwise stated, a fluorenyl group may be comprised in an aryl group and a fluorenylene group may be comprised in an arylene group.

As used herein, the term "fluorenyl group" refers to a substituted or unsubstituted fluorenyl group, "fluorenylene group" refers to a substituted or unsubstituted fluorenyl group. The fluorenyl group or fluorenylene group used in the present invention comprises a spiro compound formed by combining R and R' with each other in the following structure, and also comprises compound formed by linking adjacent R"s to each other. "Substituted fluorenyl group", "substituted fluorenylene group" means that at least one of R, R', R" in the following structure is a substituent other than hydrogen, and R" may be 1 to 8 in the following formula. In the present specification, regardless of the valence, a fluorenyl group, a fluorenylene group, a fluorenetriyl group, and the like may all be referred to as a fluorene group.

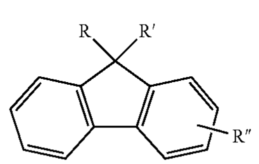

The term "spiro compound" as used herein has a spiro union which means union having one atom as the only common member of two rings. The common atom is designated as 'spiro atom'. The compounds are defined as 'monospiro-', 'dispiro-' or 'trispiro-' depending on the number of spiro atoms in one compound.

The term "heterocyclic group" used in the specification comprises a non-aromatic ring as well as an aromatic ring like "heteroaryl group" or "heteroarylene group". Unless otherwise stated, the term "heterocyclic group" means, but not limited to, a ring containing one or more heteroatoms and having 2 to 60 carbon atoms. Unless otherwise stated, the term "heteroatom" as used herein represents N, O, S, P or Si and the heterocyclic group means a monocyclic, ring assemblies, fused polycyclic system or spiro compound containing a heteroatom. In addition, heterocyclic group comprises the compound comprising the heteroatom group such as $SO_2$, P═O and the like instead of carbon forming a ring like the following compound.

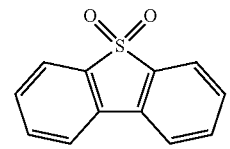 [SMILES: O=S1(=O)c2ccccc2-c2ccccc21]

The term "aliphatic ring group" as used herein refers to a cyclic hydrocarbon except for aromatic hydrocarbons, and comprises a monocyclic ring, ring assemblies, a fused polycyclic system, spiro compounds, and the like, and unless otherwise specified, it means a ring of 3 to 60 carbon atoms, but not limited thereto. For example, a fused ring formed by benzene being an aromatic ring with cyclohexane being a non-aromatic ring corresponds to aliphatic ring group.

In this specification, a 'group name' corresponding to an aryl group, an arylene group, a heterocyclic group, and the like exemplified for each symbol and its substituent may be written in the name of functional group reflecting the valence, and may also be described as the name of a parent compound. For example, in the case of phenanthrene which is a kind of aryl group, it may be described by distinguishing valence such as 'phenanthryl (group)' when it is 'monovalent group', and as 'phenanthrylene (group)' when it is 'divalent group', and it may also be described as a parent compound name, 'phenanthrene', regardless of its valence. Similarly, in the case of pyrimidine, it may be described as 'pyrimidine' regardless of its valence, and it may also be described as the name of corresponding functional group such as pyrimidinyl (group) when it is 'monovalent group', and as 'pyrimidylene (group)' when it is 'divalent group'.

In addition, in the present specification, the numbers and alphabets indicating a position may be omitted when describing a compound name or a substituent name, For example, pyrido[4,3-d]pyrimidine, benzopuro[2,3-d]pyrimidine and 9,9-dimethyl-9H-fluorene can be described as pyridopyrimidine, benzofurropyrimidine and dimethylfluorene, respectively. Therefore, both benzo[g]quinoxaline and benzo[f]quinoxaline can be described as benzoquinoxaline.

In addition, unless otherwise expressed, where any formula of the present invention is represented by the following formula, the substituent according to the index may be defined as follows.

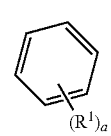

In the above formula, when a is an integer of zero, the substituent $R^1$ is absent, that is, hydrogen atoms are bonded to all the carbon constituting the benzene ring. Here, chemical formulas or compounds may be written without explicitly describing the hydrogen. In addition, one substituent $R^1$ is bonded to any carbon of the carbons forming the benzene ring when "a" is an integer of 1, when "a" is an integer of 2 or 3, substituents $R^1$s may be bonded to the carbon of the benzene ring, for example, as followings and, when "a" is an integer of 4 to 6, substituents $R^1$s are bonded to the carbon of the benzene ring in a similar manner. Further, when "a" is an integer of 2 or more, $R^1$s may be the same or different from each other.

(a = 2)

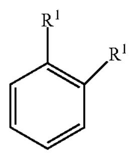

(a = 3)

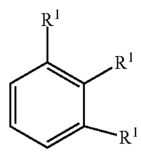

In addition, unless otherwise specified in the present specification, when referring to a condensed/fused ring, the number in the 'number-condensed/fused ring' indicates the number of condensed/fused rings. For example, a form in which three rings are condensed/fused with each other, such as anthracene, phenanthrene, and benzoquinazoline, may be represented by a 3-condensed/fused ring.

In addition, unless otherwise described herein, in the case of expressing a ring in the form of a 'number-membered' such as a 5-membered ring or a 6-membered ring, the number in the 'number-membered' represents the number of atoms forming the ring. For example, thiophene or furan may correspond to a 5-membered ring, and benzene or pyridine may correspond to a 6-membered ring.

In addition, unless otherwise specified in the present specification, the ring formed by bonding between adjacent groups may be selected from the group consisting of a $C_6$-$C_{60}$ aromatic ring group, a fluorenyl group, a $C_2$-$C_{60}$ heterocyclic group containing at least one heteroatom selected from the group consisting of O, N, S, Si, and P, and a $C_3$-$C_{60}$ aliphatic ring.

Unless otherwise stated, the term "between adjacent groups", for example, in case of the following Formulas, comprises not only "between $R_1$ and $R_2$", "between $R_2$ and $R_3$", "between $R_3$ and $R_4$", "between $R_5$ and $R_6$", but also "between $R_7$ and $R_8$" sharing one carbon, and may comprise "between substituents" attached to atom (carbon or nitrogen) consisting different ring, such as "between $R_1$ and $R_7$", "between $R_1$ and $R_8$", or "between $R_4$ and $R_5$" and the like. That is, where there are substituents bonded to adjacent elements constituting the same ring, the substituents may be correspond "adjacent groups", and even if there are no adjacent substituents on the same ring, substituents attached to the neighboring ring may correspond to "adjacent groups".

In the following Formula, when the substituents bonded to the same carbon, such as $R_7$ and $R_8$, are linked to each other to form a ring, a compound containing a spiro-moiety may be formed.

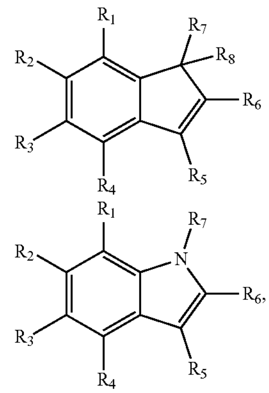

In addition, in the present specification, the expression 'neighboring groups may be linked to each other to form a ring' is used in the same sense as 'neighboring groups are linked selectively to each other to form a ring', and a case where at least one pair of neighboring groups may be bonded to each other to form a ring.

In addition, unless otherwise specified in the present specification, an aryl group, an arylene group, a fluorenyl group, a fluorenylene group, a heterocyclic group, an aliphatic ring group, an alkyl group, an alkenyl group, an alkynyl group, an alkoxy group, an aryloxy group, and a ring formed by linking neighboring groups to each other may be each optionally substituted with one or more substituents selected from the group consisting of deuterium, halogen, a silane group unsubstituted or substituted with a $C_1$-$C_{20}$ alkyl group or a $C_6$-$C_{20}$ aryl group, a phosphine oxide group unsubstituted or substituted with a $C_1$-$C_{20}$ alkyl group or a $C_6$-$C_{20}$ aryl group, a siloxane group, a cyano group, a nitro group, a $C_1$-$C_{20}$ alkylthio group, a $C_1$-$C_{20}$ alkoxy group, a $C_6$-$C_{20}$ aryloxy group, a $C_6$-$C_{20}$ arylthio, a $C_1$-$C_{20}$ alkyl group, a $C_2$-$C_{20}$ alkenyl group, a $C_2$-$C_{20}$ alkynyl group, a $C_6$-$C_{20}$ aryl group, a fluorenyl group, a $C_2$-$C_{20}$ heterocyclic group containing at least one heteroatom of O, N, S, Si, and P, and a $C_3$-$C_{20}$ aliphatic ring group.

The FIG. 1 illustrates an example of an organic electroluminescent element according to an embodiment of the present invention.

Referring to the FIG. 1, an organic electric element 100 according to an embodiment of the present invention includes a first electrode 110 formed on a substrate (not shown), a second electrode 170, and an organic material layer formed between the first electrode 110 and the second electrode 170.

The first electrode 110 may be an anode (positive electrode), and the second electrode 170 may be a cathode (negative electrode). In the case of an inverted organic electric element, the first electrode may be a cathode, and the second electrode may be an anode.

The organic material layer may be comprised a hole injection layer 120, a hole transport layer 130, a light-emitting layer 140, an electron transport layer 150, and an electron injection layer 160, and an emission-auxiliary layer 220 is formed between a hole transport layer 130 and a light-emitting layer 140. In addition, a buffer layer 210 may be further formed between a hole transport layer 130 and an emission-auxiliary layer 220.

Specifically, a hole injection layer 120, a hole transport layer 130, a buffer layer 210, an emission-auxiliary layer 220, a light-emitting layer 140, an electron transport layer 150, and an electron injection layer 160 are formed on the first electrode 110 in sequence.

Preferably, a layer for improving the luminous efficiency 180 may be formed on one side of sides of the first electrode 110 or one side of sides of the second electrode 170, wherein the one side is not facing the organic material layer. If a layer for improving the luminous efficiency 180 is formed, the luminous efficiency of an organic electric element can be improved.

For example, the light efficiency improving layer 180 may be formed on the second electrode 170, as a result, in the case of a top emission organic light emitting diode, the optical energy loss due to Surface Plasmon Polarizations (SPPs) at the second electrode 170 may be reduced and in the case of a bottom emission organic light emitting diode, the light efficiency improving layer 180 may serve as a buffer for the second electrode 170.

Although not shown in FIG. 1, an electron transport-auxiliary layer may be further formed between the light-emitting layer 140 and the electron transport layer 150.

An emission-auxiliary layer 220 according to the present invention will be described in more detail with reference to FIG. 2.

Figure 2:
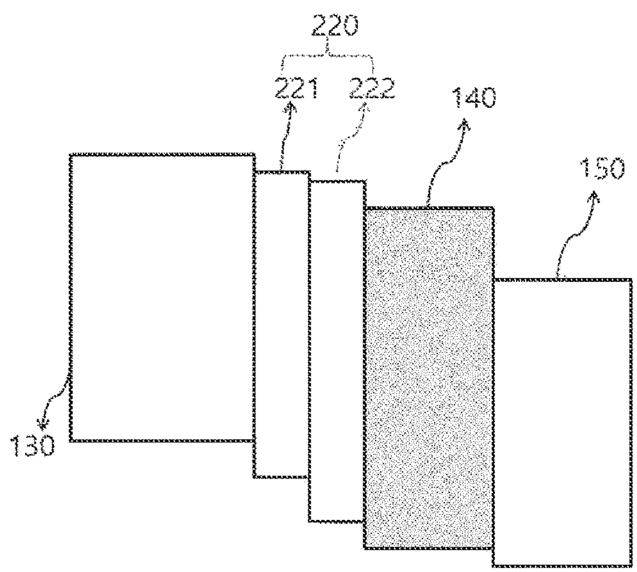
FIG. 2 is a schematic configuration diagram of an organic material layer showing the energy level of an organic electric device according to an embodiment of the present invention.

FIG. 2 is a schematic configuration diagram of an organic material layer showing the energy level of an organic electric device according to an embodiment of the present invention.

Referring to FIG. 2, an organic material layer according to an embodiment of the present invention comprises a plurality of emission-auxiliary layers, and FIG. 2 shows an organic material layer including two emission-auxiliary layers. The plurality of emission-auxiliary layers 220 comprise a first emission-auxiliary layer 221 adjacent to the hole transport layer 130 and a second emission-auxiliary layer 222 adjacent to the light-emitting layer 140.

Preferably, the HOMO energy level of the emission-auxiliary layer 220 is lower than the HOMO energy level of the hole transport layer 130 and higher than the HOMO energy level of the light-emitting layer 140, and the HOMO energy level of the first emission-auxiliary layer 221 is higher than the HOMO energy level of the second emission-auxiliary layer 222.

Since the HOMO value has a negative value, 'lower HOMO energy level' means a larger absolute value. Therefore, the absolute value of the HOMO energy level of the emission-auxiliary layer 220 according to the present invention is larger than the absolute value of the HOMO energy level of the hole transport layer 130 and smaller than the absolute value of the HOMO energy level of the light-emitting layer 140, and it is preferable that the absolute value of the HOMO energy level of the first emission-auxiliary layer 221 is smaller than the absolute value of the HOMO energy level of the second emission-auxiliary layer 222.

Preferably, the first emission-auxiliary layer 221 is formed of one type of compound without additional doping and has a thickness of 200 to 400 Å, and the second emission-auxiliary layer 222 is also formed of one type of compound without additional doping. and a thickness of 50 to 200 Å, and the total thickness of the emission-auxiliary layers is 300 to 400 Å. Here, 'additional doping' may mean doping with a p-doping material.

Like this, even if each of the emission-auxiliary layers 220 of the present invention is formed of only one type of compound without additional doping with a p-doping material, by forming the emission-auxiliary layer having a predetermined thickness and the appropriate HOMO energy level in relation to the adjacent organic material layer, the lifespan and efficiency of an organic electric element can be improved.

Preferably, the HOMO energy level of the first emission-auxiliary layer 221 is 0.01 to 0.5 eV higher than the HOMO energy level of the second auxiliary layer 222, and the HOMO energy levels of the first emission-auxiliary layer 221 and the second emission-auxiliary layer 222 are respectively 5.50 to 5.69 eV based on absolute values. That is, it is preferable that the HOMO energy level of the first light emission auxiliary layer 221 and the second light emission auxiliary layer 222 has a value of −5.69 eV or more and −5.50 eV or less, respectively, and the HOMO energy level of the first emission-auxiliary layer 221 is higher than the HOMO energy level of the second auxiliary layer 222.

Preferably, a light-emitting layer according to the present invention is a red light-emitting layer or a green light-emitting layer.

According to another embodiment of the present invention, the organic material layer may be formed in a plurality of stacks, wherein the stacks comprise a hole transport layer, an emission-auxiliary layer, a light-emitting layer, and an electron transport layer.

In general, an organic light emitting element can be divided into a single light emitting element (Single OLED) and a multilayer light emitting element (Tandem OLED) according to the number of light emitting units. A multilayer light emitting element (Tandem OLED) is an OLED element composed of two or more light emitting units (stack), and it is easier to improve the driving voltage and efficiency compared to the conventional single OLED.

Specifically, the organic electric element according to an embodiment of the present invention may include a first electrode, a first stack formed on the first electrode, a second stack formed on the first stack, and a second electrode. Here, the stack may correspond to an organic material layer, and a layer for improving light efficiency may be further formed on one side of both sides of the first electrode and/or the second electrode, wherein the one side is not facing with the organic material layer.

Each of the first and the second stacks is an organic material layer comprising a hole injection layer, a hole transport layer, a light-emitting layer and an electron transport layer, and the first and the second stacks may be formed in the same or different stacked structures.

At least one of the first stack and the second stack includes a plurality of light emitting-auxiliary layers according to the present invention. That is, a plurality of light emitting-auxiliary layers according to the present invention are comprised between the hole transport layer and the light-emitting layer, and these light emitting-auxiliary layers may be included in the first stack and/or the second stack.

In addition, a charge generation layer (CGL) may be formed between the first stack and the second stack. The charge generation layer CGL may include a first charge generation layer and a second charge generation layer. The charge generating layer (CGL) is formed between the light-emitting layer of the first stack and the light-emitting layer of the second stack to increase current efficiency generated in each light-emitting layer and smoothly distribute charges.

Two or more stacks of the organic material layer may be formed. For example, in a case where three stacks are formed, a charge generating layer (CGL) and a third stack may be additionally stacked on the second stack.

Like this, when a plurality of light-emitting layers are formed by the multilayer stack structure method, it is possible to manufacture an organic electroluminescent element that emits white light by the mixing effect of the light emitted from each light-emitting layer, as well as to emit light of various colors.

The organic layer with a smaller number of layers according to the present invention may be manufactured by a solution process or a solvent process such as a spin coating process, a nozzle printing process, an inkjet printing process, a slot coating process, a dip coating process, a roll-to-roll process, doctor blading process, a screen printing process, or a thermal transfer method using various polymer materials rather than a deposition method.

Since the organic material layer according to the present invention may be formed in various ways, the scope of protection of the present invention is not limited by a method of forming the organic material layer.

The organic electric element according to an embodiment of the present invention may be of a top emission type, a bottom emission type, or a dual emission type depending on the material used.

In addition, the organic electric element according to an embodiment of the present invention may be selected from the group consisting of an organic electroluminescent element, an organic solar cell, an organic photo conductor, an organic transistor, an element for monochromatic illumination and an element for quantum dot display.

Another embodiment of the present invention provides an electronic device including a display device which includes the above described organic electric element, and a control unit for controlling the display device. Here, the electronic device may be a wired/wireless communication terminal which is currently used or will be used in the future, and covers all kinds of electronic devices including a mobile communication terminal such as a cellular phone, a personal digital assistant (PDA), an electronic dictionary, a point-to-multipoint (PMP), a remote controller, a navigation unit, a game player, various kinds of TVs, and various kinds of computers.

According to the present invention, the HOMO energy level of the emission-auxiliary layer 220 is lower than the HOMO energy level of the hole transport layer 130 and higher than the HOMO energy level of the light-emitting layer 140.

Preferably, a plurality of emission-auxiliary layers according to the present invention comprise a first emission-auxiliary layer adjacent to a hole transport layer and a second emission-auxiliary layer adjacent to a light-emitting layer, wherein the first emission-auxiliary layer and the second emission-auxiliary layer comprise compound represented by the following Formula 1 or Formula 2.

Here, the first emission-auxiliary layer and the second emission-auxiliary layer are preferably formed of different compounds. That is, even if both the first emission-auxiliary layer and the second emission-auxiliary layer are formed of the compound represented by the following Formula 1 or both are formed of the compound represented by the following Formula 2, each of the emission-auxiliary layers is preferably formed of a different compound.

<Formula 1>

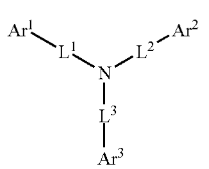

-continued

<Formula 2>

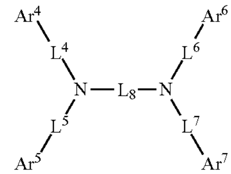

In Formulas 1 and 2, each of symbols may be defined as follows.

$Ar^1$ to $Ar^7$ are each independently selected from the group consisting of a $C_6$-$C_{60}$ aryl group, a fluorenyl group, a $C_2$-$C_{60}$ heterocyclic group comprising at least one heteroatom selected from the group consisting of O, N, S, Si and P, and a $C_3$-$C_{60}$ aliphatic ring, $Ar^4$ and $Ar^5$ may be linked to each other to form a ring, and $Ar^6$ and $Ar^7$ may be linked to each other to form a ring. When $Ar^4$ and $Ar^5$ are linked to each other or $Ar^6$ and $Ar^7$ are linked to each other to form a ring, a heterocycle including N may be formed together with N in the backbone to which they are directly or indirectly linked.

When $Ar^1$ to $Ar^7$ are each an aryl group, the aryl group may be preferably a $C_6$-$C_{30}$ aryl group, more preferably a $C_6$-$C_{18}$ aryl group, for example, phenyl, biphenyl, naphthyl, terphenyl, phenanthrene, anthracene, triphenylene, pyrene, chrysene, and the like.

When $Ar^1$ to $Ar^7$ are each a heterocyclic group, the heterocyclic group may be preferably a $C_2$-$C_{30}$ heterocyclic group, more preferably a $C_2$-$C_{26}$ heterocyclic group, for example, pyridine, pyrimidine, pyrazine, pyridazine, triazine, furan, thiophene, pyrrole, silole, indene, indole, phenyl-indole, benzoindole, phenyl-benzoindole, benzofuran, benzothiophene, benzoimidazole, benzothiazole, benzoxazole, benzosilole, dibenzofuran, dibenzothiophene, carbazole, quinoline, isoquinoline, benzoquinoline, quinoxaline, quinazoline, phenanthroline, benzonaphthothiophene, benzonaphthofuran, phenyl-carbazole, benzocarbazole, phenyl-benzocarbazole, naphthyl-benzocarbazole, dibenzocarbazole, indolocarbazole, benzofuropyridine, benzothienopyridine, and the like.

When $Ar^1$ to $Ar^7$ are each an aliphatic ring, the aliphatic ring may be preferably a $C_3$-$C_{20}$ aliphatic ring, more preferably a $C_6$-$C_{16}$ aliphatic ring, for example, cyclohexane, fluoranthene, or the like.

When $Ar^1$ to $Ar^7$ are each a fluorenyl group, the fluorenyl group may be 9,9-dimethyl-9H-fluorene, 9,9-diphenyl-9H-fluorene, 9,9'-spirobifluorene, spiro[benzo[b]fluorene-11,9'-fluorene], benzo[b]fluorene, 11,11-diphenyl-11H-benzo[b]fluorene, 9-(naphthalen-2-yl)9-phenyl-9H-fluorene, and the like.

$L^1$ to $L^7$ are each independently selected from the group consisting of a single bond, a $C_6$-$C_{60}$ arylene group, a fluorenylene group, a $C_3$-$C_{60}$ aliphatic ring, and a $C_2$-$C_{60}$ heterocyclic group comprising at least one heteroatom selected from the group consisting of O, N, S, Si and P.

Where $L^1$ to $L^7$ are each an arylene group, the arylene group may be preferably a $C_6$-$C_{30}$ arylene group, more preferably a $C_6$-$C_{18}$ arylene group, for example, phenylene, biphenyl, naphthalene, terphenyl, pyrene, phenanthrene and the like.

Where $L^1$ to $L^7$ are each a heterocyclic group, the heterocyclic group may be preferably a $C_2$-$C_{30}$ heterocyclic group, more preferably a $C_2$-$C_{22}$ heterocyclic group, for example, carbazole, phenylcarbazole, naphthylcarbazole, dibenzothiophene, dibenzofuran, benzonaphthothiophene, benzonaphthofuran and the like.

Where $L^1$ to $L^7$ are each a fluorenylene group, the fluorenylene group may be 9,9-dimethyl-9H-fluorene, 9,9-diphenyl-9H-fluorene, 9,9'-spirobifluorene, spiro[benzo[b]fluorene-11,9'-fluorene], benzo[b]fluorene, 11,11-diphenyl-11H-benzo[b]fluorene, 9-(naphthalen-2-yl)9-phenyl-9H-fluorene, and the like.

$L^8$ is selected from the group consisting of a $C_6$-$C_{60}$ arylene group, a fluorenylene group, a $C_3$-$C_{60}$ aliphatic ring, and a $C_2$-$C_{60}$ heterocyclic group comprising at least one heteroatom selected from the group consisting of O, N, S, Si and P.

Where $L^8$ is an arylene group, the arylene group may be preferably a $C_6$-$C_{30}$ arylene group, more preferably a $C_6$-$C_{18}$ arylene group, for example, phenylene, biphenyl, naphthalene, terphenyl, anthracene, phenanthrene, pyrene, and the like.

Where $L^8$ is a heterocyclic group, the heterocyclic group may be preferably a $C_2$-$C_{30}$ heterocyclic group, more preferably a $C_2$-$C_{18}$ heterocyclic group, for example, dibenzothiophene, dibenzofuran, benzonaphthofuran, benzonaphthothiophene, carbazole, phenylcarbazole, and the like.

Where $L^8$ is a fluorenylene group, the fluorenylene group may be 9,9-dimethyl-9H-fluorene, 9,9-diphenyl-9H-fluorene, 9,9'-spirobifluorene, spiro[benzo[b]fluorene-11,9'-fluorene], benzo[b]fluorene, 11,11-diphenyl-11H-benzo[b]fluorene, 9-(naphthalen-2-yl)9-phenyl-9H-fluorene, and the like.

The aryl group, arylene group, fluorenyl group, fluorenylene group, heterocyclic group, aliphatic ring group, the ring formed by linking $Ar^4$ and $Ar^5$ to each other and the ring formed by linking $Ar^6$ and $Ar^7$ to each other may be each optionally substituted with one or more substituents selected from the group consisting of deuterium, halogen, a silane group unsubstituted or substituted with a $C_1$-$C_{20}$ alkyl group or a $C_6$-$C_{20}$ aryl group, a siloxane group, a cyano group, a nitro group, a $C_1$-$C_{20}$ alkylthio group, a $C_1$-$C_{20}$ alkoxy group, a $C_6$-$C_{20}$ aryloxy group, a $C_6$-$C_{20}$ arylthio, a $C_1$-$C_{20}$ alkyl group, a $C_2$-$C_{20}$ alkenyl group, a $C_2$-$C_{20}$ alkynyl group, a $C_6$-$C_{20}$ aryl group, a fluorenyl group, a $C_2$-$C_{20}$ heterocyclic group containing at least one heteroatom of O, N, S, Si, and P, a $C_3$-$C_{20}$ aliphatic ring group, and -L'-N($R_a$)($R_b$).

L' is selected from the group consisting of a single bond, a $C_6$-$C_{20}$ arylene group, a fluorenylene group, a $C_3$-$C_{20}$ aliphatic ring, and a $C_2$-$C_{20}$ heterocyclic group comprising at least one heteroatom selected from the group consisting of O, N, S, Si and P.

$R_a$ and $R_b$ are each independently selected from the group consisting of a $C_6$-$C_{20}$ aryl group, a fluorenyl group, a $C_3$-$C_{20}$ aliphatic ring, and a $C_2$-$C_{20}$ heterocyclic group comprising at least one heteroatom selected from the group consisting of O, N, S, Si and P.

Formula 1 may be represented by Formula A-1 or Formula A-2.

<Formula A-1>

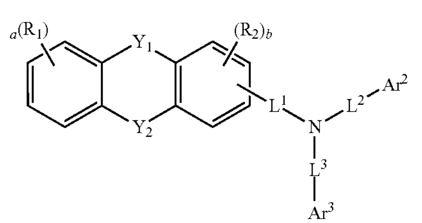

-continued

<Formula A-2>

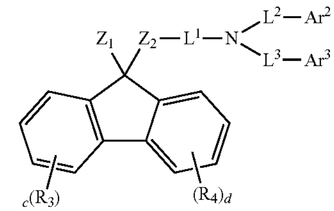

In Formulas A-1 and A-2, each of symbols may be defined as follows.

$L^1$ to $L^3$, $Ar^2$, $Ar^3$ are the same as defined for Formula 1.

$Y_1$ and $Y_2$ are each a single bond, O, S or C($R_5$)($R_6$), and a case where both $Y_1$ and $Y_2$ are a single bond is excluded.

$R_1$ to $R_6$, $Z_1$, $Z_2$ are each independently selected from the group consisting of deuterium, halogen, a silane group unsubstituted or substituted with a $C_1$-$C_{20}$ alkyl group or a $C_6$-$C_{20}$ aryl group, a siloxane group, a cyano group, a nitro group, a $C_1$-$C_{20}$ alkylthio group, a $C_1$-$C_{20}$ alkoxy group, a $C_6$-$C_{20}$ aryloxy group, a $C_6$-$C_{20}$ arylthio, a $C_1$-$C_{20}$ alkyl group, a $C_2$-$C_{20}$ alkenyl group, a $C_2$-$C_{20}$ alkynyl group, a $C_6$-$C_{20}$ aryl group, a fluorenyl group, a $C_2$-$C_{20}$ heterocyclic group containing at least one heteroatom of O, N, S, Si, and P, a $C_3$-$C_{20}$ aliphatic ring group, and -L'-N($R_a$)($R_b$), and adjacent groups may be linked to each other to form a ring, $R_5$ and $R_6$ may be linked to each other to form a ring, and $Z_1$ and $Z_2$ may be linked to each other to form a ring. When $R_5$ and $R_6$ are linked to each other or $Z_1$ and $Z_2$ are linked to each other, a spiro-compound may be formed, for example, a spirobifluorene may be formed.

a, c and d are each an integer of 0-4, b is an integer of 0-3, and where each of these is an integer of 2 or more, each of $R_1$s, each of $R_2$s, each of $R_3$s, each of $R_4$s is the same or different from each other.

The aryl group, fluorenyl group, heterocyclic group, aliphatic ring group, alkyl group, alkenyl group, alkynyl group, alkoxy group, aryloxy group, the ring formed by linking adjacent groups to each other, the ring formed by linking $R_5$ and $R_6$ to each other, and the ring formed by linking $Z_1$ and $Z_2$ to each other may be each optionally substituted with one or more substituents selected from the group consisting of deuterium, halogen, a cyano group, a nitro group, a $C_1$-$C_{20}$ alkoxy group, a $C_6$-$C_{20}$ aryloxy group, a $C_1$-$C_{20}$ alkyl group, a $C_2$-$C_{20}$ alkenyl group, a $C_2$-$C_{20}$ alkynyl group, a $C_6$-$C_{20}$ aryl group, a fluorenyl group, a $C_2$-$C_{20}$ heterocyclic group containing at least one heteroatom of O, N, S, Si, and P, a $C_3$-$C_{20}$ aliphatic ring group, and -L'-N($R_a$)($R_b$), and L', $R_a$ and $R_b$ are the same as defined for Formula 1.

Formula A-1 may be represented by one of Formulas A-3 to A-6.

<Formula A-3>

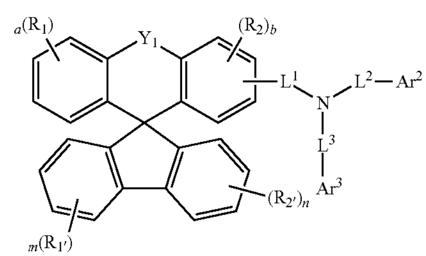

-continued

<Formula A-4>

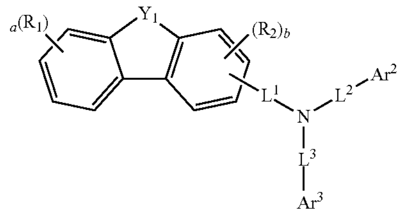

<Formula A-5>

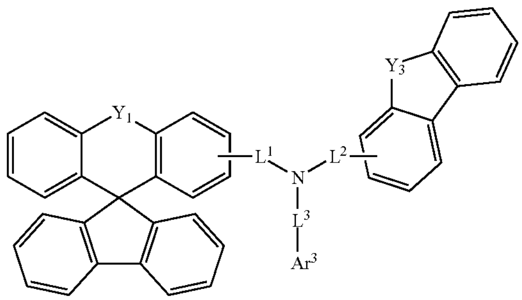

<Formula A-6>

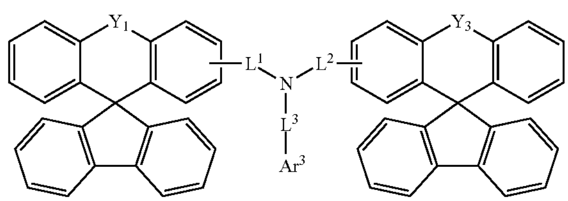

In Formulas A-3 to A-6, each of symbols may be defined as follows.

$L^1$ to $L^3$, $Ar^2$, $Ar^3$, R, $R_2$, a, b, $Y_1$ are the same as defined for Formula A-1, and $Y_3$ is defined the same as $Y_1$.

$R_1$ and $R_{2'}$ are each independently selected from the group consisting of deuterium, halogen, a cyano group, a nitro group, a $C_1$-$C_{20}$ alkoxy group, a $C_6$-$C_{20}$ aryloxy group, a $C_1$-$C_{20}$ alkyl group, a $C_2$-$C_{20}$ alkenyl group, a $C_2$-$C_{20}$ alkynyl group, a $C_6$-$C_{20}$ aryl group, a fluorenyl group, a $C_2$-$C_{20}$ heterocyclic group containing at least one heteroatom of O, N, S, Si, and P, a $C_3$-$C_{20}$ aliphatic ring group, and -L'-N($R_a$)($R_b$), and L', $R_a$ and $R_b$ are the same as defined for Formula 1.

m is an integer of 0-4, n is an integer of 0-3, and where each of these is an integer of 2 or more, each of $R^{1'}$s, each of $R^{2'}$s is the same or different from each other.

Formula 2 may be represented by Formula B-1.

<Formula B-1>

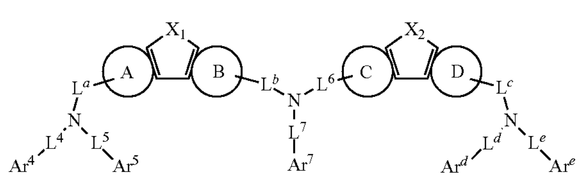

In Formula B-1, each of symbols may be defined as follows.

$L^4$ to $L^7$, $Ar^4$, $Ar^1$, $Ar^7$ are the same as defined for Formula 2.

A ring, B ring, C ring and D ring are each independently selected from the group consisting of a $C_6$-$C_{20}$ aromatic ring group, a fluorene group, a $C_2$-$C_{20}$ heterocyclic group containing at least one heteroatom of O, N, S, Si and P, and a $C_3$-$C_{20}$ aliphatic ring, and each of these may be substituted with one or more R.

$X_1$ and $X_2$ are each independently O, S, N(Ar) or C($R_7$)($R_8$).

$L^a$ to $L^e$ are each independently selected from the group consisting of a single bond, a $C_6$-$C_{20}$ arylene group, a fluorenylene group, a $C_2$-$C_{20}$ heterocyclic group comprising at least one heteroatom selected from the group consisting of O, N, S, Si and P, and a $C_3$-$C_{20}$ aliphatic ring.

$Ar^d$, $Ar^e$ and Ar are each independently selected from the group consisting of a $C_6$-$C_{20}$ aryl group, a fluorenyl group, a $C_2$-$C_{20}$ heterocyclic group comprising at least one heteroatom selected from the group consisting of O, N, S, Si and P, a $C_3$-$C_{20}$ aliphatic ring.

R, $R_7$ and $R_8$ are each independently selected from the group consisting of hydrogen, deuterium, halogen, a cyano group, a nitro group, a $C_1$-$C_{20}$ alkoxy group, a $C_6$-$C_{20}$ aryloxy group, a $C_1$-$C_{20}$ alkyl group, a $C_2$-$C_{20}$ alkenyl group, a $C_2$-$C_{20}$ alkynyl group, a $C_6$-$C_{20}$ aryl group, a fluorenyl group, a $C_2$-$C_{20}$ heterocyclic group containing at least one heteroatom of O, N, S, Si, and P, and a $C_3$-$C_{20}$ aliphatic ring group, and $R_7$ and $R_8$ may be linked to each other to form a ring.

The aryl group, arylene group, fluorenyl group, fluorenylene group, heterocyclic group, aliphatic ring group, alkyl group, alkenyl group, alkynyl group, alkoxy group, aryloxy group, the ring formed by linking $R_7$ and $R_8$ to each other may be each optionally substituted with one or more substituents selected from the group consisting of deuterium, halogen, a cyano group, a nitro group, a $C_1$-$C_{20}$ alkoxy group, a $C_6$-$C_{20}$ aryloxy group, a $C_1$-$C_{20}$ alkyl group, a $C_2$-$C_{20}$ alkenyl group, a $C_2$-$C_{20}$ alkynyl group, a $C_6$-$C_{20}$ aryl group, a fluorenyl group, a $C_2$-$C_{20}$ heterocyclic group containing at least one heteroatom of O, N, S, Si, and P, a $C_3$-$C_{20}$ aliphatic ring group, and -L'-N($R_a$)($R_b$), and L', $R_a$ and $R_b$ are the same as defined for Formula 2.

Formula B-1 may be represented by one of Formulas B-2 to B-6.

<Formula B-2>

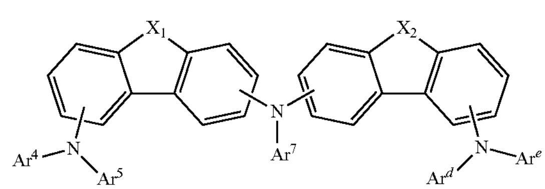

<Formula B-3>

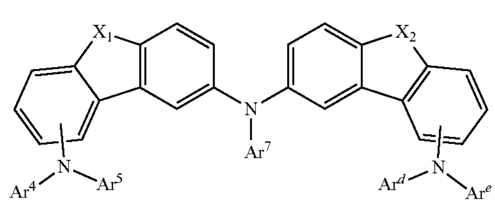

-continued

<Formula B-4>

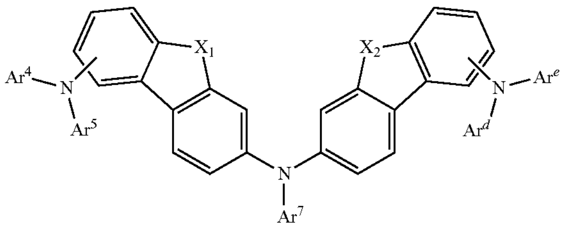

<Formula B-5>

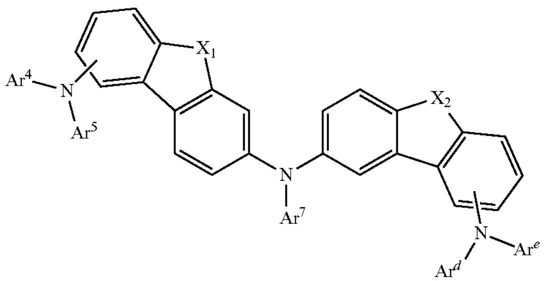

<Formula B-6>

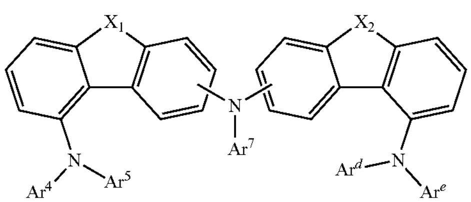

In Formulas B-2 to B-6, $Ar^4$, $Ar^5$, $Ar^7$, $Ar^d$, $Ar^e$, $X_1$, $X_2$ are the same as defined for Formula B-1.

Preferably, at least one of $Ar^1$ to $Ar^7$, and $L^8$ may be represented by Formula 3 when the first emission-auxiliary layer is consisted of the compound represented by Formula 1 or Formula 2.

<Formula 3>

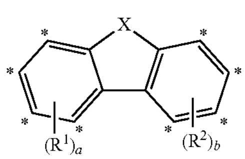

In Formula 3, each of symbols may be defined as follows.

* indicates a bonding position. X is N, N-($L^a$-$Ar^a$), O, S or C(R')(R").

In a case where $Ar^1$ to $Ar^3$ of Formula 1 are each Formula 3, $L^1$ to $L^3$ are each bonded to the carbon represented by * in Formula 3 when X is N-($L^a$-$Ar^a$), O, S or C(R')(R"), and $L^1$ to $L^3$ are each bonded to X when X is N.

In a case where $Ar^4$ to $Ar^7$ of Formula 2 are each Formula 3, $L^4$ to $L^7$ are each bonded to the carbon represented by * in Formula 3 when X is N-($L^a$-$Ar^a$), O, S or C(R')(R"), and $L^4$ to $L^7$ are each bonded to X when X is N.

In a case where $L^8$ of Formula 2 is Formula 3, both Ns in the skeleton are each bonded to the carbon represented by * in Formula 3 when X is N-($L^a$-$Ar^a$), O, S or C(R')(R"), and one of both Ns in the backbone is bonded to X, and the other is bonded to the carbon represented by * in Formula 3 when X is N.

$R^1$, $R^2$, R' and R" are each independently selected from the group consisting of hydrogen, deuterium, halogen, a cyano group, a nitro group, a $C_1$-$C_{20}$ alkylthio group, a $C_1$-$C_{20}$ alkoxy group, a $C_6$-$C_{20}$ aryloxy group, a $C_6$-$C_{20}$ arylthio, a $C_1$-$C_{20}$ alkyl group, a $C_2$-$C_{20}$ alkenyl group, a $C_2$-$C_{20}$ alkynyl group, a $C_6$-$C_{20}$ aryl group, a fluorenyl group, a $C_2$-$C_{20}$ heterocyclic group containing at least one heteroatom of O, N, S, Si, and P, a $C_3$-$C_{20}$ aliphatic ring group, and -L'-N($R_a$)($R_b$), adjacent groups may be linked to each other to form a ring, and R' and R" may be linked to each other to form a ring, and L', $R_a$ and $R_b$ are the same as defined in the above.

a and b are each an integer of 0-4, and where each of these is an integer of 2 or more, each of $R^1$s is the same or different from each other, and each of $R^2$s is the same or different from each other.

$L^a$ is selected from the group consisting of a single bond, a $C_6$-$C_{20}$ arylene group, a fluorenylene group, a $C_2$-$C_{20}$ heterocyclic group comprising at least one heteroatom selected from the group consisting of O, N, S, Si and P, and a $C_3$-$C_{20}$ aliphatic ring.

$Ar^a$ is selected from the group consisting of a $C_6$-$C_{20}$ aryl group, a fluorenyl group, a $C_2$-$C_{20}$ heterocyclic group comprising at least one heteroatom selected from the group consisting of O, N, S, Si and P, and a $C_3$-$C_{20}$ aliphatic ring.

Preferably, $Ar^1$ to $Ar^7$ may be each a $C_6$-$C_{24}$ aryl group and $L^8$ may be a $C_6$-$C_{24}$ arylene group when the second emission-auxiliary layer is consisted of the compound represented by Formula 1 or Formula 2.

In addition, preferably, at least one of $Ar^1$ to $Ar^7$ and $L^8$ may be a dibenzofuran when the second emission-auxiliary layer is consisted of the compound represented by Formula 1 or Formula 2.

The first emission-auxiliary layer and the second emission-auxiliary layer may be formed of different compound, and the first emission-auxiliary layer may comprise the compound represented by Formula A-1.

Specifically, the compound represented by formula 1 may be one of the following compounds, but there is no limitation thereto.

1-1

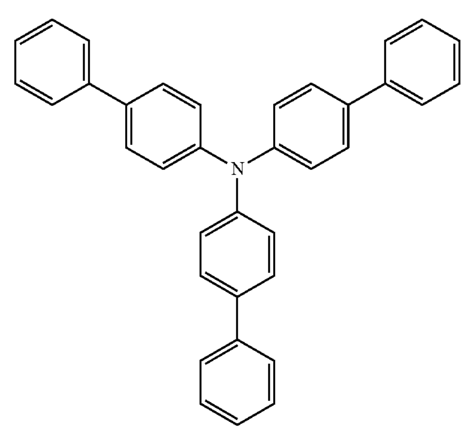

-continued
1-2
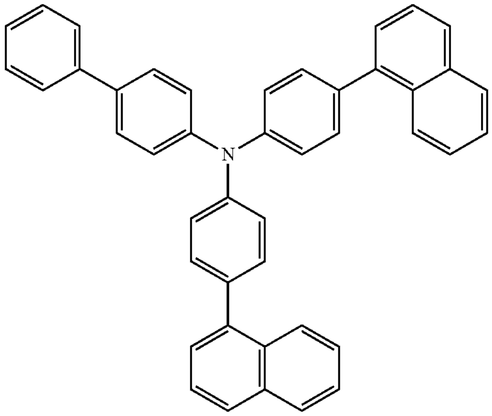
1-3
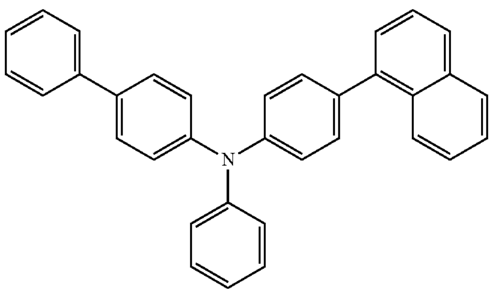
1-4
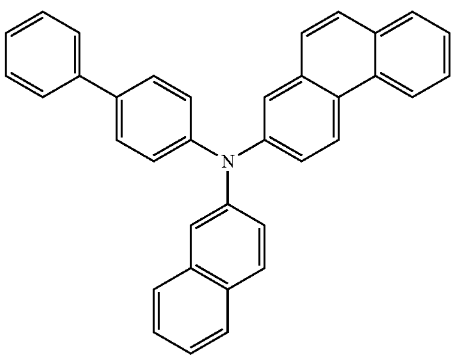
1-5
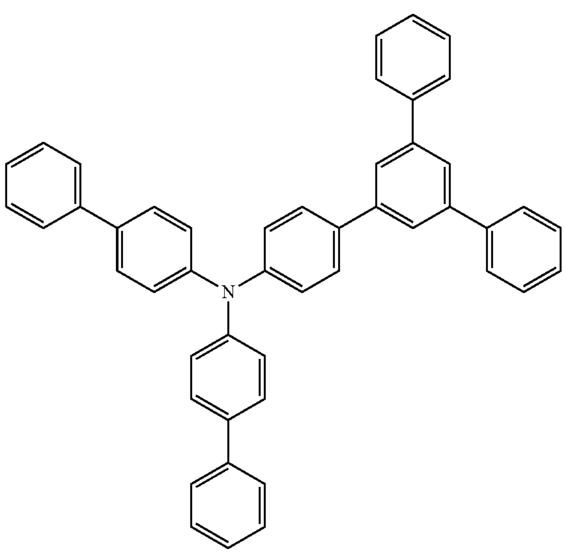
-continued
1-6
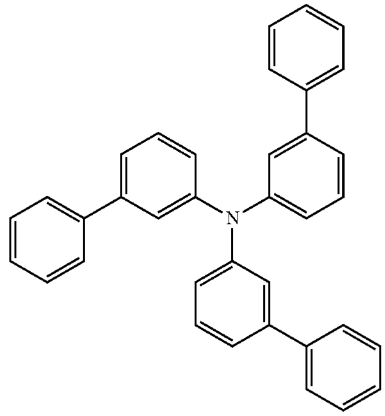
1-7
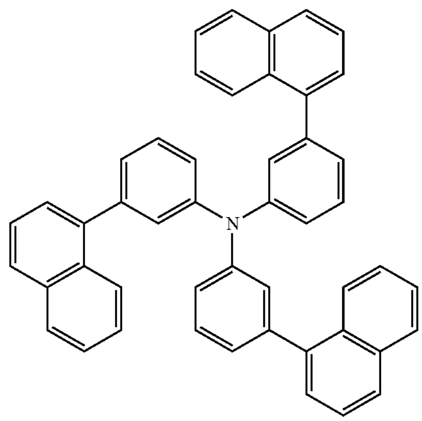
1-8
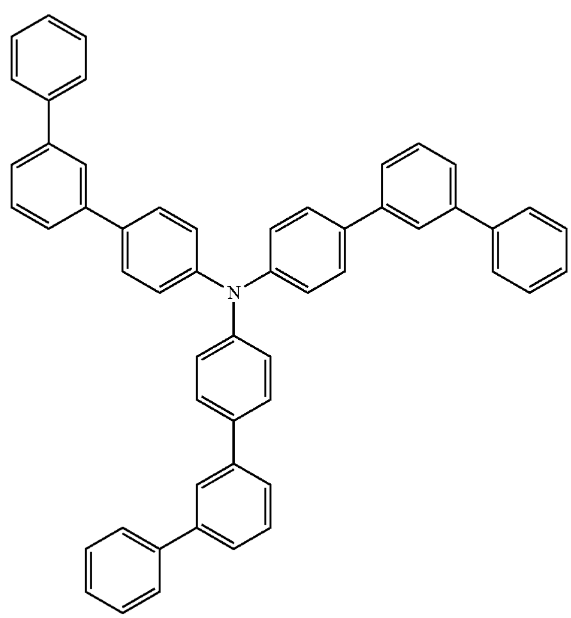

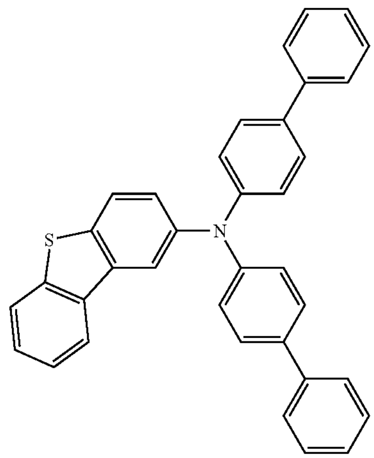
1-9
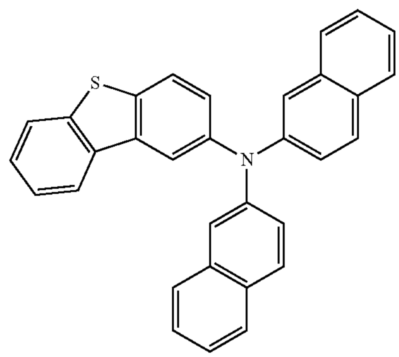
1-10
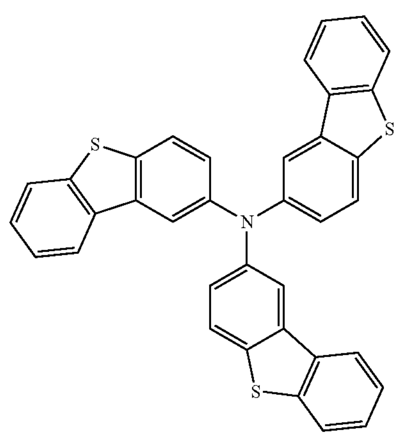
1-11
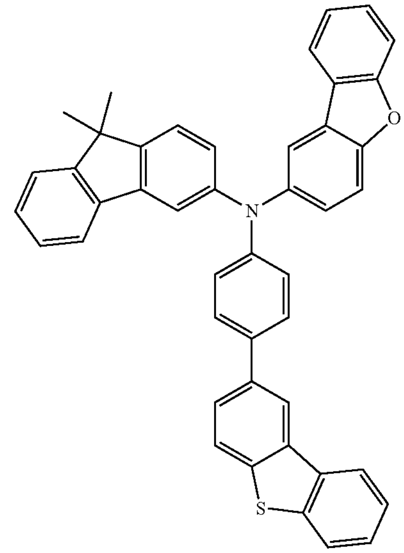
1-12
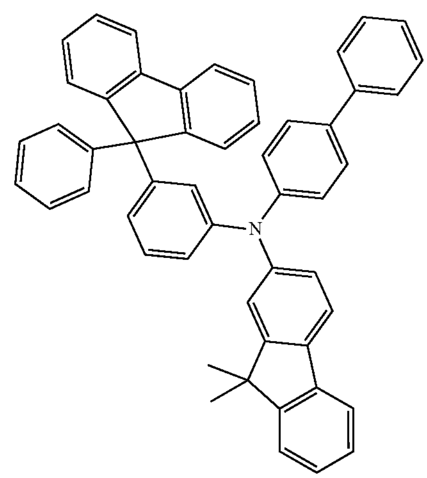
1-13
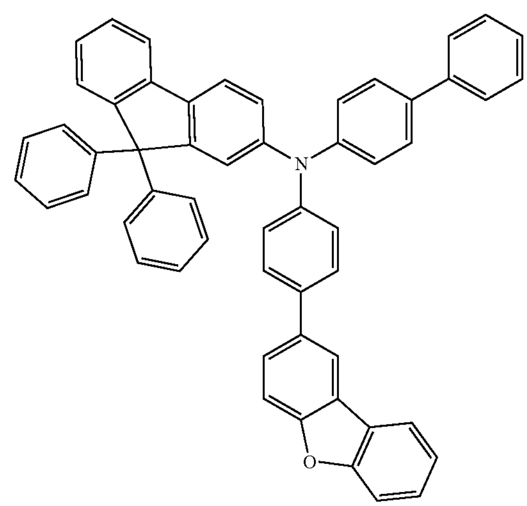
1-14

-continued
1-15
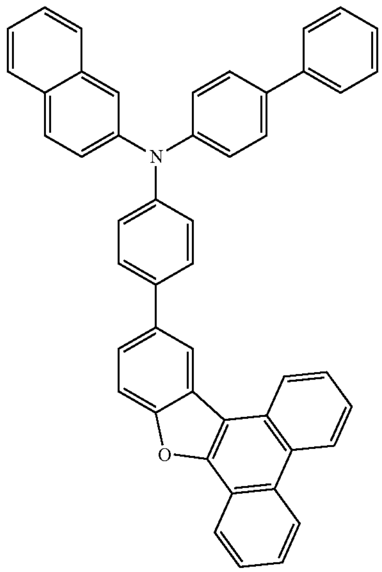
1-16
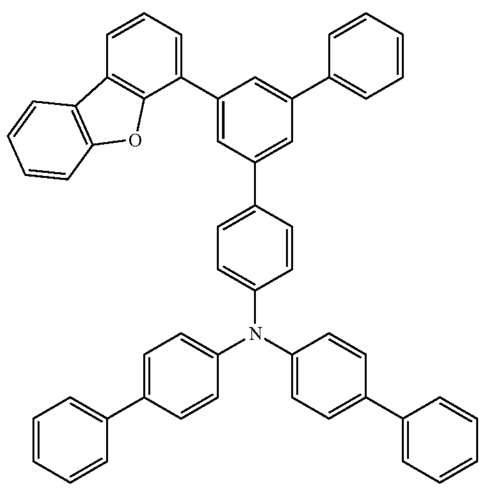
1-17
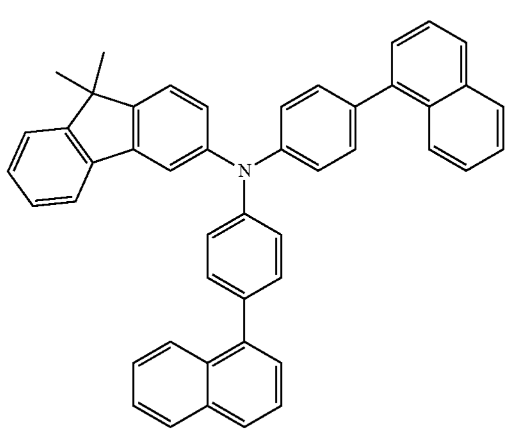
-continued
1-18
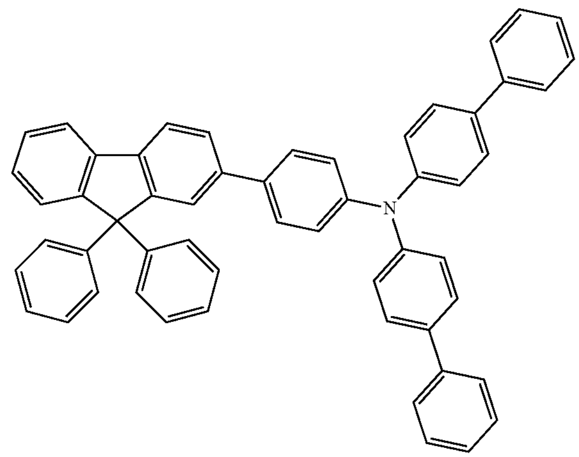
1-19
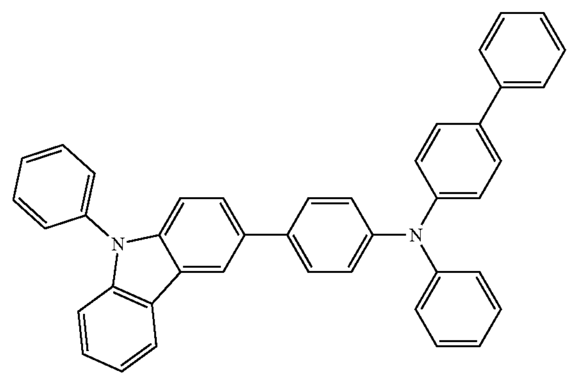
1-20
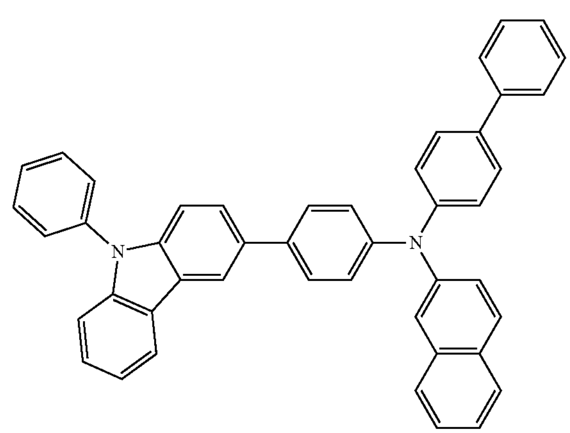

1-21
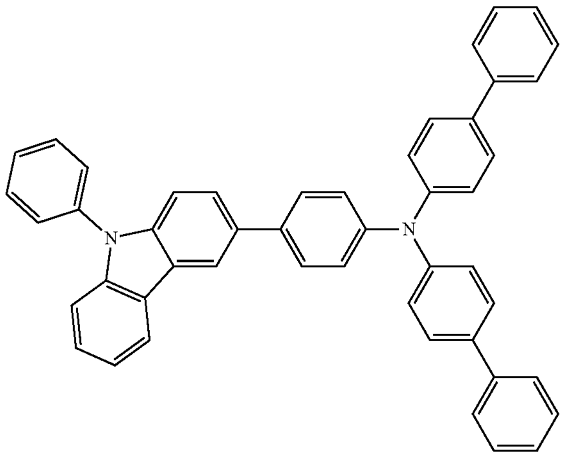
1-22
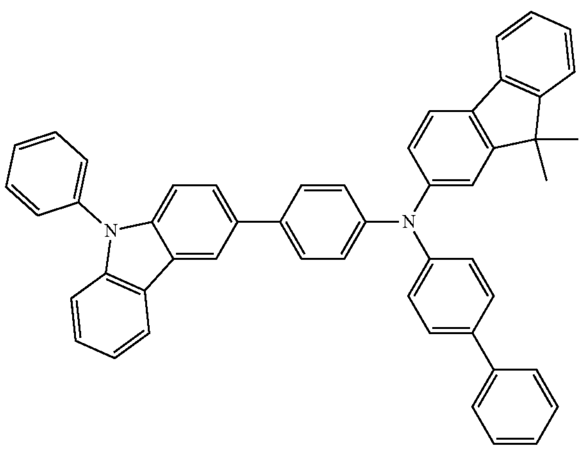
1-23
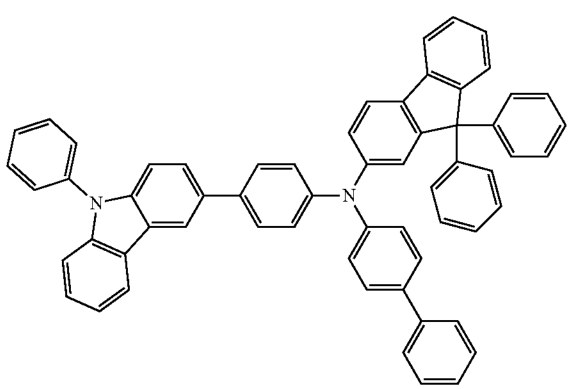
1-24
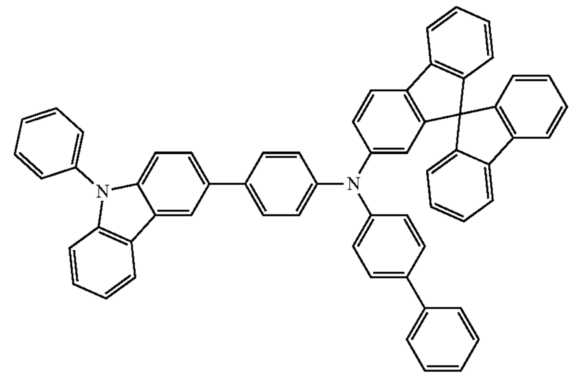
1-25
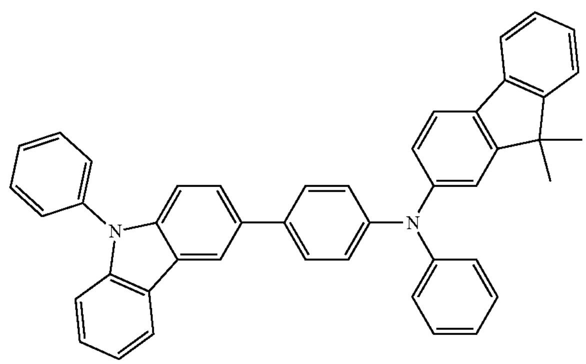
1-26
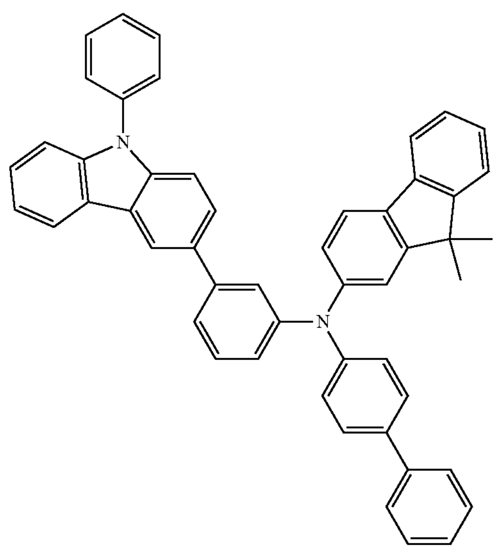

-continued
1-27
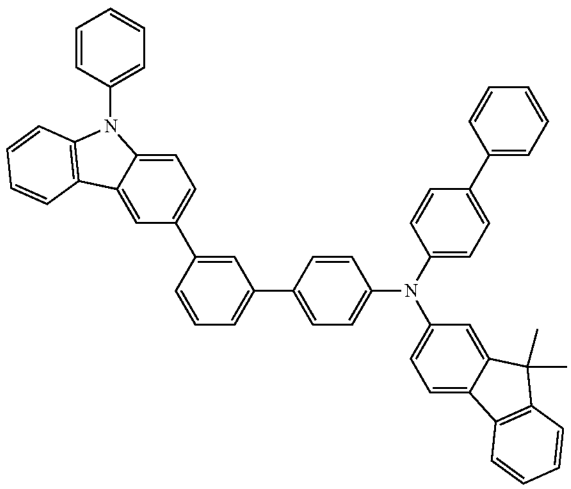
1-28
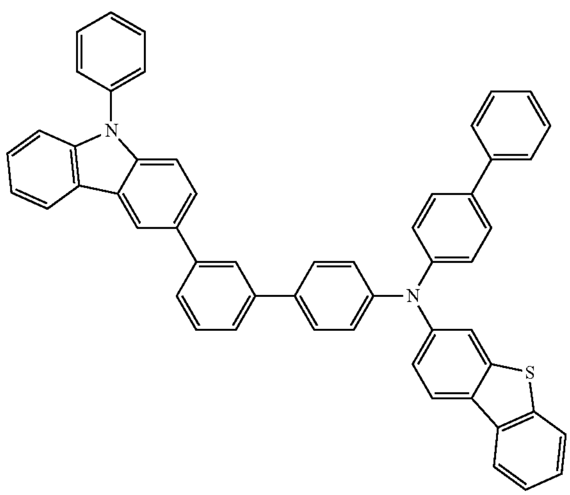
1-29
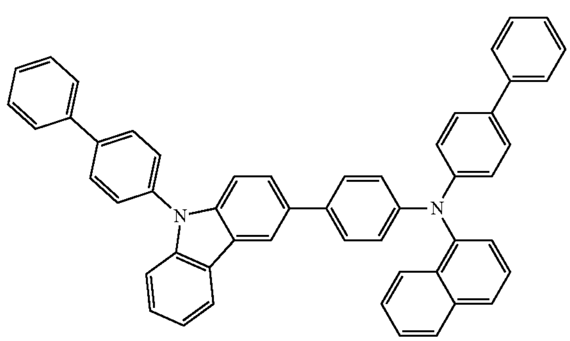
-continued
1-30
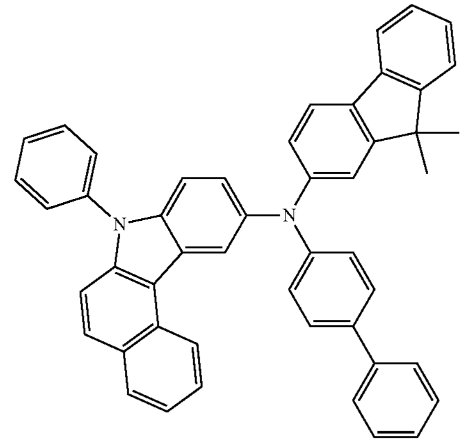
1-31
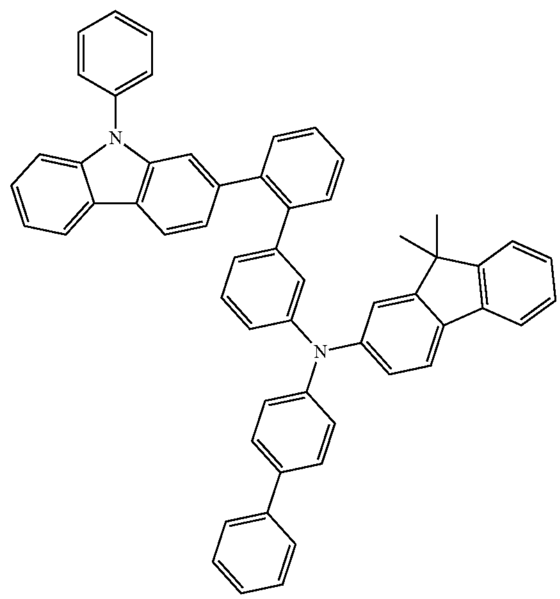
1-32
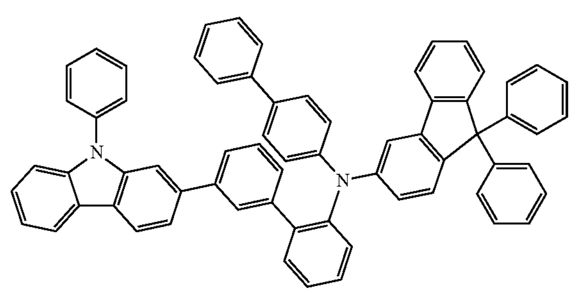

1-33
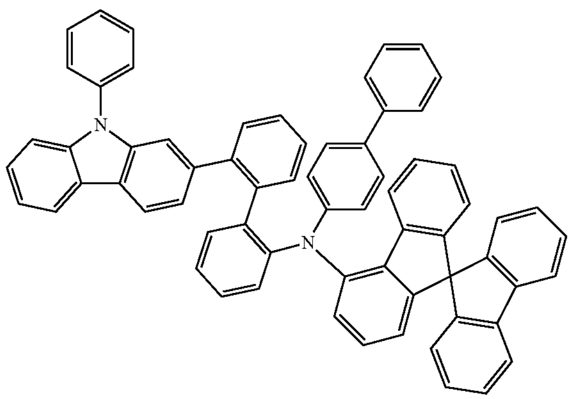
1-34
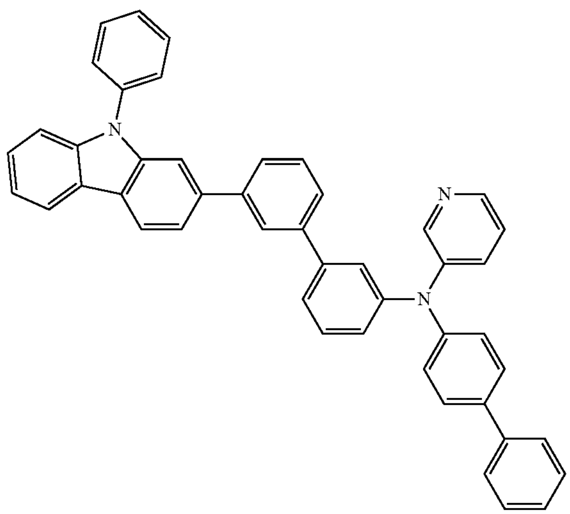
1-35
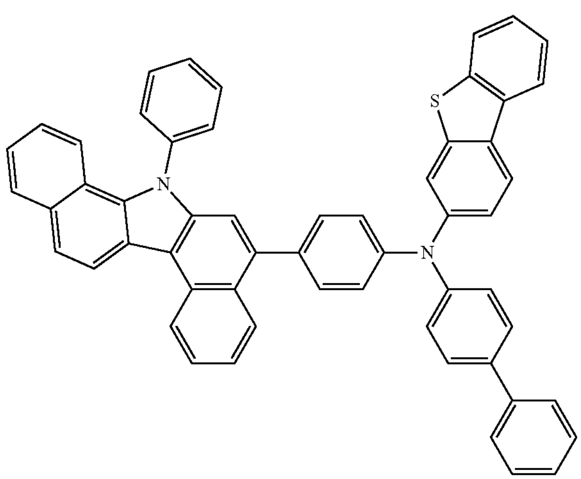
1-36
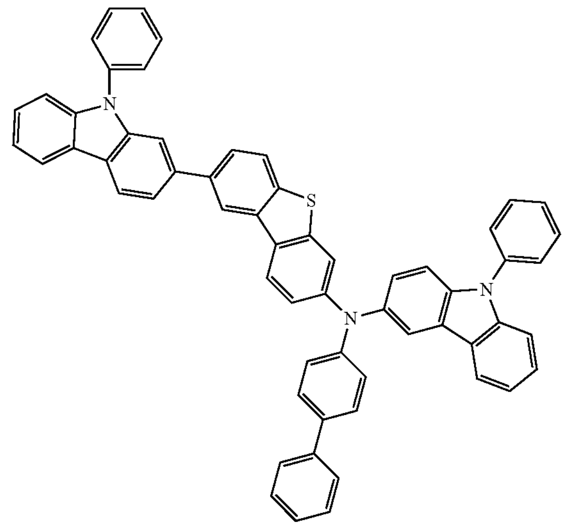
1-37
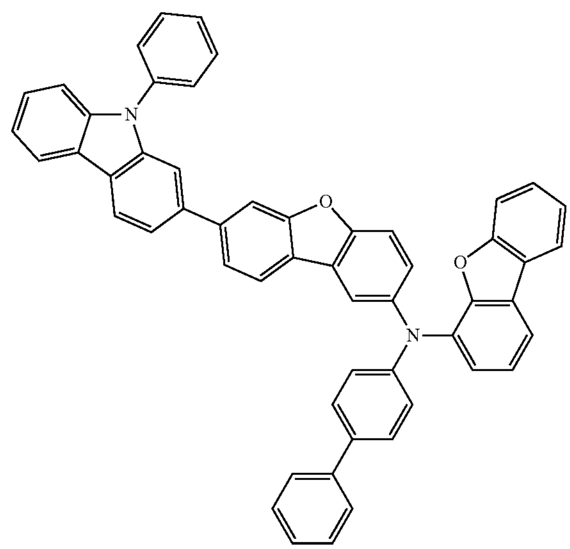
1-38
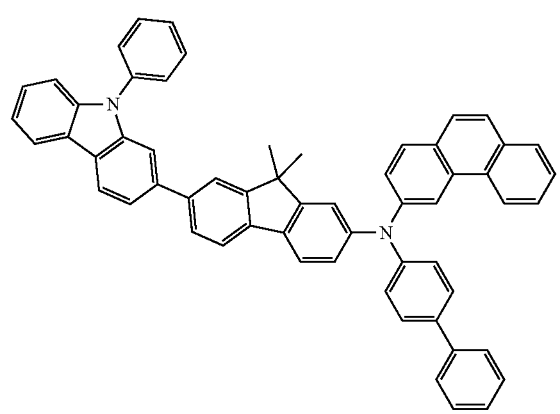

-continued
1-39
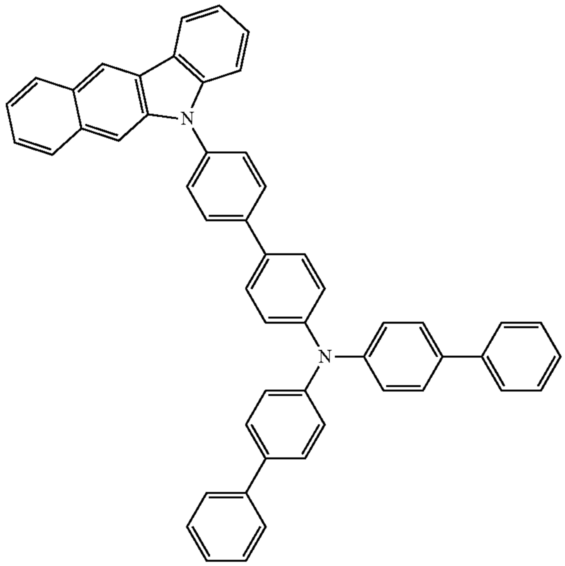
1-40
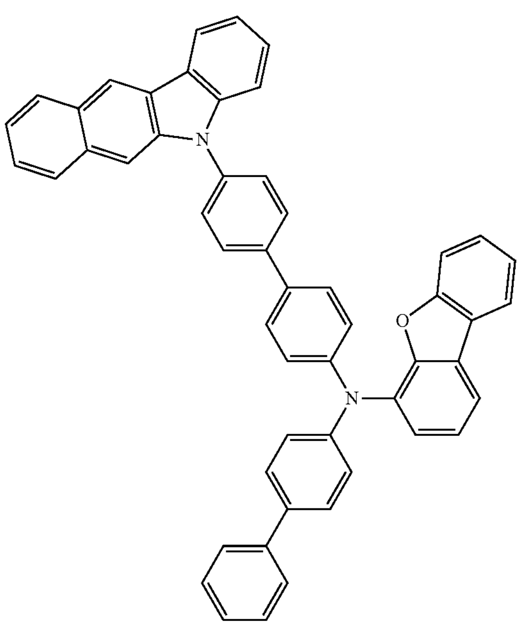
-continued
1-41
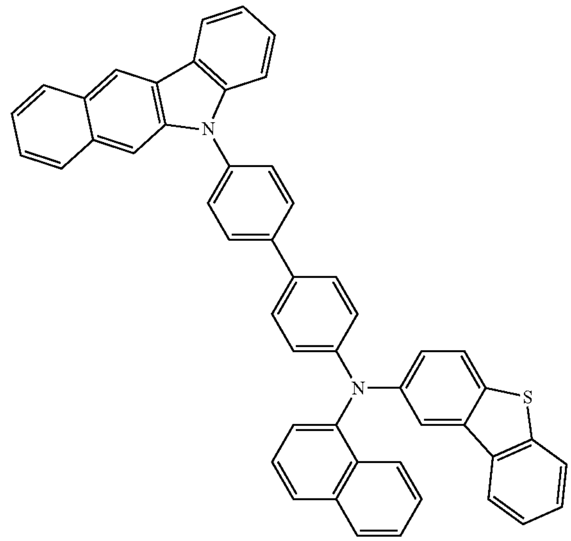
1-42
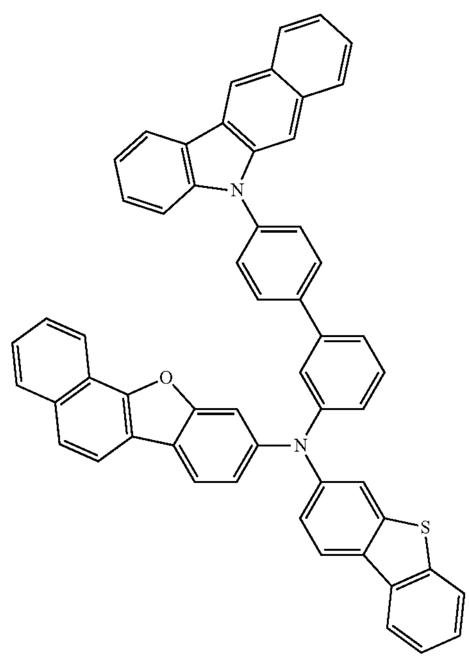

-continued
1-43
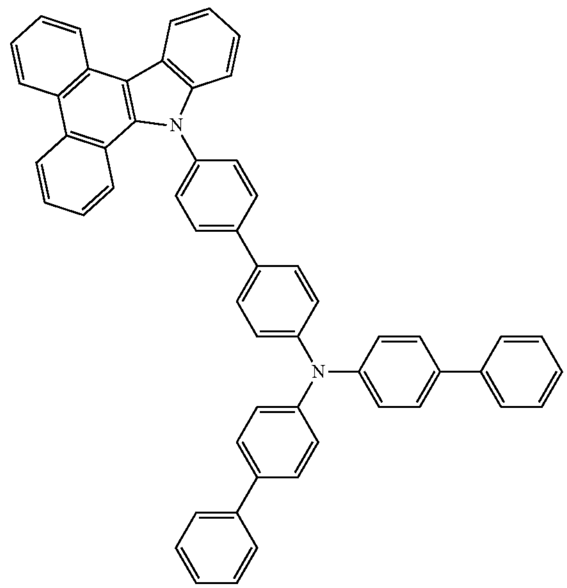
1-44
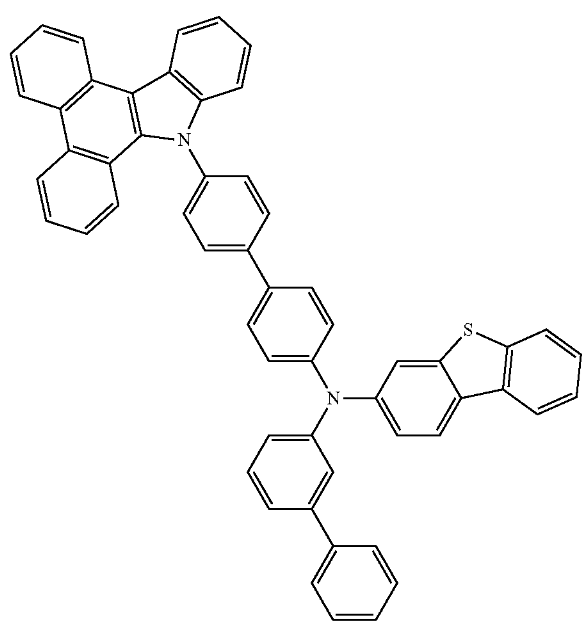
-continued
1-45
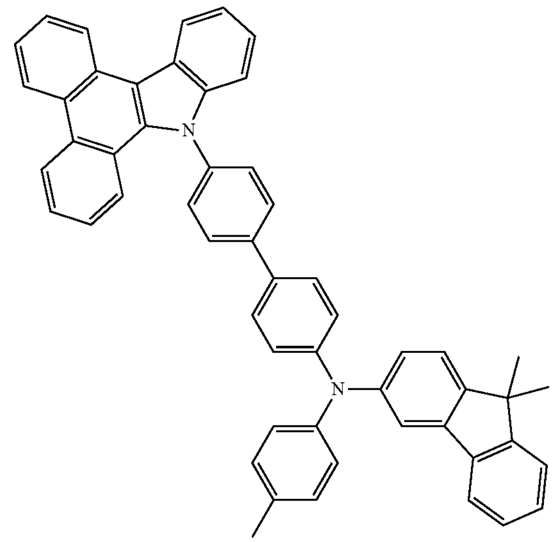
1-46
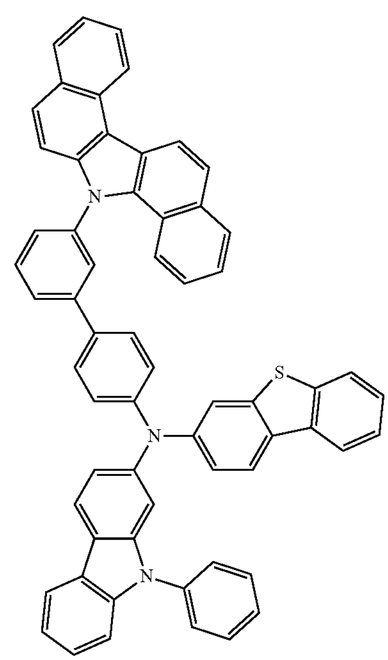

-continued
1-47
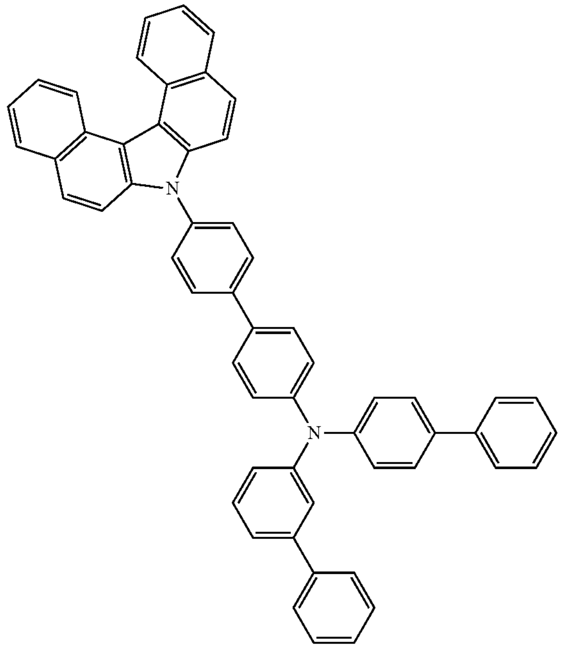
1-48
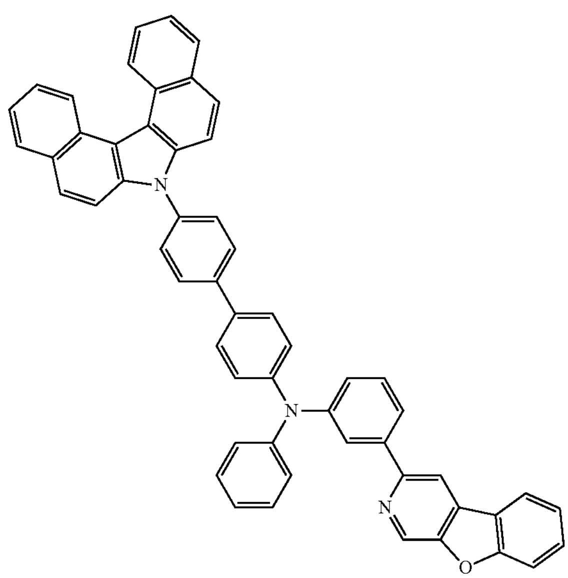
-continued
1-49
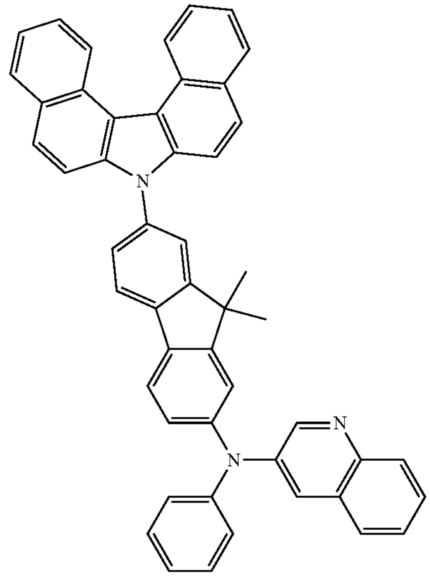
1-50
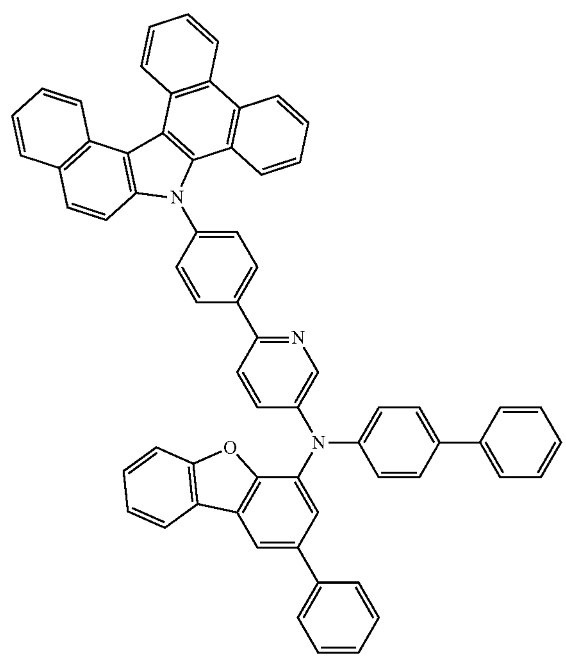

-continued
1-51
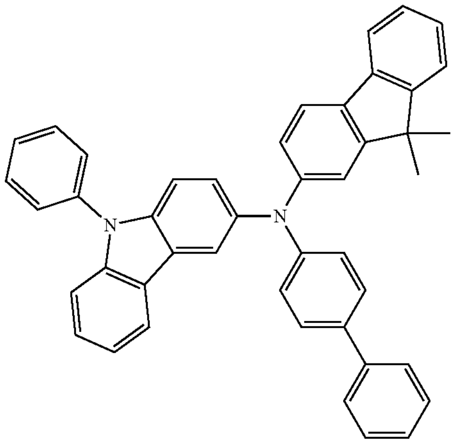
1-52
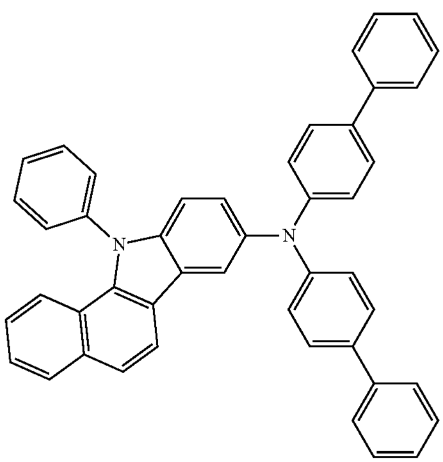
1-53
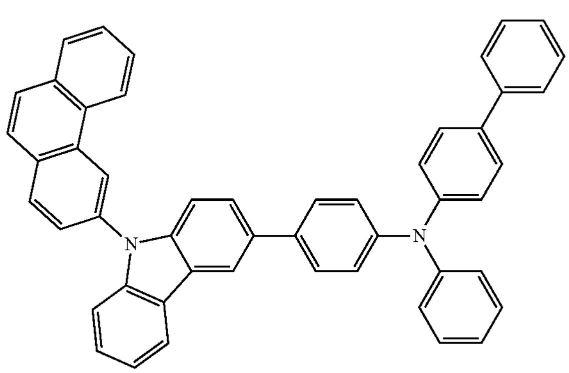
-continued
1-54
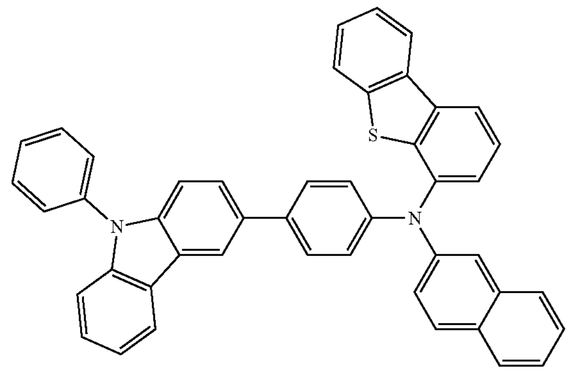
1-55
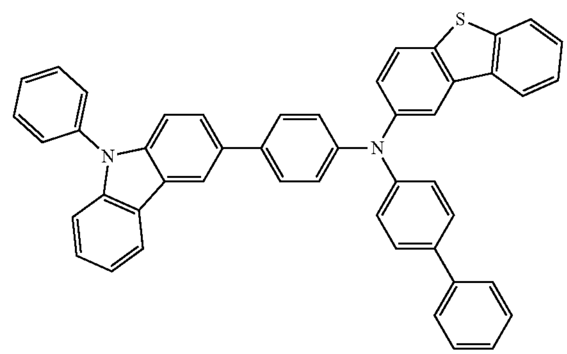
1-56
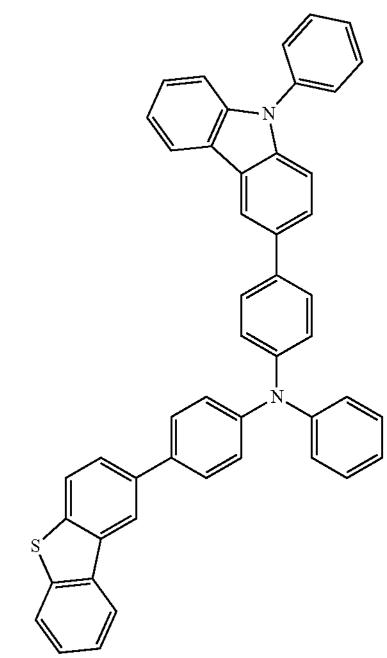

-continued
1-57
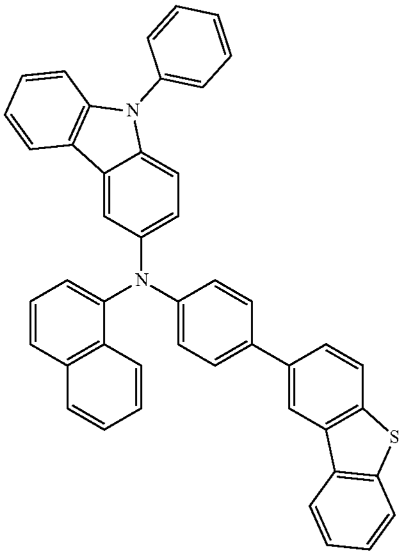
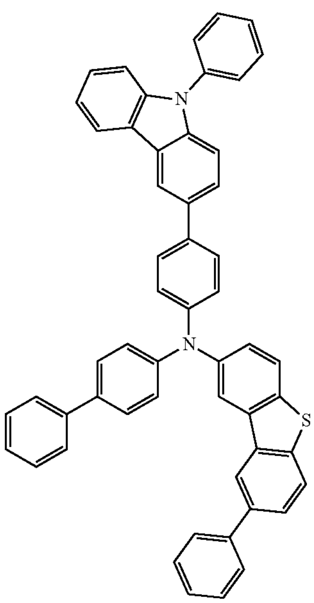
-continued
1-59
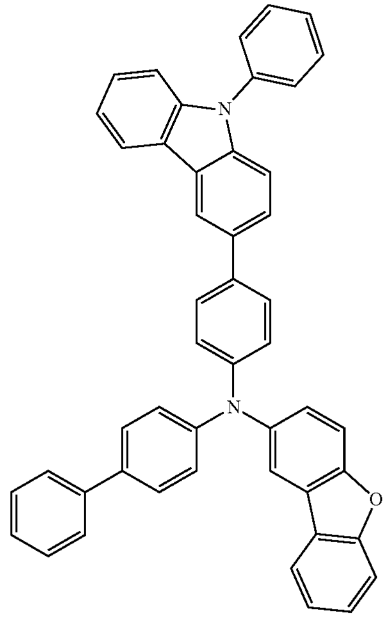
1-60
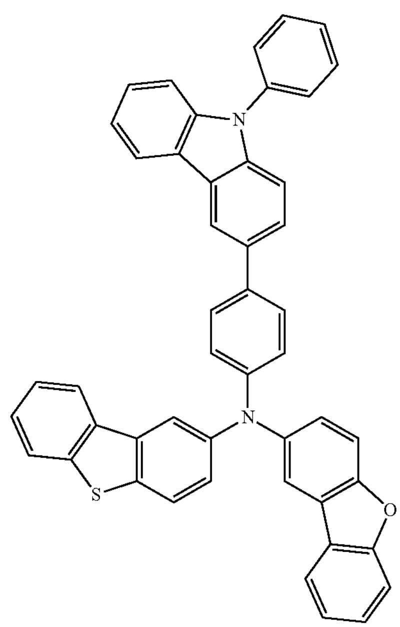

-continued
1-61
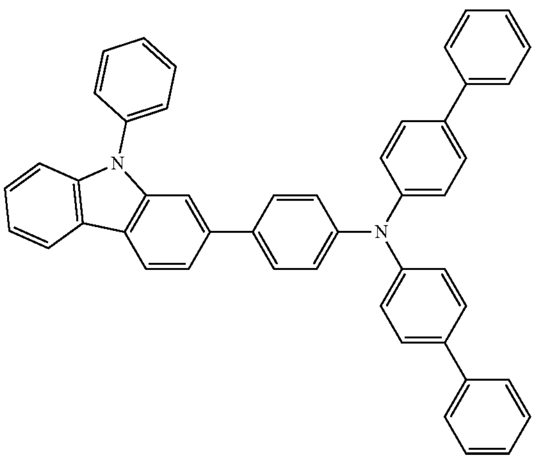
1-62
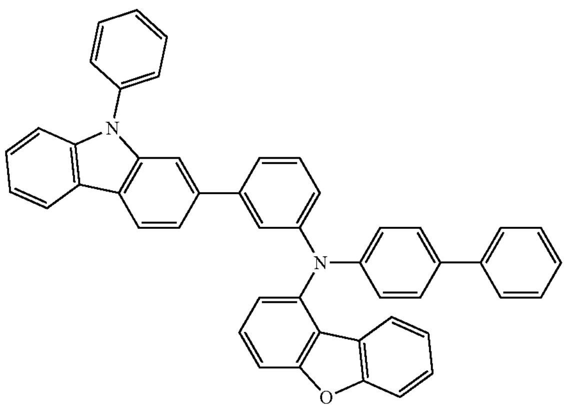
1-63
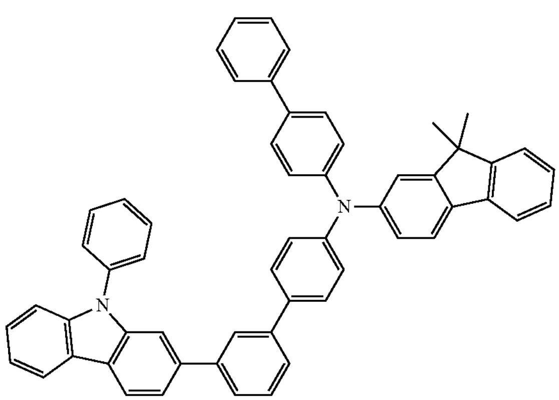
-continued
1-64
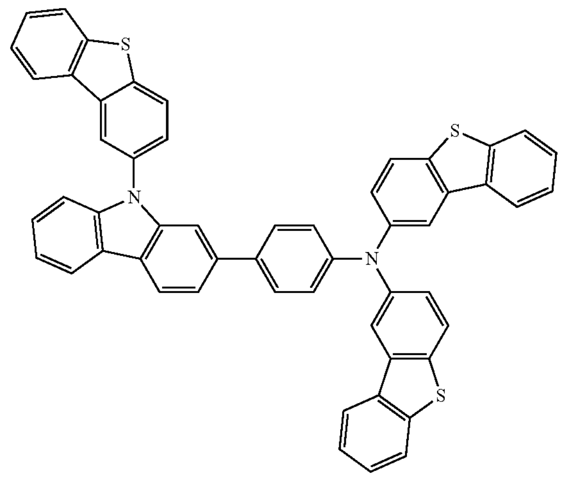
1-65
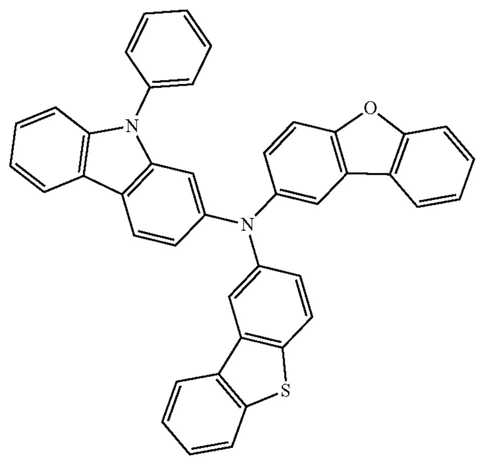
1-66
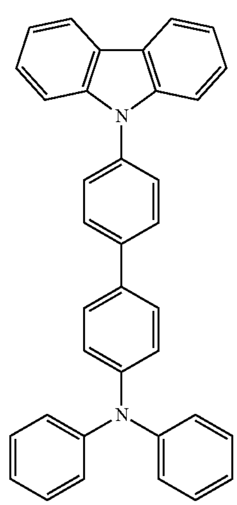

-continued
1-67
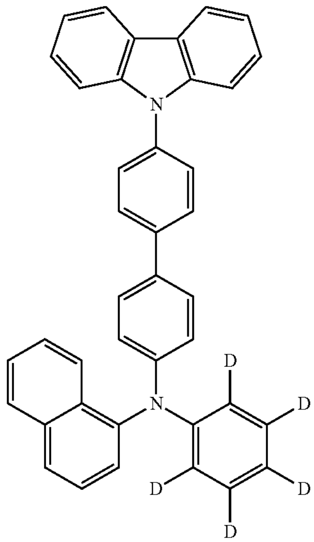
1-68
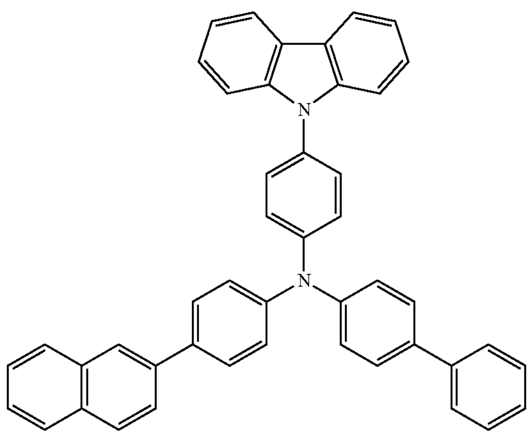
1-69
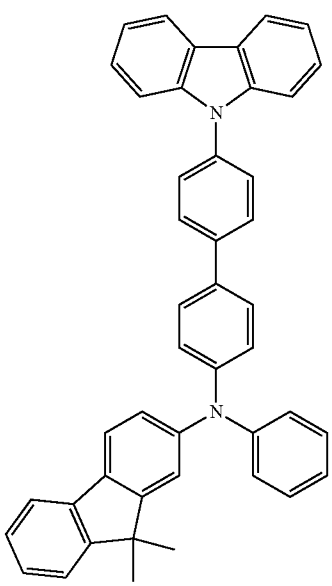
-continued
1-70
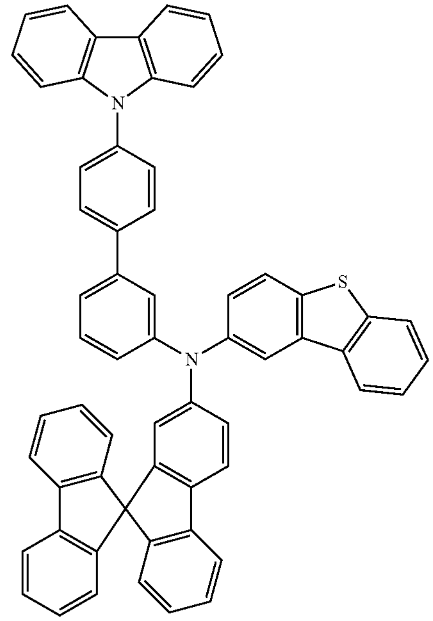
1-71
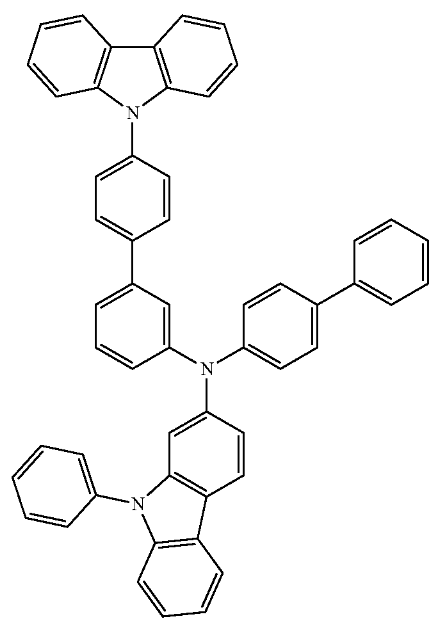

-continued
1-72
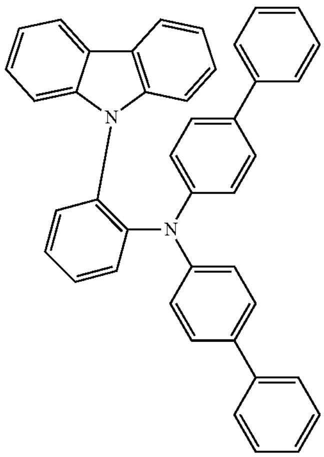
1-73
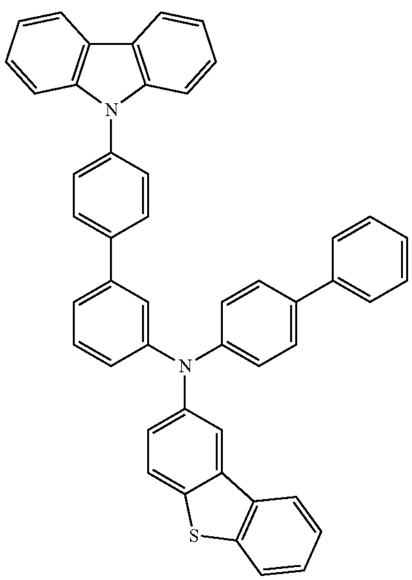
1-74
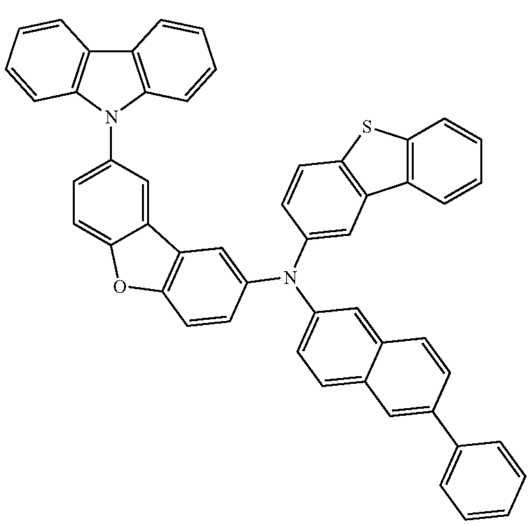
-continued
1-75
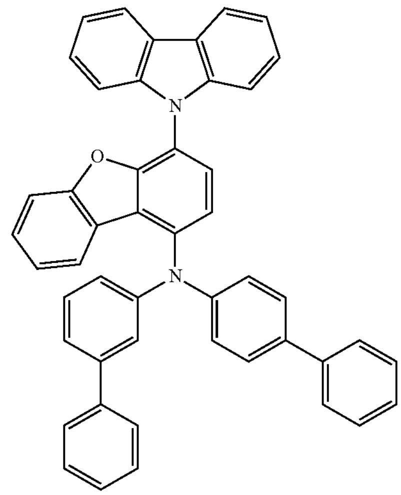
1-76
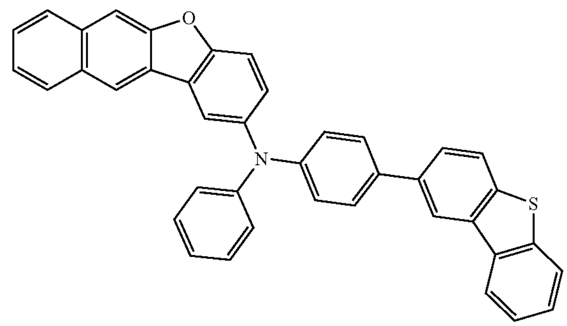
1-77
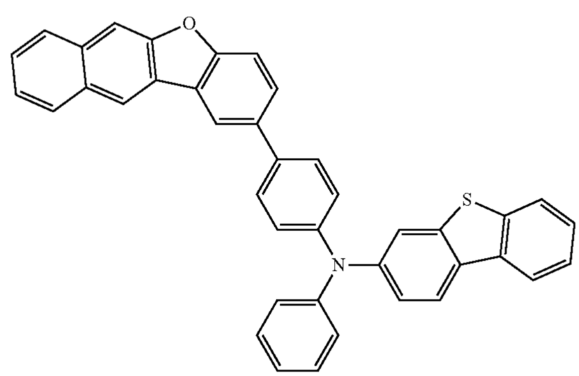
1-78
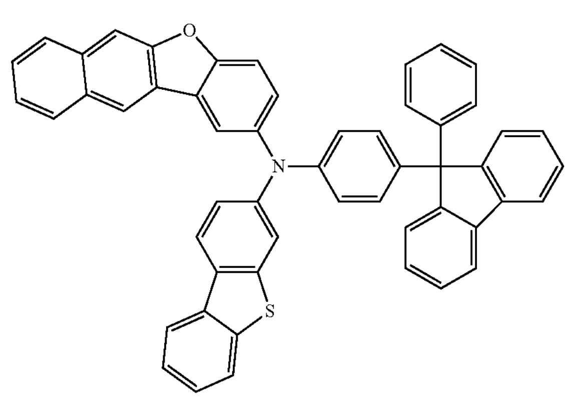

-continued
1-79
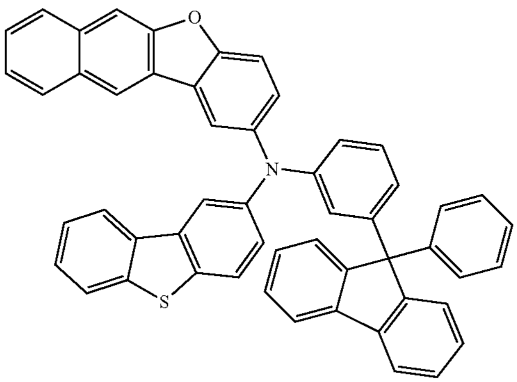
1-80
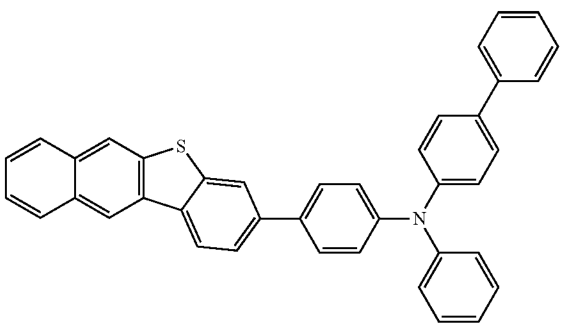
1-81
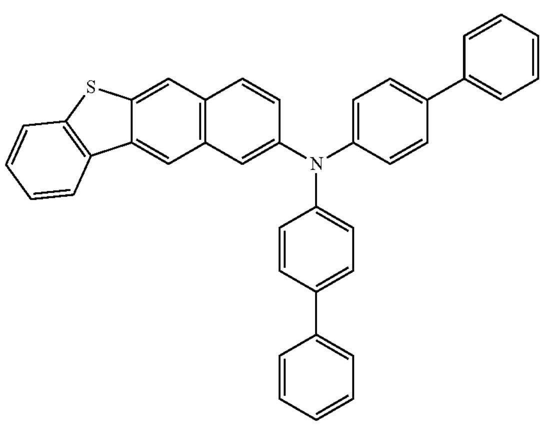
1-82
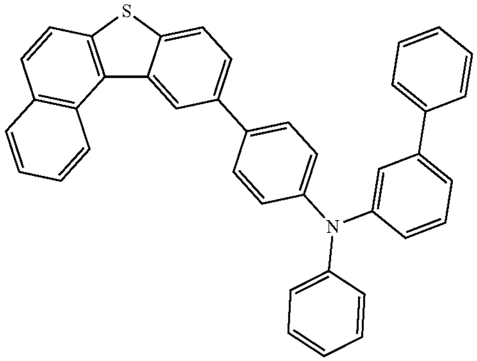
-continued
1-83
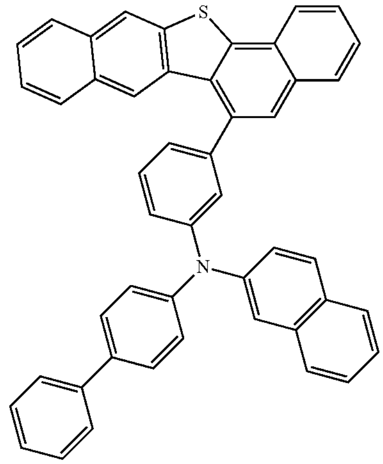
1-84
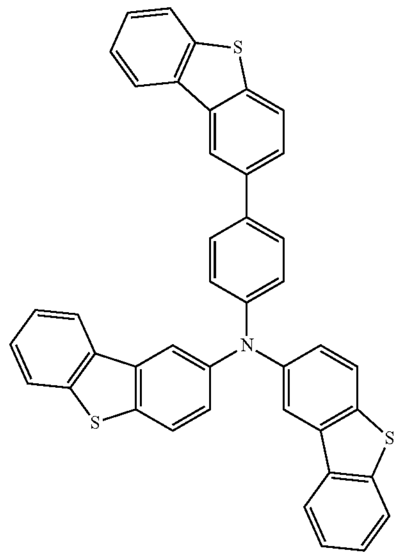
1-85
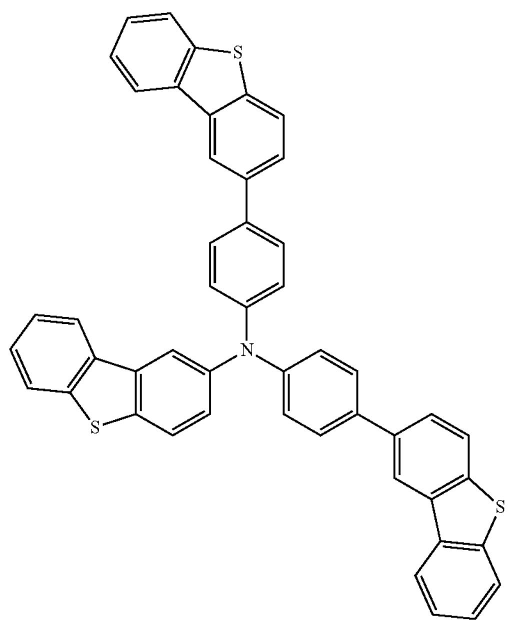

-continued
1-86
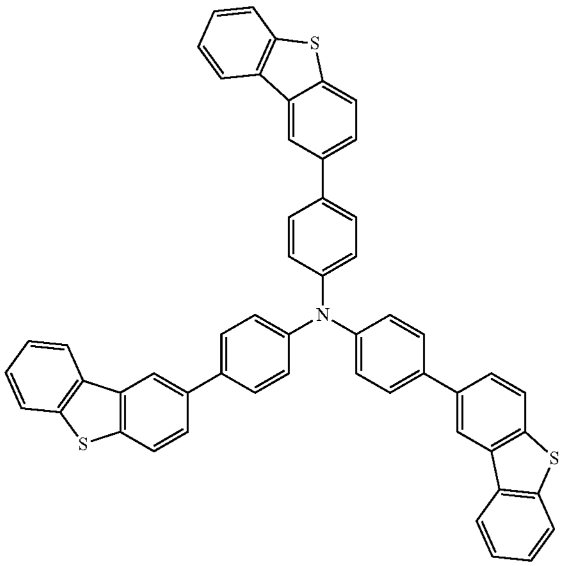
1-87
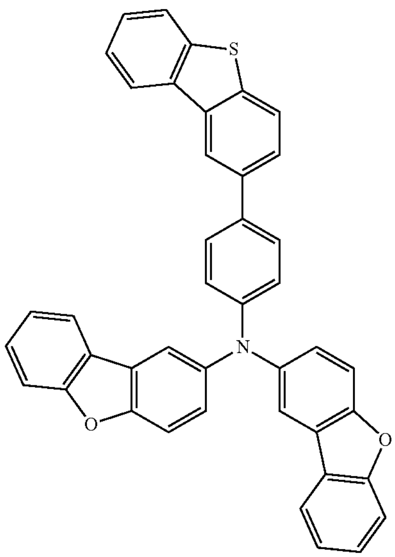
1-88
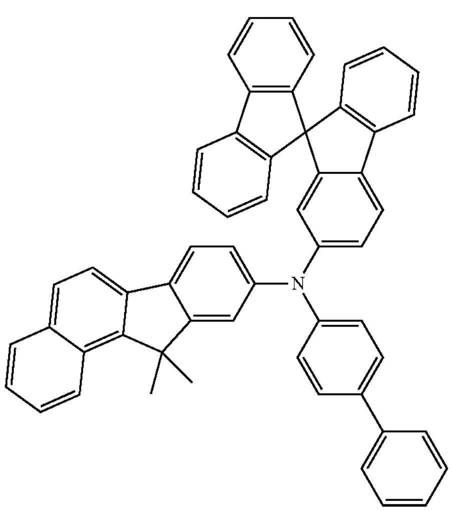
-continued
1-89
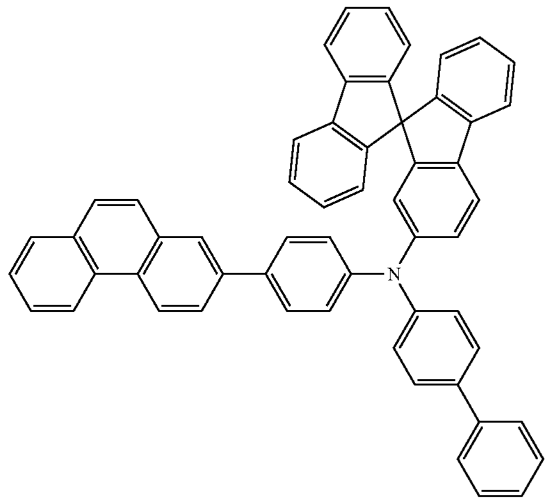
1-90
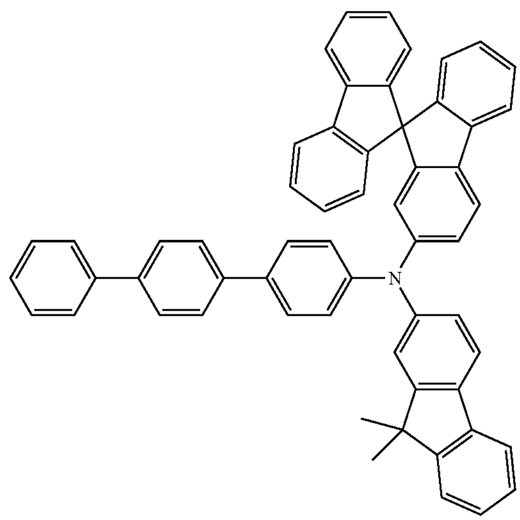
1-91
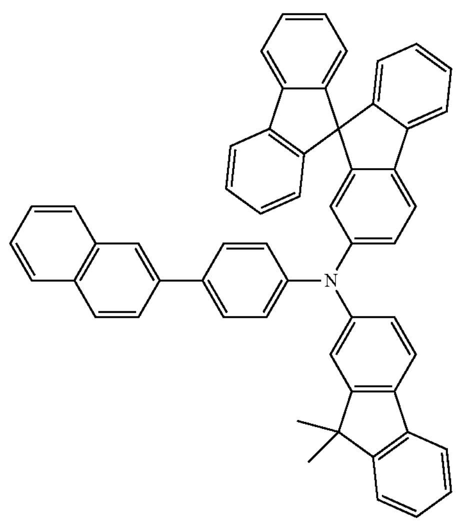

-continued
1-92
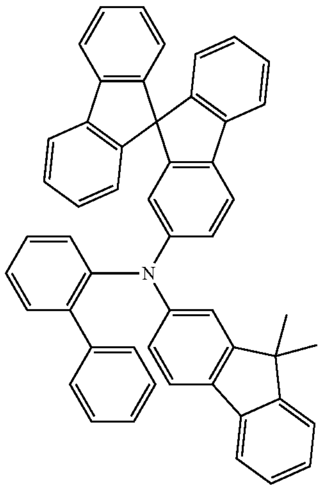
1-93
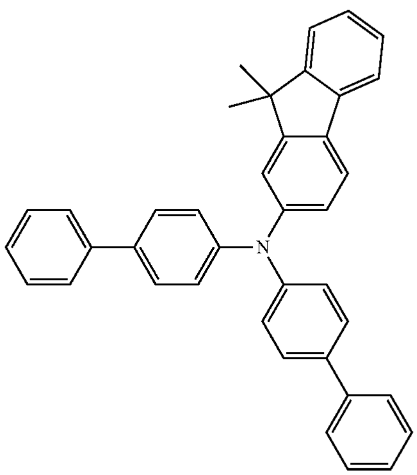
1-94
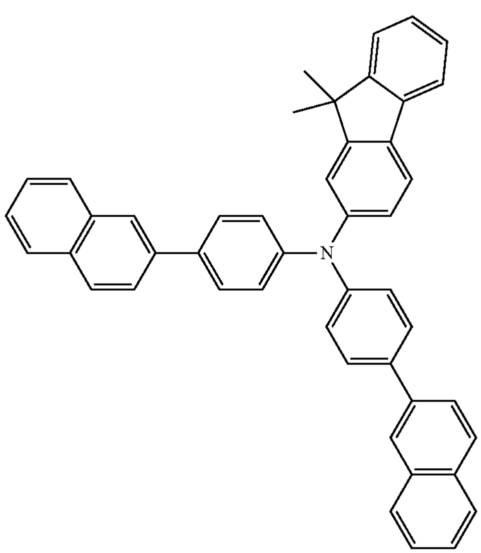
-continued
1-95
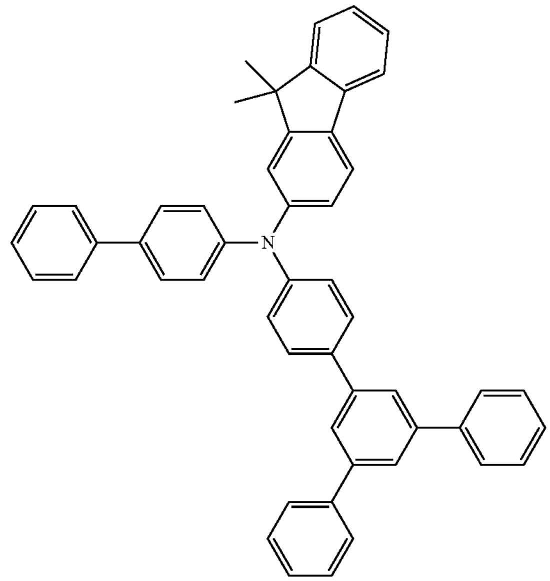
1-96
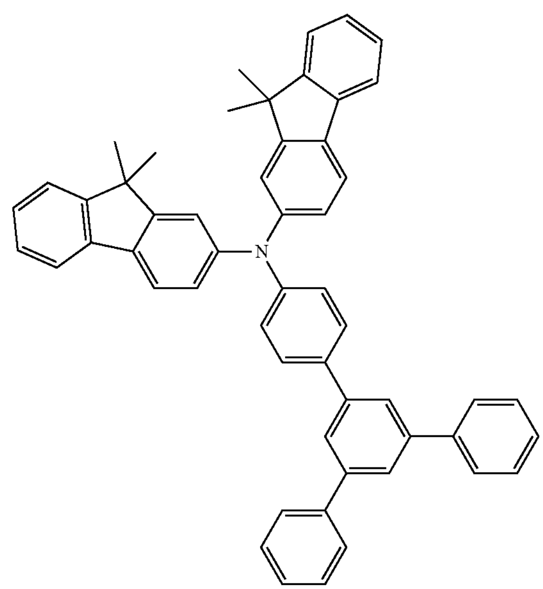

-continued
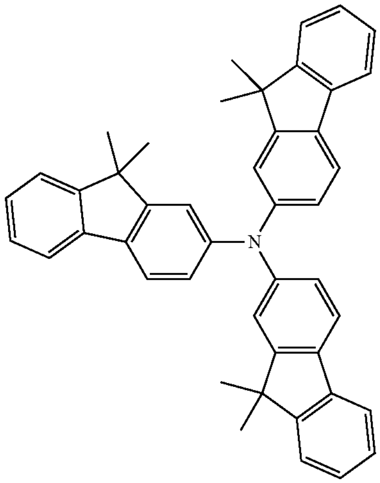
1-97
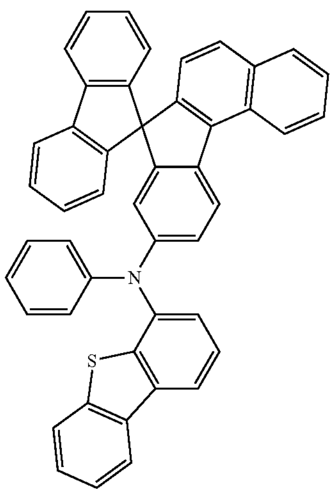
1-98
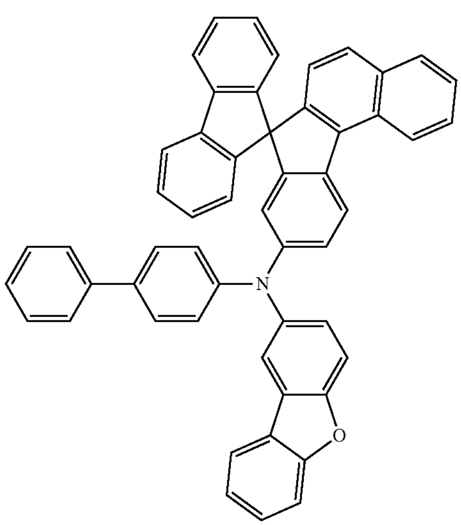
1-99
-continued
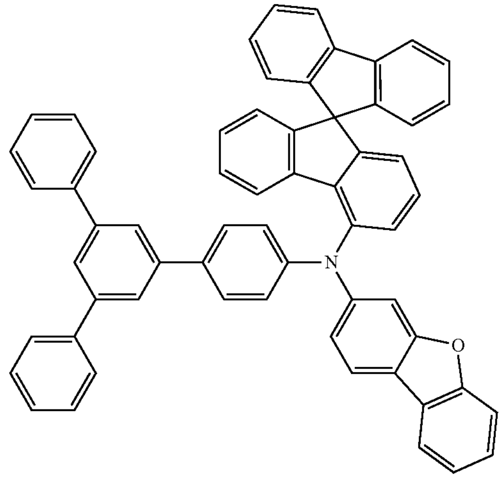
1-100
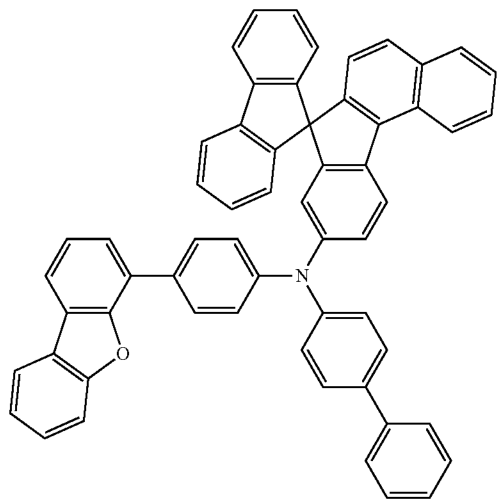
1-101
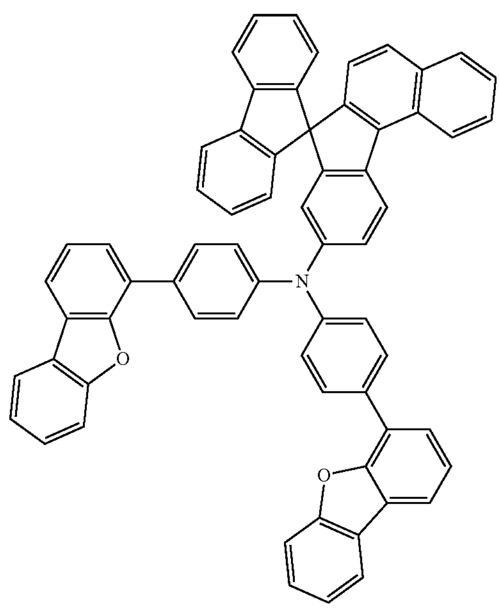
1-102

-continued
1-103
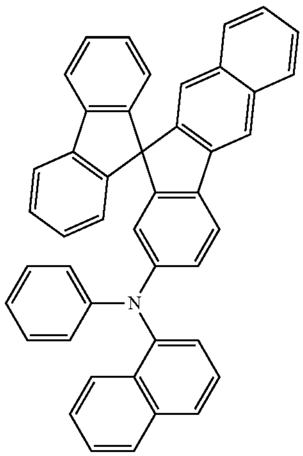
1-104
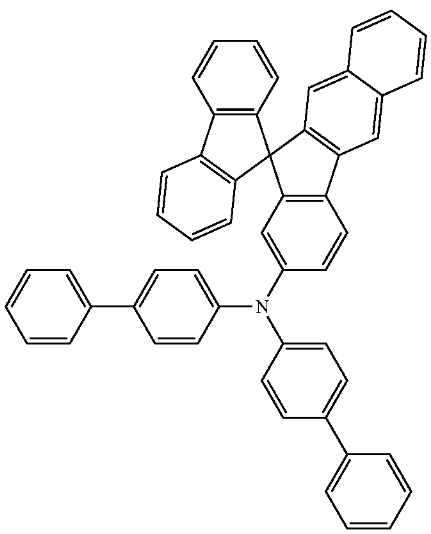
1-105
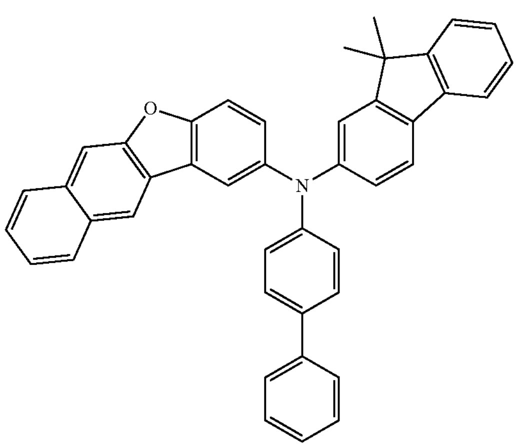
-continued
1-106
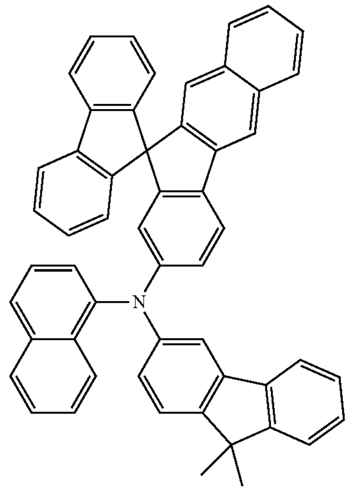
1-107
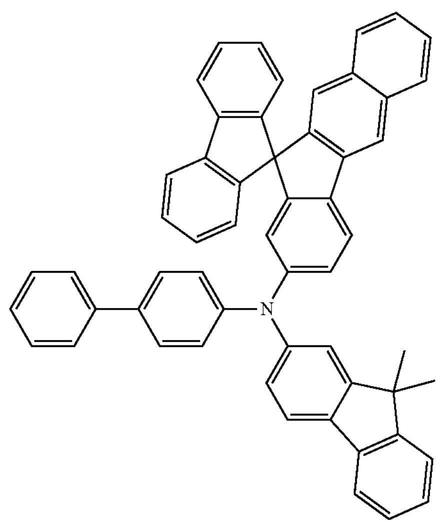
1-108
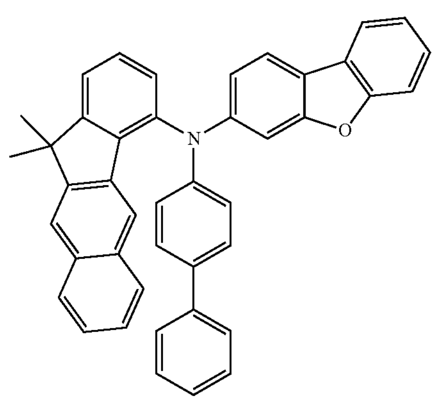

-continued
1-109
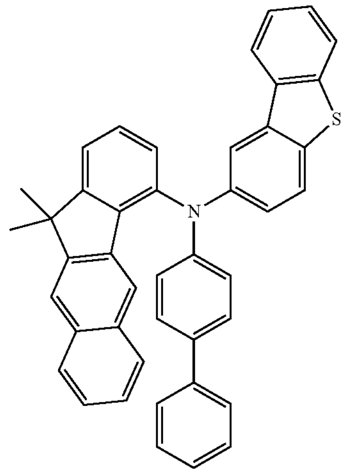
1-110
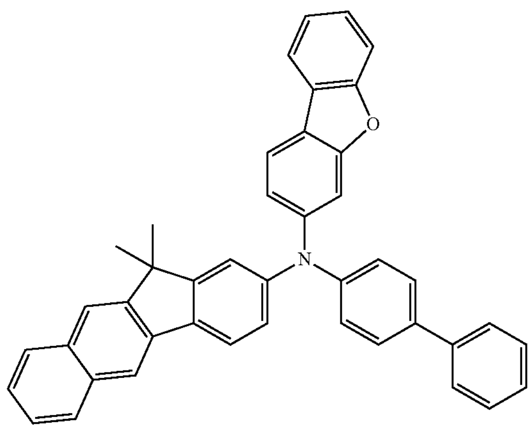
1-111
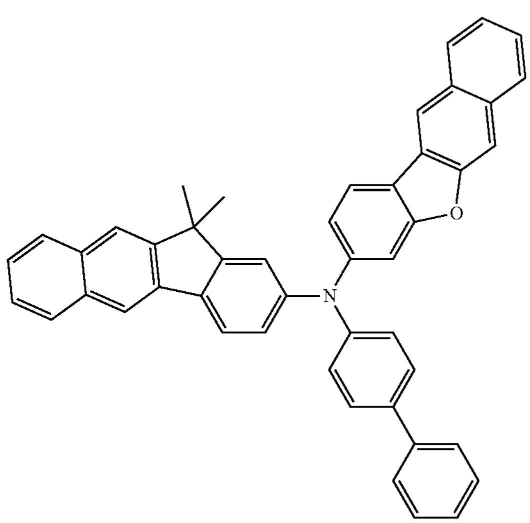
-continued
1-112
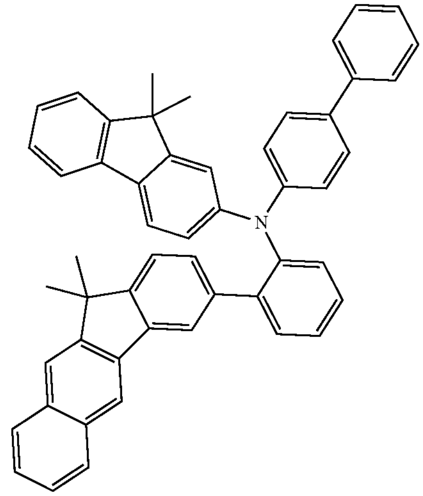
1-113
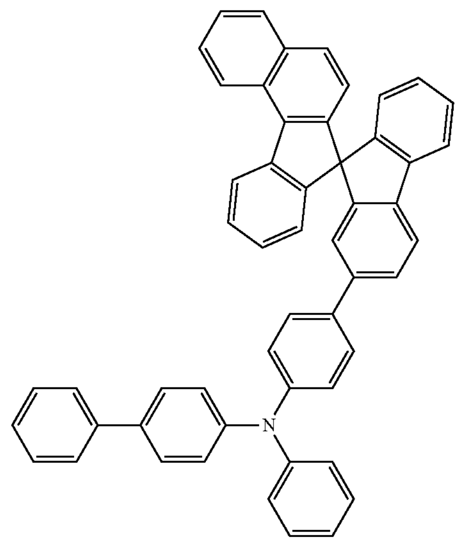
1-114
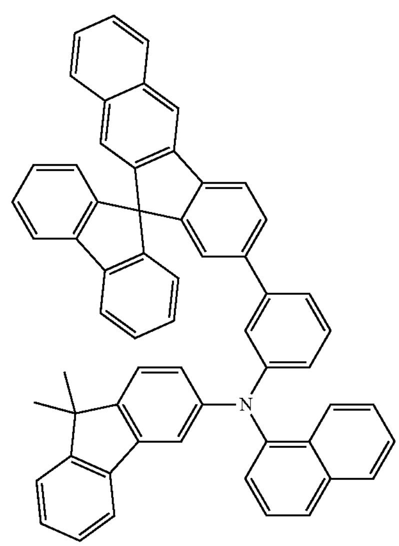

-continued
1-115
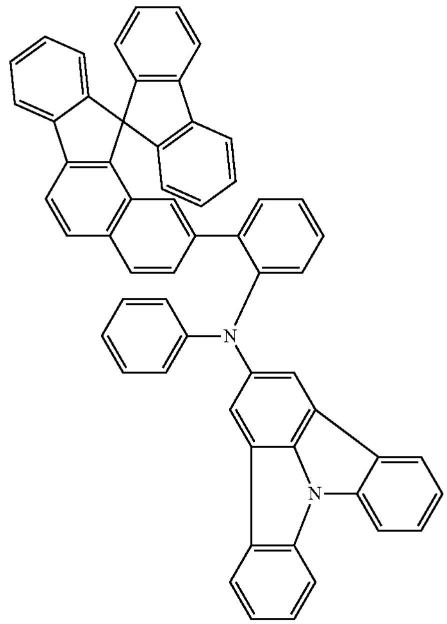
1-116
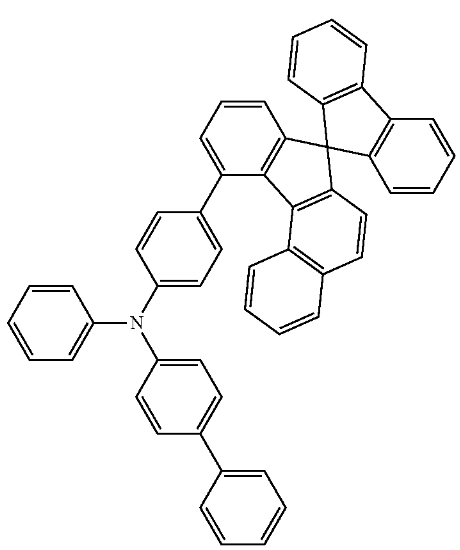
-continued
1-117
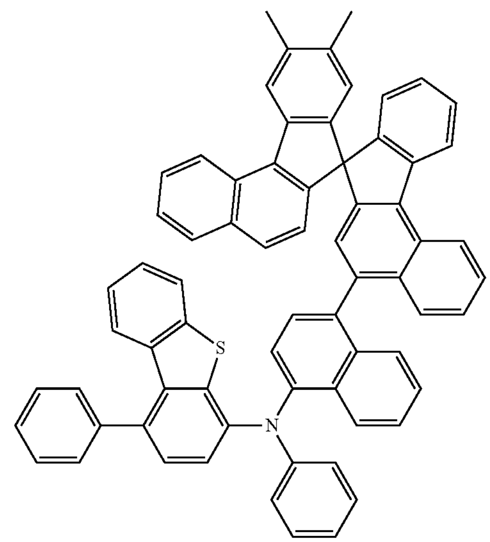
1-118
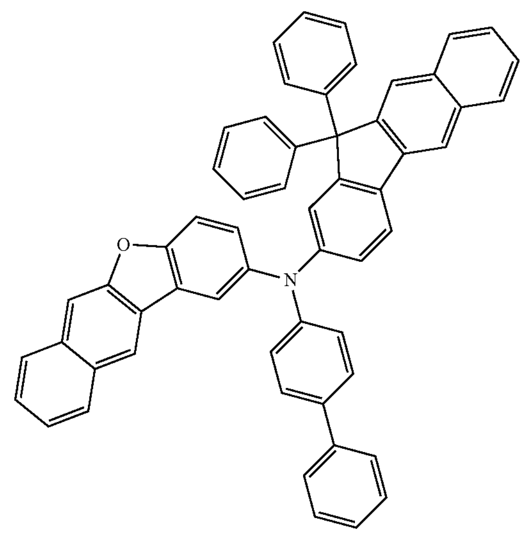
1-119
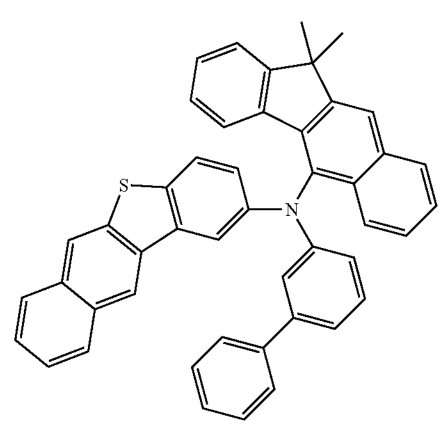

-continued
1-120
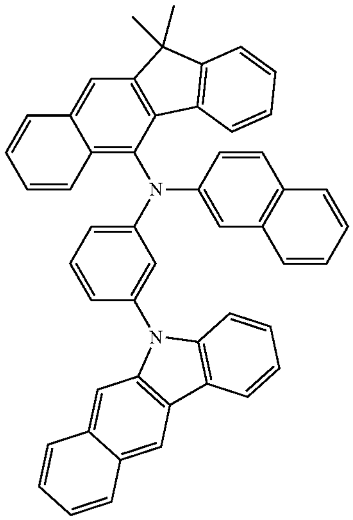
1-121
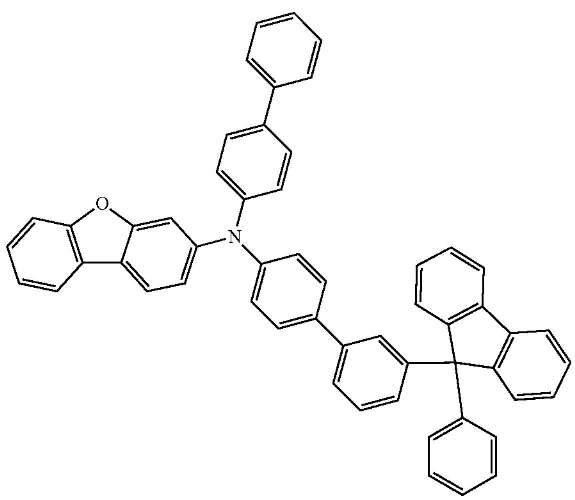
1-122
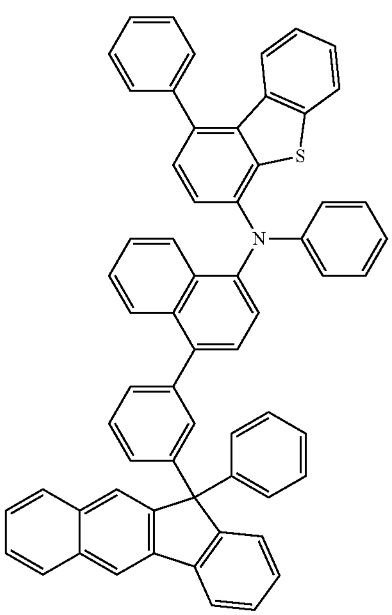
-continued
1-123
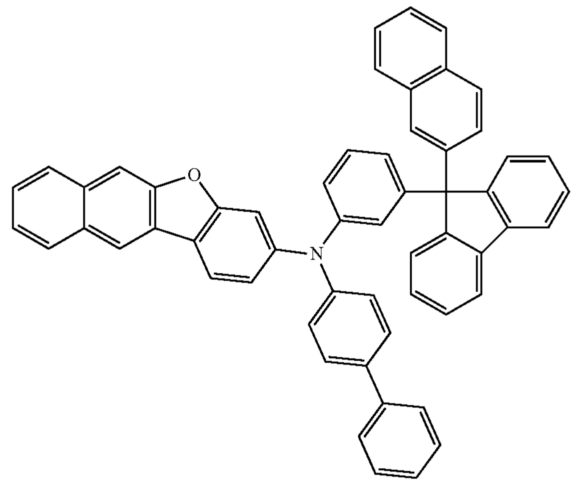
1-124
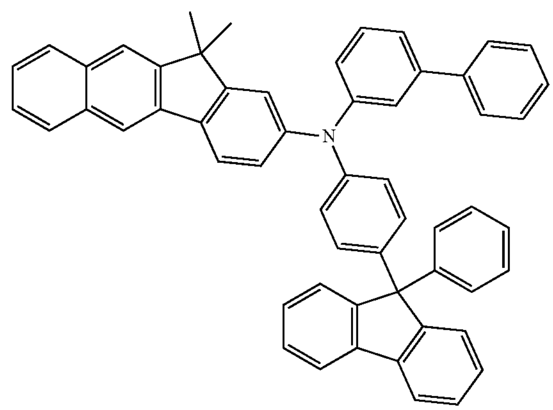
1-125
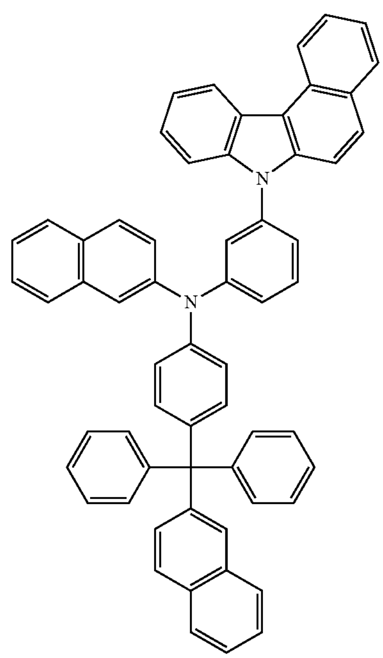

1-126
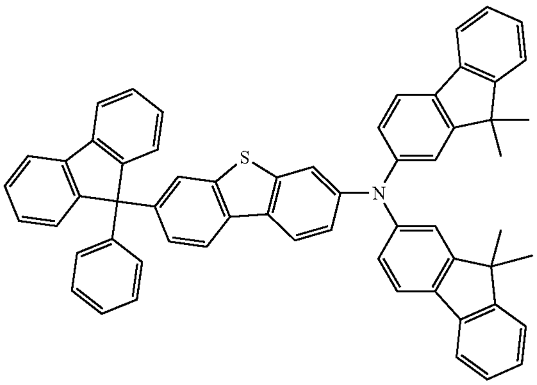
1-127
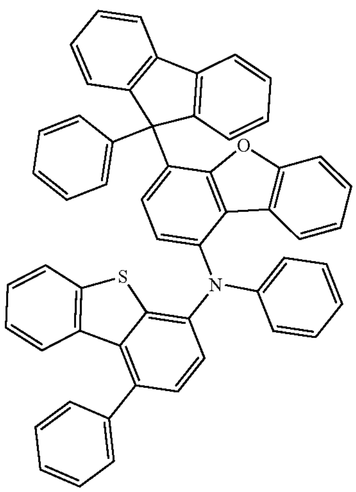
1-128
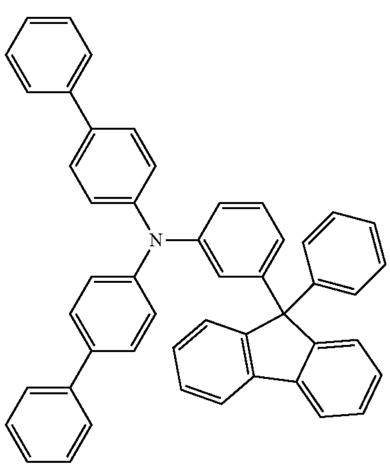
1-129
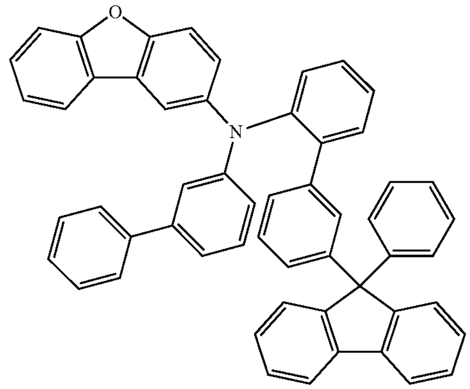
1-130
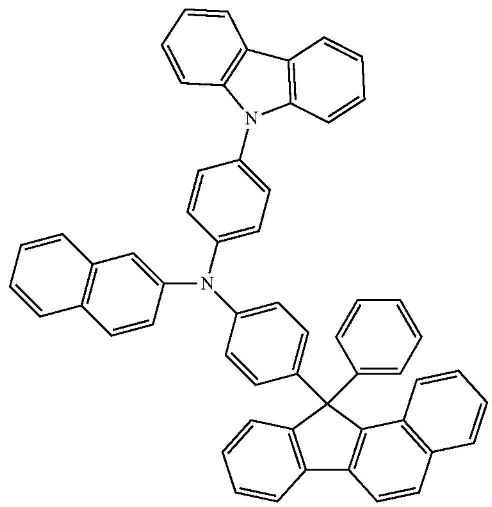
1-131
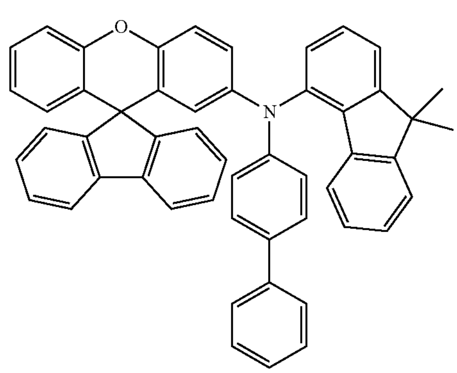

-continued
1-132
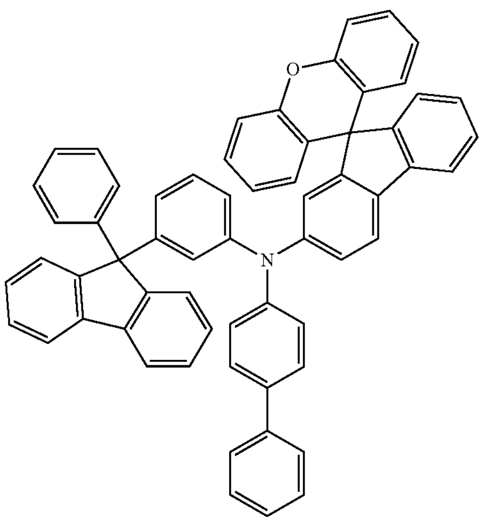
1-133
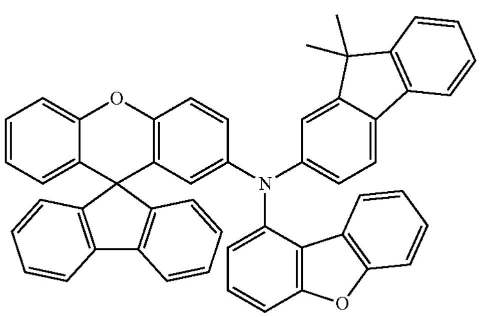
1-134
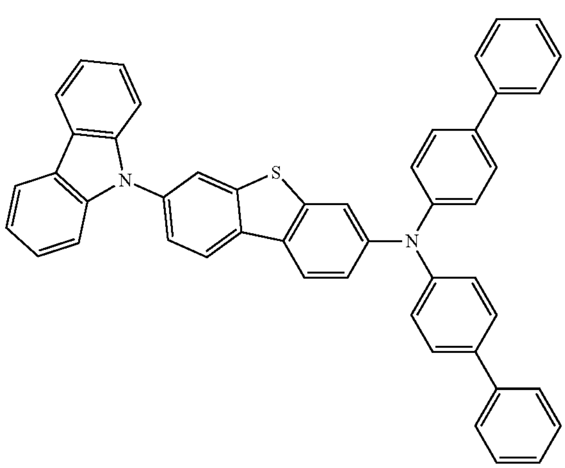
-continued
1-135
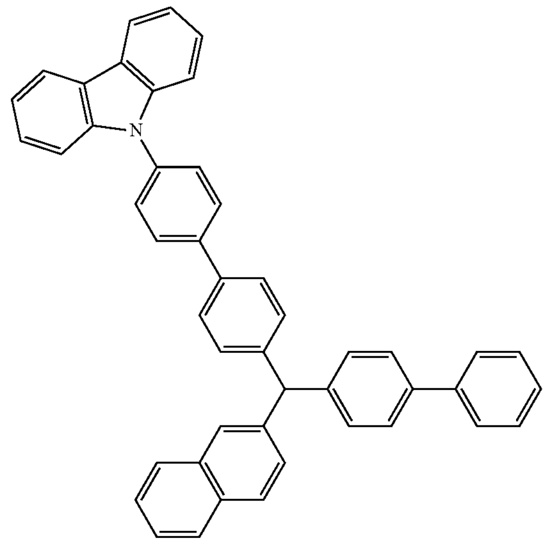
P-1
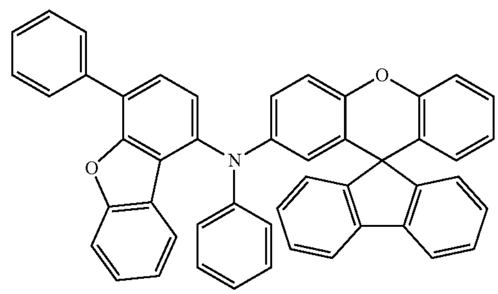
P-2
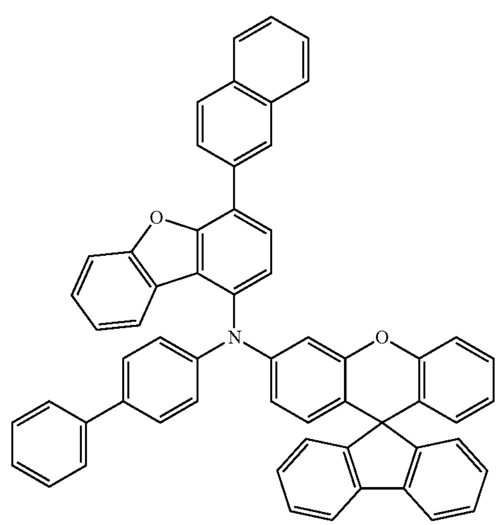

-continued
P-3
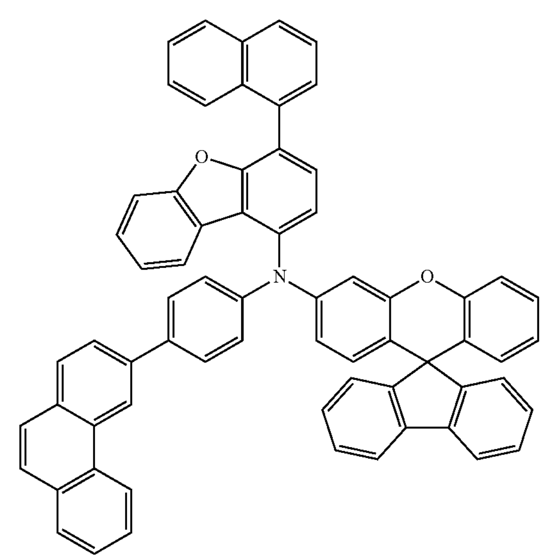
P-4
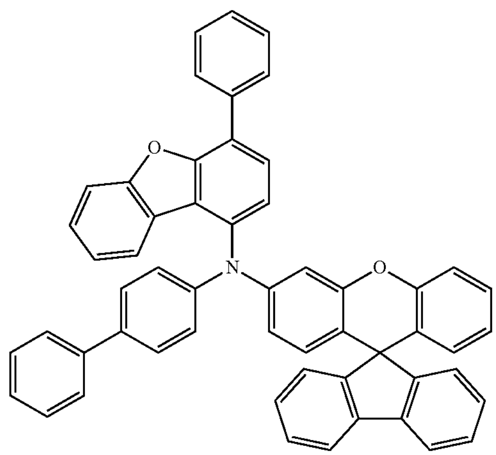
P-5
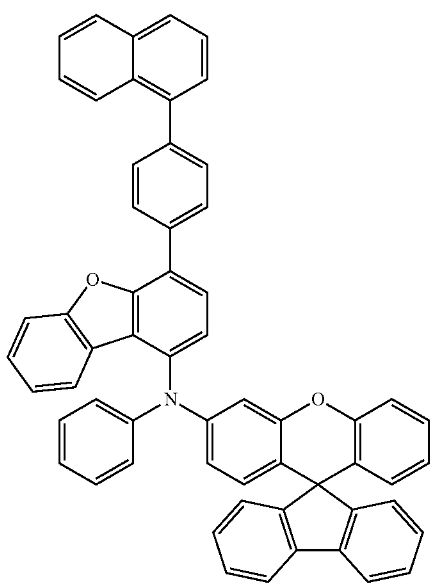
-continued
P-6
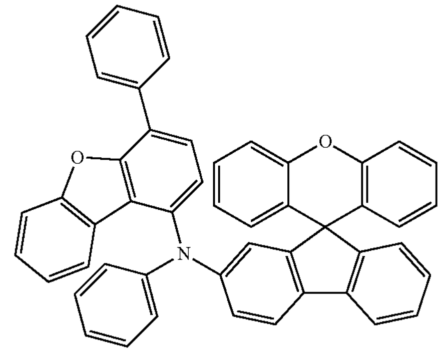
P-7
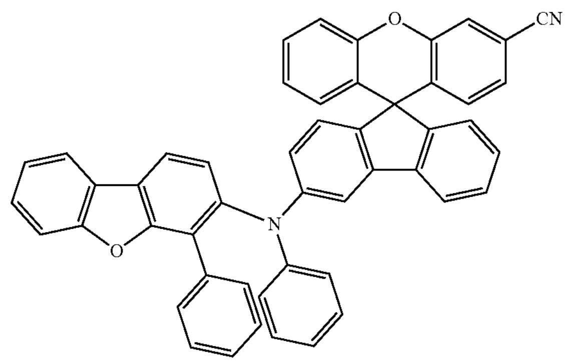
P-8
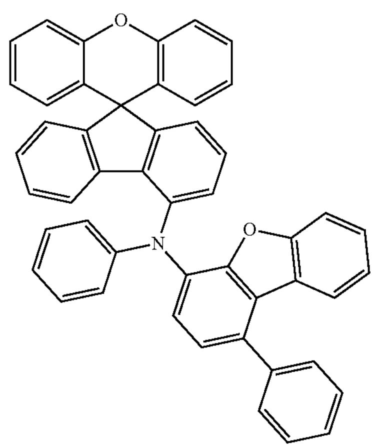
P-9
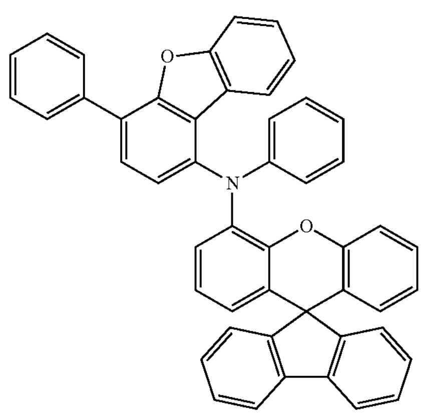

-continued
P-10
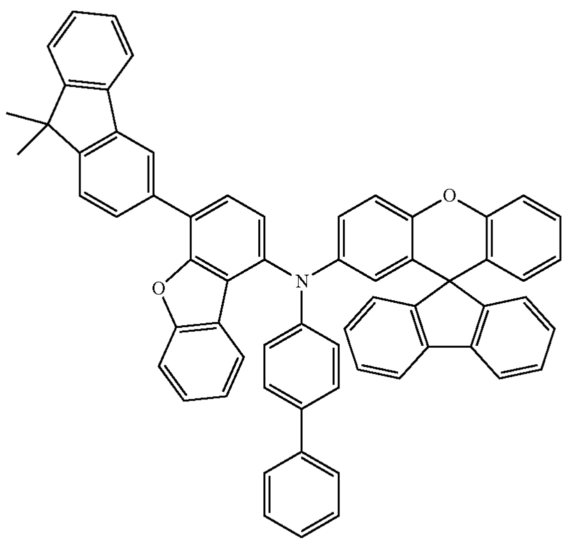
P-11
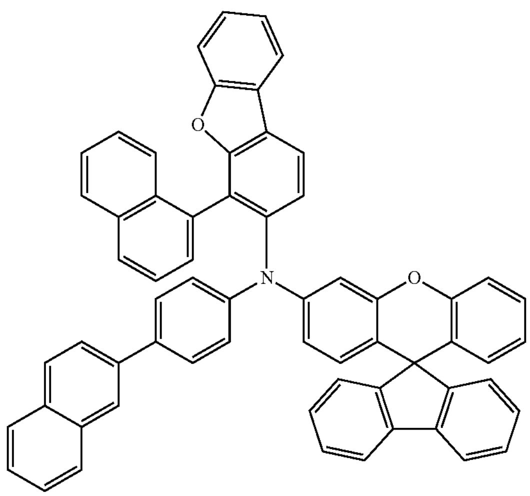
P-12
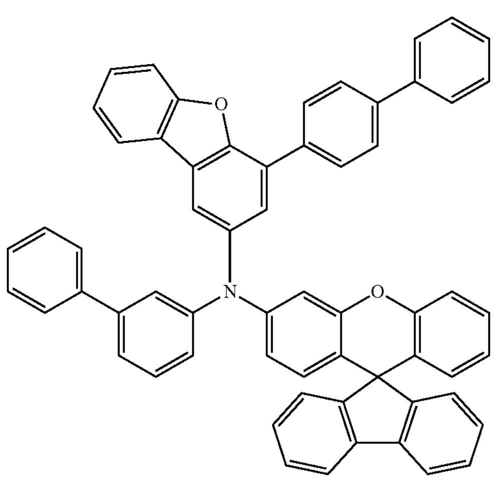
-continued
P-13
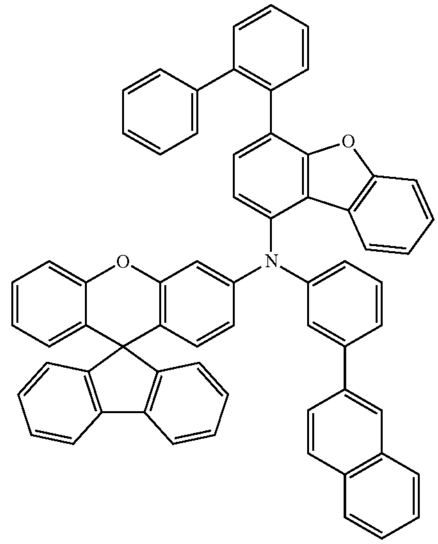
P-14
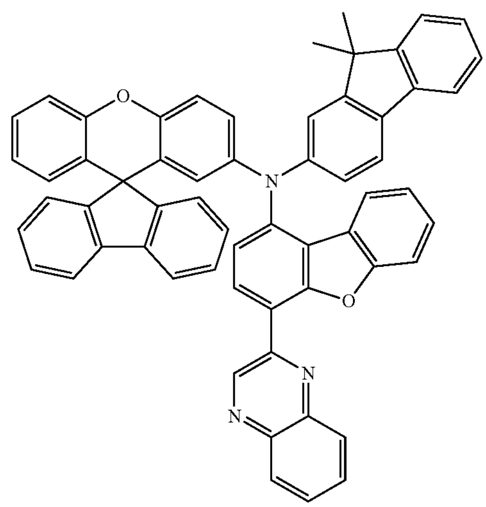
P-15
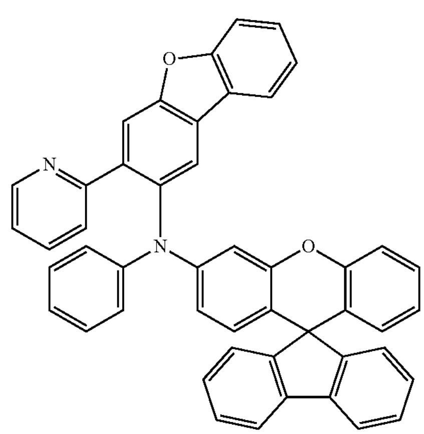

-continued
P-16
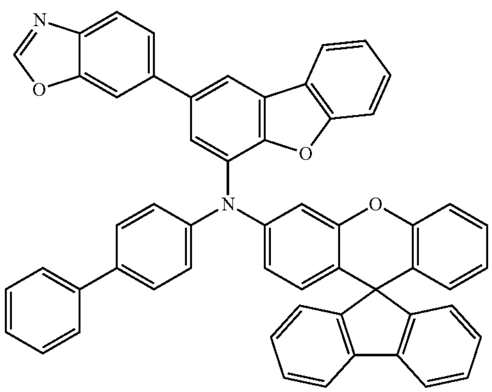
P-17
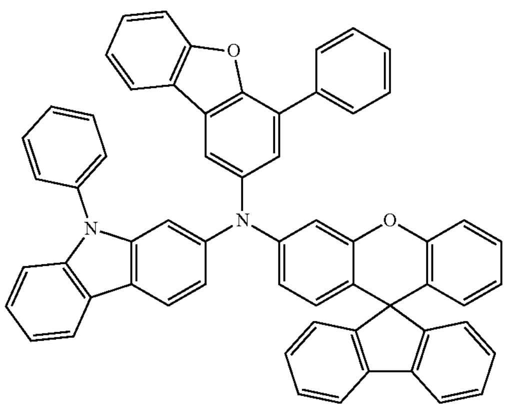
P-18
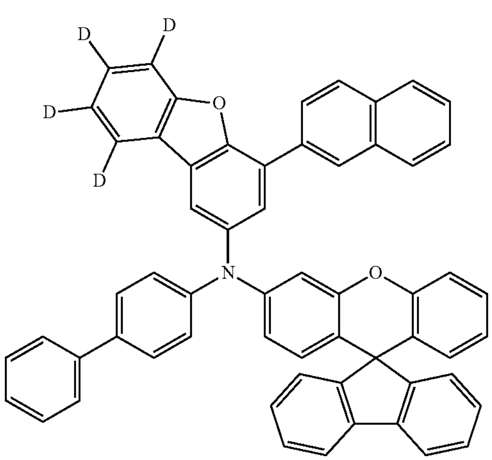
-continued
P-19
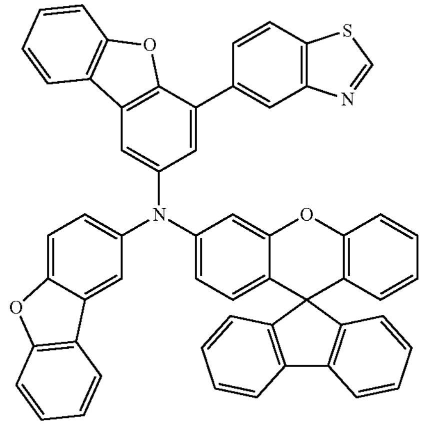
P-20
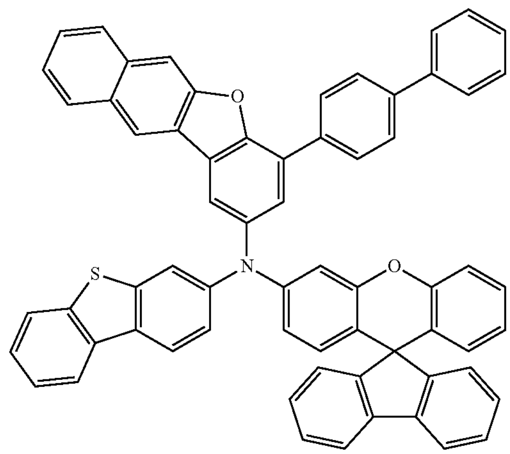
P-21
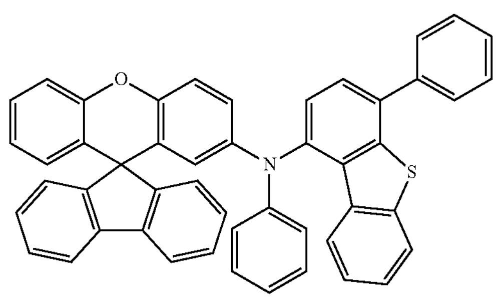
P-22
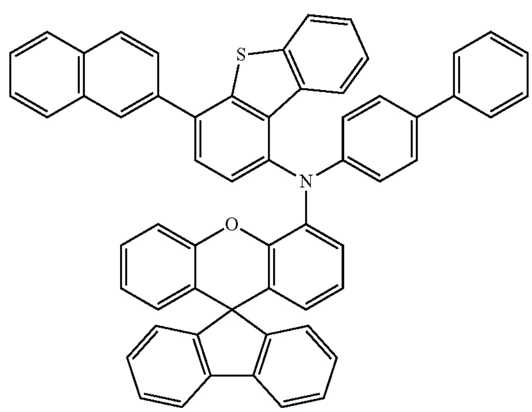

-continued
P-23
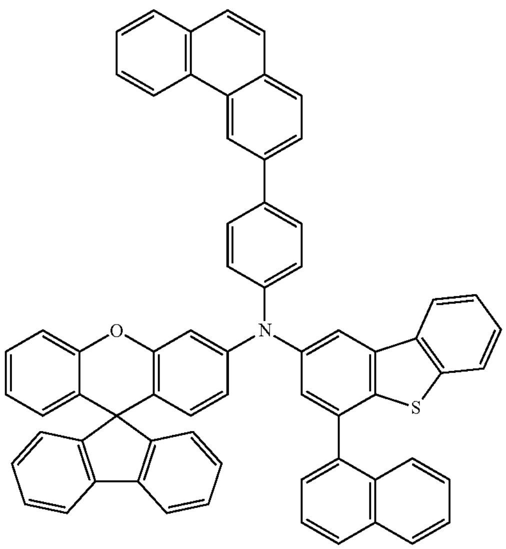
P-24
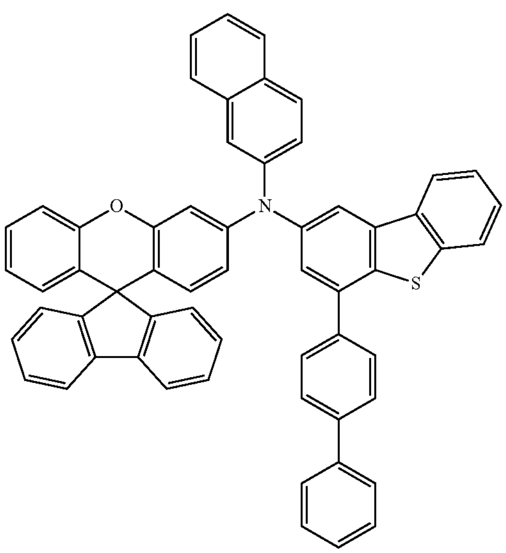
P-25
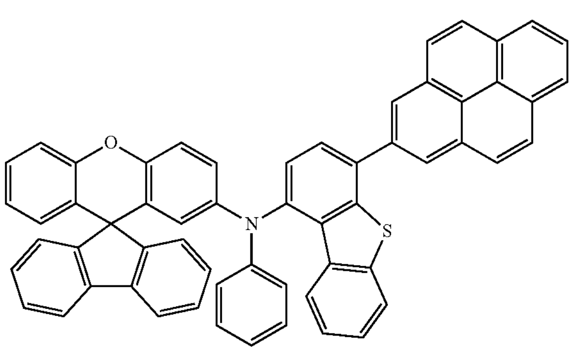
-continued
P-26
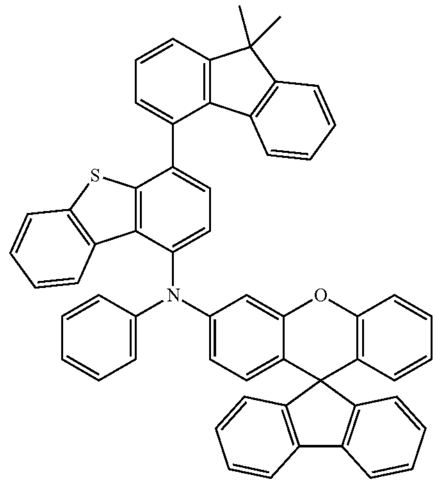
P-27
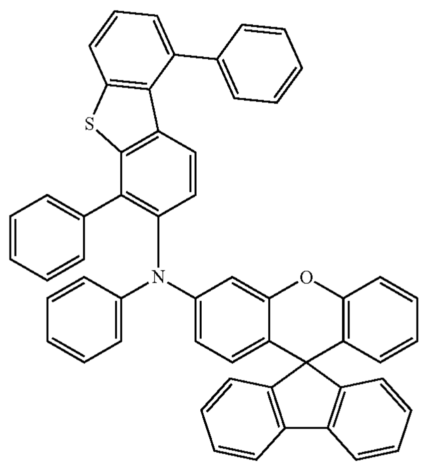
P-28
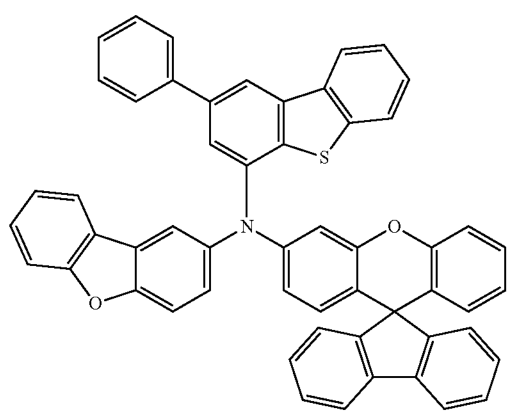

-continued
P-29
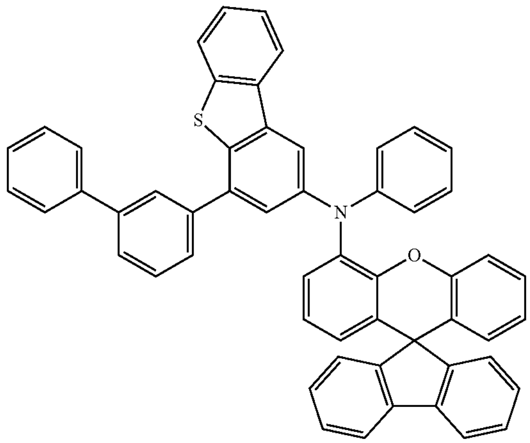
P-30
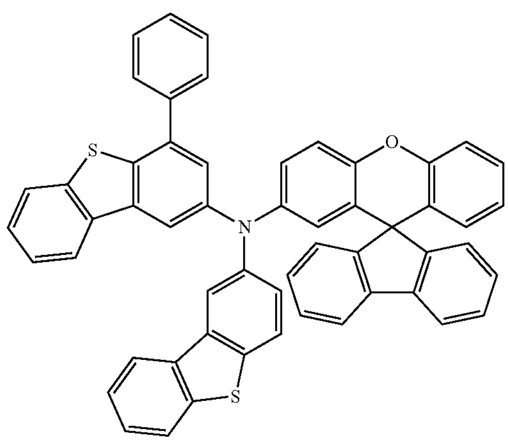
P-31
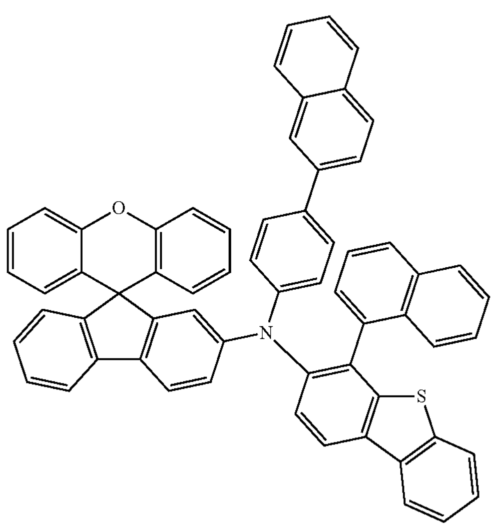
-continued
P-32
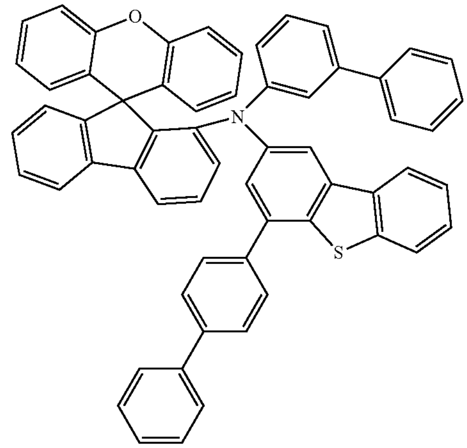
P-33
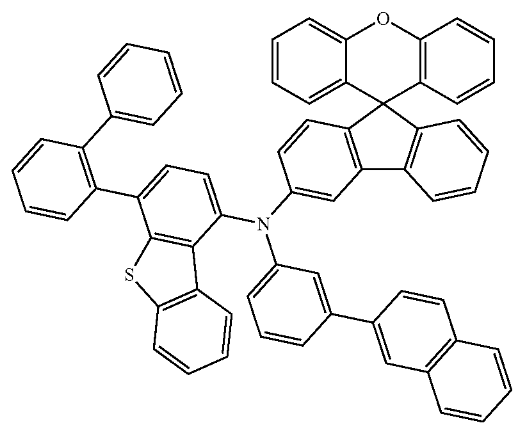
P-34
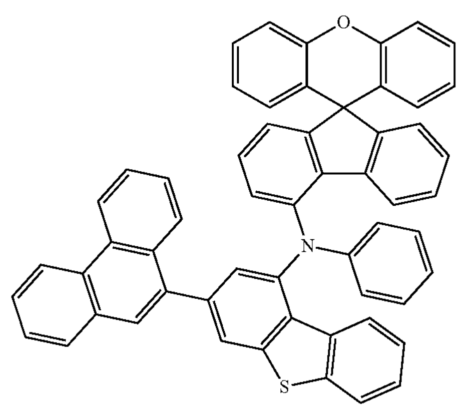
P-35
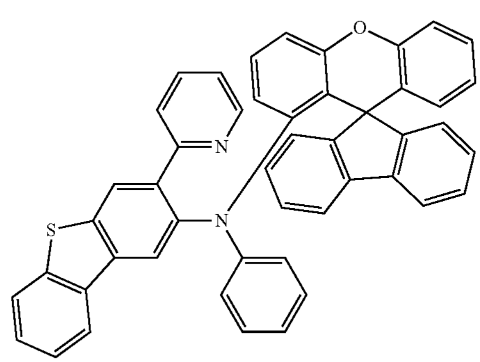

-continued
P-36
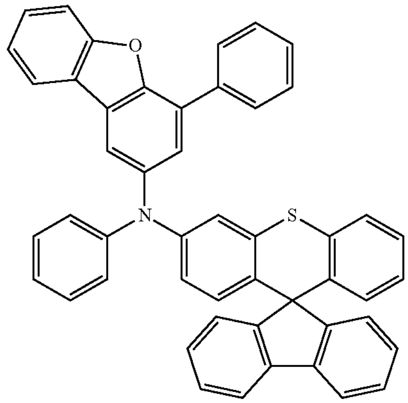
P-37
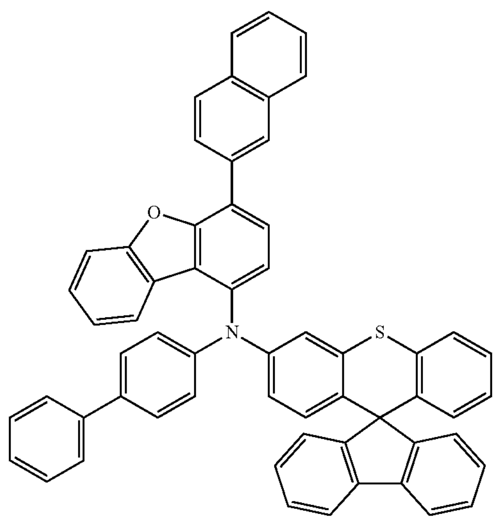
P-38
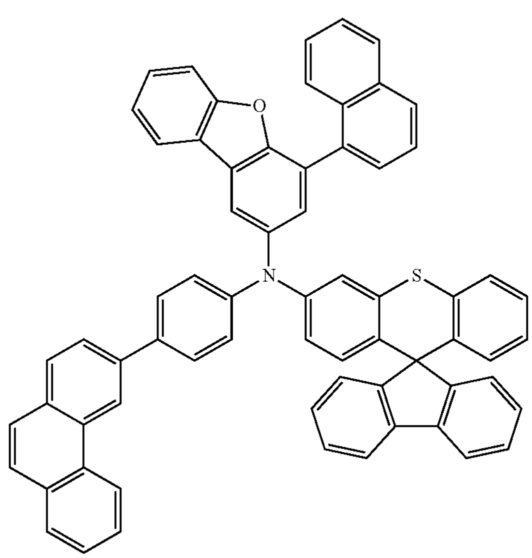
-continued
P-39
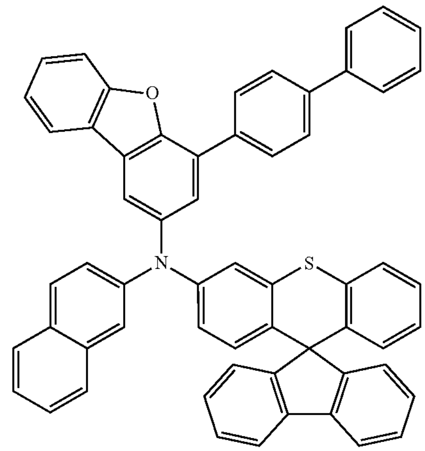
P-40
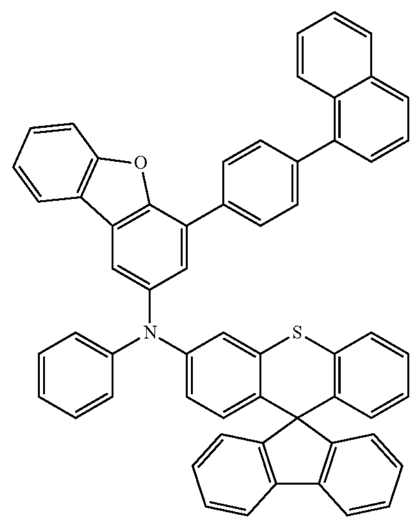
P-41
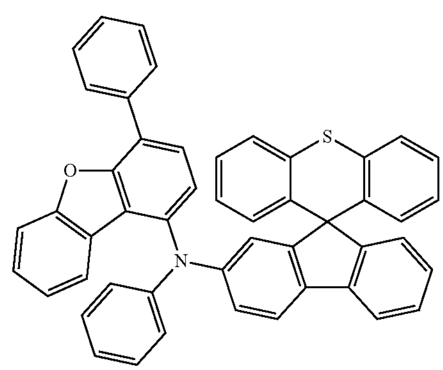

-continued
P-42
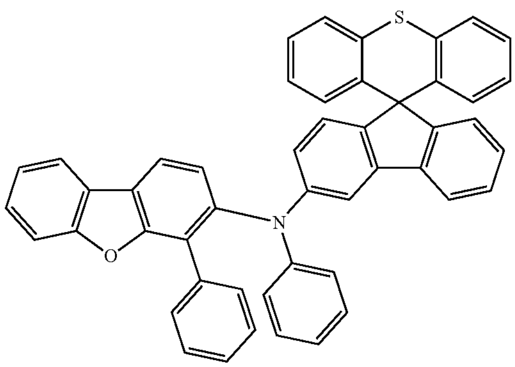
P-43
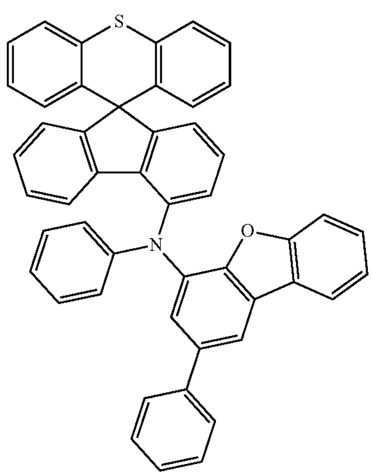
P-44
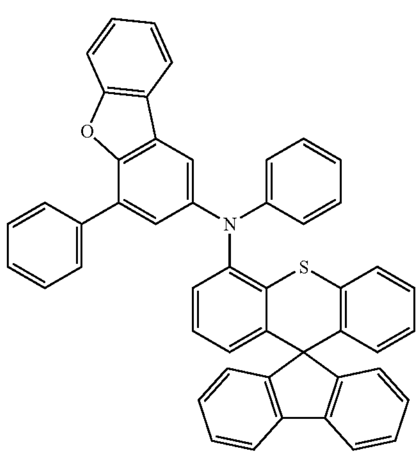
-continued
P-45
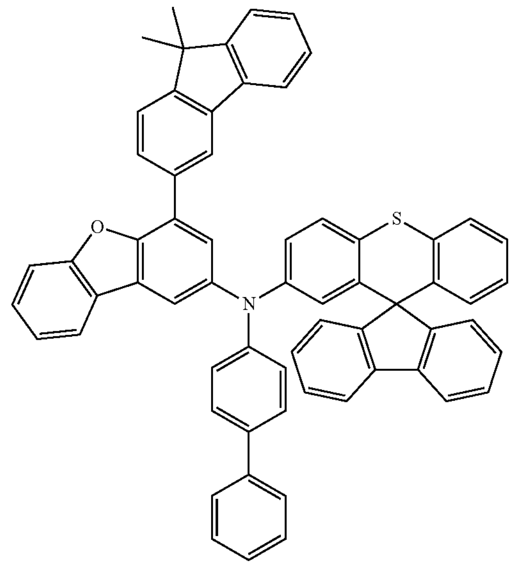
P-46
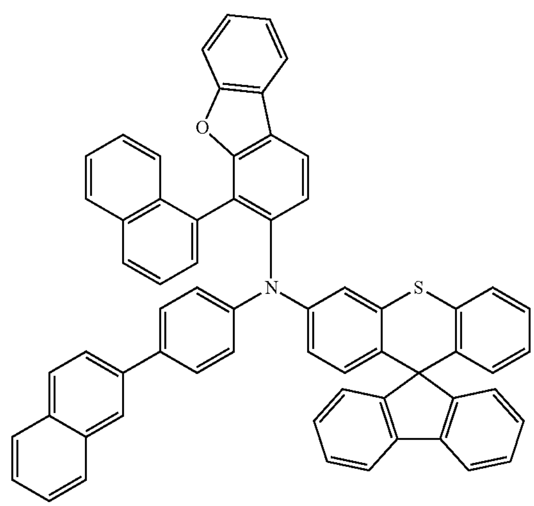
P-47
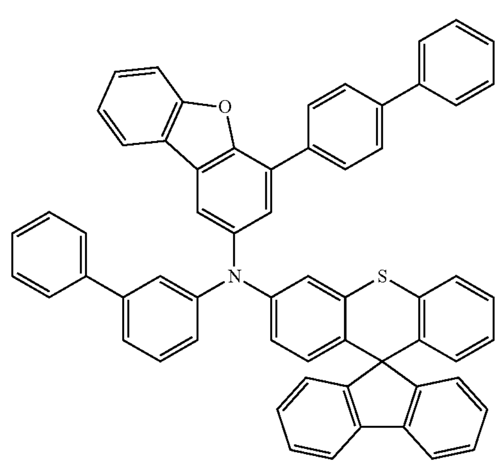

-continued
P-48
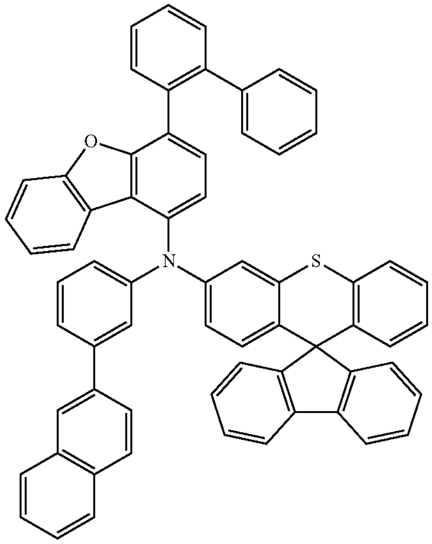
P-49
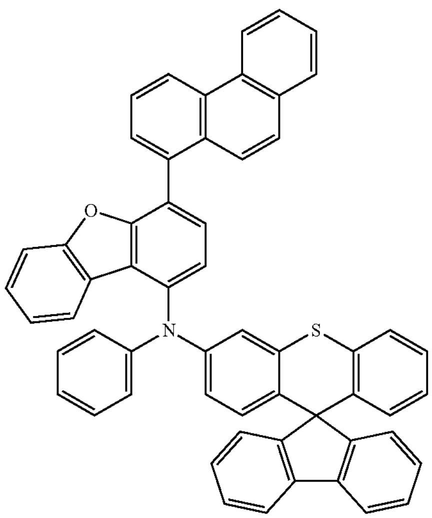
P-50
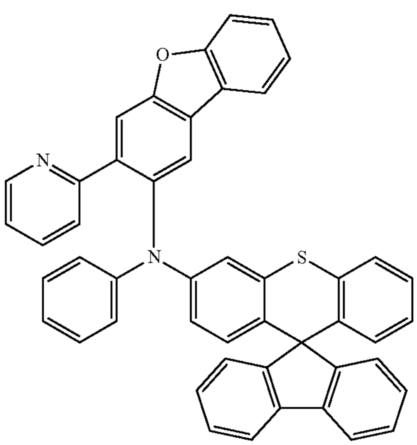
-continued
P-51
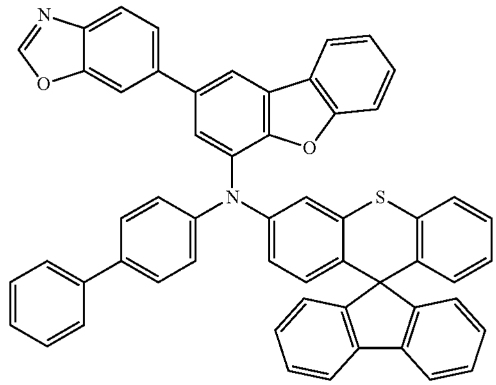
P-52
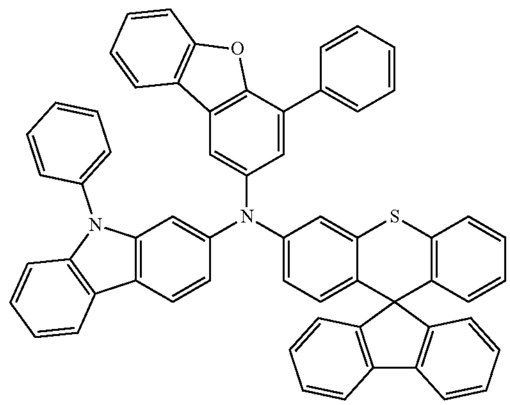
P-53
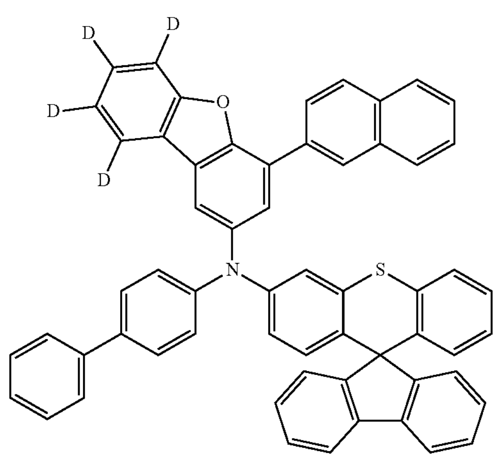

P-54
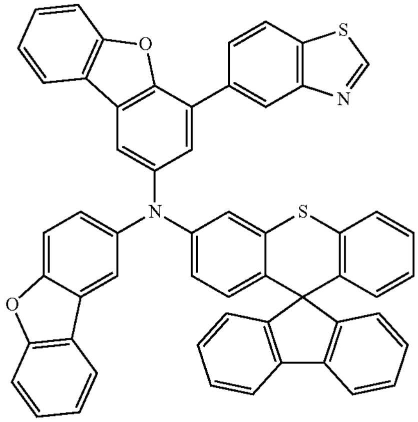
P-55
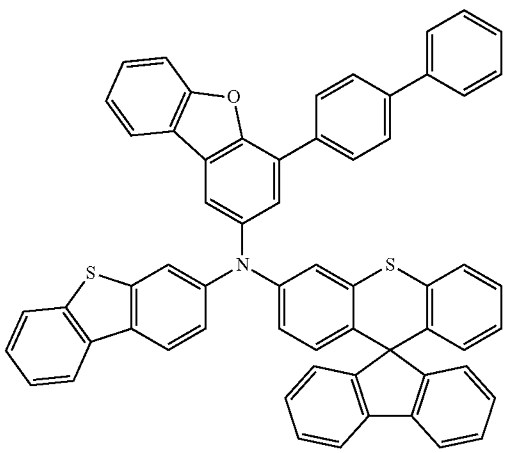
P-56
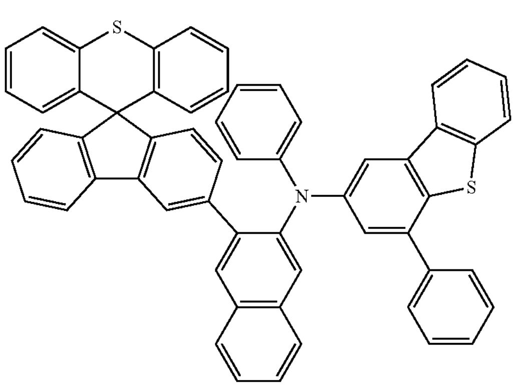
P-57
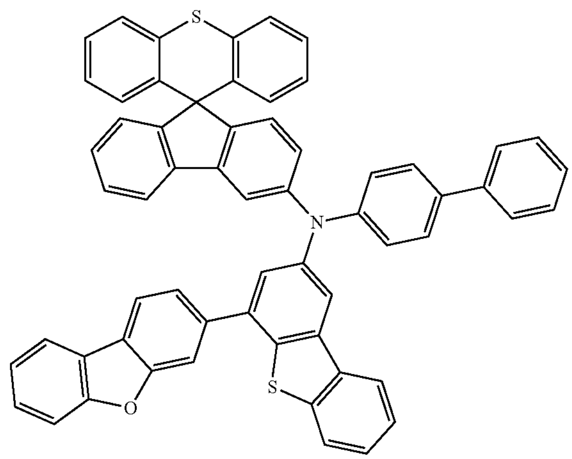
P-58
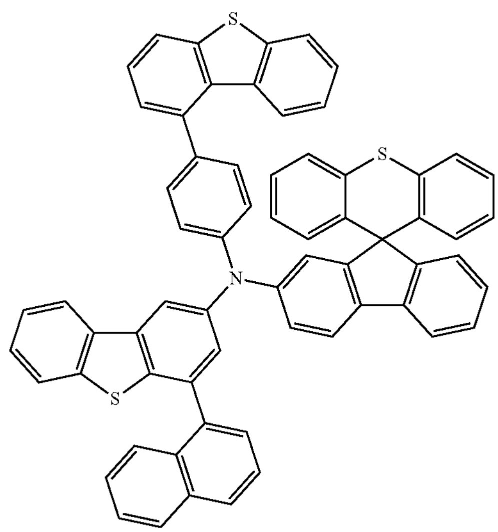
P-159
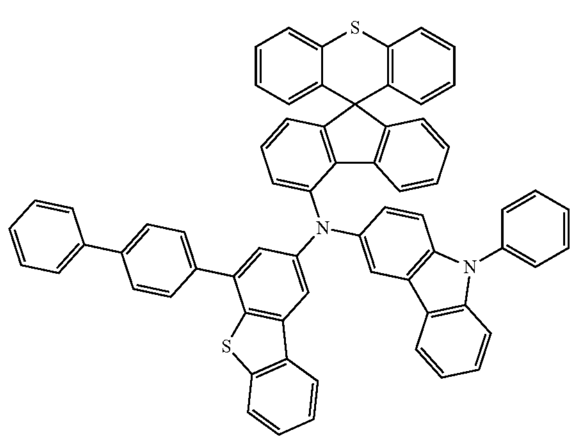

P-190
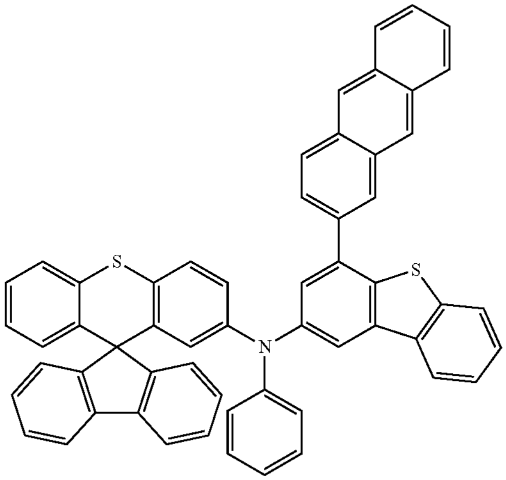
P-81
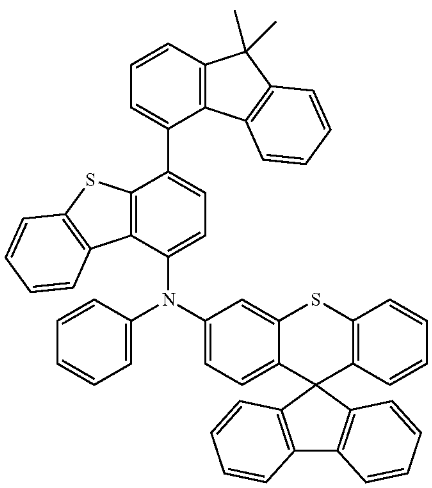
P-82
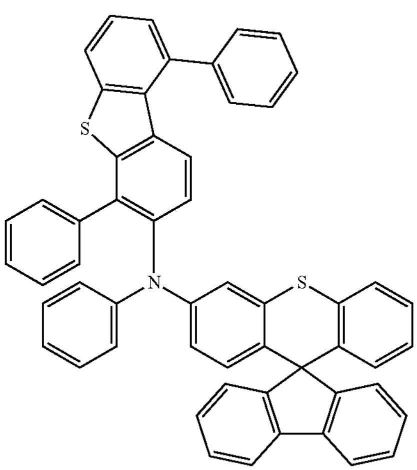
P-83
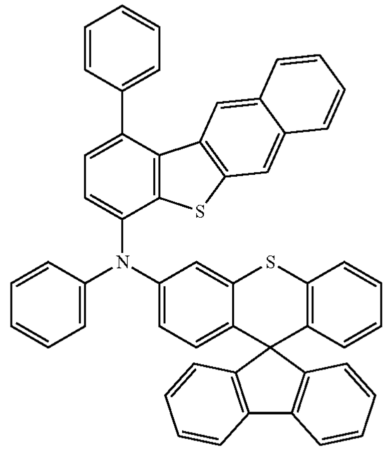
P-64
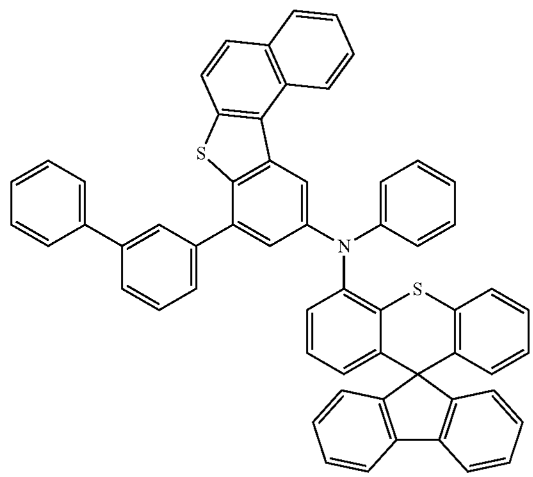
P-65
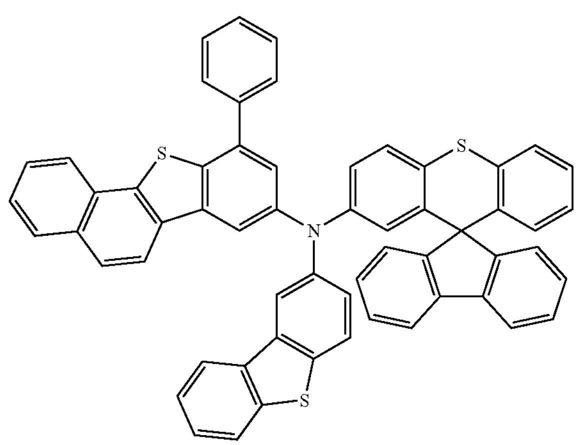

-continued
P-66
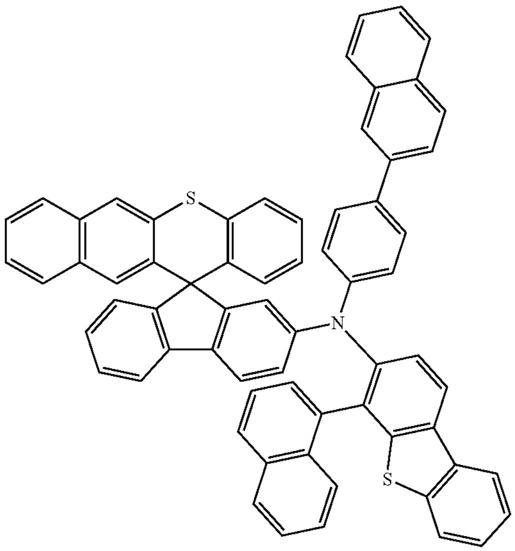
P-67
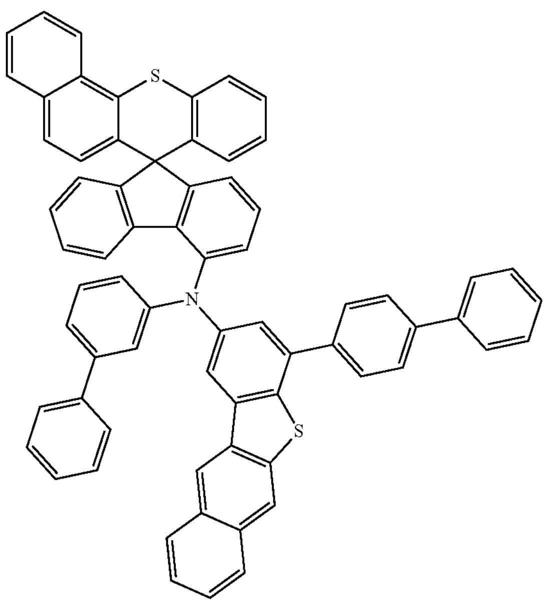
P-68
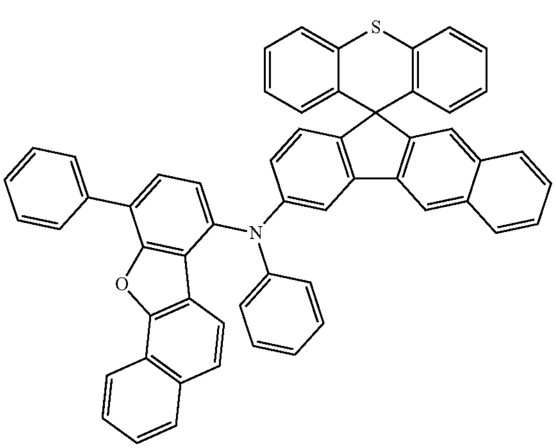
-continued
P-69
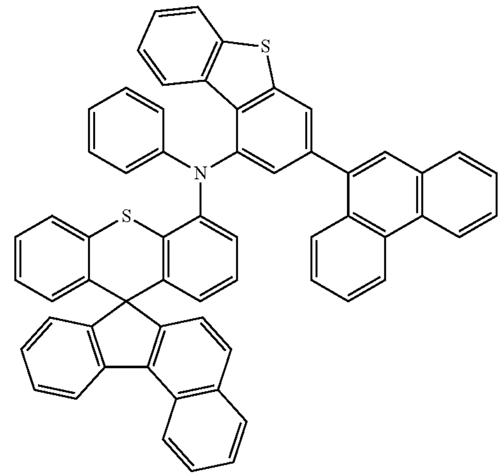
P-70
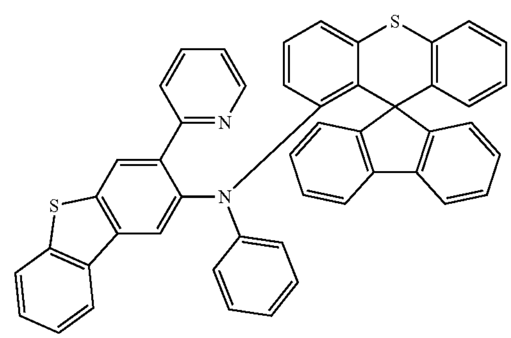
P-71
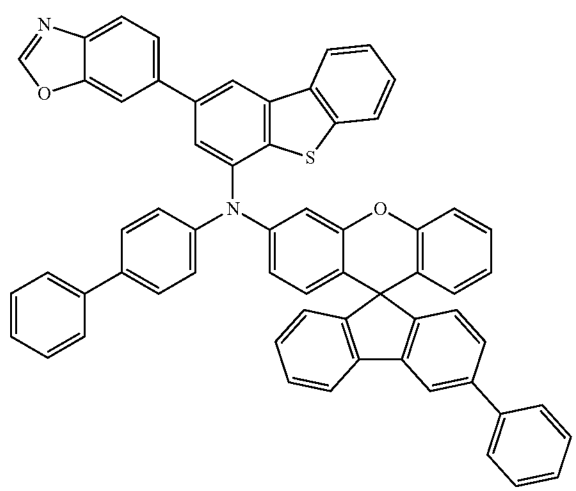

P-72
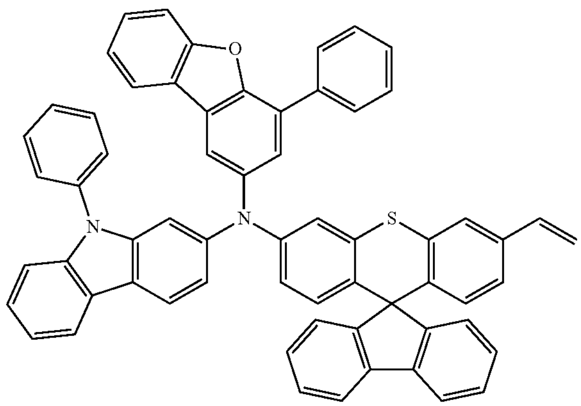
P-73
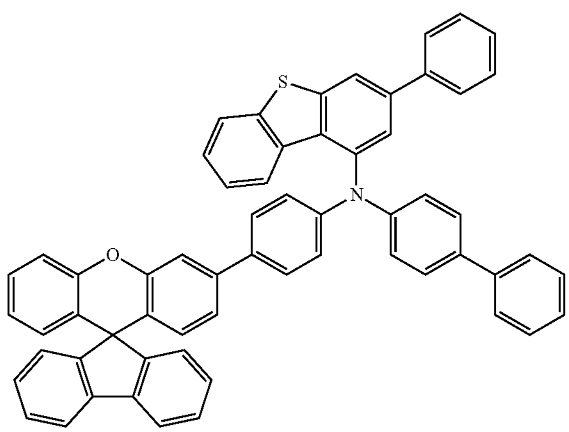
P-74
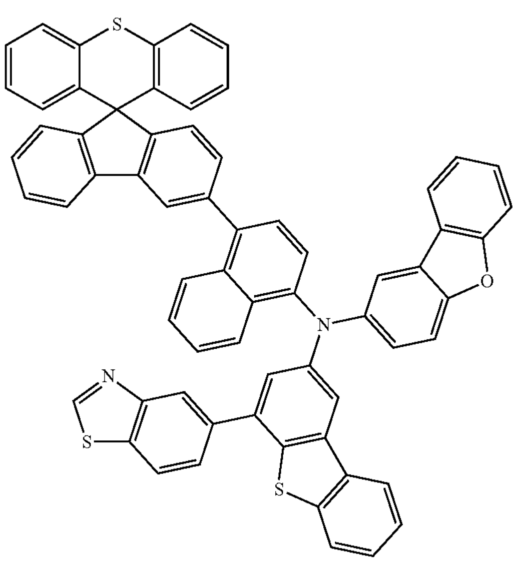
P-75
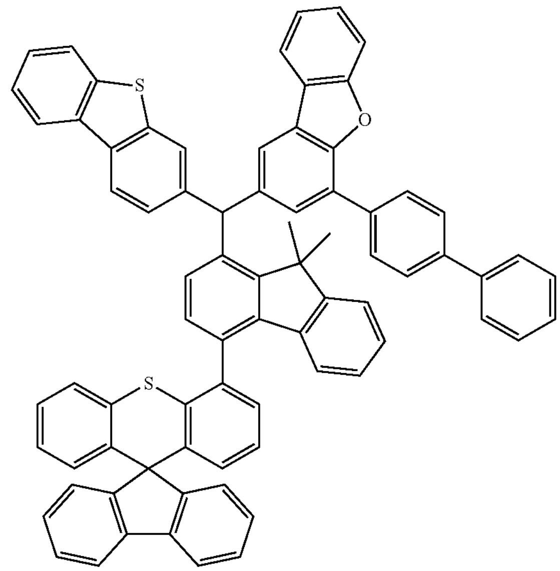
P-76
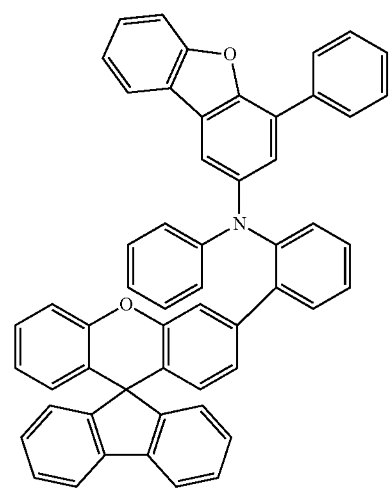
P-77
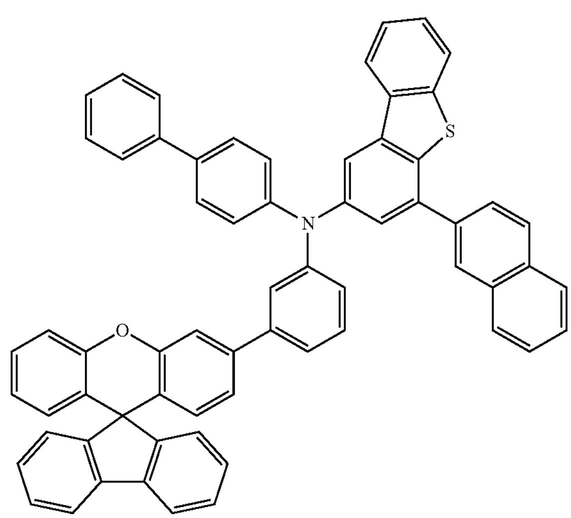

-continued
P-78
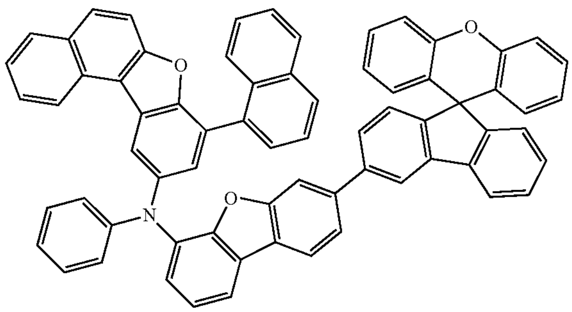
P-79
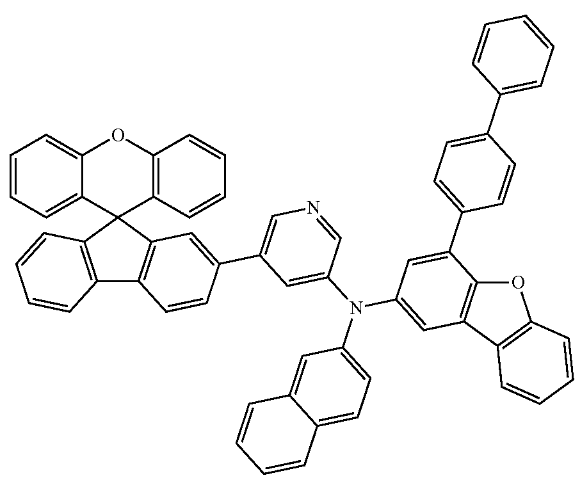
P-80
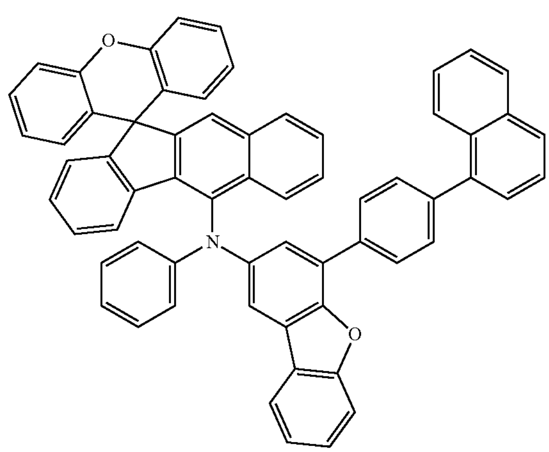
-continued
P-81
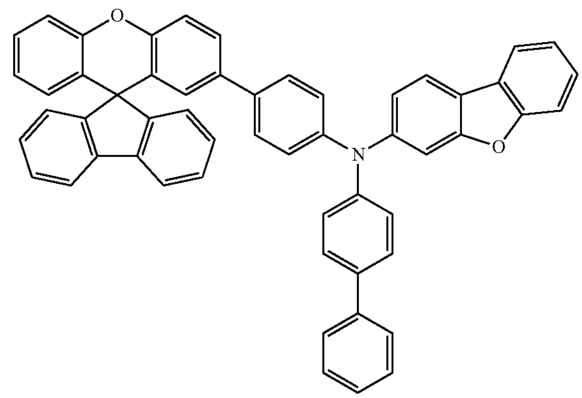
P-82
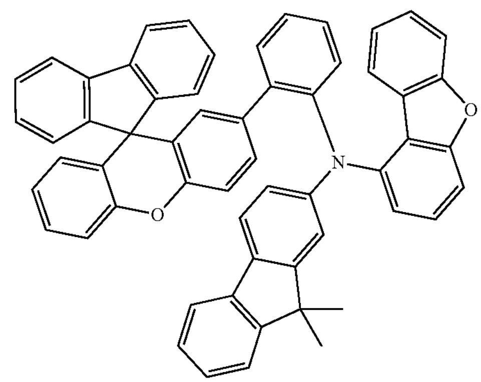
P-83
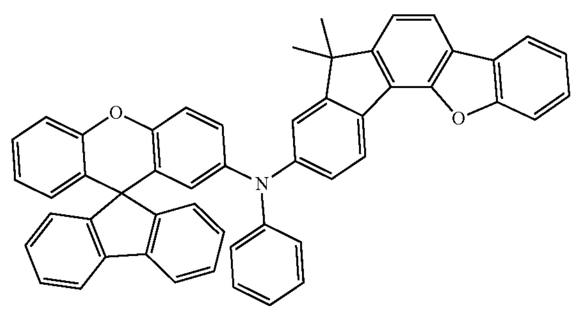
P-84
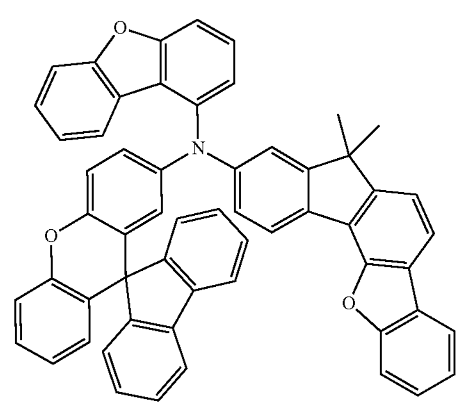

-continued
P1-1
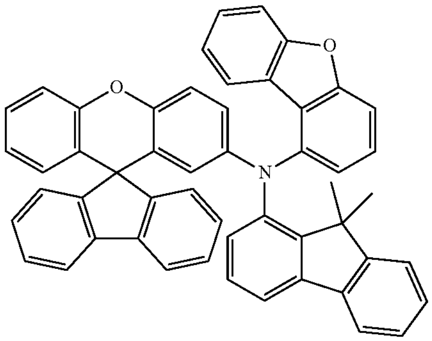
P1-2
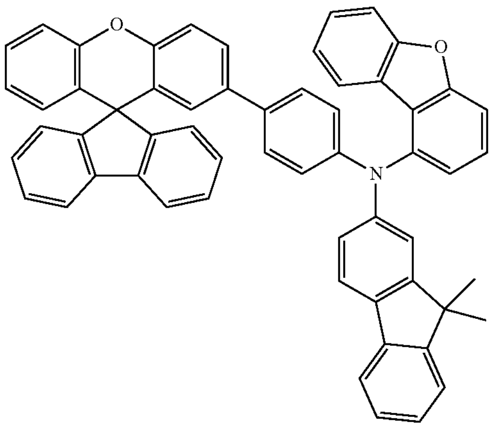
P1-3
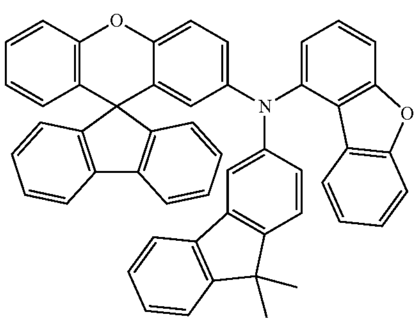
P1-4
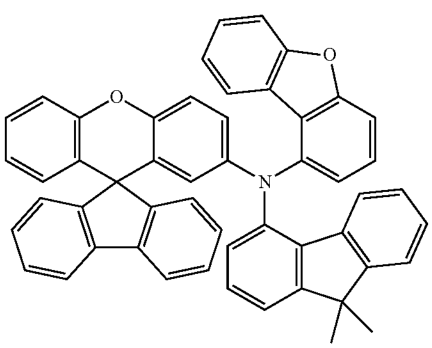
-continued
P1-5
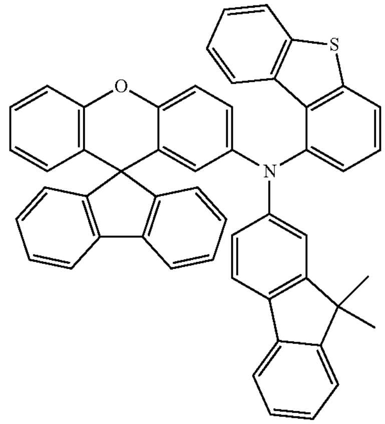
P1-6
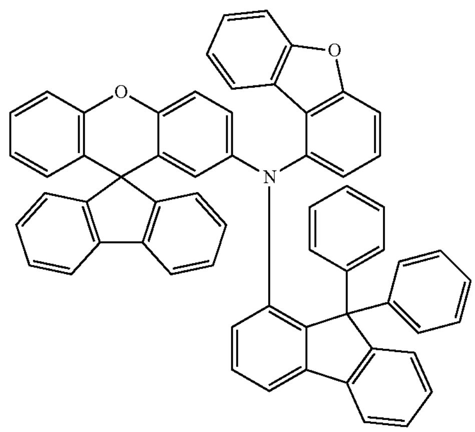
P1-7
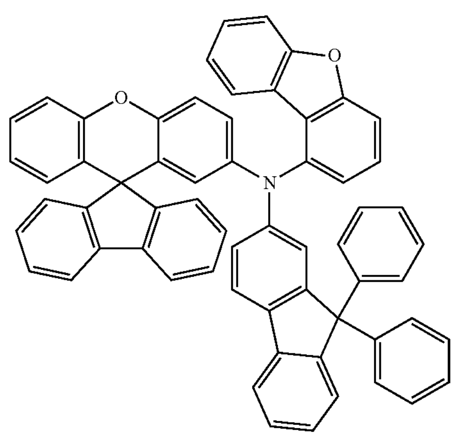

-continued
P1-8
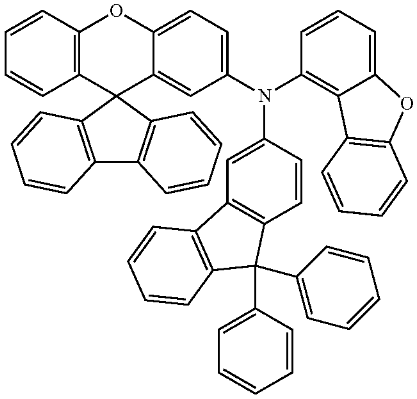
P1-9
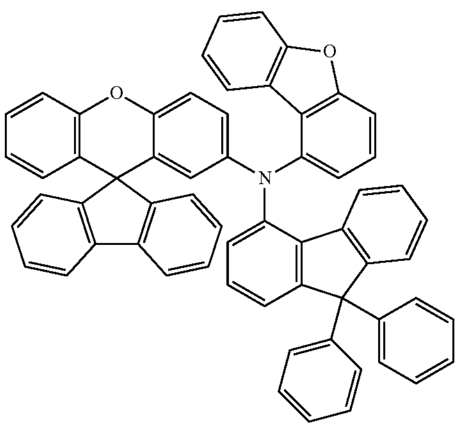
P1-10
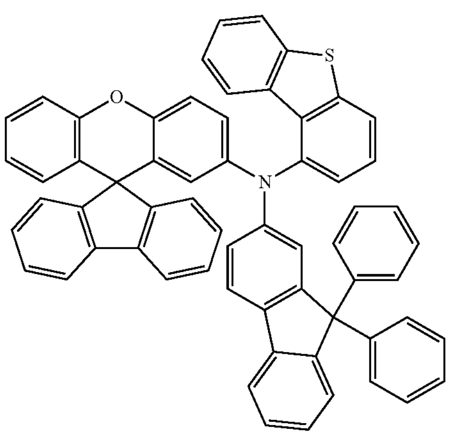
-continued
P1-11
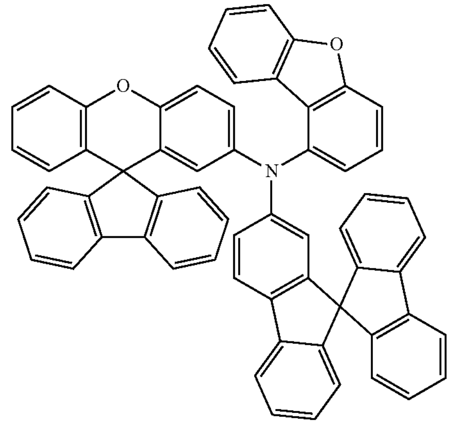
P1-12
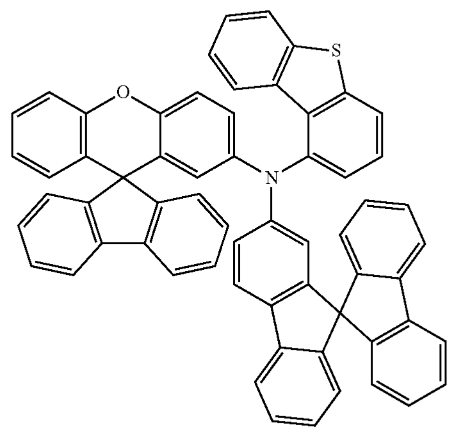
P1-13
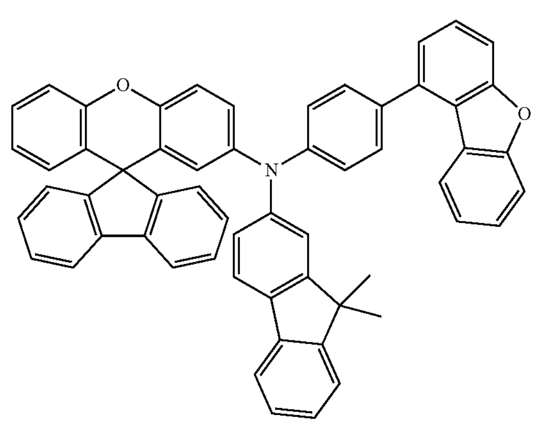

-continued
P1-14
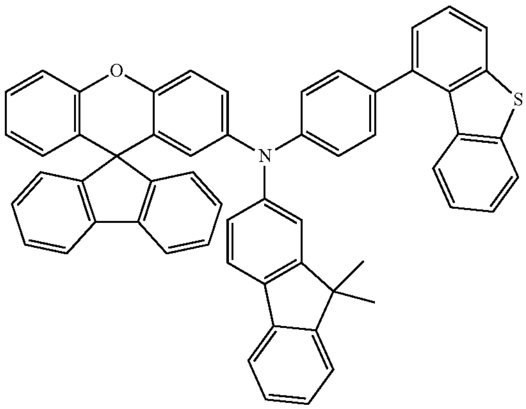
P1-15
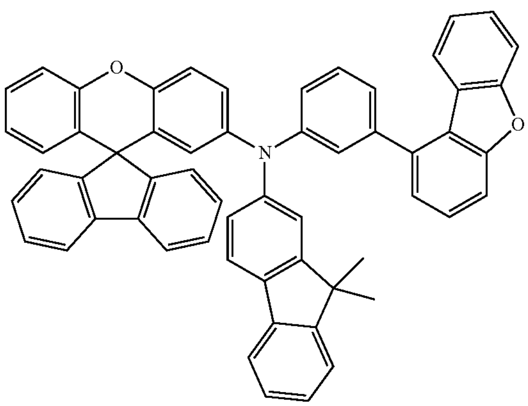
P1-16
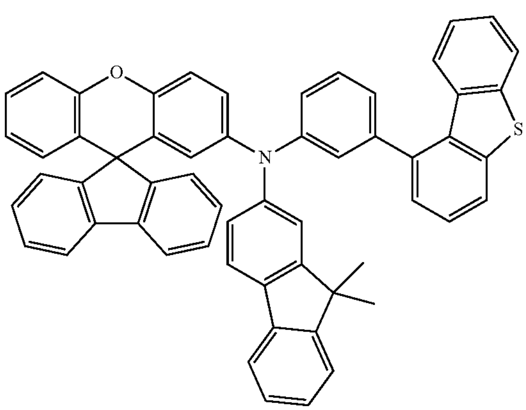
-continued
P1-17
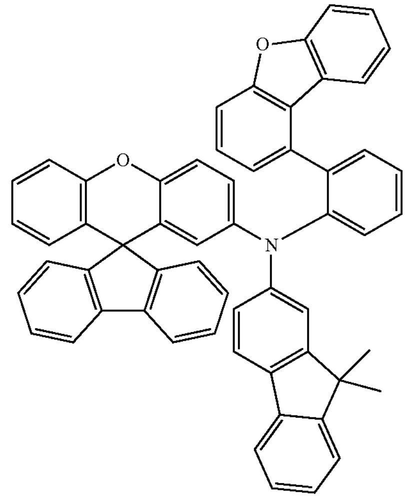
P1-18
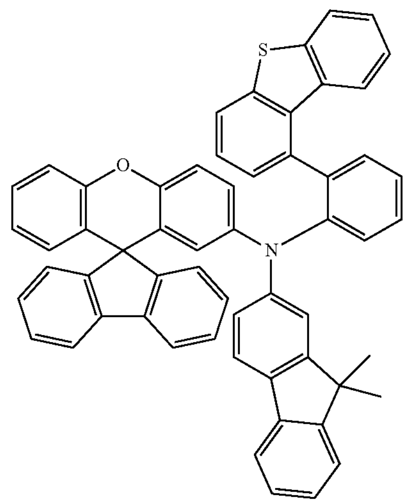
P1-19
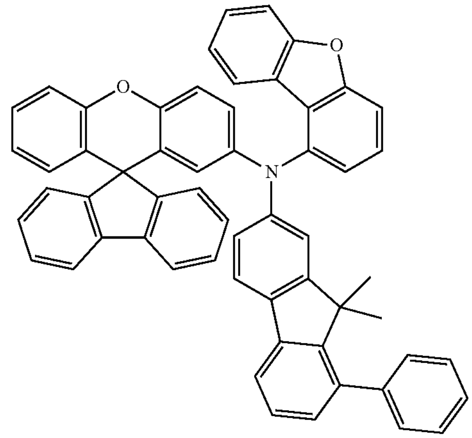

P1-20
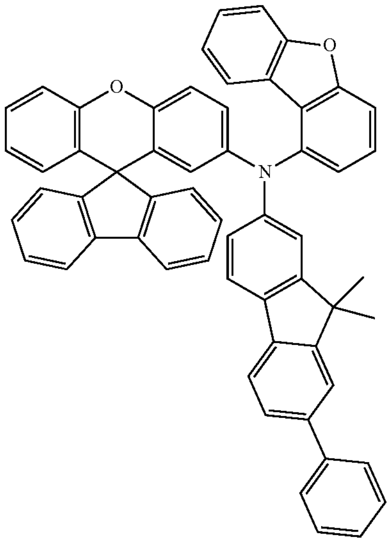
P1-21
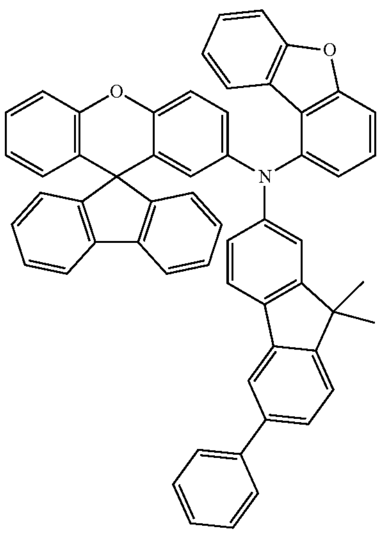
P1-22
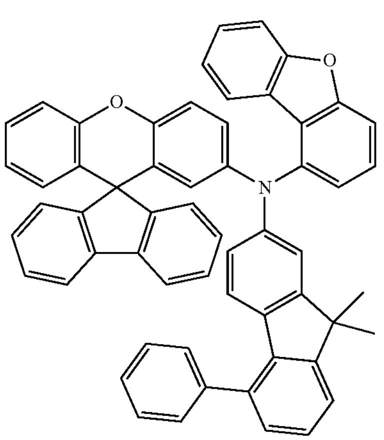
P1-23
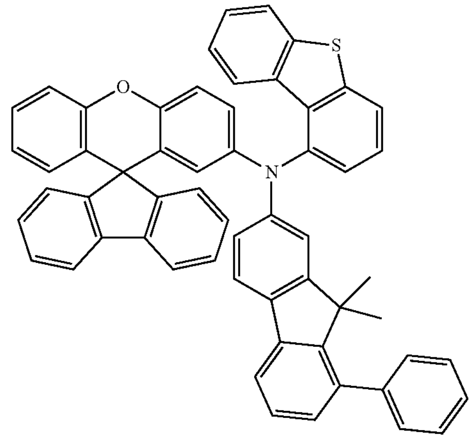
P1-24
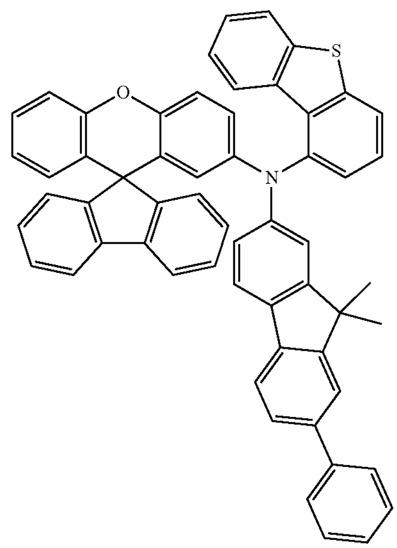
P1-25
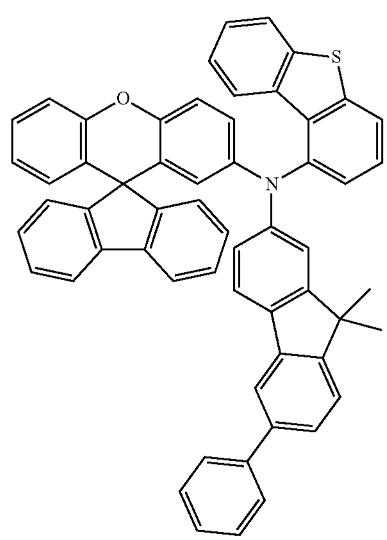

P1-26
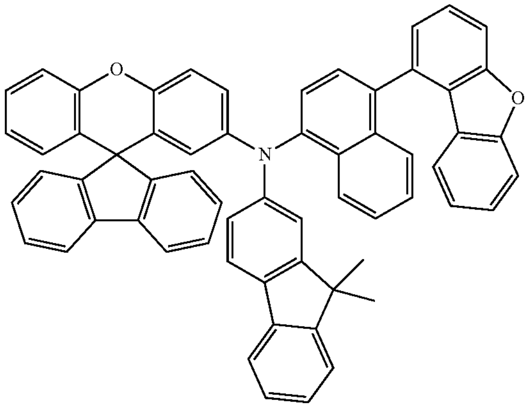
P1-27
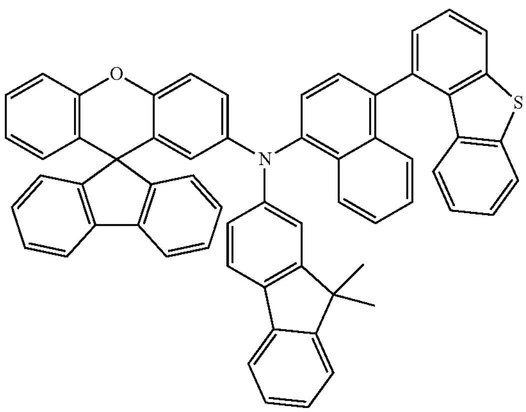
P1-28
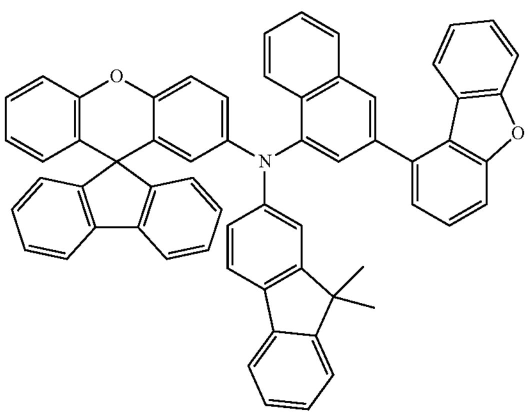
P1-29
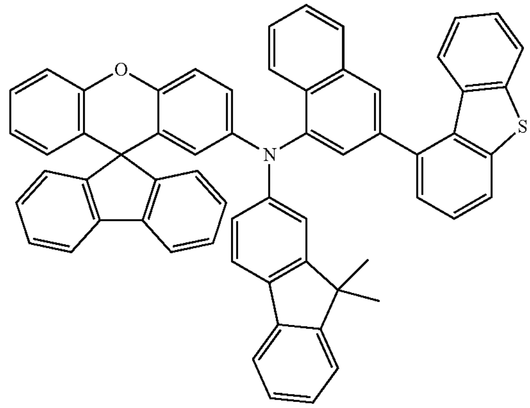
P1-30
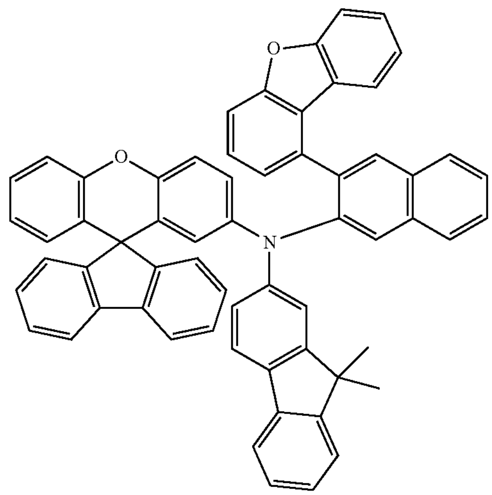
P1-31
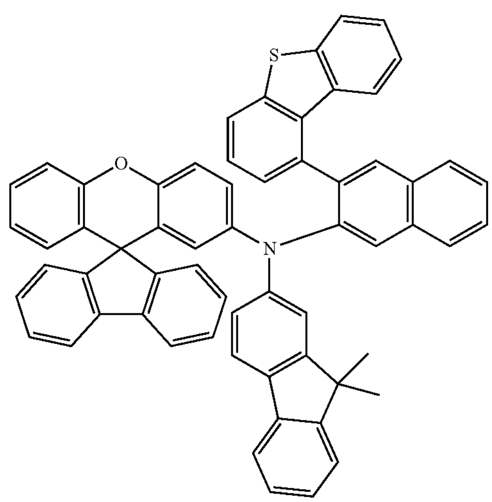

-continued
P1-32
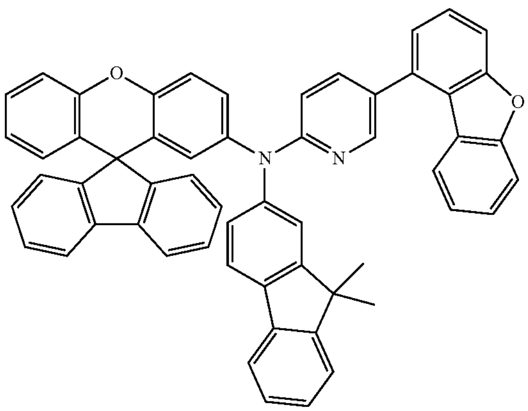
P1-33
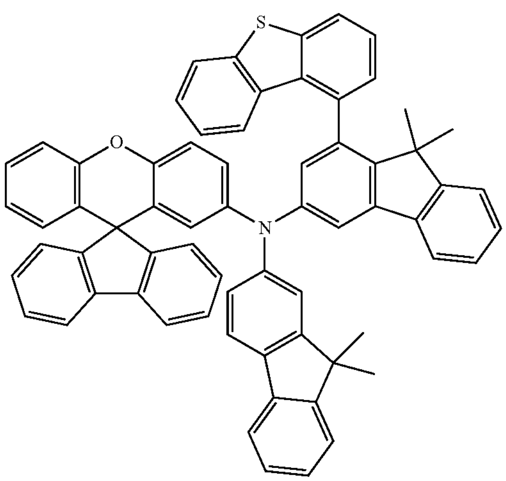
P1-34
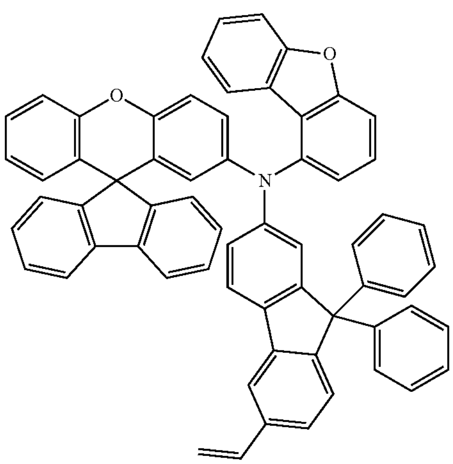
-continued
P1-35
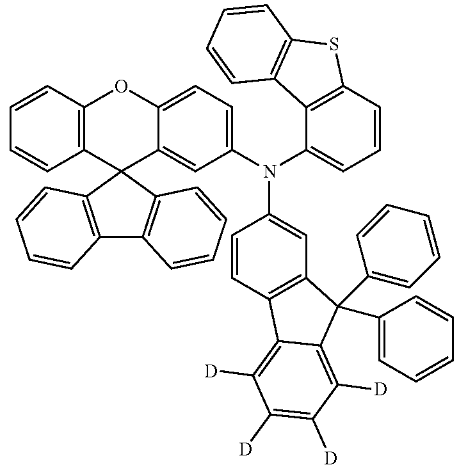
P1-36
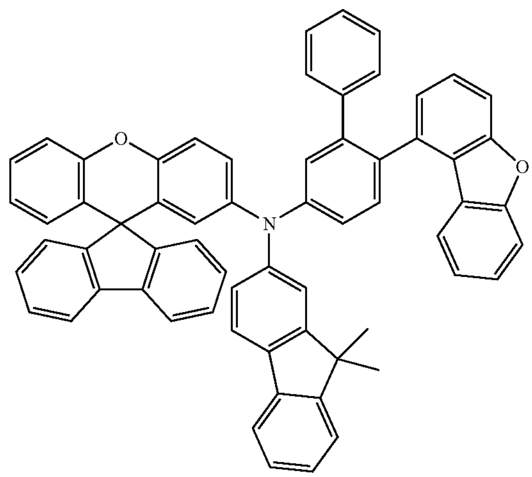
P1-37
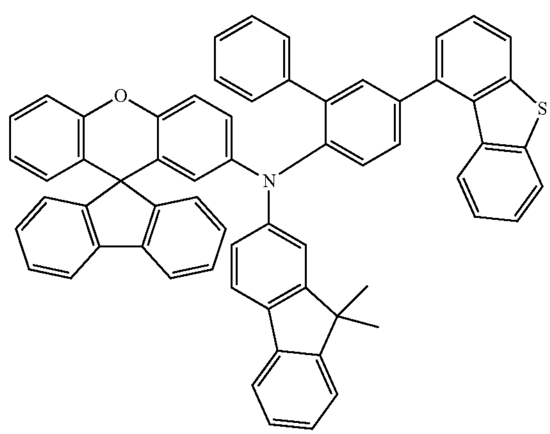

P1-38
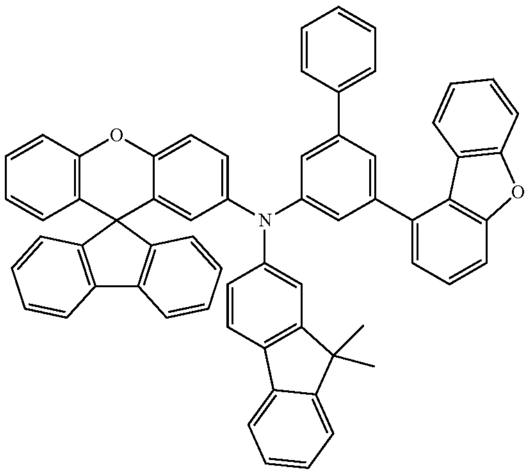
P1-39
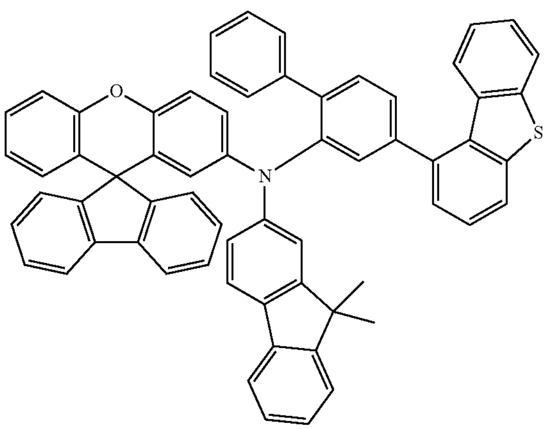
P1-40
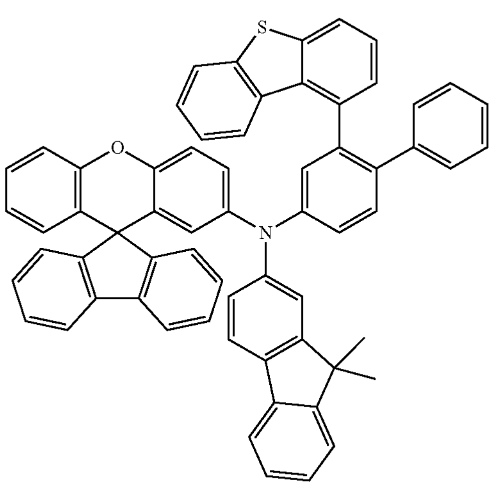
P1-41
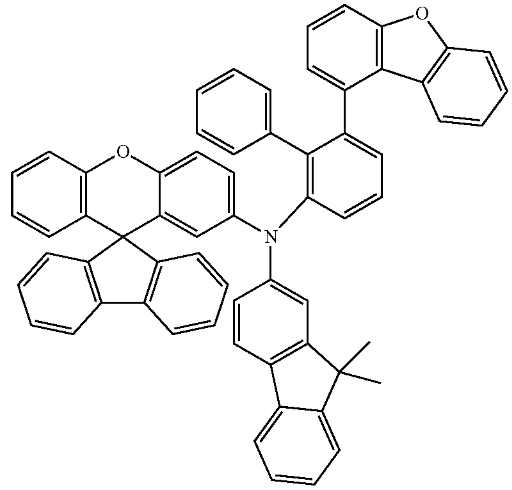
P1-42
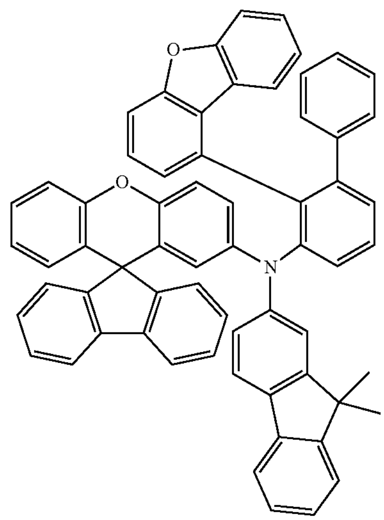
P1-43
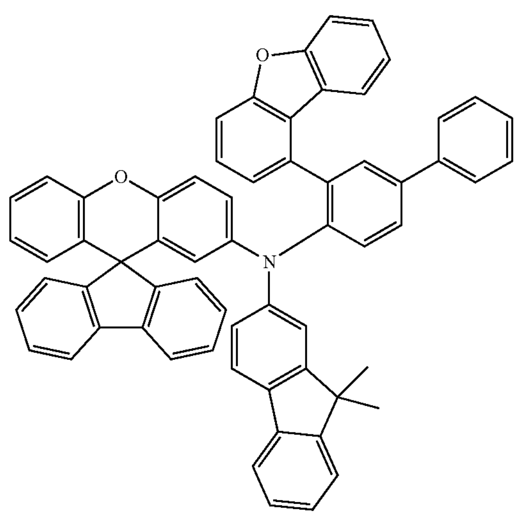

-continued
P1-44
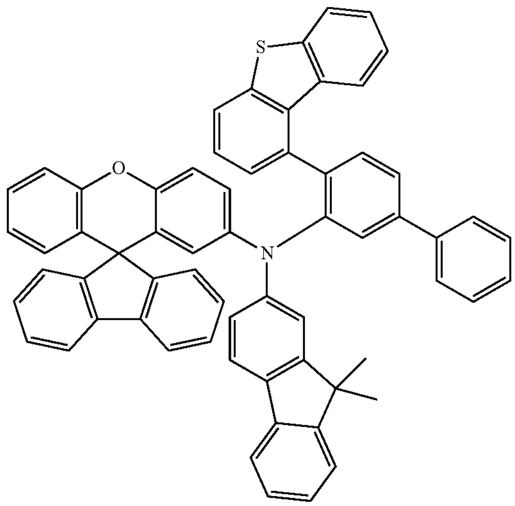
P1-45
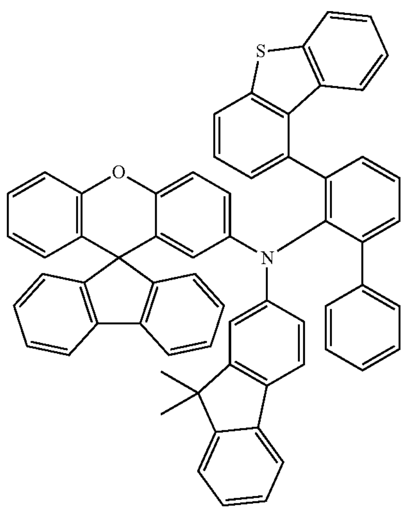
P1-46
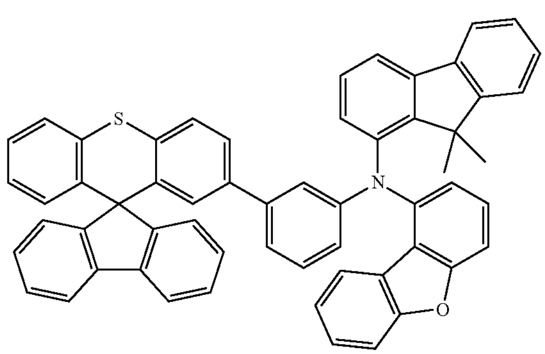
-continued
P1-47
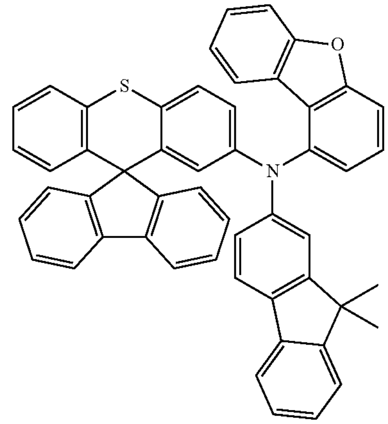
P1-48
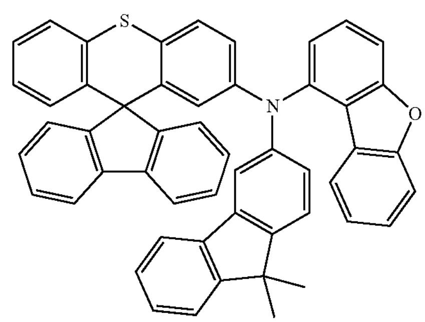
P1-49
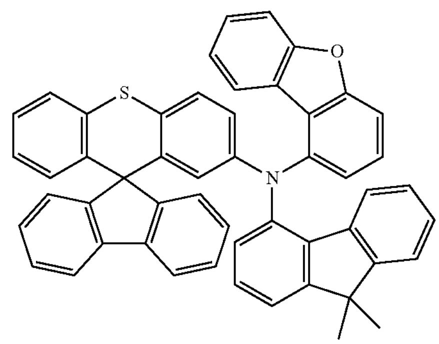
P1-50
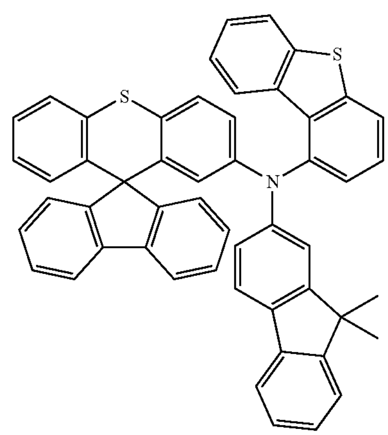

-continued
P1-51
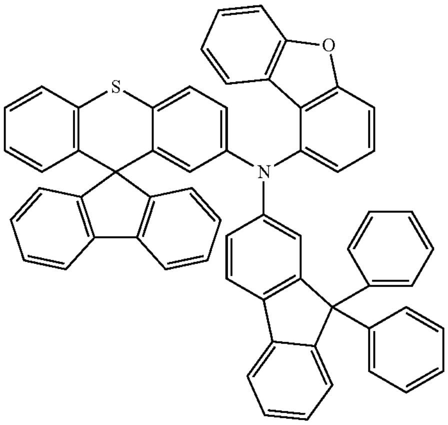
P1-52
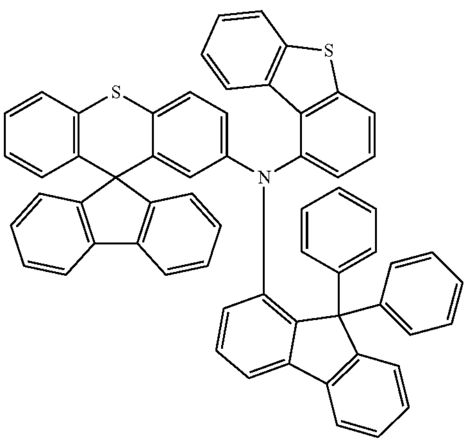
P1-53
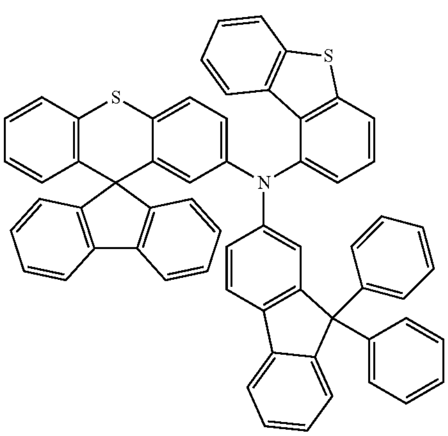
-continued
P1-54
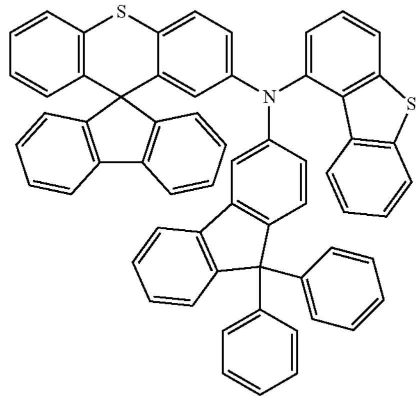
P1-55
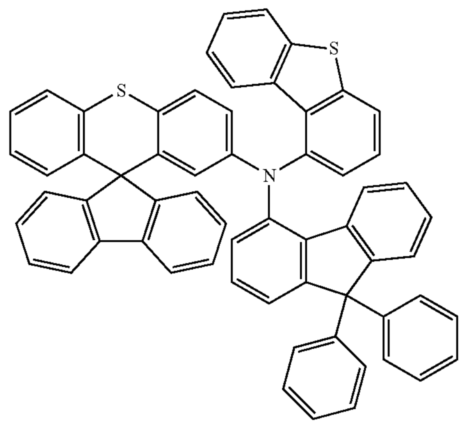
P1-56
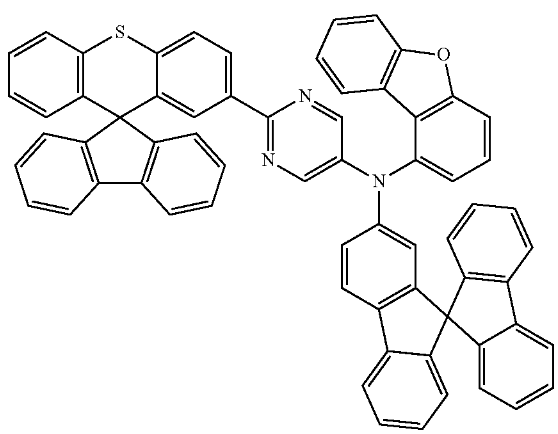

-continued
P1-57
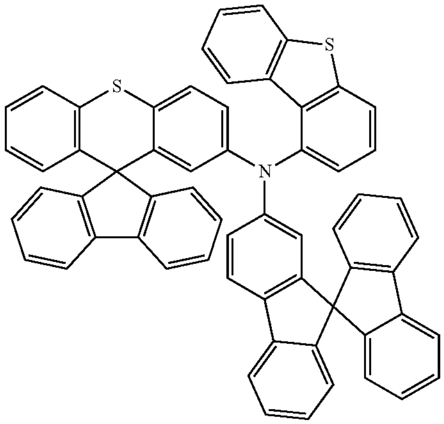
P1-58
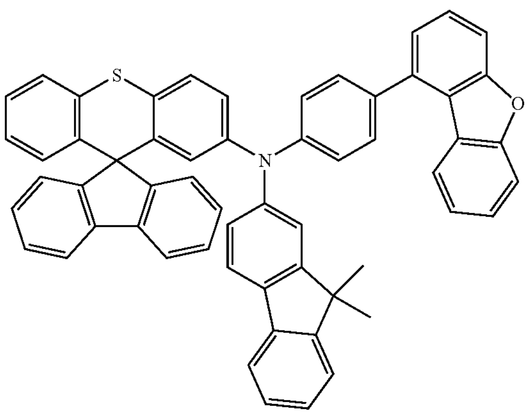
P1-59
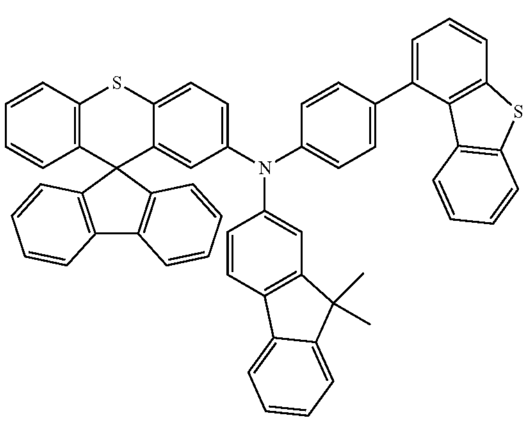
-continued
P1-60
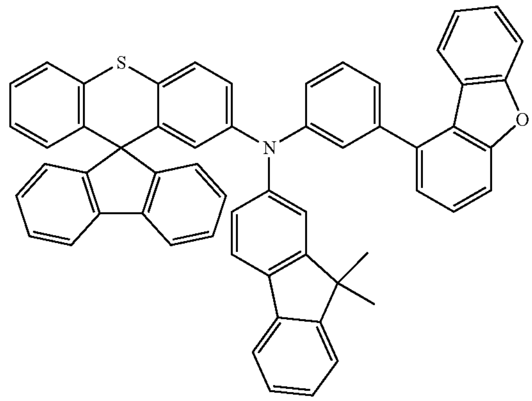
P1-61
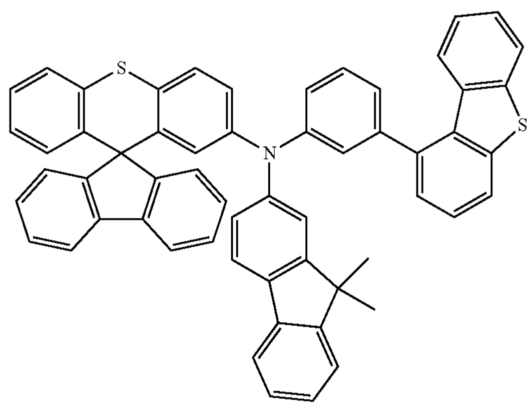
P1-62
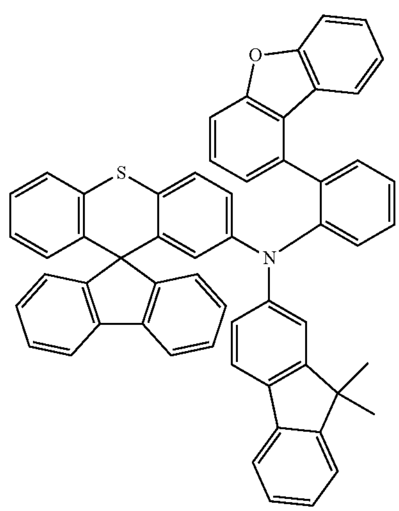

-continued
P1-63
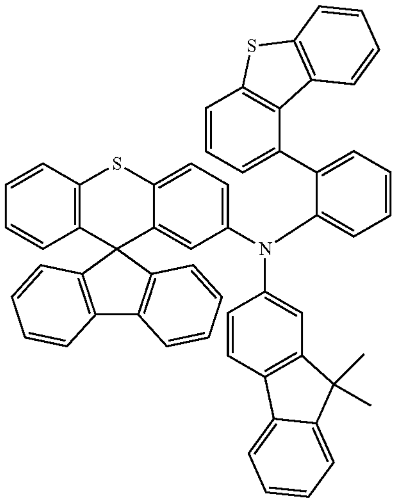
P1-64
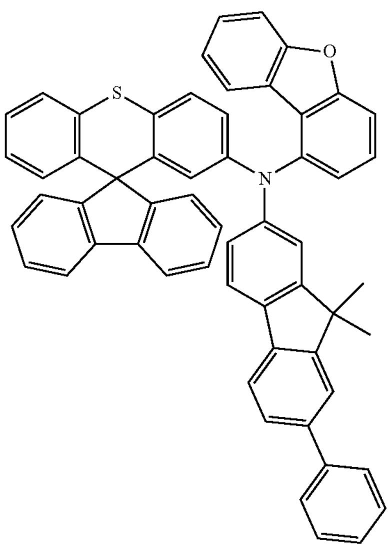
P1-65
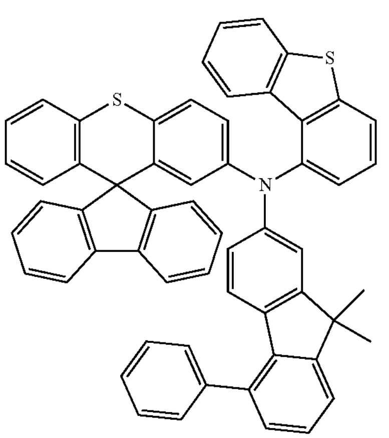
-continued
P1-66
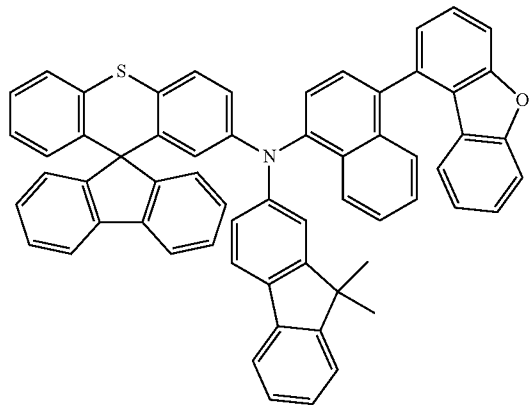
P1-67
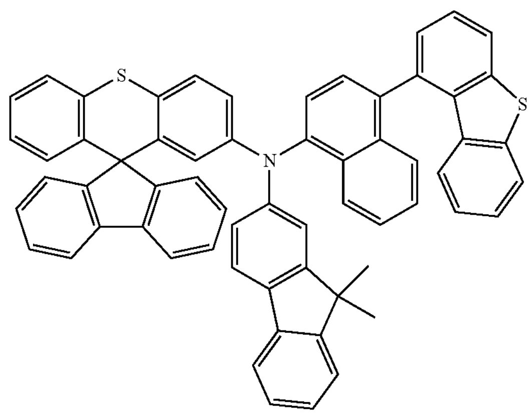
P1-68
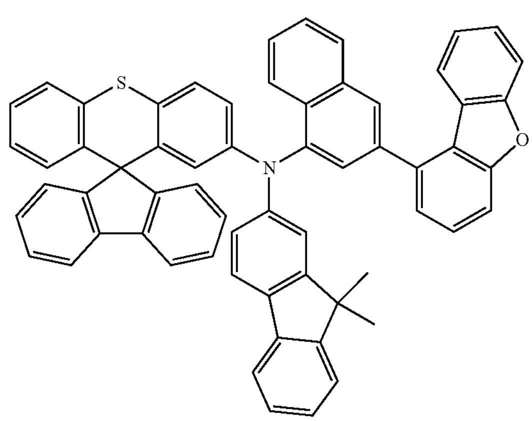

P1-68
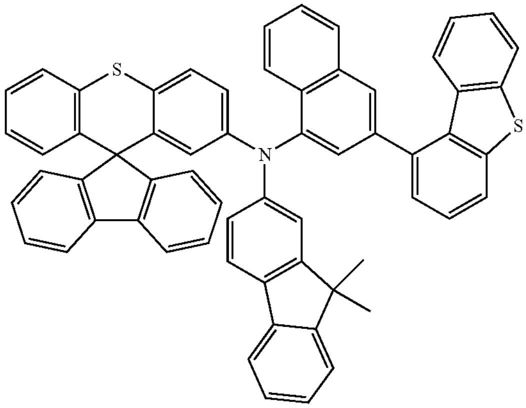
P1-70
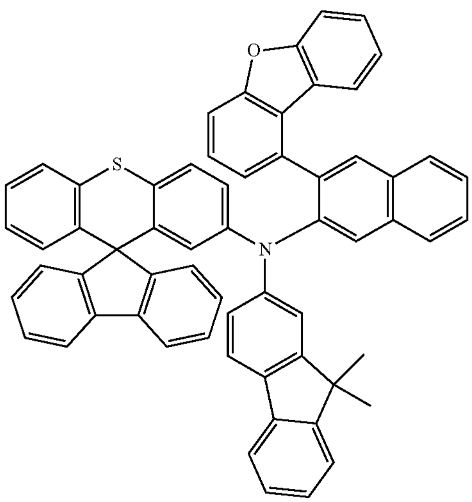
P1-71
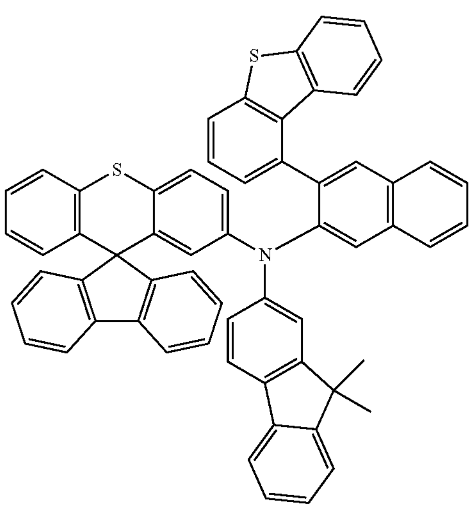
P1-72
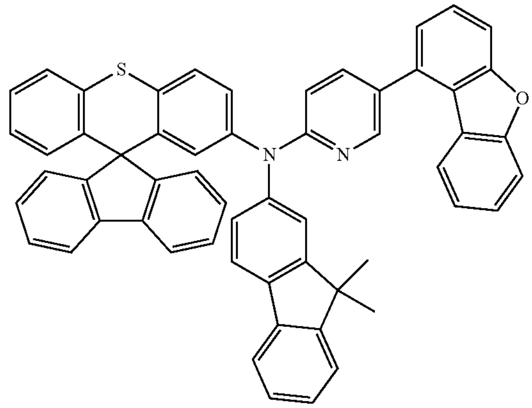
P1-73
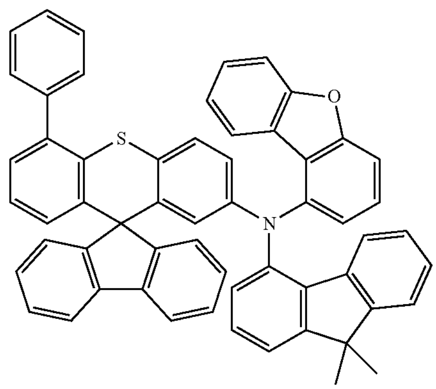
P1-74
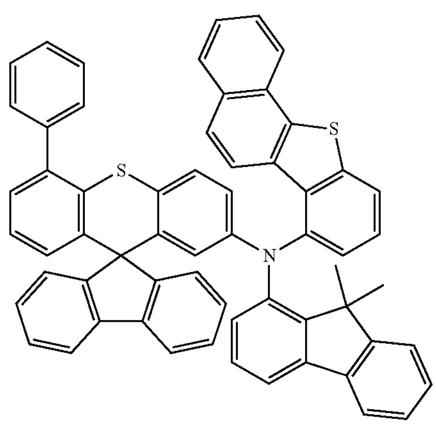

P1-75
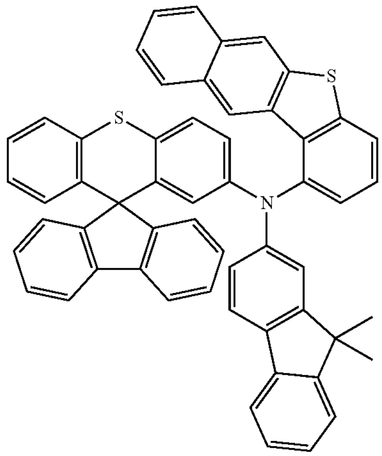
P1-76
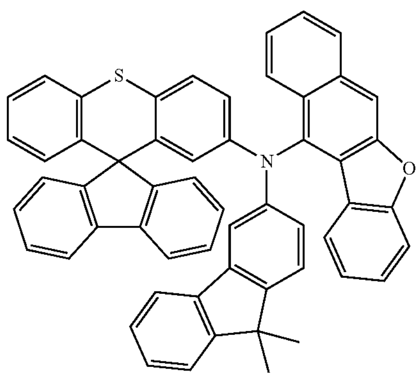
P1-77
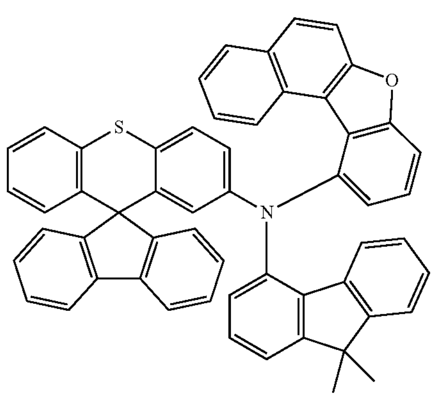
P1-78
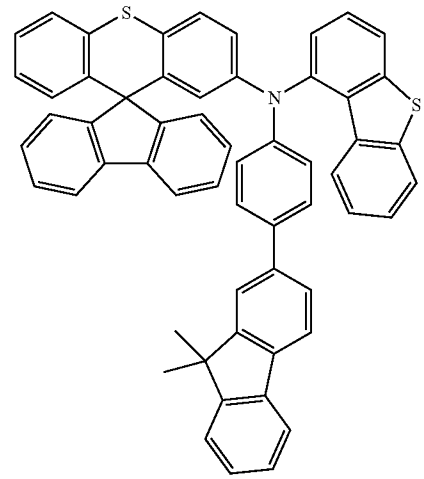
P1-79
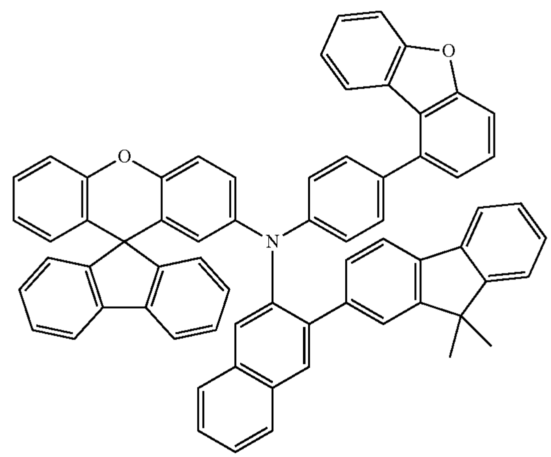
P1-80
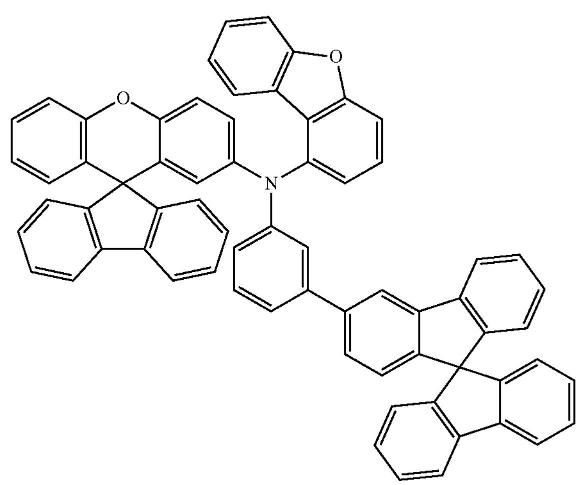

-continued
P1-81
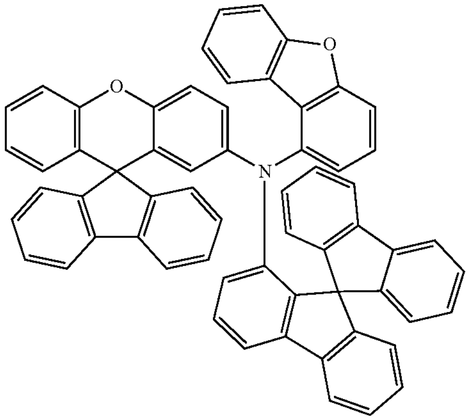
P1-82
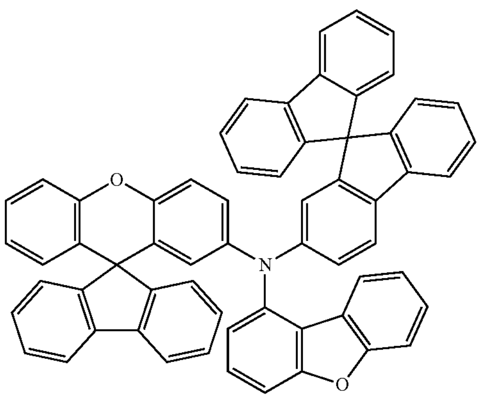
P1-83
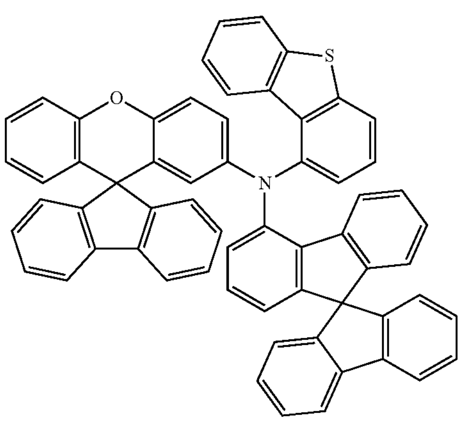
-continued
P1-84
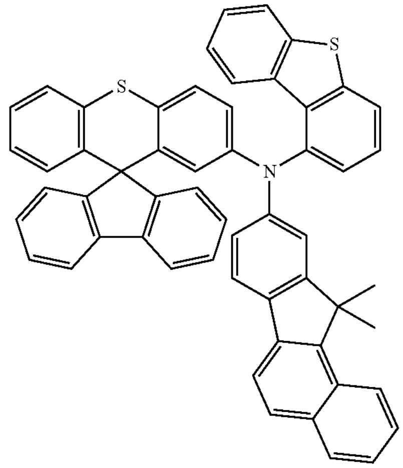
P1-85
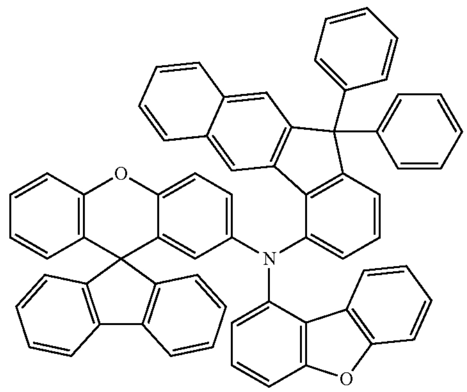
P1-86
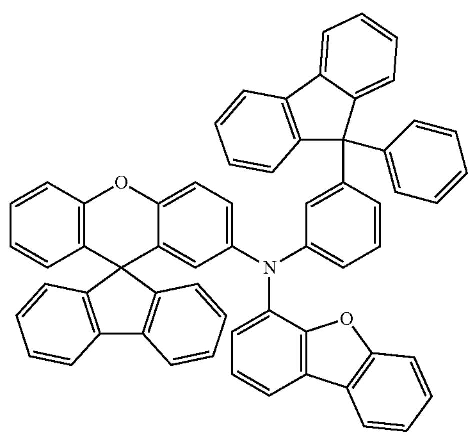

P1-87
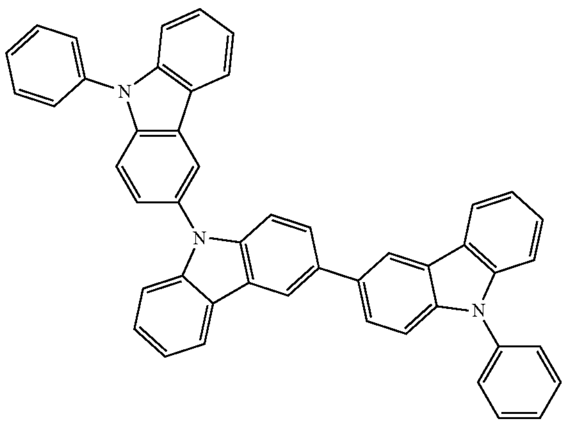
P2-1
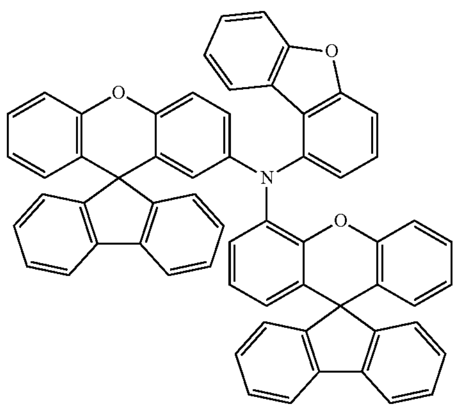
P2-2
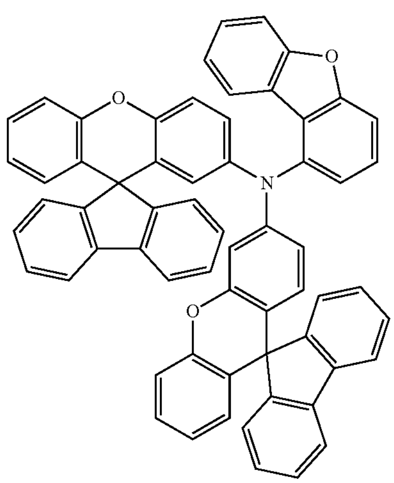
P2-3
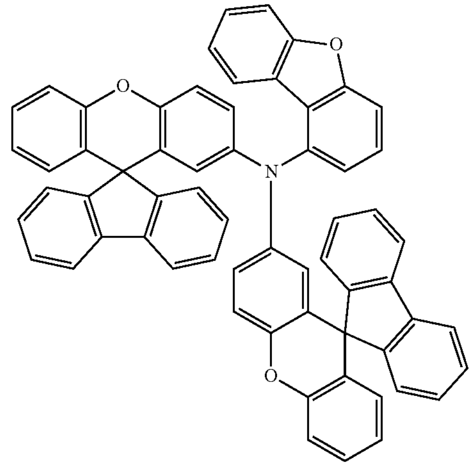
P2-4
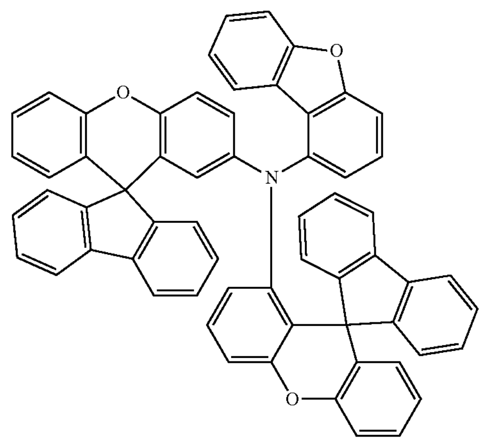
P2-5
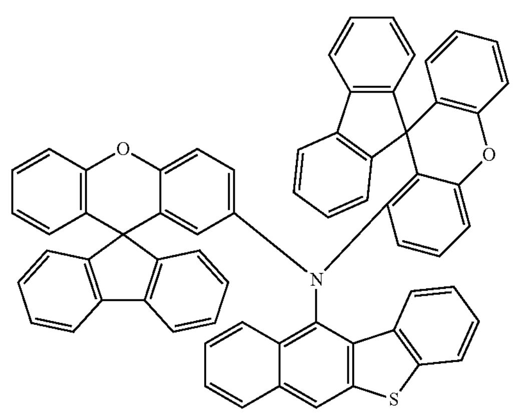

-continued
P2-6
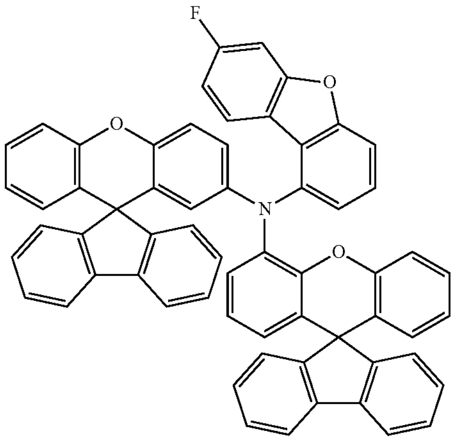
P2-7
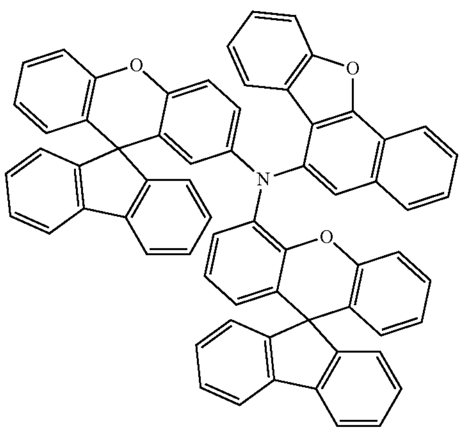
P2-8
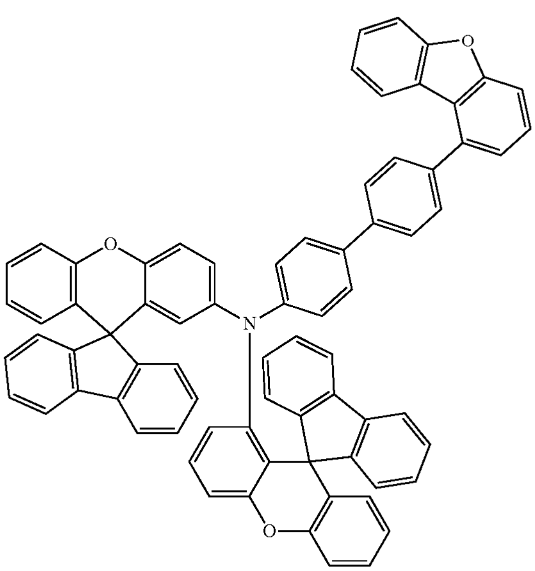
-continued
P2-9
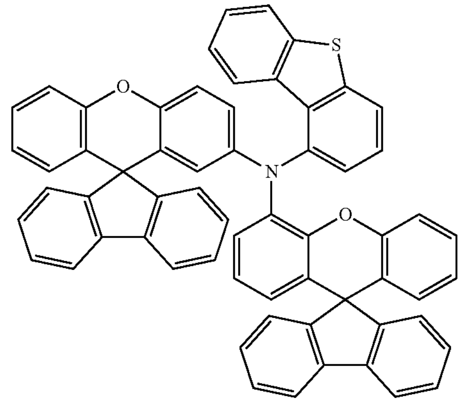
P2-10
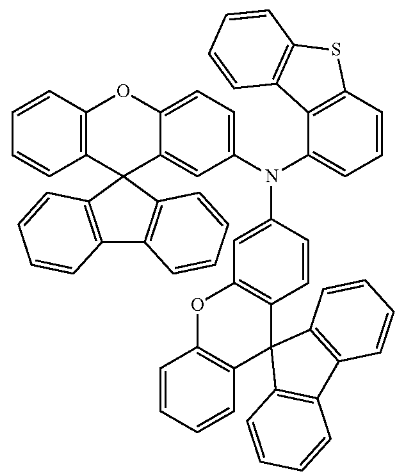
P2-11
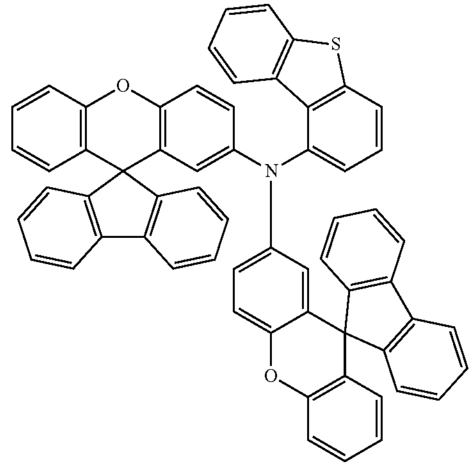

-continued
P2-12
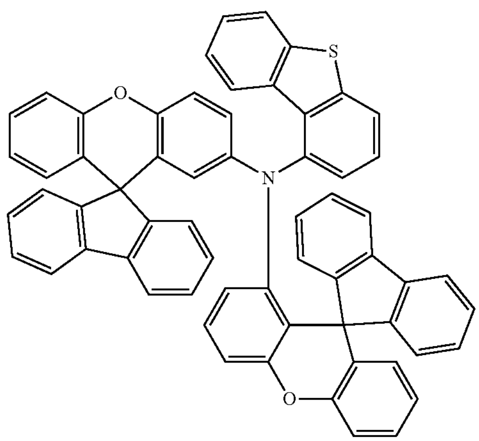
P2-13
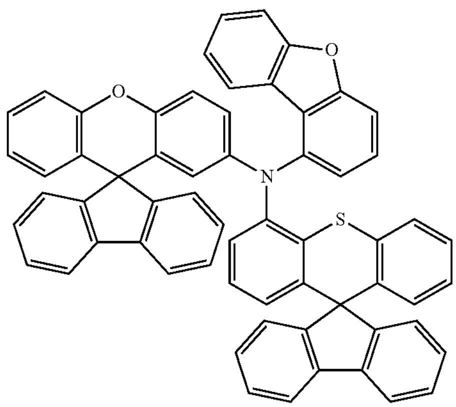
P2-14
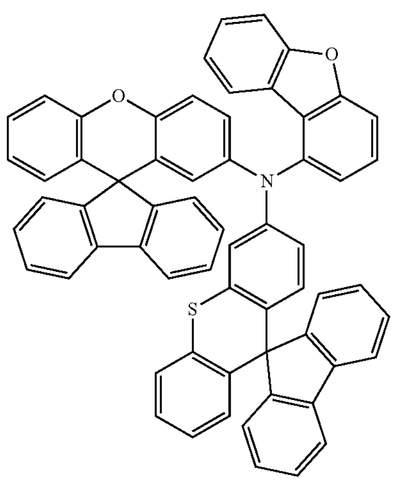
-continued
P2-15
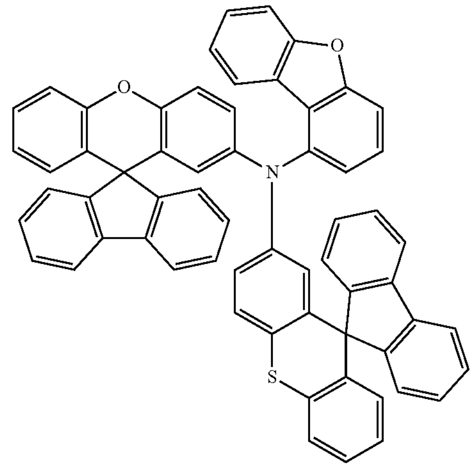
P2-16
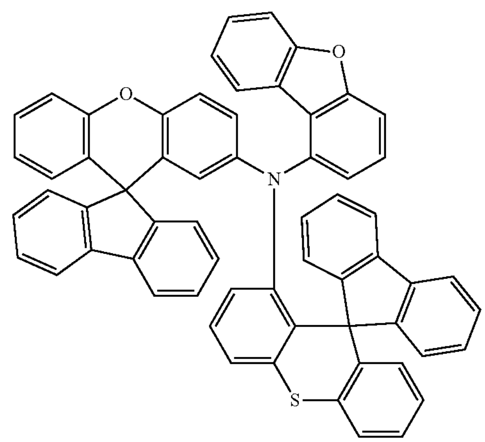
P2-17
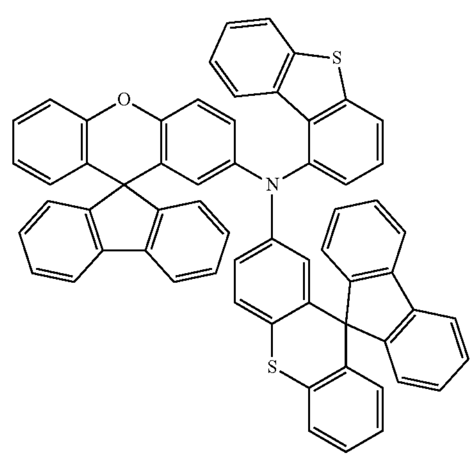

-continued
P2-18
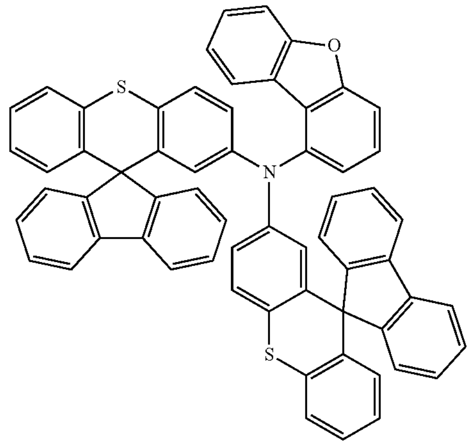
P2-19
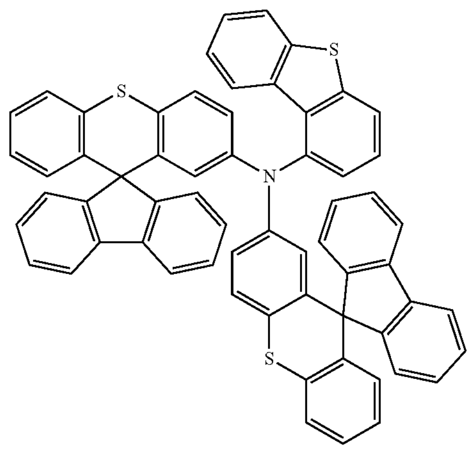
P2-20
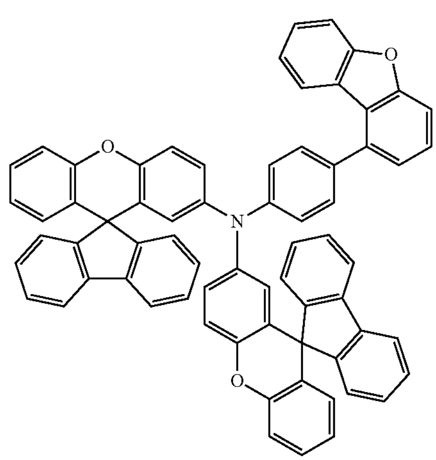
-continued
P2-21
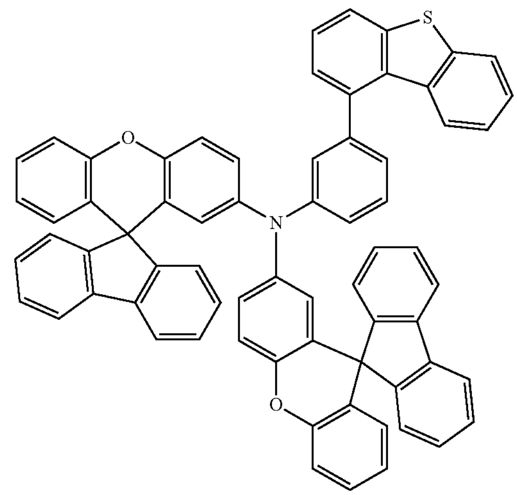
P2-22
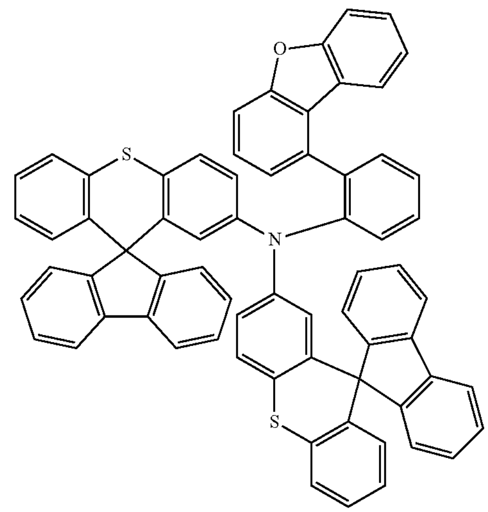
P2-23
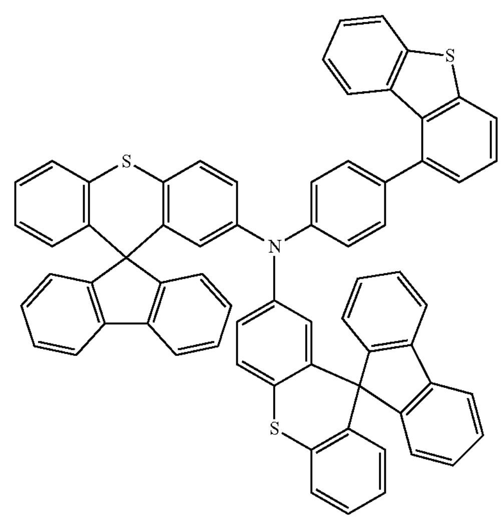

P2-24
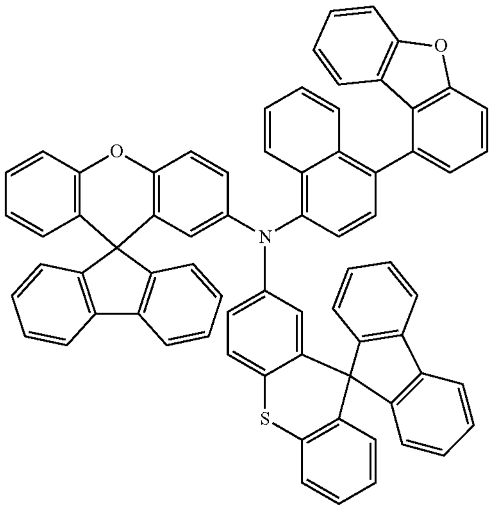
P2-25
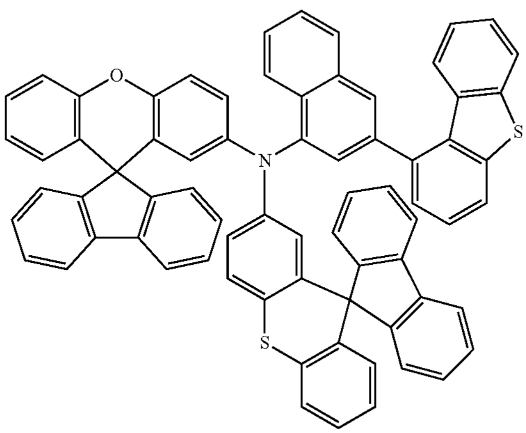
P2-26
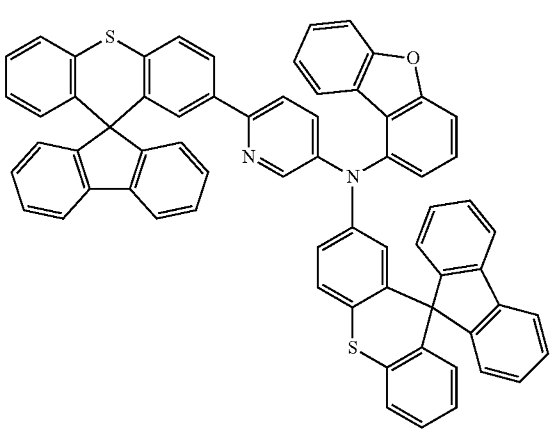
P2-27
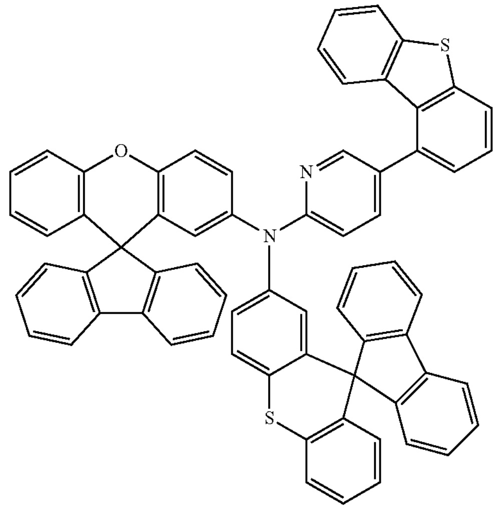
P2-28
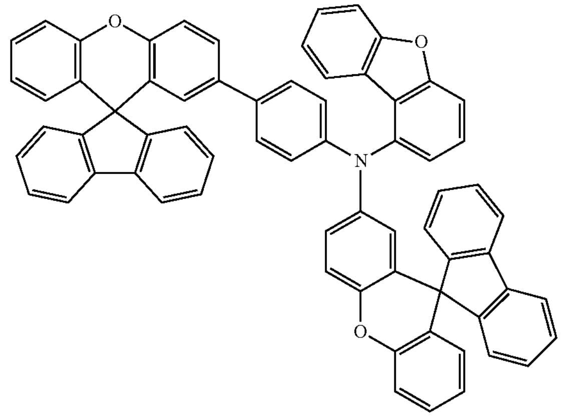
P2-29
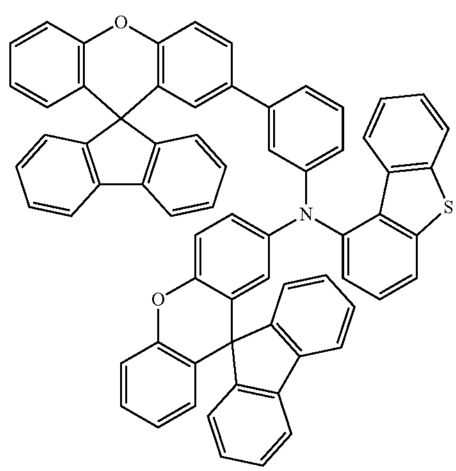

-continued
P2-30
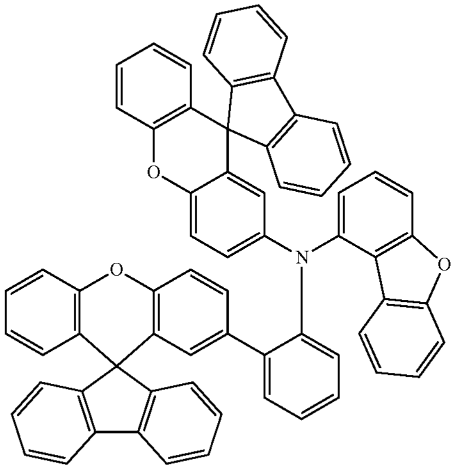
P2-31
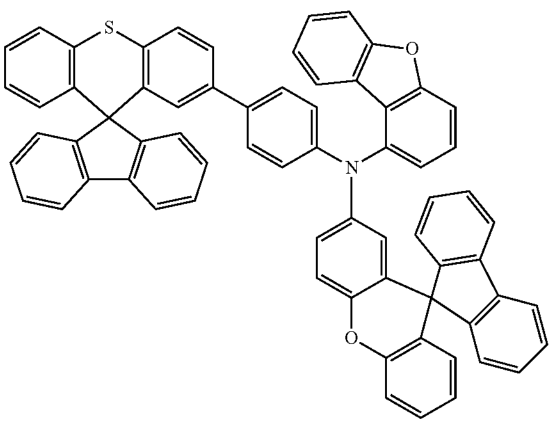
P2-32
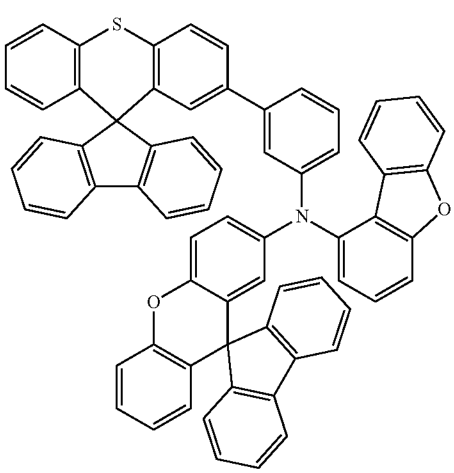
-continued
P2-33
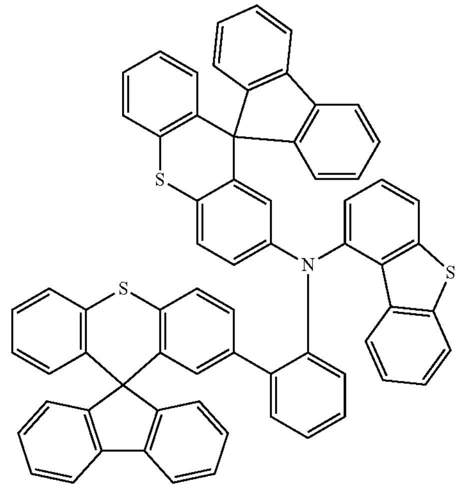
P2-34
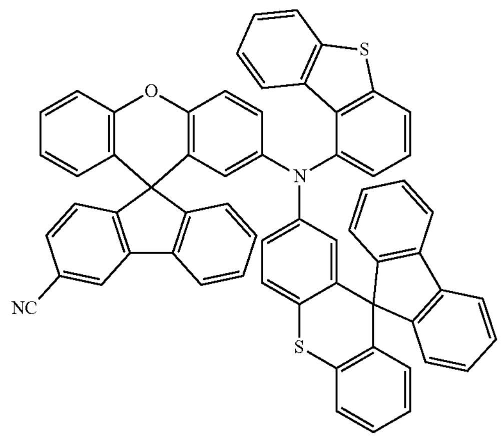
P2-35
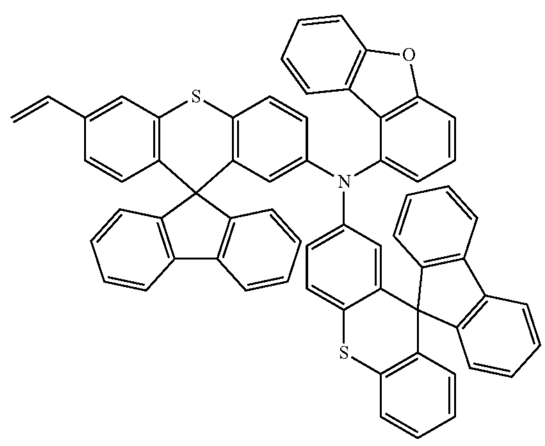

P2-36
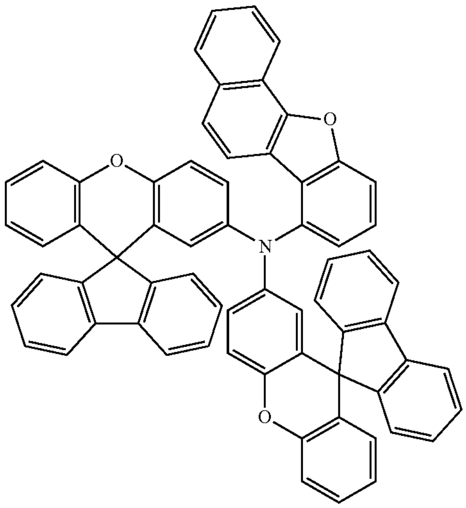
P2-37
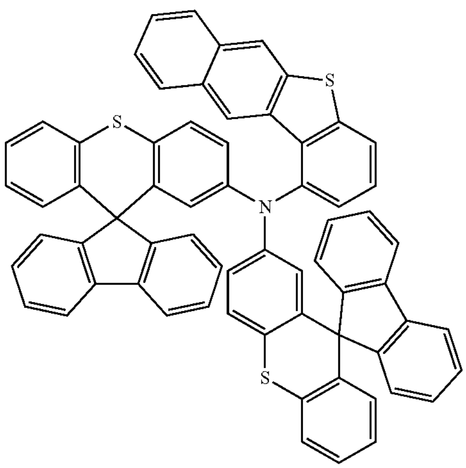
P2-38
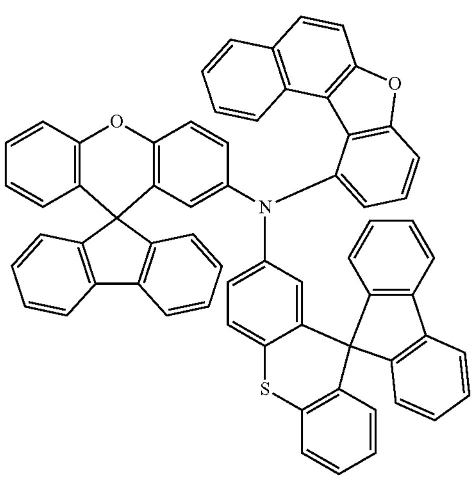
P2-39
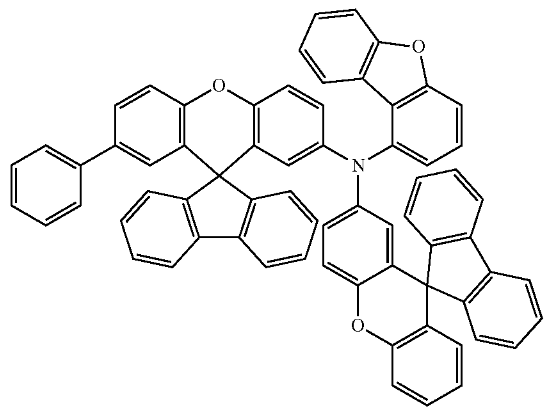
P2-40
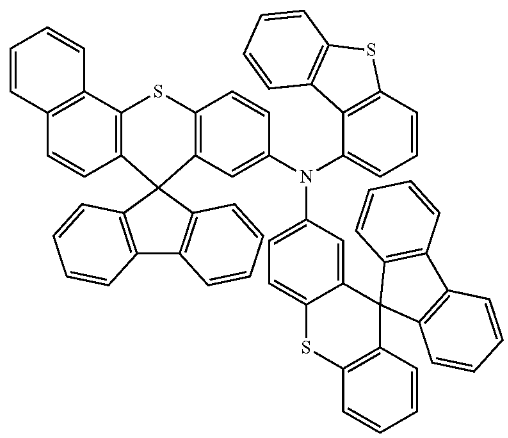
P2-41
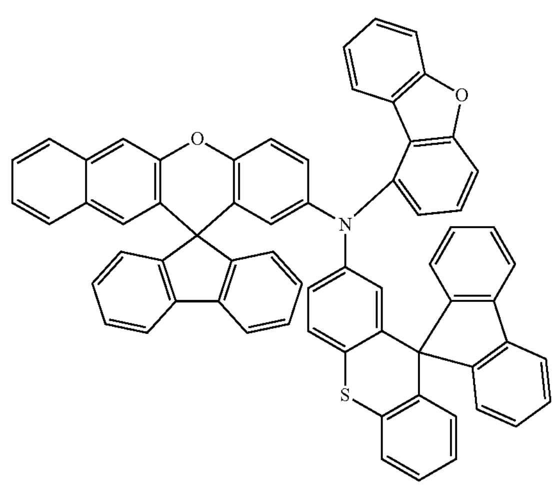

-continued
P2-42
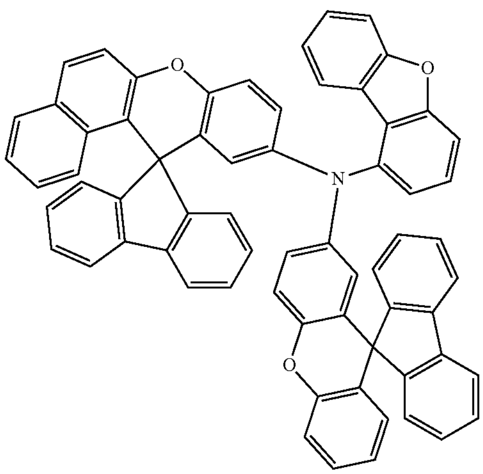
P2-43
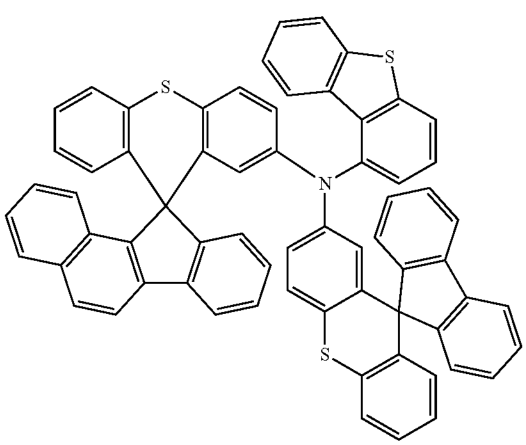
P2-44
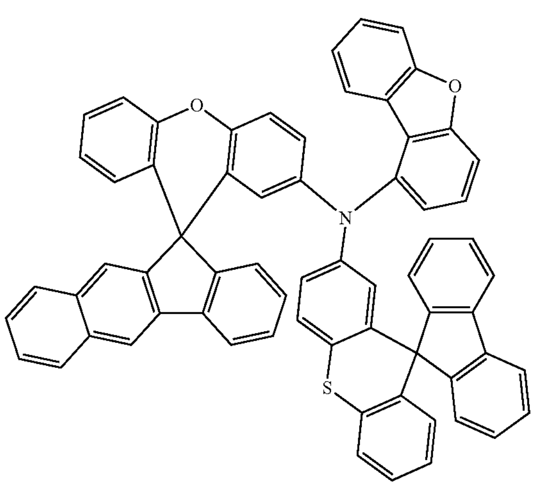
-continued
P2-45
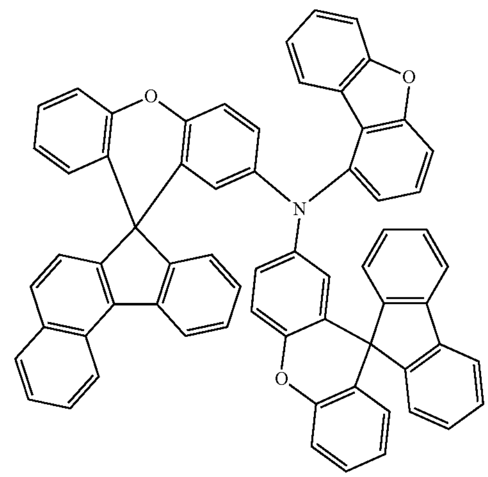
P2-46
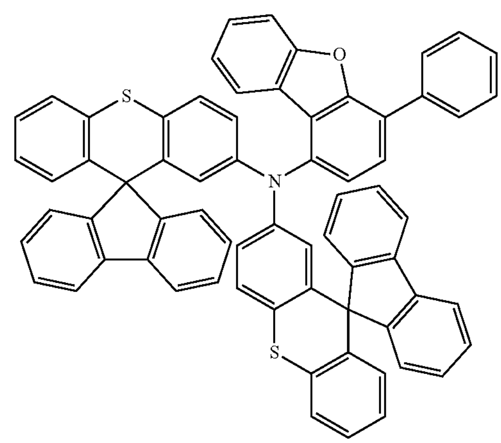
P2-47
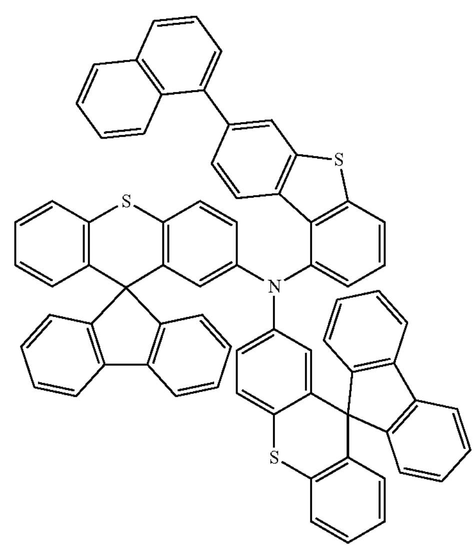

-continued
P2-48
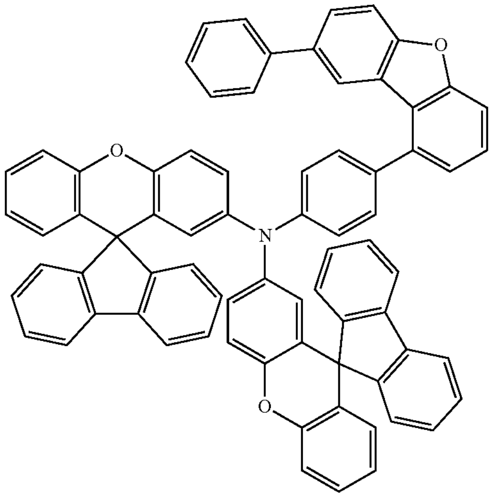
P2-49
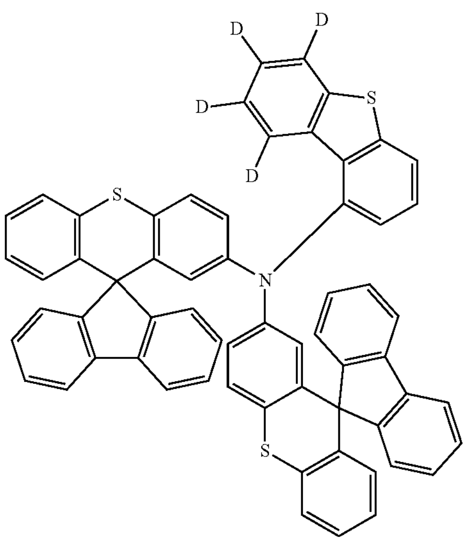
P2-50
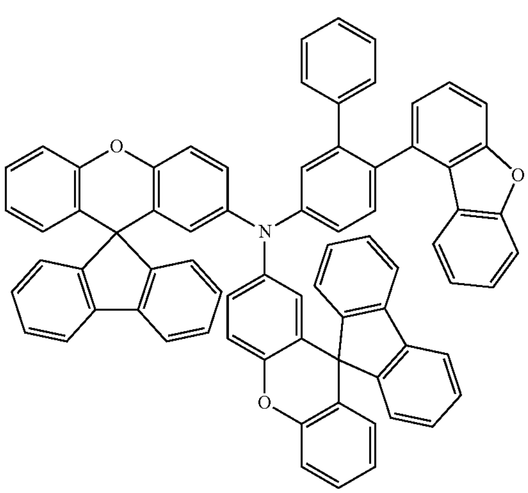
-continued
P2-51
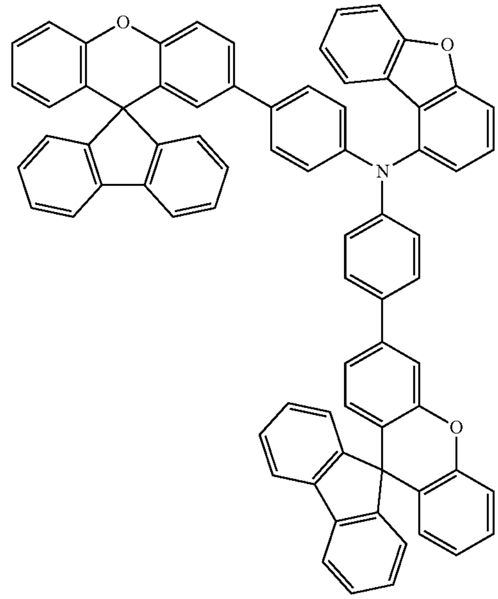
P2-52
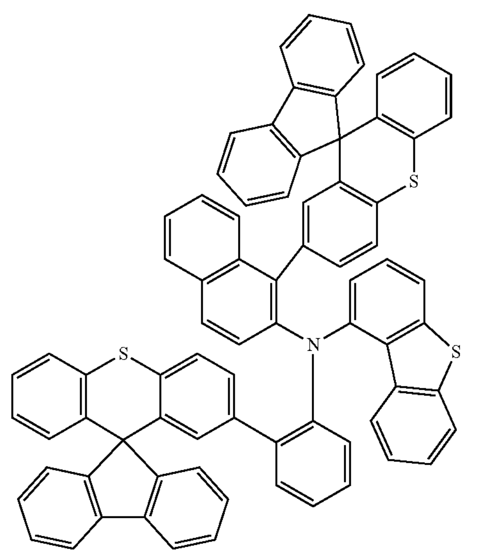

-continued
P2-53
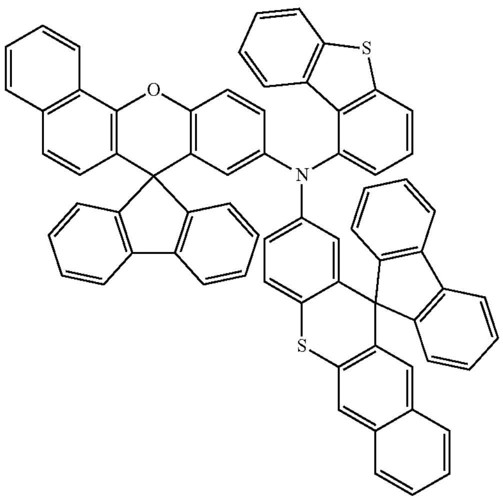
P2-54
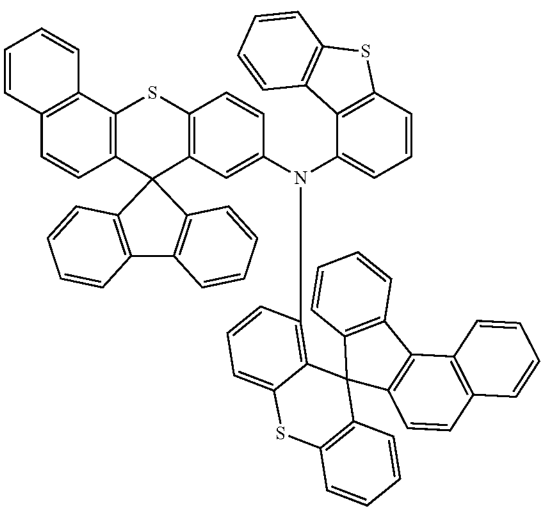
P2-55
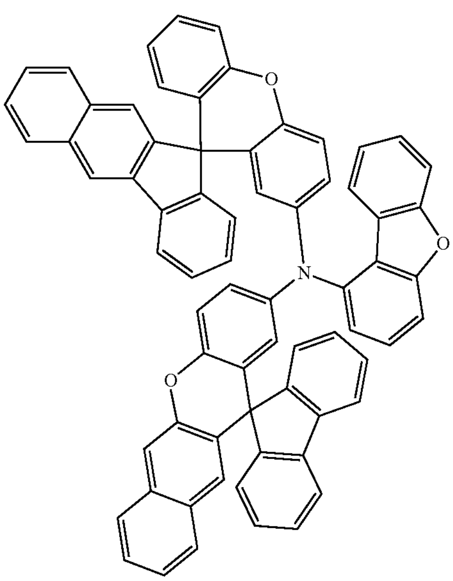
-continued
P3-1
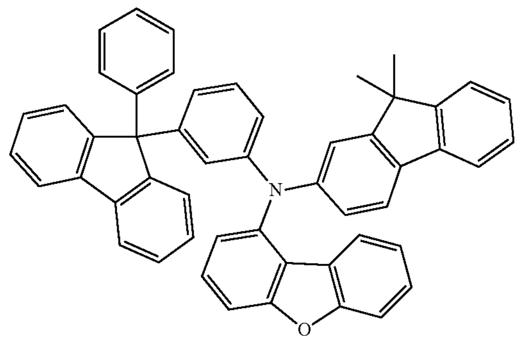
P3-2
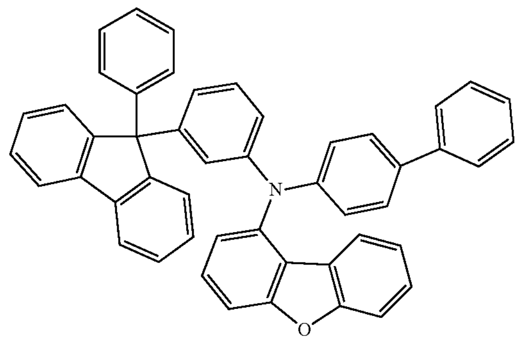
P3-3
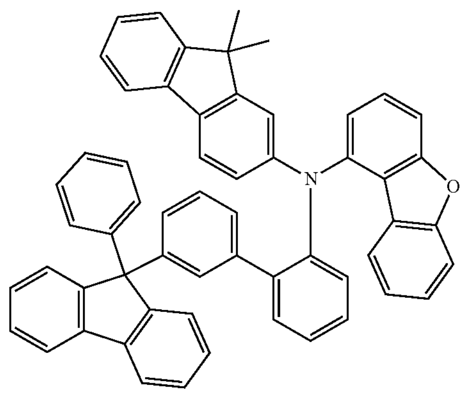
P3-4
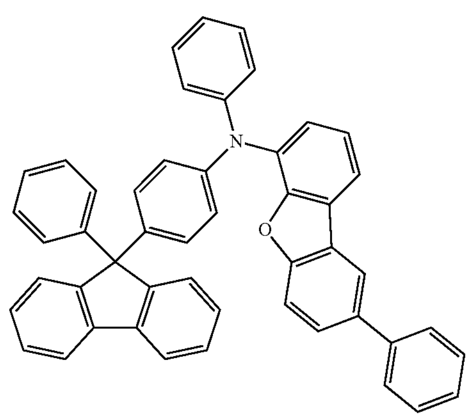

-continued
P3-5
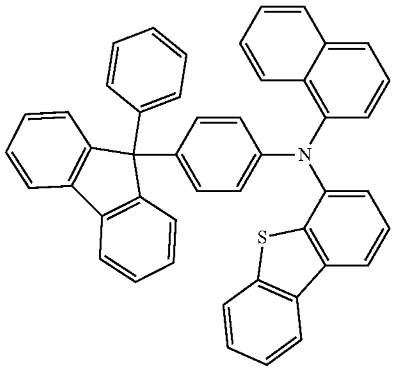
P3-6
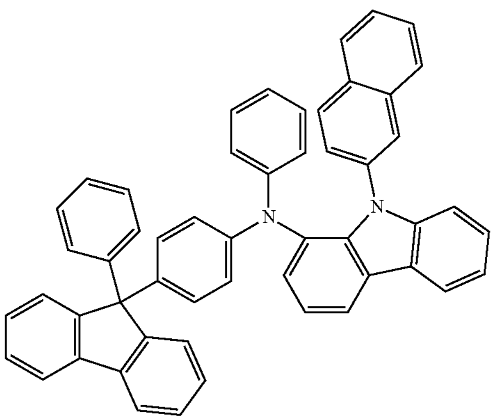
P3-7
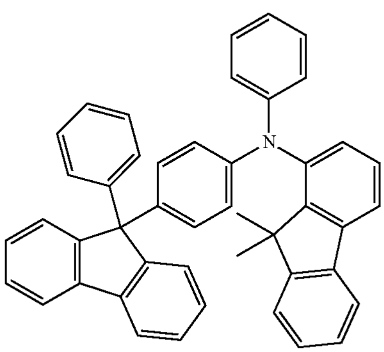
P3-8
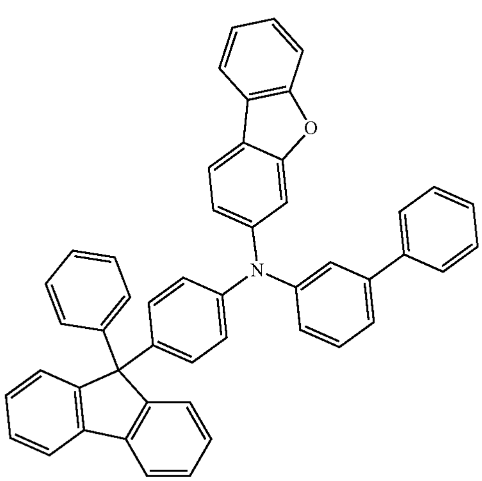
-continued
P3-9
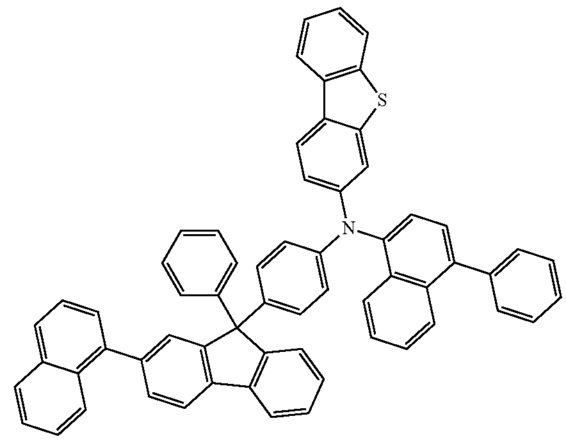
P3-10
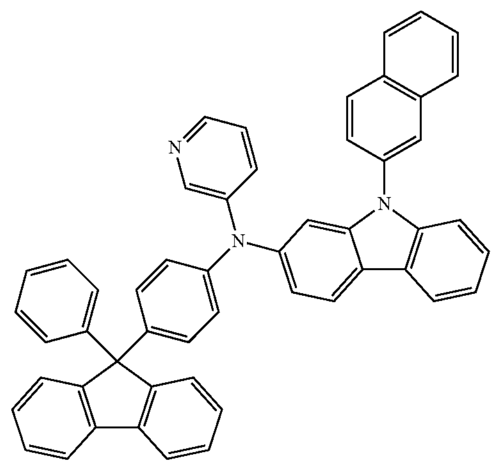
P3-11
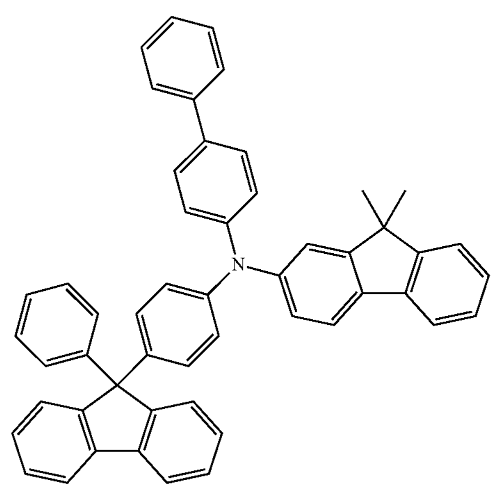

-continued
P3-12
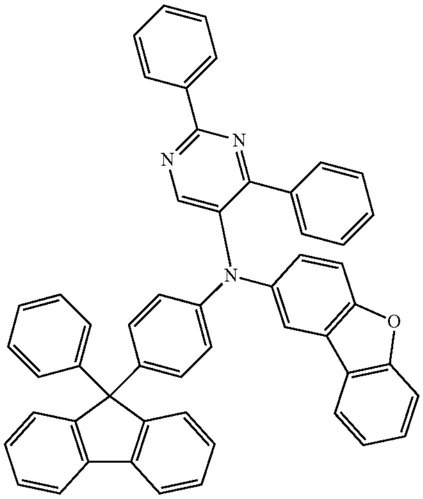
P3-13
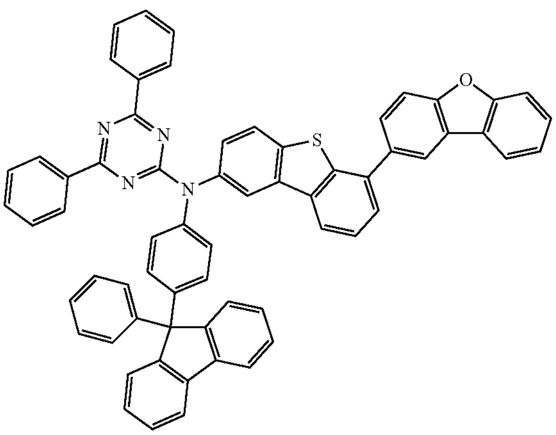
P3-14
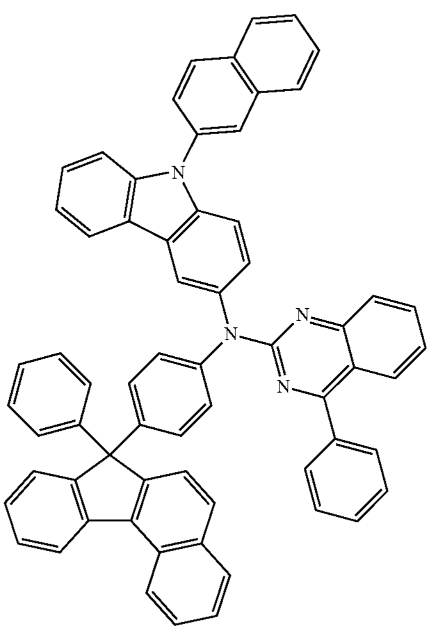
-continued
P3-15
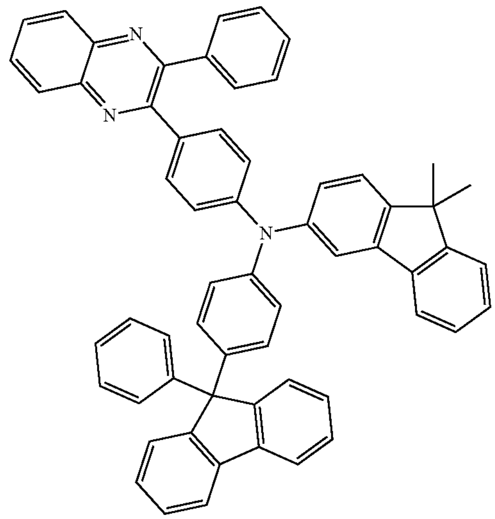
P3-16
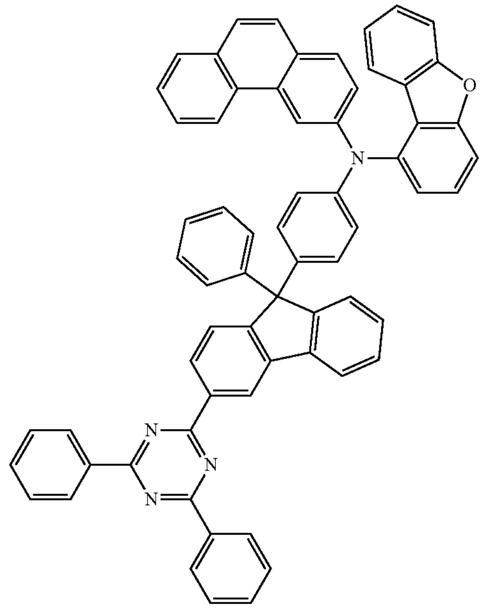
P3-17
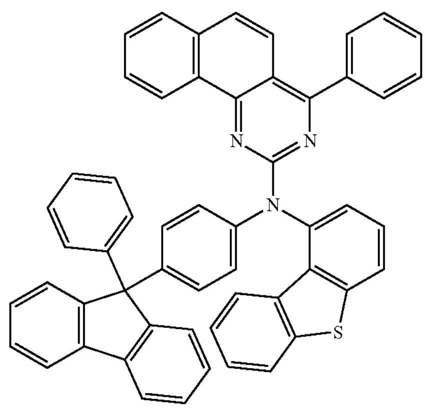

-continued
P3-18
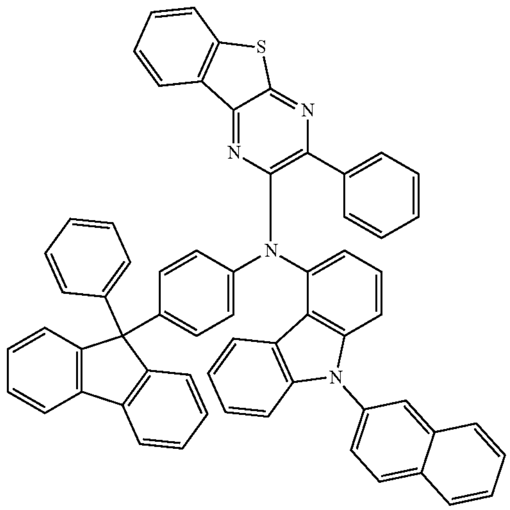
P3-19
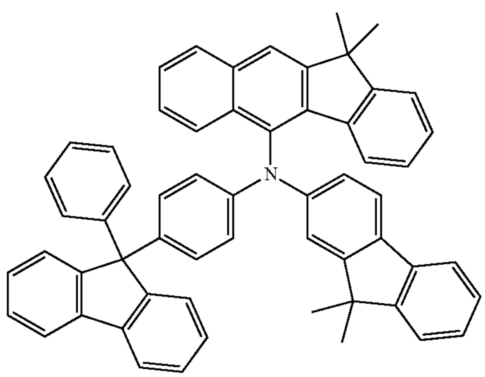
P3-20
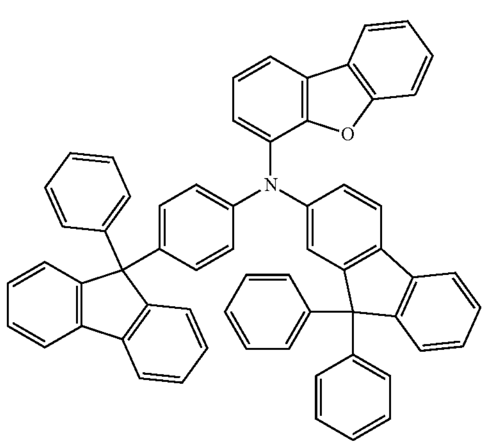
-continued
P3-21
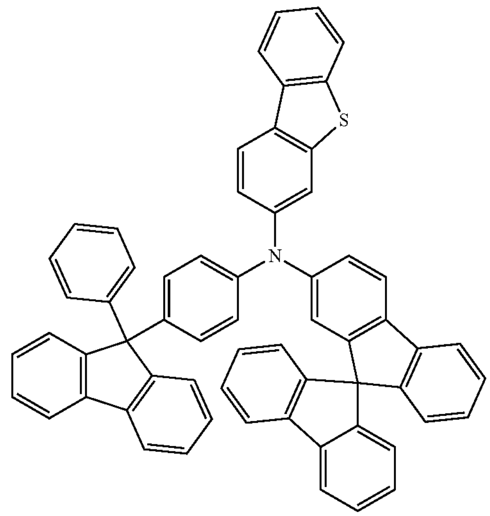
P3-22
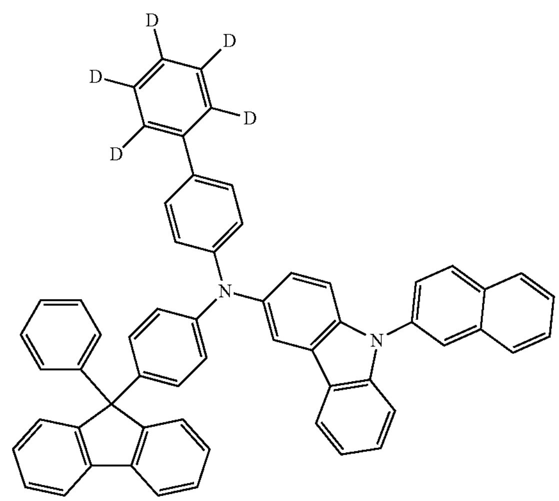
P3-23
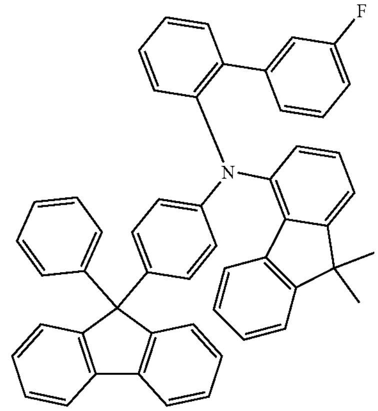

-continued
P3-24
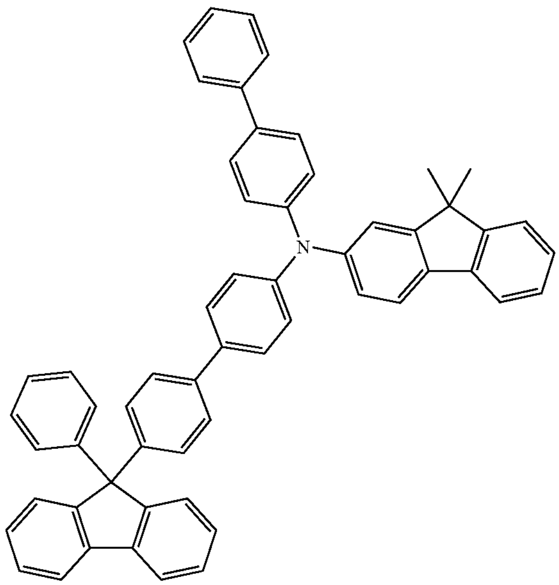
P3-25
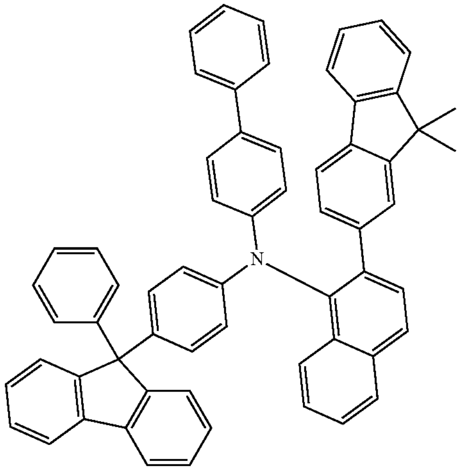
P3-26
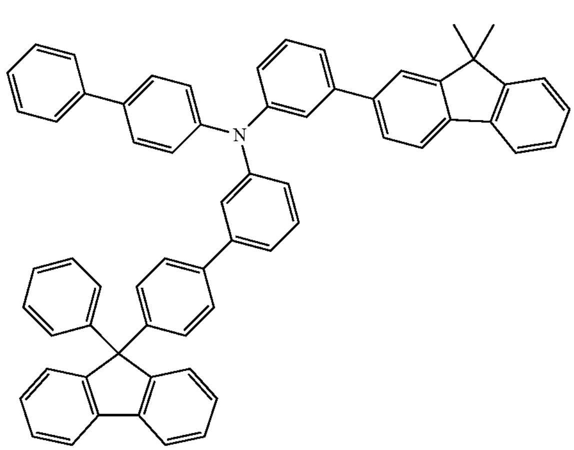
-continued
P3-27
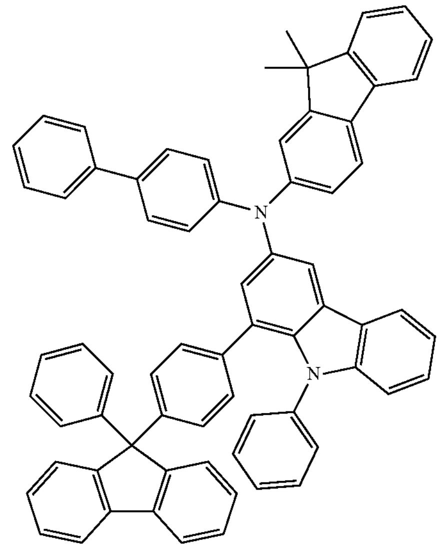
P3-28
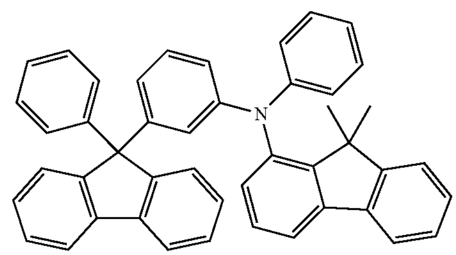
P3-29
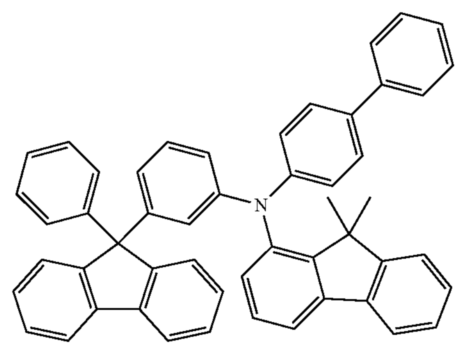
P3-30
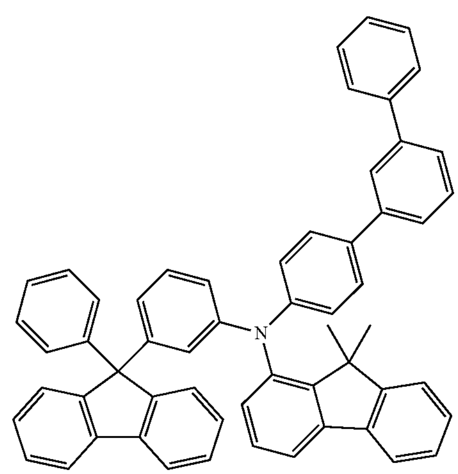

-continued
P3-31
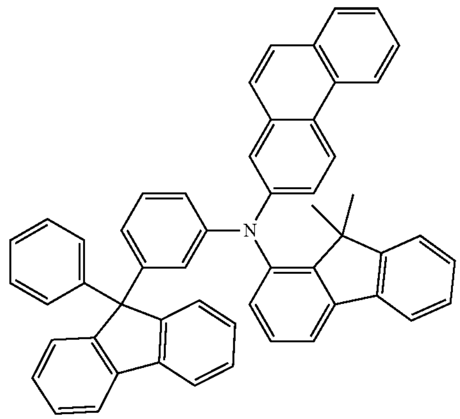
P3-32
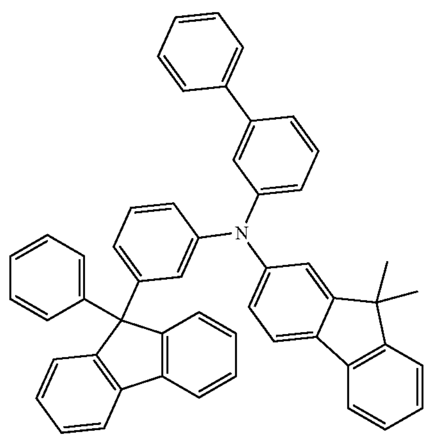
P3-33
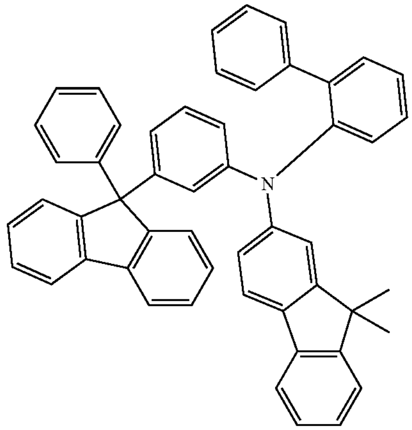
-continued
P3-34
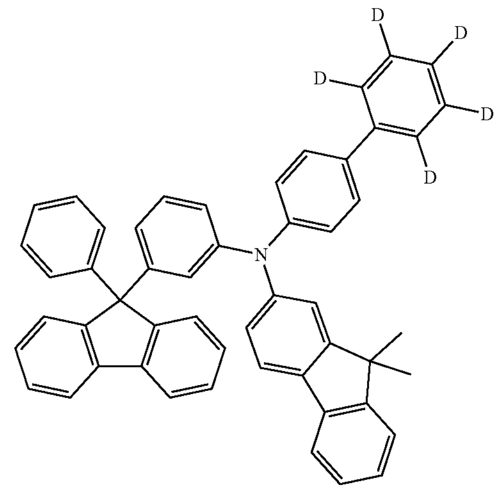
P3-35
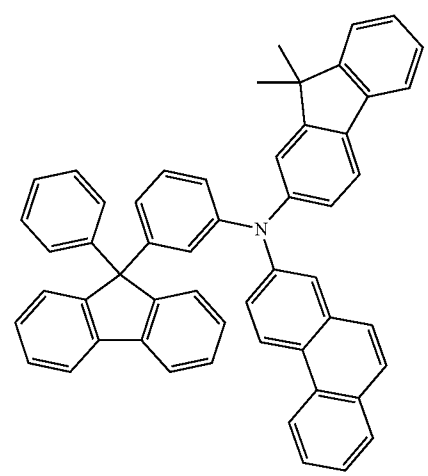
P3-36
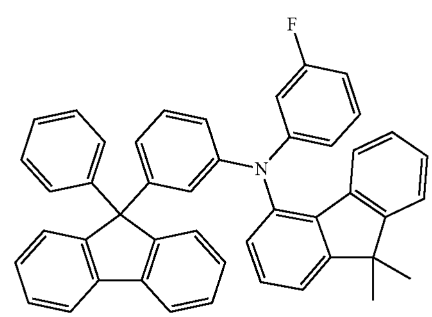

-continued
P3-37
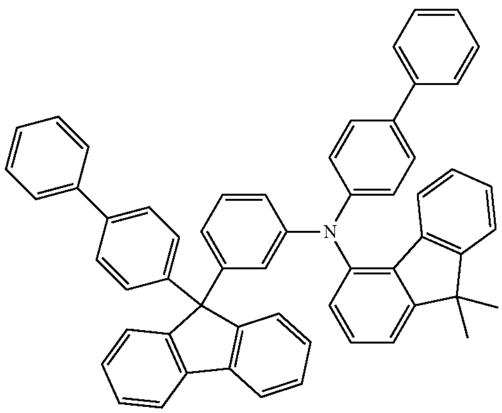
P3-38
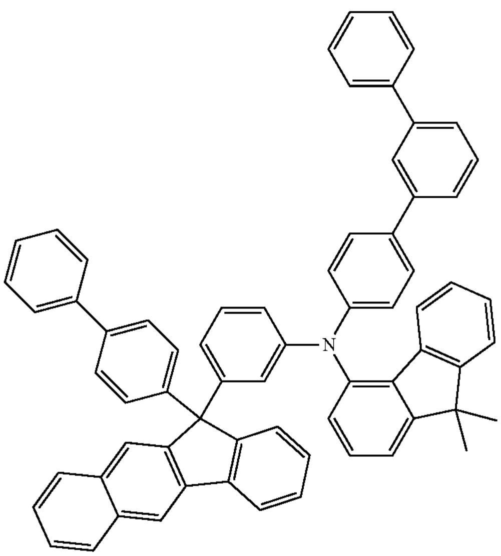
P3-39
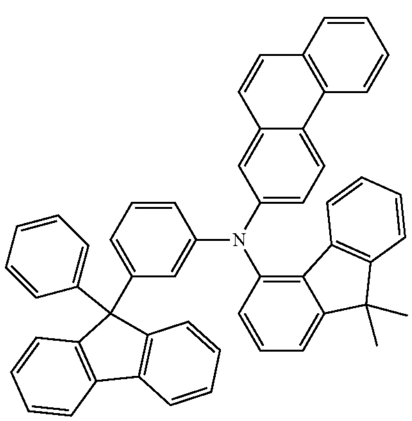
-continued
P3-40
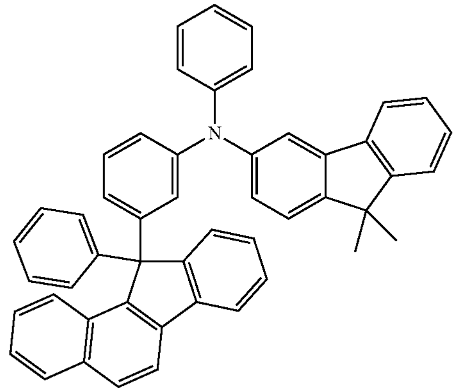
P3-41
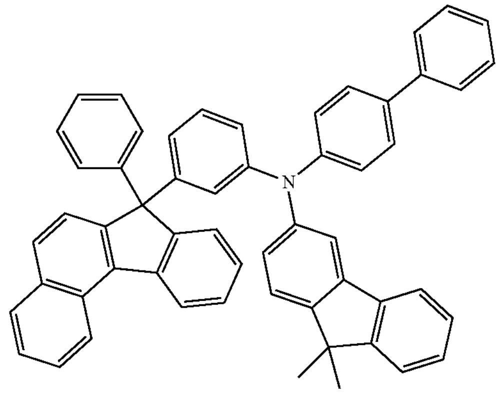
P3-42
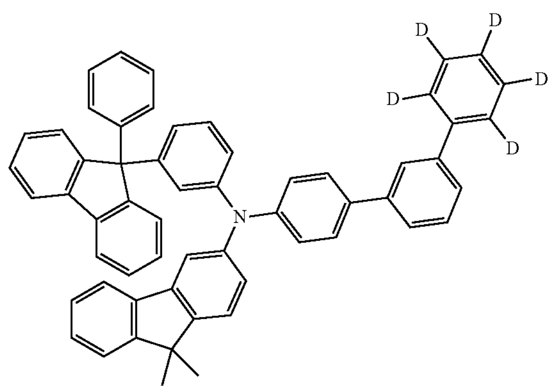
P3-43
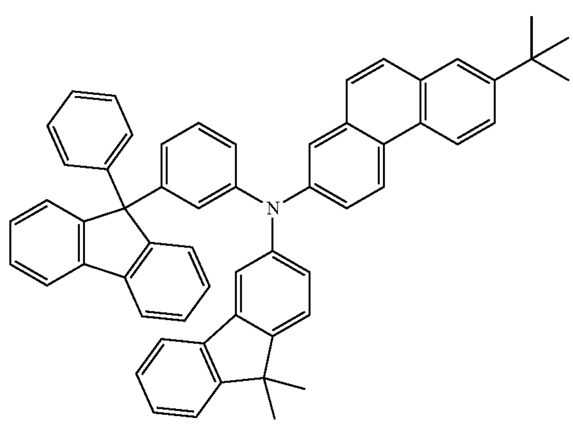

-continued
P3-44
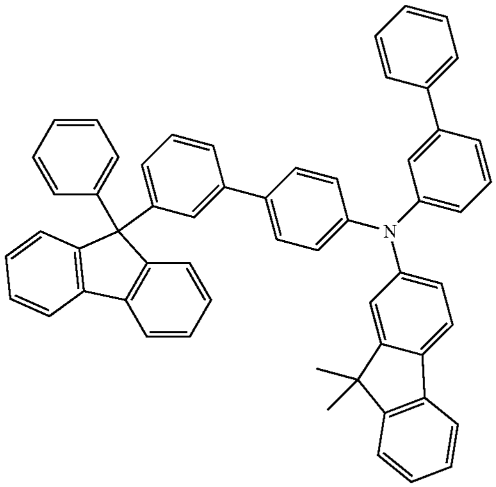
P3-45
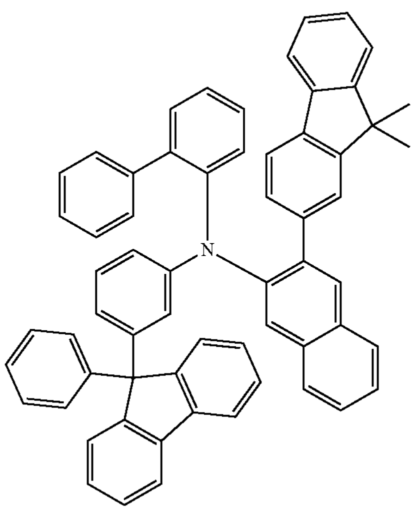
P3-46
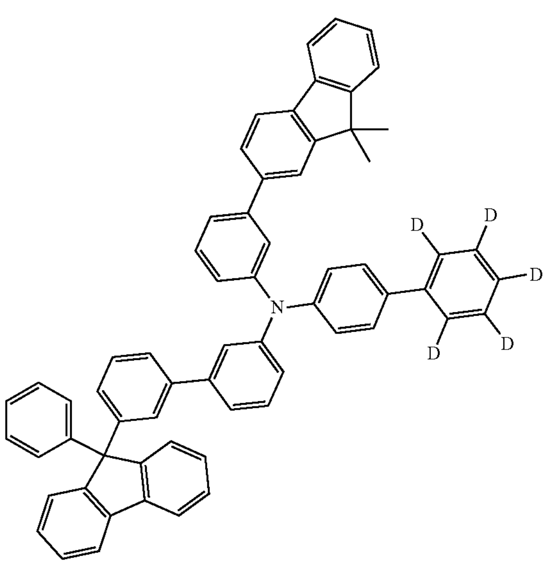
-continued
P3-47
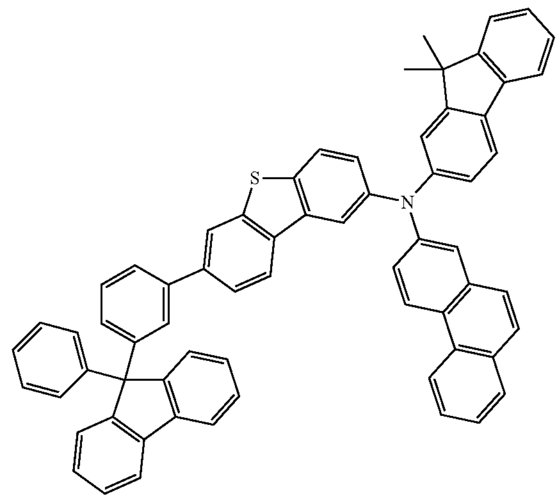
P3-48
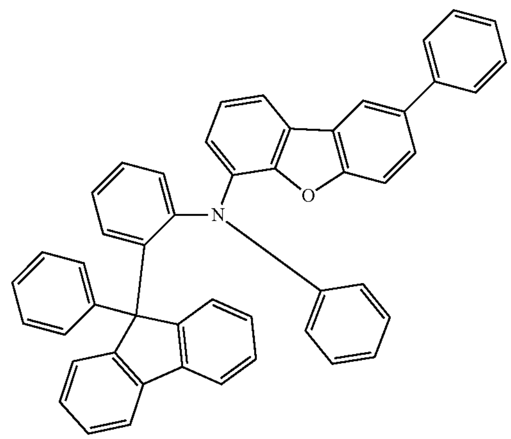
P3-49
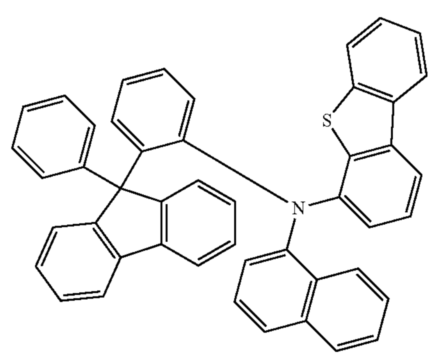

-continued
P3-50
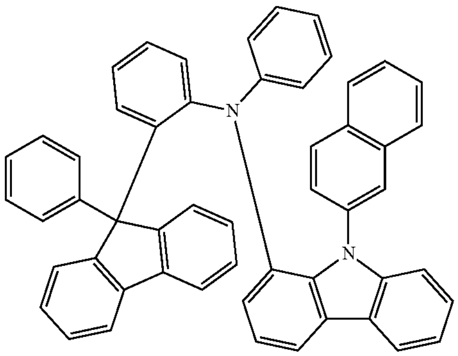
P3-51
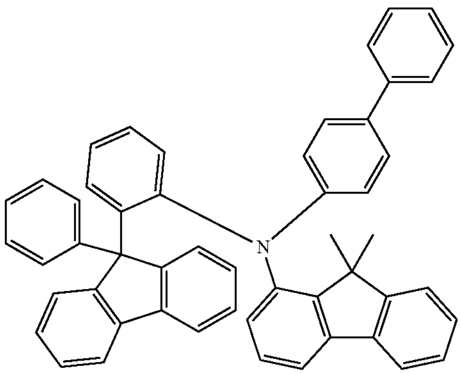
P3-52
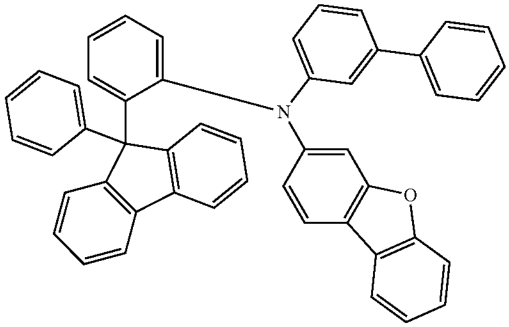
P3-53
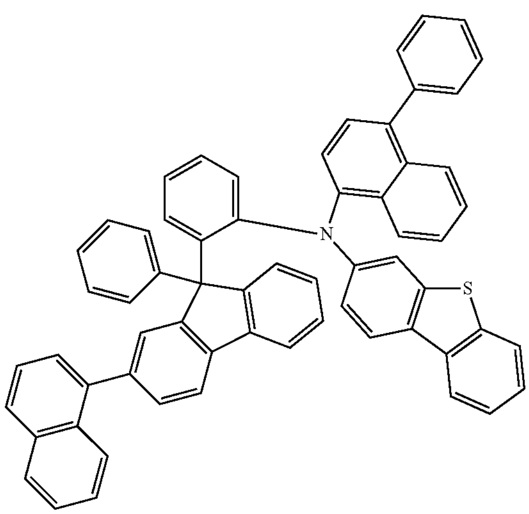
-continued
P3-54
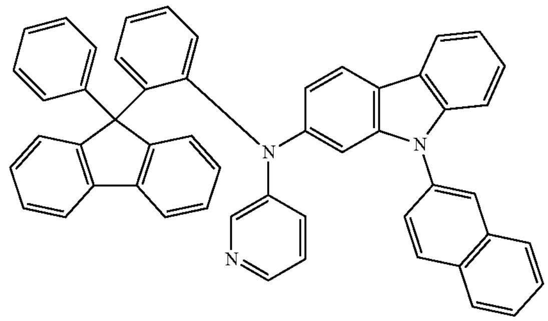
P3-55
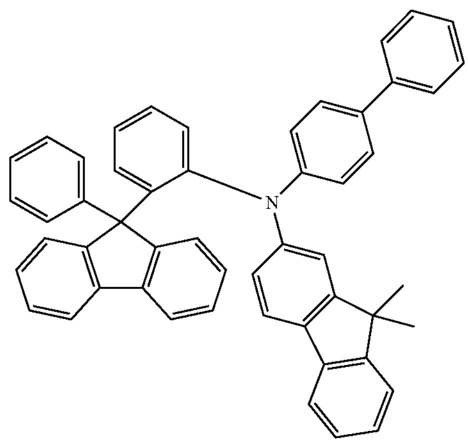
P3-56
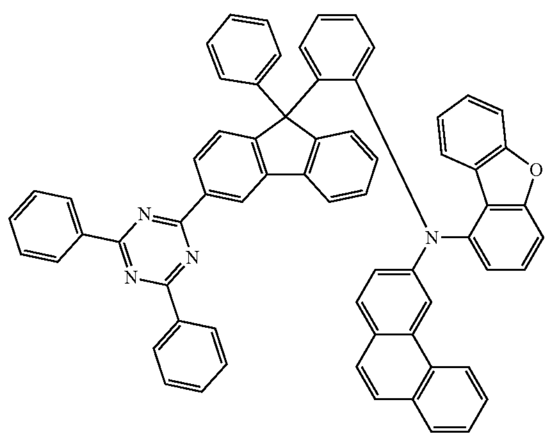

-continued
P3-57
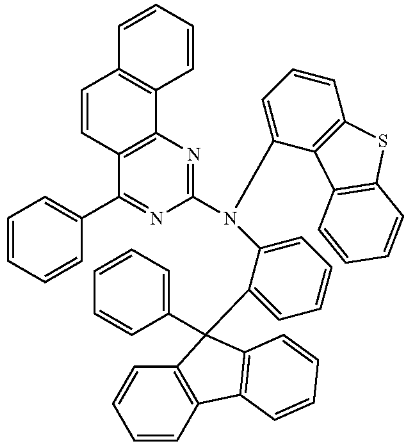
P3-58
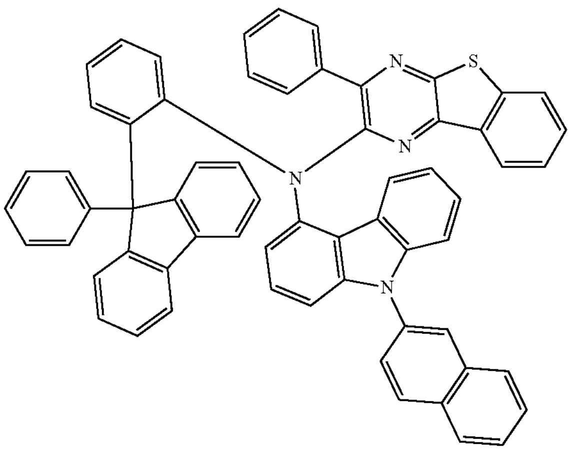
P3-59
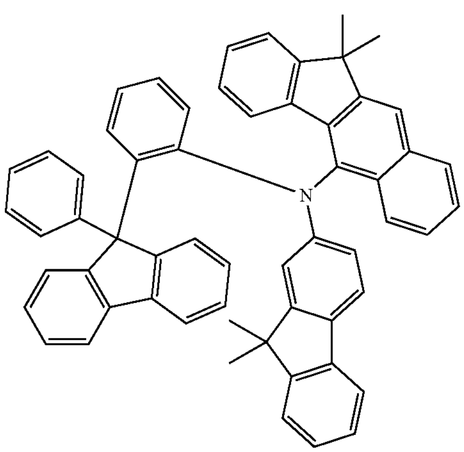
-continued
P3-60
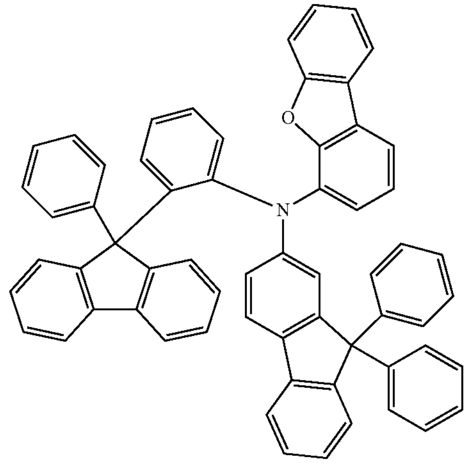
P3-61
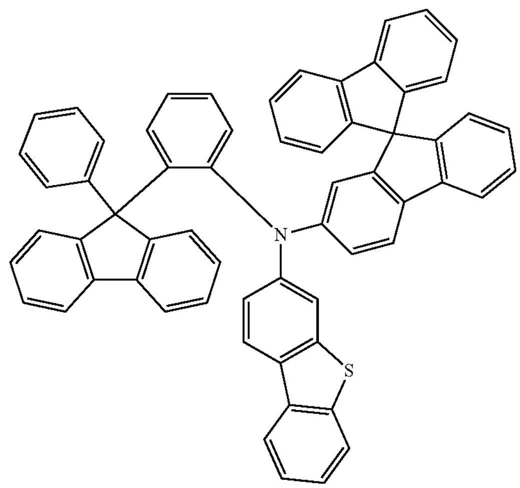
P3-62
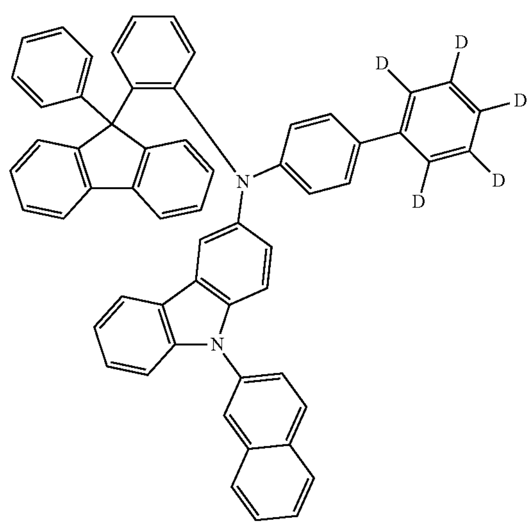

-continued
P3-63
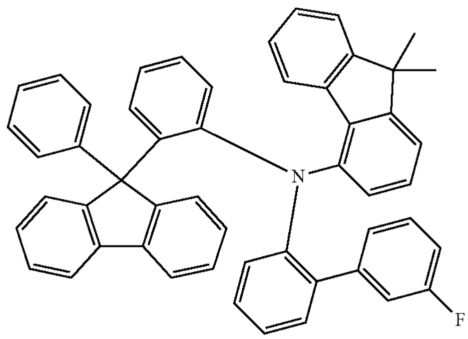
P3-64
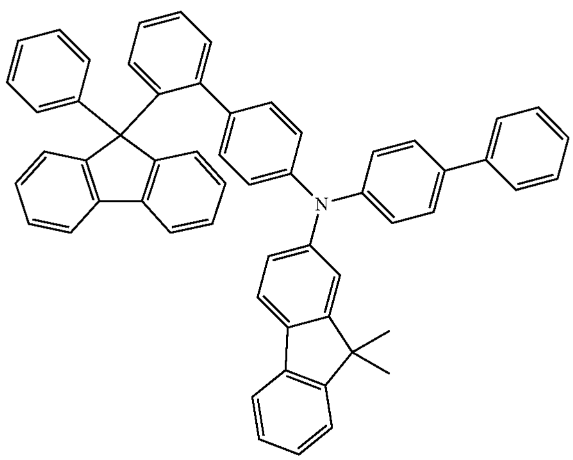
P3-65
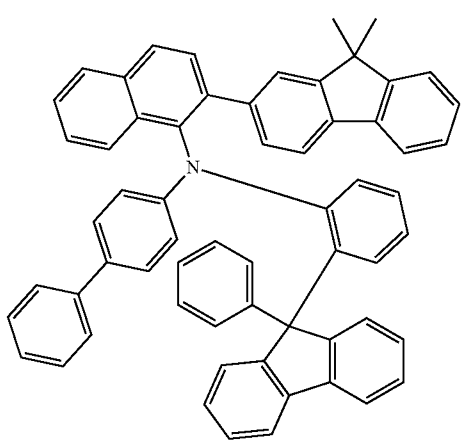
-continued
P3-66
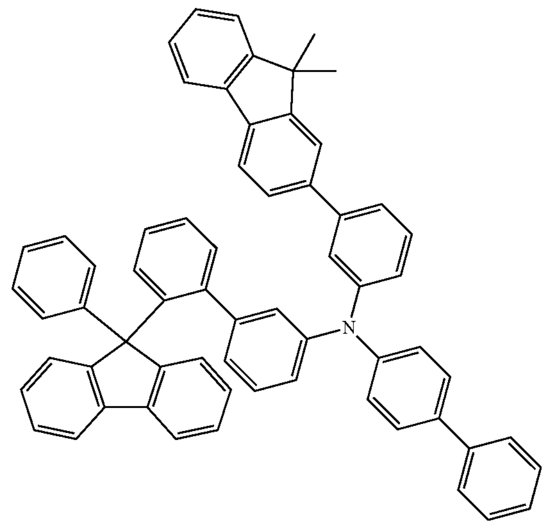
P3-67
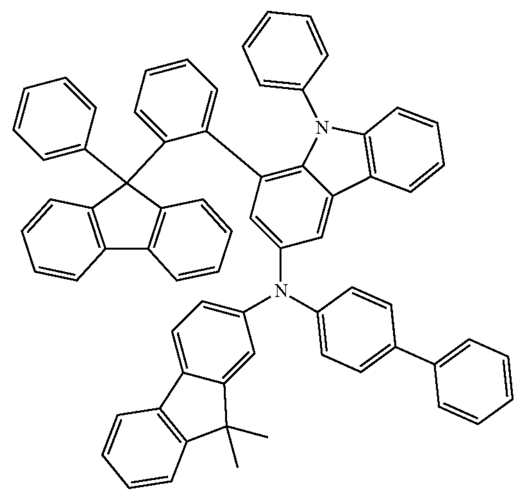
P3-68
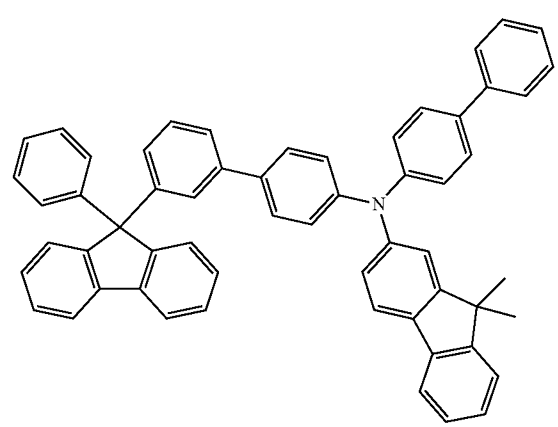

-continued
P3-69
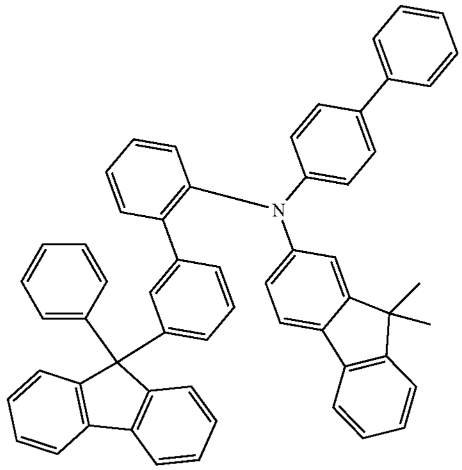
P3-70
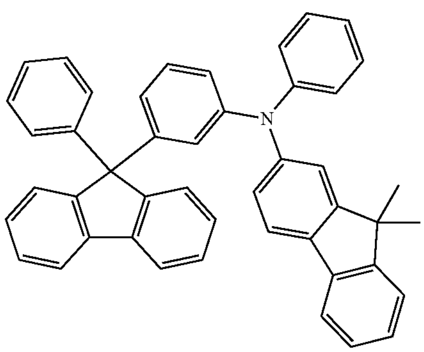
P3-71
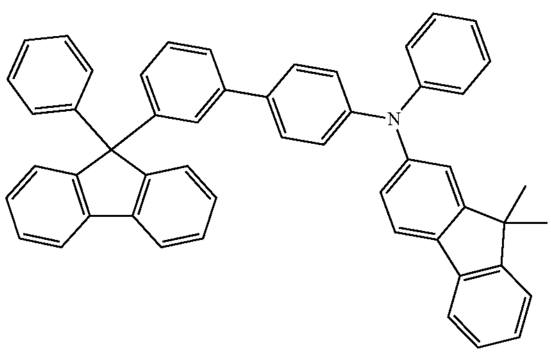
P3-72
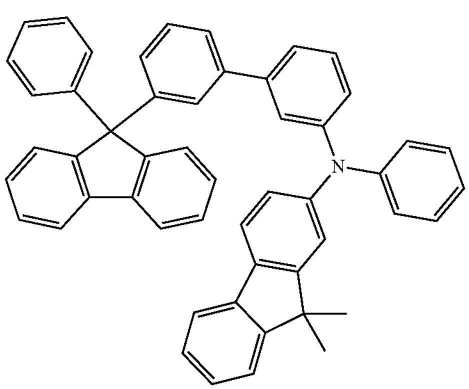
-continued
P3-73
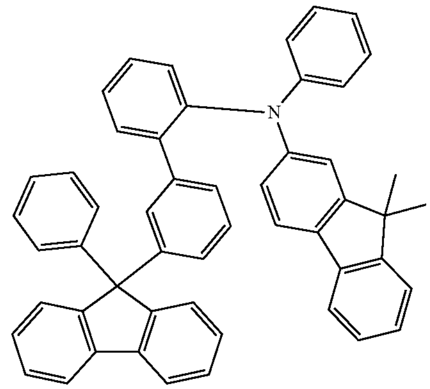
P3-74
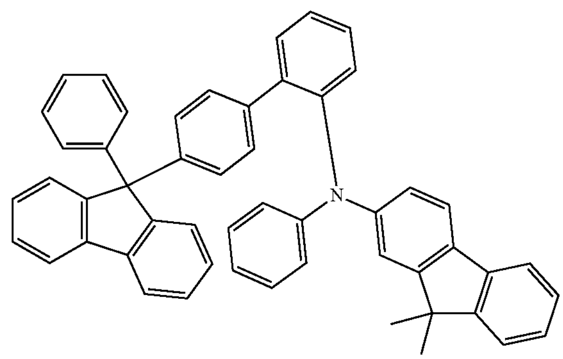
P3-75
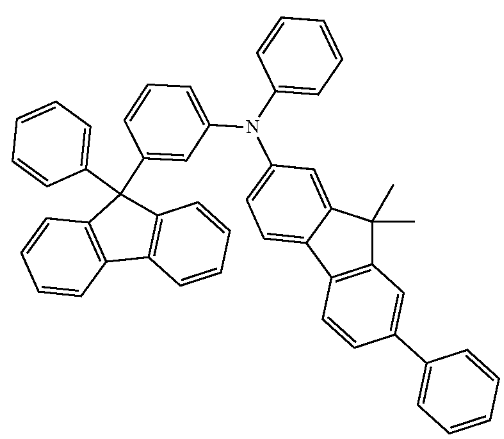

P3-76
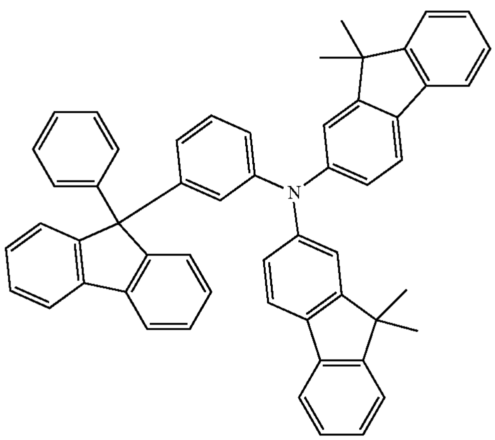
P3-77
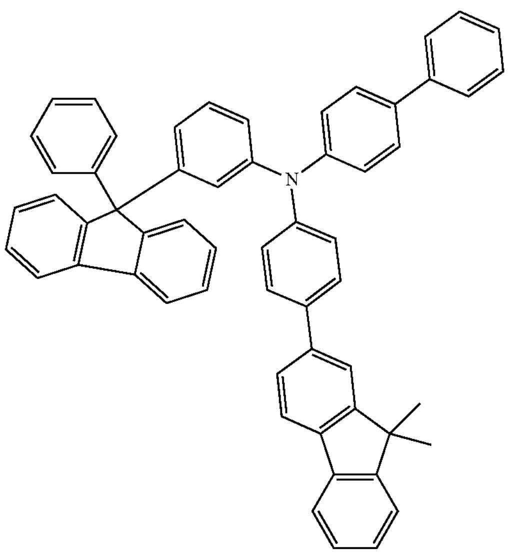
P3-78
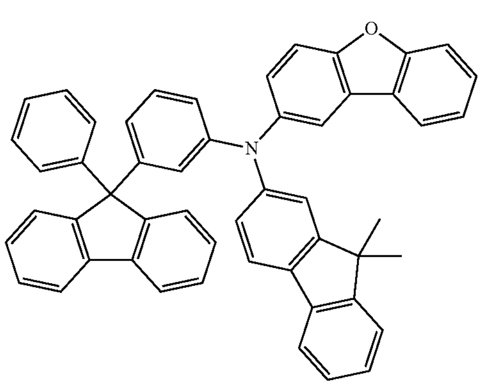
P3-79
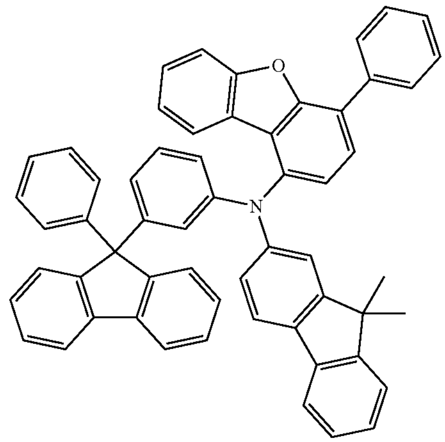
P3-80
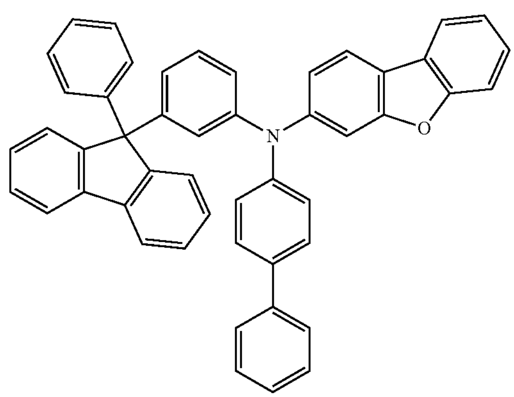
P3-81
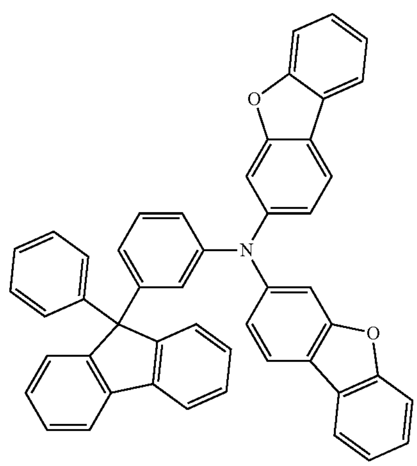

-continued
P3-82
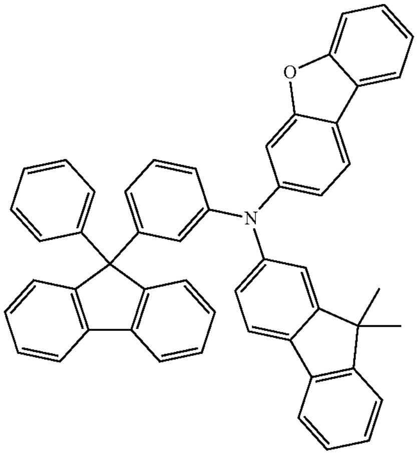
P3-83
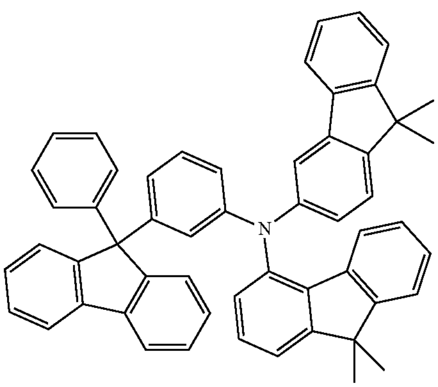
P3-84
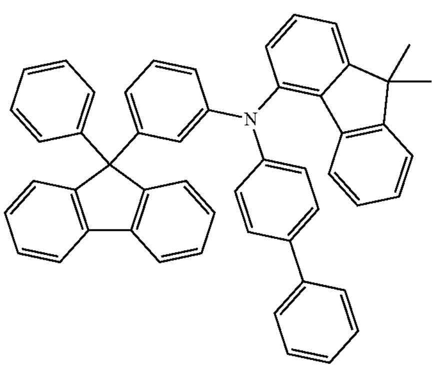
P3-85
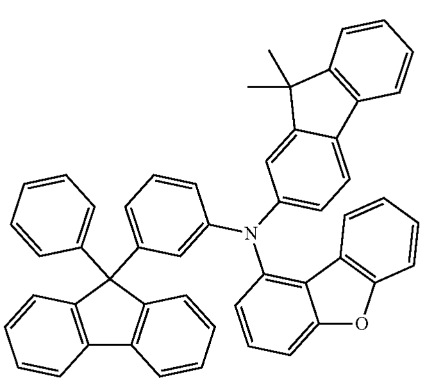
-continued
P3-86
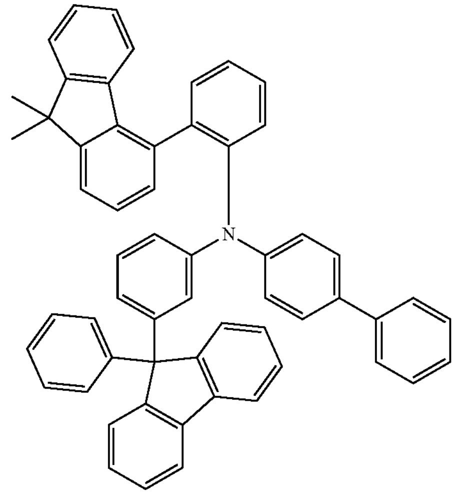
P3-87
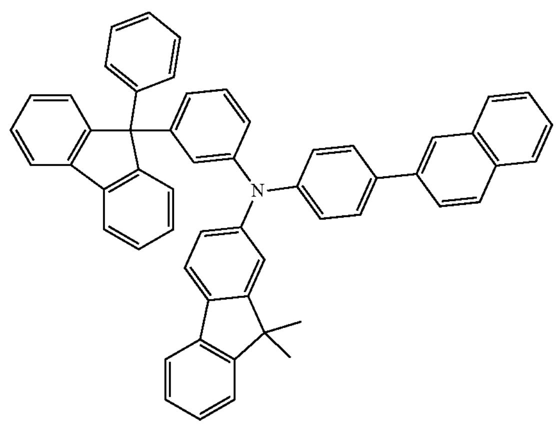
P3-88
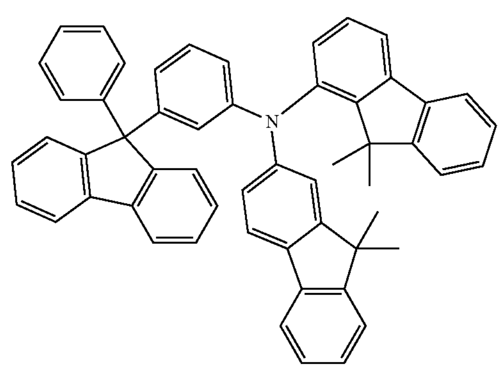

-continued
P3-89
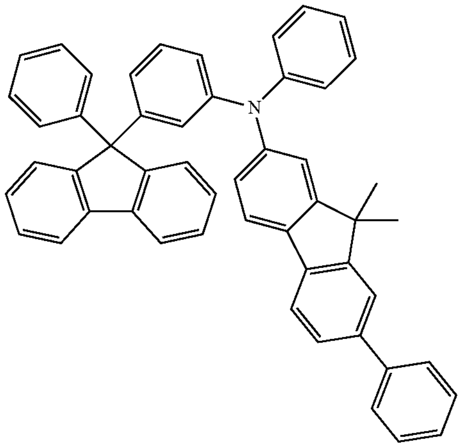
P3-90
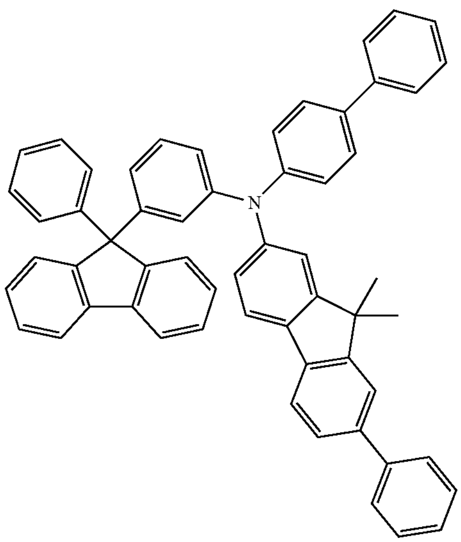
P3-91
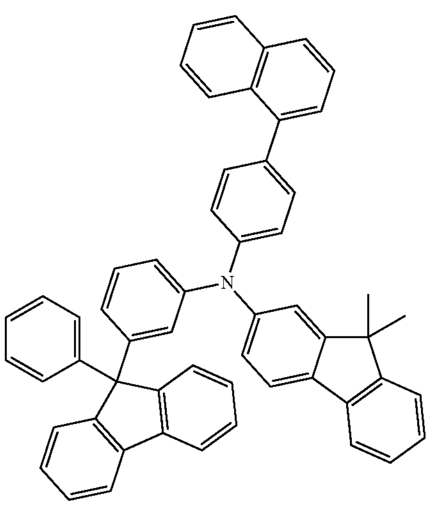
-continued
P3-92
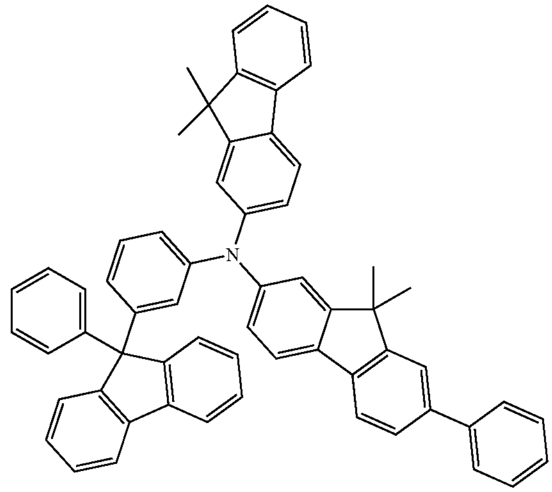
P3-93
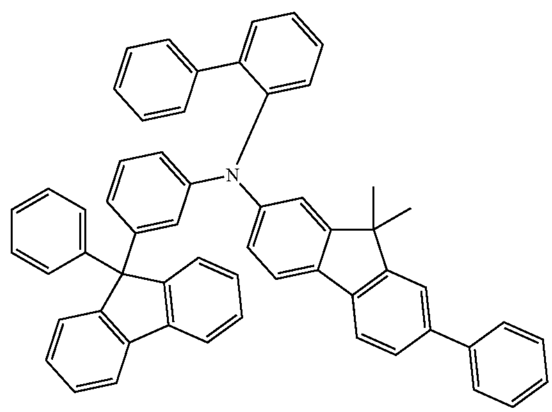
P3-94
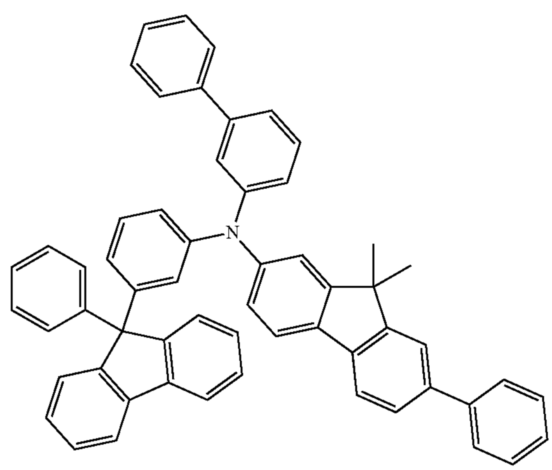

-continued
P3-95
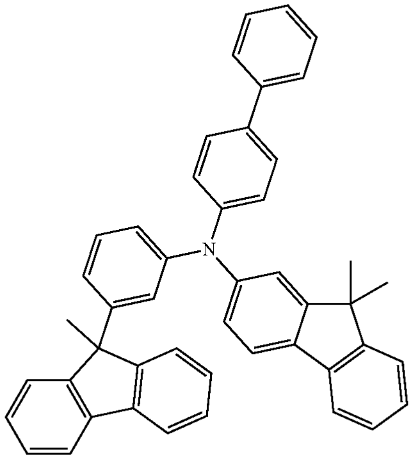
P3-96
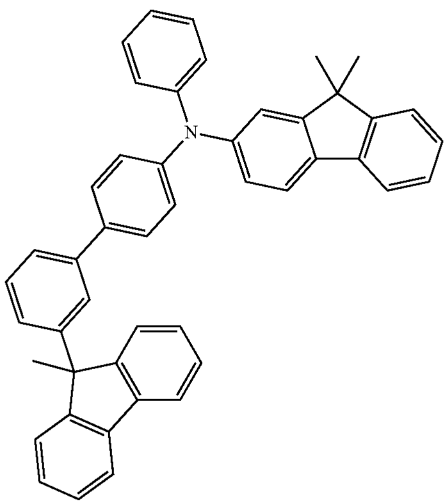
P3-97
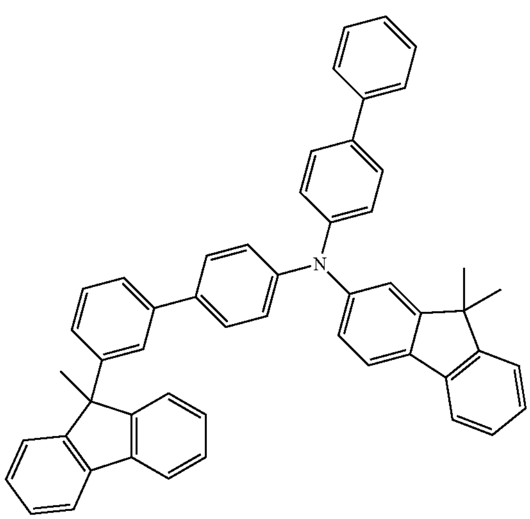
-continued
P3-98
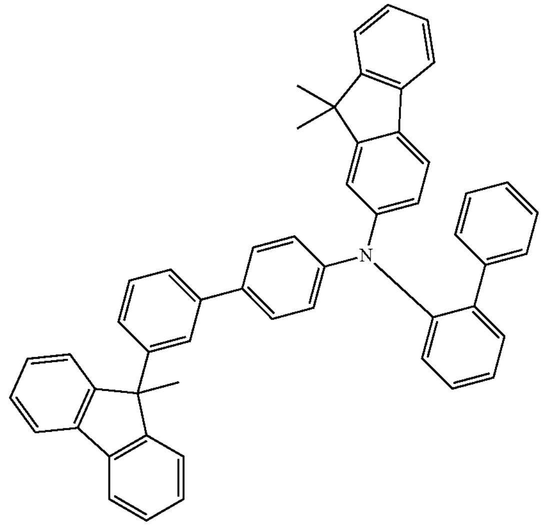
P3-99
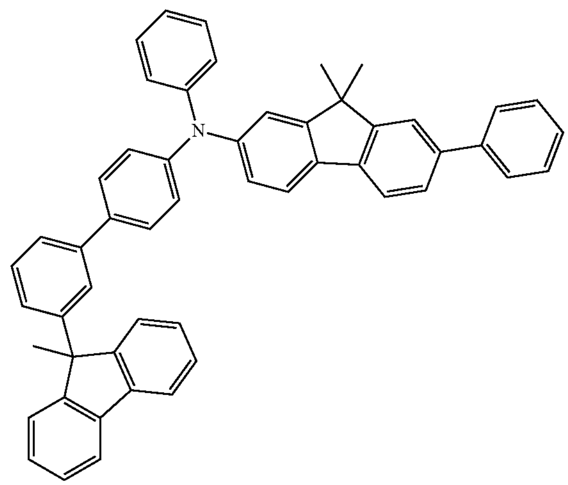
P3-100
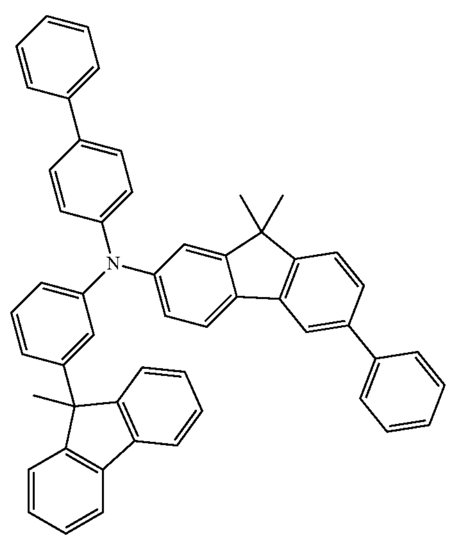

-continued
P3-101
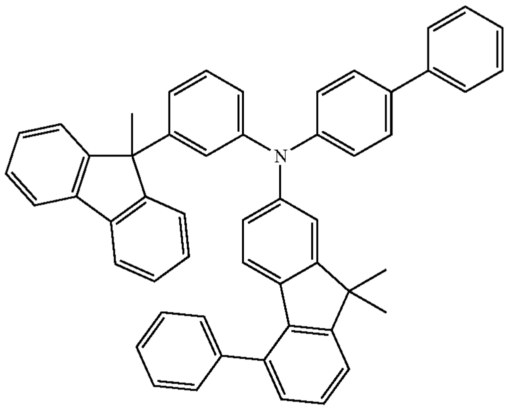
P3-102
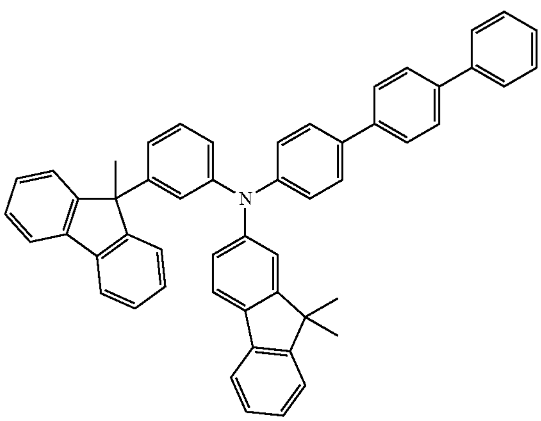
P3-103
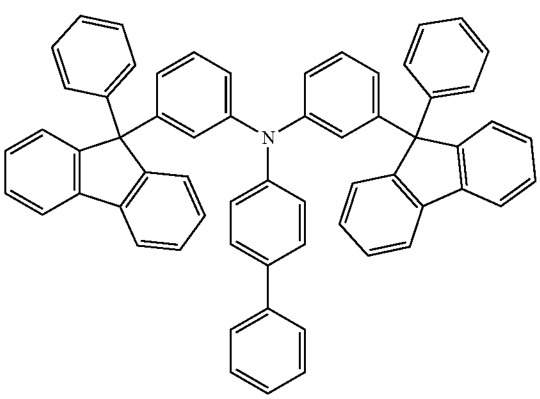
-continued
P3-104
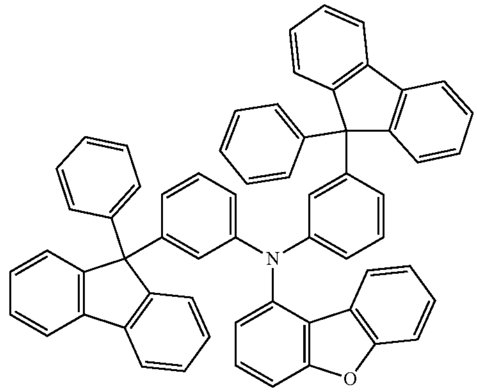
P3-105
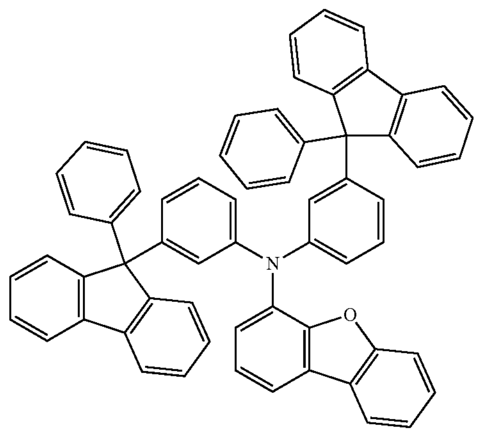
P3-106
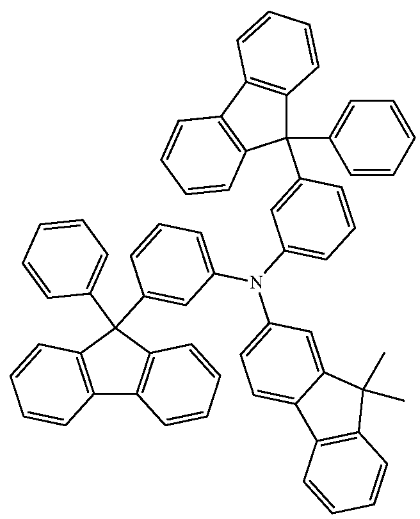

P3-107
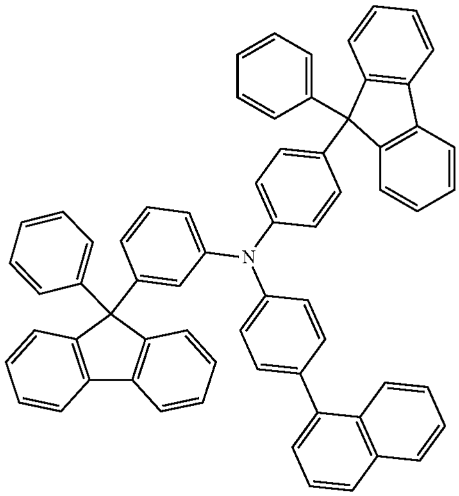
P3-108
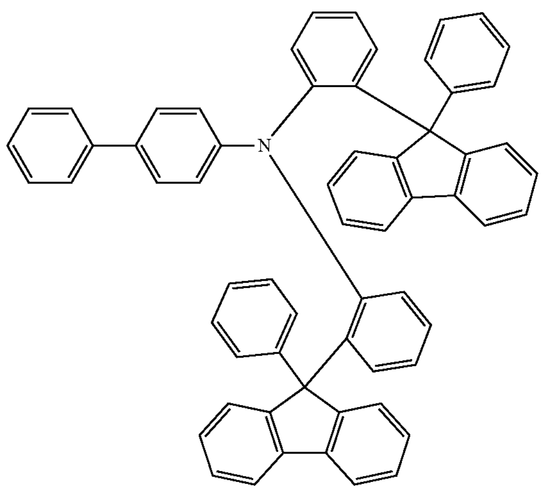
Specifically, the compound represented by formula 2 may be one of the following compounds, but there is no limitation thereto.
2-1
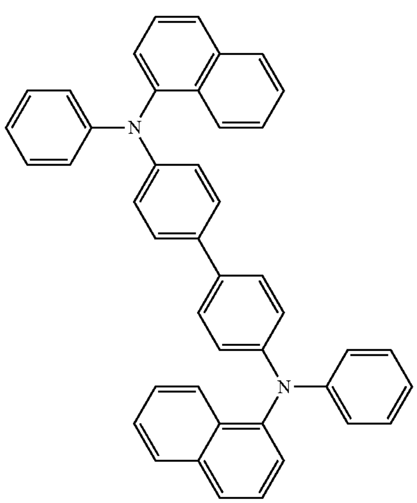
2-2
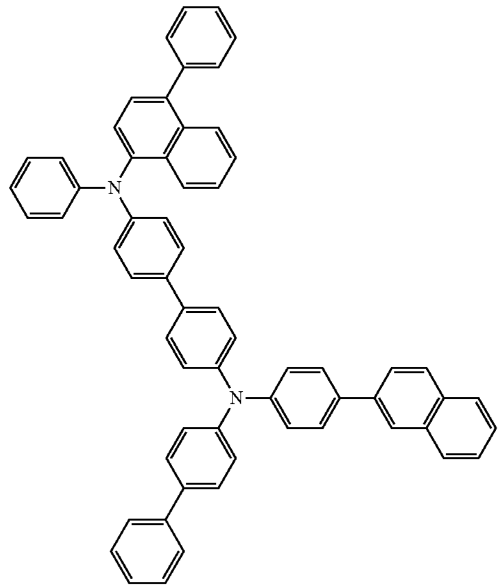
2-3
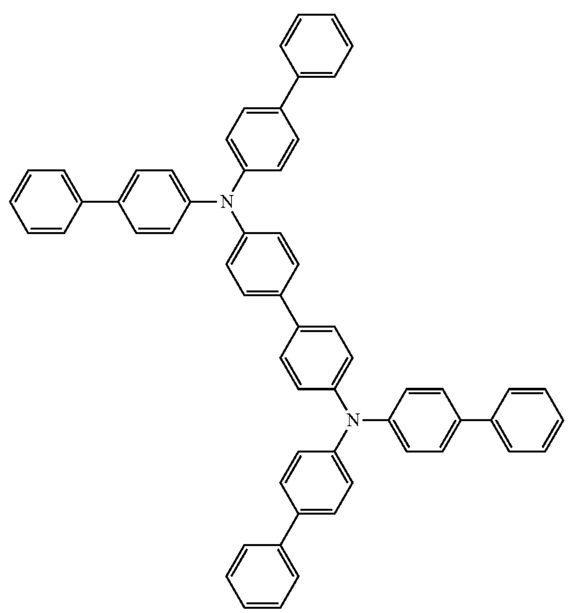

-continued
2-4
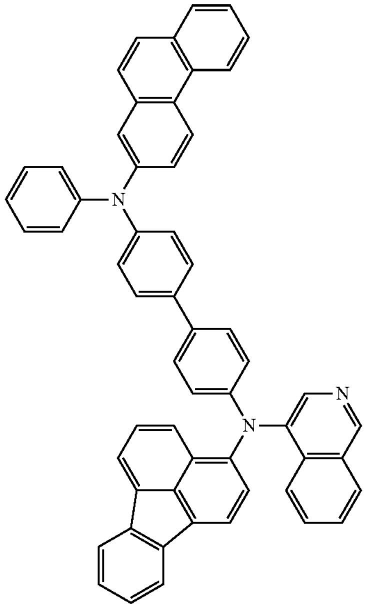
-continued
2-6
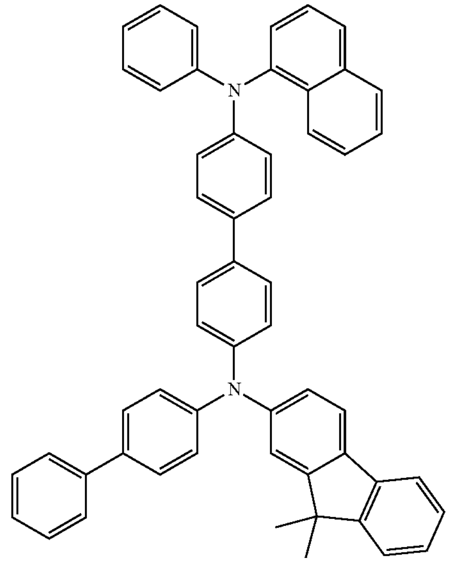
2-5
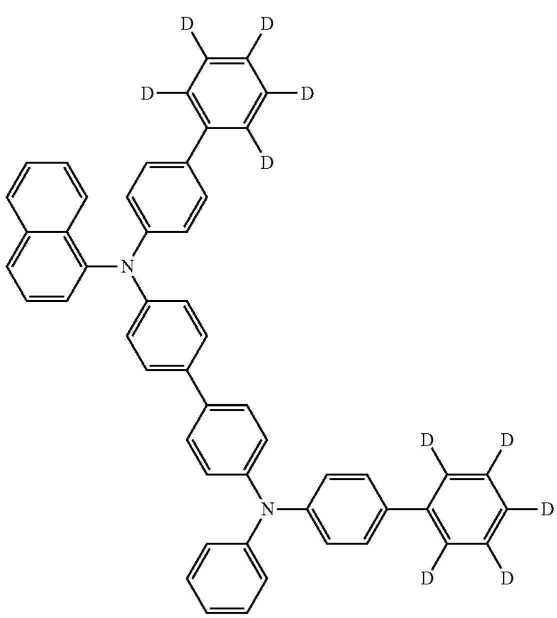
2-7
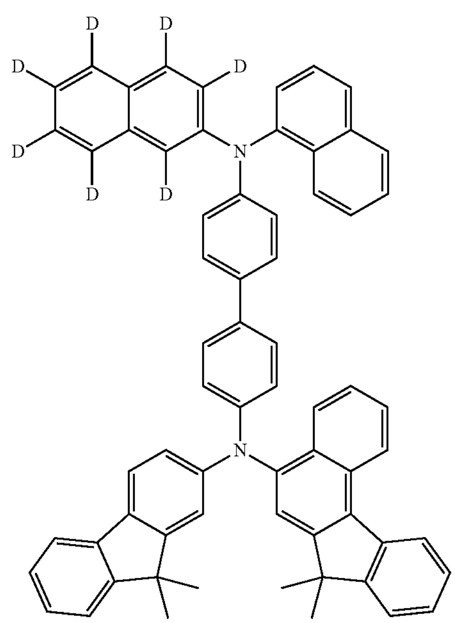

-continued
2-8
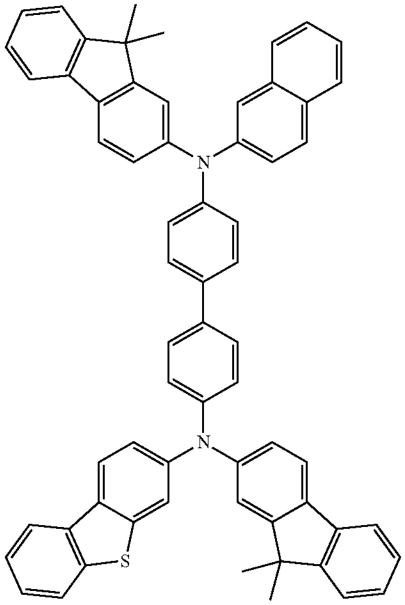
2-9
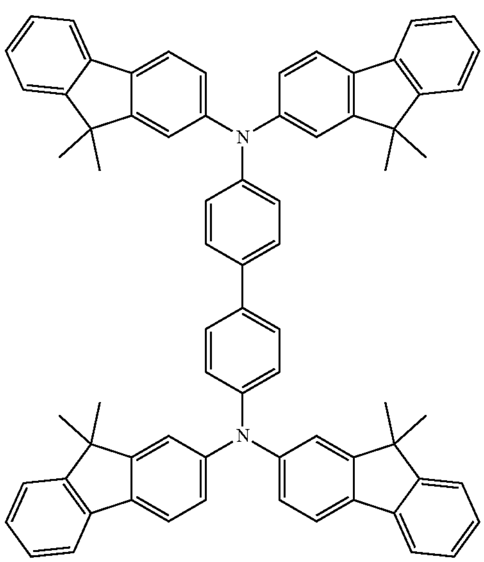
-continued
2-10
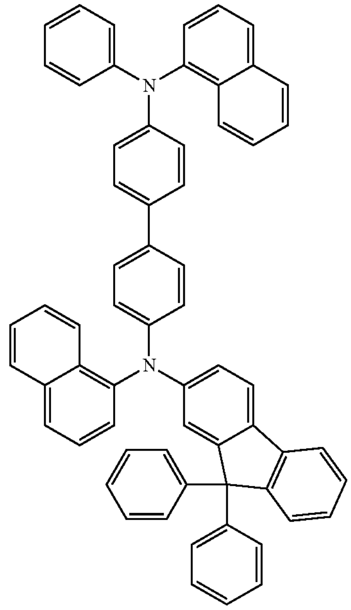
2-11
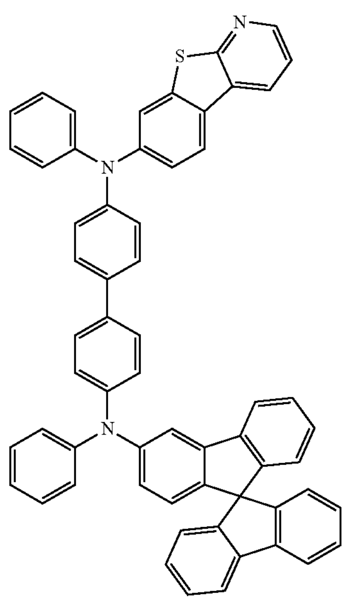

-continued
2-12
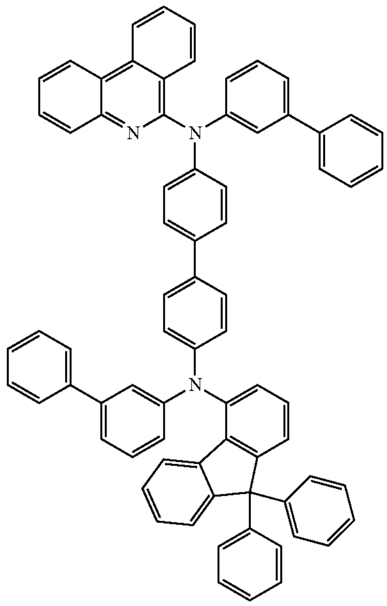
2-13
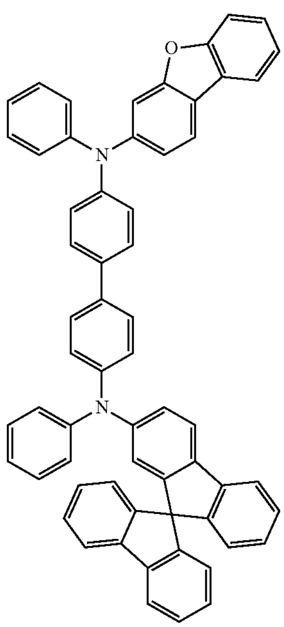
-continued
2-14
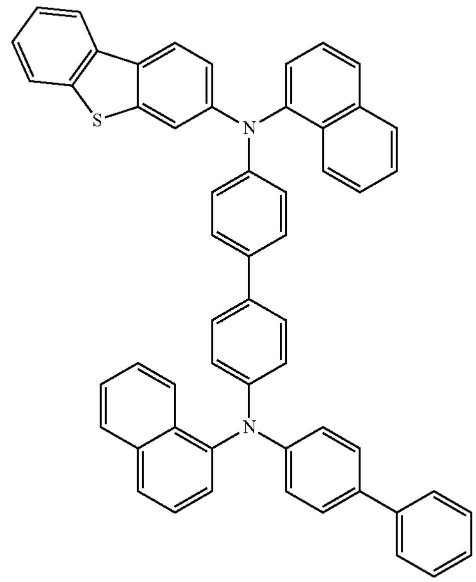
2-15
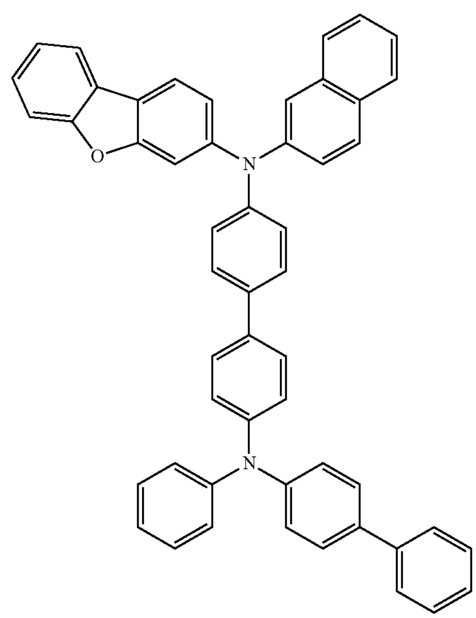

-continued
2-16
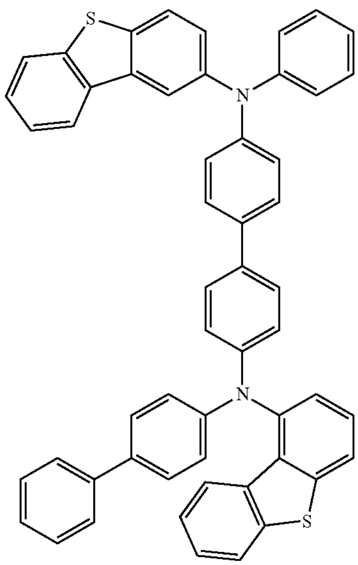
2-17
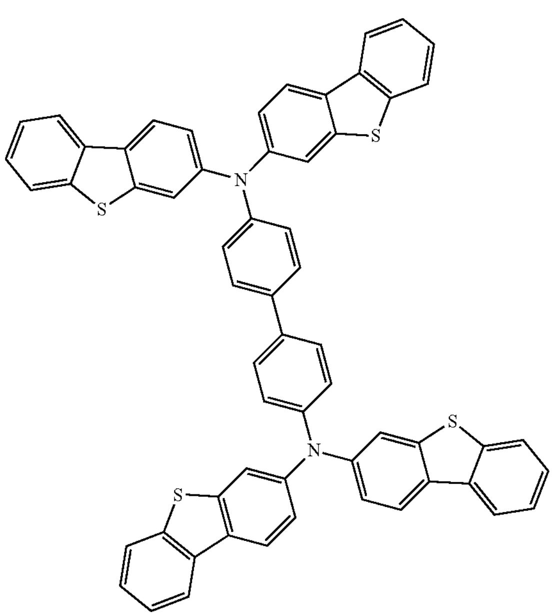
-continued
2-18
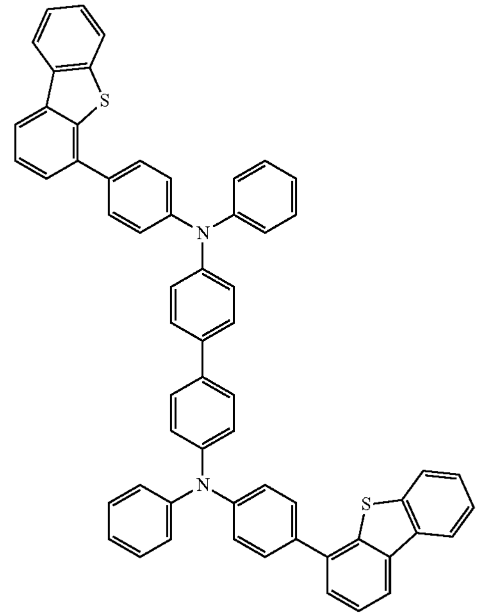
2-19
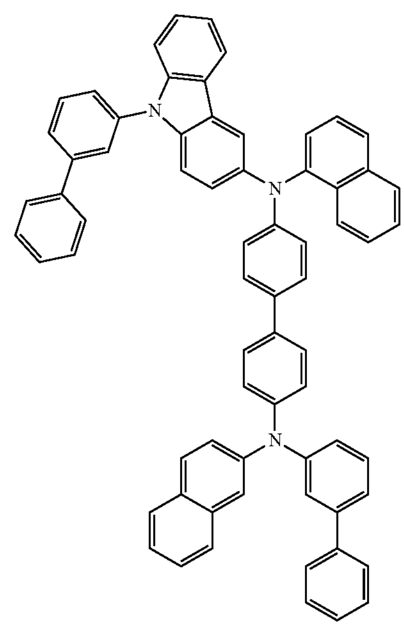

-continued
2-20
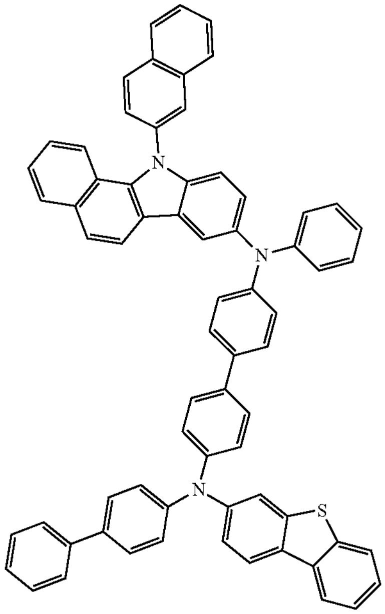
2-21
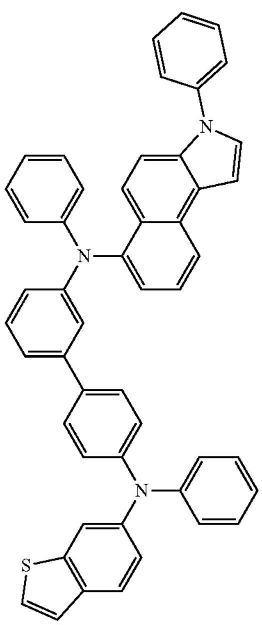
-continued
2-22
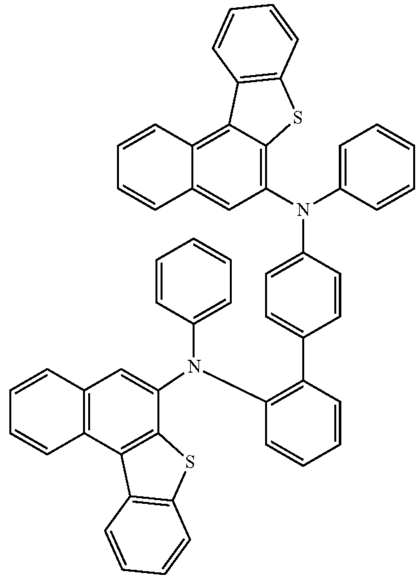
2-23
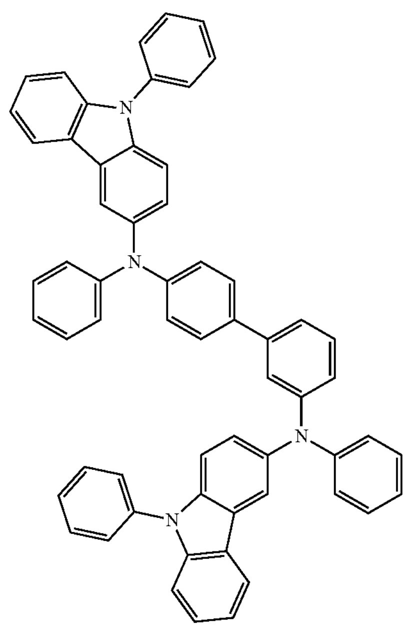

-continued
2-24
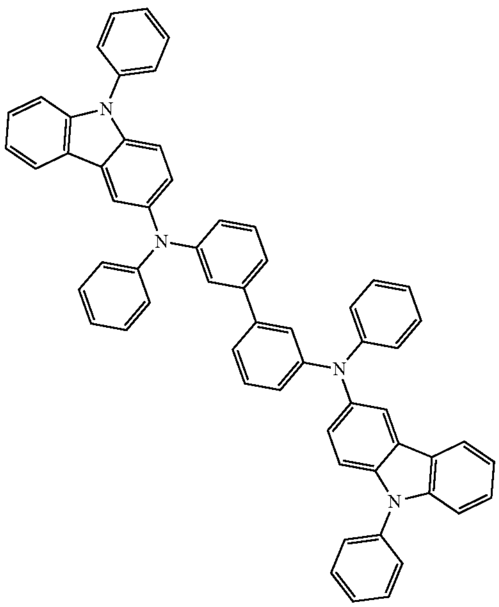
2-25
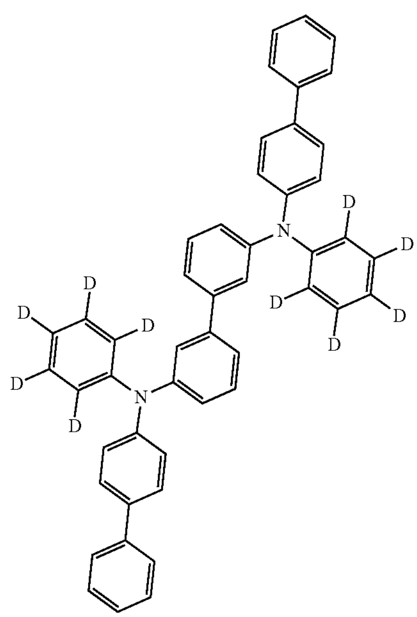
-continued
2-26
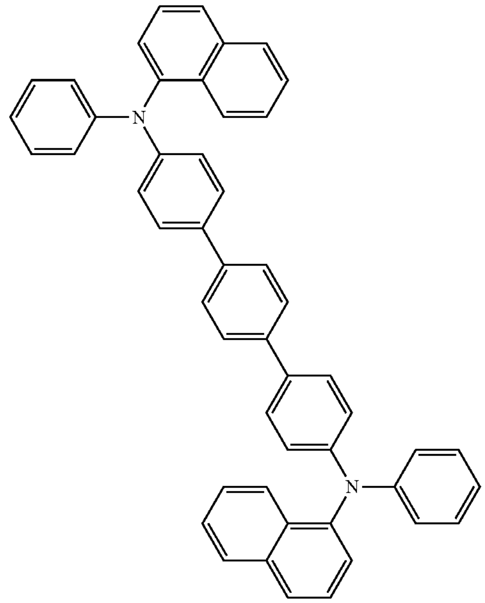
2-27
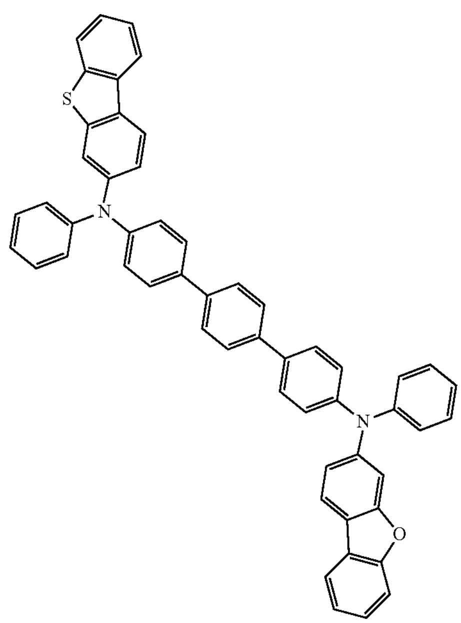

-continued
2-28
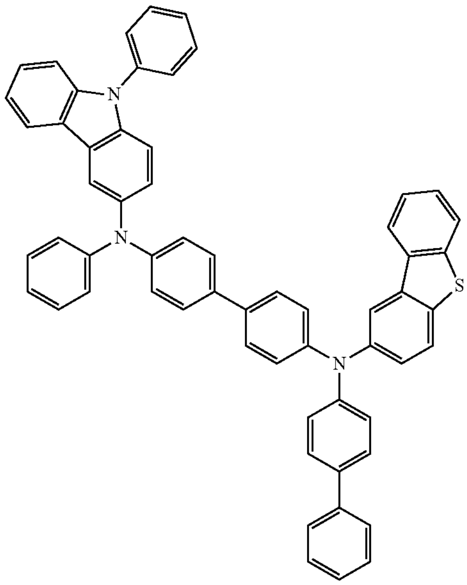
2-29
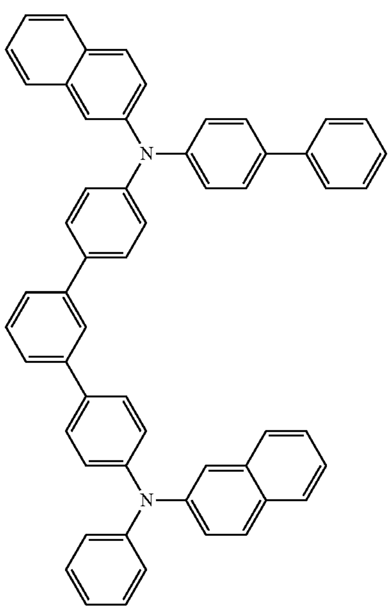
-continued
2-30
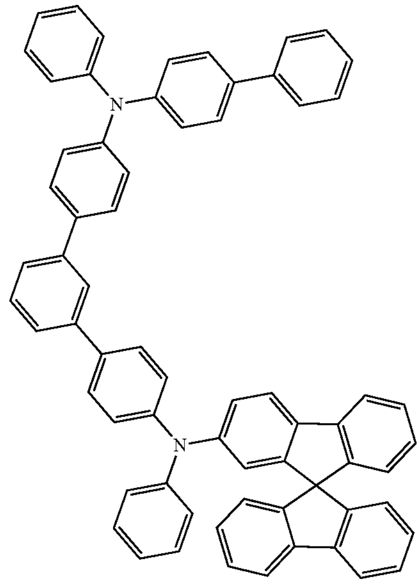
2-31
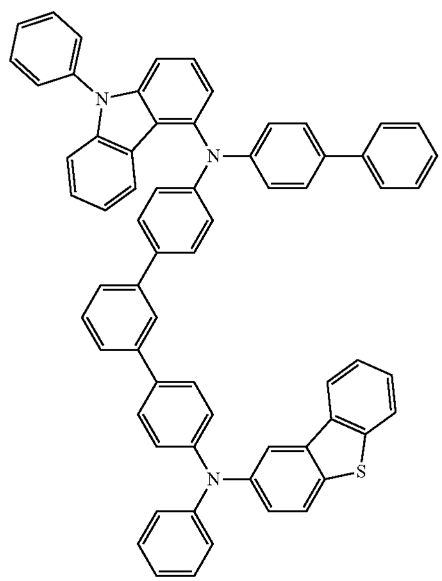
2-32
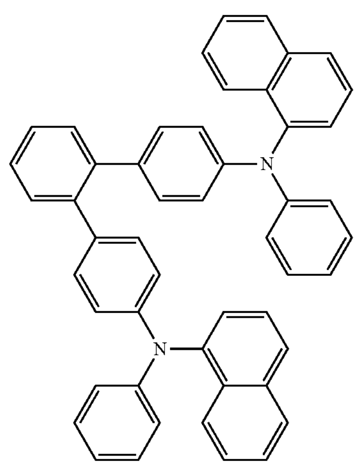

-continued
2-33
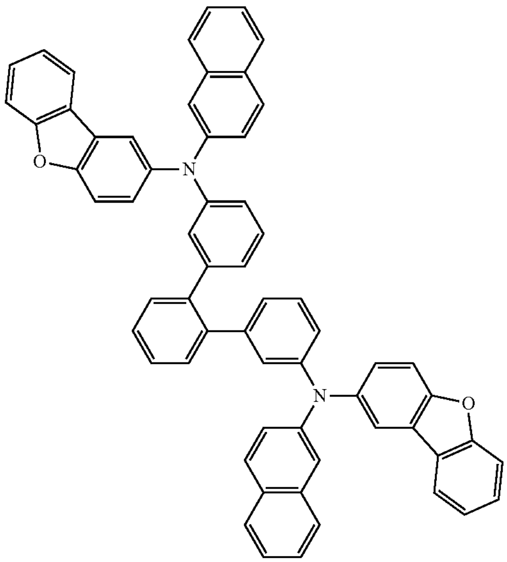
2-34
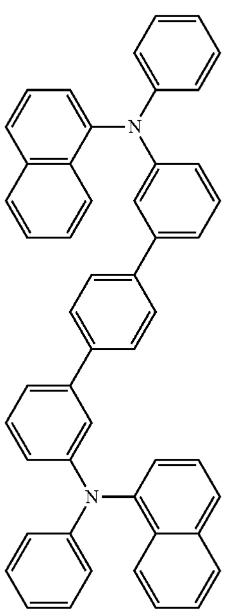
-continued
2-35
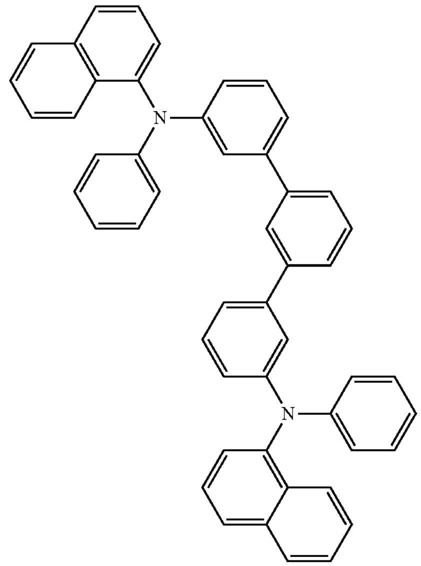
2-36
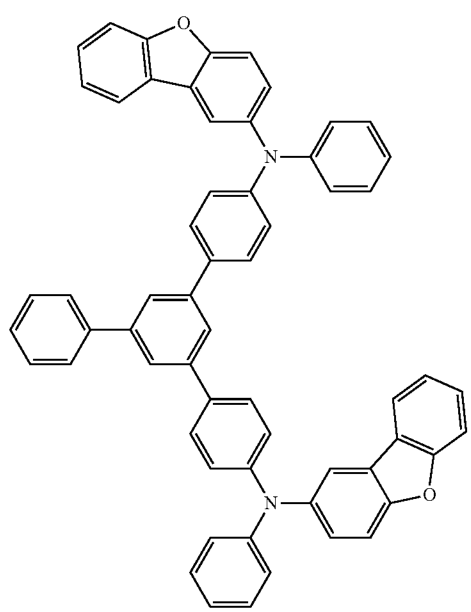

-continued
2-37
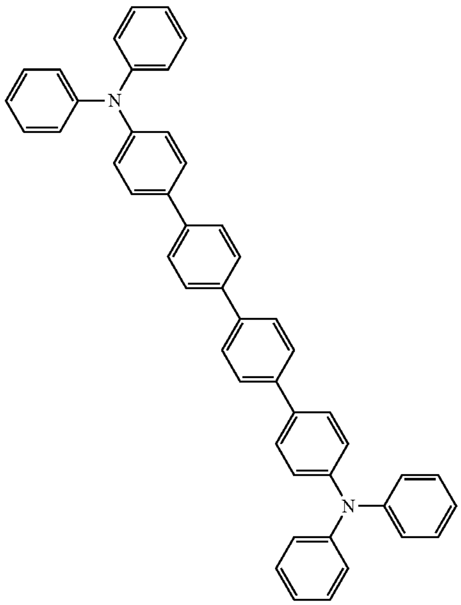
2-38
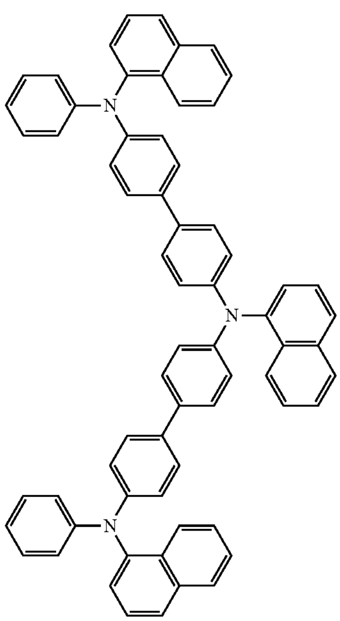
-continued
2-39
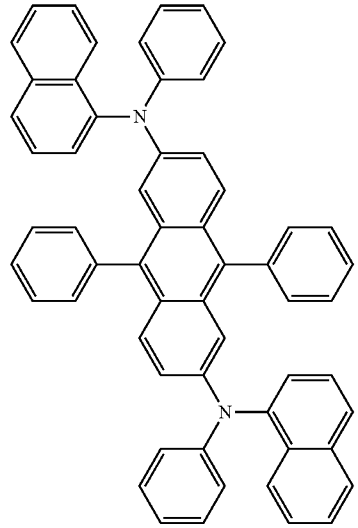
2-40
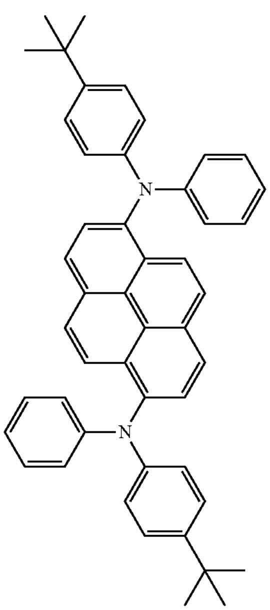

-continued
2-41
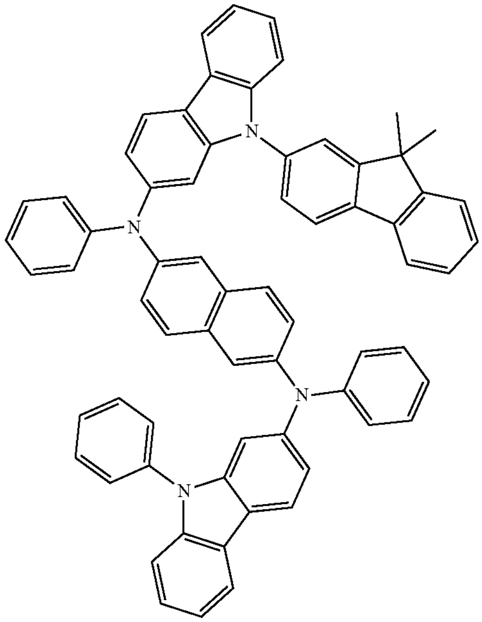
2-42
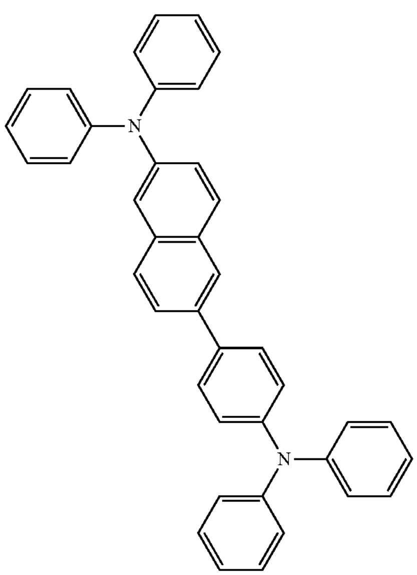
-continued
2-43
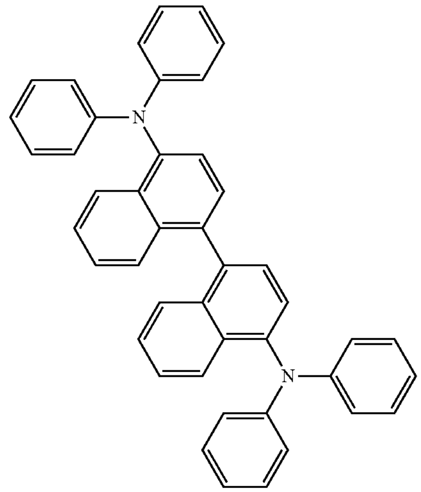
2-44
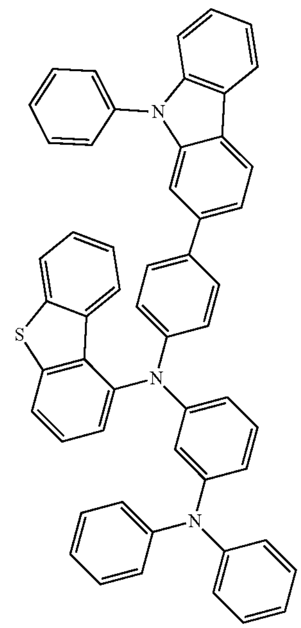
2-45
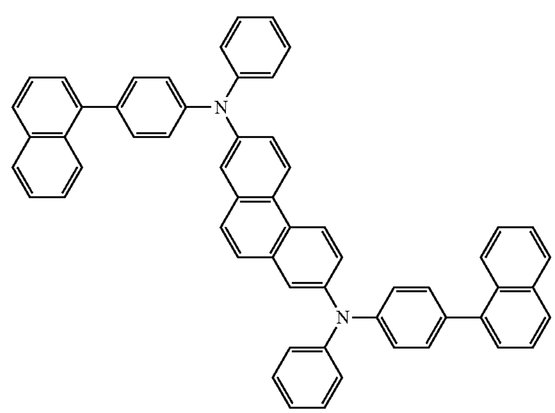

-continued
2-46
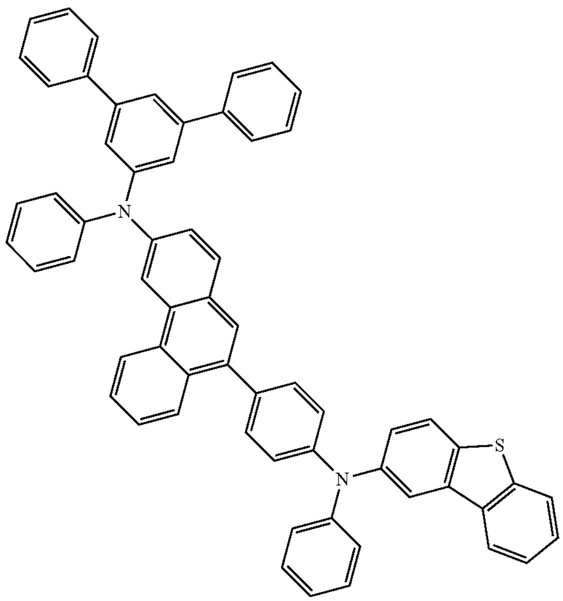
2-47
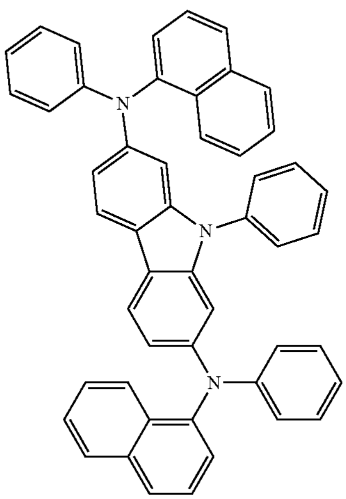
2-48
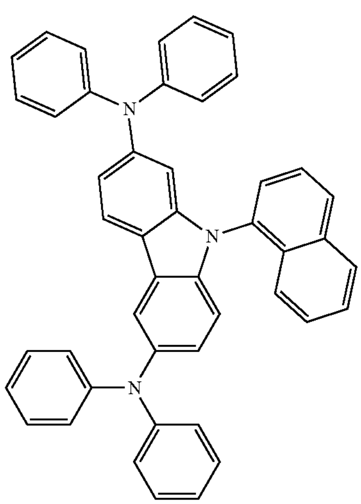
-continued
2-49
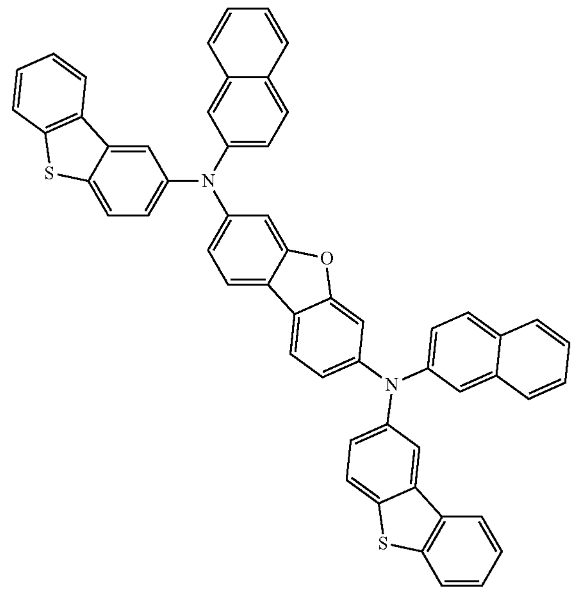
2-50
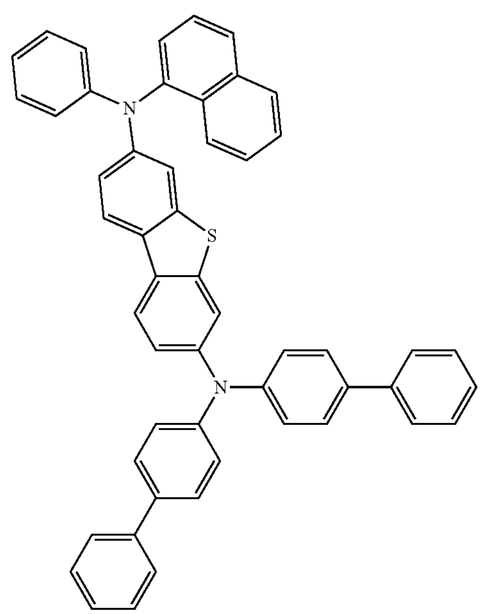

-continued
2-51
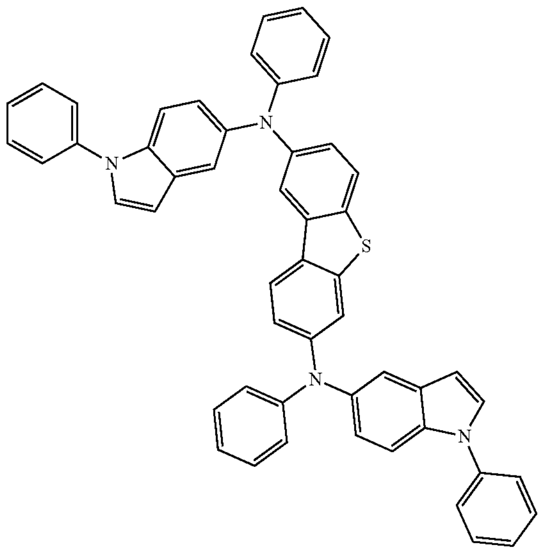
2-52
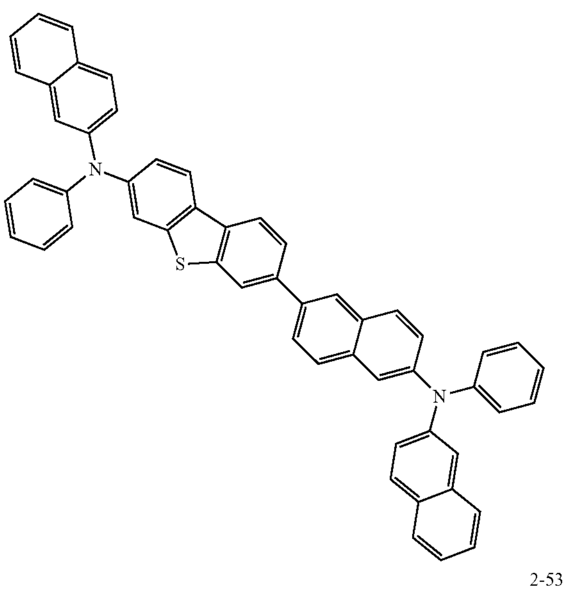
2-53
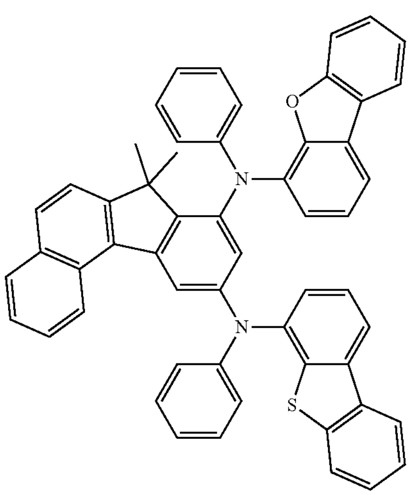
-continued
2-54
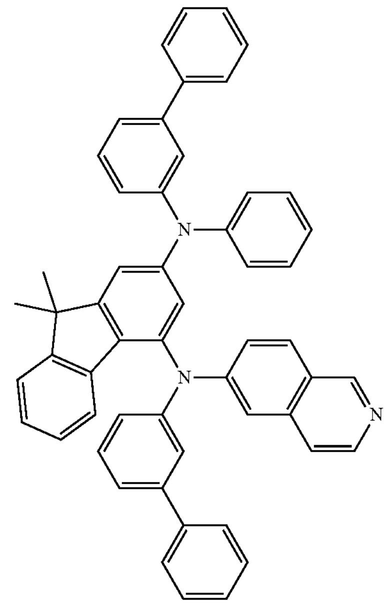
2-55
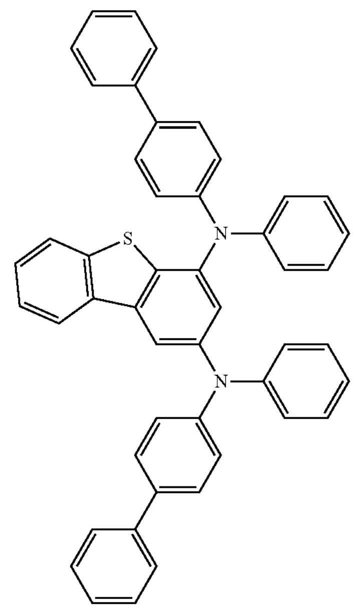
2-56
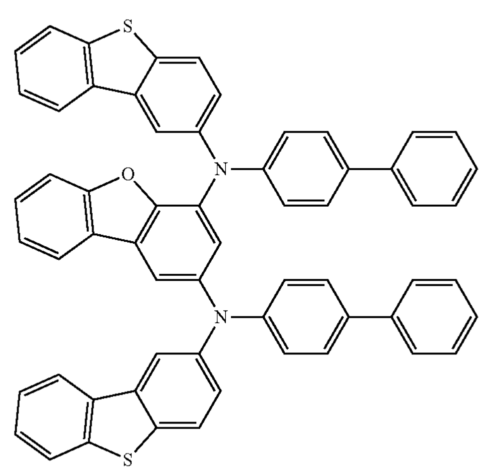

-continued
2-57
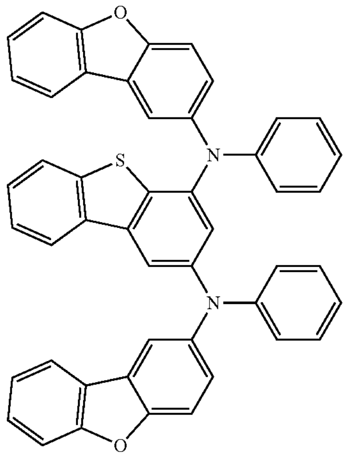
2-58
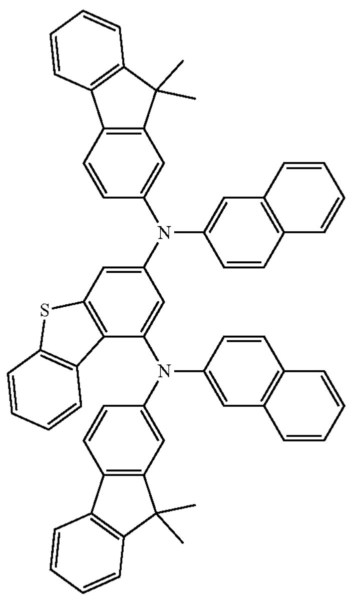
2-59
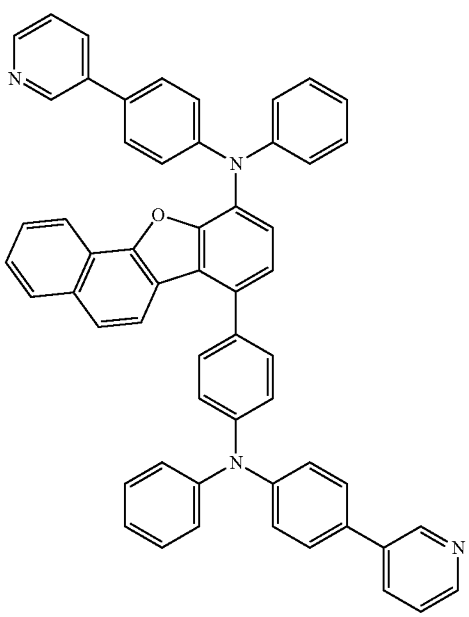
-continued
2-60
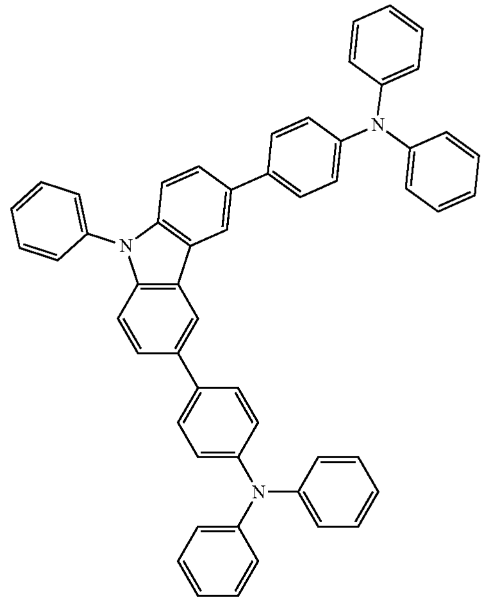
2-61
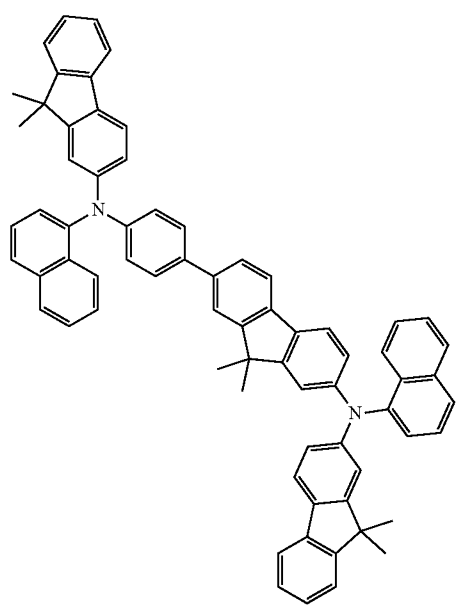

-continued
2-62
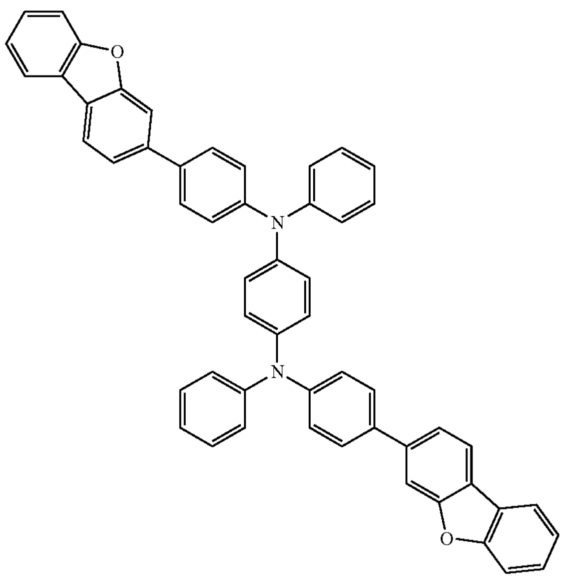
2-63
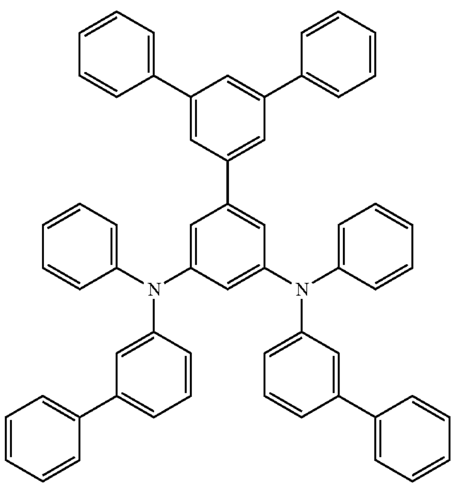
2-64
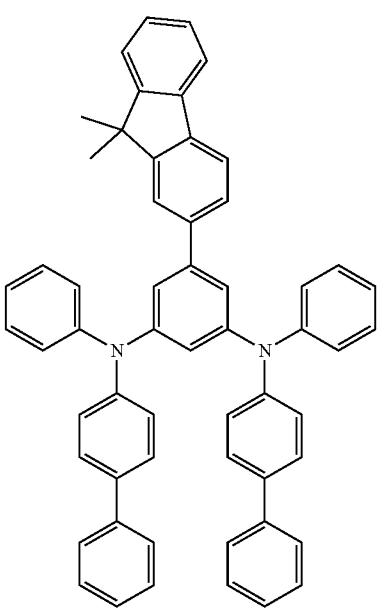
-continued
2-65
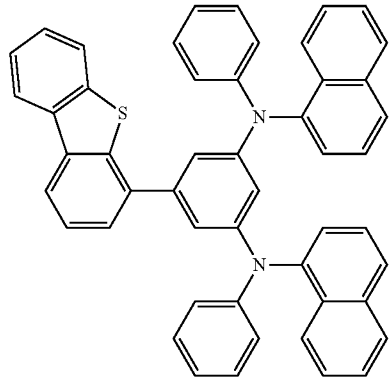
2-66
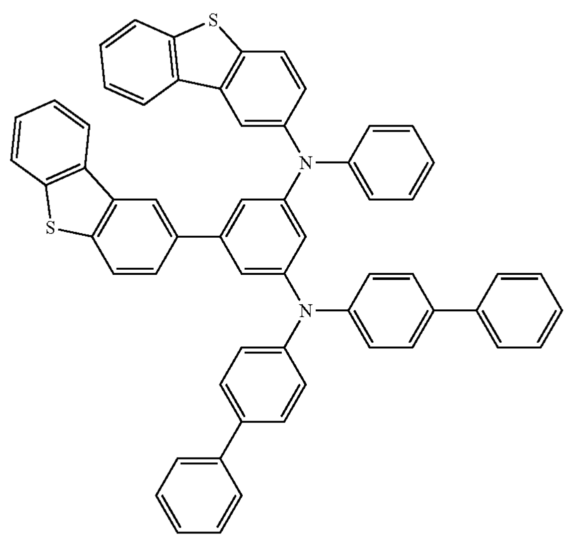
2-67
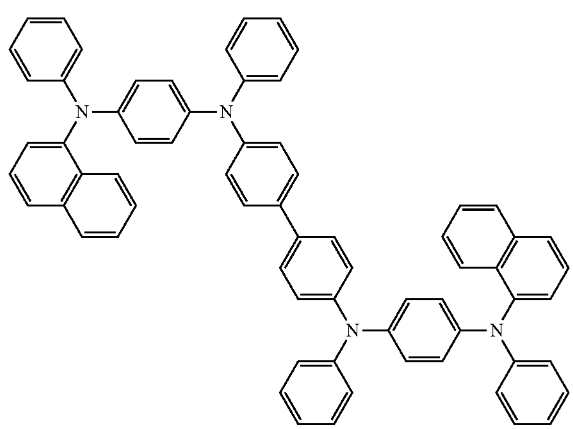

-continued
2-68
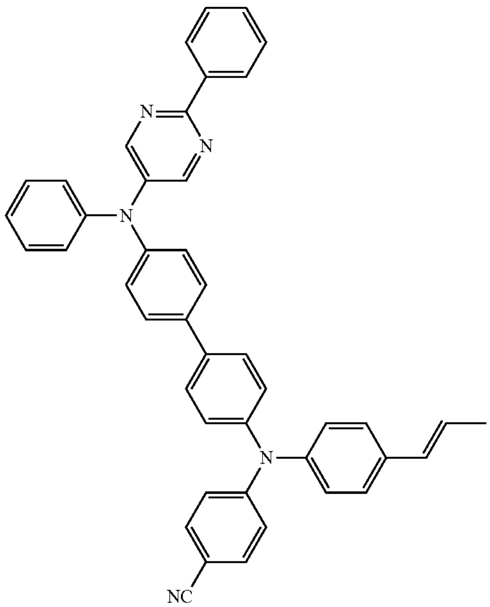
2-69
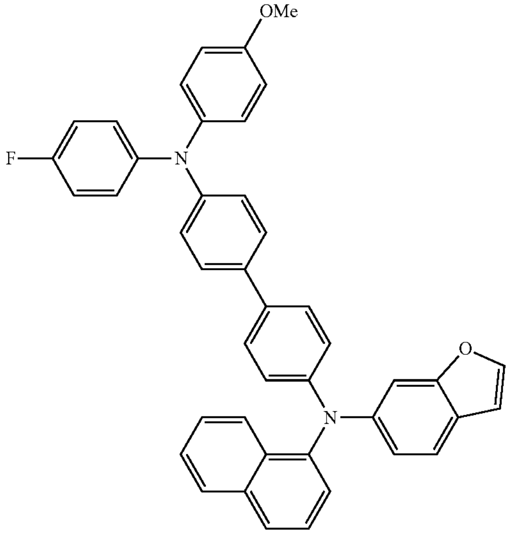
-continued
2-70
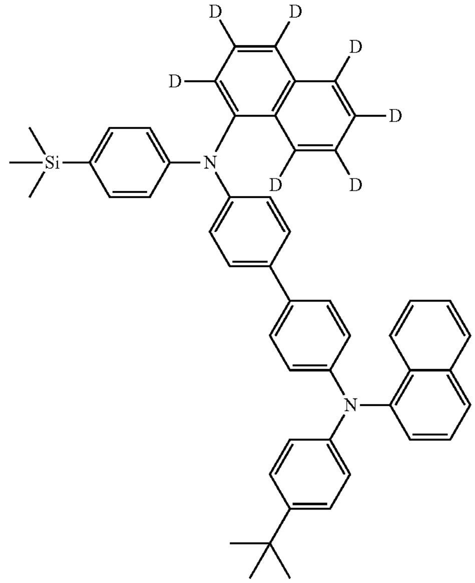
2-71
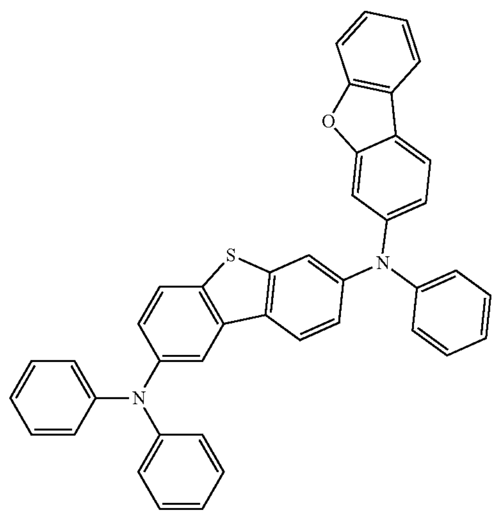
2-72
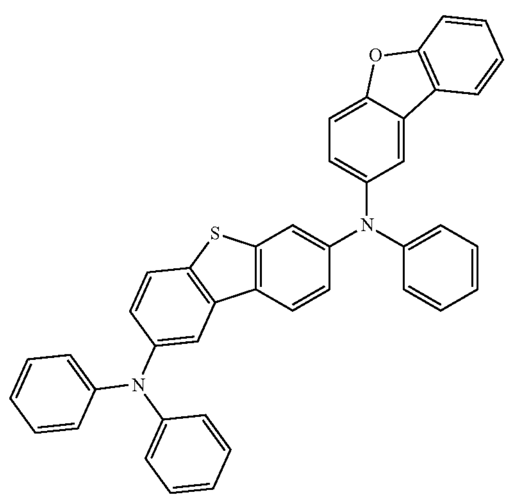

-continued
2-73
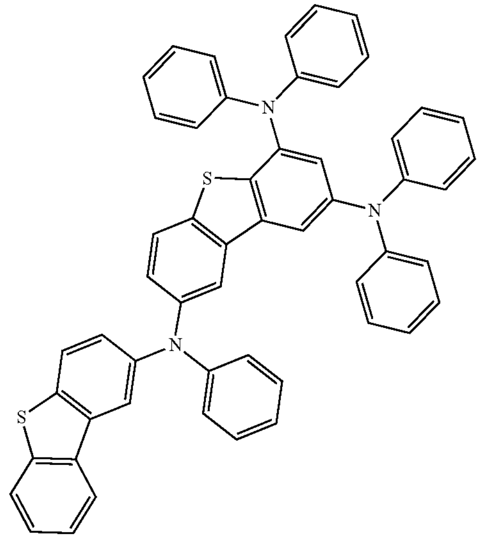
2-74
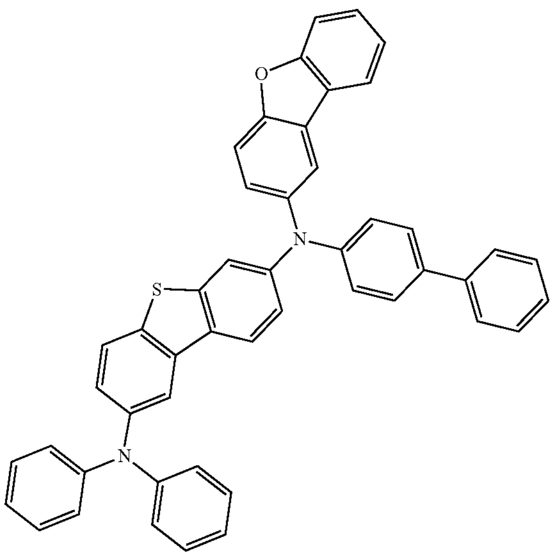
2-75
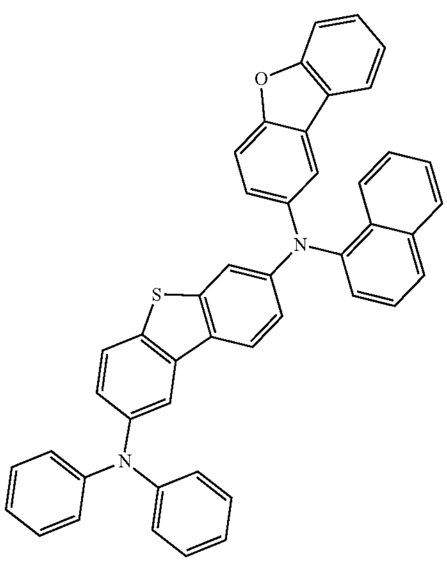
-continued
2-76
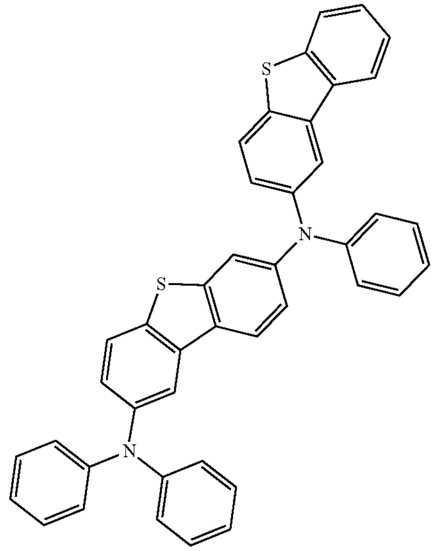
2-77
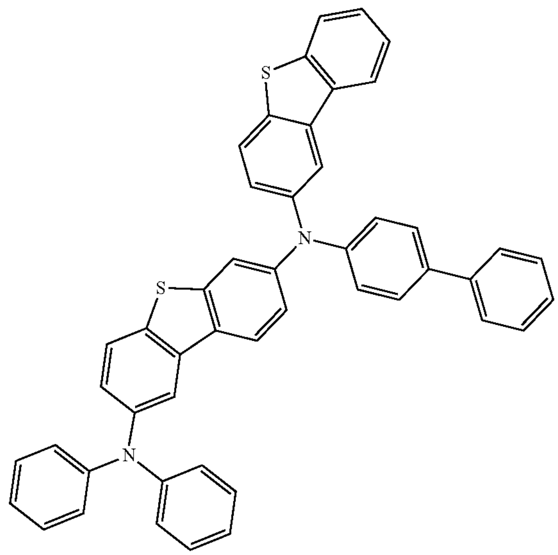
2-78
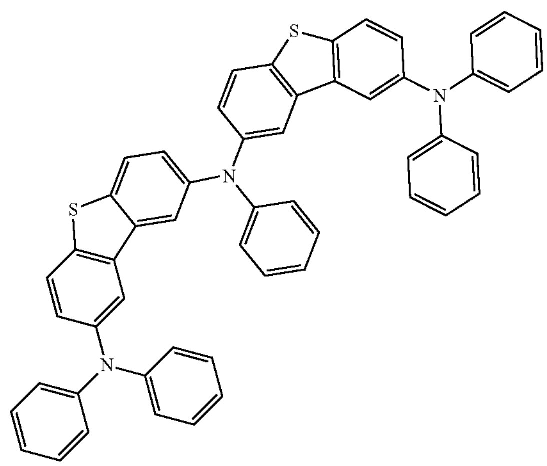

-continued
2-79
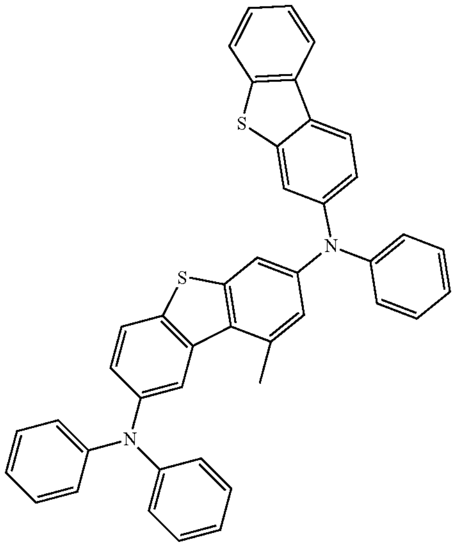
2-80
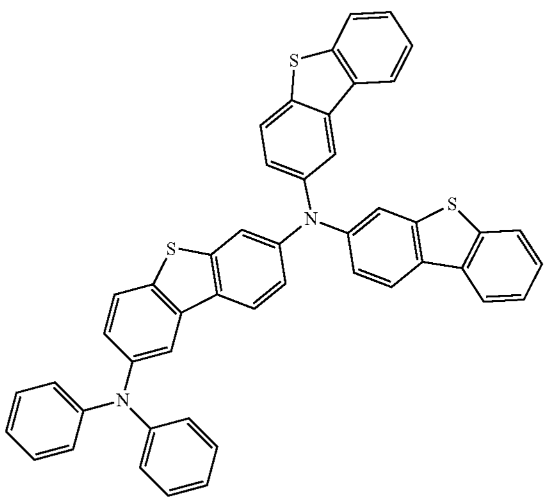
2-81
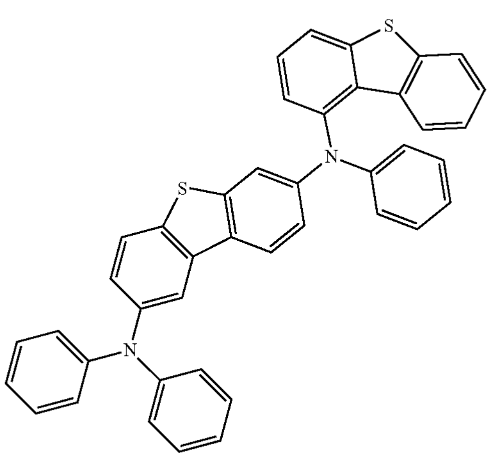
-continued
2-82
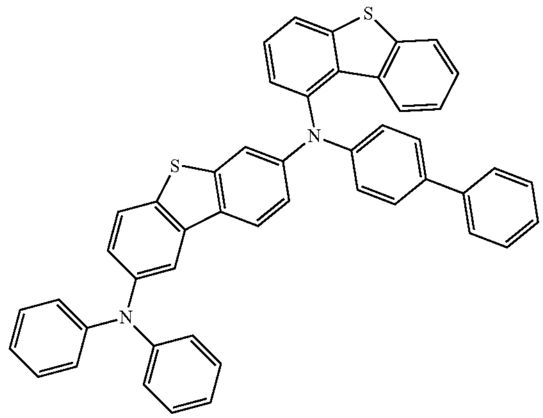
2-83
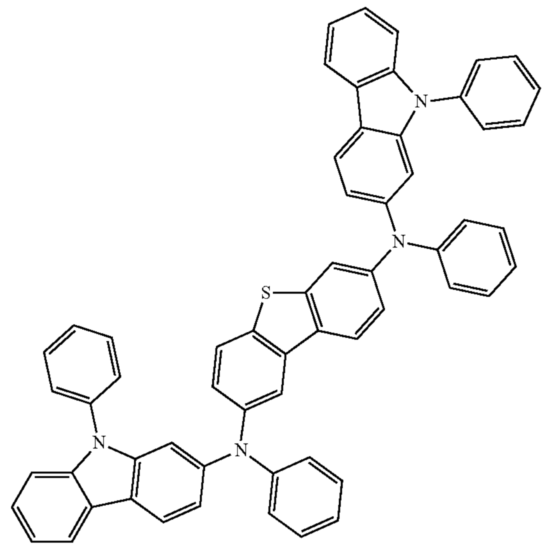
2-84
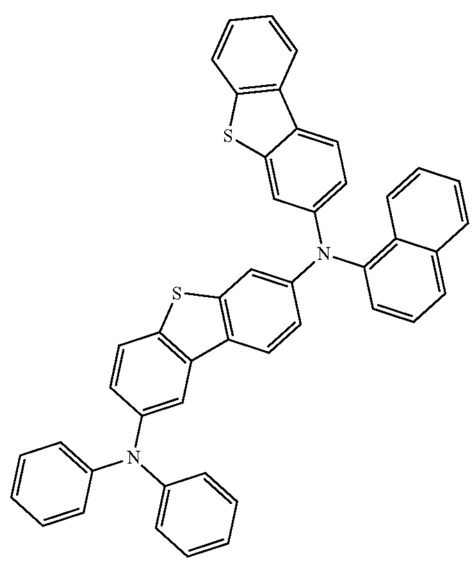

-continued
2-85
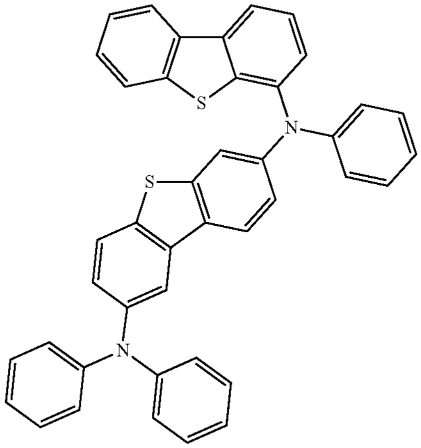
2-86
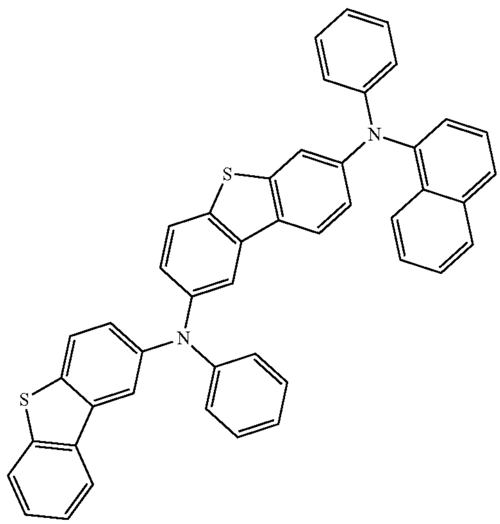
2-87
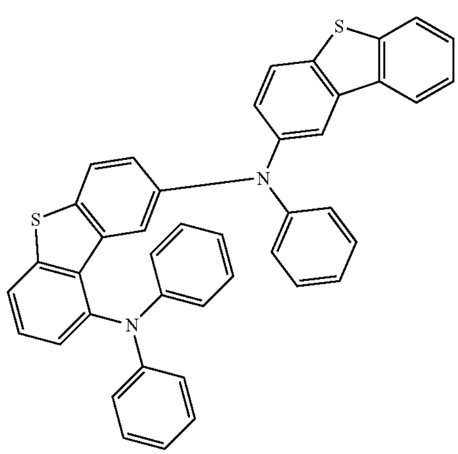
-continued
2-88
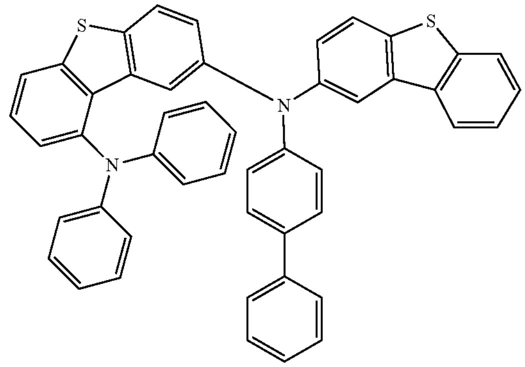
2-89
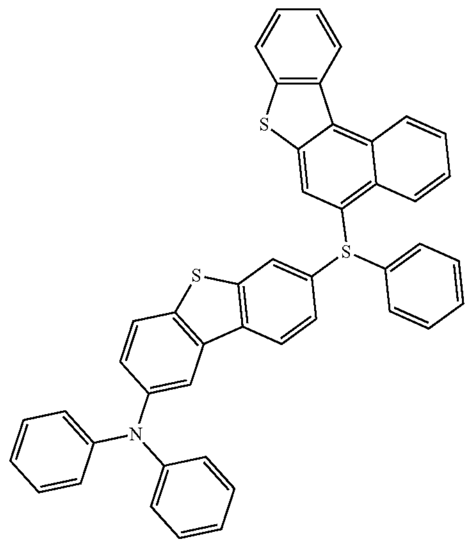
2-90
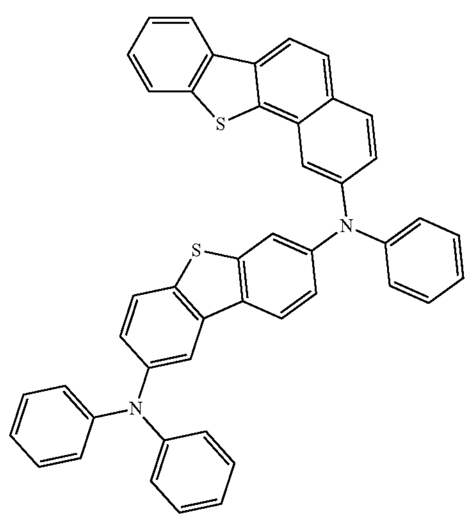

-continued
2-91
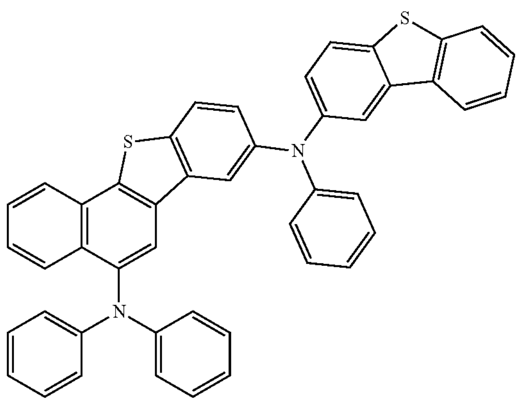
2-92
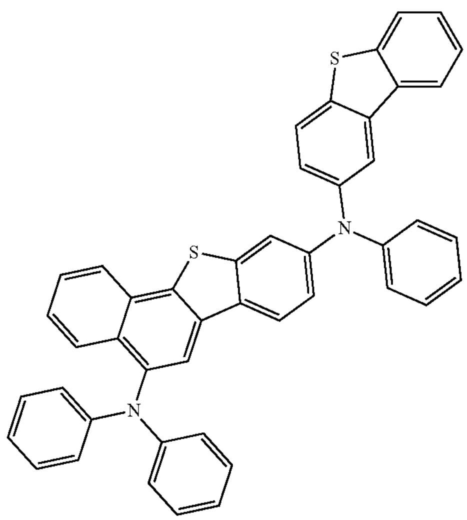
2-93
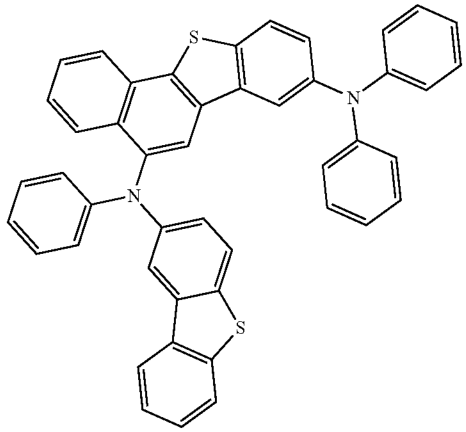
-continued
2-94
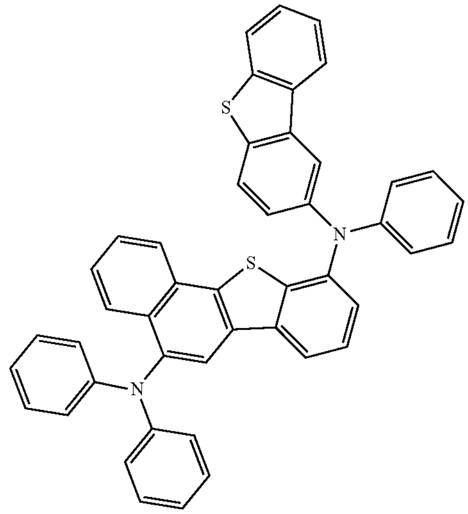
2-95
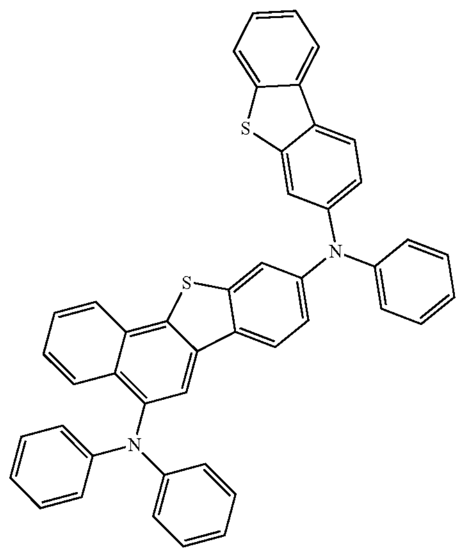
2-96
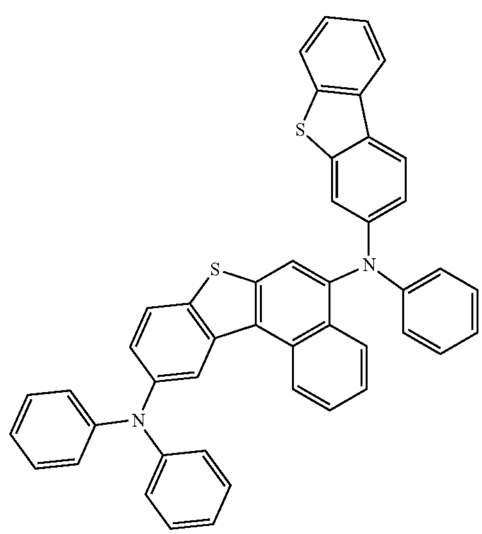

-continued
2-97
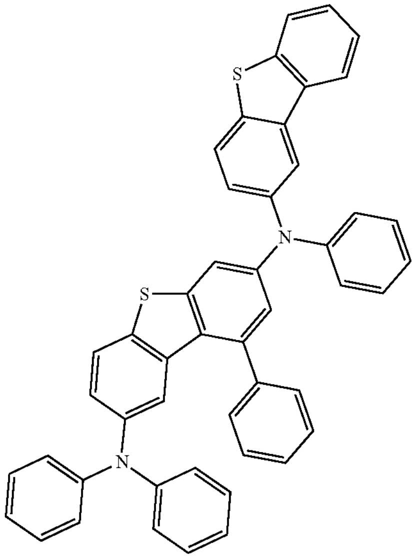
2-98
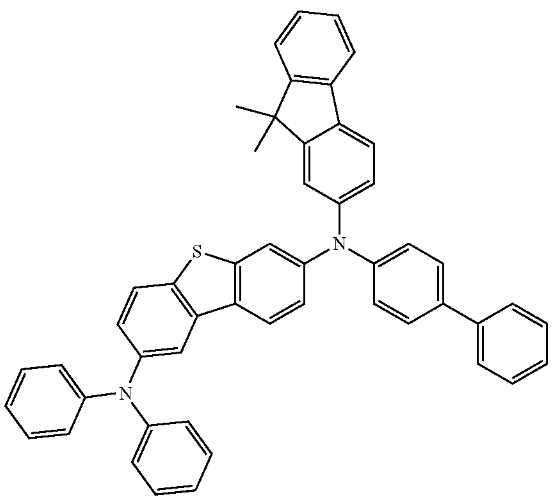
2-99
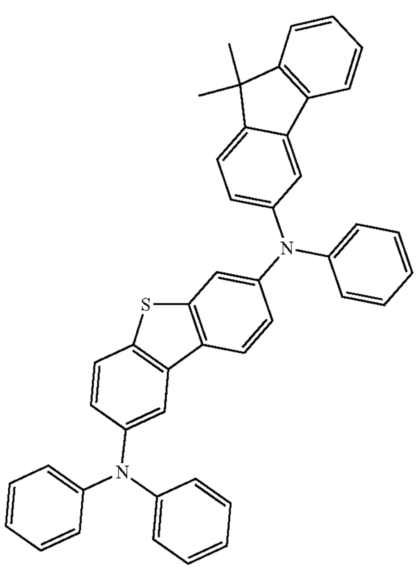
-continued
2-100
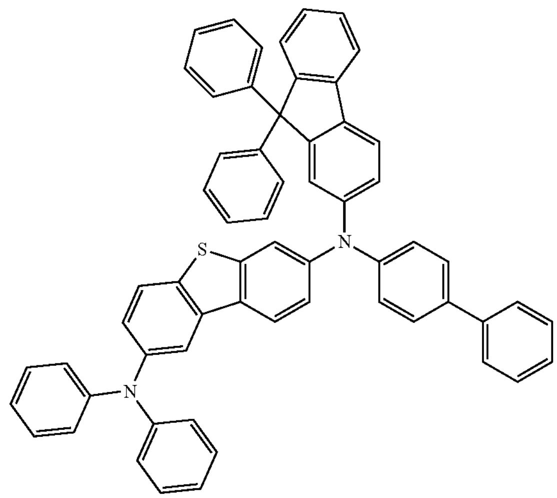
2-101
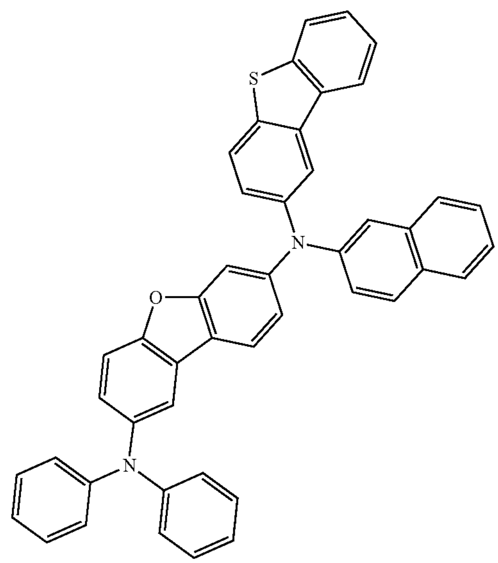
2-102
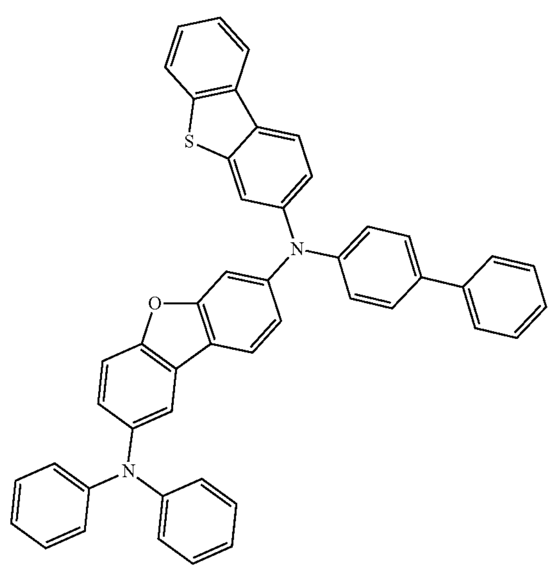

-continued
2-103
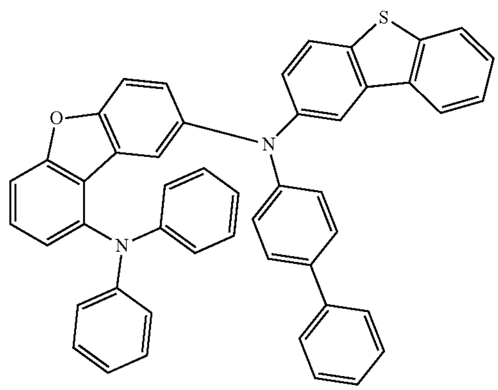
2-104
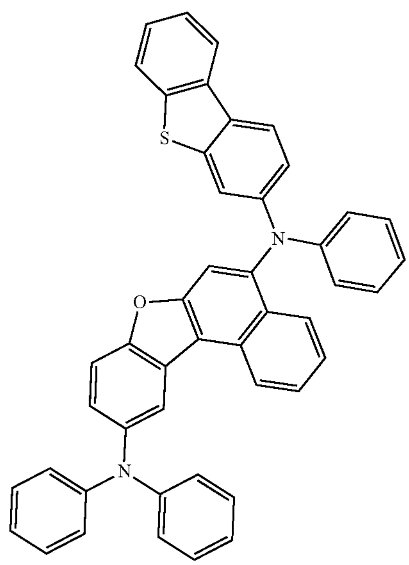
2-105
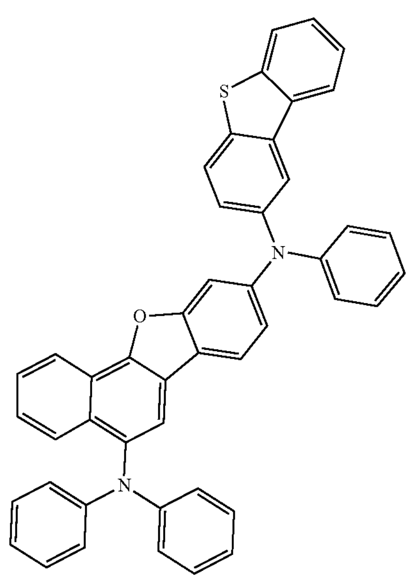
-continued
2-106
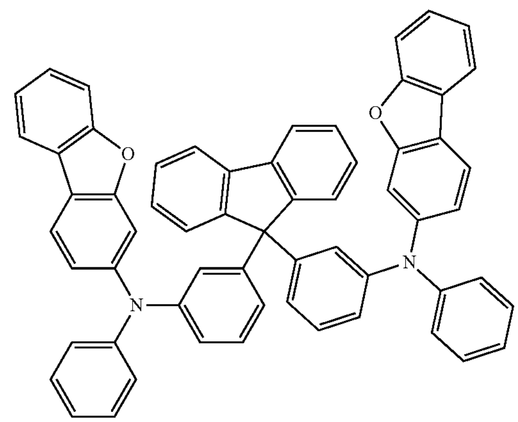
2-107
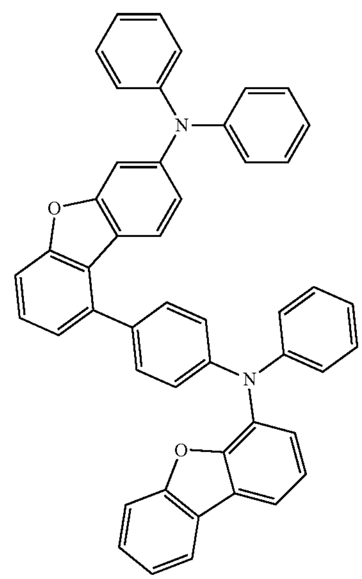
2-108
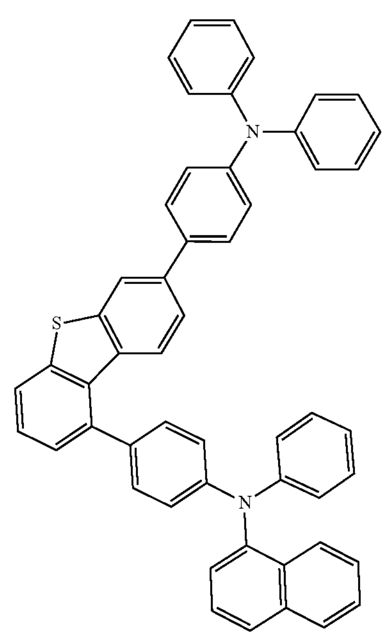

-continued
2-109
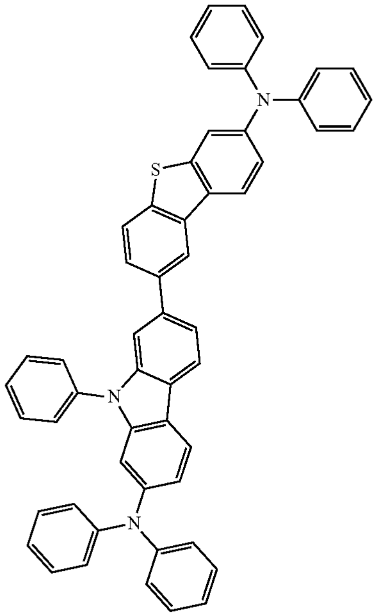
2-110
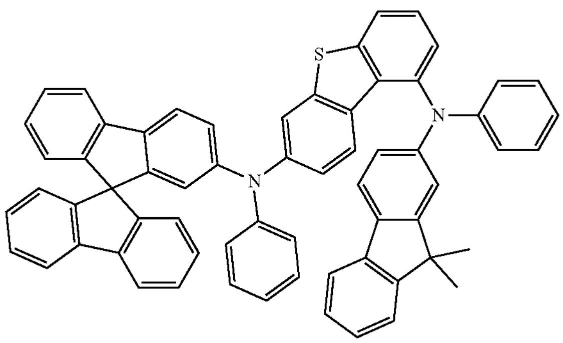
2-111
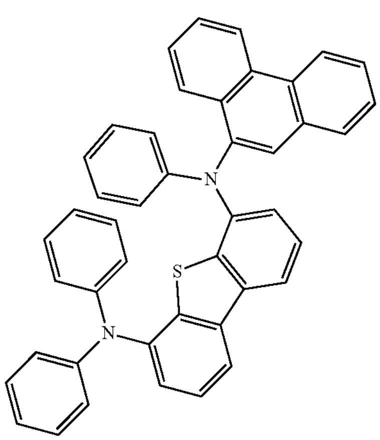
-continued
2-112
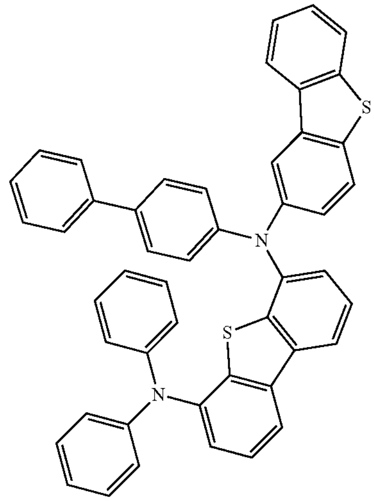
2-113
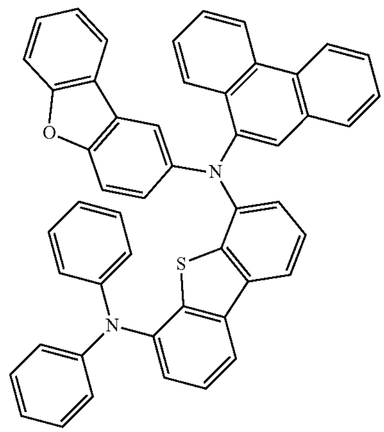
2-114
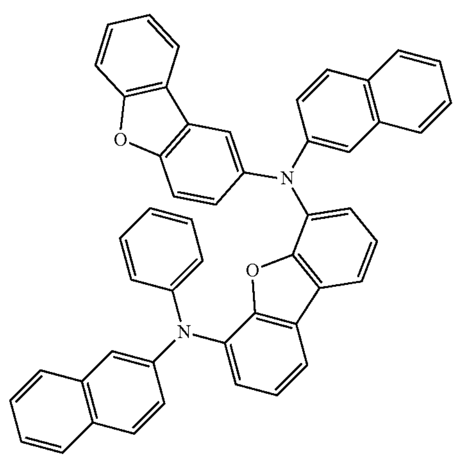

-continued
2-115
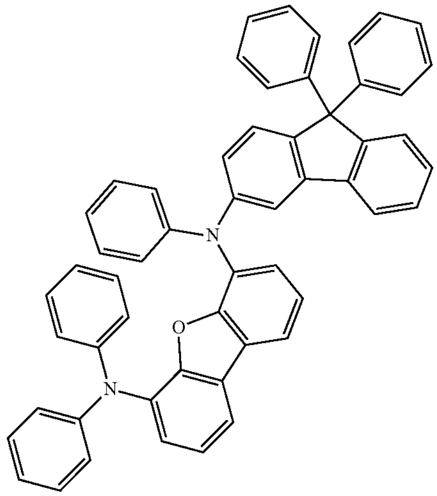
2-116
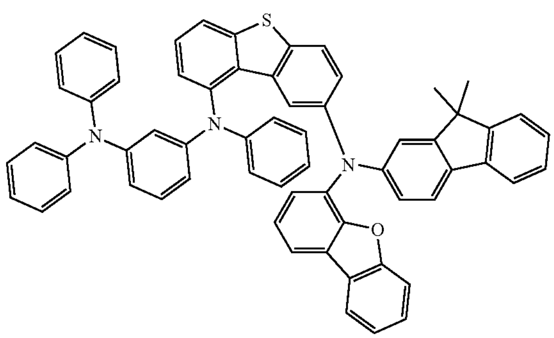
2-117
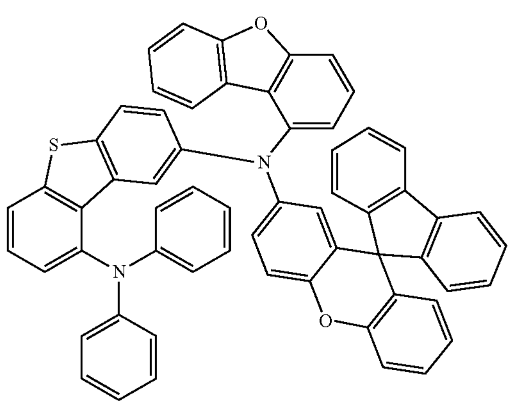
2-118
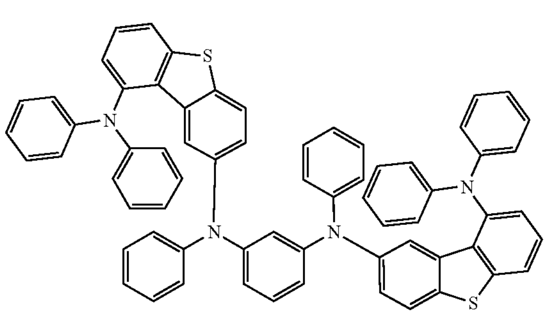
-continued
2-119
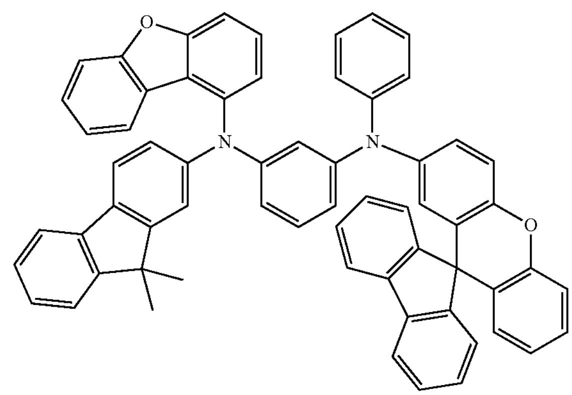
2-120
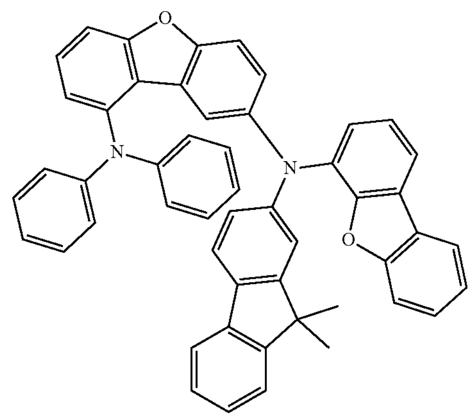
2-121
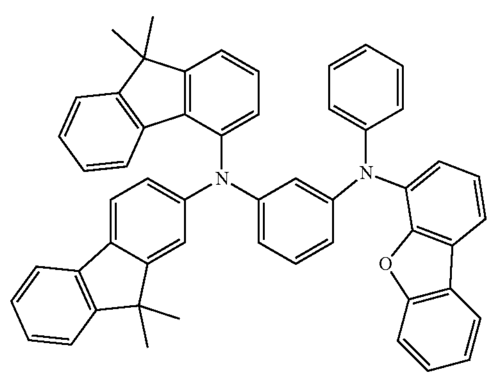
2-122
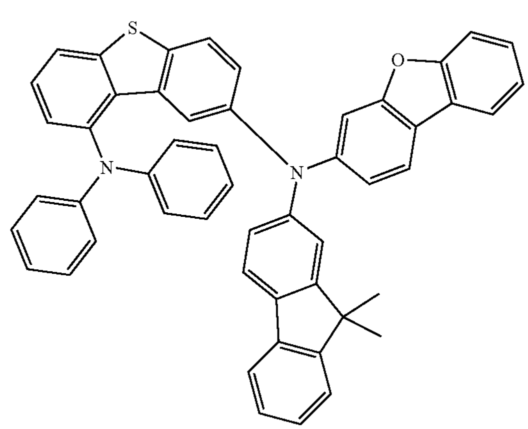

-continued
2-123
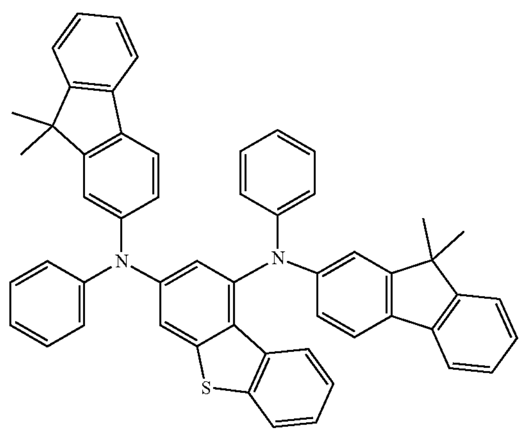
2-124
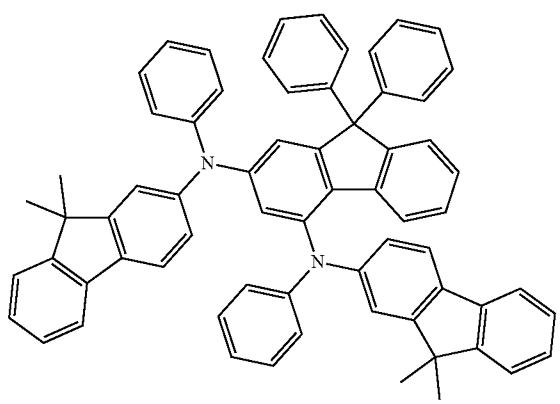
2-125
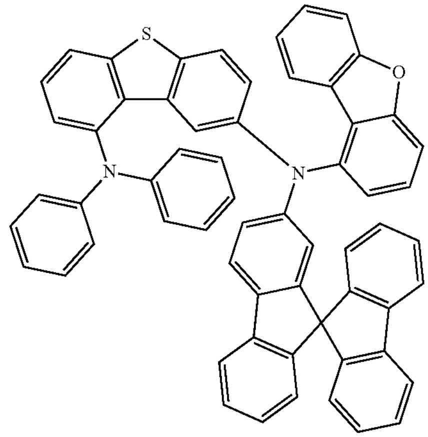
-continued
2-126
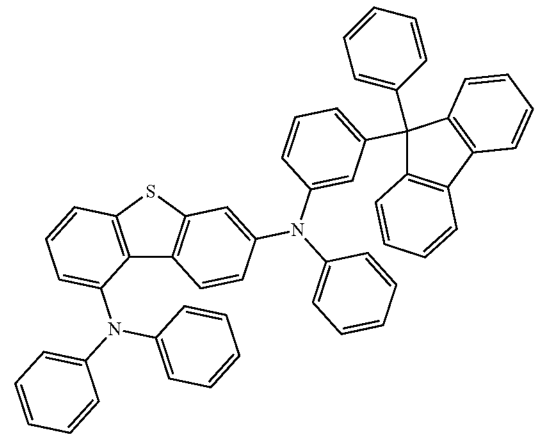
2-127
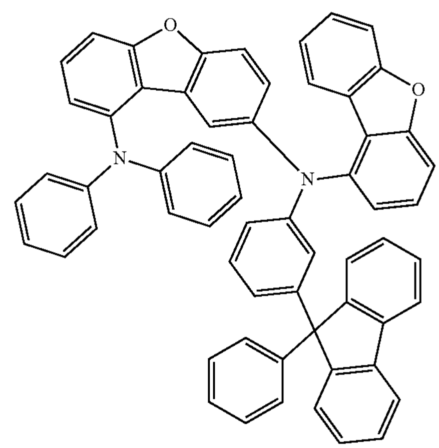
2-128
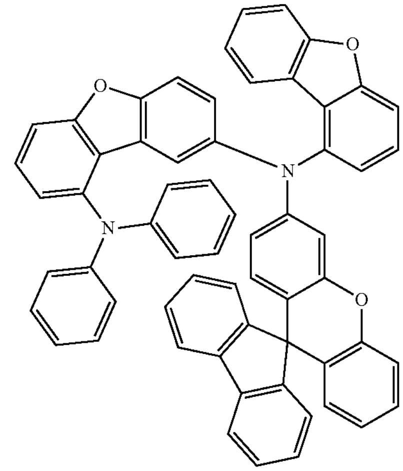

-continued
2-129
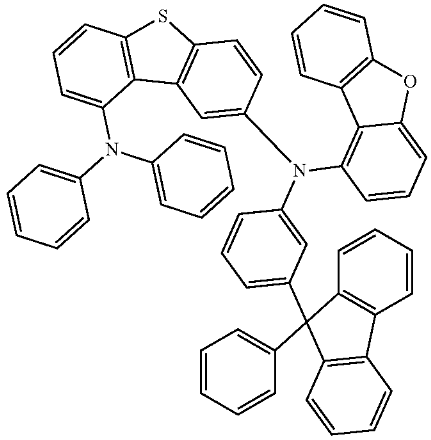
2-130
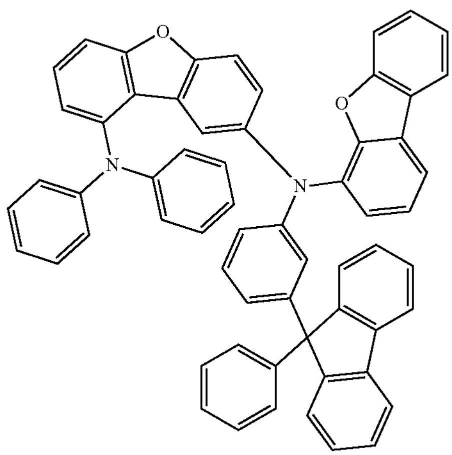
2-131
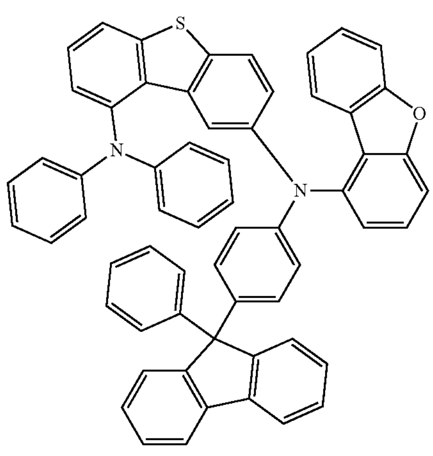
-continued
2-132
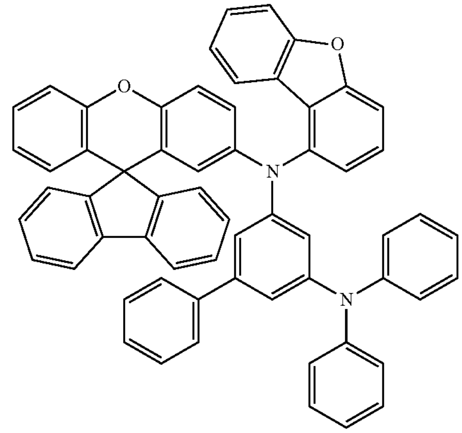
2-133
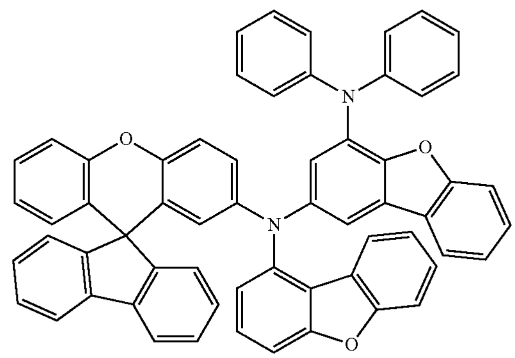
2-134
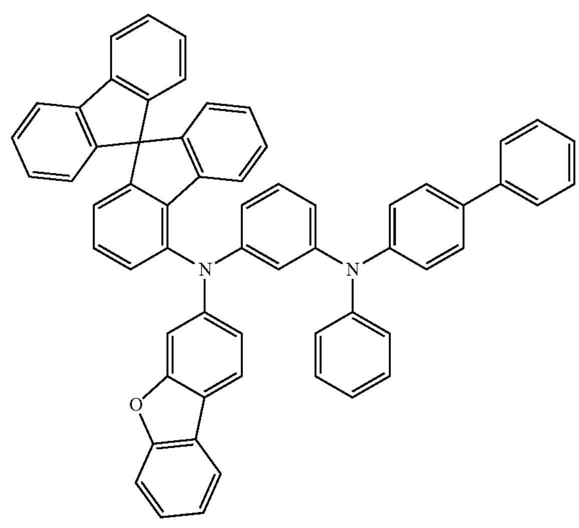

-continued
2-135
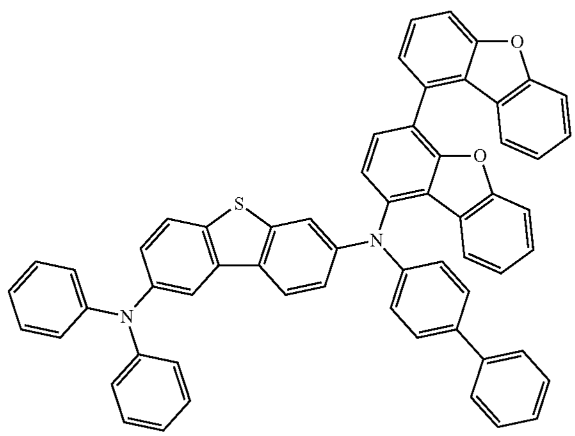
2-136
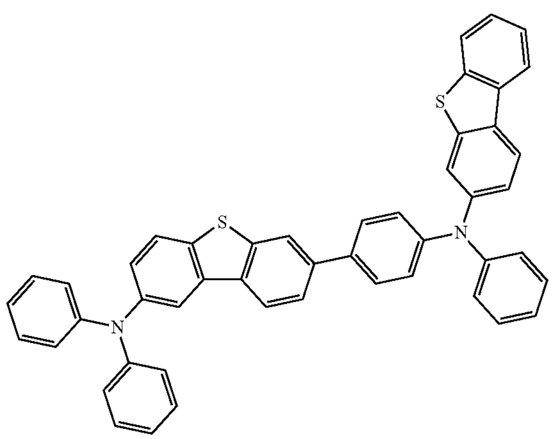
2-137
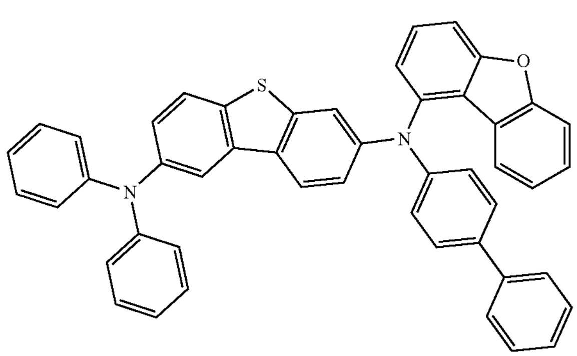
-continued
2-138
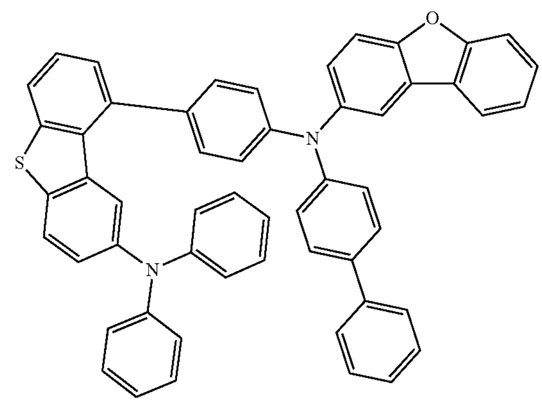
P4-1
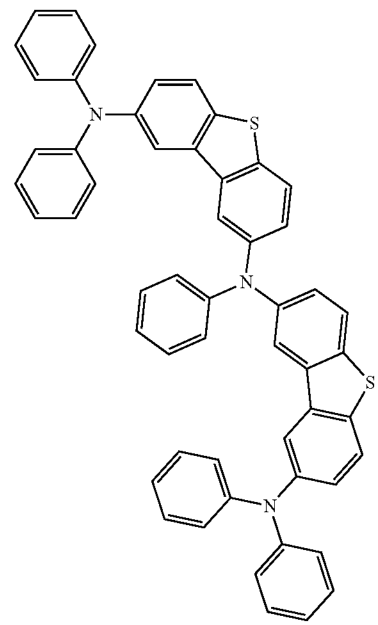
P4-2
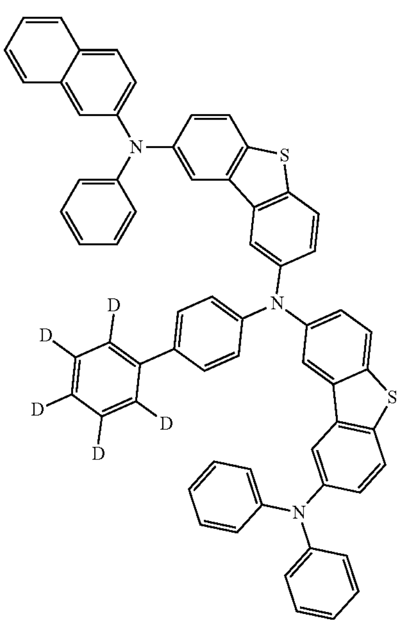

-continued
P4-3
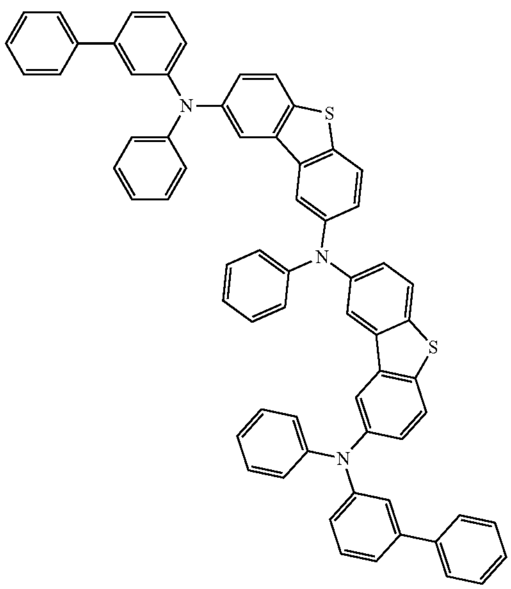
P4-4
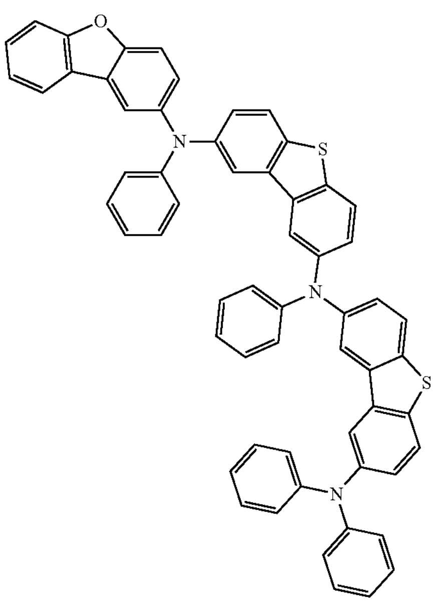
-continued
P4-5
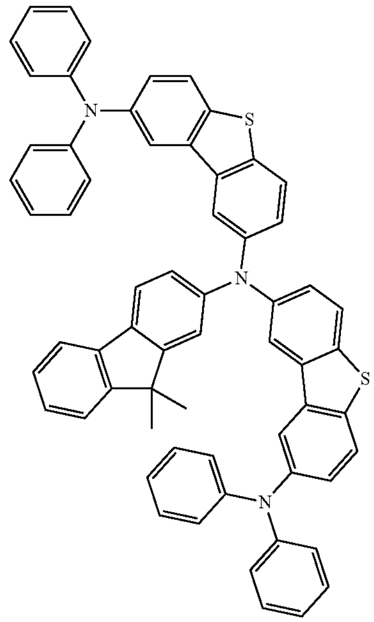
P4-6
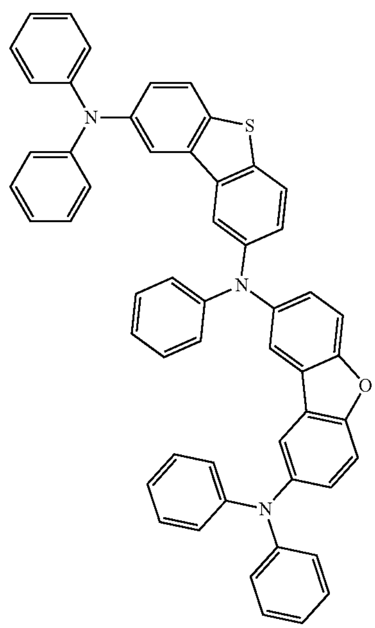

-continued
P4-7
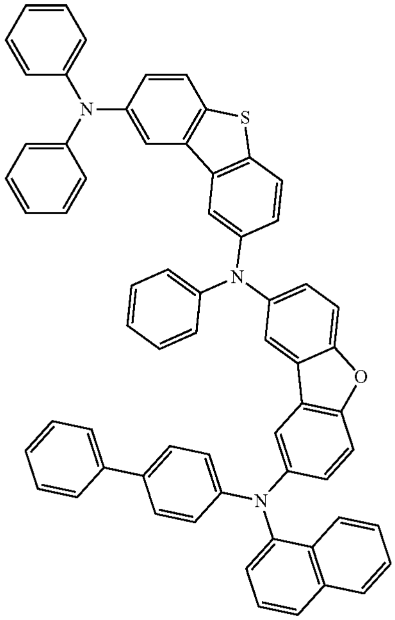
P4-8
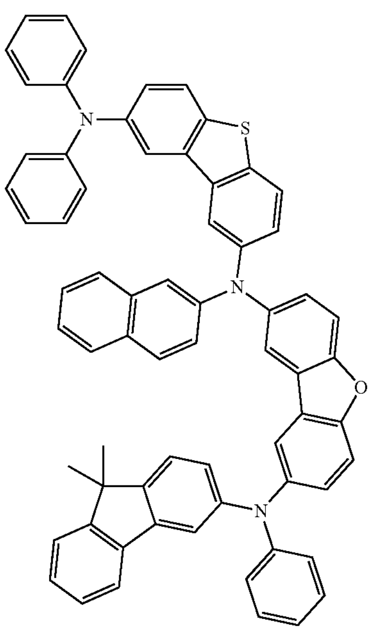
-continued
P4-9
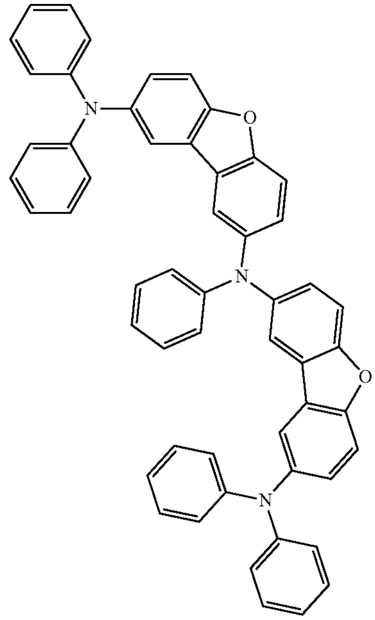
P4-10
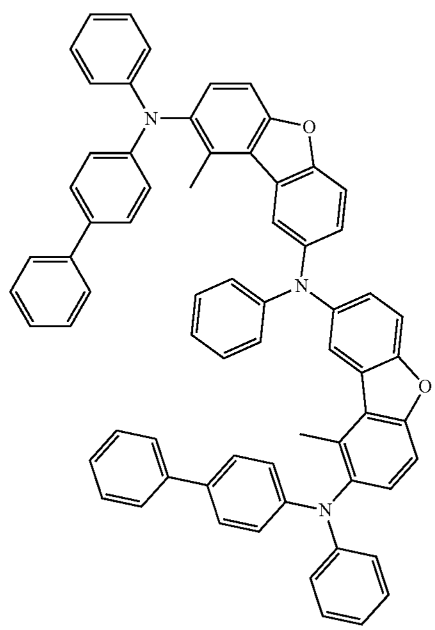

-continued
P4-11
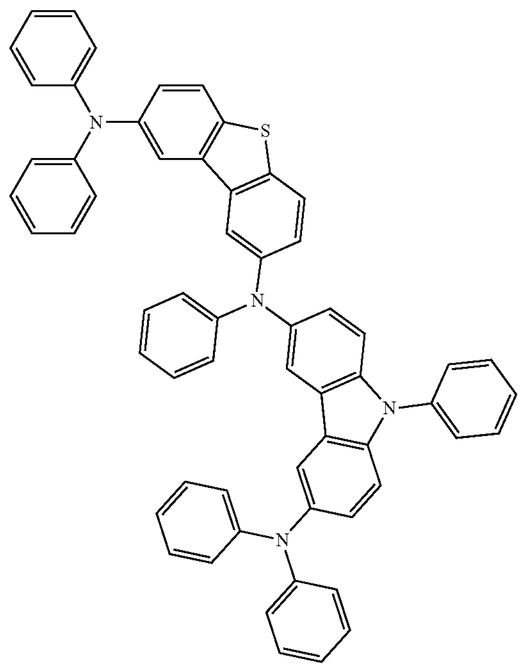
P4-12
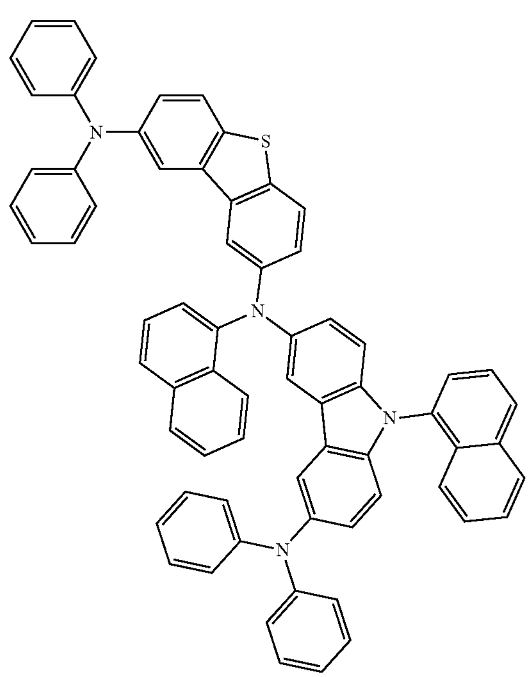
P4-13
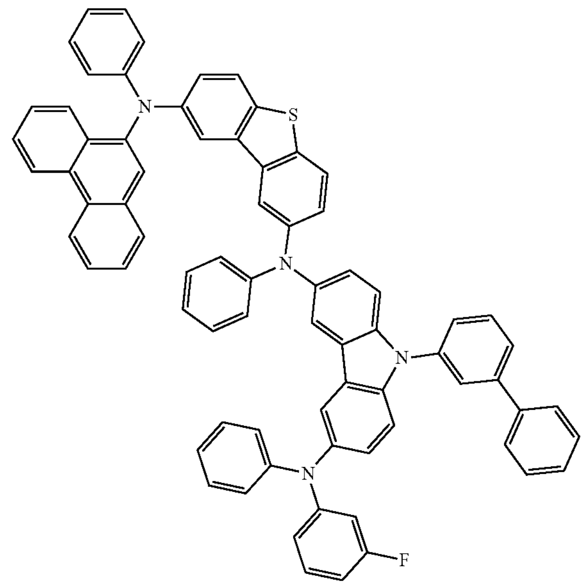
P4-14
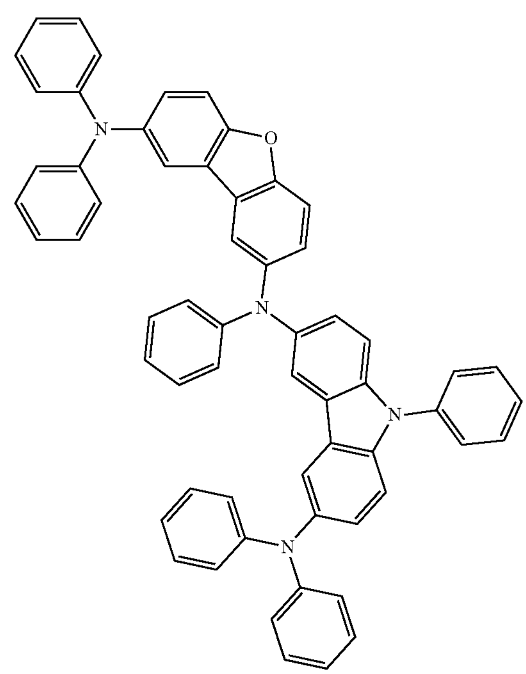

P4-15
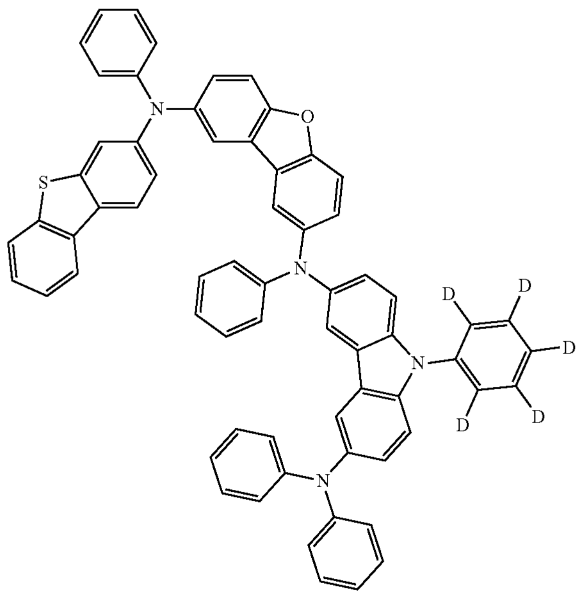
P4-16
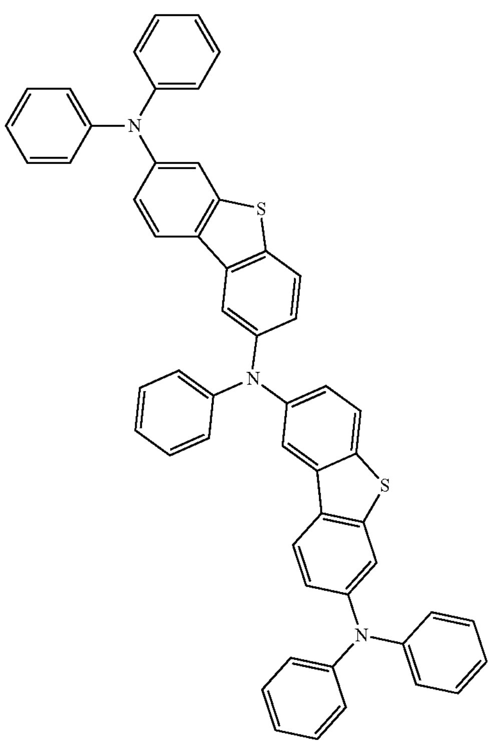
P4-17
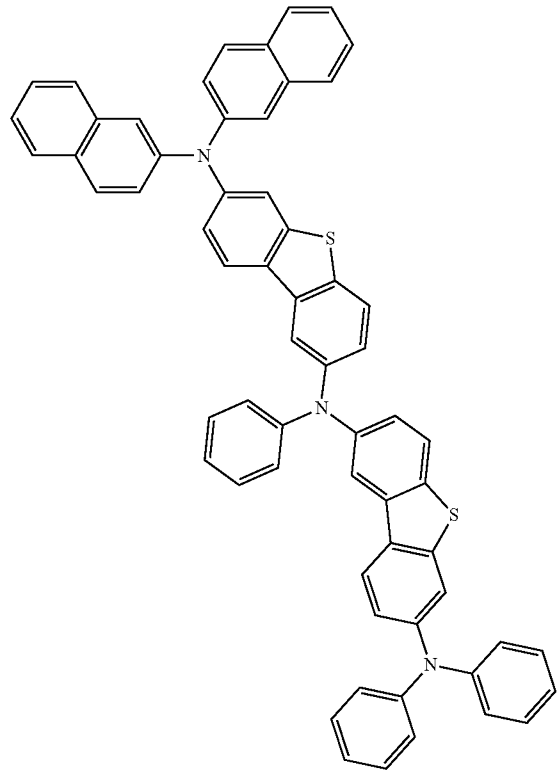
P4-18
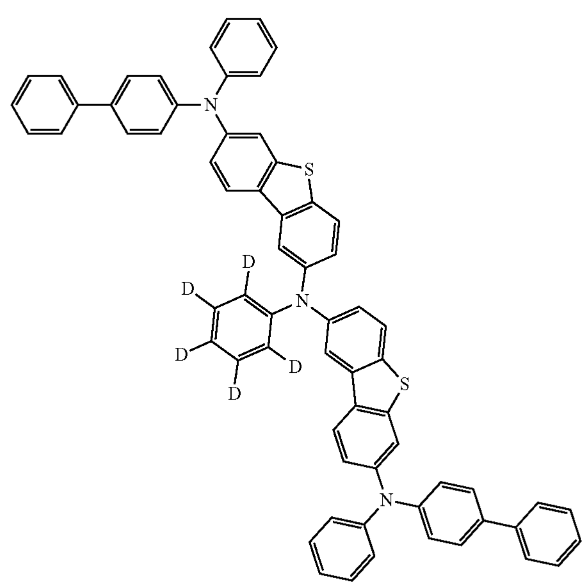

-continued
P4-19
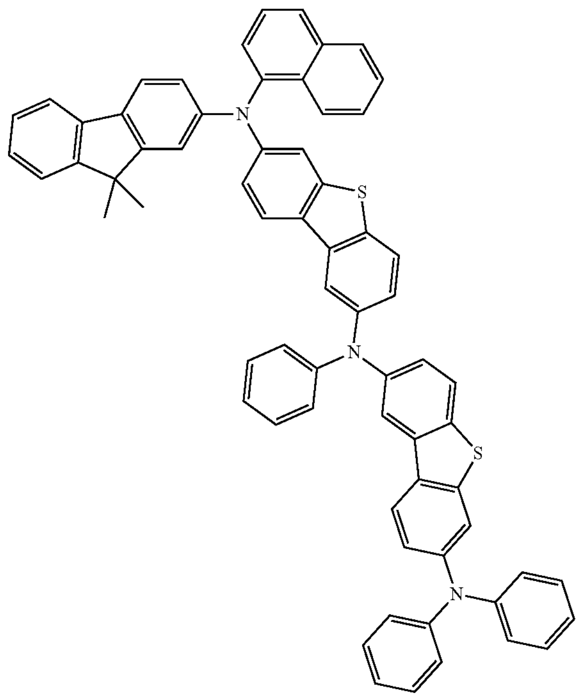
P4-20
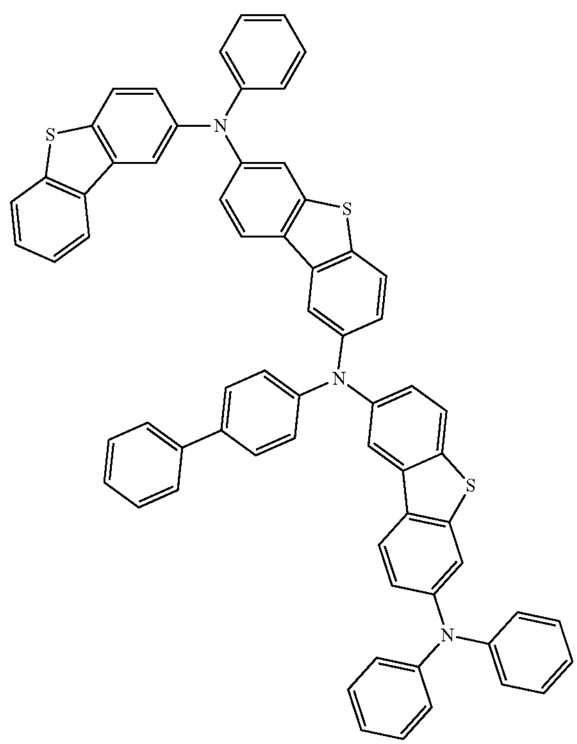
-continued
P4-21
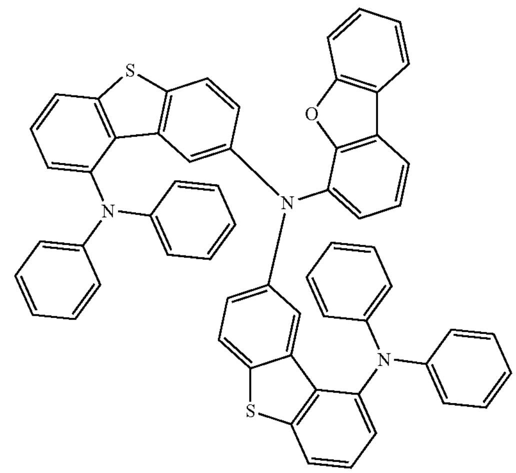
P4-22
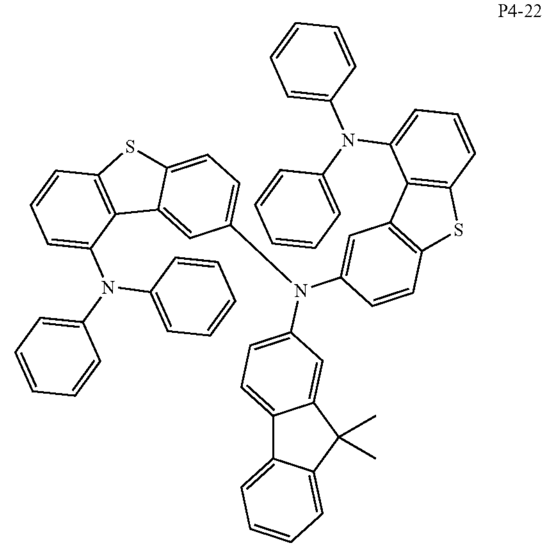
P4-23
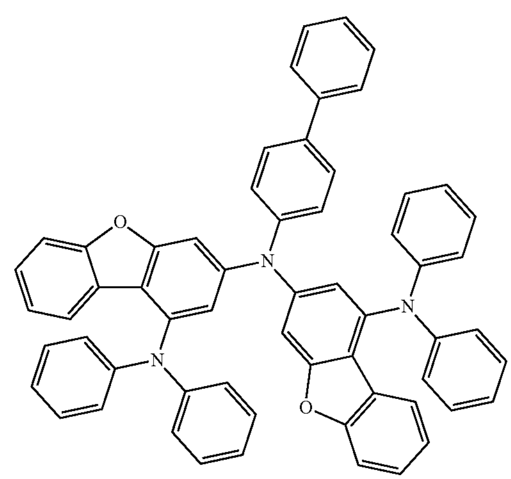

-continued
P4-24
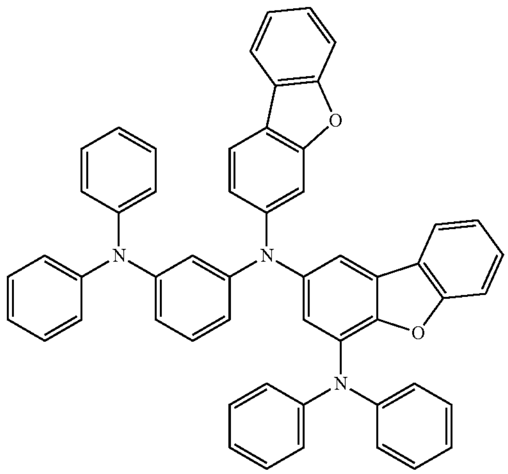
P4-25
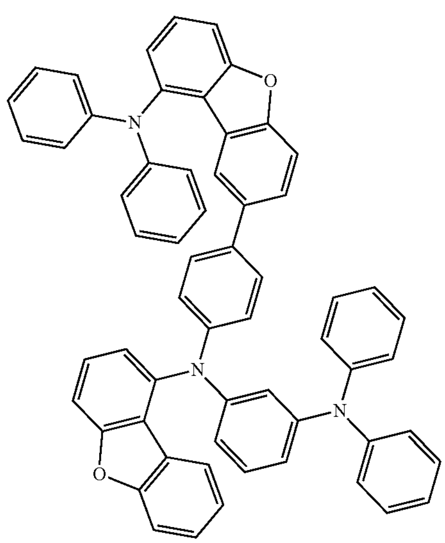
-continued
P4-26
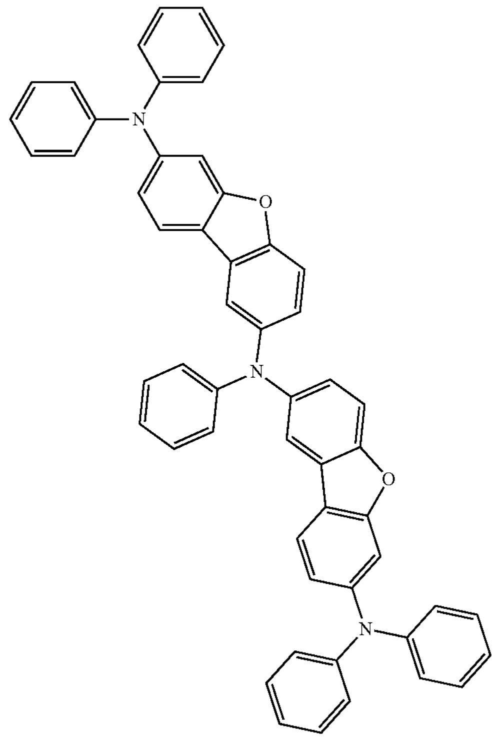
P4-27
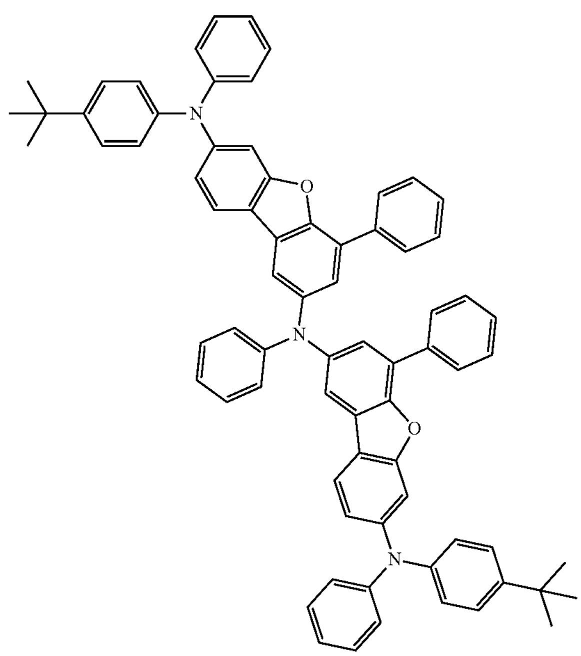

-continued
P4-28
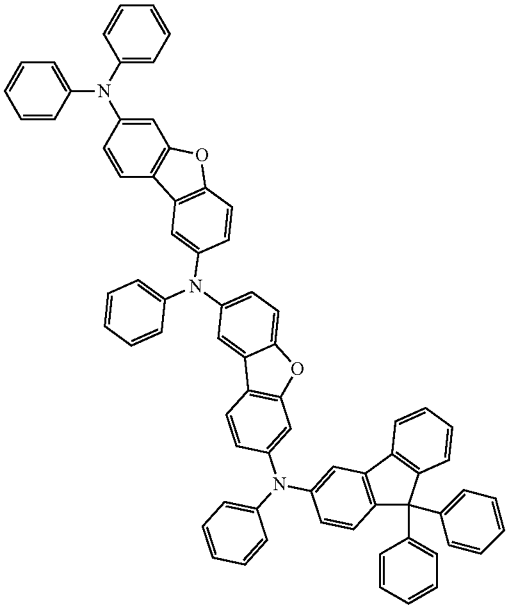
P4-29
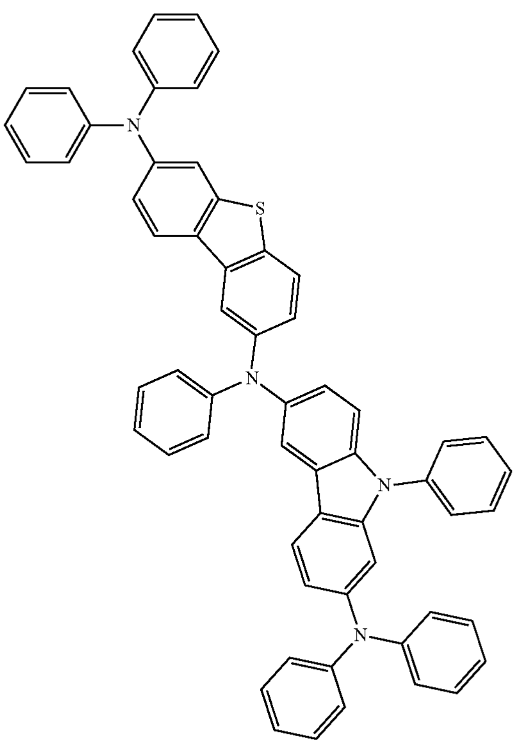
-continued
P4-30
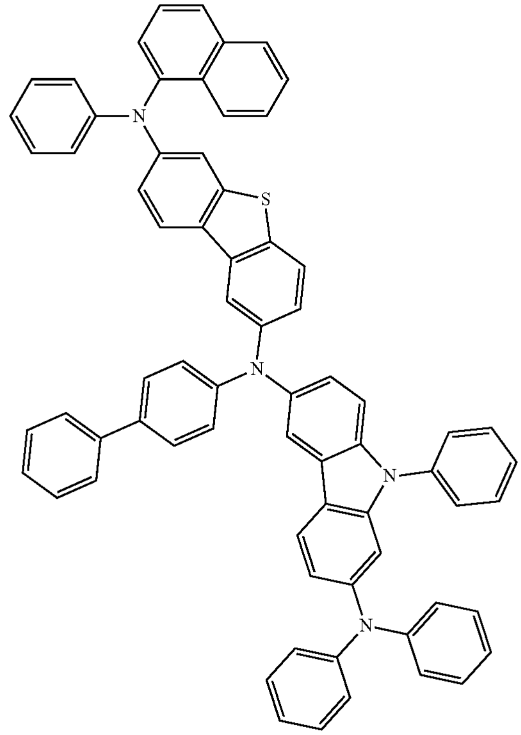
P4-31
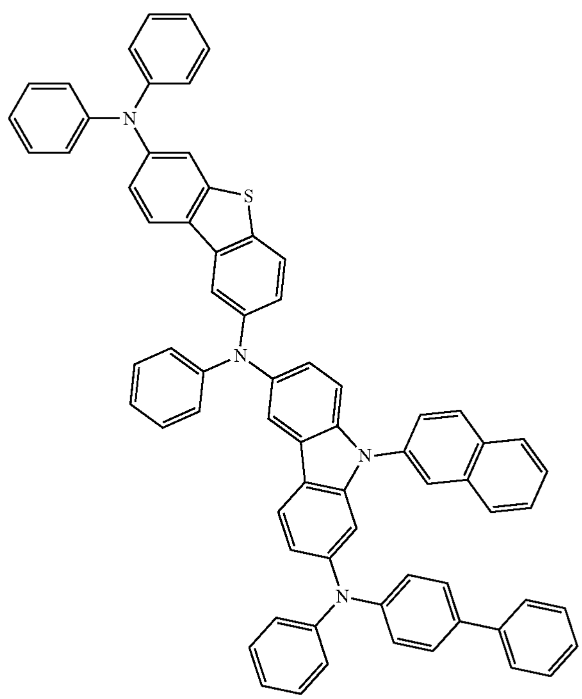

P4-32
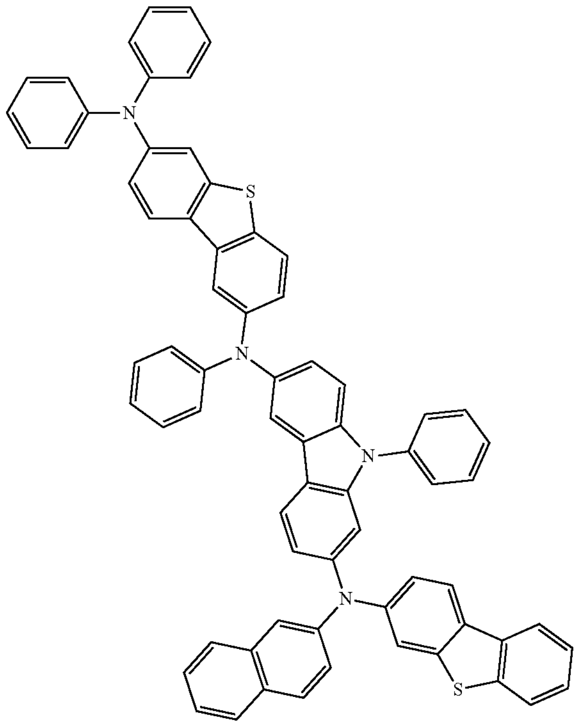
P4-33
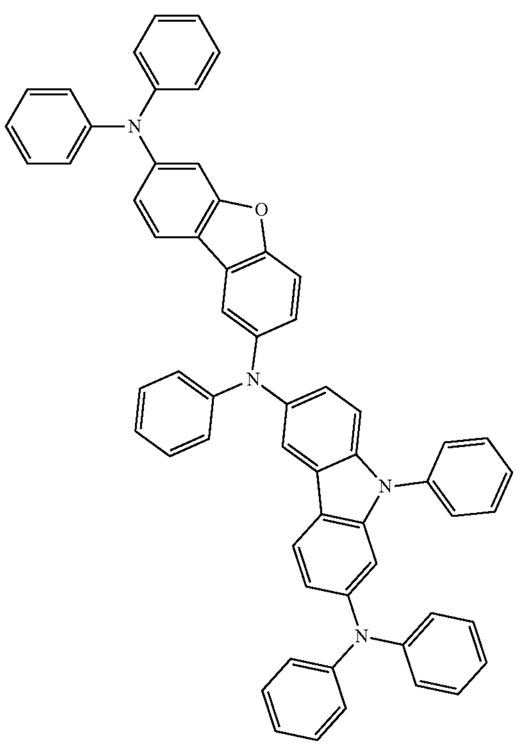
P4-34
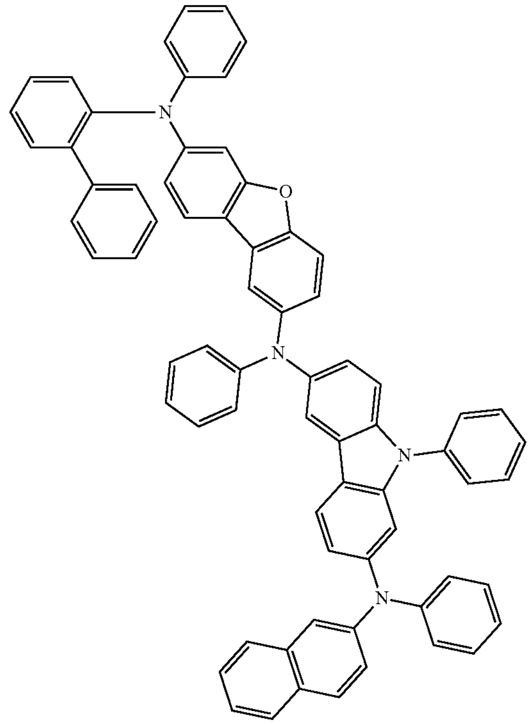
P4-35
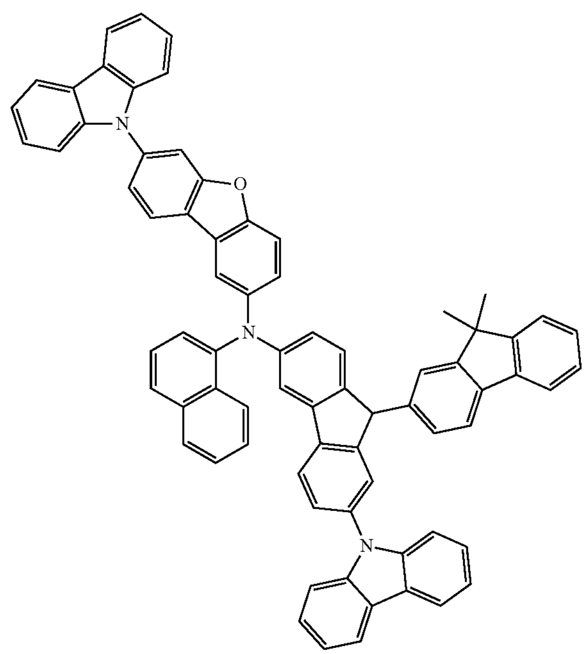

P4-36
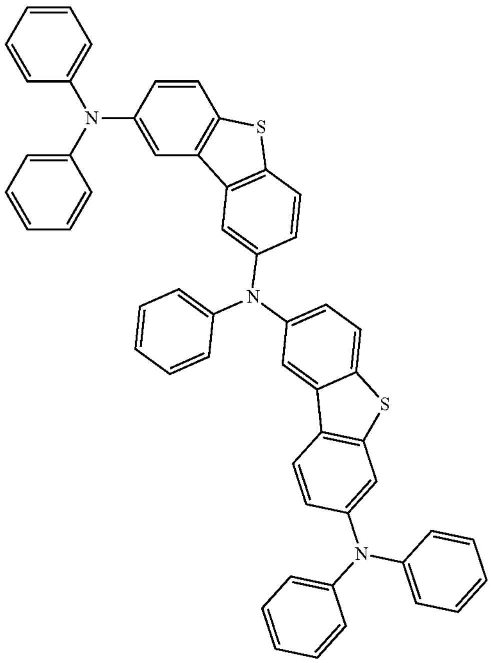
P4-37
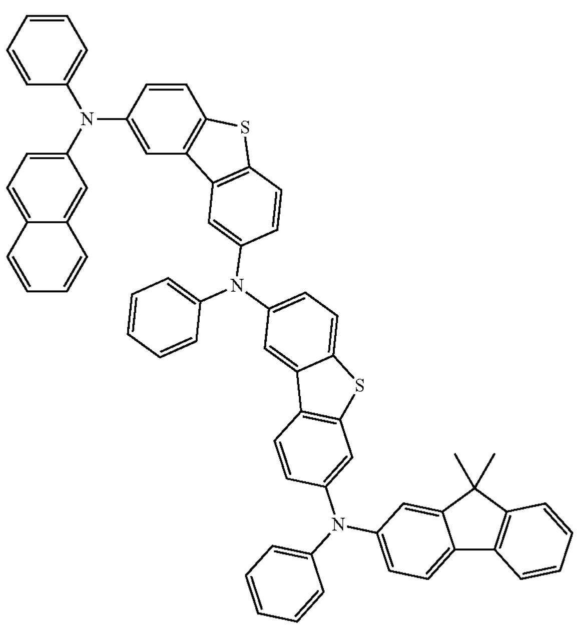
P4-38
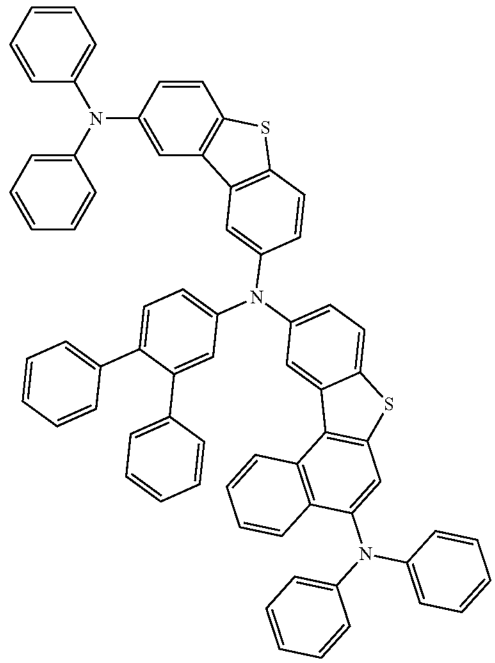
P4-39
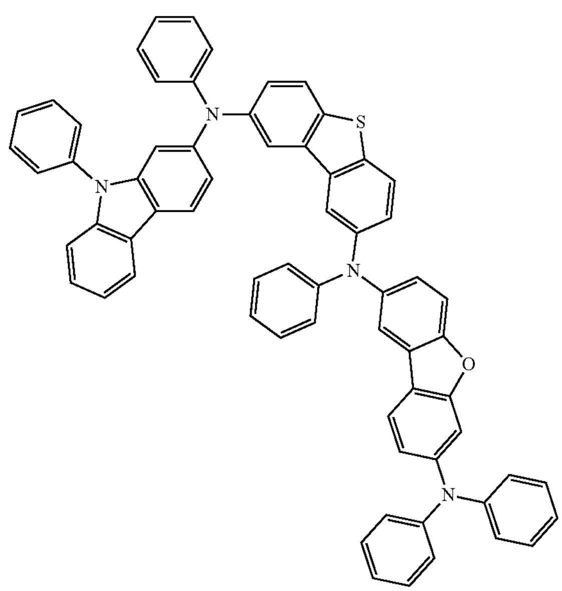

-continued
P4-40
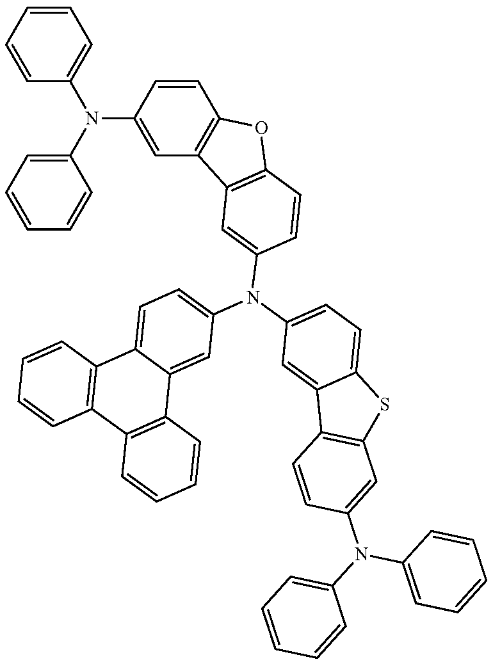
P4-41
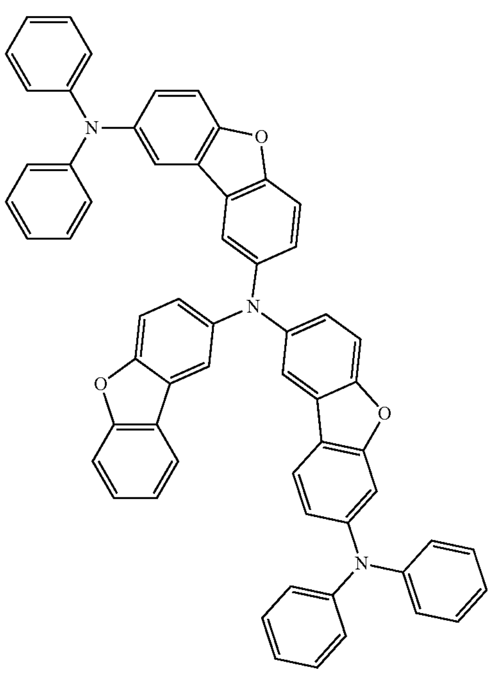
-continued
P4-42
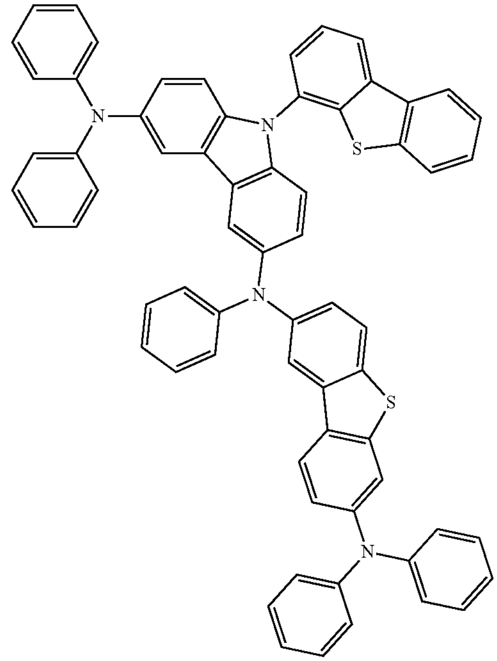
P4-43
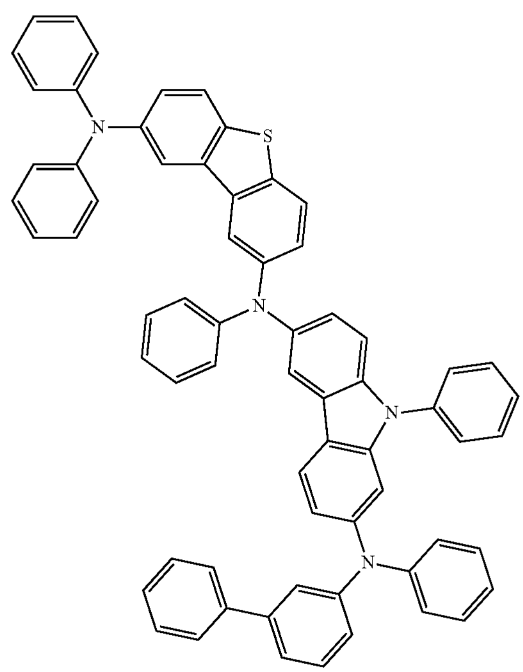

-continued
P4-44
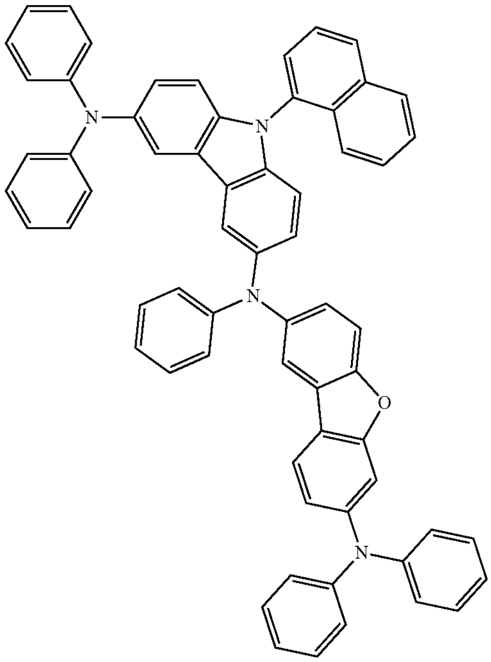
-continued
P4-46
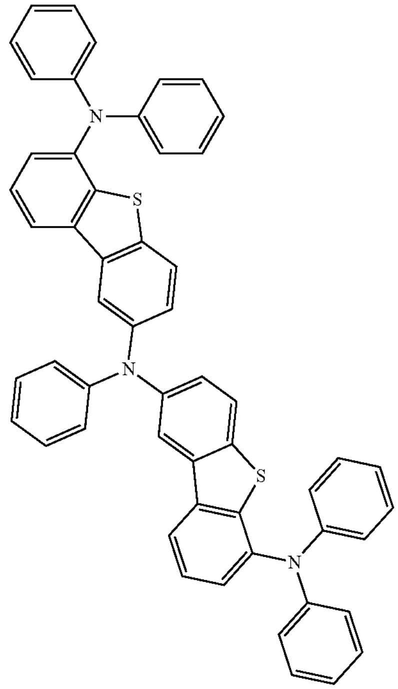
P4-45
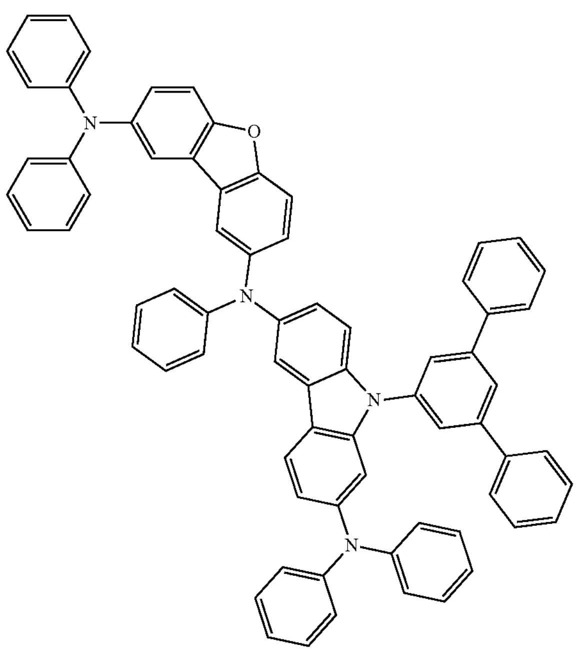
P4-47
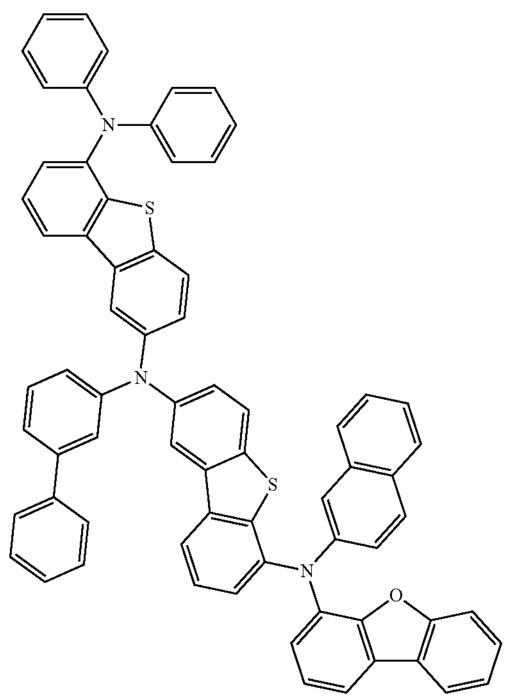

-continued
P4-48
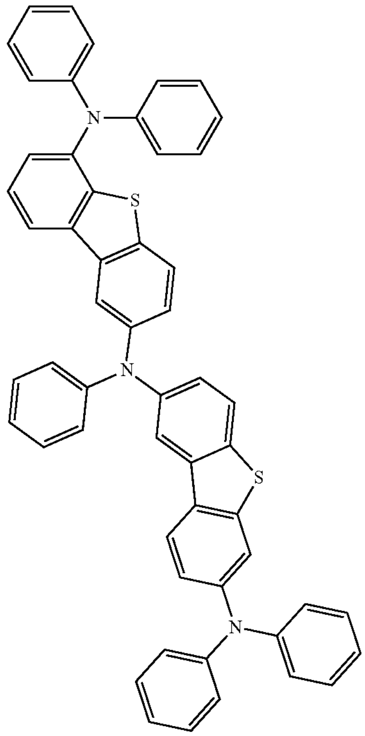
P4-49
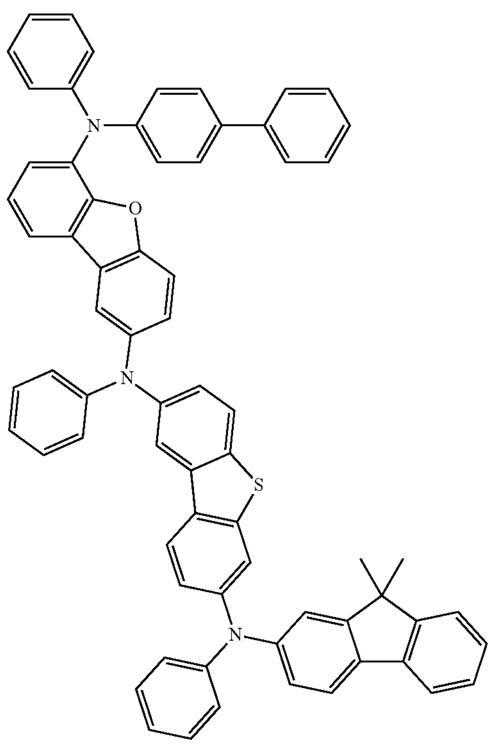
-continued
P4-50
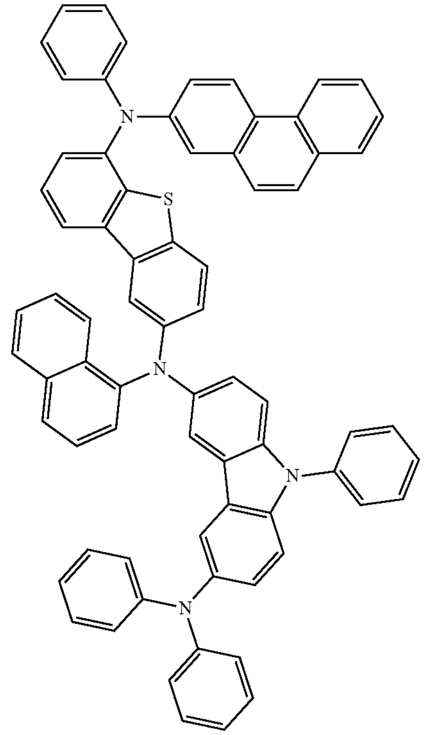
P4-51
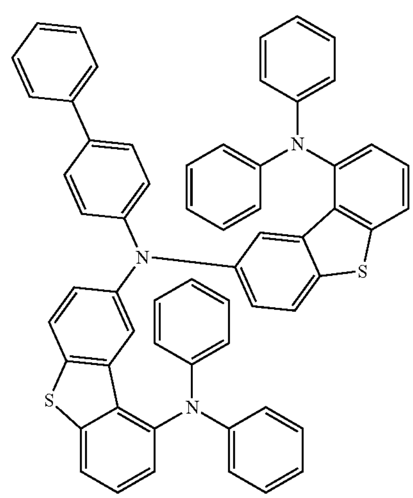

-continued
P4-52
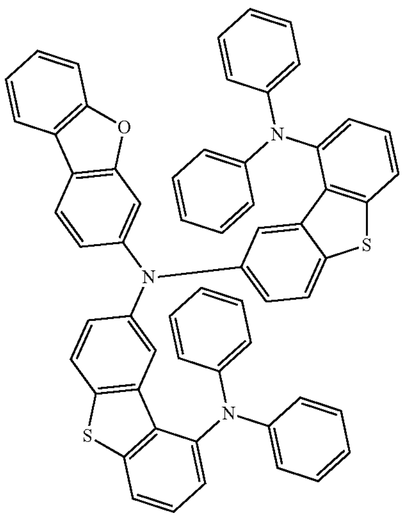
P4-53
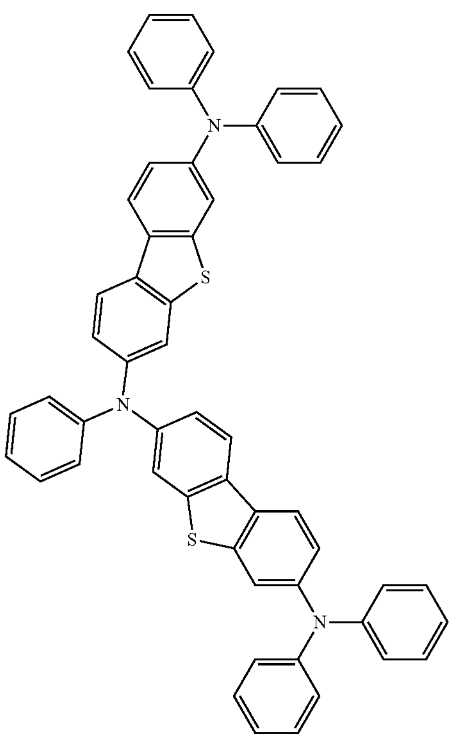
-continued
P4-54
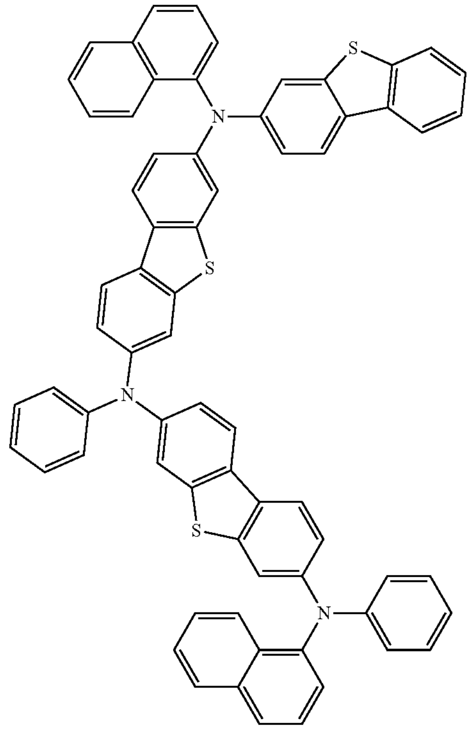
P4-55
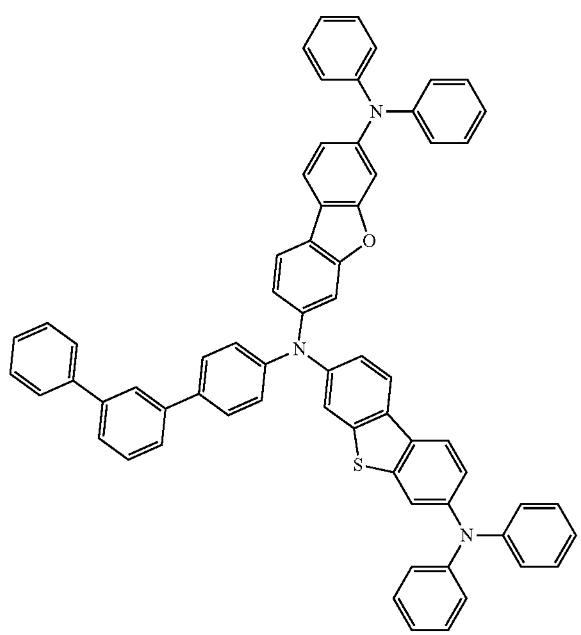

-continued
P4-56
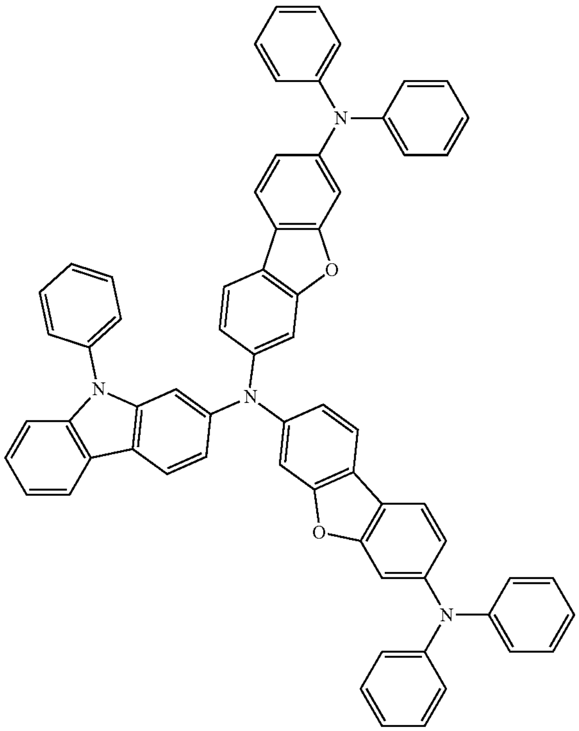
P4-57
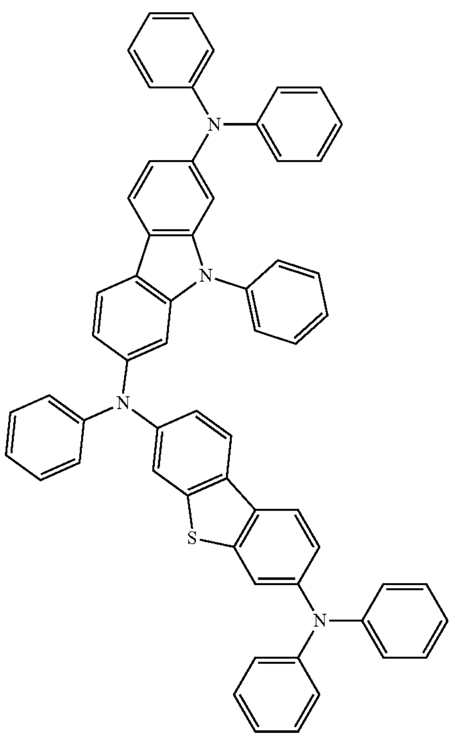
-continued
P4-58
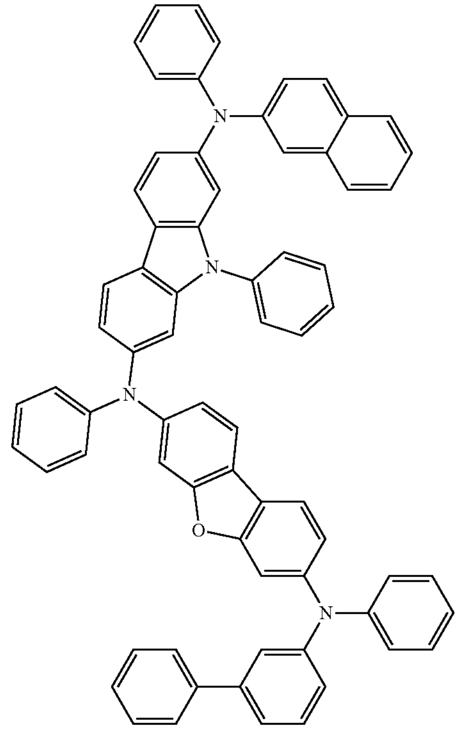
P4-59
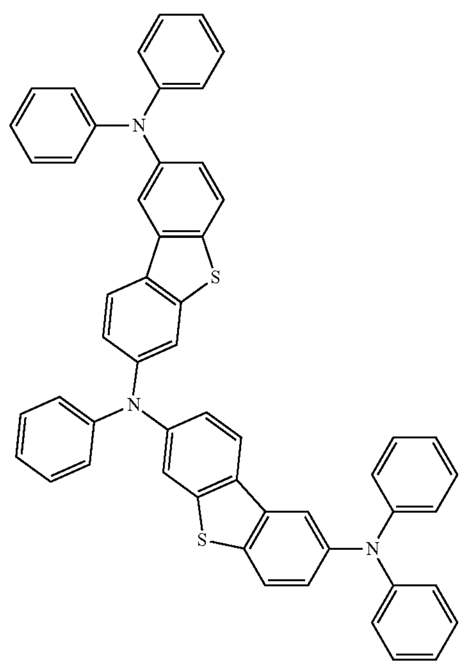

P4-60
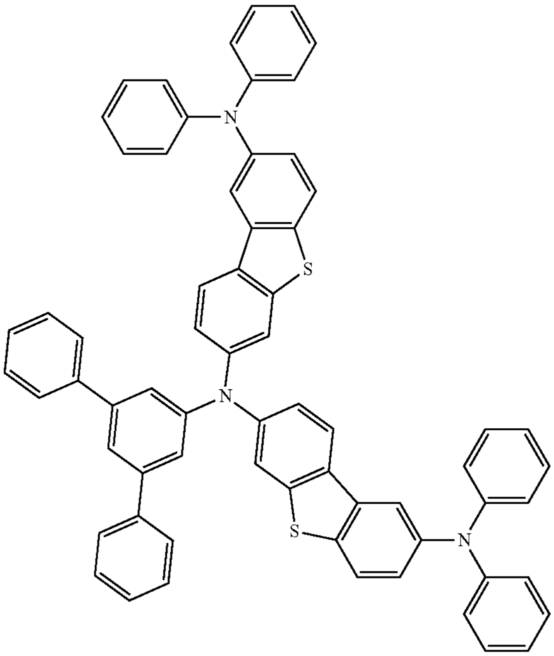
P4-61
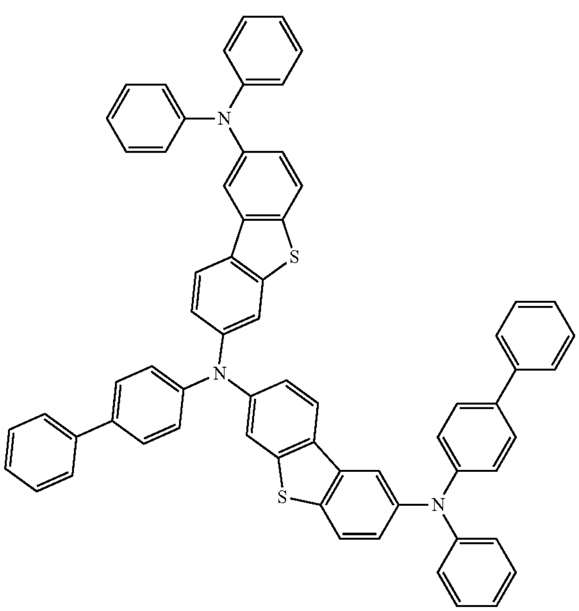
P4-62
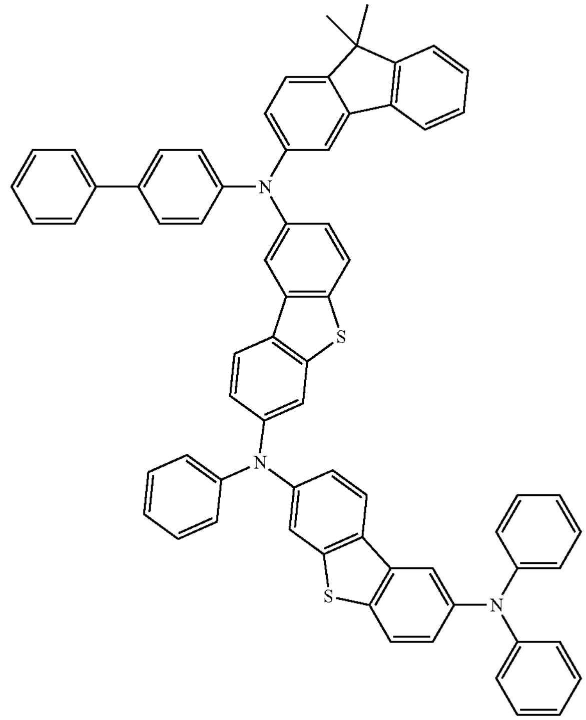
P4-63
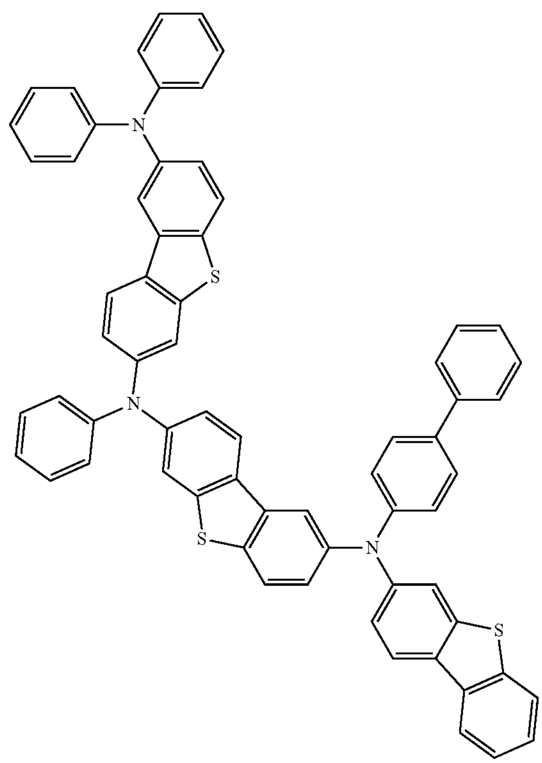

-continued
P4-64
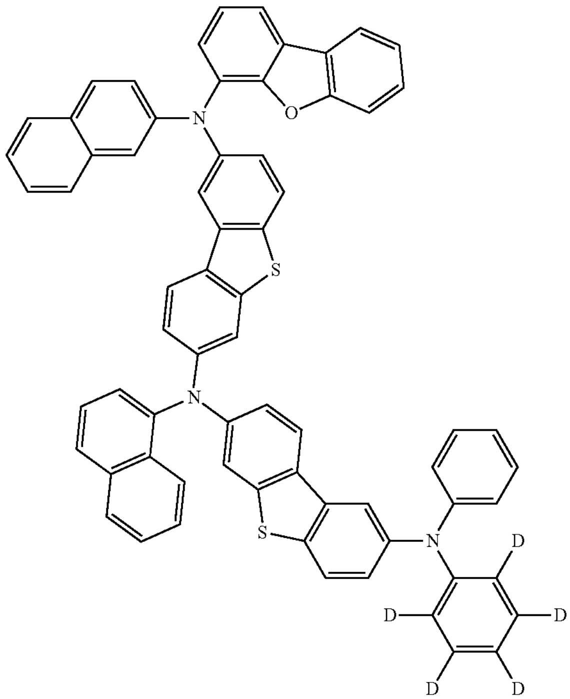
P4-65
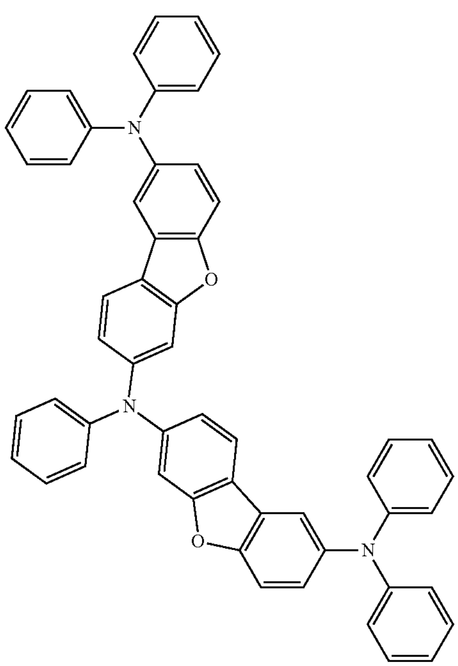
-continued
P4-66
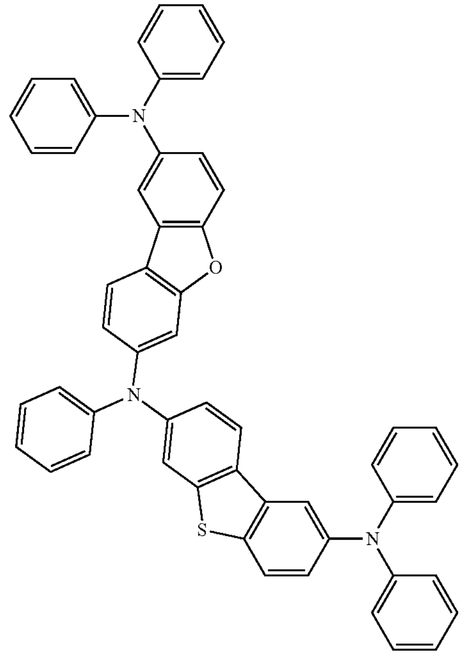
P4-67
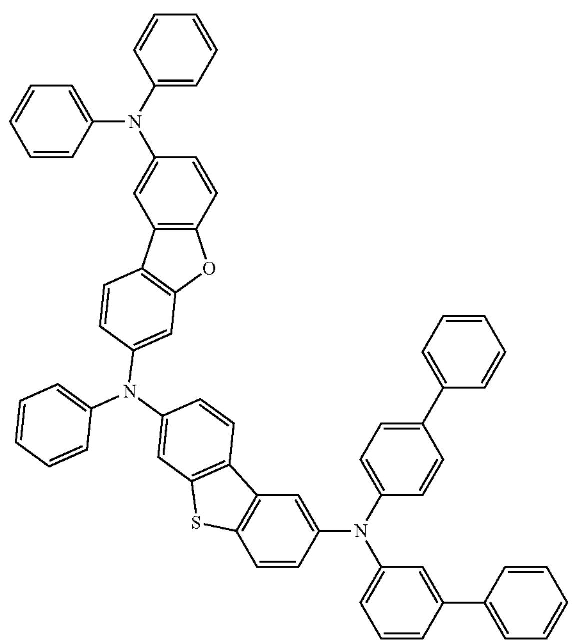

-continued
P4-68
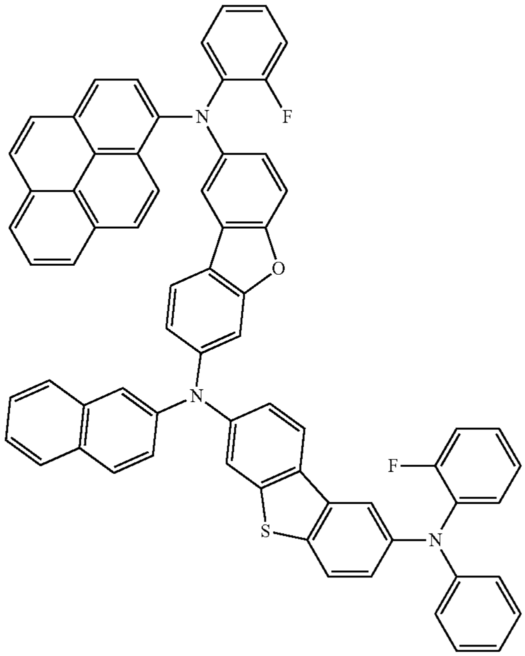
P4-69
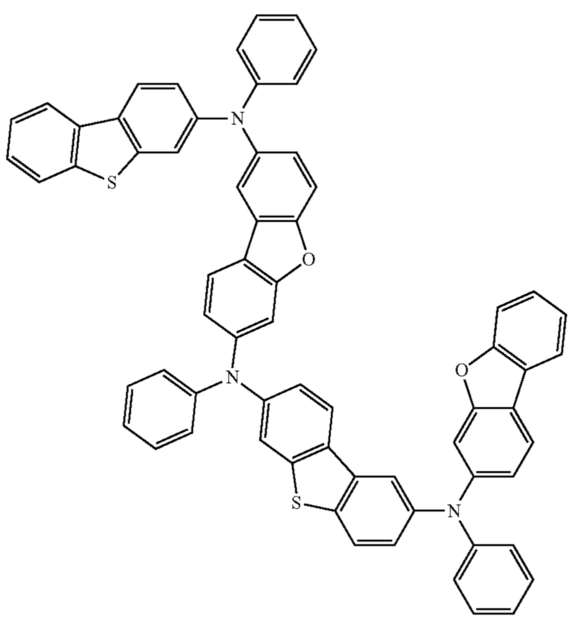
-continued
P4-70
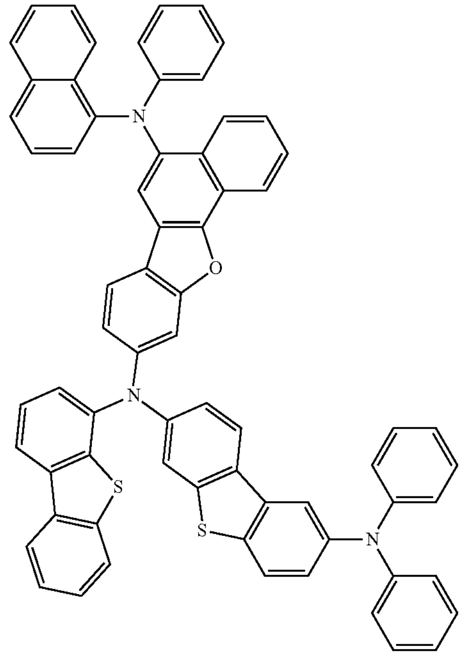
P4-71
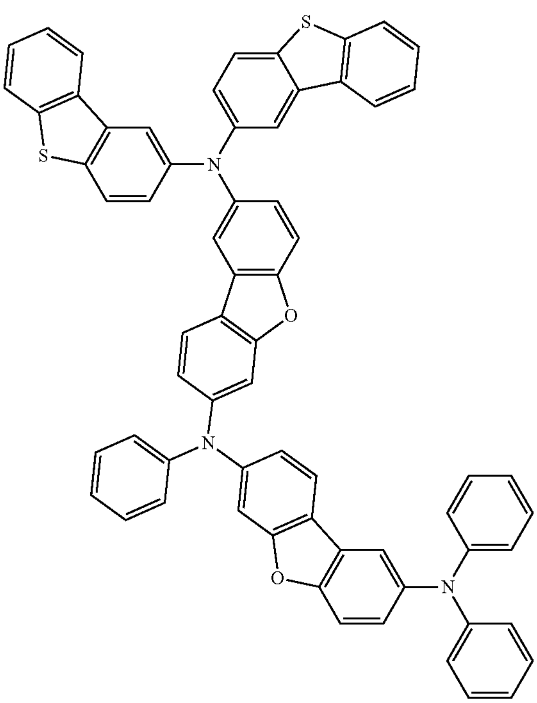

-continued
P4-72
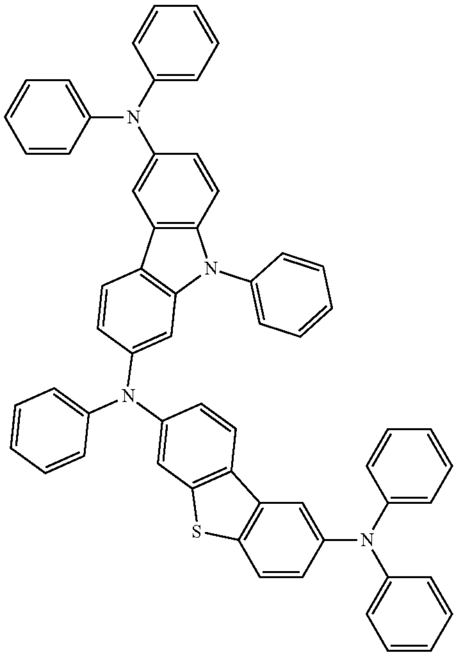
P4-73
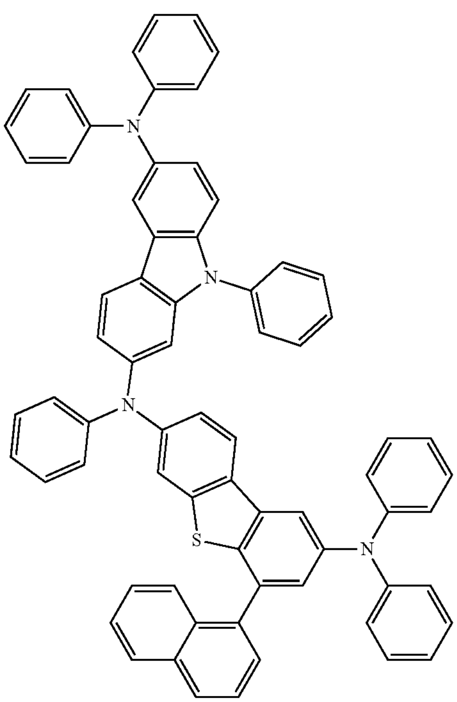
-continued
P4-74
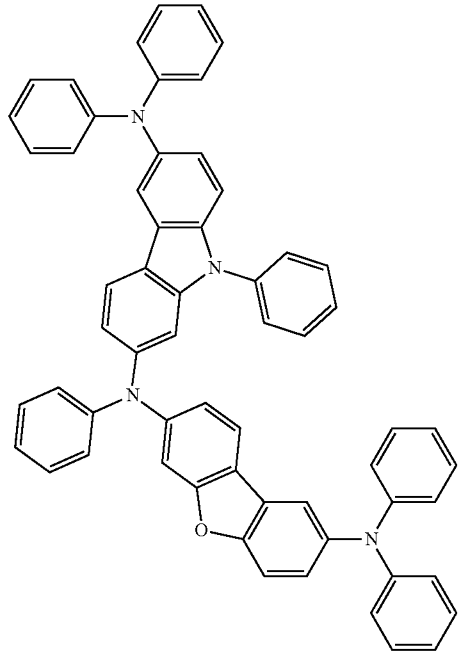
P4-75
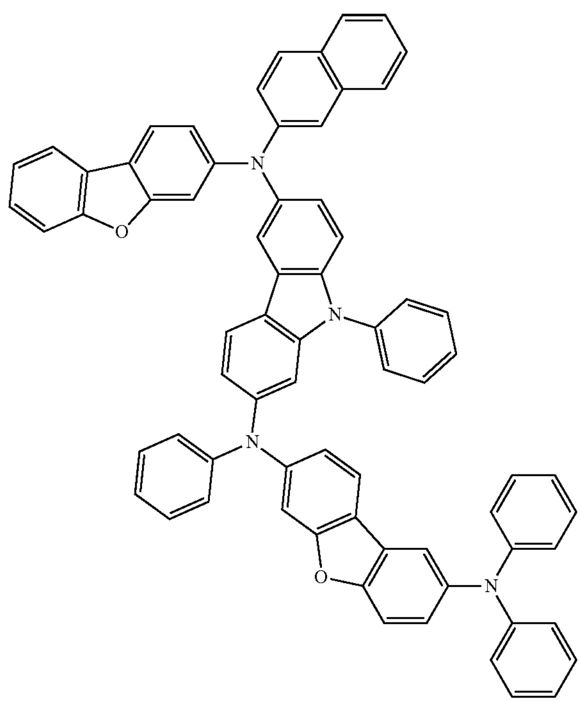

-continued
P4-76
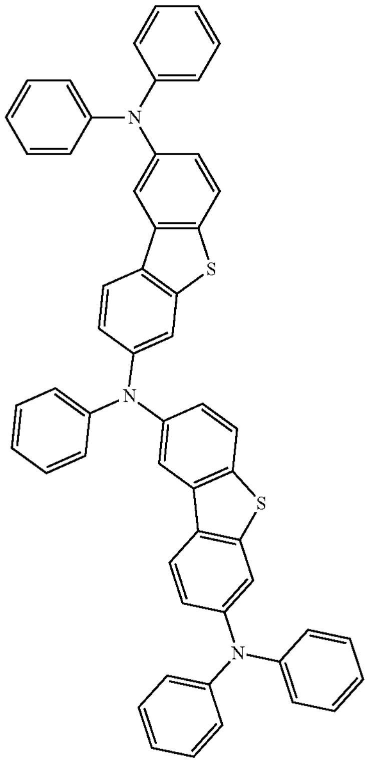
-continued
P4-78
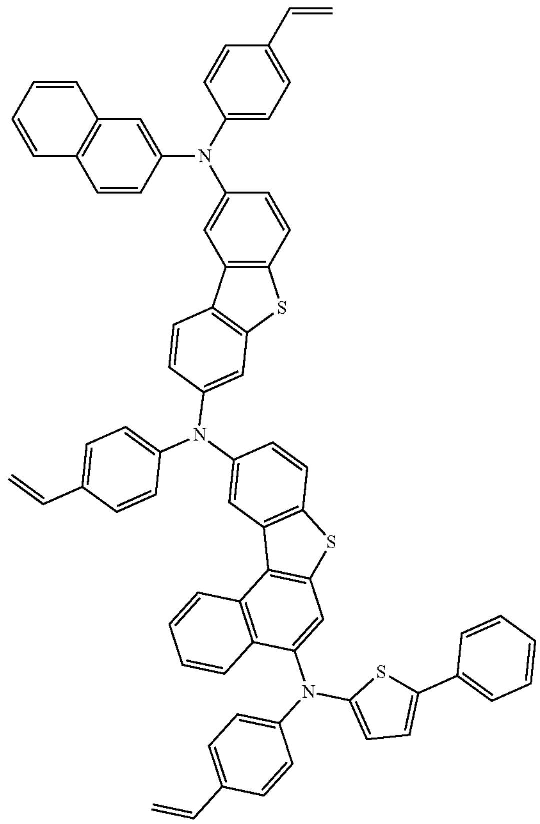
P4-77
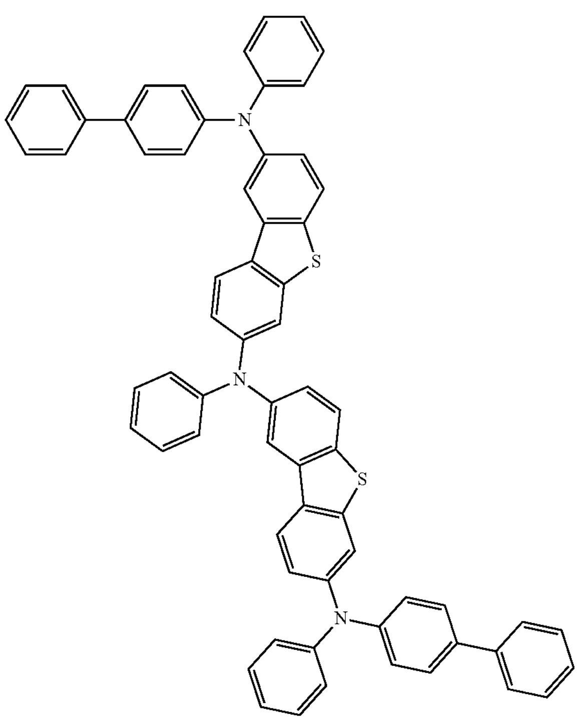
P4-79
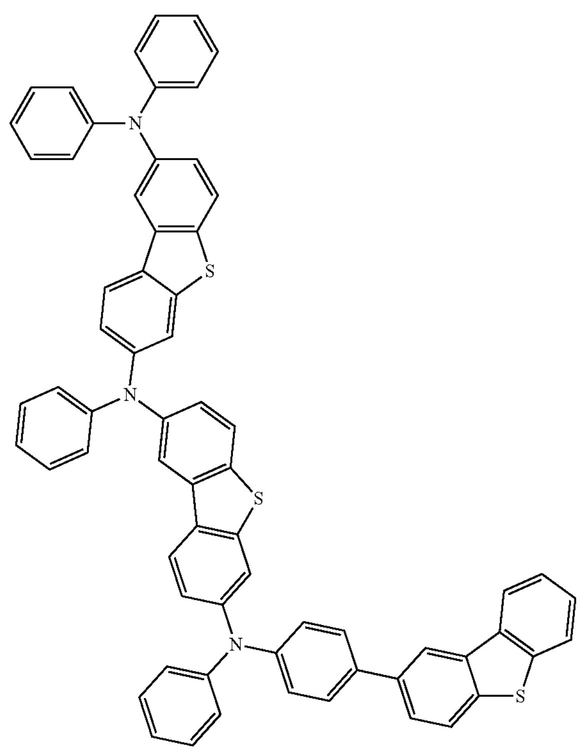

P4-80
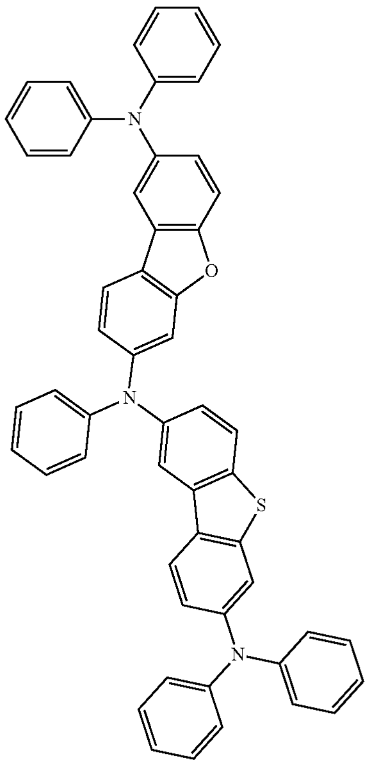
P4-81
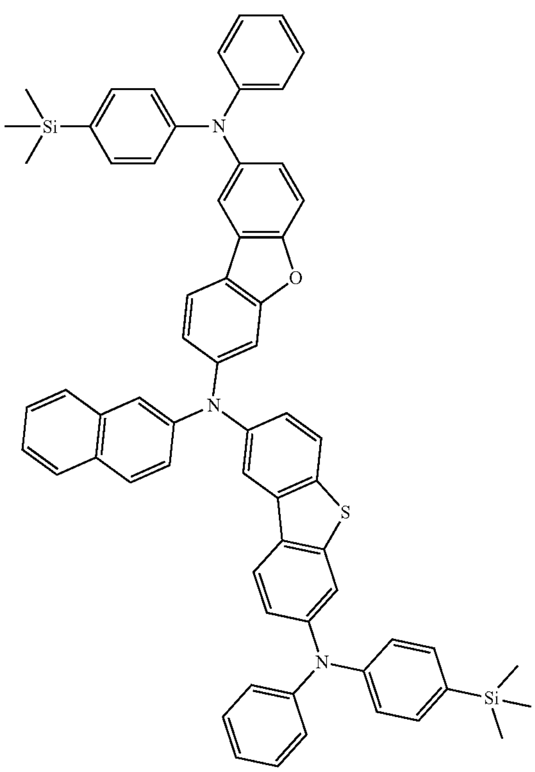
P4-82
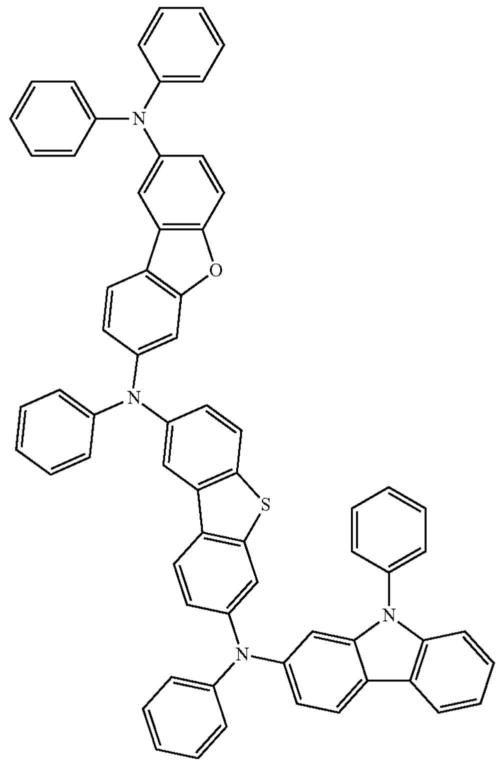
P4-83
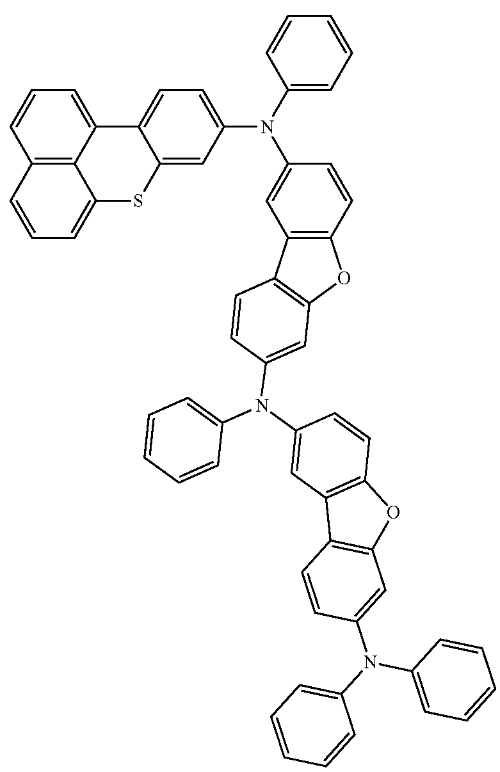

-continued
P4-84
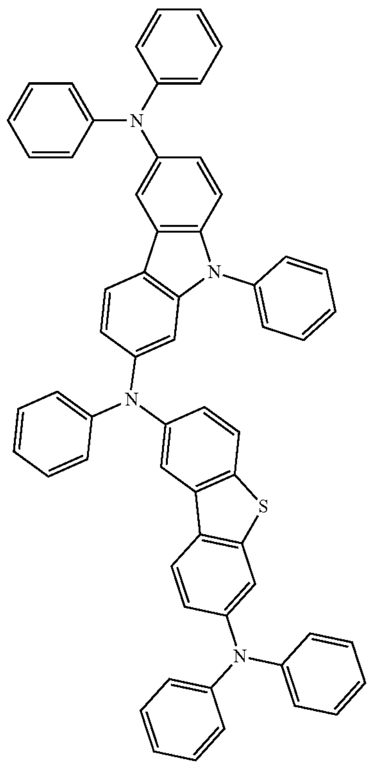
P4-85
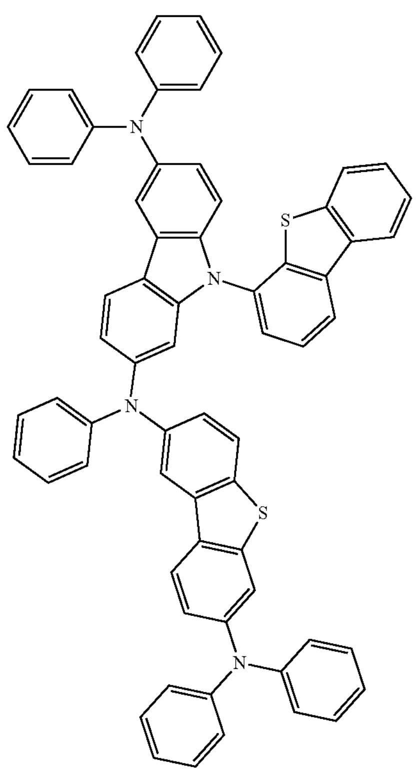
-continued
P4-86
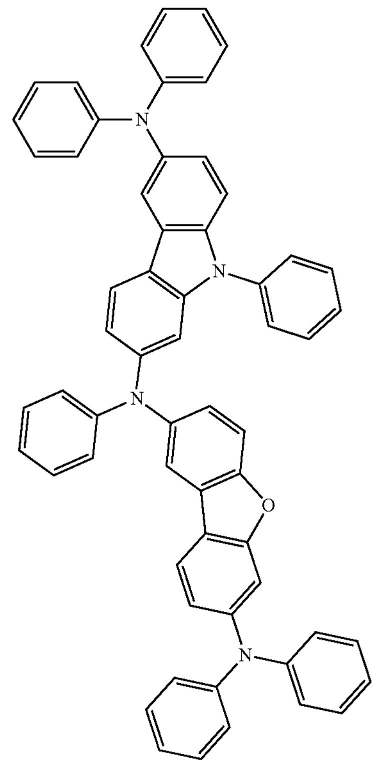
P4-87
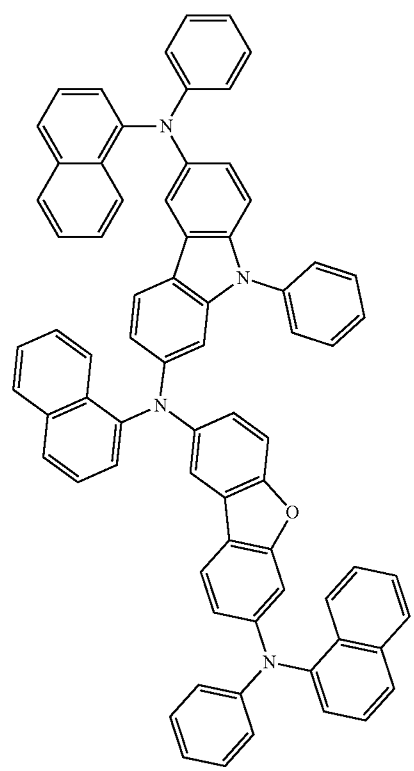

-continued
P4-88
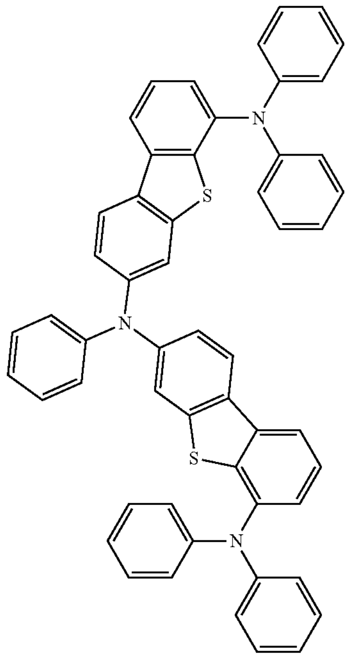
-continued
P4-90
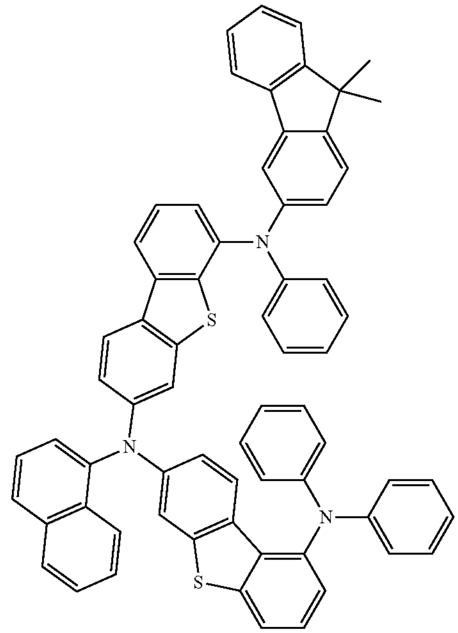
P4-89
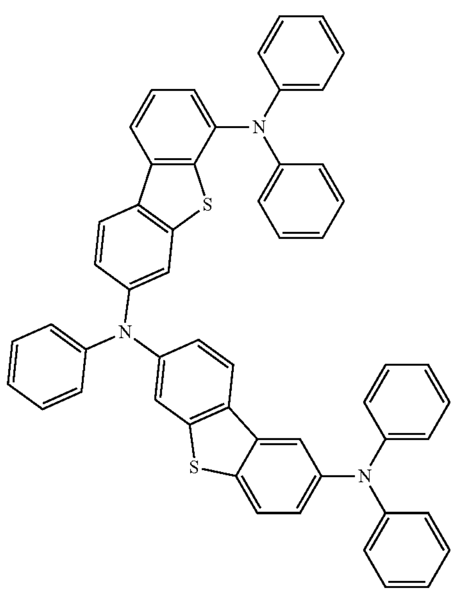
P4-91
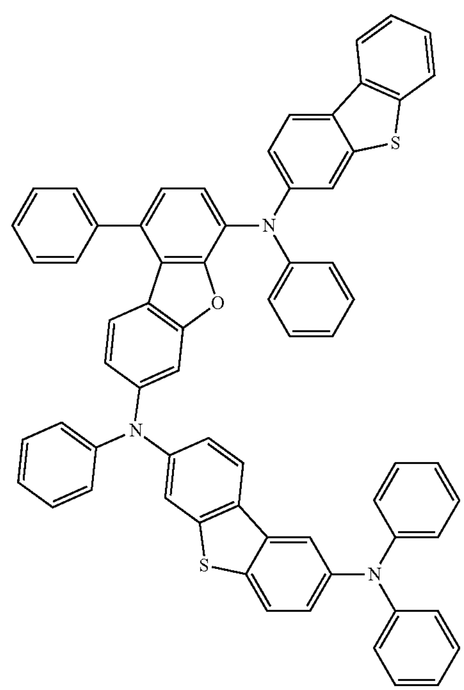

-continued
P4-92
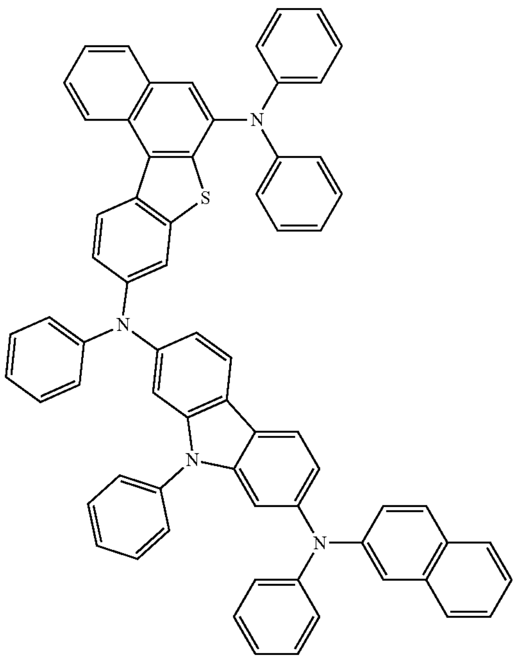
P4-93
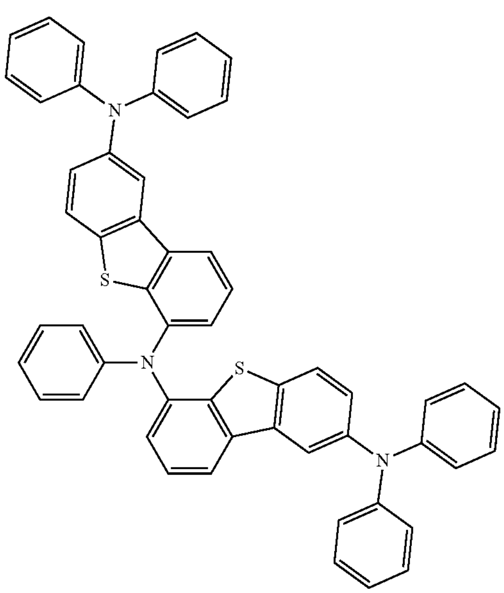
-continued
P4-94
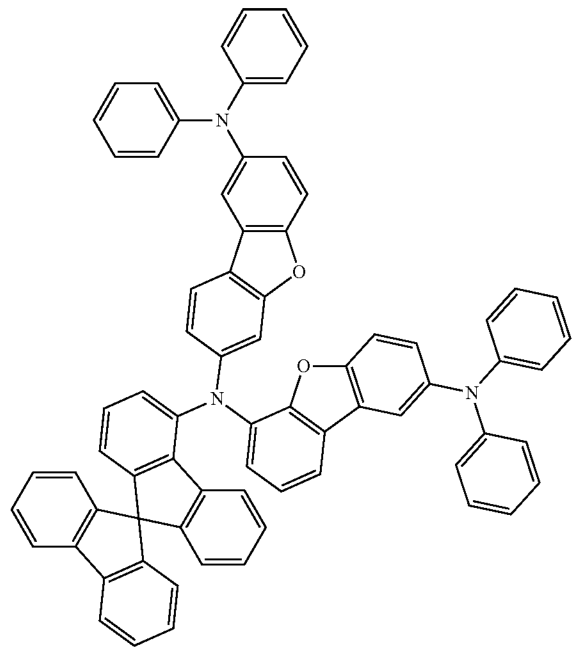
P4-95
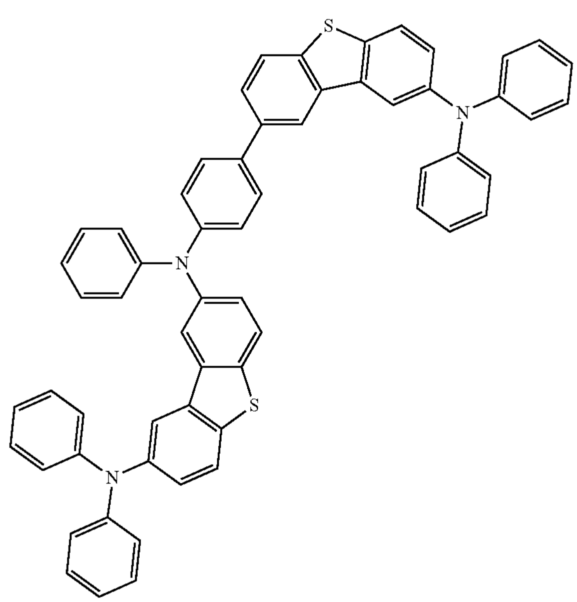

P4-96
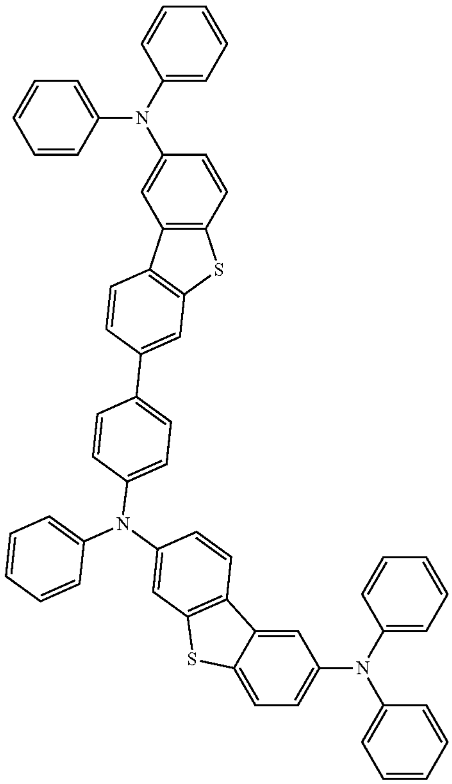
P4-97
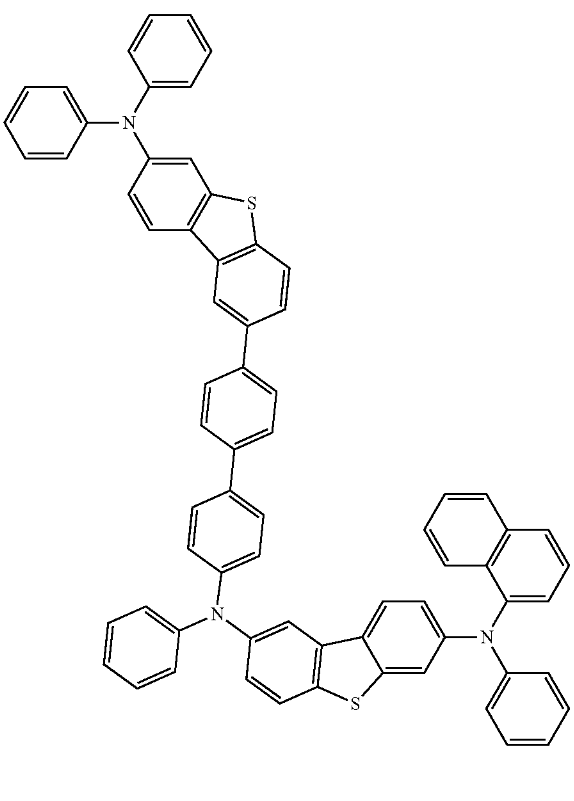
P4-98
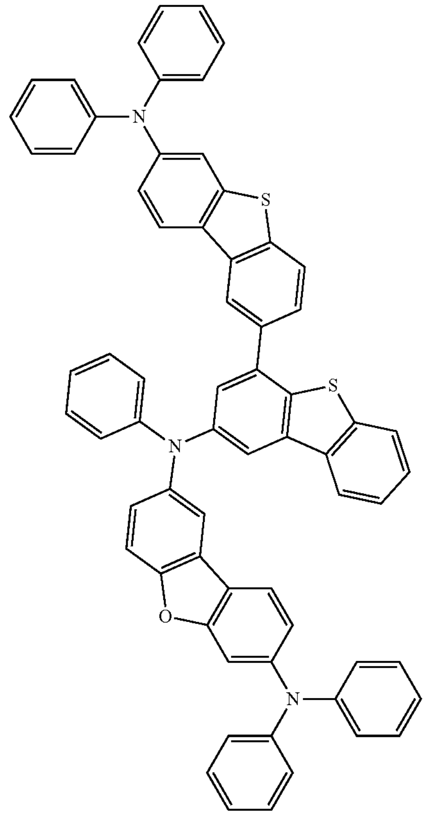
P4-99
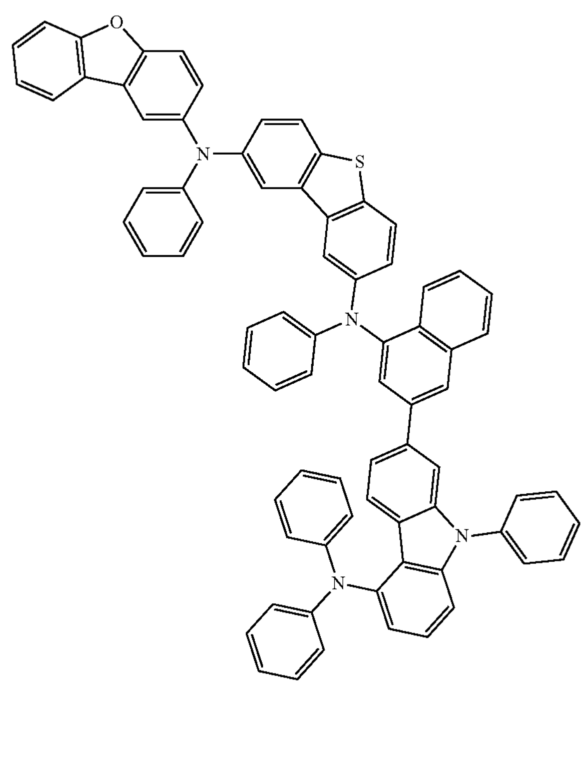

-continued
P4-100
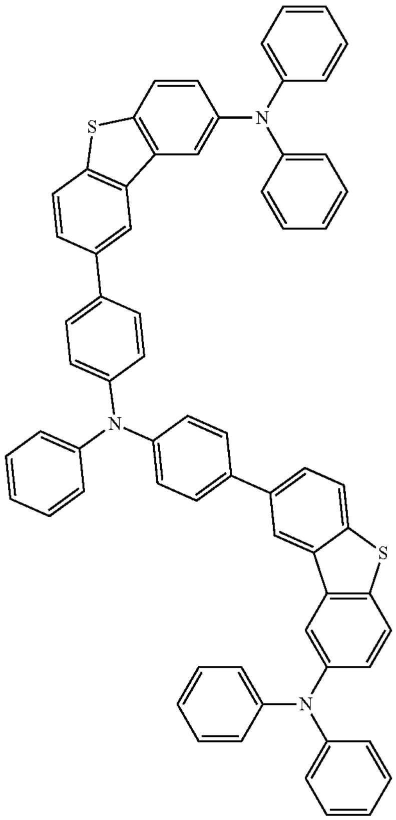
P4-101
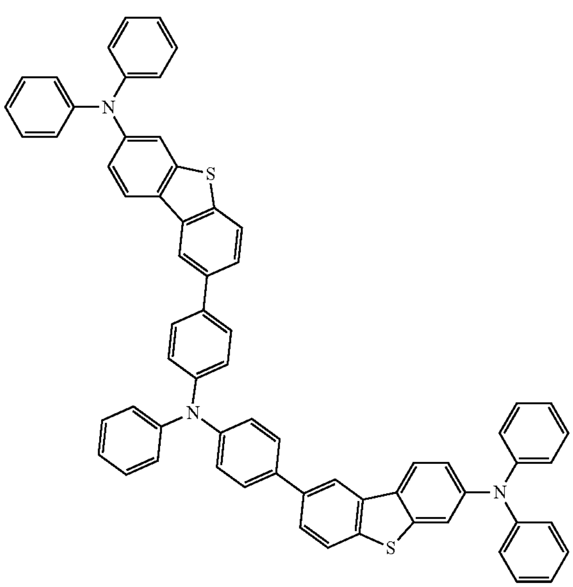
-continued
P4-102
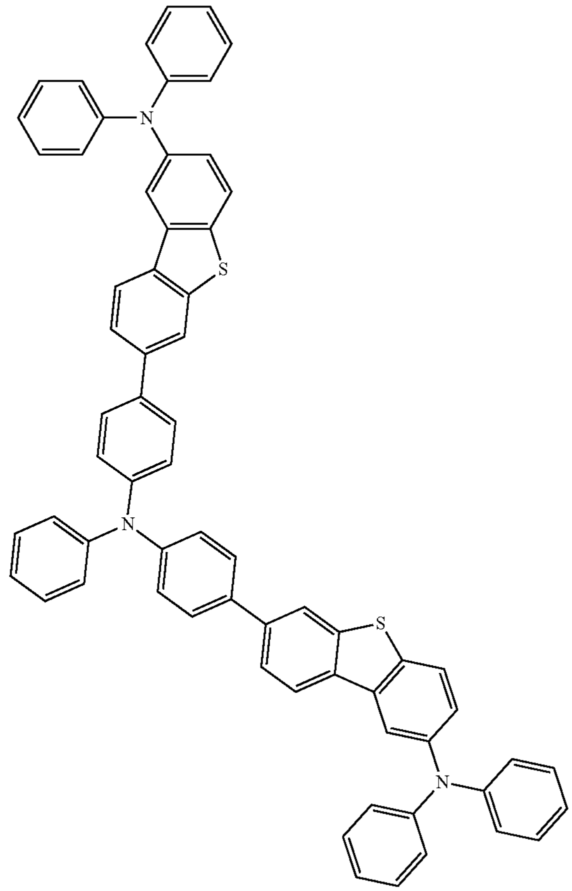
P4-103
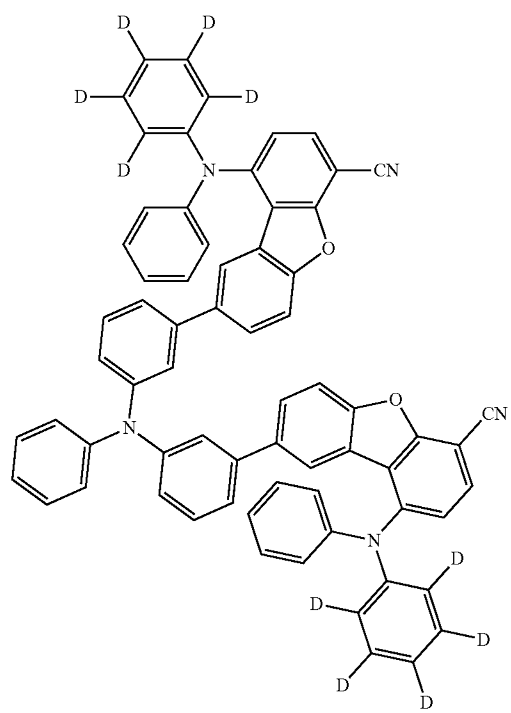

P4-104
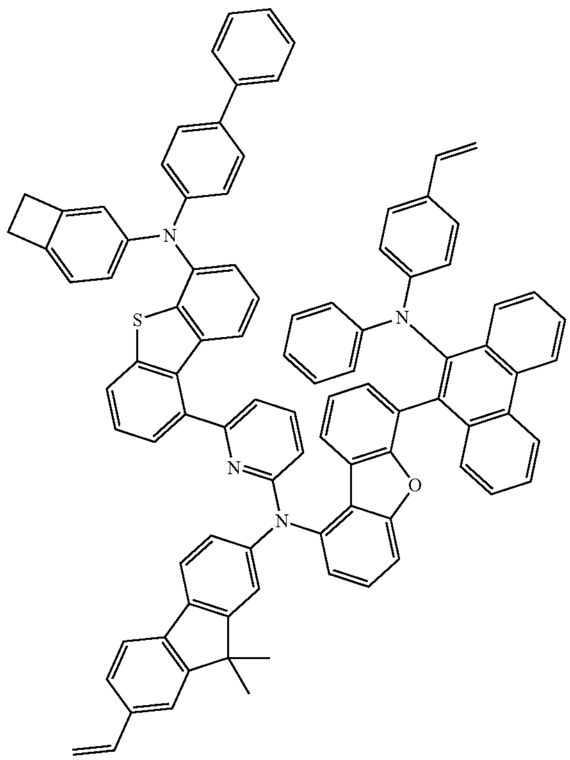
P4-105
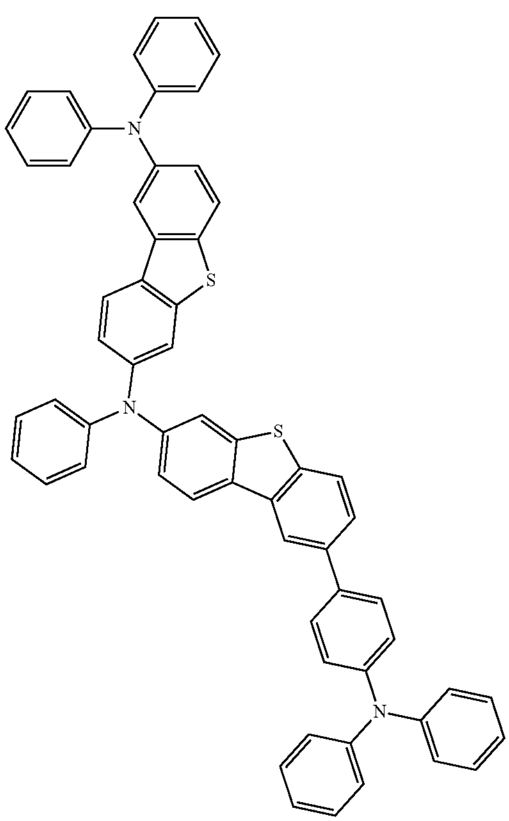
P4-106
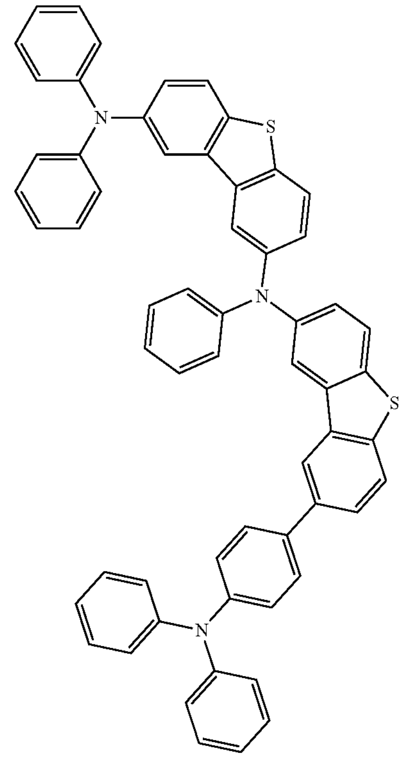
P4-107
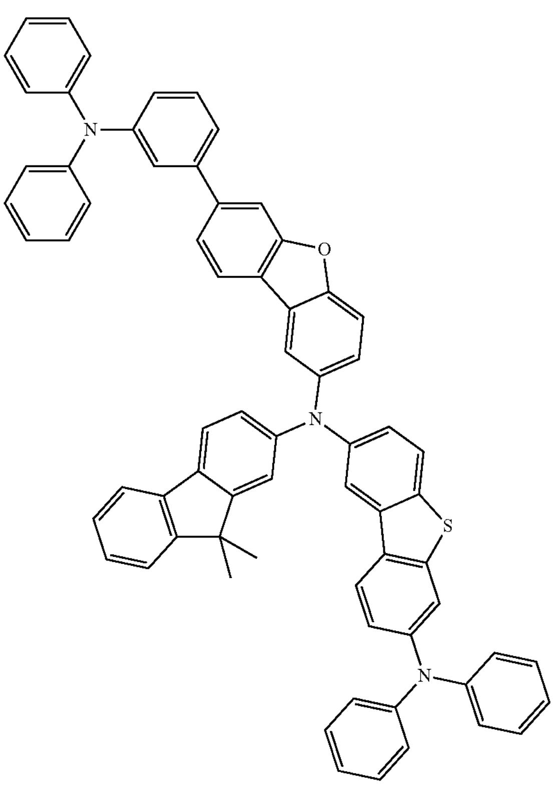

-continued
P4-108
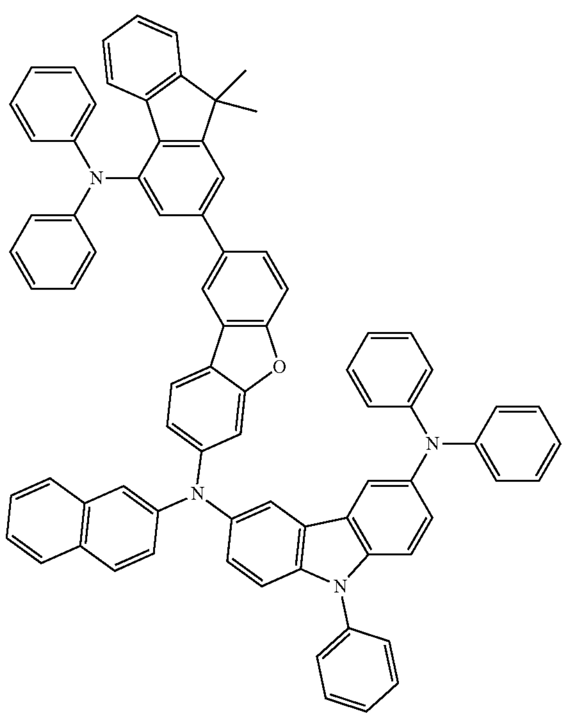
P4-109
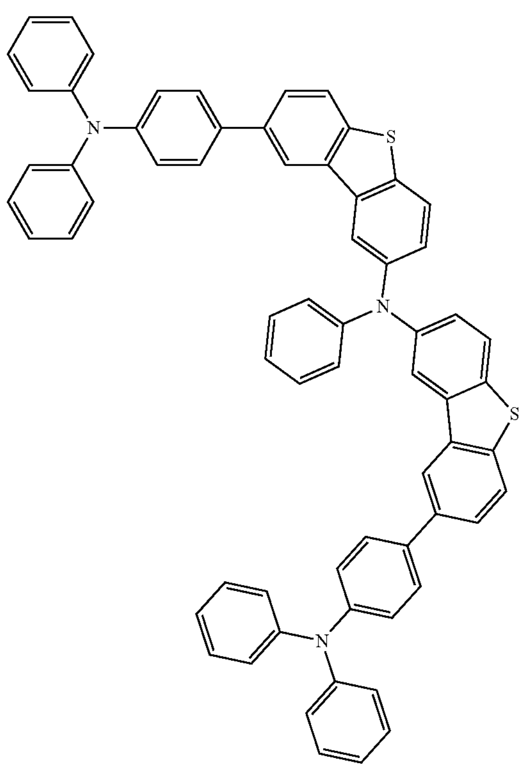
-continued
P4-110
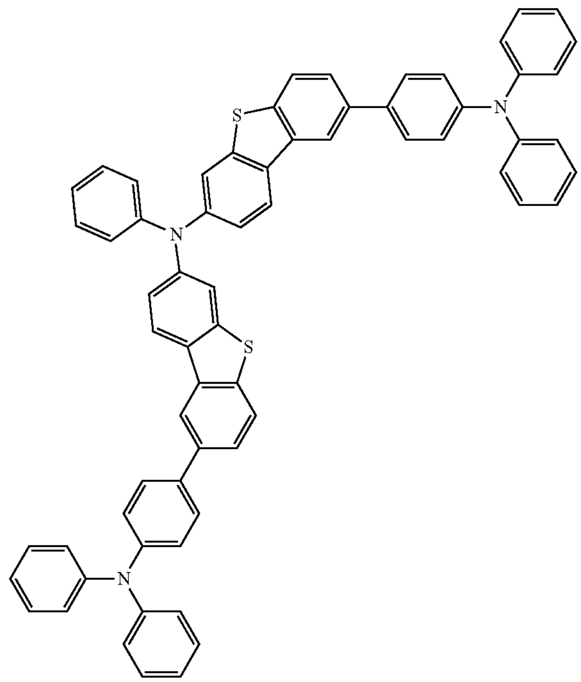
P4-111
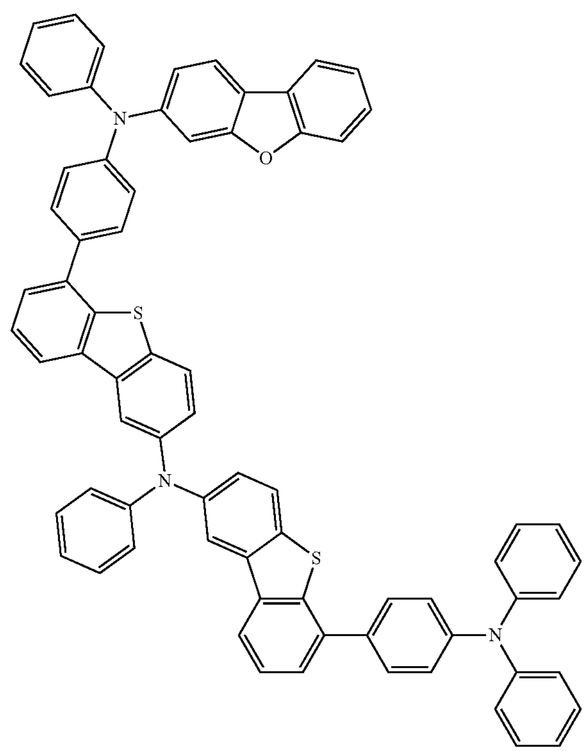

P4-112
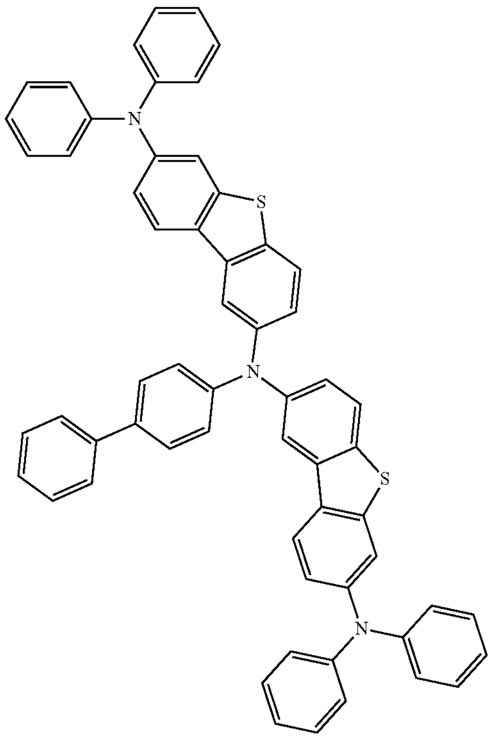
P4-113
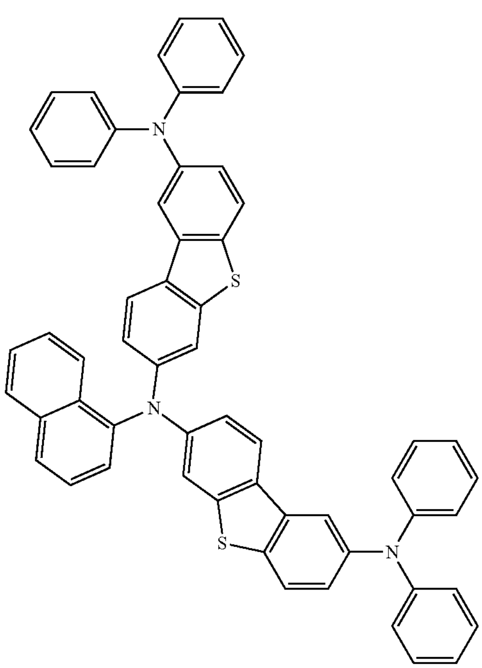
P4-114
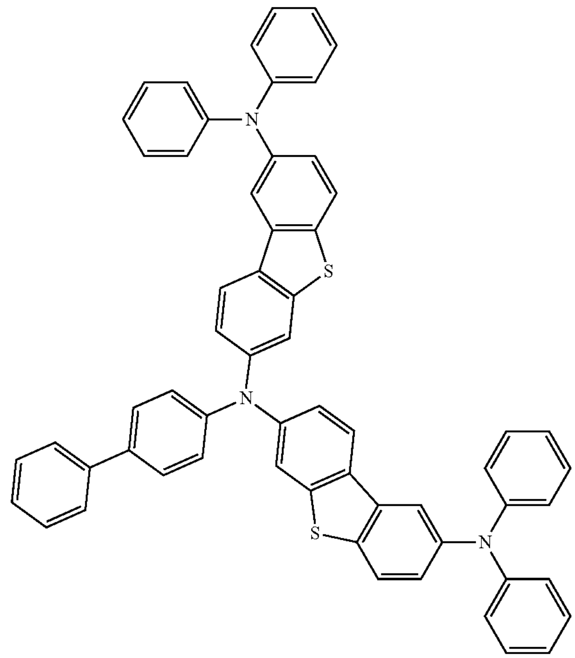
P4-115
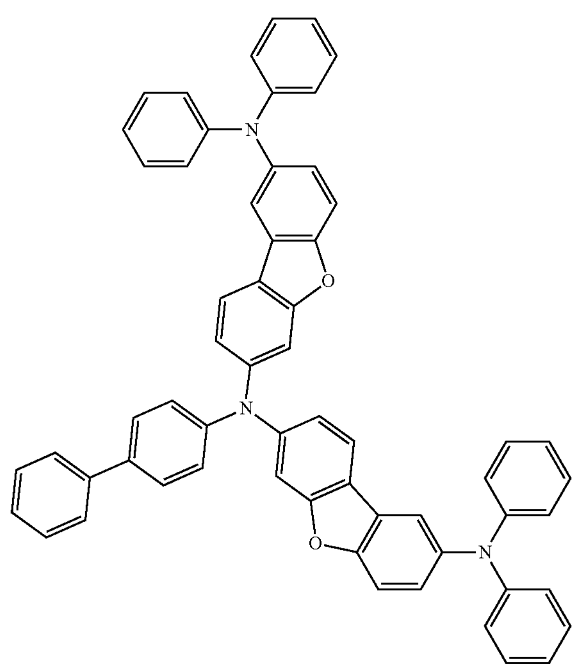

P4-116
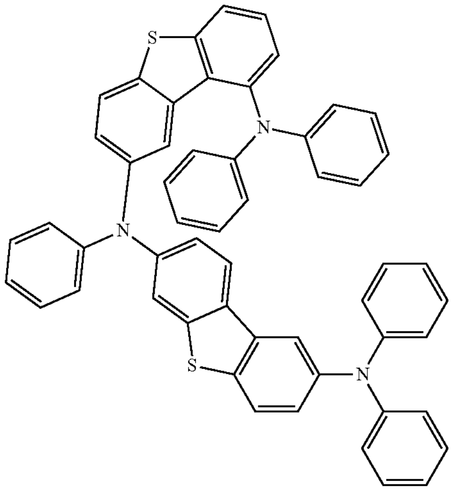
P4-117
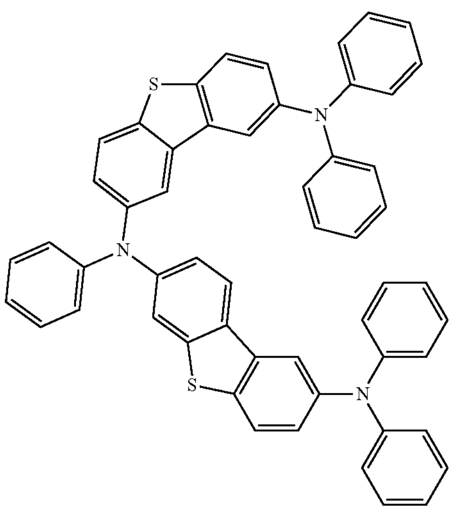
P4-118
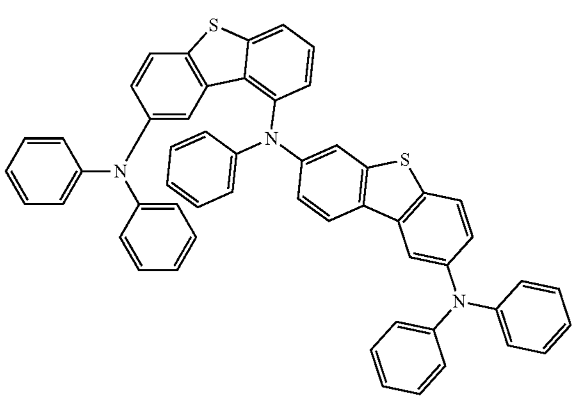
P4-119
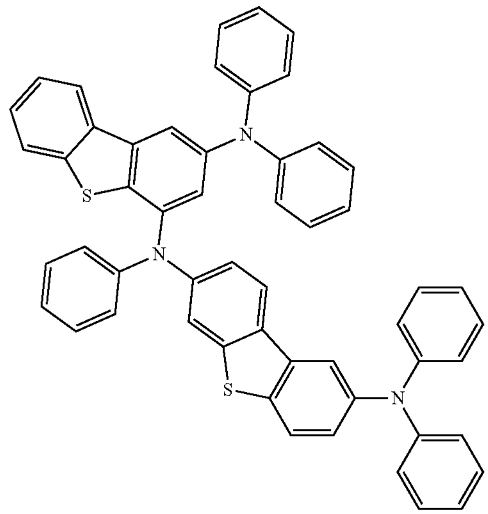
P4-120
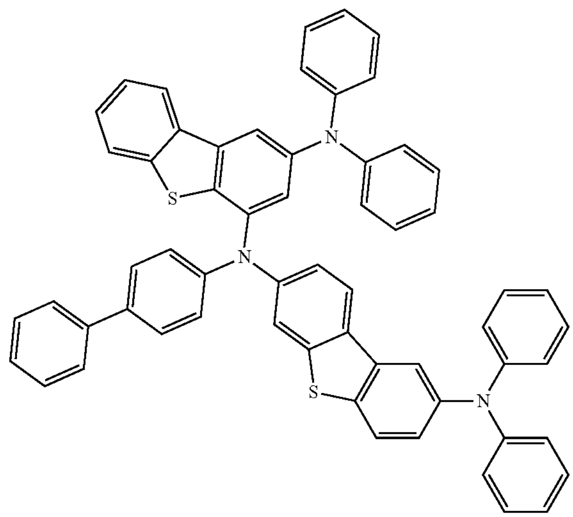
P4-121
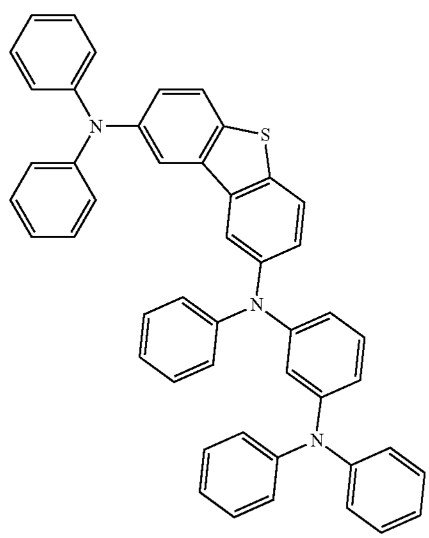

-continued
P4-122
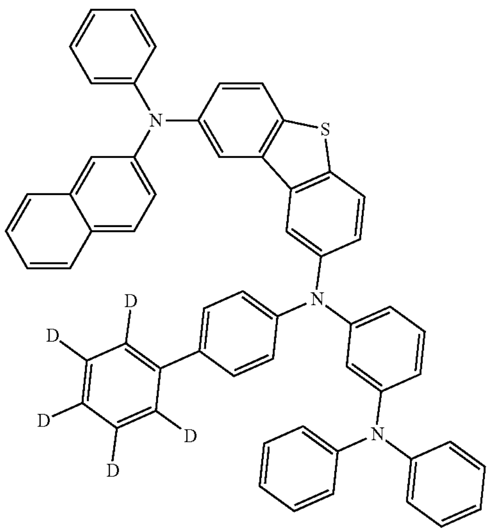
P4-123
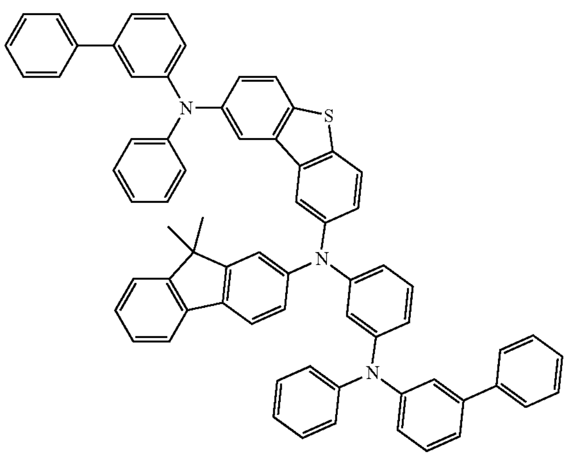
P4-124
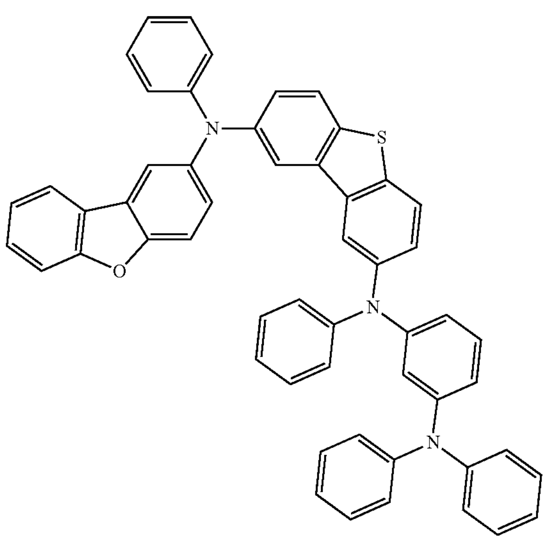
-continued
P4-125
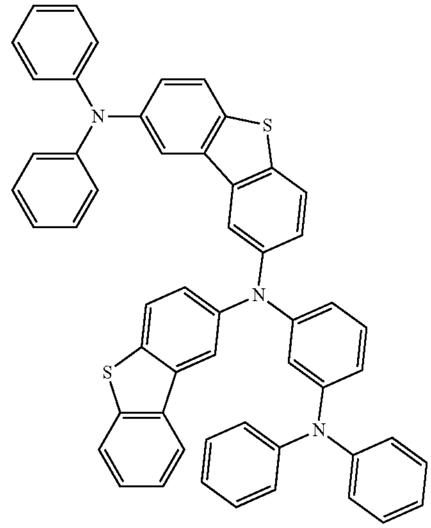
P4-126
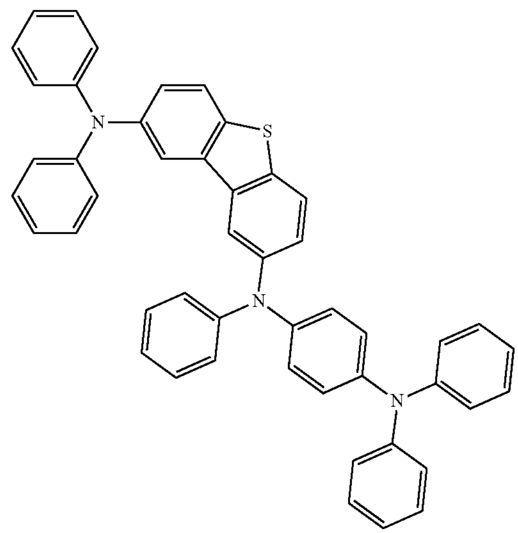
P4-127
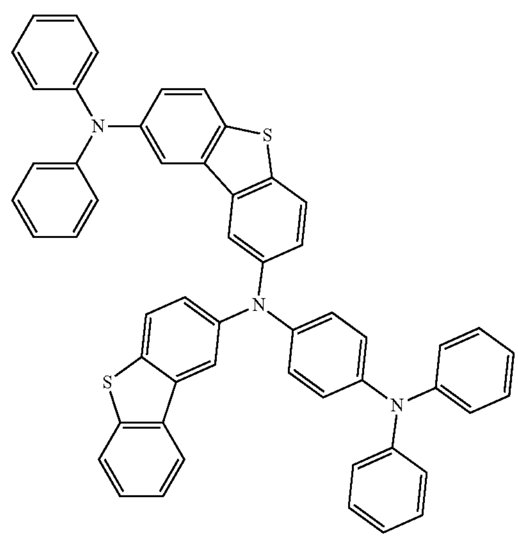

-continued
P4-128
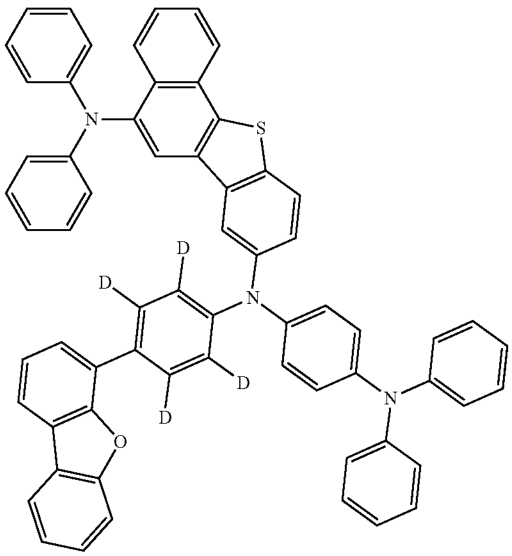
P4-129
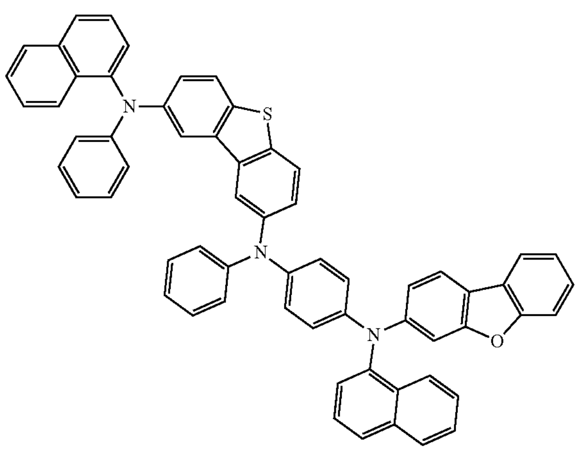
P4-130
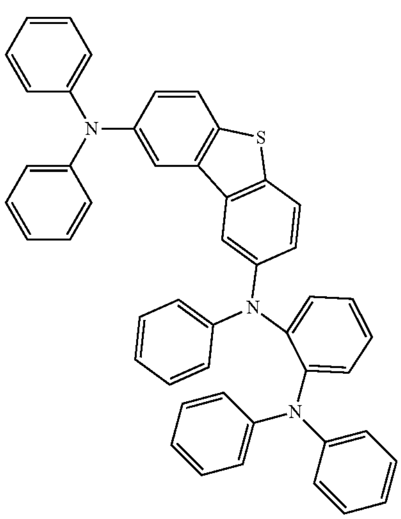
-continued
P4-131
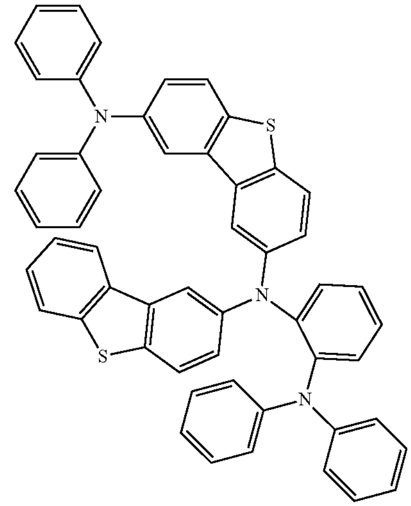
P4-132
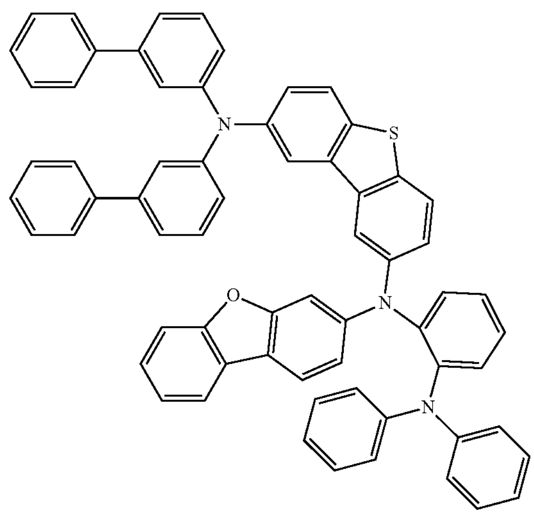
P4-133
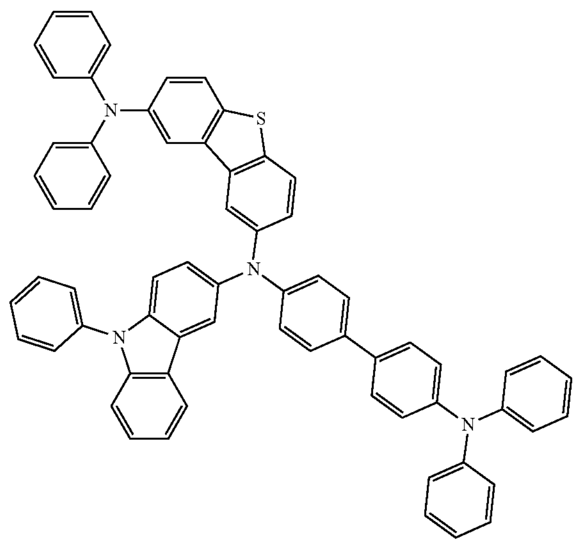

-continued
P4-134
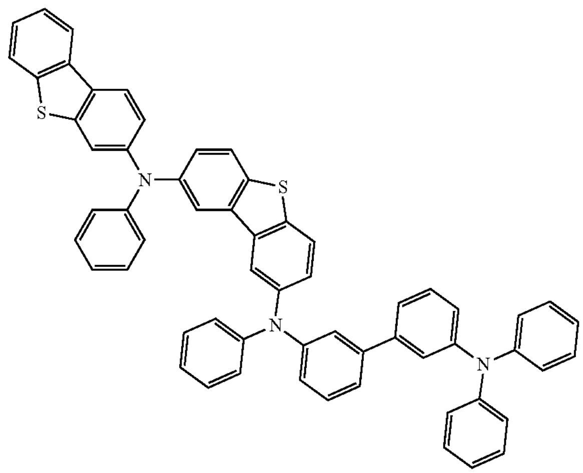
P4-136
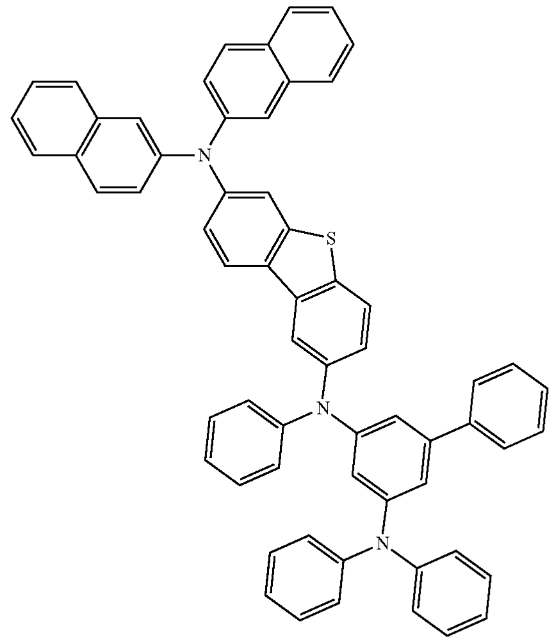
P4-135
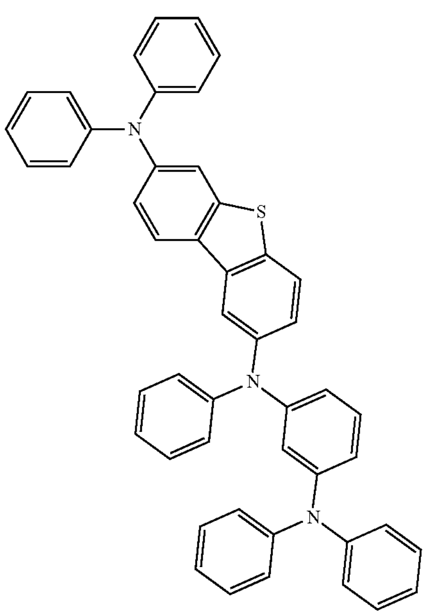
P4-137
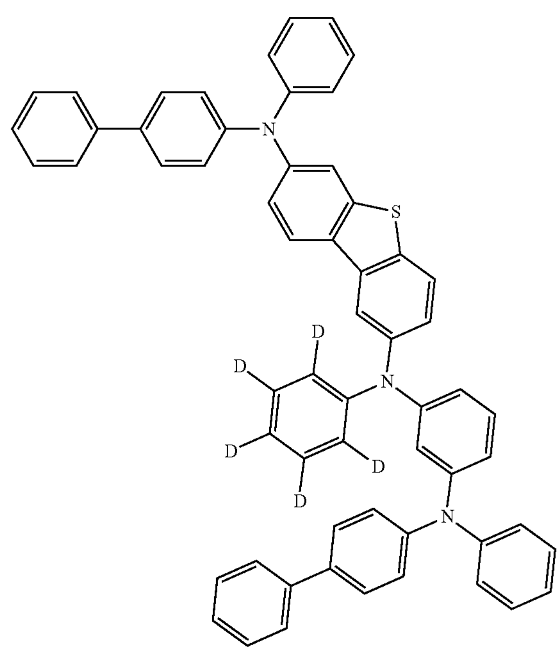

P4-138
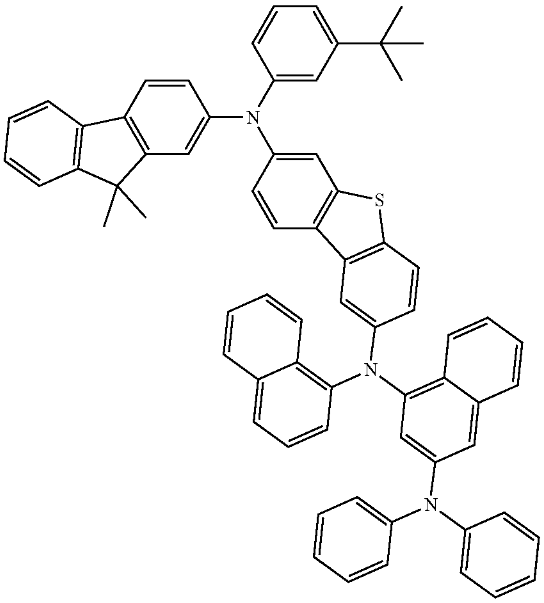
P4-139
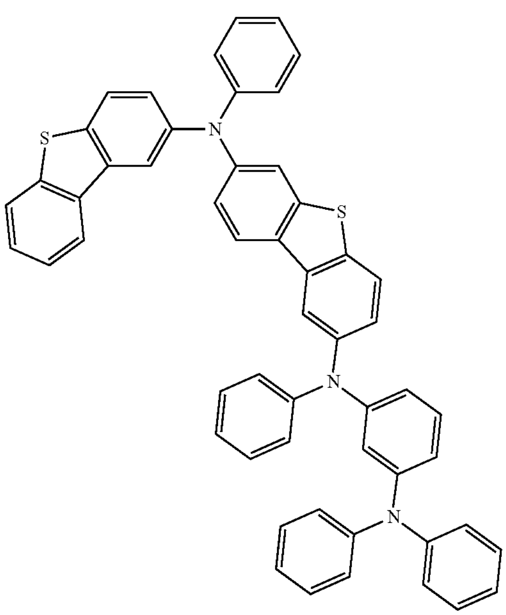
P4-140
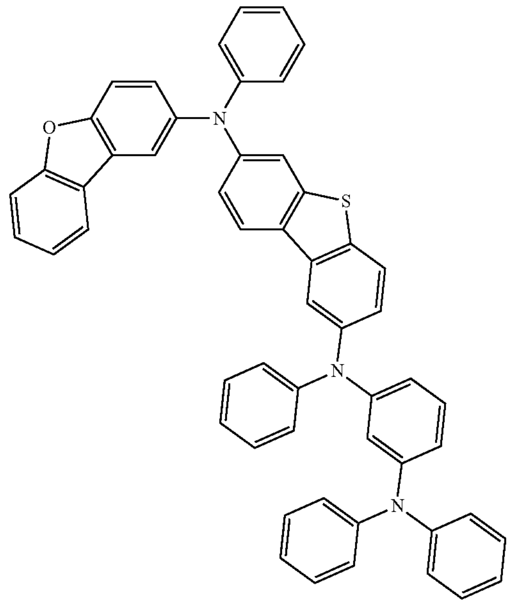
P4-141
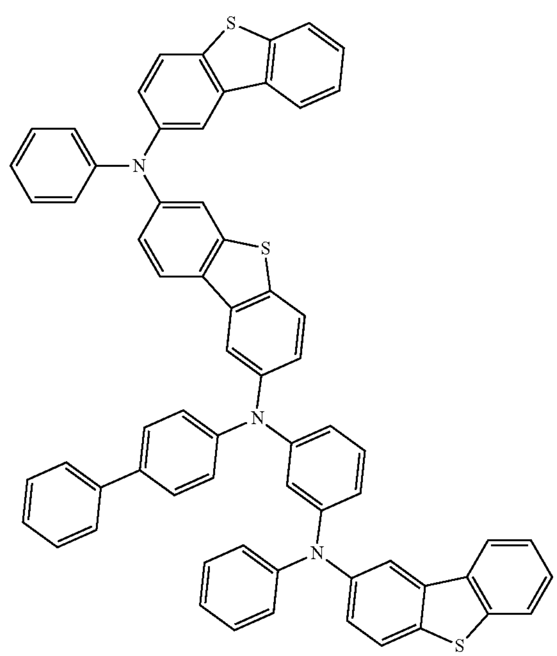

P4-142
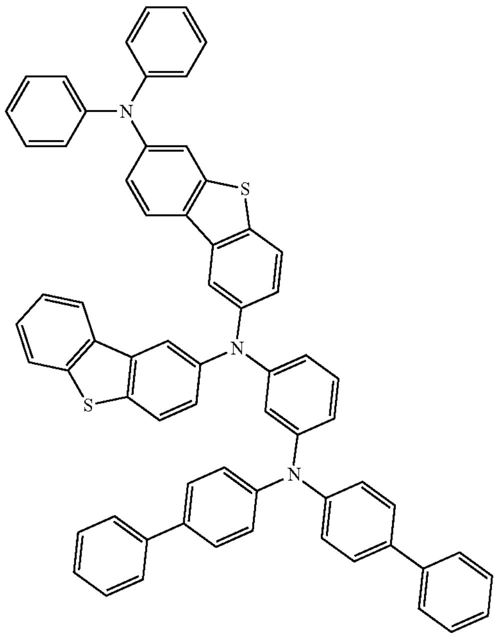
P4-143
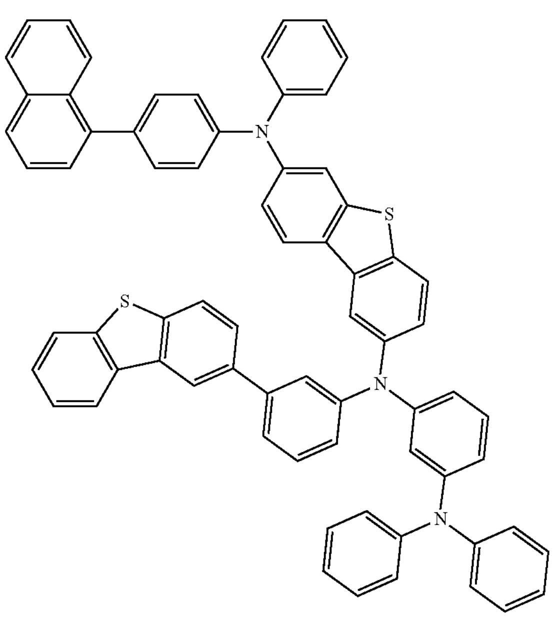
P4-144
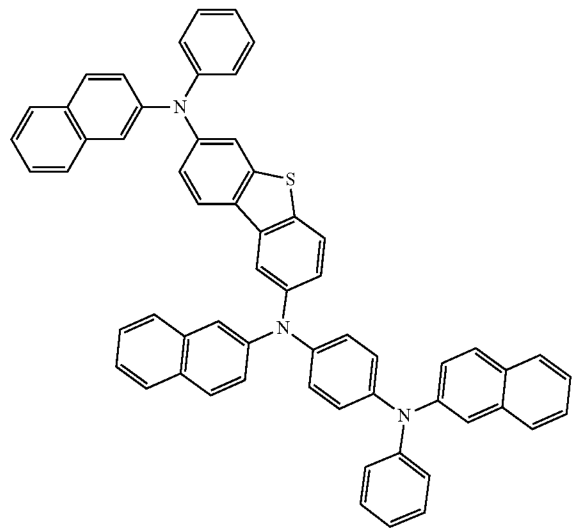
P4-145
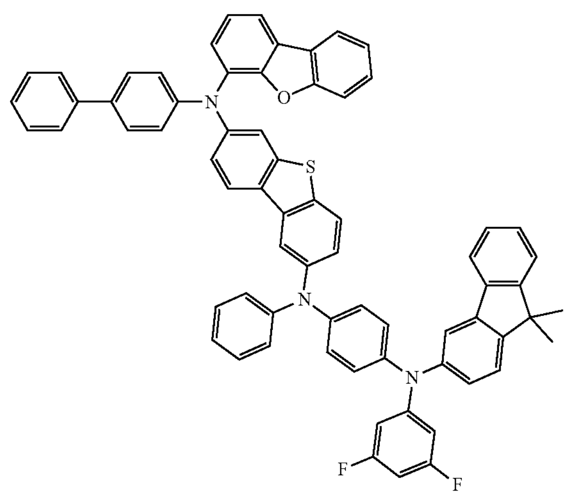
P4-146
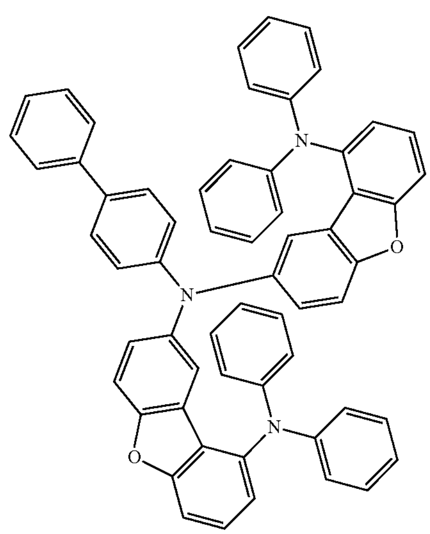

-continued
P4-147
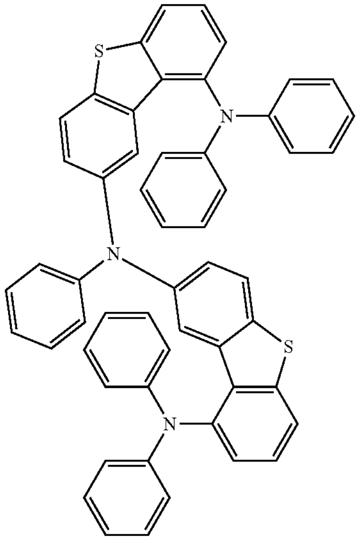
P4-148
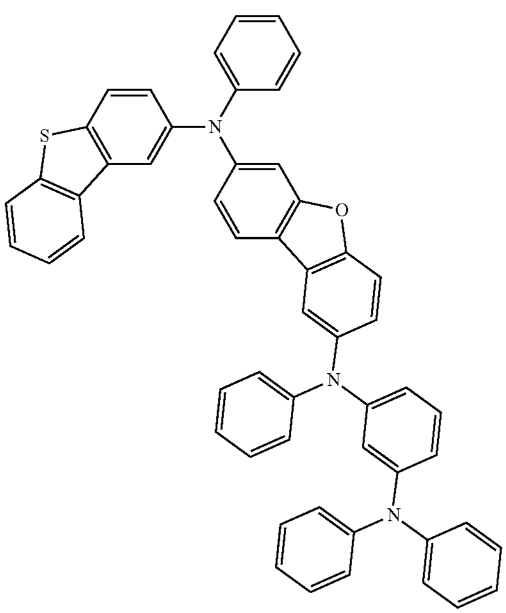
-continued
P4-149
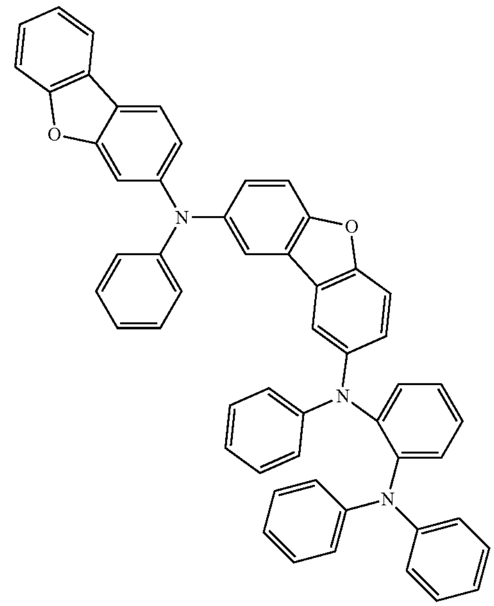
P4-150
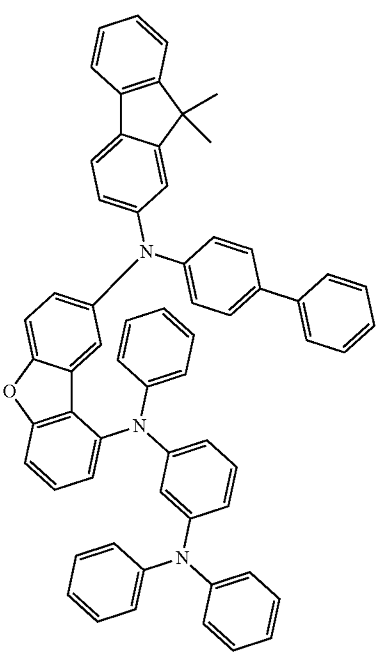

-continued
P4-151
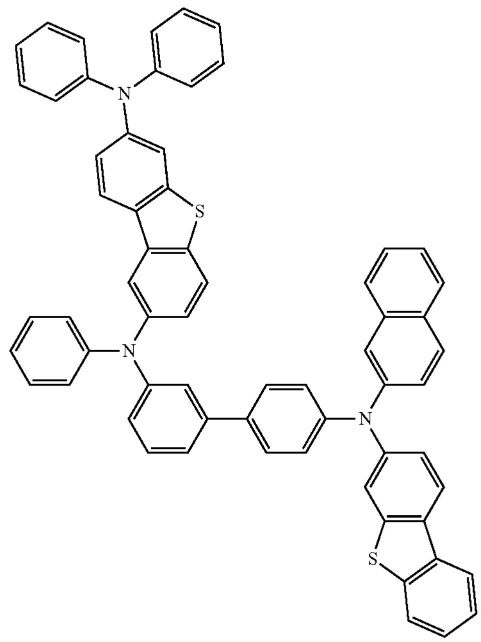
P4-152
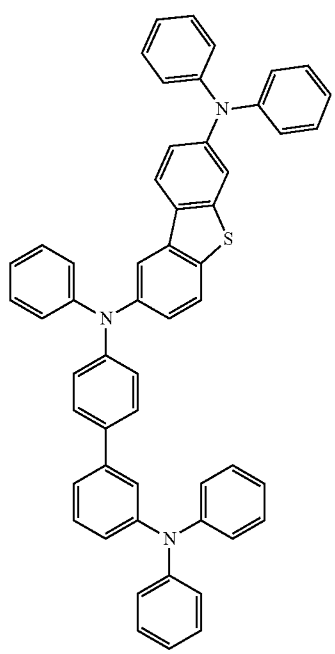
-continued
P4-153
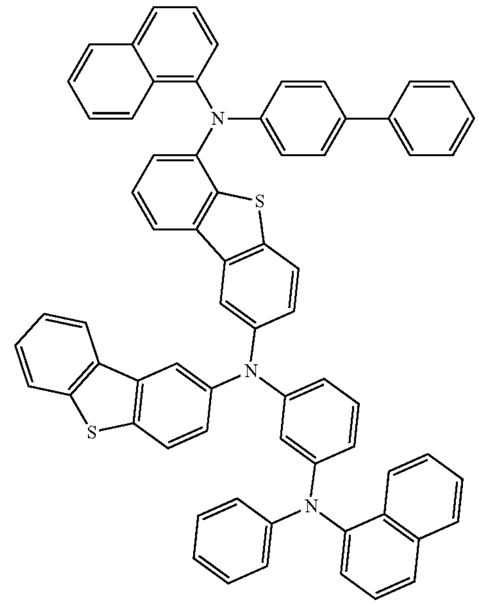
P4-154
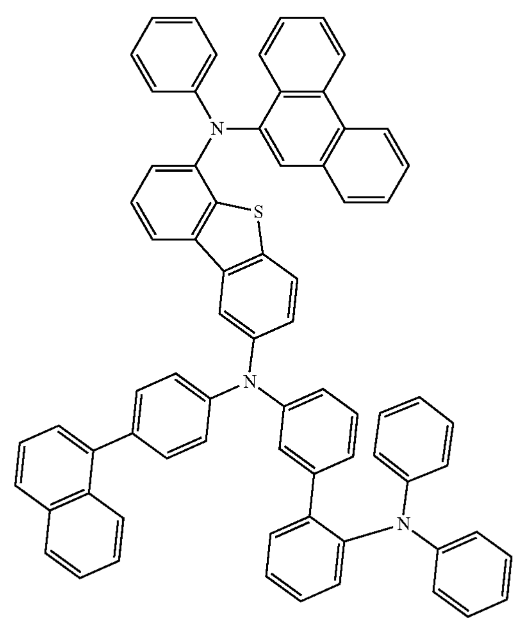

-continued
P4-155
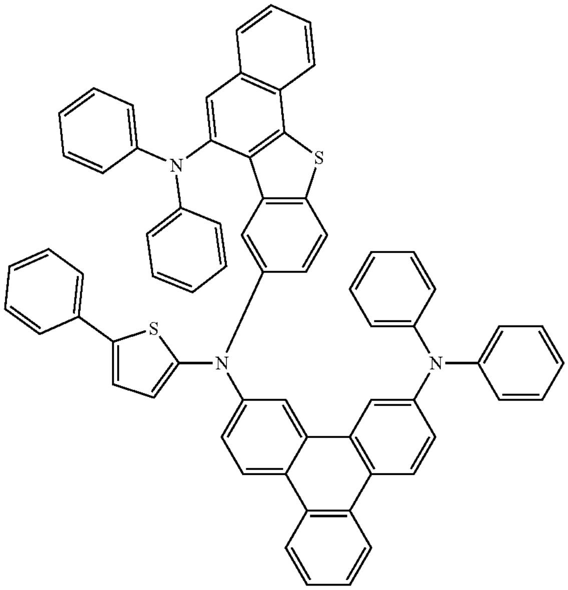
P4-156
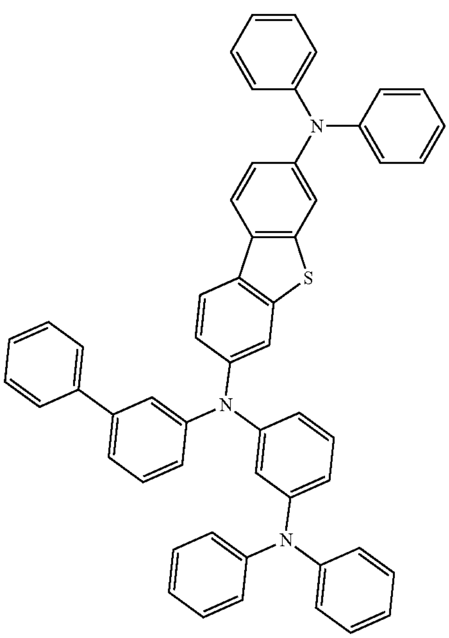
-continued
P4-157
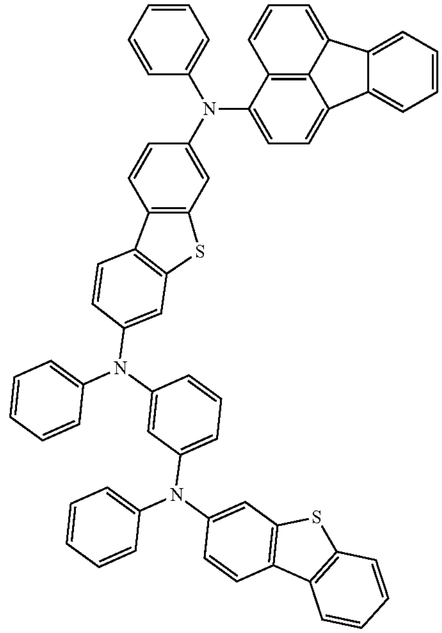
P4-158
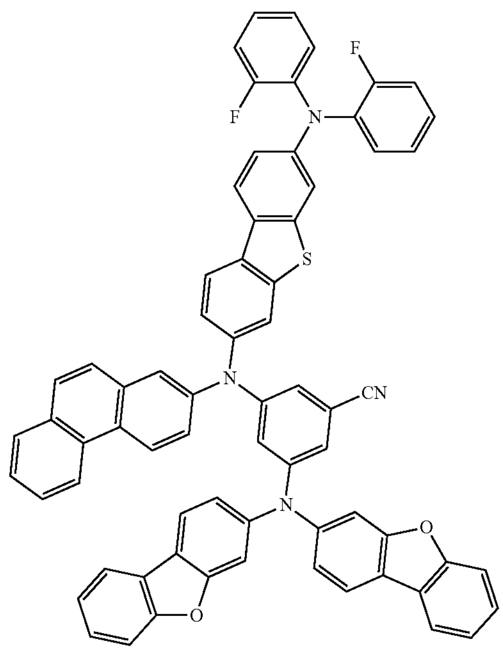

-continued
P4-159
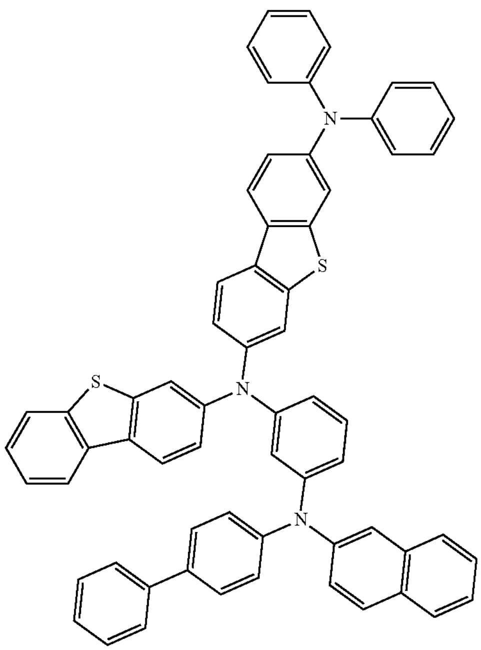
-continued
P4-161
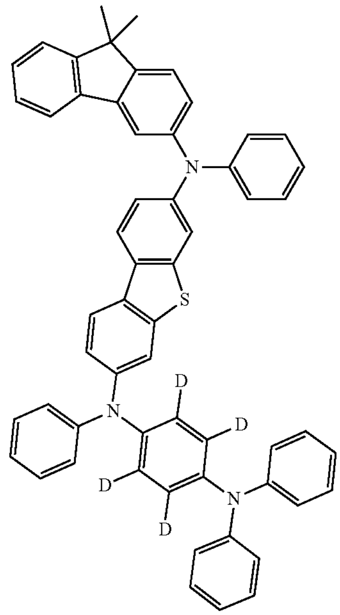
P4-160
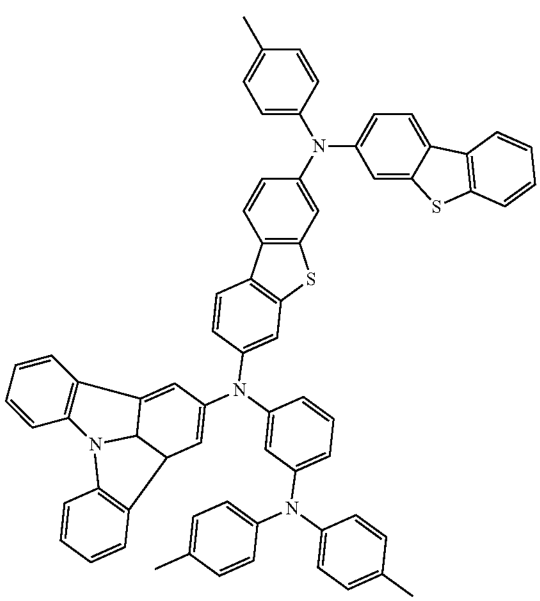
P4-162
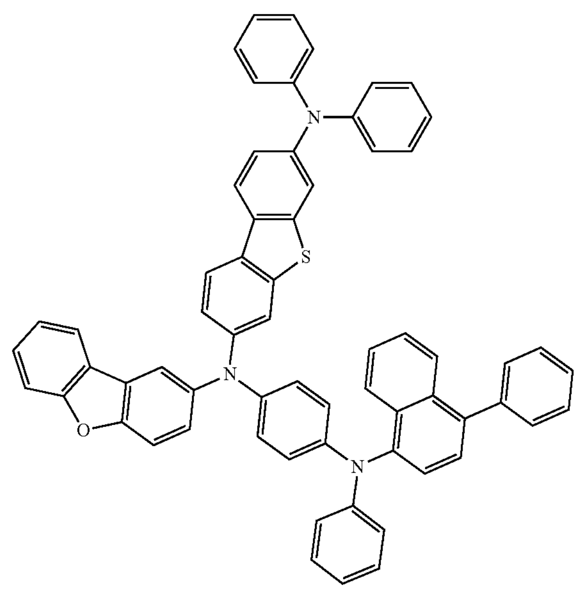

P4-163
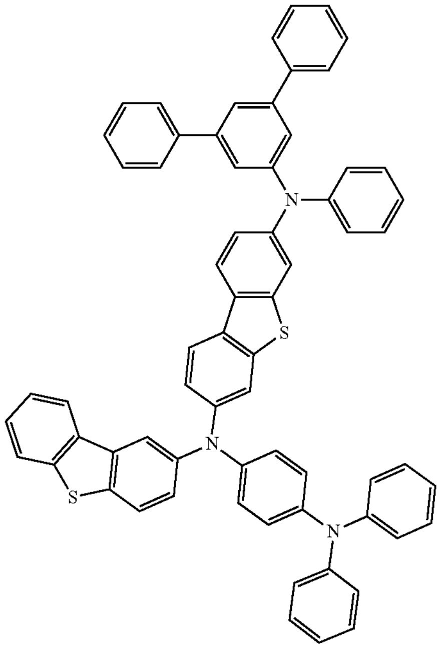
P4-164
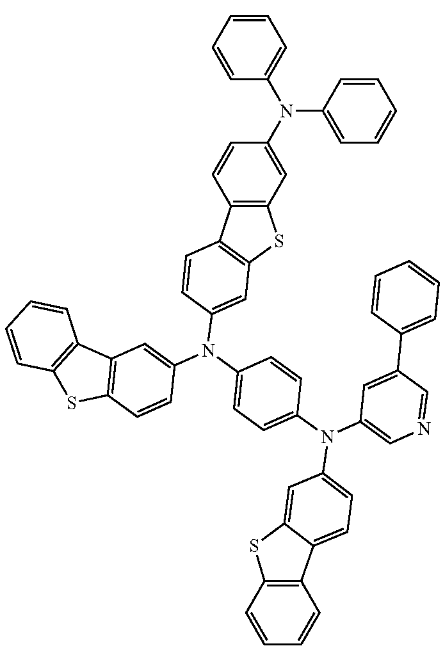
P4-165
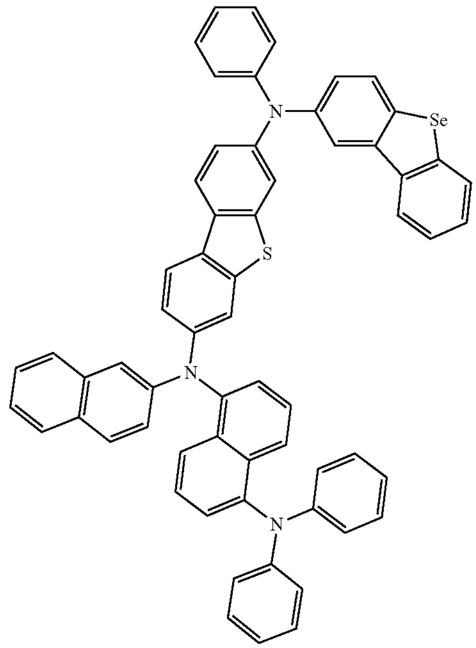
P4-166
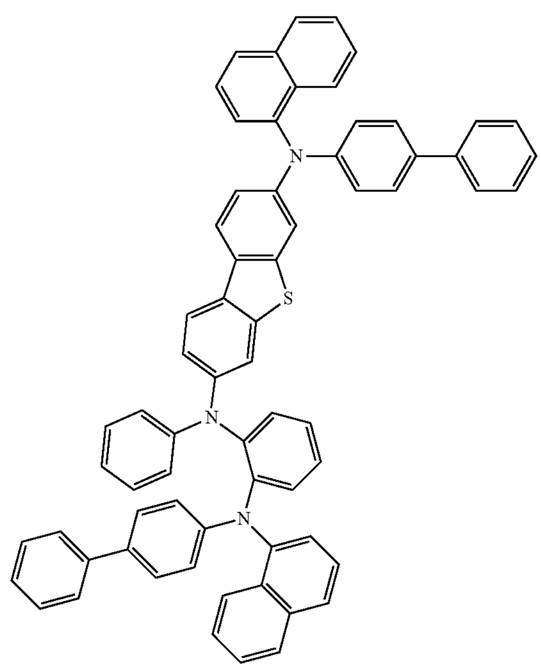

P4-167
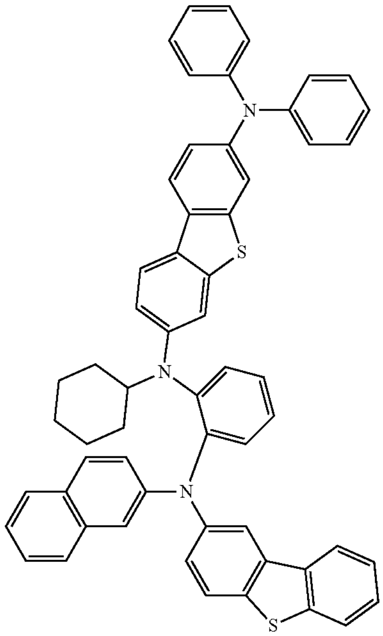
P4-169
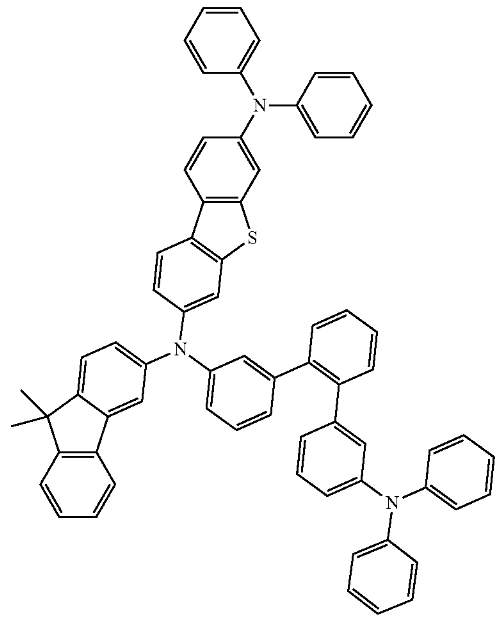
P4-168
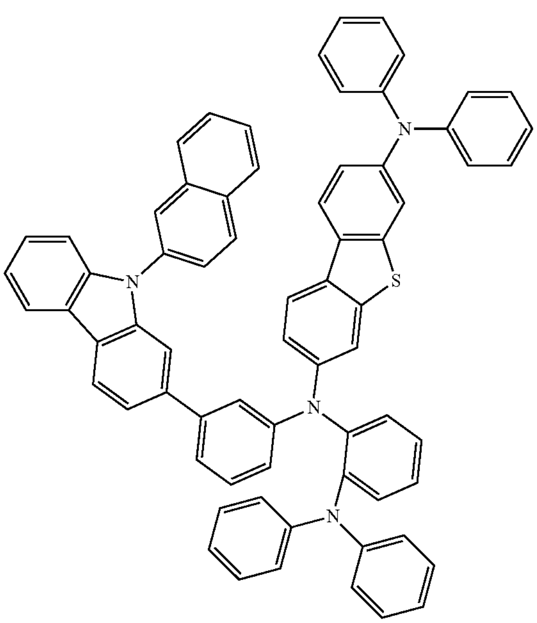
P4-170
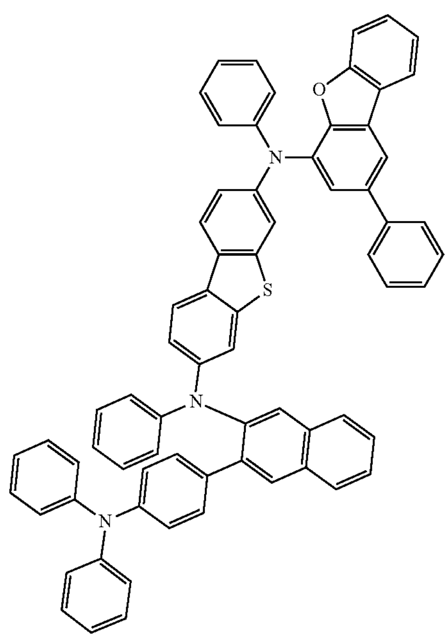

-continued
P4-171
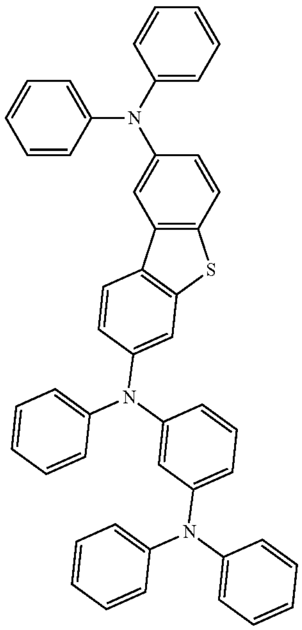
P4-172
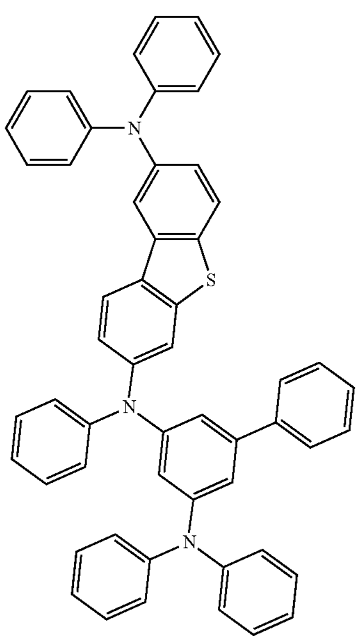
-continued
P4-173
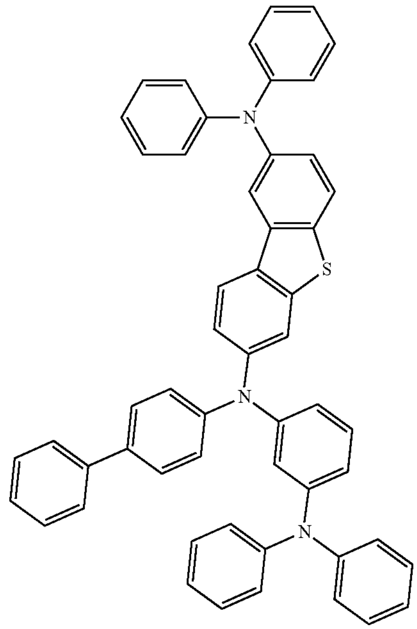
P4-174
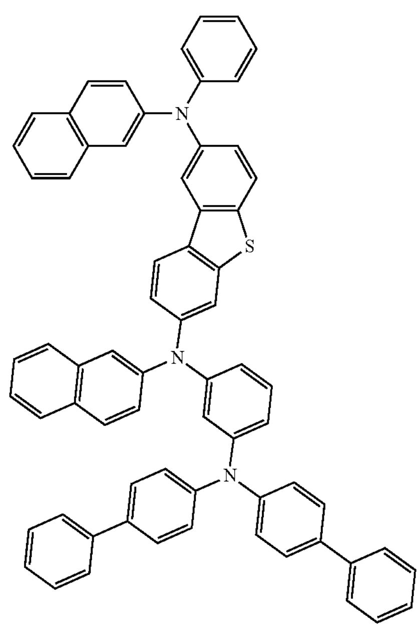

P4-175
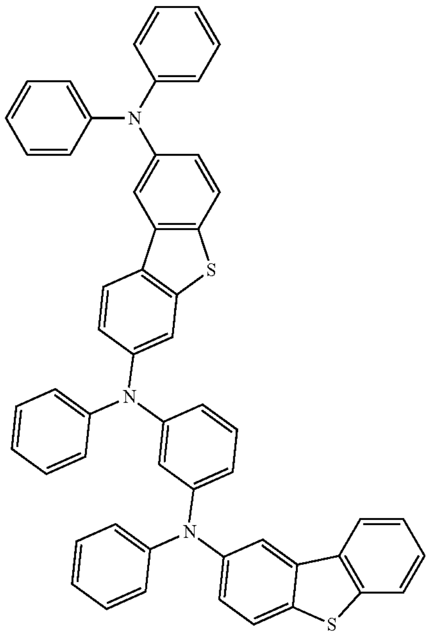
P4-177
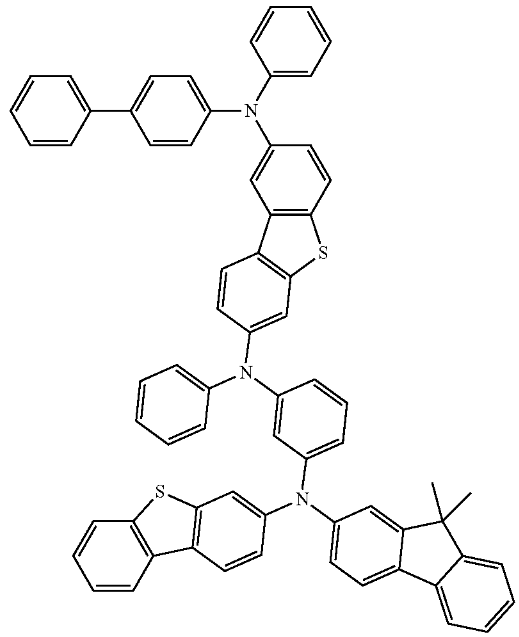
P4-176
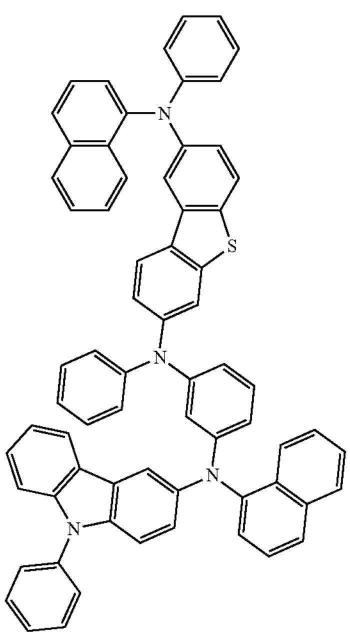
P4-178
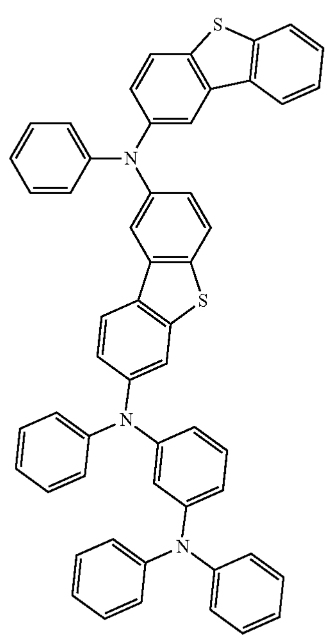

P4-179
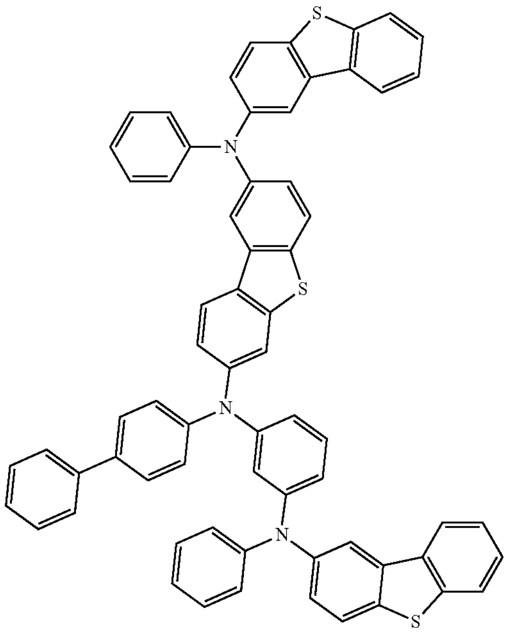
P4-180
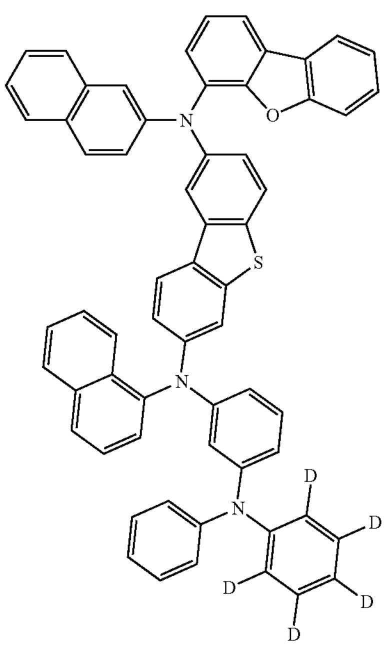
P4-181
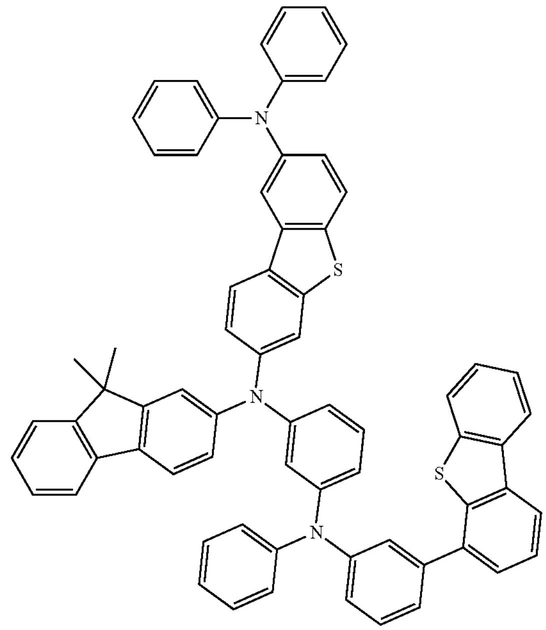
P4-182
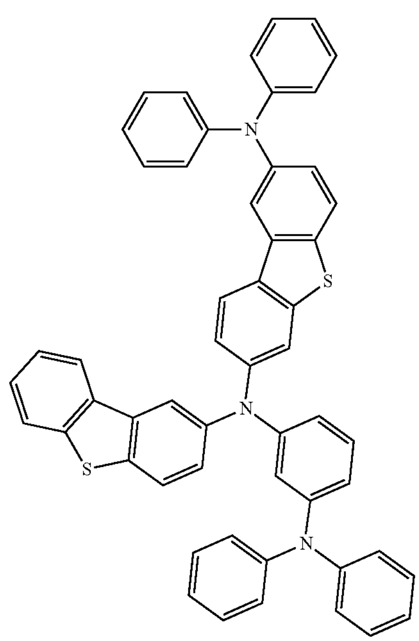

-continued
P4-183
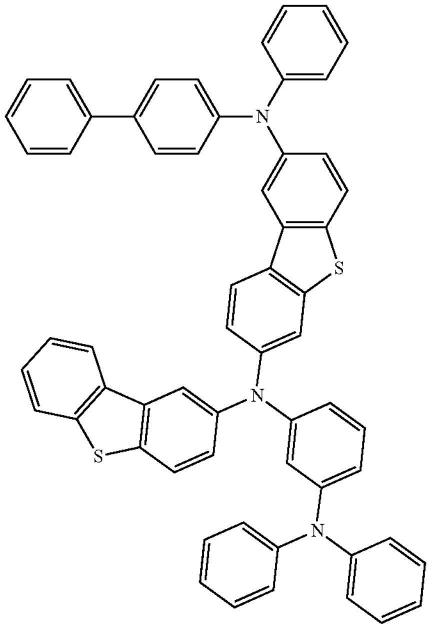
P4-184
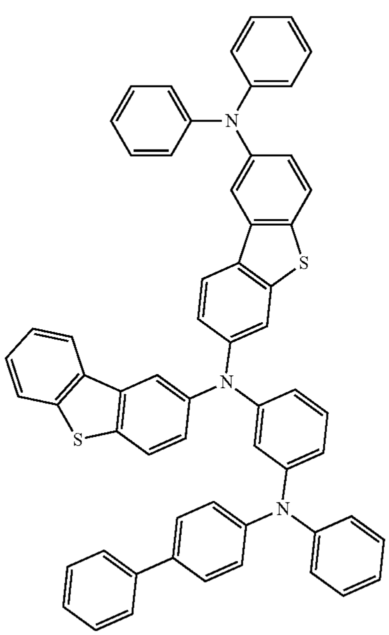
-continued
P4-185
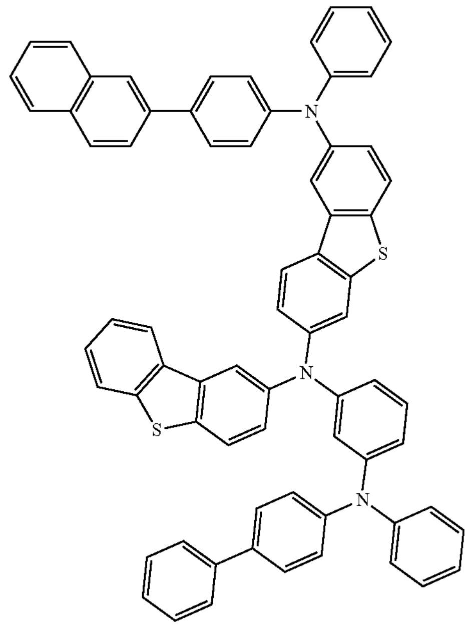
P4-186
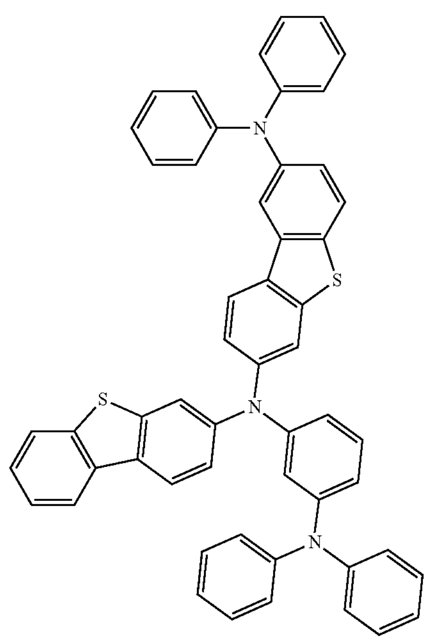

P4-187
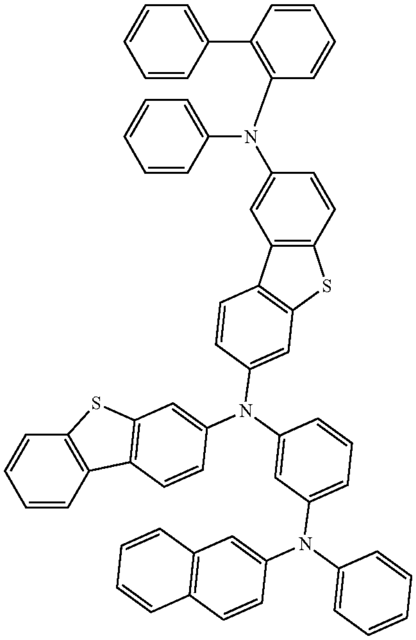
P4-189
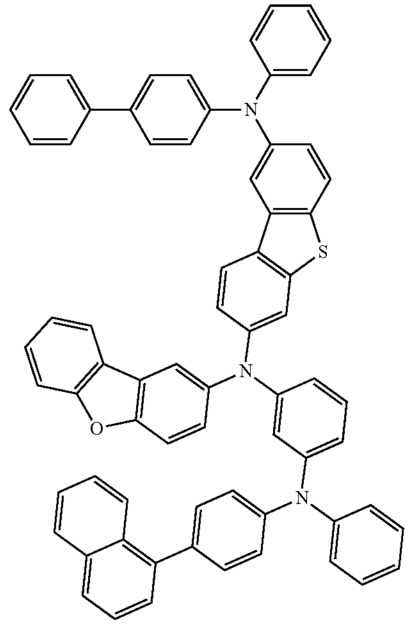
P4-188
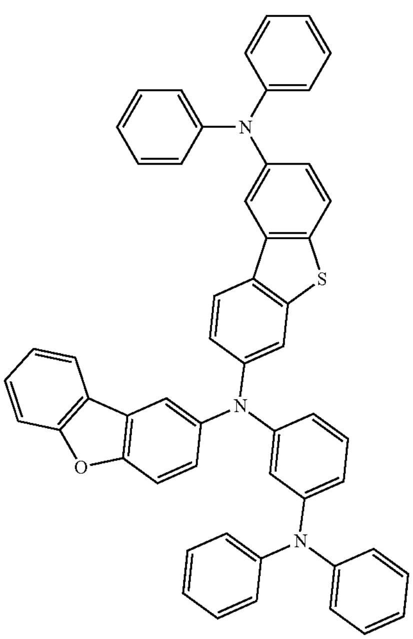
P4-190
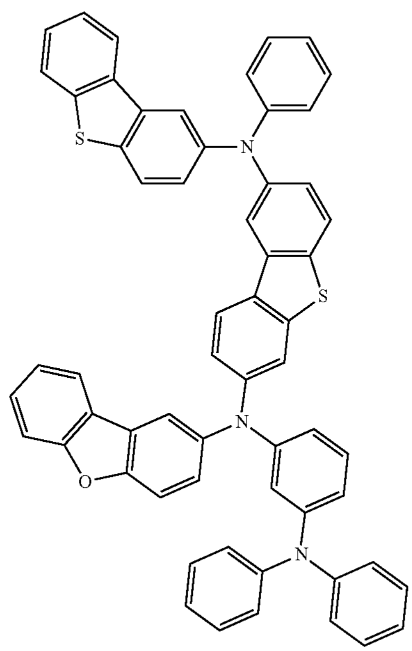

-continued
P4-191
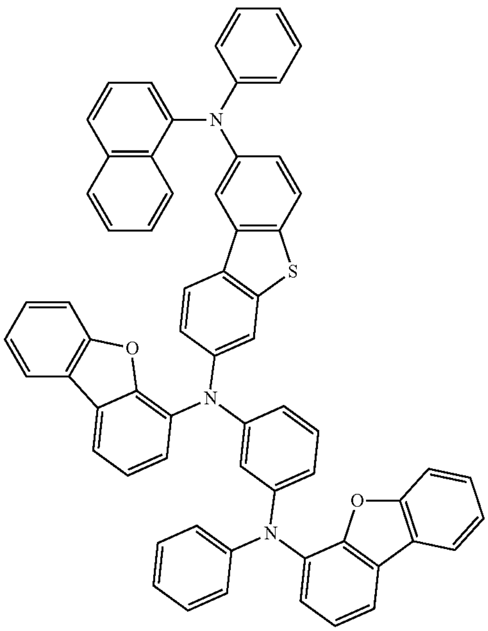
P4-192
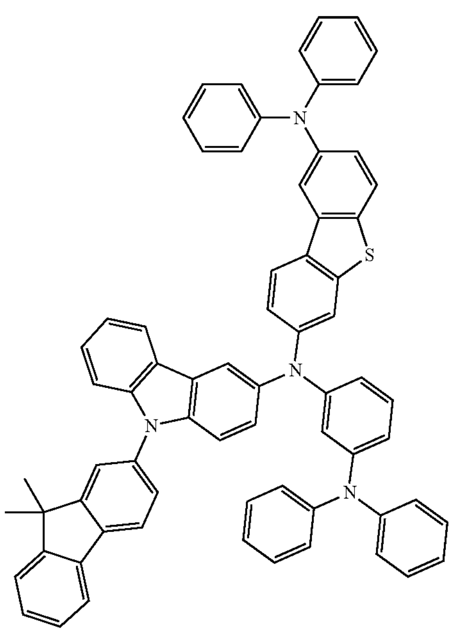
-continued
P4-193
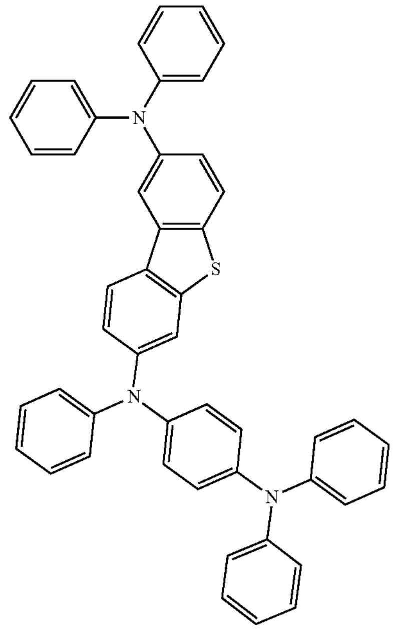
P4-194
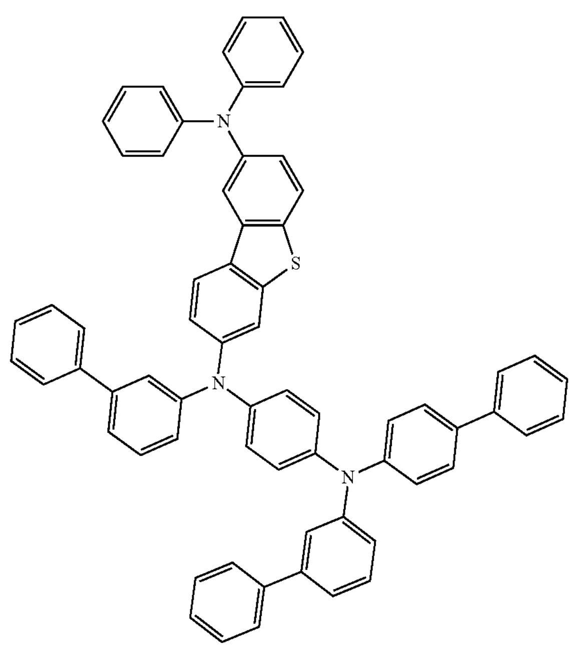

-continued
P4-195
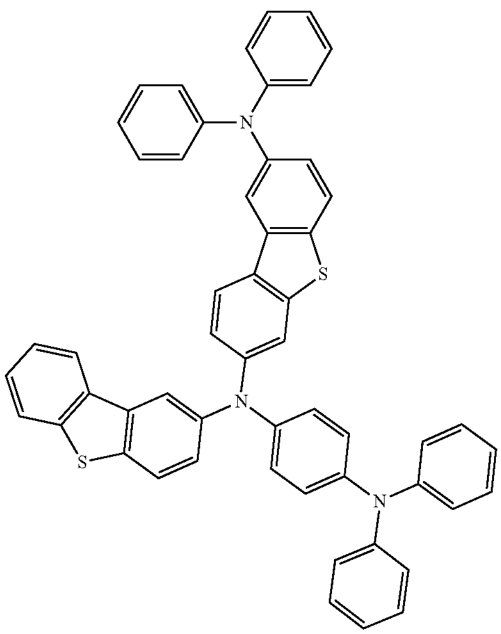
P4-196
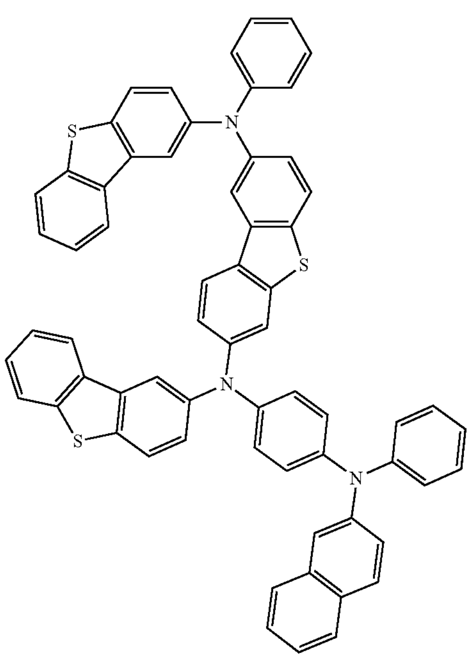
-continued
P4-197
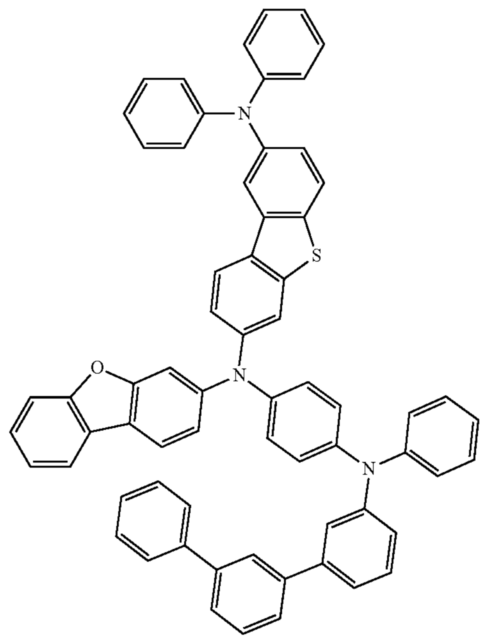
P4-198
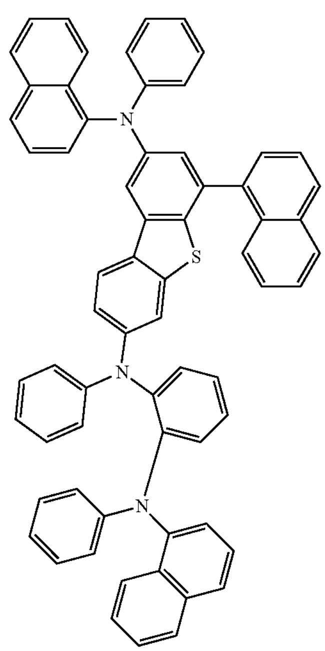

P4-199
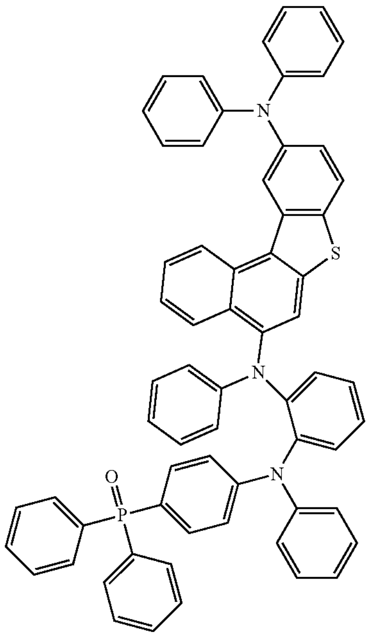
P4-200
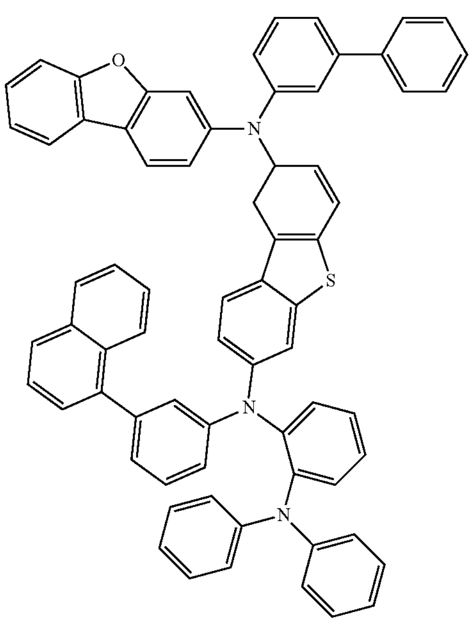
P4-201
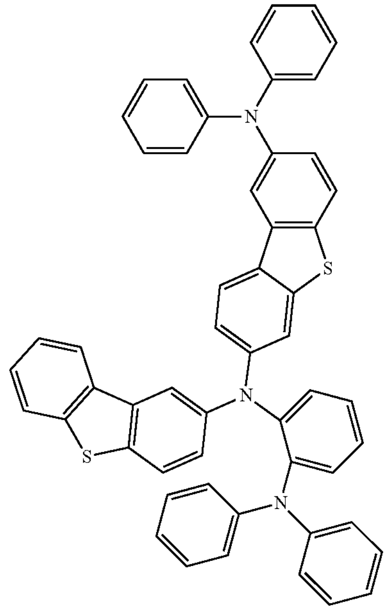
P4-202
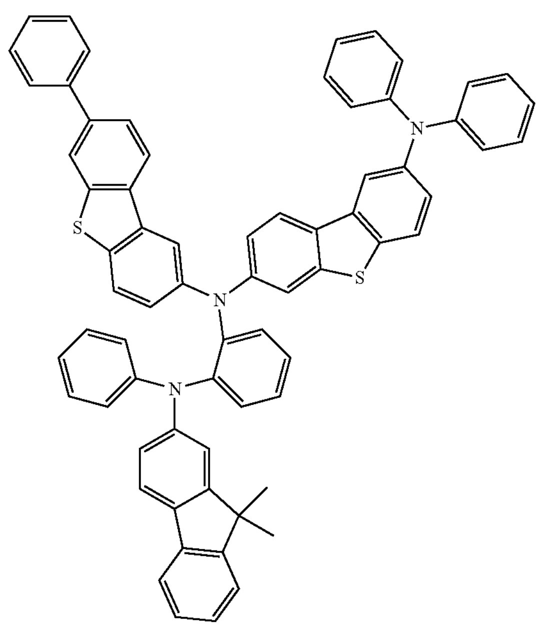

-continued
P4-203
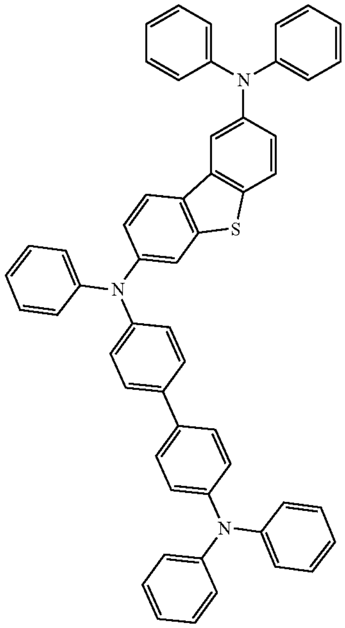
P4-204
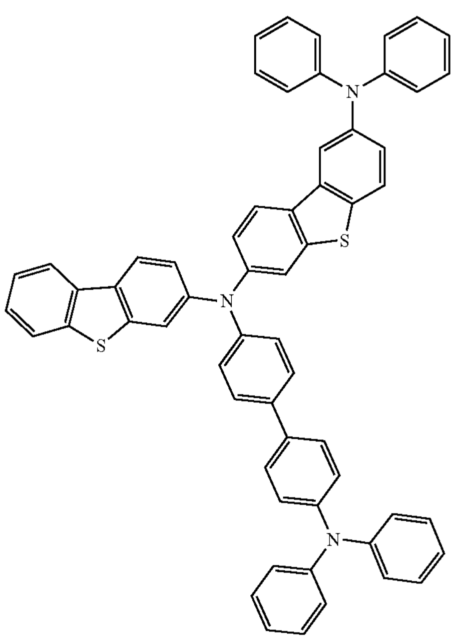
-continued
P4-205
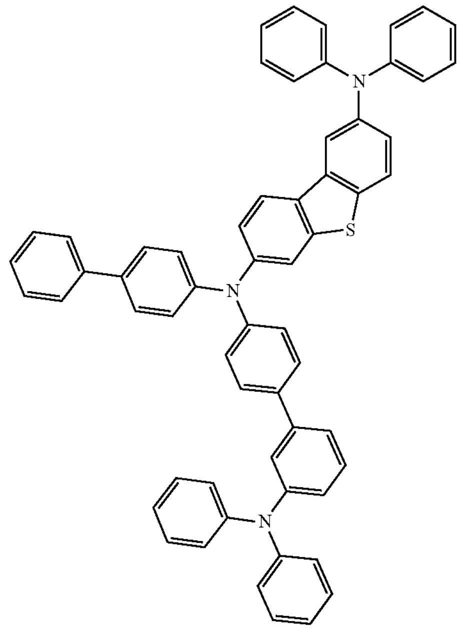
P4-206
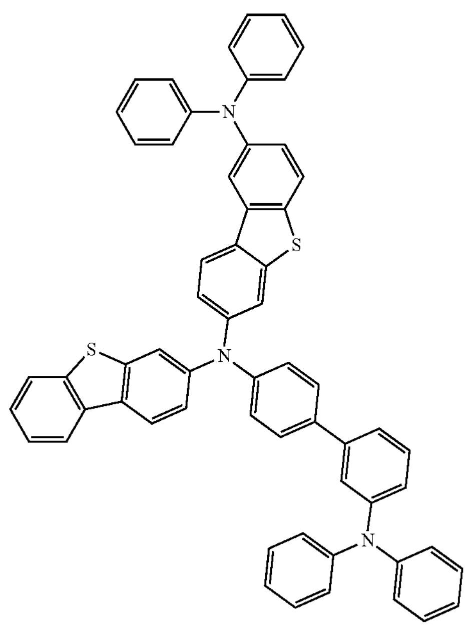

-continued
P4-207
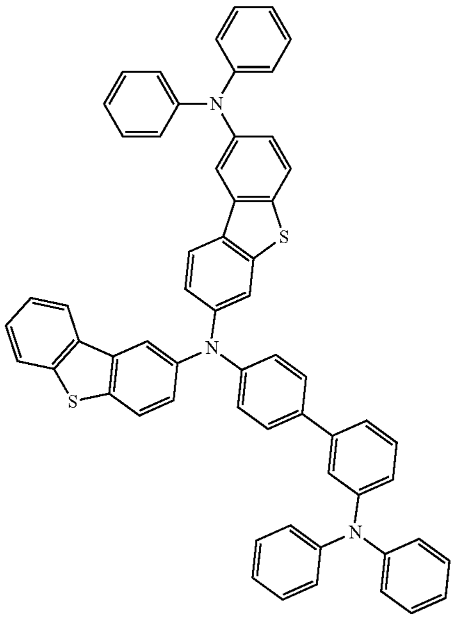
P4-208
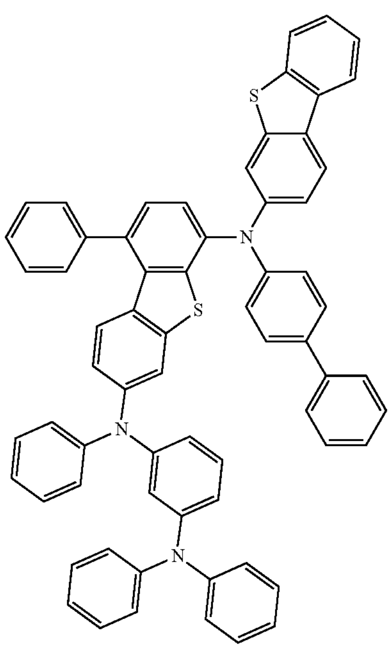
-continued
P4-209
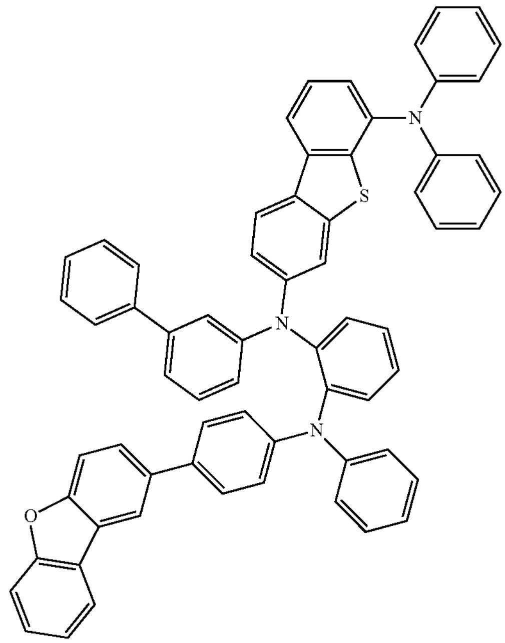
P4-210
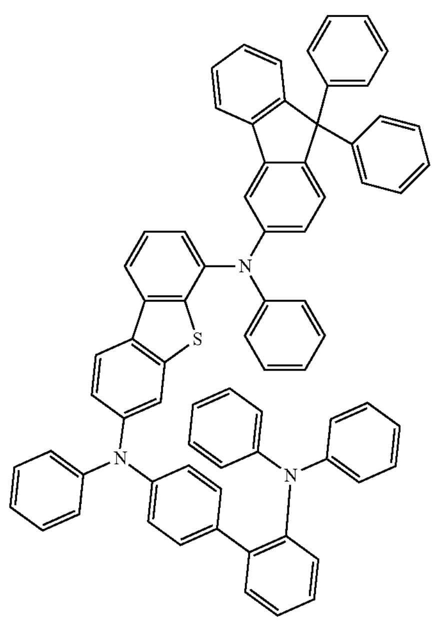

P4-211
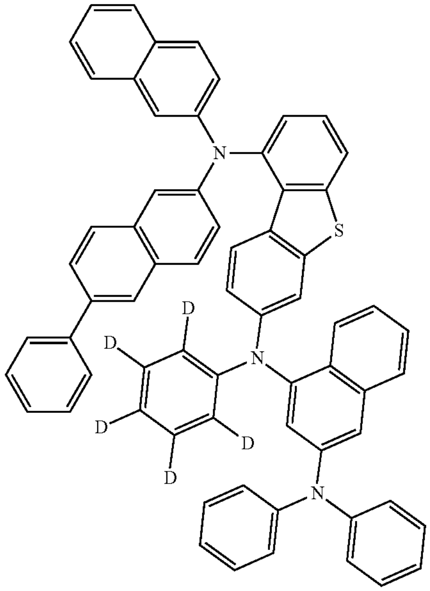
P4-212
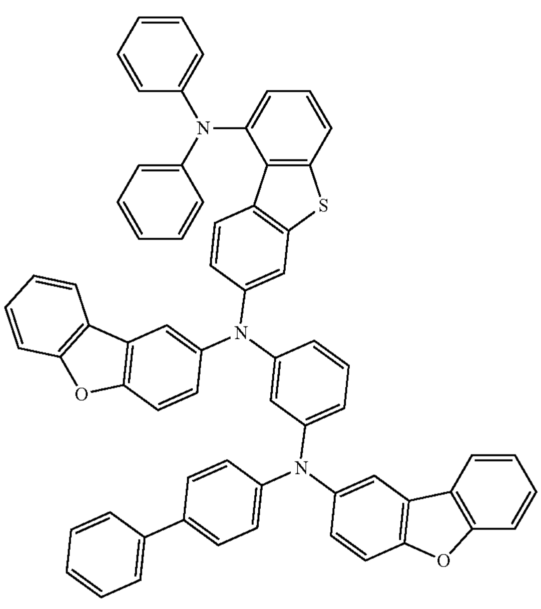
P4-213
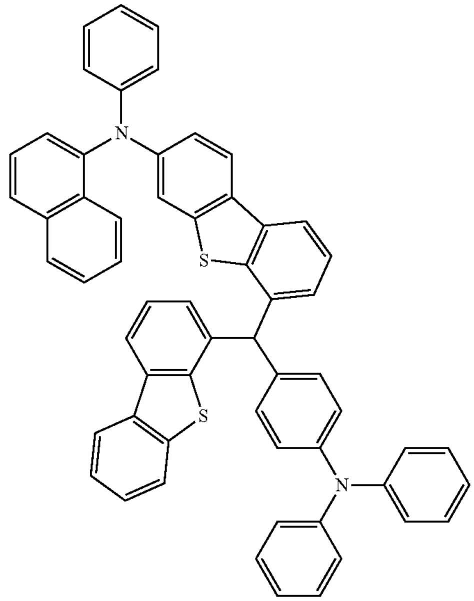
P4-214
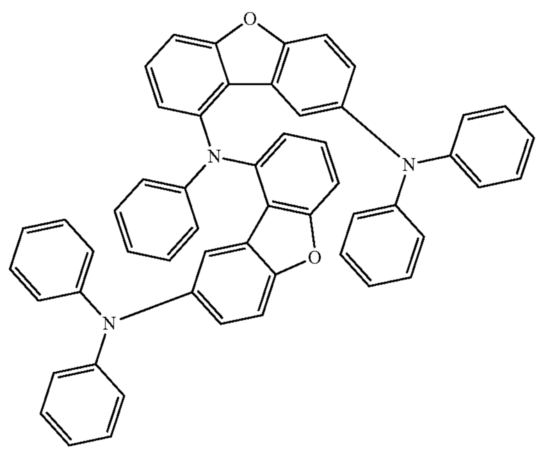
P4-215
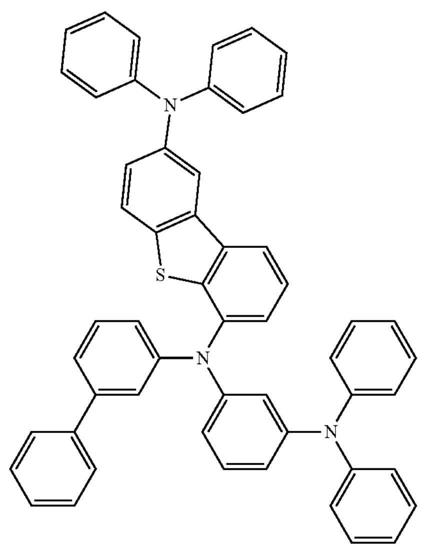

-continued
P4-216
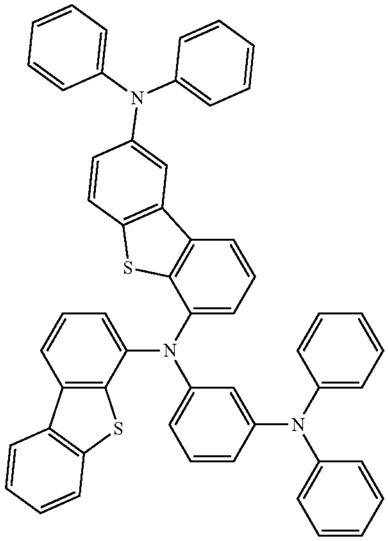
P4-217
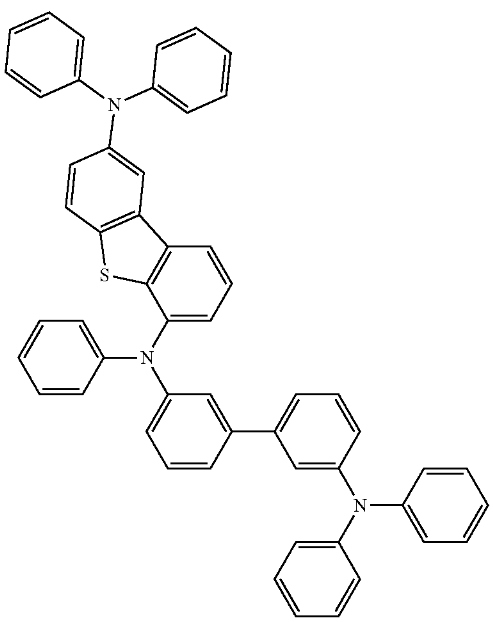
P4-218
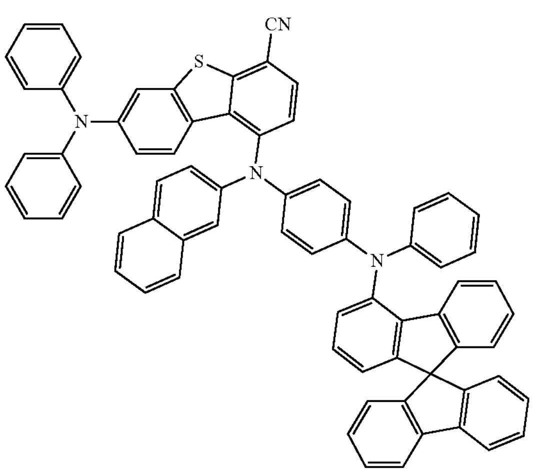
-continued
P4-219
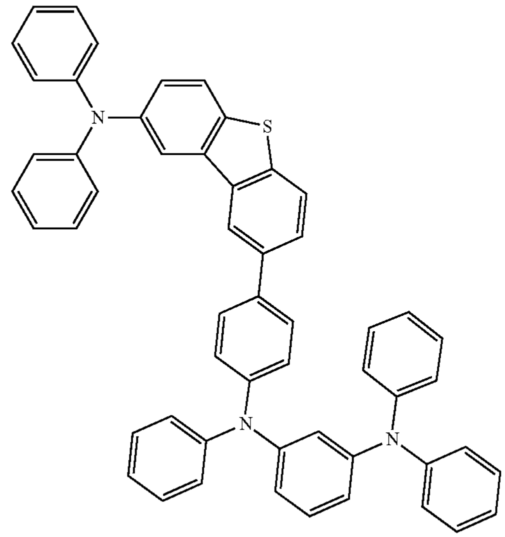
P4-220
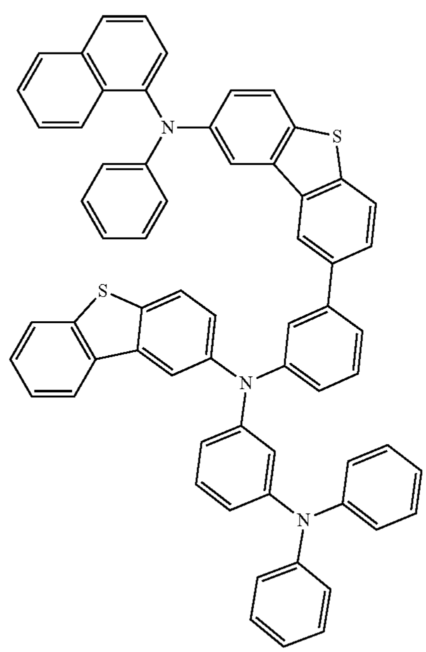

-continued
P4-221
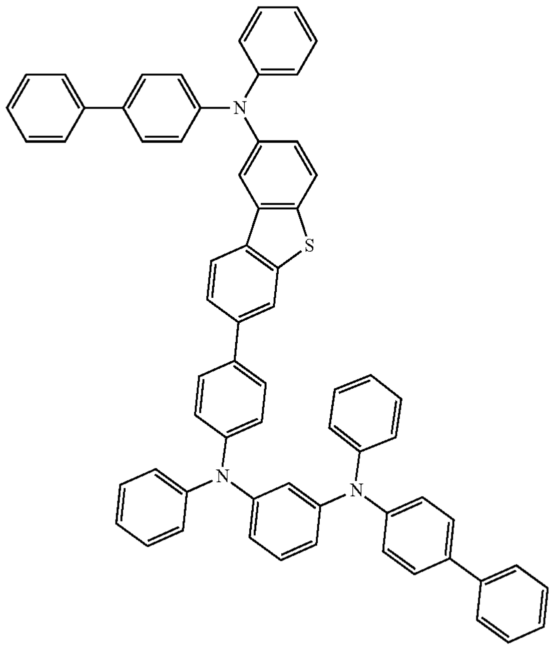
P4-222
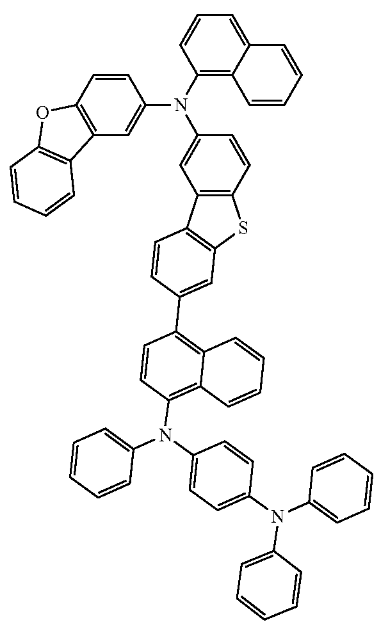
-continued
P4-223
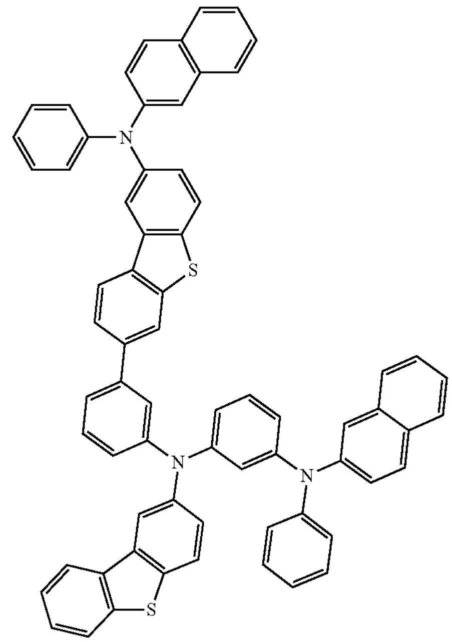
P4-224
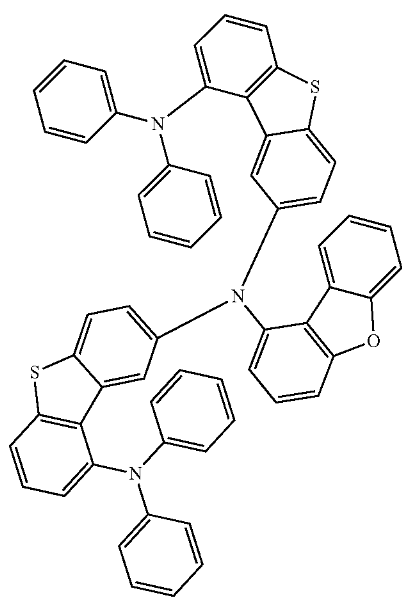

P4-225
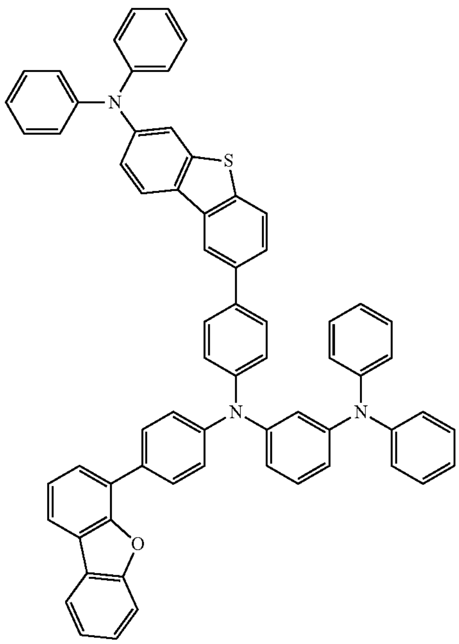
P4-226
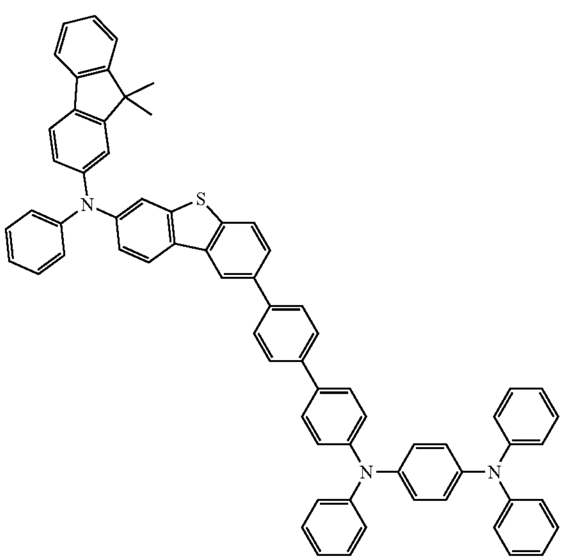
P4-227
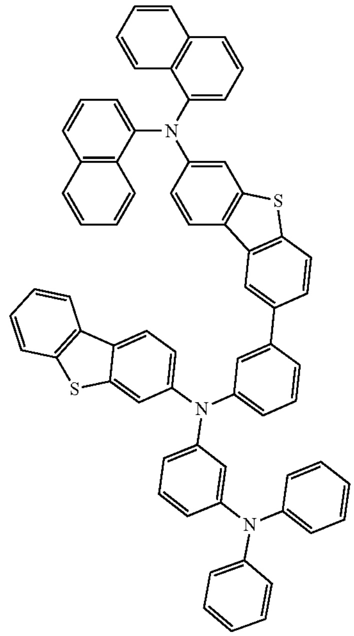
P4-228
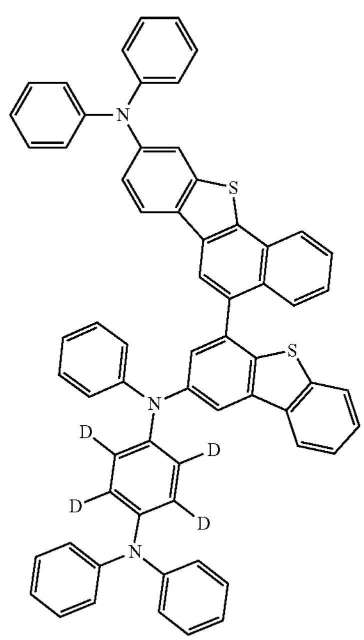

-continued
P4-229
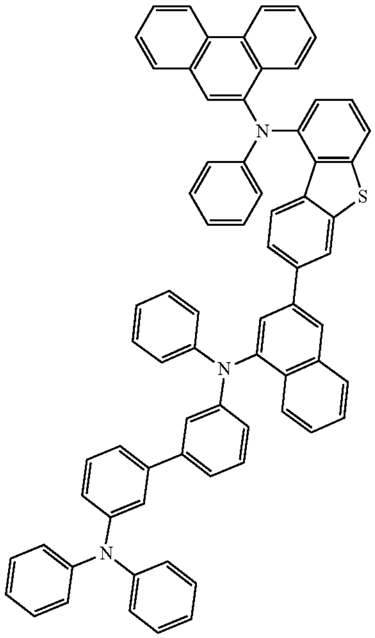
P4-230
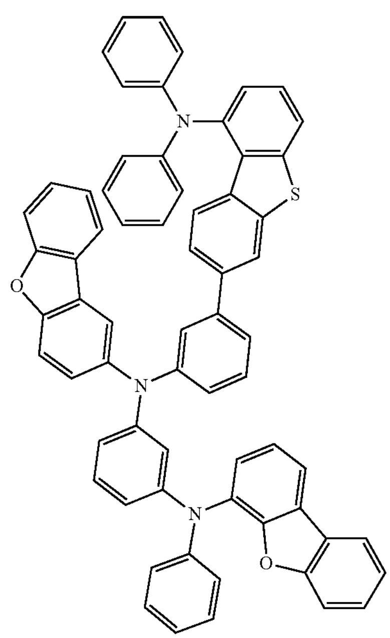
-continued
P4-231
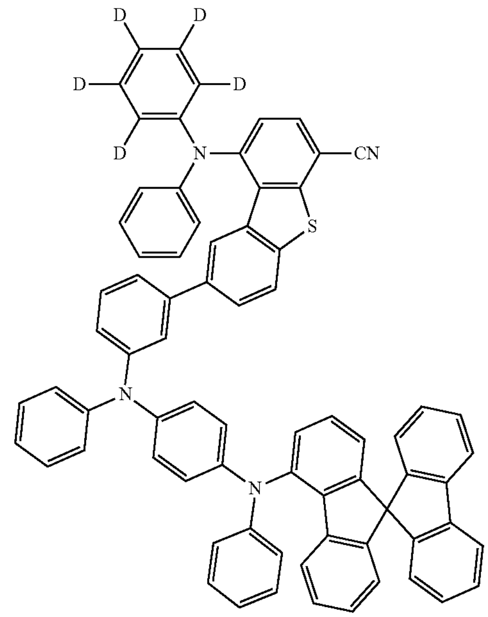
P4-232
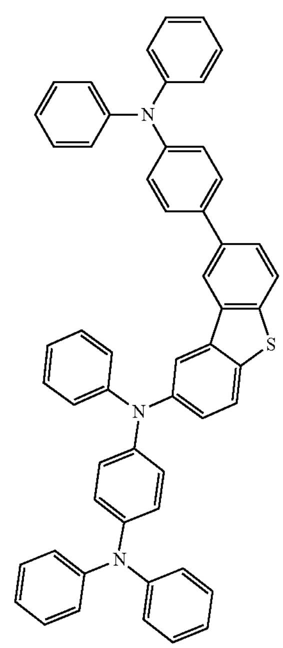

P4-233
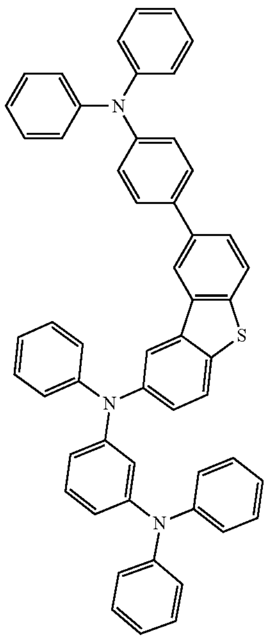
P4-234
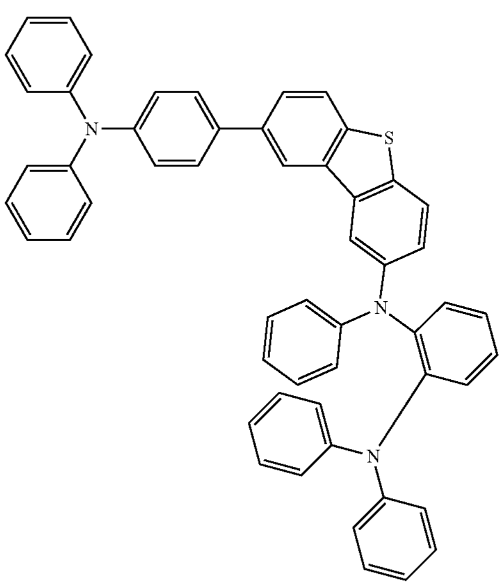
P4-235
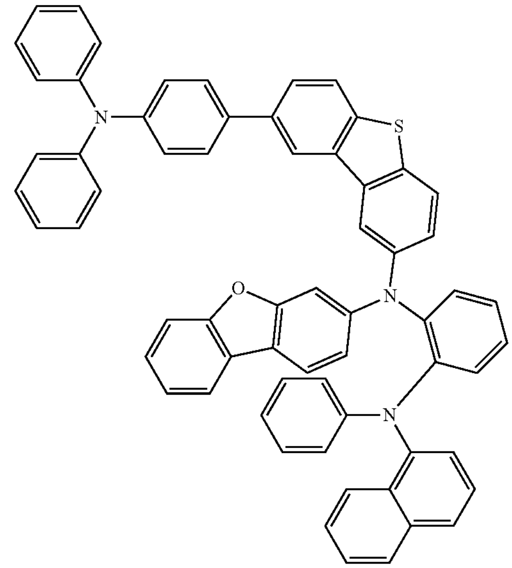
P4-236
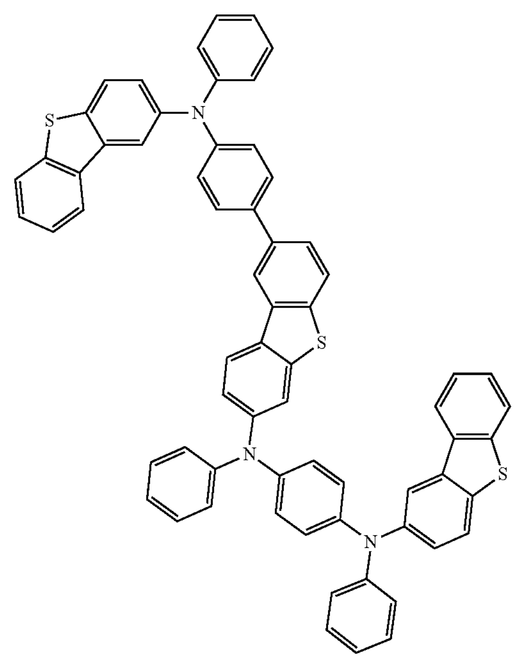

P4-237
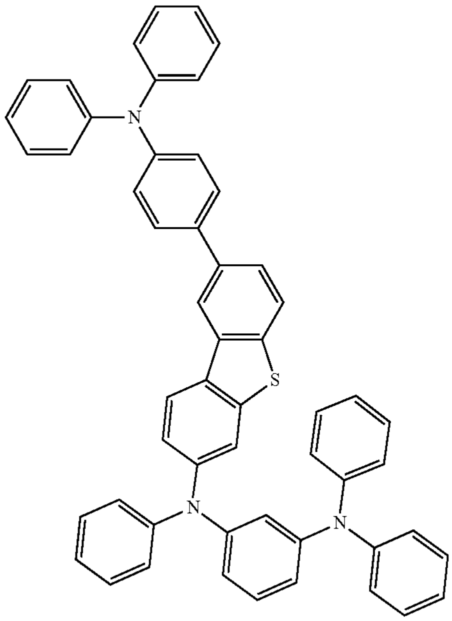
P4-238
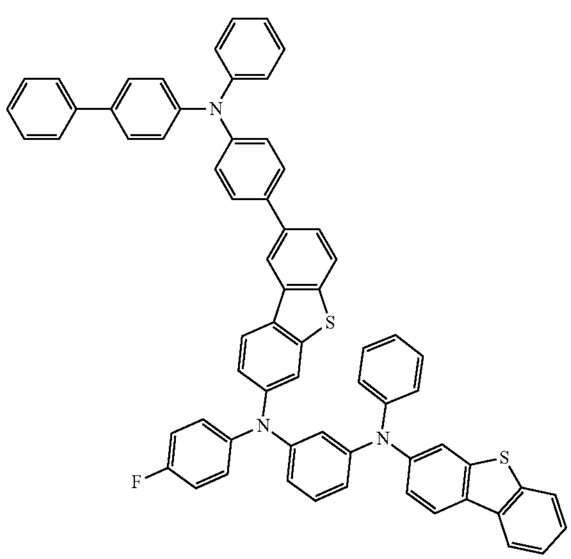
P4-239
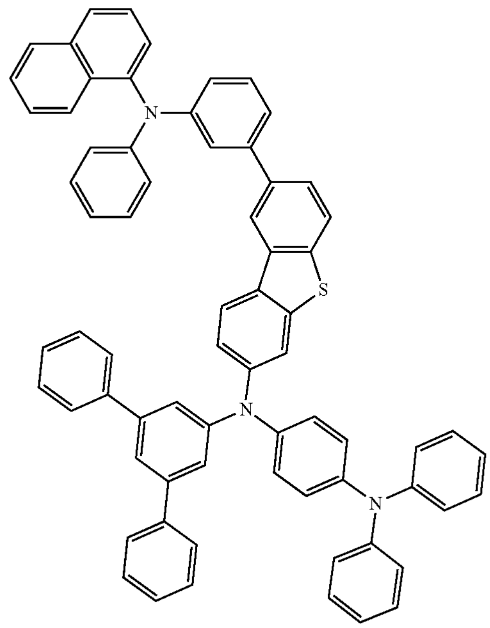
P4-240
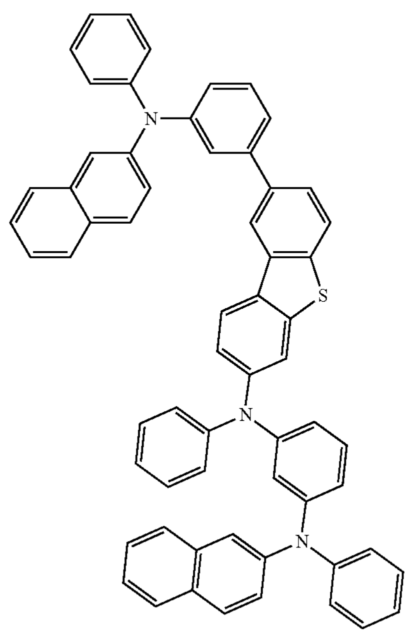

-continued
P4-241
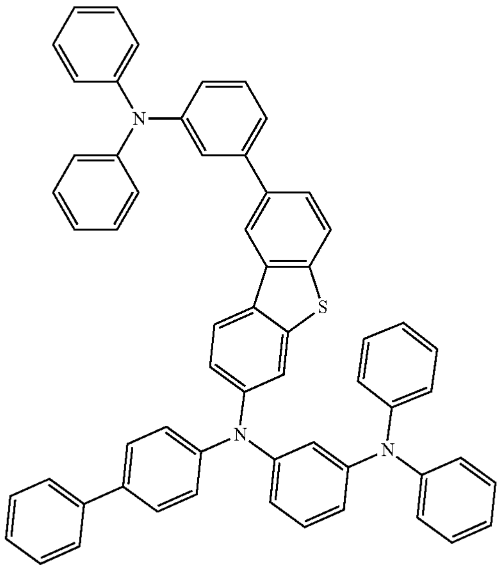
P4-242
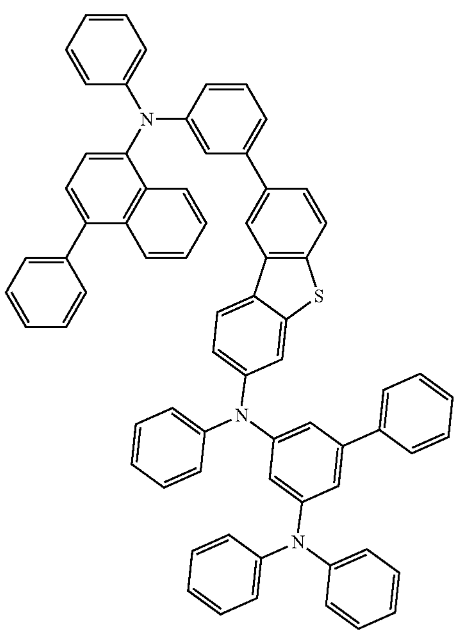
-continued
P4-243
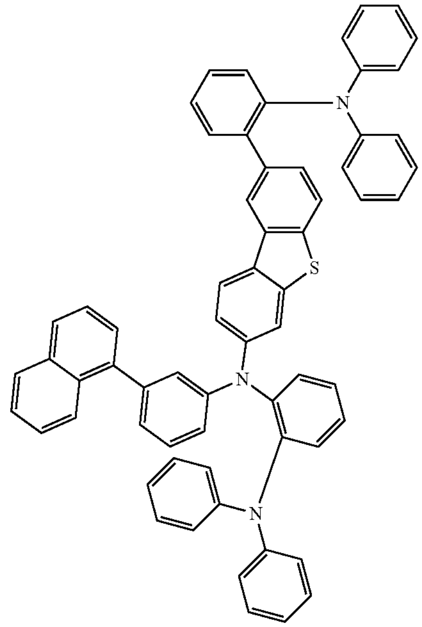
P4-244
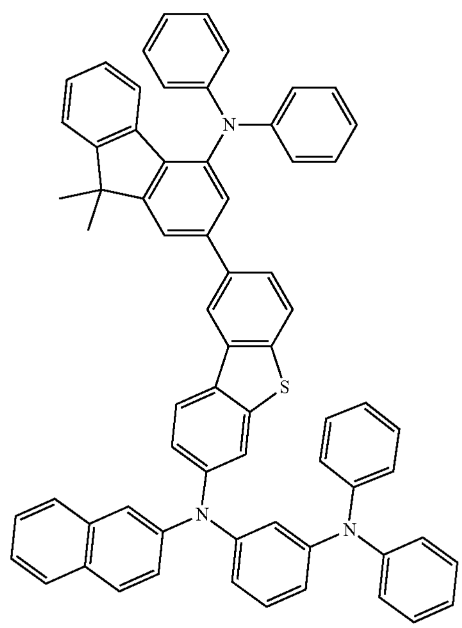

-continued
P4-245
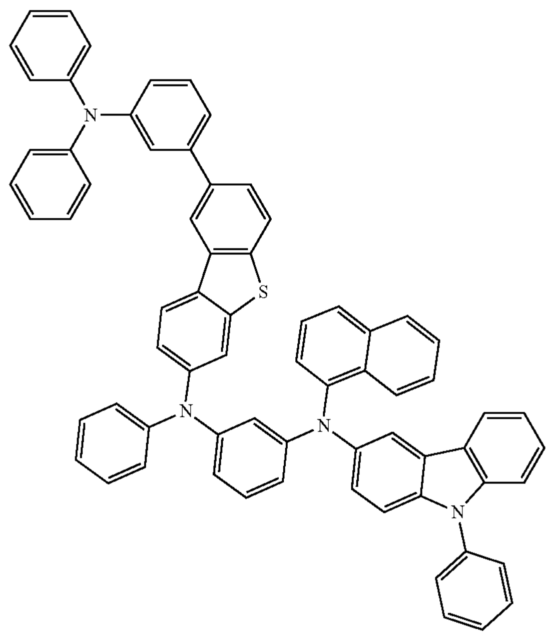
P4-246
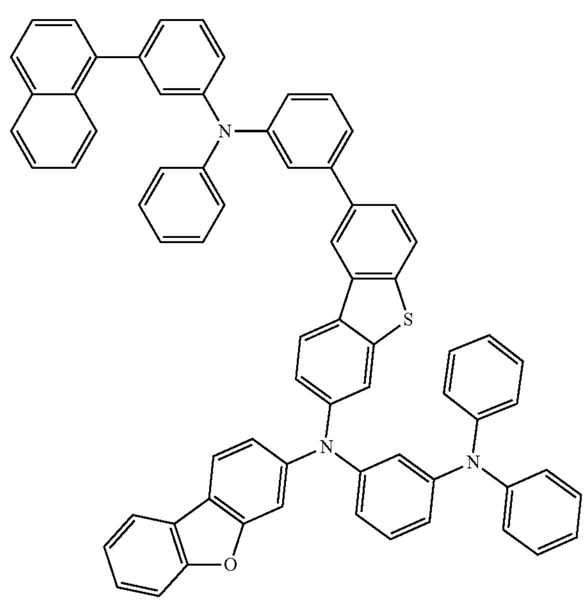
-continued
P4-247
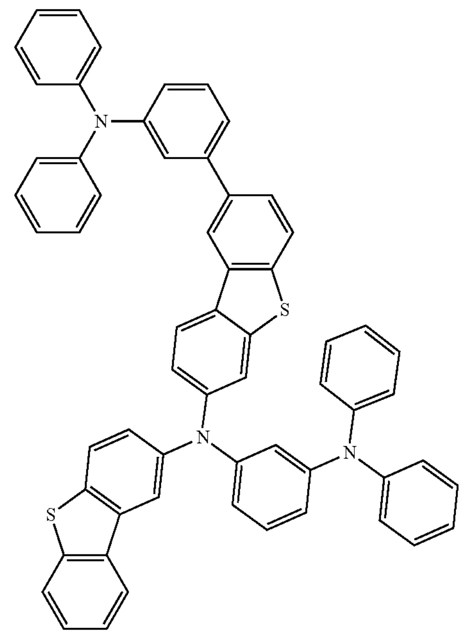
P4-248
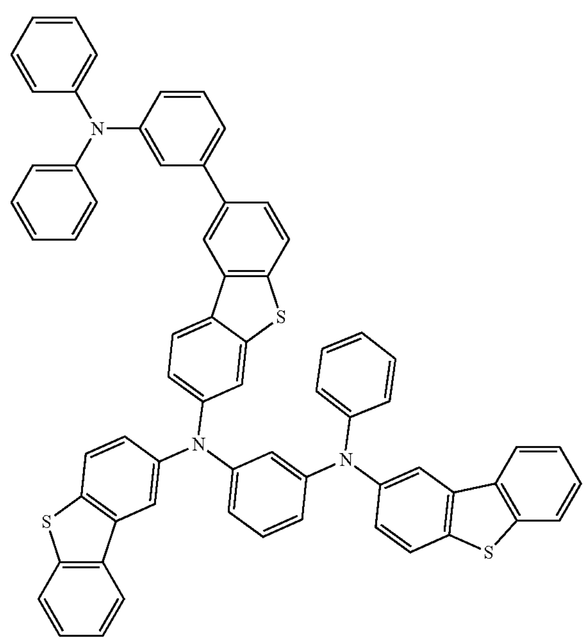

-continued
P4-249
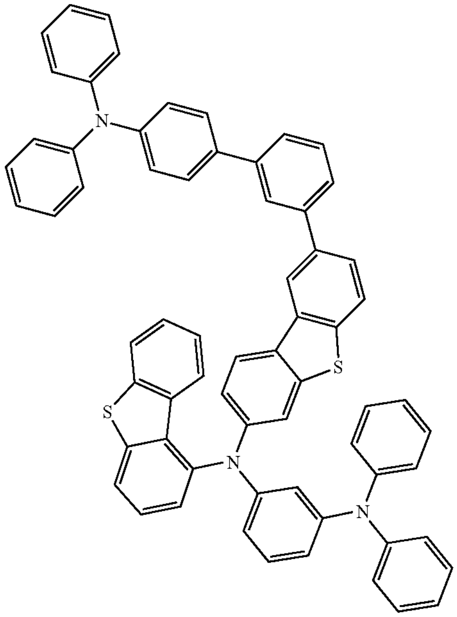
P4-250
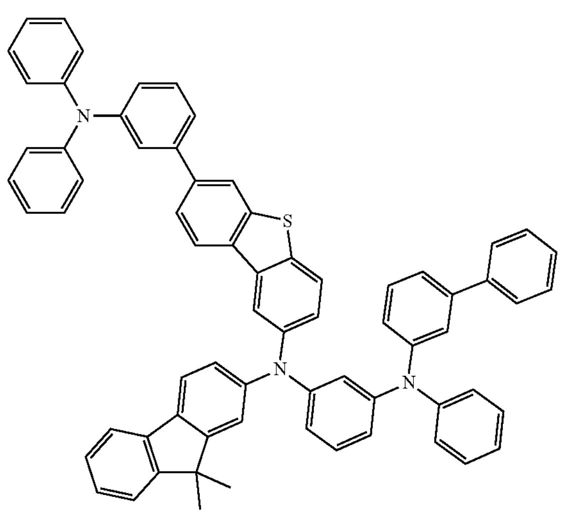
-continued
P4-251
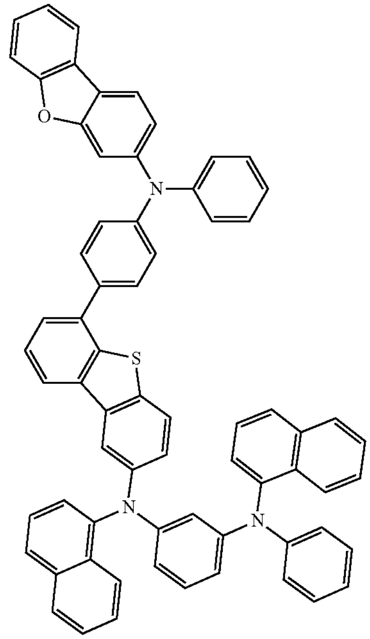
P4-252
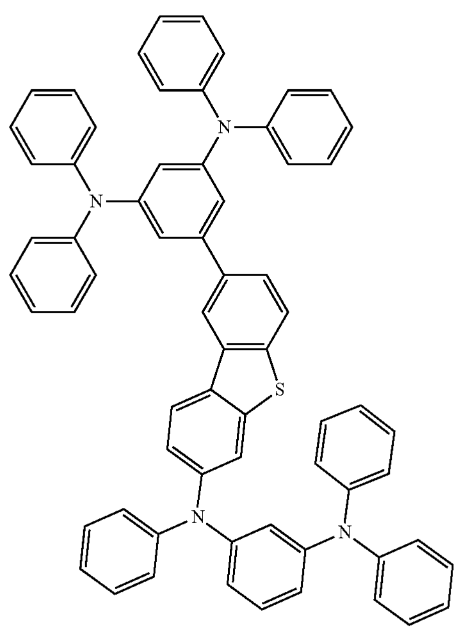

-continued
P4-253
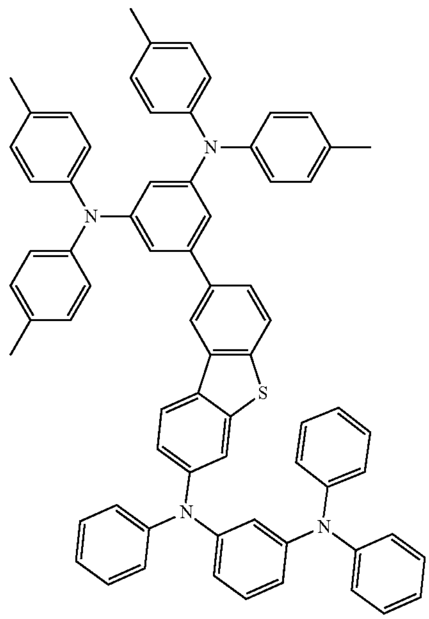
P4-254
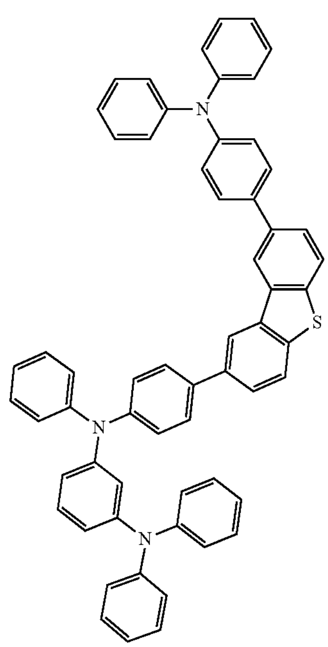
-continued
P4-255
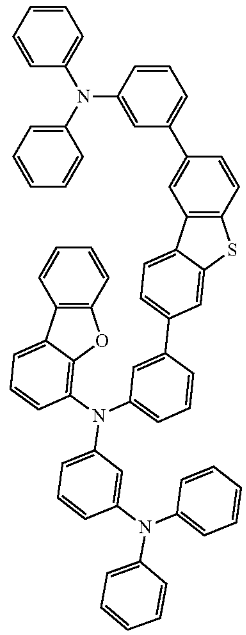
P4-256
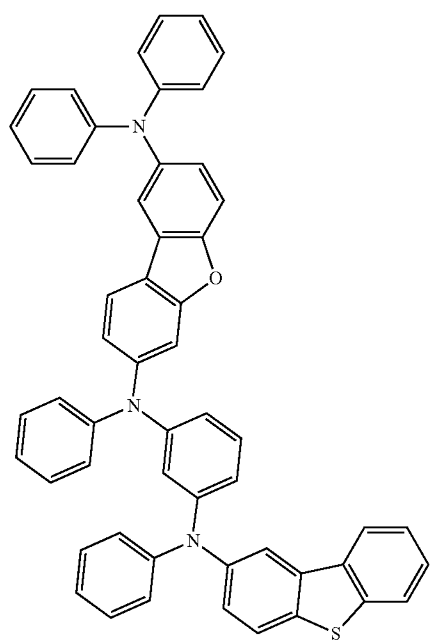

-continued
P4-257
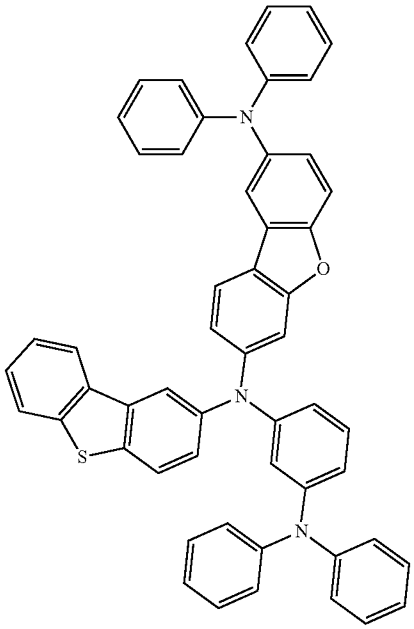
P4-258
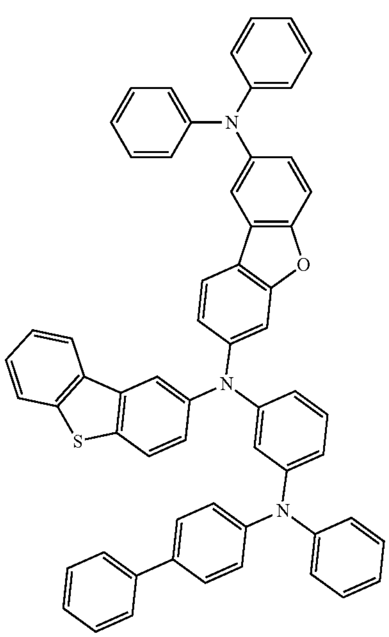
-continued
P4-259
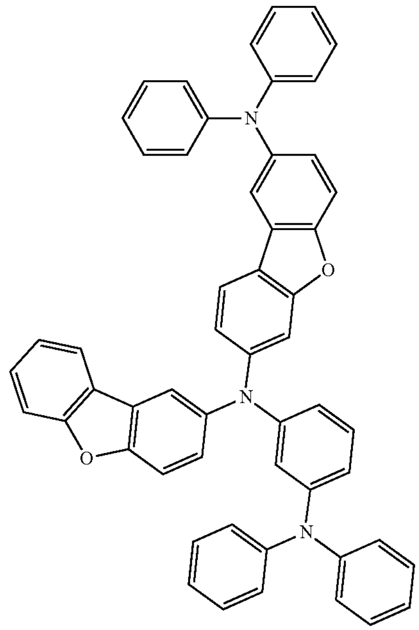
P4-260
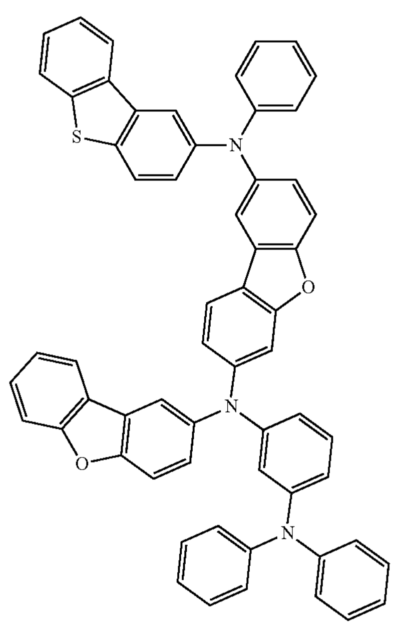

-continued

P4-261

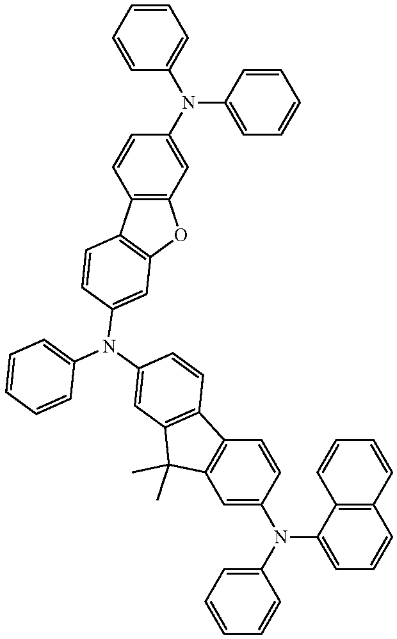

-continued

P4-263

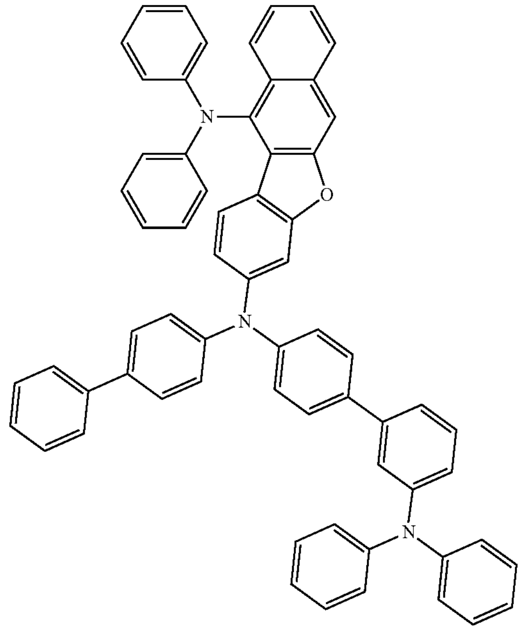

P4-262

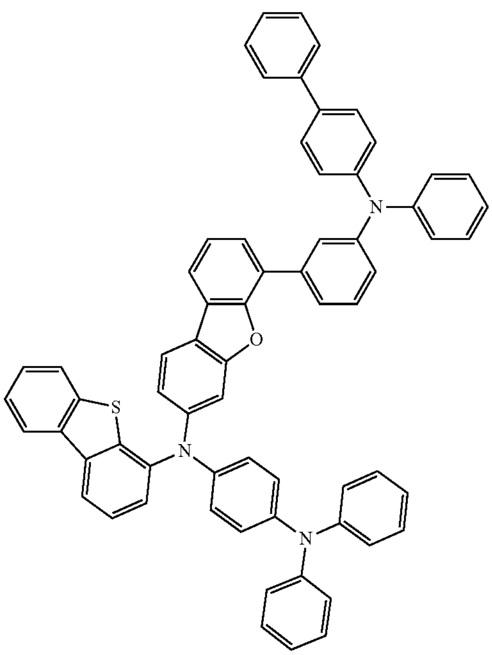

Hereinafter, examples for synthesizing the compounds represented by Formulas 1 and 2 will be described in detail with reference to examples, but the present invention is not limited to the following examples.

SYNTHESIS EXAMPLE

[Synthesis Example of 1] Compound Represented by Formula 1

The compound represented by Formula 1 according to the present invention (Final product 1) was prepared by the synthesis method disclosed in Korean Patent No. 10-1786749 (registration-published on Oct. 11, 2017), Korean Patent Application No. 2014-0152779 (filed on Nov. 5, 2014) and Korea Patent Application 2014-0161275 (filed on Nov. 19, 2014) which are filed by the applicant of the present invention.

<Reaction Scheme 1>

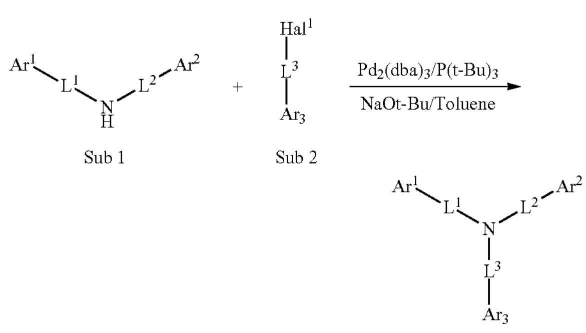

(Hal[1] is I, Br or Cl.)

Synthesis Example of Sub 1

Sub 1 of Reaction Scheme 1 may be synthesized by the reaction route of the following Reaction Scheme 2, but are not limited thereto.

<Reaction Scheme 2>

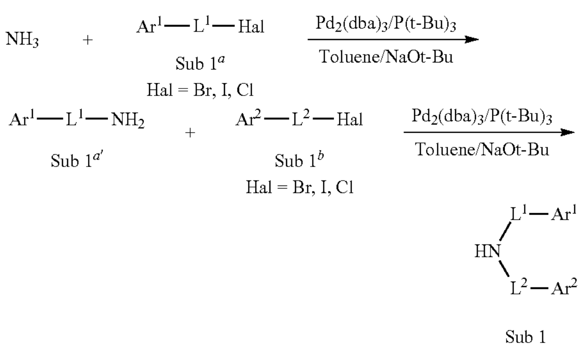

(Hal is I, Br or Cl.)

1. Synthesis Example of Sub 1A-58

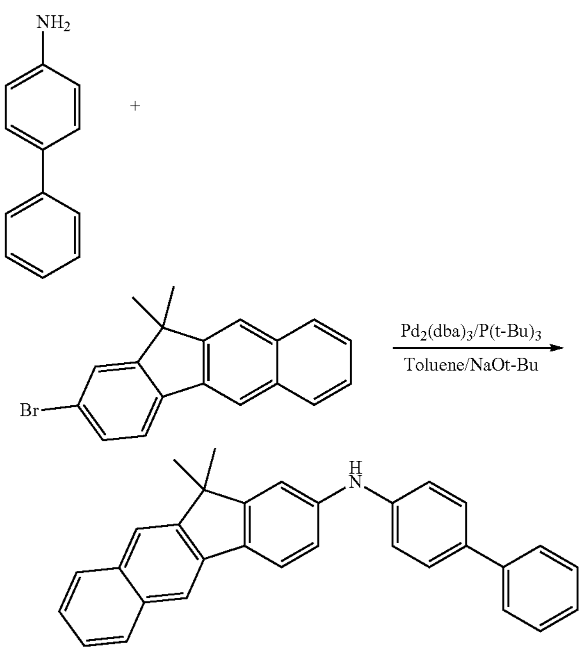

Sub1A-58

[1,1'-biphenyl]-4-amine (50 g, 295.5 mmol), 2-bromo-11,11-dimethyl-11H-benzo[b]fluorene (95.5 g, 295.5 mmol), $Pd_2(dba)_3$ (8.12 g, 8.9 mmol), $P(t\text{-}Bu)_3$ (3.59 g, 17.7 mmol), NaOt-Bu (56.8 g, 590.9 mmol) and toluene (1,477 mL) are placed in a round-bottom flask, and the reaction is carried out at 100° C. When the reaction was completed, the reaction product was extracted using $CH_2Cl_2$ and water. Then, an organic layer was dried over $MgSO_4$ and concentrated. Then, the concentrate was separated by a silica gel column and recrystallized to obtain 87.5 g (yield: 72%) of the product.

2. Synthesis Example of Sub 1A-59

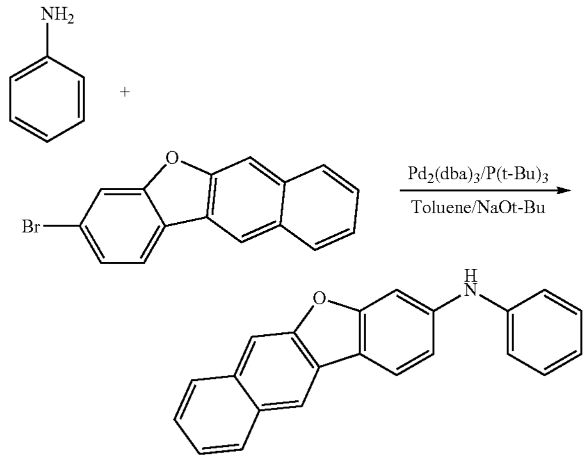

Sub1A-59

Aniline (50 g, 536.9 mmol), 3-bromonaphtho[2,3-b]benzofuran (158.9 g, 536.9 mmol), $Pd_2(dba)_3$ (14.75 g, 16.1 mmol), $P(t\text{-}Bu)_3$ (6.52 g, 32.2 mmol), NaOt-Bu (103.2 g, 1,073.8 mmol) and toluene (2,684 mL) are placed in a round-bottom flask, and then the reaction was carried out in the same manner as in the synthesis method of Sub 1A-58 to obtain 129.5 g (yield: 78%) of the product.

3. Synthesis Example of Sub1C-18

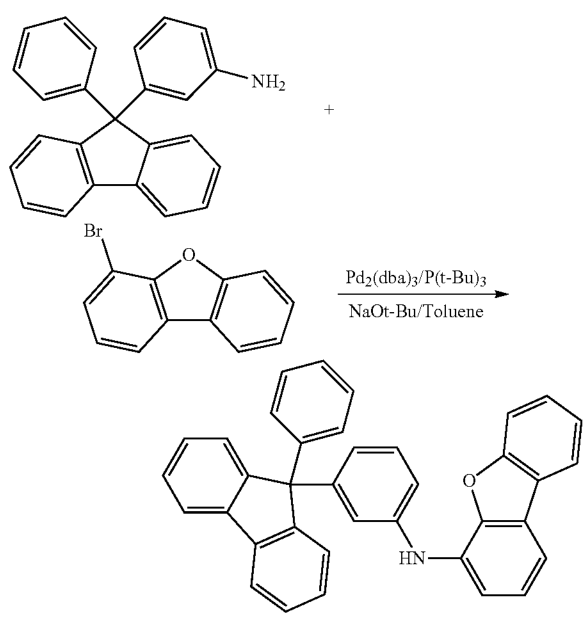

Sub1C-18

3-(9-phenyl-9H-fluoren-9-yl)aniline (43 g, 128.96 mmol), 4-bromodibenzo[b,d]furan (33.5 g, 135.4 mmol), $Pd_2(dba)_3$ (3.5 g, 3.8 mmol), $P(t\text{-}Bu)_3$ (1.6 g, 7.7 mmol), NaOt-Bu (37.2 g, 386.9 mmol) and toluene (1,322 mL) are placed in a round-bottom flask, and then the reaction was carried out in the same manner as in the synthesis method of Sub 1A-58 to obtain 55.5 g (yield: 86.2%) of the product.
Compounds belong to Sub 1 are as follows, but are not limited thereto, and FD-MS values of the compounds are shown in Table 1 below.
Sub1A-1
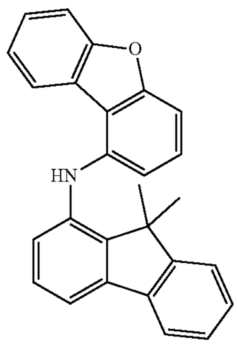
Sub1A-2
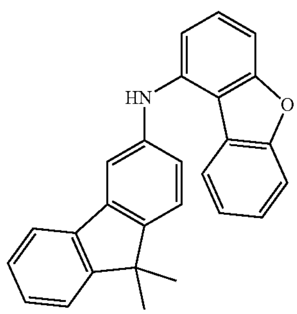
Sub1A-3
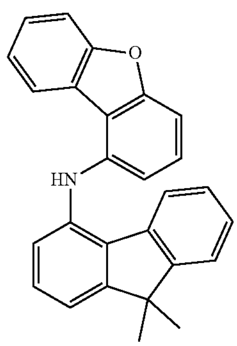
Sub1A-4
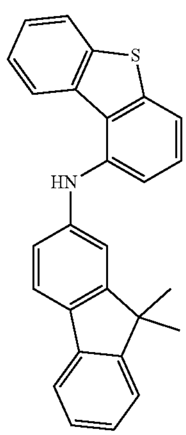
-continued
Sub1A-5
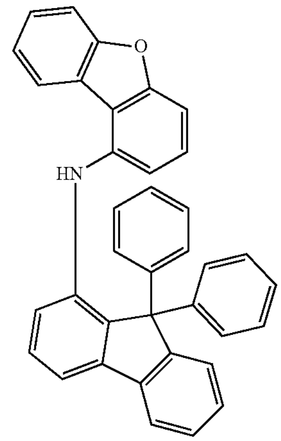
Sub1A-6
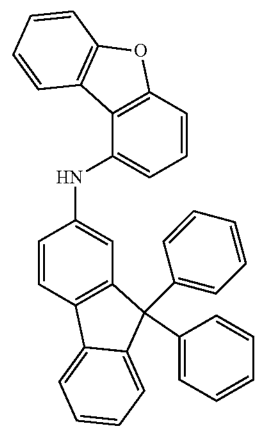
Sub1A-7
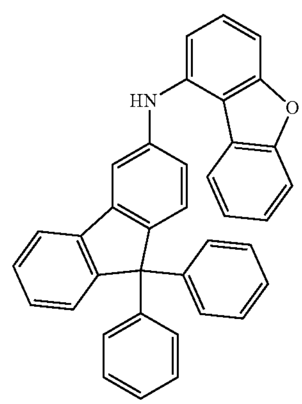

-continued
Sub1A-8
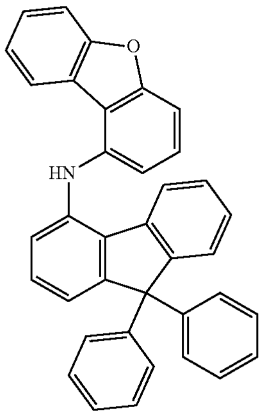
Sub1A-9
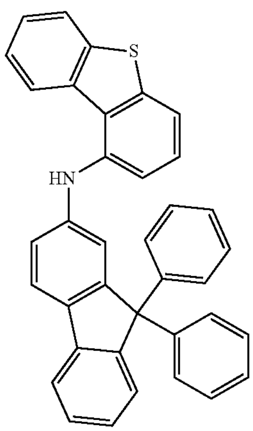
Sub1A-10
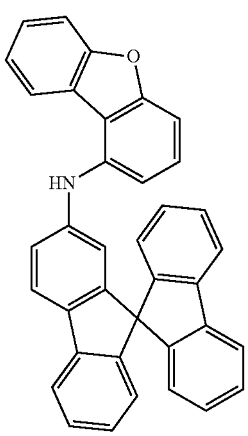
-continued
Sub1A-11
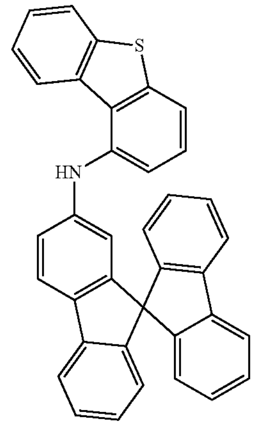
Sub1A-12
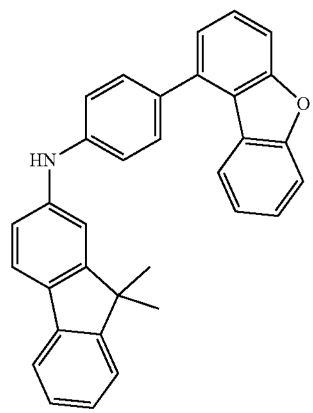
Sub1A-13
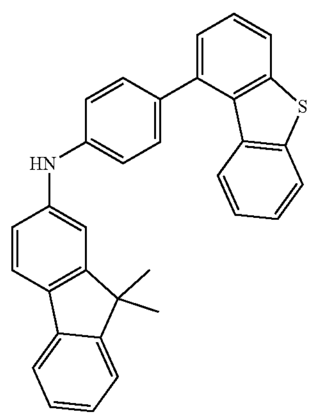
Sub1A-14
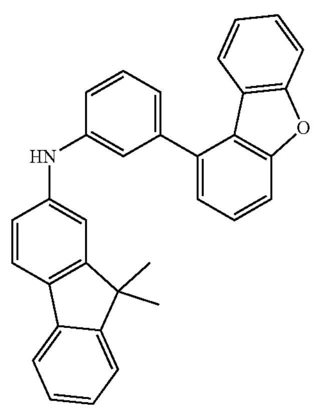

-continued
Sub1A-15
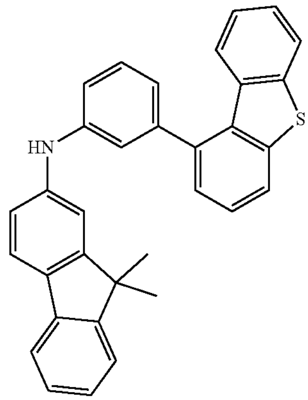
Sub1A-16
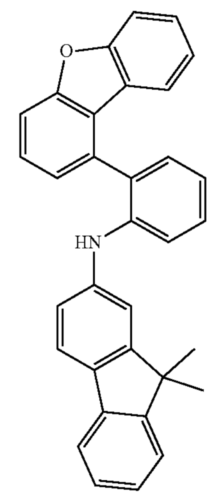
Sub1A-17
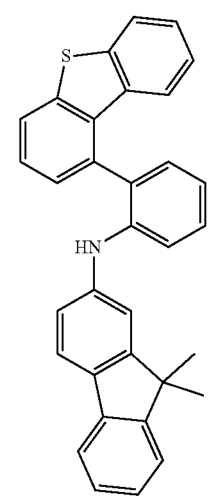
-continued
Sub1A-18
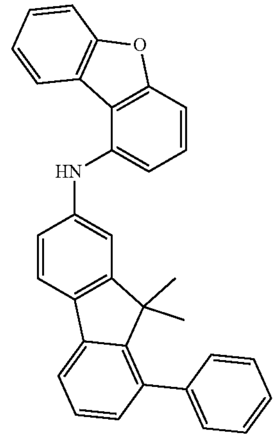
Sub1A-19
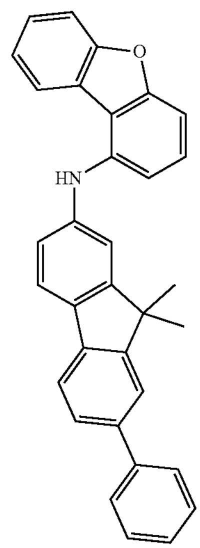
Sub1A-20
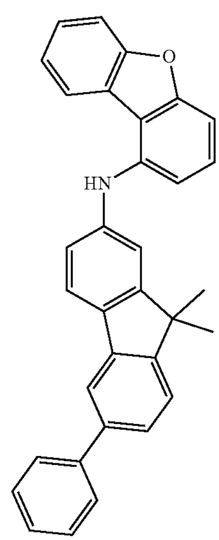

Sub1A-21
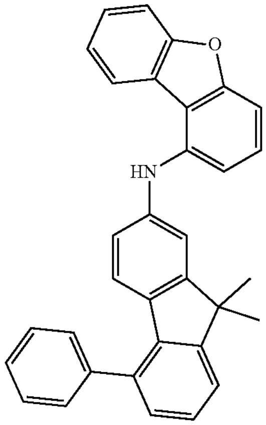
Sub1A-22
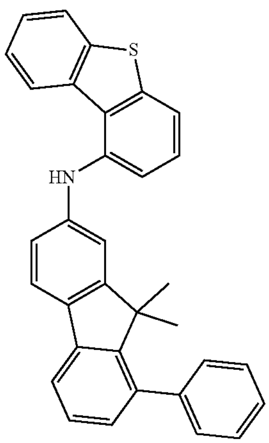
Sub1A-23
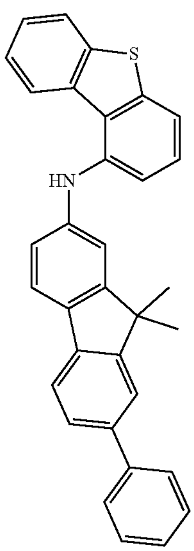
Sub1A-24
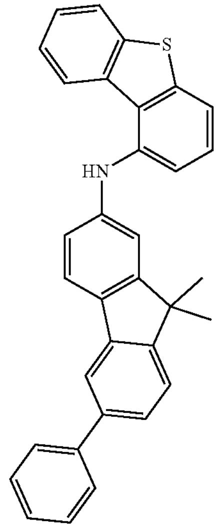
Sub1A-25
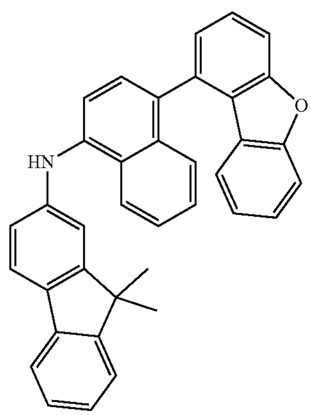
Sub1A-26
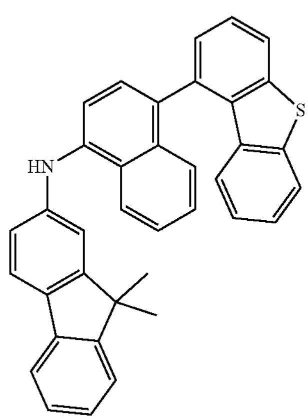

-continued
Sub1A-27
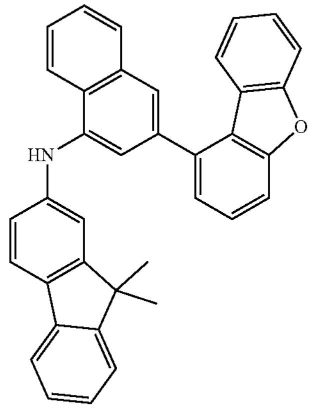
Sub1A-28
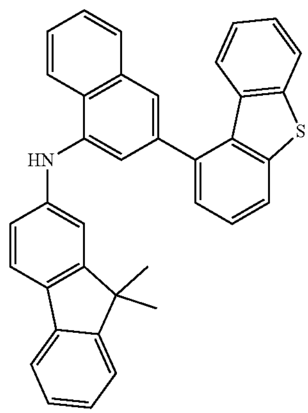
Sub1A29
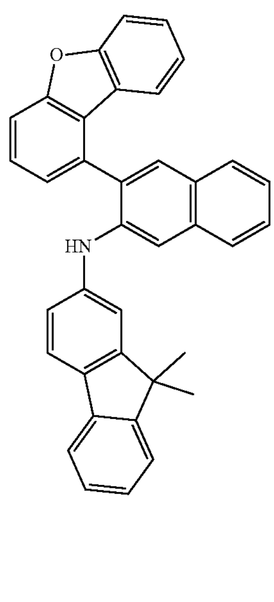
-continued
Sub1A30
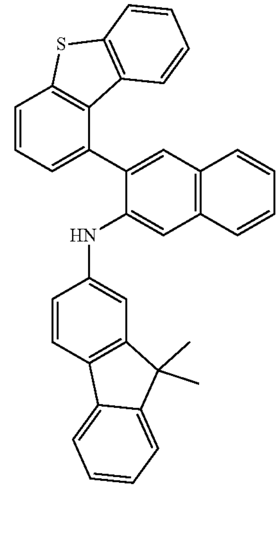
Sub1A31
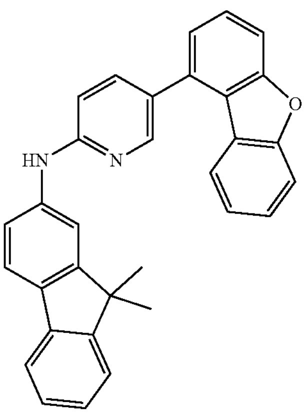
Sub1A-32
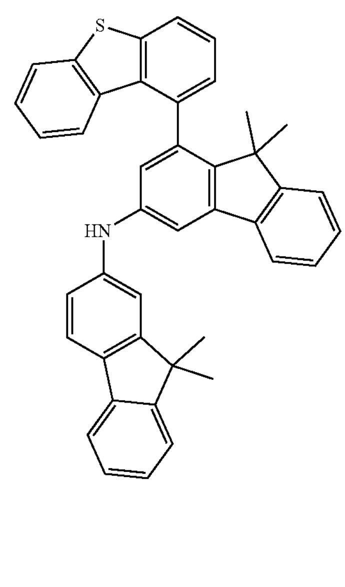

Sub1A-33
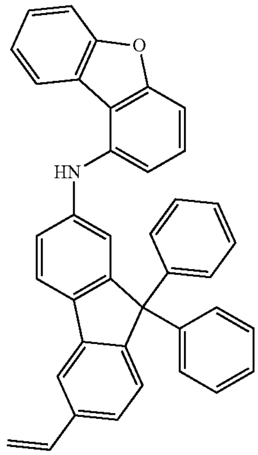
Sub1A-34
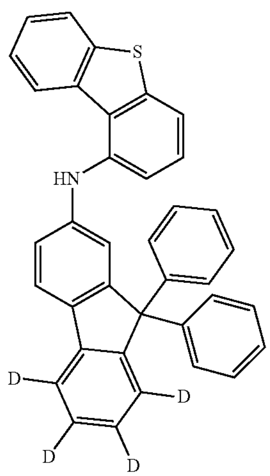
Sub1A-35
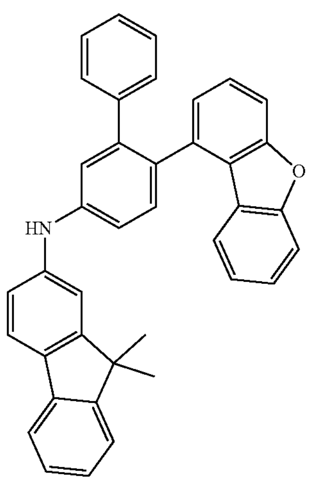
Sub1A-36
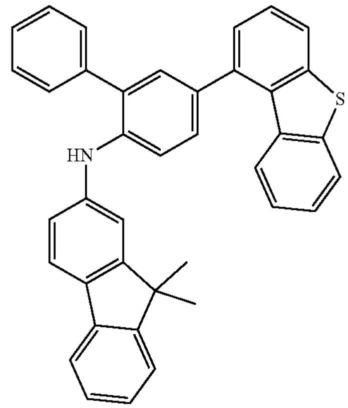
Sub1A-37
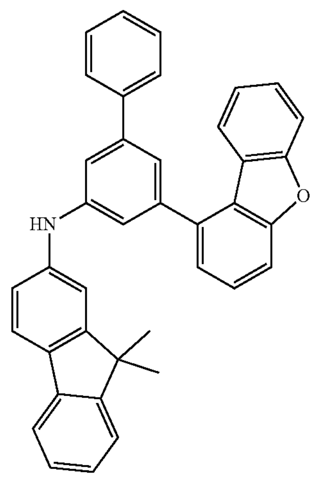
Sub1A-38
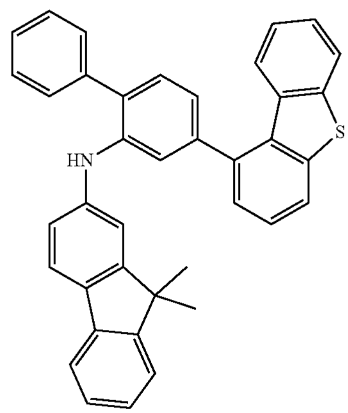

Sub1A-39
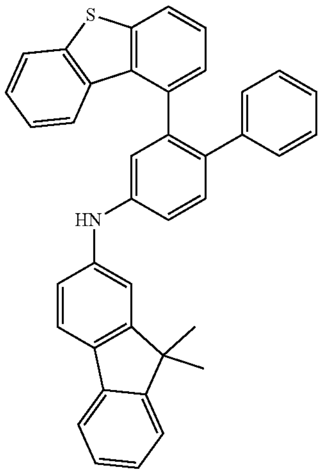
Sub1A-40
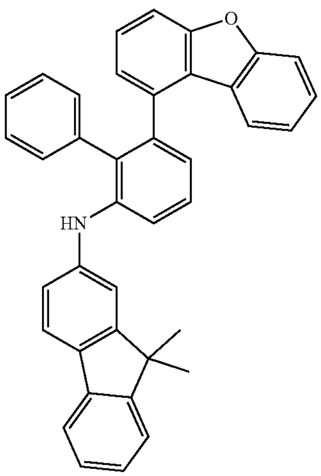
Sub1A-41
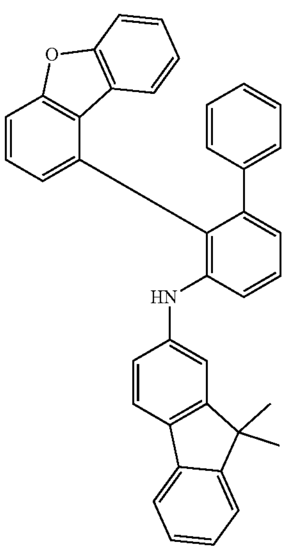
Sub1A-42
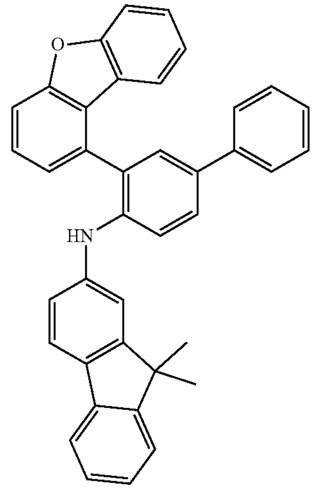
Sub1A-43
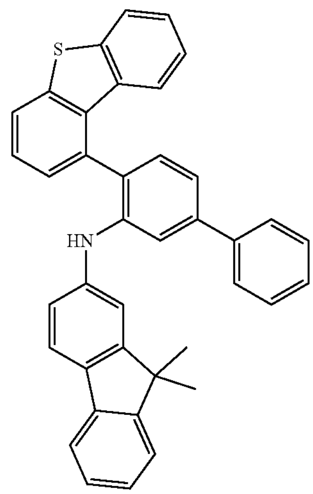
Sub1A-44
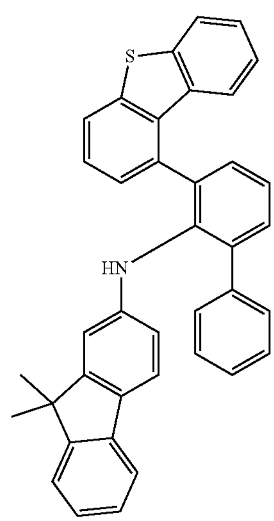

-continued
Sub1A-45
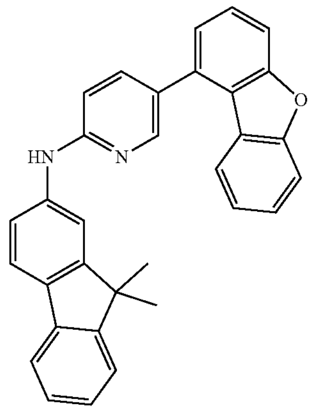
Sub1A-46
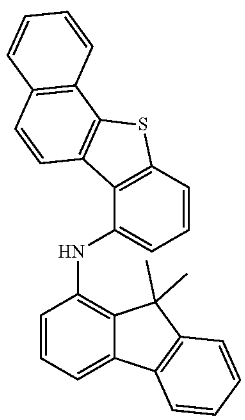
Sub1A-47
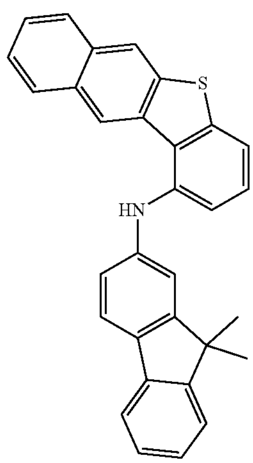
Sub1A-48
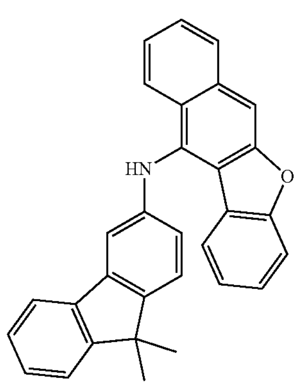
-continued
Sub1A-49
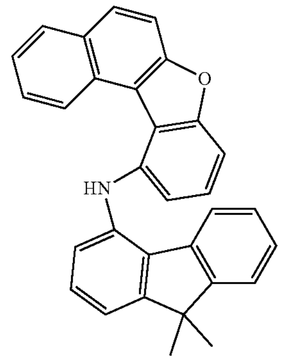
Sub1A-50
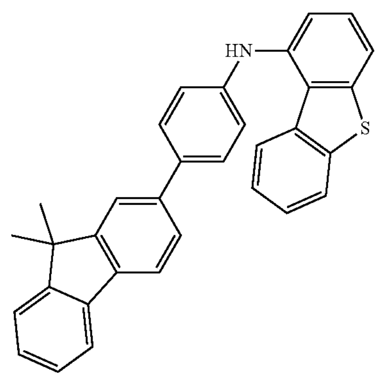
Sub1A-51
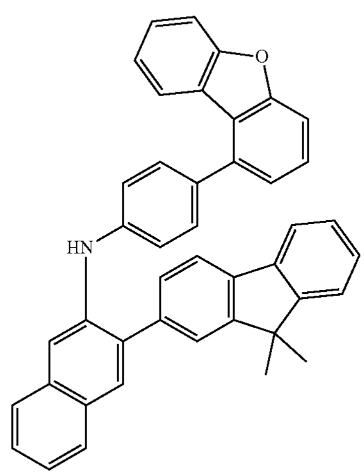

-continued
Sub1A-52
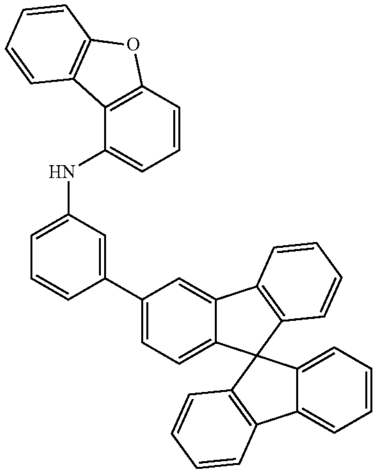
Sub1A-53
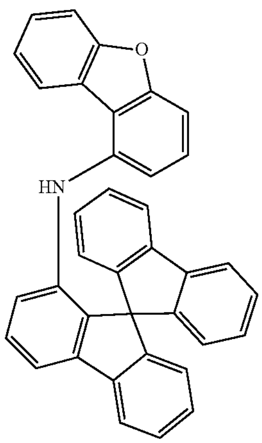
Sub1A-54
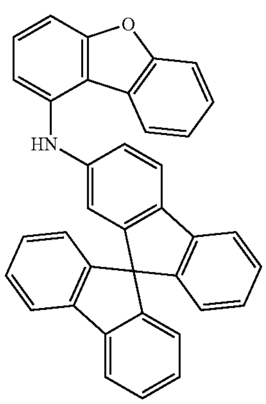
-continued
Sub1A-55
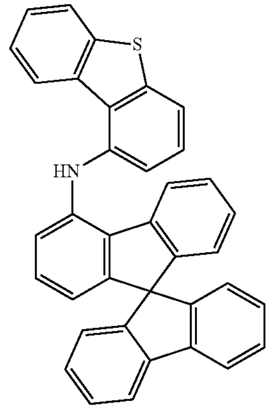
Sub1A-56
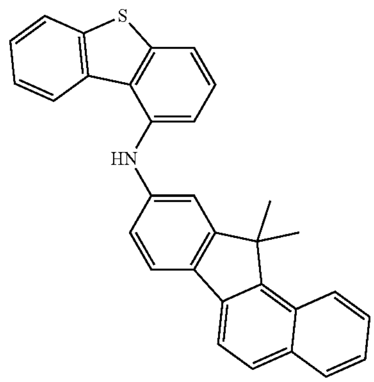
Sub1A-57
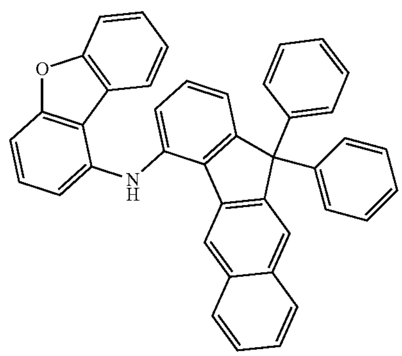
Sub1A-58
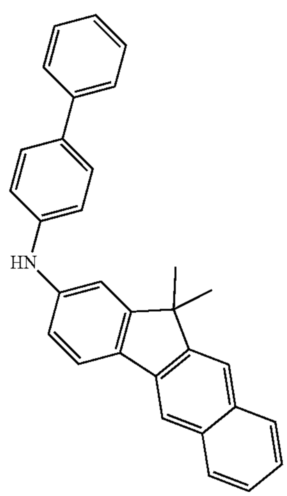

-continued
Sub1A-59
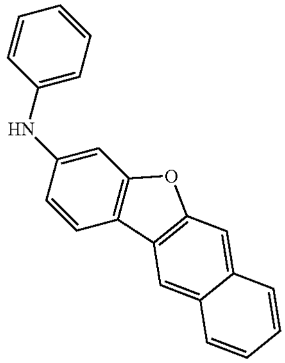
Sub1B-1
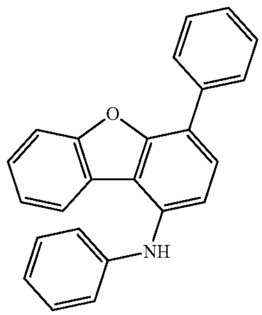
Sub1B-2
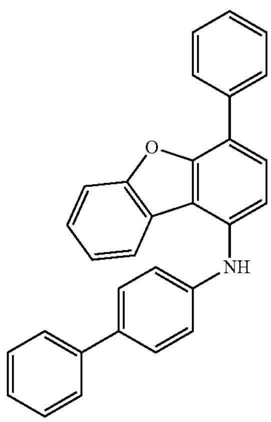
Sub1B-3
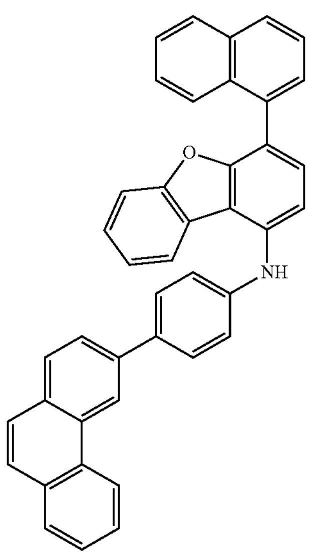
-continued
Sub1B-4
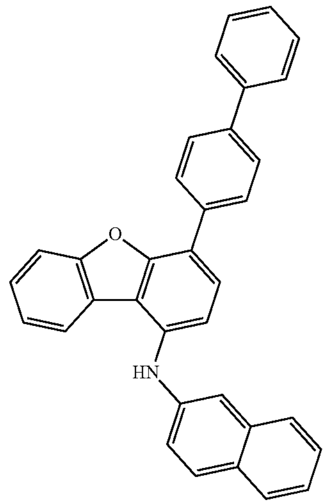
Sub1B-5
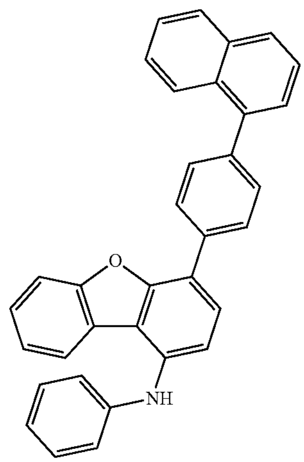
Sub1B-6
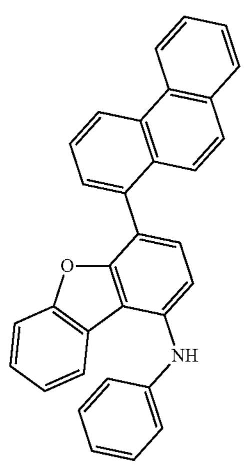

Sub1B-7
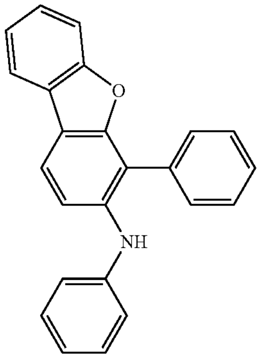
Sub1B-8
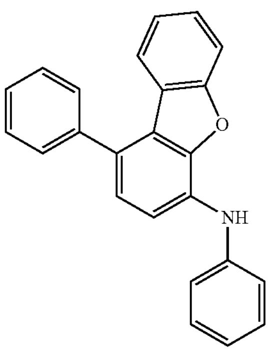
Sub1B-9
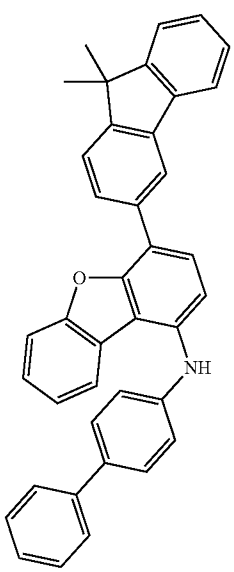
Sub1B-10
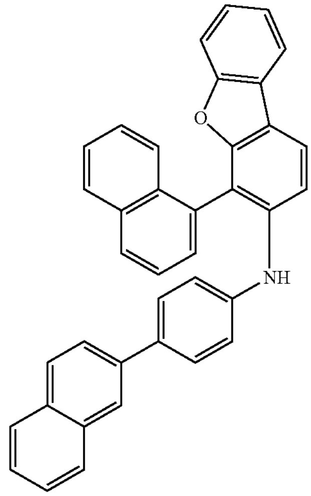
Sub1B-11
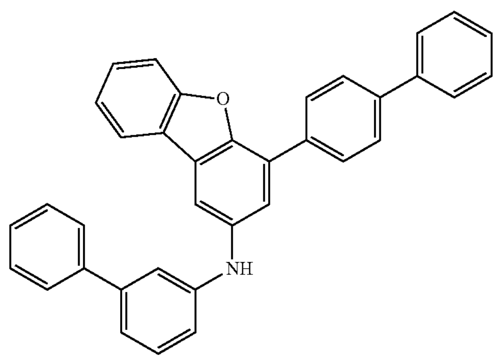
Sub1B-12
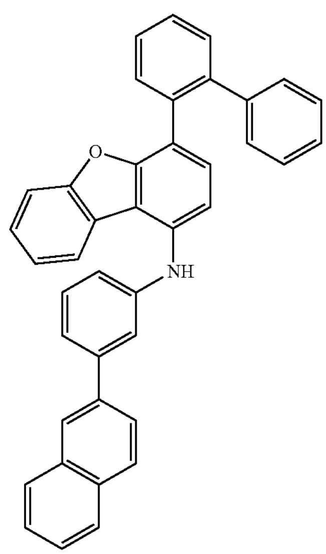

-continued
Sub1B-13
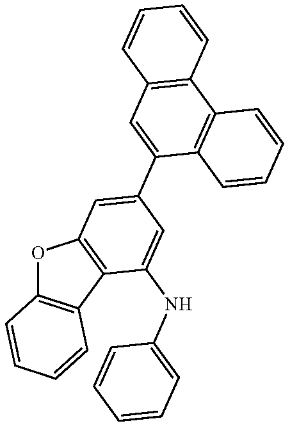
Sub1B-14
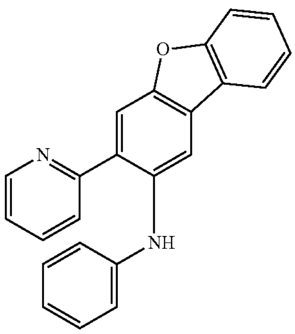
Sub1B-15
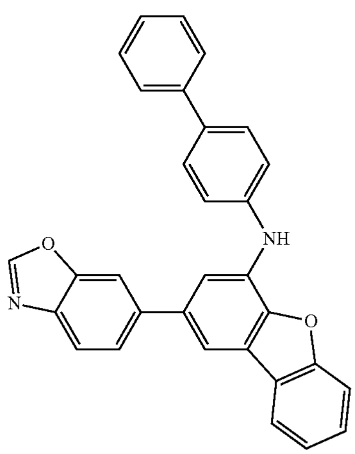
-continued
Sub1B-16
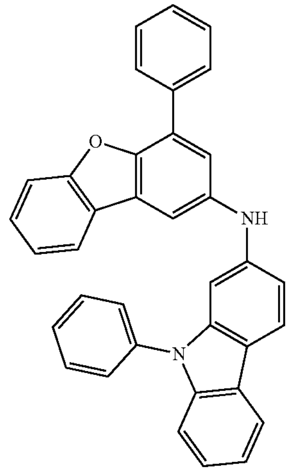
Sub1B-17
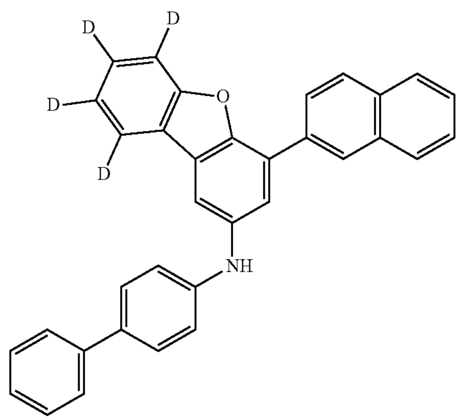
Sub1B-18
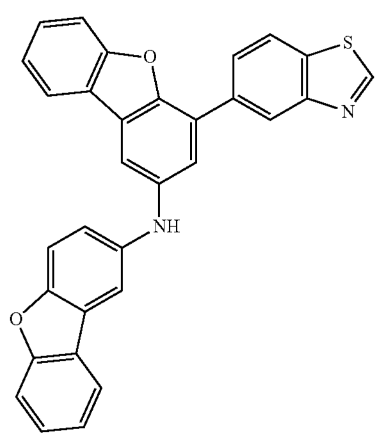

-continued
Sub1B-19
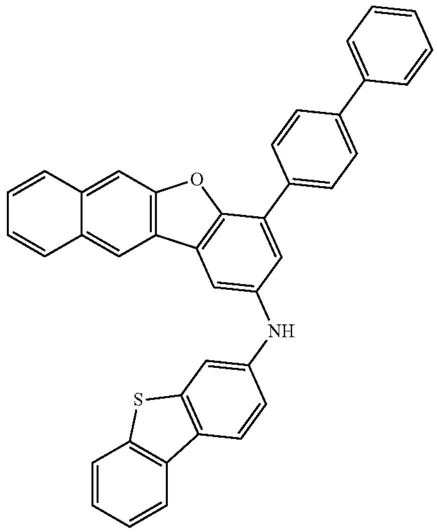
Sub1B-20
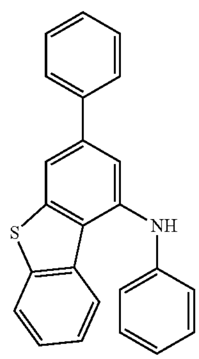
Sub1B-21
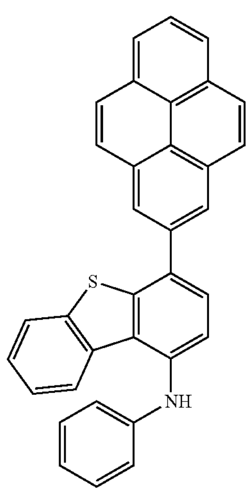
-continued
Sub1B-22
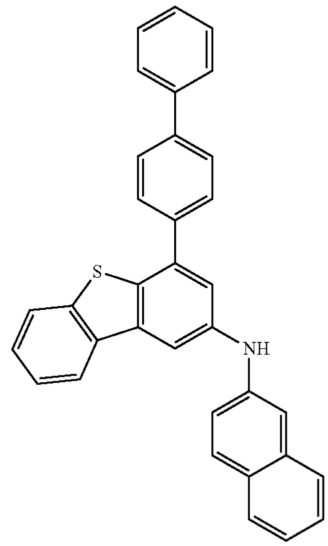
Sub1B-23
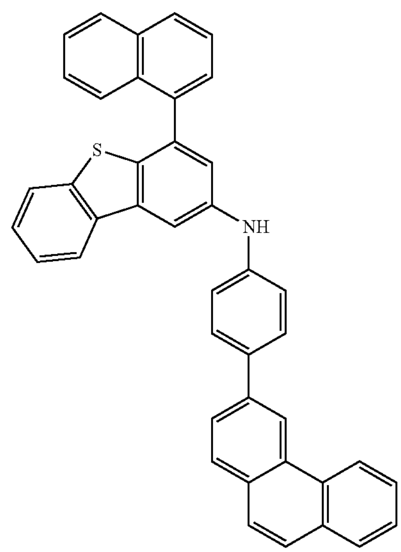
Sub1B-24
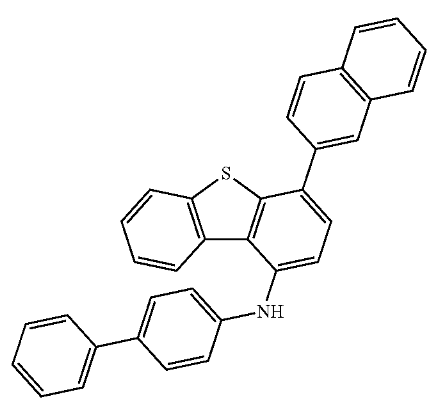

Sub1B-25
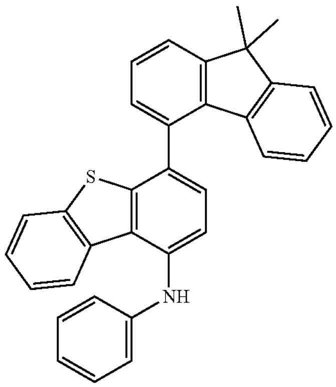
Sub1B-26
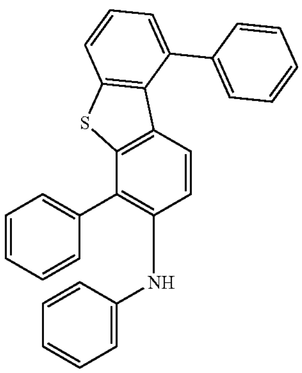
Sub1B-27
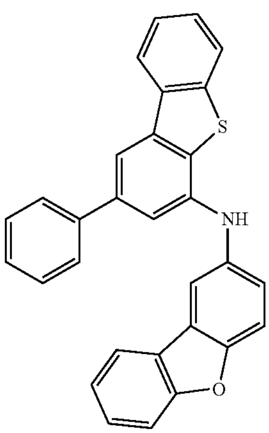
Sub1B-28
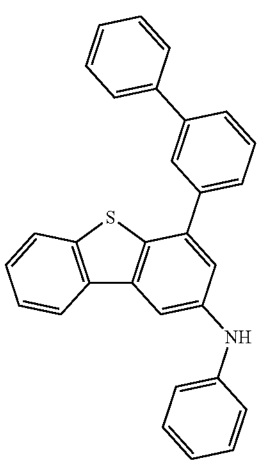
Sub1B-29
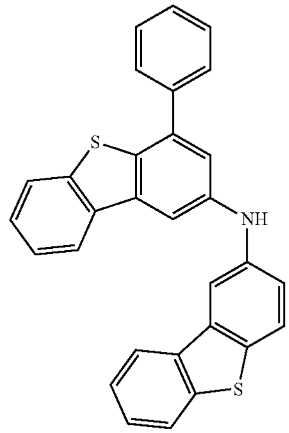
Sub1B-30
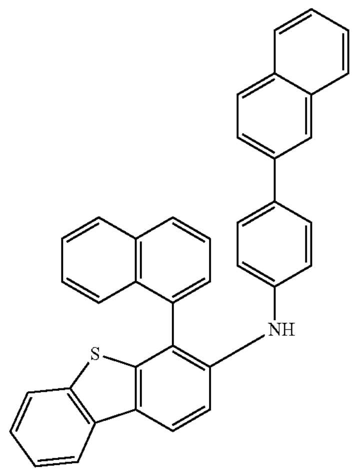
Sub1B-31
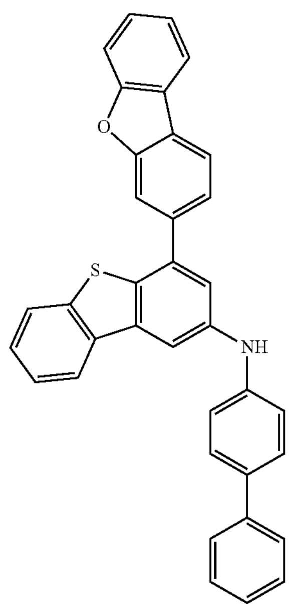

-continued
Sub1B-32
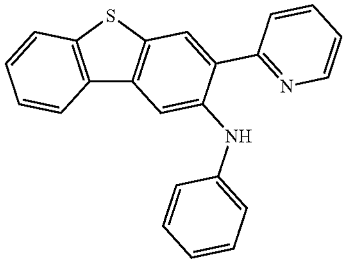
Sub1B-33
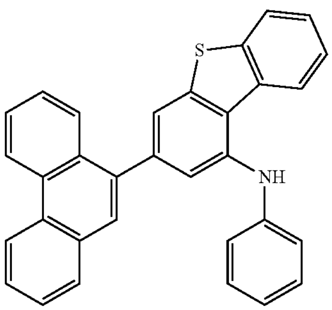
Sub1B-34
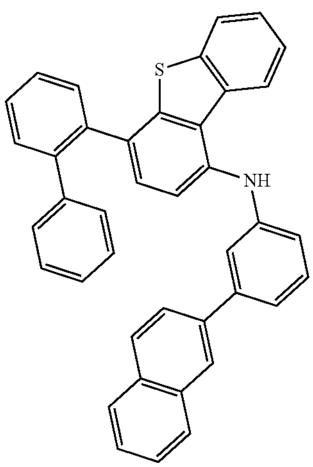
Sub1B-35
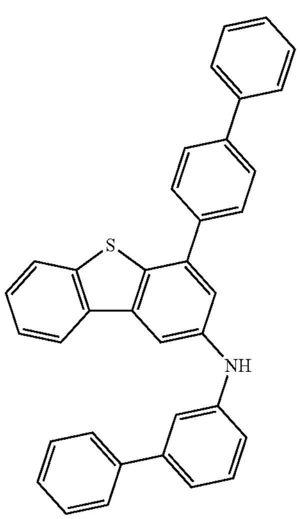
-continued
Sub1B-36
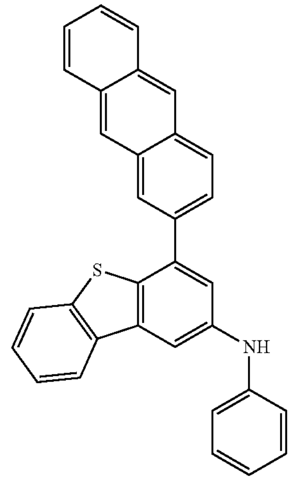
Sub1B-37
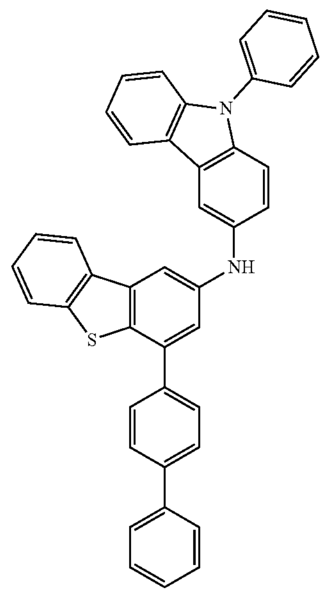
Sub1B-38
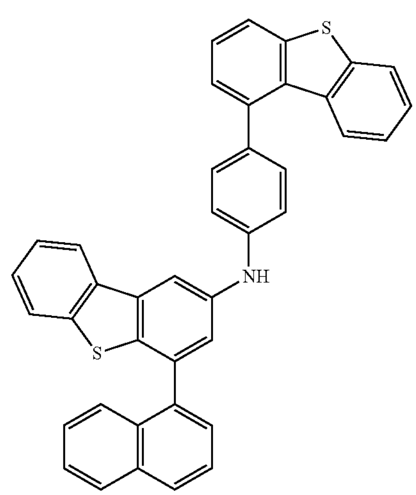

Sub1B-39
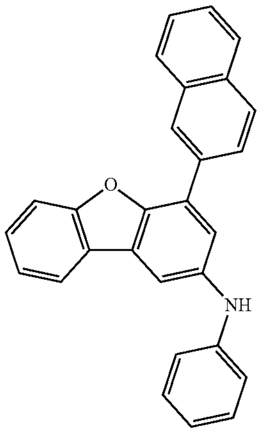
Sub1B-40
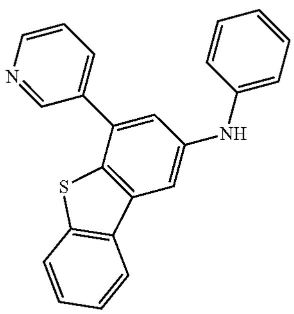
Sub1B-41
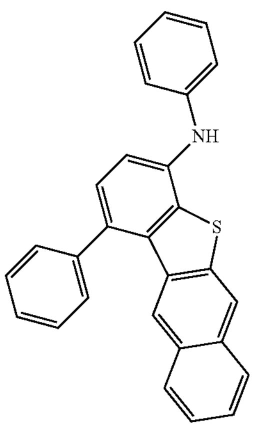
Sub1B-42
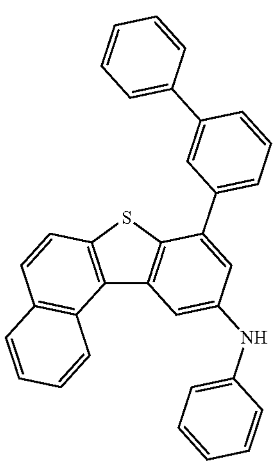
Sub1B-43
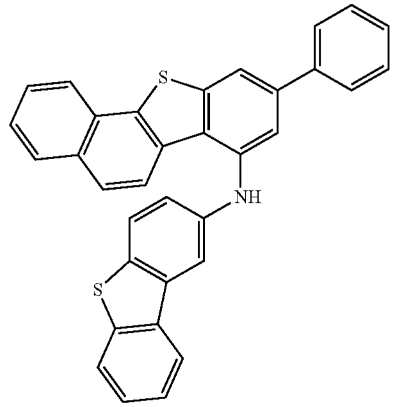
Sub1B-44
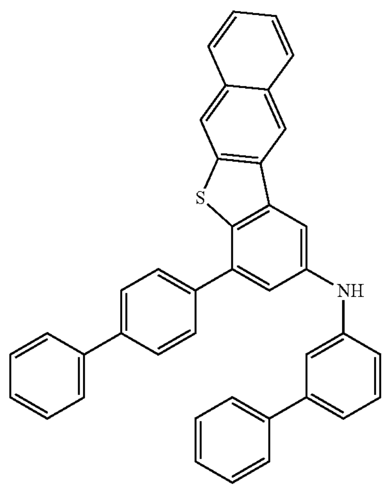
Sub1B-45
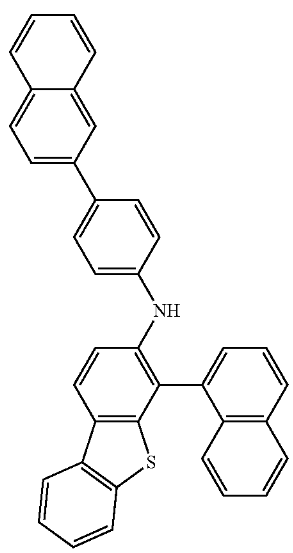

Sub1B-46
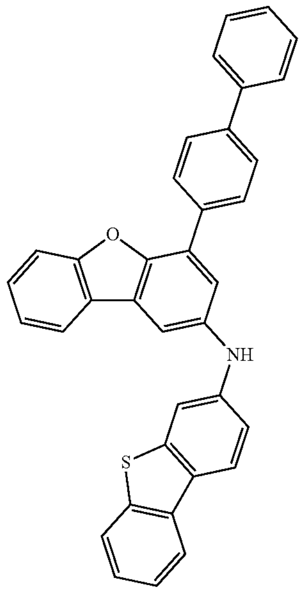
Sub1B-47
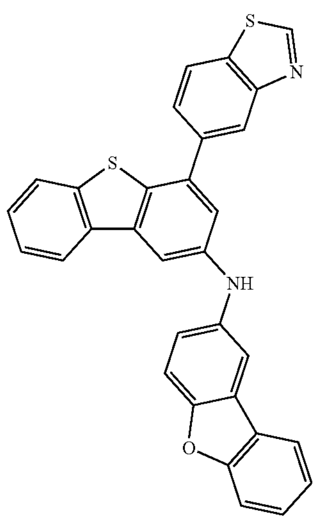
Sub1B-48
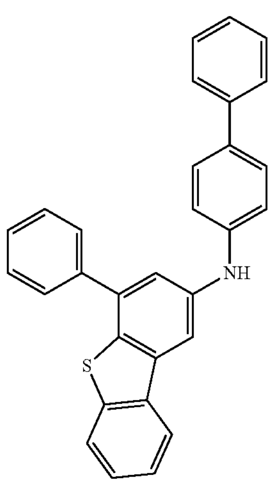
Sub1B-49
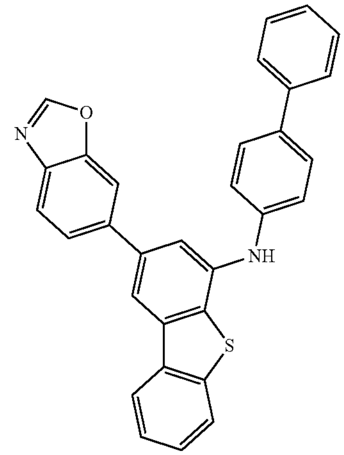
Sub1B-50
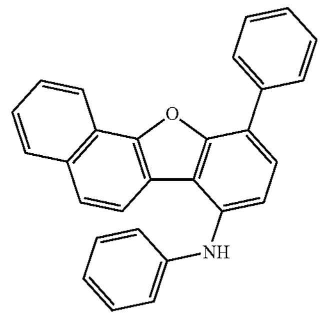
Sub1B-51
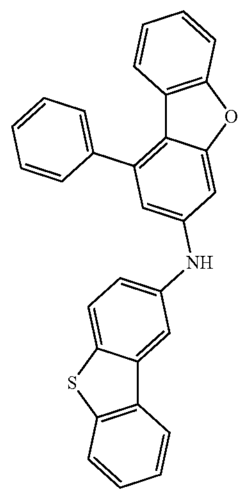
Sub1B-52
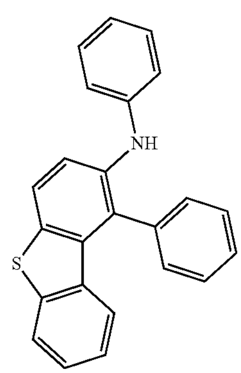

Sub1B-53
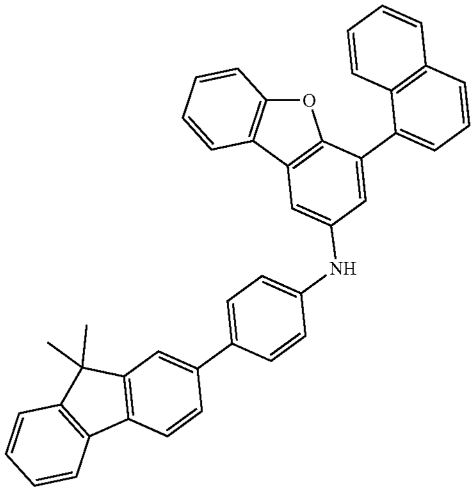
Sub1B-54
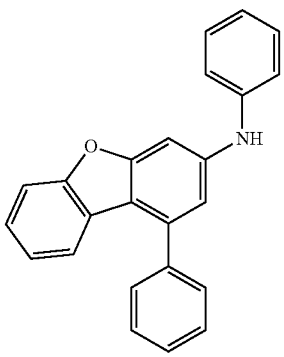
Sub1B-55
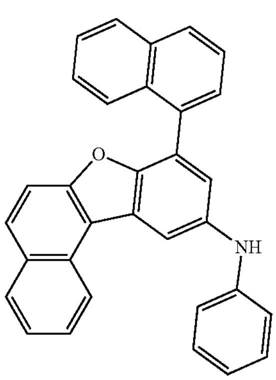
Sub1B-56
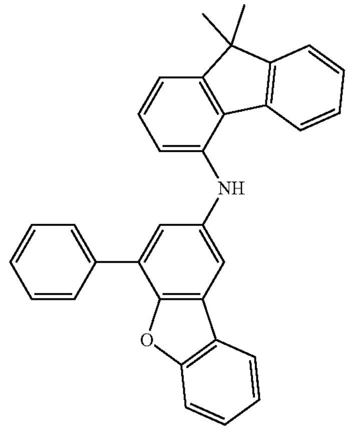
Sub1B-57
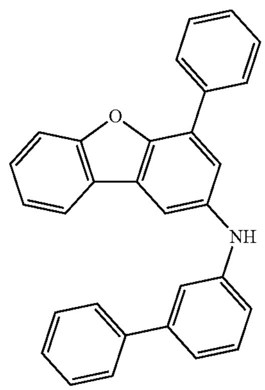
Sub1B-58
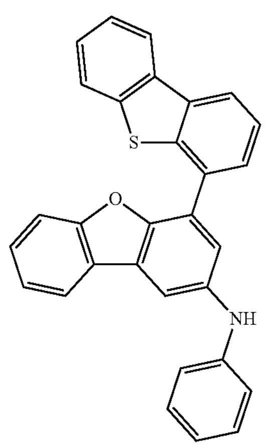

Sub1B-59
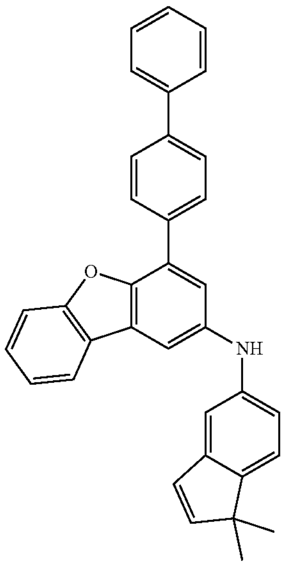
Sub1B-60
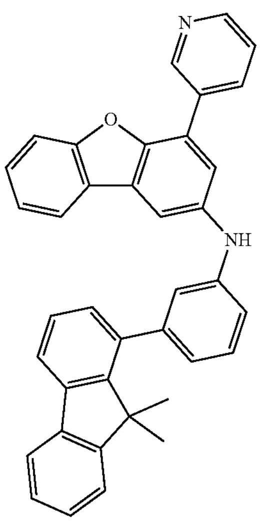
Sub1B-61
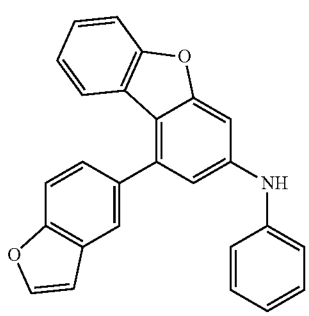
Sub1B-62
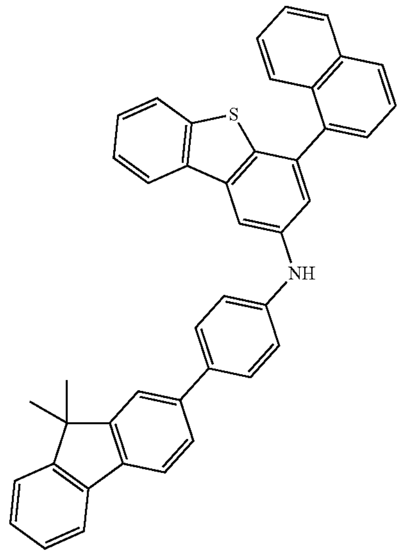
Sub1B-63
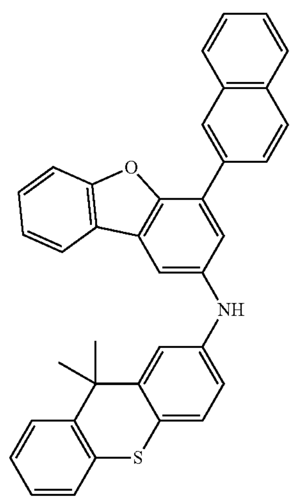
Sub1B-64
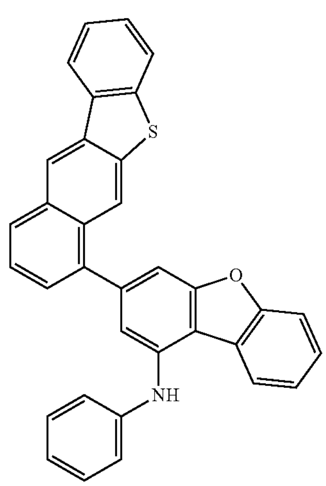

-continued
Sub1B-65
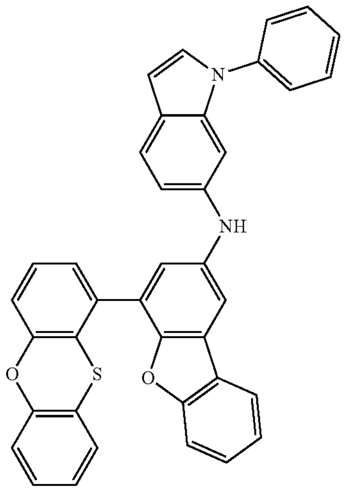
Sub1B-66
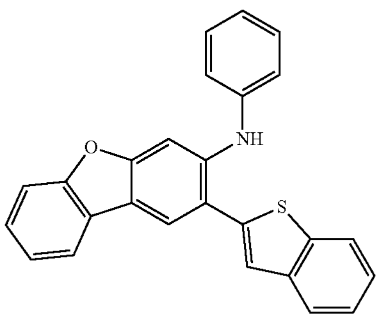
Sub1B-67
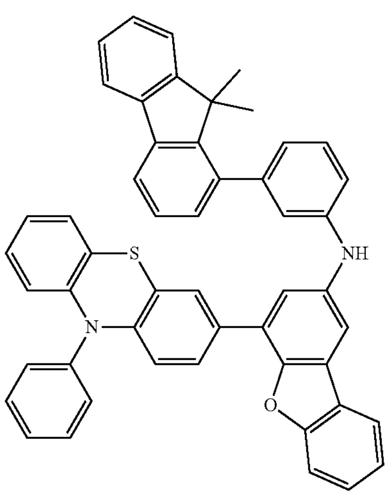
-continued
Sub1B-68
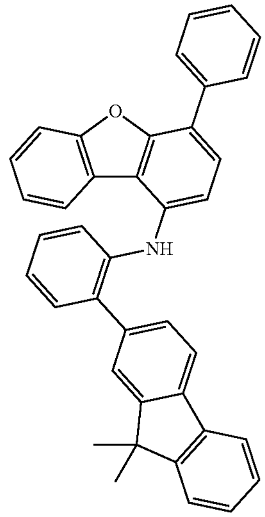
Sub1B-69
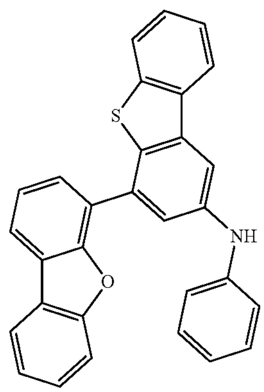
Sub1B-70
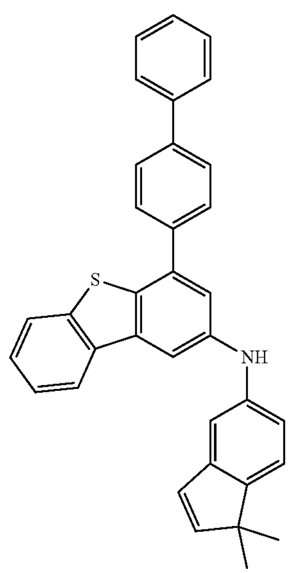

-continued
Sub1B-71
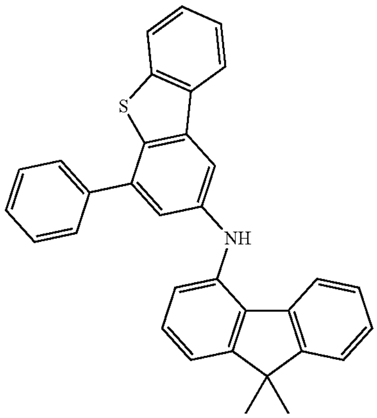
Sub1B-72
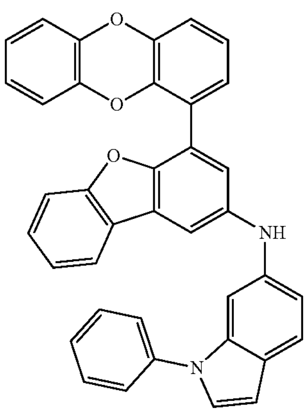
Sub1B-73
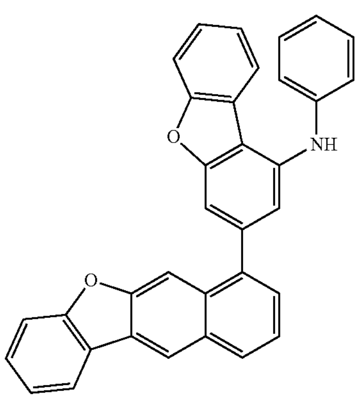
-continued
Sub1B-74
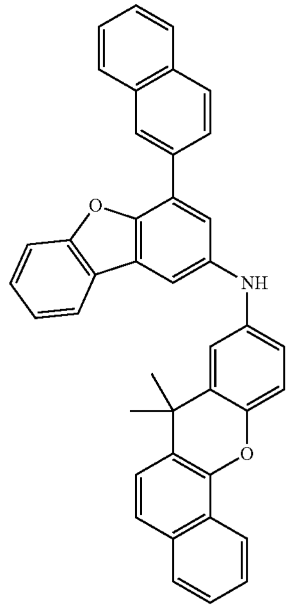
Sub1B-75
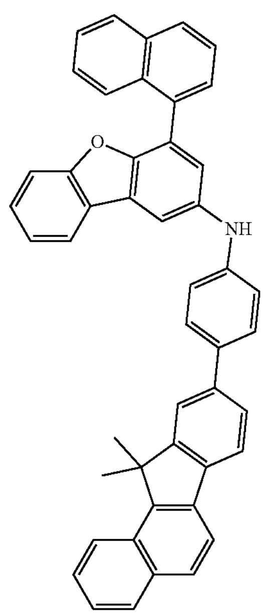

-continued
Sub1B-76
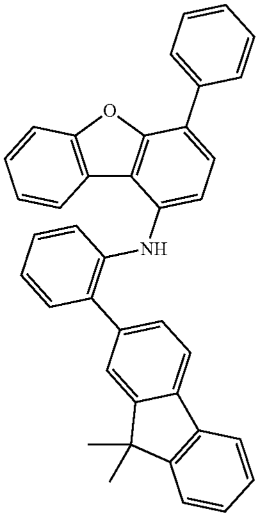
Sub1B-77
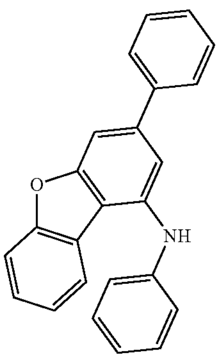
Sub1B-78
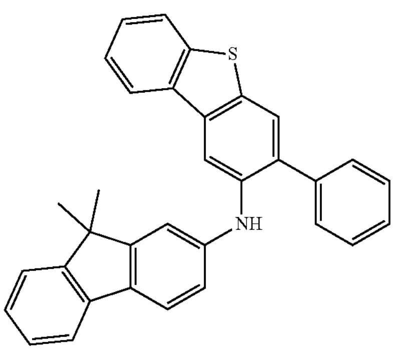
-continued
Sub1B-79
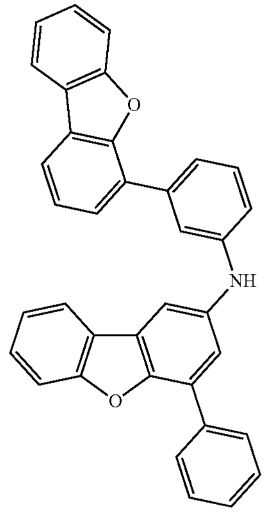
Sub1B-80
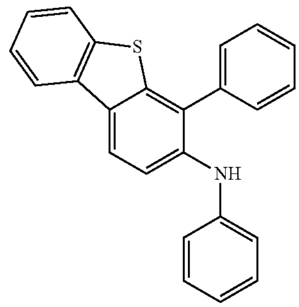
Sub1B-81
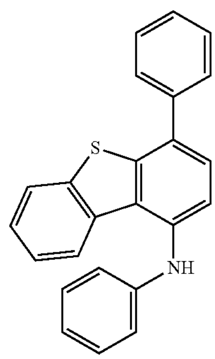
Sub1B-82
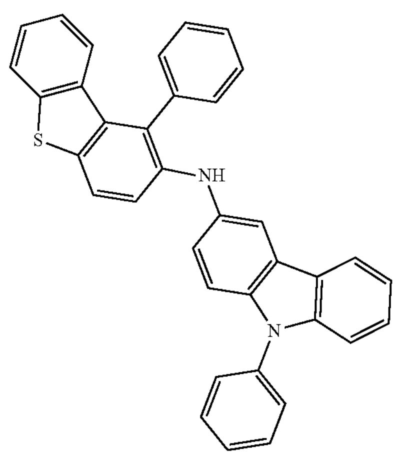

-continued
Sub1B-83
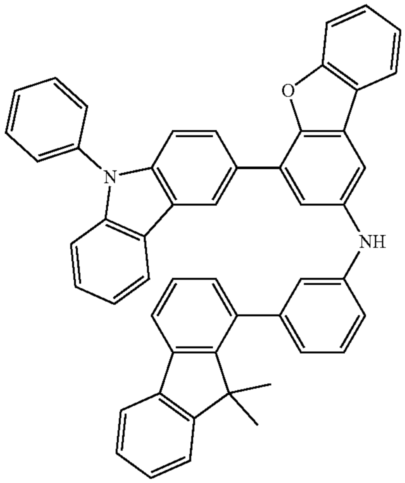
Sub1B-84
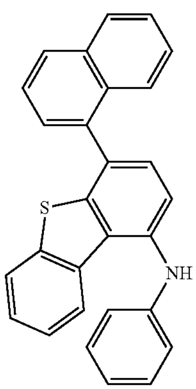
Sub1B-85
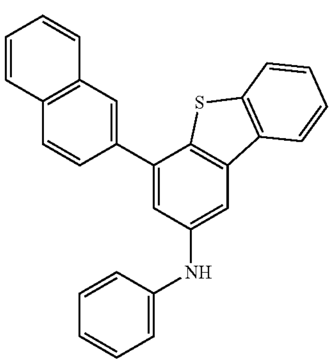
-continued
Sub1B-86
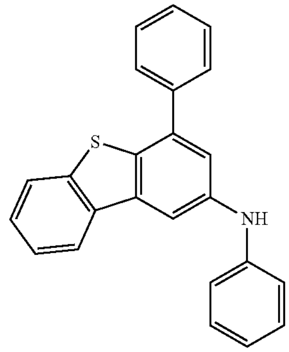
Sub1B-87
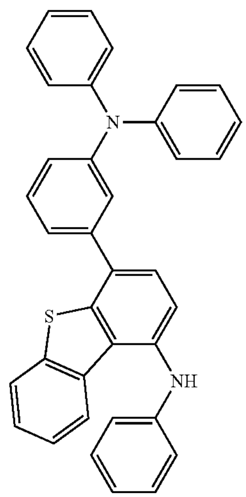
Sub1B-88
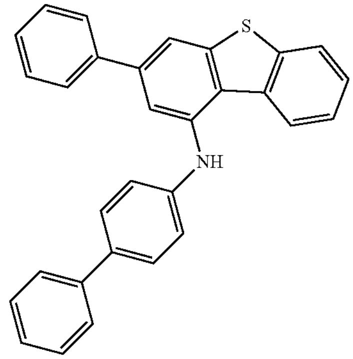

-continued
Sub1B-89
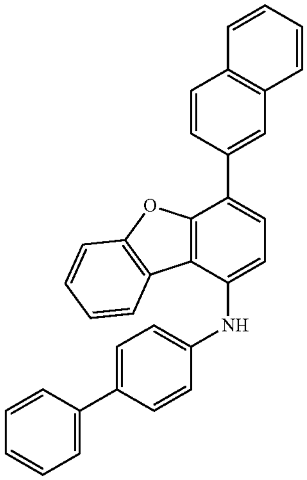
Sub1B-90
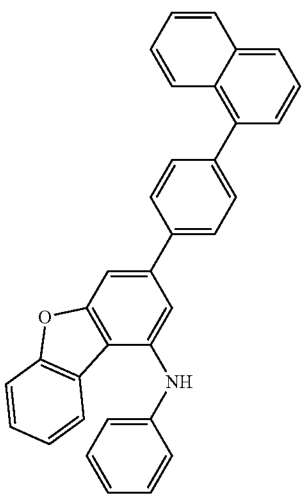
Sub1B-91
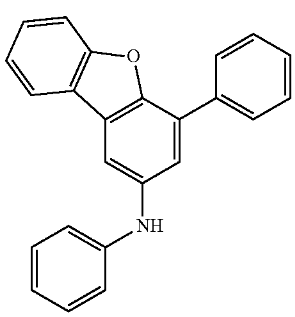
-continued
Sub1B-92
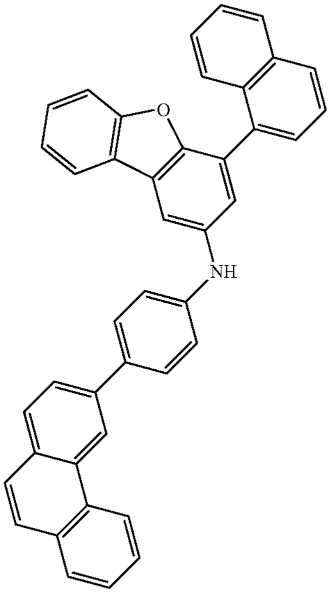
Sub1B-93
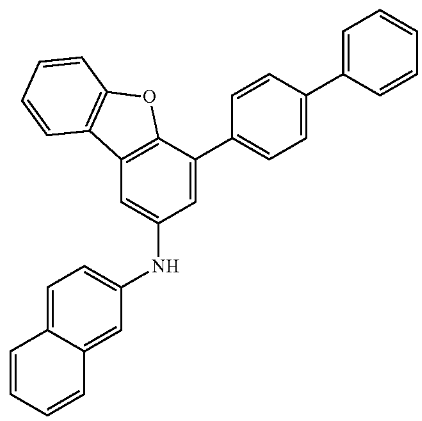
Sub1B-94
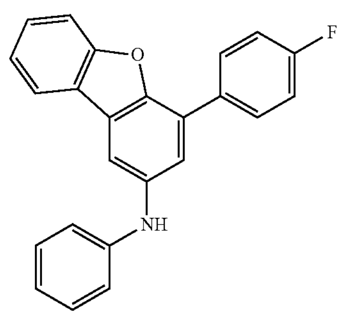
Sub1B-95
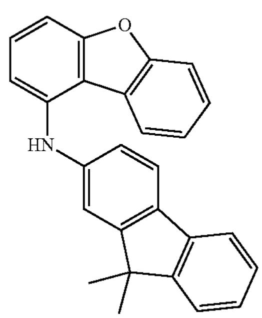

-continued
Sub1B-96
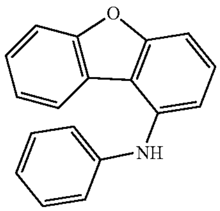
Sub1B-97
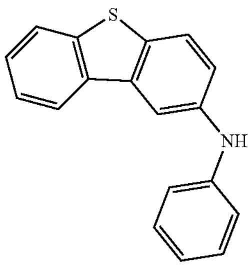
Sub1C-1
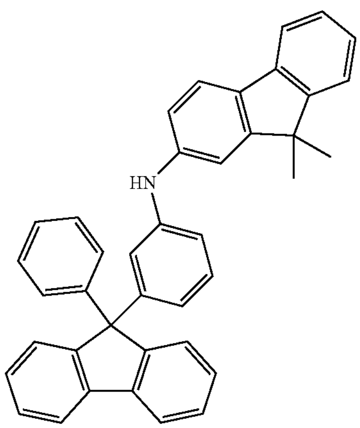
Sub1C-2
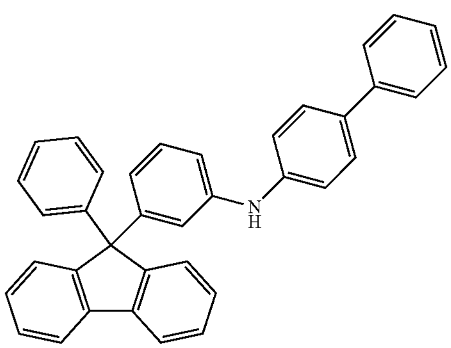
Sub1C-3
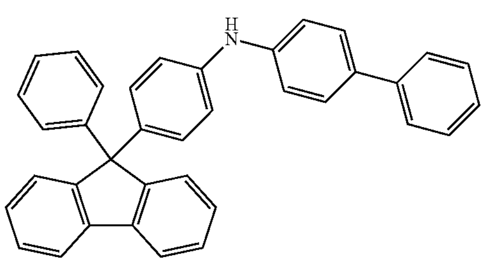
-continued
Sub1C-4
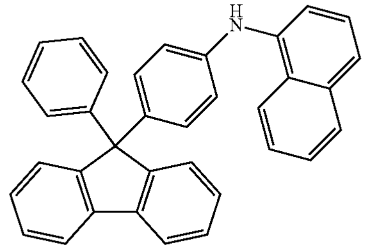
Sub1C-5
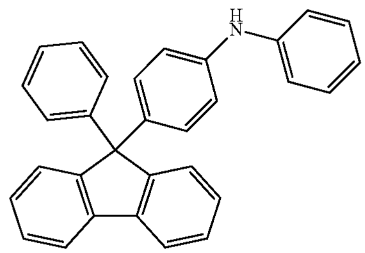
Sub1C-6
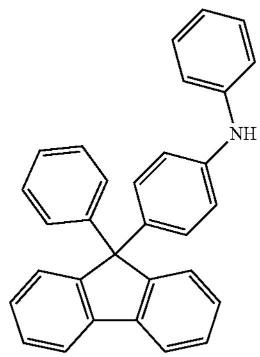
Sub1C-7
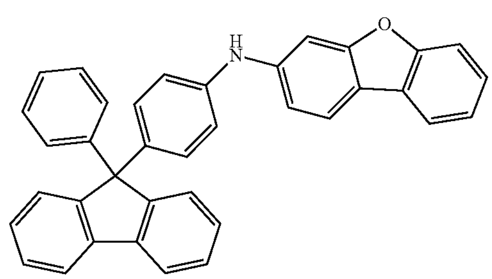
Sub1C-8
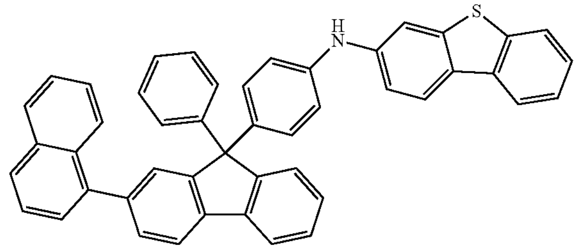

Sub1C-9
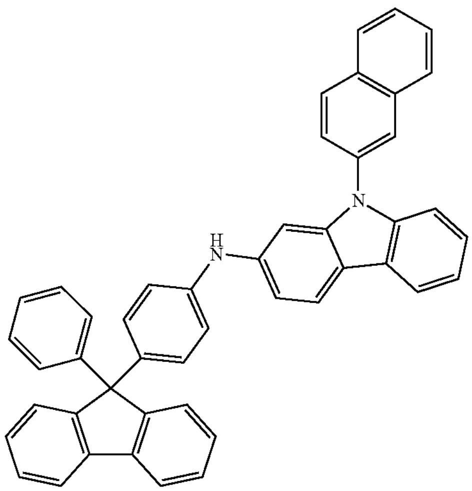
Sub1C-10
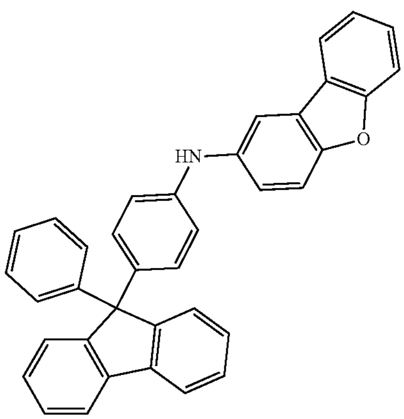
Sub1C-11
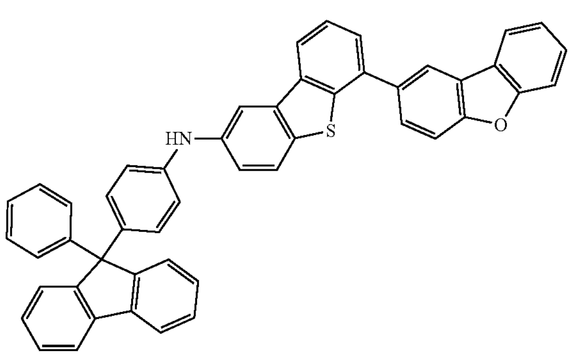
Sub1C-12
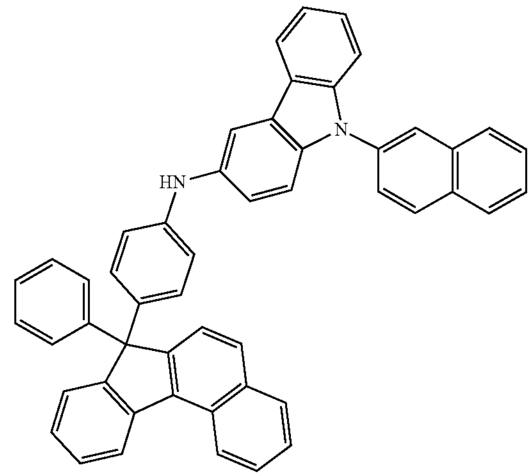
Sub1C-13
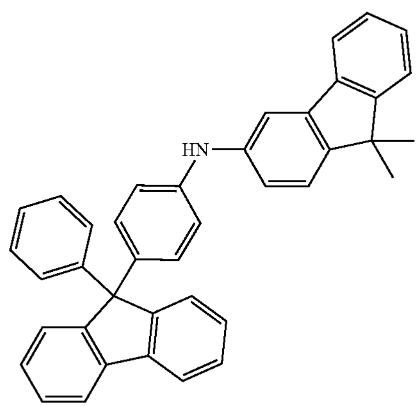
Sub1C-14
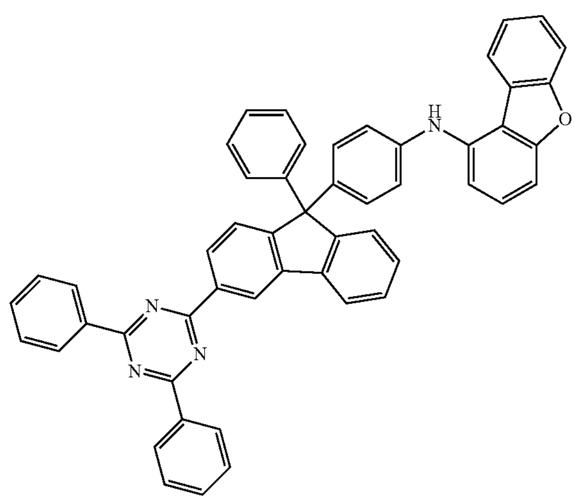

-continued
Sub1C-15
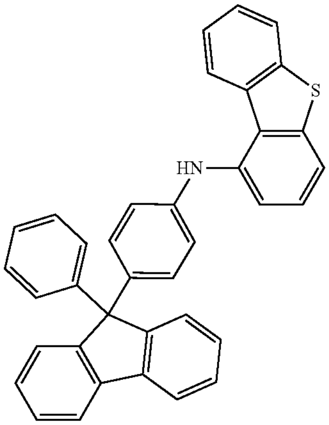
Sub1C-16
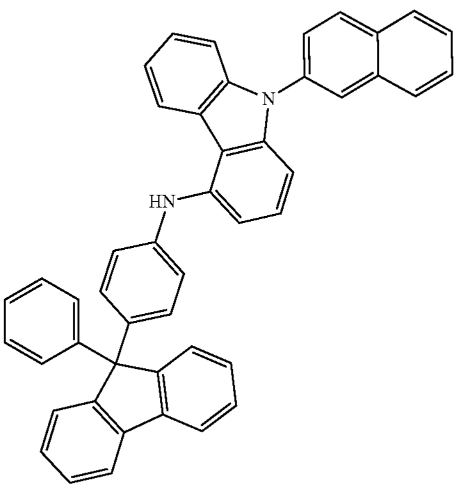
Sub1C-17
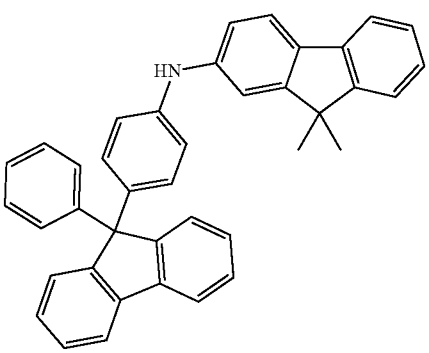
Sub1C-18
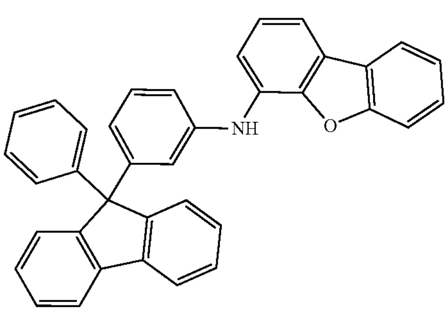
-continued
Sub1C-19
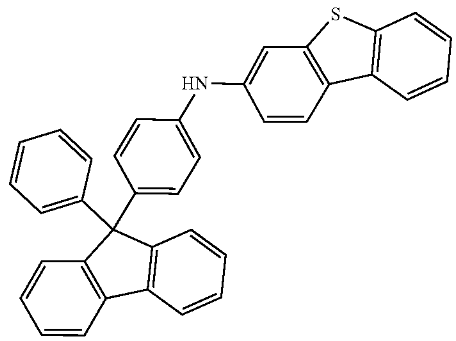
Sub1C-20
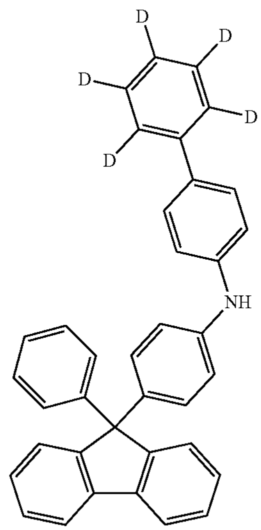
Sub1C-21
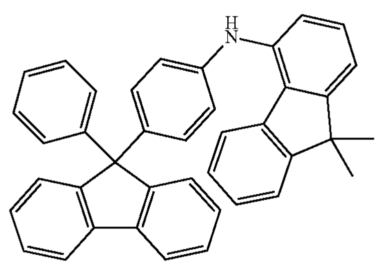
Sub1C-22
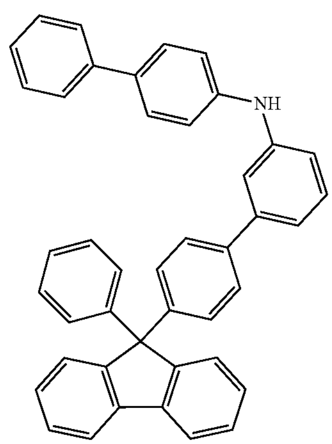

-continued
Sub1C-23
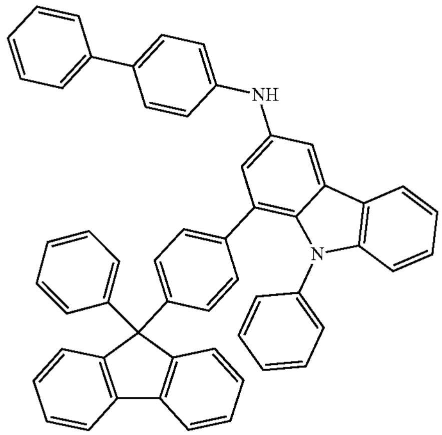
Sub1C-24
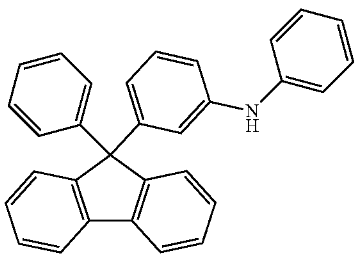
Sub1C-25
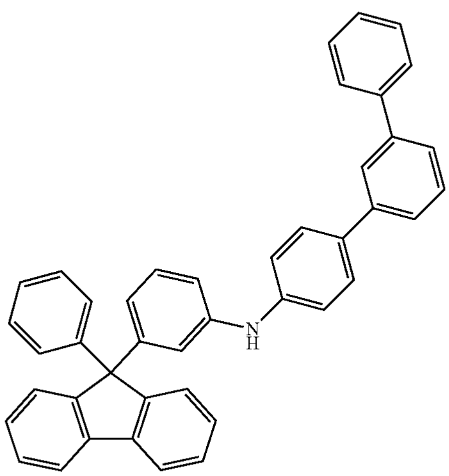
Sub1C-26
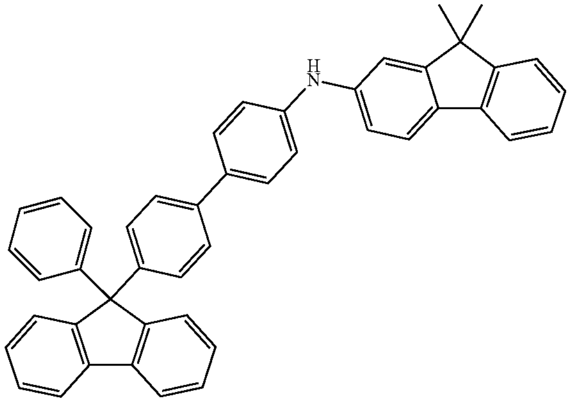
-continued
Sub1C-27
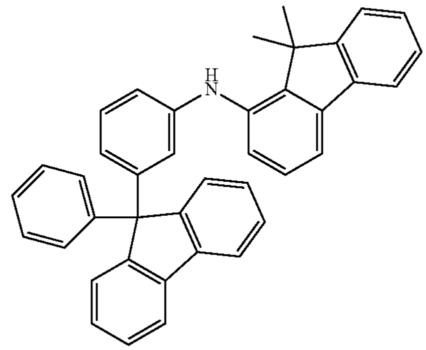
Sub1C-28
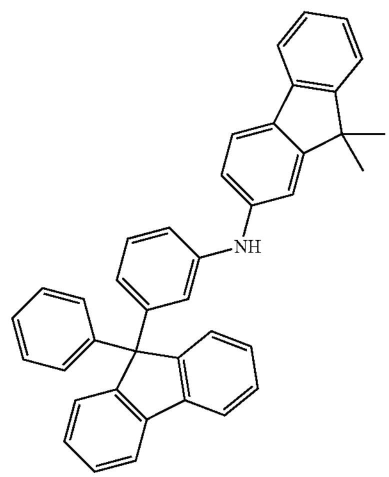
Sub1C-29
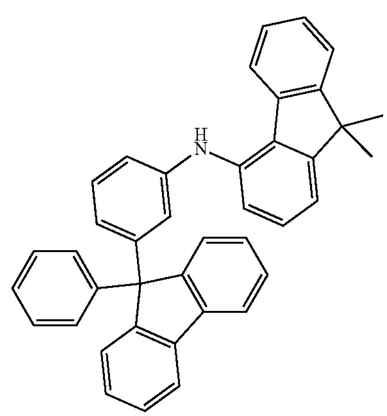

-continued
Sub1C-30
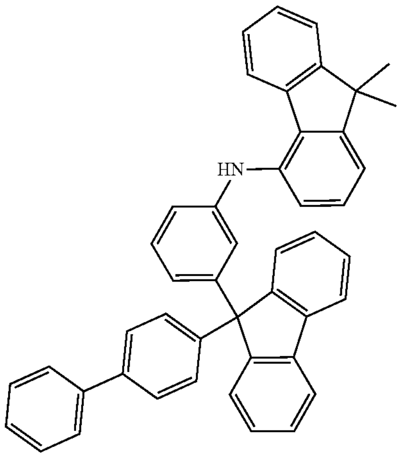
Sub1C-31
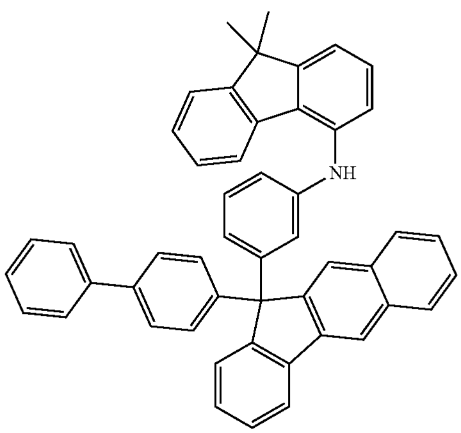
Sub1C-32
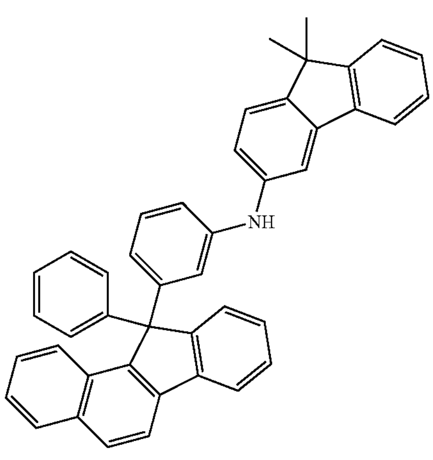
-continued
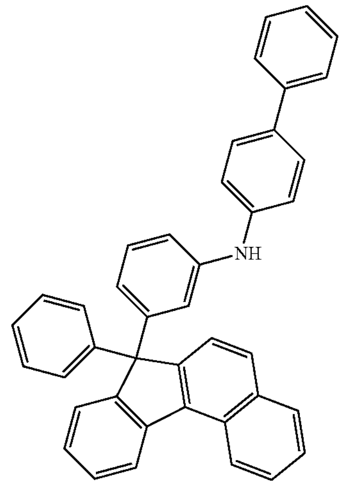
Sub1C-34
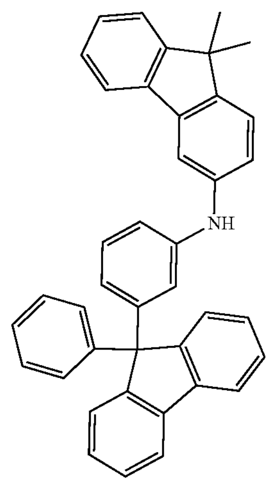
Sub1C-35
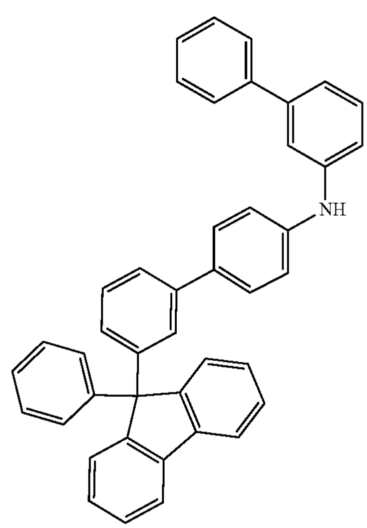

-continued
Sub1C-36
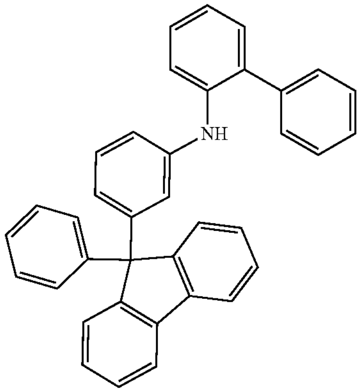
Sub1C-37
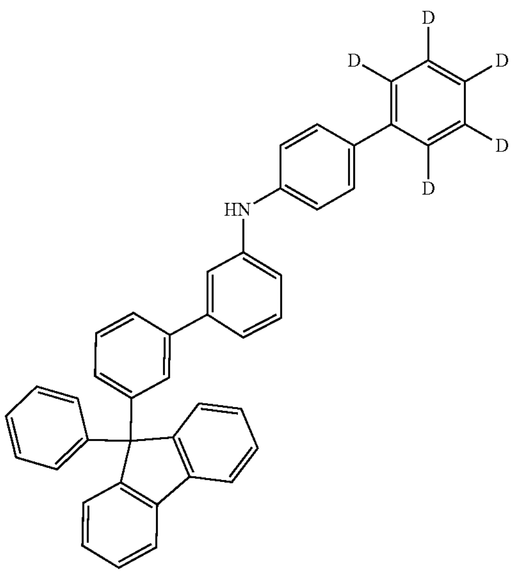
Sub1C-38
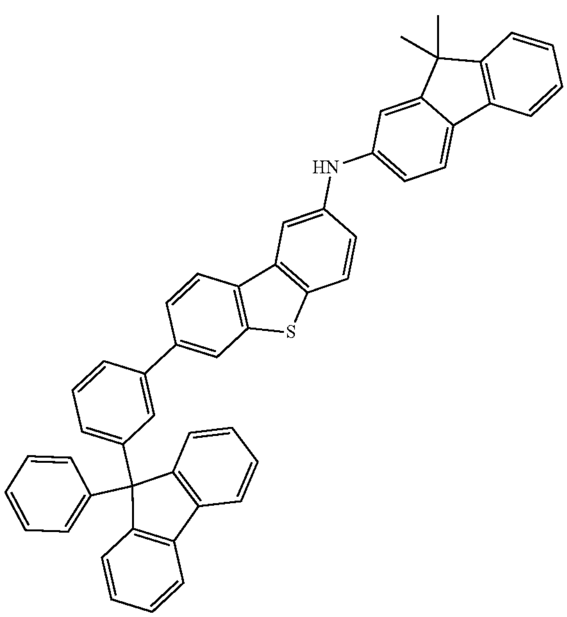
-continued
Sub1C-39
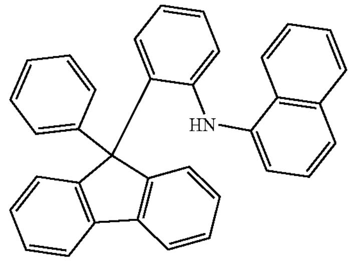
Sub1C-40
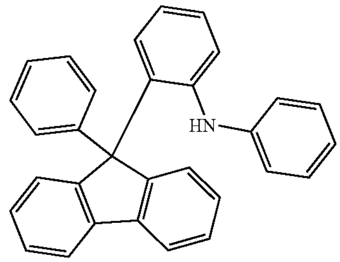
Sub1C-41
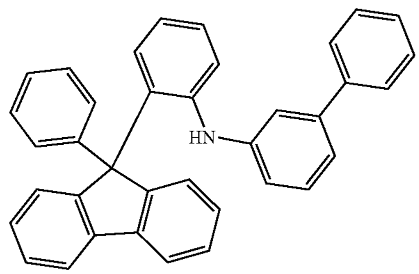
Sub1C-42
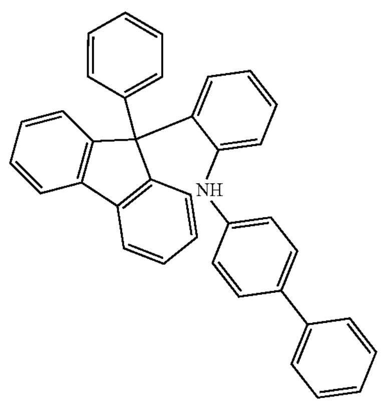
Sub1C-43
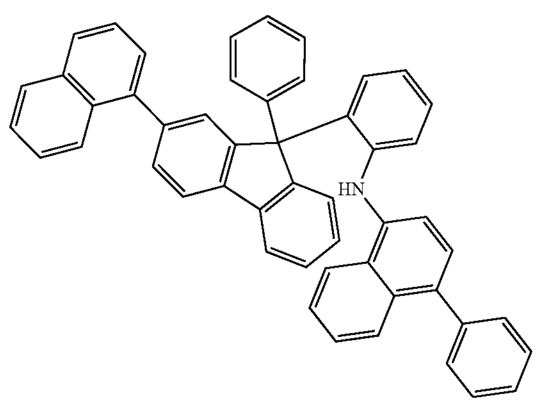

-continued
Sub1C-44
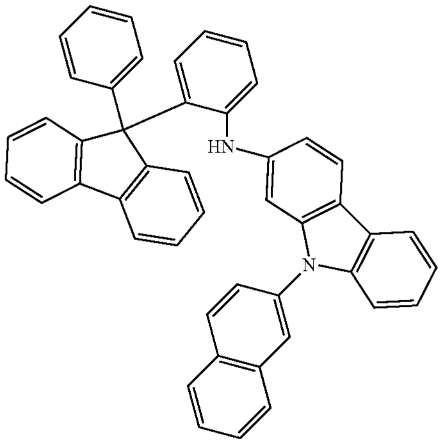
Sub1C-45
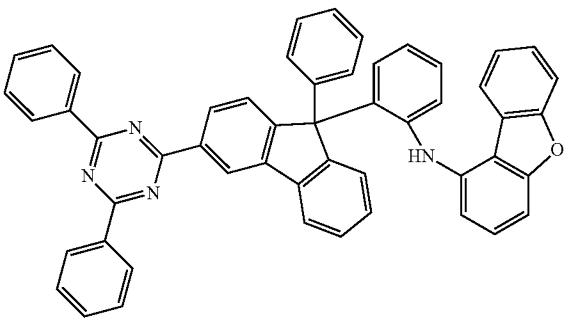
Sub1C-46
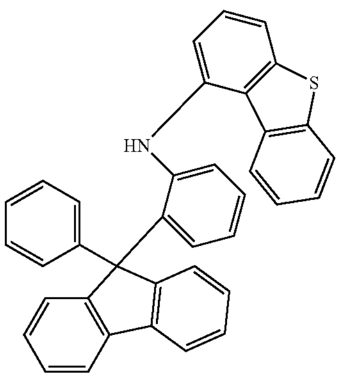
Sub1C-47
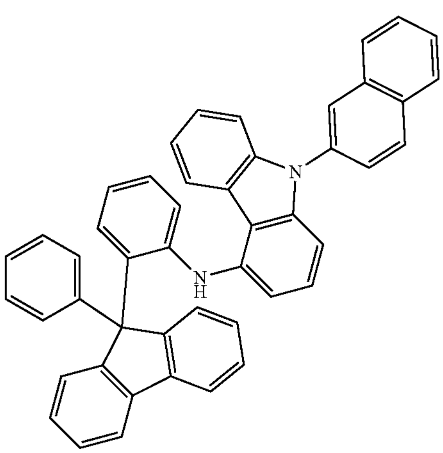
-continued
Sub1C-48
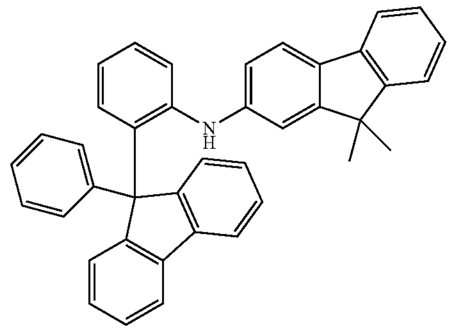
Sub1C-49
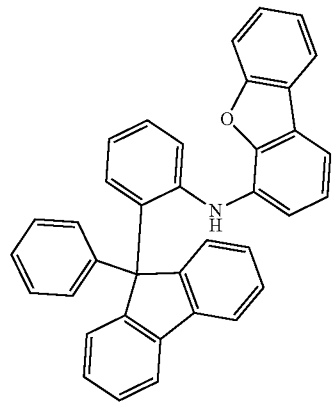
Sub1C-50
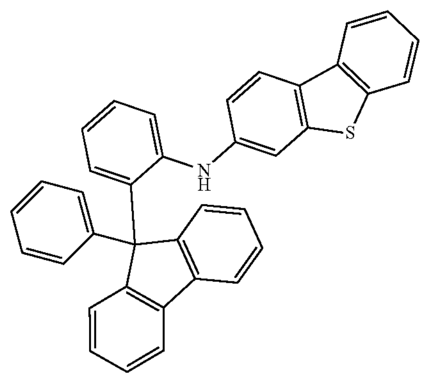
Sub1C-51
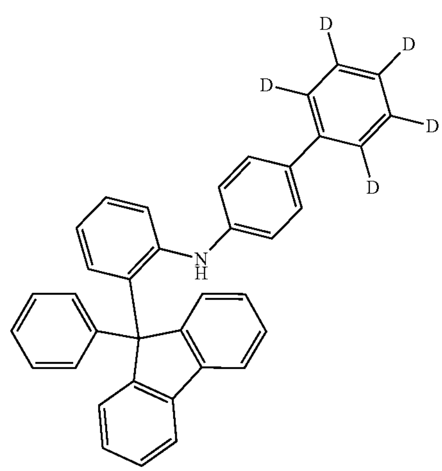

Sub1C-52
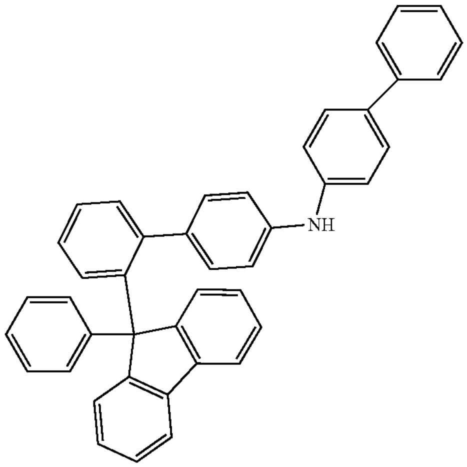
Sub1C-53
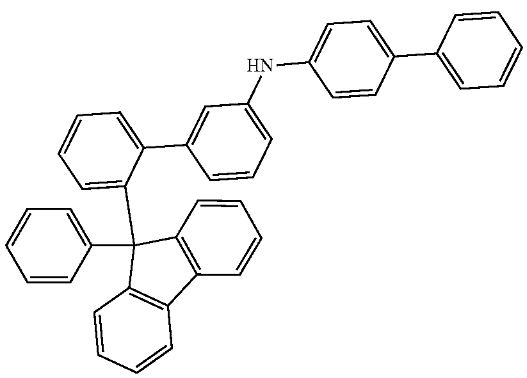
SUB1C-54
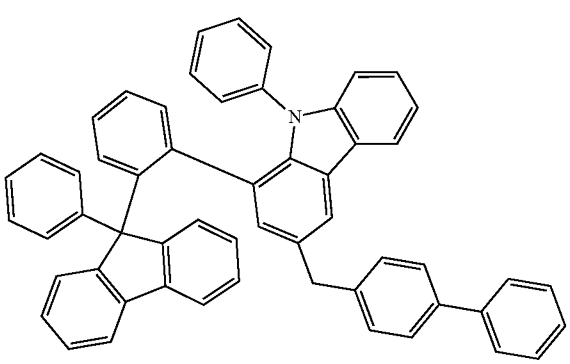
Sub1C-55
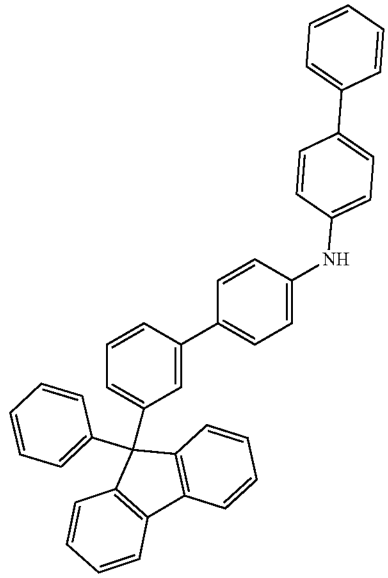
Sub1C-56
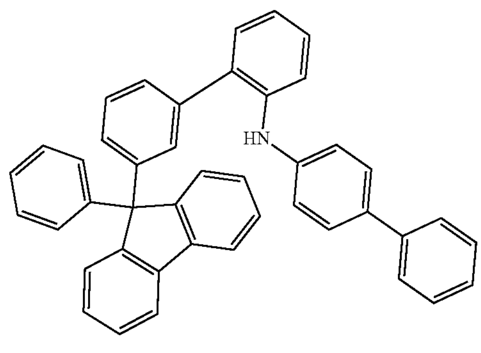
Sub1C-57
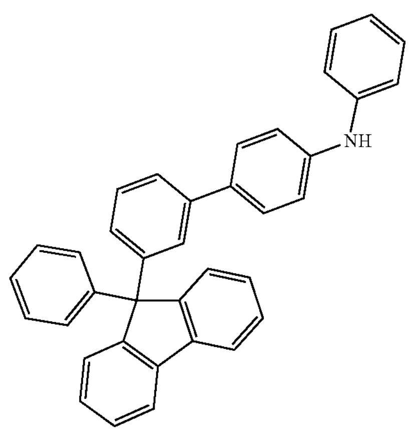

-continued
Sub1C-58
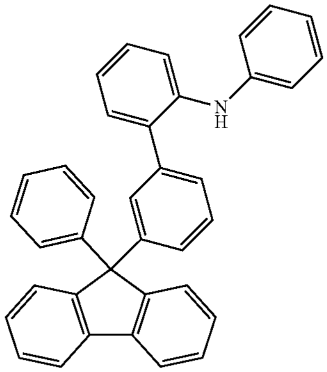
Sub1C-59
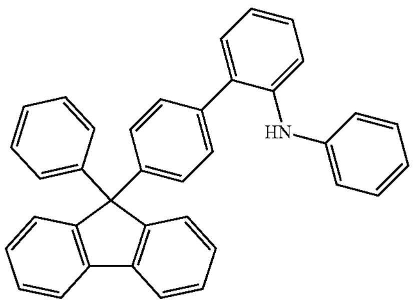
Sub1C-60
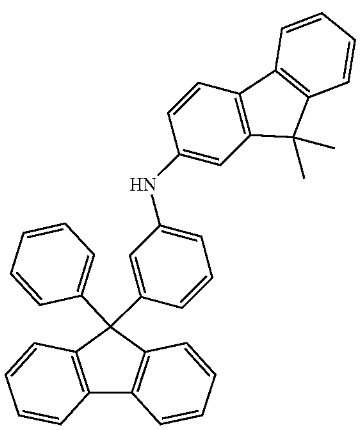
Sub1C-61
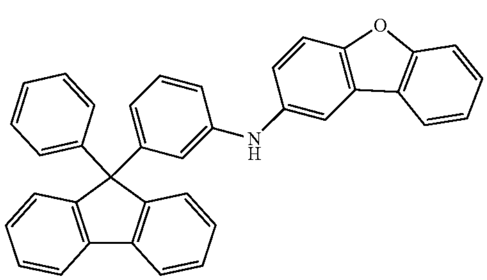
-continued
Sub1C-62
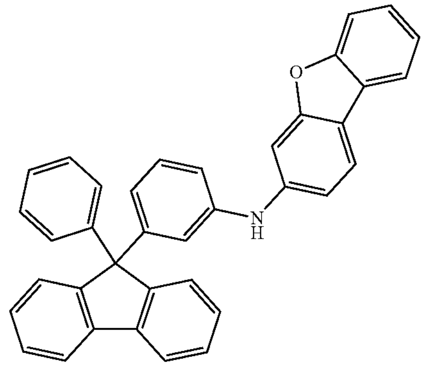
Sub1C-63
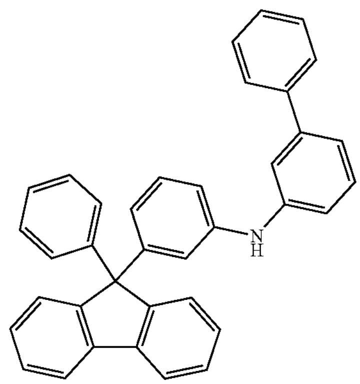
Sub1C-64
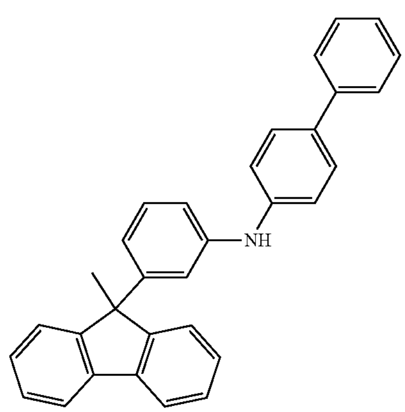

-continued
Sub1C-65
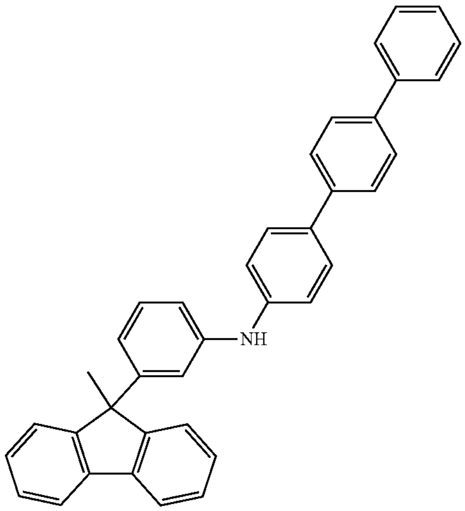
Sub1C-66
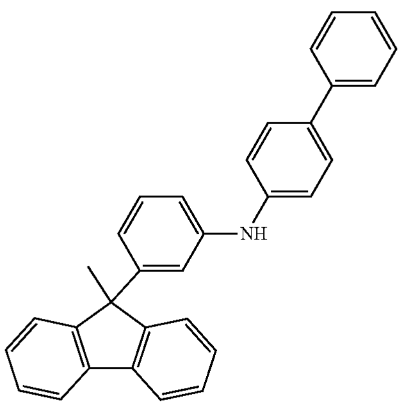
Sub1C-67
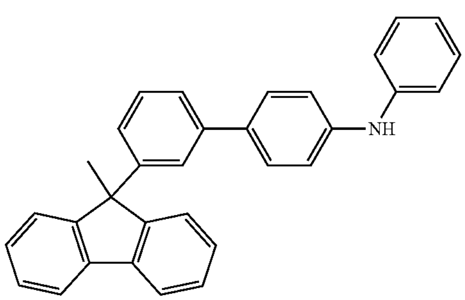
-continued
Sub1C-68
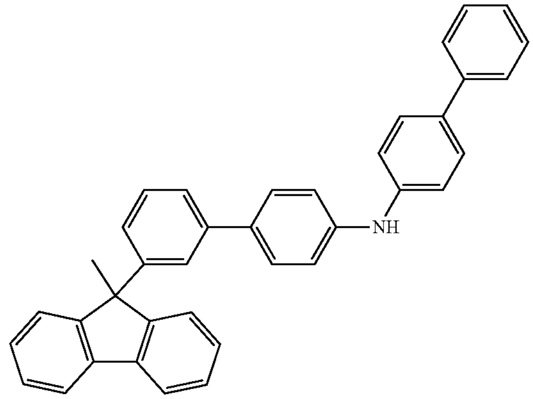
Sub1C-69
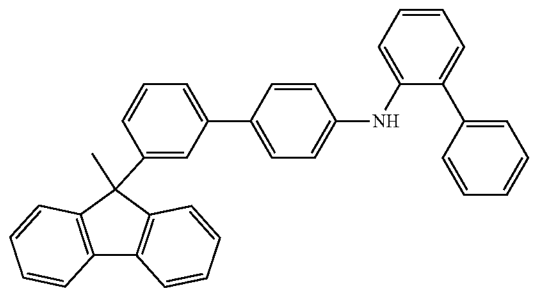
Sub1D-1
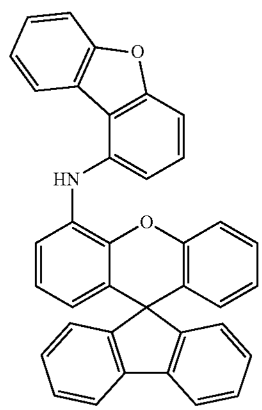
Sub1D-2
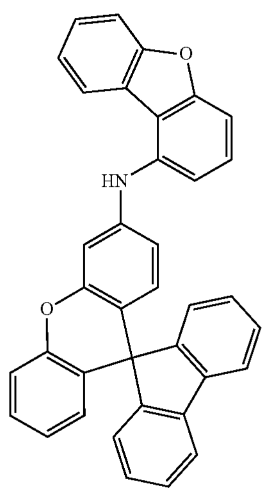

Sub1D-3
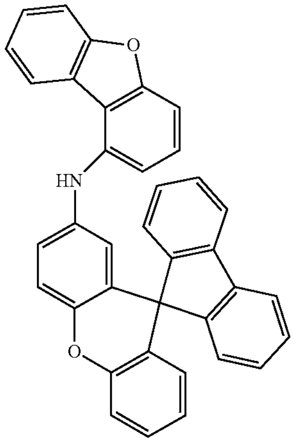
Sub1D-4
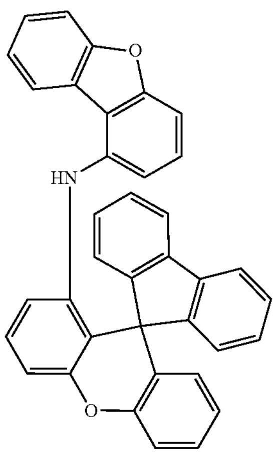
Sub1D-5
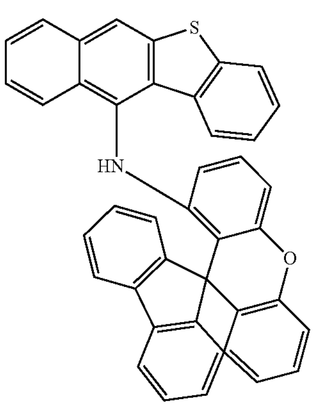
Sub1D-6
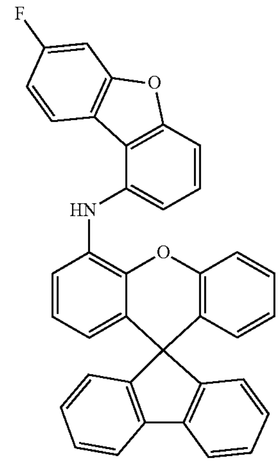
Sub1D-7
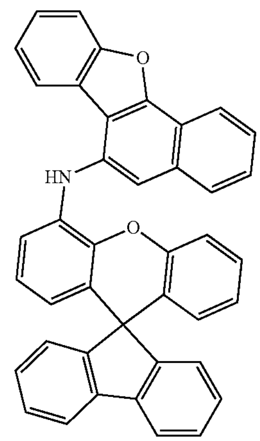
Sub1D-8
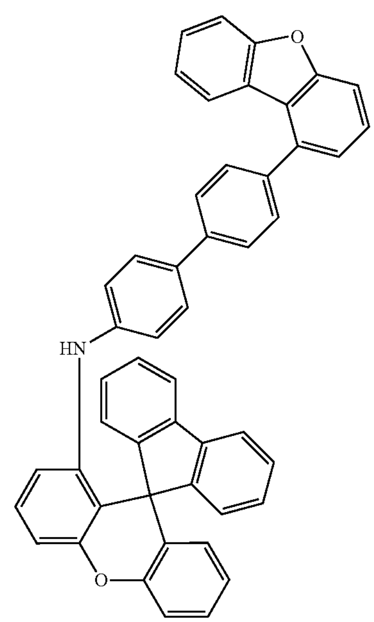

-continued
Sub1D-9
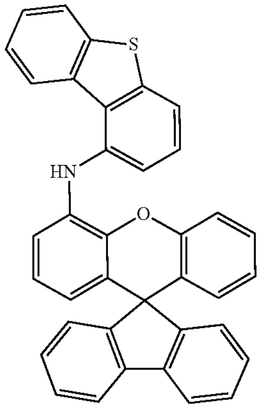
Sub1D-10
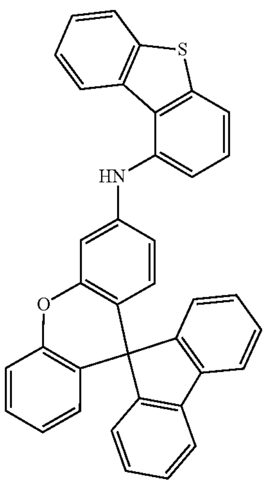
Sub1D-11
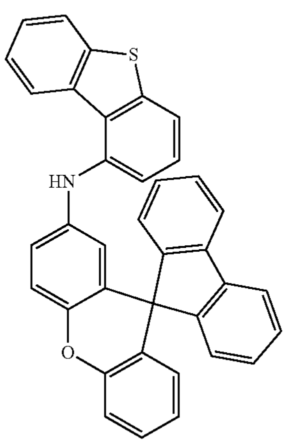
-continued
Sub1D-12
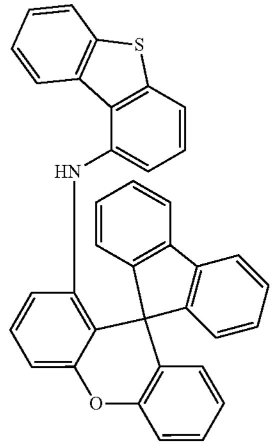
Sub1D-13
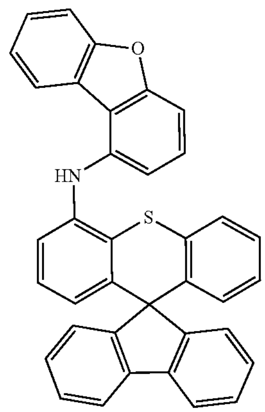
Sub1D-14
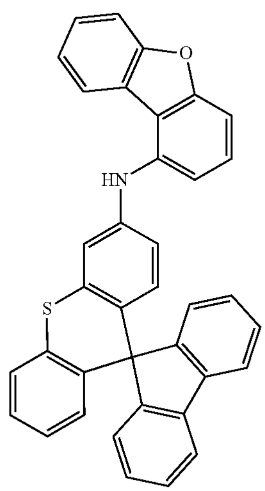

-continued
Sub1D-15
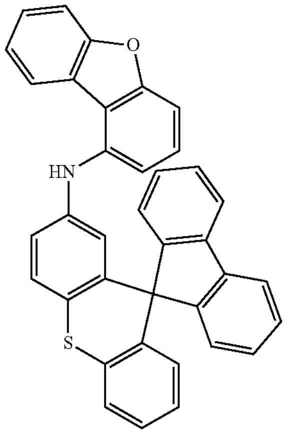
Sub1D-16
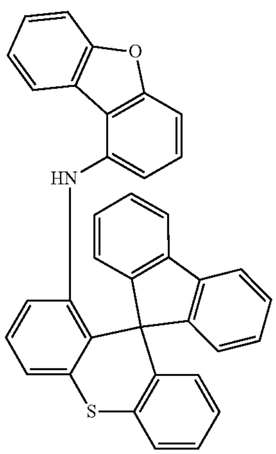
Sub1D-17
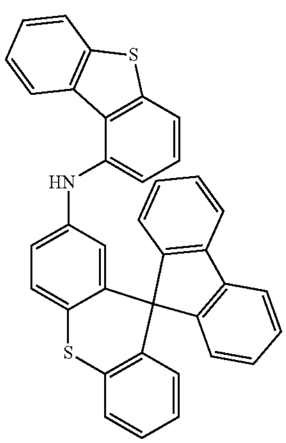
-continued
Sub1D-18
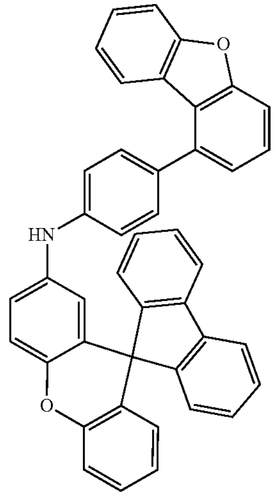
Sub1D-19
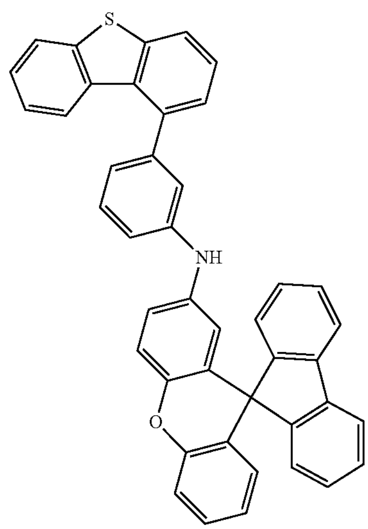
Sub1D-20
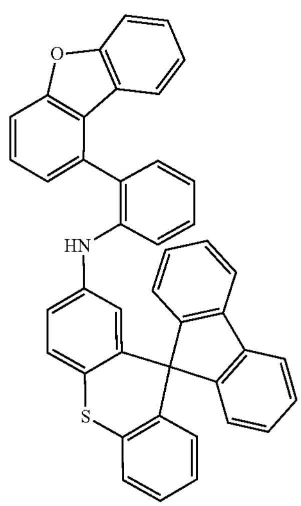

-continued
Sub1D-21
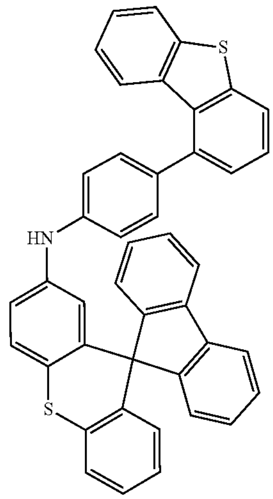
Sub1D-22
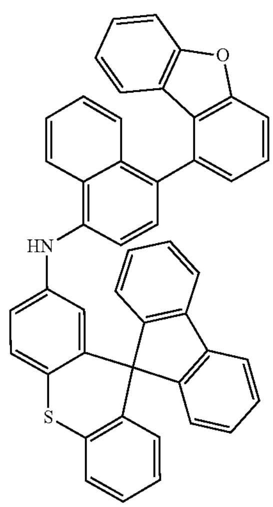
Sub1D-23
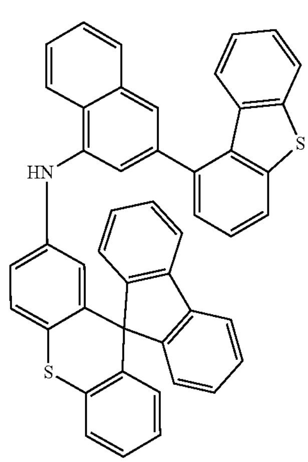
-continued
Sub1D-24
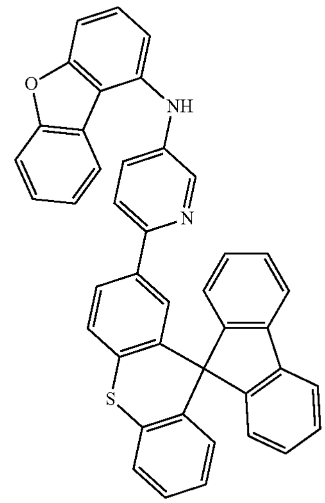
Sub1D-25
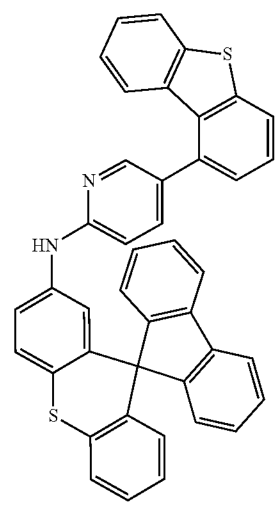
Sub1D-26
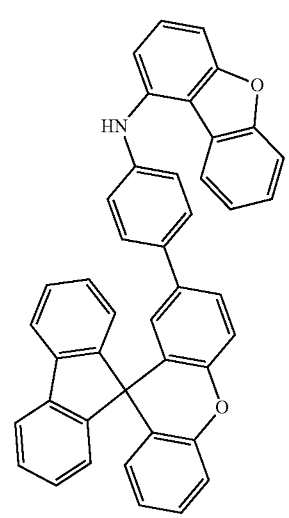

-continued
Sub1D-27
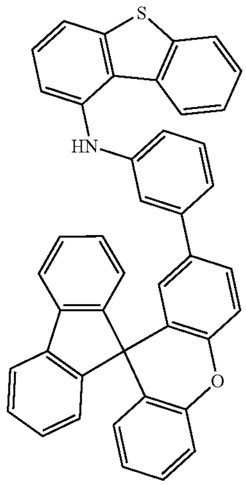
Sub1D-28
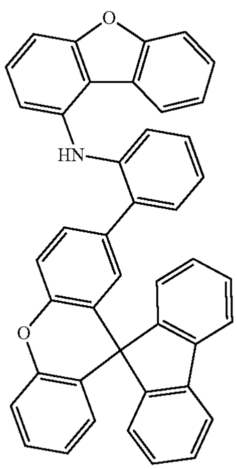
Sub1D-29
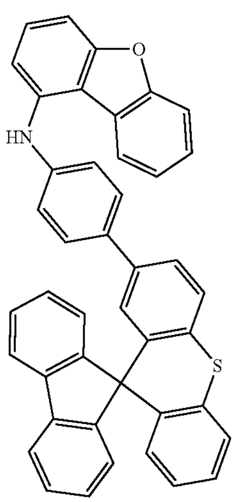
-continued
Sub1D-30
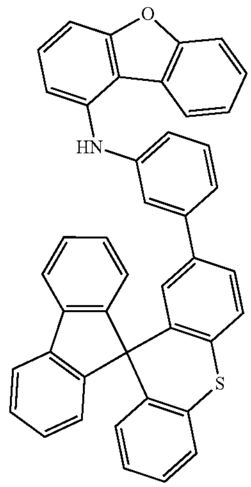
Sub1D-31
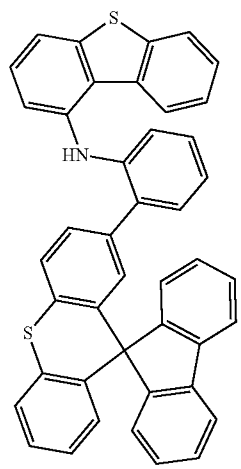
Sub1D-32
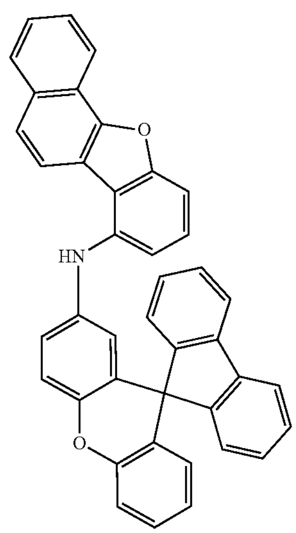

-continued
Sub1D-33
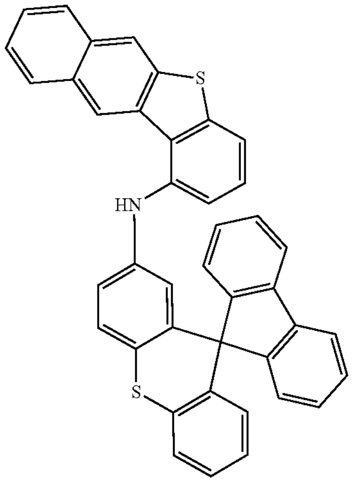
Sub1D-34
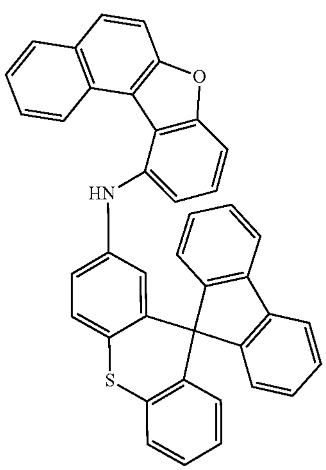
Sub1D-35
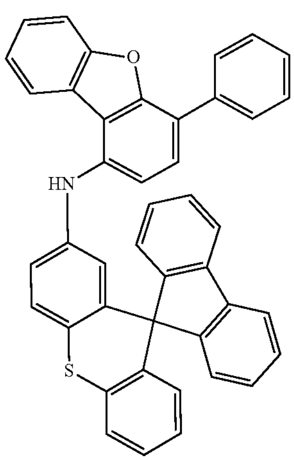
-continued
Sub1D-36
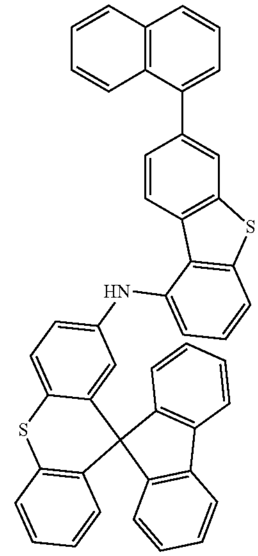
Sub1D-37
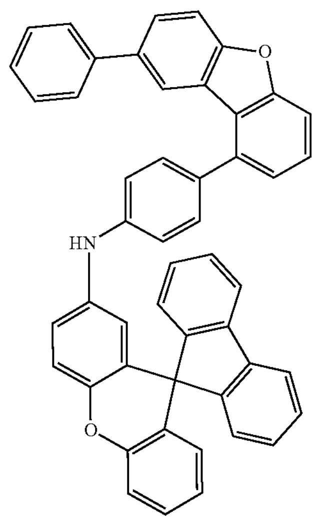
Sub1D-38
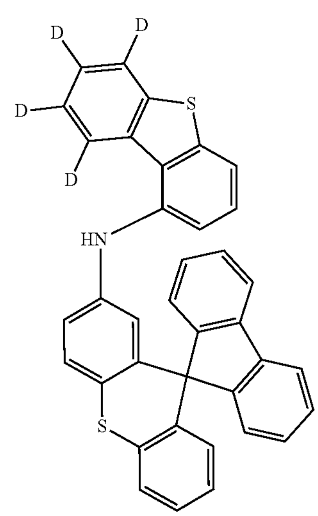

-continued
Sub1D-39
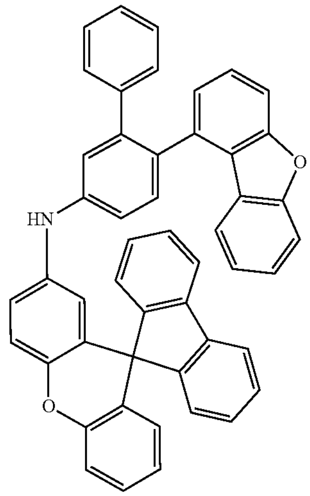
Sub1D-40
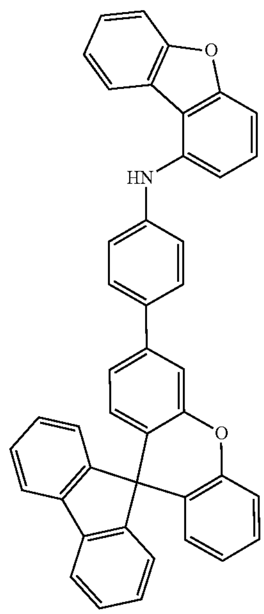
Sub1D-41
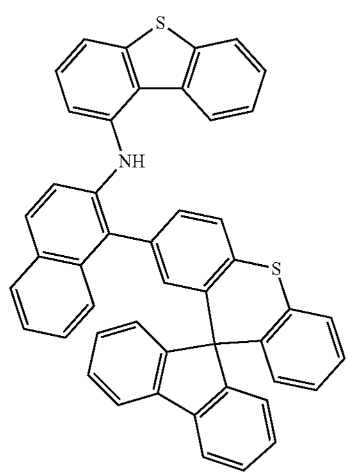
-continued
Sub1D-42
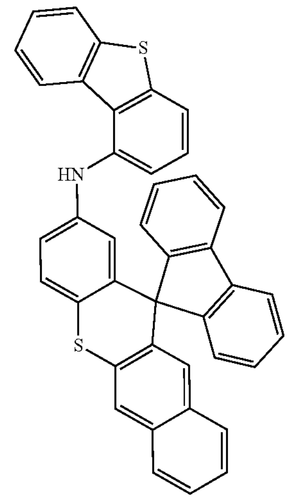
Sub1D-43
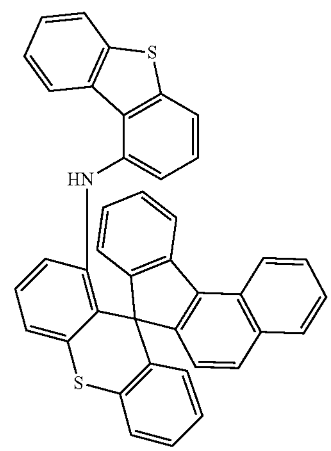
Sub1D-44
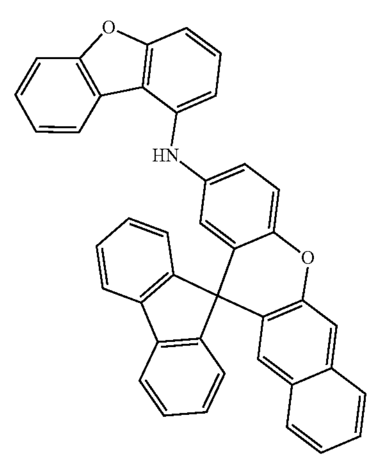

TABLE 1

| Compound | FD-MS | Compound | FD-MS |
|---|---|---|---|
| Sub1A-1 | m/z = 375.16($C_{27}H_{21}NO$ = 375.47) | Sub1A-2 | m/z = 375.16($C_{27}H_{21}NO$ = 375.47) |
| Sub1A-3 | m/z = 375.16($C_{27}H_{21}NO$ = 375.47) | Sub1A-4 | m/z = 391.14($C_{27}H_{21}NS$ = 391.53) |
| Sub1A-5 | m/z = 493.19($C_{37}H_{25}NO$ = 499.61) | Sub1A-6 | m/z = 499.19($C_{37}H_{25}NO$ = 499.61) |
| Sub1A-7 | m/z = 499.19($C_{37}H_{25}NO$ = 499.61) | Sub1A-3 | m/z = 499.19($C_{37}H_{25}NO$ = 499.61) |
| Sub1A-9 | m/z = 515.17($C_{37}H_{25}NS$ = 515.67) | Sub1A-18 | m/z = 497.18($C_{37}H_{23}NO$ = 497.60) |
| Sub1A-11 | m/z = 513.16($C_{37}H_{23}NS$ = 513.66) | Sub1A-12 | m/z = 451.19($C_{33}H_{25}NO$ = 451.57) |
| Sub1A-13 | m/z = 467.17($C_{33}H_{25}NS$ = 467.63) | Sub1A-14 | m/z = 451.19($C_{33}H_{25}NO$ = 451.57) |
| Sub1A-15 | m/z = 467.17($C_{33}H_{25}NS$ = 467.63) | Sub1A-16 | m/z = 451.19($C_{33}H_{25}NO$ = 451.57) |
| Sub1A-17 | m/z = 467.17($C_{33}H_{25}NS$ = 467.63) | Sub1A-18 | m/z = 451.19($C_{33}H_{25}NO$ = 451.57) |
| Sub1A-19 | m/z = 451.19($C_{33}H_{25}NO$ = 451.57) | Sub1A-29 | m/z = 451.19($C_{33}H_{25}NO$ = 451.57) |
| Sub1A-21 | m/z = 451.19($C_{33}H_{25}NO$ = 451.57) | Sub1A-22 | m/z = 467.17($C_{33}H_{25}NS$ = 467.63) |
| Sub1A-23 | m/z = 467.17($C_{33}H_{25}NS$ = 467.63) | Sub1A-24 | m/z = 467.17($C_{33}H_{25}NS$ = 467.63) |
| Sub1A-25 | m/z = 501.21($C_{37}H_{27}NO$ = 501.63) | Sub1A-26 | m/z = 517.19($C_{37}H_{27}NS$ = 517.69) |
| Sub1A-27 | m/z = 501.21($C_{37}H_{27}NO$ = 501.63) | Sub1A-28 | m/z = 517.19($C_{37}H_{27}NS$ = 517.69) |
| Sub1A-29 | m/z = 501.21($C_{37}H_{27}NO$ = 501.63) | Sub1A-30 | m/z = 517.19($C_{37}H_{27}NS$ = 517.69) |
| Sub1A-31 | m/z = 452.19($C_{32}H_{24}N_2O$ = 452.56) | Sub1A-32 | m/z = 583.23($C_{42}H_{33}NS$ = 583.79) |
| Sub1A-33 | m/z = 525.21($C_{39}H_{27}NO$ = 525.65) | Sub1A-34 | m/z = 519.20($C_{37}H_{21}D_4NS$ = 519.70) |
| Sub1A-35 | m/z = 527.22($C_{39}H_{29}NO$ = 527.67) | Sub1A-36 | m/z = 543.20($C_{39}H_{29}NS$ = 543.73) |
| Sub1A-37 | m/z = 527.22($C_{39}H_{29}NO$ = 527.67) | Sub1A-38 | m/z = 543.20($C_{39}H_{29}NS$ = 543.73) |
| Sub1A-39 | m/z = 543.20($C_{39}H_{29}NS$ = 543.73) | Sub1A-40 | m/z = 527.22($C_{39}H_{29}NO$ = 527.67) |
| Sub1A-41 | m/z = 527.22($C_{39}H_{29}NO$ = 527.67) | Sub1A-42 | m/z = 527.22($C_{39}H_{29}NO$ = 527.67) |
| Sub1A-43 | m/z = 543.20($C_{39}H_{29}NS$ = 543.73) | Sub1A-44 | m/z = 543.20($C_{39}H_{29}NS$ = 543.73) |
| Sub1A-45 | m/z = 452.19($C_{32}H_{24}N_2O$ = 452.56) | Sub1A-46 | m/z = 441.16($C_{31}H_{23}NS$ = 441.59) |
| Sub1A-47 | m/z = 441.16($C_{31}H_{23}NS$ = 441.59) | Sub1A-48 | m/z = 425.18($C_{31}H_{23}NO$ = 425.53) |
| Sub1A-49 | m/z = 425.18($C_{31}H_{23}NO$ = 425.53) | Sub1A-50 | m/z = 467.17($C_{33}H_{25}NS$ = 467.63) |
| Sub1A-51 | m/z = 577.24($C_{43}H_{31}NO$ = 577.73) | Sub1A-52 | m/z = 573.21($C_{43}H_{27}NO$ = 573.70) |
| Sub1A-53 | m/z = 497.18($C_{37}H_{23}NO$ = 497.60) | Sub1A-54 | m/z = 497.18($C_{37}H_{23}NO$ = 497.60) |
| Sub1A-55 | m/z = 513.16($C_{37}H_{23}NS$ = 513.66) | Sub1A-56 | m/z = 441.16($C_{31}H_{23}NS$ = 441.59) |
| Sub1A-57 | m/z = 549.21($C_{41}H_{27}NO$ = 549.67) | Sub1A-58 | m/z = 511.20($C_{31}H_{25}N$ = 411.55) |
| Sub1A-59 | m/z = 309.12($C_{22}H_{15}NO$ = 309.37) | | |
| Sub1B-1 | m/z = 335.13($C_{24}H_{17}NO$ = 335.41) | Sub1B-2 | m/z = 427.19($C_{31}H_{25}NO$ = 427.55) |
| Sub1B-3 | m/z = 561.21($C_{42}H_{27}NO$ = 561.68) | Sub1B-4 | m/z = 461.18($C_{34}H_{23}NO$ = 461.56) |
| Sub1B-5 | m/z = 461.18($C_{34}H_{23}NO$ = 461.56) | Sub1B-6 | m/z = 435.16($C_{24}H_{17}NO$ = 435.53) |
| Sub1B-7 | m/z = 335.13($C_{24}H_{17}NO$ = 335.41) | Sub1B-8 | m/z = 335.13($C_{32}H_{21}NO$ = 335.41) |
| Sub1B-9 | m/z = 527.22($C_{39}H_{29}NO$ = 527.67) | Sub1B-10 | m/z = 511.19($C_{38}H_{25}NO$ = 511.62) |
| Sub1B-11 | m/z = 487.19($C_{36}H_{25}NO$ = 487.60) | Sub1B-12 | m/z = 537.21($C_{40}H_{27}NO$ = 537.66) |
| Sub1B-13 | m/z = 435.16($C_{32}H_{21}NO$ = 435.53) | Sub1B-14 | m/z = 336.13($C_{23}H_{16}N_2O$ = 336.39) |
| Sub1B-15 | m/z = 452.15($C_{31}H_{20}N_2O_2$ = 452.51) | Sub1B-18 | m/z = 500.19($C_{36}H_{24}N_2O$ = 500.60) |
| Sub1B-17 | m/z = 465.20($C_{34}H_{19}D_4NO$ = 465.59) | Sub1B-18 | m/z = 482.11($C_{31}H_{18}N_2O_2S$ = 482.56) |
| Sub1B-19 | m/z = 567.17($C_{40}H_{25}NOS$ = 567.71) | Sub1B-29 | m/z = 351.11($C_{24}H_{17}NS$ = 351.47) |
| Sub1B-21 | m/z = 475.14($C_{34}H_{21}NS$ = 475.61) | Sub1B-22 | m/z = 477.16($C_{34}H_{23}NS$ = 477.63) |
| Sub1B-23 | m/z = 577.19($C_{42}H_{27}NS$ = 577.75) | Sub1B-24 | m/z = 477.16($C_{34}H_{23}NS$ = 477.63) |
| Sub1B-25 | m/z = 467.17($C_{33}H_{25}NS$ = 467.63) | Sub1B-26 | m/z = 427.14($C_{30}H_{21}NS$ = 427.57) |
| Sub1B-27 | m/z = 441.12($C_{30}H_{19}NOS$ = 441.55) | Sub1B-28 | m/z = 427.14($C_{30}H_{21}NS$ = 427.57) |
| Sub1B-29 | m/z = 457.10($C_{30}H_{19}NS_2$ = 457.61 ) | Sub1B-30 | m/z = 527.17($C_{38}H_{25}NS$ = 527.69) |
| Sub1B-31 | m/z = 517.15($C_{36}H_{23}NOS$ = 517.65) | Sub1B-32 | m/z = 352.10($C_{23}H_{16}N_2S$ = 352.46) |
| Sub1B-33 | m/z = 451.14($C_{32}H_{21}NS$ = 451.59) | Sub1B-34 | m/z = 553.19($C_{40}H_{27}NS$ = 553.72) |
| Sub1B-35 | m/z = 503.17($C_{36}H_{25}NS$ = 503.66) | Sub1B-36 | m/z = 451.14($C_{32}H_{21}NS$ = 451.59) |
| Sub1B-37 | m/z = 592.20($C_{42}H_{28}N_2S$ = 592.76) | Sub1B-38 | m/z = 583.14($C_{40}H_{25}NS_2$ = 583.77) |
| Sub1B-39 | m/z = 385.15($C_{28}H_{19}NO$ = 385.47) | Sub1B-40 | m/z = 352.10($C_{23}H_{16}N_2S$ = 352.46) |
| Sub1B-41 | m/z = 401.12($C_{28}H_{19}NS$ = 401.53) | Sub1B-42 | m/z = 477.16($C_{34}H_{23}NS$ = 477.63) |
| Sub1B-43 | m/z = 507.11($C_{34}H_{21}NS_2$ = 507.67) | Sub1B-44 | m/z = 553.19($C_{40}H_{27}NS$ = 553.72) |
| Sub1B-45 | m/z = 527.17($C_{38}H_{25}NS$ = 527.69) | Sub1B-46 | m/z = 517.15($C_{36}H_{23}NOS$ = 517.65) |
| Sub1B-47 | m/z = 498.09($C_{31}H_{18}N_2OS_2$ = 498.62) | Sub1B-48 | m/z = 427.14($C_{30}H_{21}NS$ = 427.57) |
| Sub1B-49 | m/z = 468.13($C_{31}H_{20}N_2OS$ = 468.57) | Sub1B-50 | m/z = 385.15($C_{28}H_{19}NO$ = 385.47) |
| Sub1B-51 | m/z = 441.12($C_{30}H_{19}NOS$ = 441.55) | Sub1B-52 | m/z = 367.14($C_{25}H_{21}NS$ = 367.51) |
| Sub1B-53 | m/z = 577.24($C_{43}H_{31}NO$ = 577.73) | Sub1B-54 | m/z = 351.16($C_{25}H_{21}NO$ = 351.45) |
| Sub1B-55 | m/z = 435.16($C_{32}H_{21}NO$ = 435.53) | Sub1B-56 | m/z = 451.19($C_{33}H_{25}NO$ = 451.57) |
| Sub1B-57 | m/z = 427.19($C_{31}H_{25}NO$ = 427.55) | Sub1B-58 | m/z = 441.12($C_{30}H_{19}NOS$ = 441.55) |
| Sub1B-59 | m/z = 477.21($C_{35}H_{27}NO$ = 477.61) | Sub1B-60 | m/z = 528.22($C_{38}H_{28}N_2O$ = 528.66) |
| Sub1B-61 | m/z = 375.13($C_{26}H_{17}NO_2$ = 375.43) | Sub1B-62 | m/z = 609.25($C_{44}H_{35}NS$ = 609.83) |
| Sub1B-63 | m/z = 533.18($C_{37}H_{27}NOS$ = 533.69) | Sub1B-64 | m/z = 507.17($C_{35}H_{25}NOS$ = 507.65) |
| Sub1B-65 | m/z = 572.16($C_{38}H_{24}N_2O_2S$ = 572.68) | Sub1B-66 | m/z = 391.10($C_{26}H_{17}NOS$ = 391.49) |
| Sub1B-67 | m/z = 724.25($C_{51}H_{36}N_2OS$ = 724.92) | Sub1B-68 | m/z = 527.22($C_{39}H_{29}NO$ = 527.67) |
| Sub1B-69 | m/z = 441.12($C_{30}H_{19}NOS$ = 441.55) | Sub1B-70 | m/z = 493.19($C_{35}H_{27}NS$ = 493.67) |
| Sub1B-71 | m/z = 467.17($C_{33}H_{25}NS$ = 467.63) | Sub1B-72 | m/z = 556.18($C_{38}H_{24}N_2O_3$ = 556.62) |
| Sub1B-73 | m/z = 475.16($C_{34}H_{21}NO_2$ = 475.55) | Sub1B-74 | m/z = 567.22($C_{41}H_{29}NO_2$ = 567.69) |
| Sub1B-75 | m/z = 627.26($C_{47}H_{33}NO$ = 627.79) | Sub1B-76 | m/z = 527.22($C_{39}H_{29}NO$ = 527.67) |
| Sub1B-77 | m/z = 335.13($C_{24}H_{17}NO$ = 335.41) | Sub1B-78 | m/z = 467.17($C_{33}H_{25}NS$ = 467.63) |
| Sub1B-79 | m/z = 501.17($C_{36}H_{23}NO_2$ = 501.59) | Sub1B-80 | m/z = 351.11($C_{24}H_{17}NS$ = 351.47) |
| Sub1B-81 | m/z = 351.11($C_{24}H_{17}NS$ = 351.47) | Sub1B-82 | m/z = 516.17($C_{36}H_{24}N_2S$ = 516.66) |
| Sub1B-83 | m/z = 708.31($C_{52}H_{40}N_2O$ = 708.91) | Sub1B-84 | m/z = 401.12($C_{28}H_{19}NS$ = 401.53) |
| Sub1B-85 | m/z = 401.12($C_{28}H_{19}NS$ = 401.53) | Sub1B-86 | m/z = 351.11($C_{24}H_{17}NS$ = 351.47) |
| Sub1B-87 | m/z = 518.18($C_{36}H_{26}N_2S$ = 518.68) | Sub1B-88 | m/z = 427.14($C_{30}H_{21}NS$ = 427.57) |
| Sub1B-89 | m/z = 461.18($C_{34}H_{23}NO$ = 461.56) | Sub1B-90 | m/z = 461.18($C_{34}H_{23}NO$ = 461.56) |
| Sub1B-91 | m/z = 335.13($C_{24}H_{17}NO$ = 335.41) | Sub1B-92 | m/z = 561.21($C_{42}H_{27}NO$ = 561.68) |
| Sub1B-93 | m/z = 461.18($C_{34}H_{23}NO$ = 461.56) | Sub1B-94 | m/z = 353.12($C_{24}H_{16}FNO$ = 353.40) |

TABLE 1-continued

| Compound | FD-MS | Compound | FD-MS |
|---|---|---|---|
| Sub1B-95 | m/z = 391.19($C_{28}H_{25}NO$ = 391.51) | Sub1B-96 | m/z = 259.10($C_{18}H_{13}NO$ = 259.31) |
| Sub1B-97 | m/z = 275.08($C_{18}H_{13}NS$ = 275.37) | | |
| Sub1C-1 | m/z = 525.25($C_{40}H_{31}N$ = 525.7) | Sub1C-2 | m/z = 485.21($C_{37}H_{27}N$ = 485.63) |
| Sub1C-3 | m/z = 485.21($C_{37}H_{27}N$ = 485.63) | Sub1C-4 | m/z = 459.2($C_{35}H_{25}N$ = 459.59) |
| Sub1C-5 | m/z = 409.18($C_{31}H_{23}N$ = 409.53) | Sub1C-6 | m/z = 409.18($C_{31}H_{23}N$ = 409.53) |
| Sub1C-7 | m/z = 499.19($C_{37}H_{25}NO$ = 499.61) | Sub1C-8 | m/z = 641.22($C_{47}H_{31}NS$ = 641.83) |
| Sub1C-9 | m/z = 624.26($C_{47}H_{32}N_2$ = 624.79) | Sub1C-10 | m/z = 499.19($C_{37}H_{25}NO$ = 499.61) |
| Sub1C-11 | m/z = 681.21($C_{49}H_{31}NOS$ = 681.85) | Sub1C-12 | m/z = 674.27($C_{51}H_{34}N_2$ = 674.85) |
| Sub1C-13 | m/z = 525.25($C_{40}H_{31}N$ = 525.7) | Sub1C-14 | m/z = 730.27($C_{52}H_{34}N_4O$ = 730.87) |
| Sub1C-15 | m/z = 515.17($C_{37}H_{25}NS$ = 515.67) | Sub1C-16 | m/z = 624.26($C_{47}H_{32}N_2$ = 624.79) |
| Sub1C-17 | m/z = 525.25($C_{40}H_{31}N$ = 525.7) | Sub1C-18 | m/z = 499.19($C_{37}H_{25}NO$ = 499.61) |
| Sub1C-19 | m/z = 515.17($C_{37}H_{25}NS$ = 515.67) | Sub1C-20 | m/z = 490.25($C_{37}H_{22}D_5N$ = 490.66) |
| Sub1C-21 | m/z = 525.25($C_{40}H_{31}N$ = 525.7) | Sub1C-22 | m/z = 561.25($C_{43}H_{31}N$ = 561.73) |
| Sub1C-23 | m/z = 726.3($C_{55}H_{38}N2$ = 726.92) | Sub1C-24 | m/z = 409.18($C_{31}H_{23}N$ = 409.53) |
| Sub1C-25 | m/z = 561.25($C_{43}H_{31}N$ = 561.73) | Sub1C-26 | m/z = 601.28($C_{46}H_{35}N$ = 601.79) |
| Sub1C-27 | m/z = 525.25($C_{40}H_{31}N$ = 525.7) | Sub1C-28 | m/z = 525.25($C_{40}H_{31}N$ = 525.7) |
| Sub1C-29 | m/z = 525.25($C_{40}H_{31}N$ = 525.7) | Sub1C-30 | m/z = 601.28($C_{46}H_{35}N$ = 601.79) |
| Sub1C-31 | m/z = 651.29($C_{50}H_{37}N$ = 651 .85) | Sub1C-32 | m/z = 575.26($C_{44}H_{33}N$ = 575.76) |
| Sub1C-33 | m/z = 535.23($C_{41}H_{29}N$ = 535.69) | Sub1C-34 | m/z = 525.25($C_{40}H_{31}N$ = 525.7) |
| Sub1C-35 | m/z = 561.25($C_{43}H_{31}N$ = 561.73) | Sub1C-36 | m/z = 485.21 ($C_{37}H_{27}N$ = 485.63) |
| Sub1C-37 | m/z = 566.28($C_{43}H_{26}D_5N$ = 566.76) | Sub1C-33 | m/z = 707.26($C_{52}H_{37}NS$ = 707.94) |
| Sub1C-39 | m/z = 459.2($C_{35}H_{25}N$ = 459.59) | Sub1C-40 | m/z = 409.18($C_{31}H_{23}N$ = 409.53) |
| Sub1C-41 | m/z = 485.21($C_{37}H_{27}N$ = 485.63) | Sub1C-42 | m/z = 485.21($C_{37}H_{27}N$ = 485.63) |
| Sub1C-43 | m/z = 661.28($C_{51}H_{35}N$ = 661.85) | Sub1C-44 | m/z = 624.26($C_{47}H_{32}N_2$ = 624.79) |
| Sub1C-45 | m/z = 730.27($C_{52}H_{34}N_4O$ = 730.87) | Sub1C-46 | m/z = 515.17($C_{37}H_{25}NS$ = 515.67) |
| Sub1C-47 | m/z = 624.26($C_{47}H_{32}N_2$ = 624.79) | Sub1C-48 | m/z = 525.25($C_{40}H_{31}N$ = 525.7) |
| Sub1C-49 | m/z = 499.19($C_{37}H_{25}NO$ = 499.61) | Sub1C-59 | m/z = 515.17($C_{37}H_{25}NS$ = 515.67) |
| Sub1C-51 | m/z = 490.25($C_{37}H_{22}D_5N$ = 490.66) | Sub1C-52 | m/z = 561.25($C_{43}H_{31}N$ = 561.73) |
| Sub1C-53 | m/z = 561.25($C_{43}H_{31}N$ = 561.73) | Sub1C-54 | m/z = 726.3($C_{55}H_{38}N_2$ = 726.92) |
| Sub1C-55 | m/z = 561.25($C_{43}H_{31}N$ = 561.73) | Sub1C-56 | m/z = 561.25($C_{43}H_{31}N$ = 561.73) |
| Sub1C-57 | m/z = 485.21($C_{37}H_{27}N$ = 485.63) | Sub1C-58 | m/z = 485.21($C_{37}H_{27}N$ = 485.63) |
| Sub1C-59 | m/z = 485.21($C_{37}H_{27}N$ = 485.63) | Sub1C-60 | m/z = 525.25($C_{40}H_{31}N$ = 525.7) |
| Sub1C-61 | m/z = 499.19($C_{37}H_{25}NO$ = 499.61) | Sub1C-62 | m/z = 499.19($C_{37}H_{25}NO$ = 499.61) |
| Sub1C-63 | m/z = 485.21($C_{37}H_{27}N$ = 485.63) | Sub1C-64 | m/z = 423.2($C_{32}H_{25}N$ = 423.56) |
| Sub1C-65 | m/z = 499.23($C_{38}H_{29}N$ = 499.66) | Sub1C-66 | m/z = 499.23($C_{38}H_{29}N$ = 499.66) |
| Sub1C-67 | m/z = 423.2($C_{32}H_{25}N$ = 423.56) | Sub1C-68 | m/z = 423.2($C_{32}H_{25}N$ = 423.56) |
| Sub1C-69 | m/z = 499.23($C_{38}H_{29}N$ = 499.66) | | |
| Sub1D-1 | m/z = 513.17($C_{37}H_{23}NO_2$ = 513.60) | Sub1D-2 | m/z = 513.17($C_{37}H_{23}NO_2$ = 513.60) |
| Sub1D-3 | m/z = 513.17($C_{37}H_{23}NO_2$ = 513.60) | Sub1D-4 | m/z = 513.17($C_{37}H_{23}NO_2$ = 513.60) |
| Sub1D-5 | m/z = 579.17($C_{41}H_{25}NOS$ = 579.72) | Sub1D-6 | m/z = 531.16($C_{37}H_{22}FNO_2$ = 531.59) |
| Sub1D-7 | m/z = 563.19($C_{41}H_{25}NO_2$ = 563.66) | Sub1D-8 | m/z = 665.24($C_{49}H_{31}NO_2$ = 665.79) |
| Sub1D-9 | m/z = 529.15($C_{37}H_{23}NOS$ = 529.66) | Sub1D-10 | m/z = 529.15($C_{37}H_{23}NOS$ = 529.66) |
| Sub1D-11 | m/z = 529.15($C_{37}H_{23}NOS$ = 529.66) | Sub1D-12 | m/z = 529.15($C_{37}H_{23}NOS$ = 529.66) |
| Sub1D-13 | m/z = 529.15($C_{37}H_{23}NOS$ = 529.66) | Sub1D-14 | m/z = 529.15($C_{37}H_{23}NOS$ = 529.66) |
| Sub1D-15 | m/z = 529.15($C_{37}H_{23}NOS$ = 529.66) | Sub1D-16 | m/z = 529.15($C_{37}H_{23}NOS$ = 529.66) |
| Sub1D-17 | m/z = 545.13($C_{37}H_{23}NS_2$ = 545.72) | Sub1D-18 | m/z = 589.20($C_{43}H_{27}NO_2$ = 589.69) |
| Sub1D-19 | m/z = 605.18($C_{43}H_{27}NOS$ = 605.76) | Sub1D-20 | m/z = 605.18($C_{43}H_{27}NOS$ = 605.76) |
| Sub1D-21 | m/z = 621.16($C_{43}H_{27}NS_2$ = 621.82) | Sub1D-22 | m/z = 655.20($C_{47}H_{29}NOS$ = 655.82) |
| Sub1D-23 | m/z = 671.17($C_{47}H_{29}NS_2$ = 671.88) | Sub1D-24 | m/z = 606.18($C_{42}H_{26}N_2OS$ = 606.74) |
| Sub1D-25 | m/z = 622.15($C_{42}H_{26}N_2S_2$ = 622.80) | Sub1D-26 | m/z = 589.20($C_{43}H_{27}NO_2$ = 589.69) |
| Sub1D-27 | m/z = 605.18($C_{43}H_{27}NOS$ = 605.76) | Sub1D-28 | m/z = 589.20($C_{43}H_{27}NO_2$ = 589.69) |
| Sub1D-29 | m/z = 605.18($C_{43}H_{27}NOS$ = 605.76) | Sub1D-30 | m/z = 605.18($C_{43}H_{27}NOS$ = 605.76) |
| Sub1D-31 | m/z = 621.16($C_{43}H_{27}NS_2$ = 621.82) | Sub1D-32 | m/z = 563.19($C_{41}H_{25}NO_2$ = 563.66) |
| Sub1D-33 | m/z = 595.14($C_{41}H_{25}NS_2$ = 595.78) | Sub1D-34 | m/z = 579.17($C_{41}H_{25}NOS$ = 579.72) |
| Sub1D-35 | m/z = 605.18($C_{43}H_{27}NOS$ = 605.76) | Sub1D-36 | m/z = 671.17($C_{47}H_{29}NS_2$ = 671.88) |
| Sub1D-37 | m/z = 665.24($C_{49}H_{31}NO_2$ = 665.79) | Sub1D-38 | m/z = 549.15($C_{37}H_{19}D_4NS_2$ = 549.74) |
| Sub1D-39 | m/z = 665.24($C_{49}H_{31}NO_2$ = 665.79) | Sub1D-40 | m/z = 589.20($C_{43}H_{27}NO_2$ = 589.69) |
| Sub1D-41 | m/z = 671.17($C_{47}H_{29}NS_2$ = 671.88) | Sub1D-42 | m/z = 595.14($C_{41}H_{25}NS_2$ = 595.78) |
| Sub1D-42 | m/z = 595.14($C_{41}H_{25}NS_2$ = 595.78) | Sub1D-44 | m/z = 563.19($C_{41}H_{25}NO_2$ = 563.66) |

Synthesis Example of Sub 2

Sub 2 of Reaction Scheme 1 may be synthesized by the following Reaction Scheme 3, but are not limited thereto.

<Reaction Scheme 3>

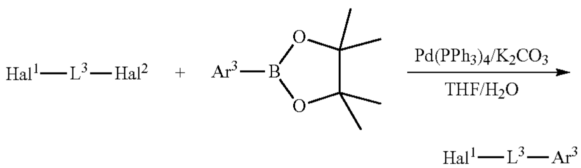

Sub 2

(Hal[1] and Hal[2] are each independently I, Br or Cl.)

1. Synthesis Example of Sub2B-1

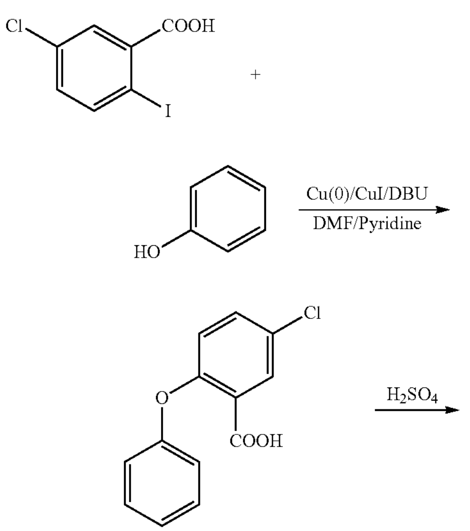

Sub2B-1-a

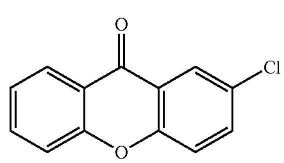

Sub2B-1-b

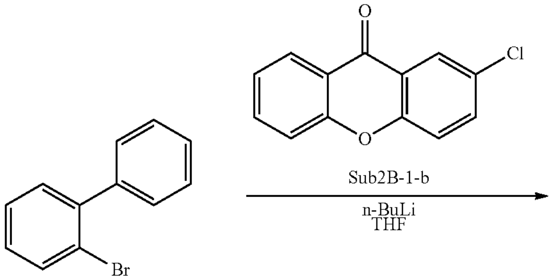

-continued

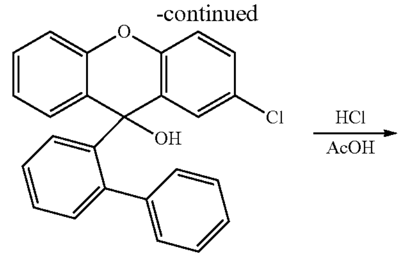

Sub2B-1-c

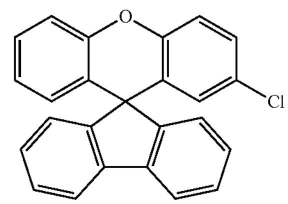

Sub2B-1

(1) Synthesis Example of Sub2B-1-a

After 5-chloro-2-iodobenzoic acid (50.0 g, 177 mmol), phenol (33.3 g, 354 mmol), 1,8-diazabicyclo[5.4.0]undec-7-ene (DBU) (80.9 g, 531 mmol), pyridine (2.9 mL), Copper powder (1.5 g, 23 mmol) and CuI (1.5 g, 7.97 mmol) were placed in a round-bottom flask, and DMF (1.2 L) was added thereto, the mixture was refluxed for 3 hours. When the reaction was complete, the reaction product was cooled to room temperature and then 3M HCl was added the reaction product until precipitation was complete. Then, the precipitate was washed with water and dried to obtain 38.3 g (yield 87%) of the product.

(2) Synthesis Example of Sub2B-1-b

After Sub2B-1-a (38.3 g, 154 mmol) were placed in a round-bottom flask and $H_2SO_4$ (1.1 mL, 21.5 mmol) was added thereto, the mixture was refluxed until all the starting materials were dissolved. When all the starting materials were dissolved, the mixture was cooled to room temperature and then ice water was added to precipitate. Then, the precipitate is washed with water, dried and dissolved with $CH_2Cl_2$. Thereafter, the solution was separated by silica gel column and recrystallized to obtain 23.09 g (yield 65%) of the product.

(3) Synthesis Example of Sub2B-1-c 2-bromo-1,1'-biphenyl (23.3 g, 99.7 mmol) was dissolved in THF (270 mL) in a round-bottom flask under a nitrogen atmosphere and the mixture was cooled to −78° C. Thereafter, n-BuLi (40 mL) was slowly titrated to the mixture, followed by stirring for 30 minutes. Then, after dissolving Sub2B-1-b (23 g, 99.7 mmol) in TIF (140 mL) and the solution was slowly titrated to the round bottom flask being the reaction in progress. Then, the reaction mixture was stirred at −78° C. for 1 hour, and then slowly raised to room temperature. When the reaction was completed, the reaction product was extracted with ethyl acetate and water. Then, an organic layer was dried over $MgSO_4$ and concentrated. Then, the concentrate was separated by a silica gel column and recrystallized to obtain 32.6 g (yield 85%) of the product.

(4) Synthesis Example of Sub2B-1

Sub2B-1-c (32 g, 84.7 mmol), acetic acid (208 mL) and concentrated hydrochloric acid (34.6 mL) were placed in a round-bottom flask and the mixture was stirred at 60-80° C. under nitrogen atmosphere for 3 hours. When the reaction was completed, the reaction product was extracted with $CH_2Cl_2$ and water. Then, an organic layer was dried over $MgSO_4$ and concentrated. Then, the concentrate was separated by a silica gel column and recrystallized to obtain 27.7 g (yield 91%) of the product.

2. Synthesis Example of Sub2B-11

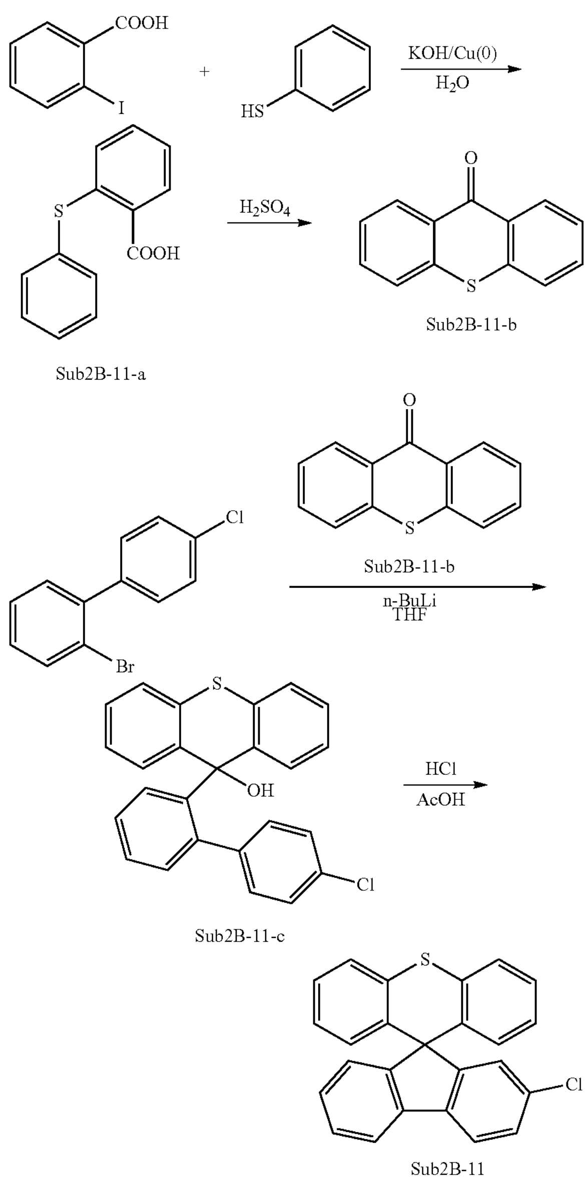

(1) Synthesis Example of Sub2B-11-a

After 2-iodobenzoic acid (50.0 g, 202 mmol), thiophenol (22.2 g, 202 mmol), potassium hydroxide (56.6 g, 1008 mmol) and Copper powder (1.3 g, 20.2 mmol) were placed in a round-bottom flask and water (1.3 L) was added thereto, the mixture was refluxed for 12 hours. When the reaction was complete, the reaction product was cooled to room temperature and then 3M HCl was added the reaction product until precipitation was complete. Then, the precipitate was washed with water and dried to obtain 41.3 g (yield 89%) of the product.

(2) Synthesis Example of Sub2B-11-b

After Sub2B-11-a (41.3 g, 179 mmol) were placed in a round-bottom flask and $H_2SO_4$ (1.3 mL) was added thereto, the mixture was refluxed until all the starting materials were dissolved. When all the starting materials were dissolved, the mixture was cooled to room temperature and then ice water was added to precipitate. Then, the precipitate is washed with water, dried and dissolved with $CH_2Cl_2$. Thereafter, the solution was separated by silica gel column and recrystallized to obtain 25.9 g (yield 68%) of the product.

(3) Synthesis Example of Sub2B-11-c 2-bromo-4'-chloro-1,1'-biphenyl (32.6 g, 122 mmol) was dissolved in THF in a round-bottom flask under a nitrogen atmosphere and the mixture was cooled to −78° C. Thereafter, n-BuLi (49 mL) was slowly titrated to the mixture, followed by stirring for 30 minutes. Then, after dissolving Sub2B-11-b (25.9 g, 122 mmol) in THF and the solution was slowly titrated to the round bottom flask being the reaction in progress. Then, the reaction mixture was stirred at −78° C. for 1 hour, and then slowly raised to room temperature. When the reaction was completed, the reaction product was extracted with ethyl acetate and water. Then, an organic layer was dried over $MgSO_4$ and concentrated. Then, the concentrate was separated by a silica gel column and recrystallized to obtain 40.1 g (yield 82%) of the product.

(4) Synthesis Example of Sub2B-11

Sub2B-11-c (40.1 g, 100 mmol), acetic acid (250 mL) and concentrated hydrochloric acid (40 mL) were placed in a round-bottom flask and the mixture was stirred at 60-80° C. under nitrogen atmosphere for 3 hours. When the reaction was completed, the reaction product was extracted with $CH_2Cl_2$ and water. Then, an organic layer was dried over $MgSO_4$ and concentrated. Then, the concentrate was separated by a silica gel column and recrystallized to obtain 31.8 g (yield 83%) of the product.

Compounds belong to Sub 2 are as follows, but are not limited thereto, and FD-MS values of the compounds are shown in Table 2 below.

Sub2B-1

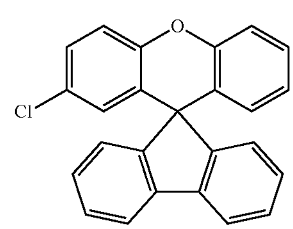

-continued
Sub2B-2
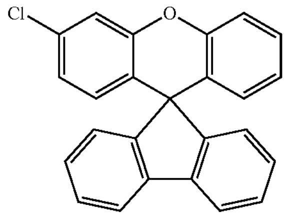
Sub2B-3
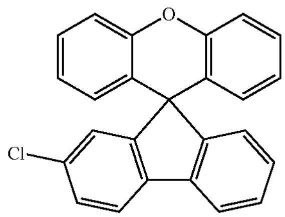
Sub2B-4
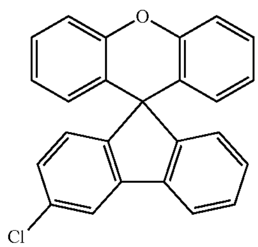
Sub2B-5
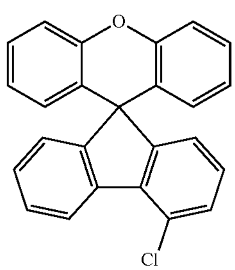
Sub2B-6
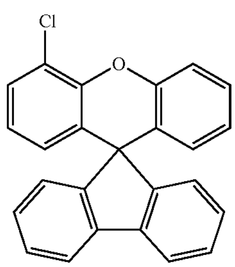
Sub2B-7
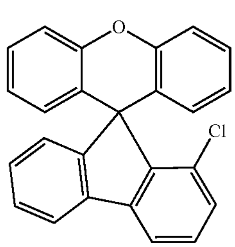
-continued
Sub2B-8
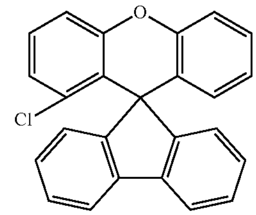
Sub2B-9
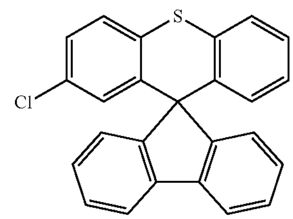
Sub2B-10
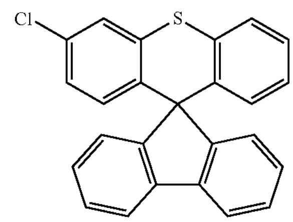
Sub2B-11
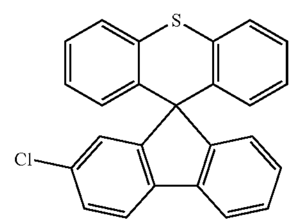
Sub2B-12
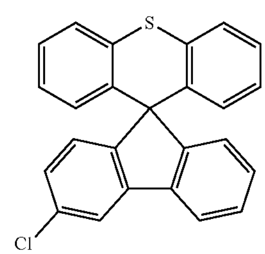
Sub2B-13
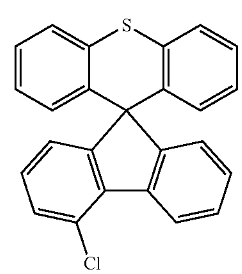

-continued
Sub2B-14
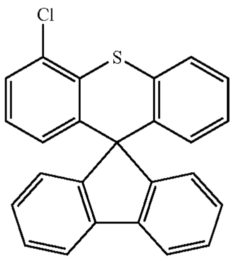
Sub2B-15
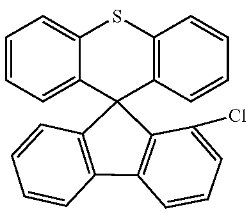
Sub2B-16
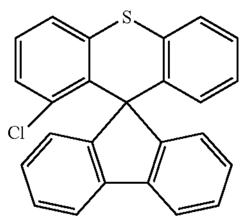
Sub2B-17
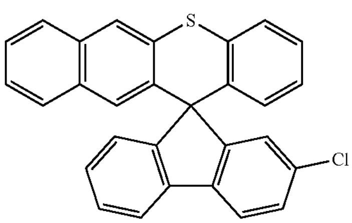
Sub2B-18
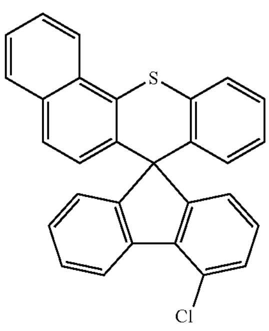
Sub2B-19
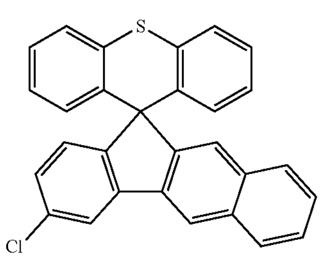
-continued
Sub2B-20
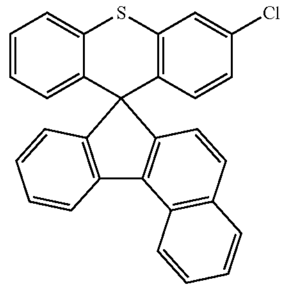
Sub2B-21
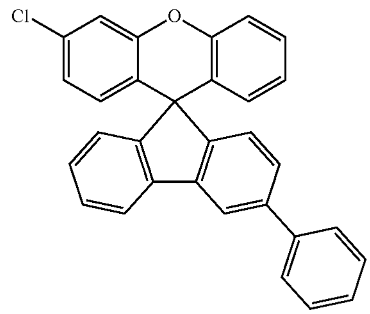
Sub2B-22
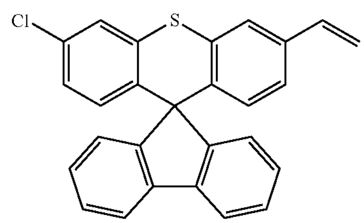
Sub2B-23
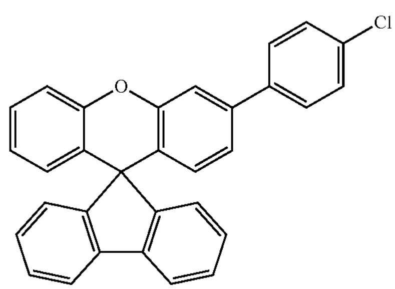
Sub2B-24
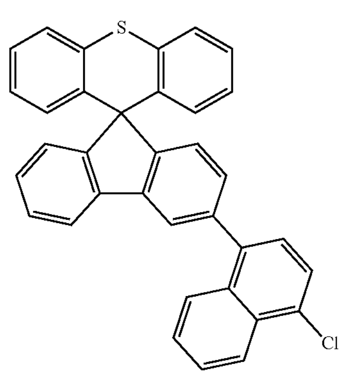

-continued
Sub2B-25
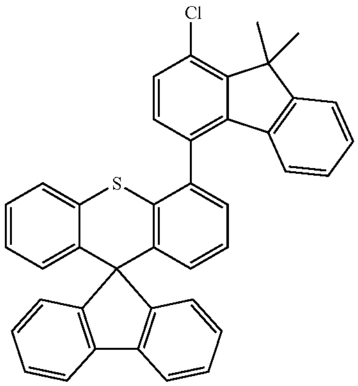
Sub2B-26
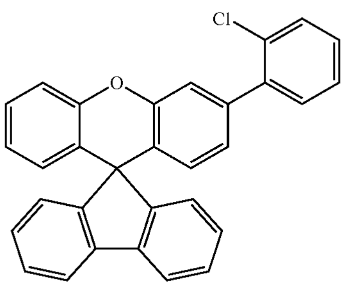
Sub2B-27
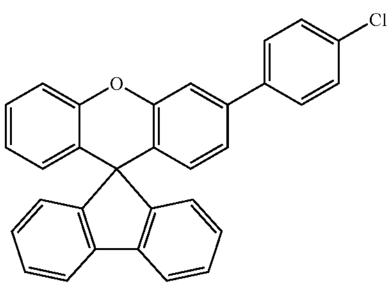
Sub2B-28
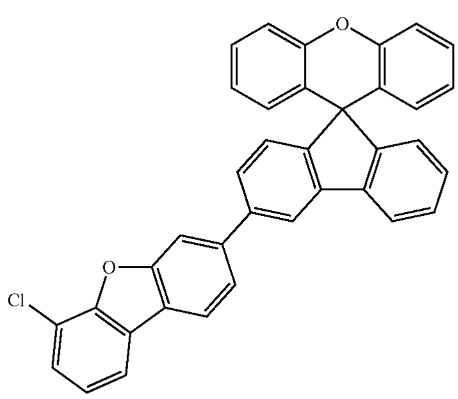
Sub2B-29
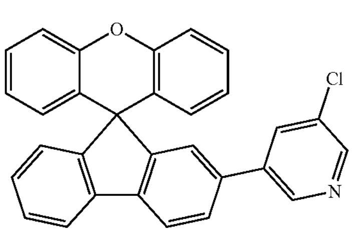
-continued
Sub2B-30
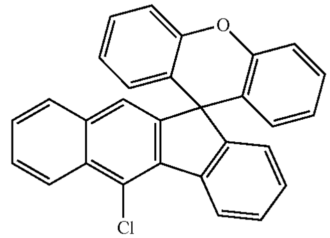
Sub2B-31
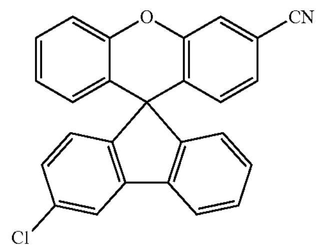
Sub2B-32
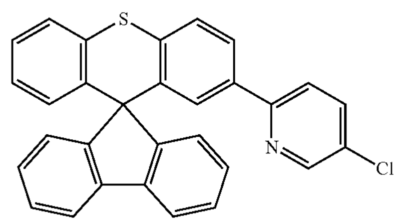
Sub2B-33
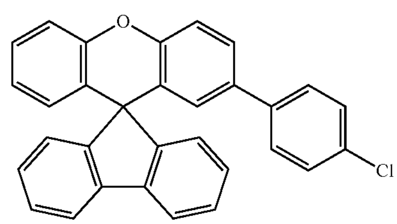
Sub2B-34
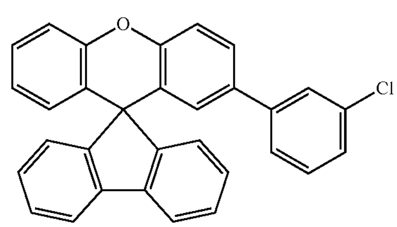
Sub2B-35
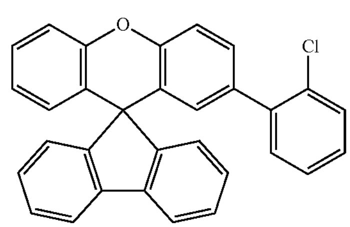
Sub2B-36
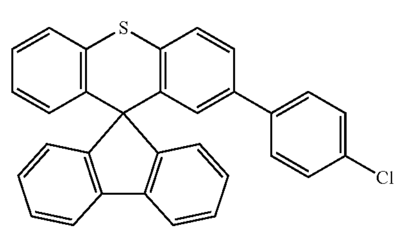

-continued
Sub2B-37
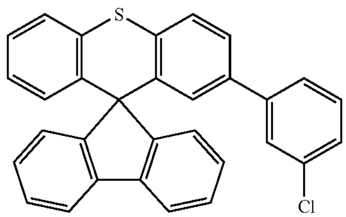
Sub2B-38
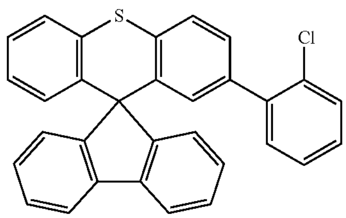
Sub2B-39
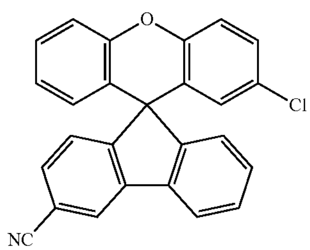
Sub2B-40
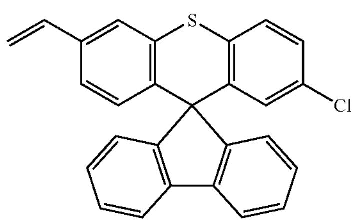
Sub2B-41
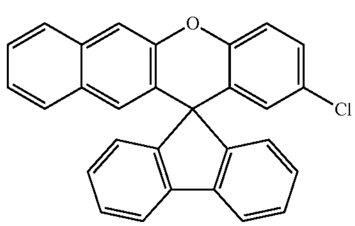
Sub2B-42
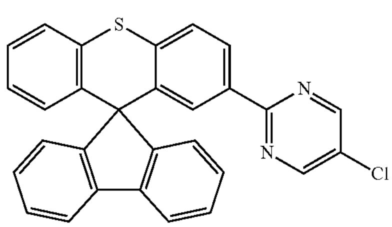
Sub2C-1
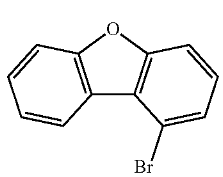
-continued
Sub2C-2
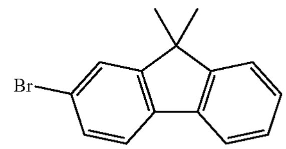
Sub2C-3
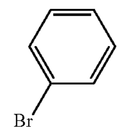
Sub2C-4
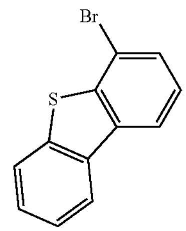
Sub2C-5
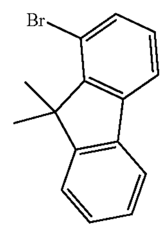
Sub2C-6
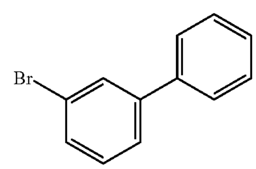
Sub2C-7
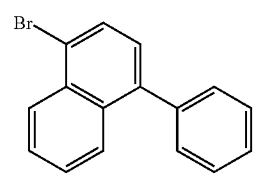
Sub2C-8
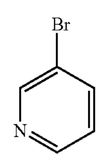
Sub2C-9
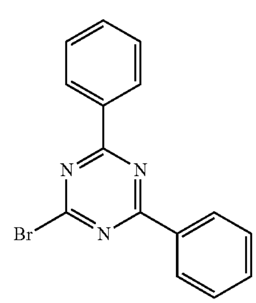

-continued
Sub2C-10
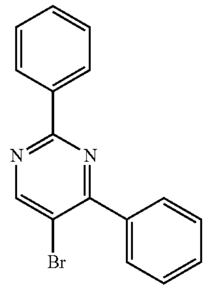
Sub2C-11
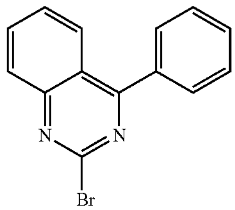
Sub2C-12
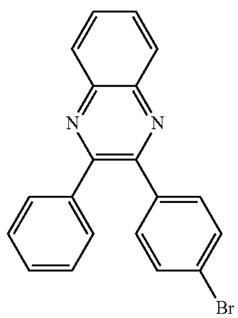
Sub2C-13
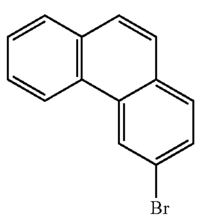
Sub2C-14
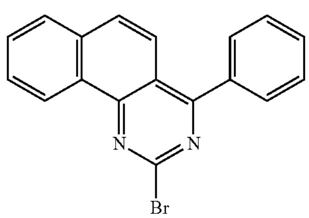
Sub2C-15
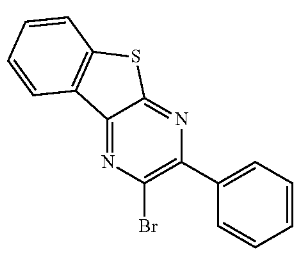
-continued
Sub2C-16
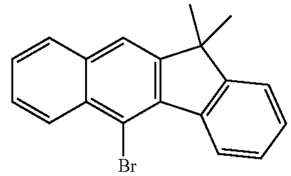
Sub2C-17
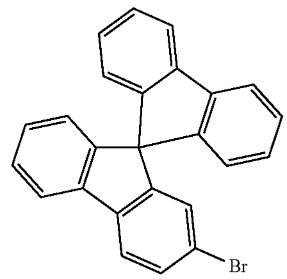
Sub2C-18
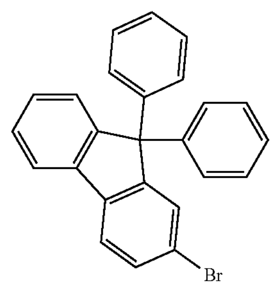
Sub2C-19
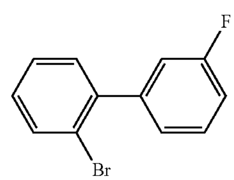
Sub2C-20
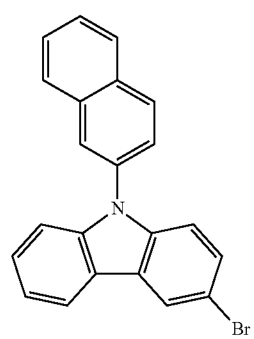

Sub2C-21
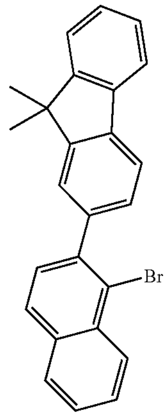
Sub2C-22
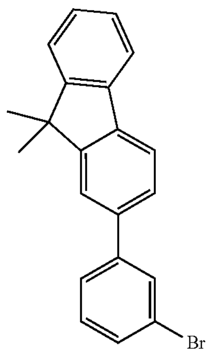
Sub2C-23
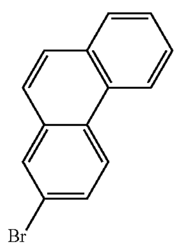
Sub2C-24
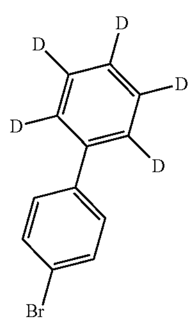
Sub2C-25
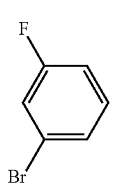
Sub2C-26
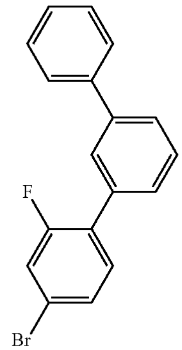
Sub2C-27
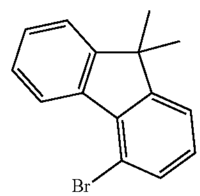
Sub2C-28
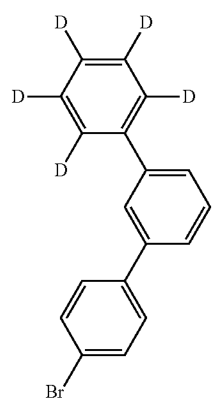
Sub2C-29
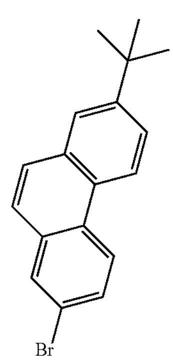

Sub2C-30
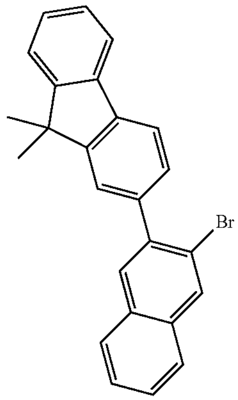
Sub2C-31
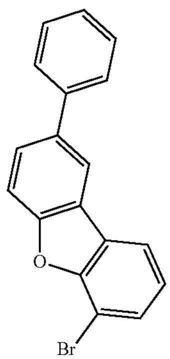
Sub2C-32
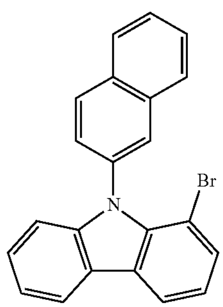
Sub2C-33
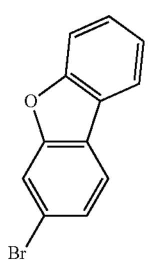
Sub2C-34
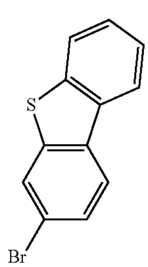
Sub2C-35
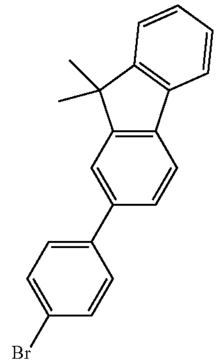
Sub2C-36
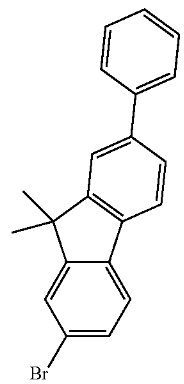
Sub2C-37
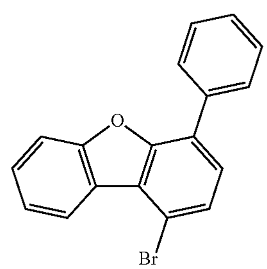
Sub2C-38
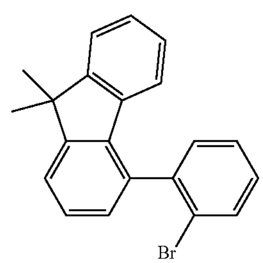
Sub2C-39
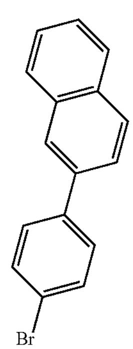

-continued

Sub2C-40

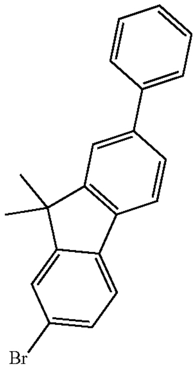

Sub2C-41

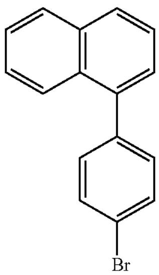

Sub2C-42

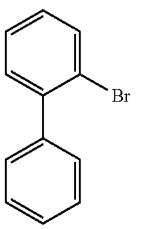

Sub2C-43

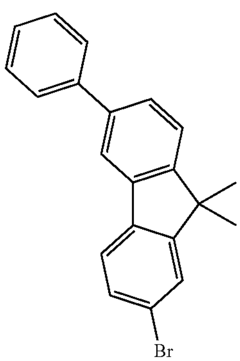

-continued

Sub2C-44

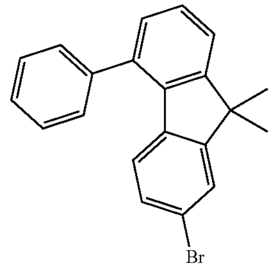

Sub2C-45

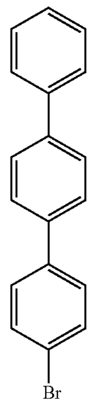

Sub2C-46

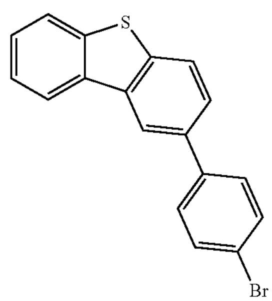

TABLE 2

| Compound | FD-MS | Compound | FD-MS |
|---|---|---|---|
| Sub2B-1 | m/z = 366.08($C_{25}H_{15}ClO$ = 366.84) | Sub2B-2 | m/z = 366.08($C_{25}H_{15}ClO$ = 366.84) |
| Sub2B-3 | m/z = 366.08($C_{25}H_{15}ClO$ = 366.84) | Sub2B-4 | m/z = 366.08($C_{25}H_{15}ClO$ = 366.84) |
| Sub2B-5 | m/z = 366.08($C_{25}H_{15}ClO$ = 366.84) | Sub2B-6 | m/z = 366.08($C_{25}H_{15}ClO$ = 366.84) |
| Sub2B-7 | m/z = 366.08($C_{25}H_{15}ClO$ = 366.84) | Sub2B-8 | m/z = 366.08($C_{25}H_{15}ClO$ = 366.84) |
| Sub2B-9 | m/z = 382.06($C_{25}H_{15}ClS$ = 382.91) | Sub2B-10 | m/z = 382.06($C_{25}H_{15}ClS$ = 382.91) |
| Sub2B-11 | m/z = 382.06($C_{25}H_{15}ClS$ = 382.91) | Sub2B-12 | m/z = 382.06($C_{25}H_{15}ClS$ = 382.91) |
| Sub2B-13 | m/z = 382.06($C_{25}H_{15}ClS$ = 382.91) | Sub2B-14 | m/z = 382.06($C_{25}H_{15}ClS$ = 382.91) |
| Sub2B-15 | m/z = 382.06($C_{25}H_{15}ClS$ = 382.91) | Sub2B-16 | m/z = 382.06($C_{25}H_{15}ClS$ = 382.91) |
| Sub2B-17 | m/z = 432.07($C_{29}H_{17}ClS$ = 432.97) | Sub2B-18 | m/z = 432.07($C_{29}H_{17}ClS$ = 432.97) |
| Sub2B-19 | m/z = 432.07($C_{29}H_{17}ClS$ = 432.97) | Sub2B-20 | m/z = 432.07($C_{29}H_{17}ClS$ = 432.97) |
| Sub2B-21 | m/z = 442.11($C_{31}H_{19}ClO$ = 442.94) | Sub2B-22 | m/z = 408.07($C_{27}H_{17}ClS$ = 408.94) |
| Sub2B-23 | m/z = 442.11($C_{31}H_{19}ClO$ = 442.94) | Sub2B-24 | m/z = 508.11($C_{35}H_{21}ClS$ = 509.06) |
| Sub2B-25 | m/z = 574.15($C_{40}H_{27}ClS$ = 575.17) | Sub2B-26 | m/z = 442.11($C_{31}H_{19}ClO$ = 442.94) |
| Sub2B-27 | m/z = 442.11($C_{31}H_{19}ClO$ = 442.94) | Sub2B-28 | m/z = 532.12($C_{37}H_{21}ClO_2$ = 533.02) |

TABLE 2-continued

| Compound | FD-MS | Compound | FD-MS |
|---|---|---|---|
| Sub2B-29 | m/z = 443.11($C_{30}H_{18}ClNO$ = 443.93) | Sub2B-30 | m/z = 416.10($C_{29}H_{17}ClO$ = 416.90) |
| Sub2B-31 | m/z = 391.08($C_{26}H_{14}ClNO$ = 391.85) | Sub2B-32 | m/z = 459.08($C_{30}H_{18}ClNS$ = 459.99) |
| Sub2B-33 | m/z = 442.11($C_{31}H_{19}ClO$ = 442.94) | Sub2B-34 | m/z = 442.11($C_{31}H_{19}ClO$ = 442.94) |
| Sub2B-35 | m/z = 442.11($C_{31}H_{19}ClO$ = 442.94) | Sub2B-36 | m/z = 458.09($C_{31}H_{19}ClS$ = 459.00) |
| Sub2B-37 | m/z = 458.09($C_{31}H_{19}ClS$ = 459.00) | Sub2B-38 | m/z = 458.09($C_{31}H_{19}ClS$ = 459.00) |
| Sub2B-39 | m/z = 391.08($C_{26}H_{14}ClNO$ = 391.85) | Sub2B-40 | m/z = 408.07($C_{27}H_{17}ClS$ = 408.94) |
| Sub2B-41 | m/z = 416.10($C_{29}H_{17}ClO$ = 416.90) | Sub2B-42 | m/z = 460.08($C_{29}H_{17}ClN_2S$ = 460.98) |
| Sub2C-1 | m/z = 245.97($C_{12}H_7BrO$ = 247.09) | Sub2C-2 | m/z = 272.02($C_{15}H_{13}Br$ = 273.17) |
| Sub2C-3 | m/z = 155.96($C_6H_5Br$ = 157.01) | Sub2C-4 | m/z = 261.95($C_{12}H_7BrS$ = 263.15) |
| Sub2C-5 | m/z = 272.02($C_{15}H_{13}Br$ = 273.17) | Sub2C-6 | m/z = 282($C_{16}H_{11}Br$ = 283.17) |
| Sub2C-7 | m/z = 231.99($C_{12}H_9Br$ = 233.11) | Sub2C-8 | m/z = 156.95($C_5H_4BrN$ = 158) |
| Sub2C-9 | m/z = 311.01($C_{15}H_{10}BrN_3$ = 312.17) | Sub2C-10 | m/z = 310.01($C_{16}H_{11}BrN_2$ = 311.18) |
| Sub2C-11 | m/z = 283.99($C_{14}H_9BrN_2$ = 285.14) | Sub2C-12 | m/z = 255.99($C_{14}H_9Br$ = 257.13) |
| Sub2C-13 | m/z = 360.03($C_{20}H_{13}BrN_2$ = 361.24) | Sub2C-14 | m/z = 334.01($C_{18}H_{11}BrN_2$ _ 335.2) |
| Sub2C-15 | m/z = 339.97($C_{16}H_9BrN_2S$ = 341.23) | Sub2C-16 | m/z = 322.04($C_{19}H_{15}Br$ = 323.23) |
| Sub2C-17 | m/z = 394.04($C_{25}H_{15}Br$ = 395.3) | Sub2C-18 | m/z = 396.05($C_{25}H_{17}Br$ = 397.32) |
| Sub2C-19 | m/z = 249.98($C_{12}H_8BrF$ = 251.1) | Sub2C-20 | m/z = 371.03($C_{22}H_{14}BrN$ = 372.27) |
| Sub2C-21 | m/z = 398.07($C_{25}H_{19}Br$ = 399.33) | Sub2C-22 | m/z = 348.05($C_{21}H_{17}Br$ = 349.27) |
| Sub2C-23 | m/z = 255.99($C_{14}H_9Br$ = 257.13) | Sub2C-24 | m/z = 237.02($C_{12}H_4D_5Br$ = 238.14) |
| Sub2C-25 | m/z = 173.95($C_6H_4BrF$ = 175) | Sub2C-26 | m/z = 308.02($C_{18}H_{13}Br$ = 309.21) |
| Sub2C-27 | m/z = 272.02($C_{15}H_{13}Br$ = 273.17) | Sub2C-28 | m/z = 313.05($C_{18}H_8D_5Br$ = 314.24) |
| Sub2C-29 | m/z = 312.05($C_{18}H_{17}Br$ = 313.24) | Sub2C-30 | m/z = 398.07($C_{25}H_{19}Br$ = 399.33) |
| Sub2C-31 | m/z = 322($C_{18}H_{11}BrO$ = 323.19) | Sub2C-32 | m/z = 371.03($C_{22}H_{14}BrN$ = 372.27) |
| Sub2C-33 | m/z = 245.97($C_{12}H_7BrO$ = 247.09) | Sub2C-34 | m/z = 261.95($C_{12}H_7BrS$ = 263.15) |
| Sub2C-35 | m/z = 348.05($C_{21}H_{17}Br$ = 349.27) | Sub2C-36 | m/z = 348.05($C_{21}H_{17}Br$ = 349.27) |
| Sub2C-37 | m/z = 322($C_{18}H_{11}BrO$ = 323.19) | Sub2C-38 | m/z = 348.05($C_{21}H_{17}Br$ = 349.27) |
| Sub2C-39 | m/z = 282($C_{16}H_{11}Br$ = 283.17) | Sub2C-40 | m/z = 348.05($C_{21}H_{17}Br$ = 349.27) |
| Sub2C-41 | m/z = 282($C_{16}H_{11}Br$ = 283.17) | Sub2C-42 | m/z = 231.99($C_{12}H_9Br$ = 233.11) |
| Sub2C-43 | m/z = 348.05($C_{21}H_{17}Br$ = 349.27) | Sub2C-44 | m/z = 348.05($C_{21}H_{17}Br$ = 349.27) |
| Sub2C-45 | m/z = 308.02($C_{18}H_{13}Br$ = 309.21) | Sub2C-46 | m/z = 337.98 ($C_{18}H_{11}BrS$ = 339.25) |

Synthesis Example of Final Products

1. Synthesis Example of 1-76

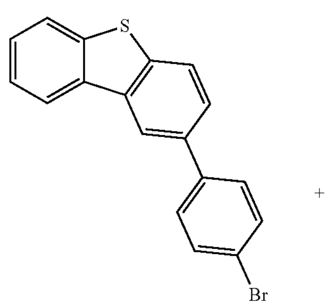

Sub2C-46

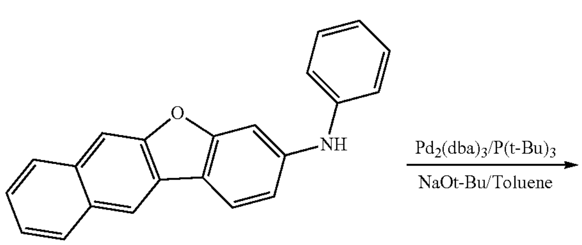

Sub1A-59

-continued

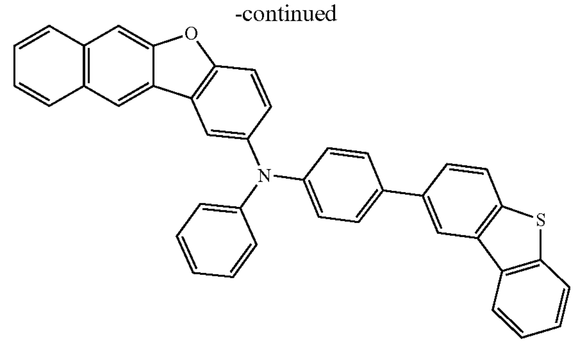

1-76

After Sub 2C-46 (142.0 g, 418.6 mmol) was dissolved in toluene (2,093 mL) and Sub 1A-59 (129.5 g, 418.6 mmol), $Pd_2(dba)_3$ (11.5 g, 12.6 mmol), $P(t\text{-}Bu)_3$ (5.1 g, 25.1 mmol) and NaOt-Bu (80.5 g, 837.2 mmol) were added to the solution, the reaction was carried out at 100° C. When the reaction was completed, the reaction product was extracted with $CH_2Cl_2$ and water. Then, an organic layer was dried over $MgSO_4$ and concentrated. Then, the concentrate was separated by a silica gel column and recrystallized to obtain 173.5 g (yield: 73%) of the product.

2. Synthesis Example of 1-110

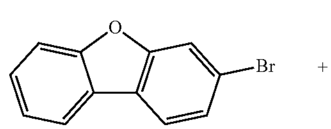

Sub2C-33

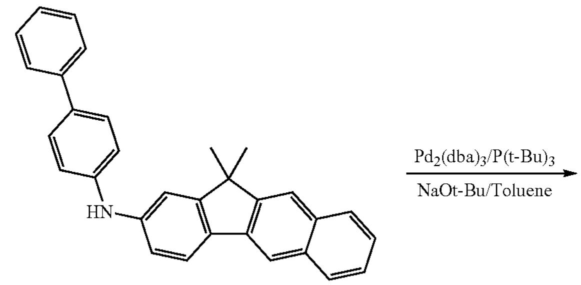

Sub1A-58

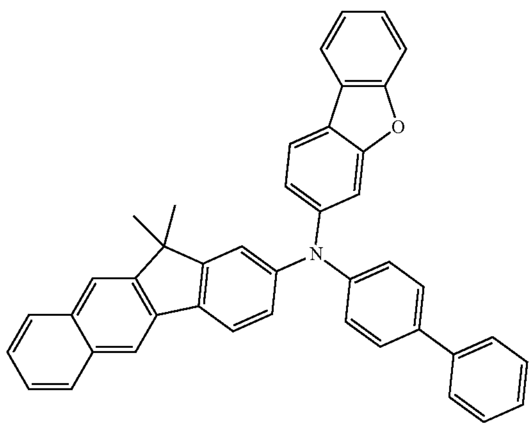

1-110

After dissolving Sub 2C-33 (52.5 g, 212.6 mmol) in toluene (1,063 mL), Sub 1A-58 (87.5 g, 212.6 mmol), $Pd_2(dba)_3$ (5.8 g, 6.4 mmol), $P(t\text{-}Bu)_3$ (2.6 g, 12.8 mmol) and NaOt-Bu (40.9 g, 425.2 mmol) were added to the solution, and then the reaction was carried out in the same manner as in the synthesis method of 1-76 to obtain 92.1 g (yield: 75%) of the product.

3. Synthesis Example of P-1

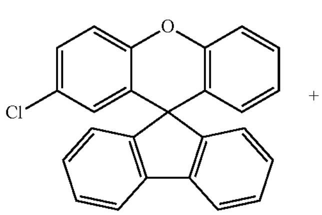

Sub2B-1

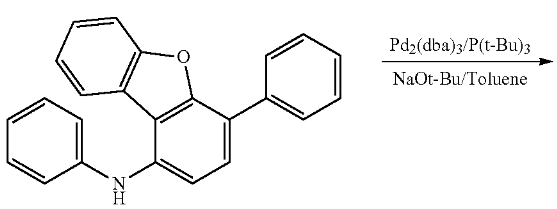

Sub1B-1

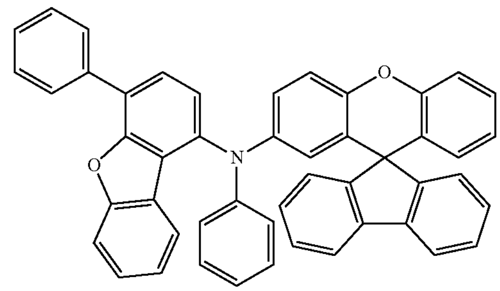

P-1

After Sub2B-1 (20 g, 54.5 mmol) was dissolved in toluene (400 mL) and Sub1B-1 (18.3 g, 54.5 mmol), $Pd_2(dba)_3$ (1.5 g, 1.64 mmol), $P(t\text{-}Bu)_3$ (50 wt % Sol.) (1.3 mL, 3.3 mmol) and NaOt-Bu (15.7 g, 163.6 mmol) were added to the solution, the reaction was carried out at 80° C. When the reaction was completed, the reaction product was extracted with $CH_2Cl_2$ and water. Then, an organic layer was dried over $MgSO_4$ and concentrated. Then, the concentrate was separated by a silica gel column and recrystallized to obtain 29.8 g (yield: 82%) of the product.

4. Synthesis Example of P-73

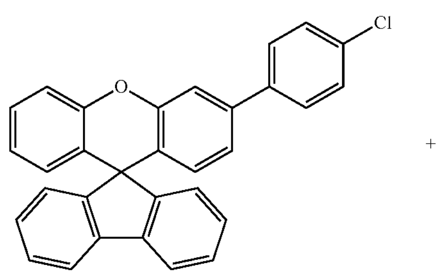

Sub2B-27

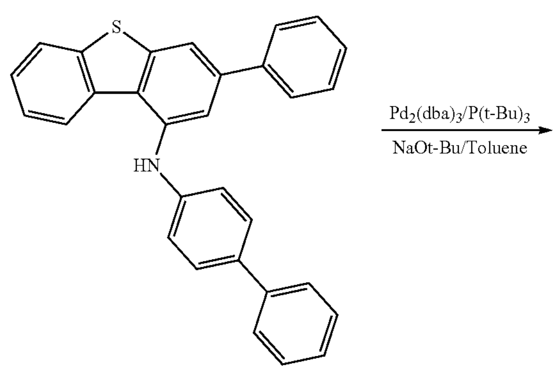

Sub1B-88

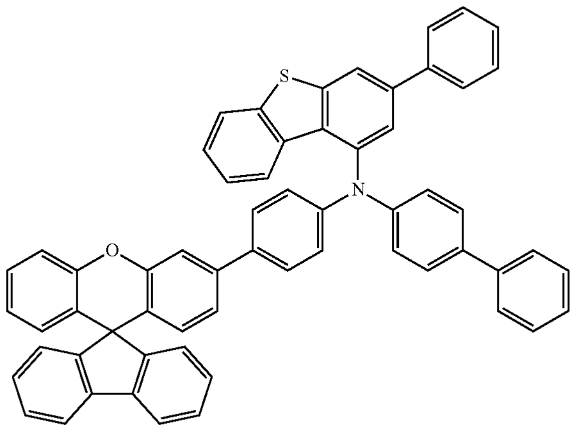

P-73

After dissolving Sub 2B-27 (17 g, 38.4 mmol) in toluene (340 mL), Sub 1B-88 (16.4 g, 38.4 mmol), $Pd_2(dba)_3$ (1.05 g, 1.15 mmol), NaOt-Bu (11.06 g, 115.14 mmol) and $P(t\text{-}Bu)_3$ (50 wt % Sol.) (0.93 mL, 2.3 mmol) were added to the solution, and then the reaction was carried out in the same manner as in the synthesis method of P-1 to obtain 20.4 g (yield: 80%) of the product.

5. Synthesis Example of P1-2

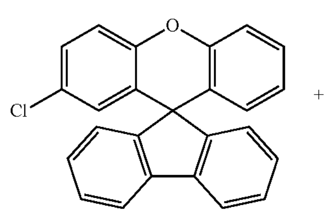

Sub2B-1

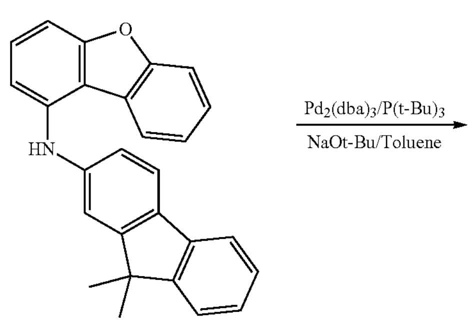

Sub1B-95

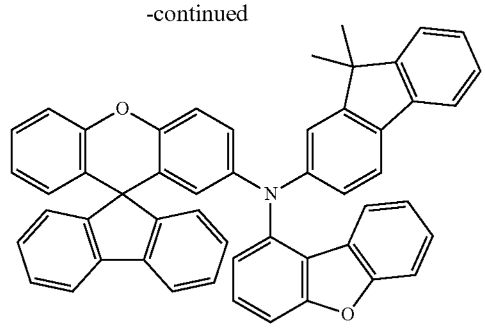

P1-2

After dissolving Sub 2B-1 (15 g, 40.9 mmol) in toluene (300 mL), Sub 1B-95 (16.0 g, 40.9 mmol), $Pd_2(dba)_3$ (1.12 g, 1.2 mmol), NaOt-Bu (11.8 g, 122.7 mmol) and $P(t\text{-}Bu)_3$ (50 wt % Sol.) (1.00 mL, 2.5 mmol) were added to the solution, and then the reaction was carried out in the same manner as in the synthesis method of P-1 to obtain 24.2 g (yield: 84%) of the product.

6. Synthesis Example of P1-13

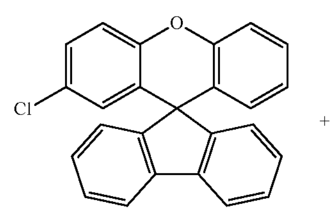

Sub2B-1

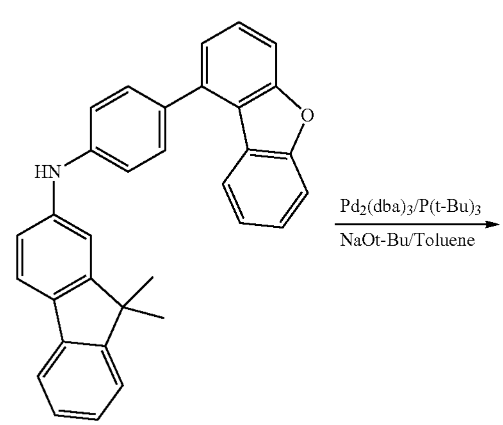

Sub1A-12

-continued

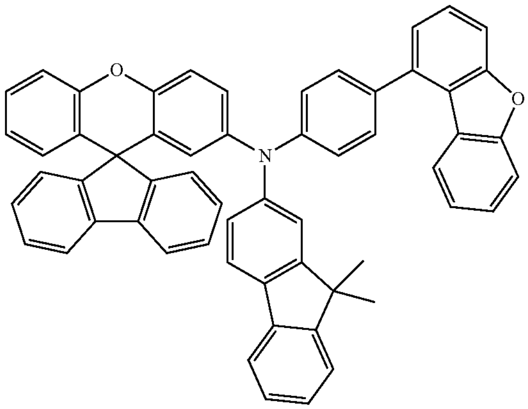

P1-13

After dissolving Sub 2B-1 (10.2 g, 27.8 mmol) in toluene (210 mL), Sub 1A-12 (12.6 g, 27.8 mmol), $Pd_2(dba)_3$ (0.8 g, 0.76 mmol), NaOt-Bu (8.0 g, 83.4 mmol) and $P(t\text{-}Bu)_3$ (50 wt % Sol.) (0.7 mL, 1.7 mmol) were added to the solution, and then the reaction was carried out in the same manner as in the synthesis method of P-1 to obtain 17.6 g (yield: 81%) of the product.

7. Synthesis Example of P1-86

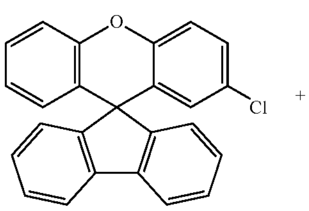

Sub2B-1

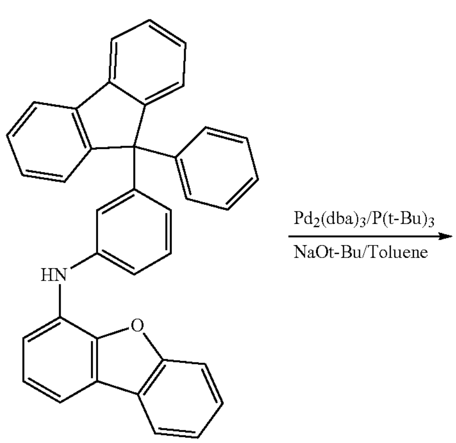

Sub1C-18

-continued

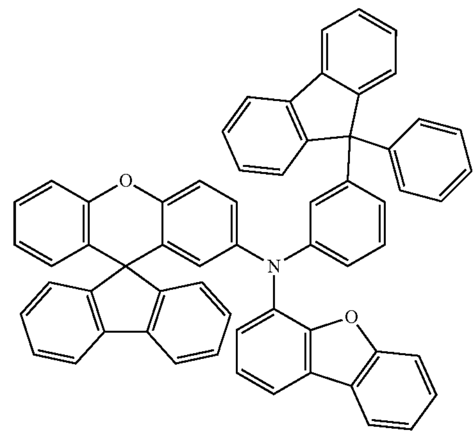

P1-86

After dissolving Sub 2B-1 (33 g, 89.9 mmol) in toluene (922 mL), Sub 1C-18 (47.2 g, 94.5 mmol), $Pd_2(dba)_3$ (2.5 g, 2.7 mmol), NaOt-Bu (25.9 g, 269.8 mmol) and $P(t\text{-}Bu)_3$ (50 wt % Sol.) (1.1 mL, 5.4 mmol) were added to the solution, and then the reaction was carried out in the same manner as in the synthesis method of P-1 to obtain 63.5 g (yield: 85.1%) of the product.

8. Synthesis Example of P2-3

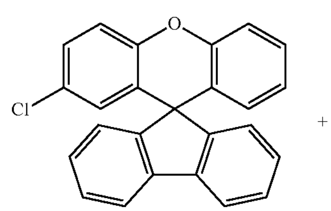

Sub2B-1

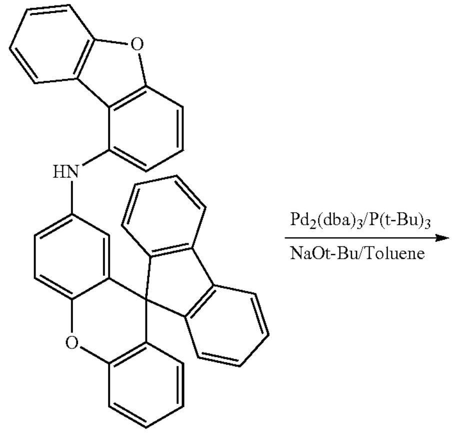

Sub1D-3

-continued

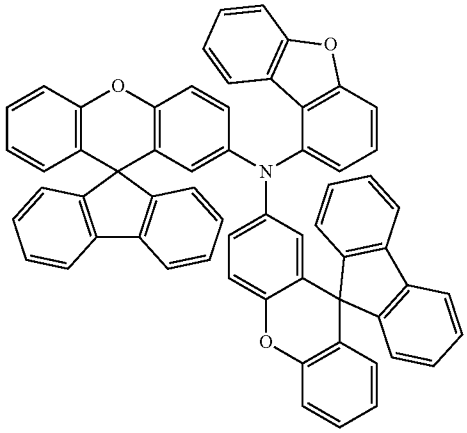

P2-3

After dissolving Sub 2B-1 (9.5 g, 25.9 mmol) in toluene (200 mL), Sub 1D-3 (13.3 g, 25.9 mmol), $Pd_2(dba)_3$ (0.7 g, 0.8 mmol), NaOt-Bu (7.5 g, 77.7 mmol) and $P(t\text{-}Bu)_3$ (50 wt % Sol.) (0.6 mL, 0.8 mmol) were added to the solution, and then the reaction was carried out in the same manner as in the synthesis method of P-1 to obtain 18.1 g (yield: 83%) of the product.

9. Synthesis Example of P3-80

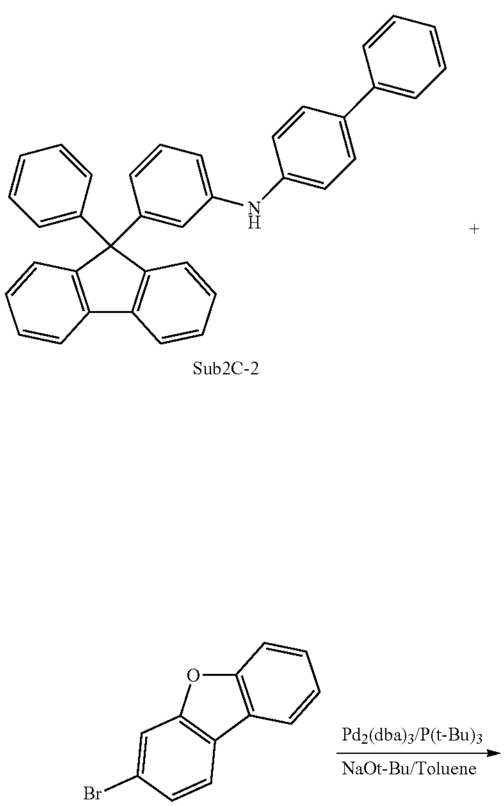

Sub2C-2

Sub2C-33

-continued

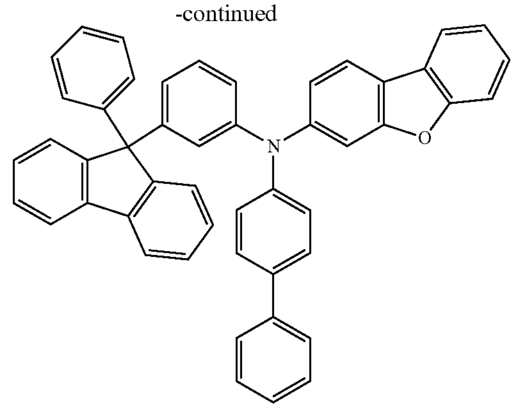

P3-80

After dissolving Sub1C-2 (10 g, 20.59 mmol) in toluene (211 mL), Sub2C-33 (5.34 g, 21.62 mmol), $Pd_2(dba)_3$ (0.57 g, 0.62 mmol), $P(t\text{-}Bu)_3$ (0.33 g, 1.65 mmol) and NaOt-Bu (5.94 g, 61.78 mmol) were added to the solution, and then the reaction was carried out in the same manner as in the synthesis method of P-1 to obtain 10.87 g (yield: 81%) of the product.

10. Synthesis Example of P3-88

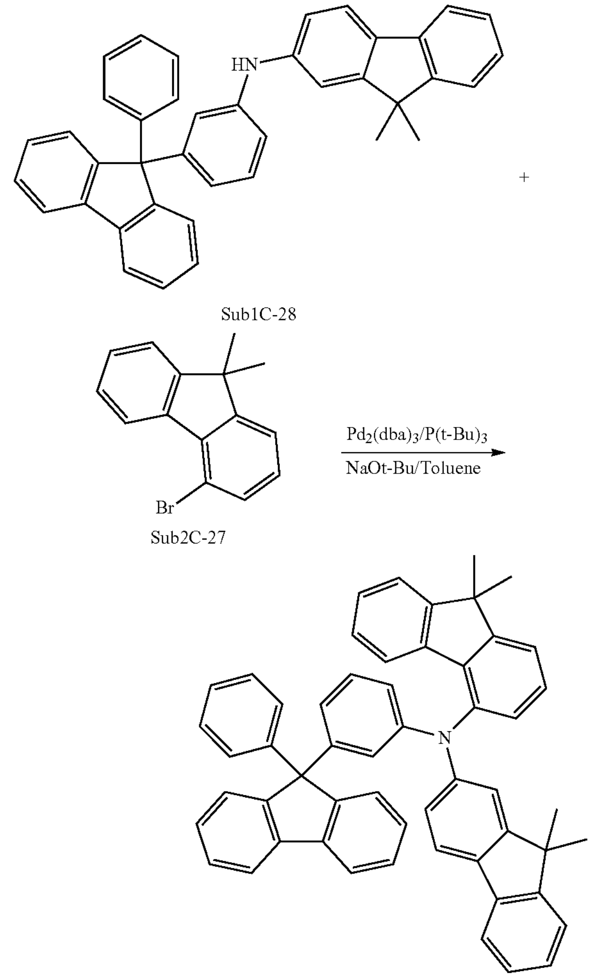

Sub1C-28

Sub2C-27

P3-88

After dissolving Sub1C-28 (8.9 g, 16.93 mmol) in toluene (174 mL), Sub2C-27 (4.86 g, 17.78 mmol), $Pd_2(dba)_3$ (0.47 g, 0.51 mmol), $P(t\text{-}Bu)_3$ (0.27 g, 1.35 mmol) and NaOt-Bu (4.88 g, 50.79 mmol) were added to the solution, and then the reaction was carried out in the same manner as in the synthesis method of P-1 to obtain 9.72 g (yield: 80%) of the product.

The FD-MS values of the compounds represented by Formula 1 of the present invention synthesized by the above synthesis method are shown in Table 3 below.

TABLE 3

| Compound | FD-MS | Compound | FD-MS |
|---|---|---|---|
| 1-1 | m/z = 473.21($C_{36}H_{27}N$ = 473.62) | 1-2 | m/z = 573.25($C_{44}H_{31}N$ = 753.74) |
| 1-3 | m/z = 447.20($C_{34}H_{25}N$ = 447.58) | 1-4 | m/z = 471.20($C_{36}H_{25}N$ = 471.60) |
| 1-5 | m/z = 625.28($C_{48}H_{35}N$ = 625.82) | 1-6 | m/z = 473.21($C_{36}H_{27}N$ = 473.62) |
| 1-7 | m/z = 623.26($C_{48}H_{33}N$ = 623.80) | 1-8 | m/z = 701.31($C_{54}H_{39}N$ = 701.91) |
| 1-9 | m/z = 503.17($C_{36}H_{25}NS$ = 503.66) | 1-10 | m/z = 451.14($C_{32}H_{21}NS$ = 451.59) |
| 1-11 | m/z = 563.08($C_{36}H_{21}NS_3$ = 563.75) | 1-12 | m/z = 633.21($C_{45}H_{31}NOS$ = 633.81) |
| 1-13 | m/z = 677.31($C_{52}H_{39}N$ = 677.89) | 1-14 | m/z = 727.29($C_{55}H_{37}NO$ = 727.91) |
| 1-15 | m/z = 637.24($C_{48}H_{31}NO$ = 637.78) | 1-16 | m/z = 715.29($C_{54}H_{37}NO$ = 715.29) |
| 1-17 | m/z = 613.28($C_{47}H_{35}N$ = 613.80) | 1-18 | m/z = 713.31($C_{55}H_{379}N$ = 713.92) |
| 1-19 | m/z = 562.24($C_{42}H_{30}N_2$ = 562.72) | 1-20 | m/z = 612.26($C_{46}H_{32}N_2$ = 612.78) |
| 1-21 | m/z = 638.27($C_{48}H_{34}N_2$ = 638.81) | 1-22 | m/z = 678.30($C_{51}H_{38}N_2$ = 678.88) |
| 1-23 | m/z = 802.33($C_{61}H_{42}N_2$ = 803.02) | 1-24 | m/z = 800.32($C_{61}H_{40}N_2$ = 801.01) |
| 1-25 | m/z = 602.27($C_{45}H_{34}N_2$ = 602.78) | 1-26 | m/z = 678.30($C_{51}H_{38}N_2$ = 678.88) |
| 1-27 | m/z = 754.33($C_{57}H_{42}N_2$ = 754.98) | 1-28 | m/z = 744.26($C_{54}H_{36}N_2S$ = 744.96) |
| 1-29 | m/z = 688.29($C_{52}H_{36}N_2$ = 688.87) | 1-30 | m/z = 652.29($C_{49}H_{36}N_2$ = 652.84) |
| 1-31 | m/z = 754.33($C_{57}H_{42}N_2$ = 754.98) | 1-32 | m/z = 878.37($C_{67}H_{46}N_2$ = 879.12) |
| 1-33 | m/z = 876.35($C_{67}H_{44}N_2$ = 877.10) | 1-34 | m/z = 639.27($C_{47}H_{33}N_3$ = 639.80) |
| 1-35 | m/z = 768.26($C_{56}H_{36}N_2S$ = 768.98) | 1-36 | m/z = 833.29($C_{60}H_{39}N_3S$ = 834.05) |
| 1-37 | m/z = 742.26($C_{54}H_{34}N_2O_2$ = 742.88) | 1-38 | m/z = 778.33($C_{59}H_{42}N_2$ = 779.00) |
| 1-39 | m/z = 688.29($C_{52}H_{36}N_2$ = 688.87) | 1-40 | m/z = 702.27($C_{52}H_{34}N_2O$ = 702.86) |
| 1-41 | m/z = 692.23($C_{50}H_{32}N_2S$ = 692.88) | 1-42 | m/z = 782.24($C_{56}H_{34}N_2OS$ = 782.96) |
| 1-43 | m/z = 738.30($C_{56}H_{38}N_2$ = 738.93) | 1-44 | m/z = 768.26($C_{56}H_{36}N_2S$ = 768.98) |
| 1-45 | m/z = 716.32($C_{54}H_{40}N_2$ = 716.93) | 1-46 | m/z = 857.29($C_{62}H_{39}N_3S$ = 858.08) |
| 1-47 | m/z = 738.30($C_{56}H_{38}N_2$ = 738.93) | 1-48 | m/z = 753.28($C_{55}H_{35}N_3O$ = 753.91) |
| 1-49 | m/z = 677.28($C_{50}H_{35}N_3$ = 677.85) | 1-50 | m/z = 879.32($C_{65}H_{41}N_3O$ = 880.06) |
| 1-51 | m/z = 602.27($C_{45}H_{34}N_2$ = 602.78) | 1-52 | m/z = 612.26($C_{46}H_{32}N_2$ = 612.78) |
| 1-53 | m/z = 662.27($C_{50}H_{34}N_2$ = 662.84) | 1-54 | m/z = 642.21($C_{46}H_{30}N_2S$ = 642.82) |
| 1-55 | m/z = 668.23($C_{48}H_{32}N_2S$ = 668.86) | 1-56 | m/z = 668.23($C_{48}H_{32}N_2S$ = 668.86) |
| 1-57 | m/z = 642.21($C_{46}H_{30}N_2S$ = 642.82) | 1-58 | m/z = 744.26($C_{54}H_{36}N_2S$ = 744.96) |
| 1-59 | m/z = 652.25($C_{48}H_{32}N_2O$ = 652.80) | 1-60 | m/z = 682.21($C_{48}H_{30}N_2OS$ = 682.84) |
| 1-61 | m/z = 638.27($C_{48}H_{34}N_2$ = 638.81) | 1-62 | m/z = 652.25($C_{48}N_{32}N_2O$ = 652.80) |
| 1-63 | m/z = 754.33($C_{57}H_{42}N_2$ = 754.98) | 1-64 | m/z = 804.17($C_{54}H_{32}N_2S_3$ = 805.04) |
| 1-65 | m/z = 606.18($C_{42}H_{26}N_2OS$ = 606.74) | 1-66 | m/z = 486.21($C_{36}H_{26}N_2$ = 486.62) |
| 1-67 | m/z = 541.26($C_{40}H_{23}D_5N_2$ = 541.71) | 1-68 | m/z = 612.26($C_{46}H_{32}N_2$ = 612.78) |
| 1-69 | m/z = 602.27($C_{45}H_{34}N_2$ = 602.78) | 1-70 | m/z = 830.28($C_{61}H_{38}N_2S$ = 831.05) |
| 1-71 | m/z = 727.30($C_{54}H_{37}N_3$ = 727.91) | 1-72 | m/z = 562.24($C_{42}H_{30}N_2$ = 562.72) |
| 1-73 | m/z = 668.23($C_{48}H_{32}N_2S$ = 668.86) | 1-74 | m/z = 732.22($C_{52}H_{32}N_2OS$ = 732.9) |
| 1-75 | m/z = 652.25($C_{48}H_{32}N_2O$ = 652.8) | 1-76 | m/z = 567.17($C_{40}H_{25}NOS$ = 567.71) |
| 1-77 | m/z = 567.17($C_{40}H_{25}NOS$ = 567.71) | 1-78 | m/z = 731.23($C_{53}H_{33}NOS$ = 731.91) |
| 1-79 | m/z = 731.23($C_{53}H_{33}NOS$ = 731.91) | 1-80 | m/z = 553.19($C_{40}H_{27}NS$ = 553.72) |
| 1-81 | m/z = 553.19($C_{40}H_{27}NS$ = 553.72) | 1-82 | m/z = 553.19($C_{40}H_{27}NS$ = 553.72) |
| 1-83 | m/z = 653.22($C_{48}H_{31}NS$ = 653.84) | 1-84 | m/z = 639.11($C_{42}H_{25}NS_3$ = 639.85) |
| 1-85 | m/z = 715.15($C_{48}H_{29}NS_3$ = 715.95) | 1-86 | m/z = 791.18($C_{54}H_{33}NS_3$ = 792.05) |
| 1-87 | m/z = 607.16($C_{42}H_{25}NO_2S$ = 607.73) | 1-88 | m/z = 725.31($C_{56}H_{39}N$ = 725.94) |
| 1-89 | m/z = 735.29($C_{57}H_{37}N$ = 735.93) | 1-90 | m/z = 751.32($C_{58}H_{41}N$ = 751.97) |
| 1-91 | m/z = 725.31($C_{58}H_{39}N$ = 725.94) | 1-92 | m/z = 675.29($C_{52}H_{37}N$ = 675.88) |
| 1-93 | m/z = 513.25($C_{39}H_{31}N$ = 513.68) | 1-94 | m/z = 613.28($C_{47}H_{35}N$ = 613.80) |
| 1-95 | m/z = 665.31($C_{51}H_{39}N$ = 665.88) | 1-96 | m/z = 705.34($C_{54}H_{43}N$ = 705.95) |
| 1-97 | m/z = 593.31($C_{45}H_{39}N$ = 593.81) | 1-98 | m/z = 639.20($C_{47}H_{29}NS$ = 639.82) |
| 1-99 | m/z = 699.26($C_{53}H_{33}NOS$ = 699.85) | 1-100 | m/z = 801.30($C_{61}H_{39}NO$ = 801.99) |
| 1-101 | m/z = 775.29($C_{59}H_{37}NO$ = 775.95) | 1-102 | m/z = 865.30($C_{65}H_{39}NO_2$ _ 866.03) |
| 1-103 | m/z = 583.23($C_{45}H_{29}N$ = 583.73) | 1-104 | m/z = 685.28($C_{53}H_{35}N$ = 685.87) |
| 1-105 | m/z = 577.24($C_{43}H_{31}NO$ = 577.73) | 1-106 | m/z = 699.29($C_{54}H_{37}N_3$ = 699.90) |
| 1-107 | m/z = 725.31($C_{56}H_{39}N$ = 725.94) | 1-108 | m/z = 577.24($C_{43}H_{31}NO$ = 577.73) |
| 1-109 | m/z = 593.22($C_{43}H_{31}NS$ = 593.79) | 1-110 | m/z = 577.24($C_{43}H_{31}NO$ = 577.73) |
| 1-111 | m/z = 627.26($C_{47}H_{33}NO$ = 627.79) | 1-112 | m/z = 679.32($C_{52}H_{41}N$ = 679.91) |
| 1-113 | m/z = 685.28($C_{53}H_{35}N$ = 685.87) | 1-114 | m/z = 775.32($C_{60}H_{41}N$ = 776.00) |
| 1-115 | m/z = 772.29($C_{59}H_{36}N_2$ = 772.95) | 1-116 | m/z = 685.28($C_{53}H_{35}N$ = 685.87) |
| 1-117 | m/z = 941.31($C_{71}H_{43}NS$ = 942.19) | 1-118 | m/z = 751.29($C_{57}H_{37}NO$ = 751.93) |
| 1-119 | m/z = 643.23($C_{47}H_{33}NS$ = 643.85) | 1-120 | m/z = 676.29($C_{51}H_{36}N_2$ = 676.86) |
| 1-121 | m/z = 727.29($C_{55}H_{37}NO$ = 727.91) | 1-122 | m/z = 843.30($C_{63}H_{41}NS$ = 844.09) |
| 1-123 | m/z = 751.29($C_{57}H_{37}NO$ = 751.93) | 1-124 | m/z = 727.32($C_{56}H_{41}N$ = 727.95) |
| 1-125 | m/z = 800.32($C_{61}H_{40}N_2$ = 801.01) | 1-126 | m/z = 823.33($C_{61}H_{45}NS$ = 824.10) |
| 1-127 | m/z = 757.24($C_{55}H_{35}NOS$ = 757.95) | 1-128 | m/z = 637.28($C_{49}H_{35}N$ = 637.83) |
| 1-129 | m/z = 727.29($C_{55}H_{37}NO$ = 727.91) | 1-130 | m/z = 750.30($C_{57}H_{38}N_2$ = 750.95) |
| 1-131 | m/z = 691.29($C_{52}H_{37}NO$ = 691.87) | 1-132 | m/z = 815.32($C_{62}H_{41}$ NO = 816.02) |
| 1-133 | m/z = 705.27($C_{52}H_{35}NO_2$ = 705.86) | 1-134 | m/z = 668.23($C_{48}H_{32}N_2S$ = 668.86) |
| 1-135 | m/z = 612.26($C_{46}H_{32}N_2$ = 612.78) | | |
| P-1 | m/z = 665.24($C_{49}H_{31}NO_2$ = 665.79) | P-2 | m/z = 791.28($C_{59}H_{37}NO_2$ = 791.95) |
| P-3 | m/z = 891.31($C_{67}H_{41}NO_2$ = 892.07) | P-4 | m/z = 741.27($C_{55}H_{35}NO_2$ = 741.89) |
| P-5 | m/z = 791.28($C_{59}H_{37}NO_2$ = 791.95) | P-6 | m/z = 665.24($C_{49}H_{31}NO_2$ = 665.79) |

TABLE 3-continued

| Compound | FD-MS | Compound | FD-MS |
|---|---|---|---|
| P-7 | m/z = 665.24($C_{49}H_{31}NO_2$ = 665.79) | P-8 | m/z = 665.24($C_{49}H_{31}NO_2$ = 665.79) |
| P-9 | m/z = 665.24($C_{49}H_{31}NO_2$ = 665.79) | P-10 | m/z = 857.33($C_{54}H_{43}NO_2$ = 858.05) |
| P-11 | m/z = 841.30($C_{63}H_{39}NO_2$ = 842.01) | P-12 | m/z = 817.30($C_{61}H_{39}NO_2$ = 817.99) |
| P-13 | m/z = 867.31($C_{65}H_{41}NO_2$ = 868.05) | P-14 | m/z = 833.30($C_{60}H_{39}N_3O_2$ = 833.99) |
| P-15 | m/z = 666.23($C_{48}H_{30}N_2O_2$ = 666.78) | P-16 | m/z = 782.26($C_{56}H_{34}N_2O_3$ = 782.90) |
| P-17 | m/z = 830.29($C_{61}H_{38}N_2O_2$ = 830.99) | P-18 | m/z = 795.31($C_{59}H_{33}D_4NO_2$ = 795.97) |
| P-19 | m/z = 812.21($C_{56}H_{32}N_2O_3S$ = 812.94) | P-20 | m/z = 897.27($C_{65}H_{39}NO_2S$ = 898.09) |
| P-21 | m/z = 681.21($C_{49}H_{31}NOS$ = 681.85) | P-22 | m/z = 807.26($C_{59}H_{37}NOS$ = 808.01) |
| P-23 | m/z = 907.29($C_{67}H_{41}NOS$ = 908.13) | P-24 | m/z = 807.26($C_{59}H_{37}NOS$ = 808.01) |
| P-25 | m/z = 805.24($C_{59}H_{35}NOS$ = 806.00) | P-26 | m/z = 797.28($C_{58}H_{39}NOS$ = 798.02) |
| P-27 | m/z = 757.24($C_{55}H_{35}NOS$ = 757.95) | P-28 | m/z = 771.22($C_{55}H_{33}NO_2S$ = 771.93) |
| P-29 | m/z = 757.24($C_{55}H_{35}NOS$ = 757.95) | P-30 | m/z = 787.20($C_{55}H_{33}NOS_2$ = 788.00) |
| P-31 | m/z = 857.28($C_{63}H_{39}NOS$ = 858.07) | P-32 | m/z = 833.28($C_{61}H_{39}NOS$ = 834.05) |
| P-33 | m/z = 883.29($C_{65}H_{41}NOS$ = 884.11) | P-34 | m/z = 781.24($C_{57}H_{35}NOS$ = 781.97) |
| P-35 | m/z = 682.21($C_{48}H_{30}N_2OS$ = 682.84) | P-36 | m/z = 681.21($C_{49}H_{31}NOS$ = 681.85) |
| P-37 | m/z = 807.26($C_{59}H_{37}NOS$ = 808.01) | P-38 | m/z = 907.29($C_{67}H_{41}NOS$ = 908.13) |
| P-39 | m/z = 807.26($C_{59}H_{37}NOS$ = 808.01) | P-40 | m/z = 807.26($C_{59}H_{37}NOS$ = 808.01) |
| P-41 | m/z = 681.21($C_{49}H_{31}NOS$ = 681.85) | P-42 | m/z = 681.21($C_{49}H_{31}NOS$ = 681 .85) |
| P-43 | m/z = 681.21($C_{49}H_{31}NOS$ = 681.85) | P-44 | m/z = 681.21($C_{49}H_{31}NOS$ = 681.85) |
| P-45 | m/z = 873.31($C_{64}H_{43}NOS$ = 874.11) | P-46 | m/z = 857.28($C_{63}H_{39}NOS$ = 858.07) |
| P-47 | m/z = 833.28($C_{61}H_{39}NOS$ = 834.05) | P-48 | m/z = 883.29($C_{65}H_{41}NOS$ = 884.11) |
| P-49 | m/z = 781.24($C_{57}H_{35}NOS$ = 781.97) | P-50 | m/z = 682.21($C_{48}H_{30}N_2OS$ = 682.84) |
| P-51 | m/z = 798.23($C_{56}H_{34}N_2O_2S$ = 798.96) | P-52 | m/z = 846.27($C_{61}H_{38}N_2OS$ = 847.05) |
| P-53 | m/z = 811.28($C_{59}H_{33}D_4NOS$ = 812.04) | P-54 | m/z = 828.19($C_{56}H_{32}N_2O_2S_2$ = 829.00) |
| P-55 | m/z = 863.23($C_{61}H_{37}NOS_2$ = 864.09) | P-56 | m/z = 823.24($C_{59}H_{37}NS_2$ = 824.07) |
| P-57 | m/z = 863.23($C_{61}H_{37}NOS_2$ = 864.09) | P-58 | m/z = 929.22($C_{65}H_{39}NS_3$ = 930.21) |
| P-59 | m/z = 938.28($C_{67}H_{42}N_2S_2$ = 939.21) | P-60 | m/z = 797.22($C_{57}H_{35}NS_2$ = 798.03) |
| P-61 | m/z = 813.25($C_{58}H_{39}NS_2$ = 814.08) | P-62 | m/z = 773.22($C_{55}H_{35}NS_2$ = 774.01) |
| P-63 | m/z = 747.21($C_{53}H_{33}NS_2$ = 747.97) | P-64 | m/z = 823.24($C_{59}H_{37}NS_2$ = 824.07) |
| P-65 | m/z = 853.19($C_{59}H_{35}NS_3$ = 854.12) | P-66 | m/z = 923.27($C_{67}H_{41}NS_2$ = 924.19) |
| P-67 | m/z = 949.28($C_{69}H_{43}NS_2$ = 950.23) | P-68 | m/z = 781.24($C_{57}H_{35}NOS$ = 781.97) |
| P-69 | m/z = 847.24($C_{61}H_{37}NS_2$ = 848.09) | P-70 | m/z = 698.19($C_{48}H_{30}N_2S_2$ = 698.90) |
| P-71 | m/z = 874.27($C_{62}H_{38}N_2O_2S$ = 875.06) | P-72 | m/z = 872.29($C_{63}H_{40}N_2OS$ = 873.09) |
| P-73 | m/z = 833.28($C_{61}H_{39}NOS$ = 834.05) | P-74 | m/z = 970.21($C_{66}H_{38}N_2OS_3$ = 971.22) |
| P-75 | m/z = 1055.33($C_{76}H_{49}NOS_2$ = 1056.35) | P-76 | m/z = 741.27($C_{55}H_{35}NO_2$ = 741.89) |
| P-77 | m/z = 883.29($C_{65}H_{41}NOS$ = 884.11) | P-78 | m/z = 931.31($C_{59}H_{41}NO_3$ = 932.09) |
| P-79 | m/z = 868.31($C_{64}H_{40}N_2O_2$ = 869.04) | P-80 | m/z = 841.30($C_{63}H_{39}NO_2$ = 842.01) |
| P-81 | m/z = 741.27($C_{55}H_{35}NO_2$ = 741.89) | P-82 | m/z = 781.30($C_{58}H_{39}NO_2$ = 781.96) |
| P-83 | m/z = 705.27($C_{52}H_{35}NO_2$ = 705.86) | P-84 | m/z = 795.28($C_{58}H_{37}NO_3$ = 795.94) |
| P1-1 | m/z = 705.27($C_{52}H_{35}NO_2$ = 705.86) | P1-2 | m/z = 781.30($C_{58}H_{39}NO_2$ = 781.96) |
| P1-3 | m/z = 705.27($C_{52}H_{35}NO_2$ = 705.86) | P1-4 | m/z = 705.27($C_{52}H_{35}NO_2$ = 705.86) |
| P1-5 | m/z = 721.24($C_{52}H_{35}NOS$ = 721.92) | P1-6 | m/z = 829.30($C_{52}H_{39}NO_2$ = 830.00) |
| P1-7 | m/z = 829.30($C_{62}H_{39}NO_2$ = 830.00) | P1-8 | m/z = 829.30($C_{62}H_{39}NO_2$ = 830.00) |
| P1-9 | m/z = 829.30($C_{62}H_{39}NO_2$ = 830.00) | P1-10 | m/z = 845.28($C_{62}H_{39}NOS$ = 846.06) |
| P1-11 | m/z = 827.28($C_{62}H_{37}NO_2$ = 827.98) | P1-12 | m/z = 843.26($C_{62}H_{37}NOS$ = 844.04) |
| P1-13 | m/z = 781.30($C_{58}H_{39}NO_2$ = 781.96) | P1-14 | m/z = 797.28($C_{58}H_{39}NOS$ = 798.02) |
| P1-15 | m/z = 781.30($C_{58}H_{39}NO_2$ = 781.96) | P1-16 | m/z = 797.28($C_{58}H_{39}NOS$ = 798.02) |
| P1-17 | m/z = 781.30($C_{58}H_{39}NO_2$ = 781.96) | P1-18 | m/z = 797.28($C_{58}H_{39}NOS$ = 798.02) |
| P1-19 | m/z = 781.30($C_{58}H_{39}NO_2$ = 781.96) | P1-20 | m/z = 781.30($C_{58}H_{39}NO_2$ = 781.96) |
| P1-21 | m/z = 781.30($C_{58}H_{39}NO_2$ = 781.96) | P1-22 | m/z = 781.30($C_{58}H_{39}NO_2$ = 781.96) |
| P1-23 | m/z = 797.28($C_{58}H_{39}NOS$ = 798.02) | P1-24 | m/z = 797.28($C_{58}H_{39}NOS$ = 798.02) |
| P1-25 | m/z = 797.28($C_{58}H_{39}NOS$ = 798.02) | P1-26 | m/z = 831.31($C_{62}H_{41}NO_2$ = 832.02) |
| P1-27 | m/z = 847.29($C_{62}H_{41}NOS$ = 848.08) | P1-28 | m/z = 831.31($C_{62}H_{41}NO_2$ = 832.02) |
| P1-29 | m/z = 847.29($C_{62}H_{41}NOS$ = 848.08) | P1-30 | m/z = 831.31($C_{62}H_{41}NO_2$ = 832.02) |
| P1-31 | m/z = 847.29($C_{62}H_{41}NOS$ = 848.08) | P1-32 | m/z = 782.29($C_{57}H_{38}N_2O_2$ = 782.94) |
| P1-33 | m/z = 913.34($C_{67}H_{47}NOS$ = 914.18) | P1-34 | m/z = 855.31($C_{64}H_{41}NO_2$ = 856.04) |
| P1-35 | m/z = 849.30($C_{62}H_{35}D_4NOS$ = 850.08) | P1-36 | m/z = 857.33($C_{64}H_{43}NO_2$ = 858.05) |
| P1-37 | m/z = 873.31($C_{64}H_{43}NOS$ = 874.11) | P1-38 | m/z = 857.33($C_{64}H_{43}NO_2$ = 858.05) |
| P1-39 | m/z = 873.31($C_{64}H_{43}NOS$ = 874.11) | P1-40 | m/z = 873.31($C_{64}H_{43}NOS$ = 874.11) |
| P1-41 | m/z = 857.33($C_{64}H_{43}NO_2$ = 858.05) | P1-42 | m/z = 857.33($C_{64}H_{43}NO_2$ = 858.05) |
| P1-43 | m/z = 857.33($C_{64}H_{43}NO_2$ = 858.05) | P1-44 | m/z = 873.31($C_{64}H_{43}NOS$ = 874.11) |
| P1-45 | m/z = 873.31($C_{64}H_{43}NOS$ = 874.11) | P1-46 | m/z = 797.28($C_{58}H_{39}NOS$ = 798.02) |
| P1-47 | m/z = 721.24($C_{52}H_{35}NOS$ = 721.92) | P1-48 | m/z = 721.24($C_{52}H_{35}NOS$ = 721.92) |
| P1-49 | m/z = 721.24($C_{52}H_{35}NOS$ = 721.92) | P1-50 | m/z = 737.22($C_{52}H_{35}NS_2$ = 737.98) |
| P1-51 | m/z = 845.28($C_{62}H_{39}NOS$ = 846.06) | P1-52 | m/z = 861.25($C_{62}H_{39}NS_2$ = 862.12) |
| P1-53 | m/z = 861.25($C_{62}H_{39}NS_2$ = 862.12) | P1-54 | m/z = 861.25($C_{62}H_{39}NS_2$ = 862.12) |
| P1-55 | m/z = 861.25($C_{62}H_{39}NS_2$ = 862.12) | P1-56 | m/z = 921.28($C_{66}H_{39}N_3OS$ = 922.12) |
| P1-57 | m/z = 859.24($C_{62}H_{37}NS_2$ = 860.11) | P1-58 | m/z = 797.28($C_{58}H_{39}NOS$ = 798.02) |
| P1-59 | m/z = 813.25($C_{58}H_{39}NS_2$ = 814.08) | P1-60 | m/z = 797.28($C_{58}H_{39}NOS$ = 798.02) |
| P1-61 | m/z = 813.25($C_{58}H_{39}NS_2$ = 814.08) | P1-62 | m/z = 797.28($C_{58}H_{39}NOS$ = 798.02) |
| P1-63 | m/z = 813.25($C_{58}H_{39}NS_2$ = 814.08) | P1-64 | m/z = 797.28($C_{58}H_{39}NOS$ = 798.02) |
| P1-65 | m/z = 813.25($C_{58}H_{39}NS_2$ = 814.08) | P1-66 | m/z = 847.29($C_{62}H_{41}NOS$ = 848.08) |
| P1-67 | m/z = 863.27($C_{62}H_{41}NS_2$ = 864.14) | P1-68 | m/z = 847.29($C_{62}H_{41}NOS$ = 848.08) |
| P1-69 | m/z = 863.27($C_{62}H_{41}NS_2$ = 864.14) | P1-70 | m/z = 847.29($C_{62}H_{41}NOS$ = 848.08) |
| P1-71 | m/z = 863.27($C_{62}H_{41}NS_2$ = 864.14) | P1-72 | m/z = 798.27($C_{57}H_{38}N_2OS$ = 799.00) |
| P1-73 | m/z = 797.28($C_{58}H_{39}NOS$ = 798.02) | P1-74 | m/z = 787.24($C_{56}H_{37}NS_2$ = 788.04) |
| P1-75 | m/z = 787.24($C_{56}H_{37}NS_2$ = 788.04) | P1-76 | m/z = 771.26($C_{56}H_{37}NOS$ = 771.98) |
| P1-77 | m/z = 771.26($C_{56}H_{37}NOS$ = 771.98) | P1-78 | m/z = 813.25($C_{58}H_{39}NS_2$ = 814.08) |

TABLE 3-continued

| Compound | FD-MS | Compound | FD-MS |
|---|---|---|---|
| P1-79 | m/z = 907.35($C_{68}H_{45}NO_2$ = 908.11) | P1-80 | m/z = 903.31($C_{58}H_{41}NO_2$ = 904.08) |
| P1-81 | m/z = 827.28($C_{62}H_{37}NO_2$ = 827.98) | P1-82 | m/z = 843.26($C_{62}H_{37}NOS$ = 844.04) |
| P1-83 | m/z = 843.26($C_{62}H_{37}NOS$ = 844.04) | P1-84 | m/z = 787.24($C_{56}H_{37}NS_2$ _ 788.04) |
| P1-85 | m/z = 879.31($C_{66}H_{41}NO_2$ = 880.06) | P1-86 | m/z = 829.30($C_{62}H_{39}NO_2$ = 830.00) |
| P1-87 | m/z = 649.23($C_{48}H_{31}N_3$ = 649.80) | | |
| P2-1 | m/z = 843.28($C_{62}H_{37}NO_3$ = 843.98) | P2-2 | m/z = 843.28($C_{62}H_{37}NO_3$ = 843.98) |
| P2-3 | m/z = 843.28($C_{62}H_{37}NO_3$ = 843.98) | P2-4 | m/z = 843.28($C_{62}H_{37}NO_3$ = 843.98) |
| P2-5 | m/z = 909.27($C_{66}H_{39}NO_2S$ = 910.10) | P2-6 | m/z = 861.27($C_{62}H_{36}FNO_3$ = 861.97) |
| P2-7 | m/z = 893.29($C_{66}H_{39}NO_3$ = 894.04) | P2-8 | m/z = 995.34($C_{74}H_{45}NO_3$ = 996.18) |
| P2-9 | m/z = 859.25($C_{62}H_{37}NO_2S$ = 860.04) | P2-10 | m/z = 859.25($C_{62}H_{37}NO_2S$ = 860.04) |
| P2-11 | m/z = 859.25($C_{62}H_{37}NO_2S$ = 860.04) | P2-12 | m/z = 859.25($C_{62}H_{37}NO_2S$ = 860.04) |
| P2-13 | m/z = 859.25($C_{62}H_{37}NO_2S$ = 860.04) | P2-14 | m/z = 859.25($C_{62}H_{37}NO_2S$ = 860.04) |
| P2-15 | m/z = 859.25($C_{62}H_{37}NO_2S$ = 860.04) | P2-16 | m/z = 859.25($C_{62}H_{37}NO_2S$ = 860.04) |
| P2-17 | m/z = 875.23($C_{62}H_{37}NOS_2$ _ 876.10) | P2-18 | m/z = 875.23($C_{62}H_{37}NOS_2$ _ 876.1) |
| P2-19 | m/z = 891.21($C_{62}H_{37}NS_3$ = 892.17) | P2-20 | m/z = 919.31($C_{68}H_{41}NO_3$ = 920.08) |
| P2-21 | m/z = 935.29($C_{68}H_{41}NO_2S$ = 936.14) | P2-22 | m/z = 951.26($C_{68}H_{41}NOS_2$ = 952.20) |
| P2-23 | m/z = 967.24($C_{68}H_{41}NS_3$ = 968.26) | P2-24 | m/z = 985.30($C_{72}H_{43}NO_2S$ = 986.20) |
| P2-25 | m/z = 1001.28($C_{72}H_{43}NOS_2$ = 1002.26) | P2-26 | m/z = 952.26($C_{67}H_{40}N_2OS_2$ = 953.19) |
| P2-27 | m/z = 952.26($C_{67}H_{40}N_2OS_2$ = 953.19) | P2-28 | m/z = 919.31($C_{68}H_{41}NO_3$ = 920.08) |
| P2-29 | m/z = 935.29($C_{68}H_{41}NO_2S$ = 936.14) | P2-30 | m/z = 919.31($C_{68}H_{41}NO_3$ _ 920.08) |
| P2-31 | m/z = 935.29($C_{68}H_{41}NO_2S$ = 936.14) | P2-32 | m/z = 935.29($C_{68}H_{41}NO_2S$ = 936.14) |
| P2-33 | m/z = 967.24($C_{68}H_{41}NS_3$ = 968.26) | P2-34 | m/z = 900.23($C_{63}H_{36}N_2OS_2$ = 901.11 |
| P2-35 | m/z = 901.25($C_{64}H_{39}NOS_2$ = 902.14) | P2-36 | m/z = 893.29($C_{66}H_{39}NO_3$ = 894.04) |
| P2-37 | m/z = 941.22($C_{66}H_{39}NS_3$ = 942.23) | P2-38 | m/z = 909.27($C_{66}H_{39}NO_2S$ = 910.10) |
| P2-39 | m/z = 919.31($C_{68}H_{41}NO_3$ = 920.08) | P2-40 | m/z = 941.22($C_{66}H_{39}NS_3$ = 942.23) |
| P2-41 | m/z = 909.27($C_{66}H_{39}NO_2S$ = 910.1) | P2-42 | m/z = 893.29($C_{66}H_{39}NO_3$ = 894.04) |
| P2-43 | m/Z = 941.22($C_{66}H_{39}NS_3$ = 942.23) | P2-44 | m/z = 909.27($C_{66}H_{39}NO_2S$ = 910.10) |
| P2-45 | m/z = 893.29($C_{66}H_{39}NO_3$ _ 894.04) | P2-46 | m/z = 951.26($C_{68}H_{41}NOS_2$ = 952.2) |
| P2-47 | m/z = 1017.26($C_{72}H_{43}NS_3$ = 1018.32) | P2-48 | m/z = 995.34($C_{74}H_{45}NO_3$ = 996.18) |
| P2-49 | m/z = 895.23($C_{62}H_{33}D_4NS_3$ = 896.19) | P2-50 | m/z = 995.34($C_{74}H_{45}NO_3$ = 996.18) |
| P2-51 | m/z = 995.34($C_{74}H_{45}NO_3$ = 996.18) | P2-52 | m/z = 1093.29($C_{78}H_{47}NS_3$ = 1094.42) |
| P2-53 | m/z = 975.26($C_{70}H_{41}NOS_2$ = 976.22) | P2-54 | m/z = 991.24($C_{70}H_{41}NS_3$ = 992.29) |
| P2-55 | m/z = 943.31($C_{70}H_{41}NO_3$ = 944.10) | | |
| P3-1 | m/z = 691.29($C_{52}H_{37}NO$ = 691.87) | P3-2 | m/z = 651.26($C_{49}H_{33}NO$ = 651.81) |
| P3-3 | m/z = 767.32($C_{58}H_{41}NO$ = 767.97) | P3-4 | m/z = 651.26($C_{49}H_{33}NO$ = 651.81) |
| P3-5 | m/z = 641.22($C_{47}H_{31}NS$ = 641.83) | P3-6 | m/z = 700.29($C_{53}H_{35}N_2$ = 700.89) |
| P3-7 | m/z = 601.28($C_{46}H_{35}N$ = 601.79) | P3-8 | m/z = 651.26($C_{49}H_{33}NO$ = 651.81) |
| P3-9 | m/z = 843.3($C_{63}H_{41}NS$ = 844.09) | P3-10 | m/z = 701.28($C_{52}H_{35}N_3$ = 701.87) |
| P3-11 | m/z = 677.31($C_{52}H_{39}N$ = 677.89) | P3-12 | m/z = 729.28($C_{53}H_{35}N_3O$ = 729.88) |
| P3-13 | m/z = 912.29($C_{64}H_{40}N_4OS$ = 913.11) | P3-14 | m/z = 878.34($C_{65}H_{42}N_4$ = 879.08) |
| P3-15 | m/z = 805.35($C_{60}H_{43}N_3$ = 806.03) | P3-16 | m/z = 906.34($C_{66}H_{42}N_4O$ = 907.09) |
| P3-17 | m/z = 769.26($C_{55}H_{35}N_3S$ = 769.97) | P3-18 | m/z = 884.3($C_{63}H_{40}N_4S$ = 885.1) |
| P3-19 | m/z = 767.36($C_{59}H_{45}N$ = 768.02) | P3-20 | m/z = 815.32($C_{62}H_{41}NO$ = 816.02) |
| P3-21 | m/z = 829.28($C_{62}H_{39}NS$ = 830.06) | P3-22 | m/z = 781.35($C_{59}H_{35}D_5N_2$ = 782.01) |
| P3-23 | m/z = 695.3($C_{52}H_{38}FN$ = 695.88) | P3-24 | m/z = 753.34($C_{58}H_{43}N$ = 753.99) |
| P3-25 | m/z = 803.36($C_{62}H_{45}N$ = 804.05) | P3-26 | m/z = 829.37($C_{64}H_{47}N$ = 830.09) |
| P3-27 | m/z = 918.4($C_{70}H_{50}N_2$ = 919.18) | P3-28 | m/z = 601.28($C_{46}H_{35}N$ = 601.79) |
| P3-29 | m/z = 677.31($C_{52}H_{39}N$ = 677.89) | P3-30 | m/z = 753.34($C_{58}H_{43}N$ = 753.99) |
| P3-31 | m/z = 701.31($C_{54}H_{39}N$ = 701.91) | P3-32 | m/z = 677.31($C_{52}H_{39}N$ = 677.89) |
| P3-33 | m/z = 677.31($C_{52}H_{39}N$ = 677.89) | P3-34 | m/z = 682.34($C_{52}H_{34}D_5N$ = 682.92) |
| P3-35 | m/z = 701.31($C_{54}H_{39}N$ = 701.91) | P3-36 | m/z = 619.27($C_{46}H_{34}FN$ = 619.78) |
| P3-37 | m/z = 753.34($C_{58}H_{43}N$ = 753.99) | P3-38 | m/z = 879.39($C_{68}H_{49}N$ = 880.15) |
| P3-39 | m/z = 701.31($C_{54}H_{39}N$ = 701.91) | P3-40 | m/z = 651.29($C_{50}H_{37}N$ = 651.85) |
| P3-41 | m/z = 727.32($C_{56}H_{41}N$ = 727.95) | P3-42 | m/z = 758.37($C_{58}H_{38}D_5N$ = 759.02) |
| P3-43 | m/z = 757.37($C_{58}H_{47}N$ = 758.02) | P3-44 | m/z = 753.34($C_{58}H_{43}N$ = 753.99) |
| P3-45 | m/z = 803.36($C_{62}H_{45}N$ = 804.05) | P3-46 | m/z = 834.4($C_{64}H_{42}D_5N$ = 835.12) |
| P3-47 | m/z = 883.33($C_{66}H_{45}NS$ = 884.15) | P3-48 | m/z = 651.26($C_{49}H_{33}NO$ = 651.81) |
| P3-49 | m/z = 641.22($C_{47}H_{31}NS$ = 641.83) | P3-50 | m/z = 700.29($C_{53}H_{36}N_2$ = 700.89) |
| P3-51 | m/z = 677.31($C_{52}H_{39}N$ = 677.89) | P3-52 | m/z = 651.26($C_{49}H_{33}NO$ = 651.81) |
| P3-53 | m/z = 843.3($C_{63}H_{41}NS$ = 844.09) | P3-54 | m/z = 701.28($C_{52}H_{35}N_3$ = 701.87) |
| P3-55 | m/z = 677.31($C_{52}H_{39}N$ = 677.89) | P3-56 | m/z = 906.34($C_{66}H_{42}N_4O$ =907.09) |
| P3-57 | m/z = 769.26($C_{55}H_{35}N_3S$ = 769.97) | P3-58 | m/z = 884.3($C_{63}H_{40}N_4S$ = 885.1) |
| P3-59 | m/z = 767.36($C_{59}H_{45}N$ = 768.02) | P3-60 | m/z = 815.32($C_{62}H_{41}NO$ = 816.02) |
| P3-61 | m/z = 829.28($C_{62}H_{39}NS$ = 830.06) | P3-62 | m/z = 781.35($C_{59}H_{35}D_5N_2$ = 782.01) |
| P3-63 | m/z = 695.3($C_{52}H_{38}FN$ = 695.88) | P3-64 | m/z = 753.34($C_{58}H_{43}N$ = 753.99) |
| P3-65 | m/z = 803.36($C_{62}H_{45}N$ = 804.05) | P3-66 | m/z = 829.37($C_{64}H_{47}N$ = 830.09) |
| P3-67 | m/z = 918.4($C_{70}H_{50}N_2$ = 919.18) | P3-68 | m/z = 753.34($C_{58}H_{43}N$ = 753.99) |
| P3-69 | m/z = 753.34($C_{58}H_{43}N$ = 753.99) | P3-70 | m/z = 601.28($C_{46}H_{35}N$ = 601.79) |
| P3-71 | m/z = 677.31($C_{52}H_{39}N$ = 677.89) | P3-72 | m/z = 677.31($C_{52}H_{39}N$ = 677.89) |
| P3-73 | m/z = 677.31($C_{52}H_{39}N$ = 677.89) | P3-74 | m/z = 677.31($C_{52}H_{39}N$ = 677.89) |
| P3-75 | m/z = 677.31($C_{52}H_{39}N$ = 677.89) | P3-76 | m/z = 717.34($C_{55}H_{43}N$ = 717.96) |
| P3-77 | m/z = 753.34($C_{58}H_{43}N$ = 753.99) | P3-78 | m/z = 691.29($C_{52}H_{37}NO$ = 691.87) |
| P3-79 | m/z = 767.32($C_{58}H_{41}NO$ = 767.97) | P3-80 | m/z = 651.26($C_{49}H_{33}NO$ = 651.81) |
| P3-81 | m/z = 665.24($C_{49}H_{31}NO_2$ = 665.79) | P3-82 | m/z = 691.29($C_{52}H_{37}NO$ = 691.87) |
| P3-83 | m/z = 717.34($C_{55}H_{43}N$ = 717.96) | P3-84 | m/z = 677.31($C_{52}H_{39}N$ = 677.89) |
| P3-85 | m/z = 691.29($C_{52}H_{37}NO$ = 691.87) | P3-86 | m/z = 753.34($C_{58}H_{43}N$ = 753.99) |
| P3-87 | m/z = 727.32($C_{56}H_{41}N$ = 727.95) | P3-88 | m/z = 717.34($C_{55}H_{43}N$ = 717.96) |
| P3-89 | m/z = 677.31($C_{52}H_{39}N$ = 677.89) | P3-90 | m/z = 753.34($C_{58}H_{43}N$ = 753.99) |

TABLE 3-continued

| Compound | FD-MS | Compound | FD-MS |
|---|---|---|---|
| P3-91 | m/z = 727.32($C_{56}H_{41}N$ = 727.95) | P3-92 | m/z = 793.37($C_{61}H_{47}N$ = 794.05) |
| P3-93 | m/z = 753.34($C_{58}H_{43}N$ = 753.99) | P3-94 | m/z = 753.34($C_{58}H_{43}N$ = 753.99) |
| P3-95 | m/z = 615.29($C_{47}H_{37}N$ = 615.82) | P3-96 | m/z = 615.29($C_{47}H_{37}N$ = 615.82) |
| P3-97 | m/z = 691.32($C_{53}H_{41}N$ = 691.92) | P3-98 | m/z = 691.32($C_{53}H_{41}N$ = 691.92) |
| P3-99 | m/z = 691.32($C_{53}H_{41}N$ = 691.92) | P3-100 | m/z = 691.32($C_{53}H_{41}N$ = 691.92) |
| P3-101 | m/z = 691.32($C_{53}H_{41}N$ = 691.92) | P3-102 | m/z = 691.32($C_{53}H_{41}N$ = 691.92) |
| P3-103 | m/z = 801.34($C_{62}H_{43}N$ = 802.03) | P3-104 | m/z = 815.32($C_{62}H_{41}NO$ = 816.02) |
| P3-105 | m/z = 815.32($C_{62}H_{41}NO$ = 816.02) | P3-106 | m/z = 841.37($C_{65}H_{47}N$ = 842.10) |
| P3-107 | m/z = 851.36($C_{66}H_{45}N$ = 852.09) | P3-108 | m/z = 801.34($C_{62}H_{43}N$ = 802.03) |

[Synthesis Example of 2] Compounds Represented by Formula 2

The compound represented by Formula 2 according to the present invention (final products 2) may be prepared by reacting Sub 3 and Sub 4 as shown in Reaction Scheme 2 below, but is not limited thereto. Sub 3 may be the same as Sub 1 of Reaction Scheme 1. In addition, the compound represented by Formula 2 according to the present invention (Final product 2) was prepared by the synthesis method disclosed in Korean Patent No. 10-1614739 (registration-published on Apr. 18, 2016) and Korean Patent Application No. 10-2016-0110817 (filed on Aug. 30, 2016) which are filed by the applicant of the present invention, but is not limited thereto.

<Reaction Scheme 4>

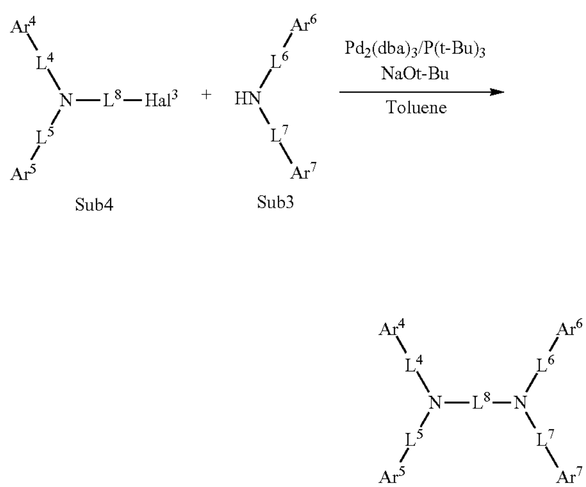

Final Products 2

(Hal[3] is Br or Cl.)

Synthesis Example of Sub 3

Sub 3 of Reaction Scheme 3 may be synthesized by the reaction route of the following Reaction Scheme 5, but are not limited thereto.

<Reaction Scheme 5>

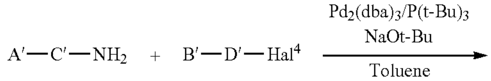

-continued

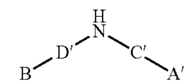

Sub3

(Hal[4] is Br or Cl.)

In Reaction Scheme 5 A' and B' are correspond to $Ar^6$ and $Ar^7$, respectively, and C' and D' are correspond to $L^6$ and $L^7$, respectively.

1. Synthesis Example of Sub 3-1

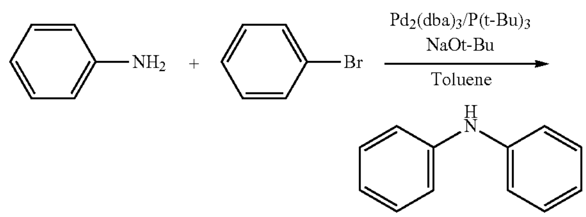

Sub 3-1

After aniline (12.0 g, 128.24 mmol) was dissolved in toluene (400 mL) and bromobenzene (20.1 g, 128.24 mmol), $Pd_2(dba)_3$ (5.9 g, 6.44 mmol), 50% $P(t\text{-}Bu)_3$ (5.21 mL, 12.89 mmol) and NaOt-Bu (37.16 g, 386.64 mmol) were added to the solution, the mixture was stirred at 100° C. When the reaction was completed, the reaction product was extracted with $CH_2Cl_2$ and water. Then, an organic layer was dried over $MgSO_4$ and concentrated. Then, the concentrate was separated by a silica gel column and recrystallized to obtain 17.01 g (yield: 78%) of the product.

2. Synthesis Example of Sub 3-22

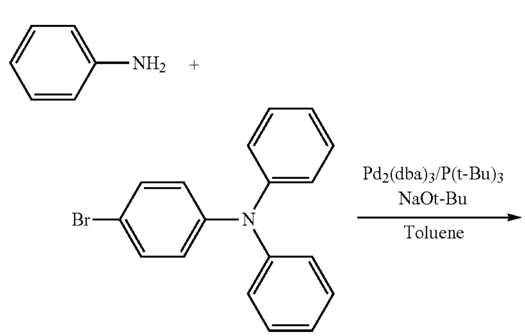

-continued

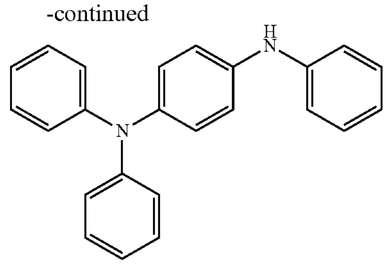

Sub 3-22

After dissolving aniline (7.09 g, 76.18 mmol) in toluene (500 mL) in a round bottom flask, 4-bromo-N,N-diphenylaniline (24.7 g 76.18 mmol), $Pd_2(dba)_3$ (3.49 g, 3.81 mmol), 50% $P(t\text{-}Bu)_3$ (3.08 mL, 7.62 mmol) and NaOt-Bu (21.96 g, 228.55 mmol) were added to the solution, and then the reaction was carried out in the same manner as in the synthesis method of Sub 3-1 to obtain 19.22 g (yield: 75%) of the product.

3. Synthesis Example of Sub 3-46

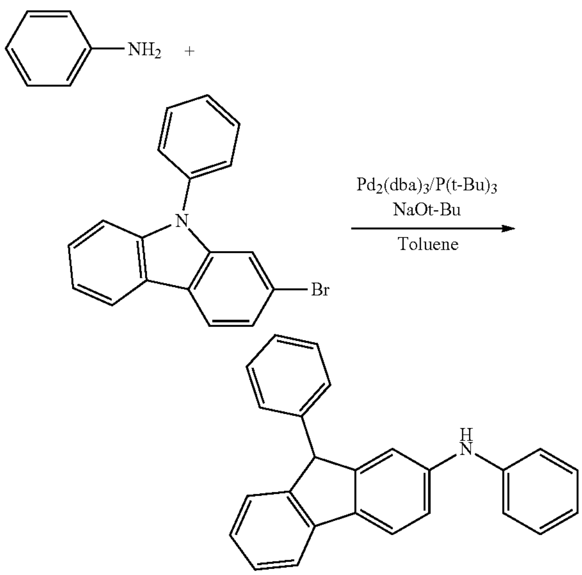

Sub 3-46

After dissolving aniline (5.72 g, 61.45 mmol) in toluene (400 mL) in a round bottom flask, 2-bromo-9-phenyl-9H-carbazole (19.80 g, 61.45 mmol), $Pd_2(dba)_3$ (2.81 g, 3.07 mmol), 50% $P(t\text{-}Bu)_3$ (2.49 mL, 6.15 mmol) and NaOt-Bu (17.72 g, 184.35 mmol) were added to the solution, and then the reaction was carried out in the same manner as in the synthesis method of Sub 3-1 to obtain 14.39 g (yield: 70%) of the product.

4. Synthesis Example of Sub 3-57

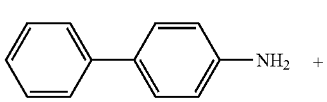

-continued

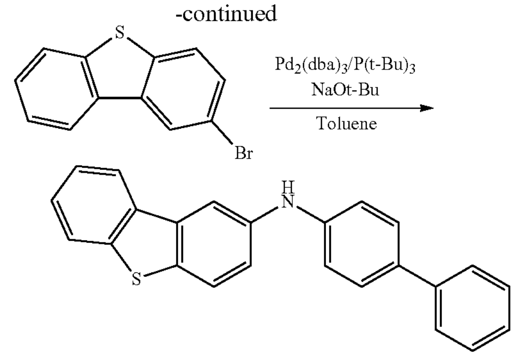

Sub 3-57

After dissolving [1,1'-biphenyl]-4-amine (13.86 g, 81.89 mmol) in toluene (430 mL) in a round bottom flask, 2-bromodibenzo[b,d]thiophene (21.55 g, 81.89 mmol), $Pd_2(dba)_3$ (3.75 g, 4.09 mmol), 50% $P(t\text{-}Bu)_3$ (3.31 mL, 8.19 mmol) and NaOt-Bu (23.61 g, 245.68 mmol) were added to the solution, and then the reaction was carried out in the same manner as in the synthesis method of Sub 3-1 to obtain 20.44 g (yield: 71%) of the product.

5. Synthesis Example of Sub 3-69

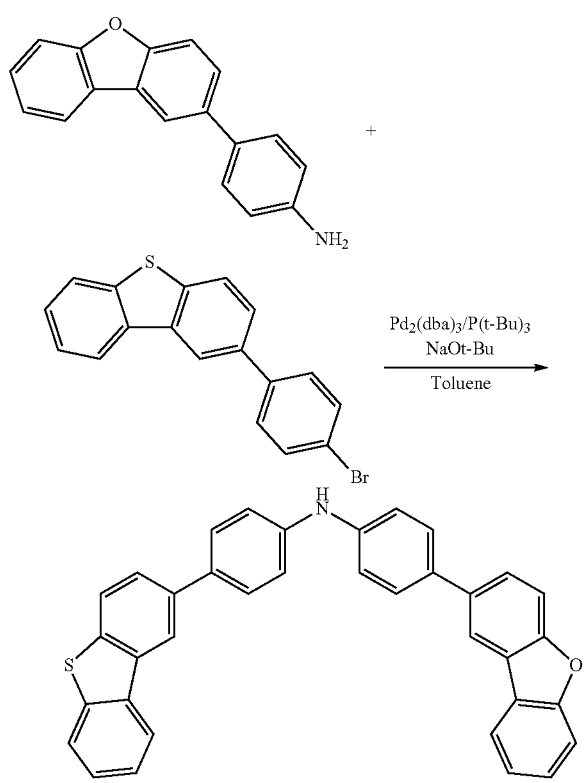

Sub 3-69

After dissolving 4-(dibenzo[b,d]furan-2-yl)aniline (12.60 g, 48.58 mmol) in toluene (330 mL) in a round bottom flask, 2-(4-bromophenyl)dibenzo[b,d]thiophene (16.48 g, 48.58 mmol), $Pd_2(dba)_3$ (2.22 g, 2.43 mmol), 50% $P(t\text{-}Bu)_3$ (1.97 mL, 4.86 mmol) and NaOt-Bu (14.0 g, 145.73 mmol) were added to the solution, and then the reaction was carried out in the same manner as in the synthesis method of Sub 3-1 to obtain 11.78 g (yield: 69%) of the product.
Compounds belong to Sub 3 are as follows, but are not limited thereto, and FD-MS values of the compounds are shown in Table 4 below.
Sub 3-1
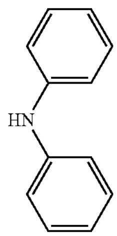
Sub 3-2
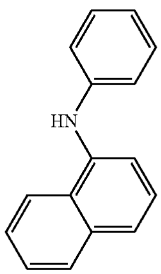
Sub 3-3
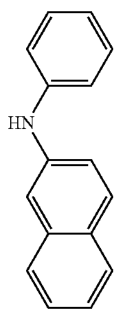
Sub 3-4
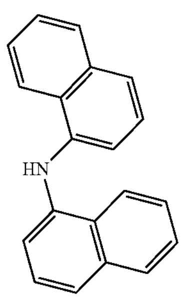
Sub 3-5
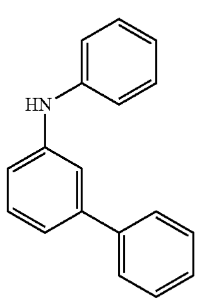
-continued
Sub 3-6
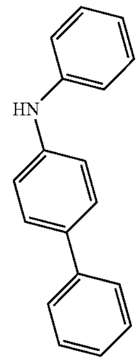
Sub 3-7
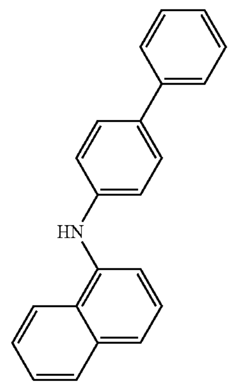
Sub 3-8
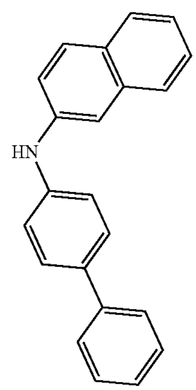
Sub 3-9
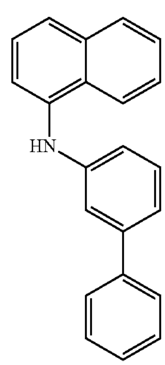

-continued
Sub 3-10
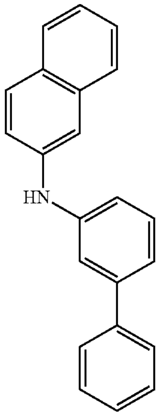
Sub 3-11
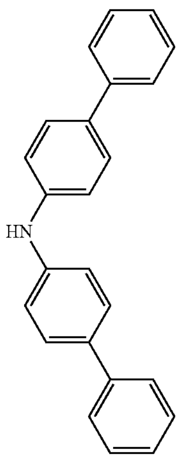
Sub 3-12
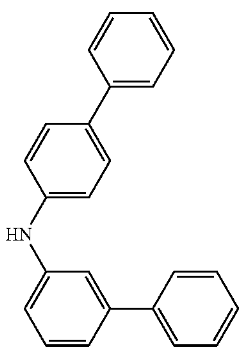
Sub 3-13
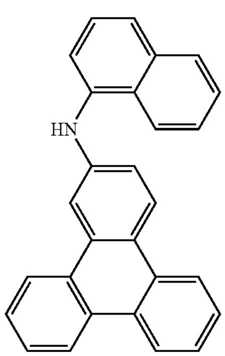
-continued
Sub 3-14
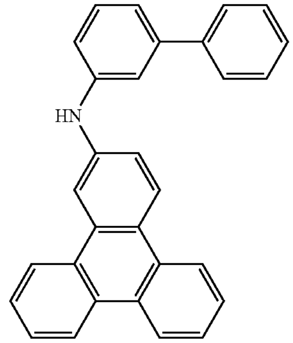
Sub 3-15
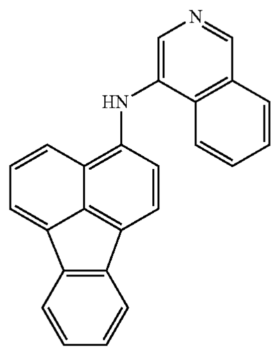
Sub 3-16
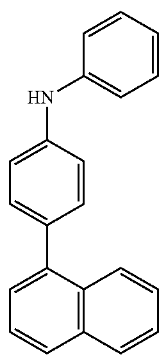
Sub 3-17
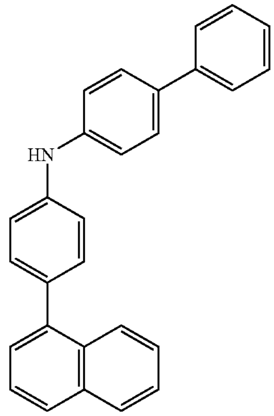

Sub 3-18
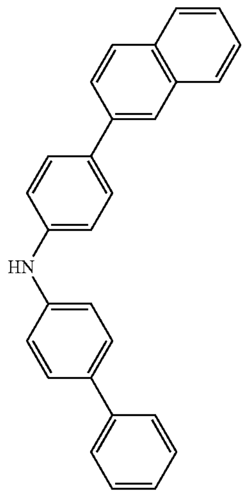
Sub 3-19
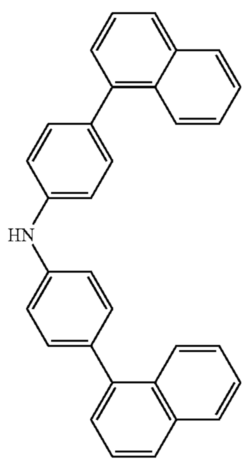
Sub 3-20
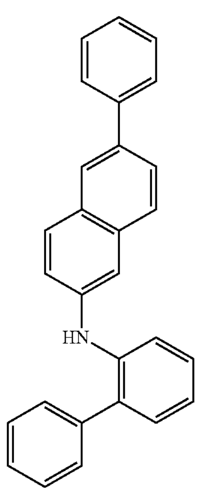
Sub 3-21
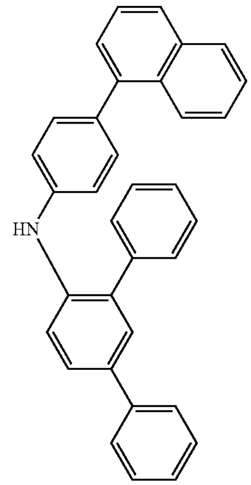
Sub 3-22
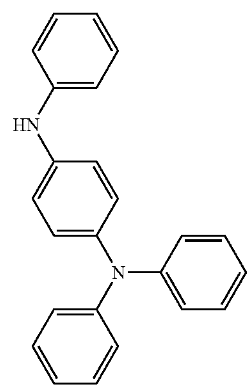
Sub 3-23
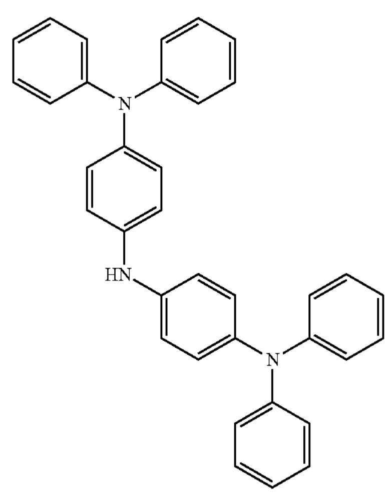

Sub 3-24
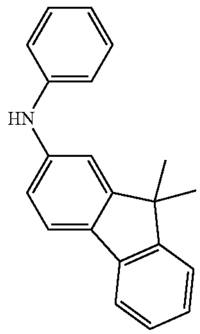
Sub 3-25
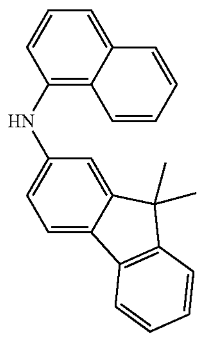
Sub 3-26
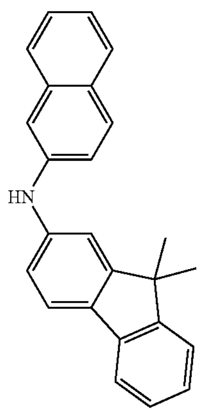
Sub 3-27
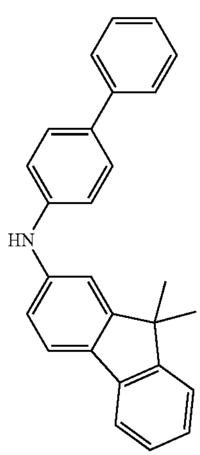
Sub 3-28
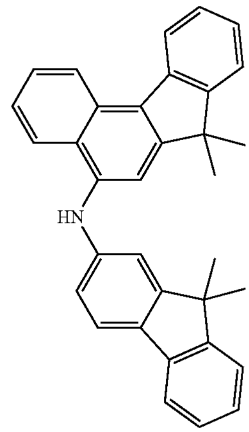
Sub 3-29
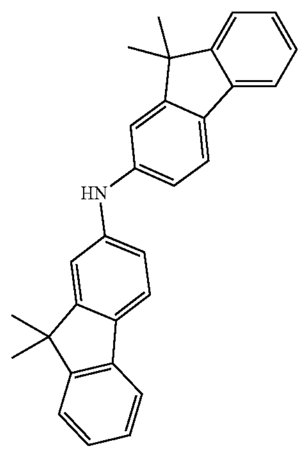
Sub 3-30
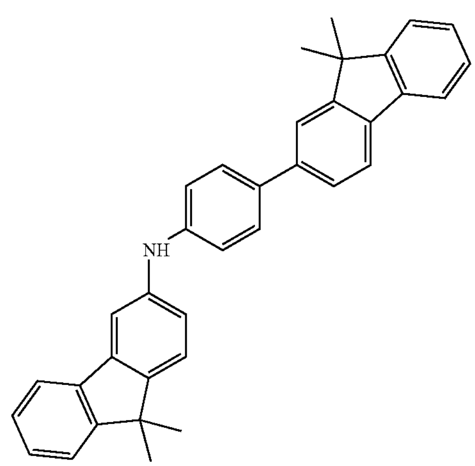

-continued
Sub 3-31
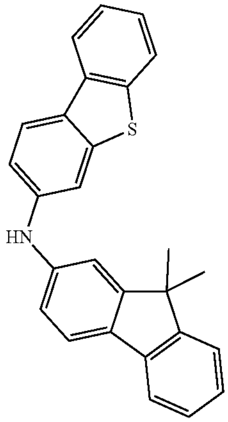
Sub 3-32
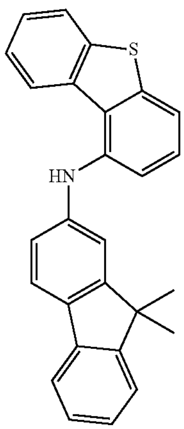
Sub 3-33
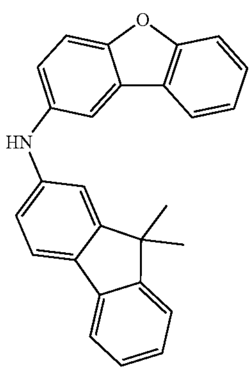
Sub 3-34
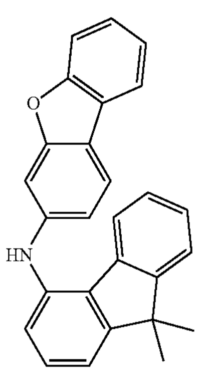
-continued
Sub 3-35
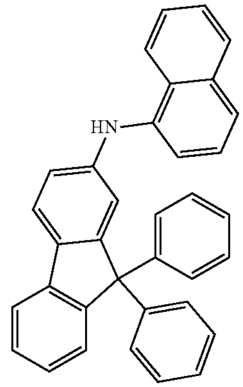
Sub 3-36
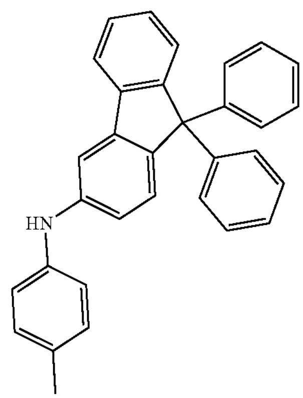
Sub 3-37
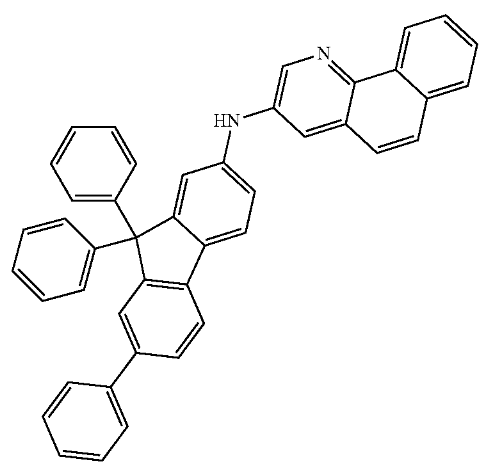

Sub 3-38
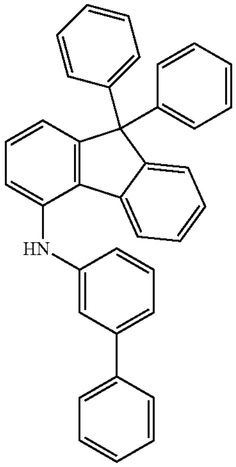
Sub 3-39
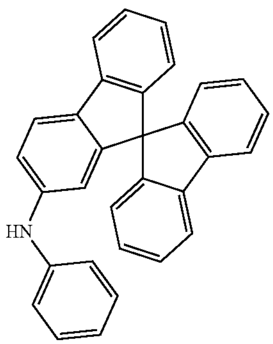
Sub 3-40
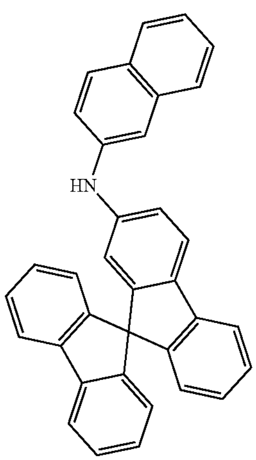
Sub 3-41
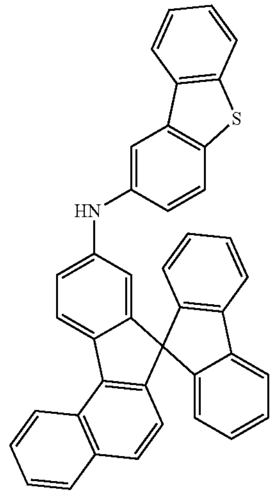
Sub 3-42
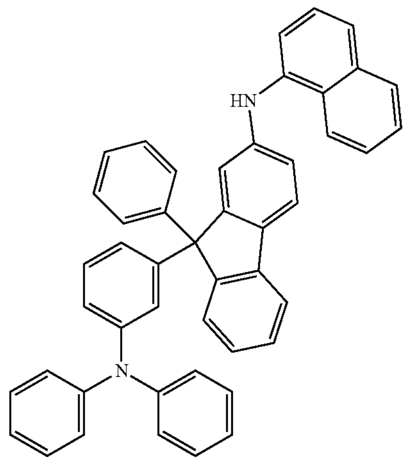
Sub 3-43
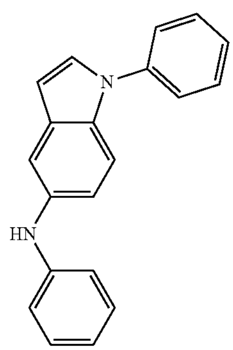
Sub 3-44
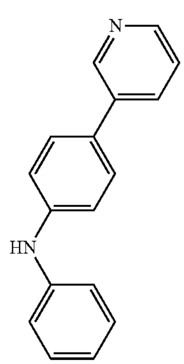

Sub 3-45
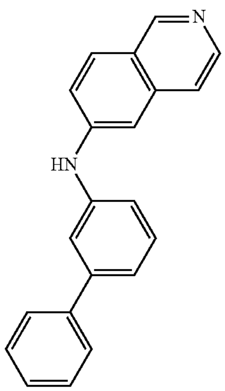
Sub 3-46
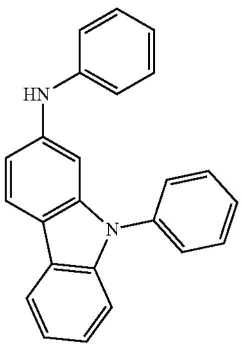
Sub 3-47
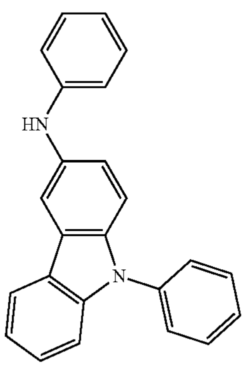
Sub 3-48
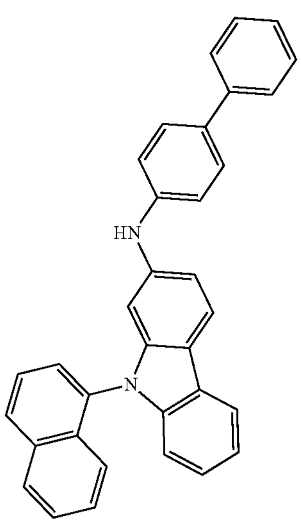
Sub 3-49
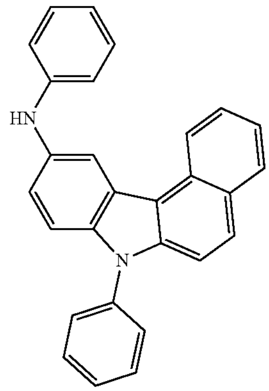
Sub 3-50
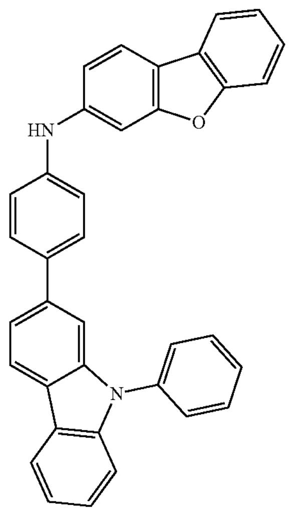
Sub 3-51
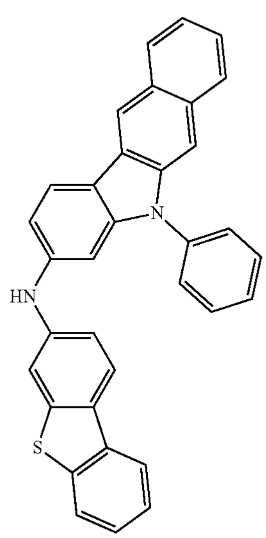

-continued
Sub 3-52
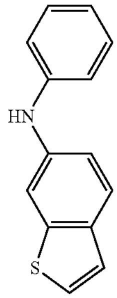
Sub 3-53
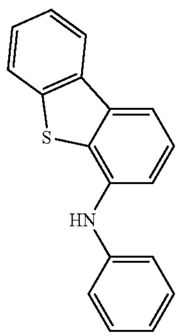
Sub 3-54
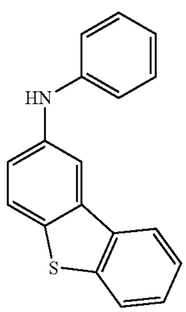
Sub 3-55
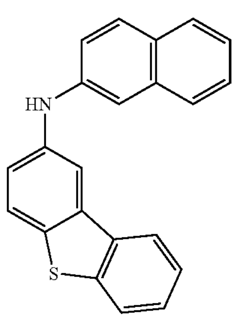
-continued
Sub 3-56
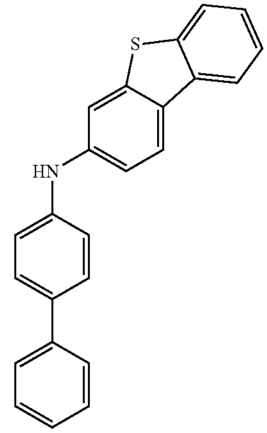
Sub 3-57
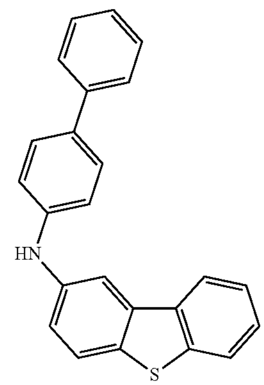
Sub 3-58
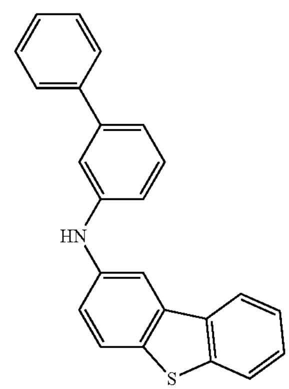
Sub 3-59
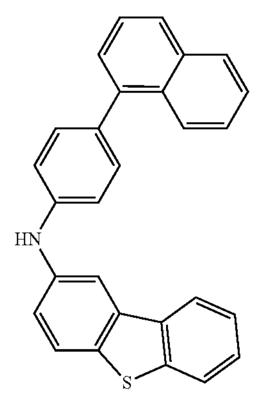

Sub 3-60
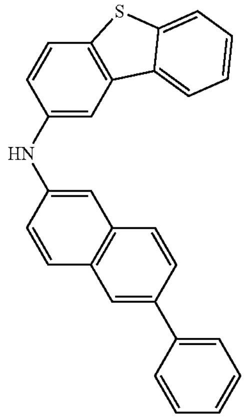
Sub 3-61
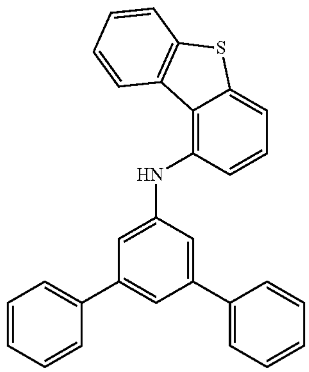
Sub 3-62
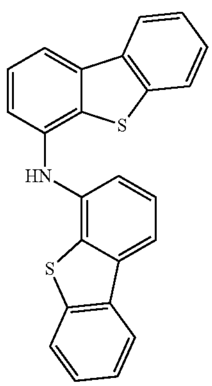
Sub 3-63
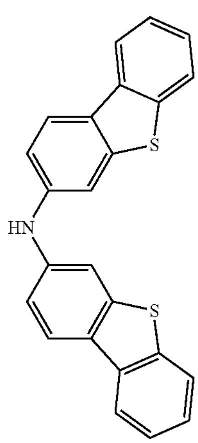
Sub 3-64
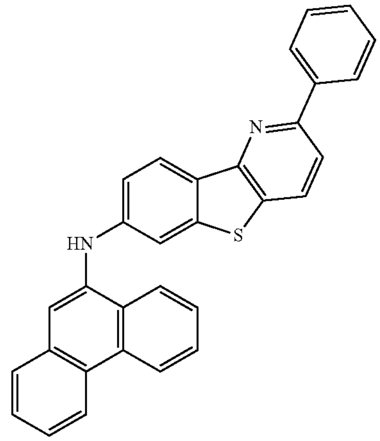
Sub 3-65
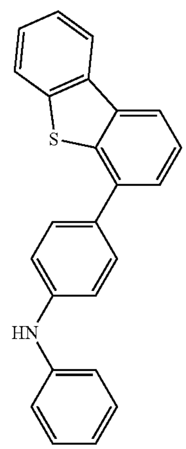
Sub 3-66
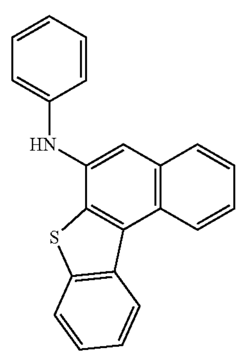

Sub 3-67
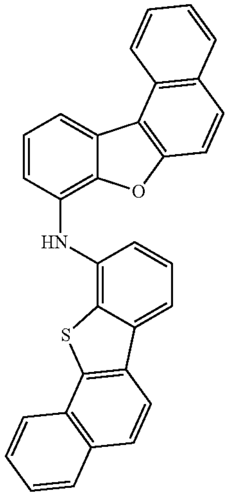
Sub 3-68
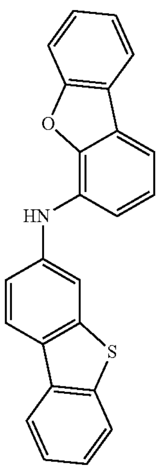
Sub 3-69
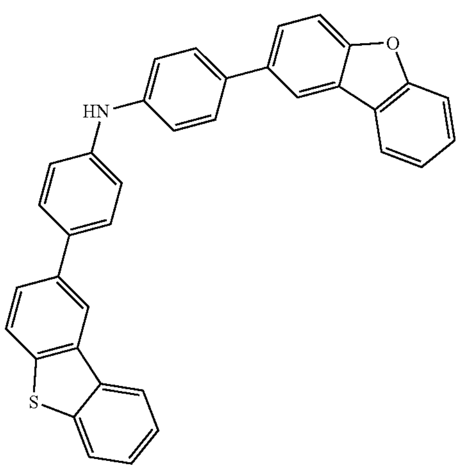
Sub 3-70
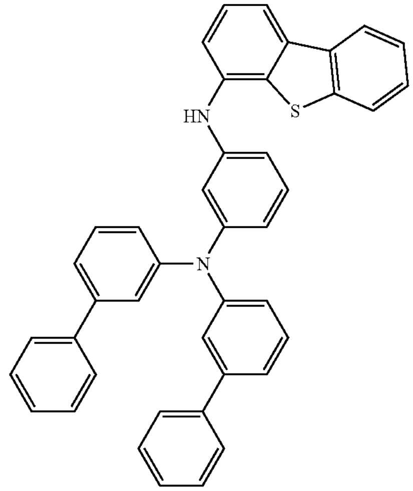
Sub 3-71
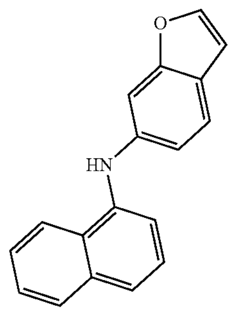
Sub 3-72
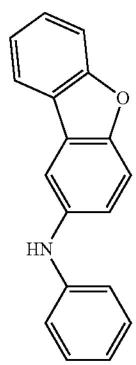
Sub 3-73
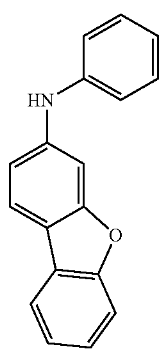

-continued
Sub 3-74
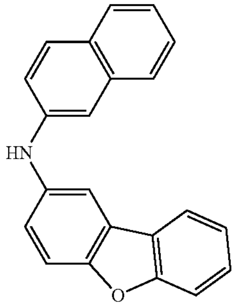
Sub 3-75
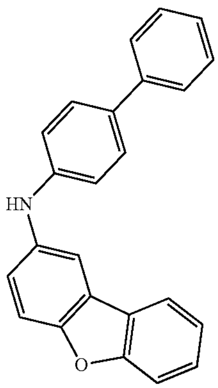
Sub 3-76
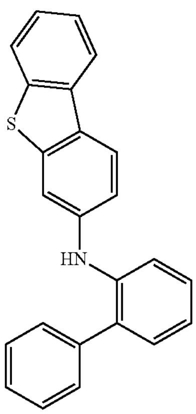
Sub 3-77
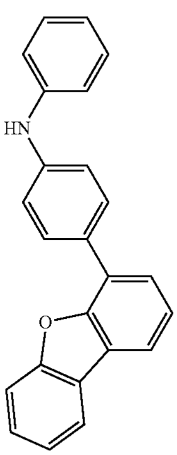
-continued
Sub 3-78
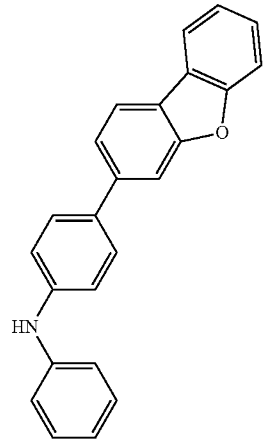
Sub 3-79
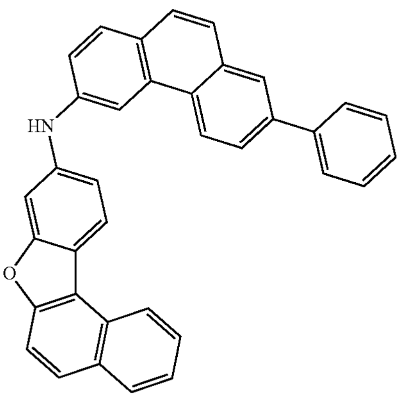
Sub 3-80
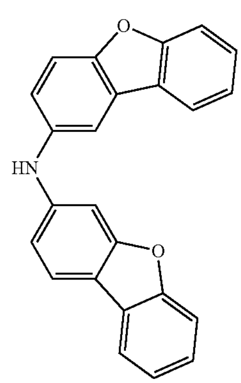

-continued
Sub 3-81
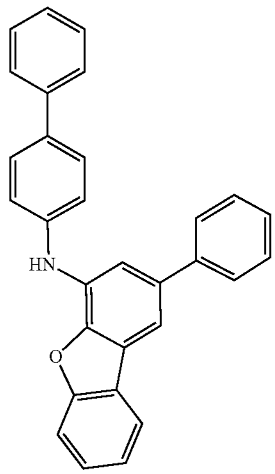
Sub 3-82
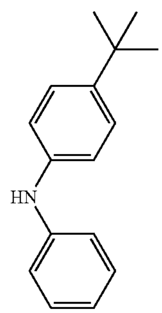
Sub 3-83
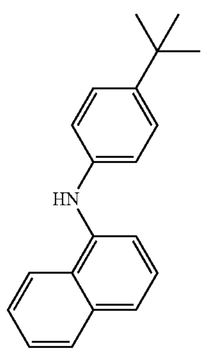
Sub 3-84
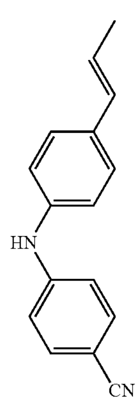
-continued
Sub 3-85
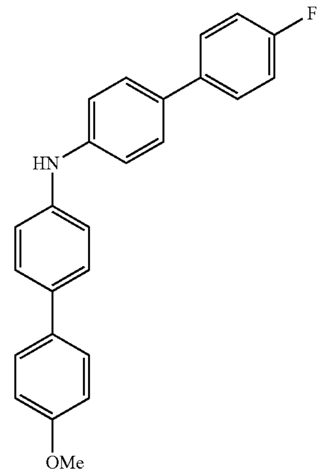
Sub 3-86
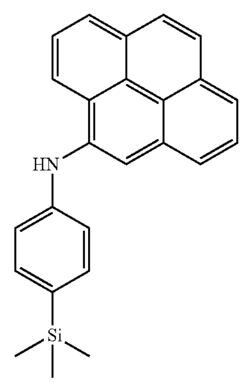
Sub 3-87
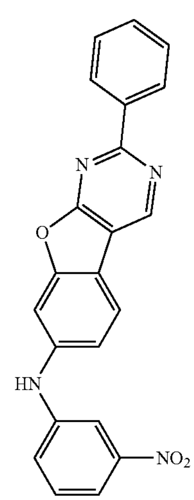

Sub 3-88
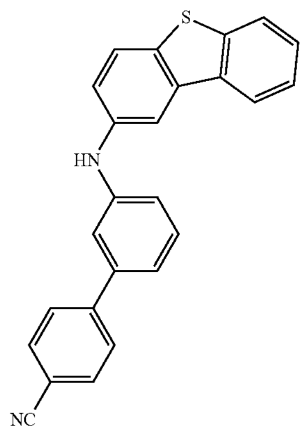
Sub 3-89
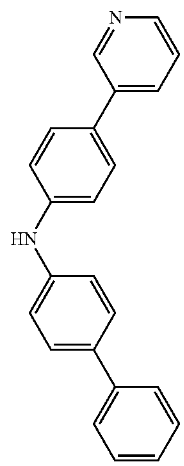
Sub 3-90
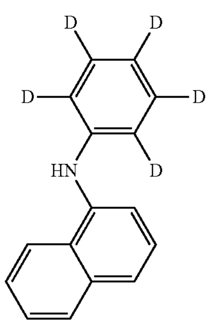
Sub 3-91
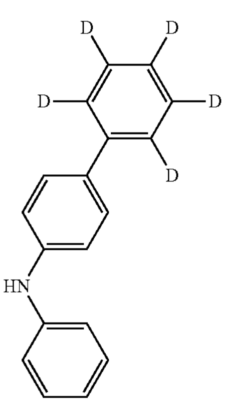
Sub 3-92
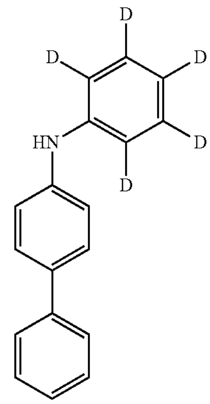
Sub 3-93
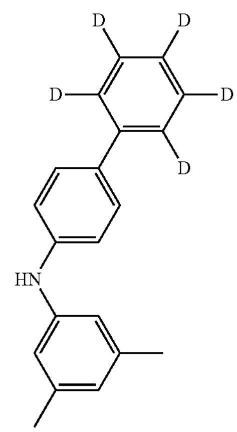
Sub 3-94
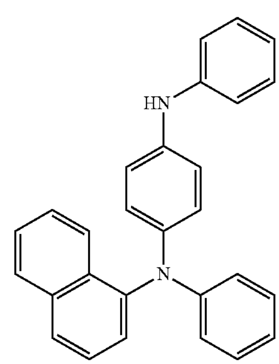

-continued
Sub 3-95
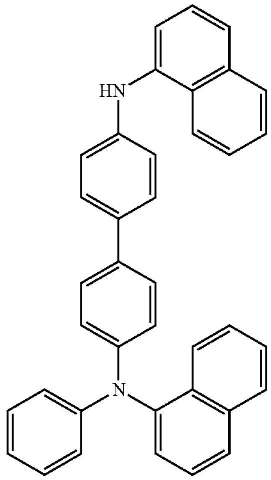
Sub 3-96
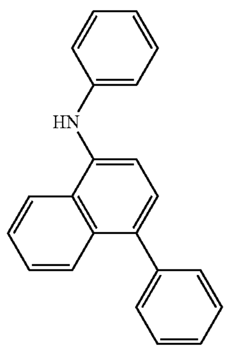
Sub 3-97
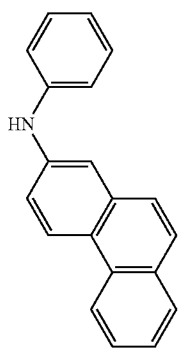
Sub 3-98
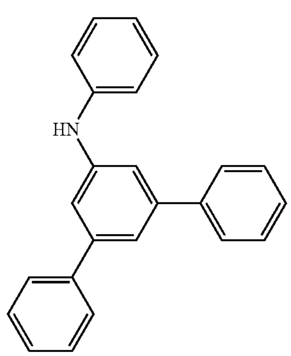
-continued
Sub 3-99
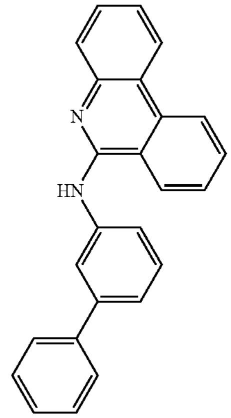
Sub 3-100
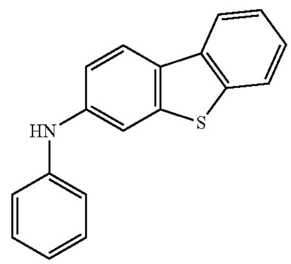
Sub 3-101
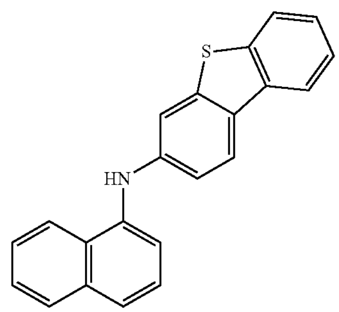
Sub 3-102
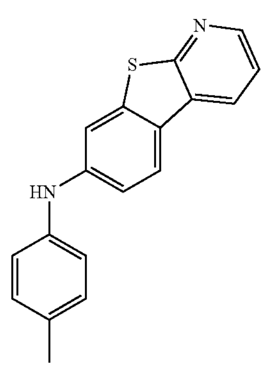

Sub 3-103
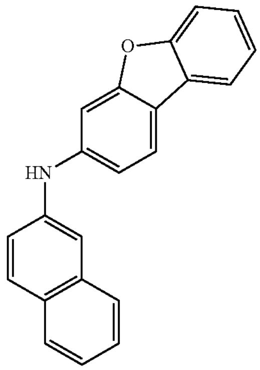
Sub 3-104
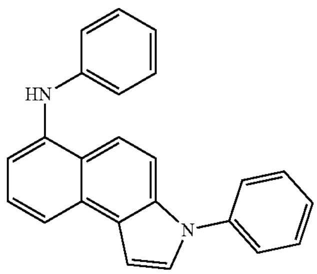
Sub 3-105
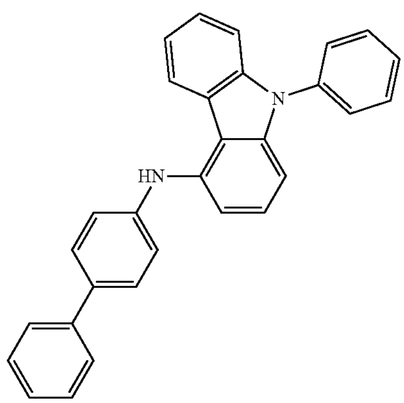
Sub 3-106
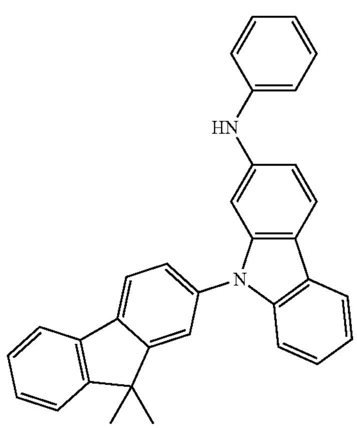
Sub 3-107
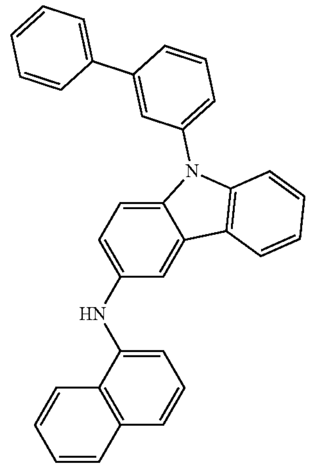
Sub 3-108
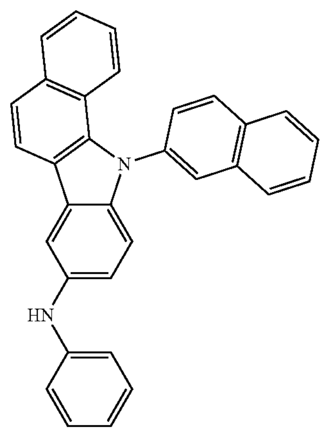
Sub 3-109
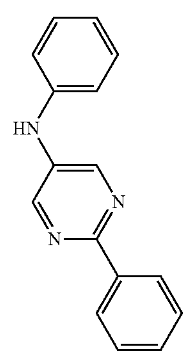

-continued

Sub 3-110

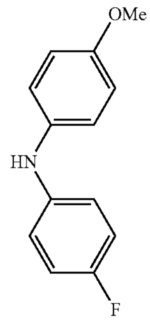

Sub 3-111

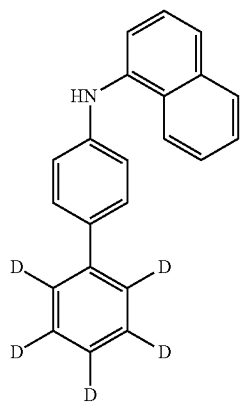

-continued

Sub 3-112

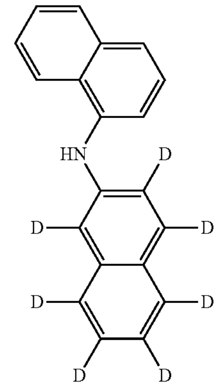

Sub 3-113

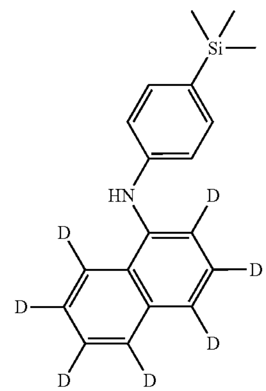

TABLE 4

| Compound | FD-MS | Compound | FD-MS |
|---|---|---|---|
| Sub 3-1 | m/z = 169.09($C_{12}H_{11}N$ = 169.22) | Sub 3-2 | m/z = 219.10($C_{16}H_{13}N$ = 219.28) |
| Sub 3-3 | m/z = 245.12($C_{18}H_{15}N$ = 245.32) | Sub 3-4 | m/z = 269.12($C_{20}H_{15}N$ = 269.34) |
| Sub 3-5 | m/z = 245.12($C_{18}H_{15}N$ = 245.32) | Sub 3-6 | m/z = 245.12($C_{18}H_{15}N$ = 245.32) |
| Sub 3-7 | m/z = 295.14($C_{22}H_{17}N$ = 295.38) | Sub 3-8 | m/z = 295.14($C_{22}H_{17}N$ = 295.38) |
| Sub 3-9 | m/z = 295.14($C_{22}H_{17}N$ = 295.38) | Sub 3-10 | m/z = 295.14($C_{22}H_{17}N$ = 295.38) |
| Sub 3-11 | m/z = 321.15($C_{24}H_{19}N$ = 321.41) | Sub 3-12 | m/z = 321.15($C_{24}H_{19}N$ = 321.41) |
| Sub 3-13 | m/z = 369.15($C_{28}H_{19}N$ = 369.47) | Sub 3-14 | m/z = 395.17($C_{30}H_{21}N$ = 395.51) |
| Sub 3-15 | m/z = 295.14($C_{22}H_{17}N$ = 295.38) | Sub 3-16 | m/z = 652.25($C_{48}H_{32}N_2O$ = 652.80) |
| Sub 3-17 | m/z = 371.17($C_{28}H_{21}N$ = 371.48) | Sub 3-18 | m/z = 371.17($C_{28}H_{21}N$ = 371.48) |
| Sub 3-19 | m/z = 421.18($C_{32}H_{23}N$ = 421.54) | Sub 3-20 | m/z = 371.17($C_{28}H_{21}N$ = 371.48) |
| Sub 3-21 | m/z = 447.20($C_{34}H_{25}N$ = 447.58) | Sub 3-22 | m/z = 336.16($C_{24}H_{20}N_2$ = 336.43) |
| Sub 3-23 | m/z = 503.24($C_{36}H_{29}N_3$ = 503.64) | Sub 3-24 | m/z = 285.15($C_{21}H_{19}N$ = 285.38) |
| Sub 3-25 | m/z = 335.17($C_{25}H_{21}N$ = 335.44) | Sub 3-26 | m/z = 335.17($C_{25}H_{21}N$ = 335.44) |
| Sub 3-27 | m/z = 361.18($C_{27}H_{23}N$ = 361.48) | Sub 3-28 | m/z = 451.23($C_{34}H_{29}N$ = 451.61) |
| Sub 3-29 | m/z = 401.21($C_{30}H_{27}N$ = 401.55) | Sub 3-30 | m/z = 477.25($C_{36}H_{31}N$ = 477.65) |
| Sub 3-31 | m/z = 391.14($C_{27}H_{21}NS$ = 391.53) | Sub 3-32 | m/z = 391.14($C_{27}H_{21}NS$ = 391.53) |
| Sub 3-33 | m/z = 375.16($C_{27}H_{21}NO$ = 375.46) | Sub 3-34 | m/z = 375.16($C_{27}H_{21}NO$ = 375.46) |
| Sub 3-35 | m/z = 459.20($C_{35}H_{25}N$ = 459.58) | Sub 3-36 | m/z = 423.20($C_{32}H_{25}N$ = 423.56) |
| Sub 3-37 | m/z = 586.24($C_{44}H_{30}N_2$ = 586.74) | Sub 3-38 | m/z = 485.21($C_{37}H_{27}N$ = 485.63) |
| Sub 3-39 | m/z = 407.17($C_{31}H_{21}N$ = 407.52) | Sub 3-40 | m/z = 457.18($C_{35}H_{23}N$ = 457.58) |
| Sub 3-41 | m/z = 563.17($C_{41}H_{25}NS$ = 563.72) | Sub 3-42 | m/z = 626.27($C_{47}H_{34}N_2$ = 626.80) |
| Sub 3-43 | m/z = 284.13($C_{20}H_{16}N_2$ = 284.36) | Sub 3-44 | m/z = 246.12($C_{17}H_{14}N_2$ = 246.31) |
| Sub 3-45 | m/z = 296.13($C_{21}H_{16}N_2$ = 296.37) | Sub 3-46 | m/z = 334.15($C_{24}H_{18}N_2$ = 334.42) |
| Sub 3-47 | m/z = 334.15($C_{24}H_{18}N_2$ = 334.42) | Sub 3-48 | m/z = 460.19($C_{34}H_{24}N_2$ = 460.58) |
| Sub 3-49 | m/z = 384.16($C_{28}H_{20}N_2$ = 384.48) | Sub 3-50 | m/z = 500.19($C_{36}H_{24}N_2O$ = 500.60) |
| Sub 3-51 | m/z = 490.15($C_{34}H_{22}N_2S$ = 490.62) | Sub 3-52 | m/z = 225.06($C_{14}H_{11}NS$ = 225.31) |
| Sub 3-53 | m/z = 275.08($C_{18}H_{13}NS$ = 275.37) | Sub 3-54 | m/z = 275.08($C_{18}H_{13}NS$ = 275.37) |
| Sub 3-55 | m/z = 325.09($C_{22}H_{15}NS$ = 325.43) | Sub 3-56 | m/z = 351.11($C_{24}H_{17}NS$ = 351.47) |
| Sub 3-57 | m/z = 351.11($C_{24}H_{17}NS$ = 351.47) | Sub 3-58 | m/z = 351.11($C_{24}H_{17}NS$ = 351.47) |
| Sub 3-59 | m/z = 401.12($C_{28}H_{19}NS$ = 401.53) | Sub 3-60 | m/z = 401.12($C_{28}H_{19}NS$ = 401.53) |
| Sub 3-61 | m/z = 427.14($C_{30}H_{21}NS$ = 427.57) | Sub 3-62 | m/z = 381.06($C_{24}H_{15}NS_2$ = 381.51) |
| Sub 3-63 | m/z = 381.06($C_{24}H_{15}NS_2$ = 381.51) | Sub 3-64 | m/z = 452.13($C_{31}H_{20}N_2S$ = 452.58) |
| Sub 3-65 | m/z = 351.11 ($C_{24}H_{17}NS$ = 351 .47) | Sub 3-66 | m/z = 325.09($C_{22}H_{15}NS$ = 325.43) |
| Sub 3-67 | m/z = 465.12($C_{32}H_{19}NOS$ = 465.57) | Sub 3-68 | m/z = 365.09($C_{24}H_{15}NOS$ = 365.45) |
| Sub 3-69 | m/z = 517.15($C_{37}H_{23}NOS$ = 517.65) | Sub 3-78 | m/z = 594.21($C_{42}H_{30}N_2S$ = 594.78) |
| Sub 3-71 | m/z = 259.10($C_{18}H_{13}NO$ = 259.31) | Sub 3-72 | m/z = 259.10($C_{18}H_{13}NO$ = 259.31) |

TABLE 4-continued

| Compound | FD-MS | Compound | FD-MS |
|---|---|---|---|
| Sub 3-73 | m/z = 259.10($C_{18}H_{13}NO$ = 259.31) | Sub 3-74 | m/z = 309.12($C_{22}H_{15}NO$ = 309.36) |
| Sub 3-75 | m/z = 335.13($C_{24}H_{17}NO$ = 335.40) | Sub 3-76 | m/z = 335.13($C_{24}H_{17}NO$ = 335.40) |
| Sub 3-77 | m/z = 335.13($C_{24}H_{17}NO$ = 335.40) | Sub 3-78 | m/z = 335.13($C_{24}H_{17}NO$ = 335.40) |
| Sub 3-79 | m/z = 485.18($C_{36}H_{23}NO$ = 485.59) | Sub 3-80 | m/z = 349.11($C_{24}H_{15}NO_2$ = 349.39) |
| Sub 3-81 | m/z = 411.16($C_{30}H_{21}NO$ = 411.49) | Sub 3-82 | m/z = 225.15($C_{16}H_{19}N$ = 225.34) |
| Sub 3-83 | m/z = 275.17($C_{20}H_{21}N$ = 275.40) | Sub 3-84 | m/z = 234.12($C_{16}H_{14}N_2$ = 234.30) |
| Sub 3-85 | m/z = 369.15($C_{25}H_{20}FNO$ = 369.44) | Sub 3-86 | m/z = 365.16($C_{25}H_{23}NSi$ = 365.55) |
| Sub 3-87 | m/z = 382.38($C_{22}H_{14}N_4O_3$ = 382.38) | Sub 3-88 | m/z = 376.10($C_{25}H_{16}N_2S$ = 376.48) |
| Sub 3-89 | m/z = 322.15($C_{23}H_{18}N_2$ = 322.41) | Sub 3-90 | m/z = 224.14($C_{16}H_8D_5N$ = 224.32) |
| Sub 3-91 | m/z = 250.15($C_{18}H_{10}D_5N$ = 259.36) | Sub 3-92 | m/z = 250.15($C_{18}H_{10}D_5N$ = 250.36) |
| Sub 3-93 | m/z = 278.18($C_{20}H_{14}D_5N$ = 278.41) | Sub 3-94 | m/z = 386.18($C_{28}H_{22}N_2$ = 386.50) |
| Sub 3-95 | m/z = 512.23($C_{38}H_{28}N_2$ = 512.66) | Sub 3-96 | m/z = 295.14($C_{22}H_{17}N$ = 295.39) |
| Sub 3-97 | m/z = 269.12($C_{20}H_{15}N$ = 269.35) | Sub 3-98 | m/z = 321.15($C_{24}H_{19}N$ = 321.42) |
| Sub 3-99 | m/z = 346.15($C_{25}H_{18}N_2$ = 346.43) | Sub 3-100 | m/z = 275.08($C_{18}H_{13}NS$ = 275.37) |
| Sub 3-101 | m/z = 325.09($C_{22}H_{15}NS$ = 325.43) | Sub 3-102 | m/z = 290.09($C_{18}H_{14}N_2S$ = 290.38) |
| Sub 3-103 | m/z = 309.12($C_{22}H_{15}NO$ = 309.37) | Sub 3-104 | m/z = 334.15($C_{24}H_{18}N_2$ = 334.42) |
| Sub 3-105 | m/z = 410.18($C_{30}H_{22}N_2$ = 410.52) | Sub 3-106 | m/z = 450.21 ($C_{33}H_{26}N_2$ = 450.59) |
| Sub 3-107 | m/z = 460.19($C_{34}H_{24}N_2$ = 460.58) | Sub 3-108 | m/z = 434.18($C_{32}H_{22}N_2$ = 434.54) |
| Sub 3-109 | m/z = 247.11($C_{16}H_{13}N_3$ = 247.30) | Sub 3-110 | m/z = 217.09($C_{13}H_{12}FNO$ = 217.24) |
| Sub 3-111 | m/z = 300.17($C_{22}H_{12}D_5N$ = 300.42} | Sub 3-112 | m/z = 276.16($C_{20}H_8D_7N$ = 276.39) |
| Sub 3-113 | m/z = 298.19($C_{19}H_{14}D_7NSi$ = 298.51) | | |

Synthesis Example of Sub 4

Sub 4 of Reaction Scheme 4 may be synthesized by the reaction route of the following Reaction Scheme 6, but are not limited thereto. The following Sub 4' may be the same as Sub 1 or Sub 3 of Reaction Scheme 1.

<Reaction Scheme 6>

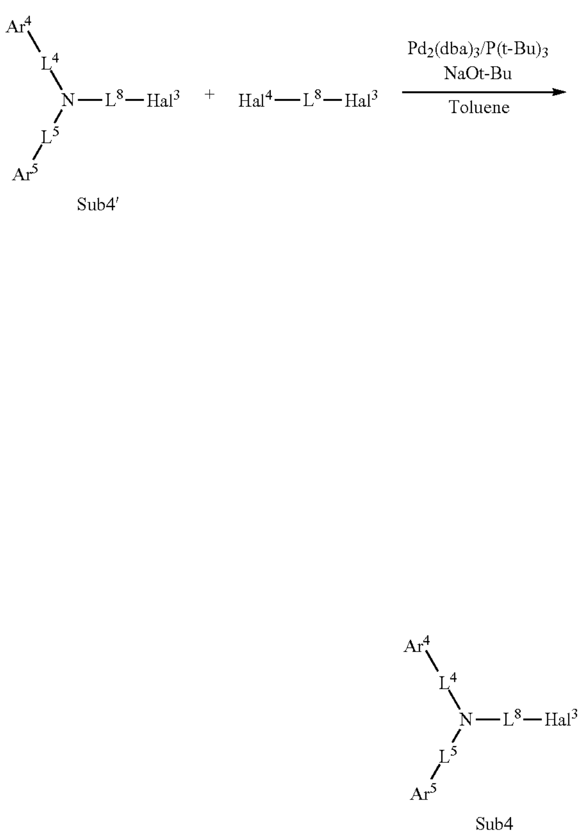

(Hal4 is I or Br, and Hal3 is Br or Cl.)

1. Synthesis Example of Sub 4-1

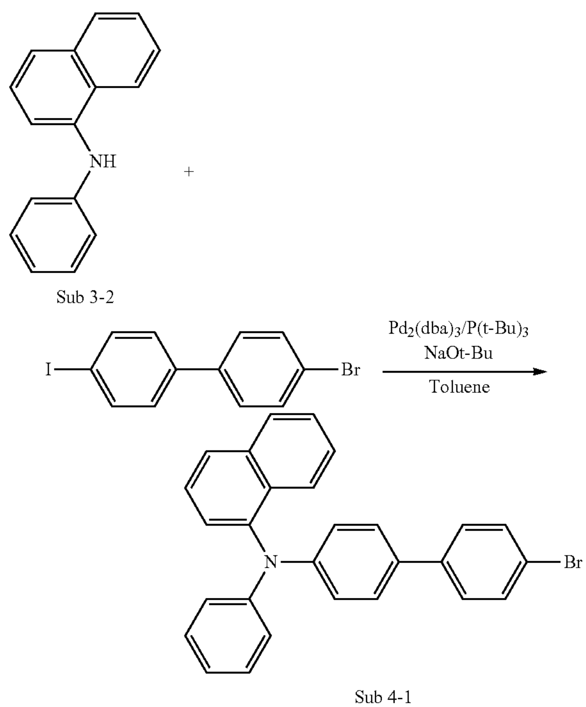

After Sub 3-2 (20.16 g, 91.92 mmol) was dissolved in toluene (965 mL) and 4-bromo-4'-iodo-1,1'-biphenyl (33 g, 91.92 mmol), $Pd_2(dba)_3$ (1.26 g, 1.38 mmol), $P(t\text{-}Bu)_3$ (0.56 g, 2.76 mmol) and NaOt-Bu (13.25 g, 137.88 mmol) were added to the solution, the mixture was stirred at 70° C. When the reaction was completed, the reaction product was extracted with $CH_2Cl_2$ and water. Then, an organic layer was dried over $MgSO_4$ and concentrated. Then, the concentrate was separated by a silica gel column and recrystallized to obtain 28.15 g (yield: 68%) of the product.

2. Synthesis Example of Sub 4-14

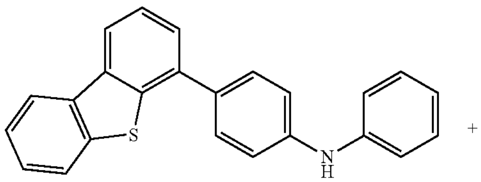

Sub 3-65

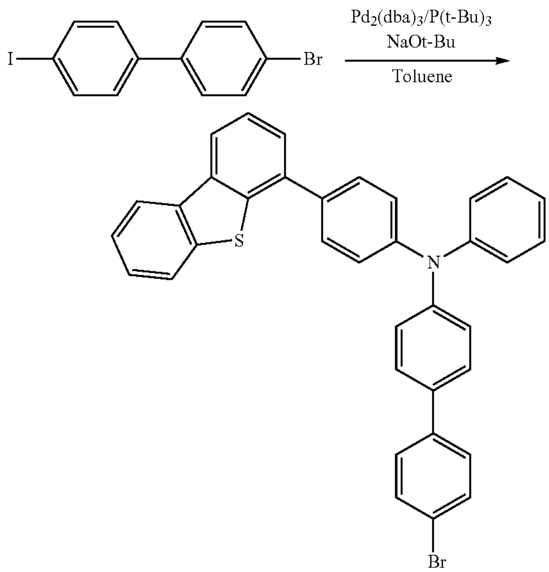

Sub 4-14

After dissolving Sub 3-65 (24.48 g, 69.64 mmol) in toluene (731 ml), 2-bromo-6-iodonaphthalene (25 g, 69.64 mmol), $Pd_2(dba)_3$ (0.96 g, 1.04 mmol), $P(t-Bu)_3$ (0.42 g, 2.09 mmol) and NaOt-Bu (10.04 g, 104.46 mmol) were added to the solution, and then the reaction was carried out in the same manner as in the synthesis method of Sub 4-1 to obtain 27.18 g (yield: 67%) of the product.

3. Synthesis Example of Sub 4-30

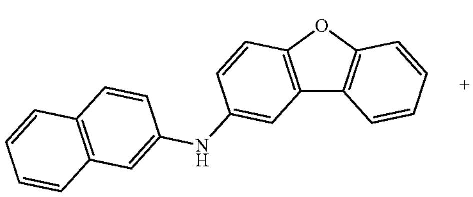

Sub 3-74

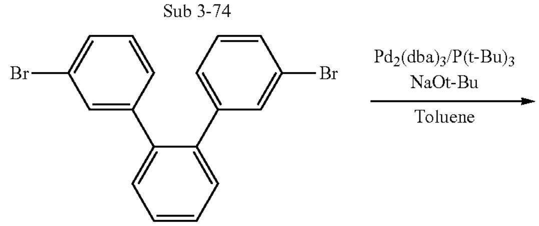

-continued

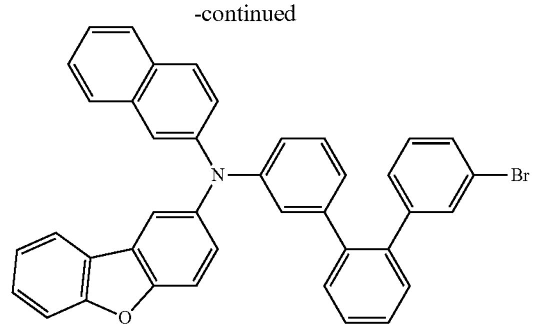

Sub 4-30

After dissolving Sub 3-74 (20.73 g, 66.99 mmol) in toluene (703 ml), 3,3"-dibromo-1,1':2',1"-terphenyl (26 g, 66.99 mmol), $Pd_2(dba)_3$ (0.92 g, 1 mmol), $P(t-Bu)_3$ (0.41 g, 2.01 mmol) and NaOt-Bu (9.66 g, 100.49 mmol) were added to the solution, and then the reaction was carried out in the same manner as in the synthesis method of Sub 4-1 to obtain 24.78 g (yield: 60%) of the product.

4. Synthesis Example of Sub 4-36

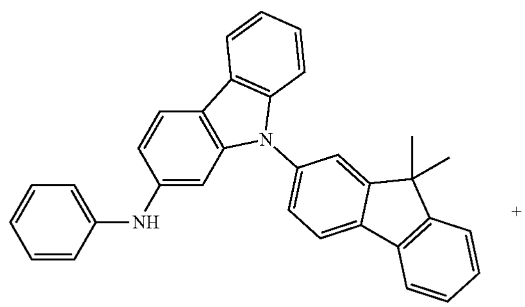

Sub 3-106

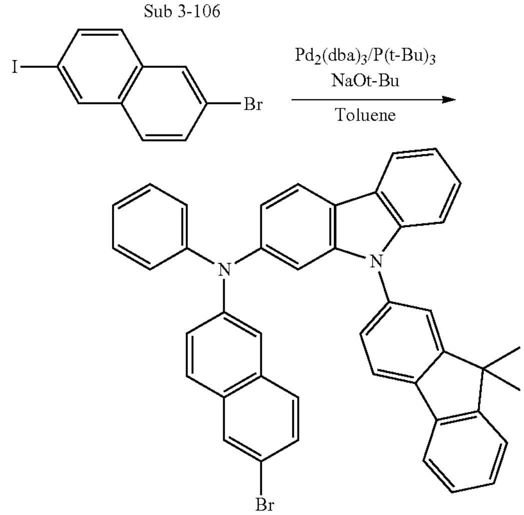

Sub 4-36

After dissolving Sub 3-106 (31.12 g, 69.08 mmol) in toluene (725 ml), 2-bromo-6-iodonaphthalene (23 g, 69.08 mmol), $Pd_2(dba)_3$ (0.95 g, 1.04 mmol), $P(t-Bu)_3$ (0.42 g, 2.07 mmol) and NaOt-Bu (9.96 g, 103.61 mmol) were added to the solution, and then the reaction was carried out in the same manner as in the synthesis method of Sub 4-1 to obtain 28.98 g (yield: 64%) of the product.

5. Synthesis Example of Sub 4-44

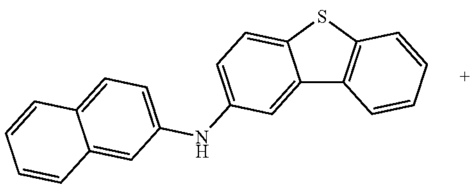

Sub 3-55

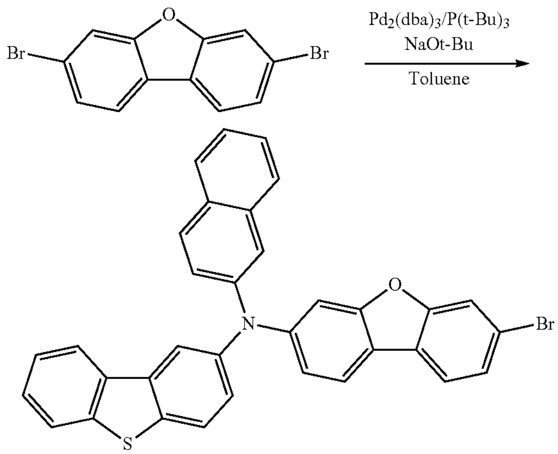

Sub 4-44

After dissolving Sub 3-55 (25.96 g, 79.76 mmol) in toluene (837 ml), 3,7-dibromodibenzo[b,d]furan (26 g, 79.76 mmol), $Pd_2(dba)_3$ (1.10 g, 1.20 mmol), $P(t\text{-}Bu)_3$ (0.48 g, 2.39 mmol) and NaOt-Bu (11.5 g, 119.64 mmol) were added to the solution, and then the reaction was carried out in the same manner as in the synthesis method of Sub 4-1 to obtain 30.94 g (yield: 68%) of the product.

6. Synthesis Example of Sub 4-56

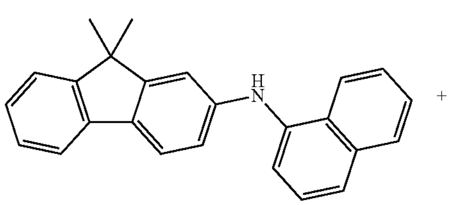

Sub 3-25

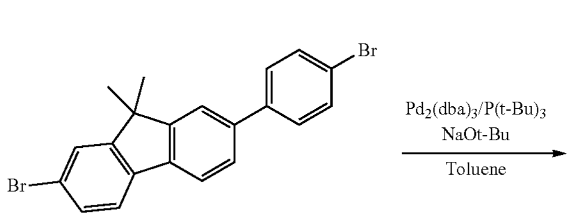

-continued

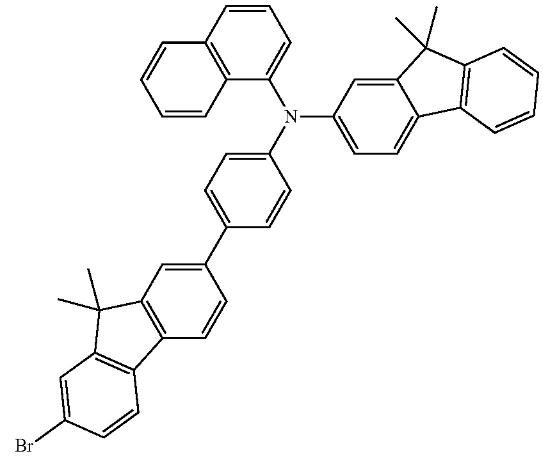

Sub 4-56

After dissolving Sub 3-25 (20.37 g, 60.72 mmol) in toluene (638 ml), 2-bromo-7-(4-bromophenyl)-9,9-dimethyl-9H-fluorene (26 g, 60.72 mmol), $Pd_2(dba)_3$ (0.83 g, 0.91 mmol), $P(t\text{-}Bu)_3$ (0.37 g, 1.82 mmol) and NaOt-Bu (8.75 g, 91.09 mmol) were added to the solution, and then the reaction was carried out in the same manner as in the synthesis method of Sub 4-1 to obtain 25.70 g (yield: 62%) of the product.

7. Synthesis Example of Sub 4-82

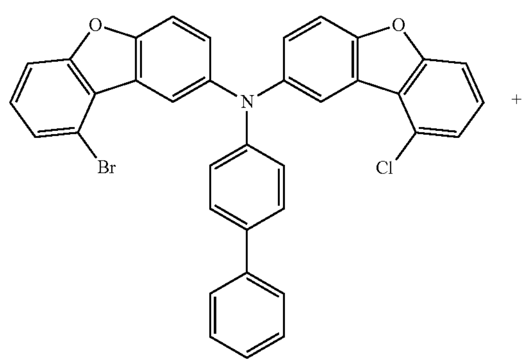

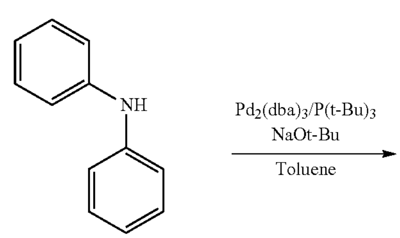

Sub3-1

-continued

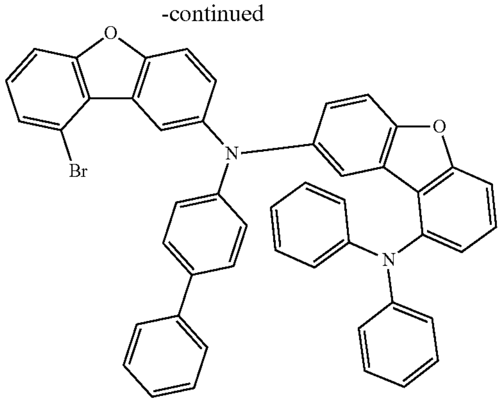

Sub4-82

After dissolving N-([1,1'-biphenyl]-4-yl)-9-bromo-N-(9-chlorodibenzo[b,d]furan-2-yl)dibenzo[b,d]furan-2-amine (33 g, 53.7 mmol) in toluene (550 ml), Sub3-1 (9.5 g, 56.4 mmol), $Pd_2(dba)_3$ (1.5 g, 1.6 mmol), $P(t\text{-}Bu)_3$ (0.7 g, 3.2 mmol) and NaOt-Bu (15.5 g, 161 mmol) were added to the solution, and then the reaction was carried out in the same manner as in the synthesis method of Sub 4-1 to obtain 33 g (yield: 82.4%) of the product.

Compounds belong to Sub 4 are as follows, but are not limited thereto, and FD-MS values of the compounds are shown in Table 5 below.

Sub 4-1

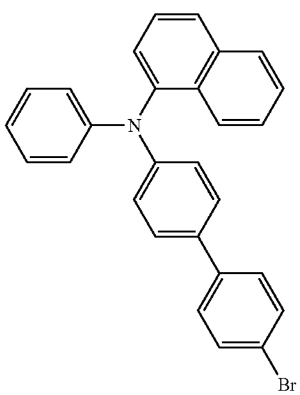

Sub 4-2

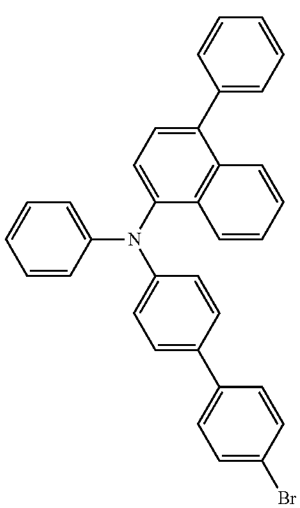

-continued

Sub 4-3

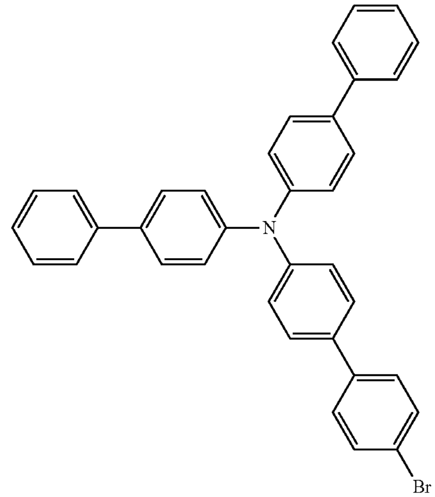

Sub 4-4

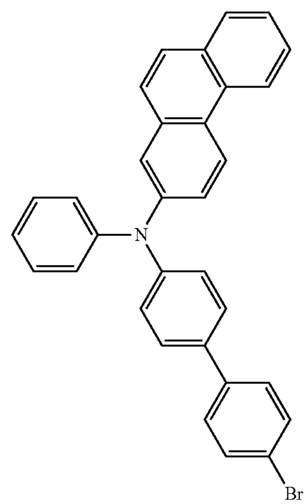

Sub 4-6

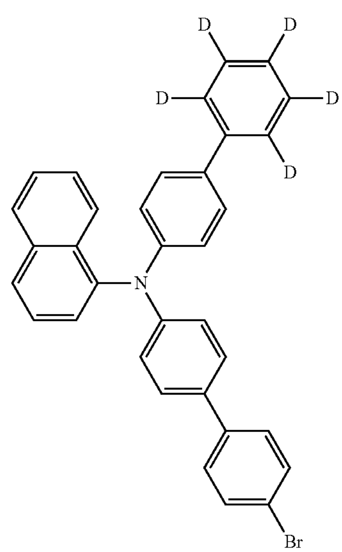

-continued
Sub 4-6
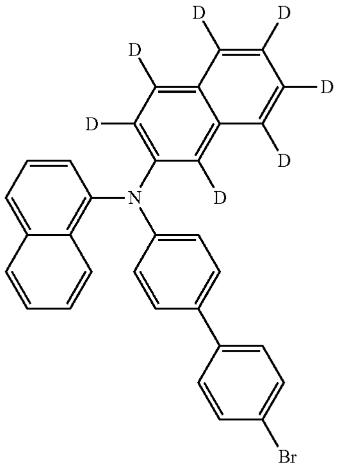
Sub 4-7
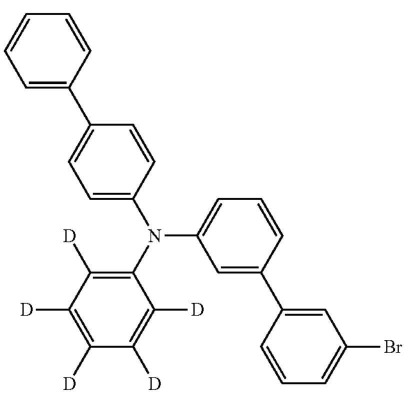
Sub 4-8
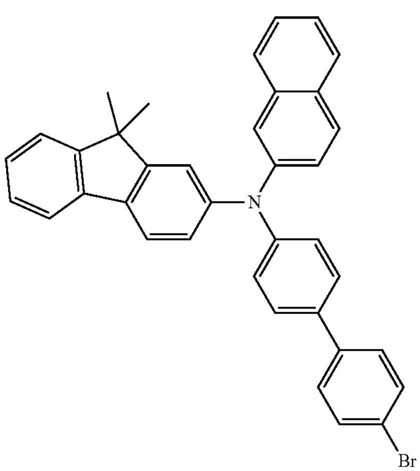
-continued
Sub 4-9
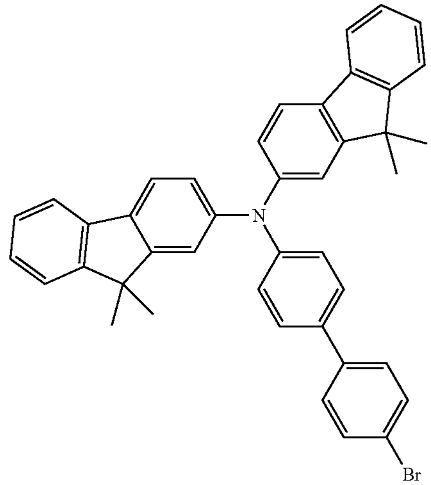
Sub 4-10
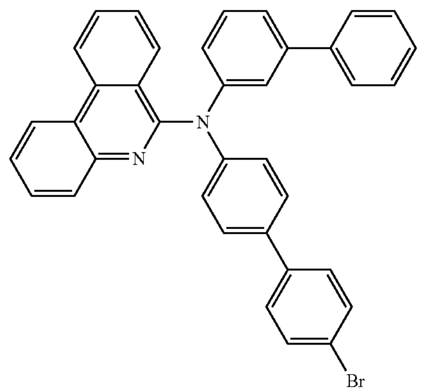
Sub 4-11
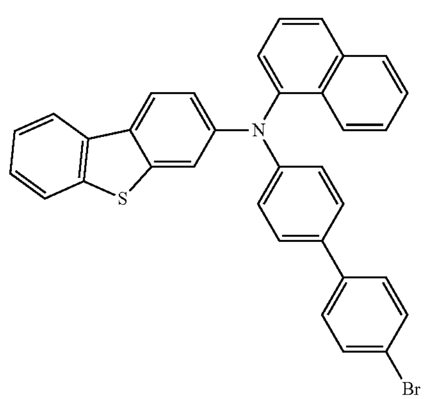

-continued
Sub 4-12
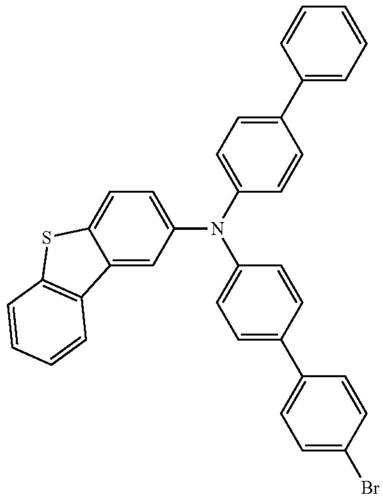
Sub 4-13
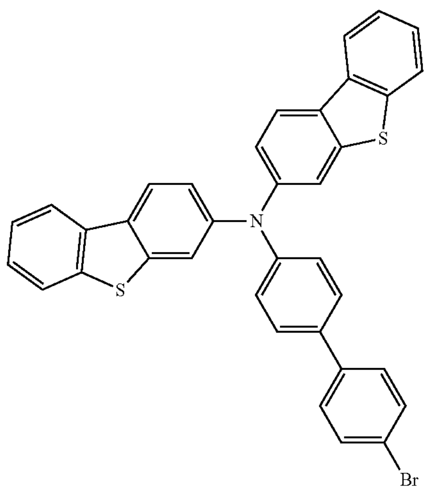
Sub 4-14
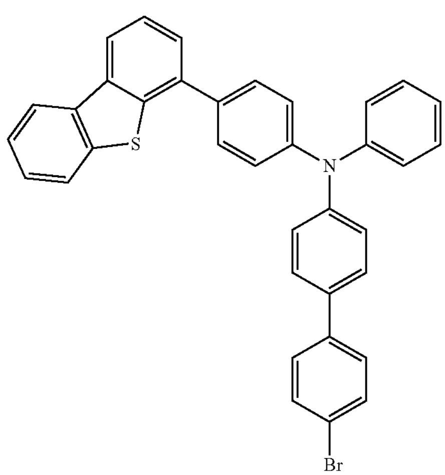
-continued
Sub 4-15
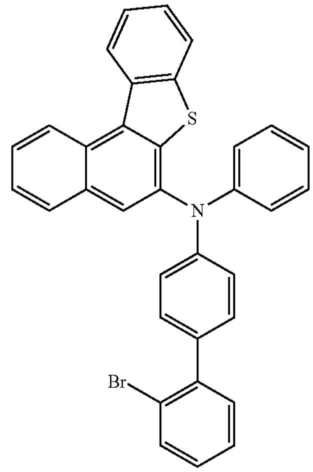
Sub 4-16
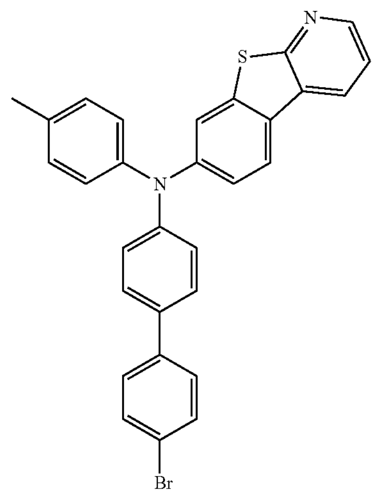
Sub 4-17
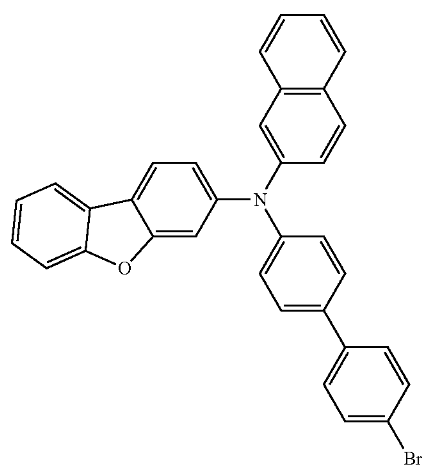

-continued
Sub 4-18
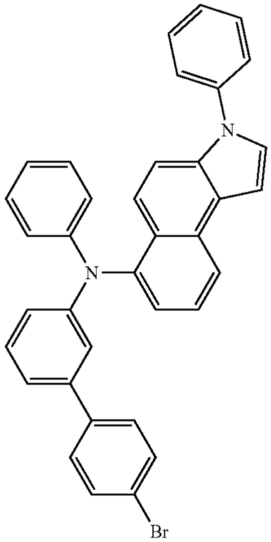
Sub 4-19
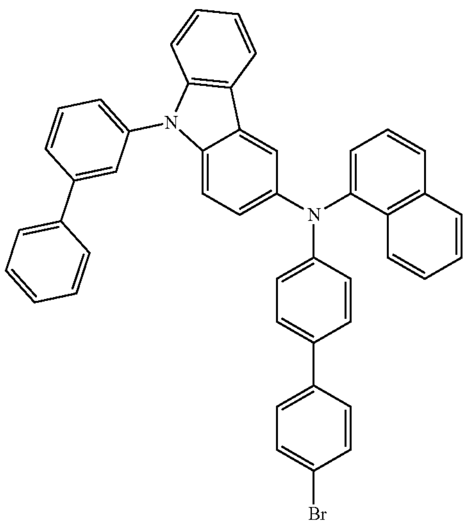
Sub 4-20
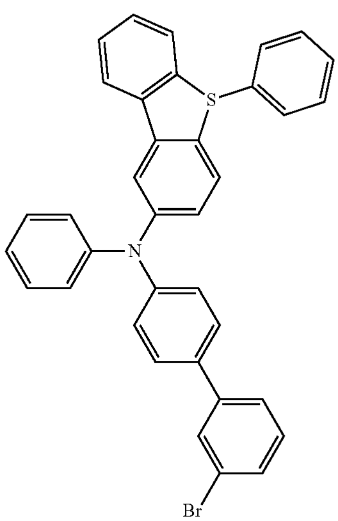
-continued
Sub 4-21
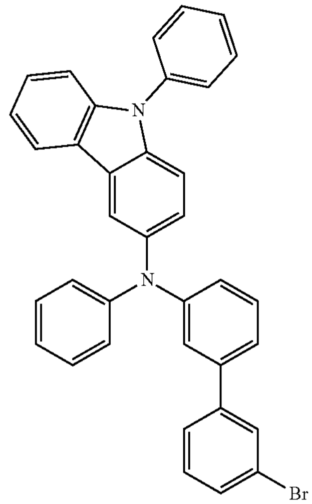
Sub 4-22
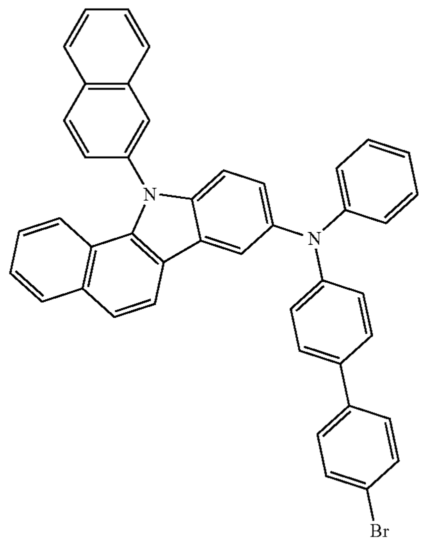
Sub 4-23
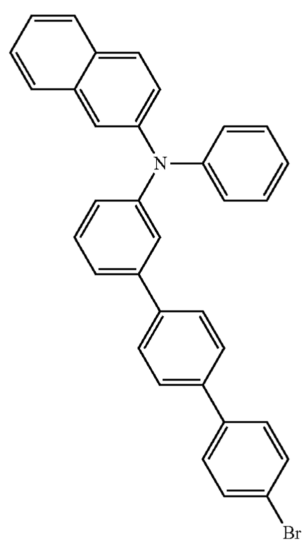

-continued
Sub 4-24
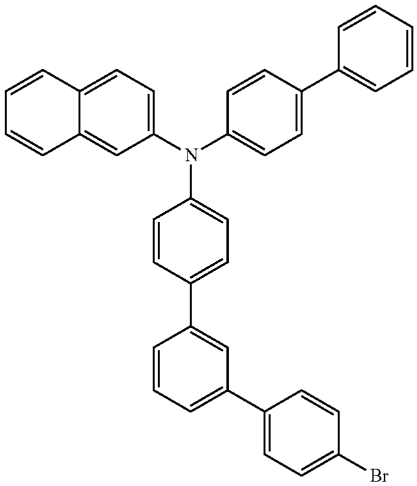
Sub 4-25
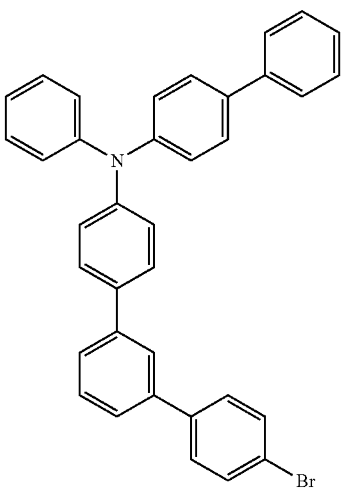
Sub 4-26
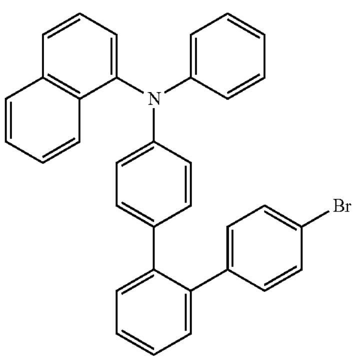
-continued
Sub 4-27
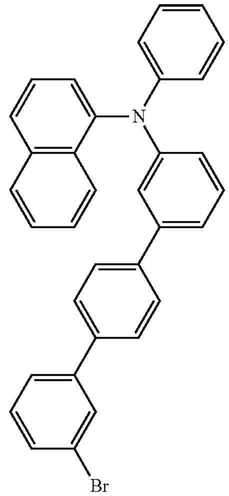
Sub 4-28
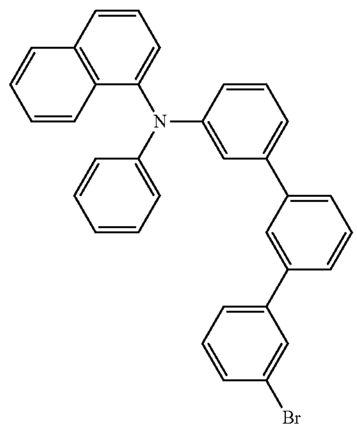
Sub 4-29
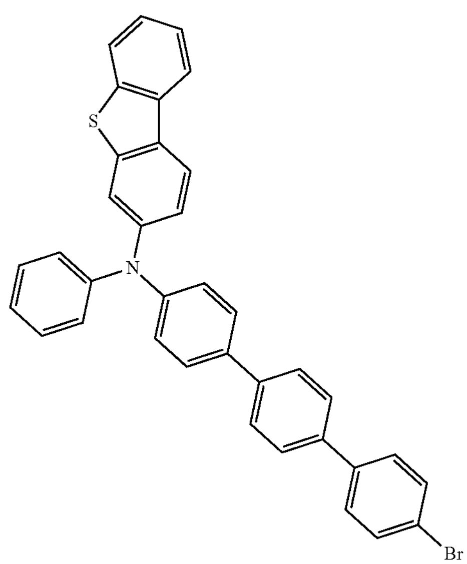

-continued
Sub 4-30
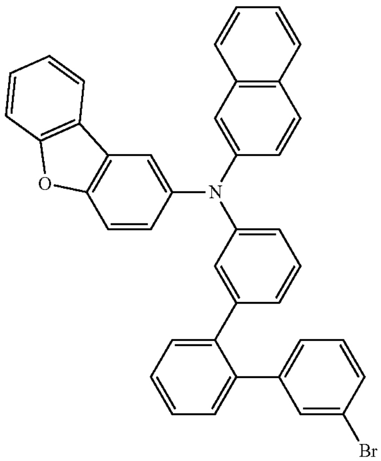
Sub 4-31
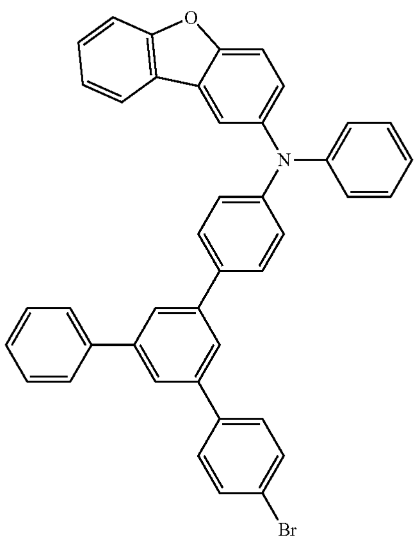
Sub 4-32
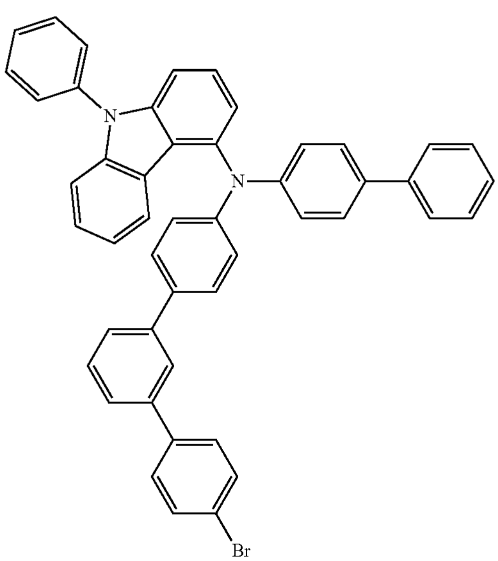
-continued
Sub 4-33
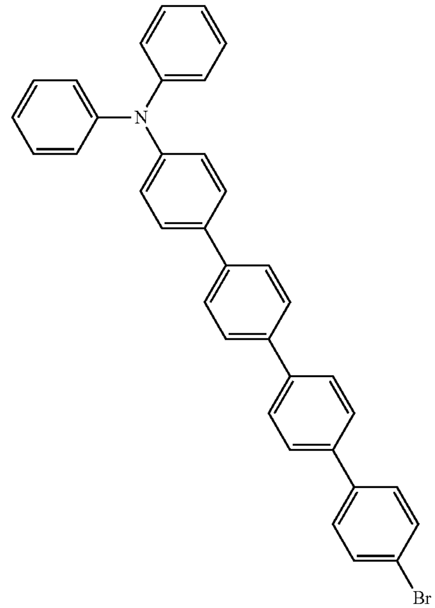
Sub 4-34
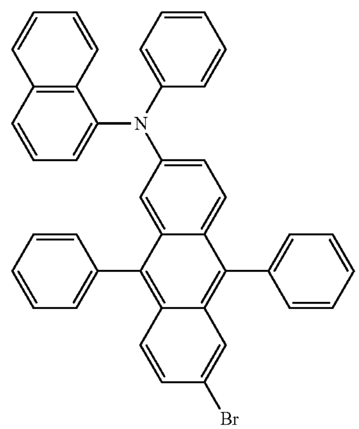
Sub 4-35
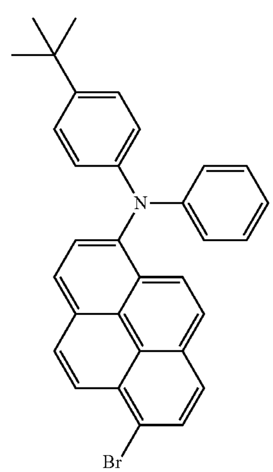

-continued
Sub 4-36
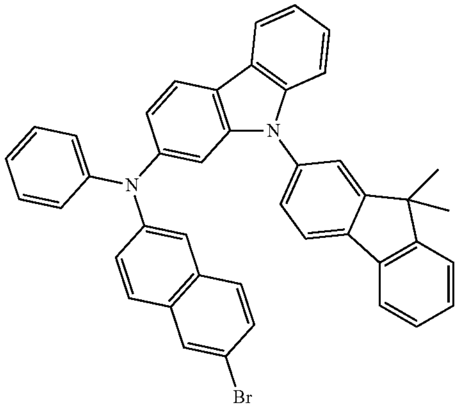
Sub 4-37
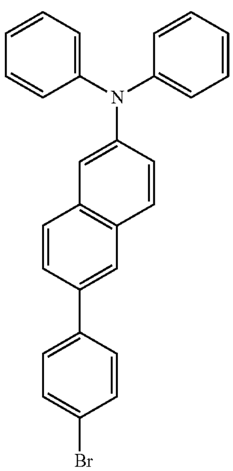
Sub 4-38
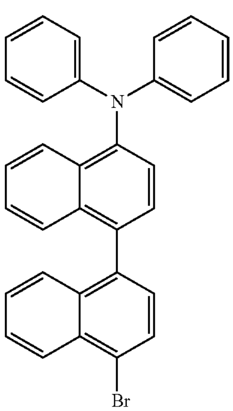
-continued
Sub 4-39
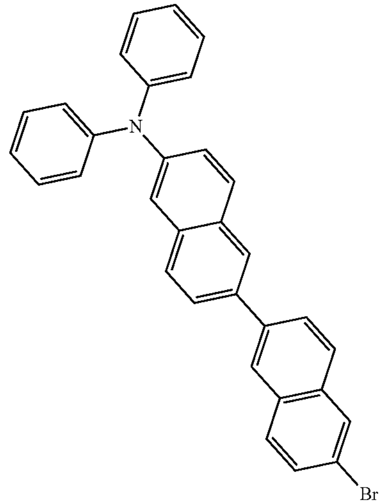
Sub 4-40
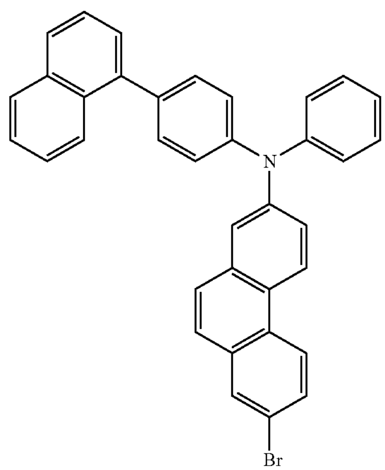
Sub 4-41
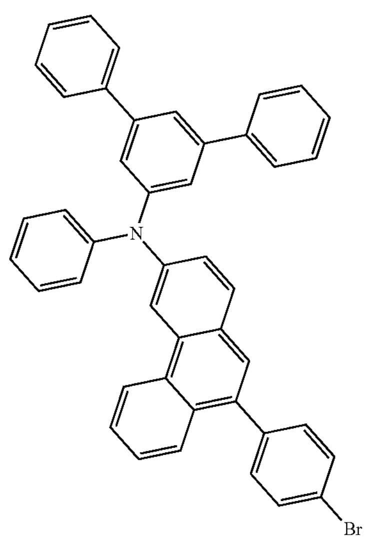

-continued
Sub 4-42
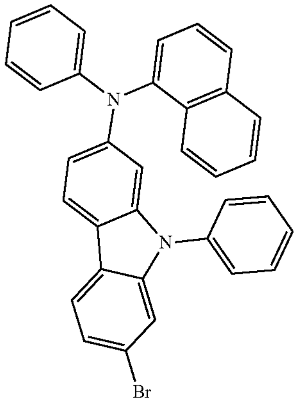
Sub 4-43
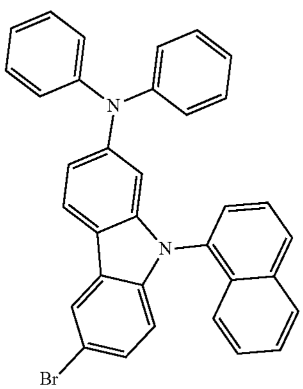
Sub 4-44
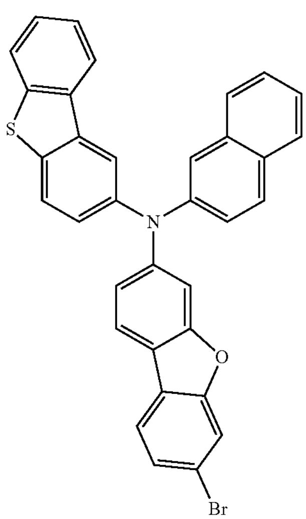
-continued
Sub 4-45
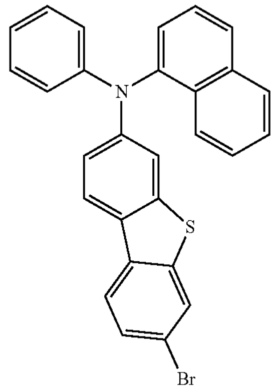
Sub 4-46
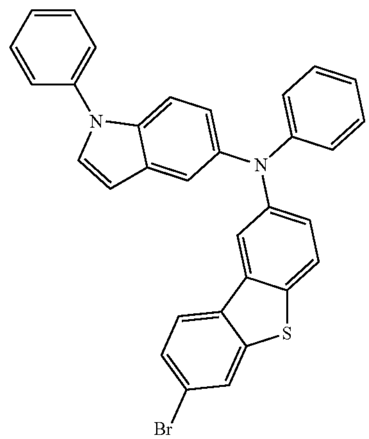
Sub 4-47
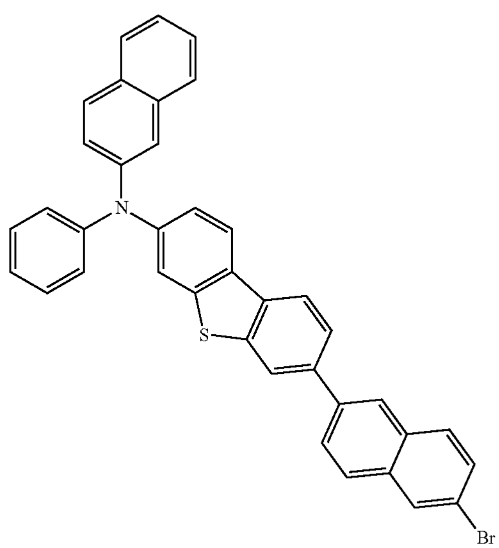

-continued
Sub 4-48
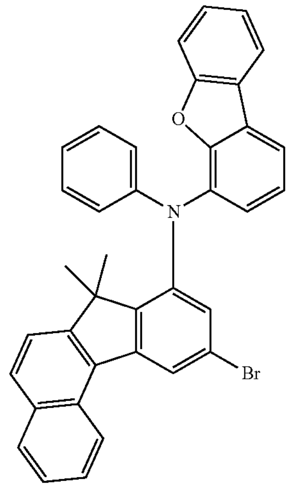
Sub 4-49
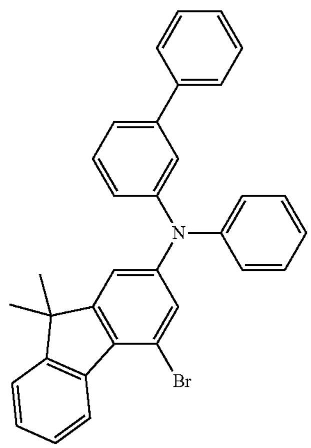
Sub 4-50
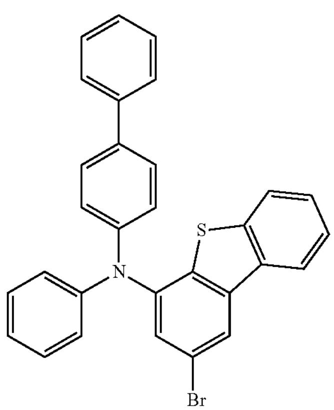
-continued
Sub 4-51
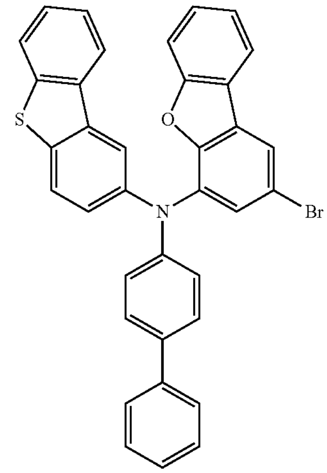
Sub 4-52
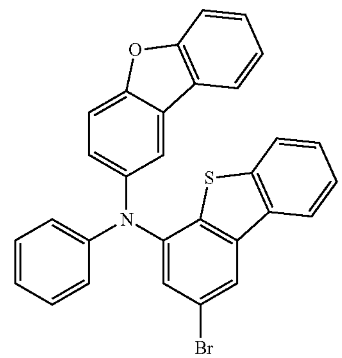
Sub 4-53
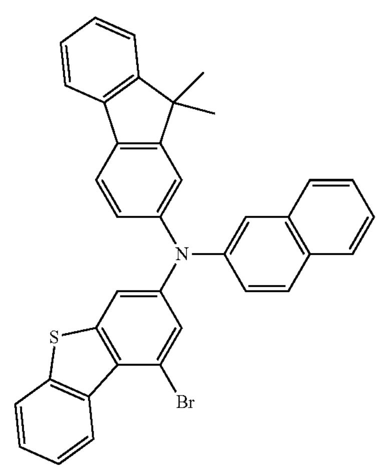

-continued
Sub 4-54
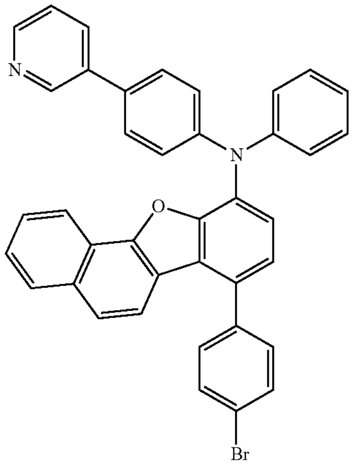
Sub 4-55
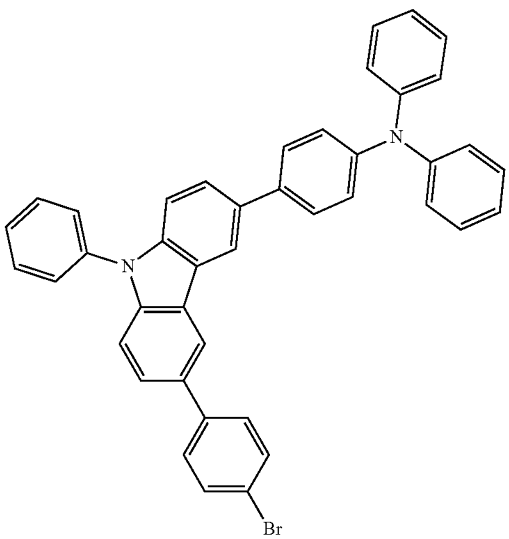
Sub 4-56
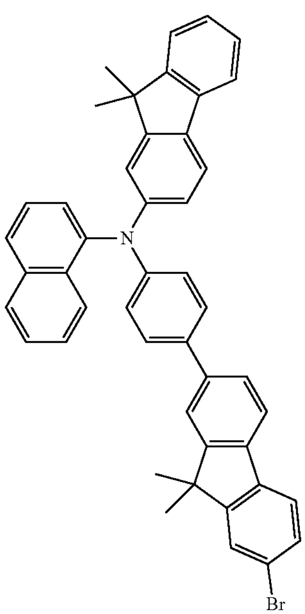
-continued
Sub 4-57
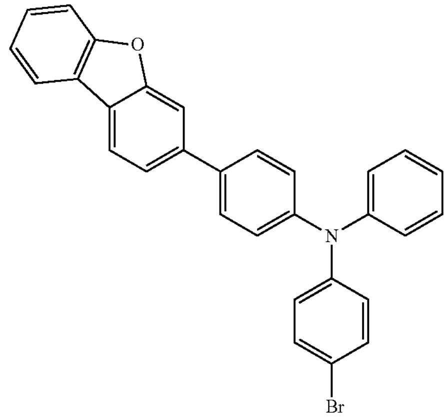
Sub 4-58
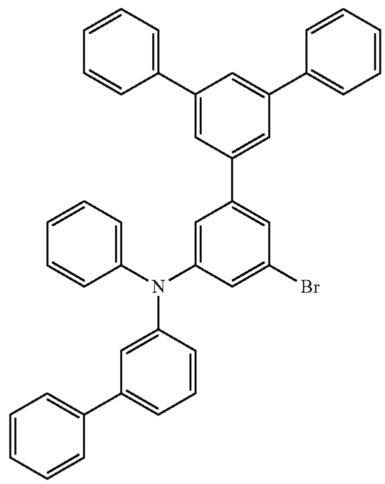
Sub 4-59
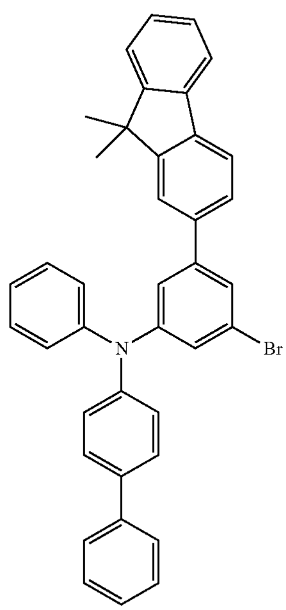

-continued
Sub 4-60
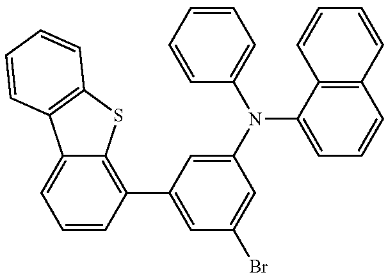
Sub 4-61
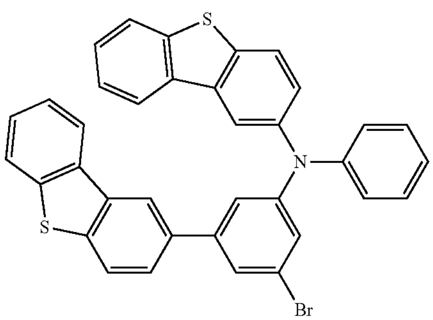
Sub 4-62
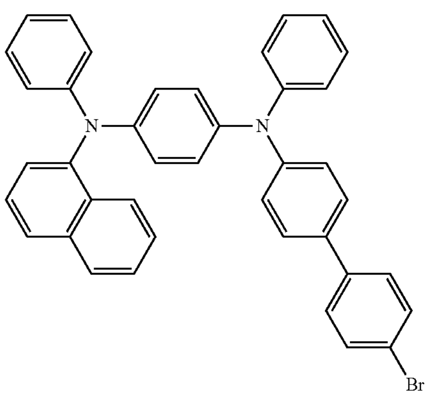
Sub 4-63
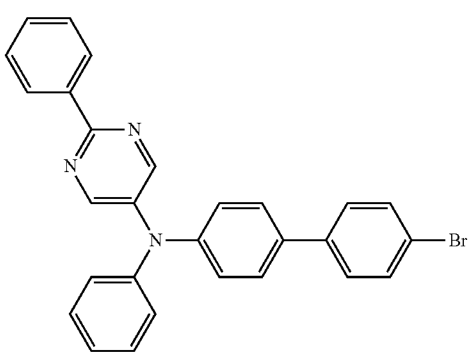
-continued
Sub 4-64
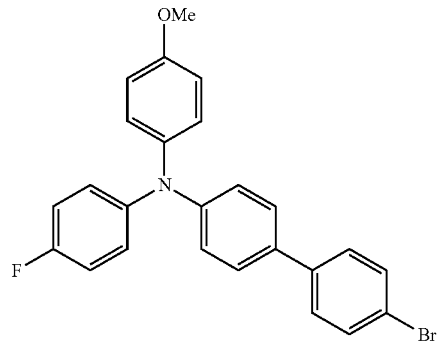
Sub 4-65
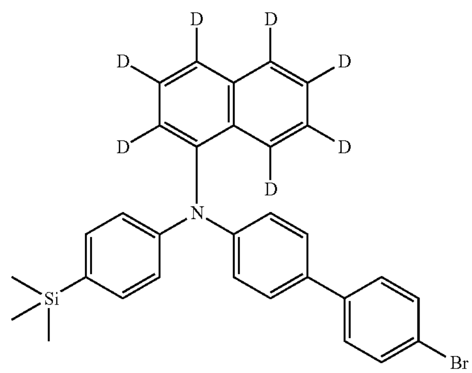
Sub 4-66
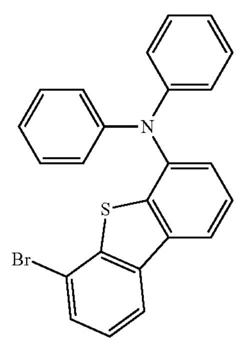
Sub 4-67
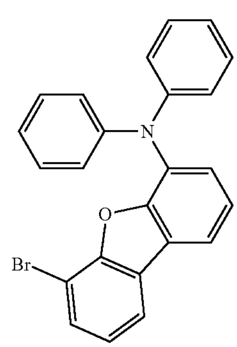

-continued
Sub 4-68
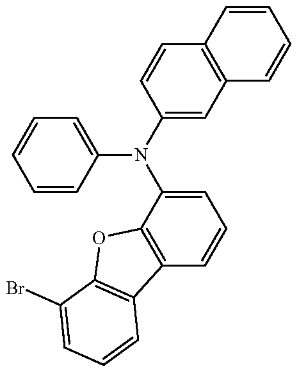
Sub 4-69
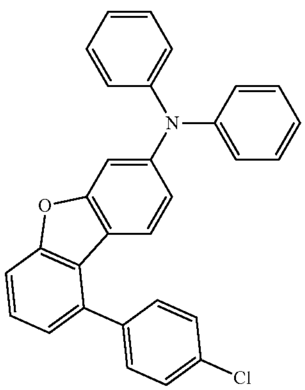
Sub 4-70
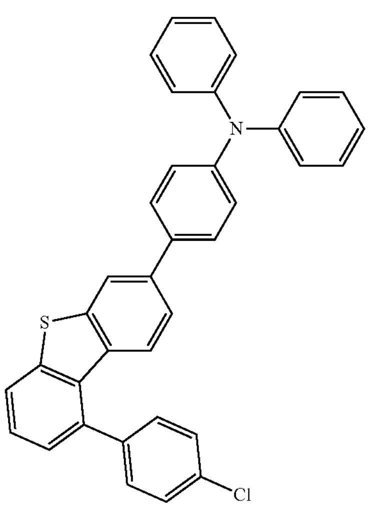
-continued
Sub4-71
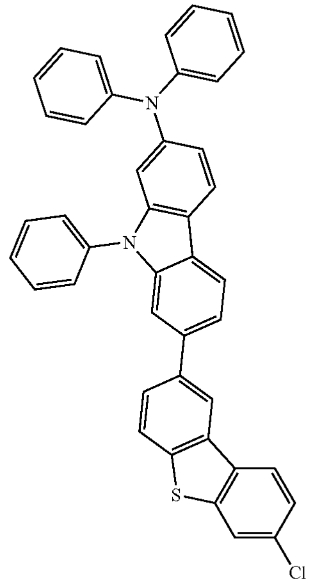
Sub4-72
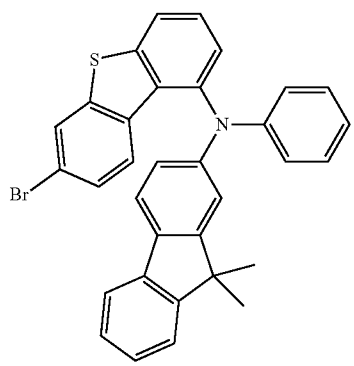
Sub4-73
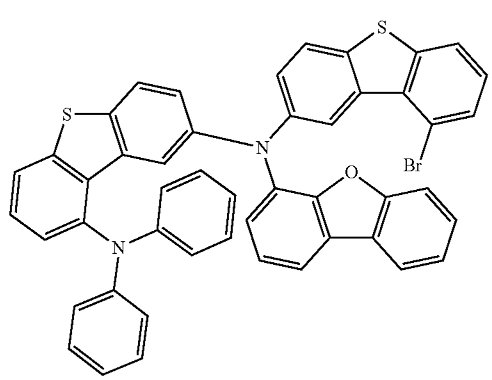

-continued
Sub4-74
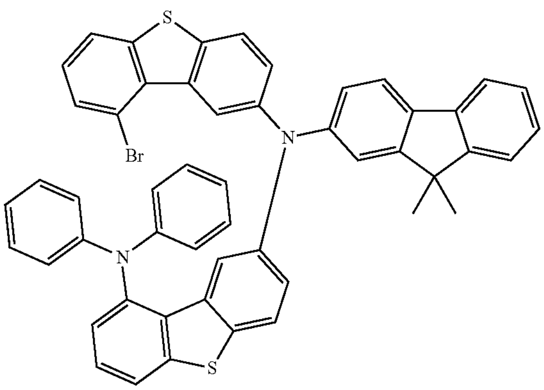
Sub4-75
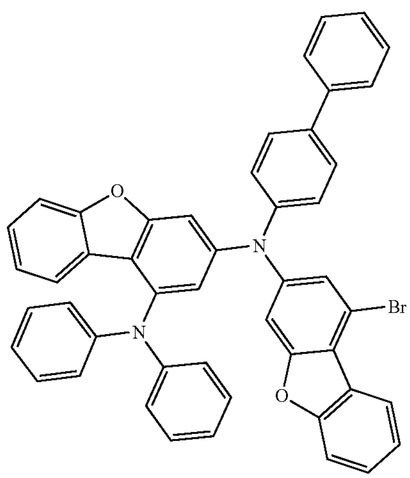
Sub4-76
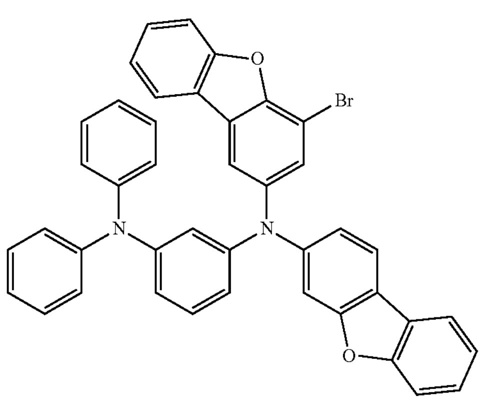
-continued
Sub4-77
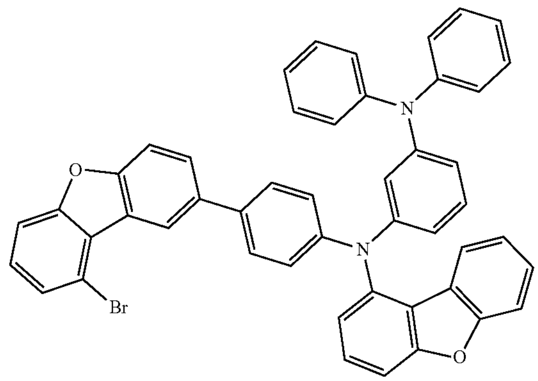
Sub4-78
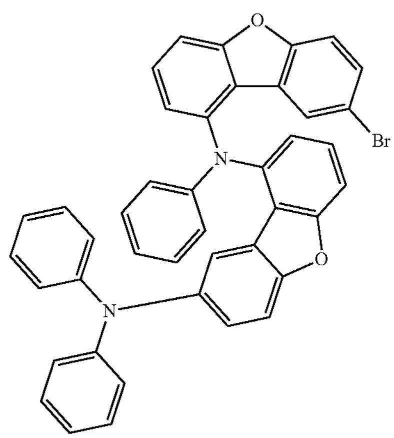
Sub4-79
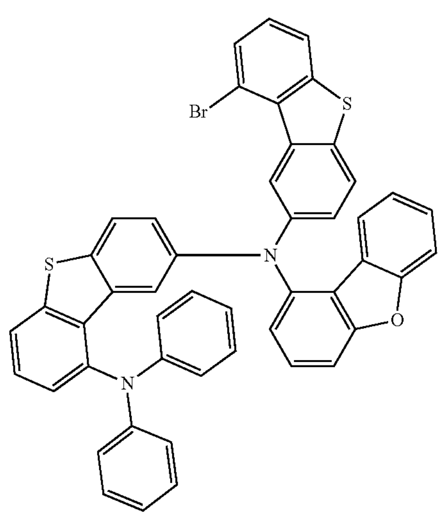

-continued
Sub4-80
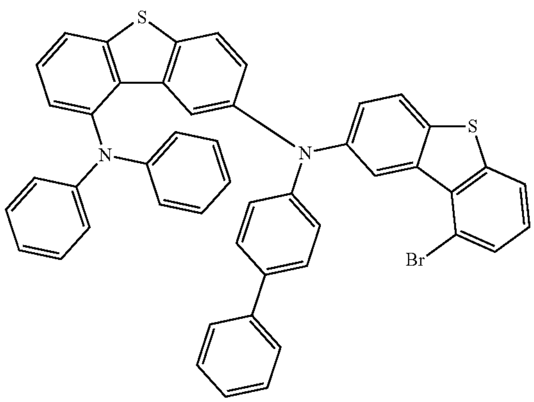
Sub4-81
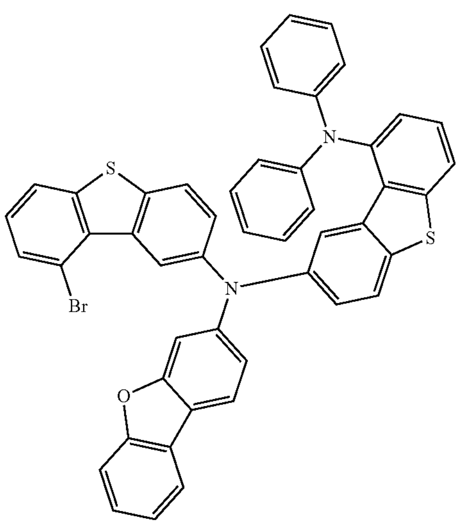
Sub4-82
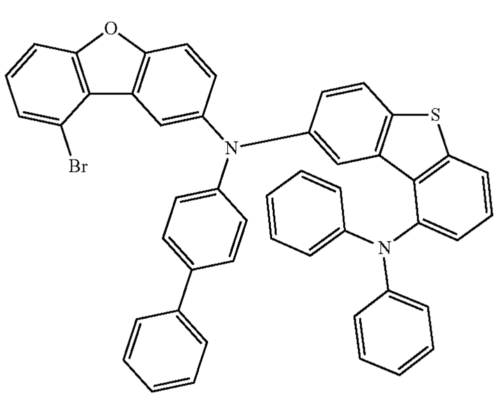
-continued
Sub4-83
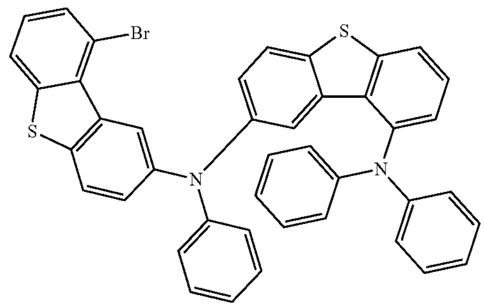
Sub4-84
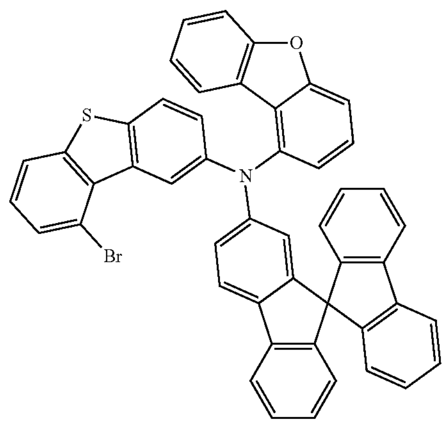
Sub4-85
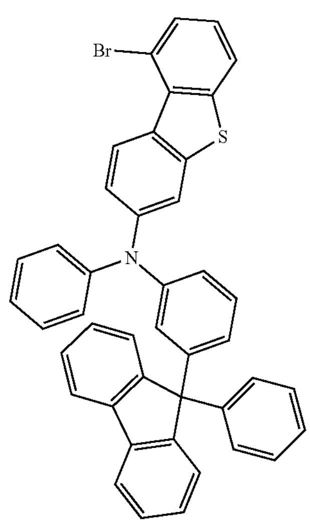

-continued
Sub4-86
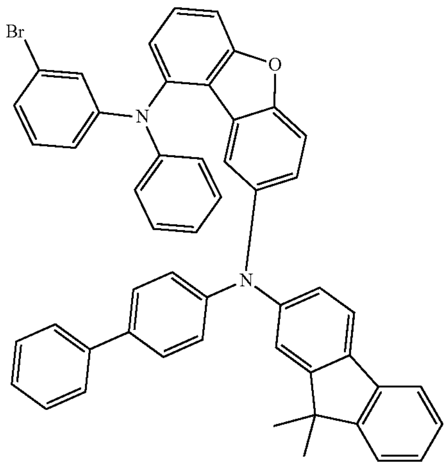
Sub4-87
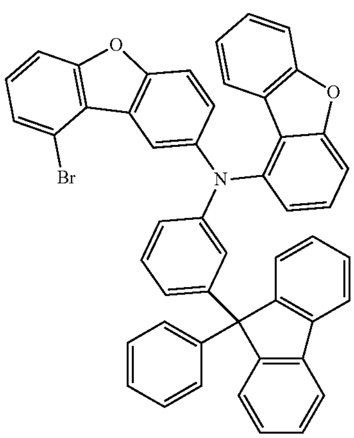
Sub4-88
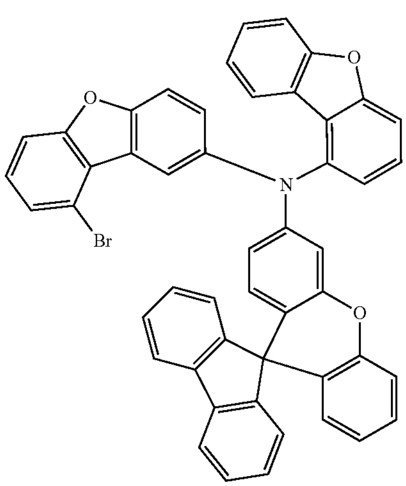
-continued
Sub4-89
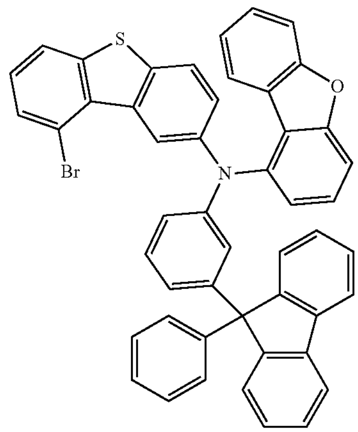
Sub4-90
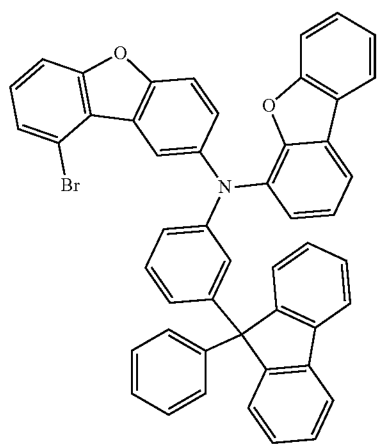
Sub4-91
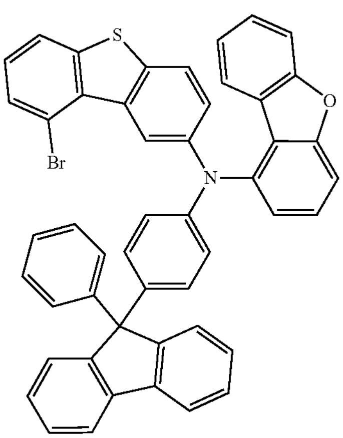

-continued

Sub4-92

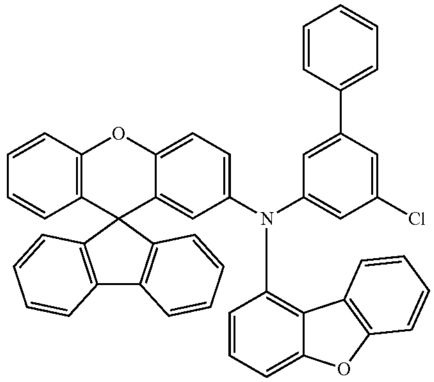

Sub4-93

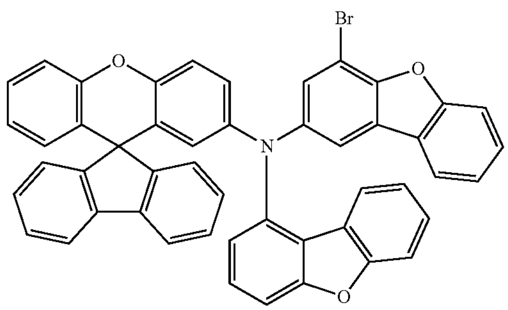

-continued

Sub4-94

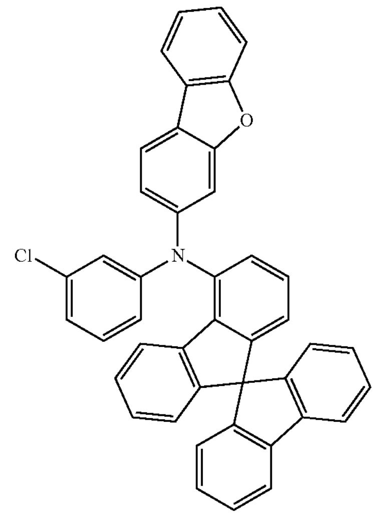

TABLE 5

| Compound | FD-MS | Compound | FD-MS |
|---|---|---|---|
| Sub 4-1 | m/z = 449.08($C_{28}H_{20}BrN$ = 450.37) | Sub 4-2 | m/z = 525.11($C_{34}H_{24}BrN$ = 526.48) |
| Sub 4-3 | m/z = 551.12($C_{36}H_{26}BrN$ = 552.50) | Sub 4-4 | m/z = 499.09($C_{32}H_{22}BrN$ = 500.43) |
| Sub 4-5 | m/z = 530.14($C_{34}H_{19}D_5BrN$ = 531.51) | Sub 4-6 | m/z = 506.14($C_{32}H_{15}D_7BrN$ = 507.48) |
| Sub 4-7 | m/z = 480.12($C_{30}H_{17}D_5BrN$ = 481.45) | Sub 4-8 | m/z = 565.14($C_{37}H_{28}BrN$ = 566.54) |
| Sub 4-9 | m/z = 631.19($C_{42}H_{34}BrN$ = 632.65) | Sub 4-10 | m/z = 576.12($C_{37}H_{25}BrN_2$ = 577.53) |
| Sub 4-11 | m/z = 555.07($C_{34}H_{22}BrNS$ = 556.51) | Sub 4-12 | m/z = 581.08($C_{36}H_{24}BrNS$ = 582.55) |
| Sub 4-13 | m/z = 611.04($C_{36}H_{22}BrNS_2$ = 612.60) | Sub 4-14 | m/z = 581.08($C_{36}H_{24}BrNS$ = 582.55) |
| Sub 4-15 | m/z = 704.28($C_{52}H_{36}N_2O$ = 704.87) | Sub 4-16 | m/z = 520.06($C_{30}H_{21}BrN_2S$ = 521.48) |
| Sub 4-17 | m/z = 539.09($C_{34}H_{22}BrNO$ = 540.45) | Sub 4-18 | m/z = 564.12($C_{36}H_{25}BrN_2$ = 565.50) |
| Sub 4-19 | m/z = 690.17($C_{46}H_{31}BrN_2$ = 691.67) | Sub 4-20 | m/z = 657.11($C_{42}H_{28}BrNS$ = 658.65) |
| Sub 4-21 | m/z = 564.12($C_{36}H_{25}BrN_2$ = 565.50) | Sub 4-22 | m/z = 664.15($C_{44}H_{29}BrN_2$ = 665.63) |
| Sub 4-23 | m/z = 525.11($C_{34}H_{24}BrN$ = 526.47) | Sub 4-24 | m/z = 601.14($C_{40}H_{26}BrN$ = 602.58) |
| Sub 4-25 | m/z = 551.12($C_{36}H_{26}BrN$ = 552.52) | Sub 4-26 | m/z = 525.11($C_{34}H_{24}BrN$ = 526.47) |
| Sub 4-27 | m/z = 525.11($C_{34}H_{24}BrN$ = 526.47) | Sub 4-28 | m/z = 525.11($C_{34}H_{24}BrN$ = 526.47) |
| Sub 4-29 | m/z = 581.08($C_{36}H_{24}BrNS$ = 582.55) | Sub 4-30 | m/z = 615.12($C_{40}H_{26}BrNO$ = 616.54) |
| Sub 4-31 | m/z = 641.14($C_{42}H_{28}BrNO$ = 642.58) | Sub 4-32 | m/z = 716.18($C_{48}H_{33}BrN_2$ = 717.71) |
| Sub 4-33 | m/z = 475.09($C_{30}H_{22}BrN$ = 476.41) | Sub 4-34 | m/z = 625.14($C_{42}H_{28}BrN$ = 626.58) |
| Sub 4-35 | m/z = 503.12($C_{32}H_{26}BrN$ = 504.46) | Sub 4-36 | m/z = 538.10($C_{34}H_{23}BrN_2$ = 539.46) |
| Sub 4-37 | m/z = 449.08($C_{28}H_{20}BrN$ = 450.38) | Sub 4-38 | m/z = 499.09($C_{32}H_{22}BrN$ = 500.43) |
| Sub 4-39 | m/z = 499.09($C_{32}H_{22}BrN$ = 500.43) | Sub 4-40 | m/z = 549.11($C_{36}H_{24}BrN$ = 550.50) |
| Sub 4-41 | m/z = 651.16($C_{44}H_{30}BrN$ = 652.64) | Sub 4-42 | m/z = 538.10($C_{34}H_{23}BrN_2$ = 539.46) |
| Sub 4-43 | m/z = 538.10($C_{34}H_{23}BrN_2$ = 539.46) | Sub 4-44 | m/z = 569.04($C_{34}H_{20}BrNOS$ = 570.50) |
| Sub 4-45 | m/z = 479.03($C_{26}H_{18}BrNS$ = 480.42) | Sub 4-46 | m/z = 544.06($C_{32}H_{21}BrN_2S$ = 545.49) |
| Sub 4-47 | m/z = 605.08($C_{38}H_{24}BrNS$ = 606.57) | Sub 4-48 | m/z = 579.12($C_{37}H_{26}BrNO$ = 580.53) |
| Sub 4-49 | m/z = 515.12($C_{33}H_{26}BrN$ = 516.48) | Sub 4-50 | m/z = 505.05($C_{30}H_{20}BrNS$ = 506.46) |
| Sub 4-51 | m/z = 559.06($C_{36}H_{22}BrNOS$ = 596.54) | Sub 4-52 | m/z = 519.03($C_{30}H_{18}BrNOS$ = 520.44) |
| Sub 4-53 | m/z = 595.10($C_{37}H_{26}BrNS$ = 596.59) | Sub 4-54 | m/z = 612.12($C_{39}H_{25}BrN_2O$ = 617.55) |
| Sub 4-55 | m/z = 640.15($C_{42}H_{29}BrN_2$ = 641.61) | Sub 4-56 | m/z = 681.20($C_{46}H_{36}BrN$ = 682.71) |
| Sub 4-57 | m/z = 489.07($C_{30}H_{20}BrNO$ = 490.40) | Sub 4-58 | m/z = 627.16($C_{42}H_{30}BrN$ = 628.61) |
| Sub 4-59 | m/z = 591.16($C_{39}H_{30}BrN$ = 592.58) | Sub 4-60 | m/z = 555.07($C_{34}H_{22}BrNS$ = 556.52) |
| Sub 4-61 | m/z = 611.04($C_{36}H_{22}BrNS_2$ = 612.60) | Sub 4-62 | m/z = 616.15($C_{40}H_{29}BrN_2$ = 617.59) |
| Sub 4-63 | m/z = 477.08($C_{28}H_{20}BrN_3$ = 478.39) | Sub 4-64 | m/z = 447.06($C_{26}H_{19}BrFNO$ = 448.34) |
| Sub 4-65 | m/z = 528.16($C_{31}H_{21}D_5BrNSi$ = 529.60) | Sub 4-66 | m/z = 429.02($C_{24}H_{16}BrNS$ = 430.36) |
| Sub 4-67 | m/z = 413.04($C_{24}H_{16}BrNO$ = 414.30} | Sub 4-68 | m/z = 463.06($C_{28}H_{18}BrNO$ = 464.36) |
| Sub 4-69 | m/z = 445.12($C_{30}H_{20}ClNO$ = 445.95) | Sub 4-70 | m/z = 537.13($C_{36}H_{24}ClNS$ = 538.11) |
| Sub 4-71 | m/z = 626.16($C_{42}H_{27}ClN_2S$ = 627.20) | Sub 4-72 | m/z = 545.08($C_{33}H_{24}BrNS$ = 546.53) |
| Sub4-73 | m/z = 792.09($C_{48}H_{29}BrN_2OS_2$ = 793.8) | Sub4-74 | m/z = 818.14($C_{51}H_{35}BrN_2S_2$ = 819.88) |
| Sub4-75 | m/z = 746.16($C_{48}H_{31}BrN_2O_2$ = 747.69) | Sub4-76 | m/z = 670.13($C_{42}H_{27}BrN_2O_2$ = 671.59) |
| Sub4-77 | m/z = 746.16($C_{48}H_{31}BrN_2O_2$ = 747.69) | Sub4-78 | m/z = 670.13($C_{42}H_{27}BrN_2O_2$ = 671.59) |

TABLE 5-continued

| Compound | FD-MS | Compound | FD-MS |
|---|---|---|---|
| Sub4-79 | m/z = 792.09($C_{48}H_{29}BrN_2OS_2$ = 793.8) | Sub4-80 | m/z = 778.11($C_{48}H_{31}BrN_2S_2$ = 779.81) |
| Sub4-81 | m/z = 792.09($C_{48}H_{29}BrN_2OS_2$ = 793.8) | Sub4-82 | m/z = 746.16($C_{48}H_{31}BrN_2O_2$ = 747.69) |
| Sub4-83 | m/z = 702.08($C_{42}H_{27}BrN_2S_2$ = 703.72) | Sub4-84 | m/z = 757.11($C_{49}H_{28}BrNOS$ = 758.73) |
| Sub4-85 | m/z = 669.11($C_{43}H_{28}BrNS$ = 670.67) | Sub4-86 | m/z = 772.21($C_{51}H_{37}BrN_2O$ = 773.77) |
| Sub4-87 | m/z = 743.15($C_{49}H_{30}BrNO_2$ = 744.69) | Sub4-88 | m/z = 757.13($C_{49}H_{28}BrNO_3$ = 758.67) |
| Sub4-89 | m/z = 759.12($C_{49}H_{30}BrNOS$ = 760.75) | Sub4-90 | m/z = 743.15($C_{49}H_{30}BrNO_2$ = 744.69) |
| Sub4-91 | m/z = 759.12($C_{49}H_{30}BrNOS$ = 760.75) | Sub4-92 | m/z = 699.2($C_{49}H_{30}ClNO_2$ = 700.23) |
| Sub4-93 | m/z = 757.13($C_{49}H_{28}BrNO_3$ = 758.67) | Sub4-94 | m/z = 607.17($C_{43}H_{26}ClNO$ = 608.14) |

Synthesis Example of Final Products

1. Synthesis Example of 2-1

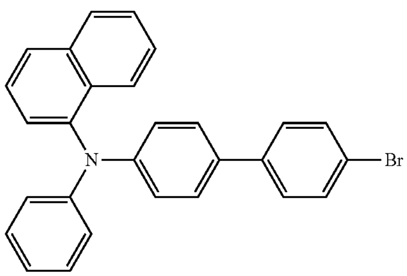

+

Sub 4-1

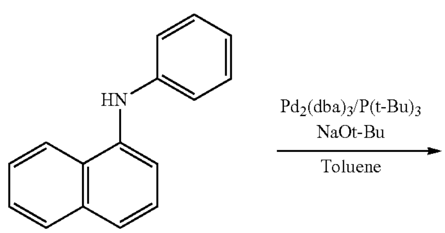

Sub 3-2

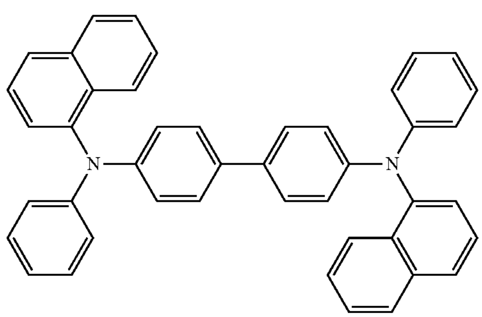

2-1

After Sub 4-1 (10 g, 22.20 mmol) was dissolved in toluene (233 mL), and Sub 3-2 (5.36 g, 24.42 mmol), $Pd_2(dba)_3$ (0.61 g, 0.67 mmol), $P(t\text{-}Bu)_3$ (0.45 g, 2.22 mmol) and NaOt-Bu (6.40 g, 66.61 mmol) were added to the solution, the mixture was stirred at 100° C. When the reaction was completed, the reaction product was extracted with $CH_2Cl_2$ and water. Then, an organic layer was dried over $MgSO_4$ and concentrated. Then, the concentrate was separated by a silica gel column and recrystallized to obtain 10.46 g (yield: 80%) of the product.

2. Synthesis Example of 2-10

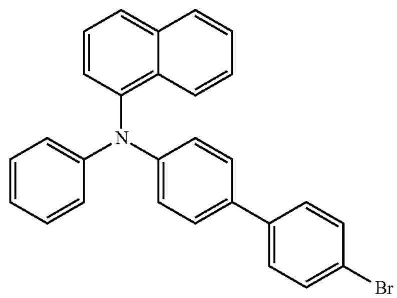

+

Sub 4-1

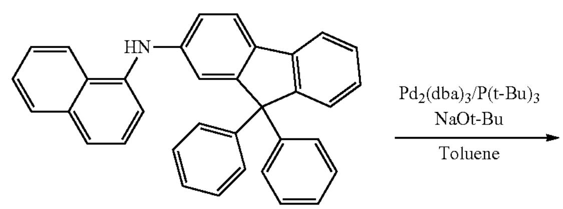

Sub 3-35

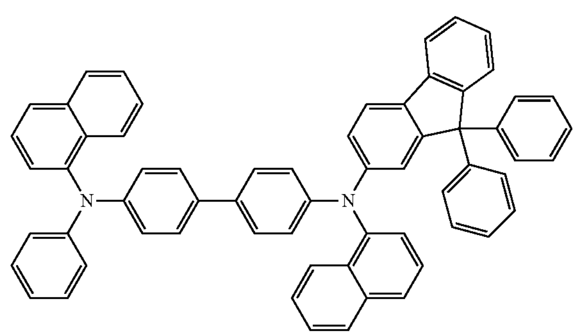

2-10

After dissolving Sub 4-1 (8 g, 17.76 mmol) in toluene (187 ml), Sub 3-35 (8.98 g, 19.54 mmol), $Pd_2(dba)_3$ (0.49 g, 0.53 mmol), $P(t\text{-}Bu)_3$ (0.36 g, 1.78 mmol) and NaOt-Bu (5.12 g, 53.29 mmol) were added to the solution, and then the reaction was carried out in the same manner as in the synthesis method of 2-1 to obtain 10.6 g (yield: 72%) of the product.

3. Synthesis Example of 2-23

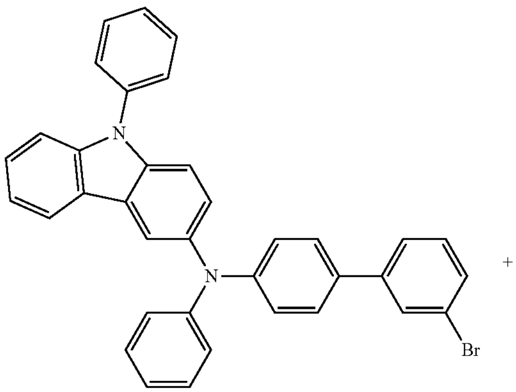

Sub 4-20

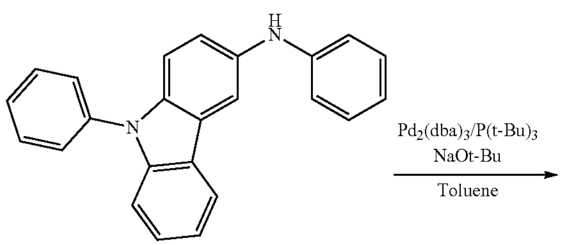

Sub 3-47

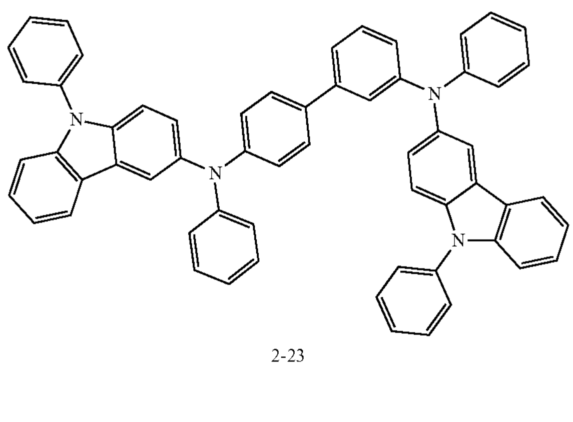

2-23

After dissolving Sub 4-20 (9 g, 15.91 mmol) in toluene (167 ml), Sub 3-47 (5.85 g, 17.51 mmol), $Pd_2(dba)_3$ (0.44 g, 0.48 mmol), $P(t-Bu)_3$ (0.32 g, 1.59 mmol) and NaOt-Bu (4.59 g, 47.74 mmol) were added to the solution, and then the reaction was carried out in the same manner as in the synthesis method of 2-1 to obtain 10.04 g (yield: 77%) of the product.

4. Synthesis Example of 2-50

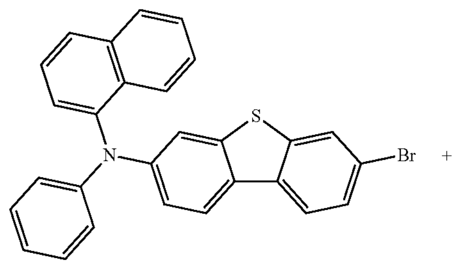

Sub 4-45

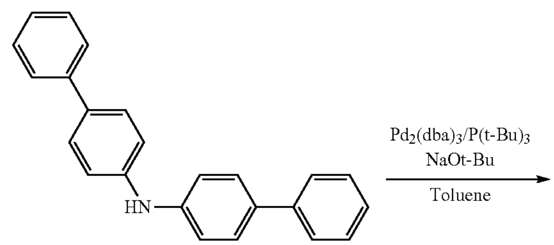

Sub 3-11

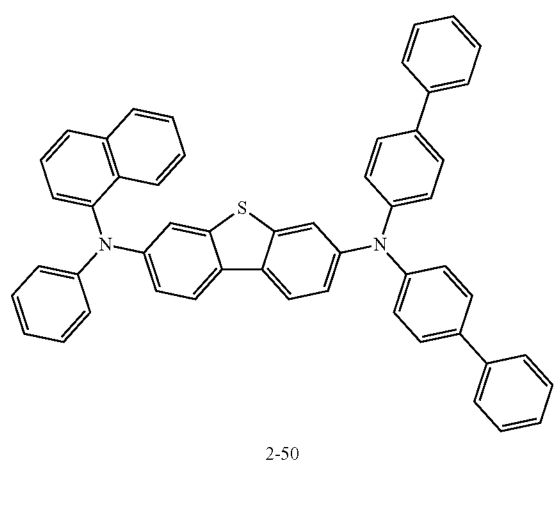

2-50

After dissolving Sub 4-45 (9.5 g, 19.77 mmol) in toluene (208 ml), Sub 3-11 (6.99 g, 21.75 mmol), $Pd_2(dba)_3$ (0.54 g, 0.59 mmol), $P(t-Bu)_3$ (0.40 g, 1.98 mmol) and NaOt-Bu (5.70 g, 59.32 mmol) were added to the solution, and then the reaction was carried out in the same manner as in the synthesis method of 2-1 to obtain 10.41 g (yield: 73%) of the product.

5. Synthesis Example of 2-114

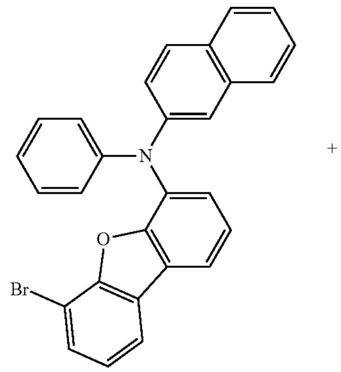

Sub 4-68

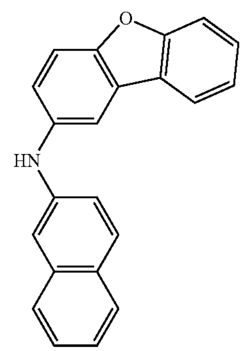

Sub 3-74

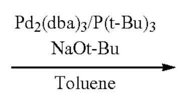

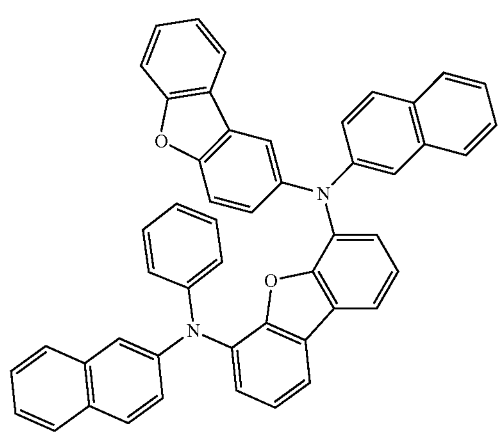

2-114

After dissolving Sub 4-68 (6.13 g, 13.20 mmol) in toluene (130 ml), Sub 3-74 (4.08 g, 13.20 mmol), $Pd_2(dba)_3$ (0.36 g, 0.40 mmol), $P(t\text{-}Bu)_3$ (0.27 g, 1.32 mmol) and NaOt-Bu (3.81 g, 39.60 mmol) were added to the solution, and then the reaction was carried out in the same manner as in the synthesis method of 2-1 to obtain 7.32 g (yield: 80%) of the product.

6. Synthesis Example of 2-128

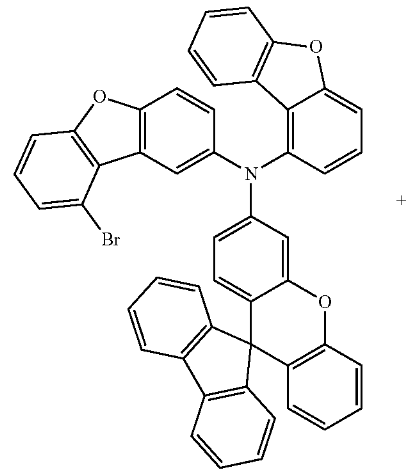

Sub4-88

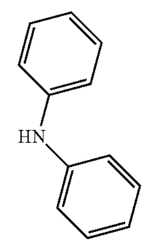

Sub3-1

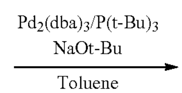

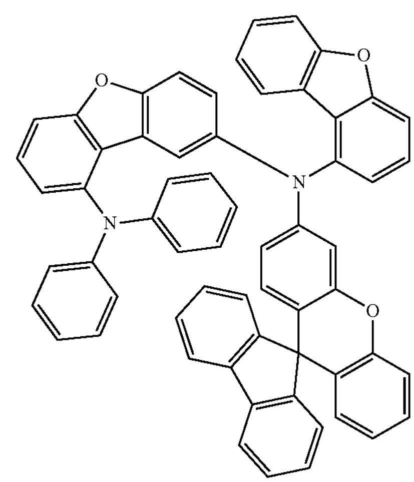

2-128

After dissolving Sub 4-88 (22 g, 29 mmol) in toluene (297 ml), Sub 3-1 (5.2 g, 30.5 mmol), $Pd_2(dba)_3$ (0.8 g, 0.9 mmol), $P(t\text{-}Bu)_3$ (0.4 g, 1.7 mmol) and NaOt-Bu (8.4 g, 87 mmol) were added to the solution, and then the reaction was carried out in the same manner as in the synthesis method of 2-1 to obtain 19.2 g (yield: 78.3%) of the product.

7. Synthesis Example of P4-23

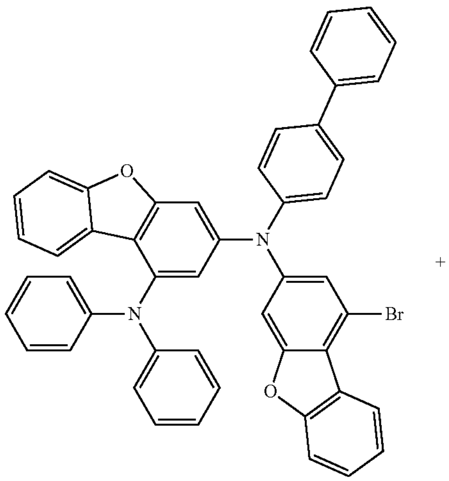

Sub4-75

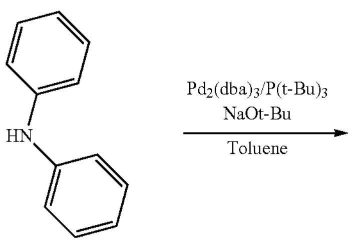

Sub3-1

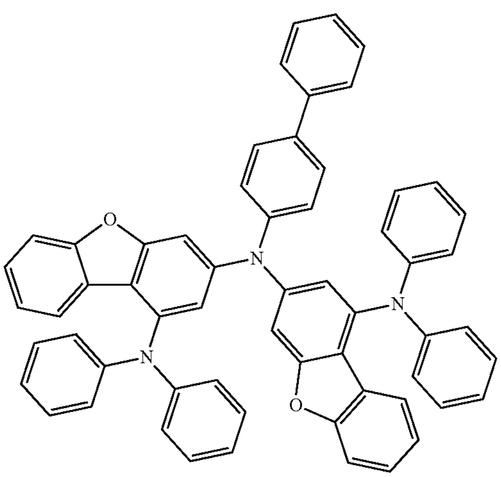

P4-23

After dissolving Sub 4-75 (26 g, 34.8 mmol) in toluene (256 ml), Sub 3-1 (6.2 g, 36.5 mmol), $Pd_2(dba)_3$ (0.96 g, 1.0 mmol), $P(t\text{-}Bu)_3$ (0.4 g, 2.1 mmol) and NaOt-Bu (10 g, 104.3 mmol) were added to the solution, and then the reaction was carried out in the same manner as in the synthesis method of 2-1 to obtain 24.2 g (yield: 83.1%) of the product.

8. Synthesis Example of P4-25

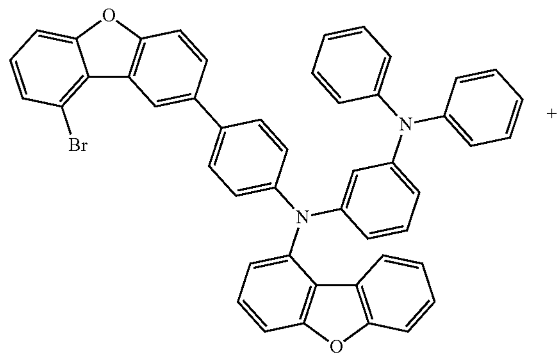

Sub4-77

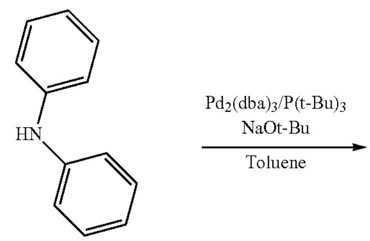

Sub3-1

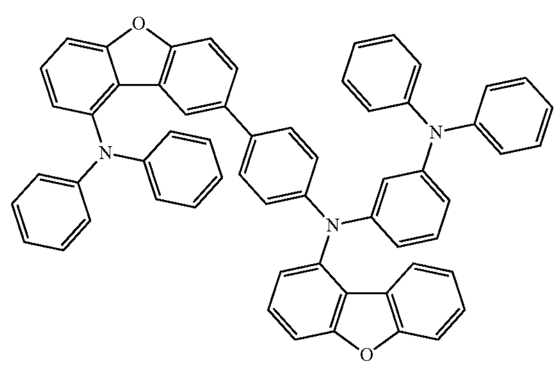

P4-25

After dissolving Sub 4-77 (19 g, 25.4 mmol) in toluene (260 ml), Sub 3-1 (4.5 g, 26.7 mmol), $Pd_2(dba)_3$ (0.7 g, 0.8 mmol), $P(t\text{-}Bu)_3$ (0.3 g, 1.5 mmol) and NaOt-Bu (7.3 g, 76.2 mmol) were added to the solution, and then the reaction was carried out in the same manner as in the synthesis method of 2-1 to obtain 16 g (yield: 75.4%) of the product.

9. Synthesis Example of P4-146

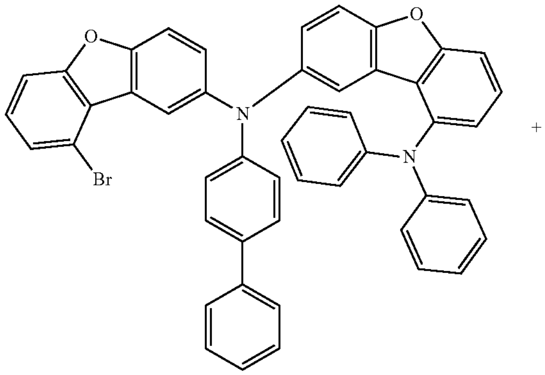

Sub4-82

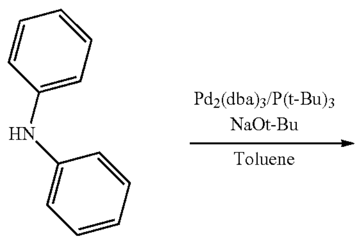

Sub3-1

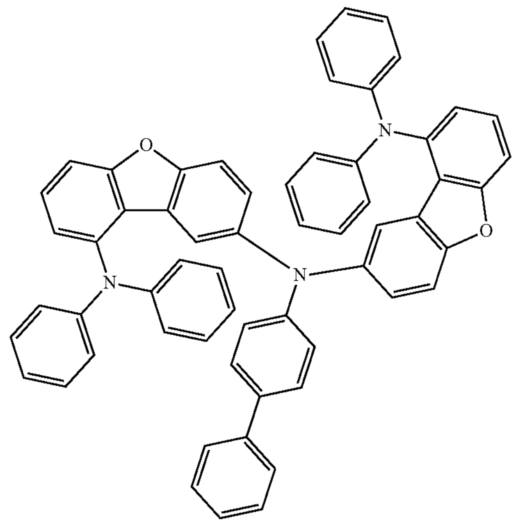

P4-146

After dissolving Sub 4-82 (23 g, 30.8 mmol) in toluene (315 ml), Sub 3-1 (5.5 g, 32.3 mmol), $Pd_2(dba)_3$ (0.9 g, 0.9 mmol), $P(t\text{-}Bu)_3$ (0.4 g, 1.9 mmol) and NaOt-Bu (8.9 g, 92.3 mmol) were added to the solution, and then the reaction was carried out in the same manner as in the synthesis method of 2-1 to obtain 20.6 g (yield: 80%) of the product.

10. Synthesis Example of P4-150

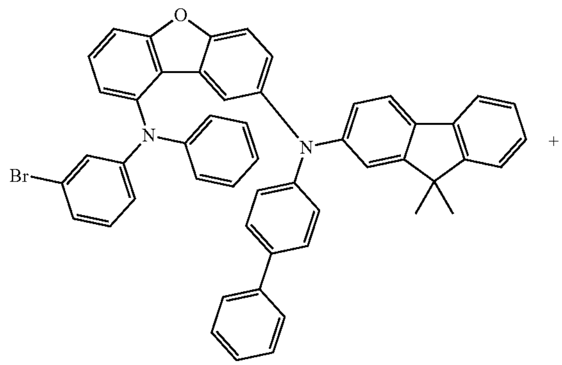

Sub4-86

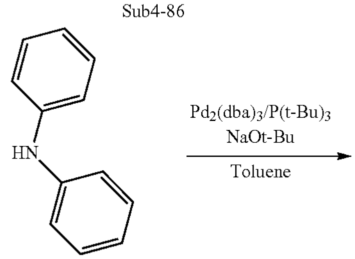

Sub3-1

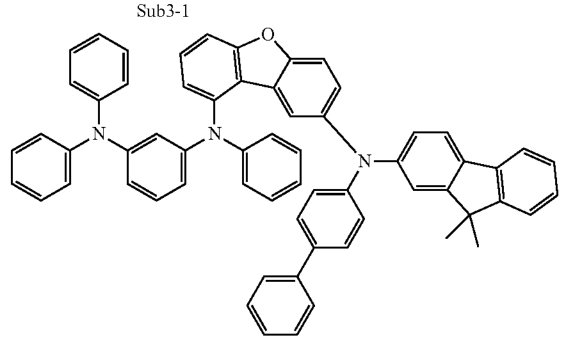

P4-150

After dissolving Sub 4-86 (24 g, 31 mmol) in toluene (318 ml), Sub 3-1 (5.5 g, 32.6 mmol), $Pd_2(dba)_3$ (0.9 g, 0.9 mmol), $P(t\text{-}Bu)_3$ (0.4 g, 1.9 mmol) and NaOt-Bu (8.9 g, 93.1 mmol) were added to the solution, and then the reaction was carried out in the same manner as in the synthesis method of 2-1 to obtain 20.7 g (yield: 77.3%) of the product.

The FD-MS values of the compounds represented by Formula 2 of the present invention synthesized by the above synthesis method are shown in Table 6 below.

TABLE 6

| Compound | FD-MS | Compound | FD-MS |
|---|---|---|---|
| 2-1 | m/z = 588.26($C_{44}H_{32}N_2$ = 588.74) | 2-2 | m/z = 816.35($C_{62}H_{44}N_2$ = 817.05) |
| 2-3 | m/z = 792.35($C_{60}H_{44}N_2$ = 793.03) | 2-4 | m/z = 763.30($C_{57}H_{37}N_3$ = 763.94) |
| 2-5 | m/z = 700.37($C_{52}H_{28}D_{10}N_2$ = 700.95) | 2-6 | m/z = 730.33($C_{55}H_{42}N_2$ = 730.96) |
| 2-7 | m/z = 877.44($C_{66}H_{43}D_7N_2$ = 878.18) | 2-8 | m/z = 876.35($C_{64}H_{48}N_2S$ = 877.16) |
| 2-9 | m/z = 952.48($C_{72}H_{60}N_2$ = 953.29) | 2-10 | m/z = 828.35($C_{63}H_{44}N_2$ = 829.06) |
| 2-11 | m/z = 863.33($C_{62}H_{45}N_3S$ = 864.12) | 2-12 | m/z = 981.41($C_{74}H_{51}N_3$ = 982.24) |
| 2-13 | m/z = 816.31($C_{61}H_{40}N_2O$ = 817.00) | 2-14 | m/z = 770.28($C_{56}H_{38}N_2S$ = 770.99) |
| 2-15 | m/z = 794.29($C_{58}H_{38}N_2O_2$ = 794.95) | 2-16 | m/z = 776.23($C_{54}H_{36}N_2S_2$ = 777.02) |

TABLE 6-continued

| Compound | FD-MS | Compound | FD-MS |
|---|---|---|---|
| 2-17 | m/z = 912.18($C_{60}H_{36}N_2S_4$ = 913.20) | 2-18 | m/z = 852.26($C_{60}H_{40}N_2S_2$ = 853.10) |
| 2-19 | m/z = 905.38($C_{68}H_{47}N_3$ = 906.15) | 2-20 | m/z = 935.33($C_{68}H_{45}N_3S$ = 936.19) |
| 2-21 | m/z = 709.26($C_{50}H_{35}N_3S$ = 709.91) | 2-22 | m/z = 800.23($C_{56}H_{36}N_2S_2$ = 801.04) |
| 2-23 | m/z = 818.34($C_{60}H_{42}N_4$ = 819.02) | 2-24 | m/z = 818.34($C_{60}H_{42}N_4$ = 819.02) |
| 2-25 | m/z = 650.35($C_{48}H_{26}D_{10}N_2$ = 650.89) | 2-26 | m/z = 664.29($C_{50}H_{36}N_2$ = 664.85) |
| 2-27 | m/z = 760.25($C_{54}H_{36}N_2OS$ = 760.96) | 2-28 | m/z = 835.30($C_{60}H_{41}N_3S$ = 836.07) |
| 2-29 | m/z = 740.32($C_{56}H_{40}N_2$ = 740.95) | 2-30 | m/z = 878.37($C_{67}H_{46}N_2$ = 879.12) |
| 2-31 | m/z = 911.33($C_{66}H_{45}N_3S$ = 912.17) | 2-32 | m/z = 664.29($C_{50}H_{36}N_2$ = 664.85) |
| 2-33 | m/z = 844.31($C_{62}H_{40}N_2O_2$ = 844.99) | 2-34 | m/z = 664.29($C_{50}H_{36}N_2$ = 664.85) |
| 2-35 | m/z = 664.29($C_{50}H_{36}N_2$ = 664.85) | 2-36 | m/z = 820.31($C_{60}H_{40}N_2O_2$ = 820.99) |
| 2-37 | m/z = 640.29($C_{48}H_{36}N_2$ = 640.83) | 2-38 | m/z = 881.38($C_{66}H_{47}N_3$ = 882.10) |
| 2-39 | m/z = 764.32($C_{58}H_{40}N_2$ = 764.97) | 2-40 | m/z = 648.35($C_{48}H_{44}N_2$ = 648.89) |
| 2-41 | m/z = 908.39($C_{67}H_{48}N_4$ = 909.15) | 2-42 | m/z = 538.24($C_{40}H_{30}N_2$ = 538.69) |
| 2-43 | m/z = 588.26($C_{44}H_{32}N_2$ = 588.75) | 2-44 | m/z = 759.27($C_{54}H_{37}N_3S$ = 759.97) |
| 2-45 | m/z = 764.32($C_{58}H_{40}N_2$ = 764.97) | 2-46 | m/z = 846.31($C_{62}H_{42}N_2S$ = 847.09) |
| 2-47 | m/z = 677.28($C_{50}H_{35}N_3$ = 677.85 | 2-48 | m/z = 627.27($C_{46}H_{33}N_3$ = 627.79) |
| 2-49 | m/z = 814.21($C_{56}H_{34}N_2OS_2$ = 815.02) | 2-50 | m/z = 720.26($C_{52}H_{36}N_2S$ = 720.93) |
| 2-51 | m/z = 748.27($C_{52}H_{36}N_4S$ = 748.95) | 2-52 | m/z = 744.26($C_{54}H_{36}N_2S$ = 744.96) |
| 2-53 | m/z = 774.27($C_{55}H_{38}N_2OS$ = 774.98) | 2-54 | m/z = 731.33($C_{54}H_{41}N_3$ = 731.94) |
| 2-55 | m/z = 670.24($C_{48}H_{34}N_2S$ = 670.87) | 2-56 | m/z = 866.24($C_{60}H_{38}N_2OS_2$ =867.10) |
| 2-57 | m/z = 698.20($C_{48}H_{30}N_2O_2S$ = 698.84) | 2-58 | m/z = 850.34($C_{62}H_{46}N_2S$ = 851.12) |
| 2-59 | m/z = 782.30($C_{56}H_{38}N_4$ = 782.95) | 2-60 | m/z = 729.31($C_{54}H_{39}N_3$ = 729.93) |
| 2-61 | m/z = 936.44($C_{71}H_{56}N_2$ = 937.24) | 2-62 | m/z = 744.28($C_{54}H_{36}N_2O_2$ = 744.89) |
| 2-63 | m/z = 792.35($C_{60}H_{44}N_2$ = 793.03) | 2-64 | m/z = 756.35($C_{57}H_{44}N_4$ = 756.99) |
| 2-65 | m/z = 694.24($C_{50}H_{34}N_2S$ = 694.90) | 2-66 | m/z = 852.26($C_{60}H_{40}N_2S_2$ = 853.11) |
| 2-67 | m/z = 922.40($C_{68}H_{50}N_4$ = 923.18) | 2-68 | m/z = 631.27($C_{44}H_{33}N_5$ = 631.78) |
| 2-69 | m/z = 626.24($C_{43}H_{31}FN_2O_2$ = 626.73) | 2-70 | m/z = 723.40($C_{51}H_{41}D_7N_2Si$ = 724.09) |
| 2-71 | m/z = 608.19($C_{42}H_{28}N_2OS$ = 608.76) | 2-72 | m/z = 608.19($C_{42}H_{28}N_2OS$ = 608.76) |
| 2-73 | m/z = 791.24($C_{54}H_{37}N_3S_2$ = 792.03) | 2-74 | m/z = 684.22($C_{48}H_{32}N_2OS$ = 684.86) |
| 2-75 | m/z = 658.21($C_{46}H_{30}N_2OS$ = 658.82) | 2-76 | m/z = 624.17($C_{42}H_{28}N_2S_2$ = 624.82) |
| 2-77 | m/z = 700.20($C_{48}H_{32}N_2S_2$ = 700.92) | 2-78 | m/z = 791.24($C_{54}H_{37}N_3S_2$ = 792.03) |
| 2-79 | m/z = 638.19($C_{43}H_{30}N_2S_2$ = 638.85) | 2-80 | m/z = 730.16($C_{48}H_{30}N_2S_3$ = 730.96) |
| 2-81 | m/z = 624.17($C_{42}H_{28}N_2S_2$ = 624.82) | 2-82 | m/z = 700.2($C_{48}H_{32}N_2S_2$ = 700.92) |
| 2-83 | m/z = 848.30($C_{60}H_{40}N_4S$ = 849.07) | 2-84 | m/z = 674.19($C_{46}H_{30}N_2S_2$ = 674.88) |
| 2-85 | m/z = 624.17($C_{42}H_{28}N_2S_2$ = 624.82) | 2-86 | m/z = 674.19($C_{46}H_{30}N_2S_2$ = 674.88) |
| 2-87 | m/z = 624.17($C_{42}H_{28}N_2S_2$ = 624.82) | 2-88 | m/z = 700.2($C_{48}H_{32}N_2S_2$ = 700.92) |
| 2-89 | m/z = 674.19($C_{46}H_{30}N_2S_2$ = 674.88) | 2-90 | m/z = 674.19($C_{46}H_{30}N_2S_2$ = 674.88) |
| 2-91 | m/z = 674.19($C_{46}H_{30}N_2S_2$ = 674.88) | 2-92 | m/z = 674.19($C_{46}H_{30}N_2S_2$ = 674.88) |
| 2-93 | m/z = 674.19($C_{46}H_{30}N_2S_2$ = 674.88) | 2-94 | m/z = 674.19($C_{46}H_{30}N_2S_2$ = 674.88) |
| 2-95 | m/z = 674.19($C_{46}H_{30}N_2S_2$ = 674.88) | 2-96 | m/z = 674.19($C_{46}H_{30}N_28_2$ = 674.88) |
| 2-97 | m/z = 700.2($C_{48}H_{32}N_2S_2$ = 700.92) | 2-98 | m/z = 710.28($C_{51}H_{38}N_2S$ = 710.94) |
| 2-99 | m/z = 634.24($C_{45}H_{34}N_2S$ = 634.84) | 2-100 | m/z = 834.31($C_{61}H_{42}N_2S$ = 835.08) |
| 2-101 | m/z = 658.21($C_{46}H_{30}N_2OS$ = 658.82) | 2-102 | m/z = 684.22($C_{48}H_{32}N_2OS$ = 684.86) |
| 2-103 | m/z = 684.22($C_{48}H_{32}N_2OS$ = 684.86) | 2-104 | m/z = 658.21 ($C_{46}H_{30}N_2OS$ = 658.82) |
| 2-105 | m/z = 658.21($C_{46}H_{30}N_2OS$ = 658.82) | 2-106 | m/z = 832.31($C_{61}H_{40}N_2O_2$ = 833.00) |
| 2-107 | m/z = 668.25($C_{48}H_{32}N_2O_2$ = 668.80) | 2-108 | m/z = 720.26($C_{52}H_{36}N_2S$ = 720.93) |
| 2-109 | m/z = 759.27($C_{54}H_{37}N_3S$ = 759.97) | 2-110 | m/z = 872.32($C_{64}H_{44}N_2S$ = 873.13) |
| 2-111 | m/z = 618.21($C_{44}H_{30}N_2S$ = 618.80) | 2-112 | m/z = 700.20($C_{48}H_{32}N_2S_2$ = 700.92) |
| 2-113 | m/z = 708.22($C_{50}H_{32}N_2OS$ = 708.88) | 2-114 | m/z = 692.25($C_{50}H_{32}N_2O_2$ = 692.82) |
| 2-115 | m/z = 742.30($C_{55}H_{38}N_2O$ = 742.92) | 2-118 | m/z = 891.33($C_{63}H_{45}N_3OS$ = 892.13) |
| 2-117 | m/z = 862.27($C_{61}H_{38}N_2O_2S$ = 863.05) | 2-118 | m/z = 958.32($C_{66}H_{46}N_4S_2$ = 959.24) |
| 2-119 | m/z = 872.34($C_{64}H_{44}N_2O_2$ = 873.07) | 2-120 | m/z = 708.28($C_{51}H_{36}N_2O_2$ = 708.86) |
| 2-121 | m/z = 734.33($C_{54}H_{42}N_2O$ = 734.94) | 2-122 | m/z = 724.25($C_{51}H_{36}N_2OS$ = 724.92) |
| 2-123 | m/z = 750.31($C_{54}H_{42}N_2S$ = 751.00) | 2-124 | m/z = 884.41($C_{67}H_{52}N_2$ = 885.17) |
| 2-125 | m/z = 846.27($C_{61}H_{38}N_2OS$ = 847.05) | 2-126 | m/z = 758.28($C_{55}H_{38}N_2S$ = 758.98) |
| 2-127 | m/z = 832.31($C_{61}H_{40}N_2O_2$ = 833) | 2-128 | m/z = 846.29($C_{61}H_{38}N_2O_3$ = 846.99) |
| 2-129 | m/z = 848.29($C_{61}H_{40}N_2OS$ = 849.06) | 2-130 | m/z = 832.31($C_{61}H_{40}N_2O_2$ = 833) |
| 2-131 | m/z = 848.29($C_{61}H_{40}N_2OS$ = 849.06) | 2-132 | m/z = 832.31($C_{61}H_{40}N_2O_2$= 833) |
| 2-133 | m/z = 846.29($C_{61}H_{38}N_2O_3$= 846.99) | 2-134 | m/z = 816.31($C_{61}H_{40}N_2O$ = 817) |
| 2-135 | m/z = 850.27($C_{60}H_{38}N_2O_2S$ = 851.04) | 2-136 | m/z = 700.2($C_{48}H_{32}N_2S_2$ = 700.92) |
| 2-137 | m/z = 684.22($C_{48}H_{32}N_2OS$ = 684.86) | 2-138 | m/z = 760.25($C_{54}H_{36}N_2OS$ = 760.96) |
| P4-21 | m/z = 881.25($C_{60}H_{39}N_3OS_2$ = 882.11) | P4-22 | m/z = 907.31($C_{63}H_{45}N_3S_2$ = 908.19) |
| P4-23 | m/z = 835.32($C_{60}H_{41}N_3O_2$ = 836.01) | P4-24 | m/z = 759.29($C_{54}H_{37}N_3O_2$ = 759.91) |
| P4-25 | m/z = 835.32($C_{60}H_{41}N_3O_2$ = 836.01) | P4-51 | m/z = 867.27($C_{60}H_{41}N_3S_2$ = 868.13) |
| P4-52 | m/z = 881.25($C_{60}H_{39}N_3OS_2$ = 882.11) | P4-146 | m/z = 835.32($C_{60}H_{41}N_3O_2$ = 836.01) |
| P4-147 | m/z = 791.24($C_{54}H_{37}N_3S_2$ = 792.03) | P4-150 | m/z = 861.37($C_{63}H_{47}N_3O$ = 862.09) |
| P4-214 | m/z = 759.29($C_{54}H_{37}N_3O_2$ = 759.91) | P4-215 | m/z = 881.25($C_{60}H_{39}N_3OS_2$ = 882.11) |

Hereinafter, a method for measuring the HOMO energy level using the compound of the present invention prepared according to the above synthesis example will be described in detail with reference to Examples, but the present invention is not limited to the following Examples.

<Example for Measuring HOMO Energy Level>

The HOMO energy level can be measured using a CV-graph.

A measurement sample in which the electrolyte and the compound to be measured are dissolved is prepared. Illustratively, 0.1M TBAP in ACN (acetonitrile) electrolyte may be prepared, and 2.5 mg of the compound to be measured may be dissolved in 1 ml of chloroform as a solvent to prepare a measurement sample.

Thereafter, the cyclic voltammetry of the measurement sample is measured at room temperature, and the HOMO energy level can be obtained using the CV-graph (current-voltage graph). The vertical axis of the CV-graph represents the current and the horizontal axis represents the voltage (potential), and the HOMO energy level is calculated using the lower curve among the two curves. That is, a graph in the case of reverse scanning of the voltage is used, and the HOMO energy level can be obtained from the potential value at the intersection of two straight lines. That is, the unit of the potential value can be changed to the energy unit eV.

The above two straight lines refer to the tangent line (horizontal line) drawn to the graph in the section before the meaningful reaction starts (the section with little change in current) and the tangent line drawn to the curve (the section in which the current rapidly decreases as the voltage is applied) between the points where a meaningful reaction starts and the maximum oxidation current flows.

On the other hand, in order to obtain the HOMO energy level of the compound to be measured, it is necessary to correct the HOMO energy level of the reference sample.

That is, the HOMO energy level of the compound to be measured is calculated by adding the correction value, which is the difference in CV value between the reference sample and the measurement sample, to HOMO energy level intrinsic to the reference sample as s shown in the following conversion formula.

HOMO energy level of the compound to be measured=HOMO energy level unique to the reference sample+correction value     Conversion formula:

In the conversion equation, the correction value is obtained by the following equation.

Correction value=(HOMO energy level in CV-graph of reference sample)−(HOMO level in CV-graph of measurement sample)

For example, when $Alq_3$ is used as a reference sample, the HOMO energy level of the compound to be measured can be obtained by the following conversion equation. The intrinsic HOMO energy level of $Alq_3$ is −5.8 eV.

HOMO energy level of the compound to be measured=−5.8 (eV)+correction value

[Correction value=(HOMO energy level in CV-graph of $Alq_3$)−(HOMO energy level in CV-graph of sample to be measured)]

The HOMO energy levels for the compounds of the present invention measured according to the energy level measurement method as described above are shown in Table 7 below.

TABLE 7

| Compound | HOMO Energy level | Compound | HOMO Energy level |
|---|---|---|---|
| 1-5 | −5.63 eV | 1-9 | −5.56 eV |
| 1-13 | −5.57 eV | 1-16 | −5.61 eV |
| 1-62 | −5.75 eV | 1-72 | −5.72 eV |
| 1-100 | −5.71 eV | 1-105 | −5.53 eV |
| 1-131 | −5.61 eV | 1-134 | −5.55 eV |
| 1-135 | −5.48 eV | 2-16 | −5.58 eV |
| 2-26 | −5.51 eV | 2-44 | −5.64 eV |
| 2-73 | −5.54 eV | 2-76 | −5.60 eV |

TABLE 7-continued

| Compound | HOMO Energy level | Compound | HOMO Energy level |
|---|---|---|---|
| 2-78 | −5.55 eV | 2-83 | −5.53 eV |
| 2-106 | −5.65 eV | 2-116 | −5.58 eV |
| 2-117 | −5.60 eV | 2-118 | −5.57 eV |
| 2-120 | −5.65 eV | 2-123 | −5.59 eV |

Hereinafter, examples will be given for the manufacture and evaluation of an organic electric element employing the compound of the present invention, but the present invention is not limited to the following examples.

<Manufacturing and Evaluation of a Blue Organic Electric Element>

[Test Example 1] Green Organic Electric Element (Emission-Auxiliary Layer)

A hole injection layer having a thickness of 60 nm was formed by vacuum-deposition of 4,4',4"-tris[2-naphthyl (phenyl)amino]triphenylamine (hereinafter, abbreviated as 2-TNATA) on an ITO layer (anode) that was formed on the glass substrate. Thereafter, N,N'-bis(1-naphthalenyl)-N,N'-bis-phenyl-(1,1'-biphenyl)-4,4'-diamine (hereinafter, abbreviated as NPB) was vacuum-deposited to a thickness of 60 nm to form a hole transport layer on the hole injection layer.

Next, light emitting-auxiliary layers comprising a first light emitting-auxiliary layer and a second light emitting-auxiliary layer were formed on the hole transport layer, wherein the first emission-auxiliary layer is formed by vacuum-depositing the compound 1-3 of the present invention to a thickness of 30 nm and the second emission-auxiliary layer is formed by vacuum-depositing the compound 1-16 of the present invention to a thickness of 5 nm. Here, it is preferable to first deposit a material having a high HOMO energy level among the first emission-auxiliary layer and the second emission-auxiliary layer.

Thereafter, a light-emitting layer having a thickness of 30 nm was formed on the light emitting-auxiliary layer. Here, 4,4'-N,N'-dicarbazole-biphenyl(hereinafter, "CBP") was used as a host, and tris(2-phenylpyridine)-iridium (hereinafter, "$Ir(ppy)_3$") was used as a dopant, and the dopant was doped so that the weight ratio thereof was 95:5.

Next, (1,1'-biphenyl-4-olato)bis(2-methyl-8-quinolinolato)aluminum (hereinafter, abbreviated as BAlq) was vacuum-deposited to a thickness of 10 nm on the light-emitting layer to form a hole blocking layer and bis(10-hydroxybenzo[h]quinolinato)beryllium (hereinafter, abbreviated as $BeBq_2$) was vacuum-deposited to a thickness of 50 nm on the hole blocking layer to form an electron transport layer.

Thereafter, LiF was deposited to a thickness of 0.2 nm to form an electron injection layer, and then Al was deposited to a thickness of 150 nm to form a cathode, thereby manufacturing an organic electroluminescent element.

[Test Example 2] to [Test Example 24]

An organic electroluminescent element was manufactured in the same manner as in Test Example 1, except that the compounds shown in Table 8 were used as material of the first and second light emitting-auxiliary layer.

Comparative Example 1

An organic electroluminescent element was manufactured in the same manner as in Test Example 1, except that the following Comparative Compounds 1 and 2 were mixed in a weight ratio of 98:2 and the mixture was vacuum deposited to a thickness of 10 nm to form a first emission-auxiliary layer, and then Comparative Compound 1 was vacuum deposited on the first emission-auxiliary layer to a thickness of 40 nm to form a second emission-auxiliary layer.

Comparative Example 2

An organic electroluminescent element was manufactured in the same manner as in Test Example 1, except that Compound 1-13 and the following comparative compound 2 were mixed in a weight ratio of 98:2 and the mixture was vacuum-deposited to a thickness of 5 nm to form a first emission-auxiliary layer, and then Comparative Compound 1-16 was vacuum deposited on the first emission-auxiliary layer to a thickness of 30 nm to form a second emission-auxiliary layer.

<Comparative compound 1>

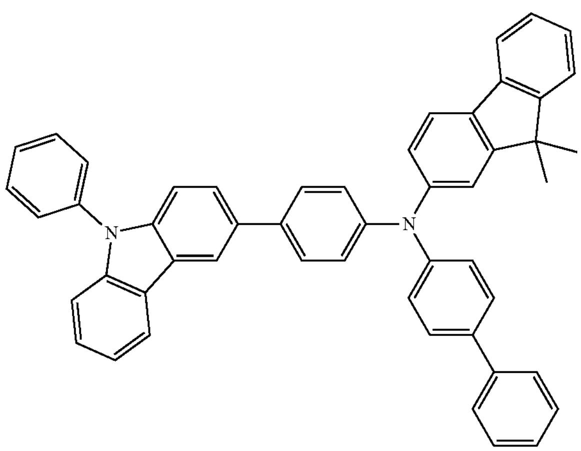

-continued

<Comparative compound 2>

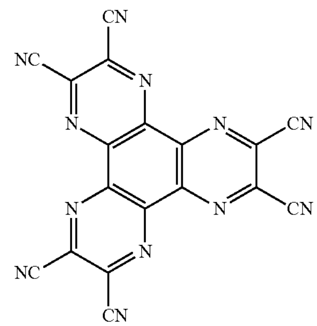

[Comparative Example 3] to [Comparative Example 8]

An organic electroluminescent element was manufactured in the same manner as in Test Example 1, except that one type of compound was vacuum-deposited to a thickness of 35 nm without additional doping to form one emission-auxiliary layer, as shown in Table 8 below.

A forward bias DC voltage was applied to the organic electric elements manufactured in Test Examples 1 to 24 and Comparative Examples 1 to 8 and electroluminescence (EL) characteristics were measured with a PR-650 manufactured by photo research and lifetime (T95) was measured with a lifetime measuring device manufactured by Mc Science at 5000 cd/m$^2$ standard luminance. The measurement results are shown in Table 8 below.

TABLE 8

| | EAL 1 | EAL 2 | Voltage (V) | Current Density (mA/cm$^2$) | Brightness (cd/m$^2$) | Efficiency (cd/A) | Lifetime T(95) | CIE x | CIE y |
|---|---|---|---|---|---|---|---|---|---|
| comp. Ex(1) | Comp. compd 1 + Comp. compd 2 | Comp. compd 1 | 6.5 | 17.8 | 5000 | 28.1 | 100.7 | 0.34 | 0.64 |
| comp. Ex(2) | 1-13 + Comp. compd 2 | 1-16 | 6.3 | 16.0 | 5000 | 31.2 | 115.2 | 0.35 | 0.62 |
| comp. Ex(3) | 1-9 | — | 6.2 | 15.0 | 5000 | 33.3 | 112.4 | 0.33 | 0.62 |
| comp. Ex(4) | 1-13 | — | 6.1 | 14.7 | 5000 | 34.1 | 114.9 | 0.30 | 0.63 |
| comp. Ex(5) | 1-134 | — | 6.1 | 15.4 | 5000 | 32.5 | 113.1 | 0.35 | 0.61 |
| comp. Ex(6) | 2-106 | — | 6.2 | 15.7 | 5000 | 31.8 | 116.3 | 0.32 | 0.61 |
| comp. Ex(7) | 2-116 | — | 6.0 | 15.7 | 5000 | 31.9 | 115.5 | 0.33 | 0.64 |
| comp. Ex(8) | 2-120 | — | 6.0 | 15.3 | 5000 | 32.7 | 113.8 | 0.35 | 0.62 |
| Test Ex. (1) | 1-13 | 1-16 | 5.3 | 9.1 | 5000 | 55.1 | 128.7 | 0.30 | 0.63 |
| Text Ex. (2) | | 1-100 | 5.1 | 10.0 | 5000 | 50.1 | 126.7 | 0.34 | 0.61 |
| Test Ex. (3) | | 2-44 | 5.1 | 9.1 | 5000 | 55.2 | 129.3 | 0.32 | 0.65 |
| Test Ex. (4) | | 2-116 | 5.3 | 9.2 | 5000 | 54.4 | 126.9 | 0.32 | 0.63 |
| Test Ex. (5) | 1-134 | 1-5 | 5.4 | 11.9 | 5000 | 42.0 | 122.8 | 0.33 | 0.65 |
| Test Ex. (6) | | 1-131 | 5.3 | 12.1 | 5000 | 41.5 | 121.1 | 0.32 | 0.61 |
| Test Ex. (7) | | 2-16 | 5.4 | 12.2 | 5000 | 41.1 | 122.4 | 0.32 | 0.63 |
| Test Ex. (8) | | 2-117 | 5.3 | 12.3 | 5000 | 40.5 | 121.8 | 0.32 | 0.62 |
| Test Ex. (9) | 2-28 | 1-9 | 5.1 | 10.4 | 5000 | 48.0 | 128.5 | 0.31 | 0.65 |
| Test Ex. (10) | | 1-13 | 5.2 | 10.6 | 5000 | 47.2 | 129.5 | 0.31 | 0.64 |
| Test Ex. (11) | | 2-73 | 5.1 | 11.0 | 5000 | 45.5 | 129.4 | 0.32 | 0.60 |
| Test Ex. (12) | | 2-120 | 5.1 | 10.6 | 5000 | 47.3 | 125.0 | 0.34 | 0.63 |
| Test Ex. (13) | 2-116 | 1-16 | 4.8 | 9.0 | 5000 | 55.7 | 131.3 | 0.32 | 0.60 |

TABLE 8-continued

| | EAL 1 | EAL 2 | Voltage (V) | Current Density (mA/cm$^2$) | Brightness (cd/m$^2$) | Efficiency (cd/A) | Lifetime T(95) | CIE x | CIE y |
|---|---|---|---|---|---|---|---|---|---|
| Test Ex. (14) | | 1-62 | 4.8 | 9.1 | 5000 | 55.1 | 132.8 | 0.30 | 0.62 |
| Test Ex. (15) | | 2-76 | 4.9 | 9.7 | 5000 | 51.8 | 133.0 | 0.31 | 0.65 |
| Test Ex. (16) | | 2-106 | 4.8 | 8.9 | 5000 | 56.2 | 131.7 | 0.32 | 0.61 |
| Test Ex. (17) | 2-117 | 1-13 | 4.6 | 8.2 | 5000 | 61.2 | 135.0 | 0.34 | 0.64 |
| Test Ex. (18) | | P1-86 | 4.6 | 8.1 | 5000 | 61.5 | 134.3 | 0.35 | 0.61 |
| Test Ex. (19) | | 2-127 | 4.7 | 8.4 | 5000 | 59.4 | 133.8 | 0.30 | 0.65 |
| Test Ex. (20) | 2-117 | 2-128 | 4.7 | 8.5 | 5000 | 58.6 | 133.2 | 0.35 | 0.64 |
| Test Ex. (21) | P4-146 | 1-13 | 4.5 | 8.0 | 5000 | 62.5 | 136.7 | 0.31 | 0.63 |
| Test Ex. (22) | | P1-86 | 4.5 | 7.8 | 5000 | 63.8 | 136.0 | 0.30 | 0.64 |
| Test Ex. (23) | | 2-127 | 4.6 | 8.1 | 5000 | 61.9 | 135.6 | 0.31 | 0.62 |
| Test Ex. (24) | | 2-128 | 4.6 | 8.2 | 5000 | 61.3 | 135.2 | 0.32 | 0.62 |

As can be seen from the results in table 8 above, when a green organic electroluminescent element is manufactured by using the material for an organic electroluminescent element of the present invention as a material for a plurality of emission-auxiliary layers, the driving voltage, efficiency and lifespan were improved, compared to the comparative examples.

Comparative Examples 1 and 2 are similar to the present invention in that two emission-auxiliary layers are formed, but are different from the present invention in that the first emission-auxiliary is formed by doping comparative compound 1 or compound 1-13 of the present invention with comparative compound 2 being a p-type doping material.

Comparative Examples 1 and 2 also have a difference in the material and thickness of the emission-auxiliary layer. It can be seen that the driving voltage, efficiency and lifespan of the element were further improved in Comparative Example 2, in which the total thickness of the emission-auxiliary layer and each of the emission-auxiliary layers were thinner than those of Comparative Example 1.

In addition, the driving voltage and efficiency of the element were improved in Comparative Examples 3 to 8, compared to Comparative Examples 1 and 2, wherein the elements of Comparative Examples 1 and 2 were manufactured by mixing Comparative Compound 2 being a p-type doping material and in Comparative Examples 3 to 8, a single-layered emission-auxiliary layer is formed as one type of compound without using a p-type doping material.

In addition, it can be seen that the driving voltage, efficiency, and lifespan in the elements of Test Examples 1 to 24 of the present invention significantly are significantly improved, compared to Comparative Examples 3 to 8, wherein, in Test Examples 1 to 24 of the present invention, a plurality of emission-auxiliary layers, that is, two emission-auxiliary layers are formed, and the HOMO energy levels of two emission-auxiliary layers are each lower than that of a hole transport layer and the HOMO energy level of the first emission-auxiliary layer is higher than that of the second emission-auxiliary layer.

This is because the charge balance within the light-emitting layer is increased by forming a plurality of emission-auxiliary layers with compound having high hole mobility and excellent hole injection properties, wherein the compound is used as the first emission-auxiliary layer material, and compound having excellent electron blocking properties, wherein the compound is used as the second emission-auxiliary layer material, thereby improving the injection/flow characteristics of holes and electrons without using a p-type doping material.

[Test Example 25] to [Test Example 48] Red Organic Electric Element (Emission-Auxiliary Layer)

An organic electroluminescent element was manufactured in the same manner as in Test Example 1, except that the compounds were used as a first emission-auxiliary layer material and a second emission-auxiliary layer material, as shown in Table 9, and bis-(1-phenylisoquinolyl)iridium(III) acetylacetonate (hereinafter, $(piq)_2Ir(acac)$ was approximately flagship) was used as a dopant.

Comparative Example 91

An organic electroluminescent element was manufactured in the same manner as in Comparative Example 1, except that bis-(1-phenylisoquinolyl)iridium(III)acetylacetonate (hereinafter, abbreviated as $(piq)_2Ir(acac)$) was used as a dopant.

Comparative Example 10

An organic electroluminescent element was manufactured in the same manner as in Comparative Example 2, except that a mixture of Compound 1-9 of the present invention and Comparative Compound 2 in a weight ratio of 98:2 is used as a first emission-auxiliary layer material, Compound 1-5 of the present invention is used as a second emission-auxiliary layer material, and bis-(1-phenylisoquinolyl) iridium(III)acetylacetonate (hereinafter, abbreviated as $(piq)_2Ir(acac)$) is used as a dopant.

[Comparative Example 11] to [Comparative Example 16]

An organic electroluminescent element was manufactured in the same manner as in Comparative Example 3, except that the compound shown in Table 9 was used as the emission-auxiliary layer material, and bis-(1-phenylisoquinolyl)iridium(III)acetylacetonate (hereinafter, abbreviated as $(piq)_2Ir(acac)$) was used as the dopant.

A forward bias DC voltage was applied to the organic electric elements manufactured in Test Examples 25 to 48 and Comparative Examples 9 to 16 and electroluminescence (EL) characteristics were measured with a PR-650 manufactured by photo research and lifetime (T95) was measured with a lifetime measuring device manufactured by Mc Science at 2500 cd/m$^2$ standard luminance. The measurement results are shown in Table 9 below.

TABLE 9

| | EAL 1 | EAL 2 | Voltage (V) | Current Density (mA/cm²) | Brightness (cd/m²) | Efficiency (cd/A) | Lifetime T(95) | CIE x | CIE y |
|---|---|---|---|---|---|---|---|---|---|
| comp. Ex(9) | Comp. compd 1 + Comp. compd 2 | Comp. compd 1 | 5.8 | 21.2 | 2500 | 11.8 | 102.8 | 0.6 | 0.3 |
| comp. Ex(10) | 1-9 + Comp. compd 2 | 1-5 | 5.6 | 17.6 | 2500 | 14.2 | 103.9 | 0.6 | 0.4 |
| comp. Ex(11) | 1-5 | — | 5.5 | 17.7 | 2500 | 14.1 | 103.5 | 0.6 | 0.3 |
| comp. Ex(12) | 1-62 | — | 5.4 | 16.4 | 2500 | 15.2 | 103.7 | 0.6 | 0.3 |
| comp. Ex(13) | 1-100 | — | 5.3 | 16.9 | 2500 | 14.8 | 104.3 | 0.6 | 0.3 |
| comp. Ex(14) | 2-16 | — | 5.4 | 15.3 | 2500 | 16.3 | 104.2 | 0.6 | 0.4 |
| comp. Ex(15) | 2-44 | — | 5.3 | 15.7 | 2500 | 15.9 | 105.6 | 0.6 | 0.3 |
| comp. Ex(16) | 2-76 | — | 5.3 | 15.2 | 2500 | 16.5 | 105.8 | 0.6 | 0.3 |
| Test Ex. (25) | 1-9 | 1-5 | 4.8 | 9.6 | 2500 | 26.1 | 121.9 | 0.66 | 0.33 |
| Test Ex. (26) | | 1-16 | 4.9 | 10.4 | 2500 | 24.1 | 123.7 | 0.66 | 0.32 |
| Test Ex. (27) | | 2-76 | 4.8 | 10.1 | 2500 | 24.8 | 121.4 | 0.66 | 0.33 |
| Test Ex. (28) | | 2-118 | 4.9 | 9.5 | 2500 | 26.2 | 120.8 | 0.66 | 0.33 |
| Test Ex. (29) | 1-135 | 1-9 | 5.2 | 10.5 | 2500 | 23.7 | 119.3 | 0.66 | 0.32 |
| Test Ex. (30) | | 1-105 | 5.1 | 10.8 | 2500 | 23.1 | 119.4 | 0.66 | 0.32 |
| Test Ex. (31) | | 2-16 | 5.0 | 10.5 | 2500 | 23.9 | 118.6 | 0.66 | 0.33 |
| Test Ex. (32) | | 2-28 | 5.1 | 10.7 | 2500 | 23.3 | 119.6 | 0.66 | 0.33 |
| Test Ex. (33) | 2-44 | 1-62 | 5.0 | 10.6 | 2500 | 23.6 | 120.8 | 0.66 | 0.33 |
| Test Ex. (34) | | 1-100 | 5.0 | 9.1 | 2500 | 27.4 | 123.1 | 0.66 | 0.33 |
| Test Ex. (35) | | 2-106 | 4.9 | 10.3 | 2500 | 24.3 | 121.0 | 0.66 | 0.32 |
| Test Ex. (36) | | 2-120 | 4.9 | 9.9 | 2500 | 25.3 | 123.9 | 0.66 | 0.33 |
| Test Ex. (37) | 2-73 | 1-13 | 4.5 | 8.8 | 2500 | 28.4 | 127.7 | 0.66 | 0.32 |
| Test Ex. (38) | | 1-134 | 4.6 | 8.7 | 2500 | 28.6 | 126.6 | 0.66 | 0.33 |
| Test Ex. (39) | | 2-76 | 4.6 | 8.6 | 2500 | 29.1 | 127.4 | 0.66 | 0.32 |
| Test Ex. (40) | | 2-123 | 4.7 | 8.9 | 2500 | 28.2 | 127.8 | 0.66 | 0.33 |
| Test Ex. (41) | 2-135 | 1-16 | 4.6 | 7.9 | 2500 | 31.8 | 129.7 | 0.66 | 0.33 |
| Test Ex. (42) | | 1-100 | 4.6 | 7.7 | 2500 | 32.4 | 130.7 | 0.66 | 0.32 |
| Test Ex. (43) | | 2-16 | 4.6 | 7.8 | 2500 | 32.1 | 130.3 | 0.66 | 0.33 |
| Test Ex. (44) | 2-135 | 2-137 | 4.5 | 7.6 | 2500 | 32.9 | 131.0 | 0.66 | 0.32 |
| Test Ex. (45) | 2-138 | 1-16 | 4.5 | 8.3 | 2500 | 30.3 | 128.2 | 0.66 | 0.33 |
| Test Ex. (46) | | 1-100 | 4.5 | 8.0 | 2500 | 31.1 | 129.0 | 0.66 | 0.33 |
| Test Ex. (47) | | 2-16 | 4.5 | 8.1 | 2500 | 30.8 | 128.7 | 0.66 | 0.33 |
| Test Ex. (48) | | 2-137 | 4.4 | 7.9 | 2500 | 31.5 | 129.4 | 0.66 | 0.33 |

As can be seen in Table 9, Comparative Examples 1 and 2 are similar to the present invention in that two emission-auxiliary layers are formed, but are different from the present invention in that the first emission-auxiliary is formed by doping comparative compound 1 or compound 1-9 of the present invention with comparative compound 2 being a p-type doping material, and Comparative Examples 11 to 16 are different from the present invention in that a single emission-auxiliary layer is formed with one type of compound.

Looking at Comparative Examples 9 to 16, the element characteristics of Comparative Examples 11 to 16 being formed as a single layer were better than those of Comparative Examples 11 to 16 being formed with two emission-auxiliary layers. In particular, Comparative Examples 10 and 11 are common in that they include an emission-auxiliary layer formed of Compound 1-5, but the element characteristics are slightly improved in Comparative Example 11 having a single emission-auxiliary layer.

However, in the case of Examples 25 to 48 of the present invention, even when a plurality of emission-auxiliary layers are formed, the characteristics of the element were remarkably improved. From these results, it can be confirmed that the characteristics of the element can be improved when a plurality of emission-auxiliary layers are formed with different thicknesses by selectively using compounds having the HOMO energy level correlation according to the conditions defined in the present invention.

In the case of the present invention, it seems that the characteristics of the element are is improved because the compound having a different HOMO energy level between the HOMO energy level of a hole transport layer and the HOMO energy level of the light-emitting layer is used as a emission-auxiliary layer material, and the thicknesses of the emission-auxiliary layers was controlled when the first and the second emission-auxiliary layer are formed, thereby improving the injection of electrons and holes into the light-emitting layer and the charge balance.

Although the exemplary embodiments of the present invention have been described for illustrative purposes, those skilled in the art to which the present invention pertains will be capable of various modifications without departing from the essential characteristics of the present invention. Therefore, the embodiment disclosed herein is intended to illustrate the scope of the technical idea of the present invention, and the spirit and scope of the present invention are not limited by the embodiments. The scope of the present invention shall be construed on the basis of the accompanying claims, and it shall be construed that all of the technical ideas included within the scope equivalent to the claims belong to the present invention.

What is claimed is:

1. An organic electric element, comprising:

a first electrode;

a second electrode; and an organic material layer between the first electrode and the second electrode, the organic material layer comprising:

a light-emitting layer;

a hole transport layer between the first electrode and the light-emitting layer; and a plurality of emission-auxiliary layers between the light-emitting layer and the hole transport layer, wherein the plurality of emission-auxiliary layers comprise a first emission-auxiliary layer adjacent to the hole transport layer and a second emission-auxiliary layer adjacent to the light-emitting layer, each of the first emission-auxiliary layer and the second emission-auxiliary layer is independently formed of one type of a compound without additional doping, a highest occupied molecular orbital (HOMO) energy level of the plurality of emission-auxiliary layers is lower than a HOMO energy level of the hole transport layer and is higher than the HOMO energy level of the light-emitting layer, a HOMO energy level of the first emission-auxiliary layer is higher than the HOMO energy level of the second emission-auxiliary layer, wherein the first emission-auxiliary layer and the second emission-auxiliary layer are formed of different compounds, wherein the first emission-auxiliary layer comprises a compound represented by the following Formula 1 or Formula 2, and the second emission-auxiliary layer comprises a compound represented by Formula A-1, Formula A-2 or Formula 2:

<Formula 1>

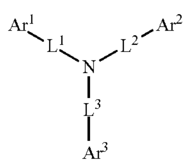

<Formula 2>

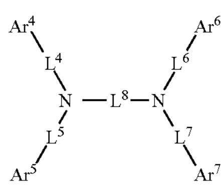

<Formula A-1>

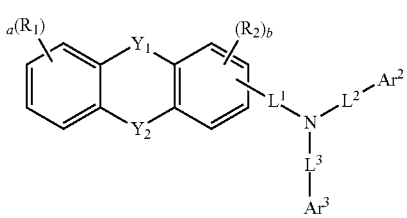

<Formula A-2>

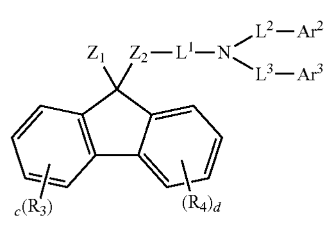

wherein $Ar^1$ to $Ar^7$ are each independently selected from the group consisting of a $C_6$-$C_{60}$ aryl group, a fluorenyl group, a $C_2$-$C_{60}$ heterocyclic group comprising at least one heteroatom selected from the group consisting of O, N, S, Si and P, and a $C_3$-$C_{60}$ aliphatic ring, $Ar^4$ and $Ar^5$ may be linked to each other to form a ring, and $Ar^6$ and $Ar^7$ may be linked to each other to form a ring, $L^1$ to $L^7$ are each independently selected from the group consisting of a single bond, a $C_6$-$C_{60}$ arylene group, a fluorenylene group, a $C_3$-$C_{60}$ aliphatic ring, and a $C_2$-$C_{60}$ heterocyclic group comprising at least one heteroatom selected from the group consisting of O, N, S, Si and P, $L^8$ is selected from the group consisting of a $C_6$-$C_{60}$ arylene group, a fluorenylene group, a $C_3$-$C_{60}$ aliphatic ring, and a $C_2$-$C_{60}$ heterocyclic group comprising at least one heteroatom selected from the group consisting of O, N, S, Si and P, with a proviso that at least one of $Ar^4$ to $Ar^7$ and $L^8$ comprises the heterocyclic group or at least two of $Ar^4$ to $Ar^7$ comprise the fluorenyl group in Formula 2, $Y_1$ and $Y_2$ are O, S or $C(R_5)(R_6)$, $R_1$ to $R_6$, and $Z_1$ are each independently selected from the group consisting of deuterium, halogen, a silane group unsubstituted or substituted with a $C_1$-$C_{20}$ alkyl group or a $C_6$-$C_{20}$ aryl group, a siloxane group, a cyano group, a nitro group, a $C_1$-$C_{20}$ alkylthio group, a $C_1$-$C_{20}$ alkoxy group, a $C_6$-$C_{20}$ aryloxy group, a $C_6$-$C_{20}$ arylthio, a $C_1$-$C_{20}$ alkyl group, a $C_2$-$C_{20}$ alkenyl group, a $C_2$-$C_{20}$ alkynyl group, a $C_6$-$C_{20}$ aryl group, a fluorenyl group, a $C_2$-$C_{20}$ heterocyclic group containing at least one heteroatom of O, N, S, Si, and P, a $C_3$-$C_{20}$ aliphatic ring group, and $-L'-N(R_a)(R_b)$, and adjacent groups may be linked to each other to form a ring, $R_5$ and $R_6$ may be linked to each other to form a ring, and $Z_1$ and $Z_2$ may be linked to each other to form a ring, $Z_2$ is selected from the group consisting of a $C_6$-$C_{20}$ arylene group, a fluorenylene group, a $C_2$-$C_{20}$ heterocyclic group containing at least one heteroatom of O, N, S, Si, and P, and a $C_3$-$C_{20}$ aliphatic ring group, a, c and d are each an integer of 0 to 4, b is an integer of 0 to 3, and when each of these is an integer of 2 or more, a plurality of $R_1$ may be the same as or different from each other, a plurality of $R_2$ may be the same as or different from each other, and a plurality of $R_3$ may be the same as or different from each other, L' is selected from the group consisting of a single bond, a $C_6$-$C_{20}$ arylene group, a fluorenylene group, a $C_3$-$C_{20}$ aliphatic ring, and a $C_2$-$C_{20}$ heterocyclic group comprising at least one heteroatom selected from the group consisting of O, N, S, Si and P, and $R_a$ and $R_b$ are each independently selected from the group consisting of a $C_6$-$C_{20}$ aryl group, a fluorenyl group, a $C_3$-$C_{20}$ aliphatic ring, and a $C_2$-$C_{20}$ heterocyclic group comprising at least one heteroatom selected from the group consisting of O, N, S, Si and P in Formula 1 and Formula 2, the aryl group, arylene group, fluorenyl group, fluorenylene group, heterocyclic group, aliphatic ring group, the ring formed by linking $Ar^4$ and $Ar^5$ to each other and the ring formed by linking $Ar^6$ and $Ar^7$ to each other may be each optionally substituted with one or more substituents selected from the group consisting of deuterium, halogen, a silane group unsubstituted or substituted with a $C_1$-$C_{20}$ alkyl group or a $C_6$-$C_{20}$ aryl group, a siloxane group, a cyano group, a nitro group, a $C_1$-$C_{20}$ alkylthio group, a $C_1$-$C_{20}$ alkoxy group, a $C_6$-$C_{20}$ aryloxy group, a $C_6$-$C_{20}$ arylthio, a $C_1$-$C_{20}$ alkyl group, a $C_2$-$C_{20}$ alkenyl group, a $C_2$-$C_{20}$ alkynyl group, a $C_6$-$C_{20}$ aryl group, a fluorenyl group, a $C_2$-$C_{20}$ heterocyclic group containing at least one heteroatom of O, N, S, Si, and P, and a $C_3$-$C_{20}$ aliphatic ring group, in Formula A-1 and A-2, the aryl group, arylene group, fluorenyl group, fluorenylene group, heterocyclic group, aliphatic ring group, alkyl group, alkenyl group, alkynyl group, alkoxy group, aryloxy group, the ring formed by linking adjacent groups to each other, the ring formed by linking $R_5$ and $R_6$ to each other, and the ring formed by linking $Z_1$ and $Z_2$ to each other may be each optionally substituted with one or more substituents selected from the group consisting of deuterium, halogen, a cyano group, a nitro group, a $C_1$-$C_{20}$ alkoxy group, a $C_6$-$C_{20}$ aryloxy group, a $C_1$-$C_{20}$ alkyl group, a $C_2$-$C_{20}$ alkenyl group, a $C_2$-$C_{20}$ alkynyl group, a $C_6$-$C_{20}$ aryl group, a fluorenyl group, a $C_2$-$C_{20}$ heterocyclic group containing at least one heteroatom of O, N, S, Si, and P, and a $C_3$-$C_{20}$ aliphatic ring group.

2. The organic electric element of claim 1, wherein the thickness of the first emission-auxiliary layer is 200 to 400 Å, the thickness of the second emission-auxiliary layer is 50 to 200 Å, and the total thickness of the plurality of emission-auxiliary layers is 300 to 400 Å.

3. The organic electric element of claim 1, wherein the HOMO energy level of the first emission-auxiliary layer is 0.01 to 0.5 eV higher than the HOMO energy level of the second auxiliary layer.

4. The organic electric element of claim 1, wherein the HOMO energy levels of the first and the second emission-auxiliary layer are respectively in the range of 5.50 to 5.69 eV based on absolute values, with a proviso that the HOMO energy level of the first emission-auxiliary layer is higher than the HOMO energy level of the second emission-auxiliary layer.

5. The organic electric element of claim 1, wherein the compound represented by Formula 1 of the first emission-auxiliary layer is represented by Formula A-1 or Formula A-2:

<Formula A-1>

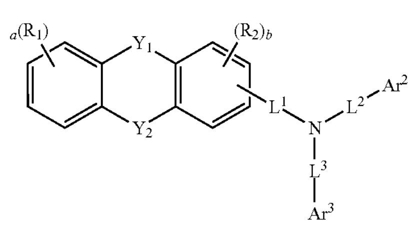

-continued

<Formula A-2>

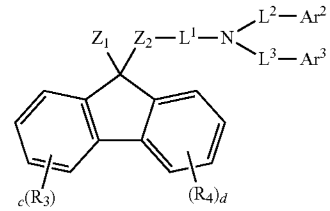

wherein, in Formula A-1 and Formula A-2 of the first emission-auxiliary layer:

$L^1$ to $L^3$, $Ar^2$, $Ar^3$ are the same as defined in claim 1, $Y_1$ and $Y_2$ are a single bond, O, S or $C(R_5)(R_6)$, and a case when both $Y_1$ and $Y_2$ are a single bond is excluded, $R_1$ to $R_6$, and $Z_1$ are each independently selected from the group consisting of deuterium, halogen, a silane group unsubstituted or substituted with a $C_1$-$C_{20}$ alkyl group or a $C_6$-$C_{20}$ aryl group, a siloxane group, a cyano group, a nitro group, a $C_1$-$C_{20}$ alkylthio group, a $C_1$-$C_{20}$ alkoxy group, a $C_6$-$C_{20}$ aryloxy group, a $C_6$-$C_{20}$ arylthio, a $C_1$-$C_{20}$ alkyl group, a $C_2$-$C_{20}$ alkenyl group, a $C_2$-$C_{20}$ alkynyl group, a $C_6$-$C_{20}$ aryl group, a fluorenyl group, a $C_2$-$C_{20}$ heterocyclic group containing at least one heteroatom of O, N, S, Si, and P, a $C_3$-$C_{20}$ aliphatic ring group, and -L'-N($R_a$)($R_b$), and adjacent groups may be linked to each other to form a ring, $R_5$ and $R_6$ may be linked to each other to form a ring, and $Z_1$ and $Z_2$ may be linked to each other to form a ring, $Z_2$ is selected from the group consisting of a $C_6$-$C_{20}$ arylene group, a fluorenylene group, a $C_2$-$C_{20}$ heterocyclic group containing at least one heteroatom of O, N, S, Si, and P, and a $C_3$-$C_{20}$ aliphatic ring group, a, c and d are each an integer of 0 to 4, b is an integer of 0 to 3, and when each of these is an integer of 2 or more, a plurality of $R_1$ are the same or different from each other, a plurality of $R_2$ are the same or different from each other, a plurality of $R_3$ are the same or different from each other, and a plurality of $R_4$ are the same or different from each other, in Formula A-1 and Formula A-2 of the first emission-auxiliary layer, the aryl group, arylene group, fluorenyl group, fluorenylene group, heterocyclic group, aliphatic ring group, alkyl group, alkenyl group, alkynyl group, alkoxy group, aryloxy group, the ring formed by linking adjacent groups to each other, the ring formed by linking $R_5$ and $R_6$ to each other, and the ring formed by linking $Z_1$ and $Z_2$ to each other may be each optionally substituted with one or more substituents selected from the group consisting of deuterium, halogen, a cyano group, a nitro group, a $C_1$-$C_{20}$ alkoxy group, a $C_6$-$C_{20}$ aryloxy group, a $C_1$-$C_{20}$ alkyl group, a $C_2$-$C_{20}$ alkenyl group, a $C_2$-$C_{20}$ alkynyl group, a $C_6$-$C_{20}$ aryl group, a fluorenyl group, a $C_2$-$C_{20}$ heterocyclic group containing at least one heteroatom of O, N, S, Si, and P, and a $C_3$-$C_{20}$ aliphatic ring group, and L', $R_a$ and $R_b$ are the same as defined in claim 1.

6. The organic electric element of claim 5, wherein Formula A-1 of the first emission-auxiliary layer and the second emission-auxiliary layer is represented by Formula A-3:

<Formula A-5>

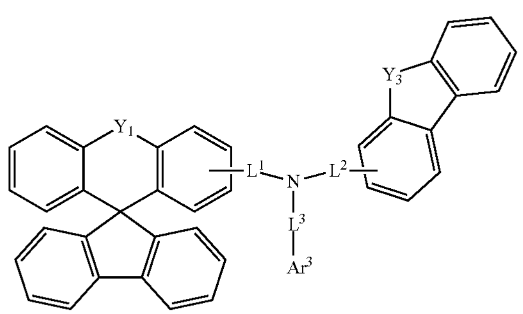

<Formula A-6>

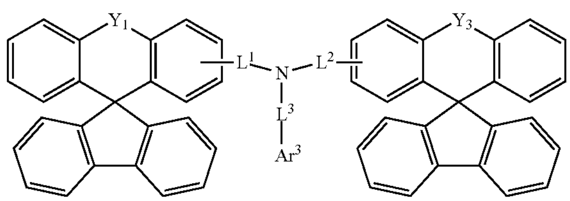

wherein:

$R_{1'}$ and $R_{2'}$ are each independently selected from the group consisting of deuterium, halogen, a cyano group, a nitro group, a $C_1$-$C_{20}$ alkoxy group, a $C_6$-$C_{20}$ aryloxy group, a $C_1$-$C_{20}$ alkyl group, a $C_2$-$C_{20}$ alkenyl group, a $C_2$-$C_{20}$ alkynyl group, a $C_6$-$C_{20}$ aryl group, a fluorenyl group, a $C_2$-$C_{20}$ heterocyclic group containing at least one heteroatom of O, N, S, Si, and P, a $C_3$-$C_{20}$ aliphatic ring group, and -L'-N($R_a$)($R_b$), m is an integer of 0 to 4, n is an integer of 0 to 3, and when each of these is an integer of 2 or more, each of $R_{1'}$s, each of $R_{2'}$s is the same or different from each other, and $Y_1$, $L^1$ to $L^3$, $Ar^2$, $Ar^3$, $R_1$, $R_2$, a, b, L', $R_a$ and $R_b$ are the same as defined in claim 5.

7. The organic electric element of claim 5, wherein Formula A-1 of the first emission-auxiliary layer and the second emission-auxiliary layer is represented by Formula A-5 or Formula A-6:

<Formula A-5>

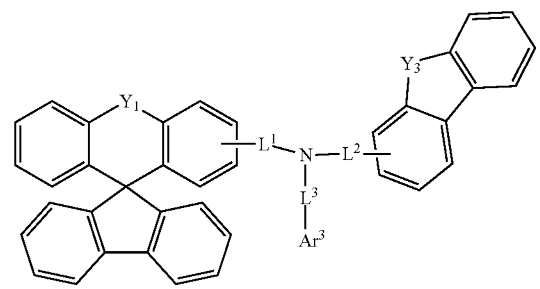

<Formula A-6>

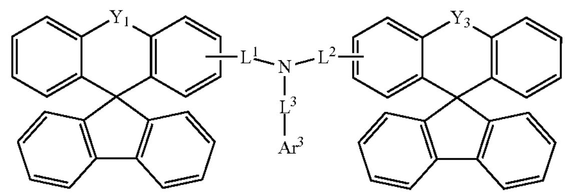

wherein $Y_1$, $L^1$ to $L^3$, $Ar^3$ are the same as defined in claim 5 and $Y_3$ is defined the same as $Y_1$.

8. The organic electric element of claim 1, wherein Formula 2 of the first and second emission auxiliary layers is represented by Formula B-1:

<Formula B-1>

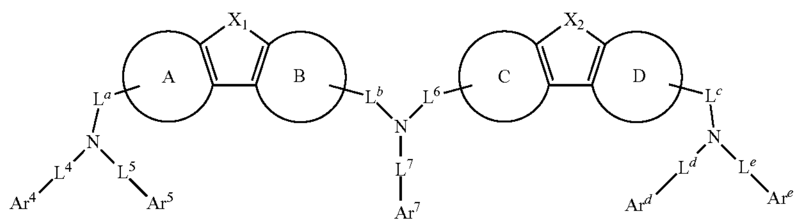

wherein, $L^4$ to $L^7$, $Ar^4$, $Ar^5$, $Ar^7$ are the same as defined in claim 1, A ring, B ring, C ring and D ring are each independently selected from the group consisting of a $C_6$-$C_{20}$ aromatic ring group, a fluorene group, a $C_2$-$C_{20}$ heterocyclic group containing at least one heteroatom of O, N, S, Si and P, and a $C_3$-$C_{20}$ aliphatic ring, and each of these may be substituted with one or more R, $X_1$ and $X_2$ are each independently O, S, N(Ar) or C($R_7$)($R_8$), $L^a$ to $L^e$ are each independently selected from the group consisting of a single bond, a $C_6$-$C_{20}$ arylene group, a fluorenylene group, a $C_2$-$C_{20}$ heterocyclic group comprising at least one heteroatom selected from the group consisting of O, N, S, Si and P, and a $C_3$-$C_{20}$ aliphatic ring, $Ar^d$, $Ar^e$ and Ar are each independently selected from the group consisting of a $C_6$-$C_{20}$ aryl group, a fluorenyl group, a $C_2$-$C_{20}$ heterocyclic group comprising at least one heteroatom selected from the group consisting of O, N, S, Si and P, a $C_3$-$C_{20}$ aliphatic ring, R, $R_7$ and $R_8$ are each independently selected from the group consisting of hydrogen, deuterium, halogen, a cyano group, a nitro group, a $C_1$-$C_{20}$ alkoxy group, a $C_6$-$C_{20}$ aryloxy group, a $C_1$-$C_{20}$ alkyl group, a $C_2$-$C_{20}$ alkenyl group, a $C_2$-$C_{20}$ alkynyl group, a $C_6$-$C_{20}$ aryl group, a fluorenyl group, a $C_2$-$C_{20}$ heterocyclic group containing at least one heteroatom of O, N, S, Si, and P, and a $C_3$-$C_{20}$ aliphatic ring group, and $R_7$ and $R_8$ may be linked to each other to form a ring, the aryl group, arylene group, fluorenyl group, fluorenylene group, heterocyclic group, aliphatic ring group, alkyl group, alkenyl group, alkynyl group, alkoxy group, aryloxy group, the ring formed by linking $R_7$ and $R_8$ to each other may be each optionally substituted with one or more substituents selected from the group consisting of deuterium, halogen, a cyano group, a nitro group, a $C_1$-$C_{20}$ alkoxy group, a $C_6$-$C_{20}$ aryloxy group, a $C_1$-$C_{20}$ alkyl group, a $C_2$-$C_{20}$ alkenyl group, a $C_2$-$C_{20}$ alkynyl group, a $C_6$-$C_{20}$ aryl group, a fluorenyl group, a $C_2$-$C_{20}$ heterocyclic group containing at least one heteroatom of O, N, S, Si, and P, and a $C_3$-$C_{20}$ aliphatic ring group, and L', $R_a$ and $R_b$ are the same as defined in claim 1.

9. The organic electric element of claim 8, wherein Formula B-1 is represented by Formula B-2:

<Formula B-2>

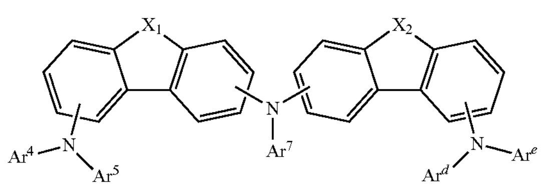

wherein $Ar^4$, $Ar^5$, $Ar^7$, $Ar^d$, $Ar^e$, $X_1$ and $X_2$ are the same as defined in claim 8.

10. The organic electric element of claim 8, wherein Formula B-1 is represented by one of the following Formula B-3 to Formula B-6:

<Formula B-3>

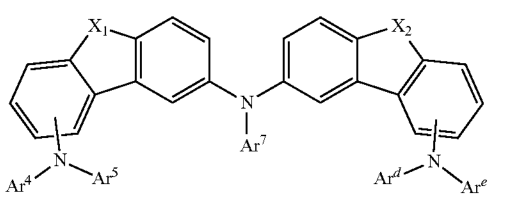

<Formula B-4>

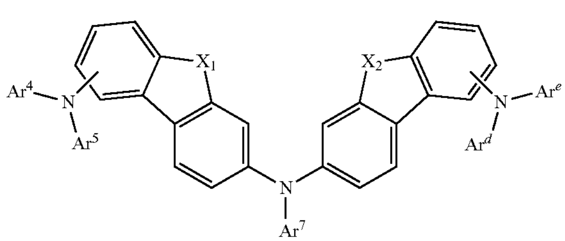

-continued

<Formula B-5>

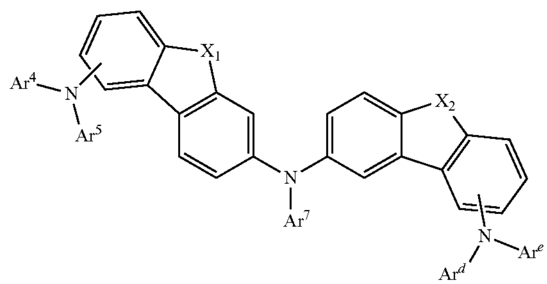

<Formula B-6>

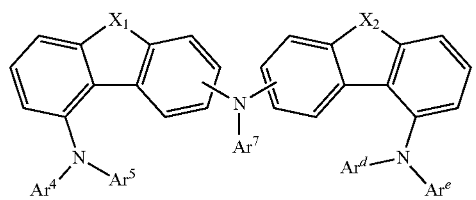

wherein $Ar^4$, $Ar^5$, $Ar^7$, $Ar^d$, $Ar^e$, $X_1$ and $X_2$ are the same as defined in claim 8.

11. The organic electric element of claim 5, wherein the compound represented by Formula 1 of the first emission-auxiliary layer is represented by Formula A-1.

12. The organic electric element of claim 1, wherein the compound represented by Formula 1 of the first emission-auxiliary layer is one of the following compounds:

1-1

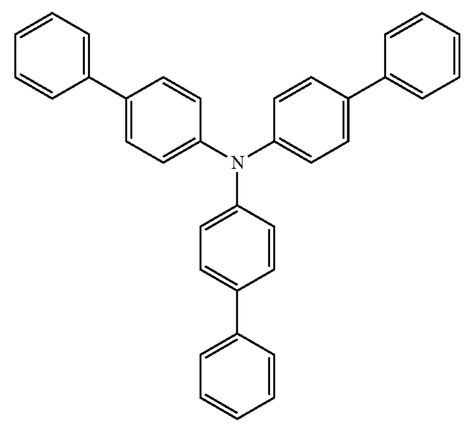

1-2

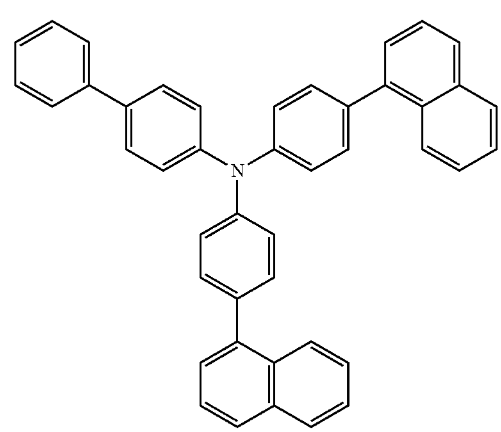

-continued
1-3
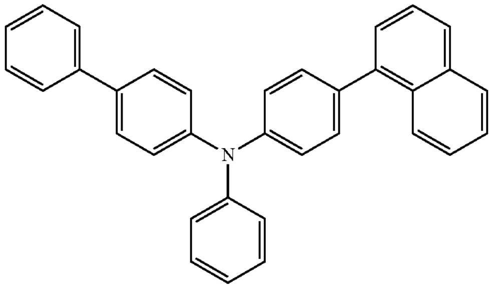
1-4
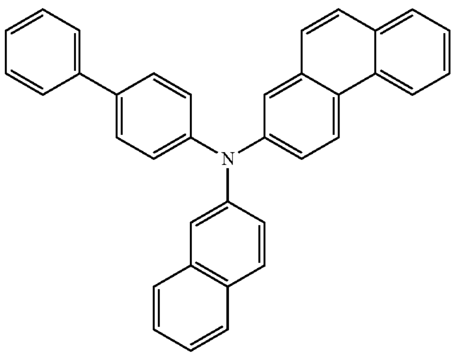
1-5
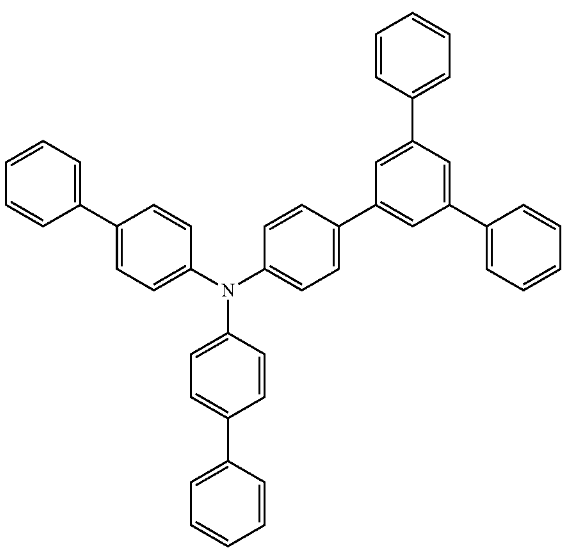
1-6
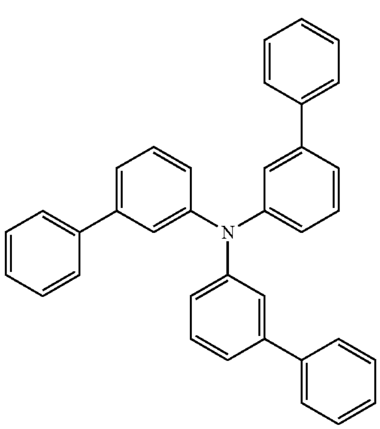
-continued
1-7
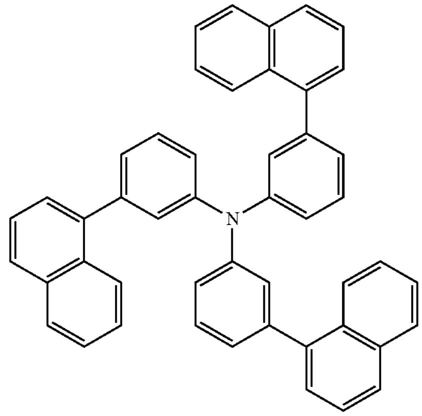
1-8
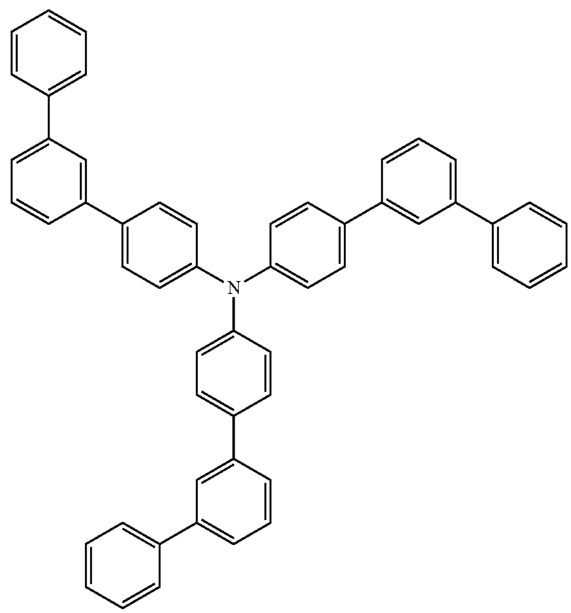
1-9
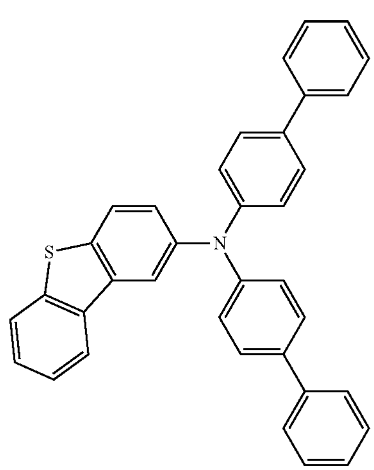

-continued
1-10
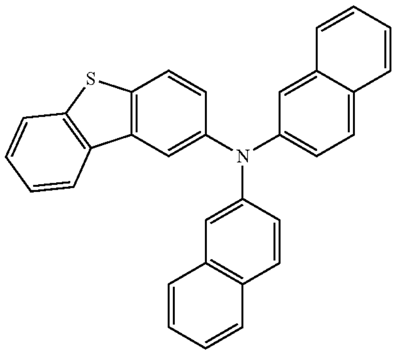
1-11
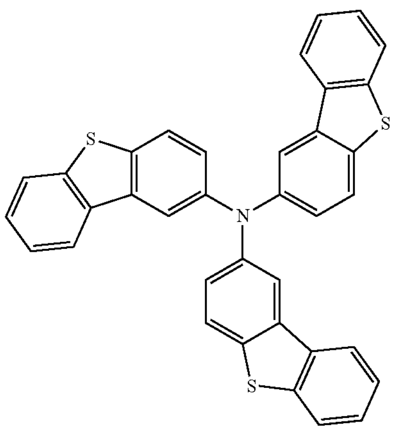
1-12
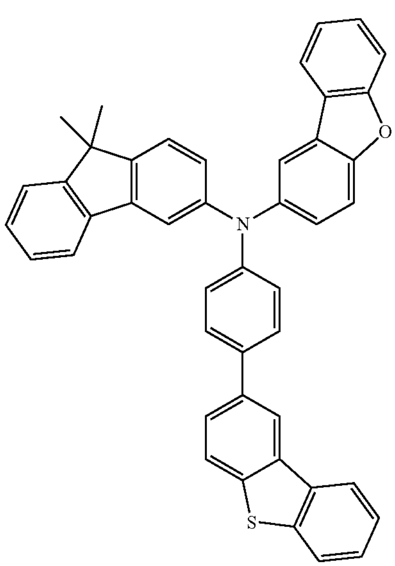
-continued
1-13
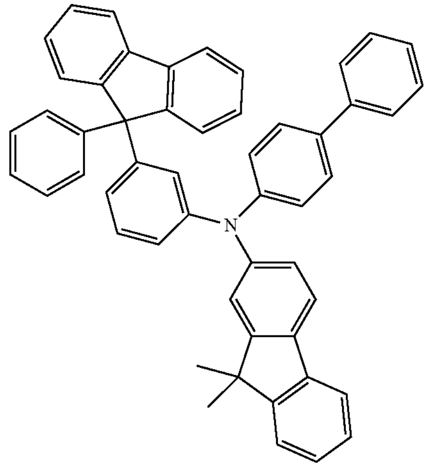
1-14
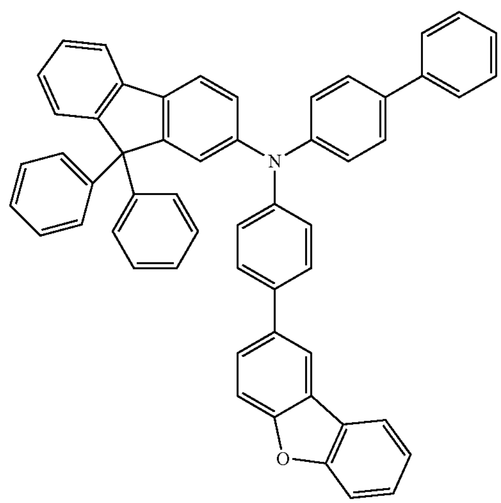
1-15
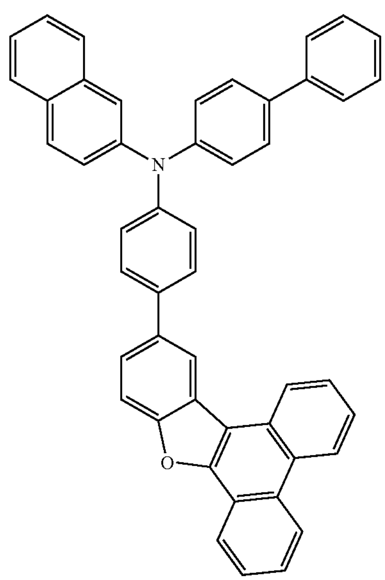

-continued
1-16
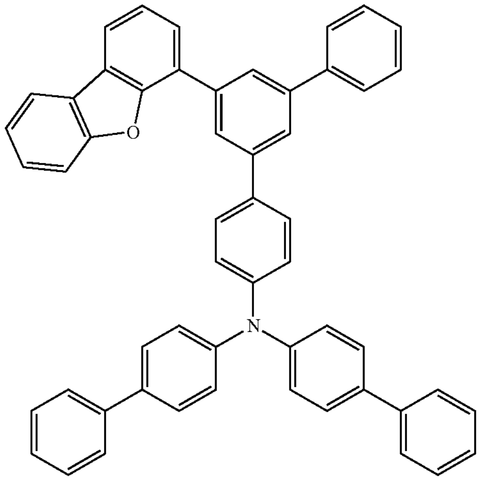
1-17
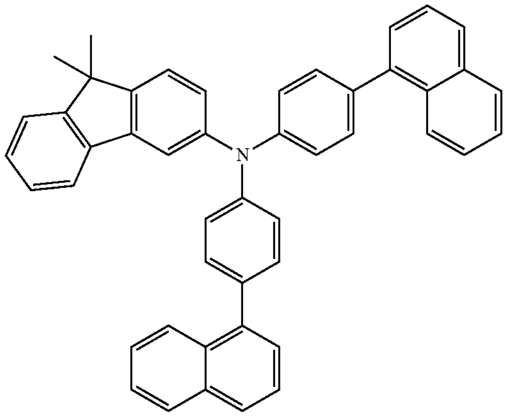
1-18
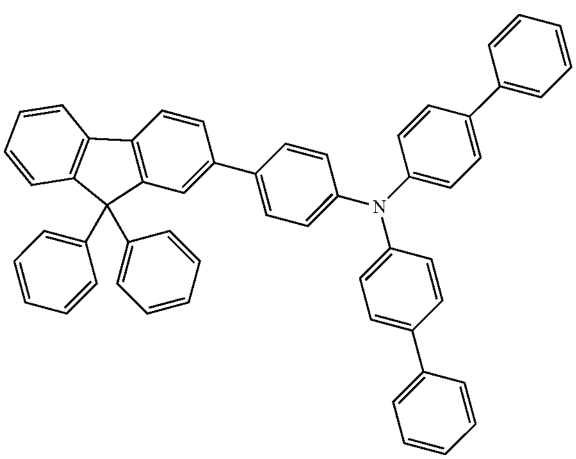
-continued
1-19
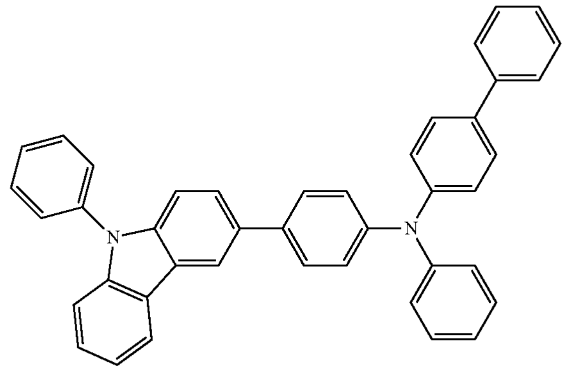
1-20
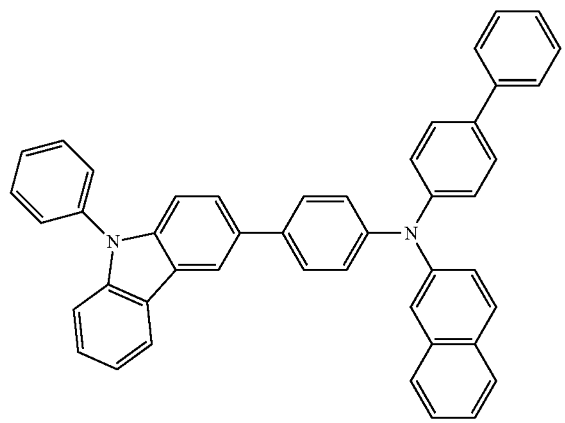
1-21
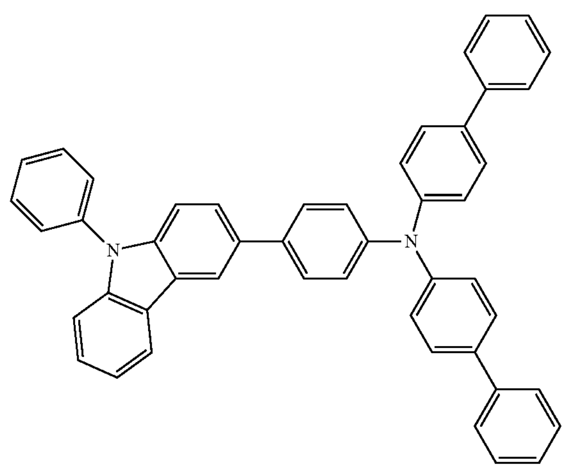

-continued
1-22
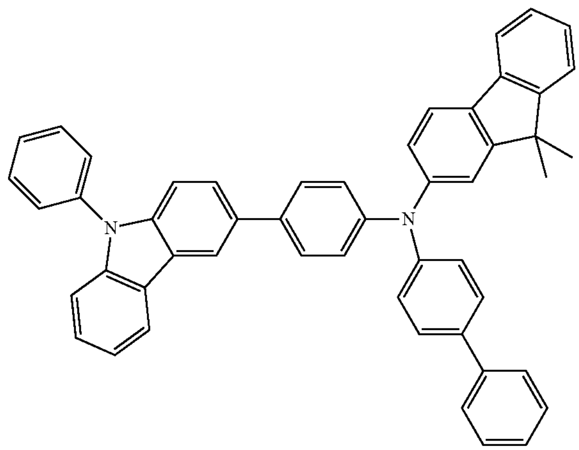
1-23
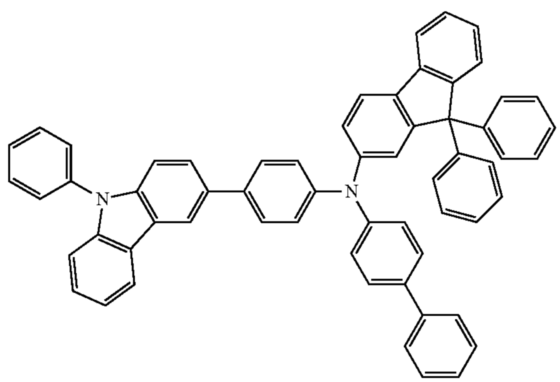
1-24
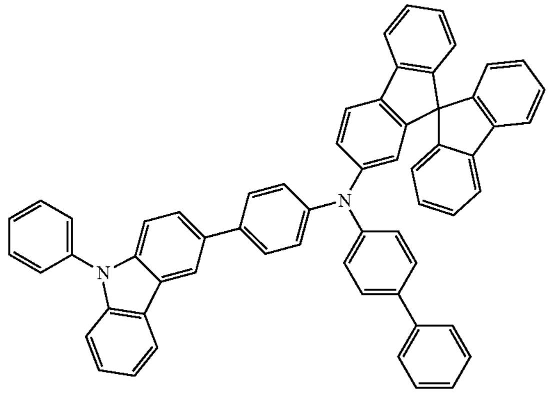
-continued
1-25
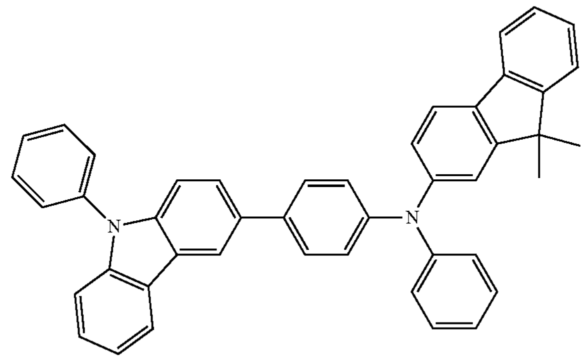
1-26
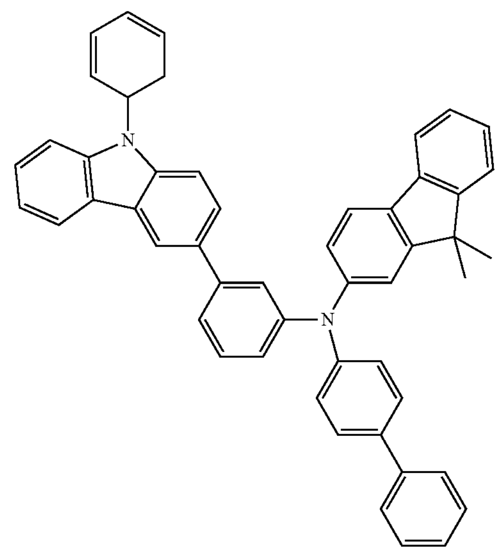
1-27
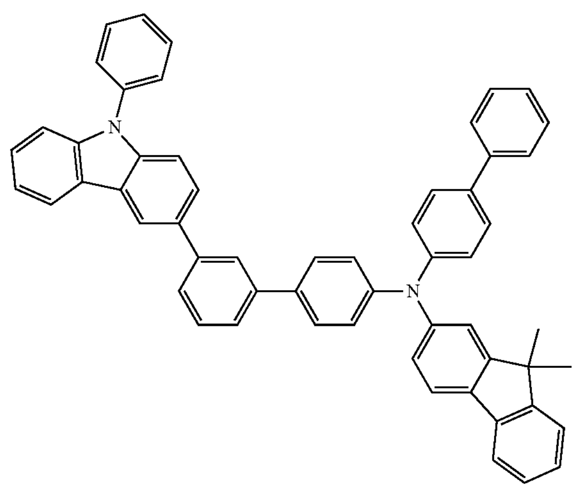

-continued
1-28
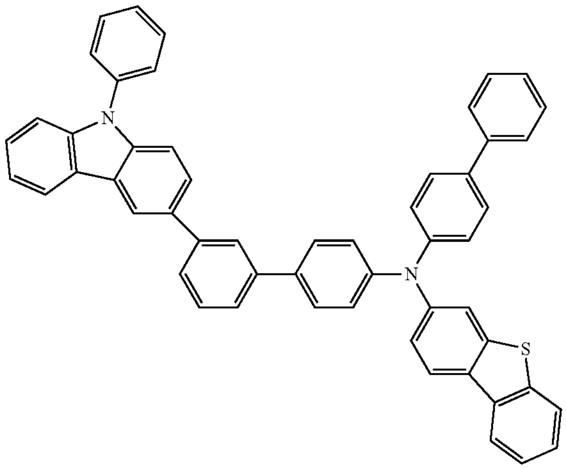
1-29
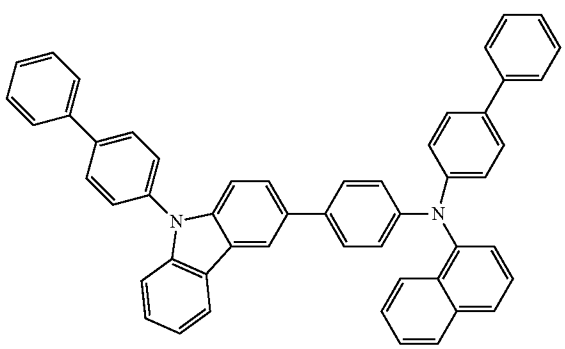
1-30
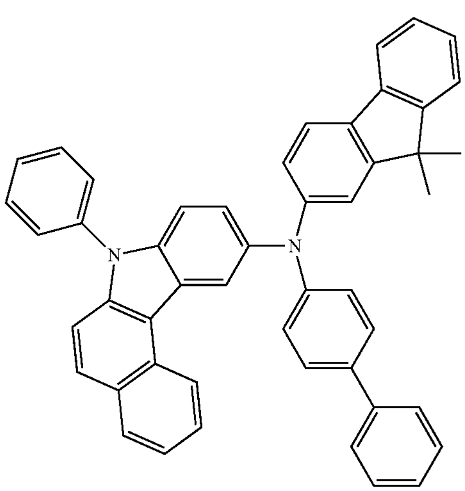
-continued
1-31
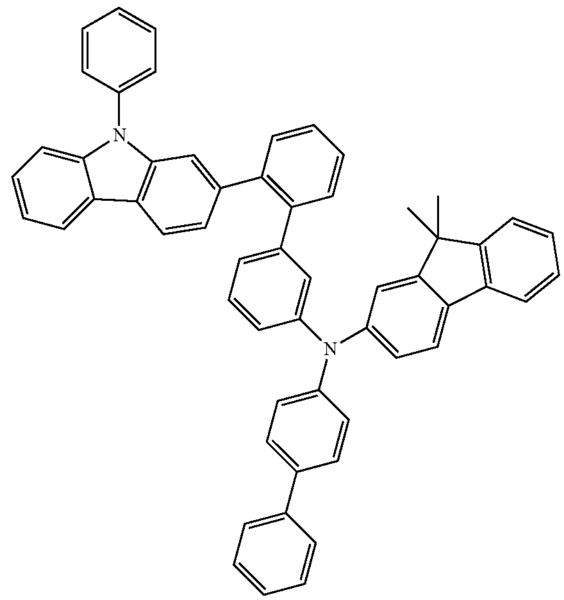
1-32
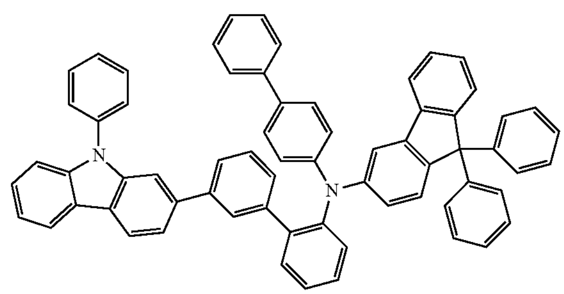
1-33
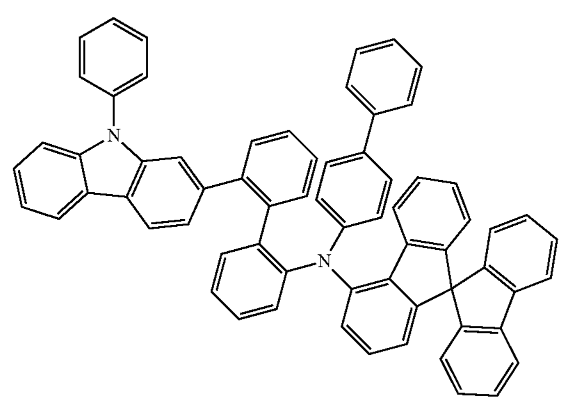

-continued
1-34
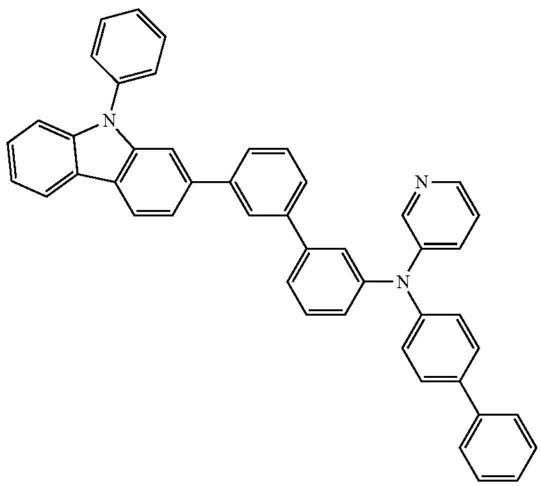
1-35
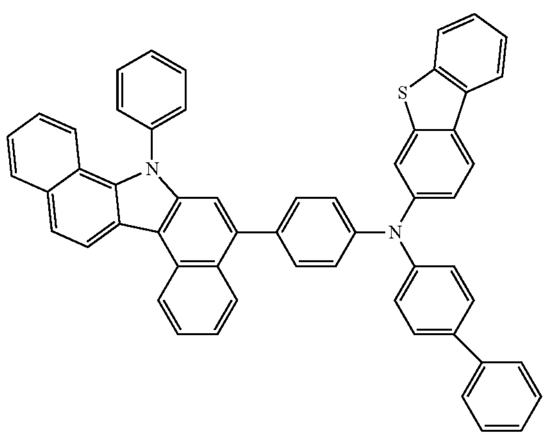
1-36
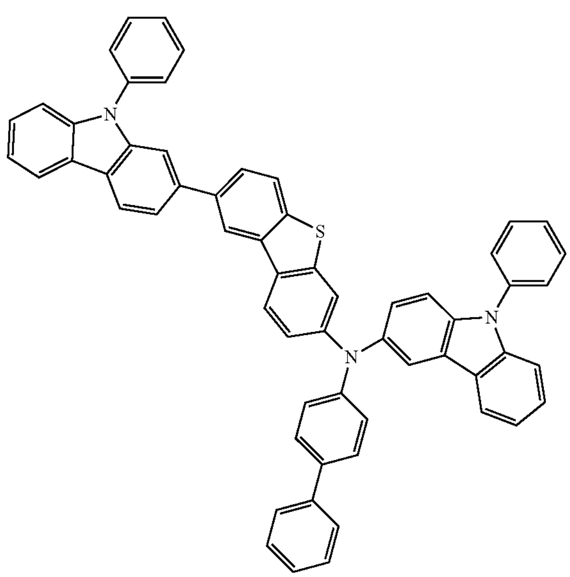
-continued
1-37
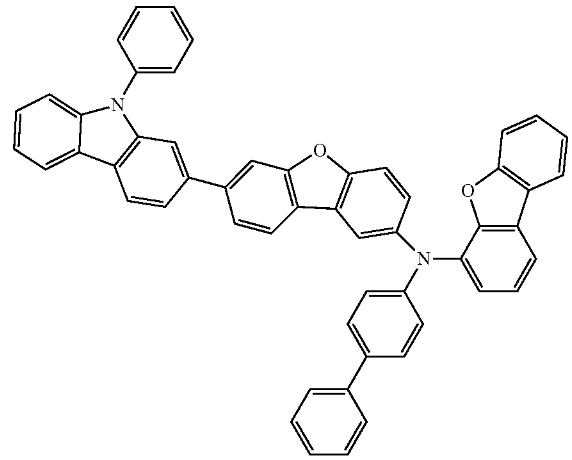
1-38
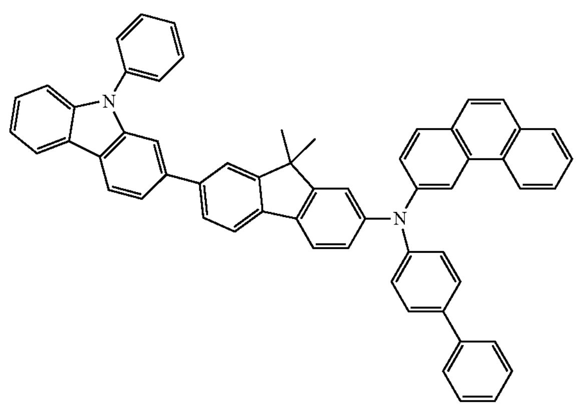
1-39
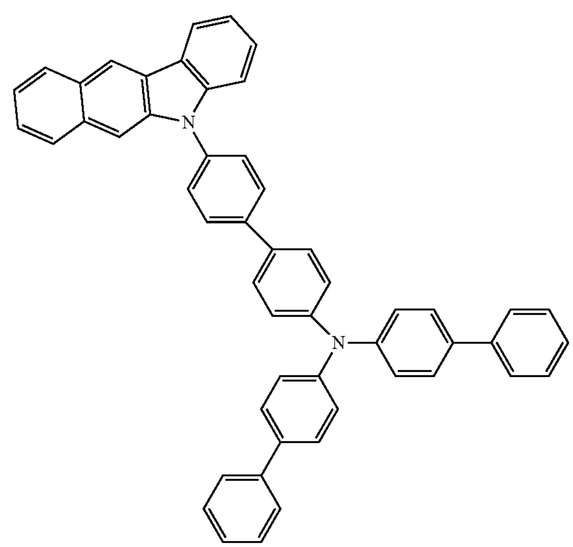

-continued
1-40
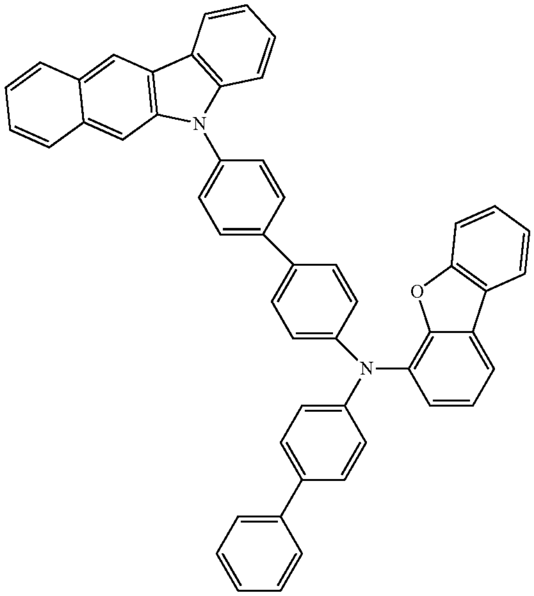
1-41
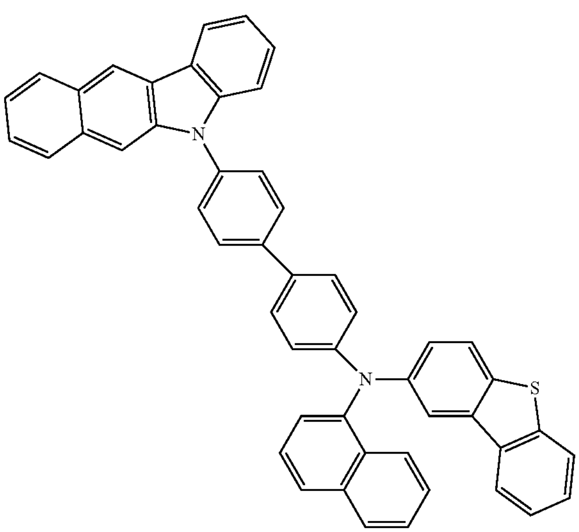
-continued
1-42
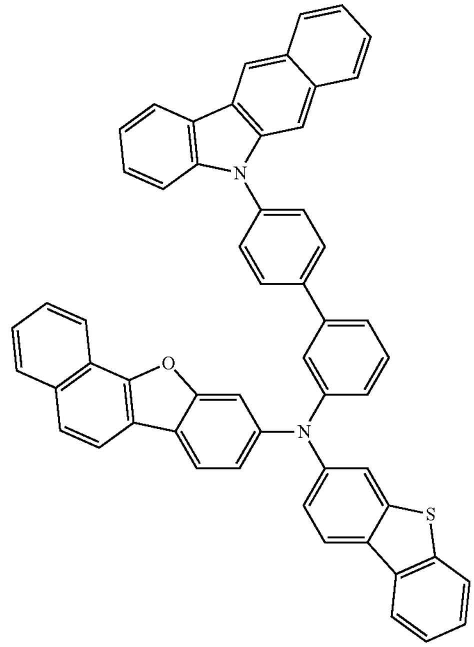
1-43
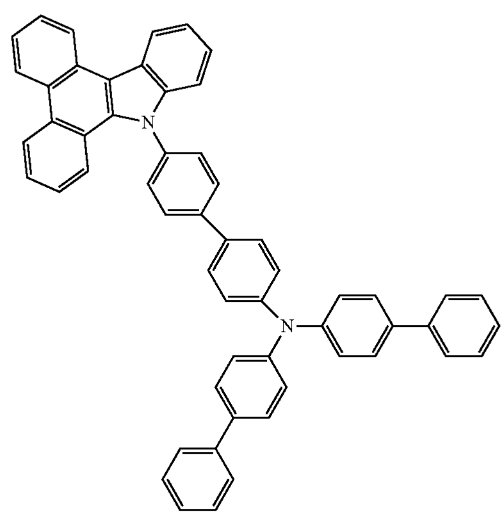

-continued
1-44
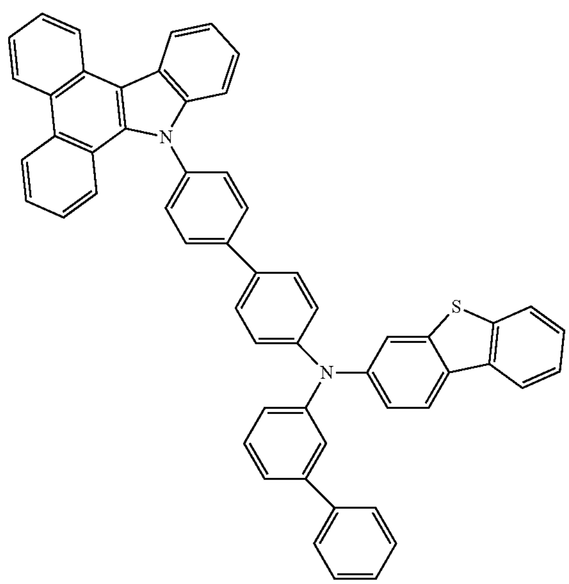
1-45
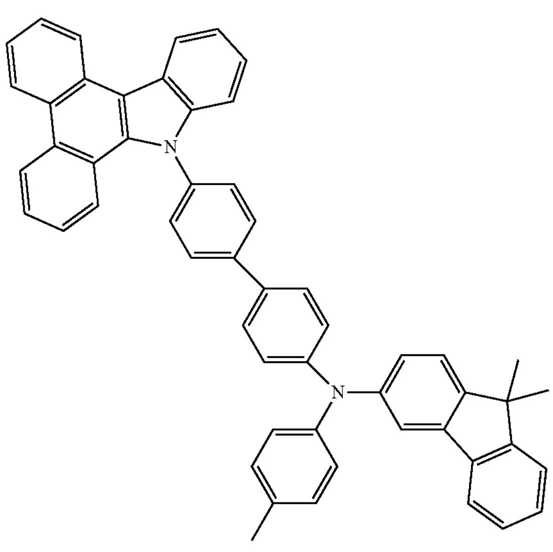
-continued
1-46
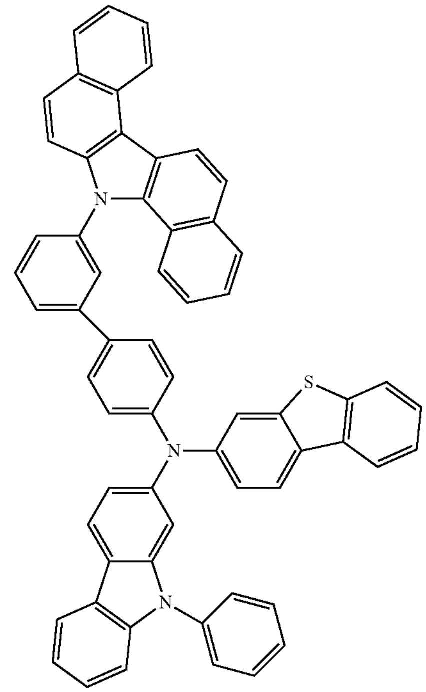
1-47
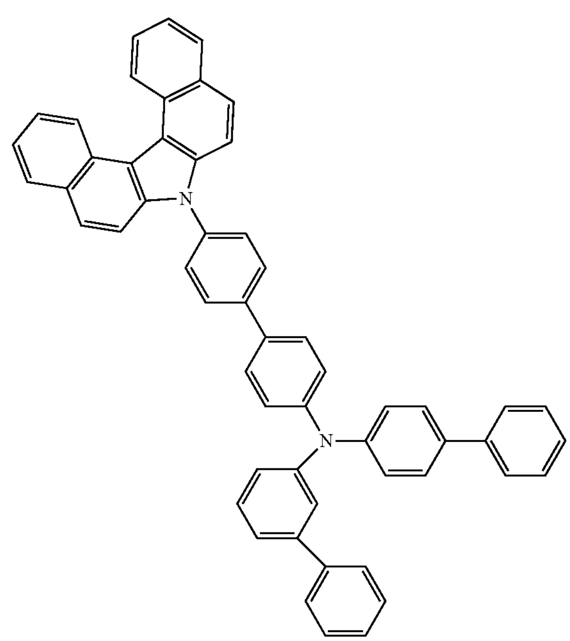

-continued
1-48
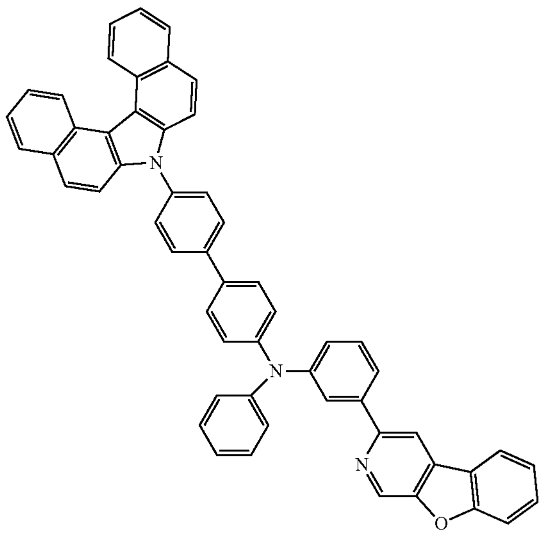
1-49
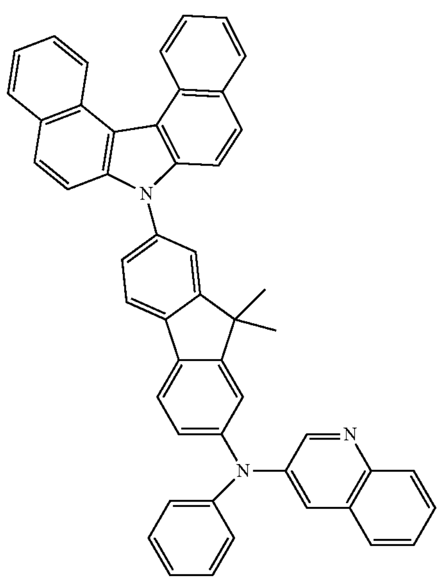
-continued
1-50
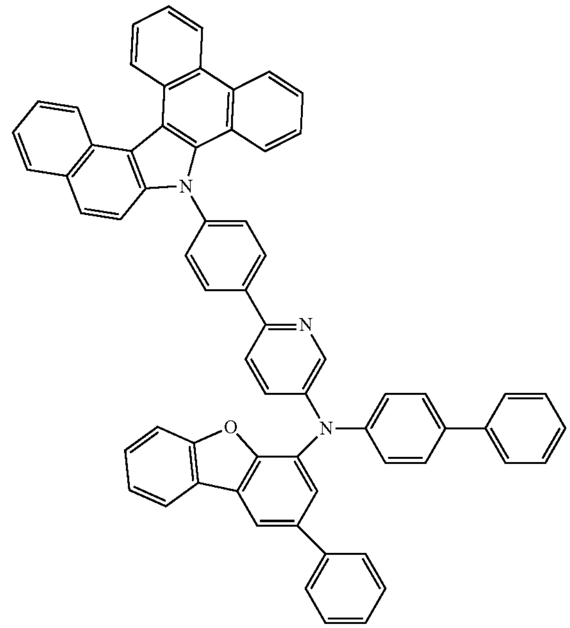
1-51
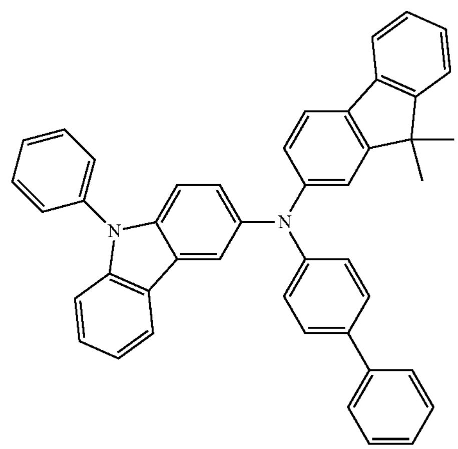
1-52
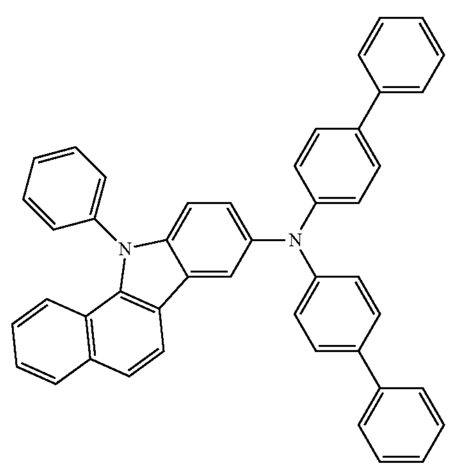

-continued
1-53
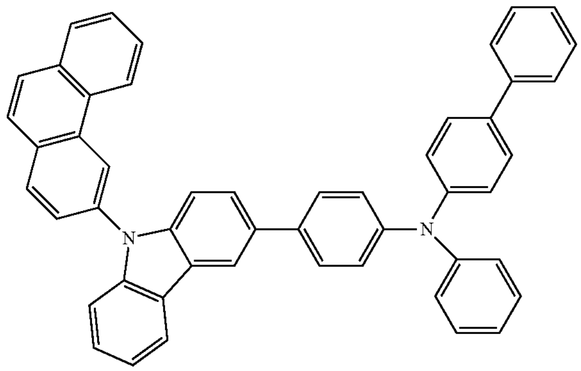
1-54
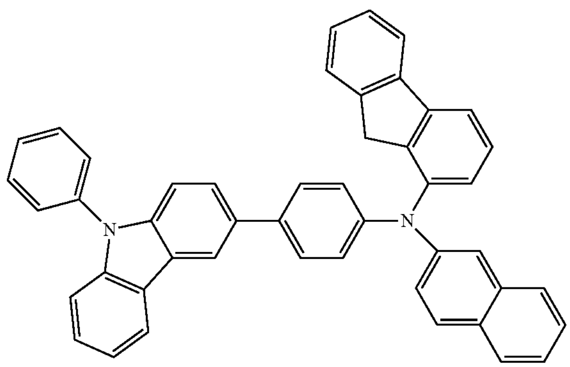
1-55
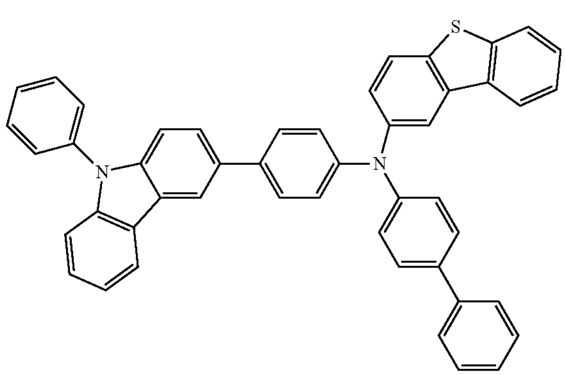
-continued
1-56
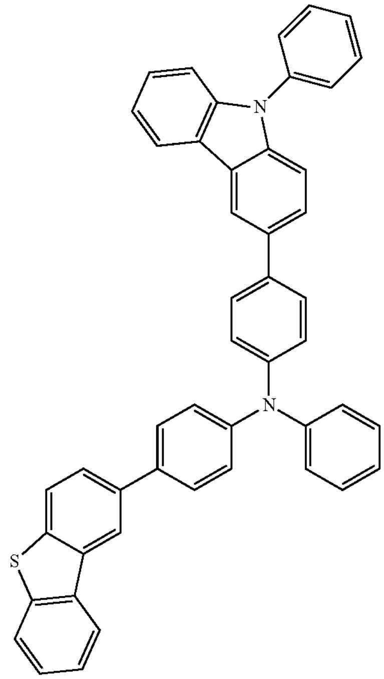
1-57
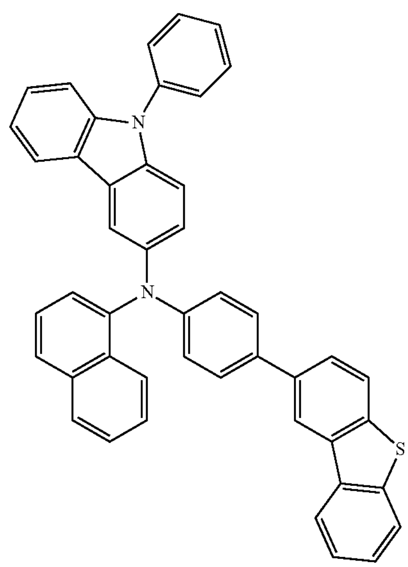

-continued
1-58
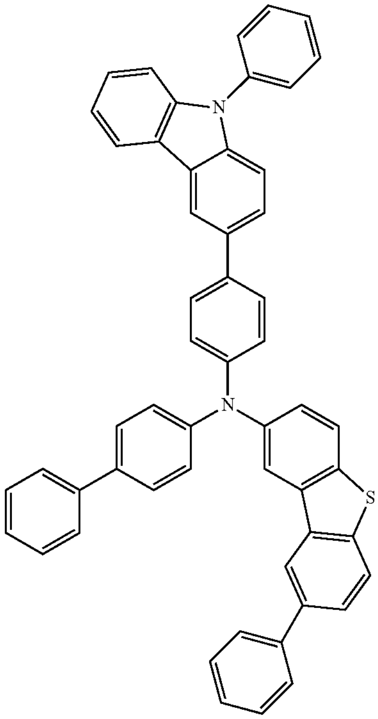
1-59
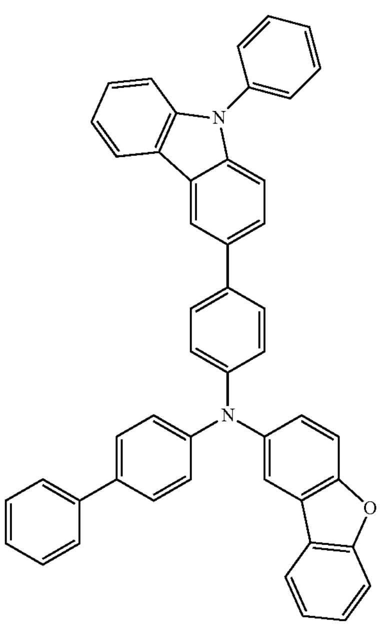
-continued
1-60
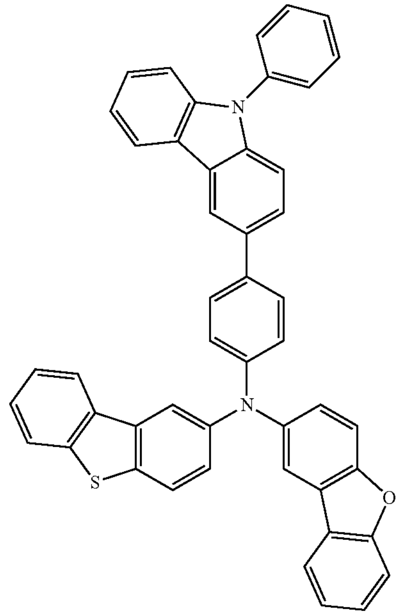
1-61
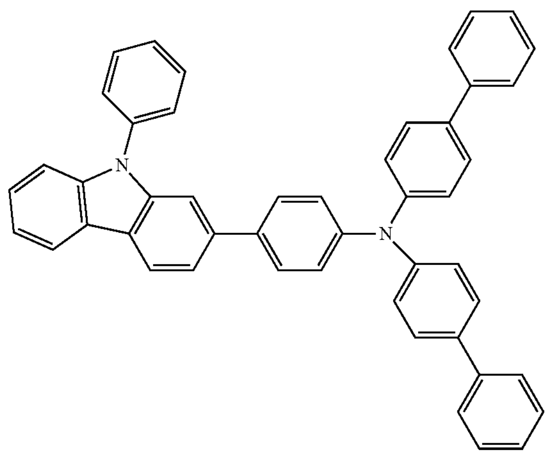
1-62
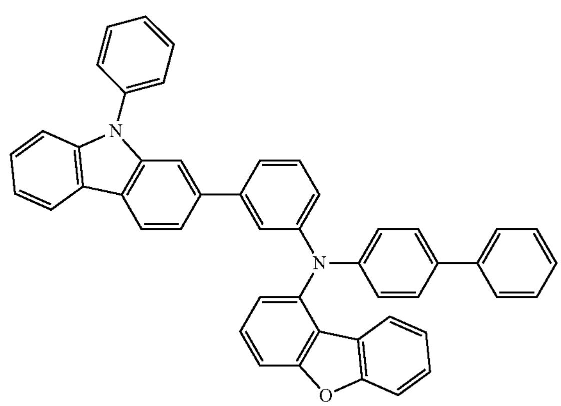

1-63
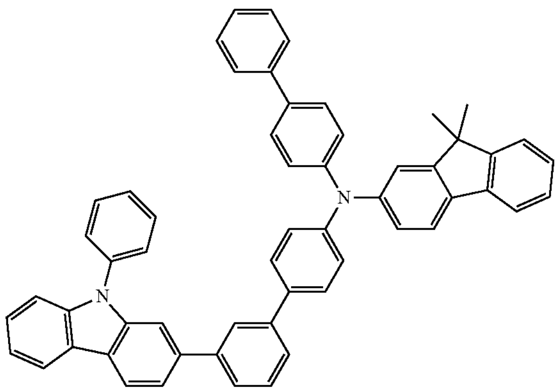
1-64
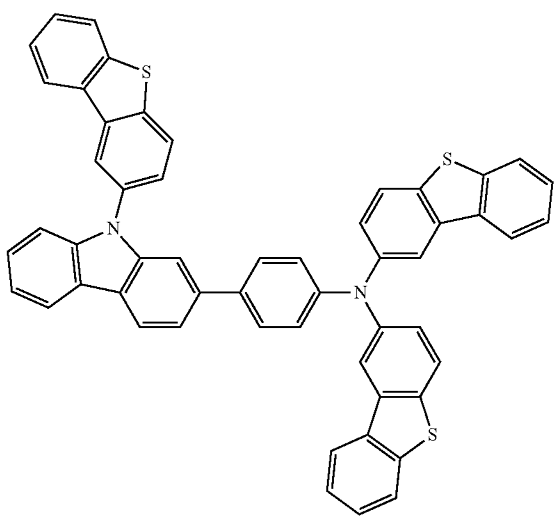
1-65
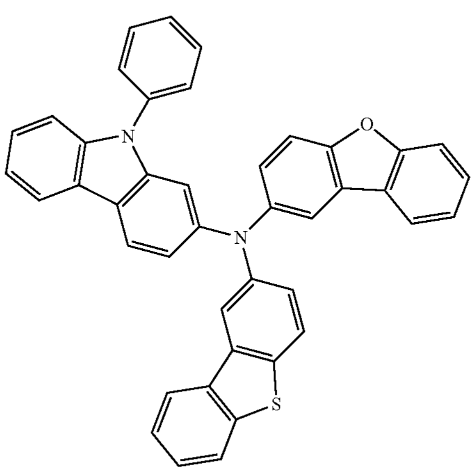
1-66
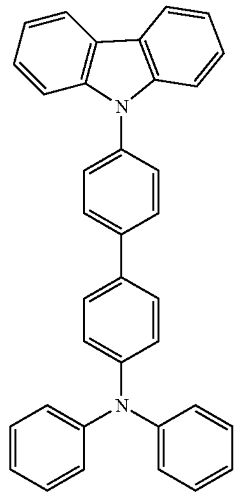
1-67
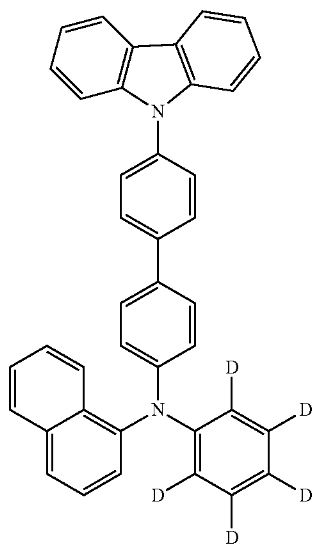
1-68
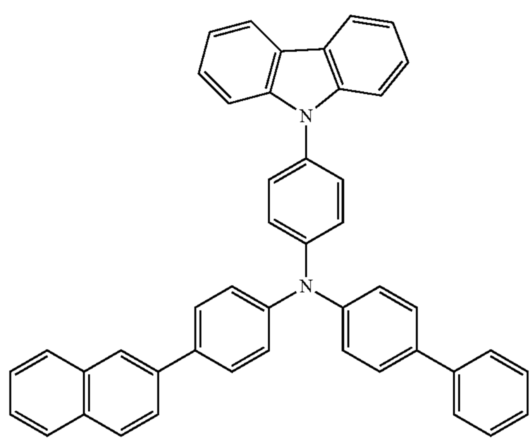

-continued
1-69
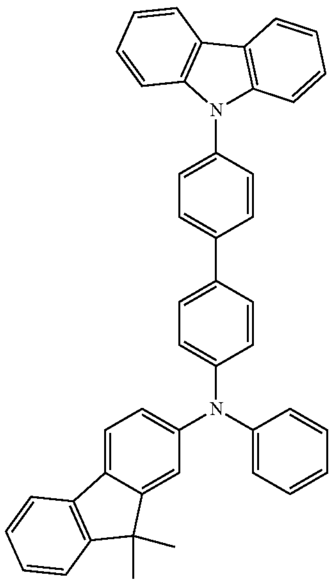
1-70
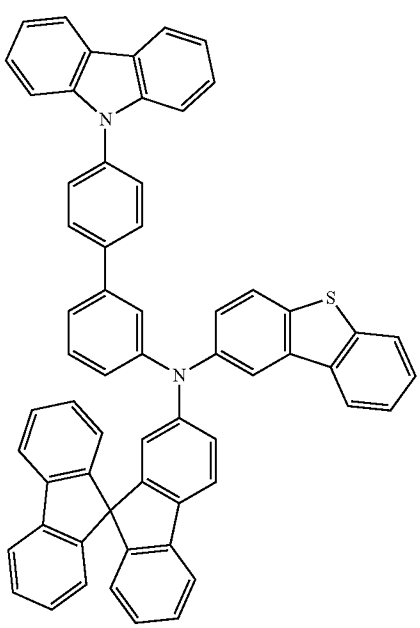
-continued
1-71
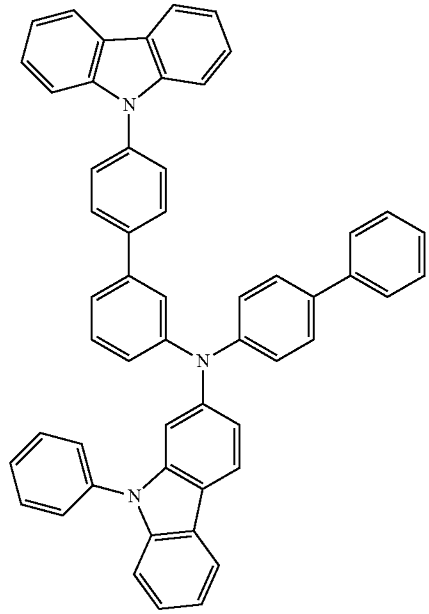
1-72
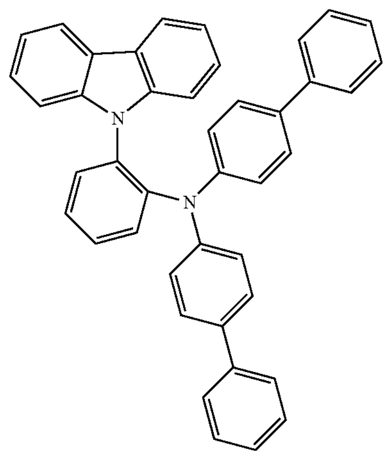
1-73
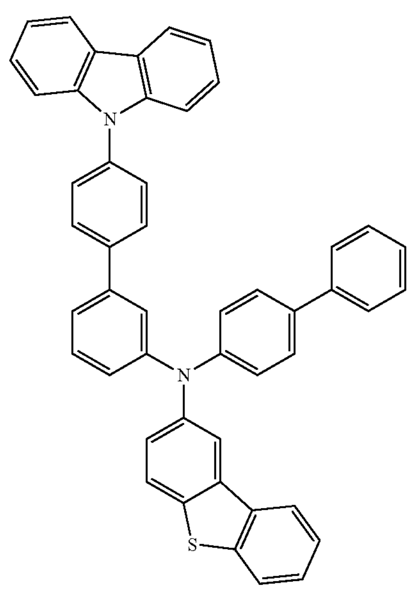

-continued
1-74
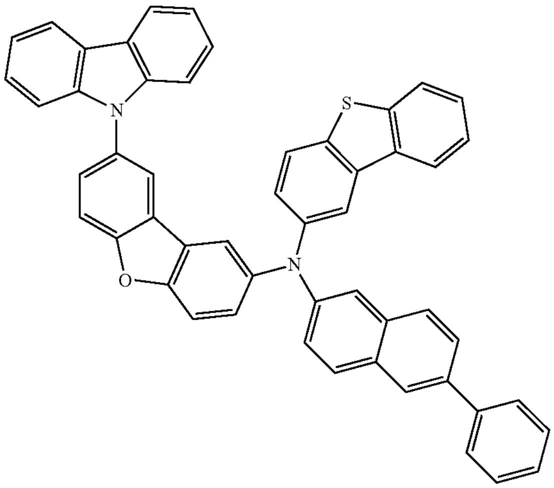
1-75
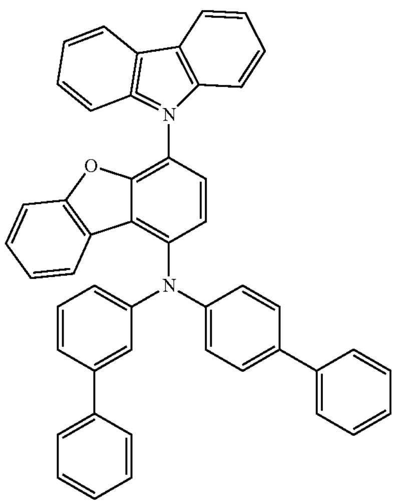
1-76
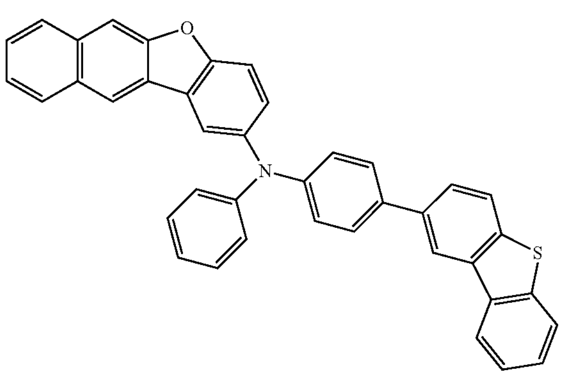
-continued
1-77
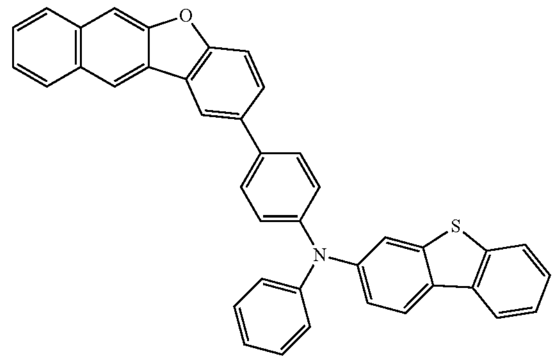
1-78
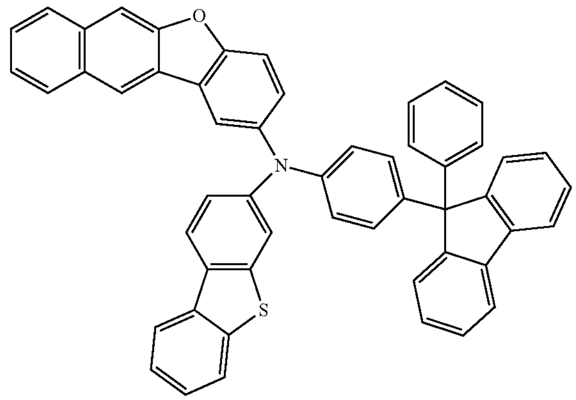
1-79
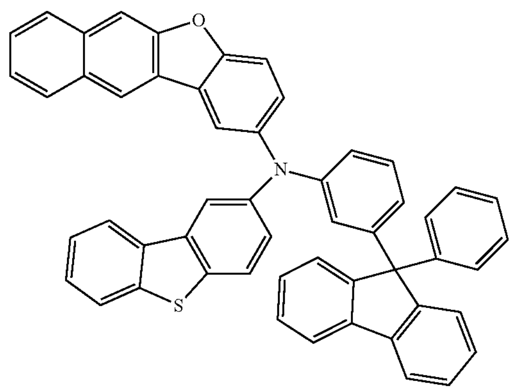
1-80
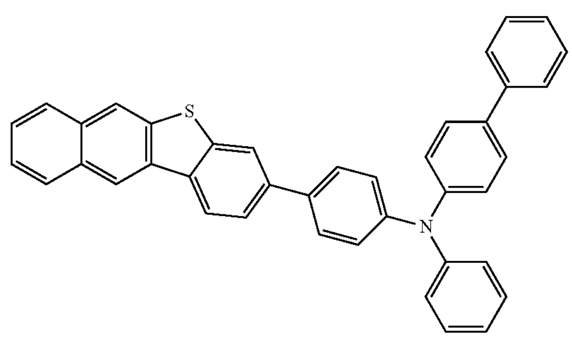

-continued
1-81
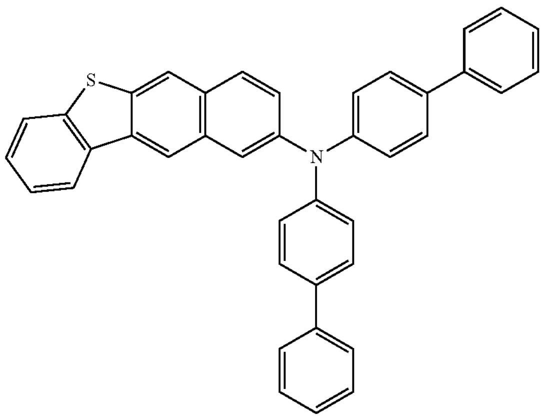
1-82
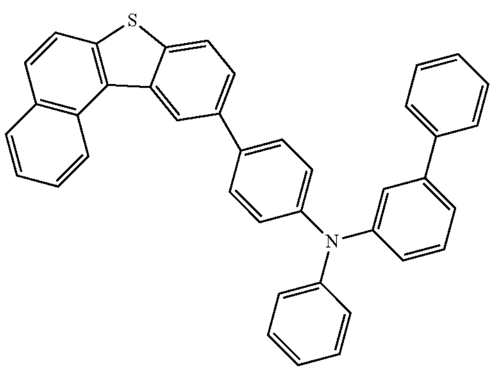
1-83
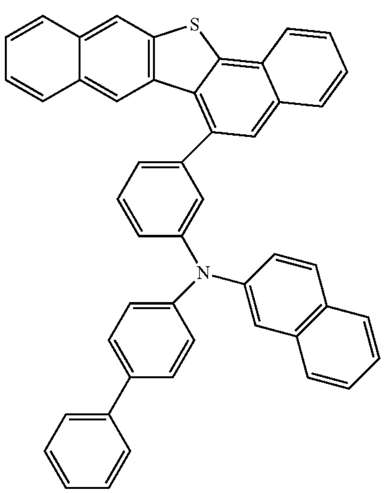
-continued
1-84
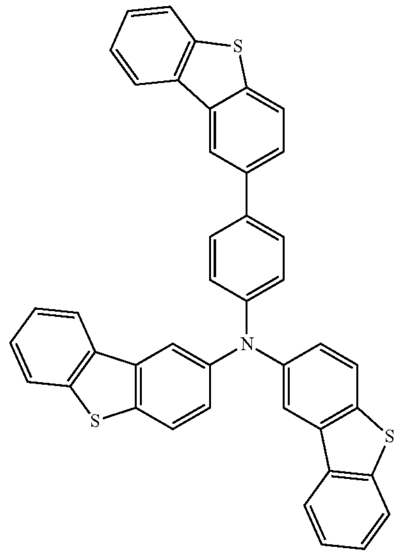
1-85
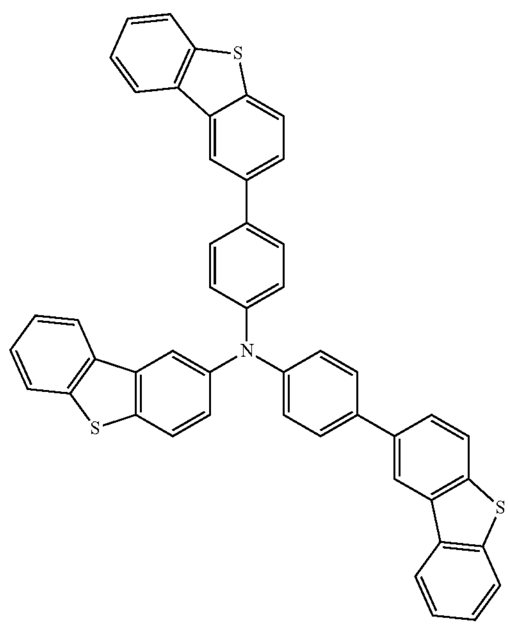

-continued
1-86
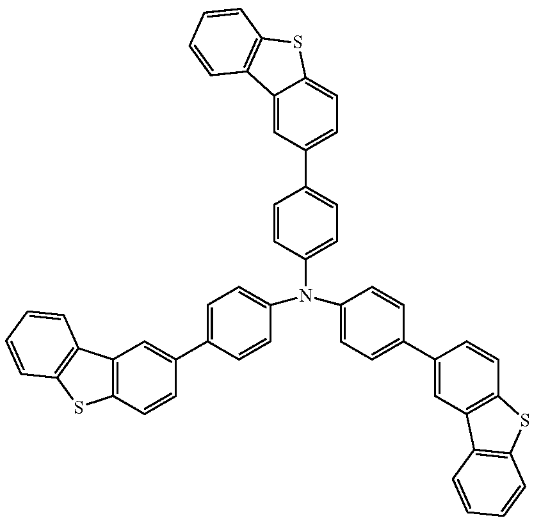
1-87
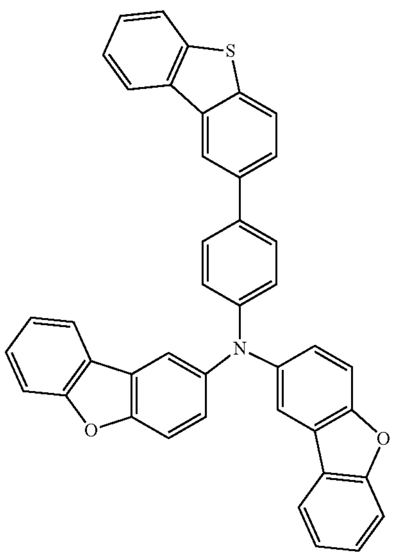
1-88
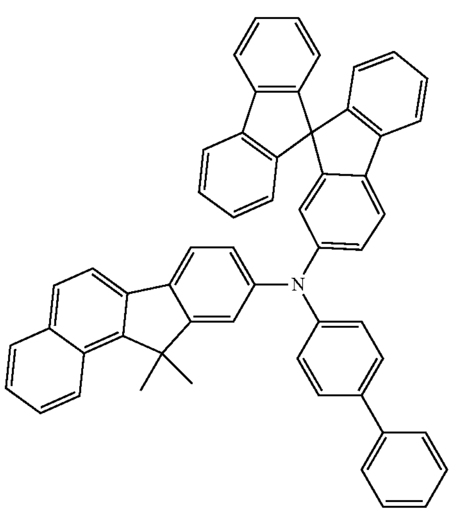
-continued
1-89
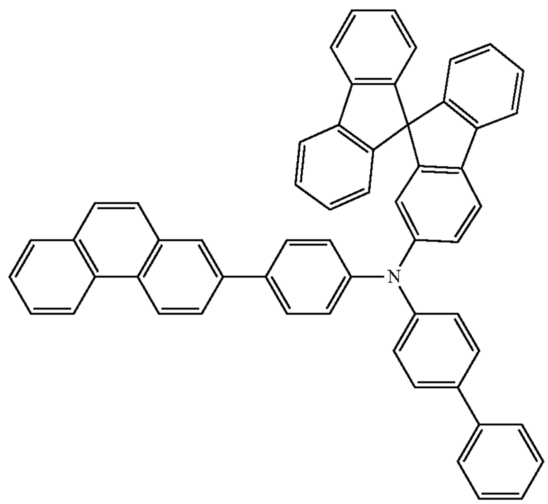
1-90
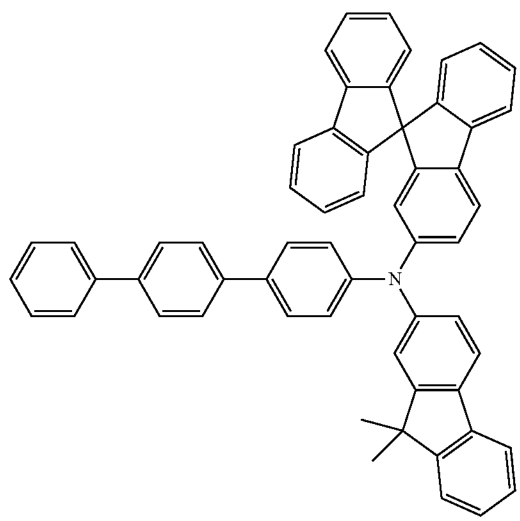
1-91
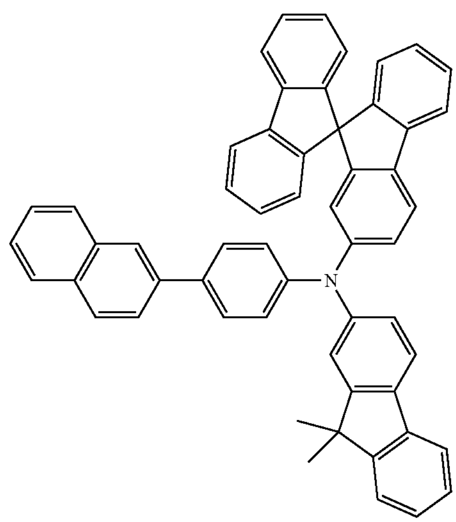

-continued
1-92
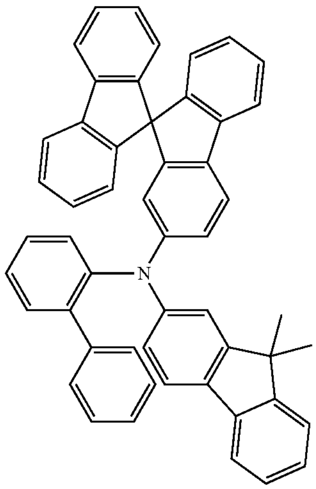
1-93
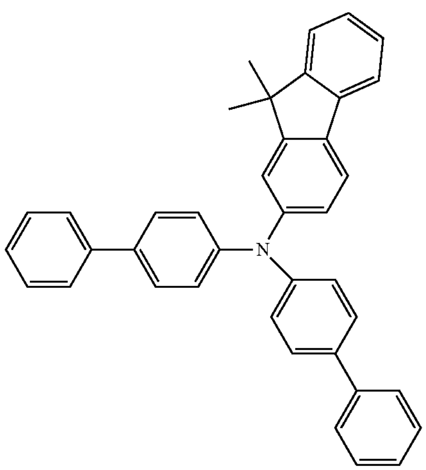
1-94
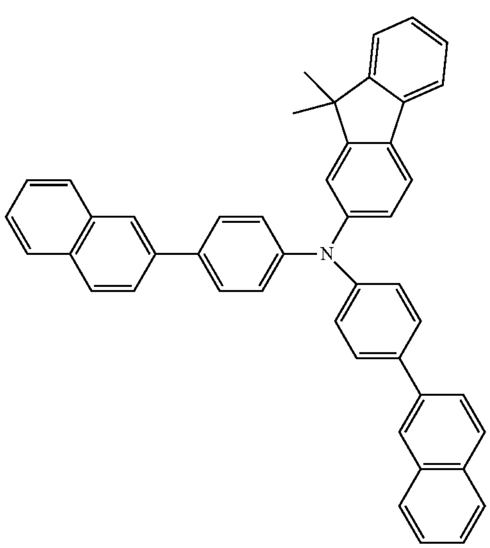
-continued
1-95
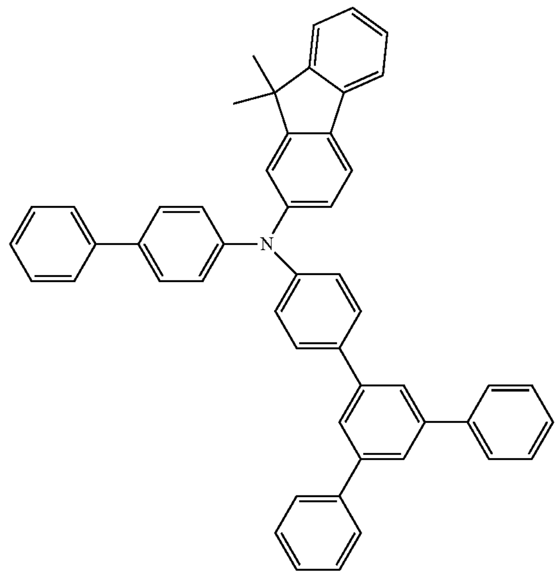
1-96
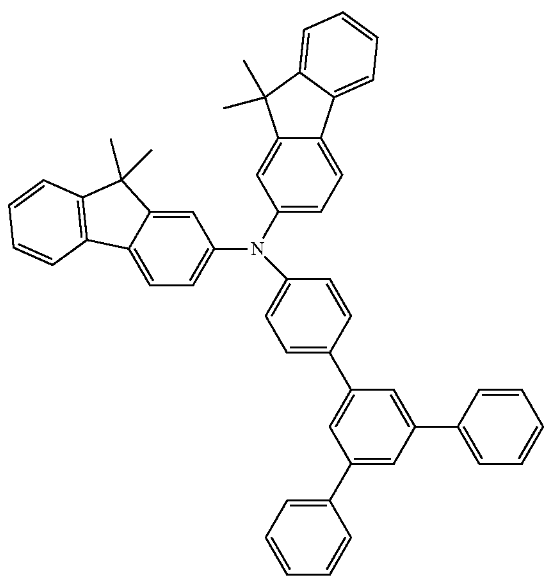
1-97
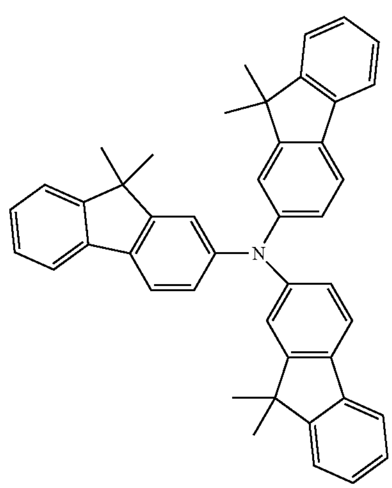

1-98
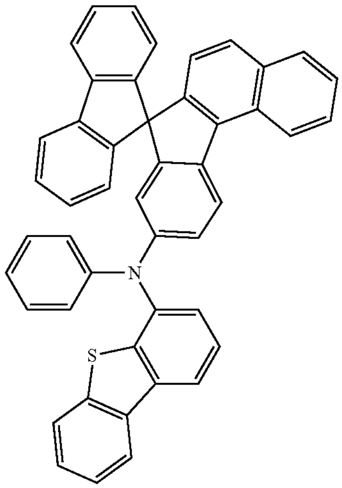
1-99
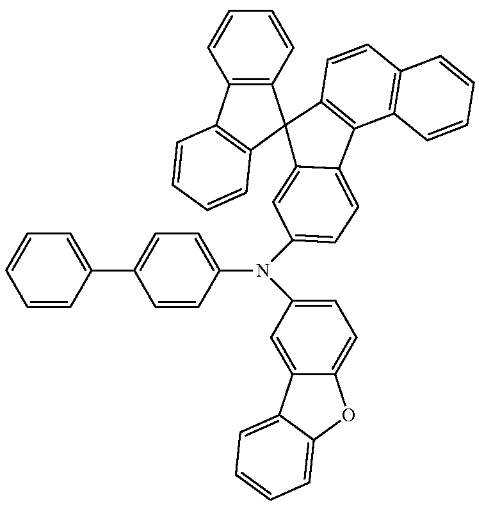
1-100
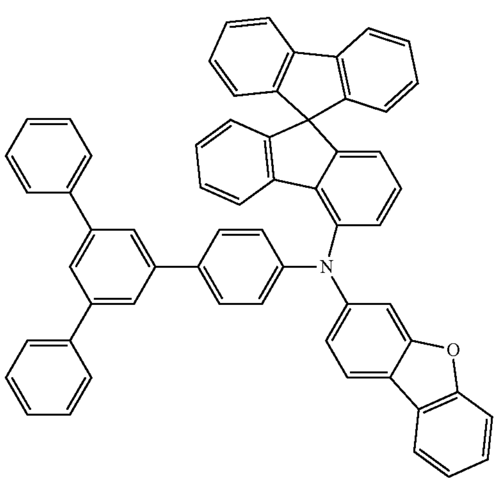
1-101
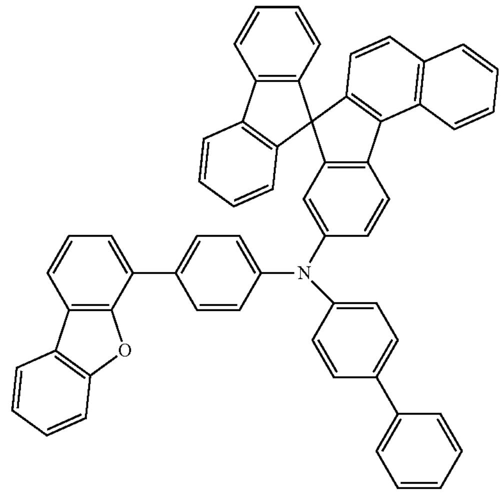
1-102
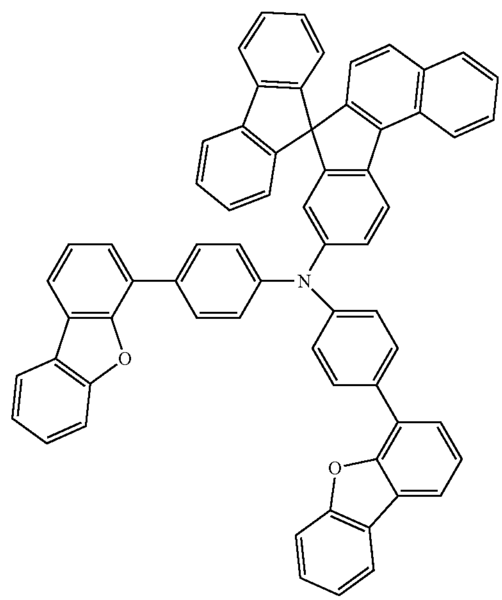
1-103
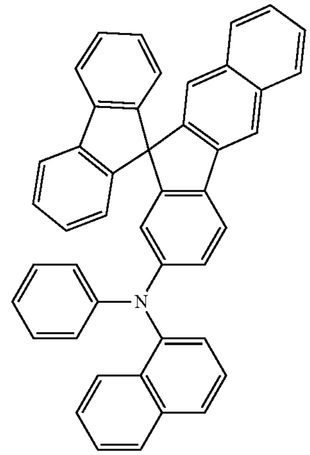

-continued
1-104
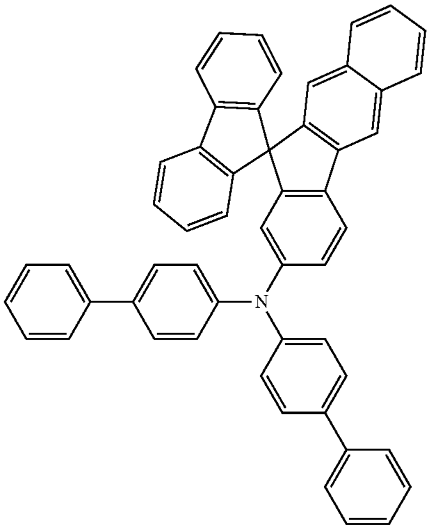
1-105
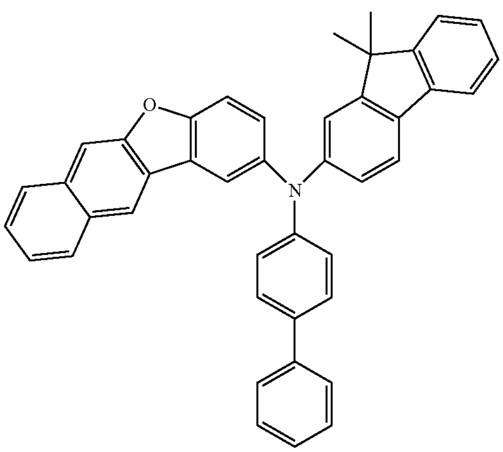
1-106
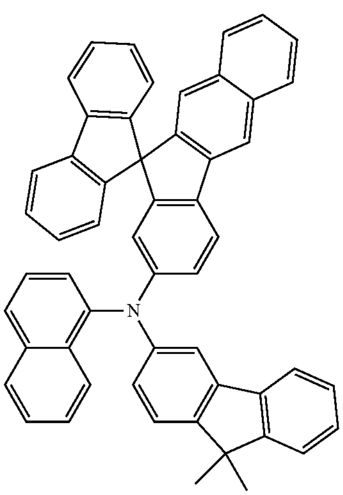
-continued
1-107
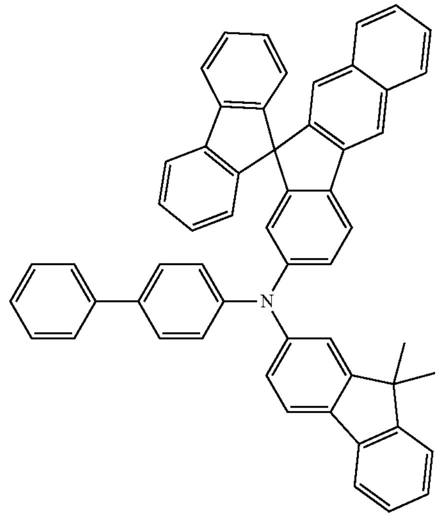
1-108
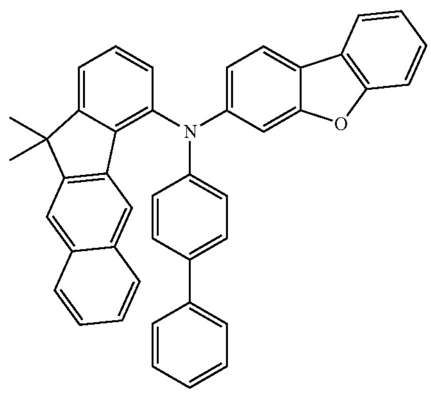
1-109
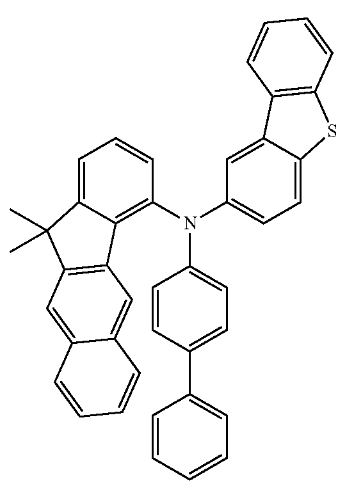

-continued
1-110
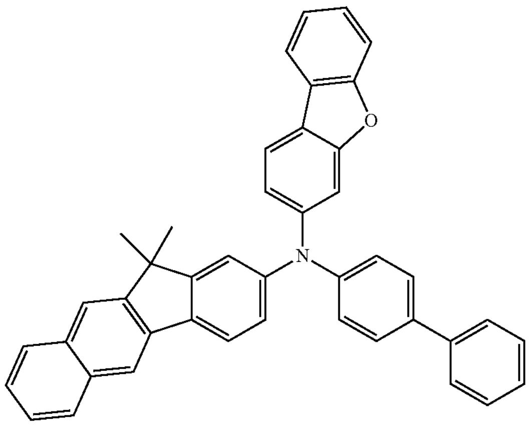
1-111
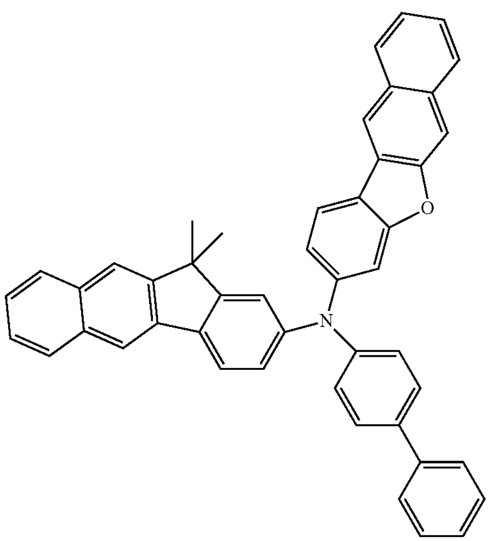
1-112
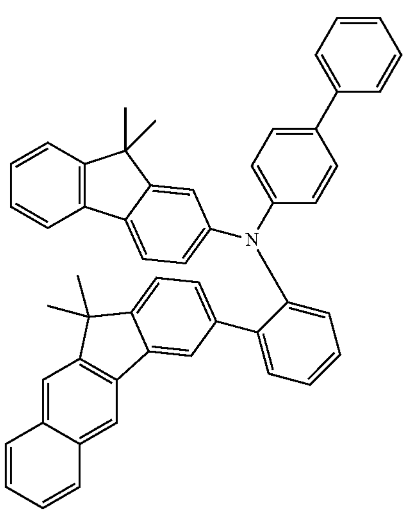
-continued
1-113
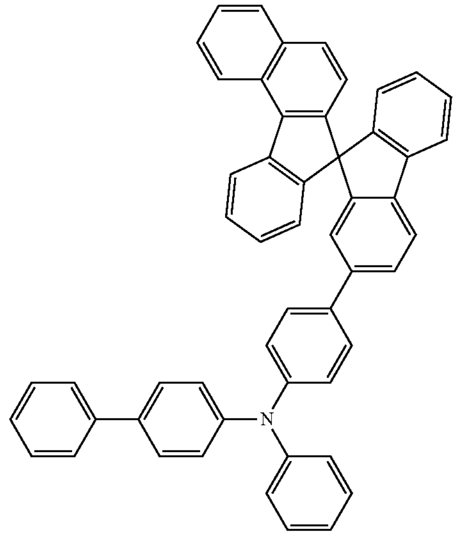
1-114
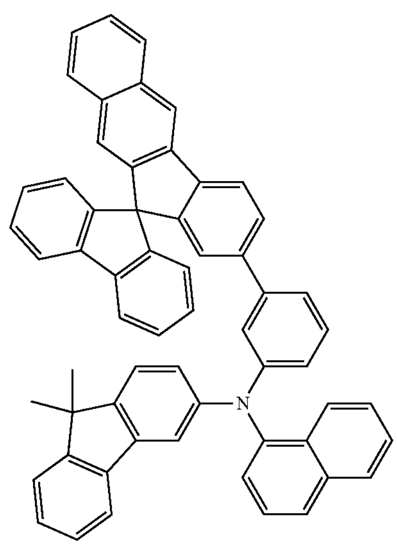

-continued
1-115
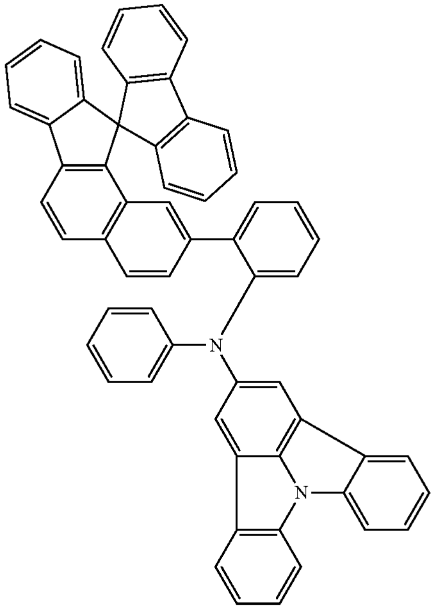
1-116
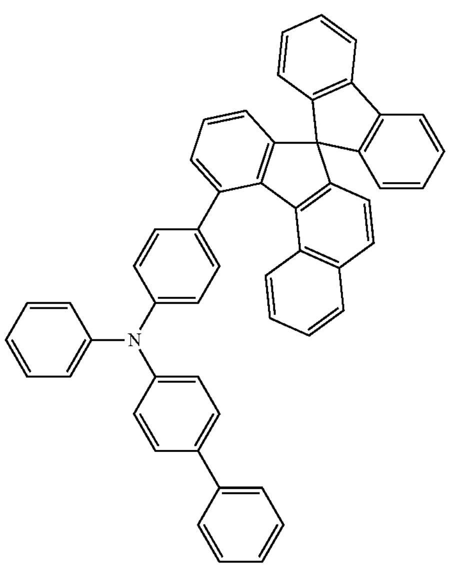
-continued
1-117
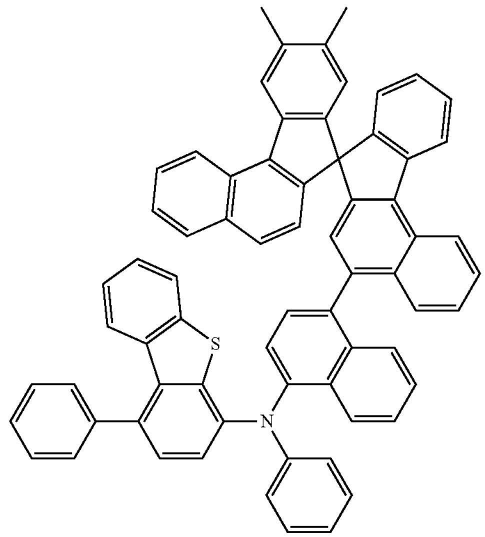
1-118
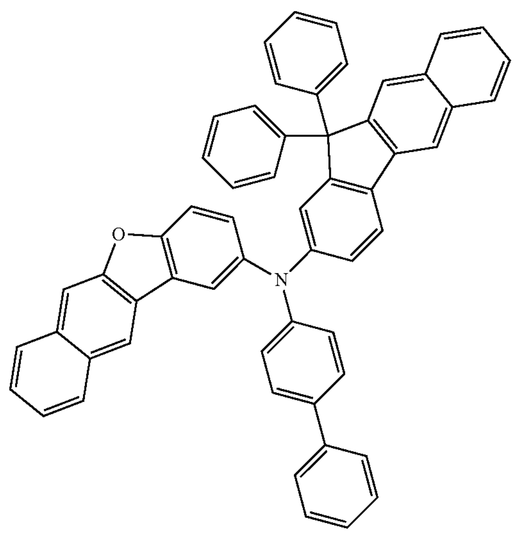
1-119
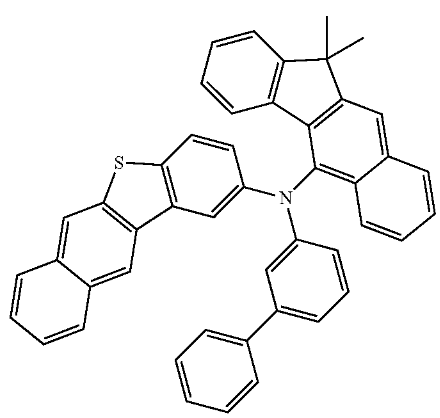

-continued
1-120
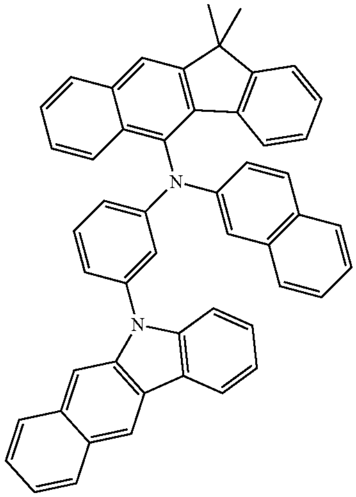
1-121
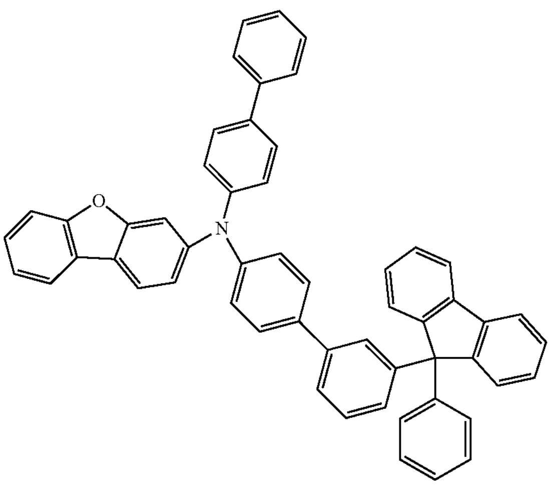
1-122
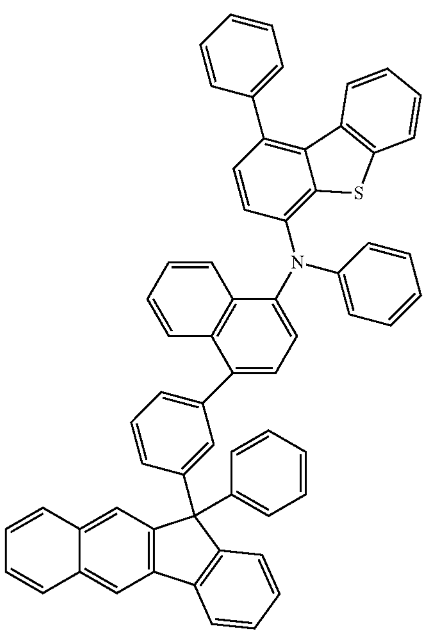
-continued
1-123
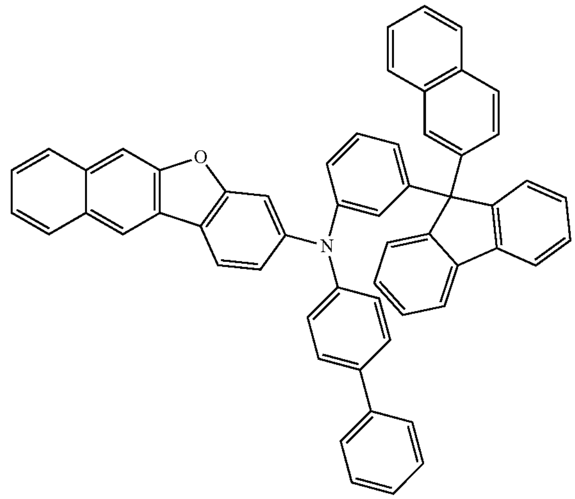
1-124
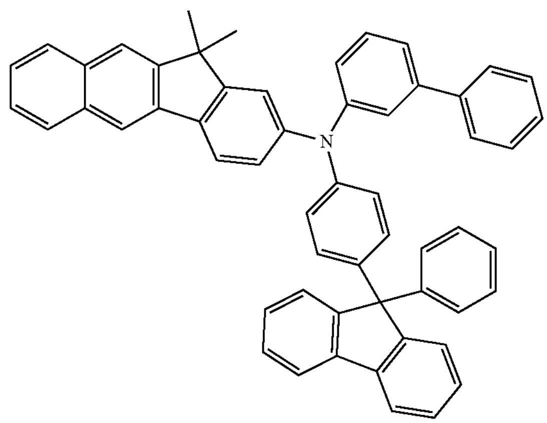
1-125
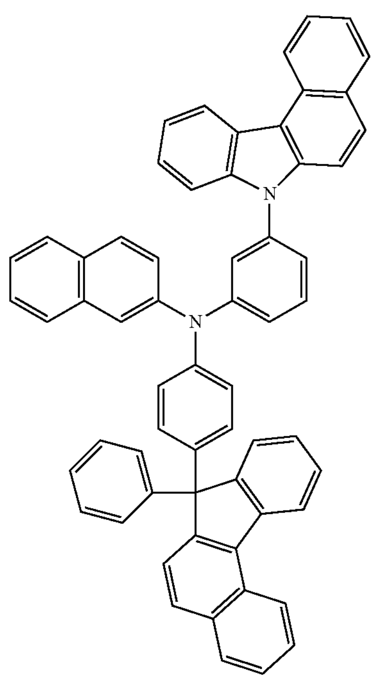

-continued
1-126
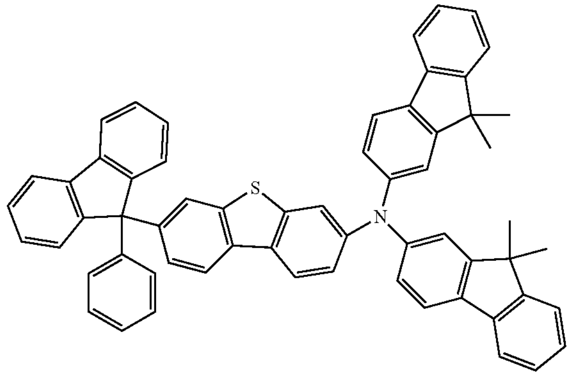
1-127
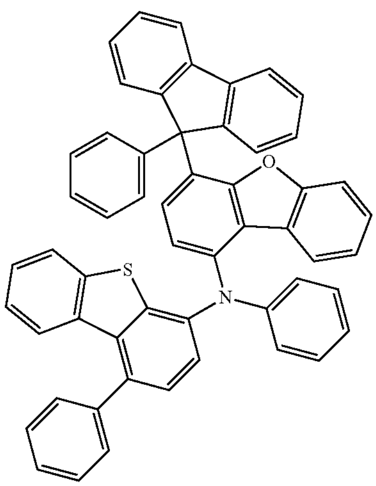
1-128
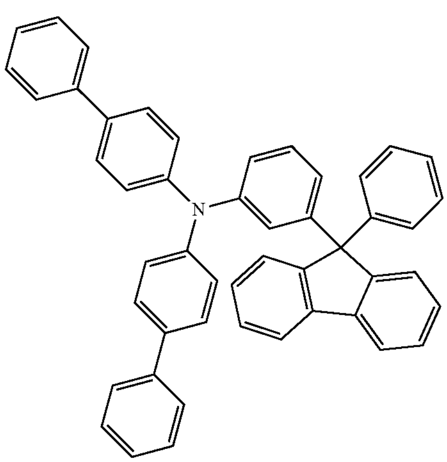
-continued
1-129
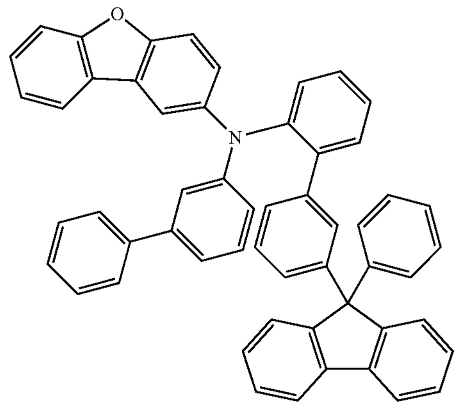
1-130
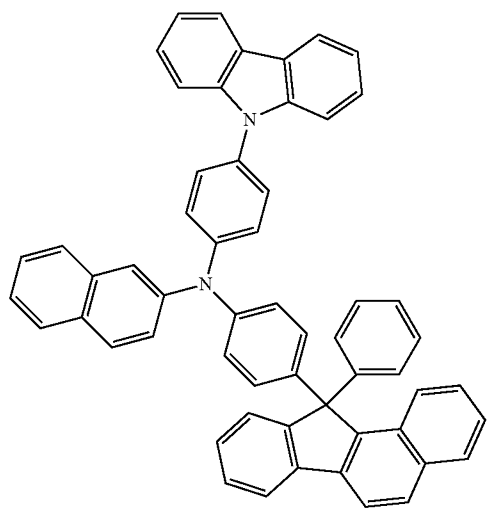
1-131
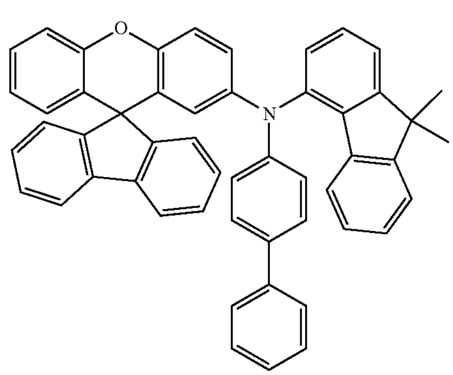

-continued
1-132
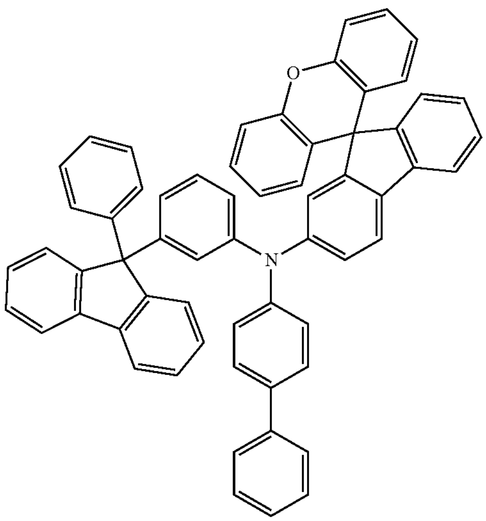
1-133
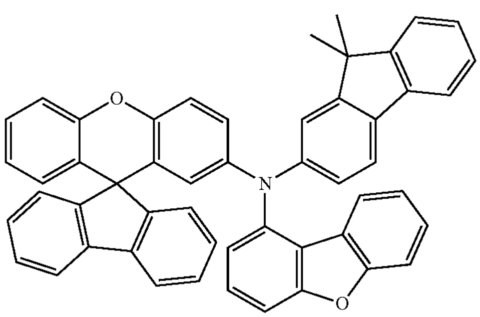
1-134
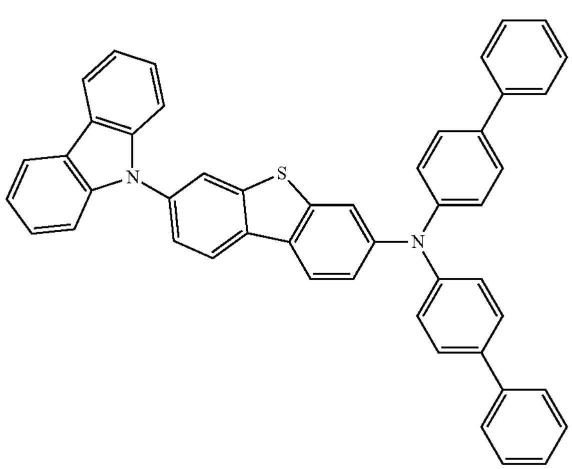
-continued
1-135
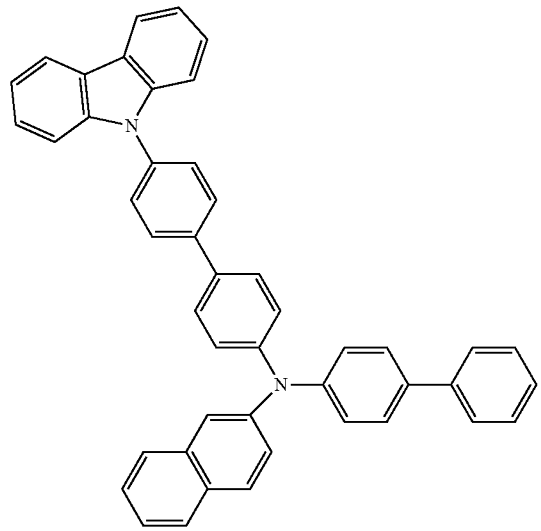
P-1
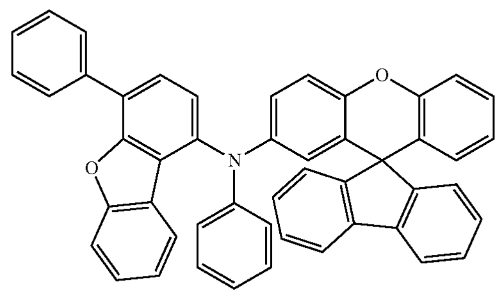
P-2
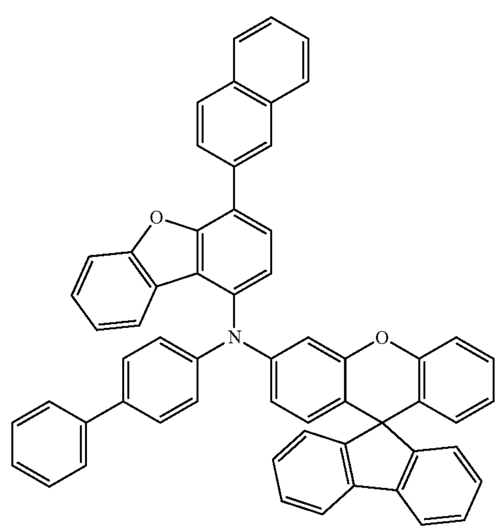

-continued
P-3
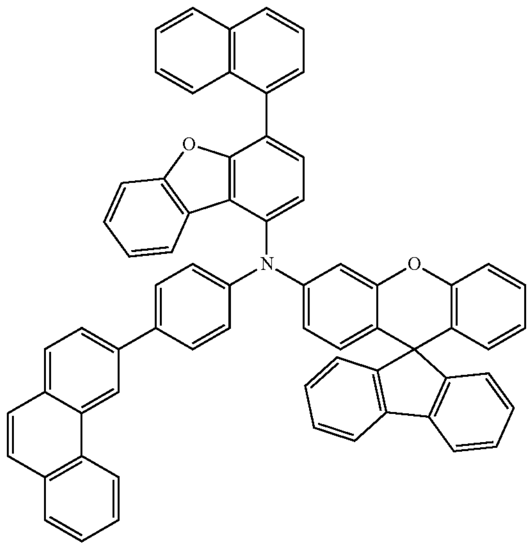
P-4
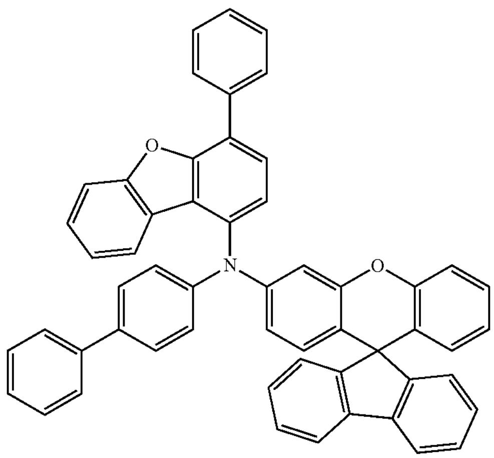
P-5
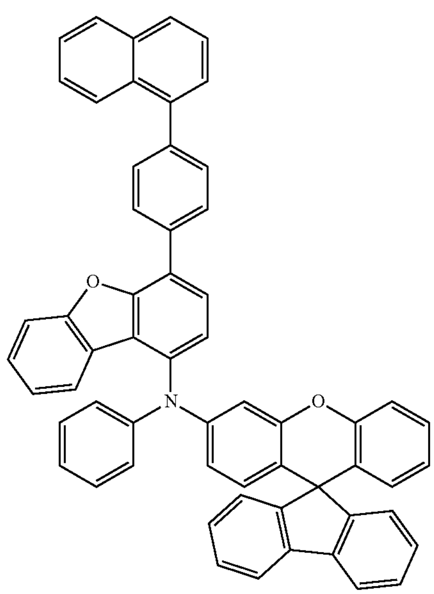
-continued
P-6
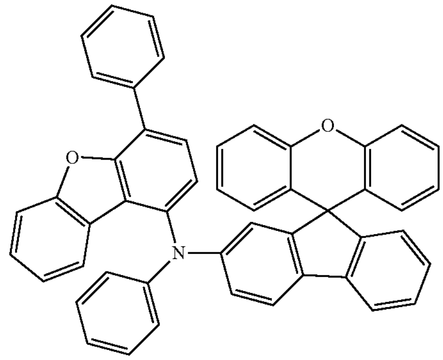
P-7
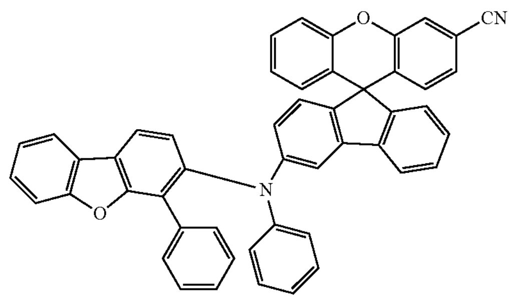
P-8
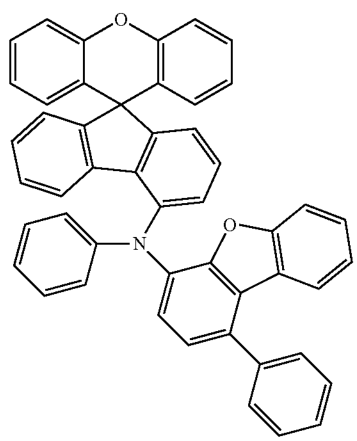
P-9
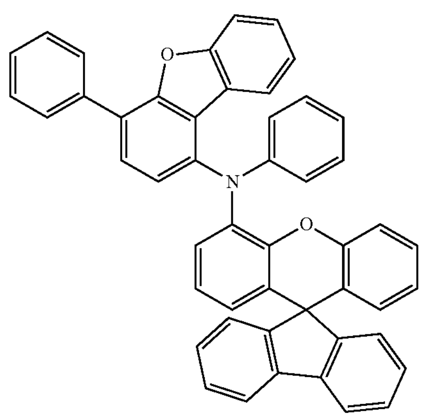

-continued
P-10
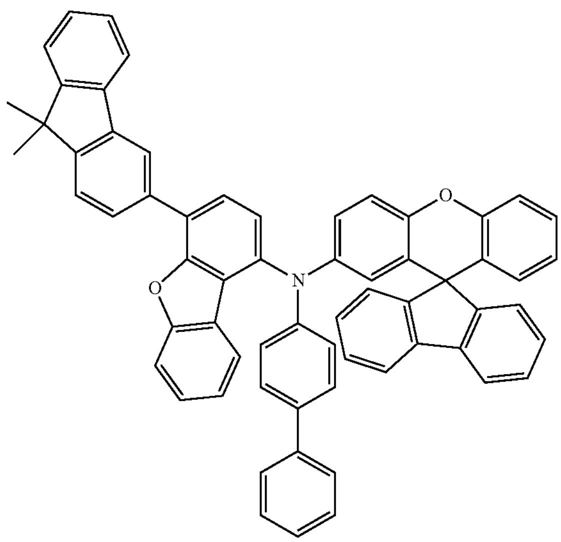
P-11
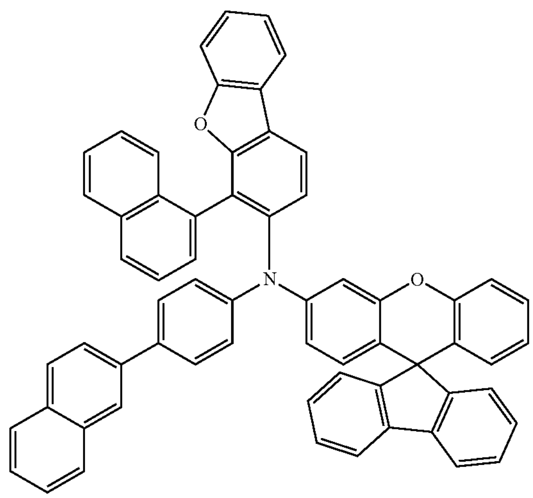
P-12
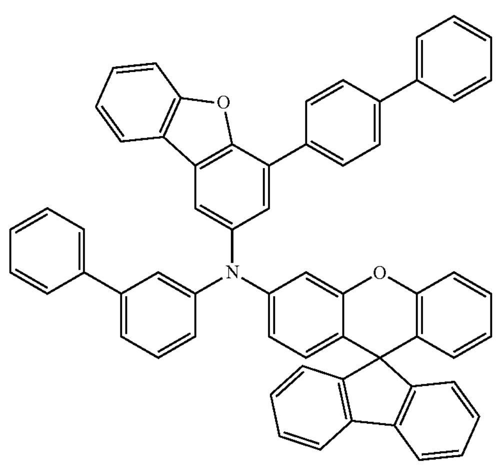
-continued
P-13
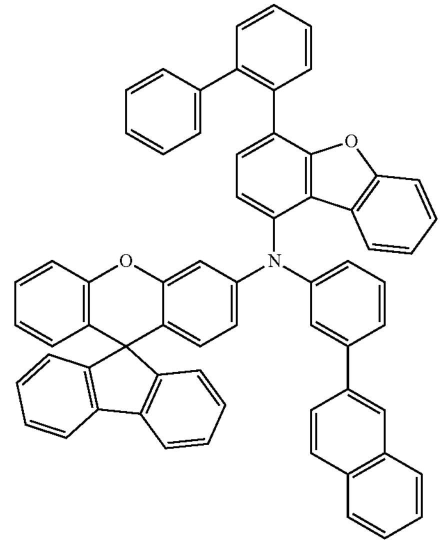
P-14
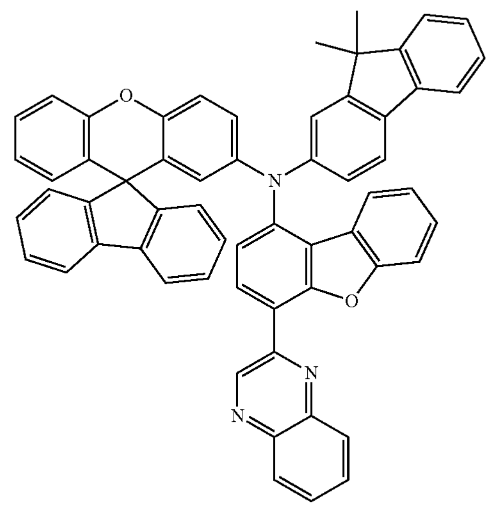
P-15
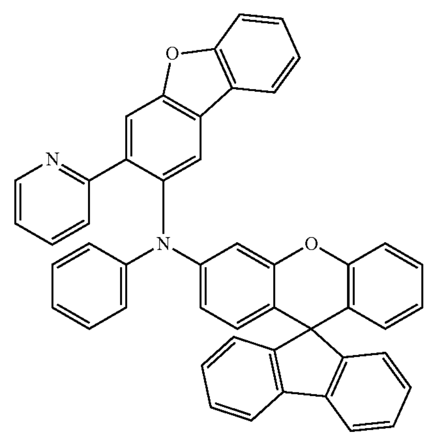

-continued
P-16
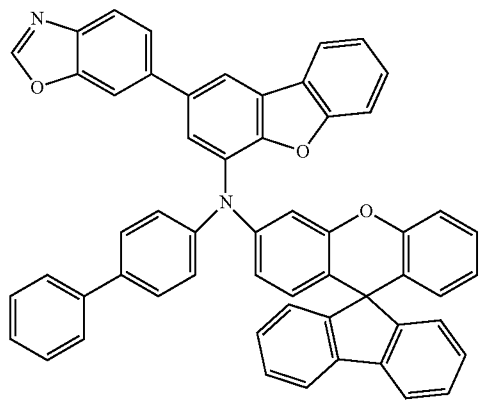
P-17
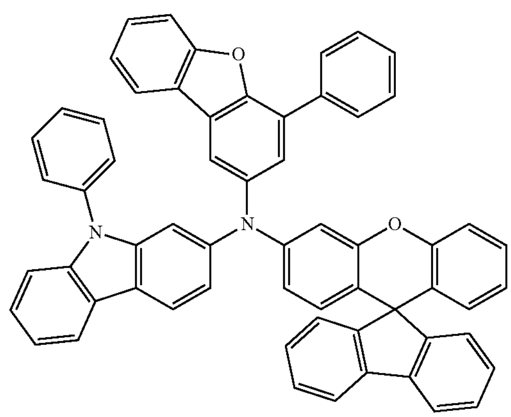
P-18
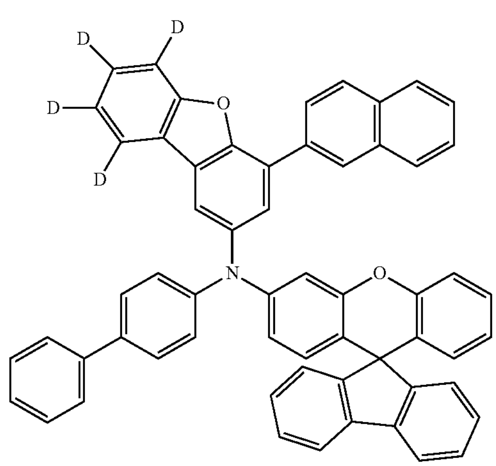
-continued
P-19
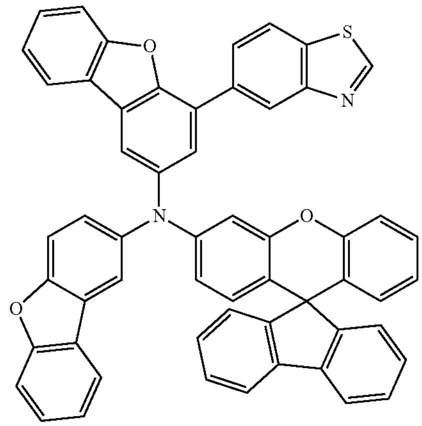
P-20
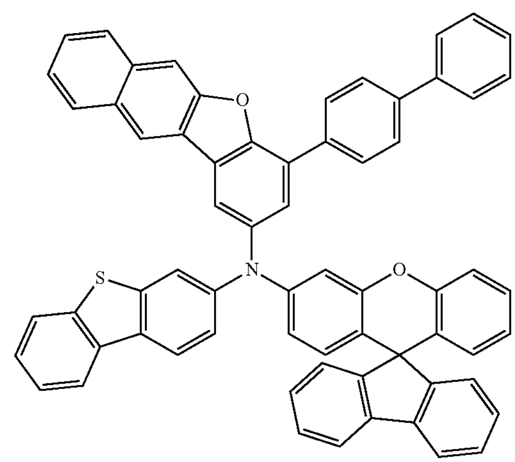
P-21
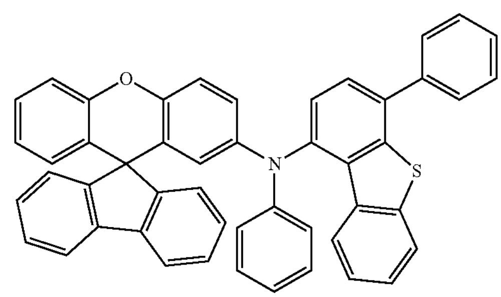
P-22
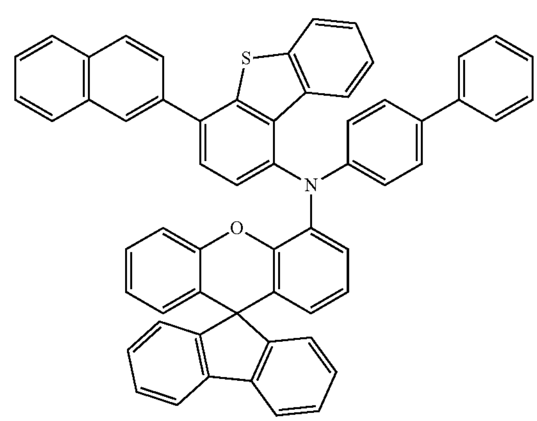

P-23
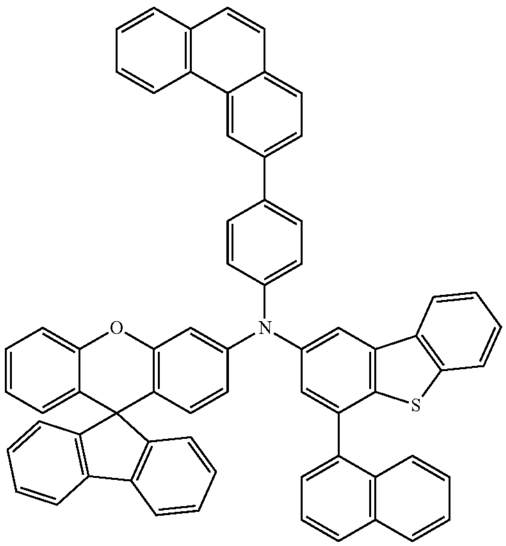
P-24
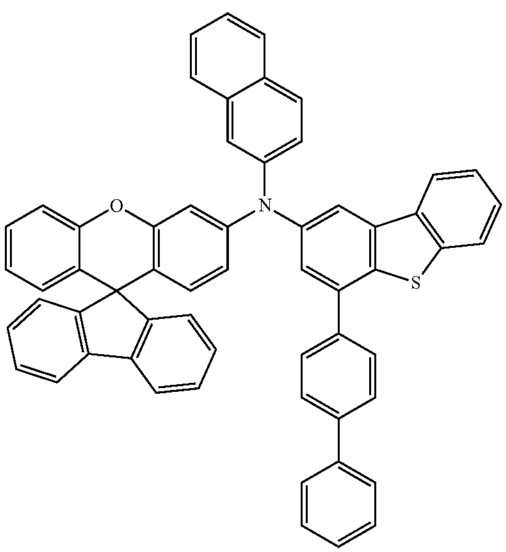
P-25
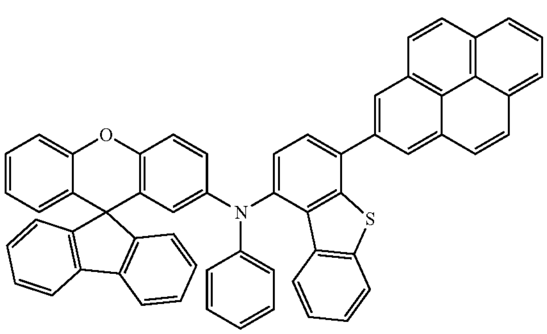
P-26
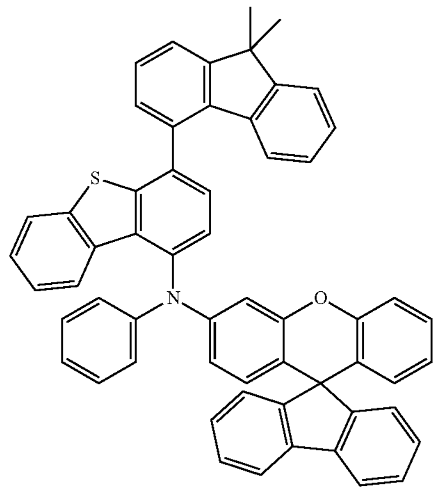
P-27
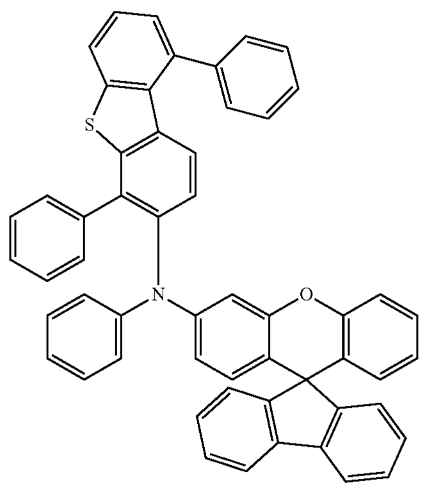
P-28
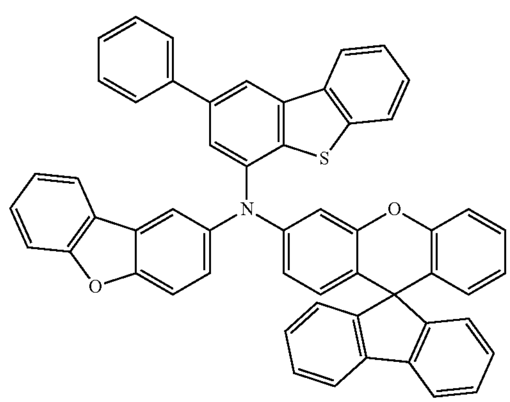

P-29
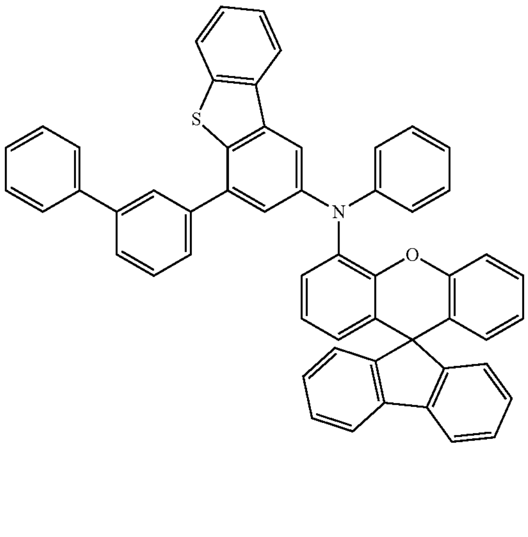
P-30
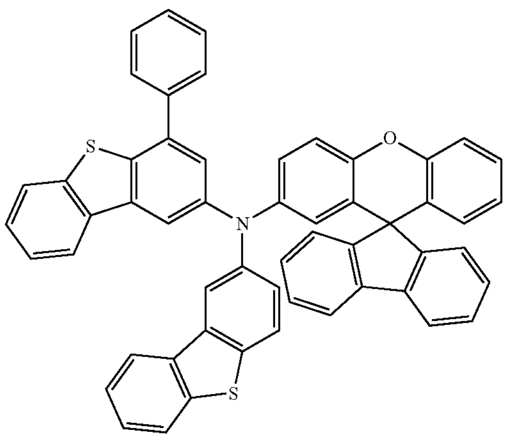
P-31
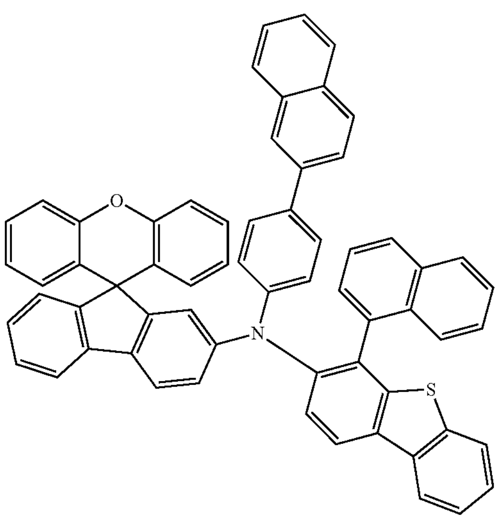
P-32
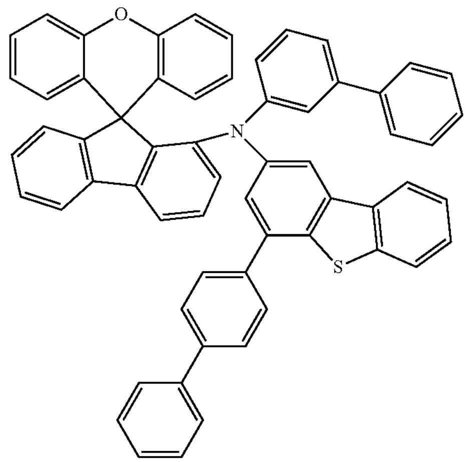
P-33
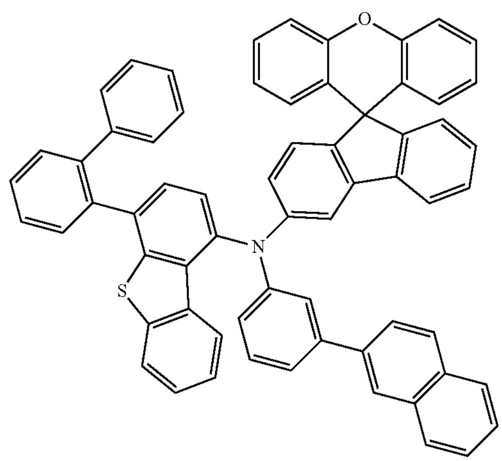
P-34
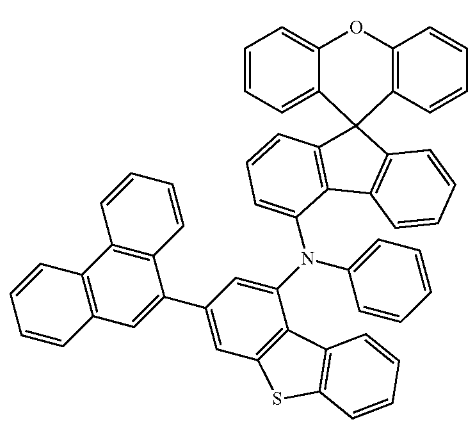

P-35
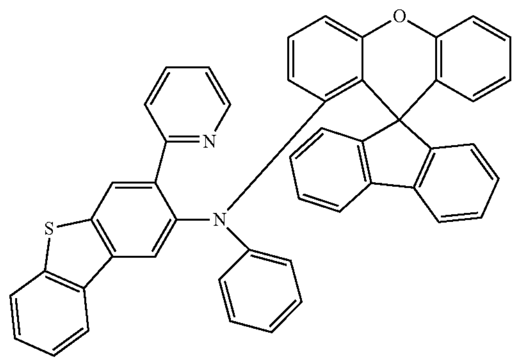
P-36
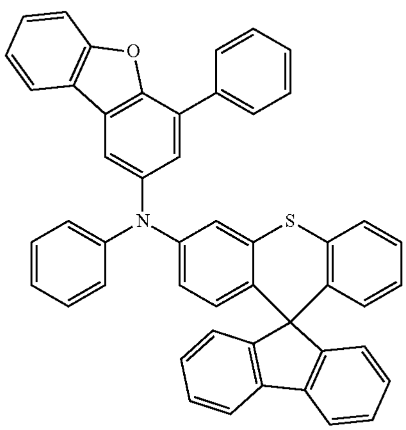
P-37
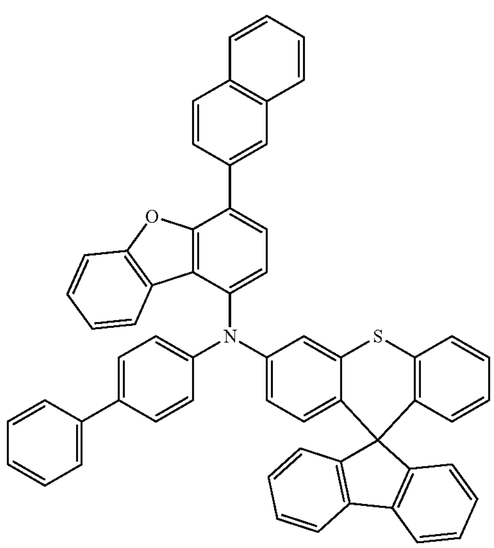
P-38
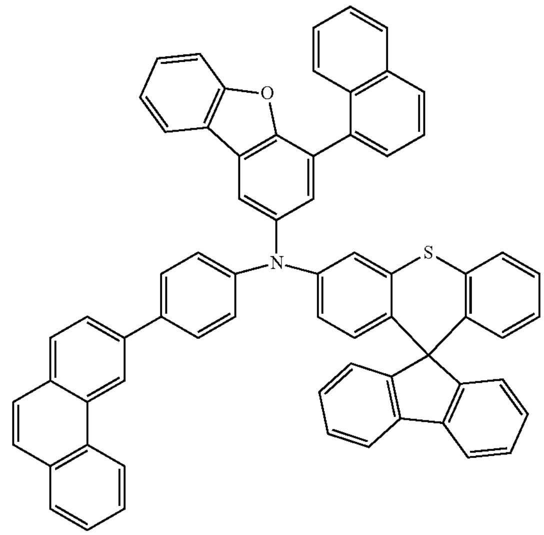
P-39
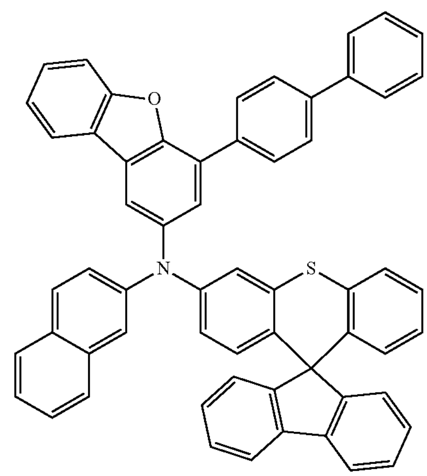
P-40
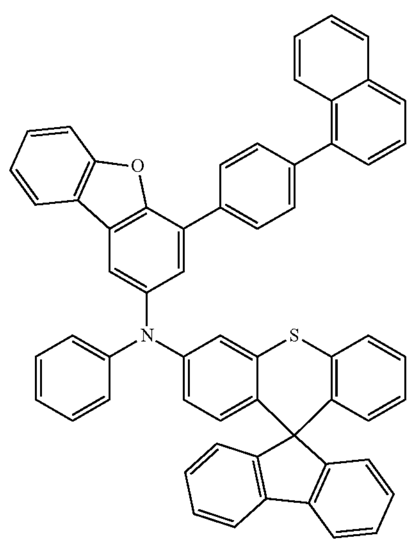

-continued
P-41
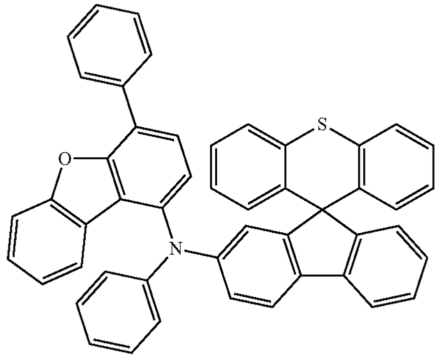
P-42
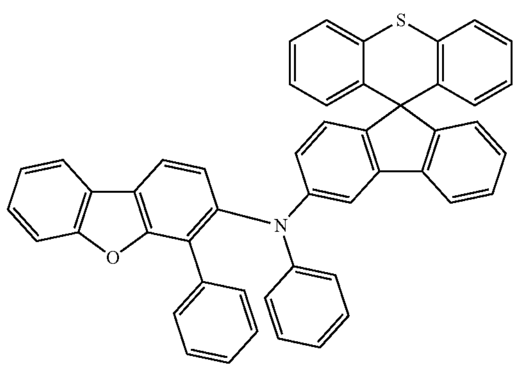
P-43
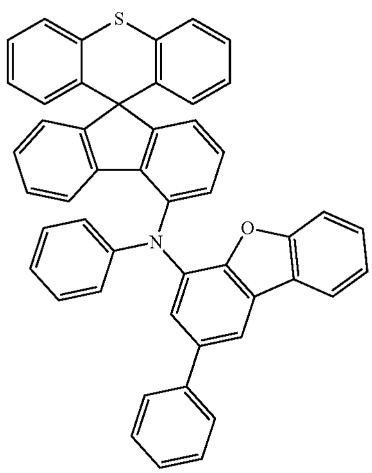
P-44
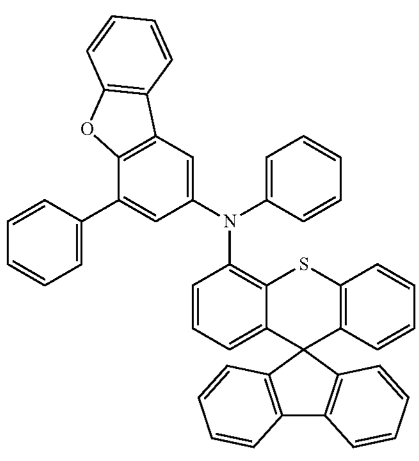
P-45
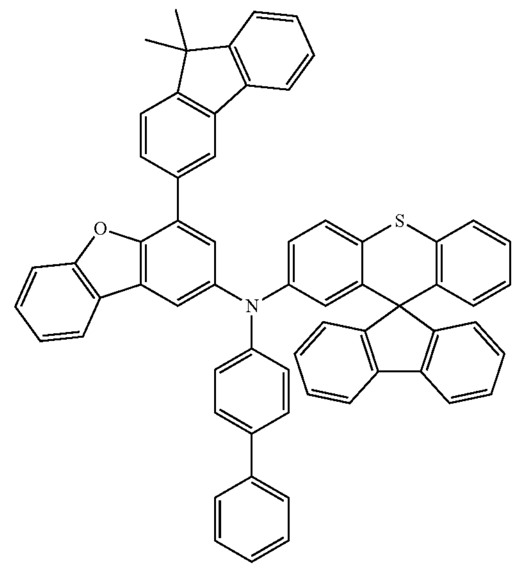
P-46
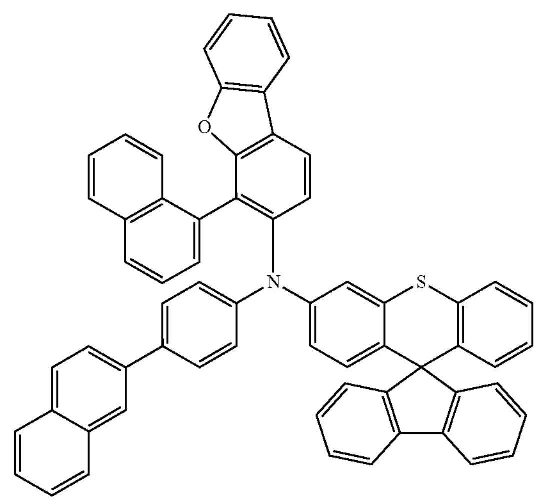
P-47
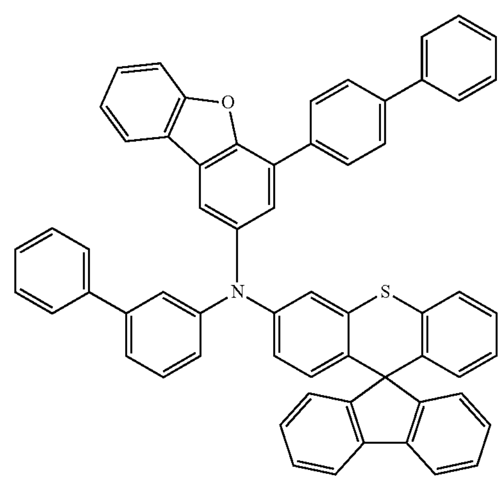

P-48
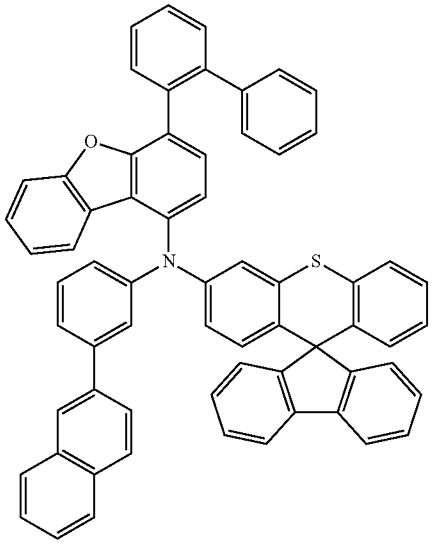
P-49
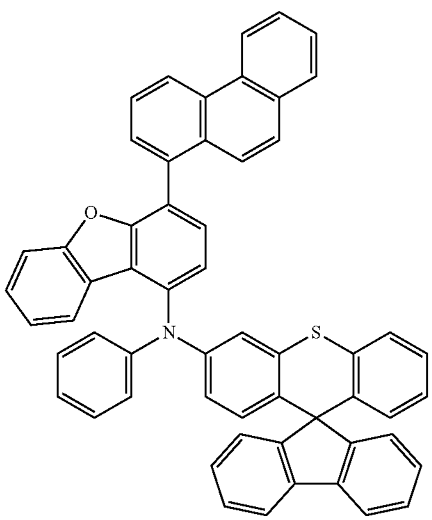
P-50
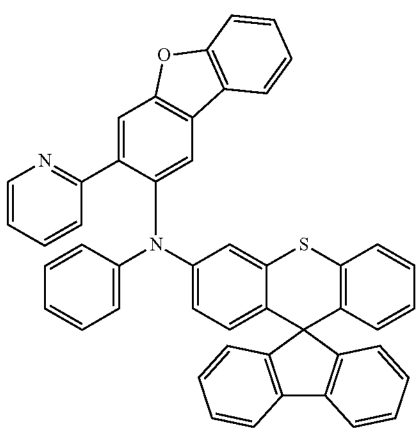
P-51
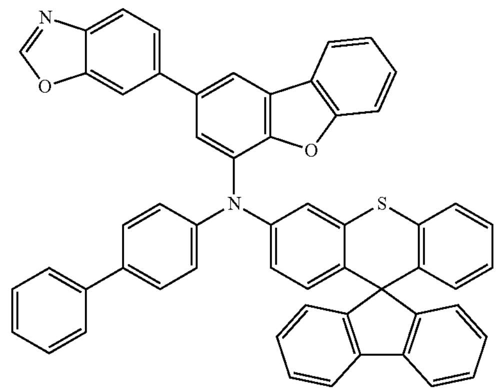
P-52
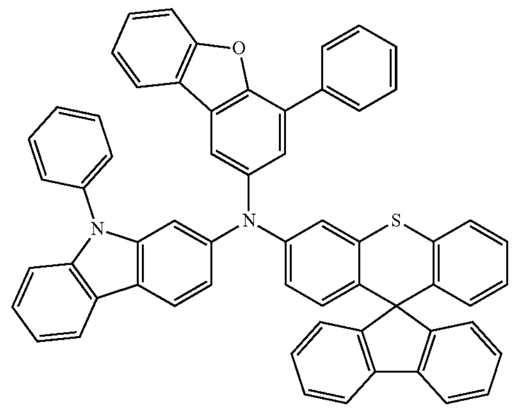
P-53
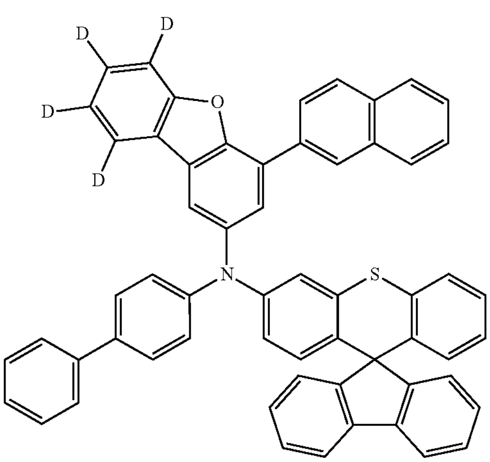

-continued
P-54
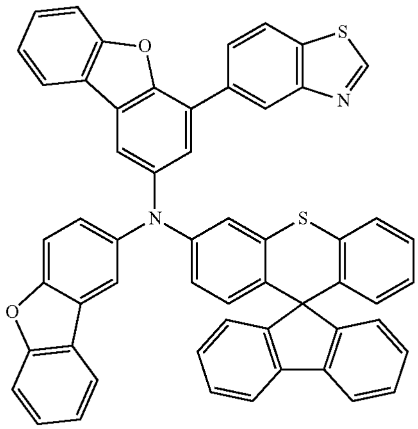
P-55
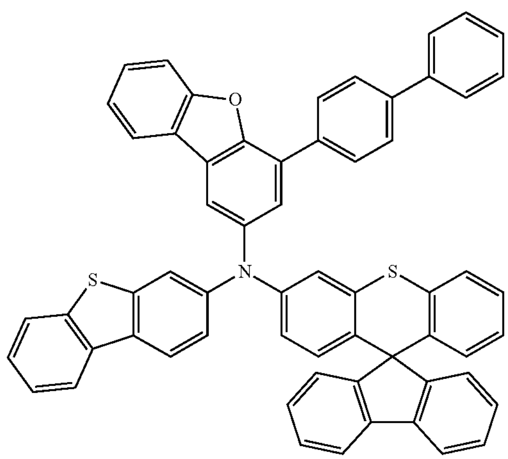
P-56
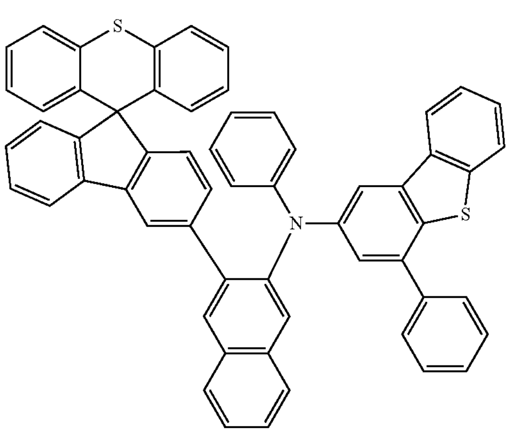
-continued
P-57
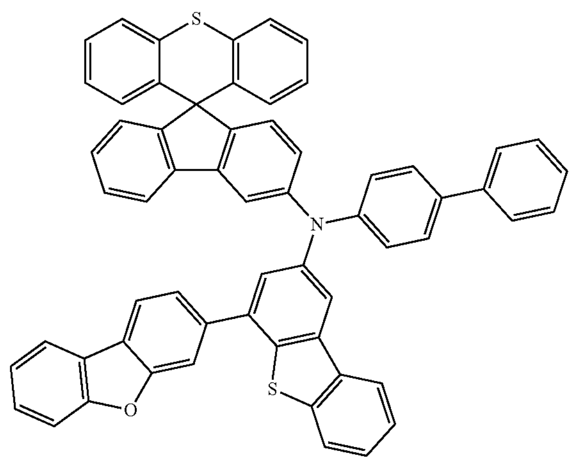
P-58
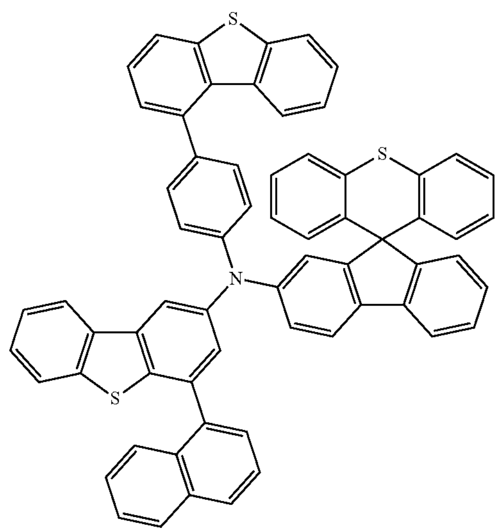
P-59
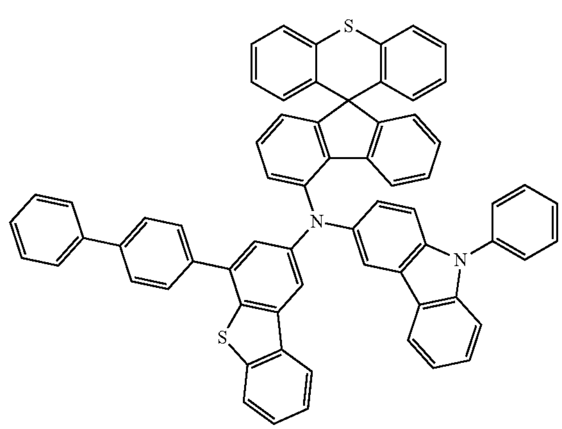

-continued
P-60
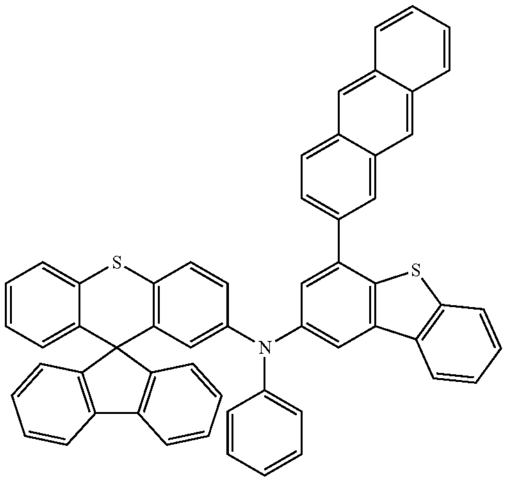
P-61
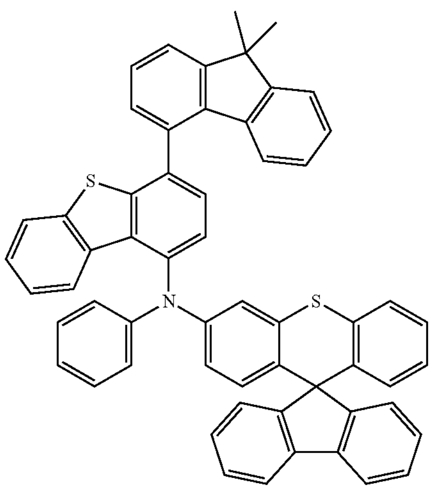
P-62
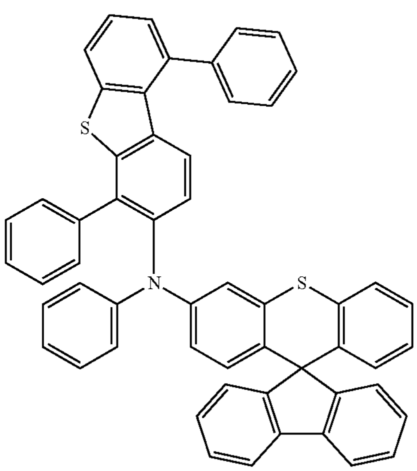
-continued
P-63
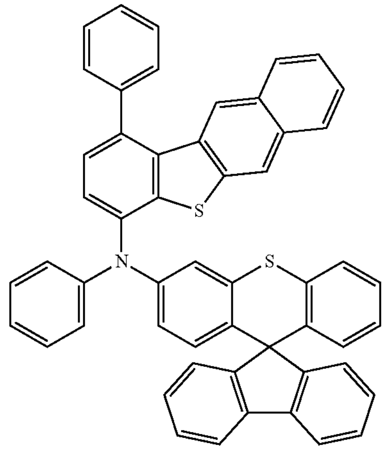
P-64
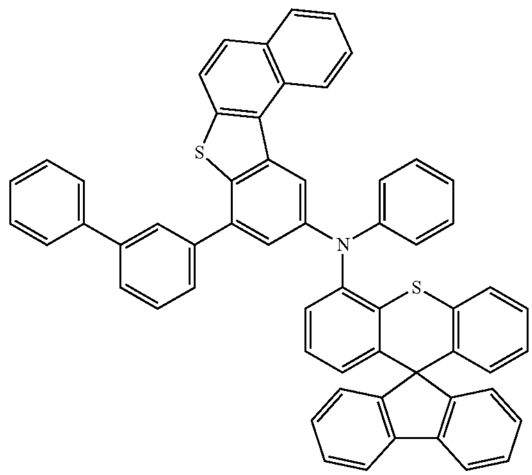
P-65
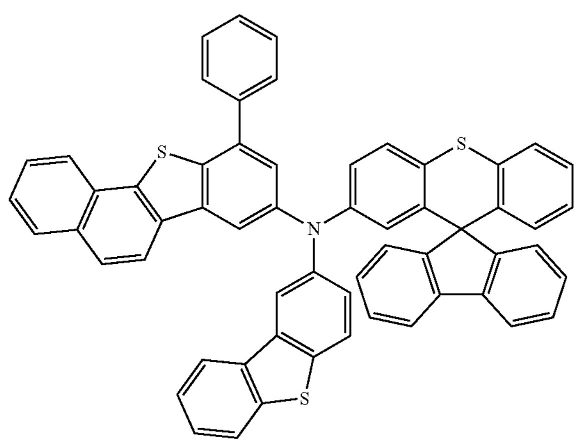

-continued
P-66
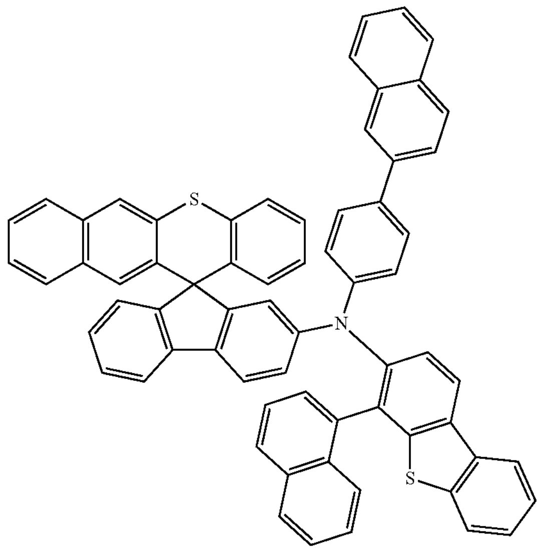
P-67
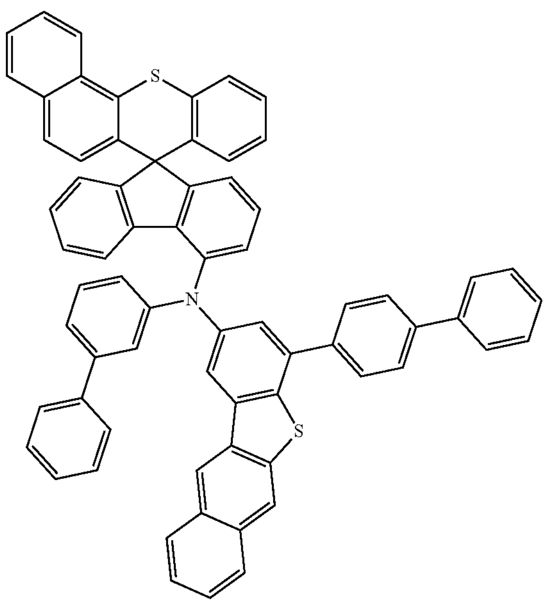
P-68
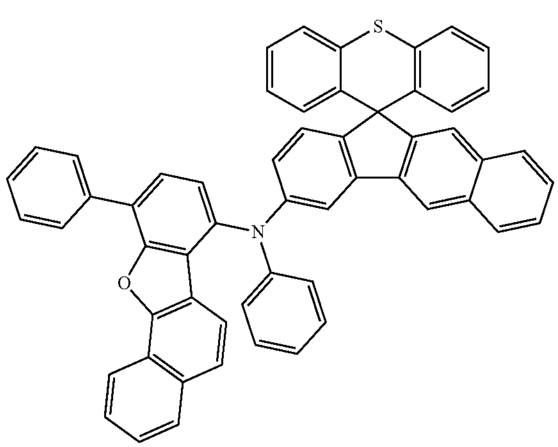
-continued
P-69
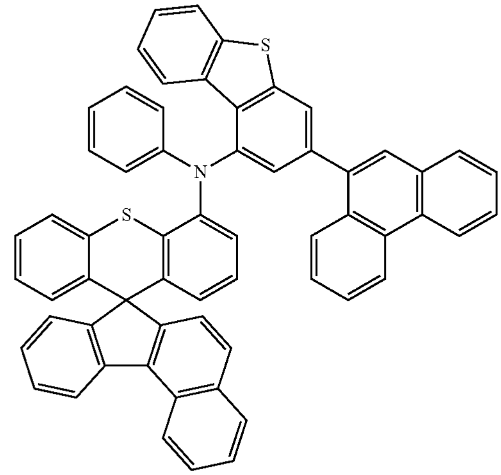
P-70
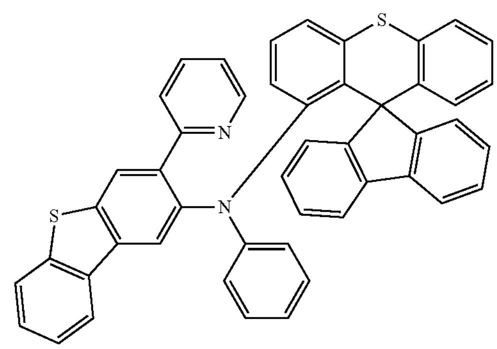
P-71
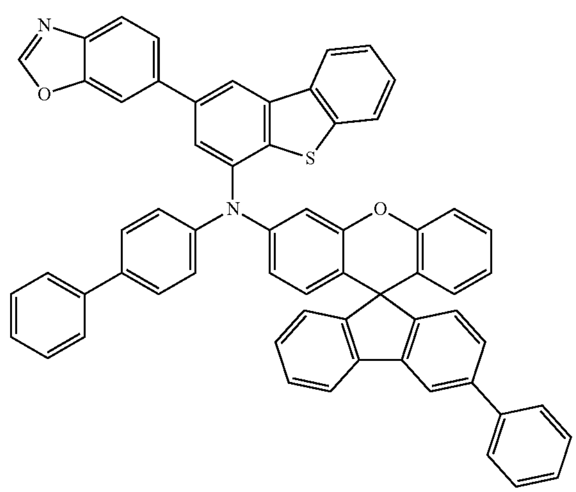

-continued
P-72
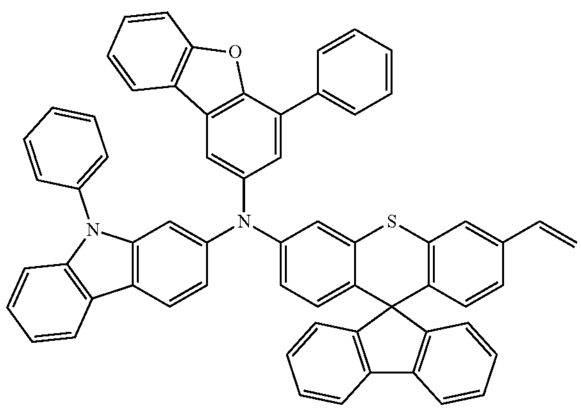
P-73
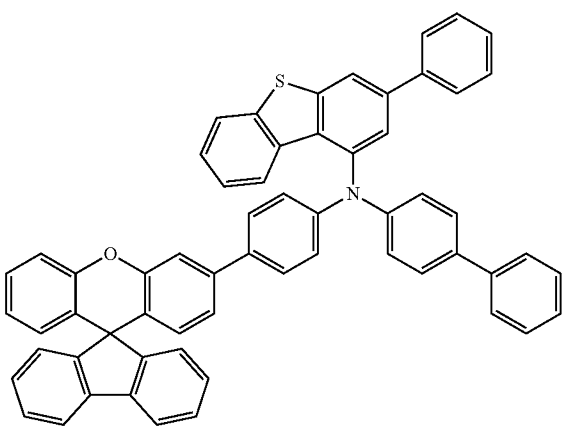
P-74
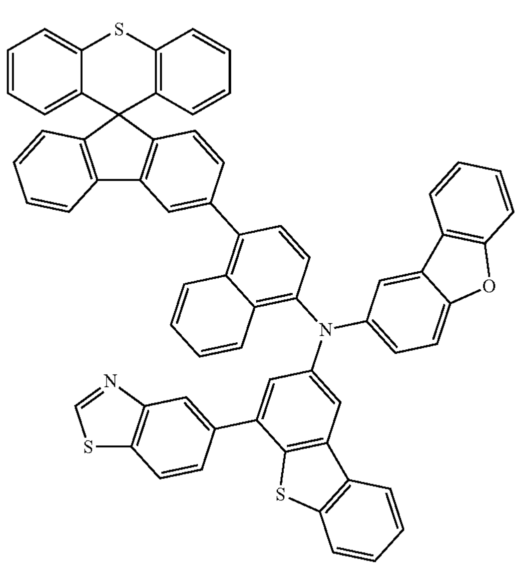
-continued
P-75
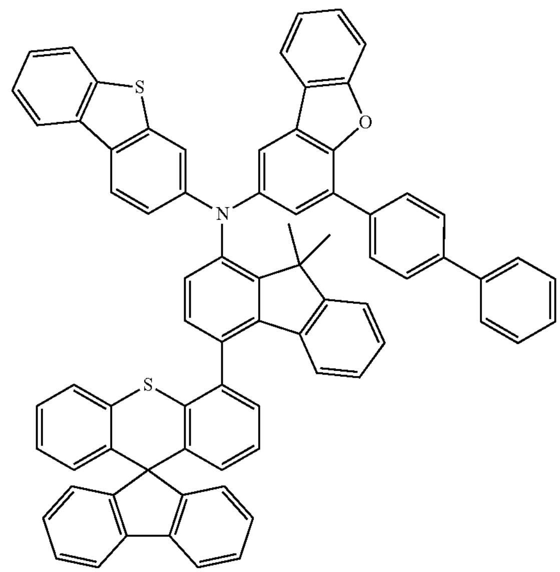
P-76
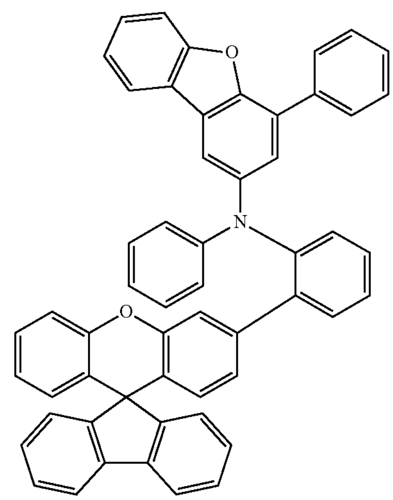
P-77
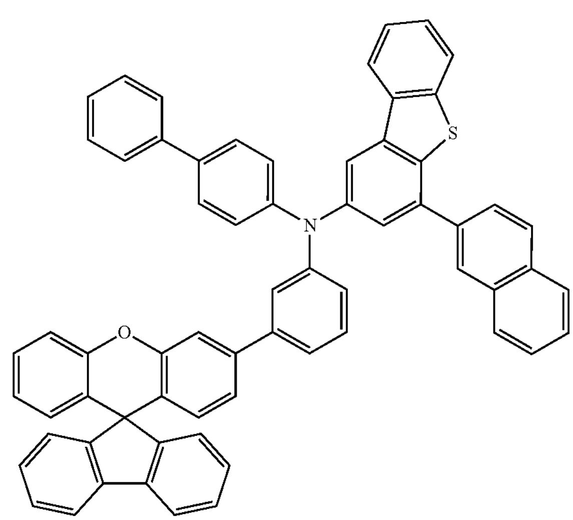

-continued
P-78
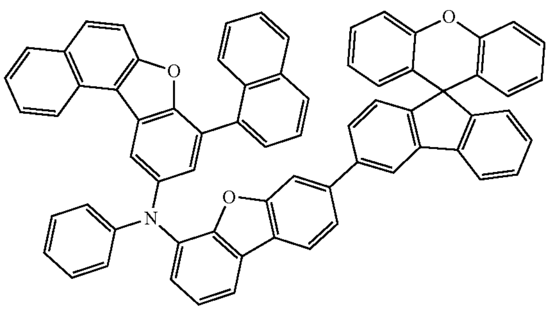
P-79
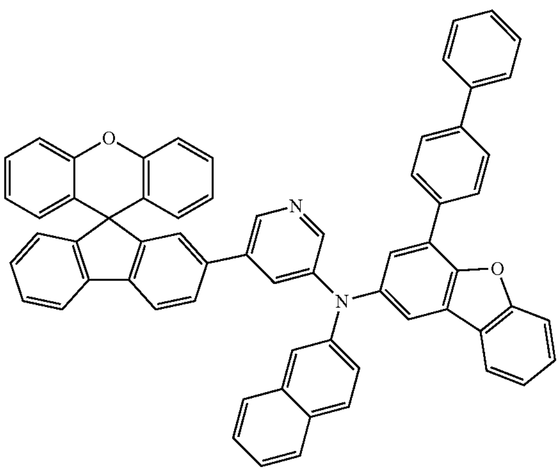
P-80
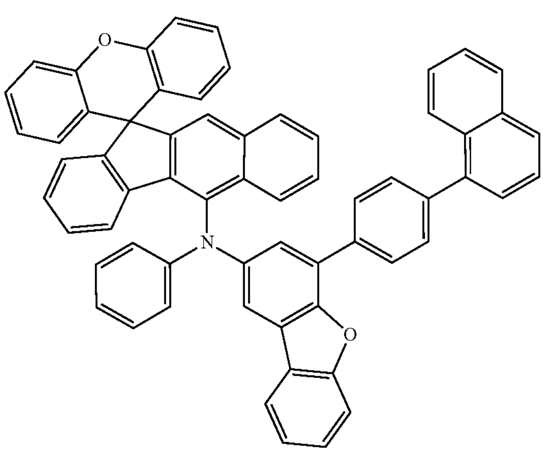
-continued
P-81
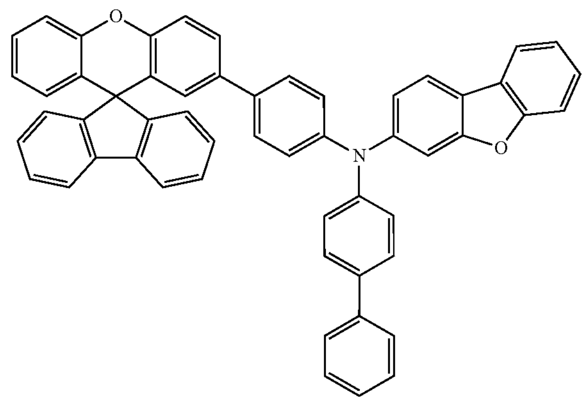
P-82
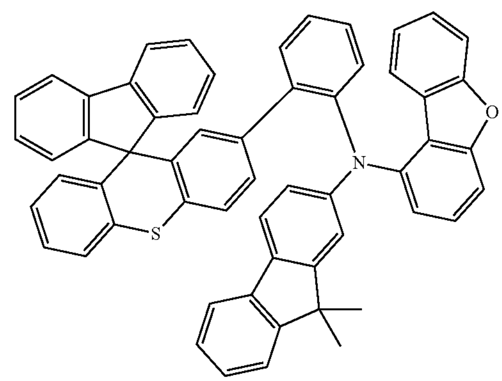
P-83
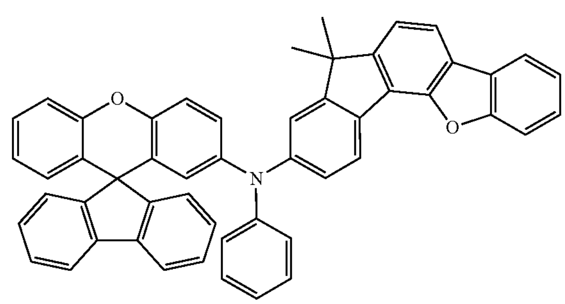
P-84
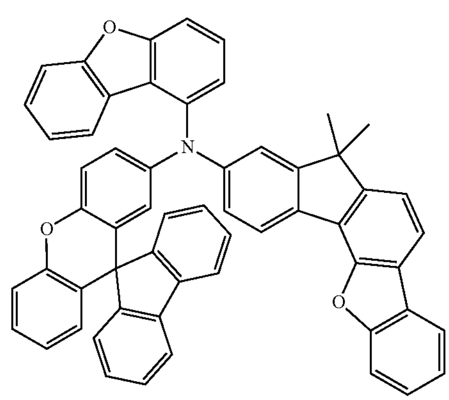

P1-1
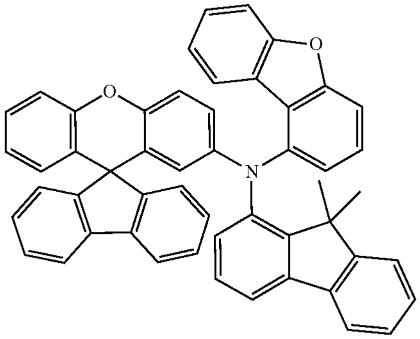
P1-2
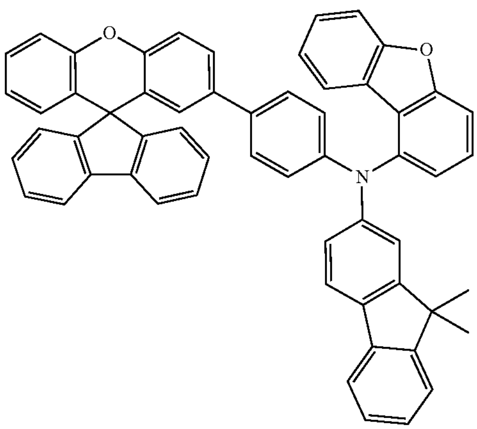
P1-3
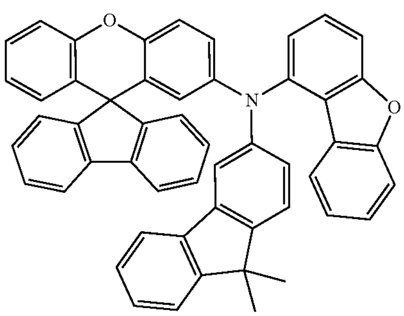
P1-4
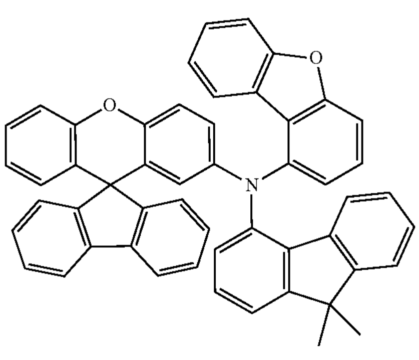
P1-5
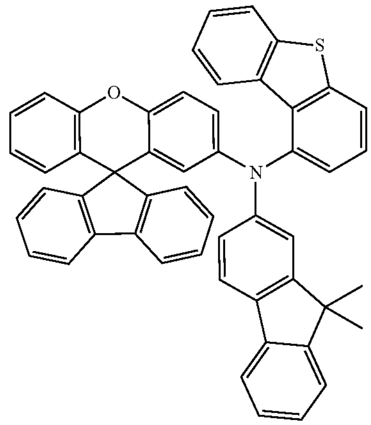
P1-6
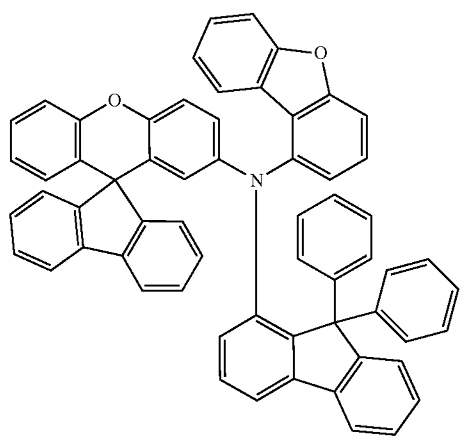
P1-7
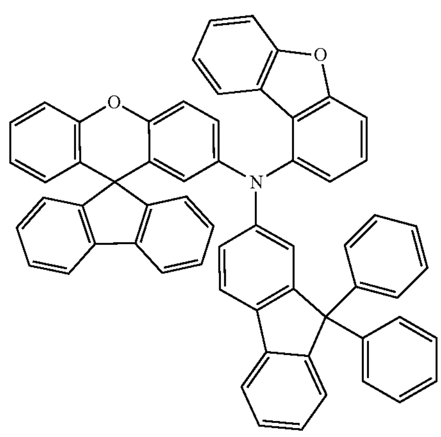

-continued
P1-8
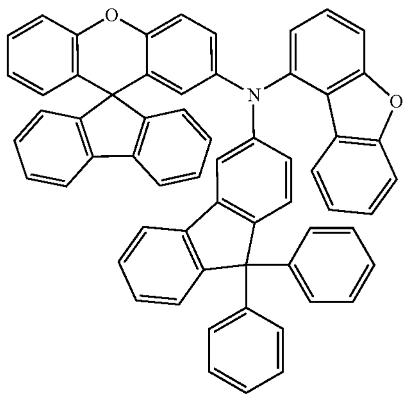
P1-9
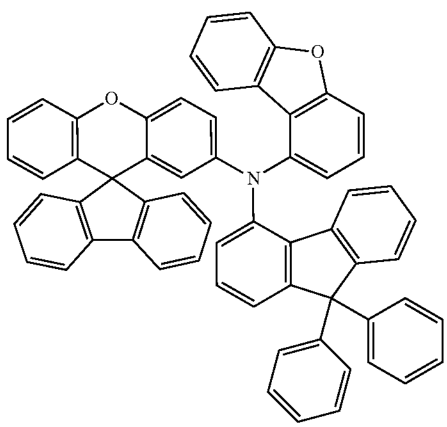
P1-10
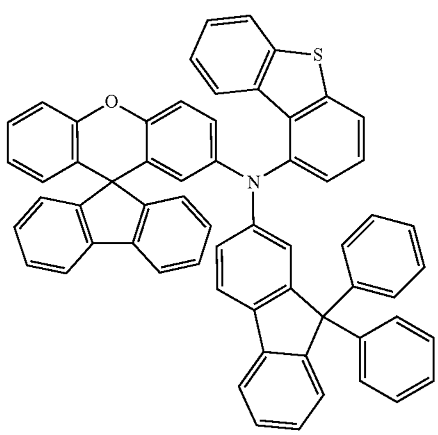
-continued
P1-11
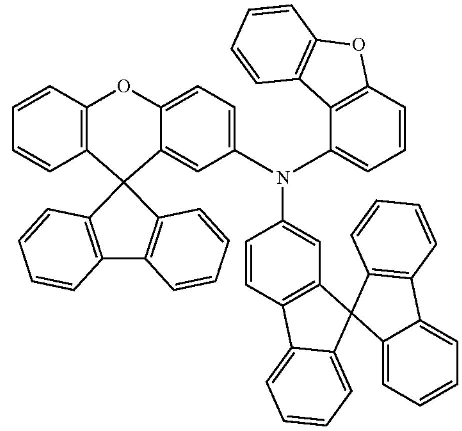
P1-12
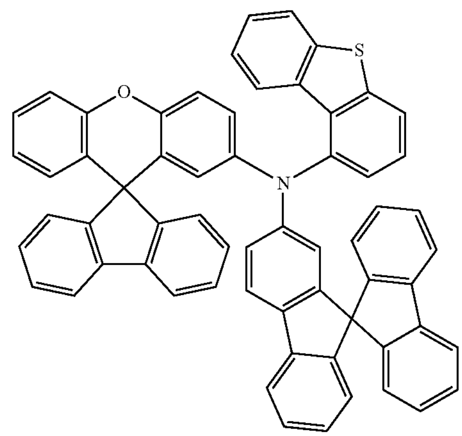
P1-13
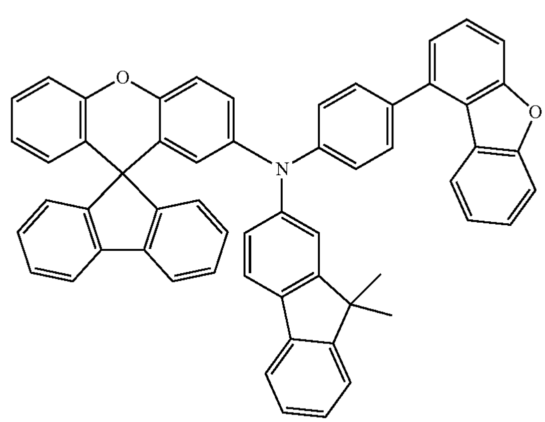

-continued
P1-14
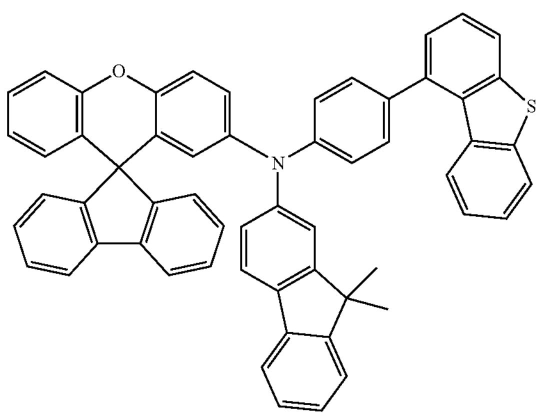
P1-15
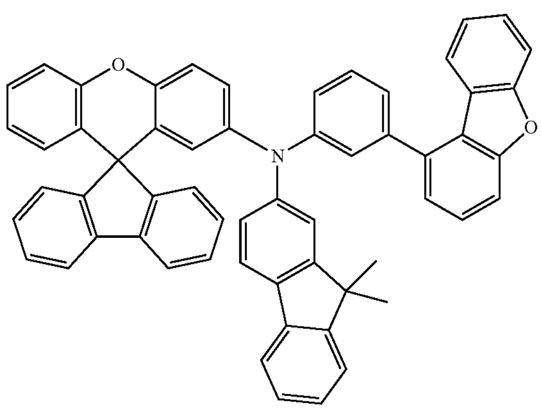
P1-16
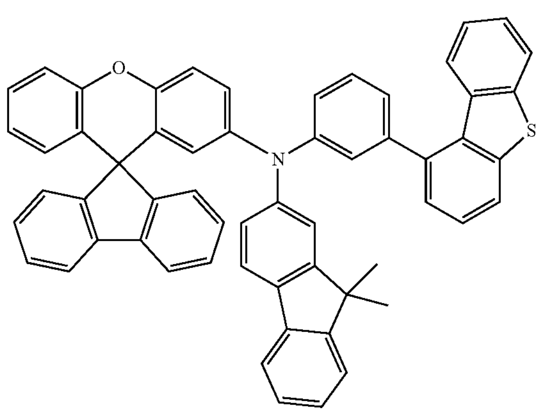
-continued
P1-17
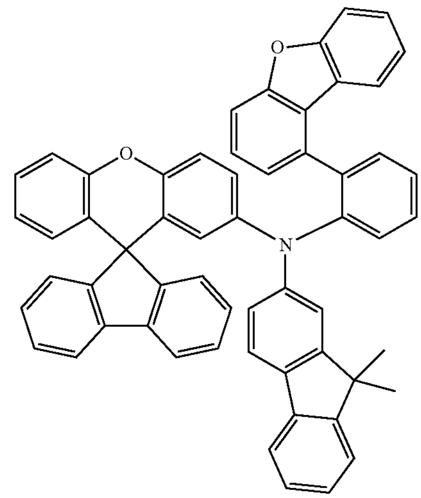
P1-18
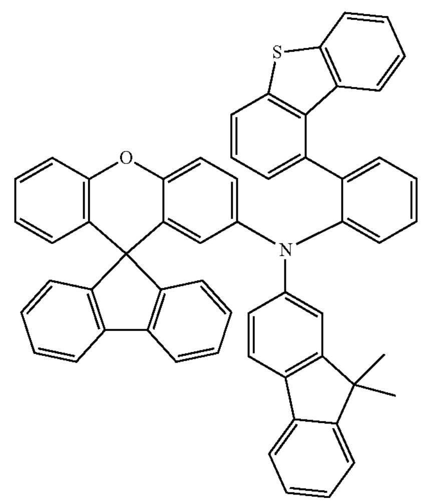
P1-19
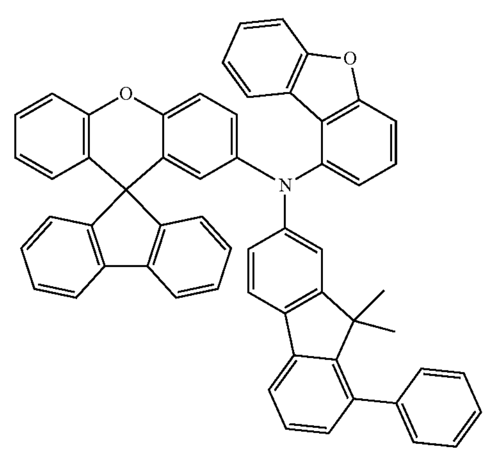

-continued
P1-20
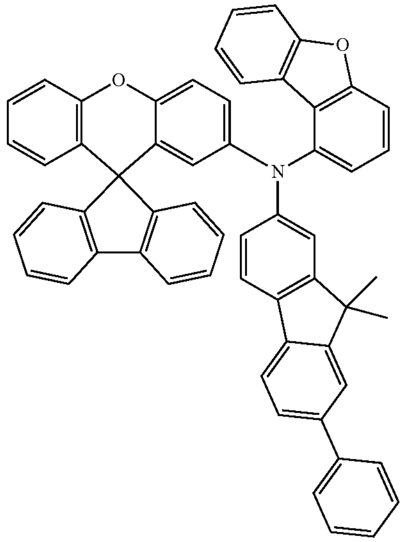
P1-21
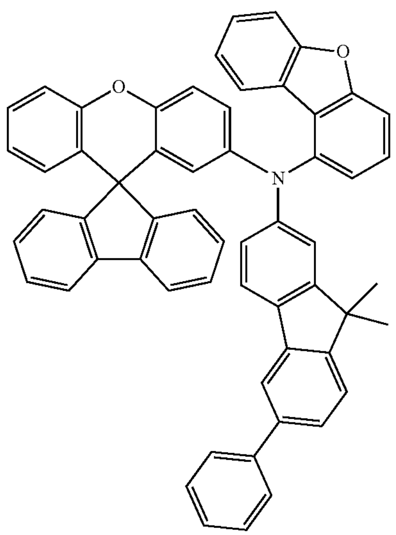
P1-22
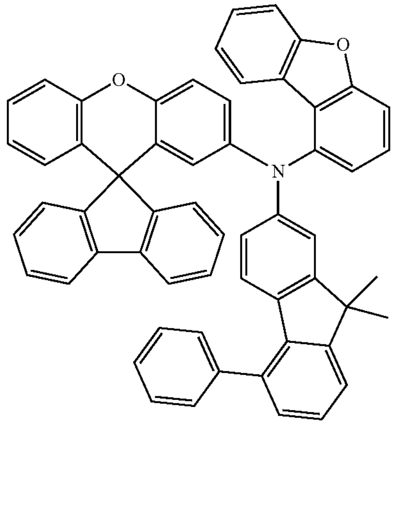
-continued
P1-23
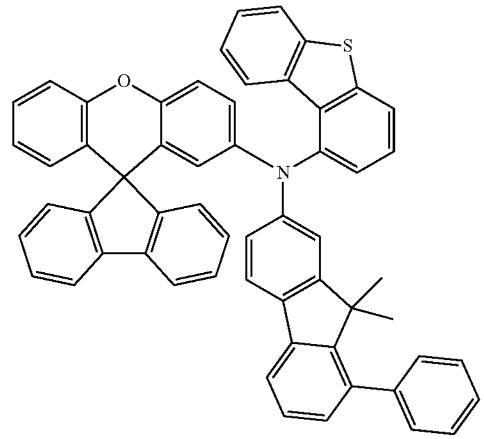
P1-24
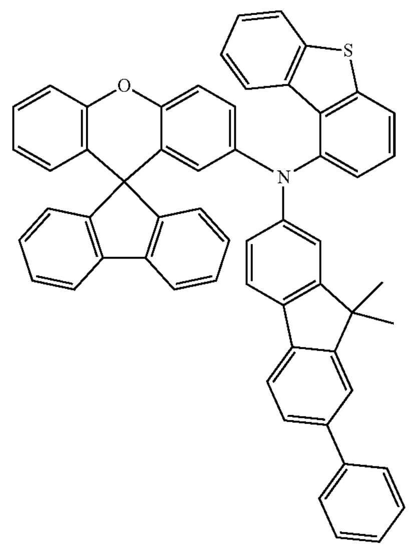
P1-25
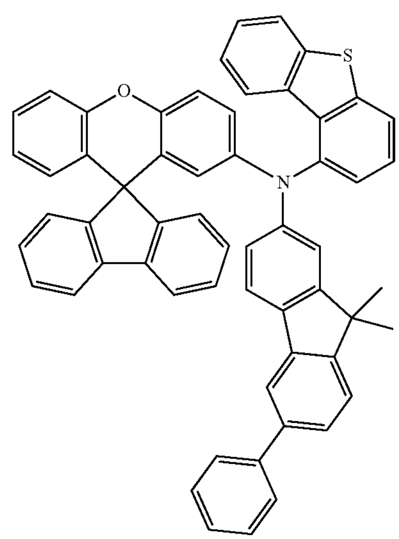

-continued
P1-26
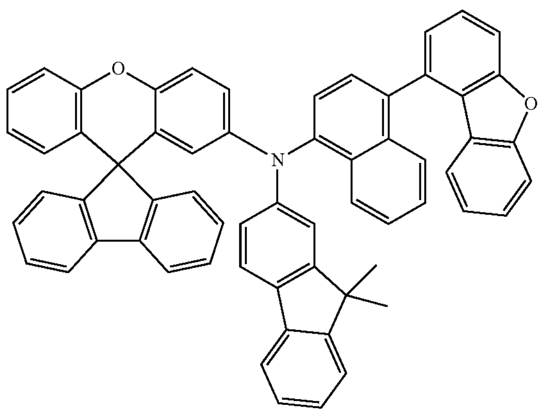
P1-27
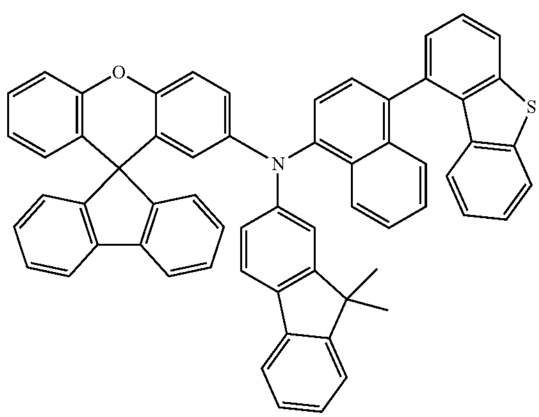
P1-28
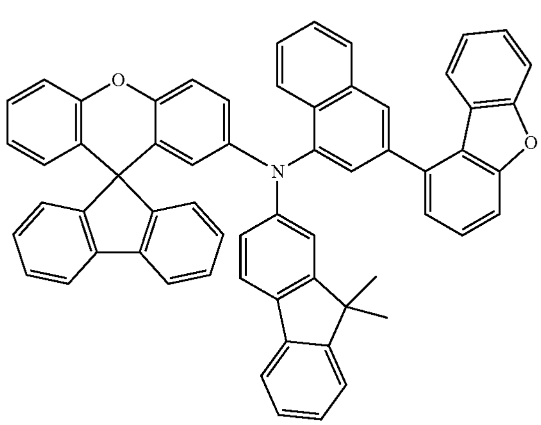
-continued
P1-29
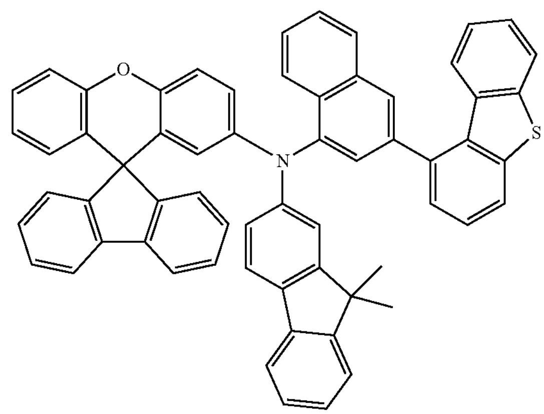
P1-30
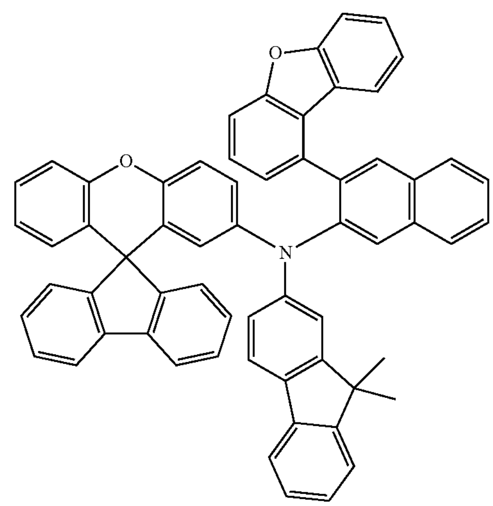
P1-31
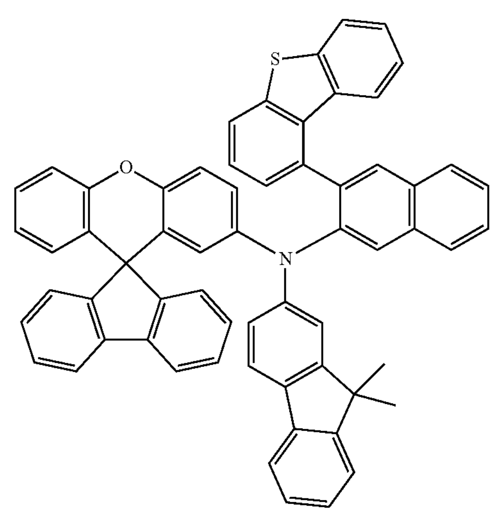

-continued
P1-32
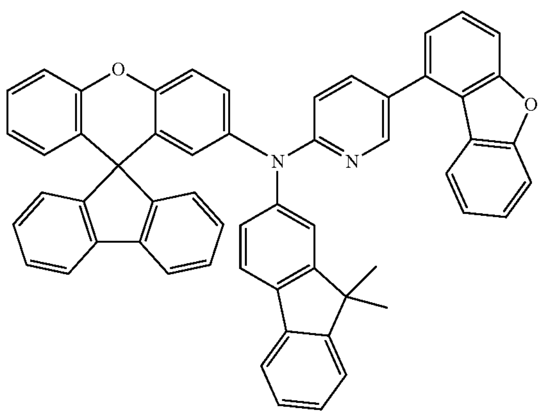
P1-33
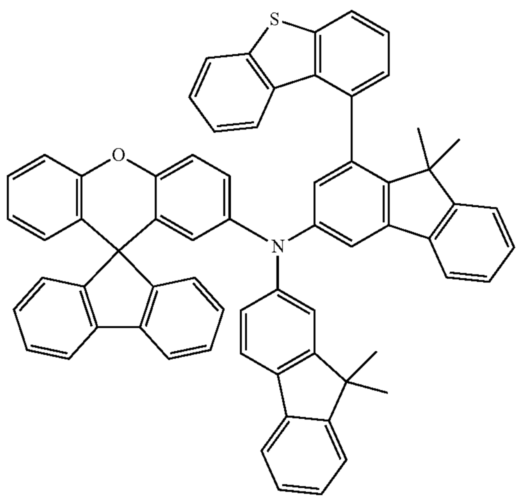
P1-34
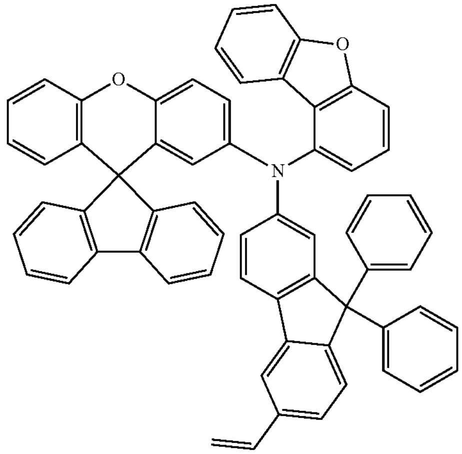
-continued
P1-35
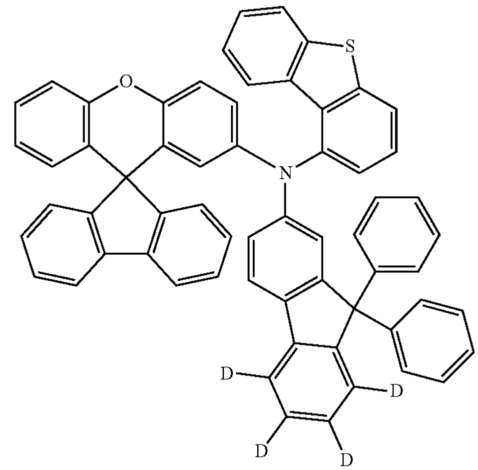
P1-36
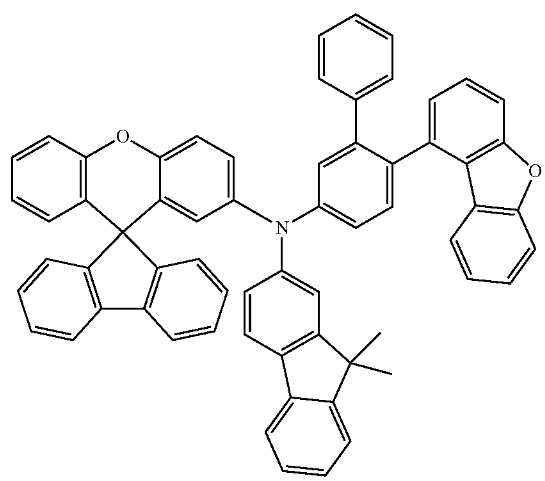
P1-37
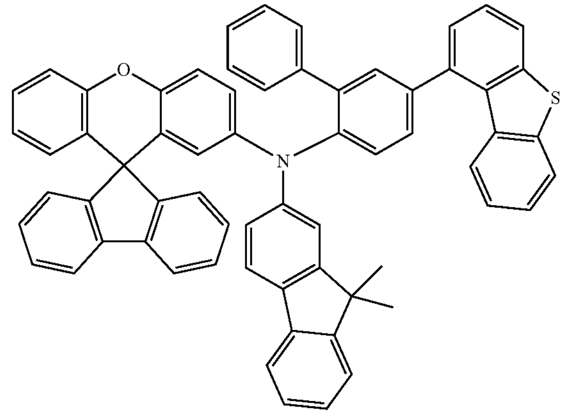

-continued
P1-38
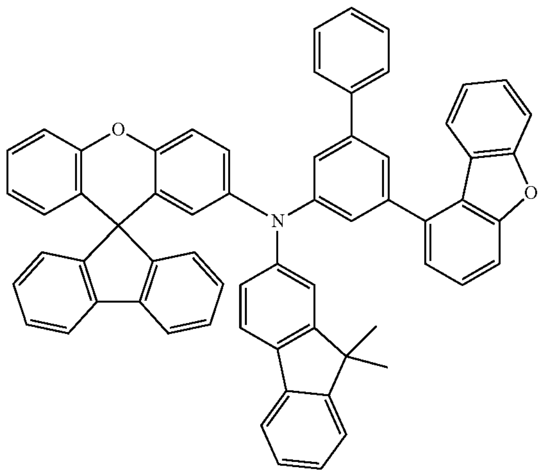
P1-39
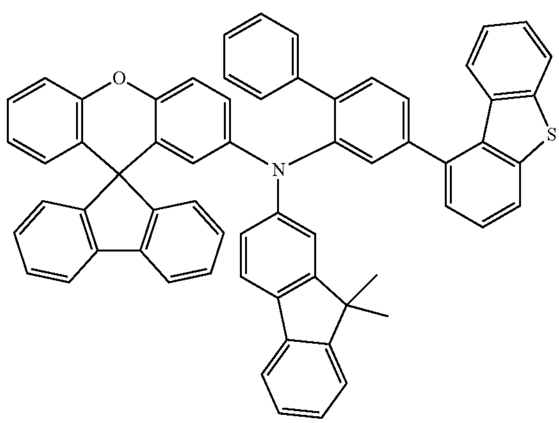
P1-40
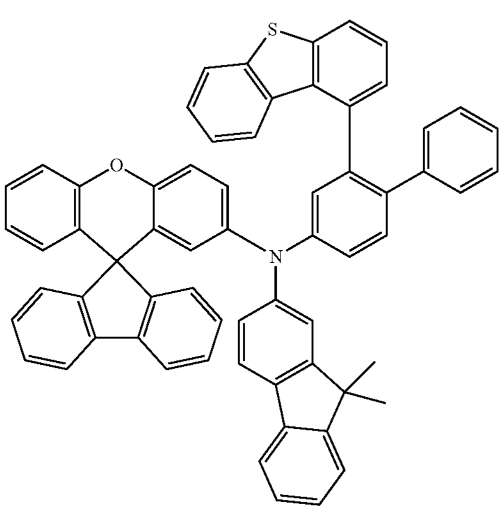
-continued
P1-41
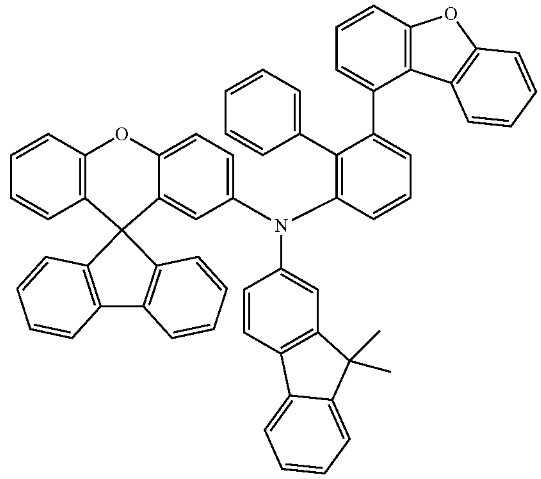
P1-42
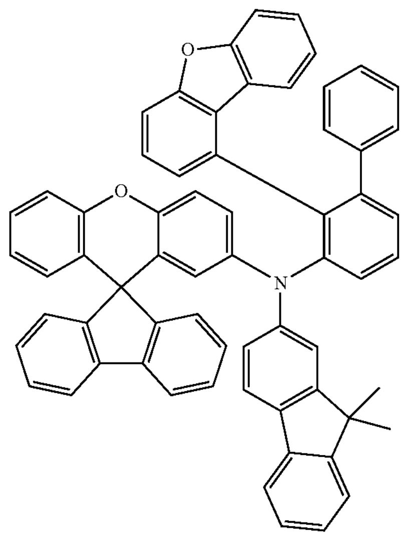
P1-43
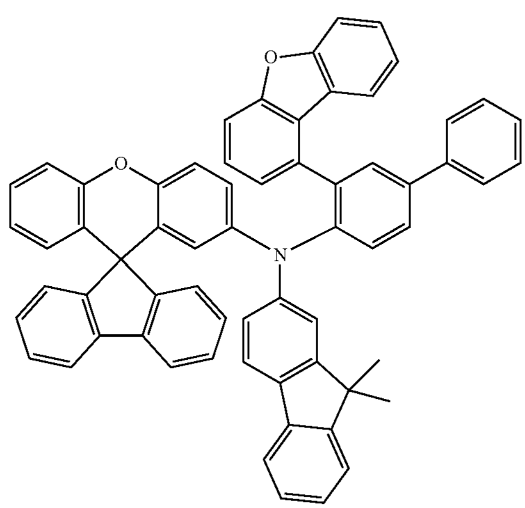

P1-44
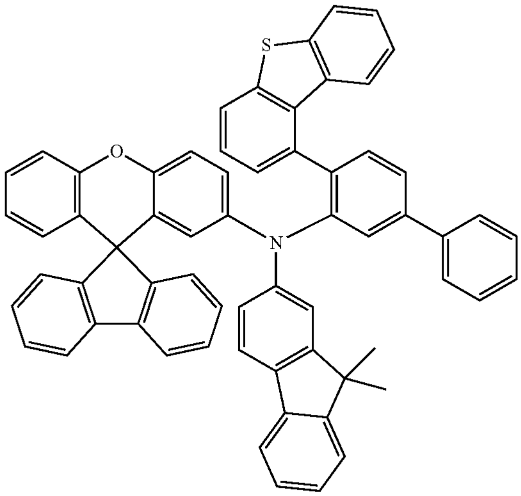
P1-45
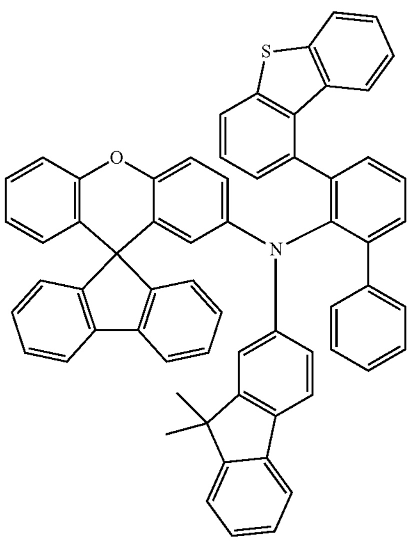
P1-46
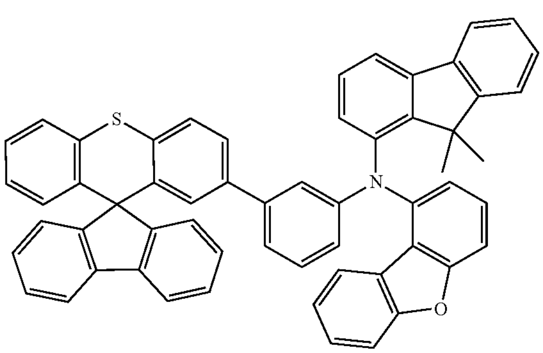
P1-47
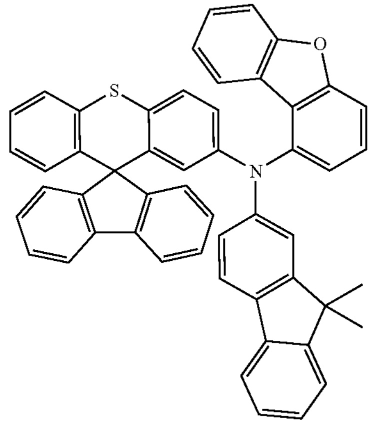
P1-48
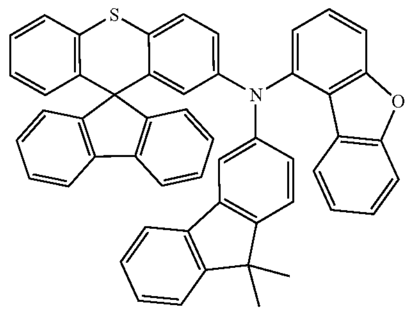
P1-49
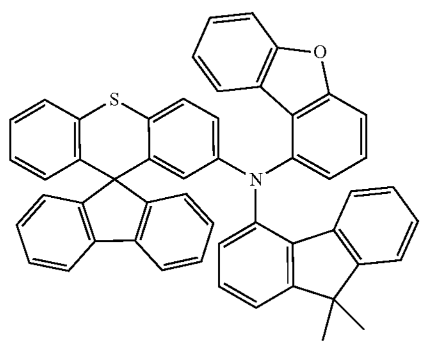
P1-50
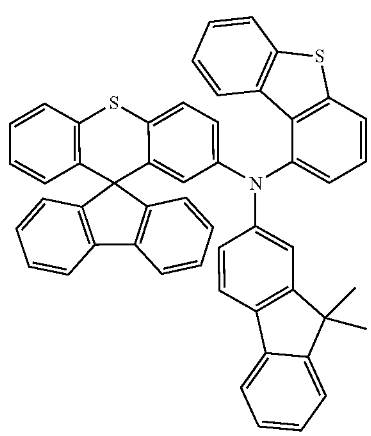

P1-51
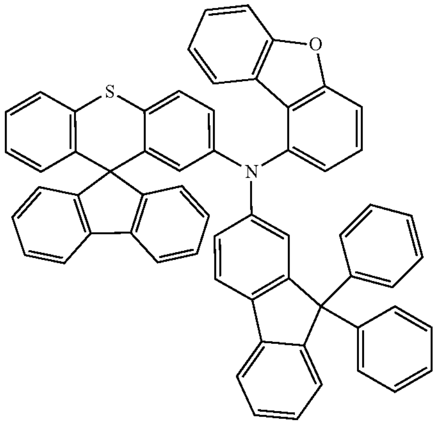
P1-54
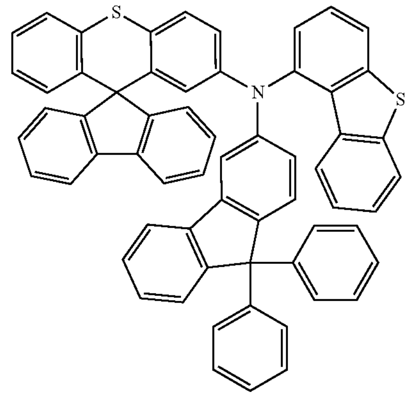
P1-52
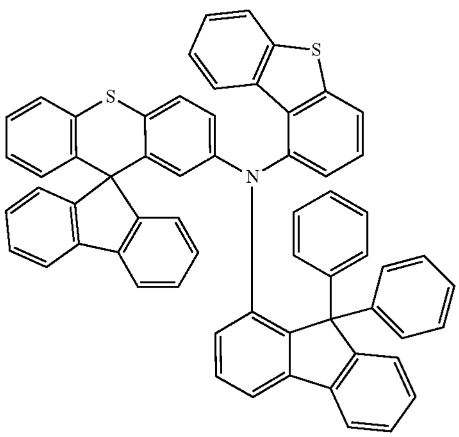
P1-55
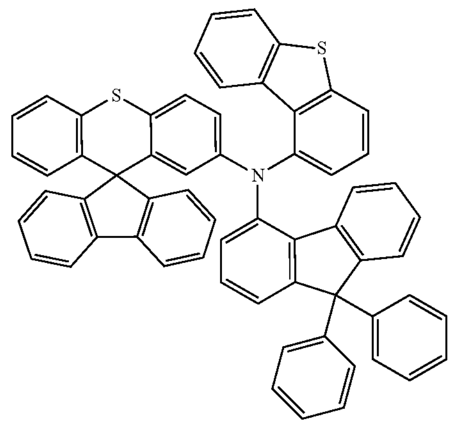
P1-53
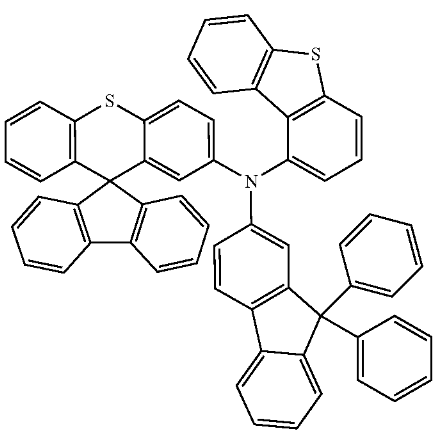
P1-56
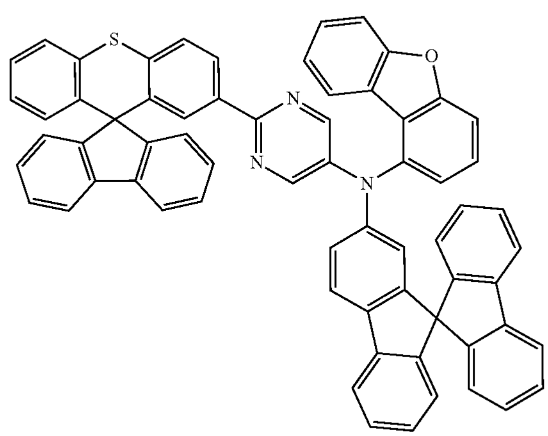

P1-57
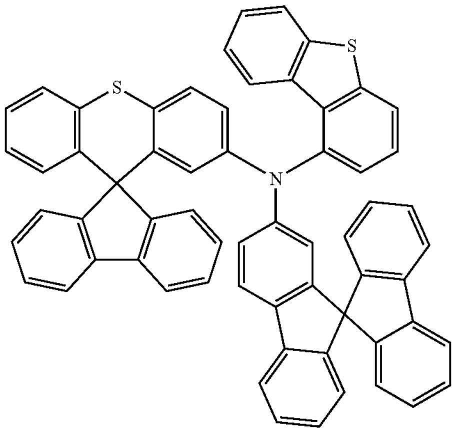
P1-58
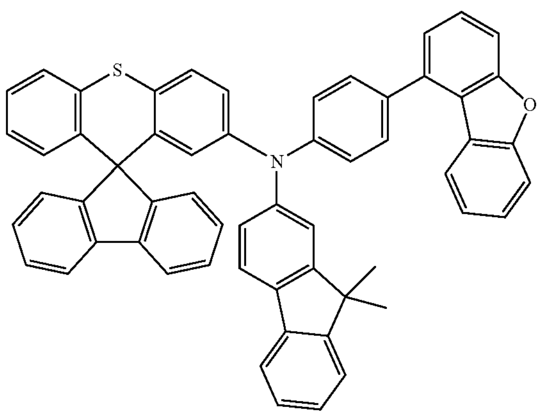
P1-59
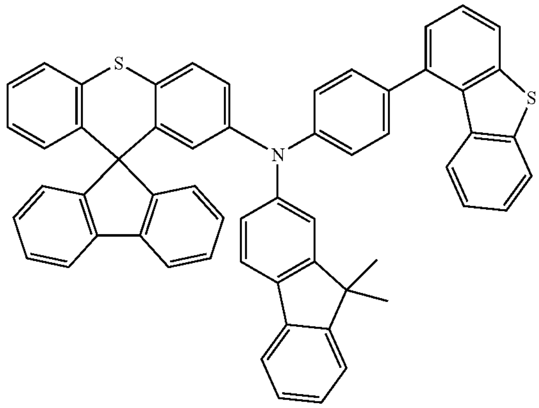
P1-60
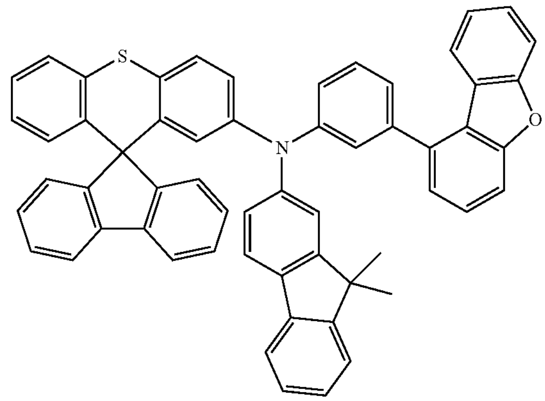
P1-61
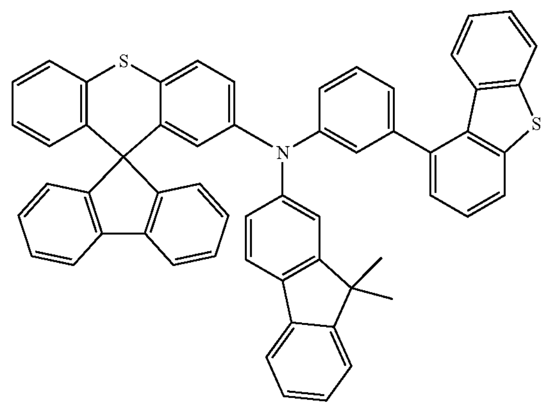
P1-62
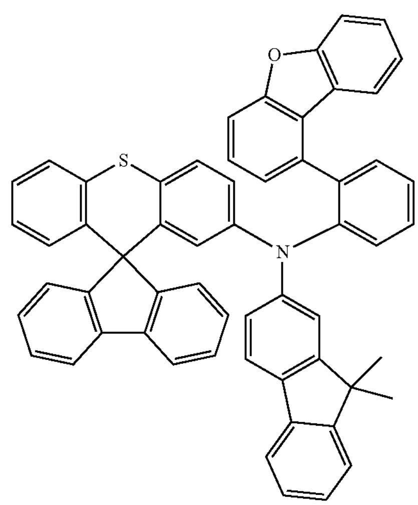

-continued
P1-63
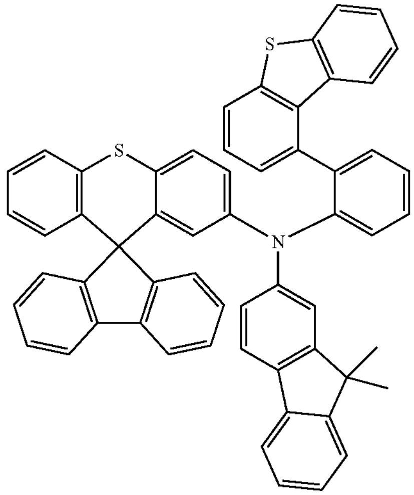
P1-64
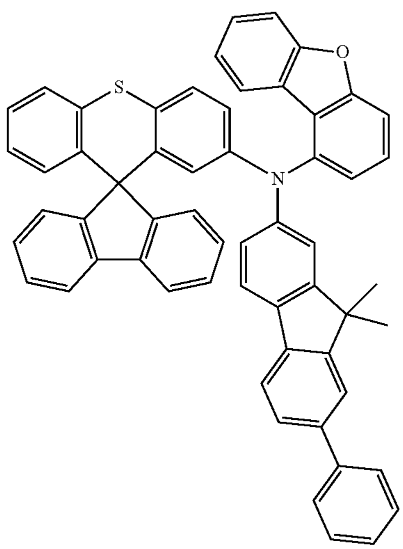
P1-65
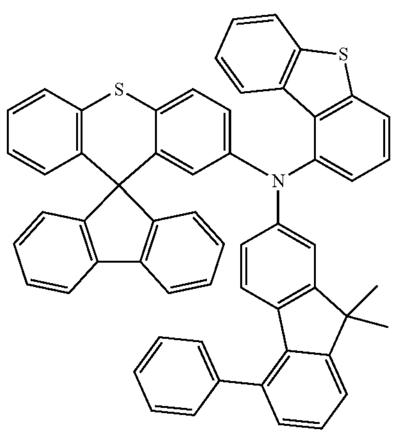
-continued
P1-66
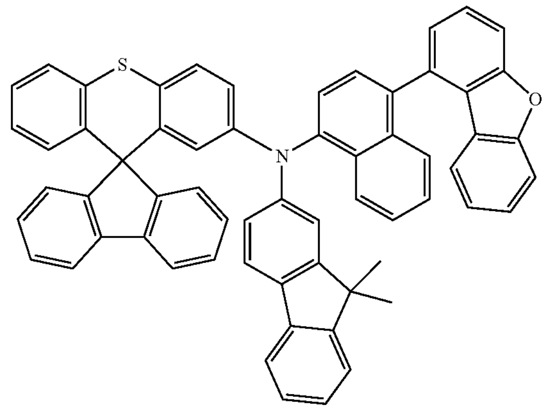
P1-67
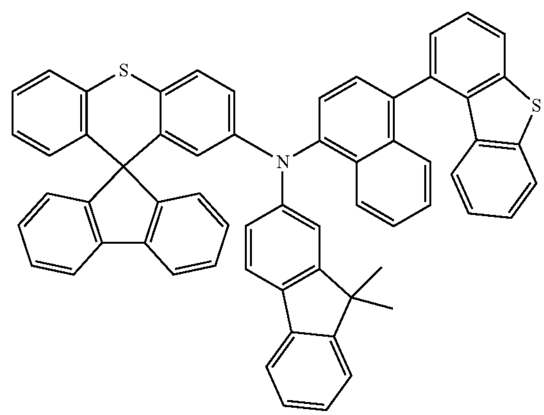
P1-68
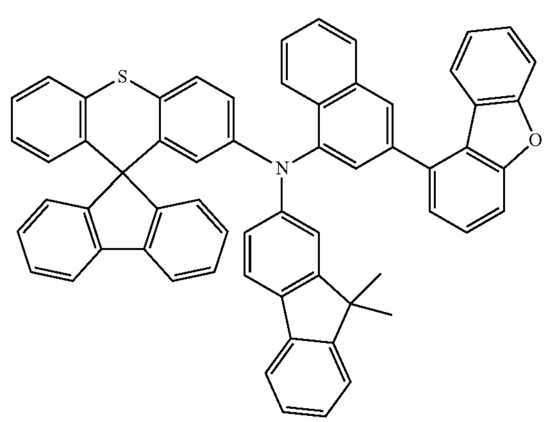

-continued
P1-69
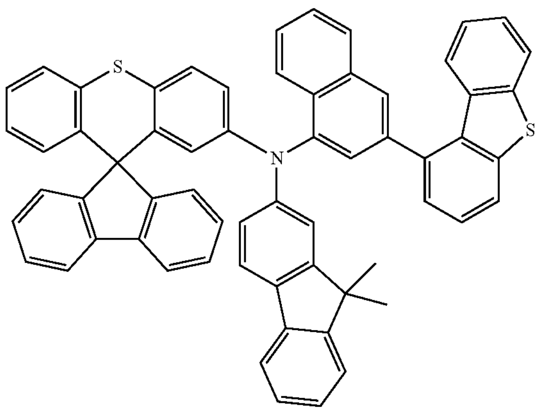
P1-70
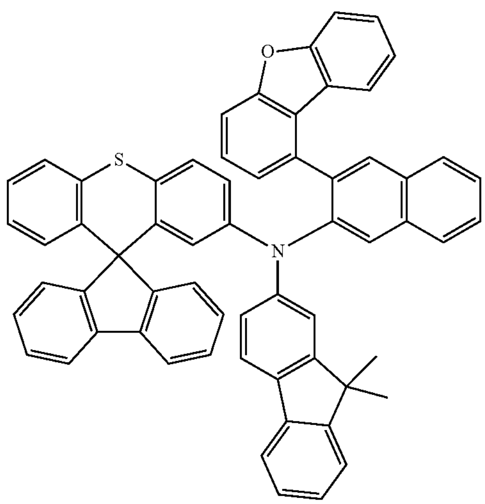
P1-71
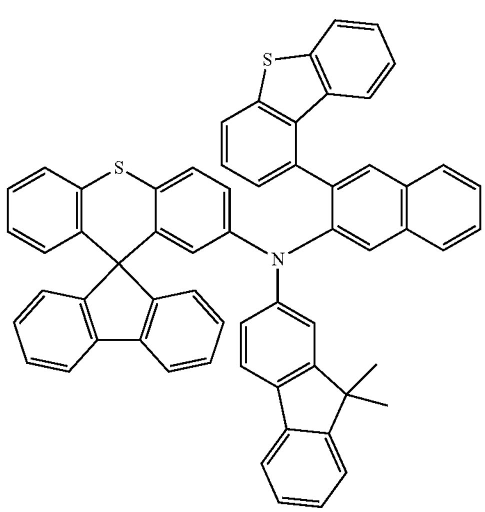
-continued
P1-72
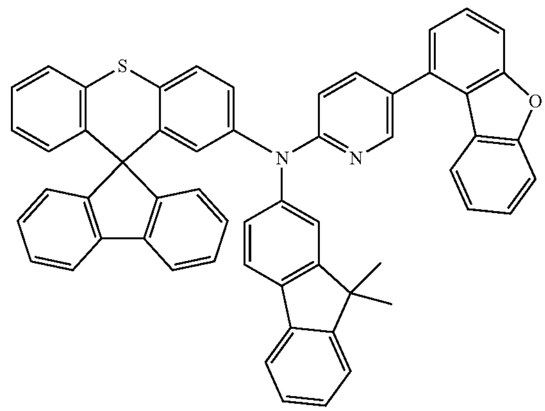
P1-73
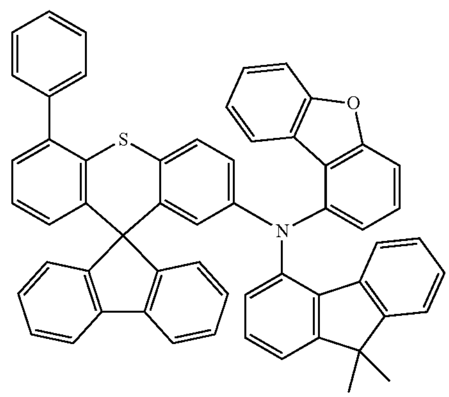
P1-74
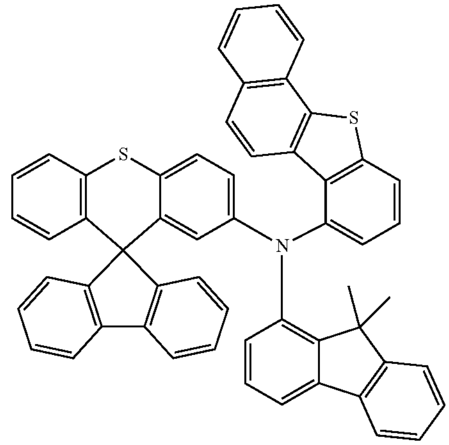

-continued
P1-75
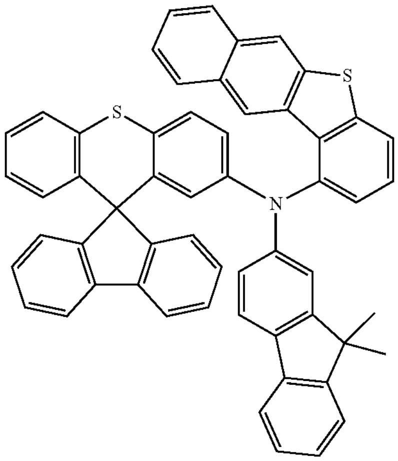
P1-76
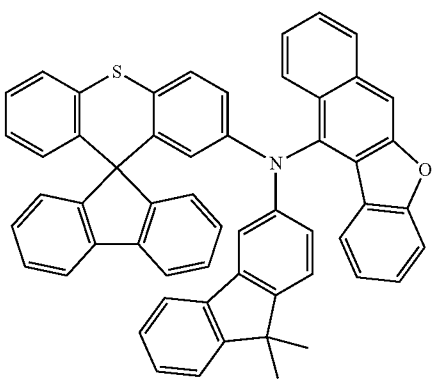
P1-77
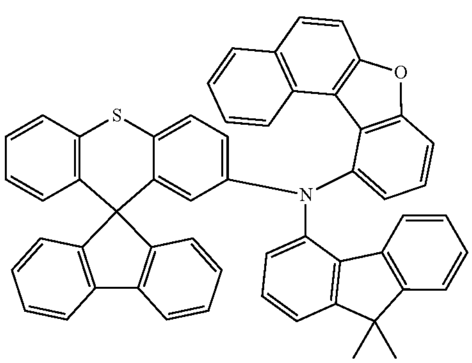
-continued
P1-78
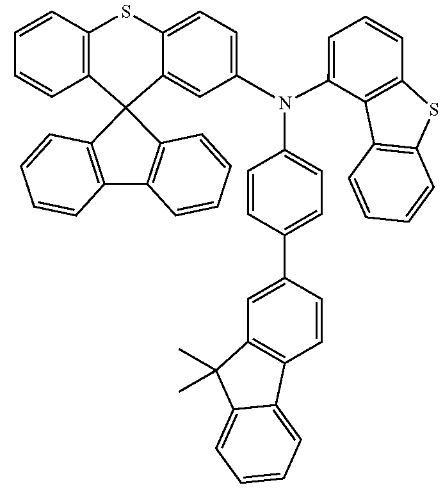
P1-79
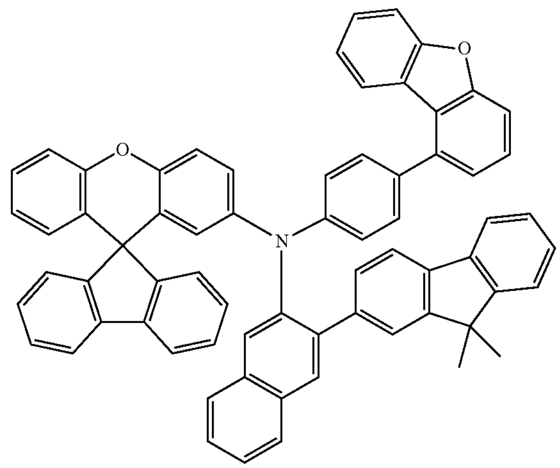
P1-80
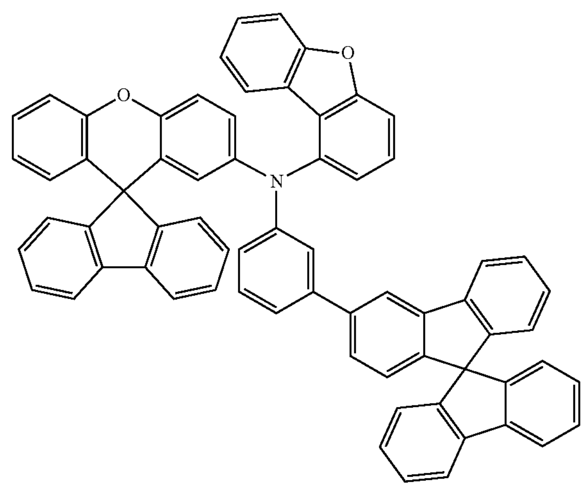

-continued
P1-81
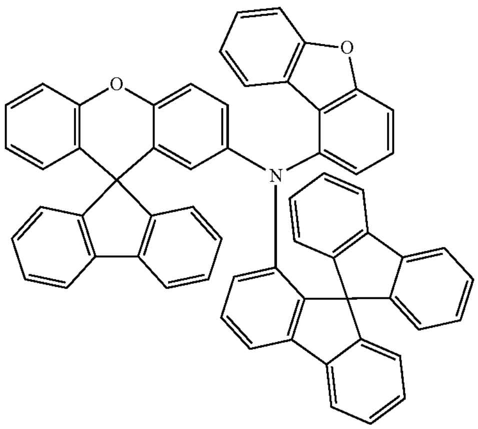
P1-82
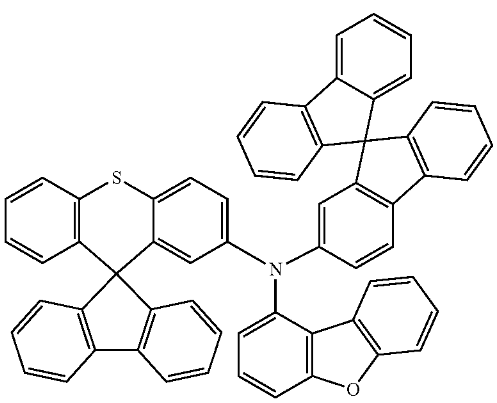
P1-83
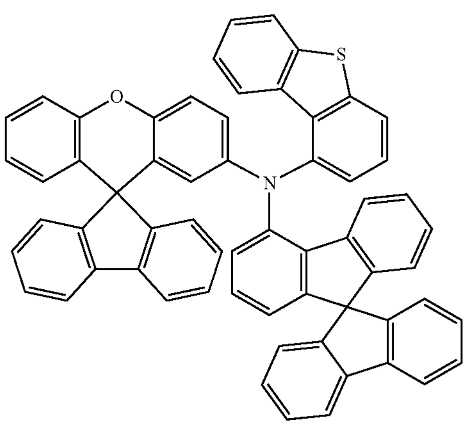
-continued
P1-84
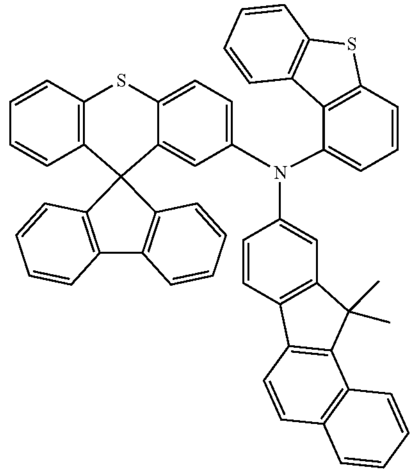
P1-85
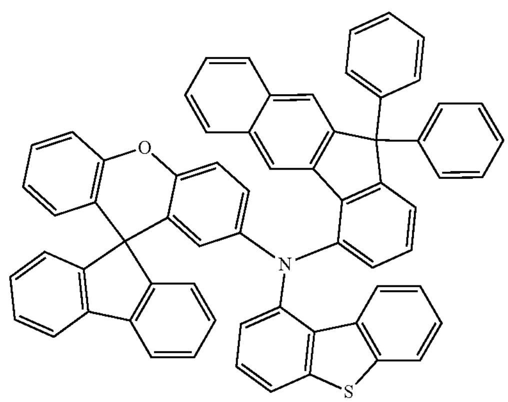
P1-86
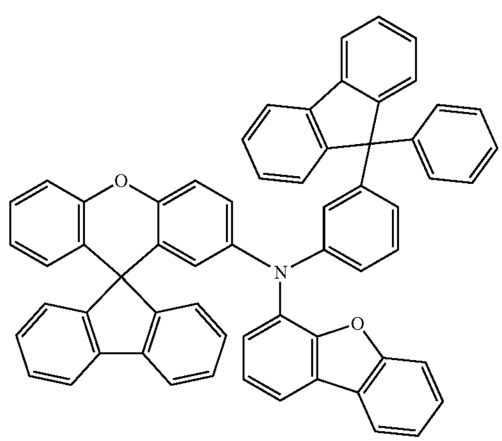

-continued
P1-87
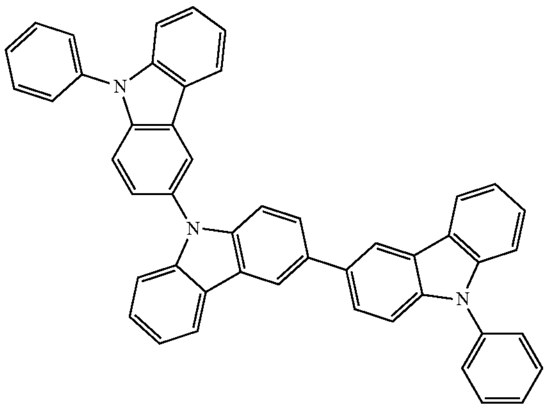
P2-1
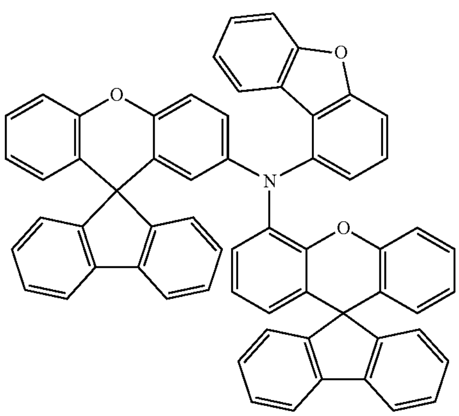
P2-2
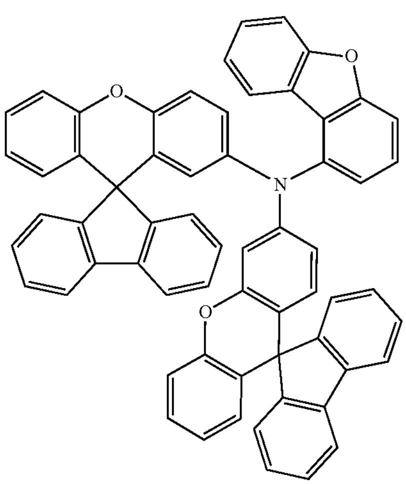
-continued
P2-3
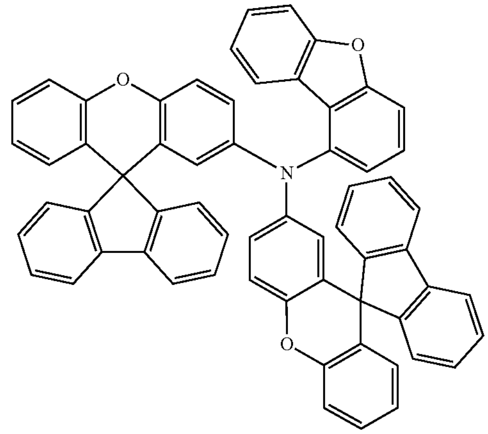
P2-4
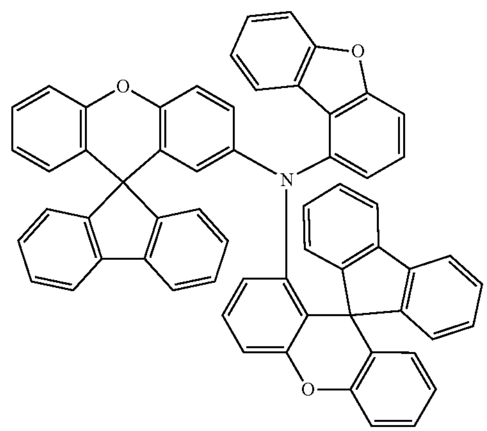
P2-5
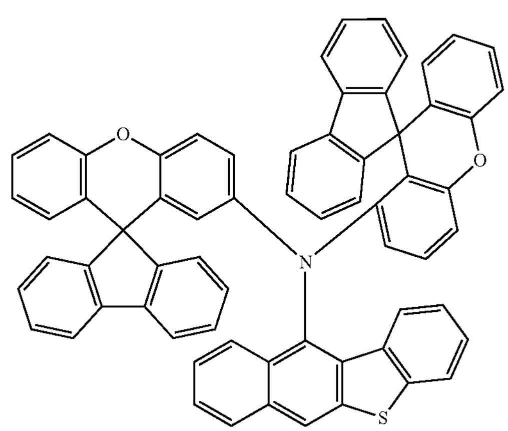

-continued
P2-6
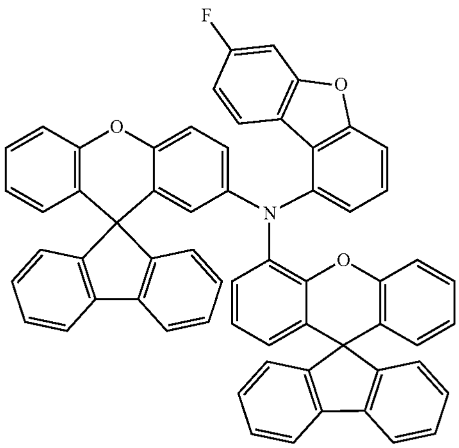
P2-7
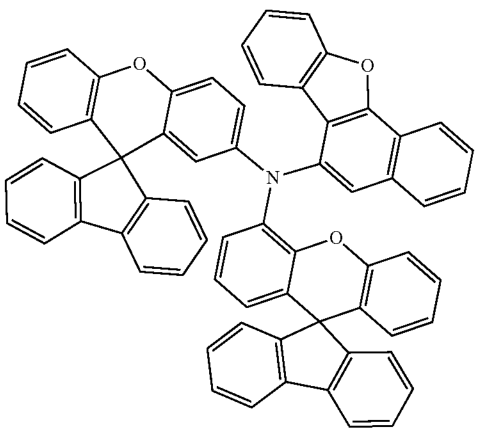
P2-8
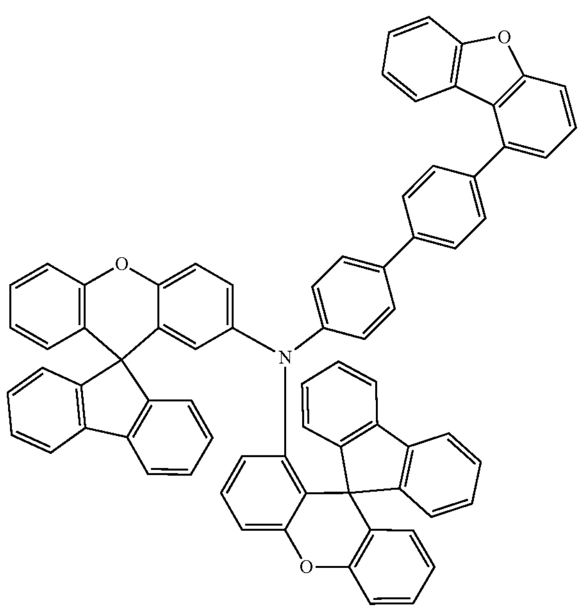
-continued
P2-9
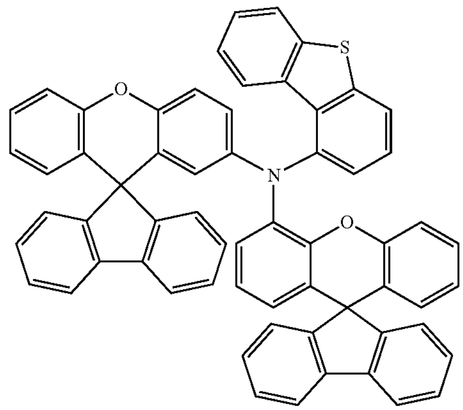
P2-10
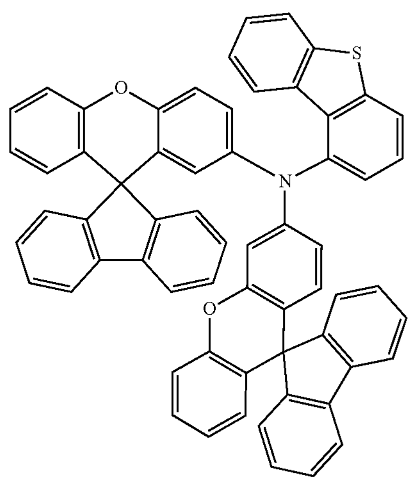
P2-11
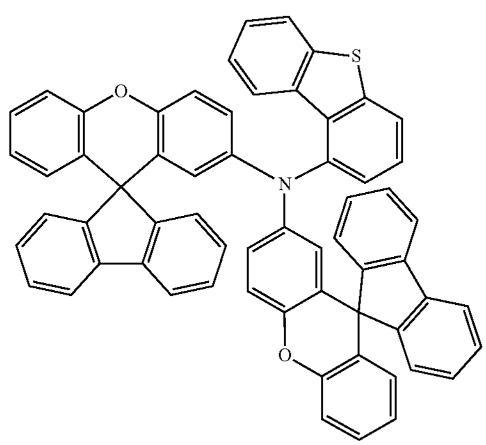

-continued
P2-12
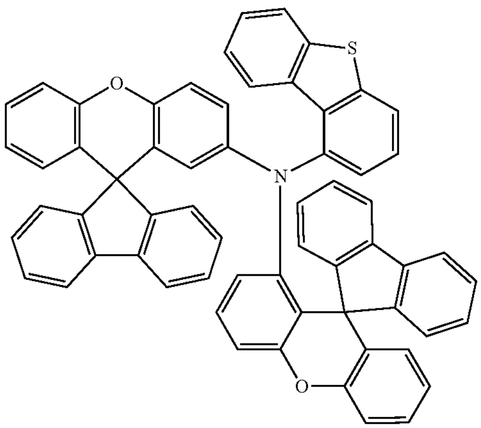
P2-13
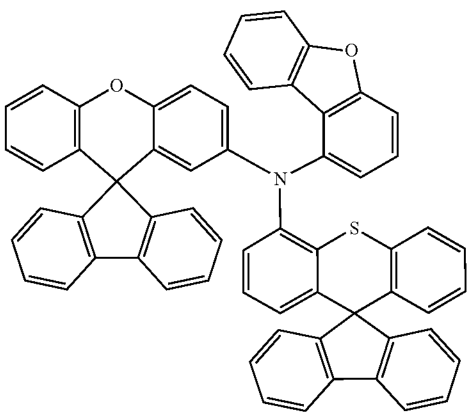
P2-14
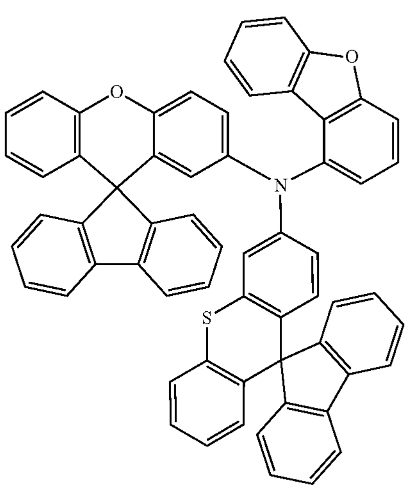
-continued
P2-15
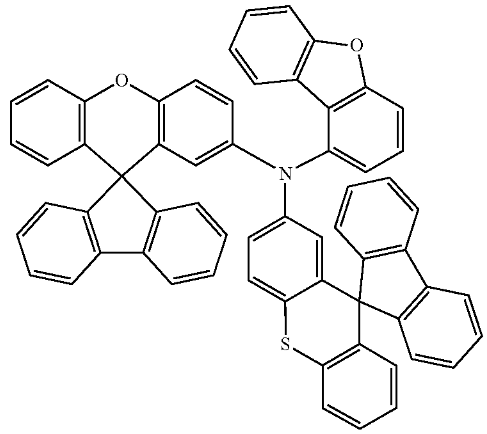
P2-16
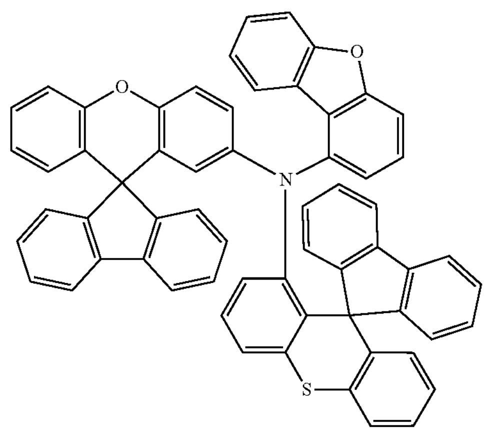
P2-17
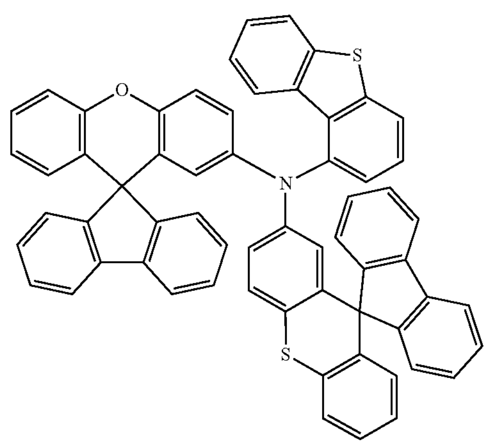

-continued
P2-18
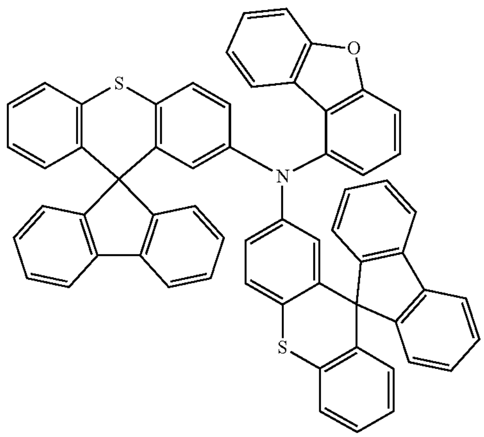
P2-19
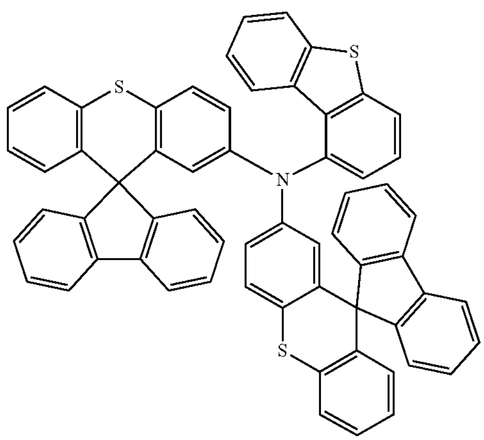
P2-20
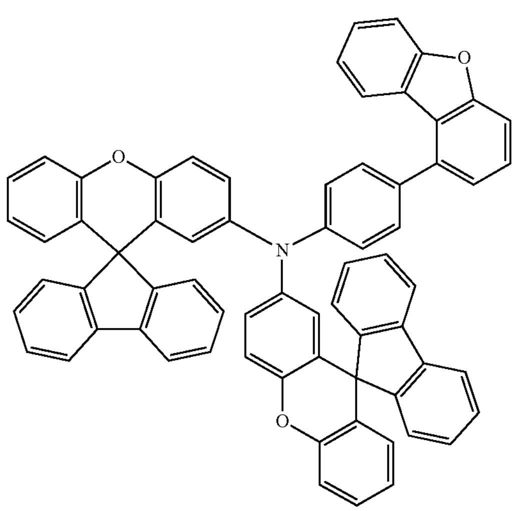
-continued
P2-21
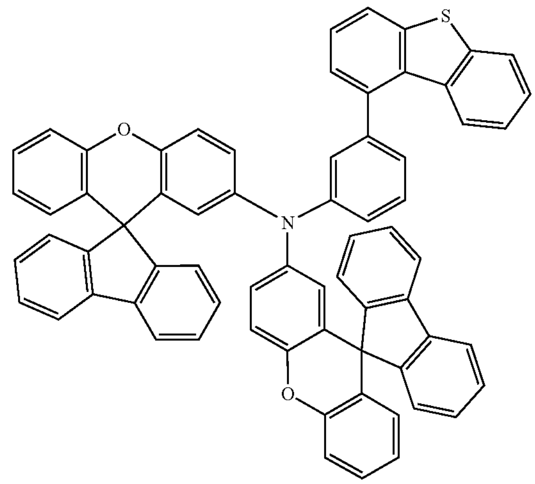
P2-22
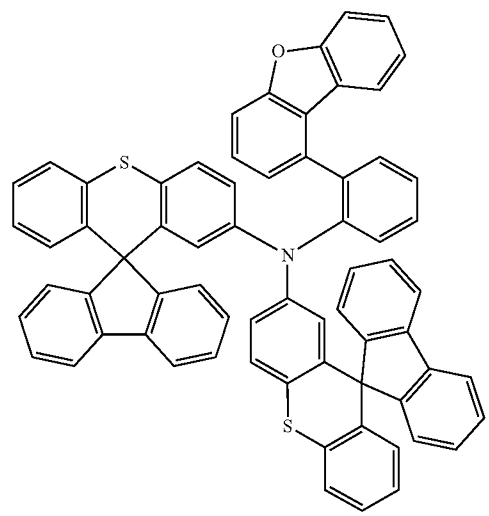
P2-23
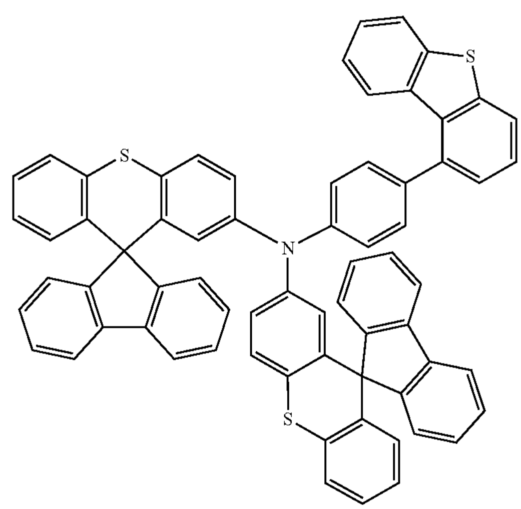

-continued
P2-24
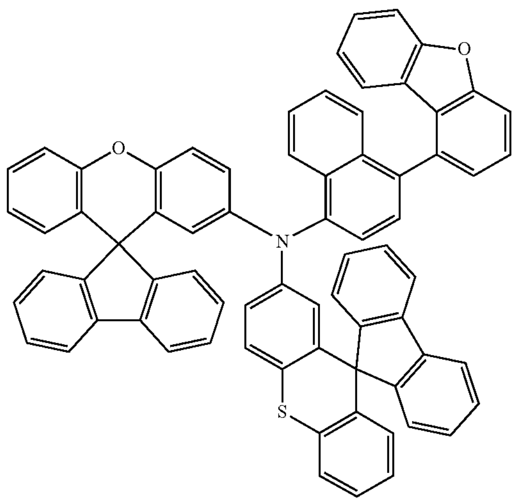
P2-25
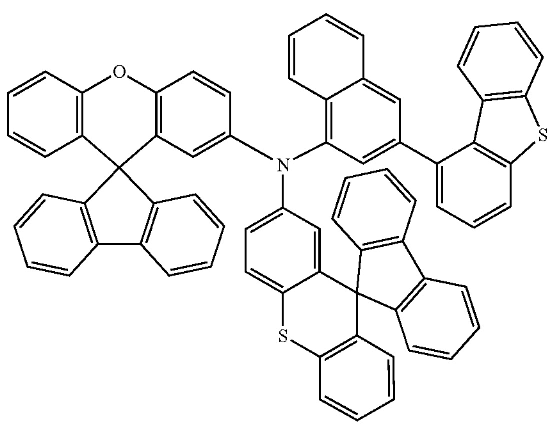
P2-26
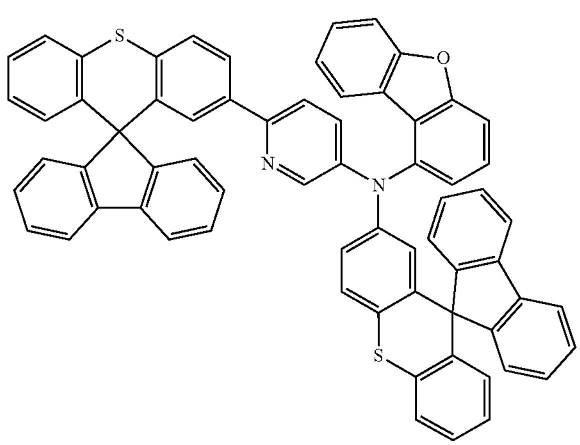
-continued
P2-27
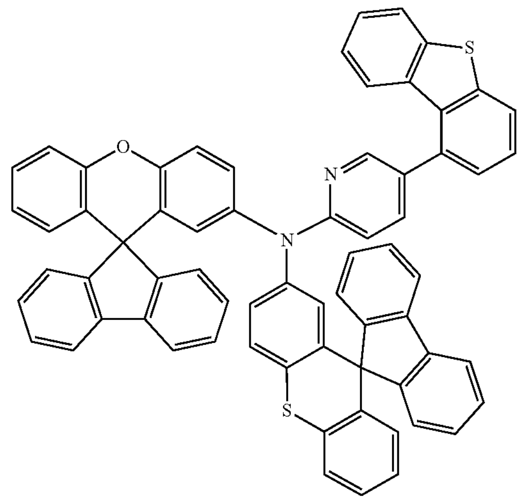
P2-28
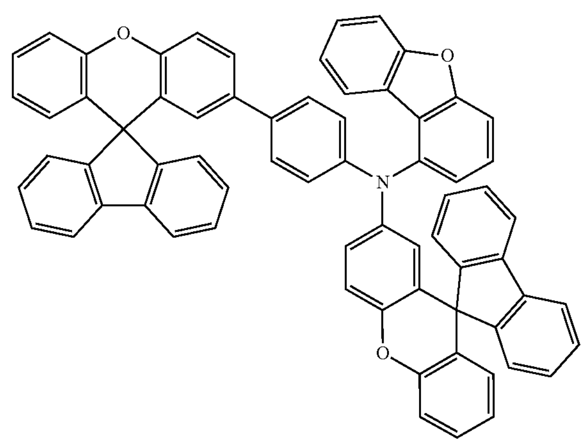
P2-29
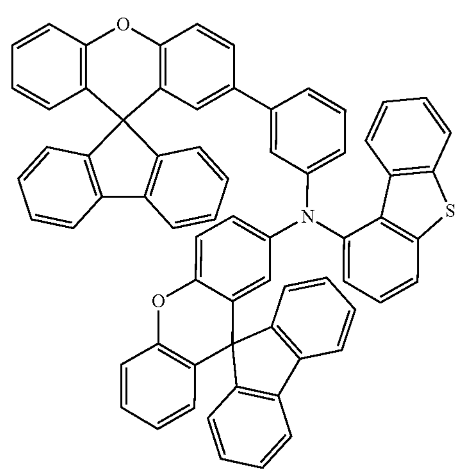

-continued
P2-30
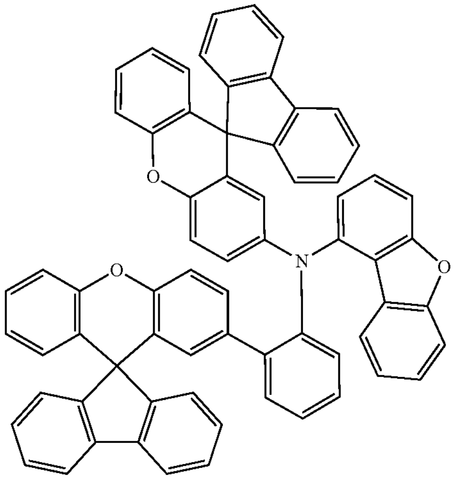
P2-31
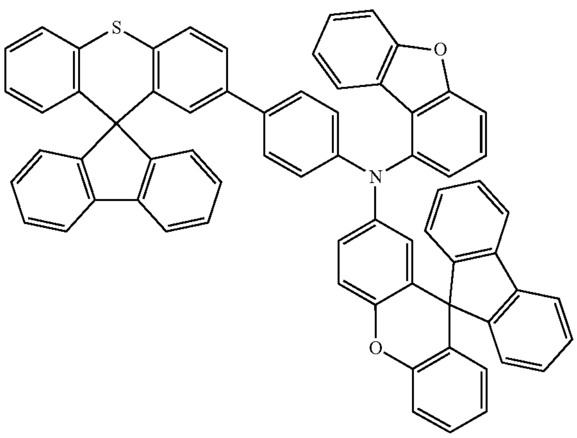
P2-32
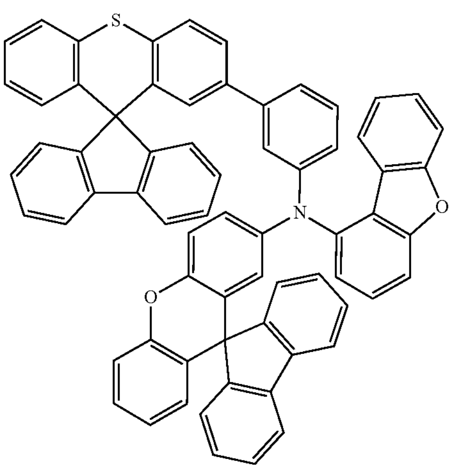
-continued
P2-33
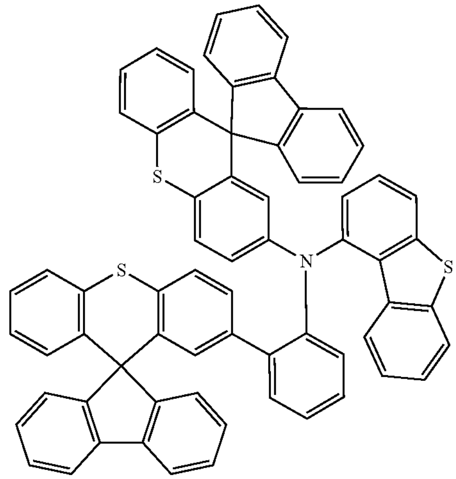
P2-34
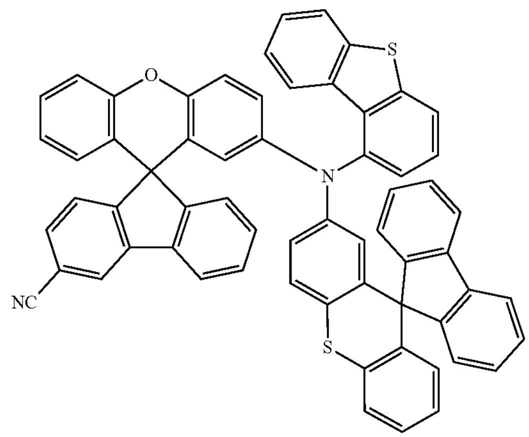
P2-35
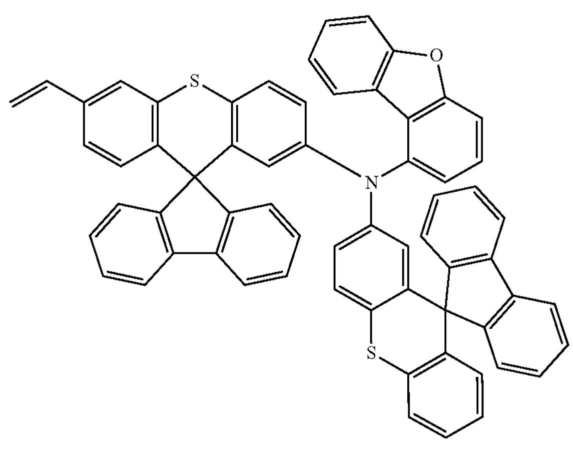

P2-36
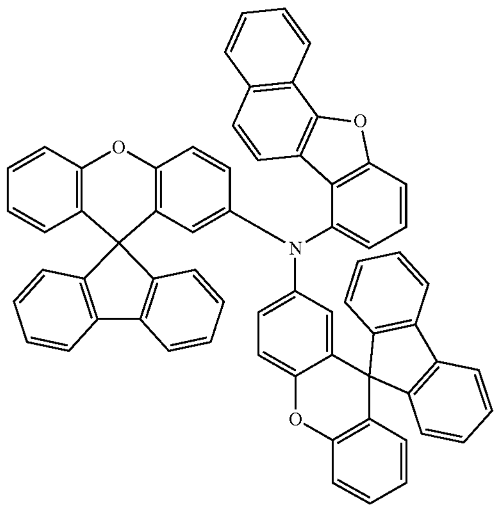
P2-37
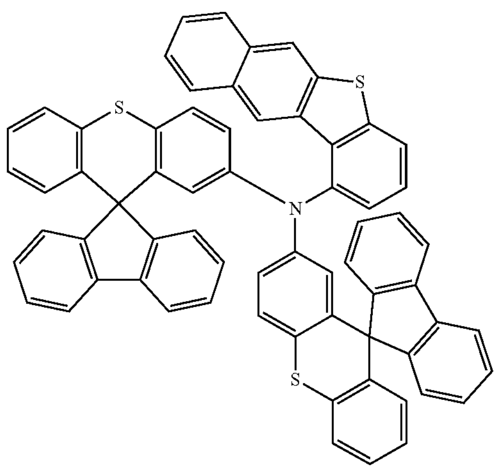
P2-38
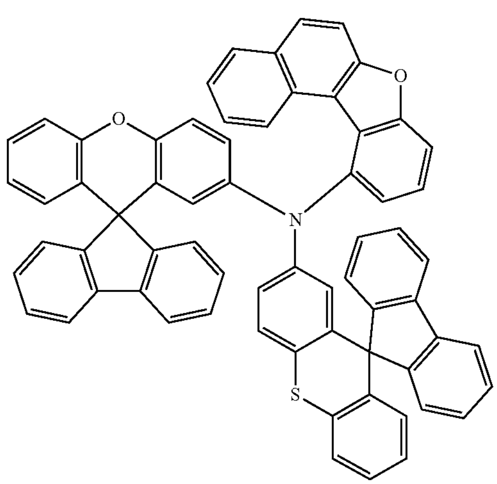
P2-39
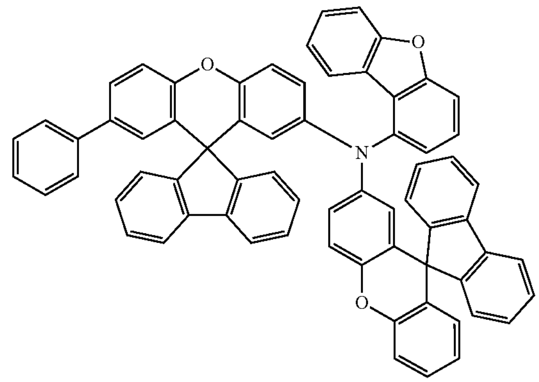
P2-40
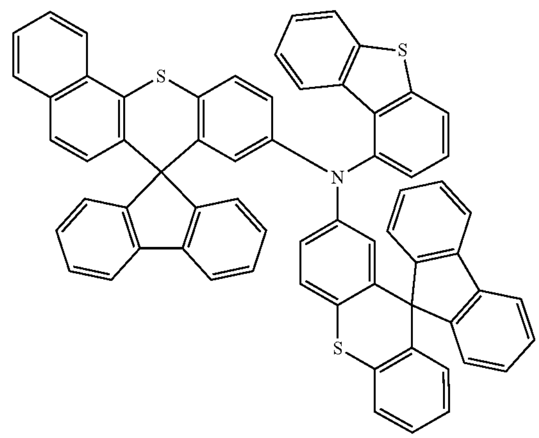
P2-41
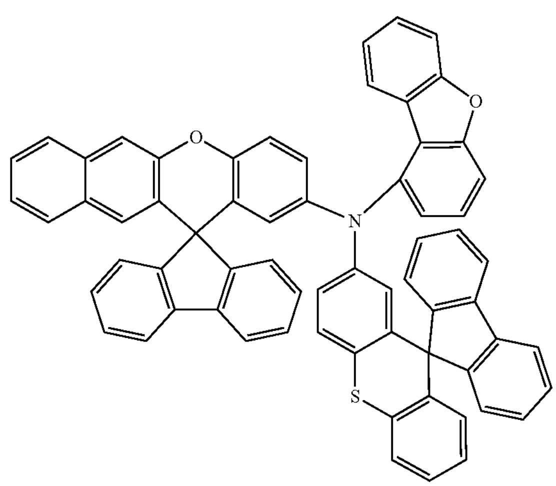

-continued
P2-42
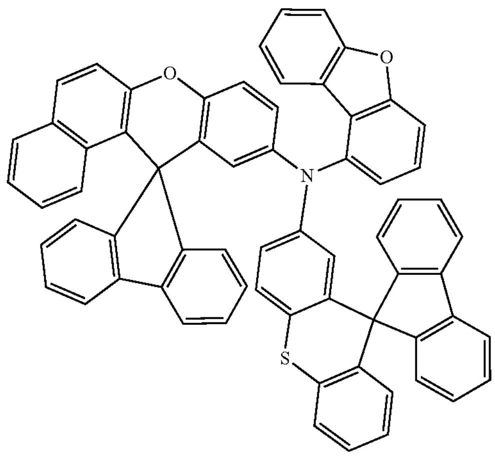
P2-43
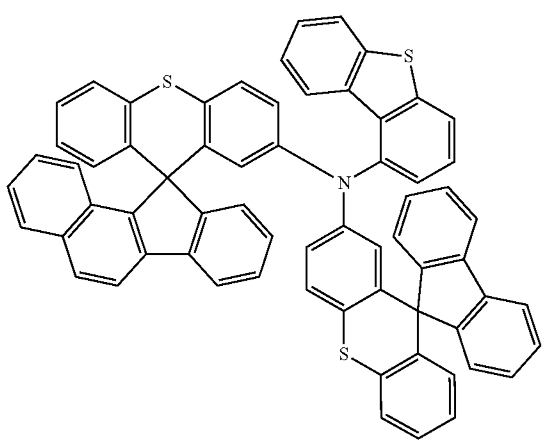
P2-44
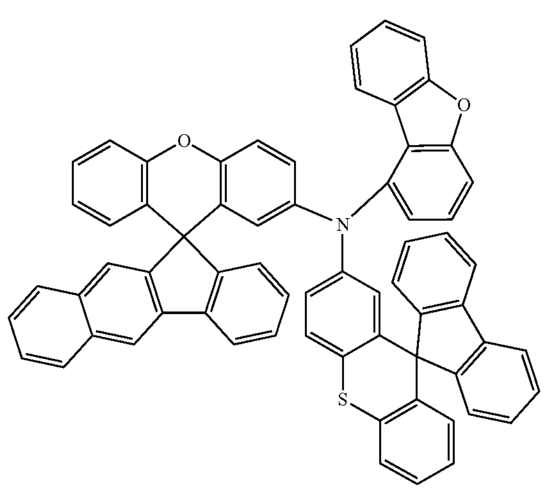
P2-45
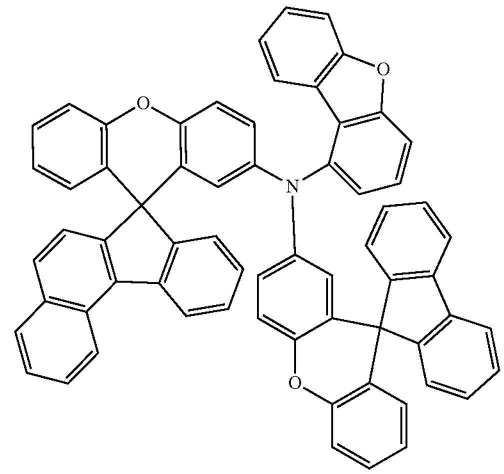
P2-46
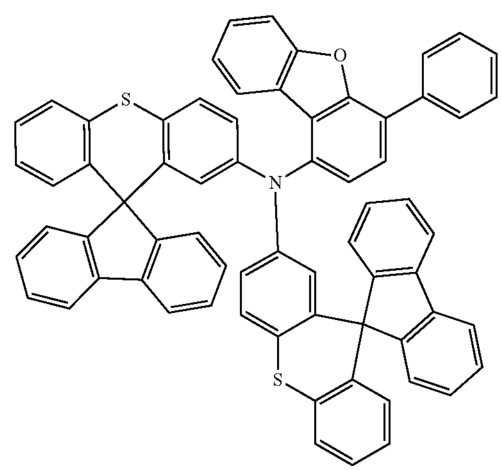
P2-47
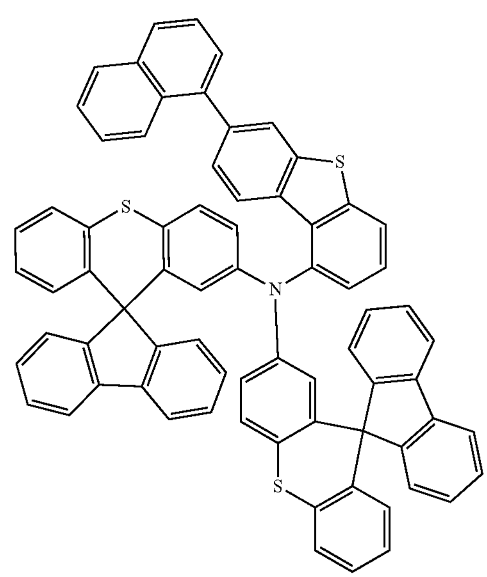

-continued
P2-48
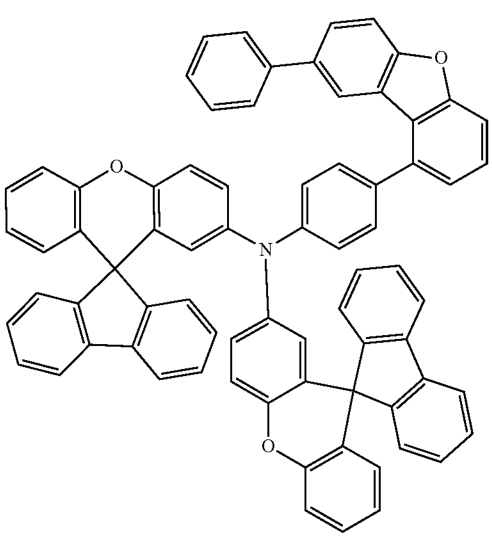
P2-49
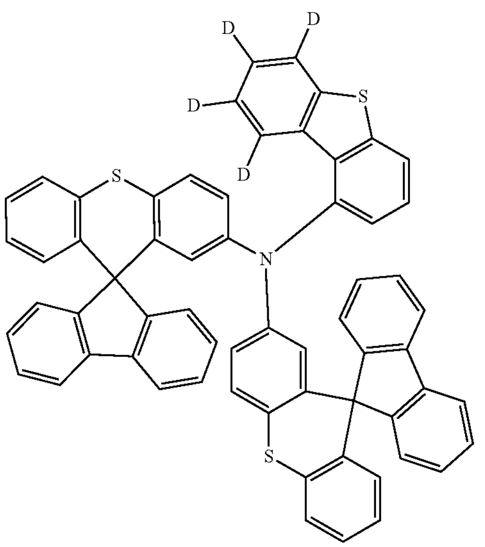
P2-50
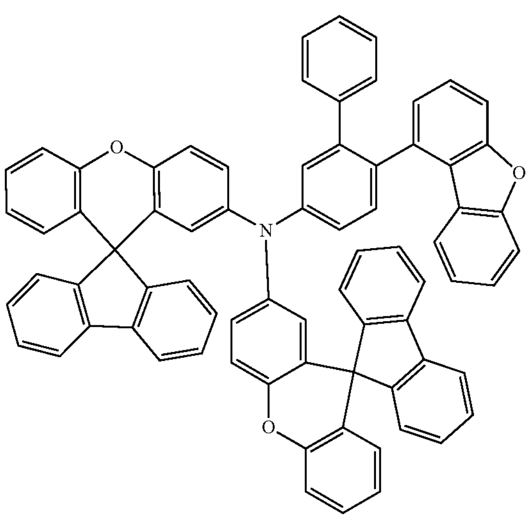
-continued
P2-51
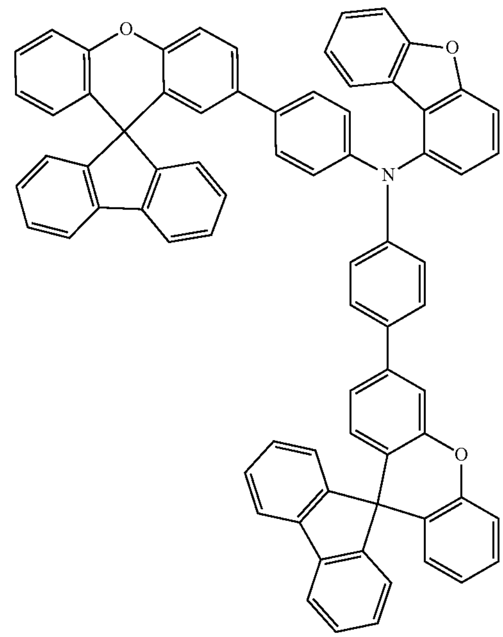
P2-52
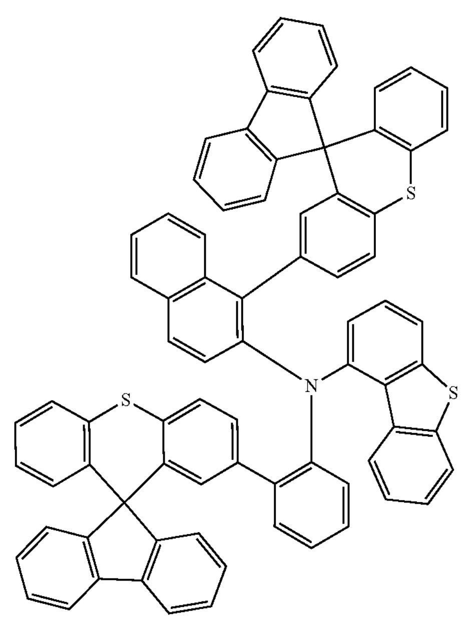

-continued
P2-53
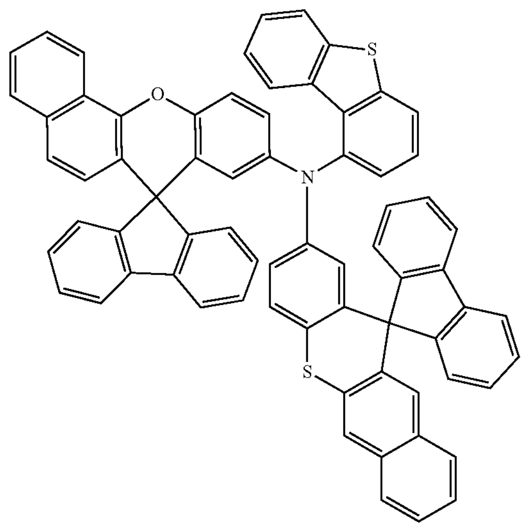
P2-54
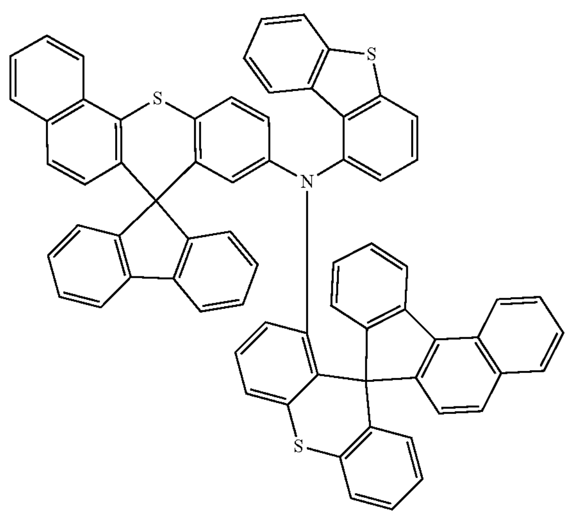
P2-55
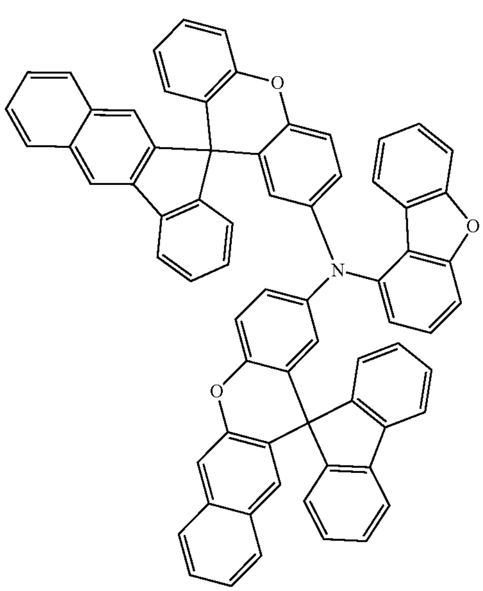
-continued
P3-1
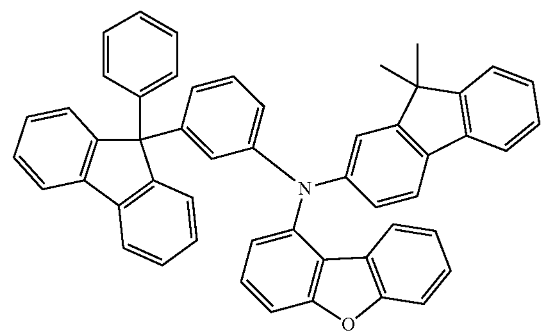
P3-2
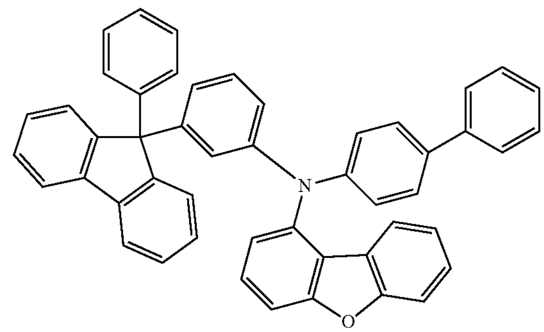
P3-3
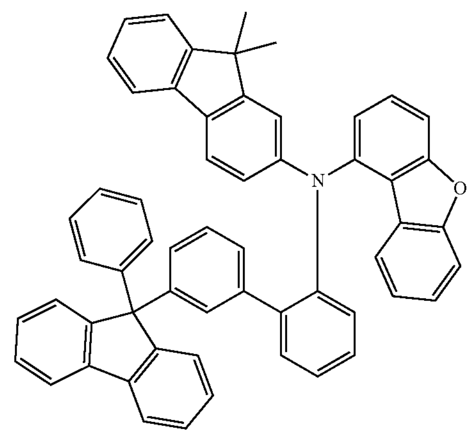
P3-4
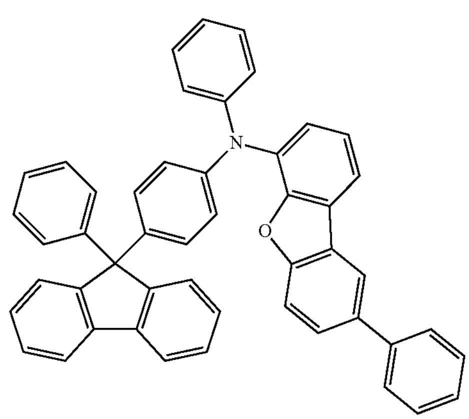

P3-5
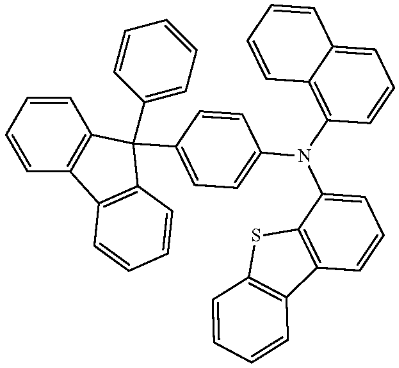
P3-6
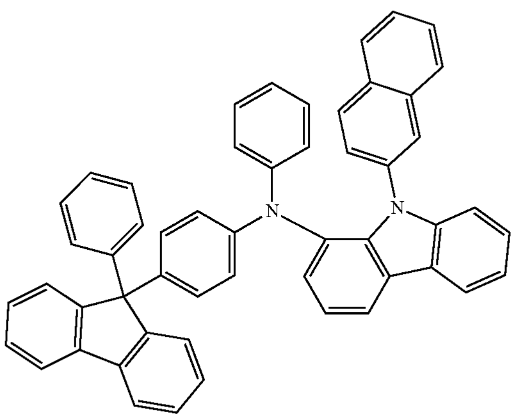
P3-7
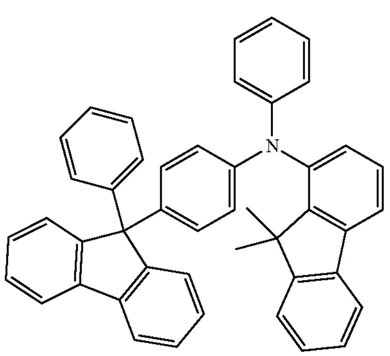
P3-8
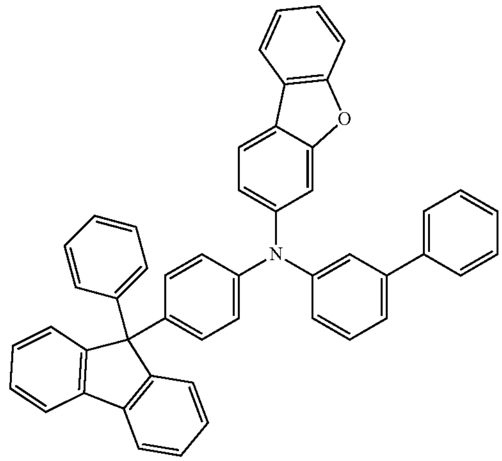
P3-9
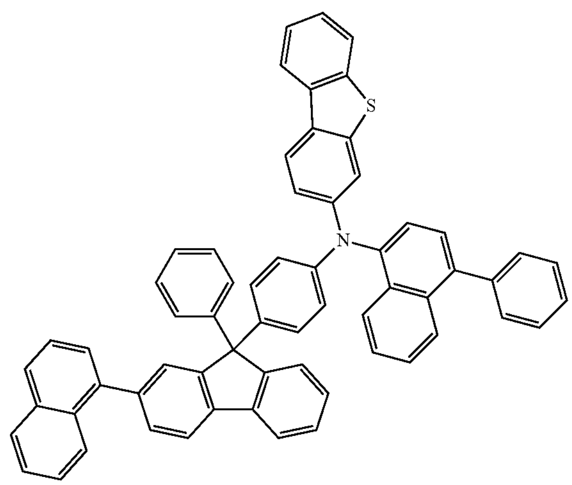
P3-10
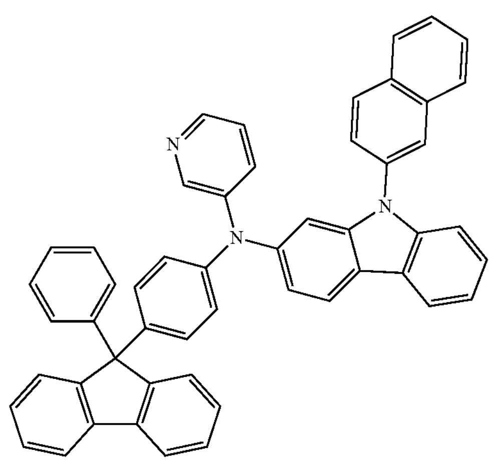

P3-11
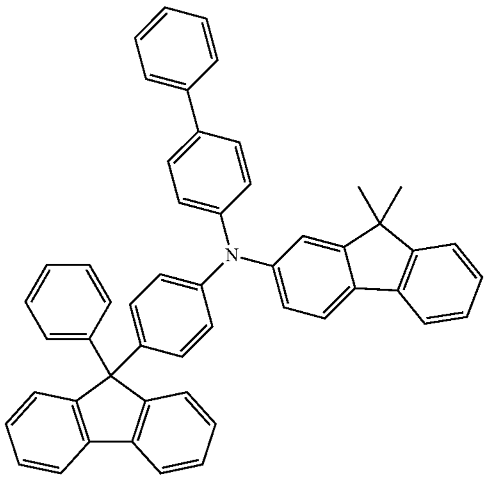
P3-12
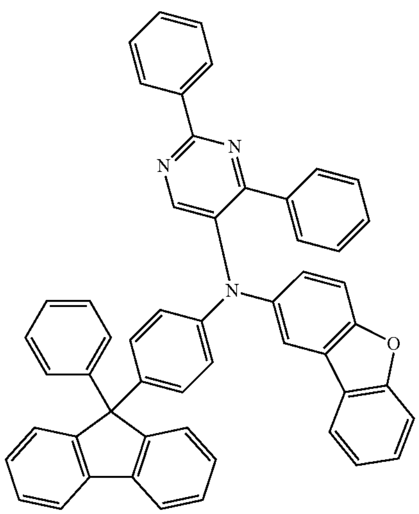
P3-13
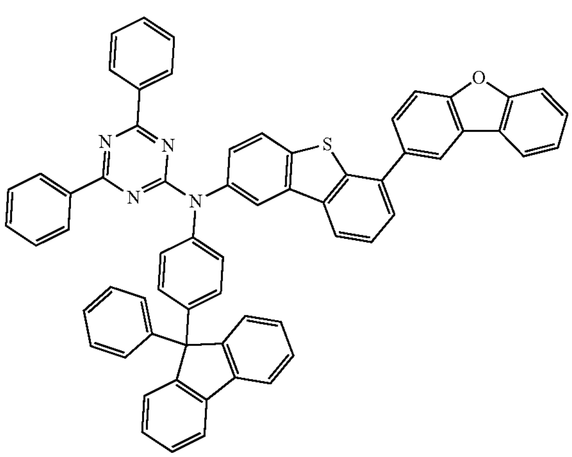
P3-14
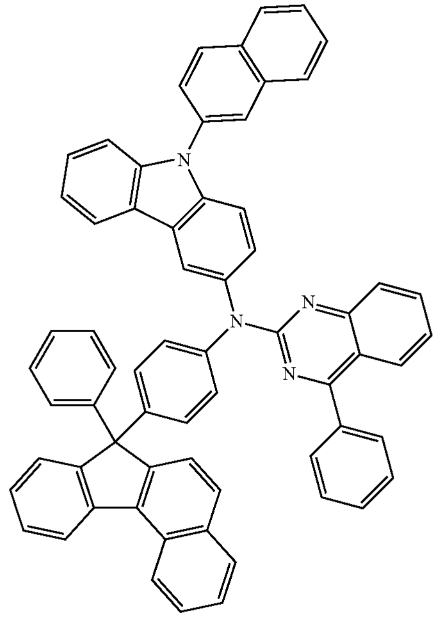
P3-15
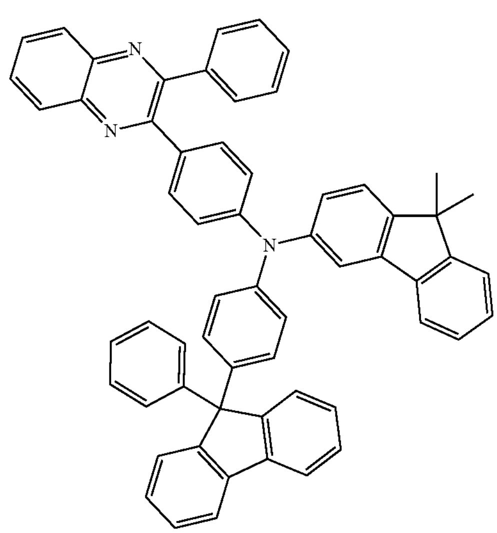

-continued
P3-16
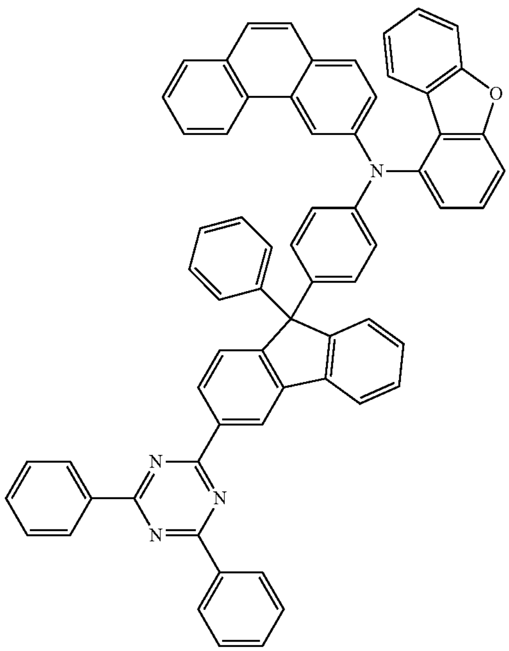
P3-17
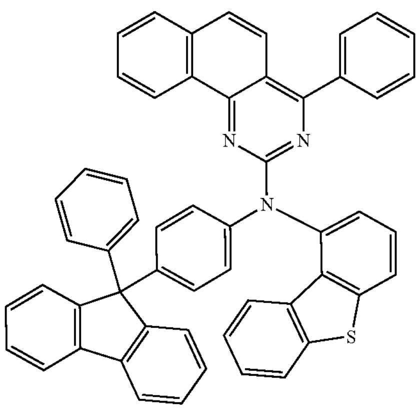
P3-18
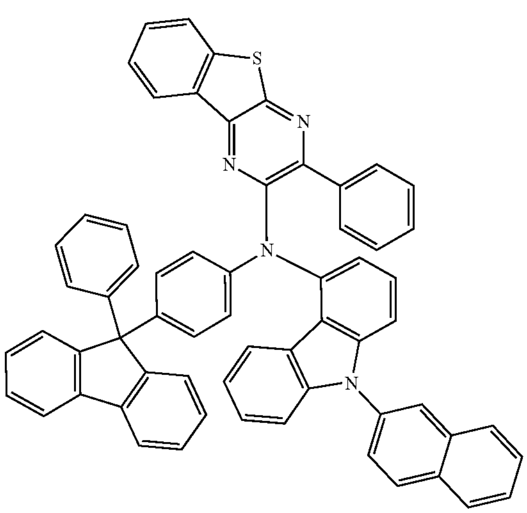
-continued
P3-19
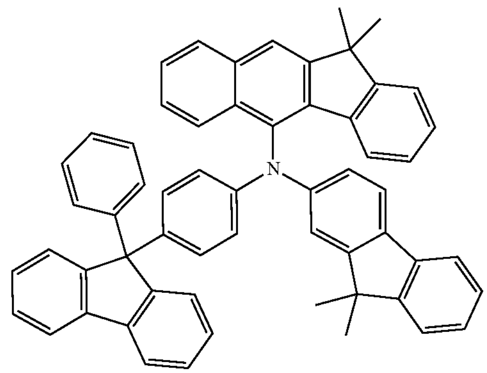
P3-20
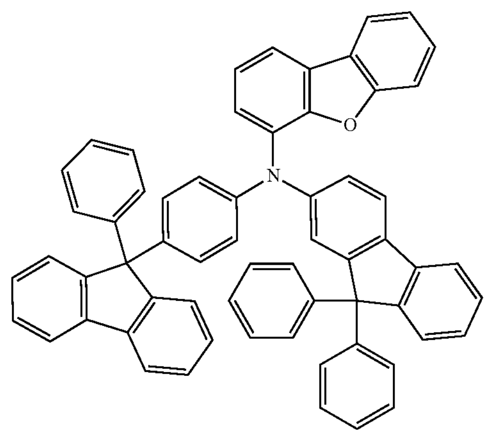
P3-21
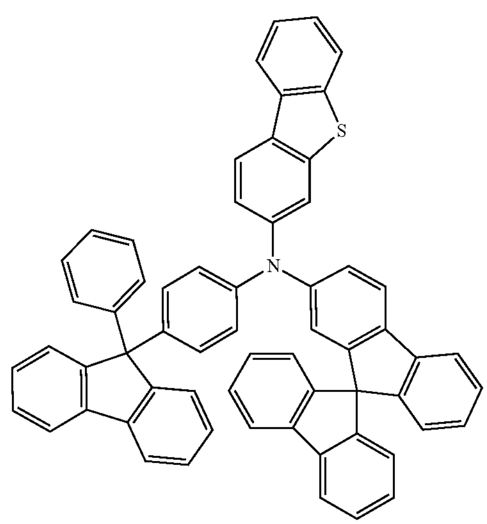

P3-22
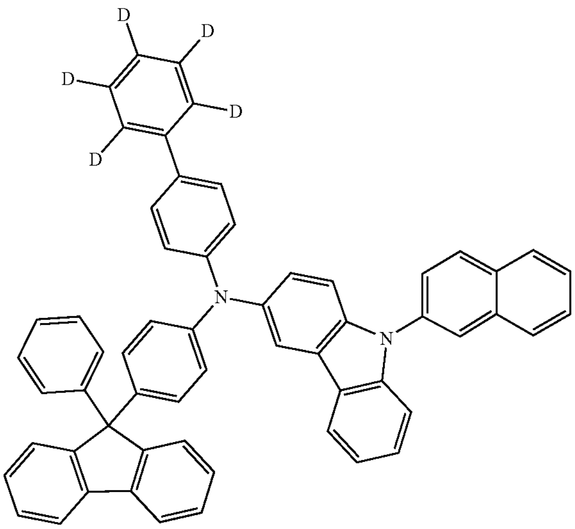
P3-23
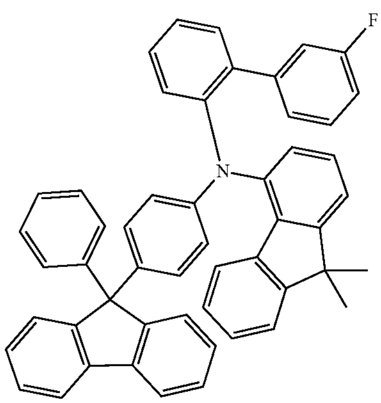
P3-24
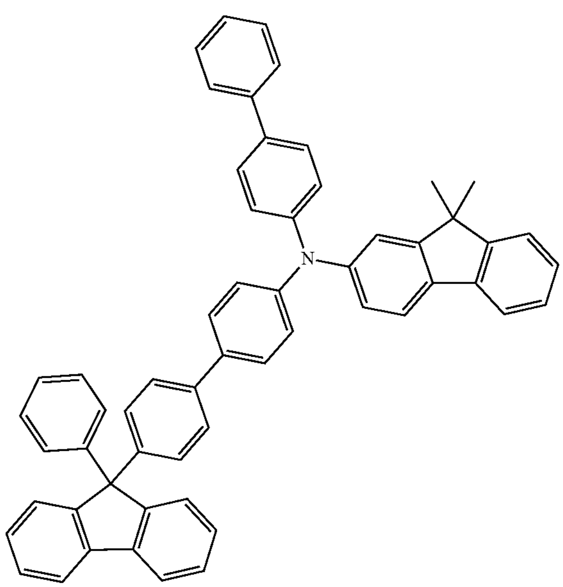
P3-25
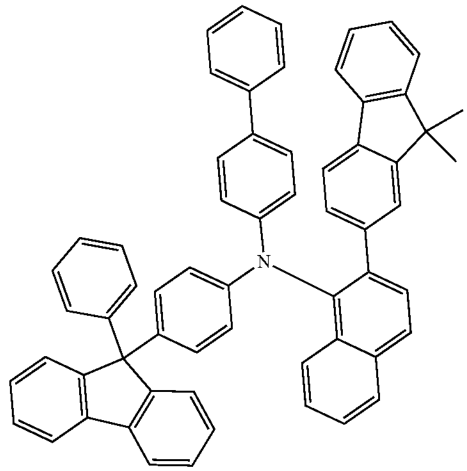
P3-26
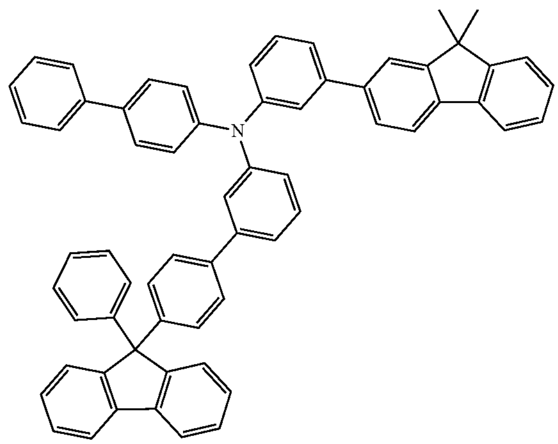
P3-27
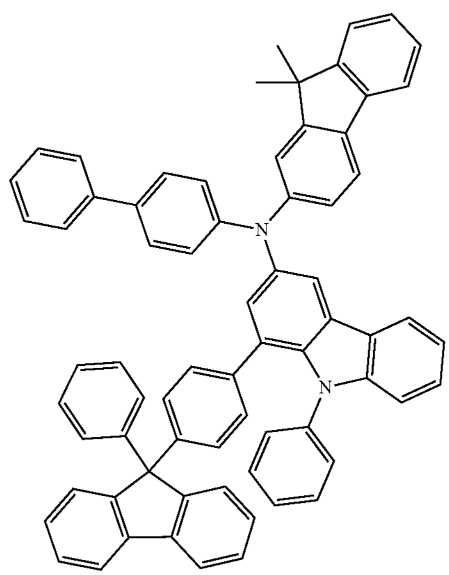

-continued
P3-28
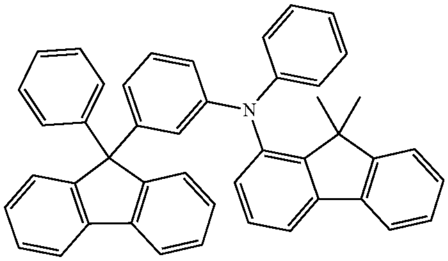
P3-29
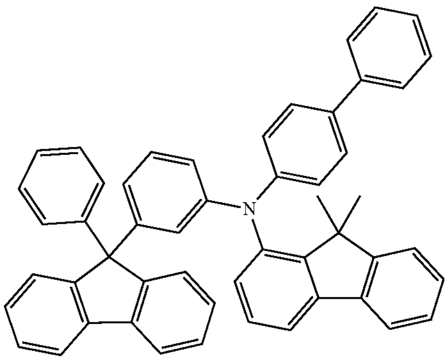
P3-30
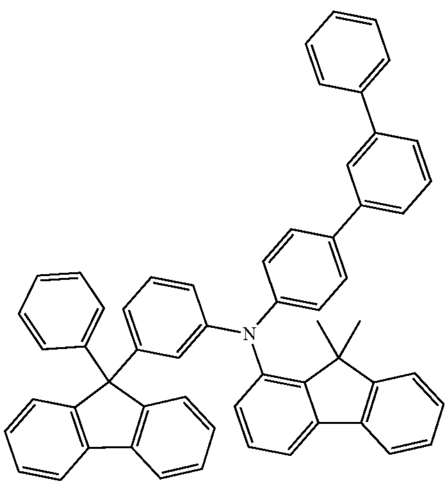
P3-31
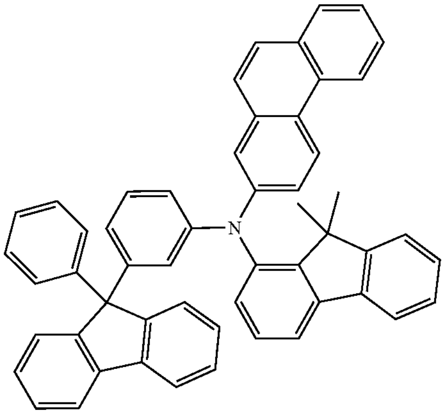
-continued
P3-32
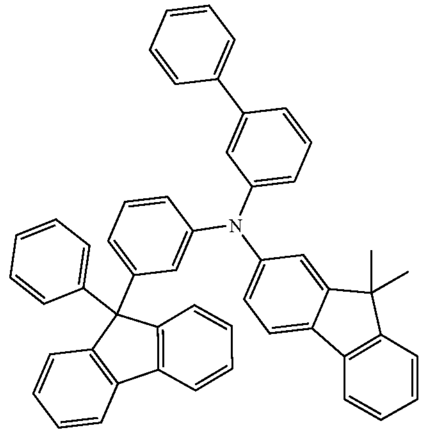
P3-33
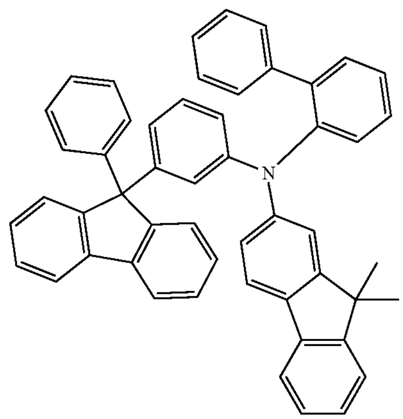
P3-34
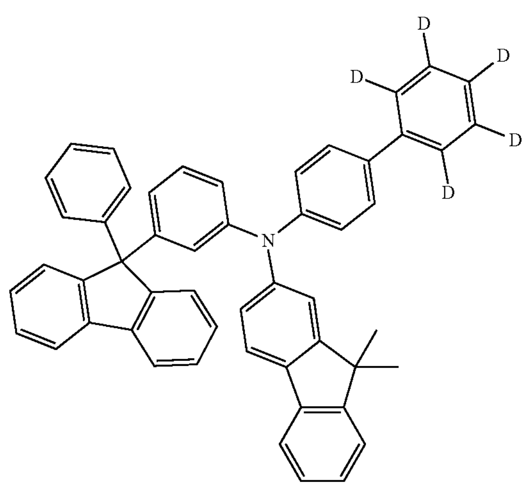

-continued
P3-35
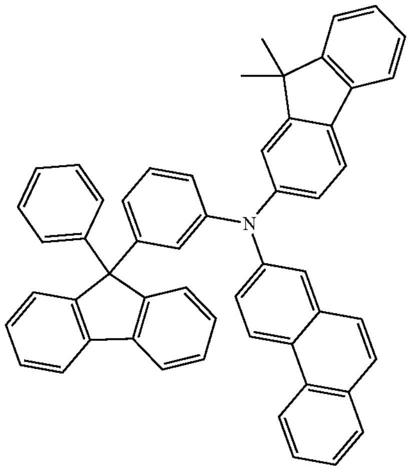
P3-36
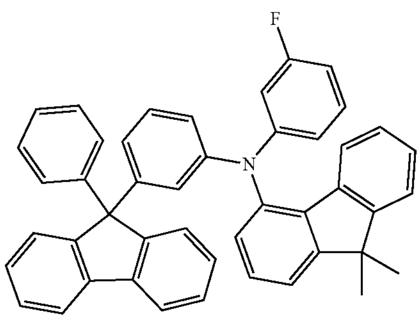
P3-37
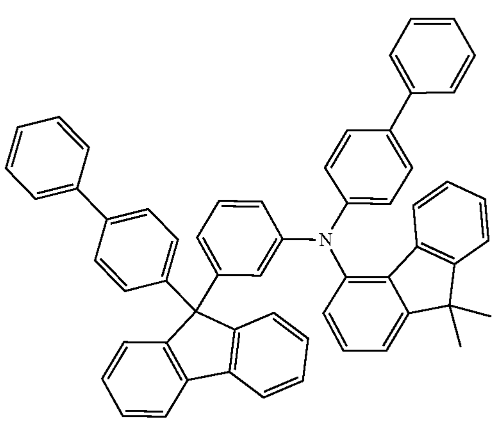
-continued
P3-38
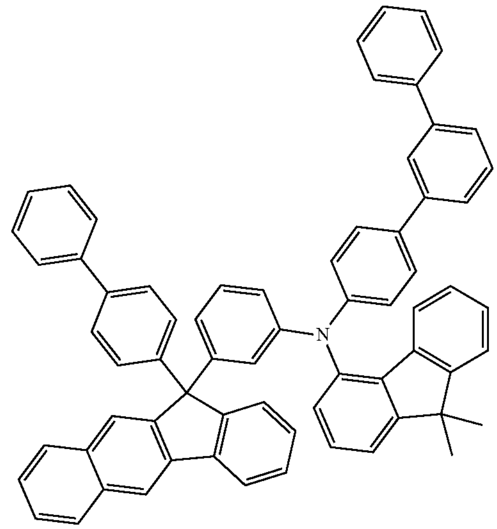
P3-39
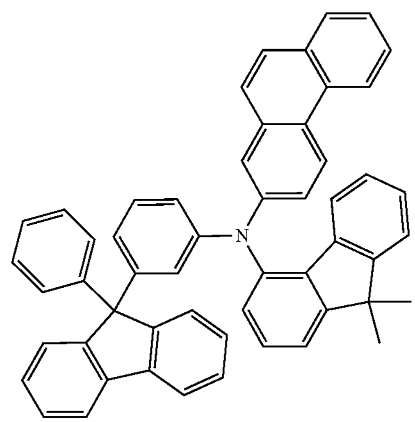
P3-40
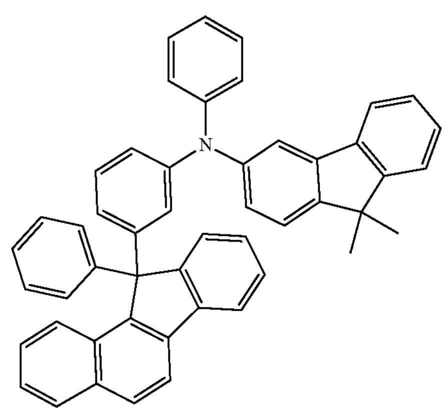

-continued
P3-41
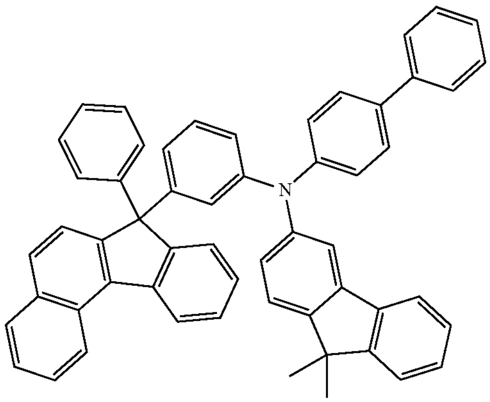
P3-42
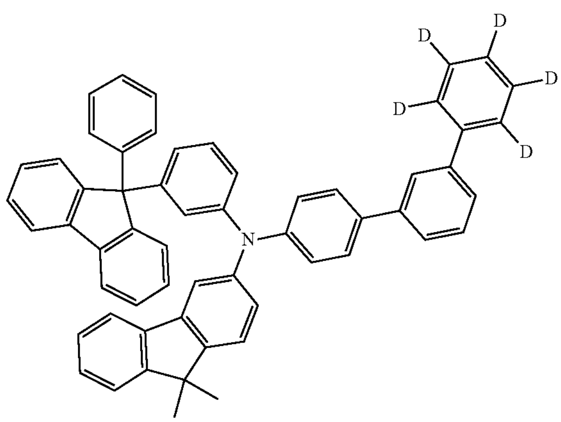
P3-43
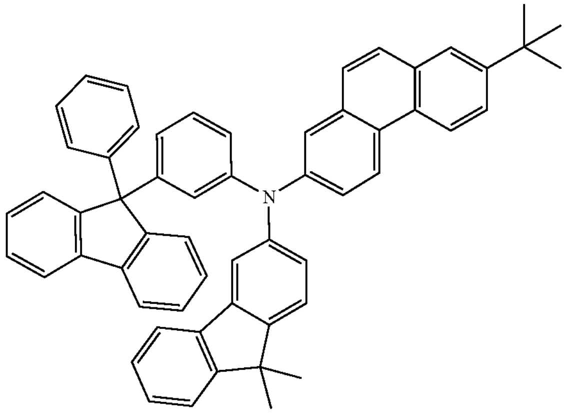
-continued
P3-44
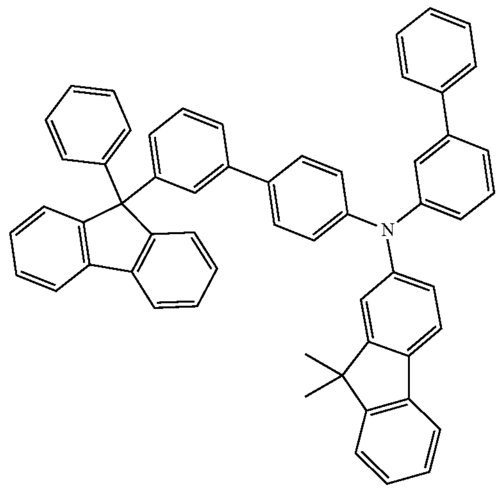
P3-45
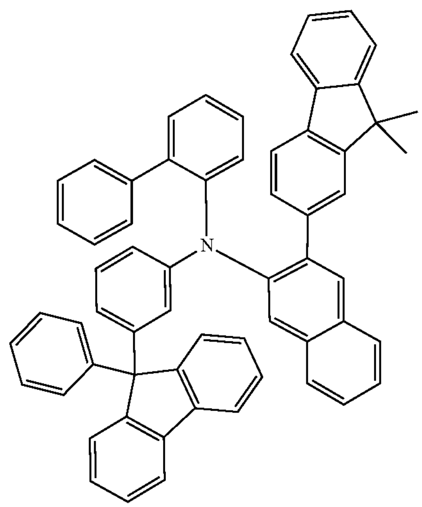
P3-46
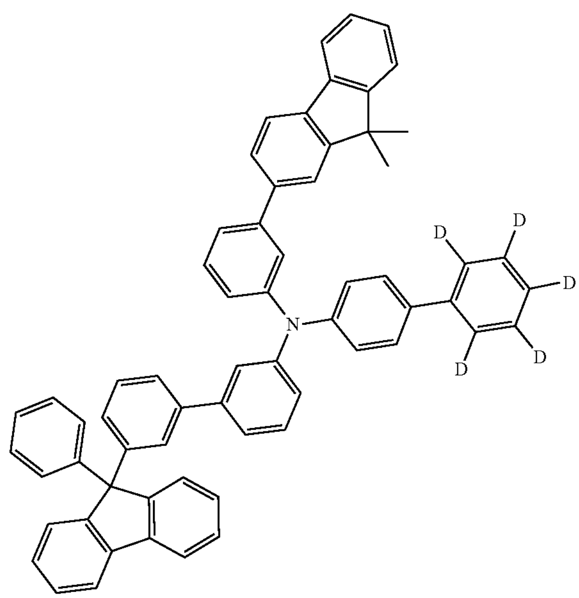

P3-47
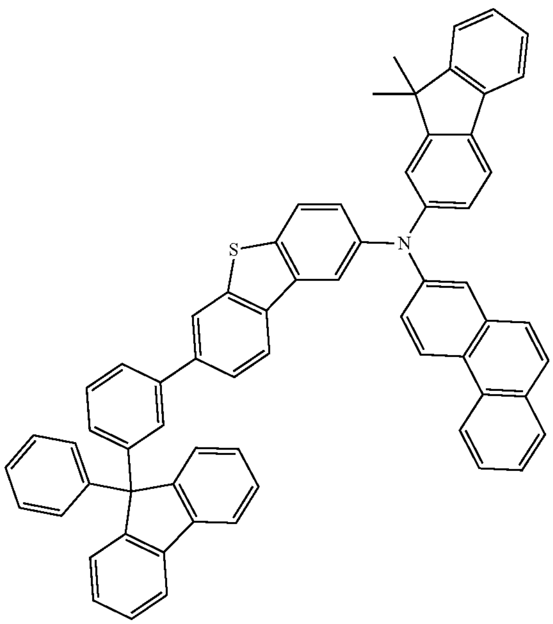
P3-48
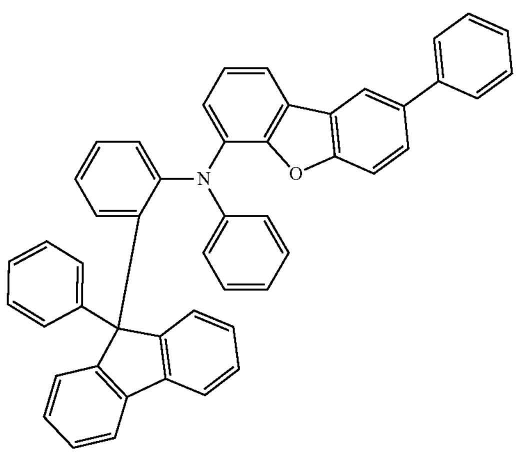
P3-49
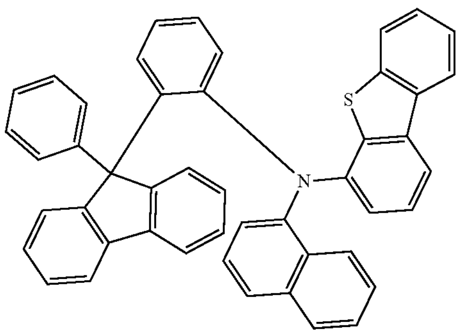
P3-50
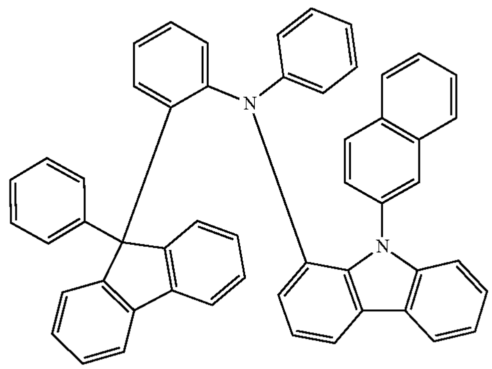
P3-51
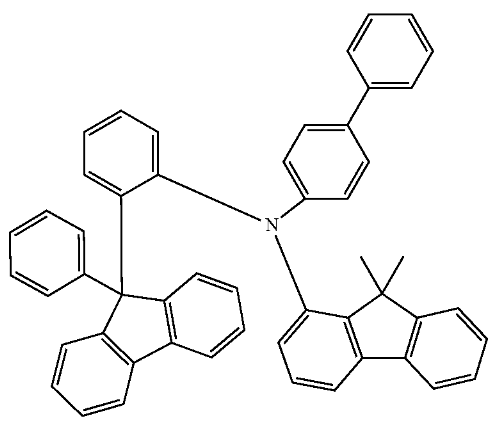
P3-52
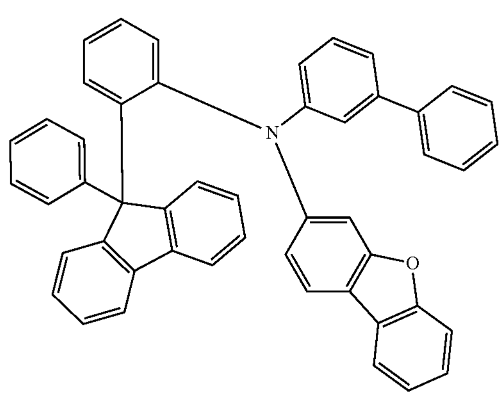

P3-53
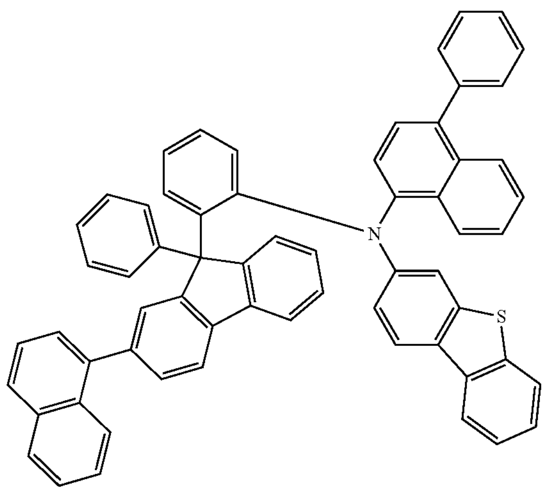
P3-54
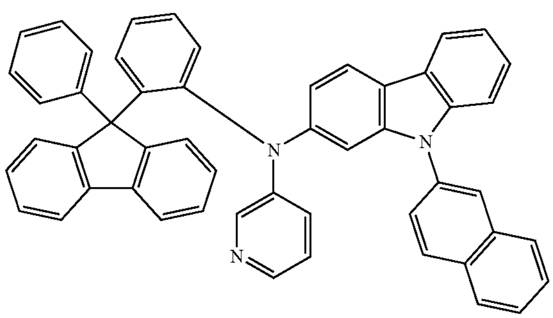
P3-55
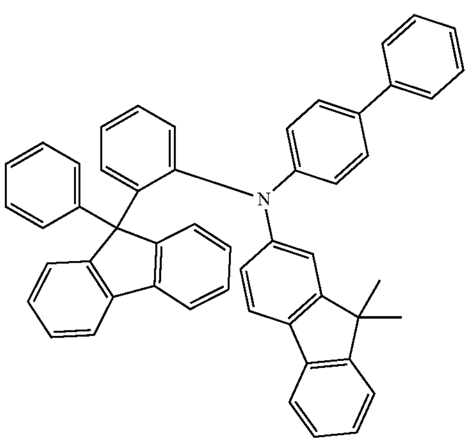
P3-56
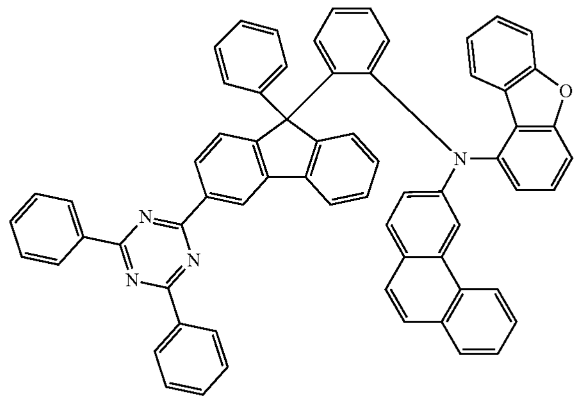
P3-57
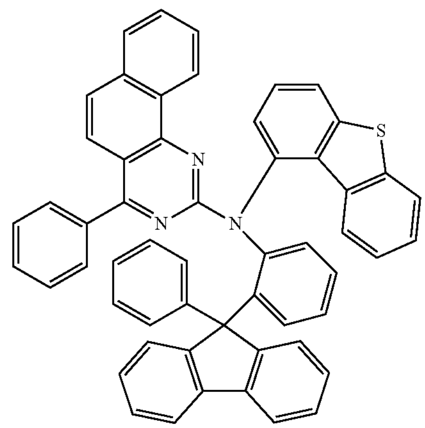
P3-58
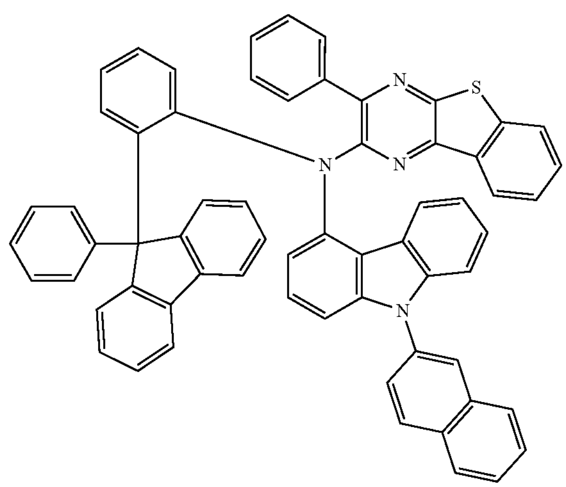

P3-59
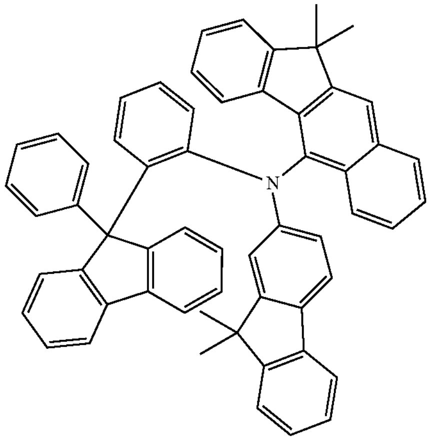
P3-60
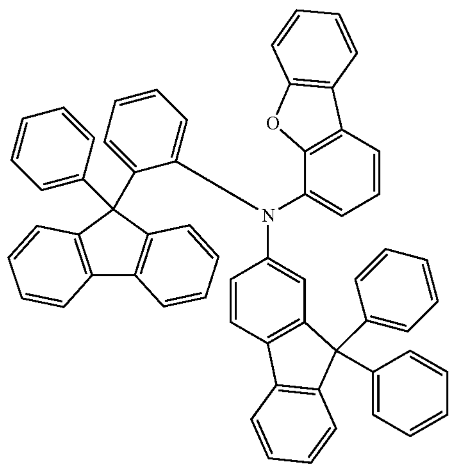
P3-61
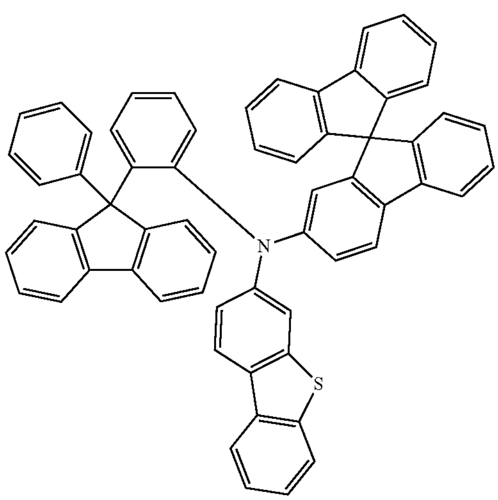
P3-62
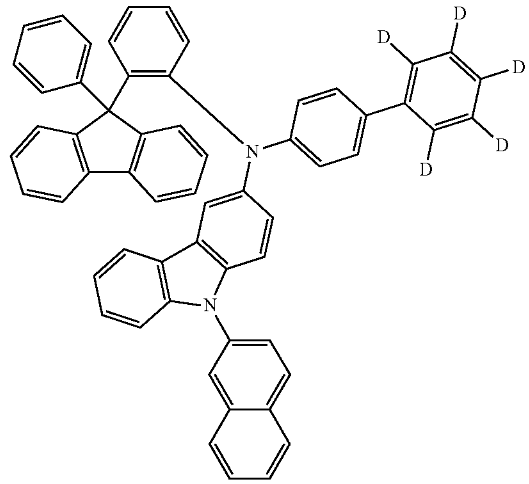
P3-63
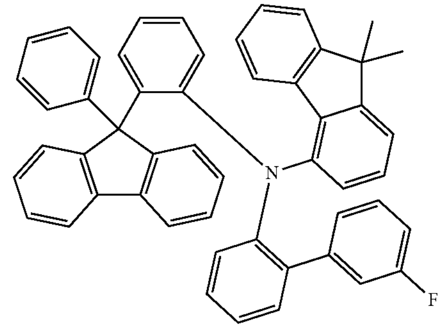
P3-64
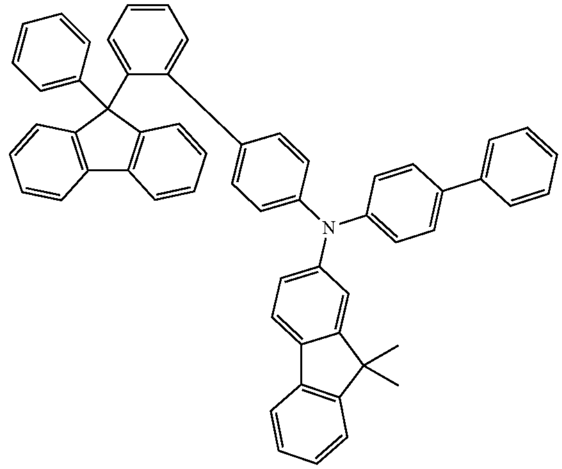

-continued
P3-65
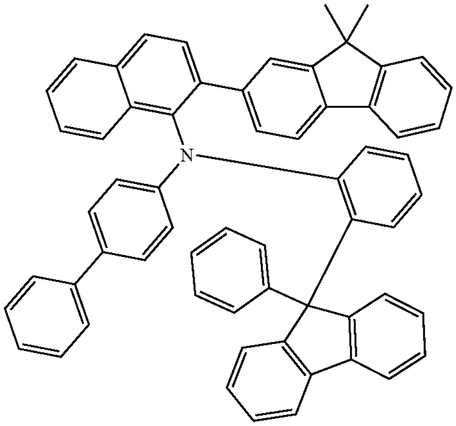
P3-66
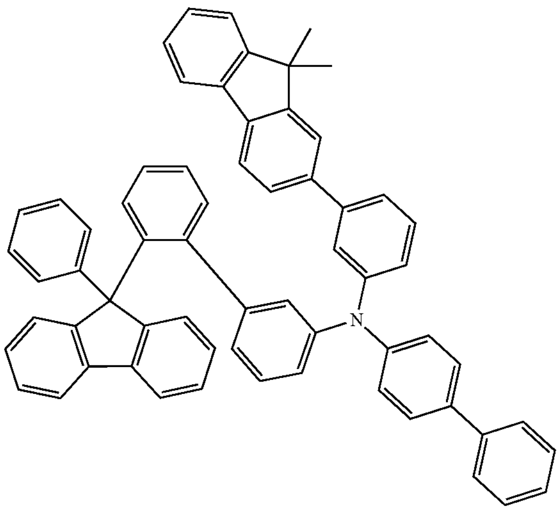
P3-67
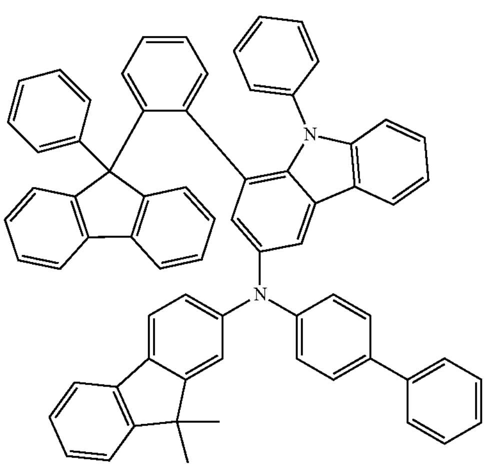
-continued
P3-68
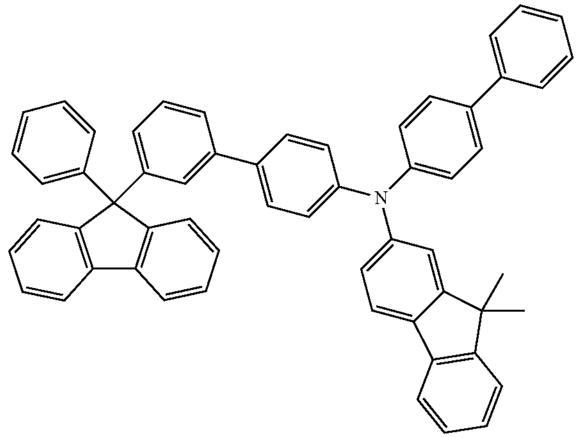
P3-69
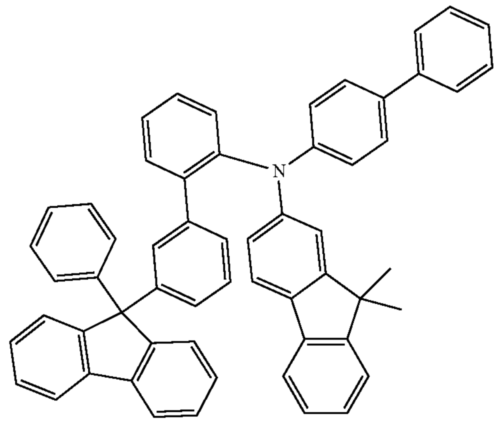
P3-70
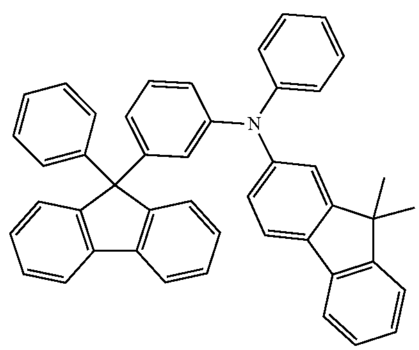
P3-71
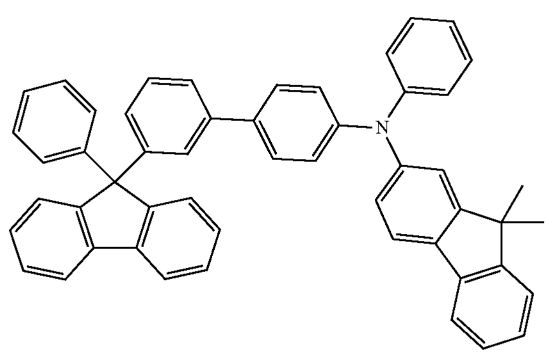

-continued
P3-72
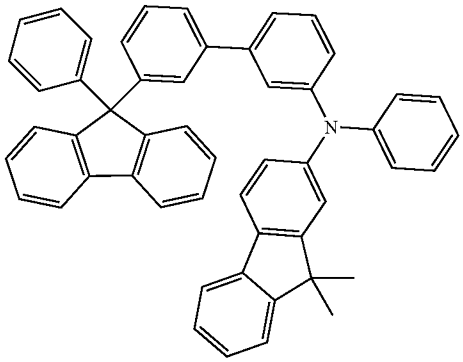
P3-73
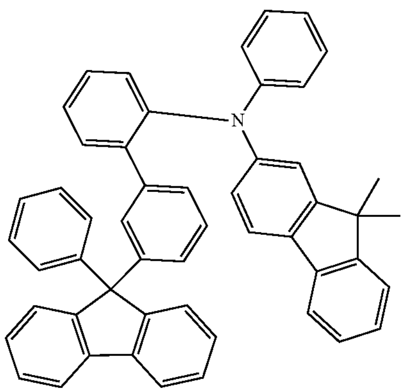
P3-74
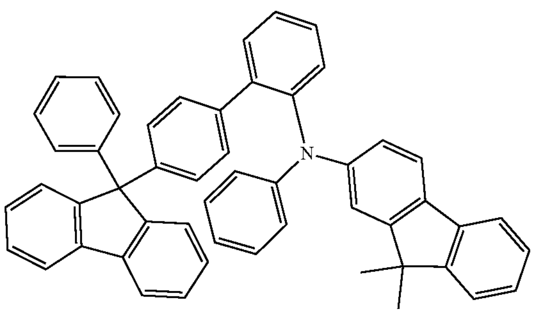
P3-75
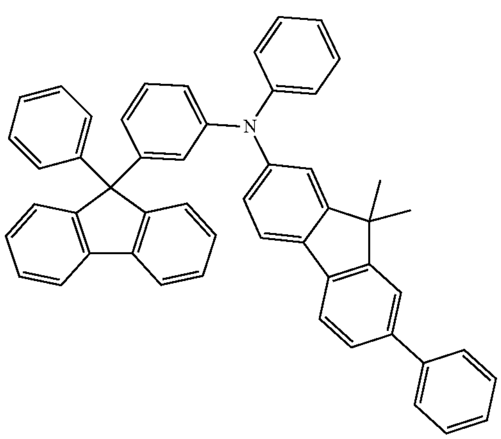
-continued
P3-76
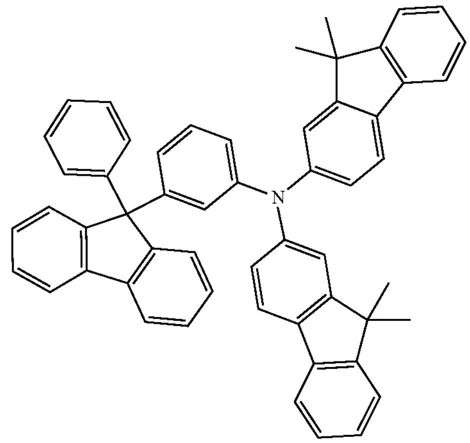
P3-77
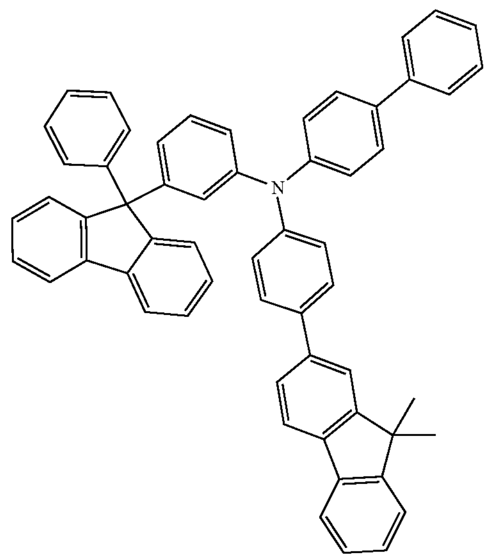
P3-78
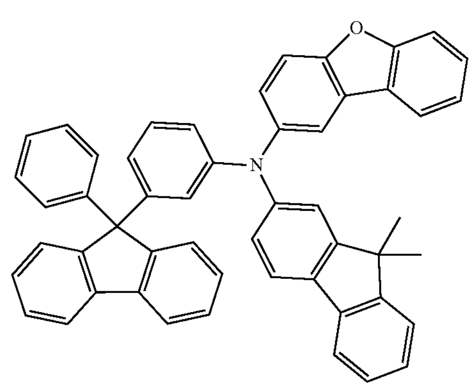

-continued
P3-79
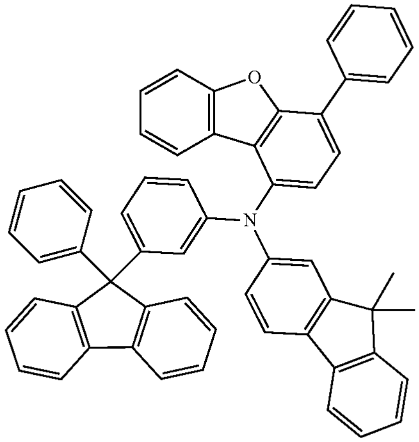
P3-80
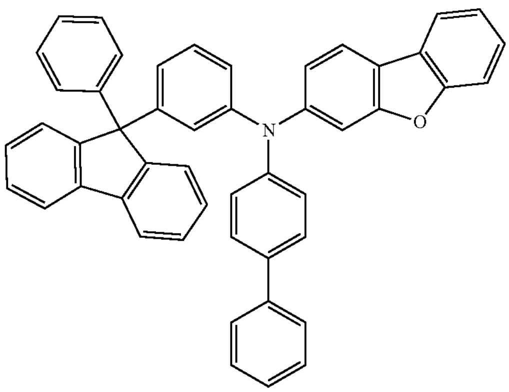
P3-81
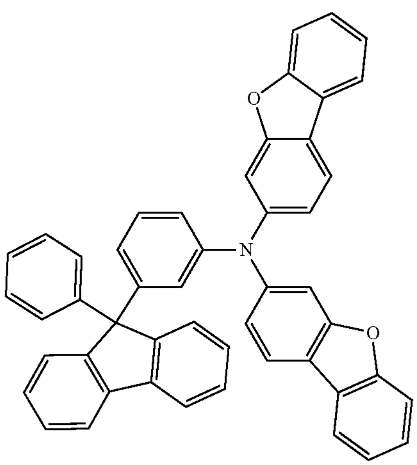
-continued
P3-82
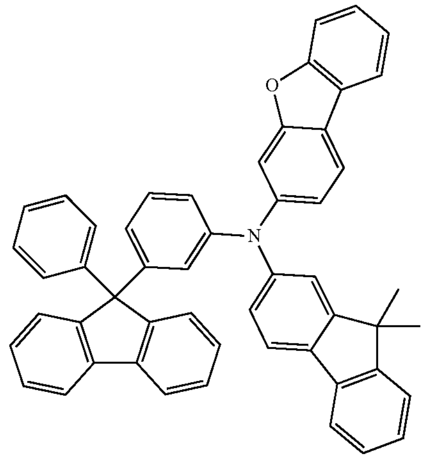
P3-83
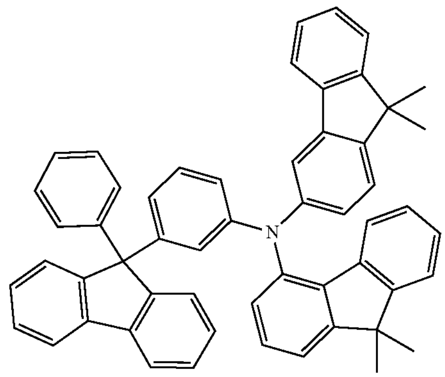
P3-84
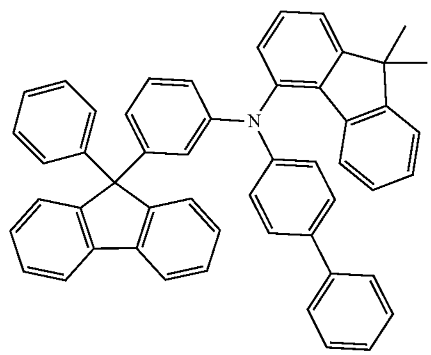
P3-85
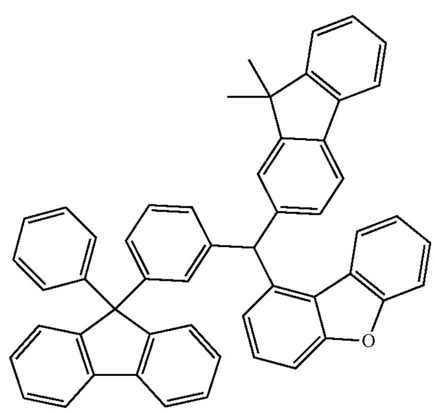

P3-86
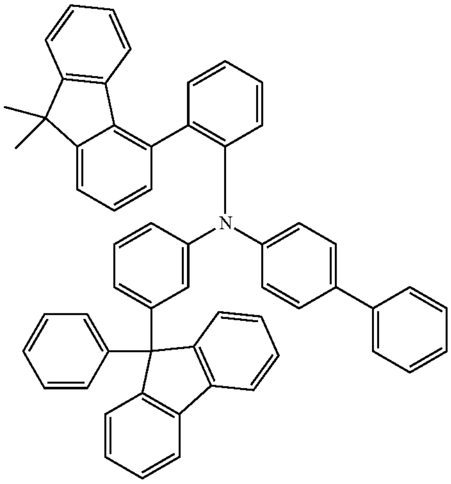
P3-87
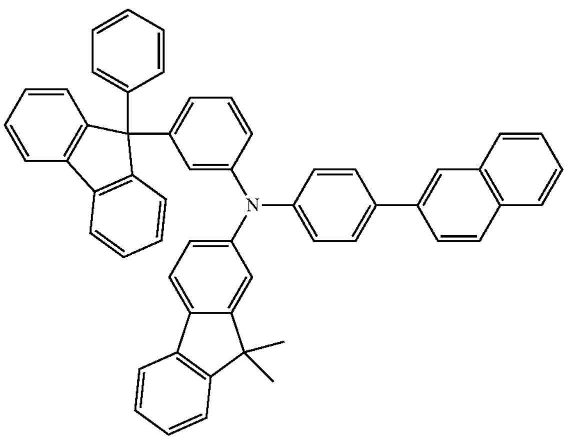
P3-88
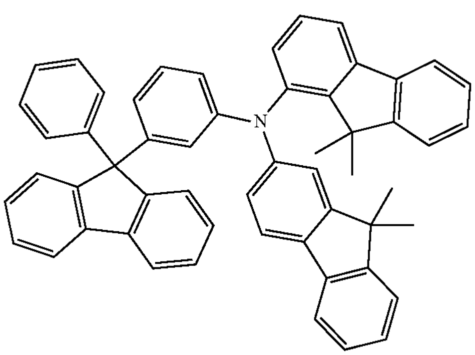
P3-89
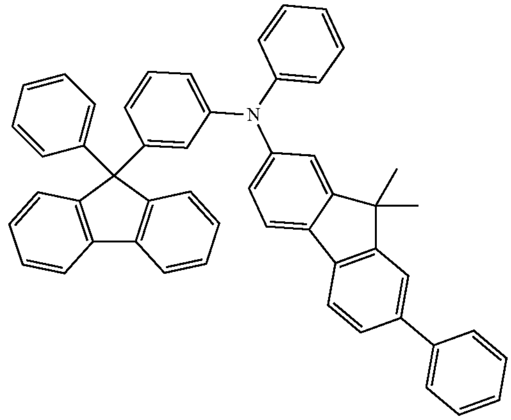
P3-90
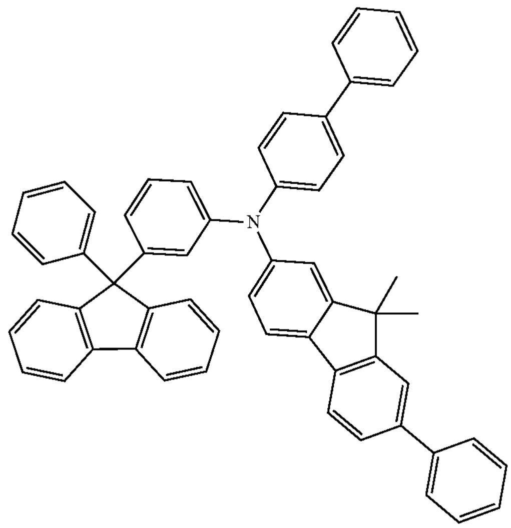
P3-91
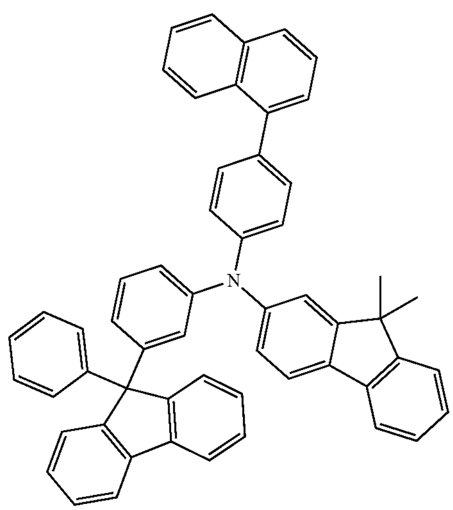

-continued
P3-92
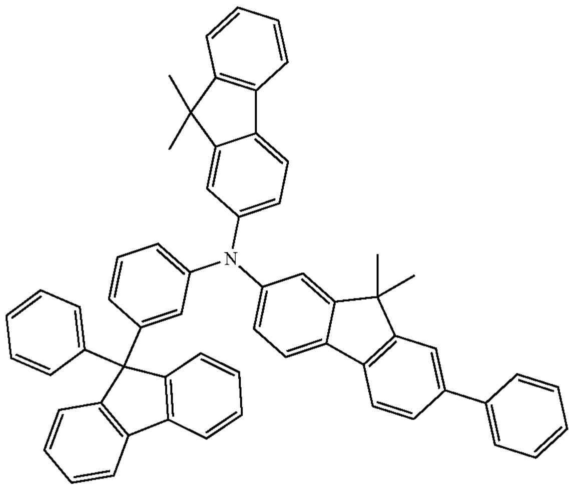
P3-93
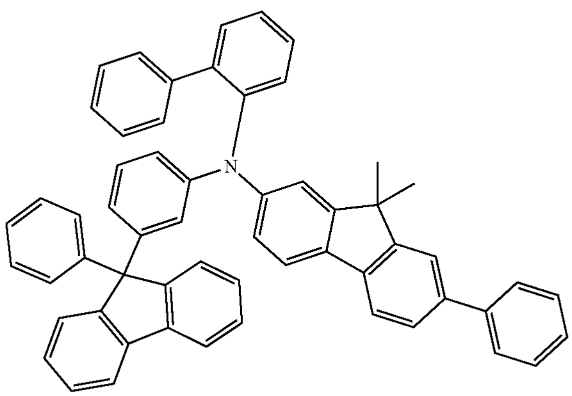
P3-94
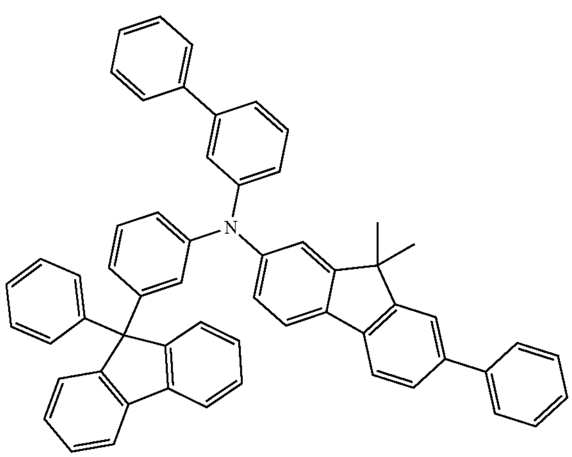
-continued
P3-95
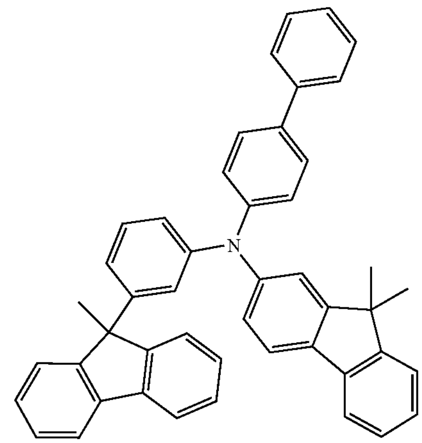
P3-96
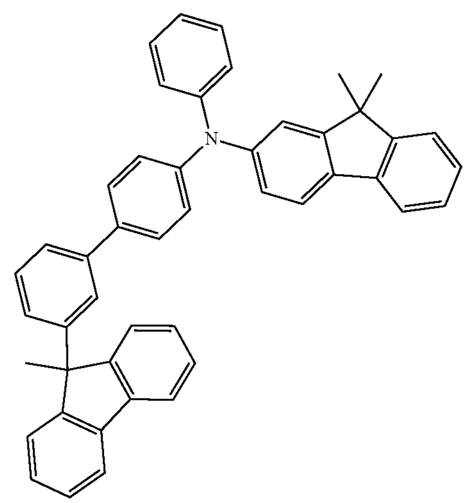
P3-97
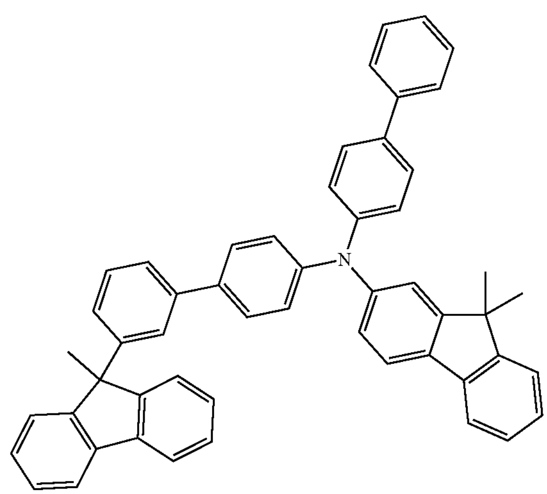

-continued
P3-98
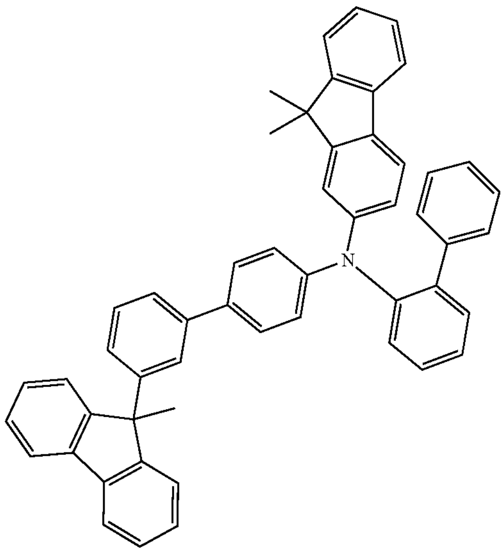
P3-99
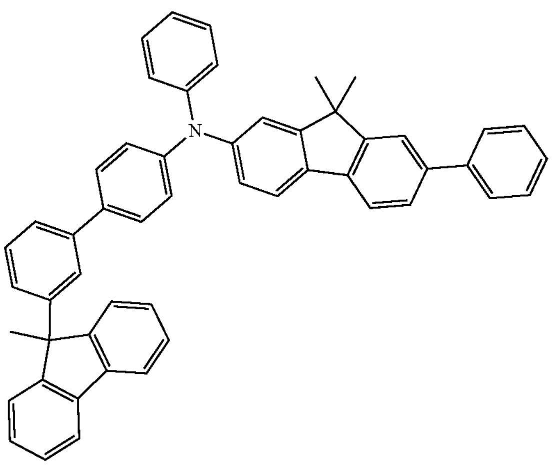
P3-100
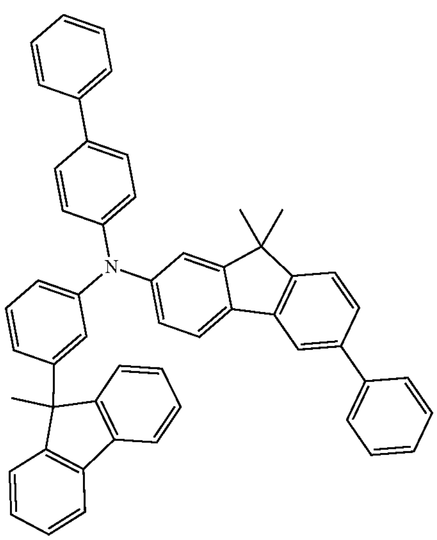
-continued
P3-101
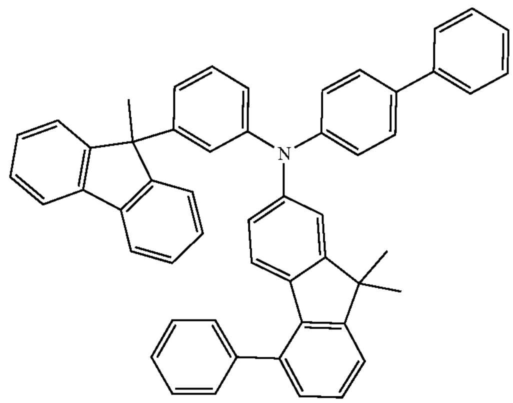
P3-102
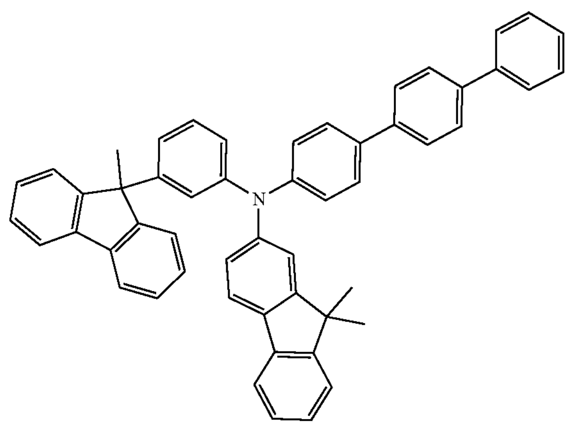
P3-103
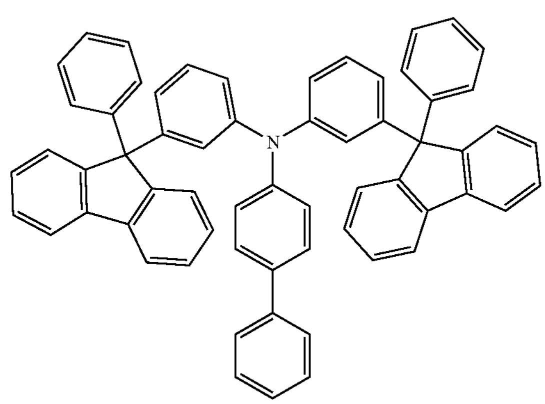

-continued
P3-104
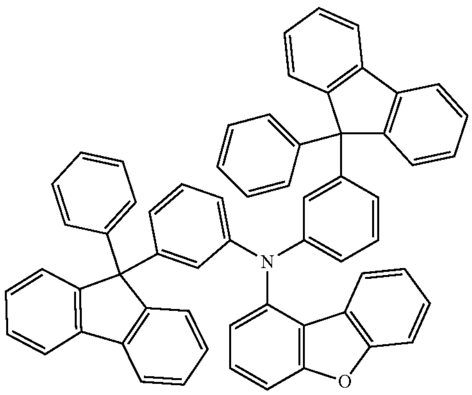
P3-105
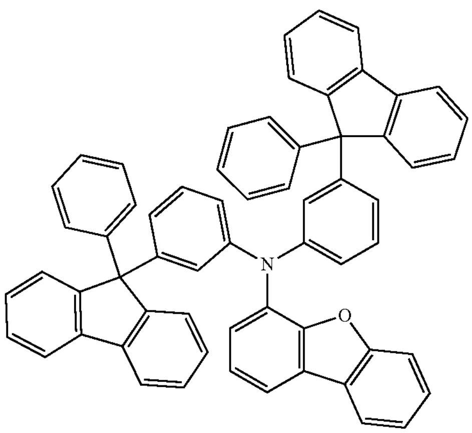
P3-106
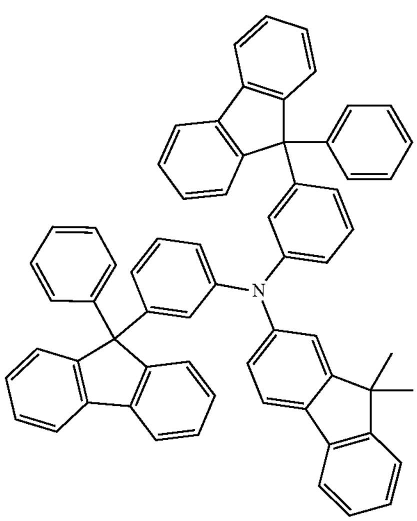
-continued
P3-107
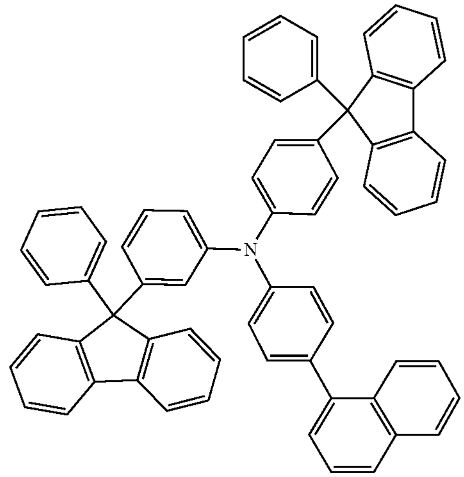
P3-108
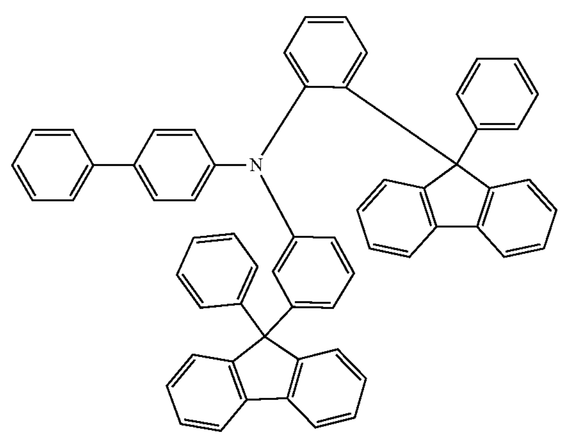
13. The organic electric element of claim 1, wherein the compound represented by Formula 2 is one of the following compounds:

-continued
2-4
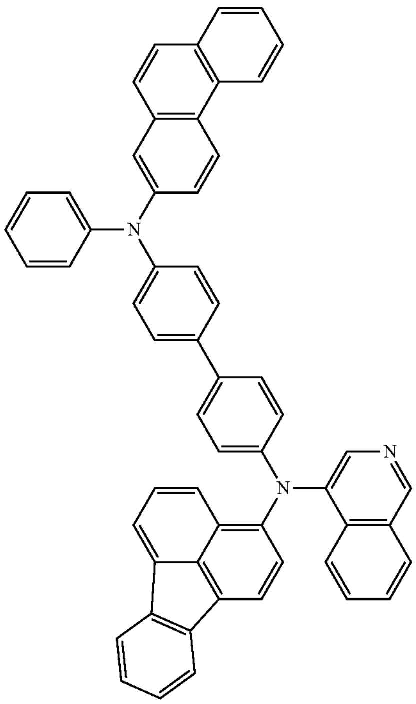
2-8
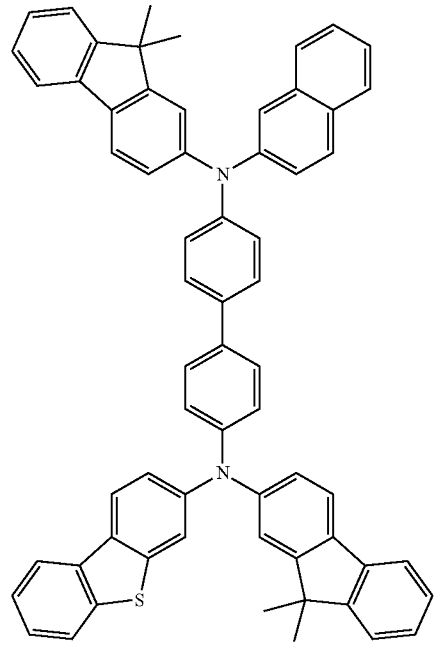
2-7
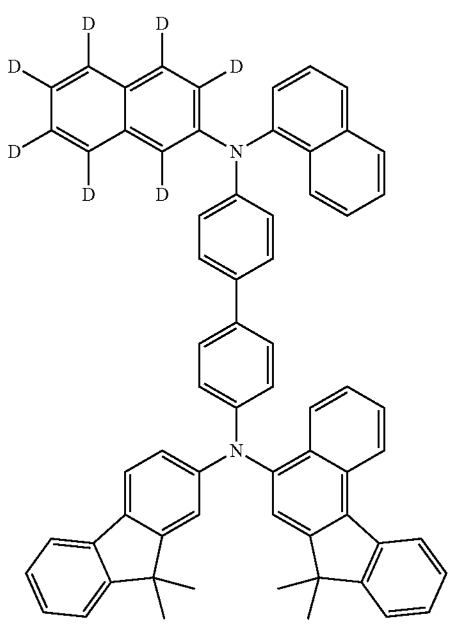
2-9
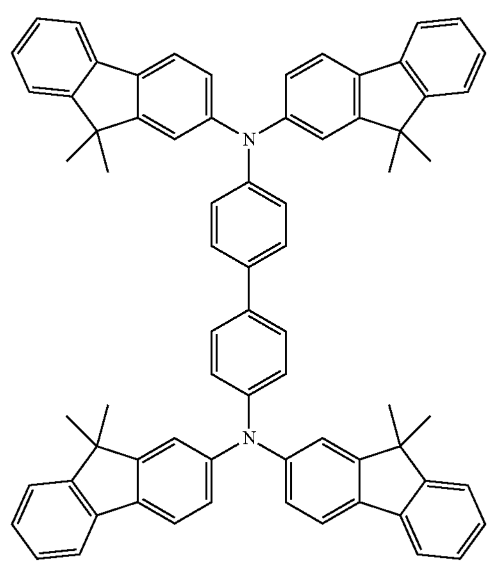

-continued
2-11
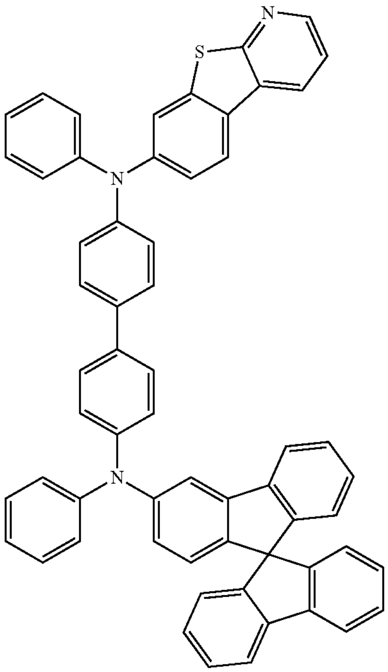
2-12
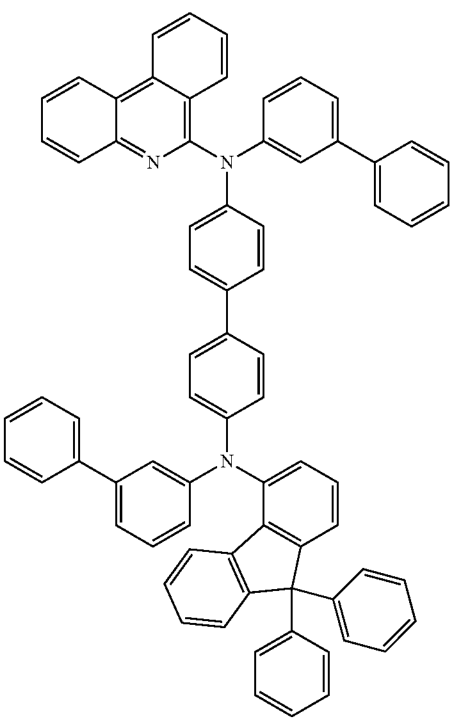
-continued
2-13
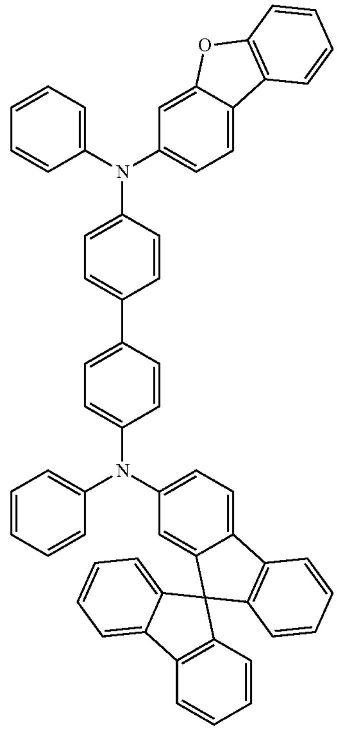
2-14
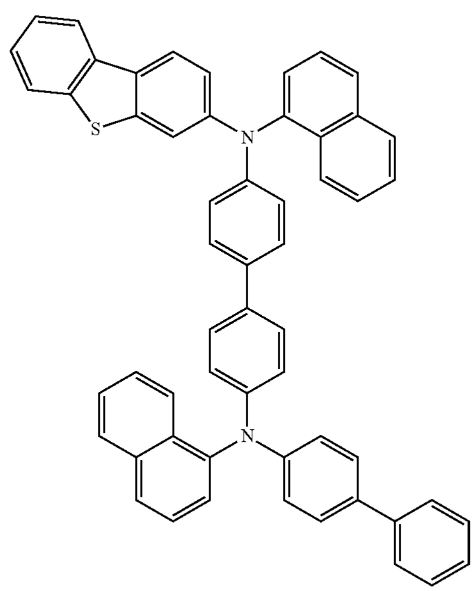

-continued
2-15
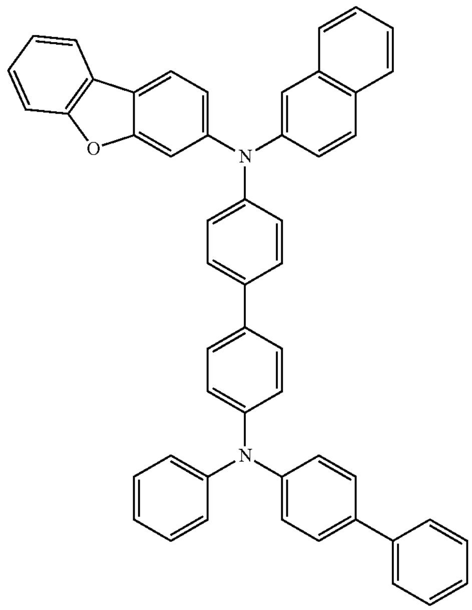
2-16
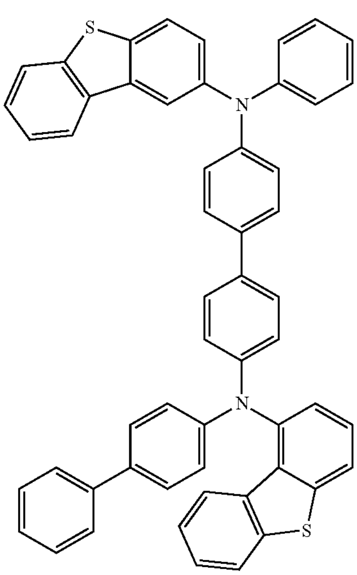
-continued
2-17
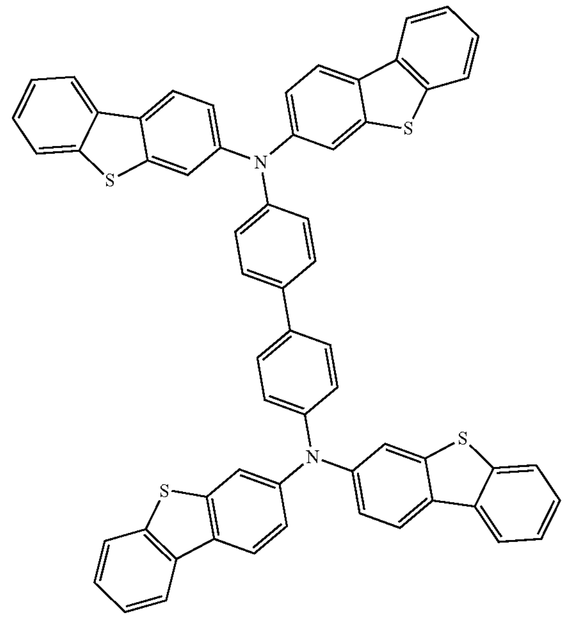
2-18
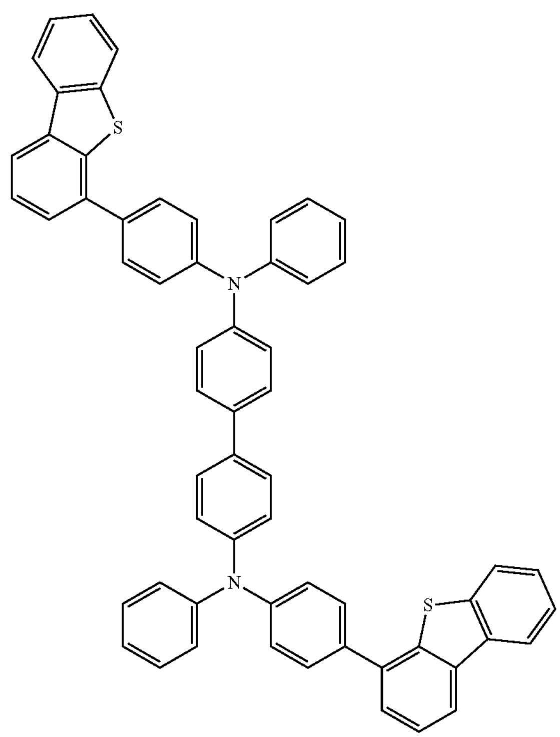

-continued
2-19
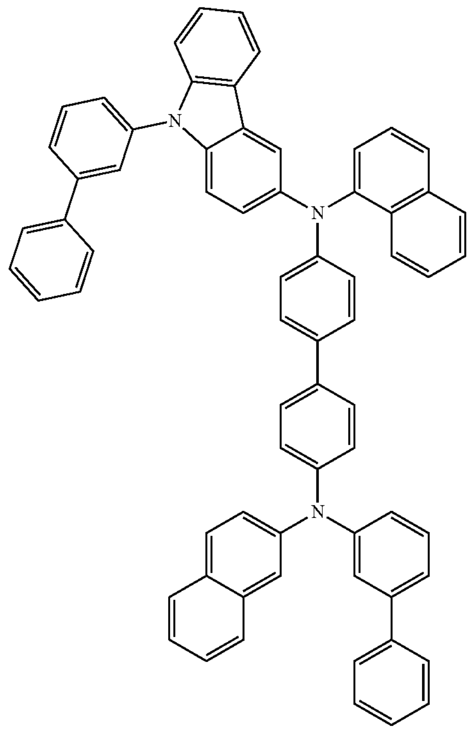
2-20
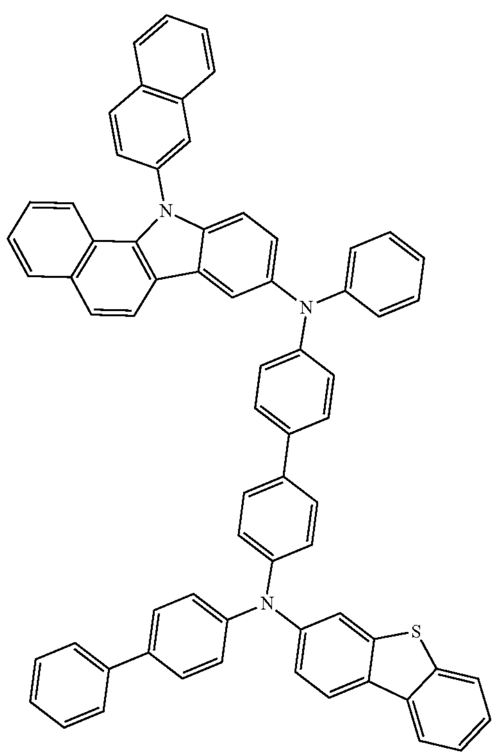
-continued
2-21
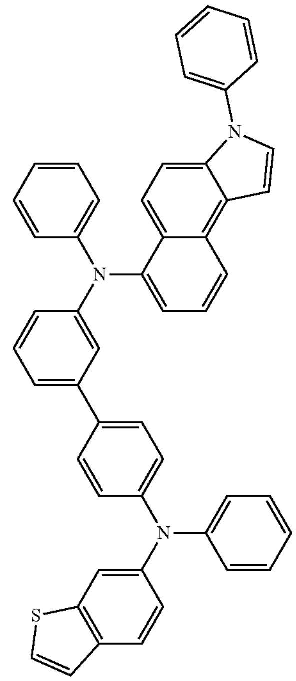
2-22
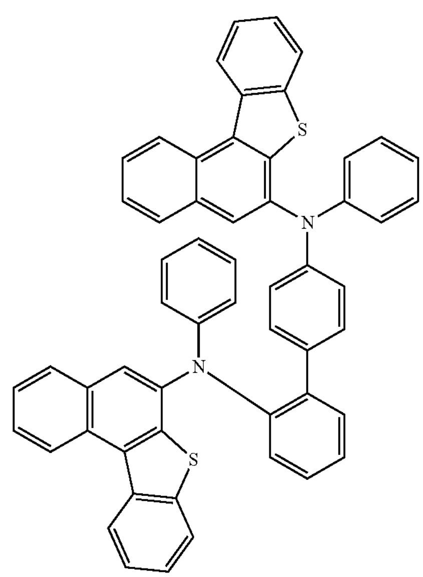

-continued
2-23
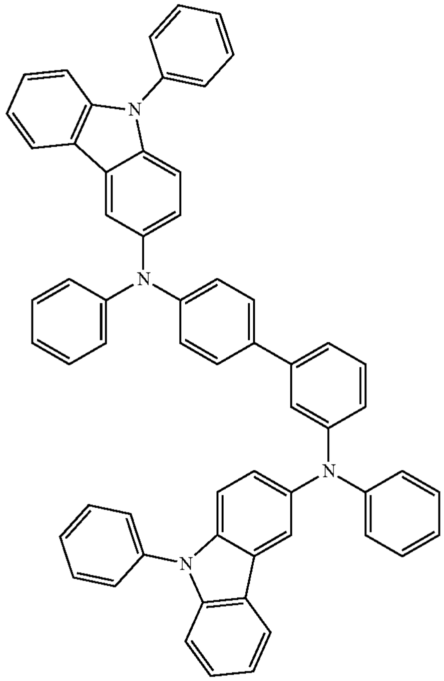
2-24
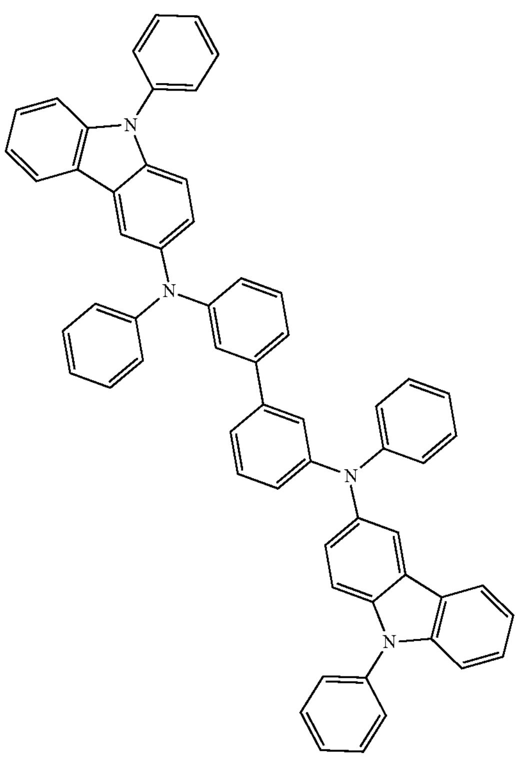
-continued
2-27
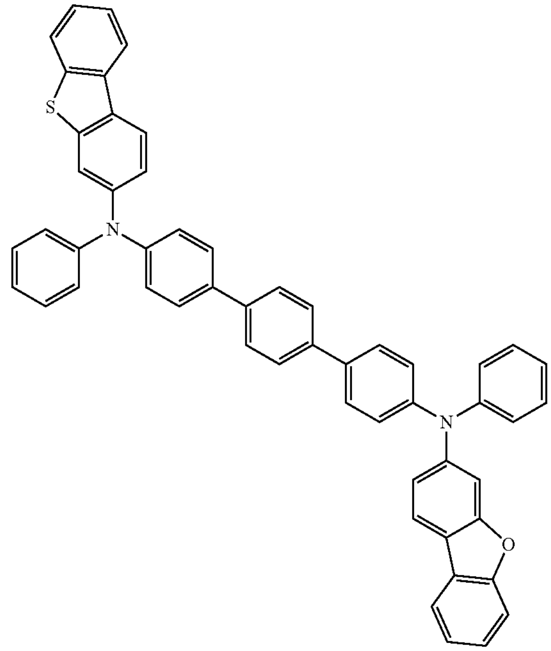
2-28
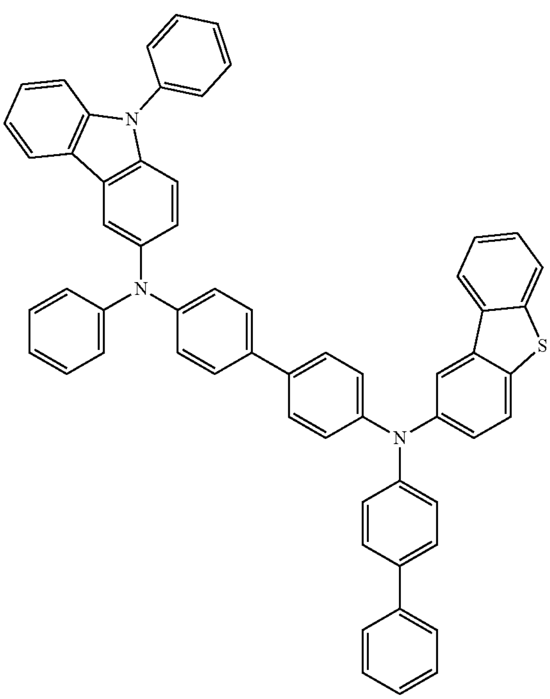

2-31
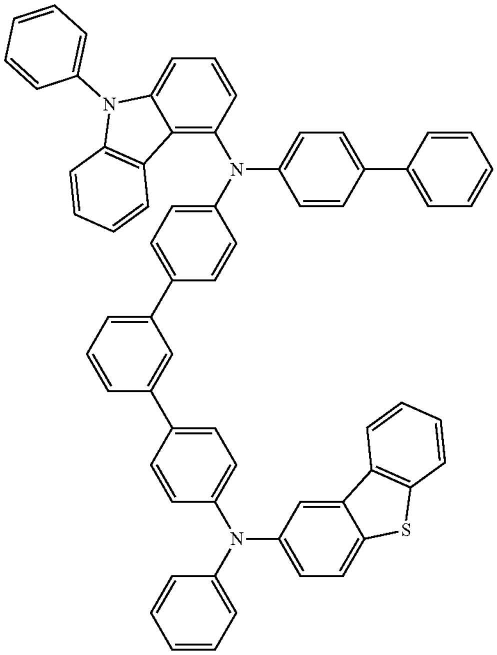
2-33
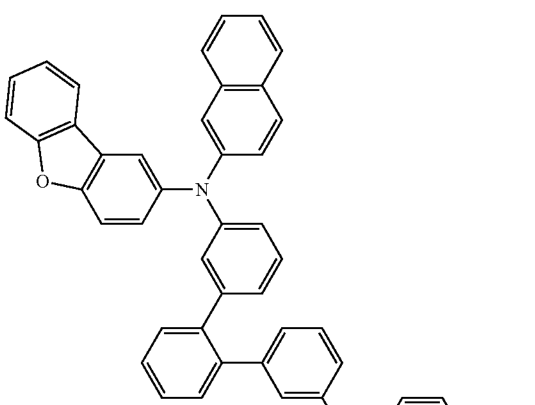
2-36
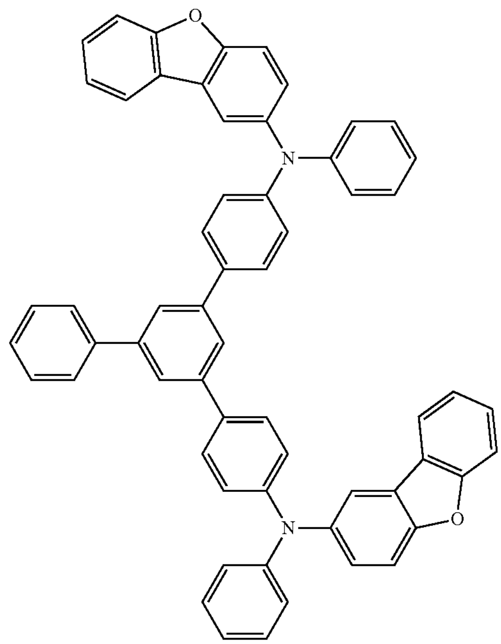
2-41
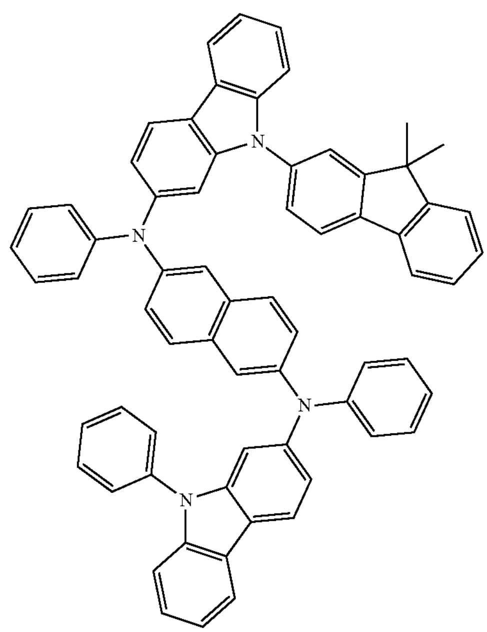

-continued
2-44
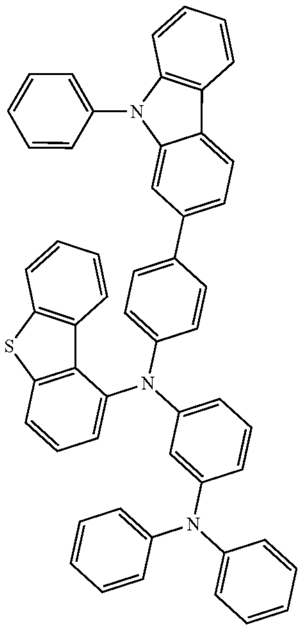
2-46
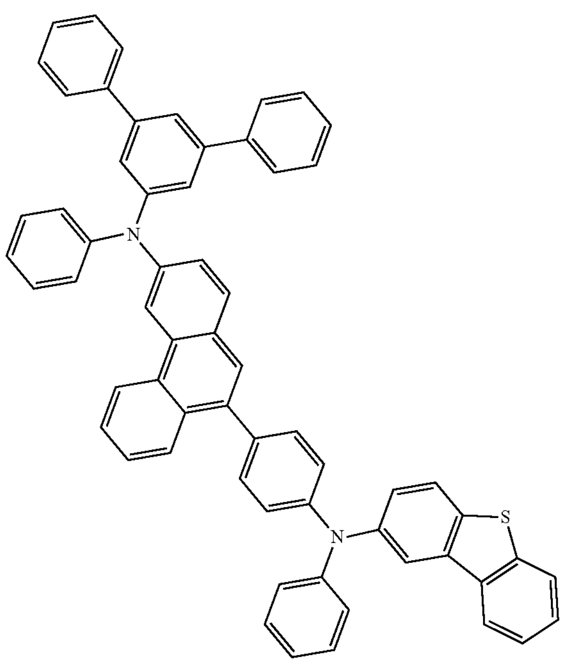
-continued
2-47
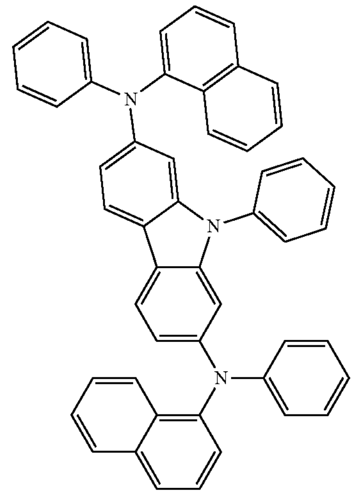
2-48
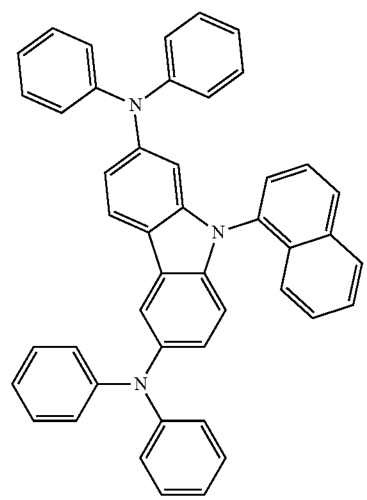
2-49
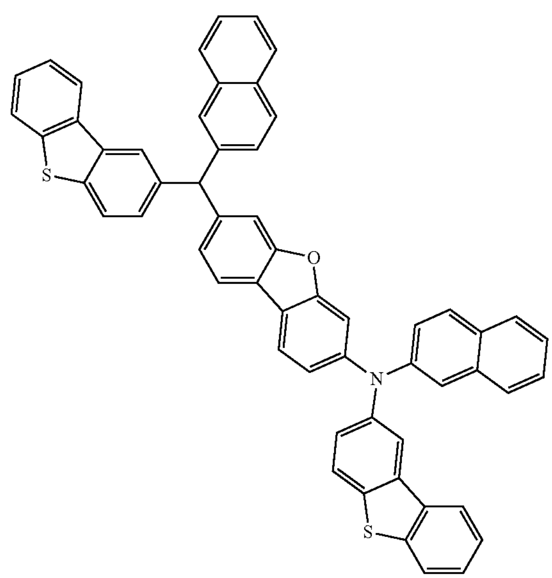

-continued
2-50
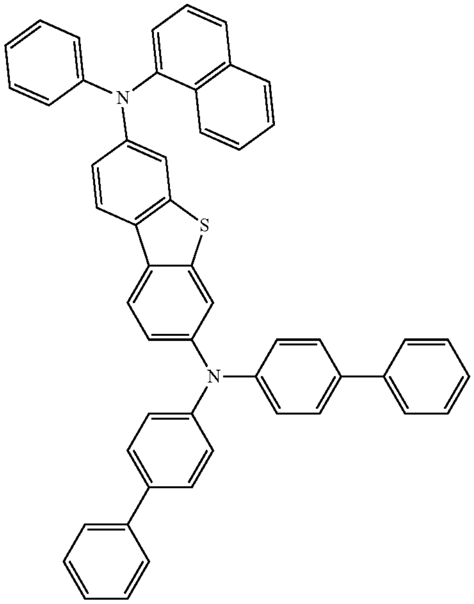
2-51
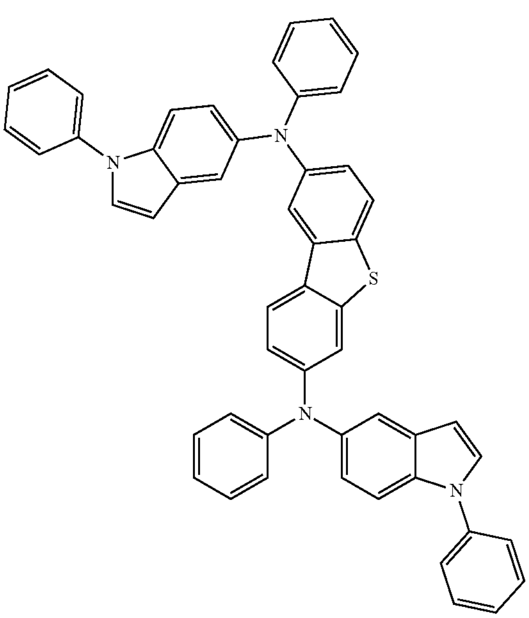
-continued
2-52
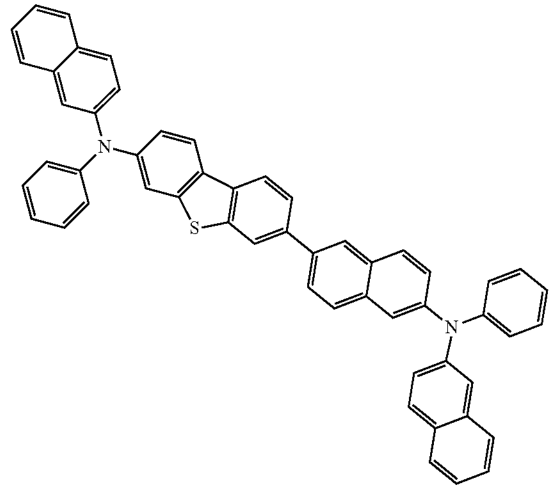
2-53
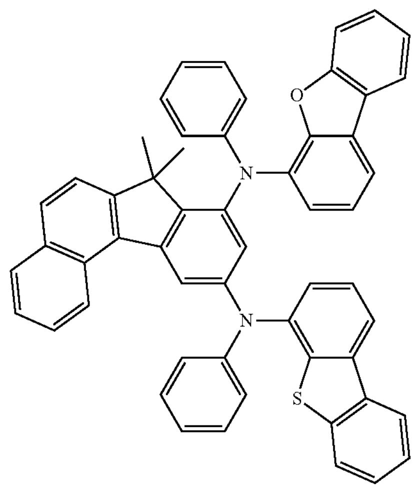
2-54
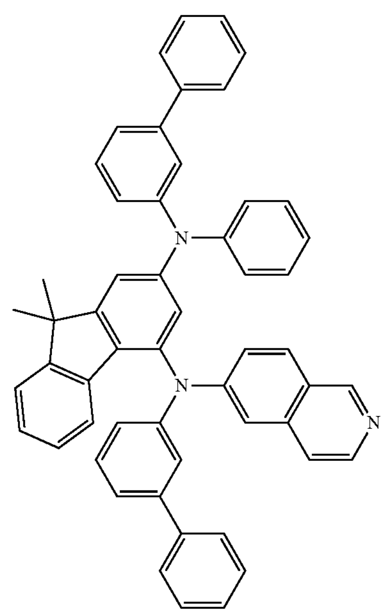

-continued
2-55
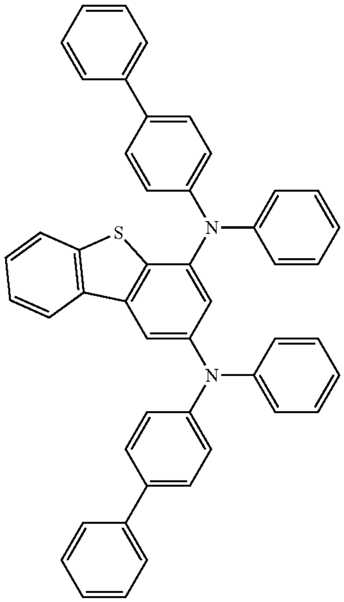
2-56
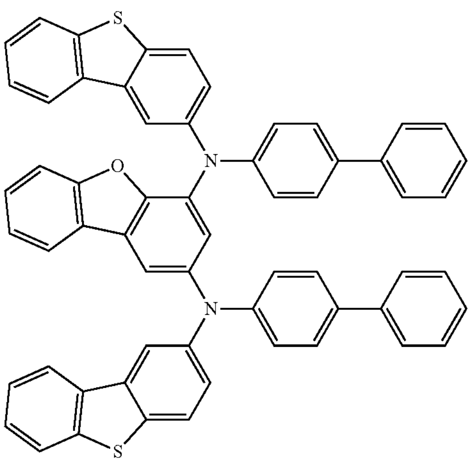
2-57
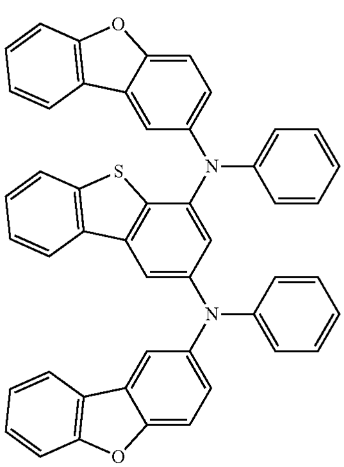
-continued
2-58
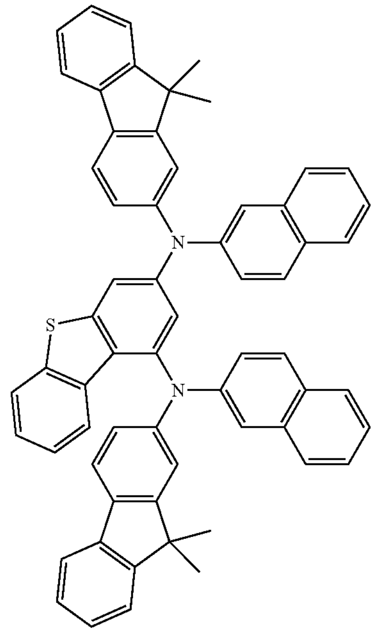
2-59
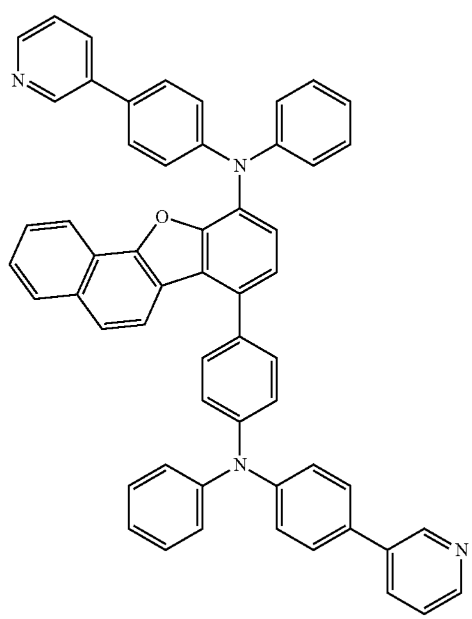

2-60
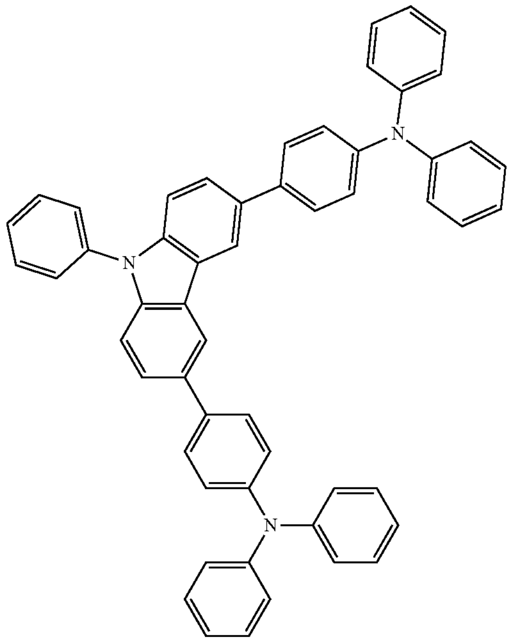
2-61
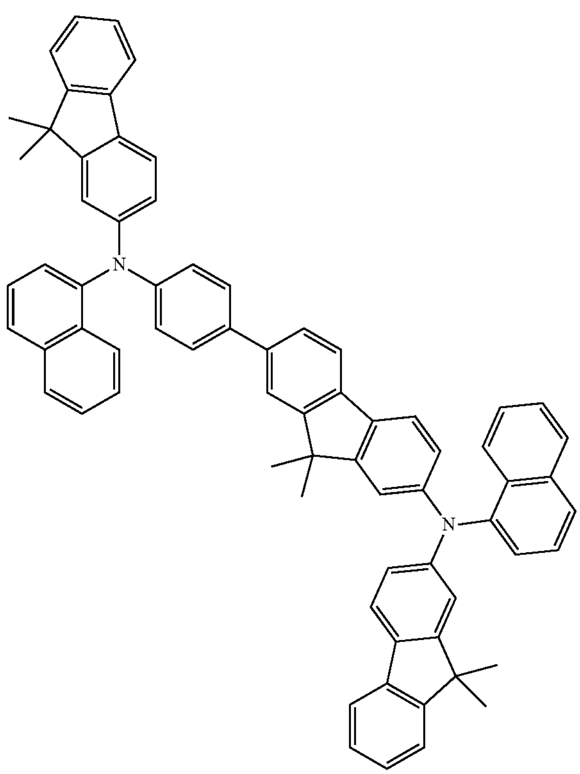
2-62
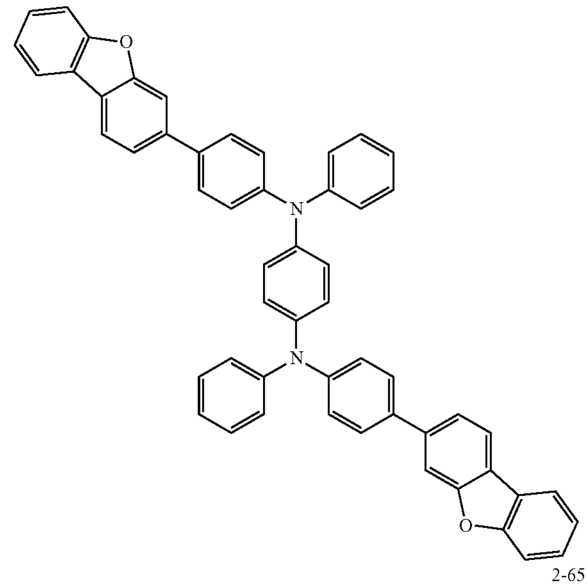
2-65
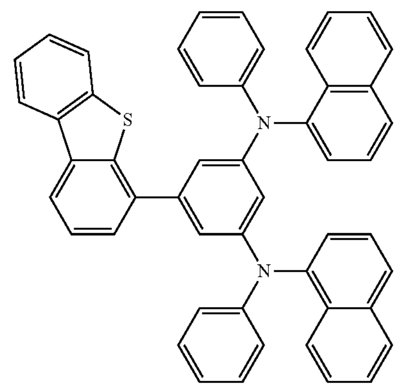
2-66
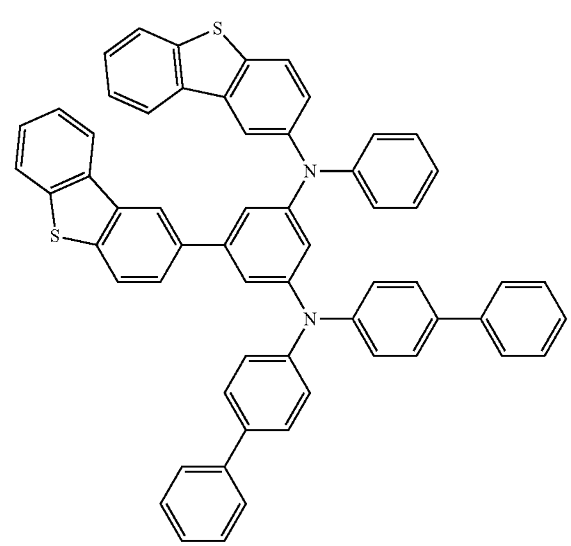

-continued
2-68
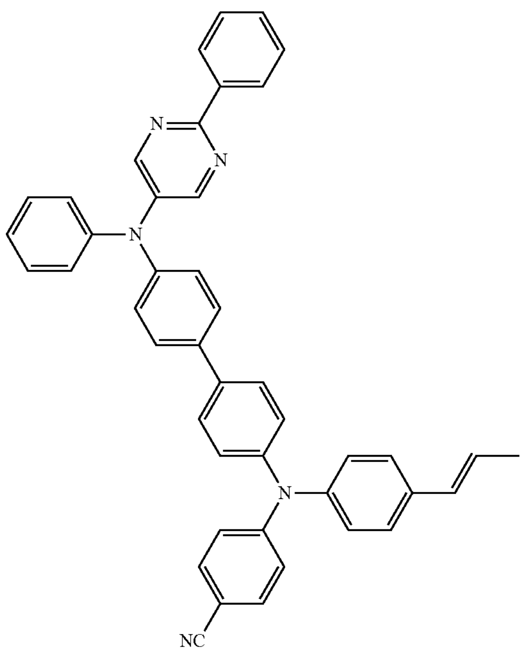
2-69
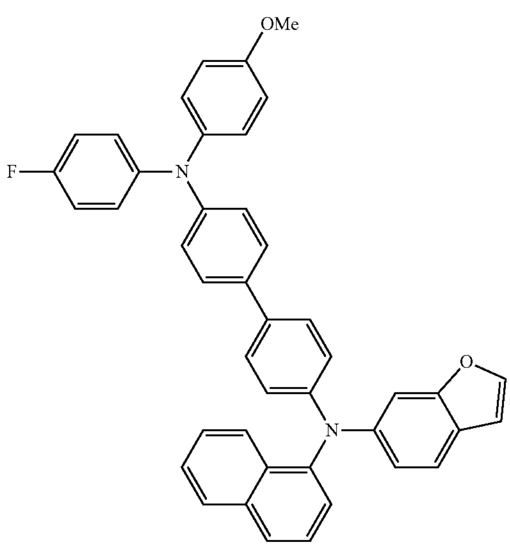
-continued
2-71
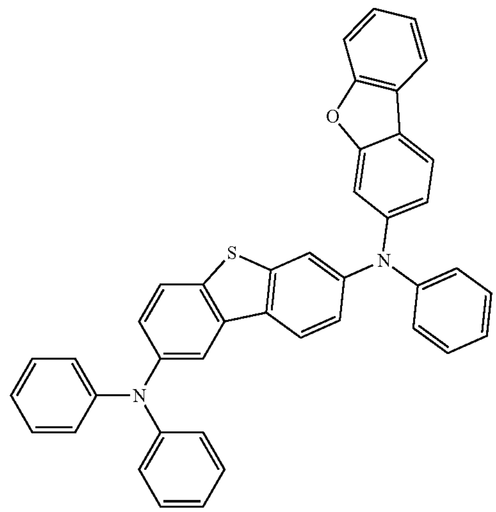
2-72
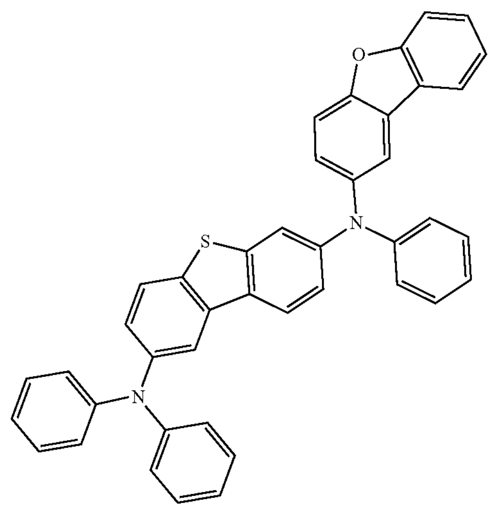
2-73
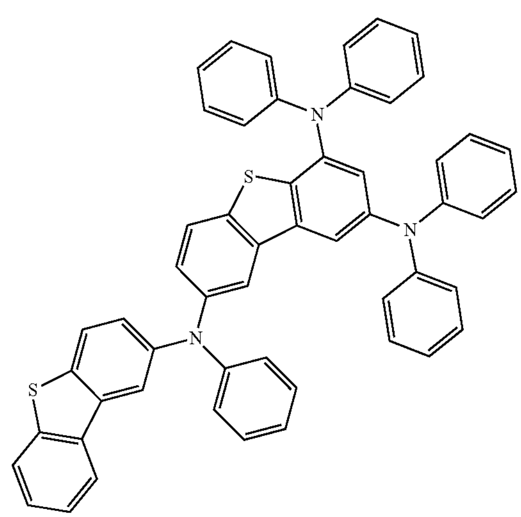

-continued
2-74
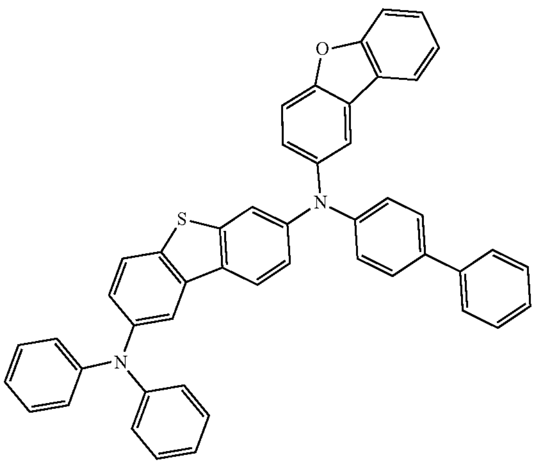
2-75
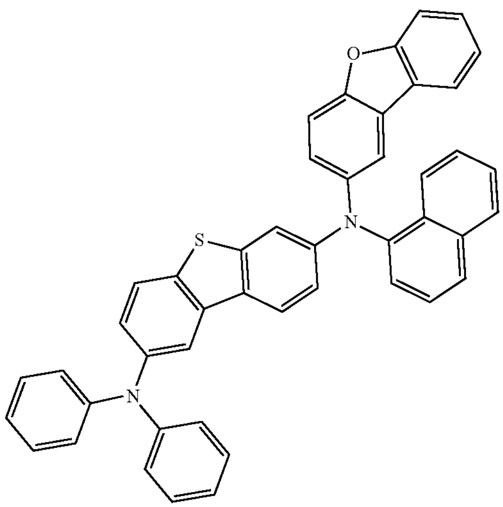
2-76
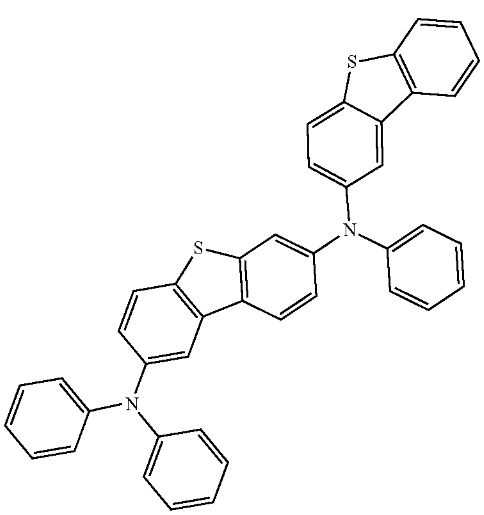
-continued
2-77
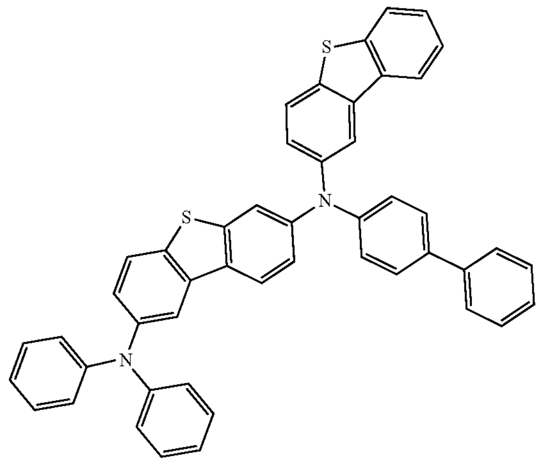
2-78
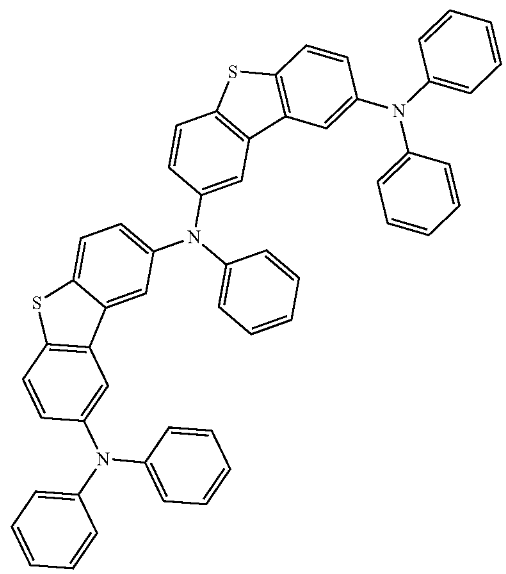
2-79
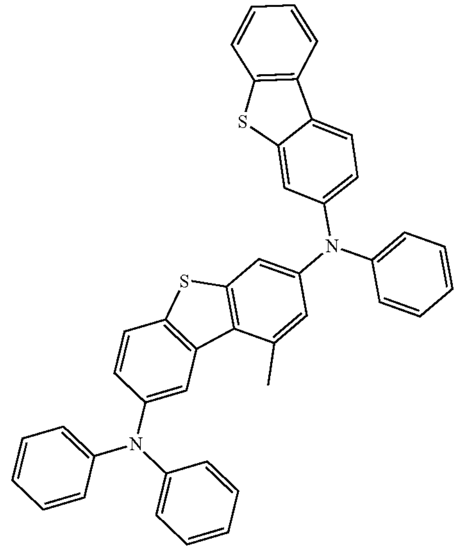

2-80
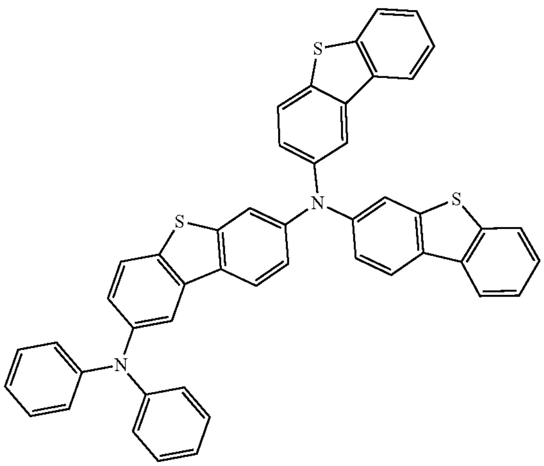
2-81
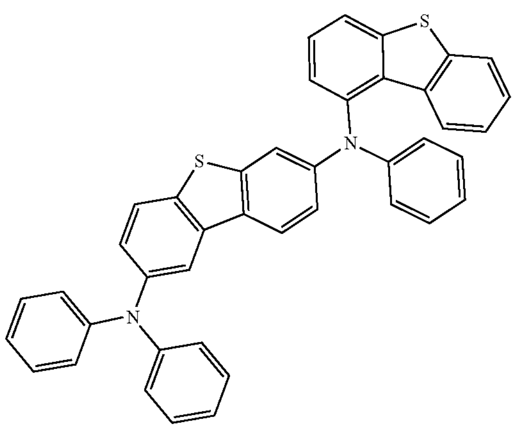
2-82
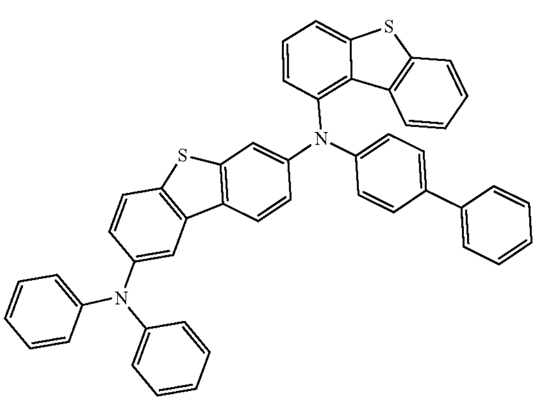
2-83
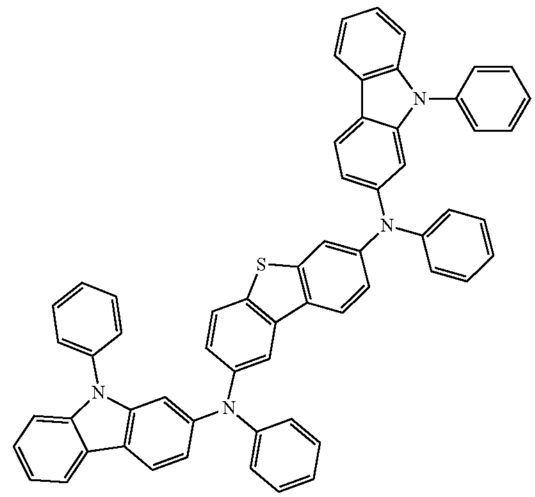
2-84
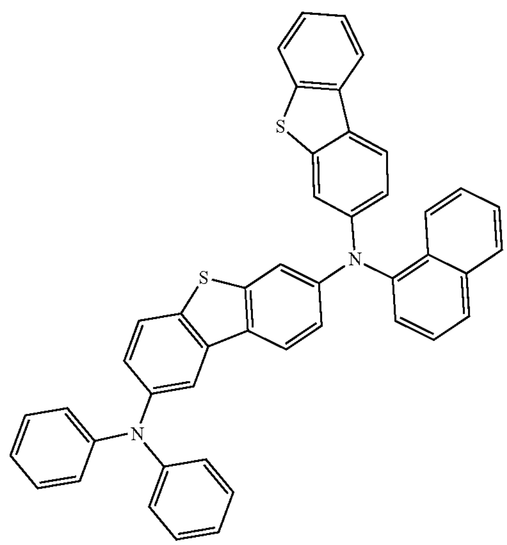
2-85
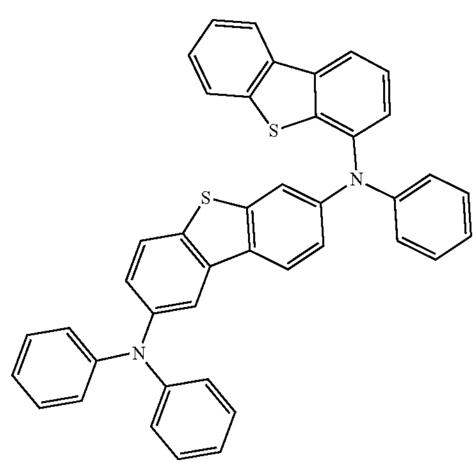

-continued
2-86
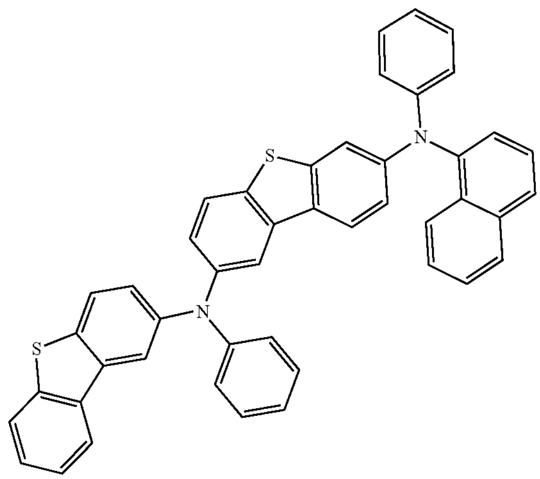
2-87
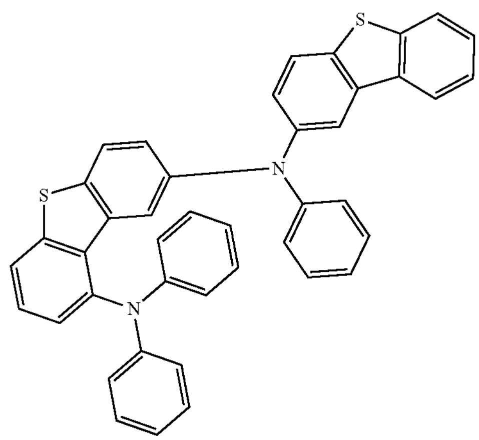
2-88
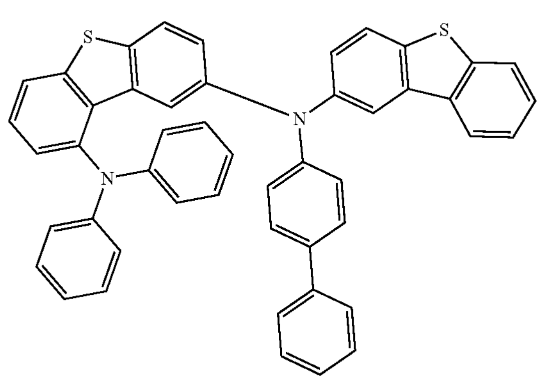
-continued
2-89
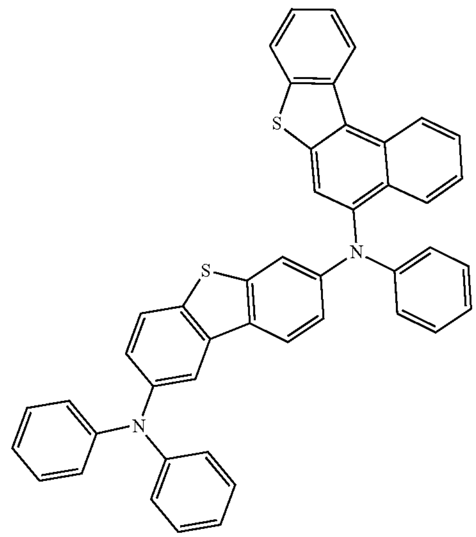
2-90
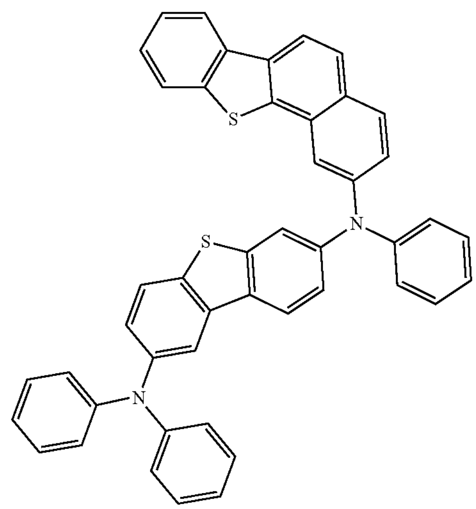
2-91
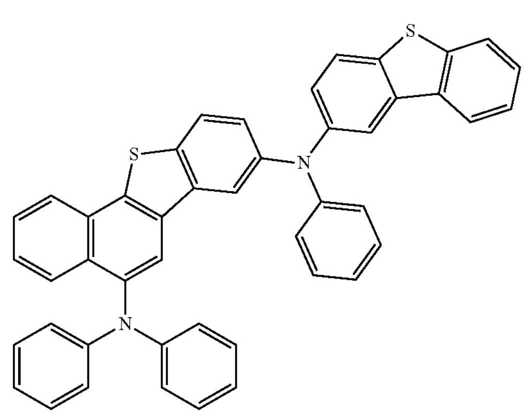

-continued
2-92
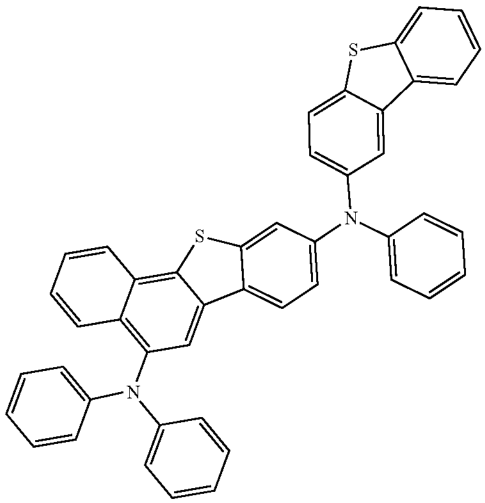
2-93
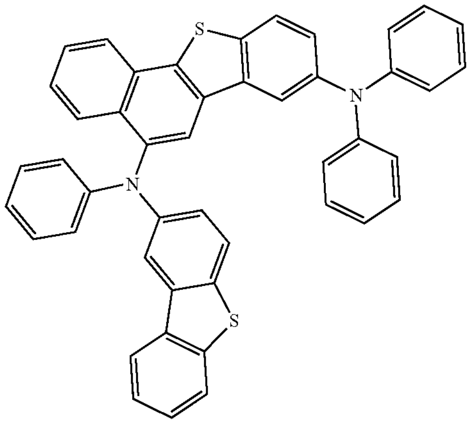
2-94
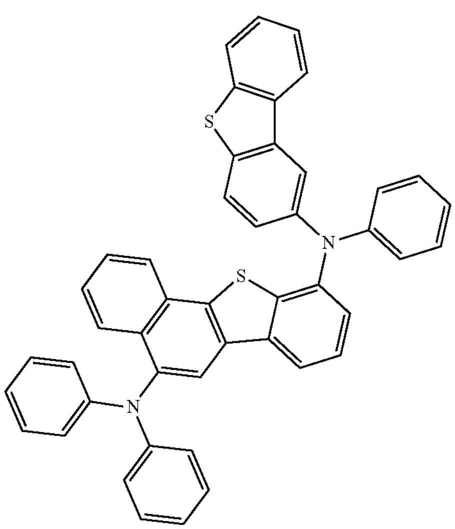
-continued
2-95
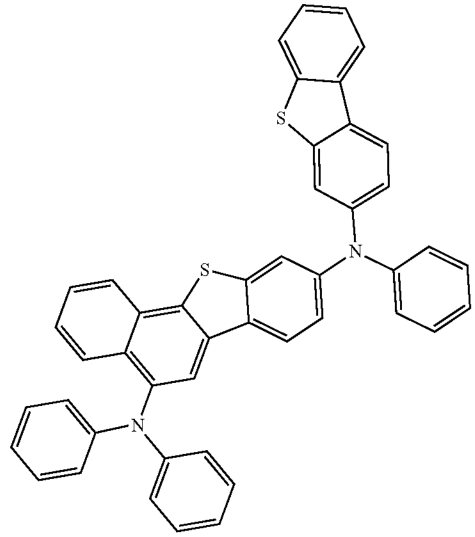
2-96
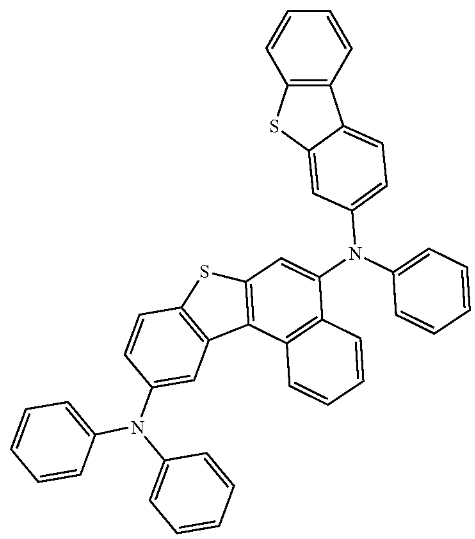
2-97
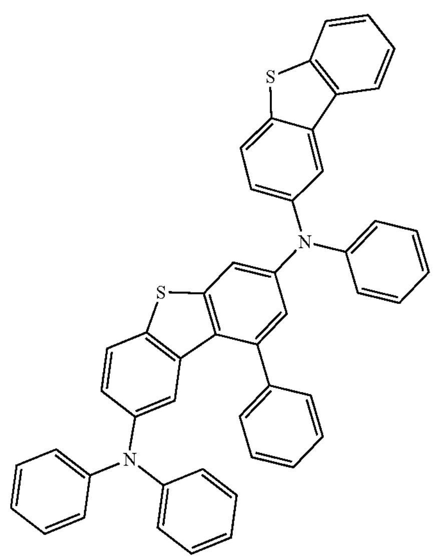

-continued
2-98
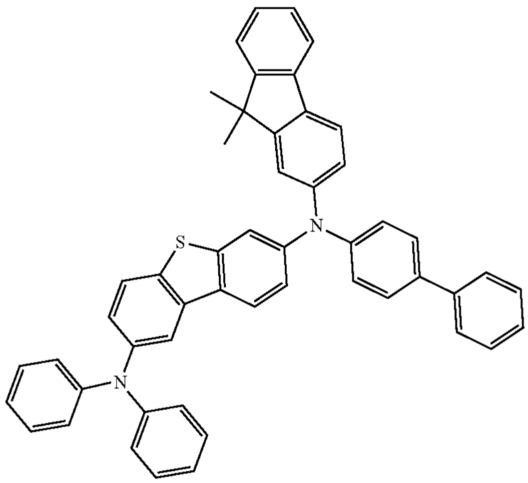
2-99
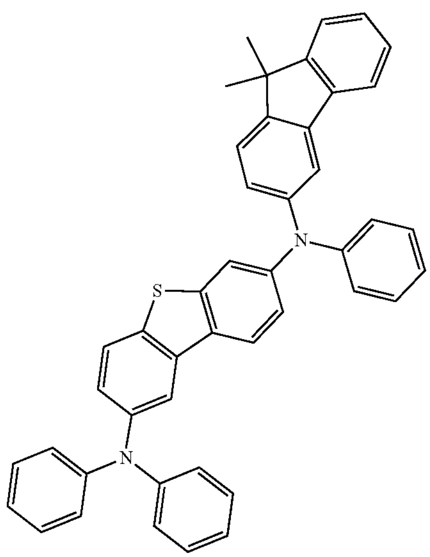
2-100
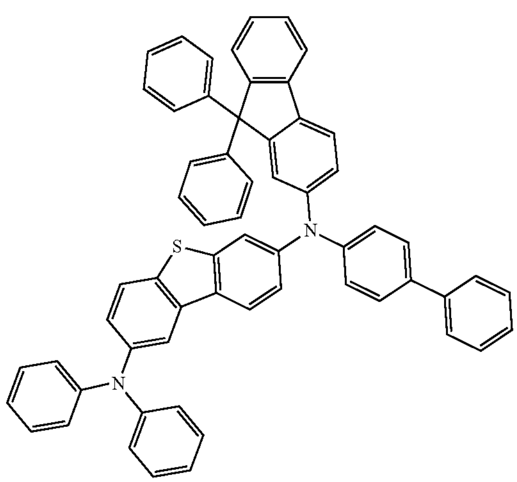
-continued
2-101
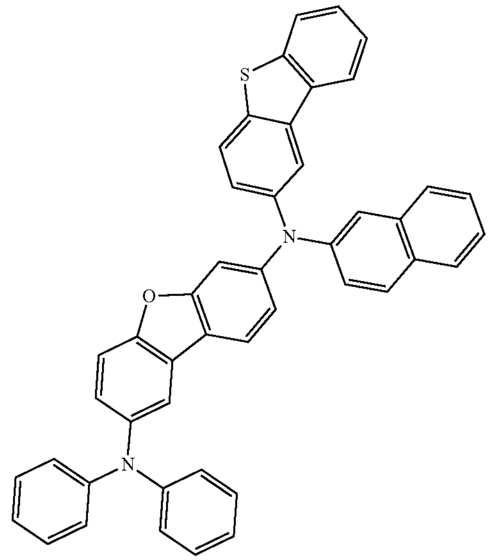
2-102
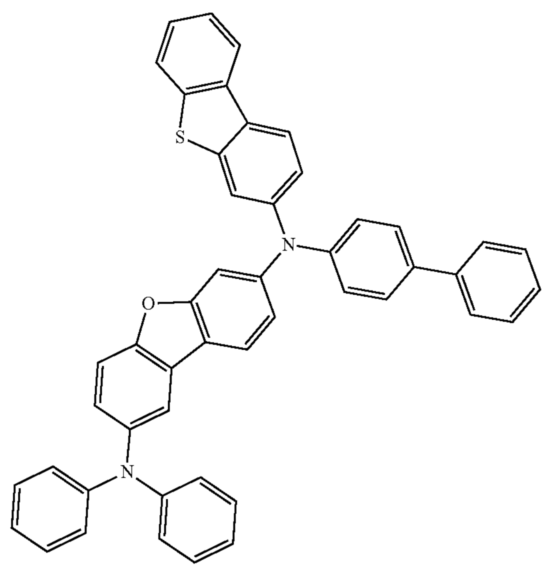
2-103
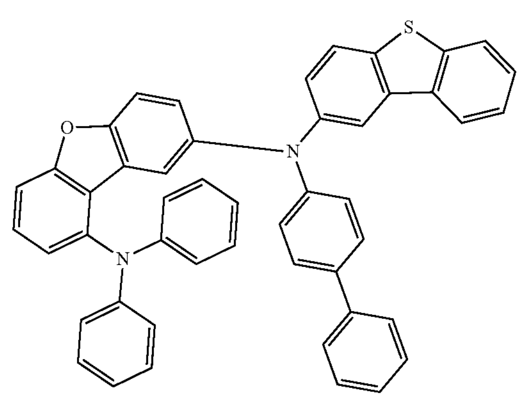

-continued
2-104
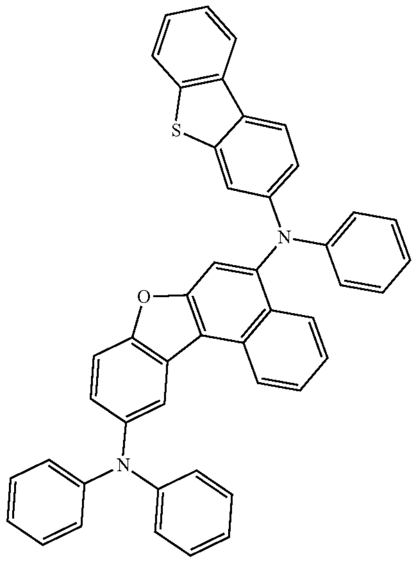
2-105
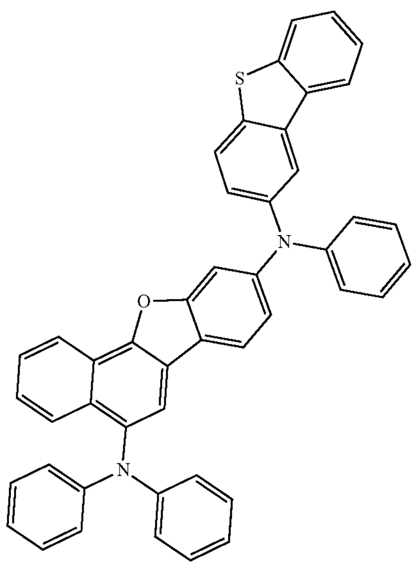
2-106
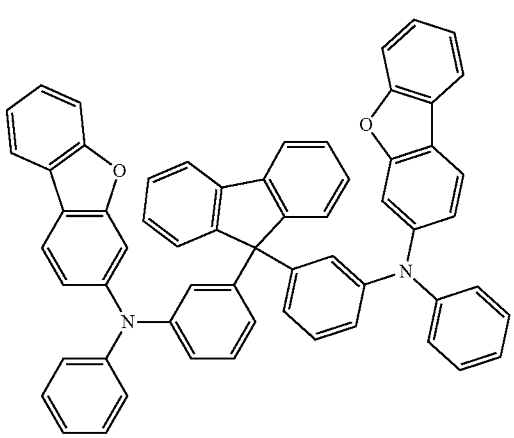
-continued
2-107
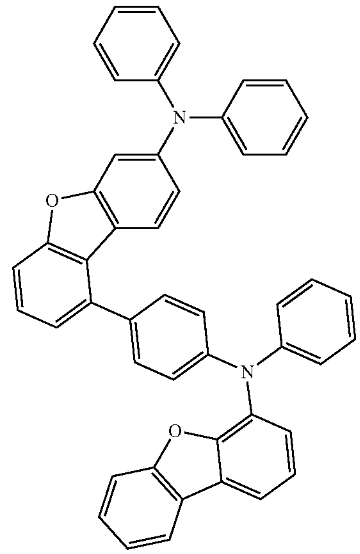
2-108
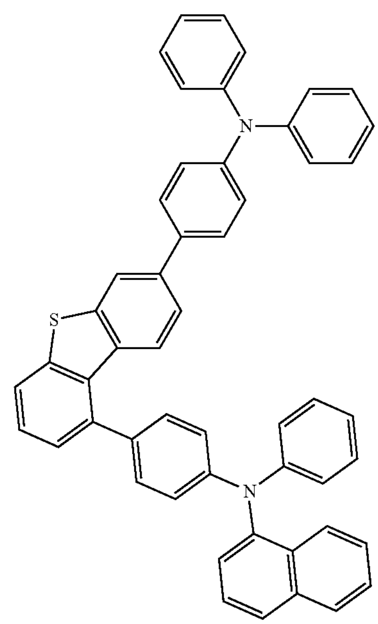

-continued
2-109
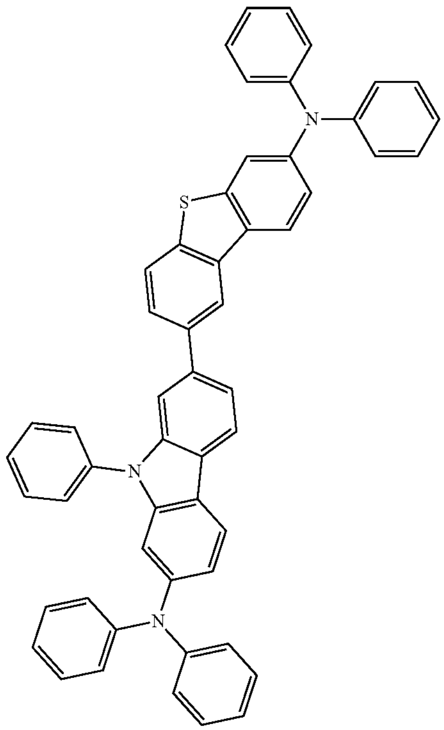
2-110
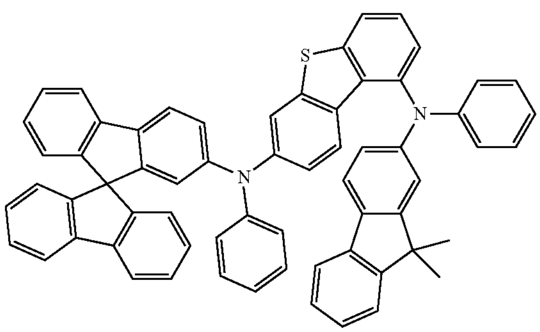
2-111
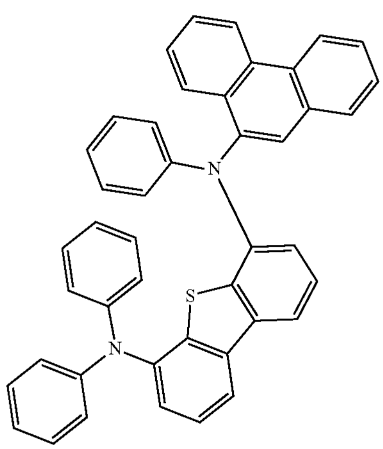
-continued
2-112
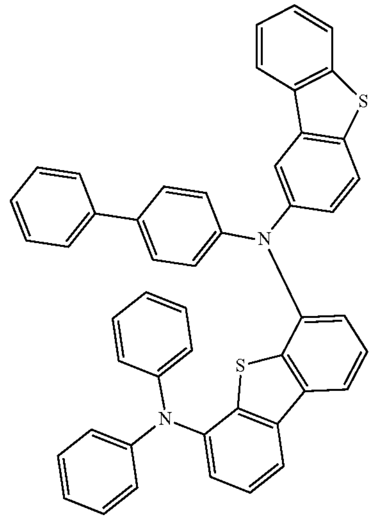
2-113
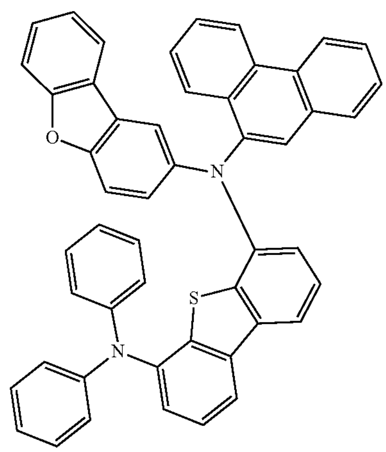
2-114
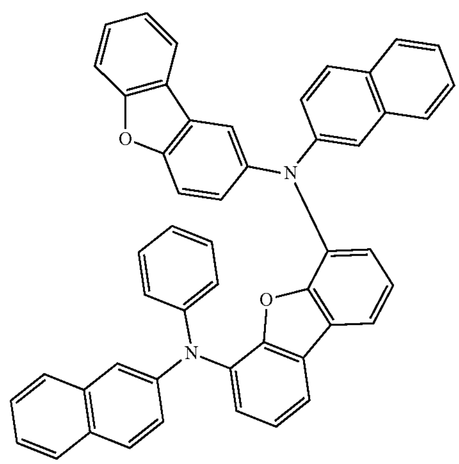

-continued
2-115
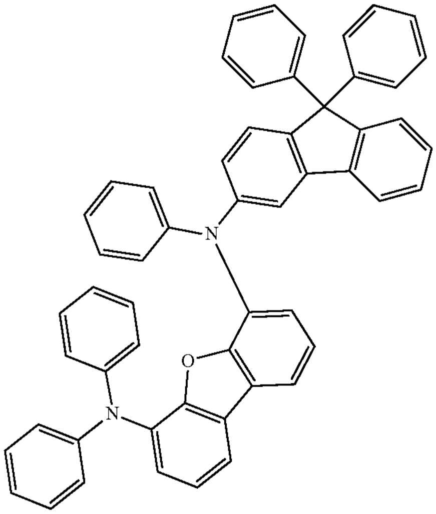
2-116
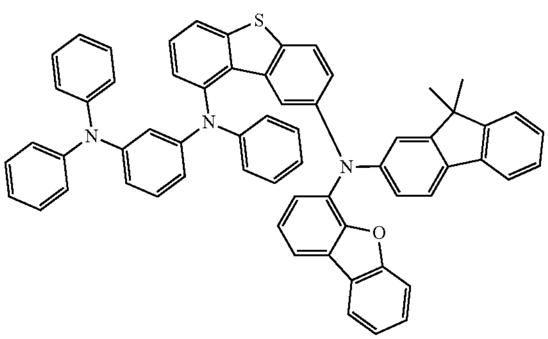
2-117
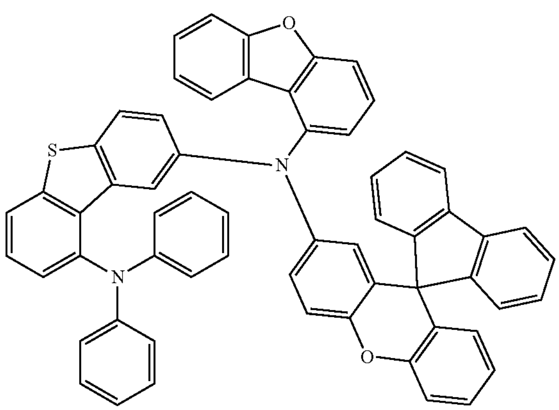
2-118
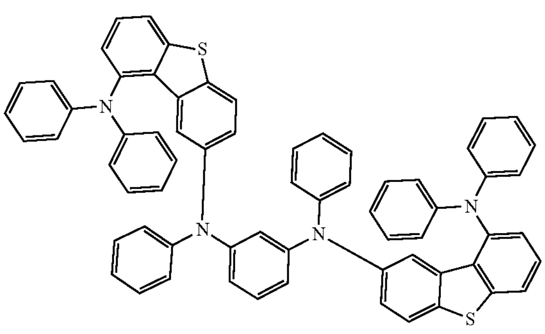
-continued
2-119
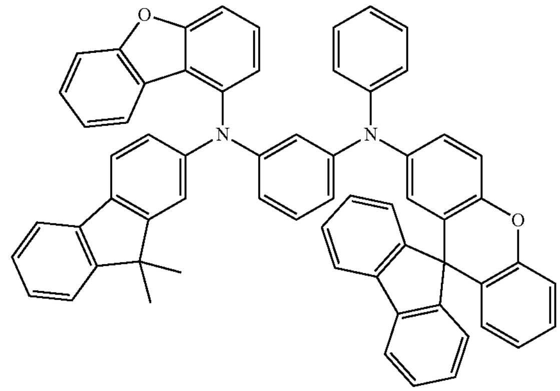
2-120
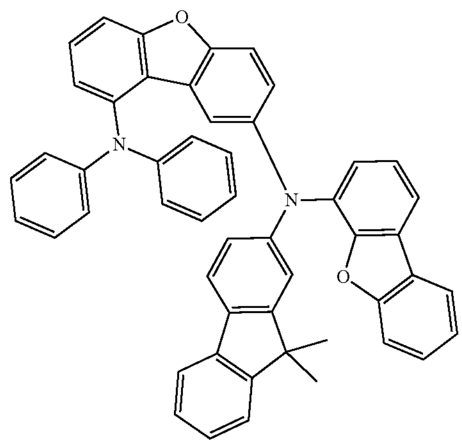
2-121
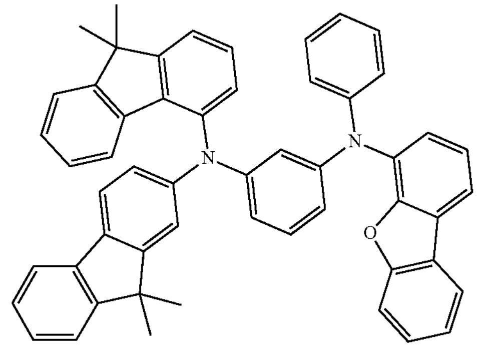
2-122
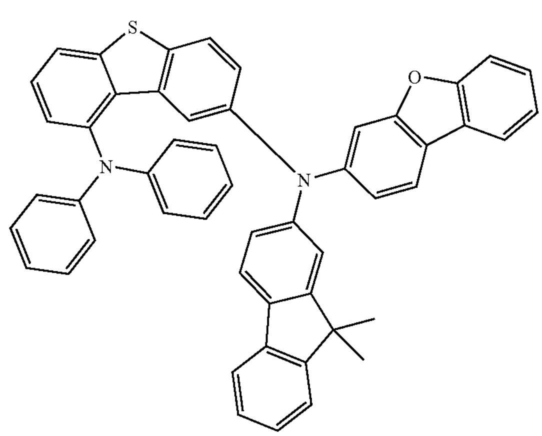

-continued
2-123
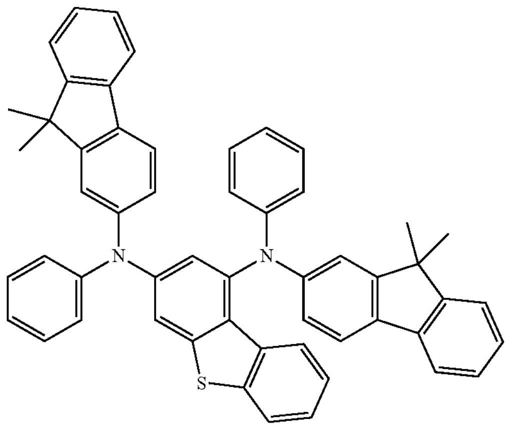
-continued
2-124
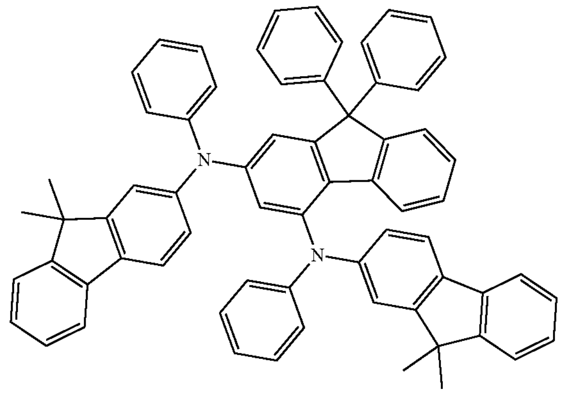
2-125
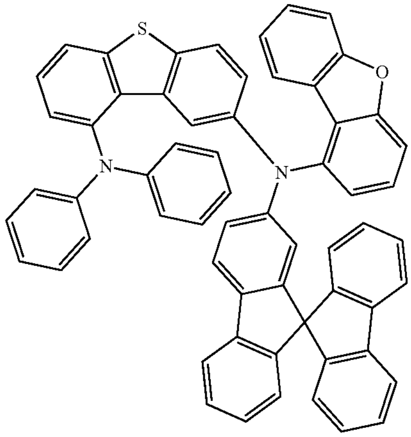
2-126
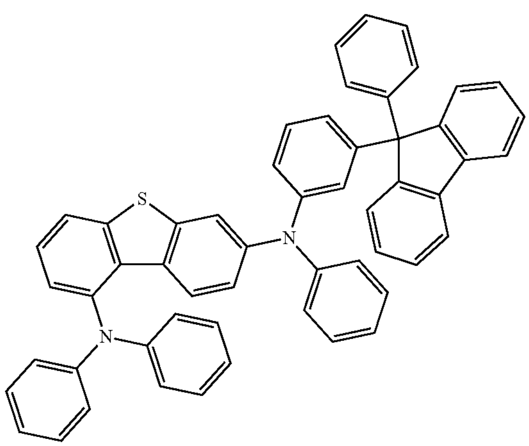

-continued
2-127
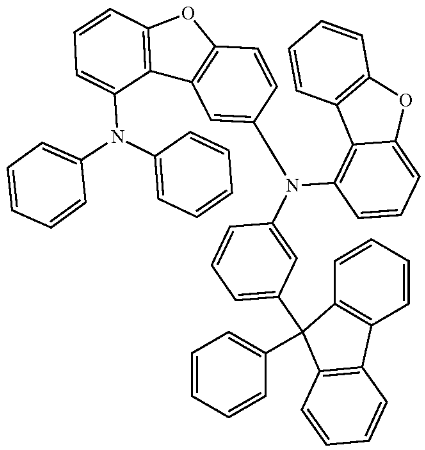
2-128
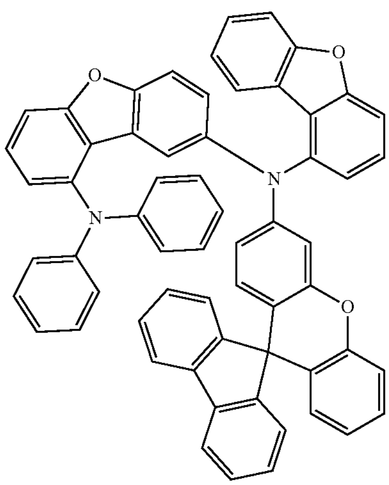
2-129
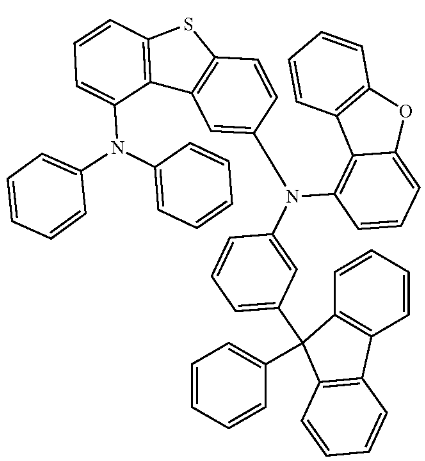

-continued
2-130
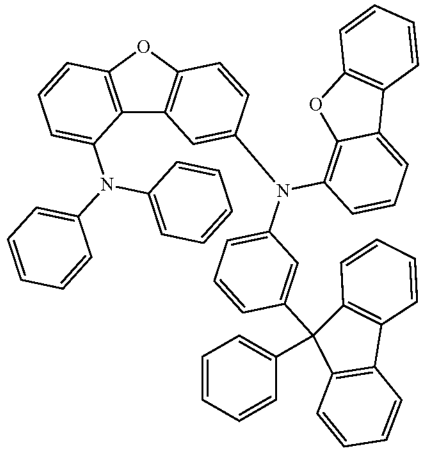
2-131
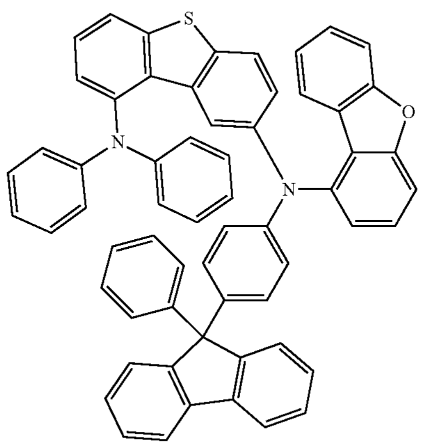
2-132
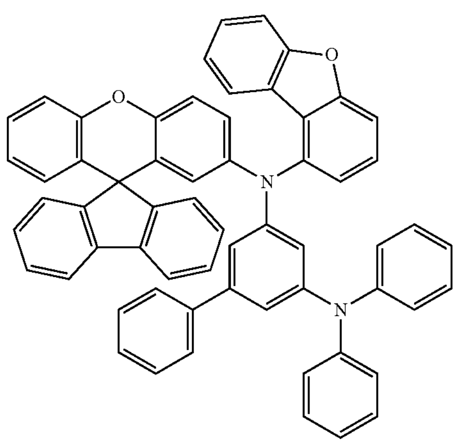

-continued
2-133
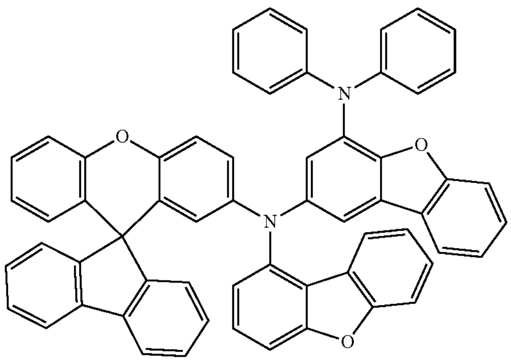
2-134
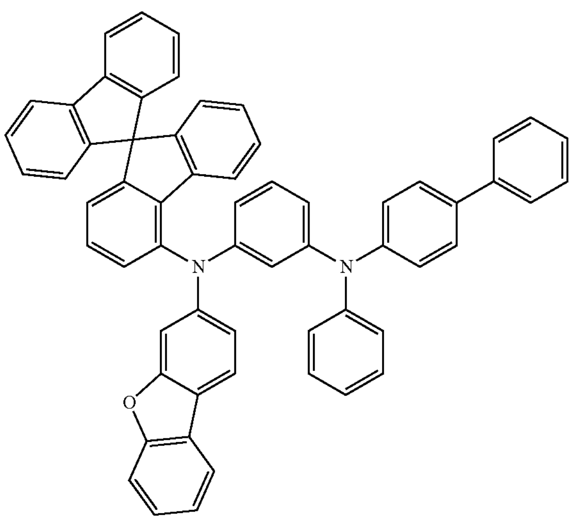
2-135
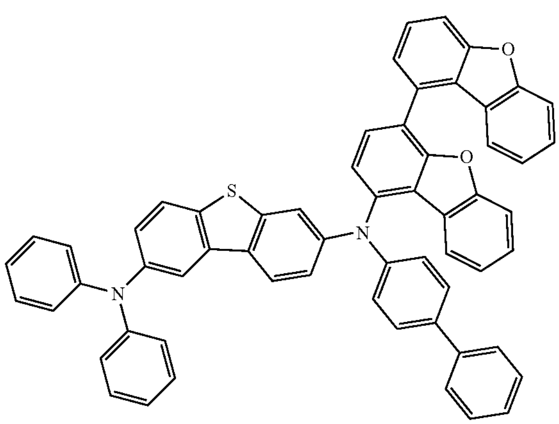

-continued
2-136
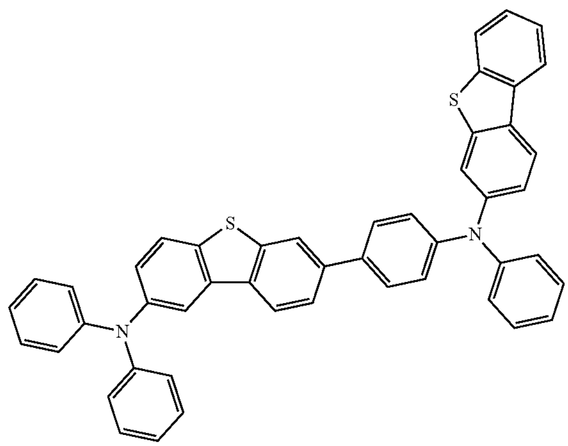
2-137
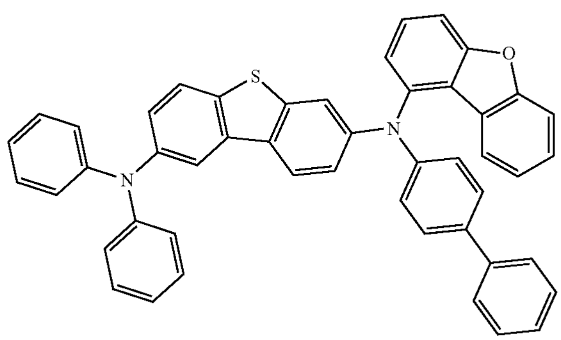
2-138
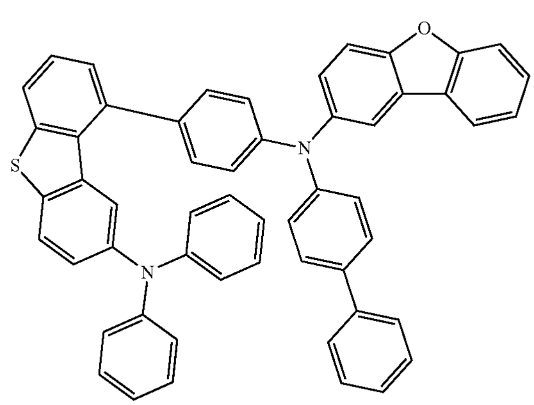

-continued
P4-1
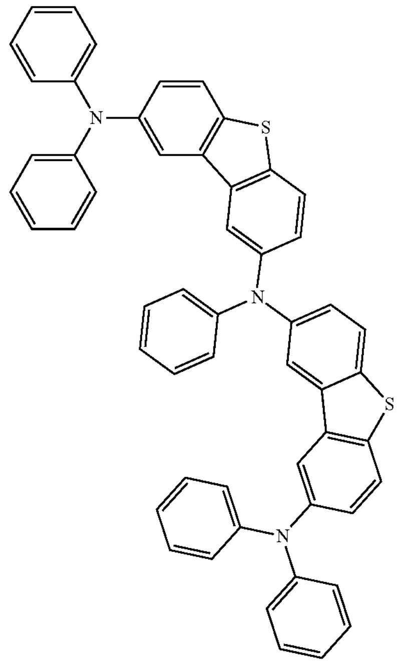
P4-2
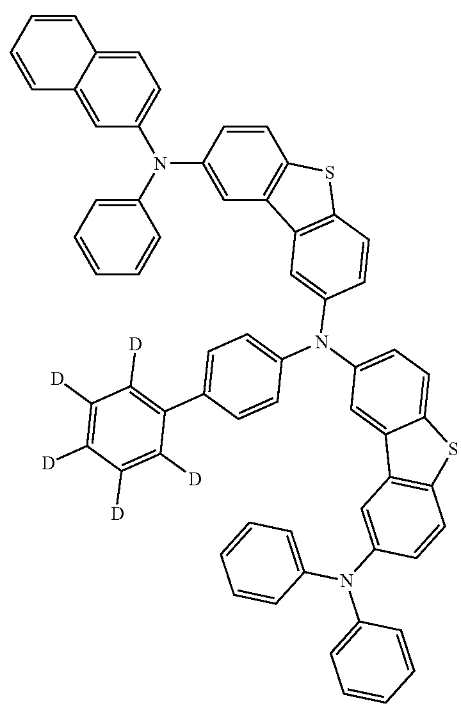

-continued
P4-3
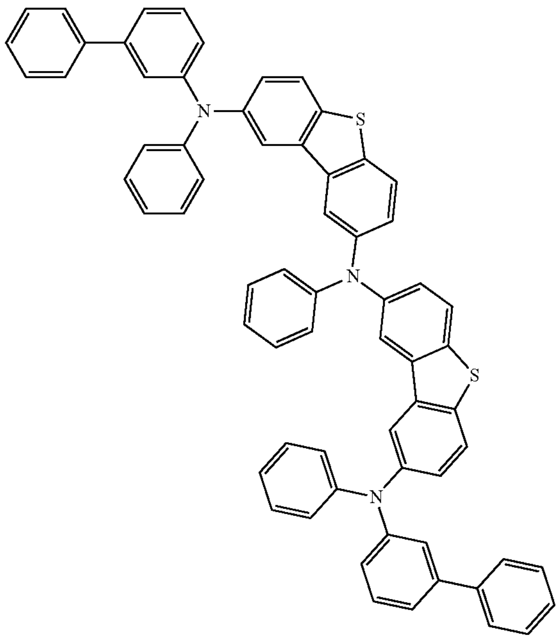
P4-4
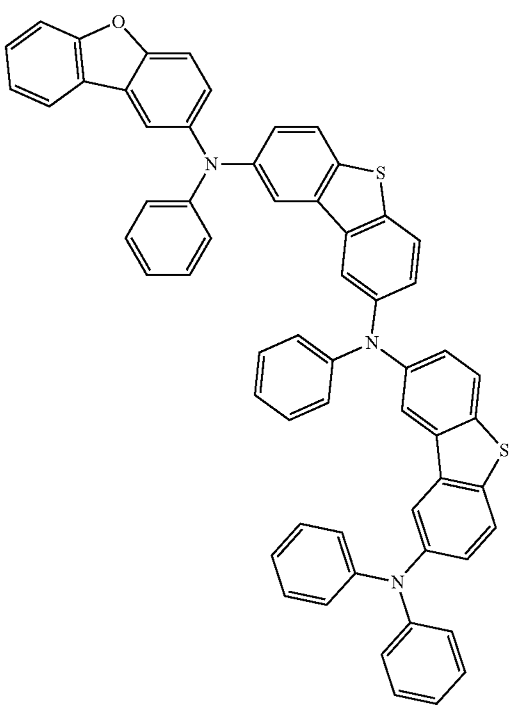

-continued
P4-5
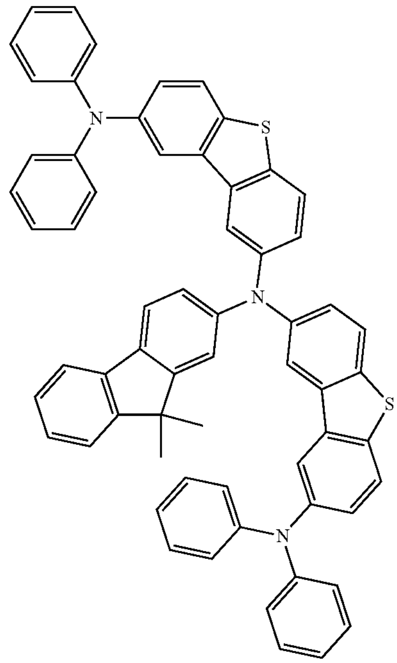
P4-6
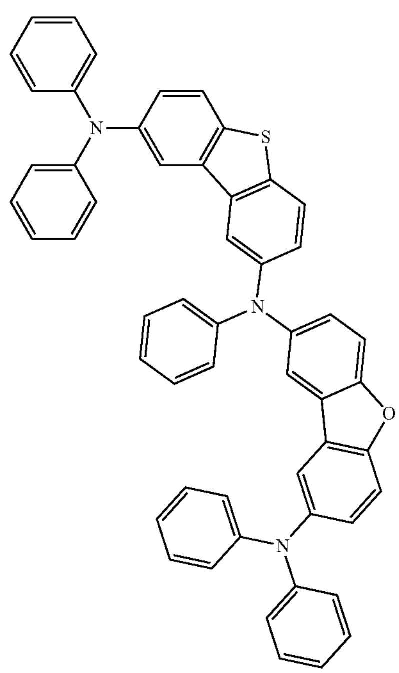

-continued
P4-7
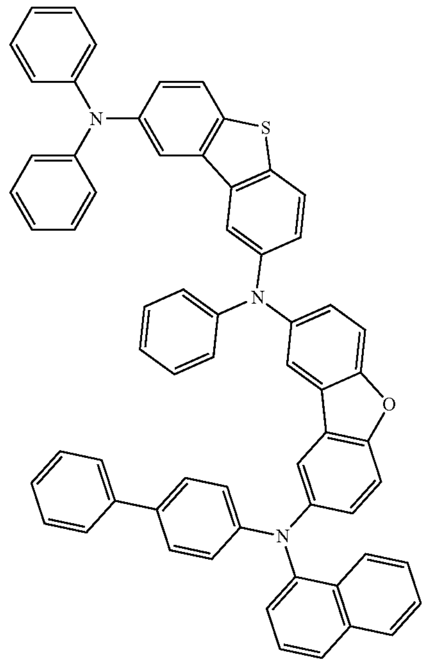
P4-8
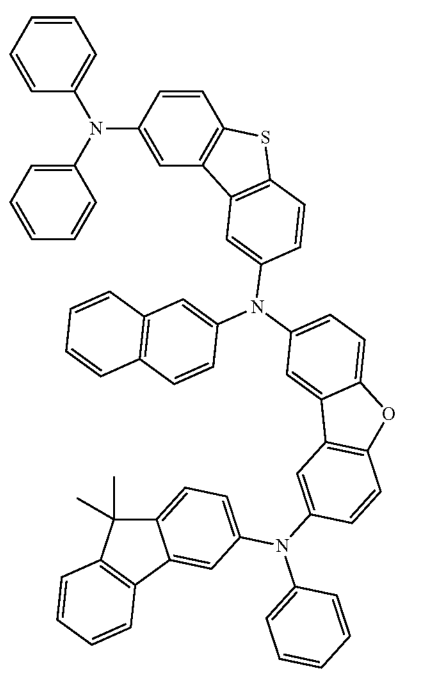

-continued
P4-9
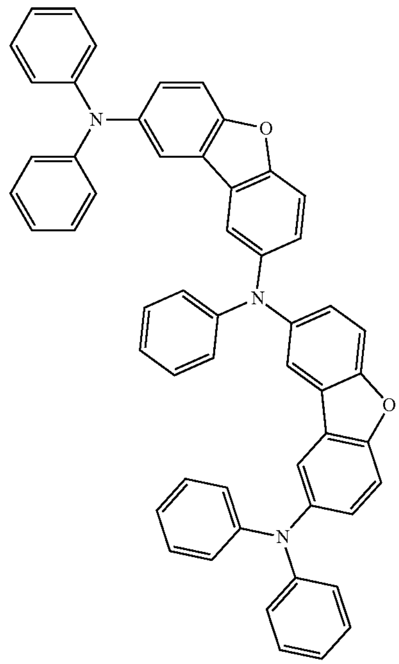
P4-10
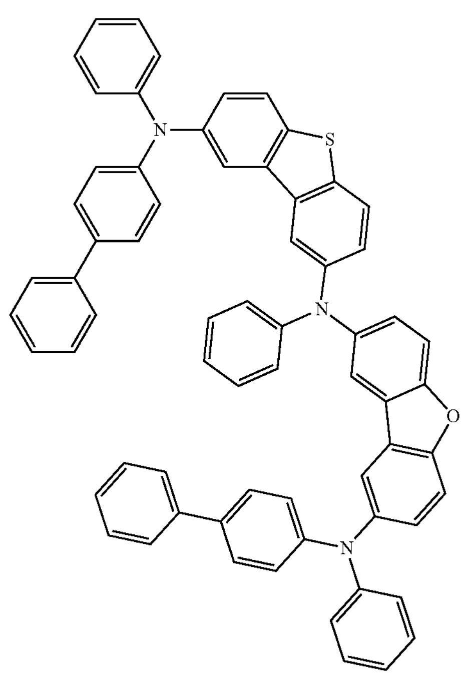

-continued
P4-11
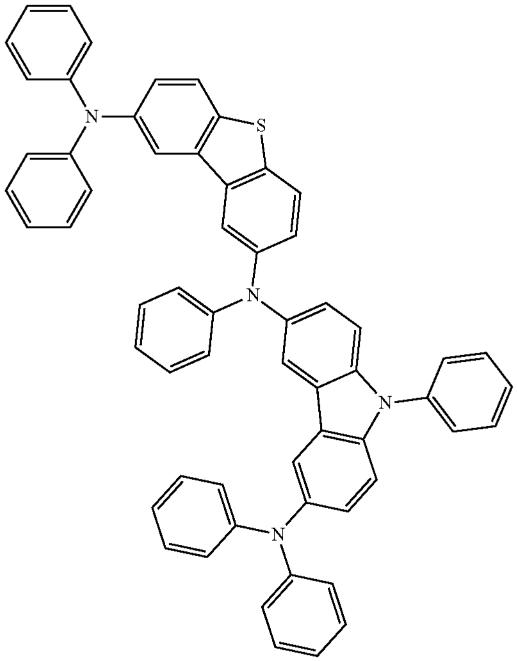
P4-12
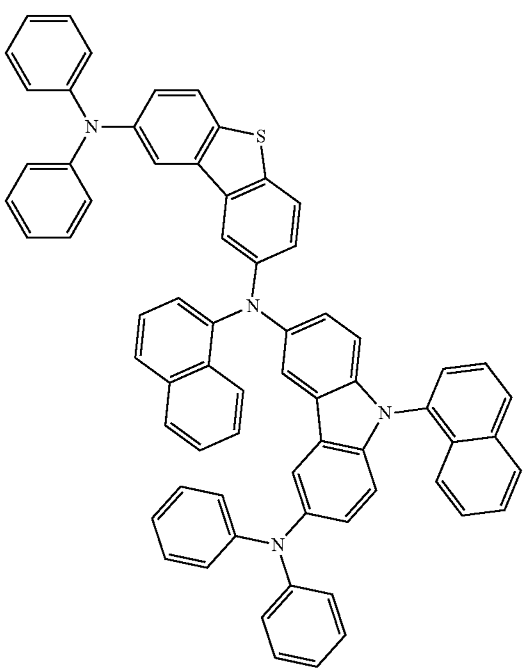

-continued
P4-13
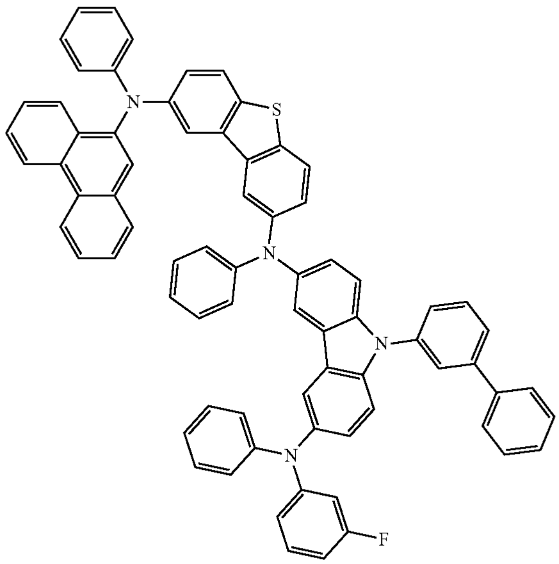
P4-14
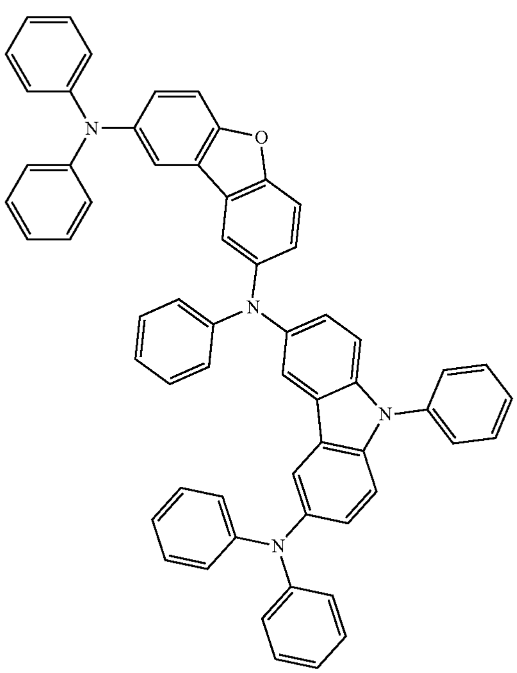

-continued
P4-15
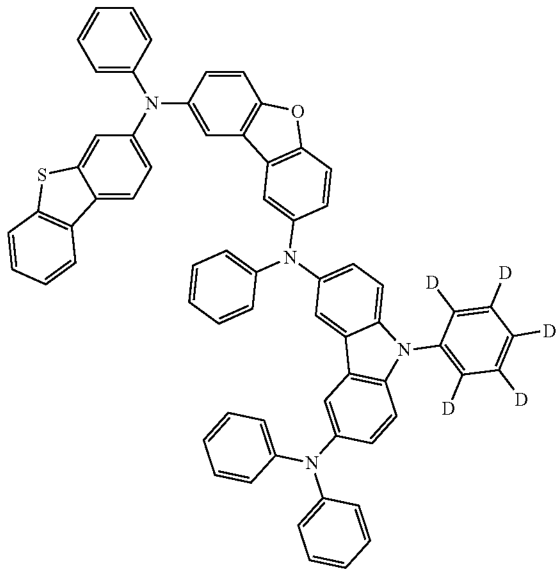
P4-16
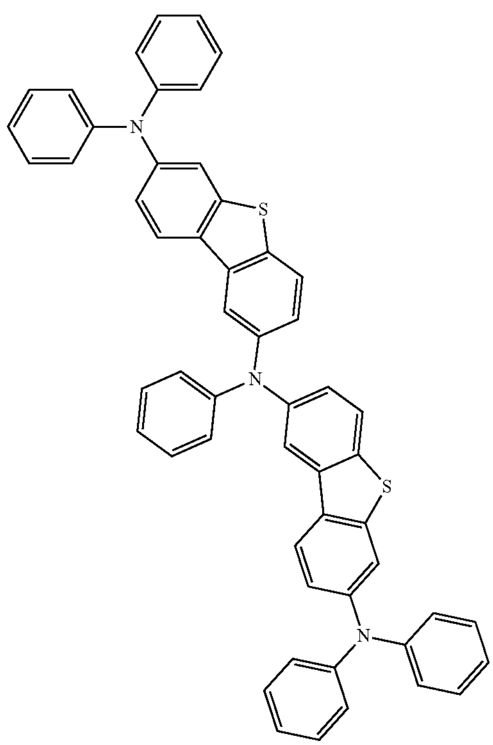

-continued
P4-17
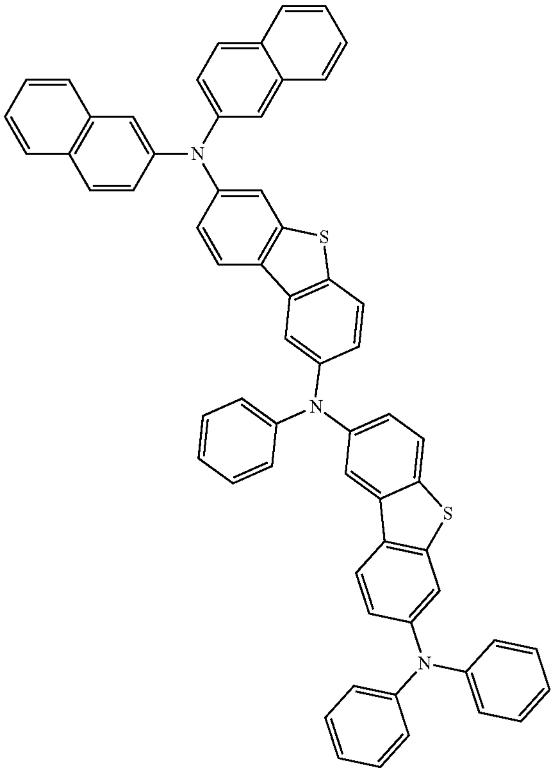
P4-18
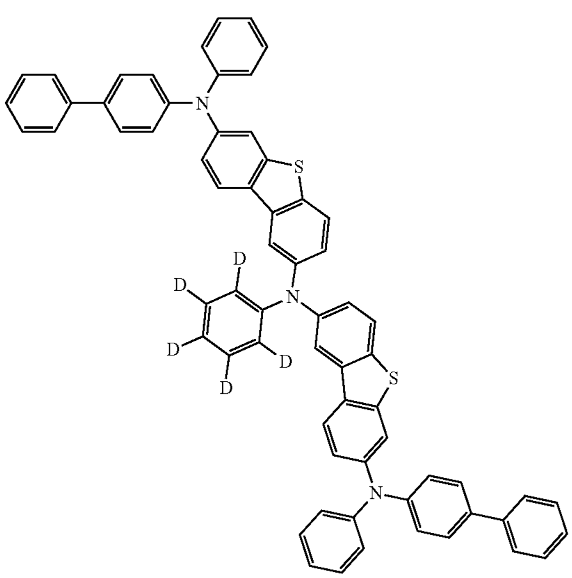

-continued
P4-19
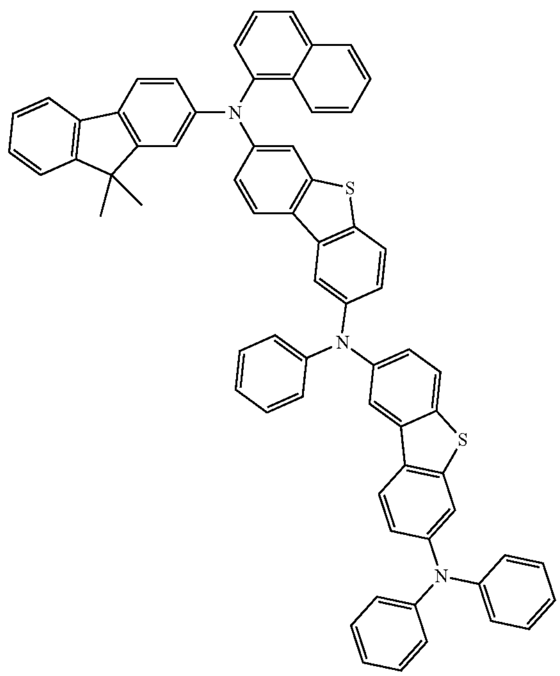
P4-20
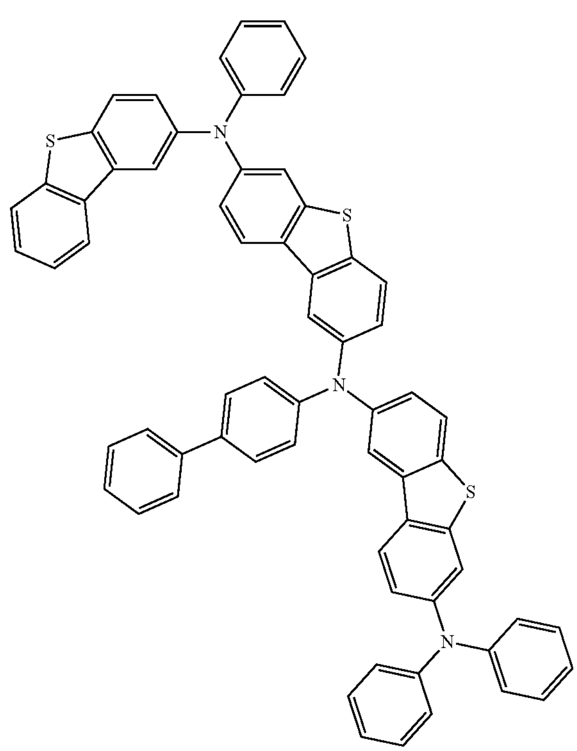

-continued
P4-21
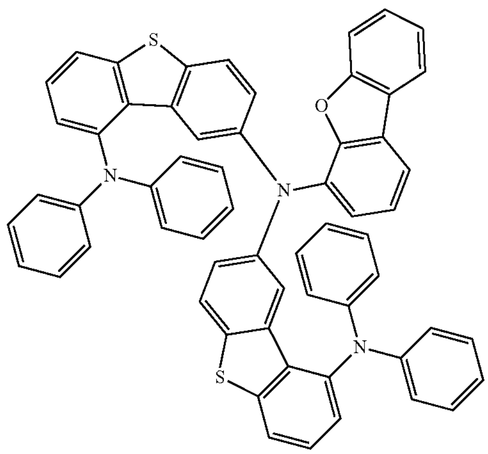
P4-22
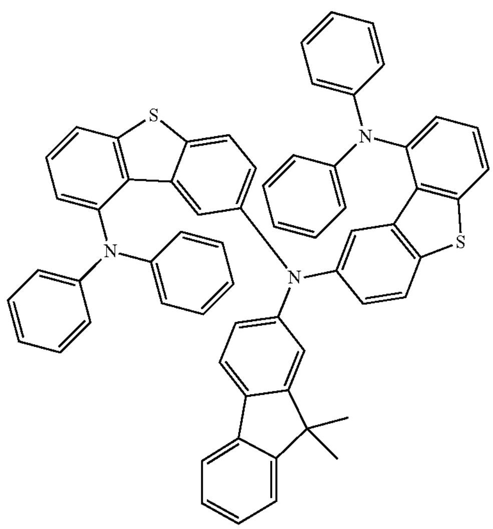
P4-23
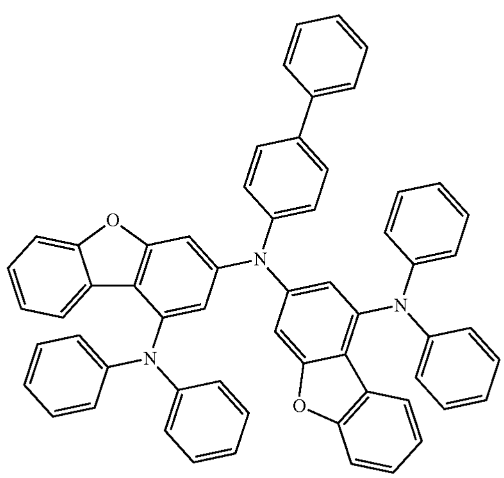

-continued
P4-24
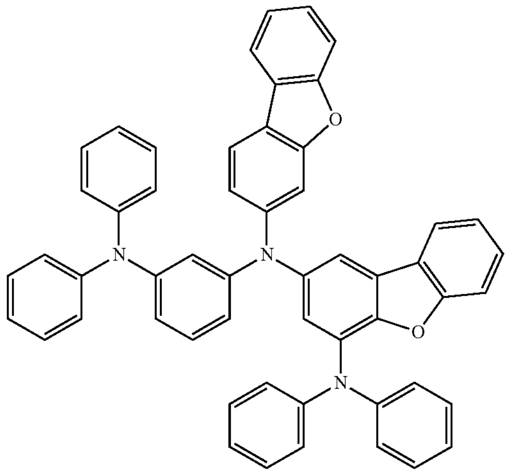
P4-25
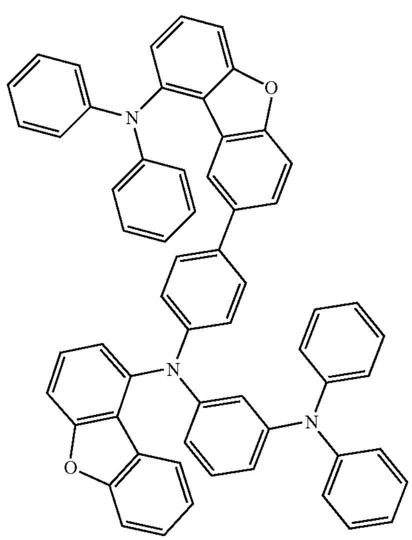

-continued
P4-26
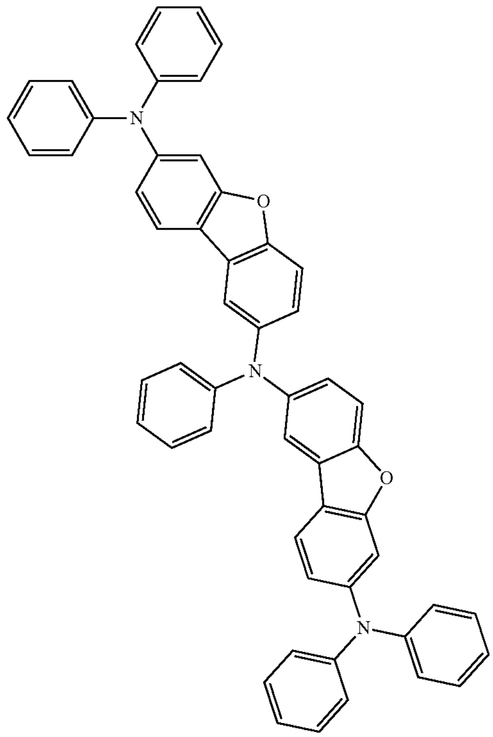
P4-27
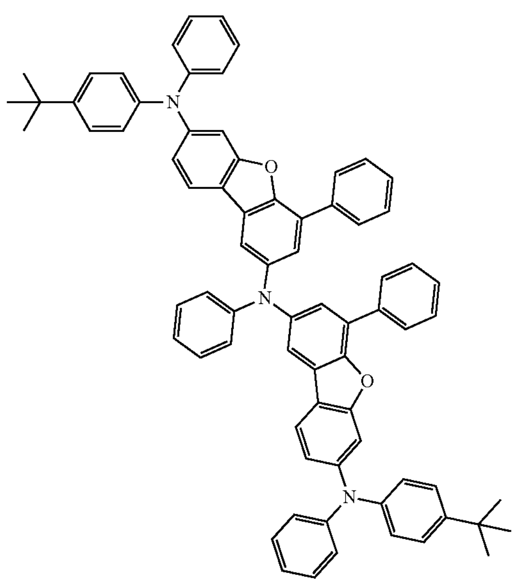

-continued
P4-28
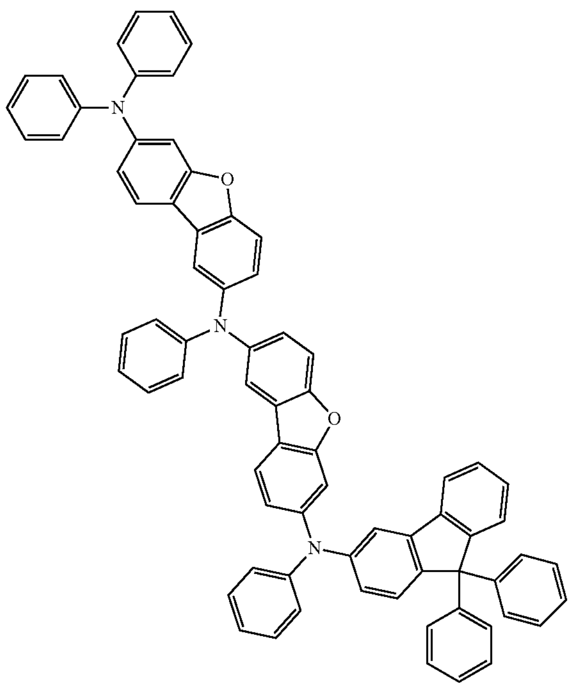
P4-29
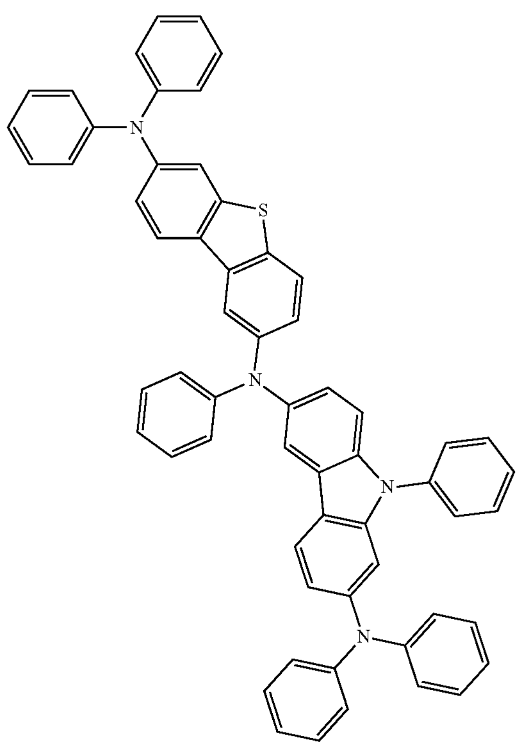

-continued
P4-30
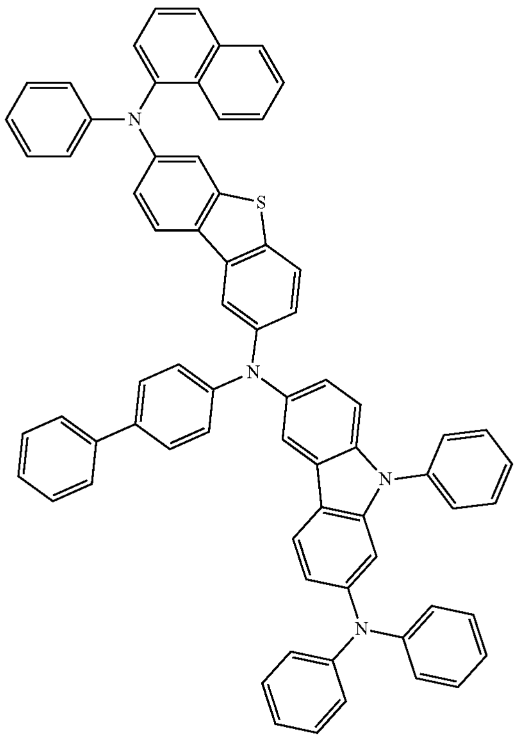
P4-31
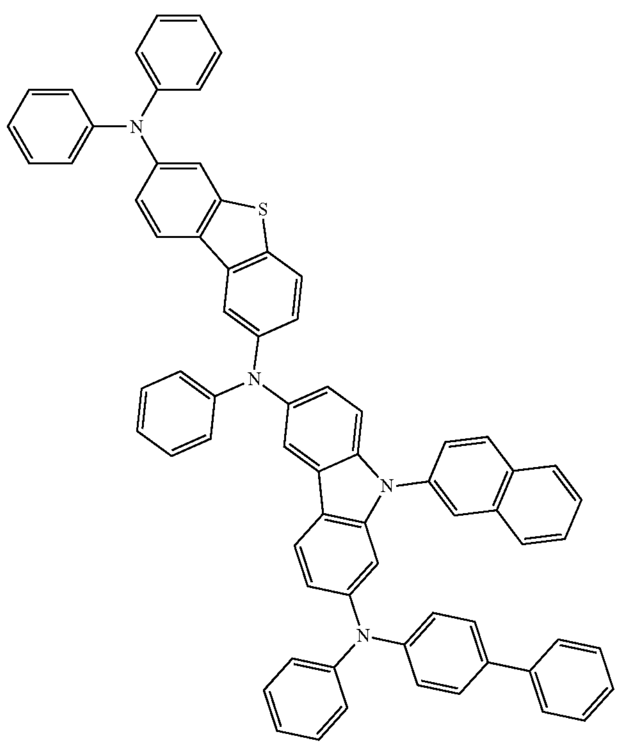

-continued
P4-32
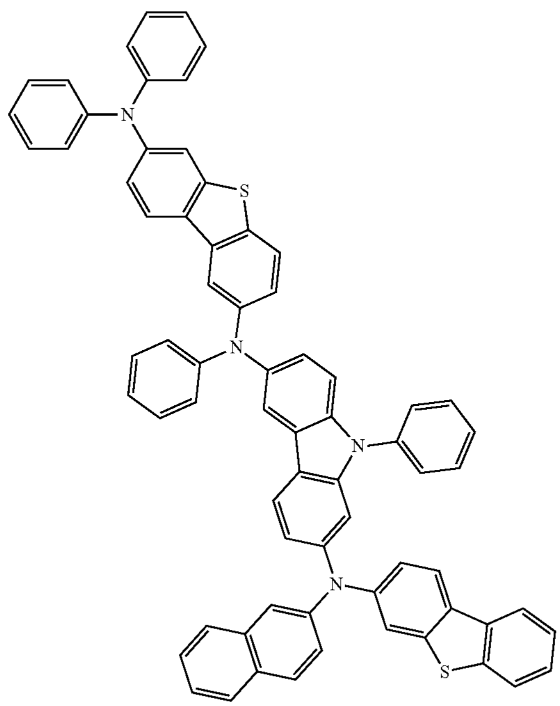
P4-33
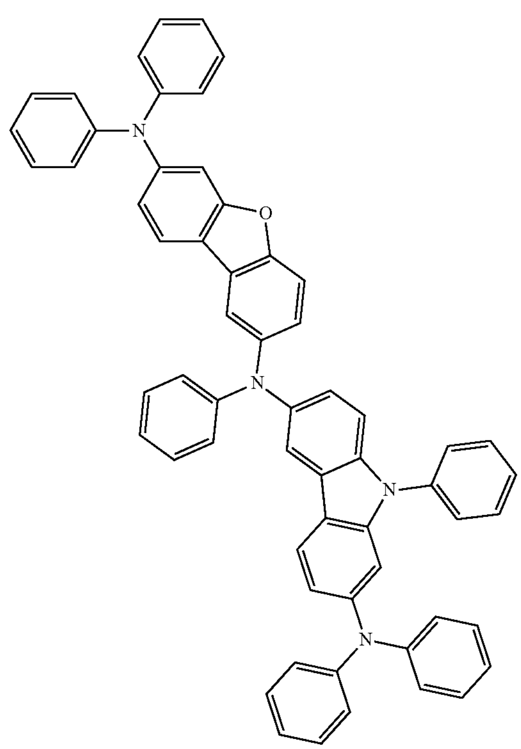

-continued
P4-34
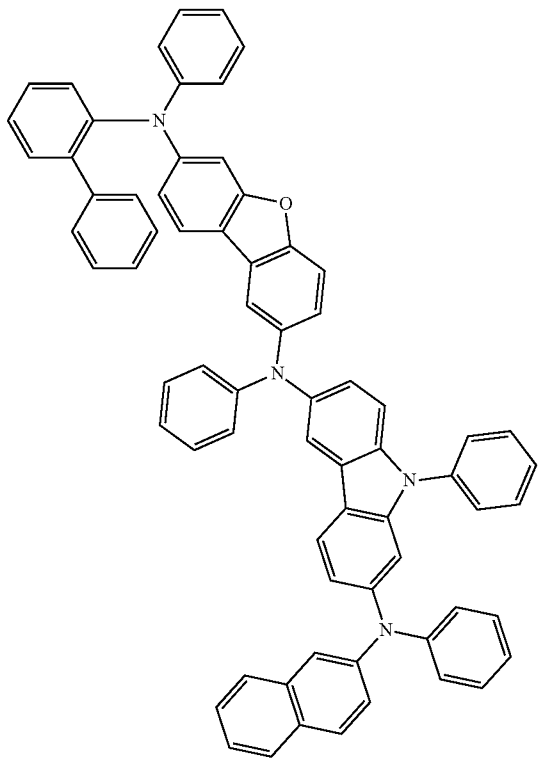
P4-35
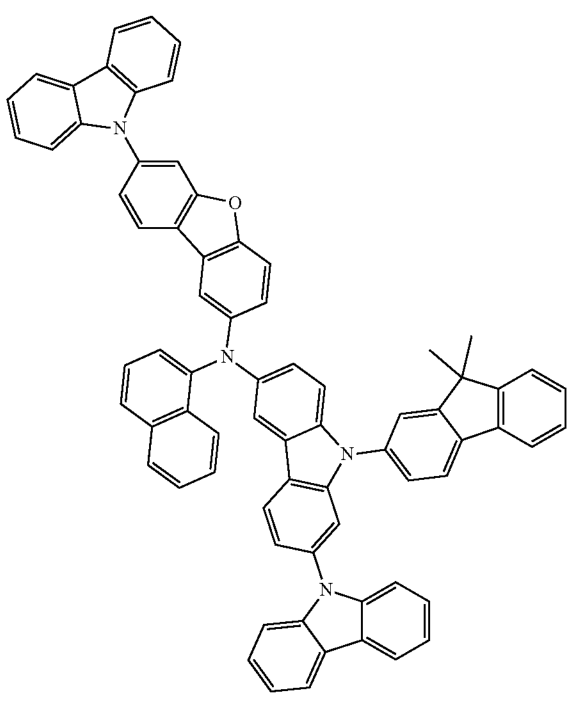

-continued
P4-36
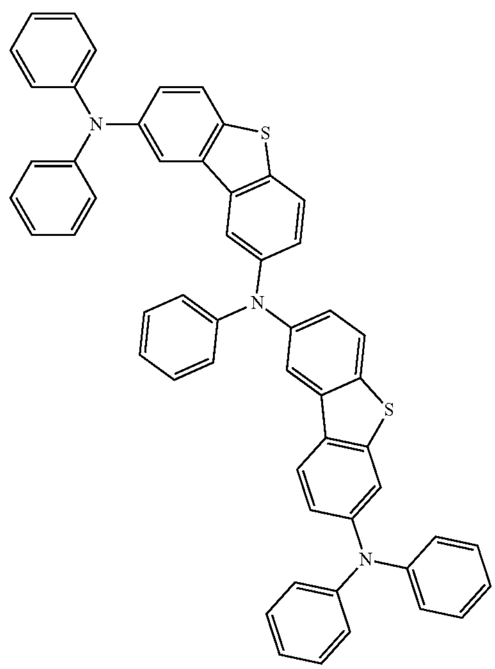
P4-37
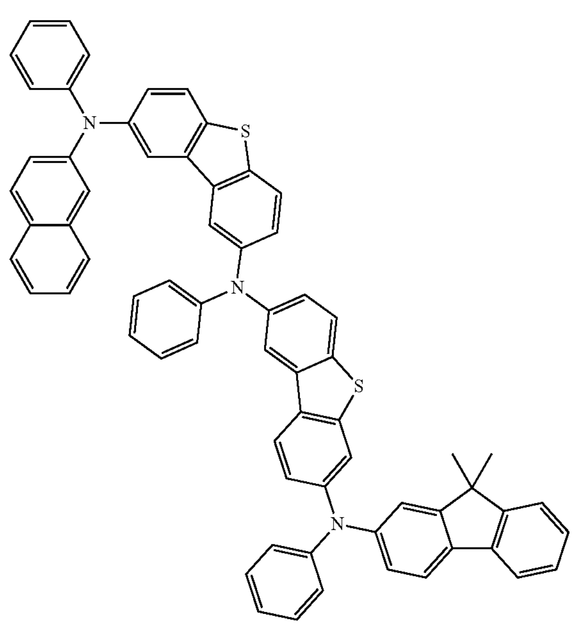

-continued
P4-38
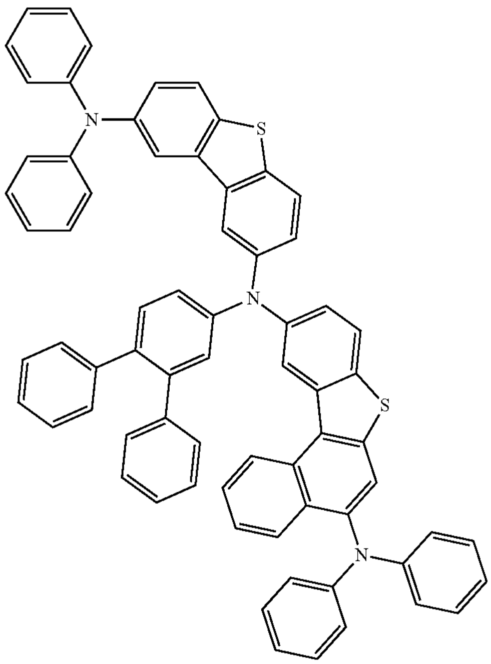
P4-39
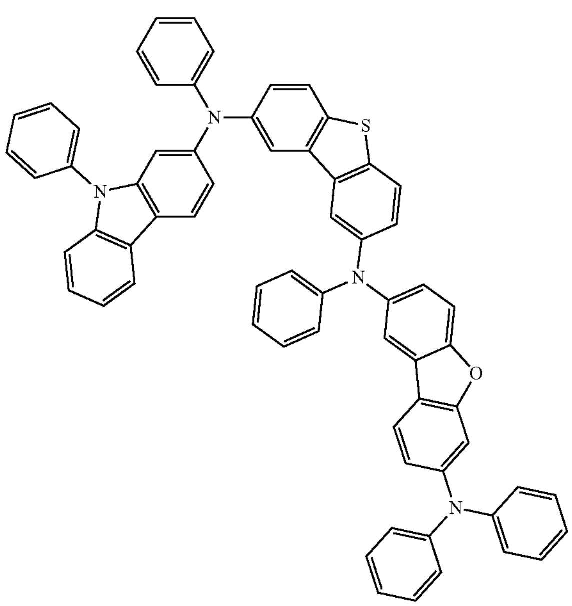

-continued
P4-40
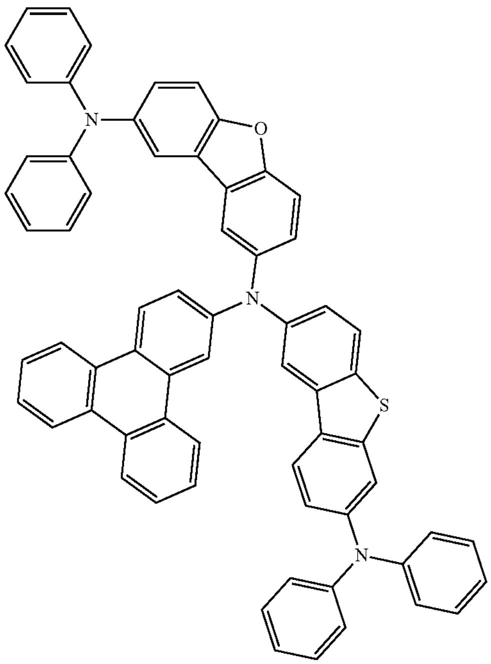
P4-41
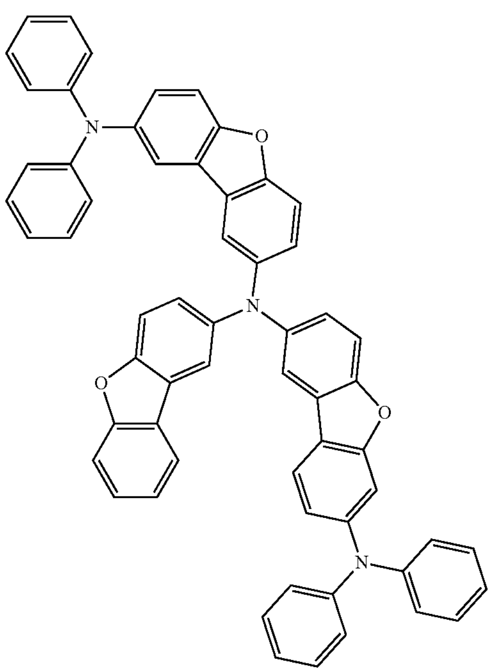

-continued
P4-42
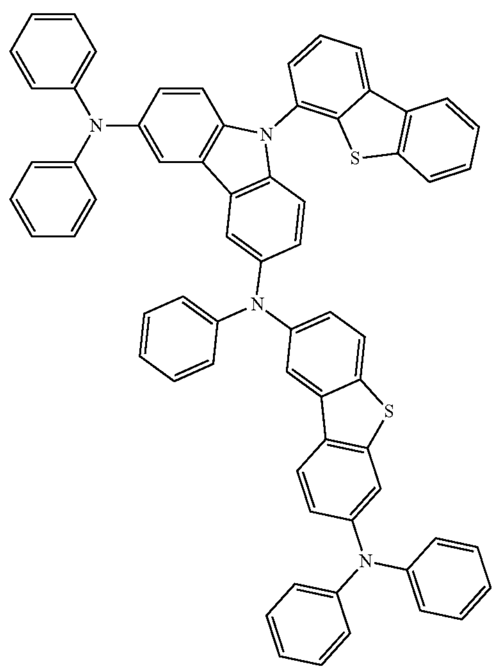
P4-43
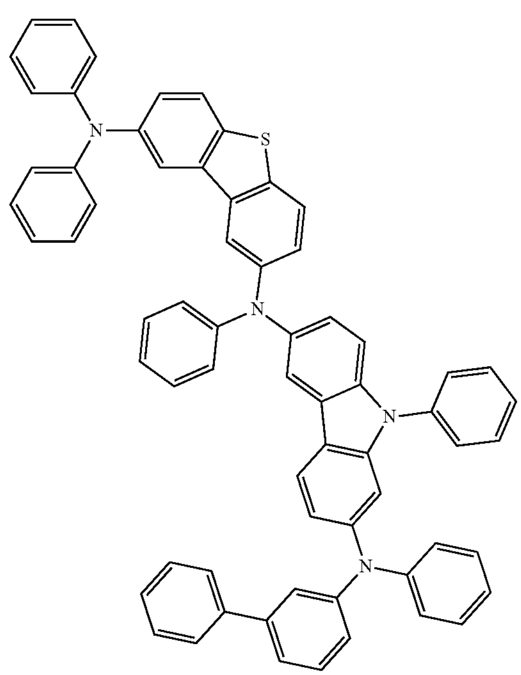

-continued
P4-44
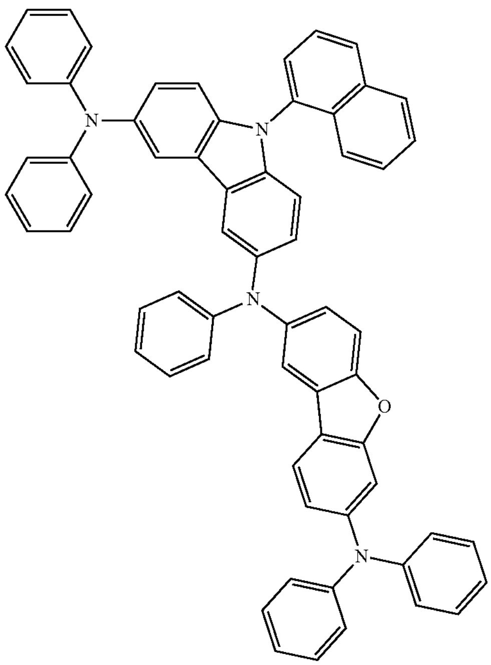
P4-45
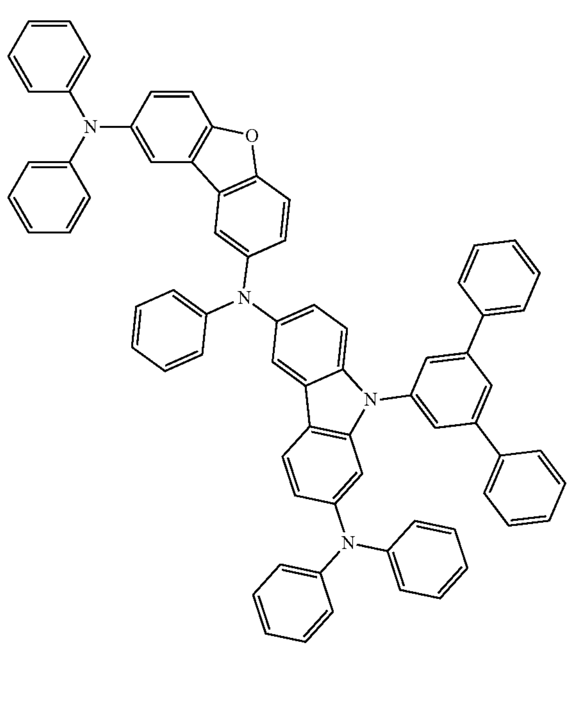

-continued
P4-46
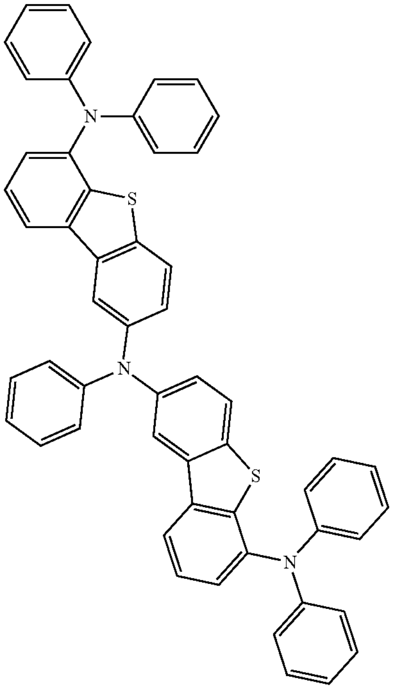
P4-47
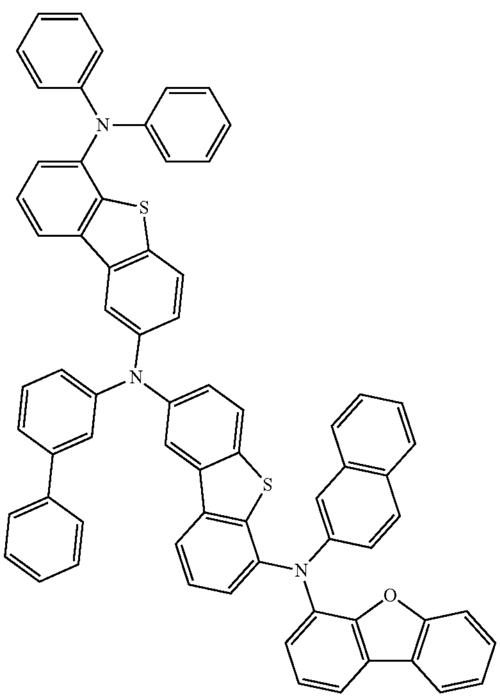

-continued
P4-48
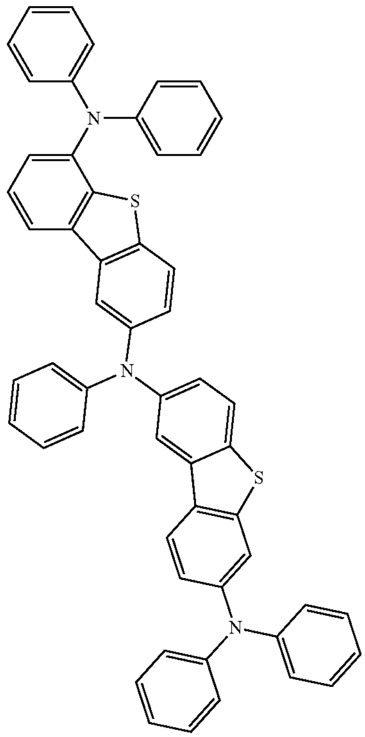
P4-49
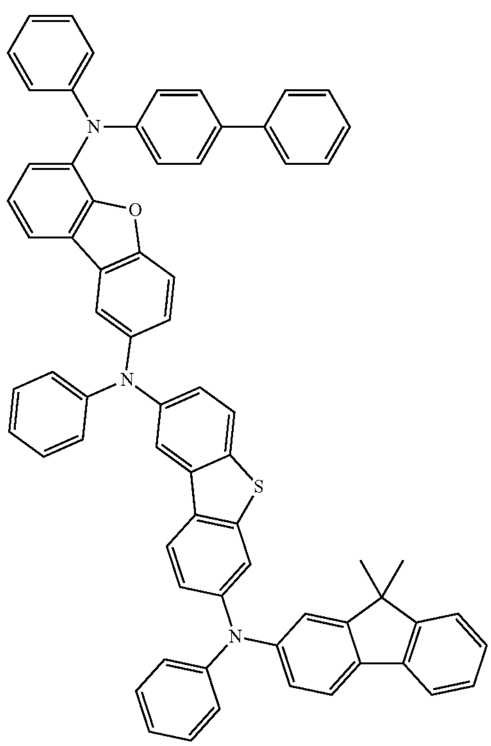

-continued
P4-50
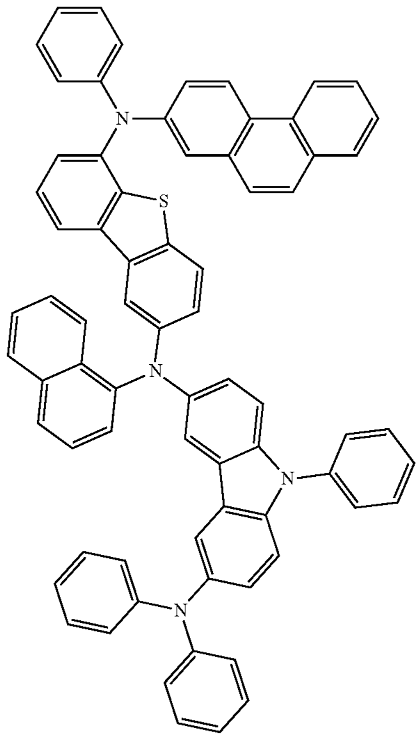
P4-51
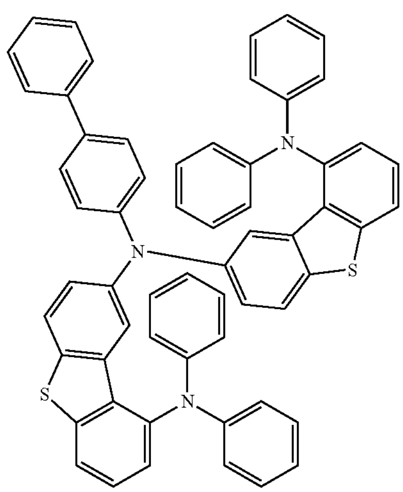

-continued
P4-52
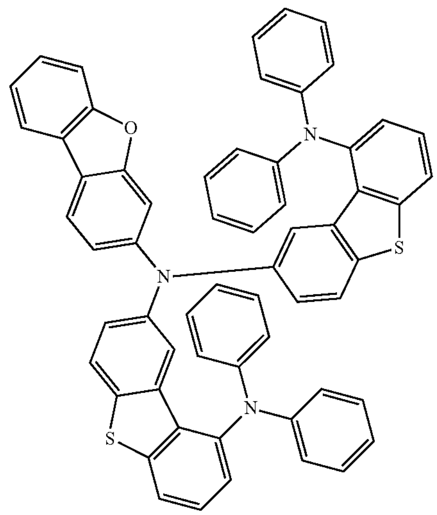
P4-53
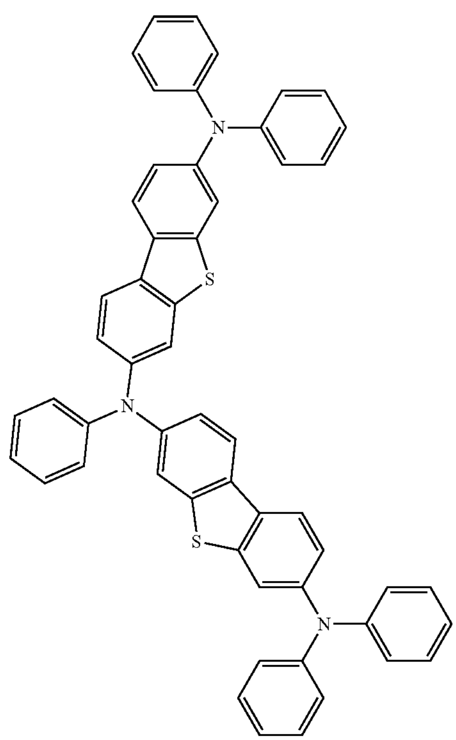

-continued
P4-54
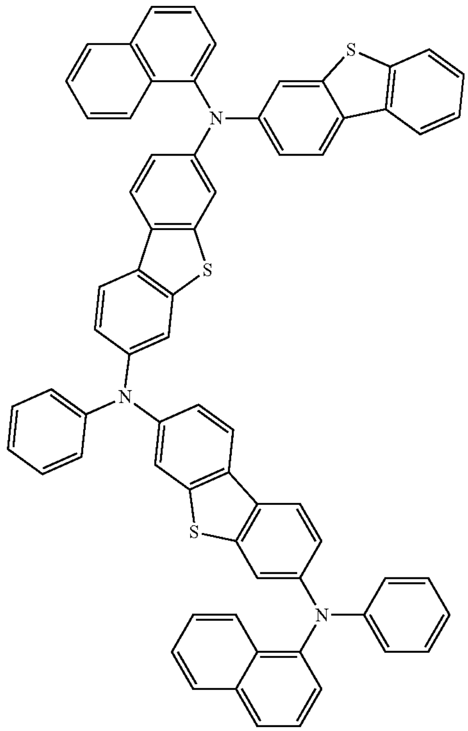
P4-55
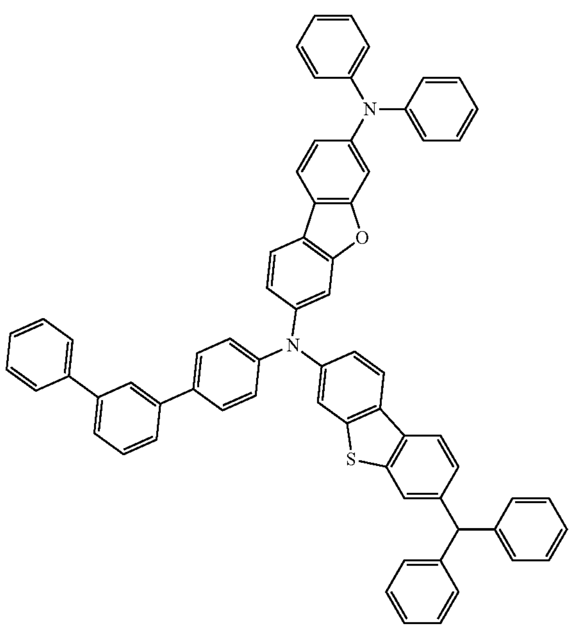

-continued
P4-56
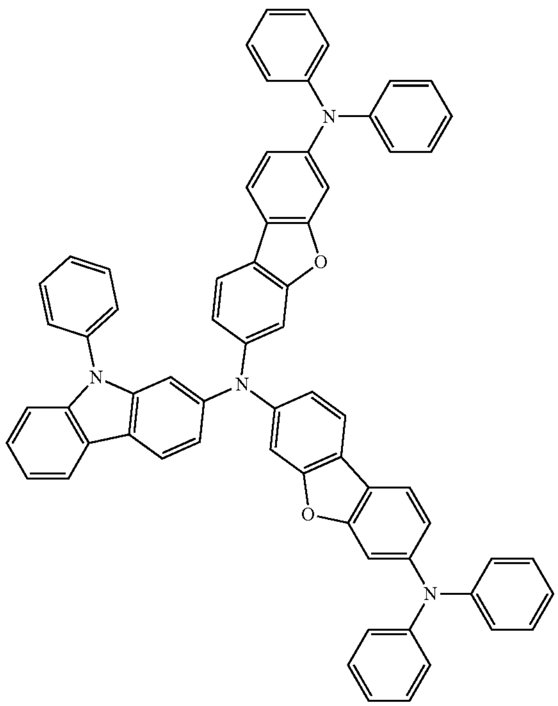
P4-57
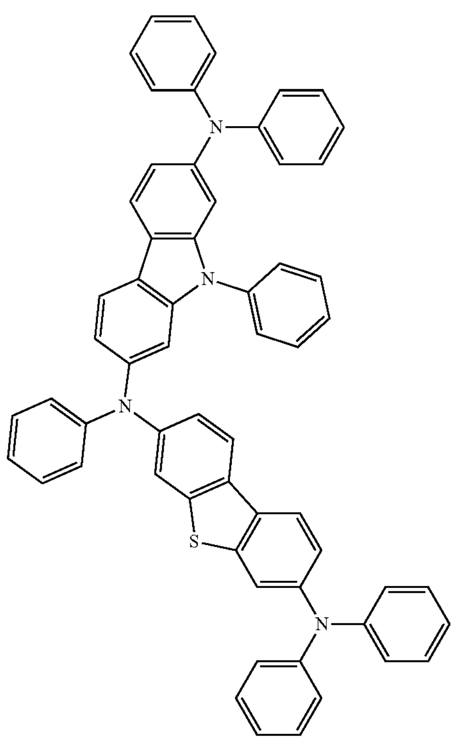

-continued
P4-58
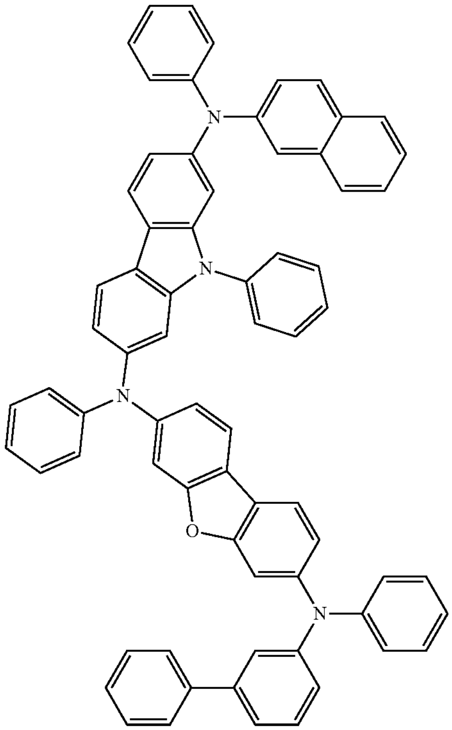
P4-59
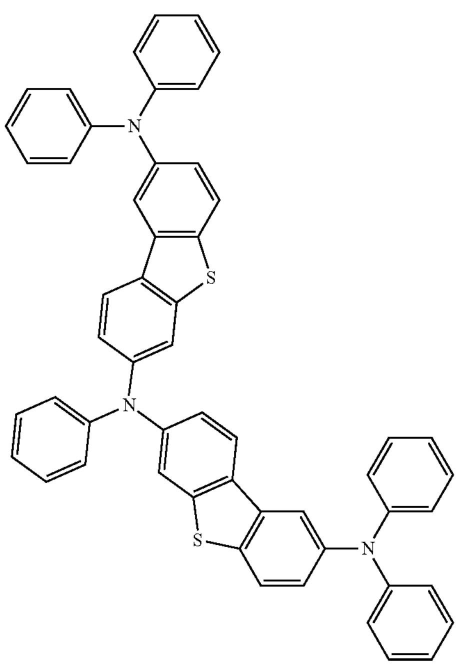

-continued
P4-60
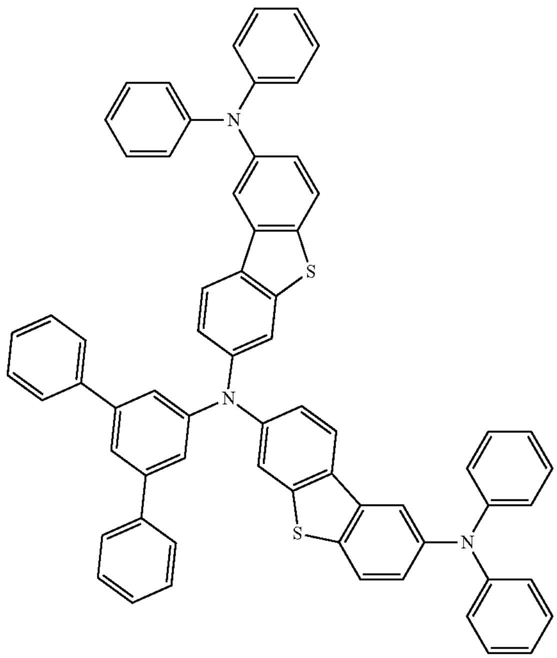
P4-61
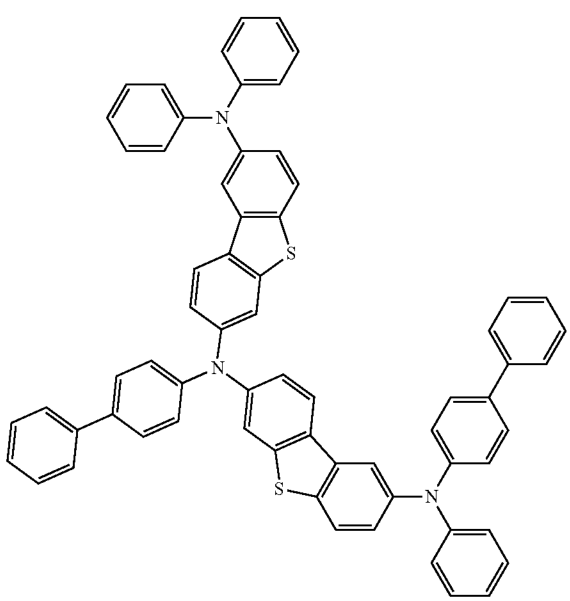

-continued
P4-62
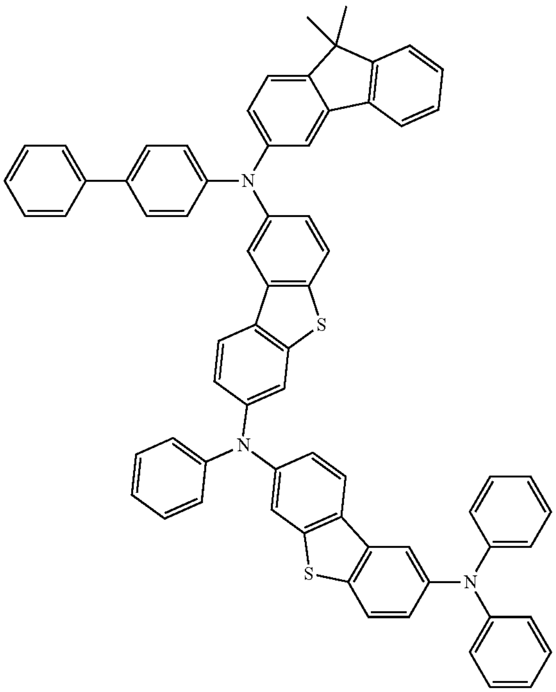
P4-63
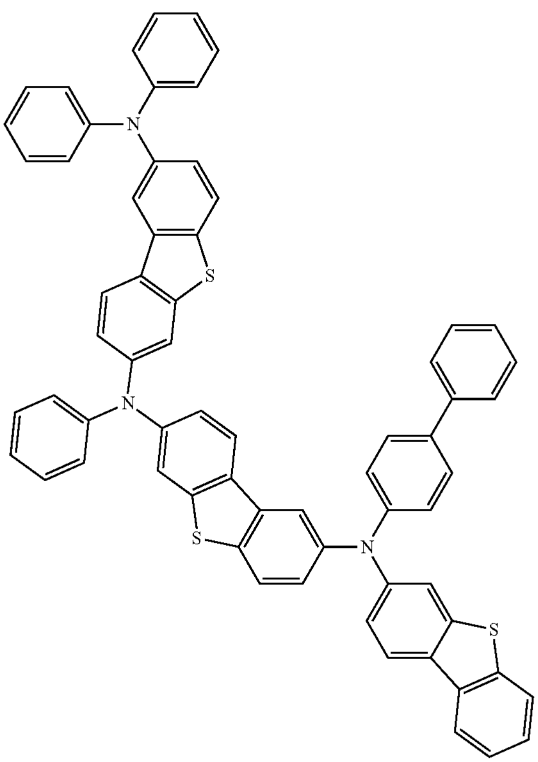

-continued
P4-64
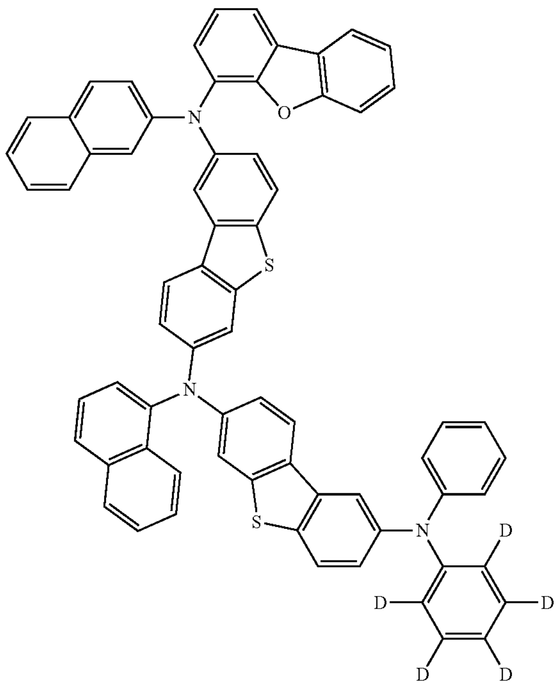
P4-65
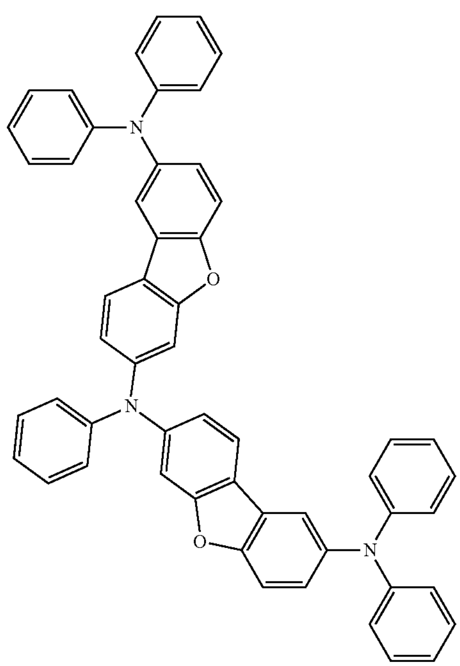

-continued
P4-66
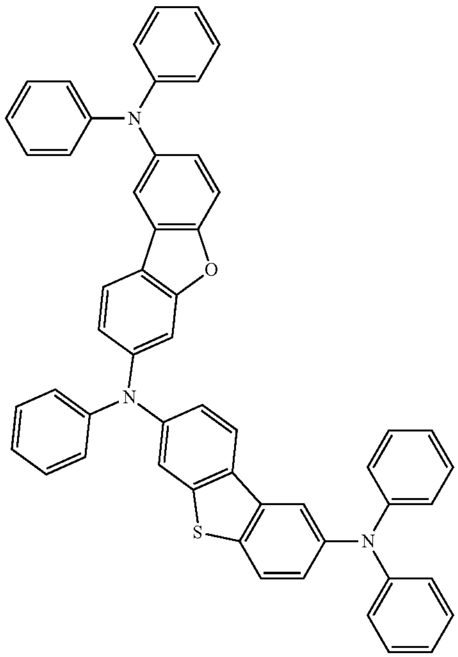
P4-67
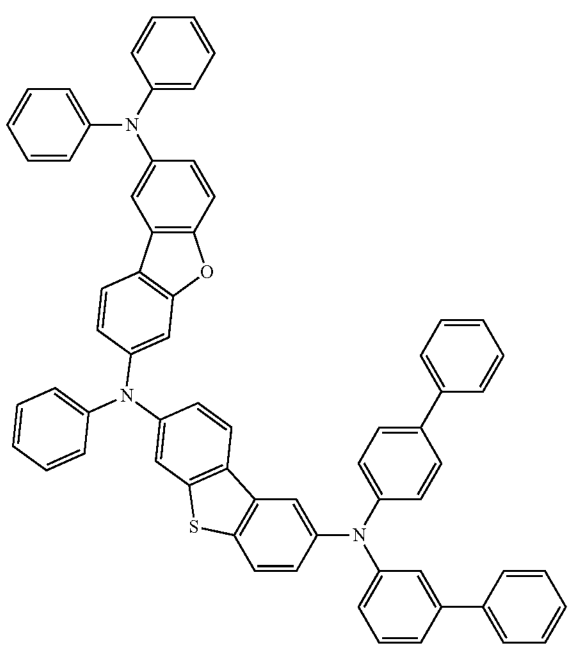

-continued
P4-68
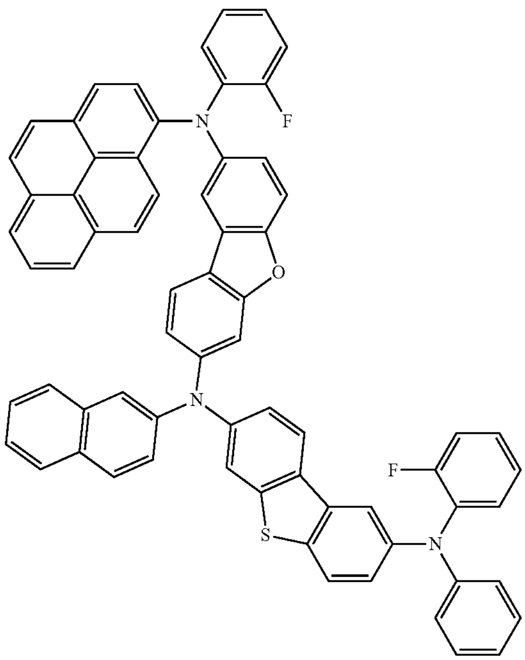
P4-69
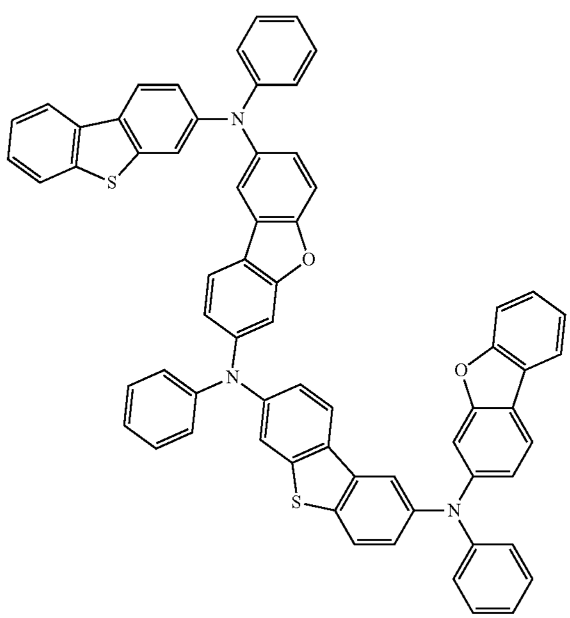

-continued
P4-70
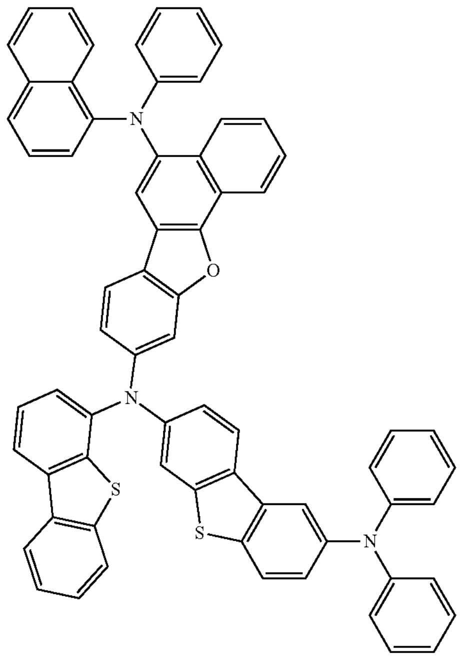
P4-71
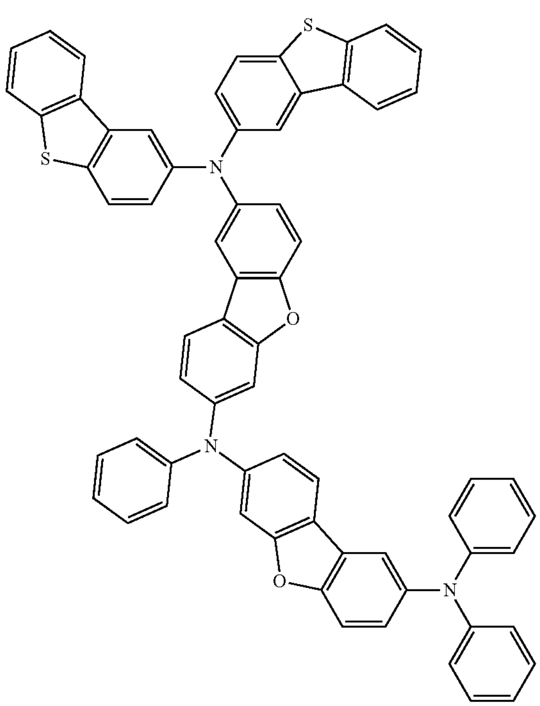

-continued
P4-72
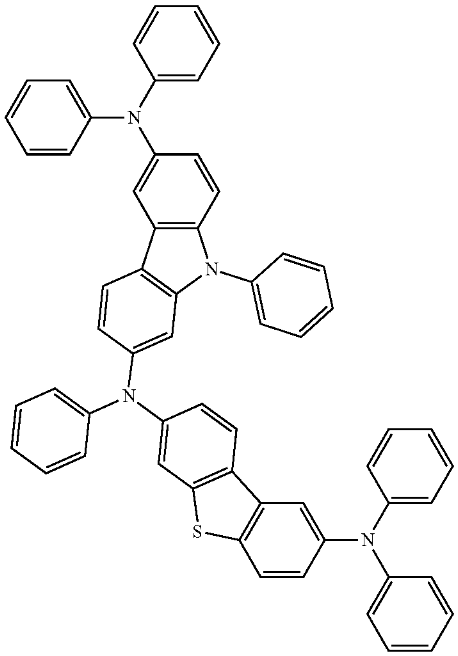
P4-73
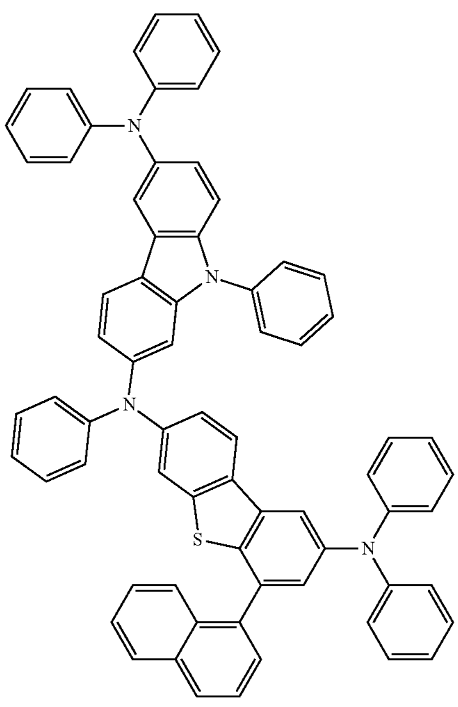

-continued
P4-74
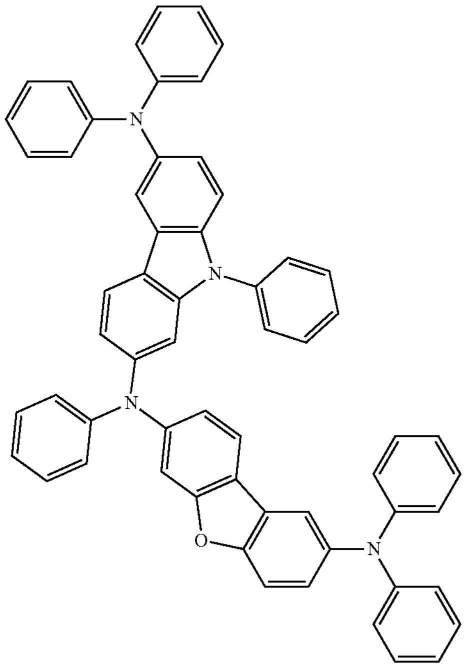
P4-75
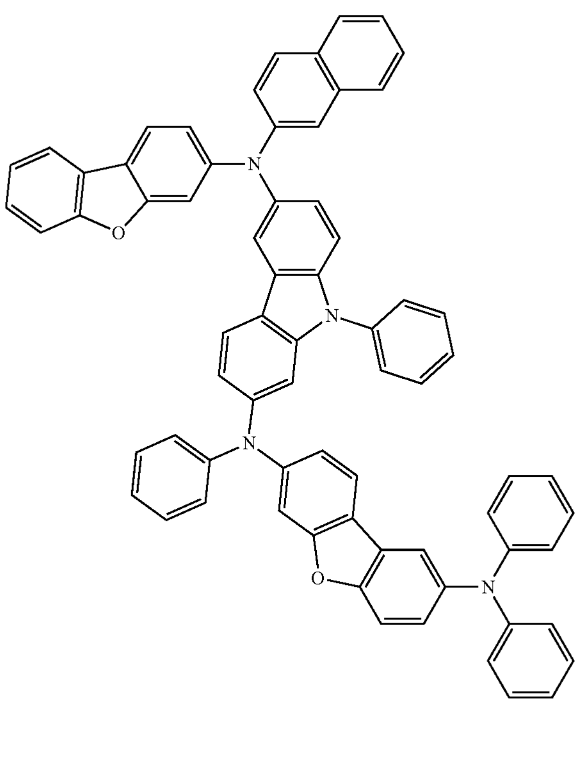

-continued
P4-76
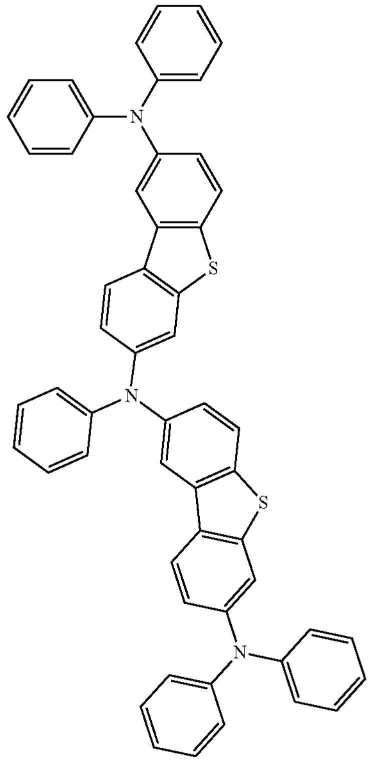
P4-77
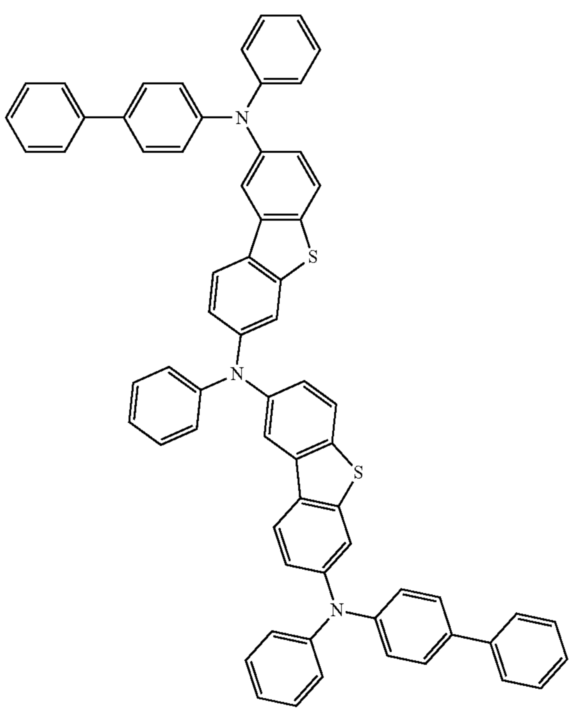

-continued
P4-78
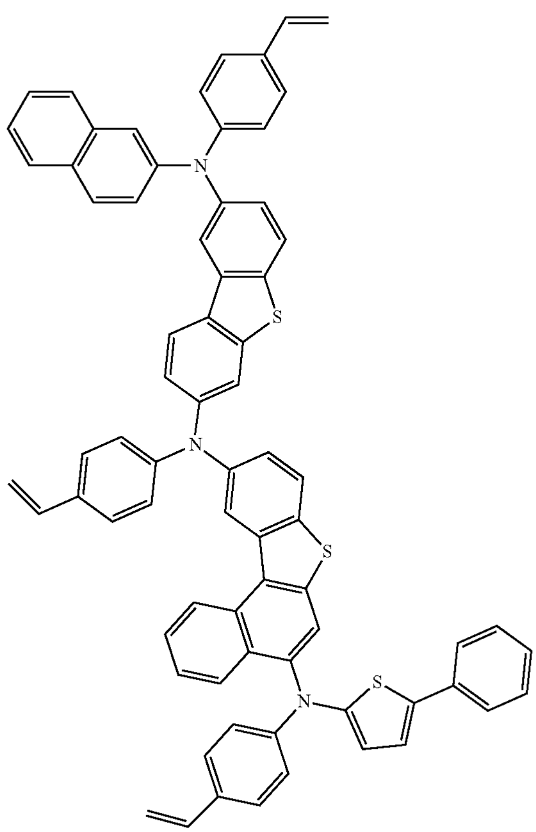
P4-79
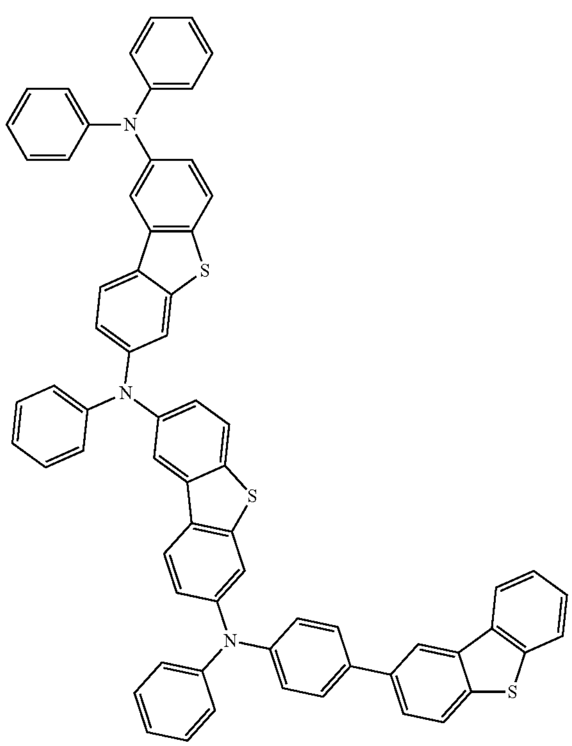

-continued
P4-80
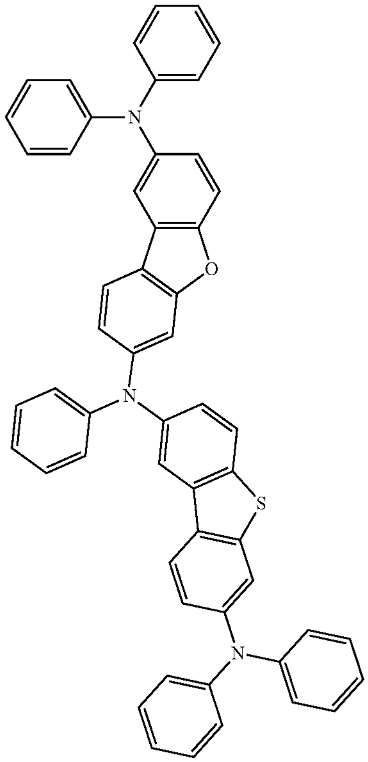
P4-81
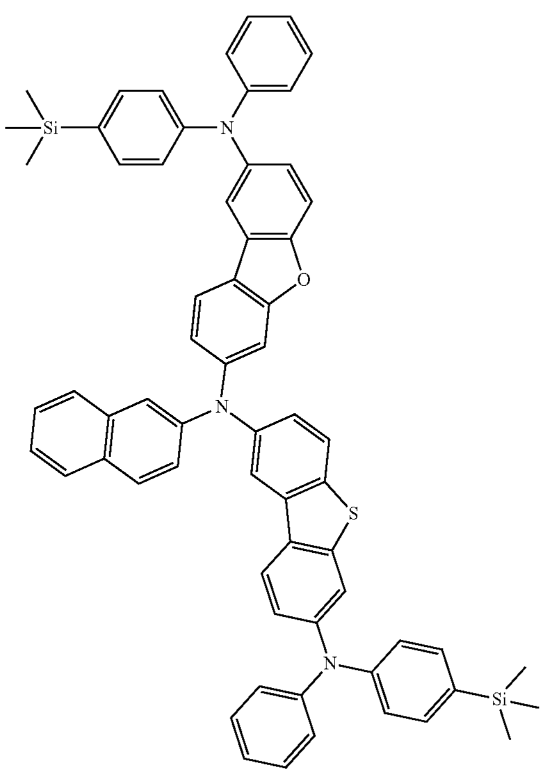

-continued
P4-82
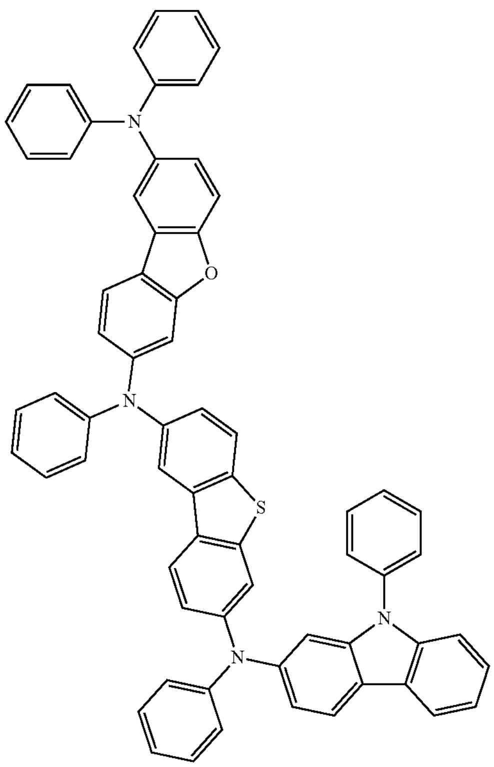
P4-83
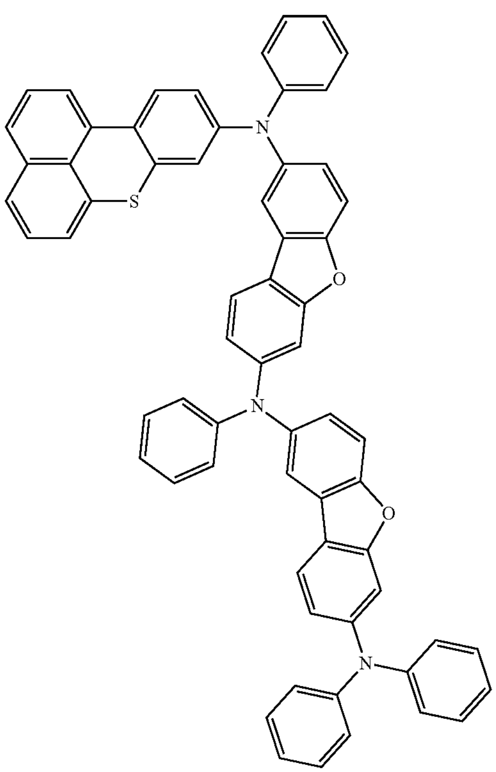

-continued
P4-84
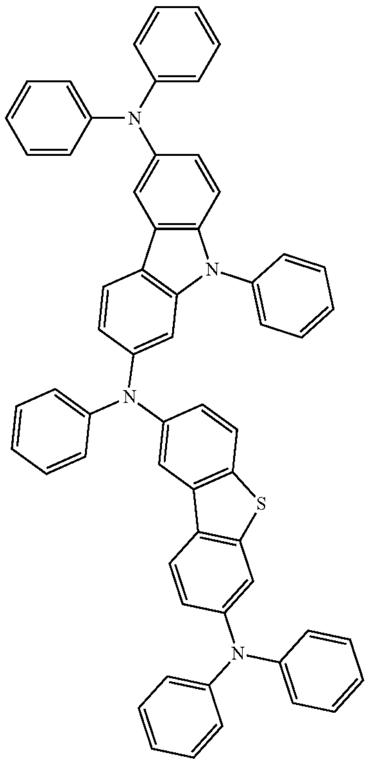
P4-85
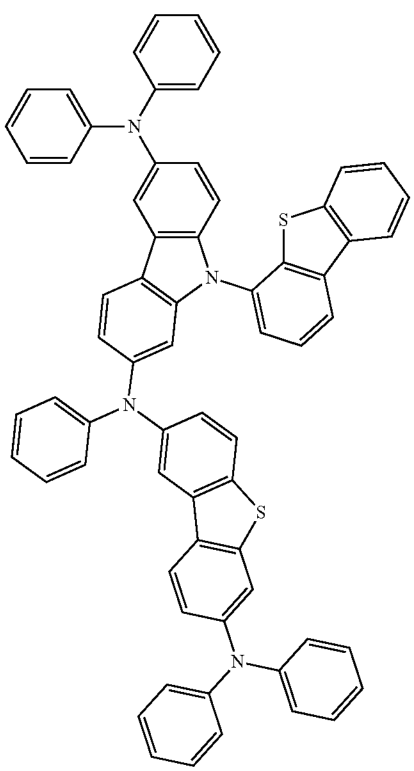

-continued
P4-86
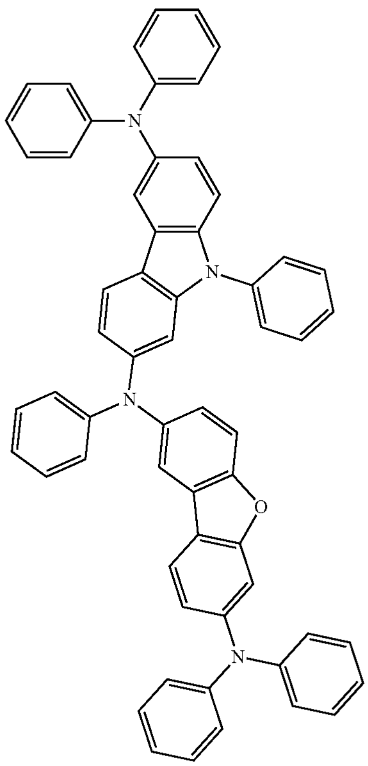
P4-87
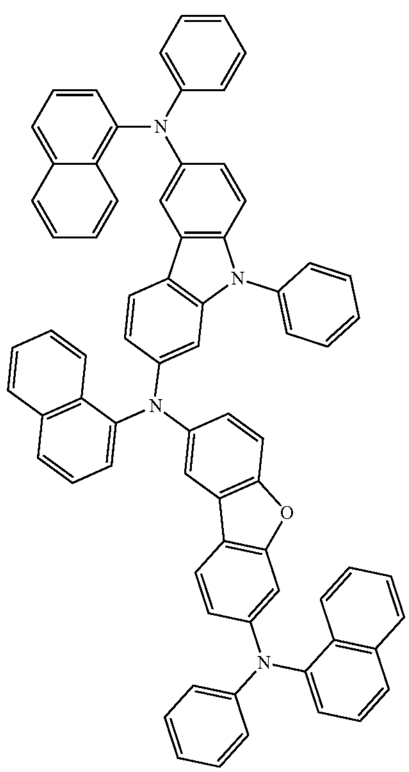

-continued
P4-88
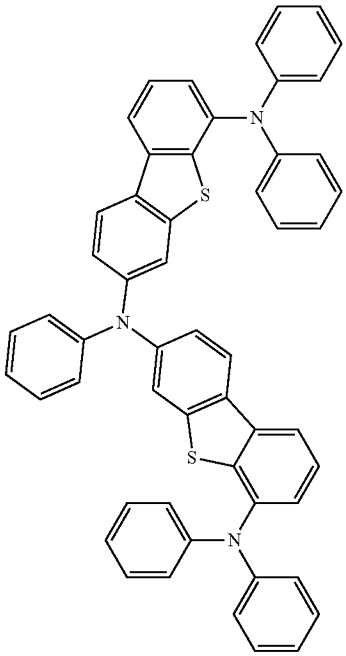
P4-89
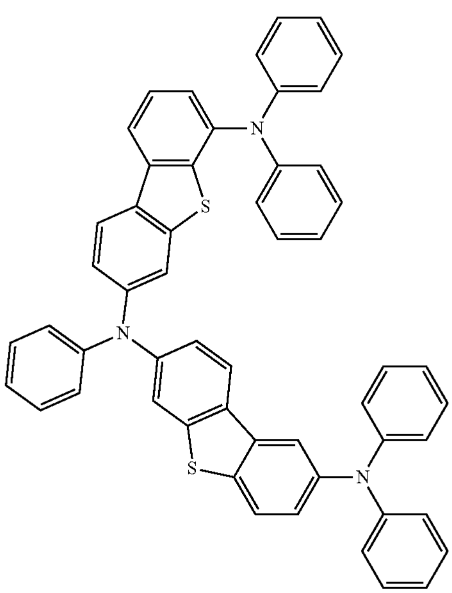

-continued
P4-90
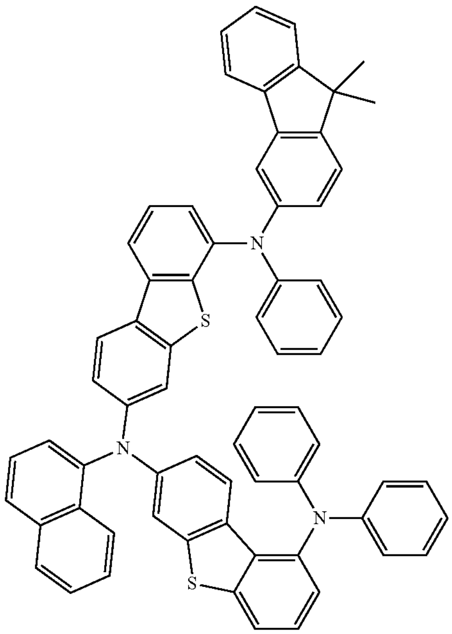
P4-91
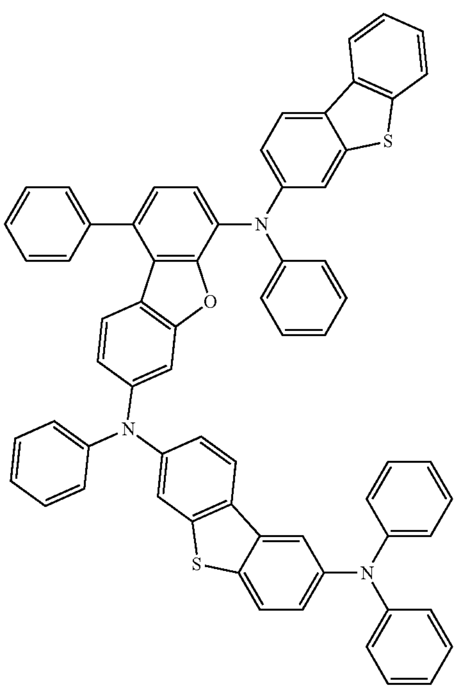

-continued
P4-92
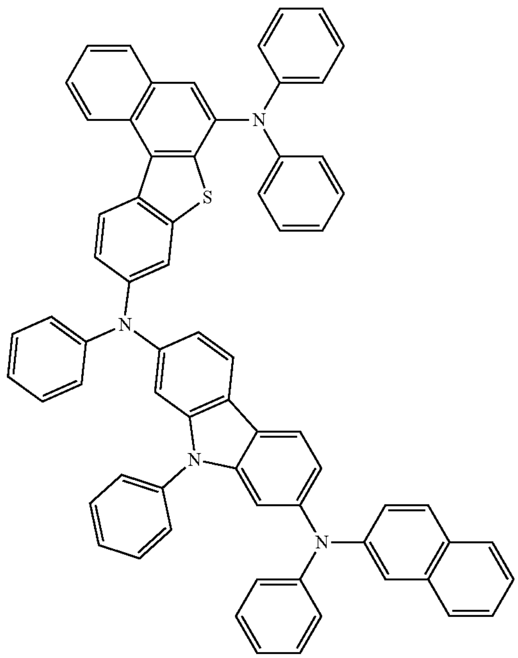
P4-93
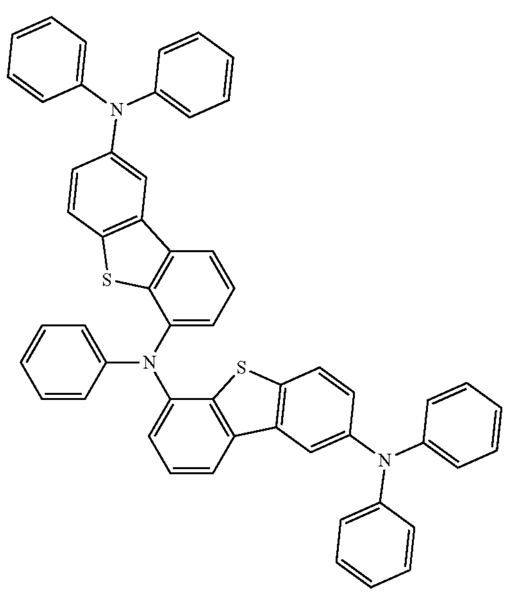

-continued
P4-94
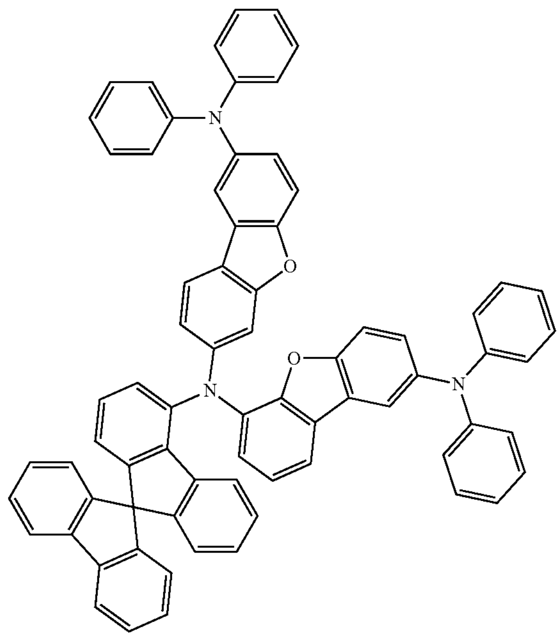
P4-95
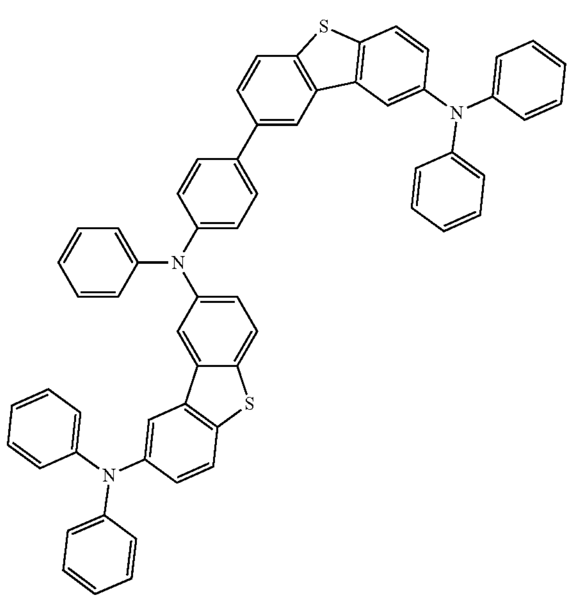

-continued
P4-96
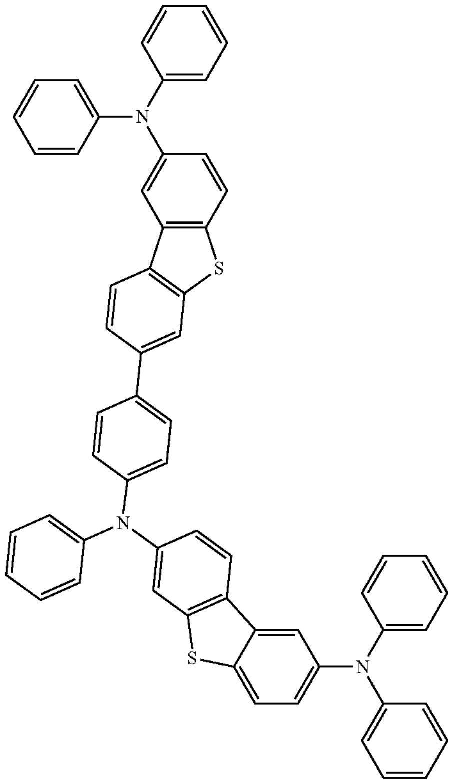
P4-97
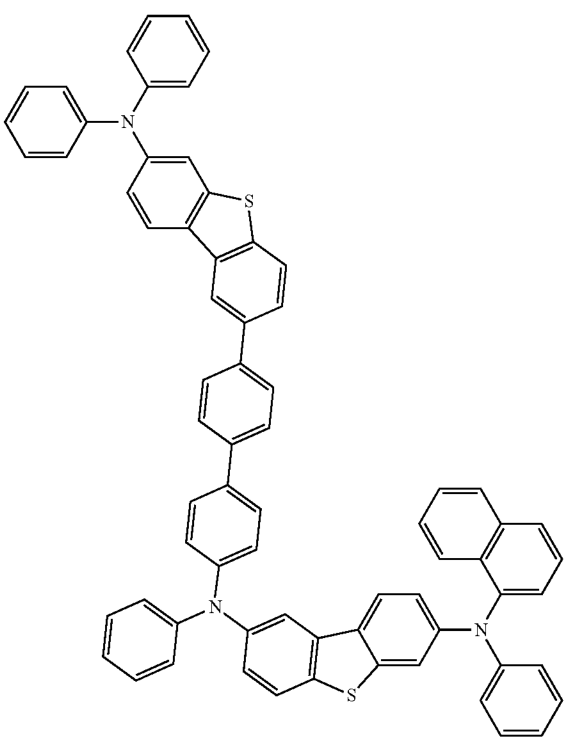

-continued
P4-98
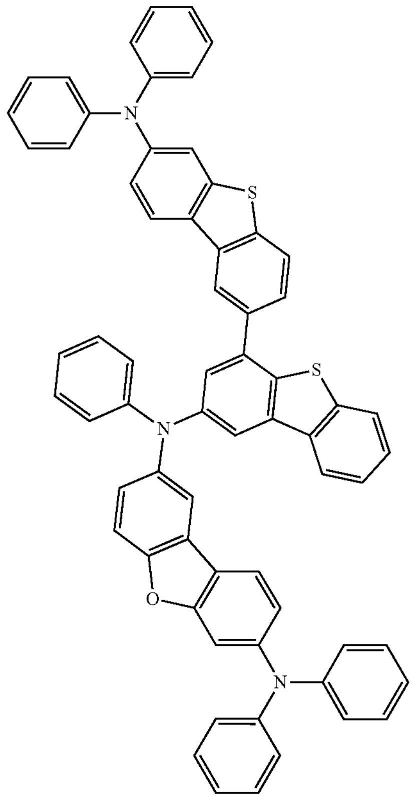
P4-99
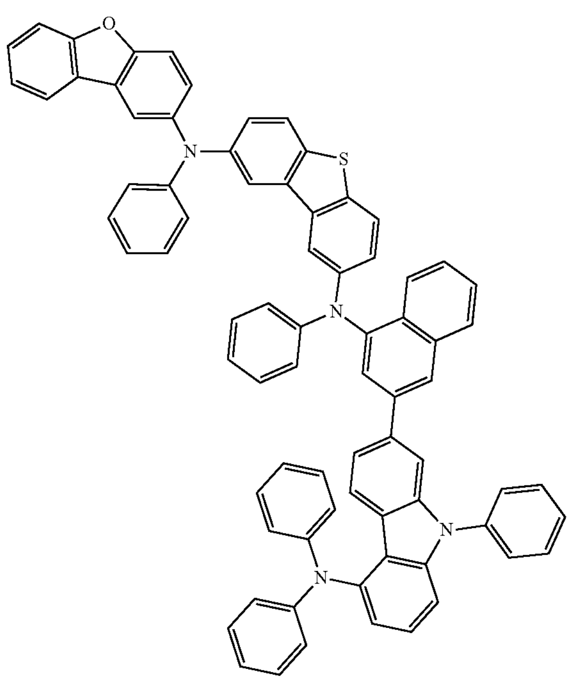

-continued
P4-100
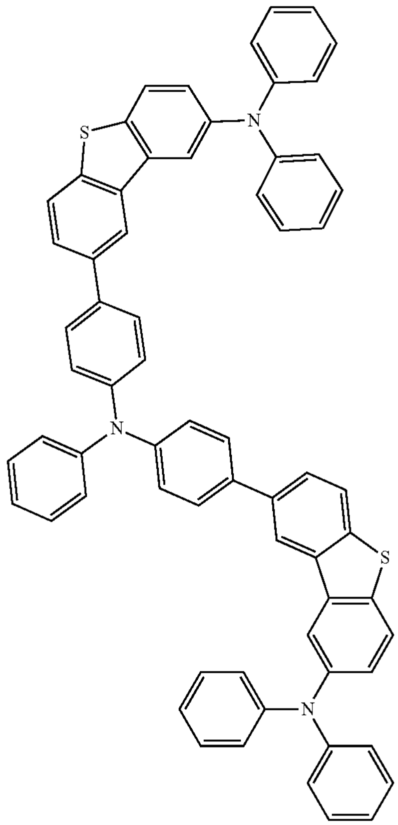
P4-101
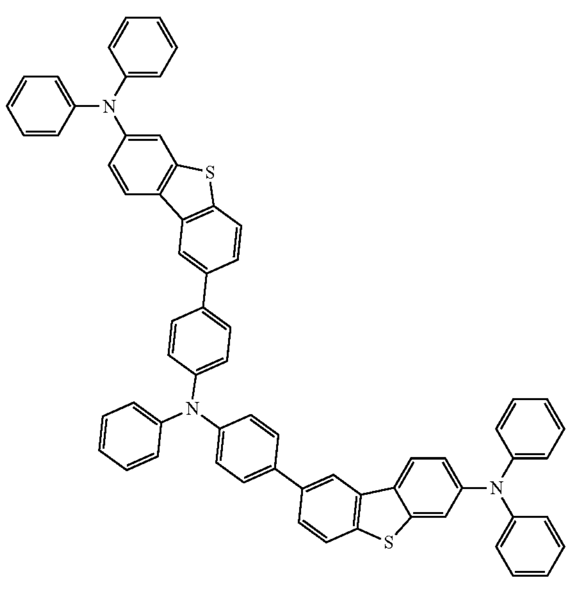

-continued
P4-102
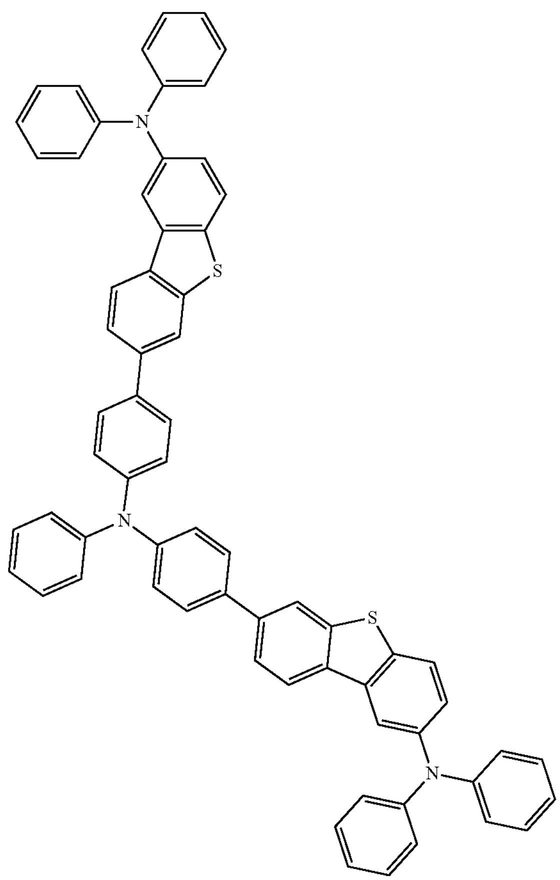
P4-103
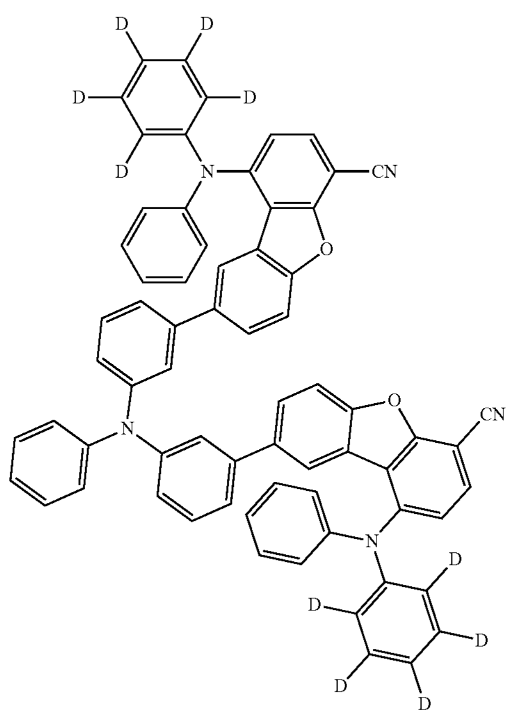

-continued
P4-104
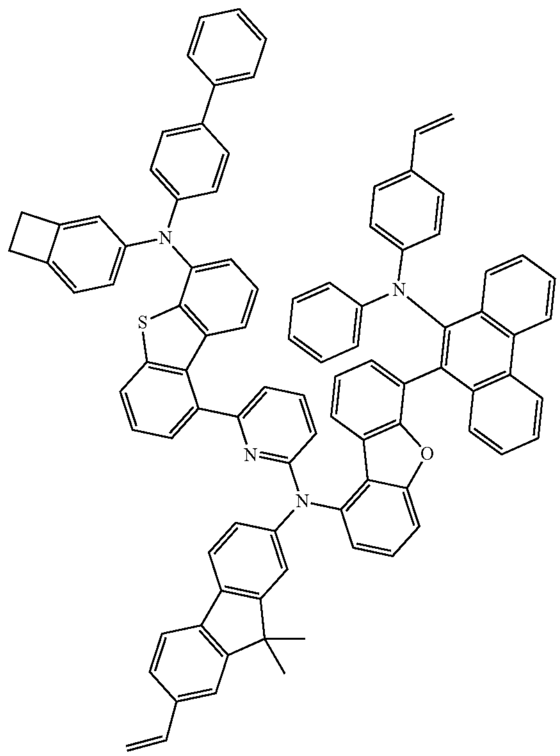
P4-105
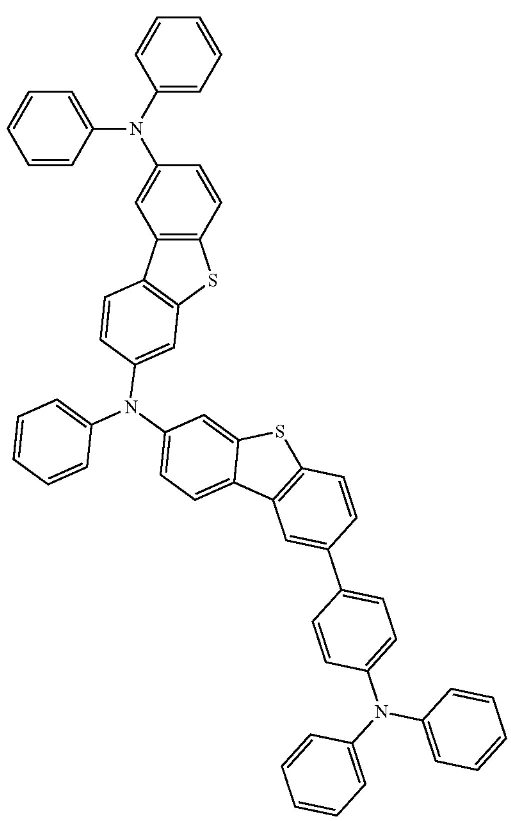

-continued
P4-106
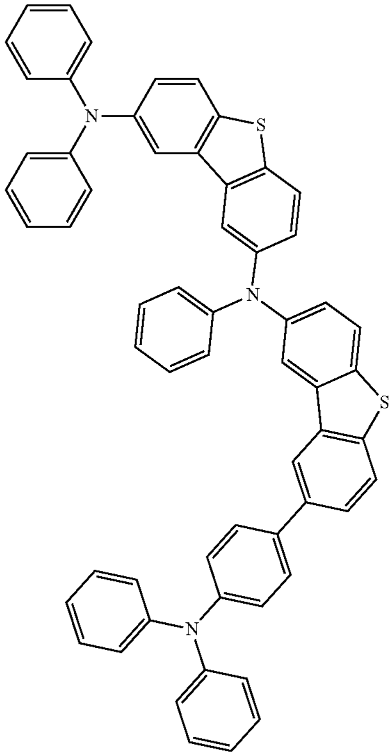
P4-107
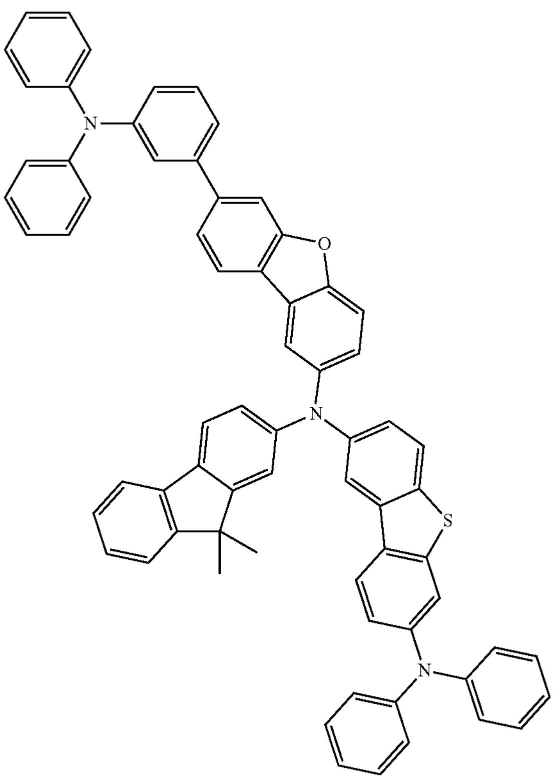

-continued
P4-108
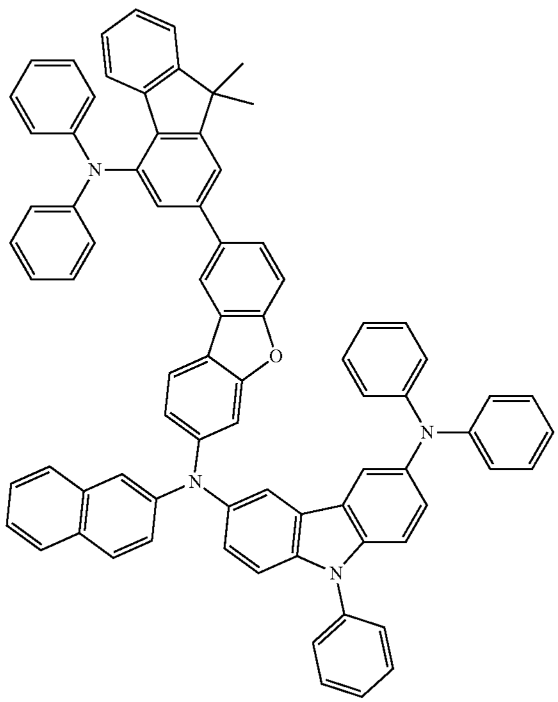
P4-109
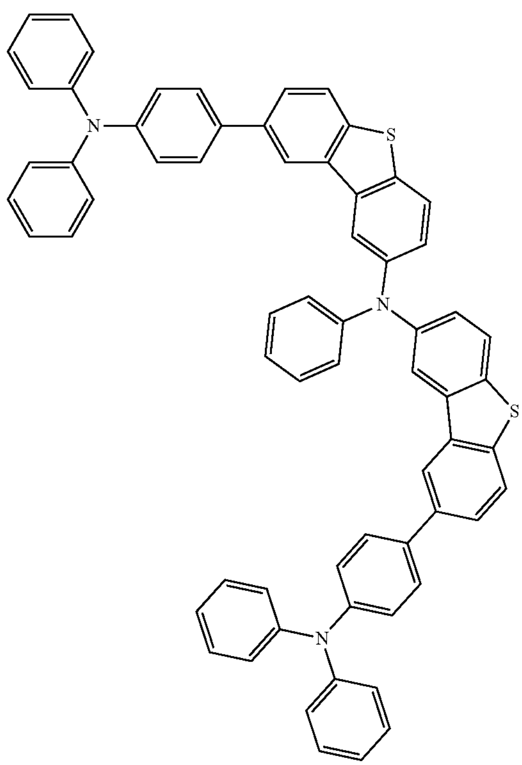

-continued
P4-110
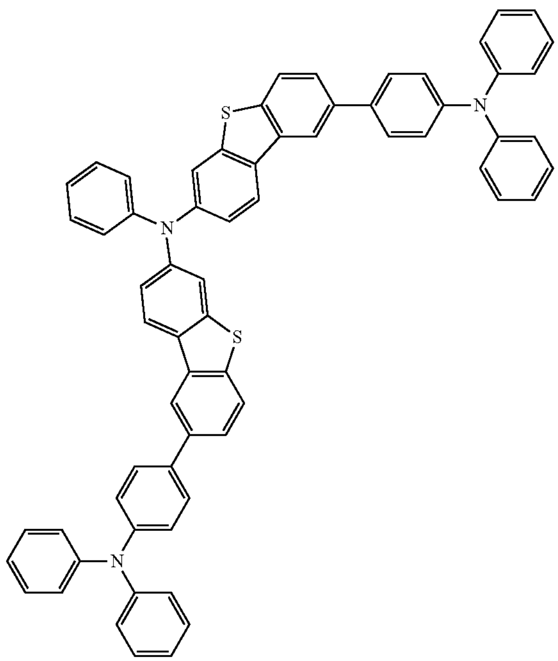
P4-111
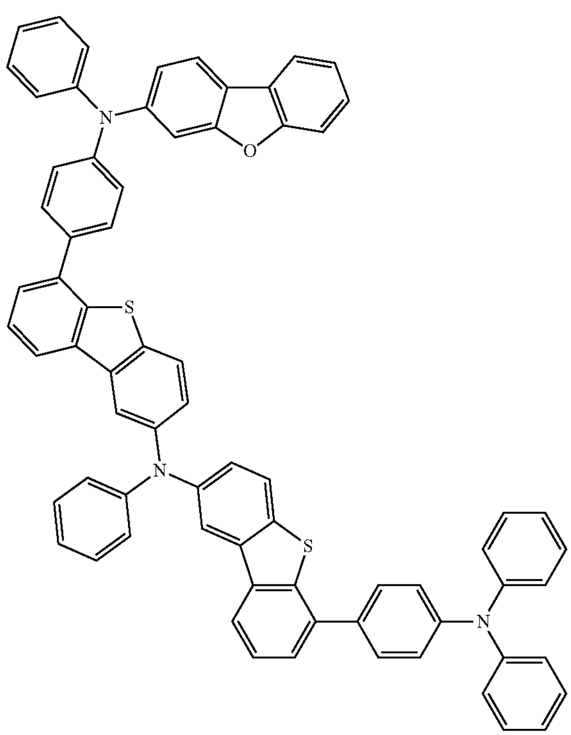

-continued
P4-112
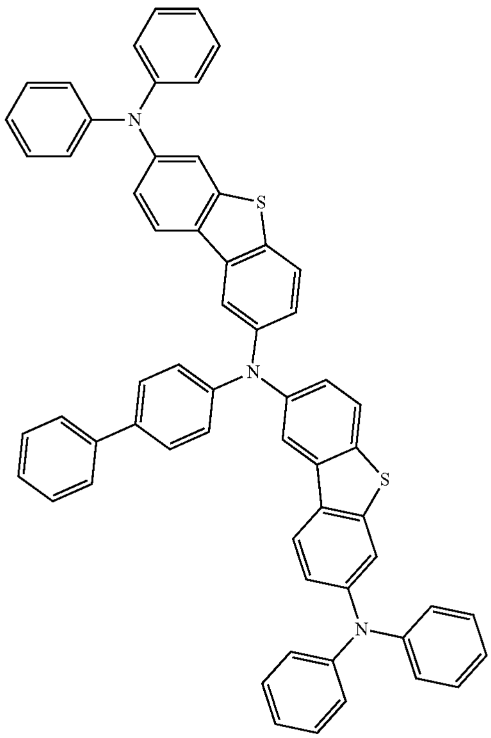
P4-113
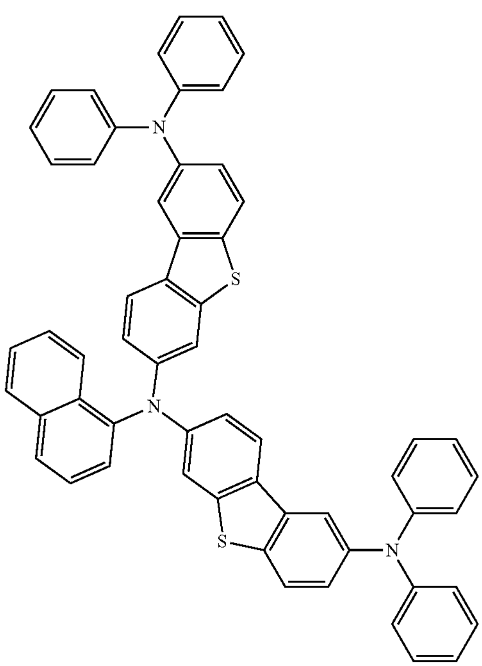

-continued
P4-114
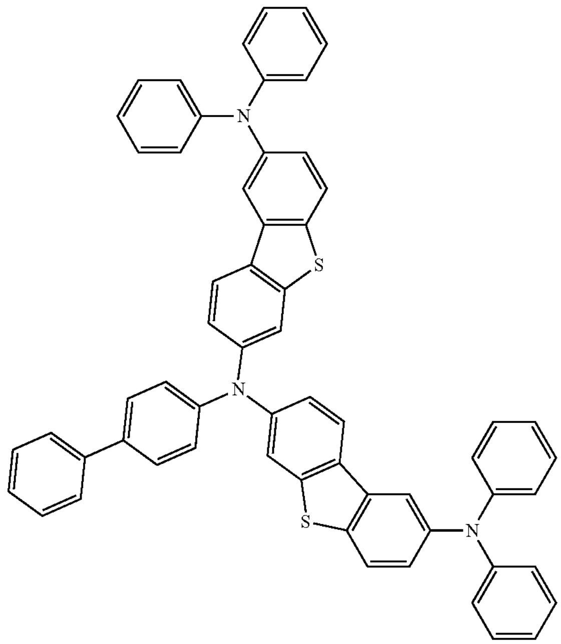
P4-115
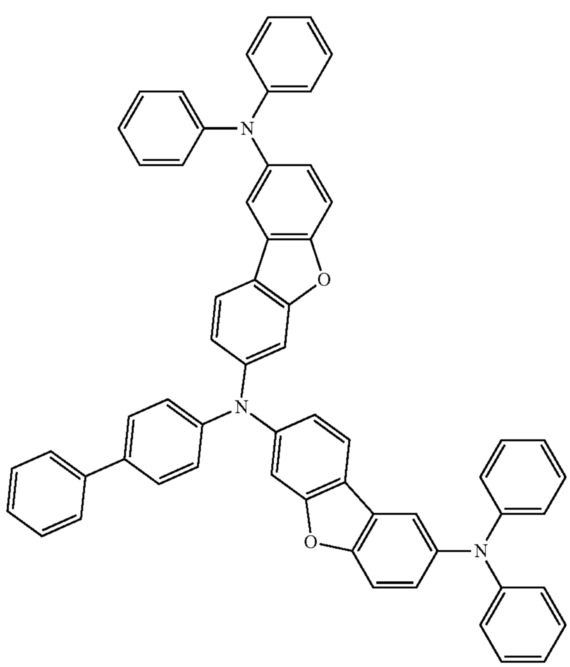

-continued
P4-116
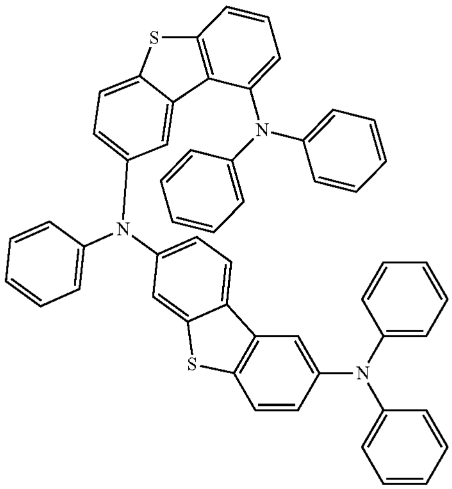
P4-117
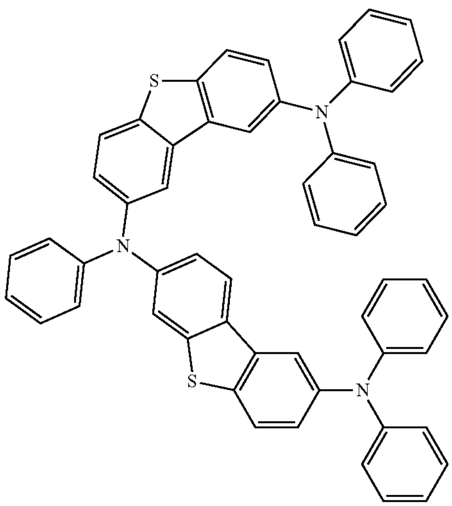
P4-118
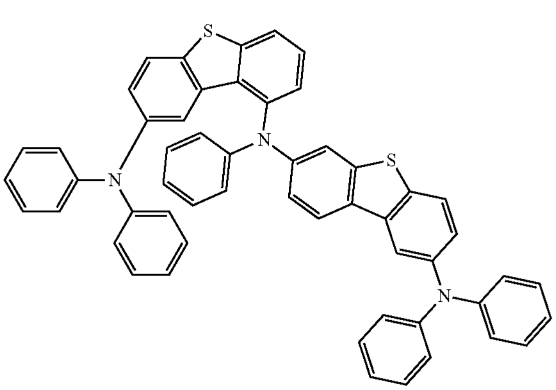

-continued
P4-119
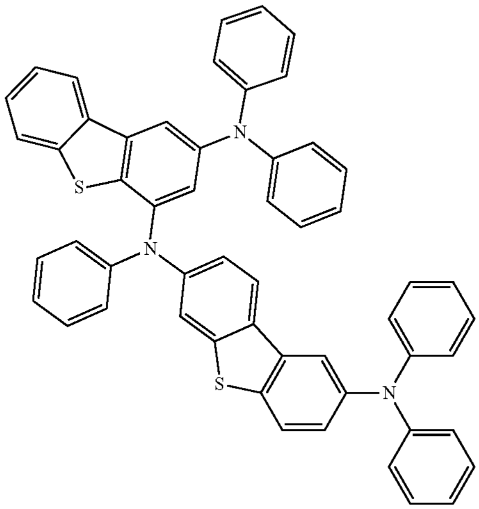
P4-120
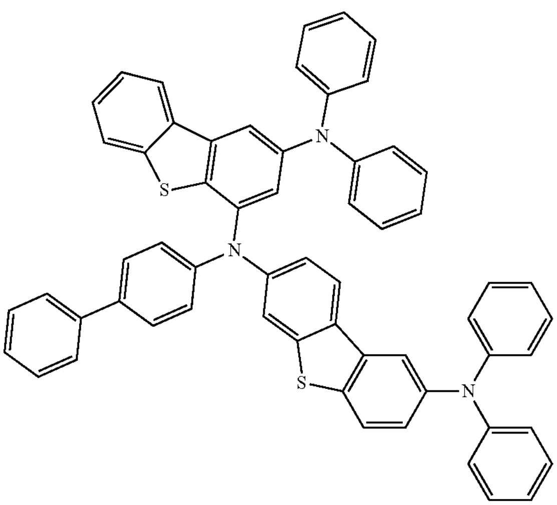
P4-121
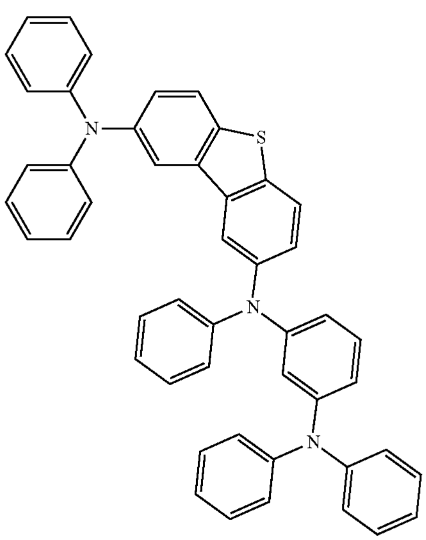

-continued
P4-122
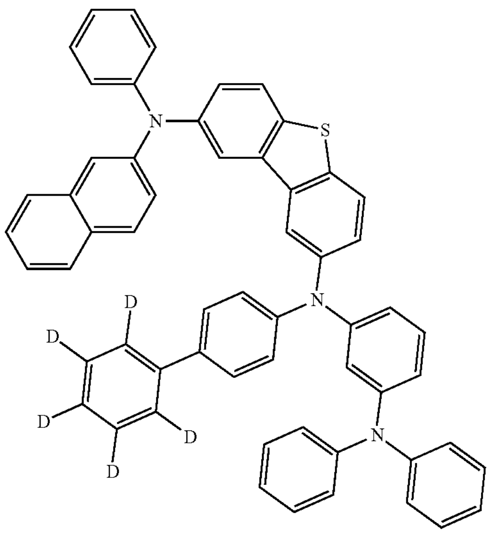
P4-123
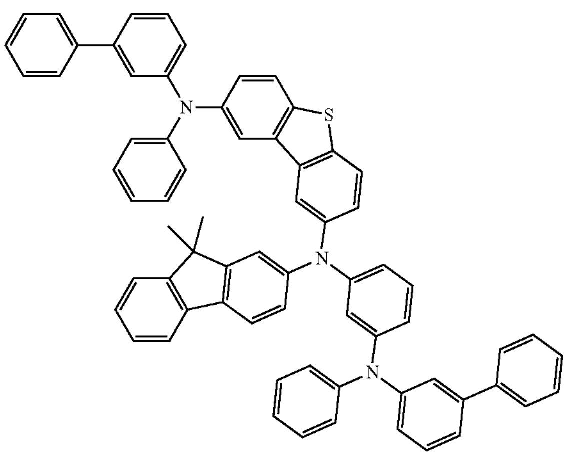
P4-124
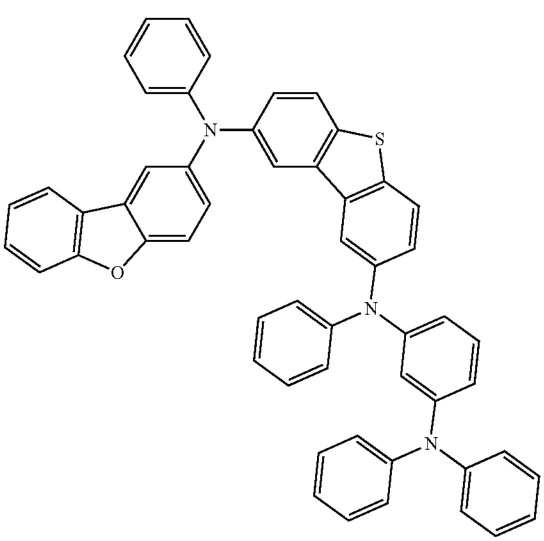

-continued
P4-125
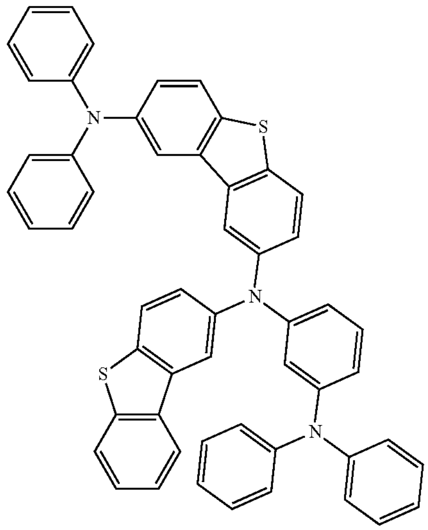
P4-126
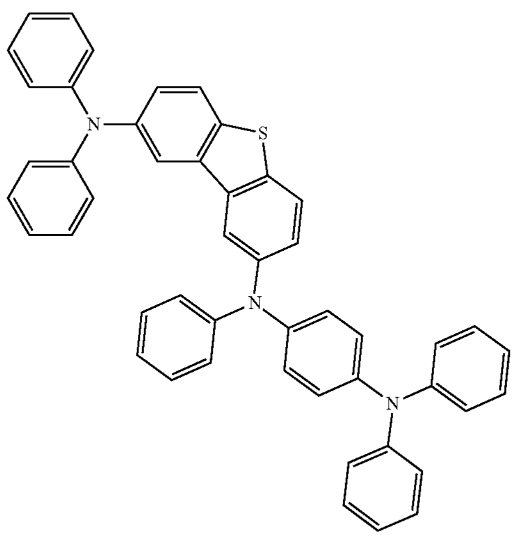
P4-127
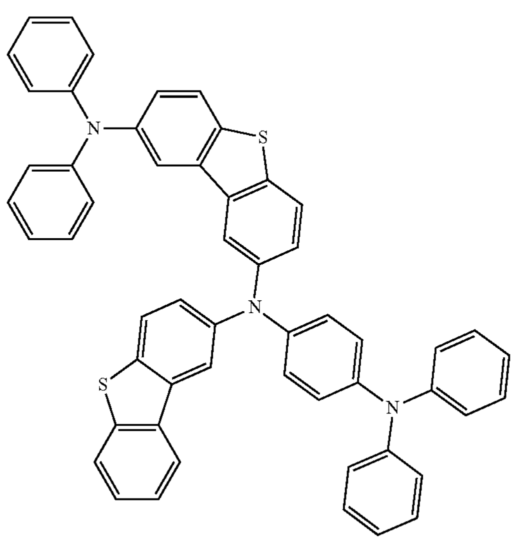

-continued
P4-128
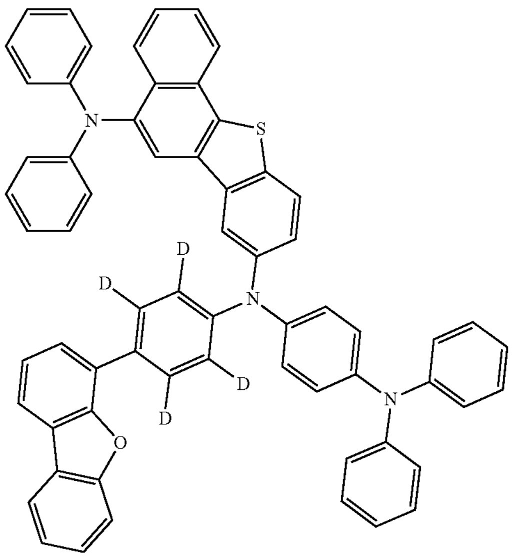
P4-129
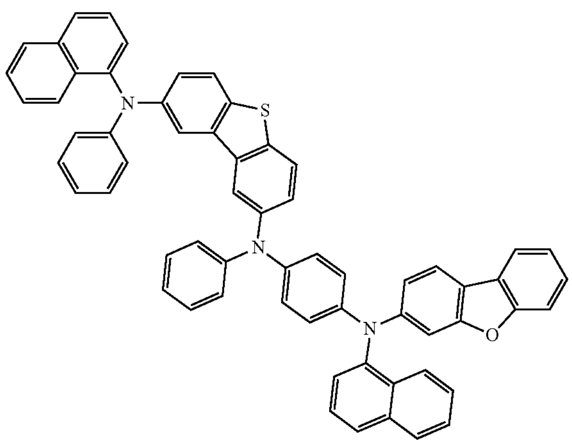
P4-130
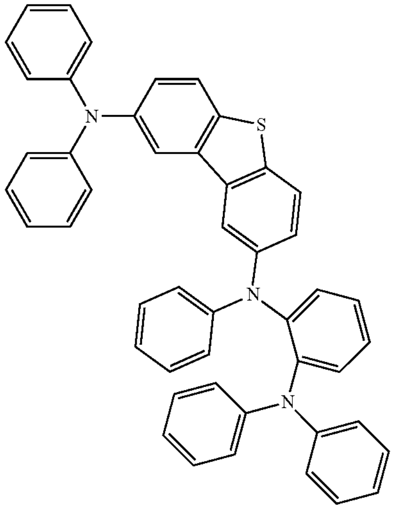

-continued
P4-131
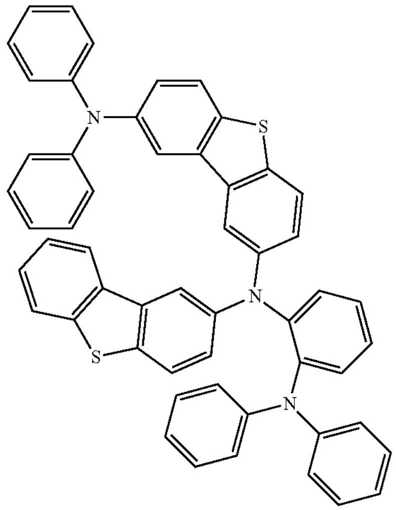
P4-132
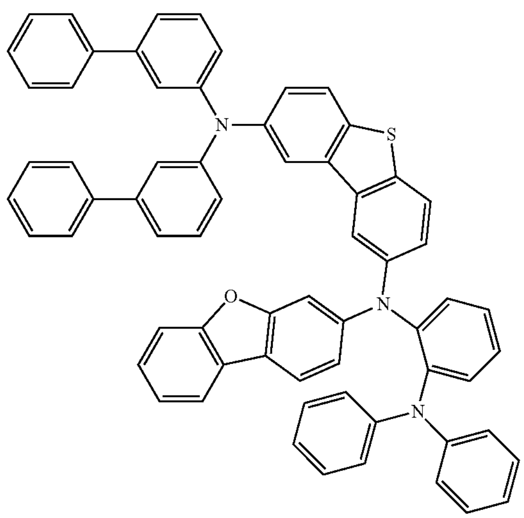
P4-133
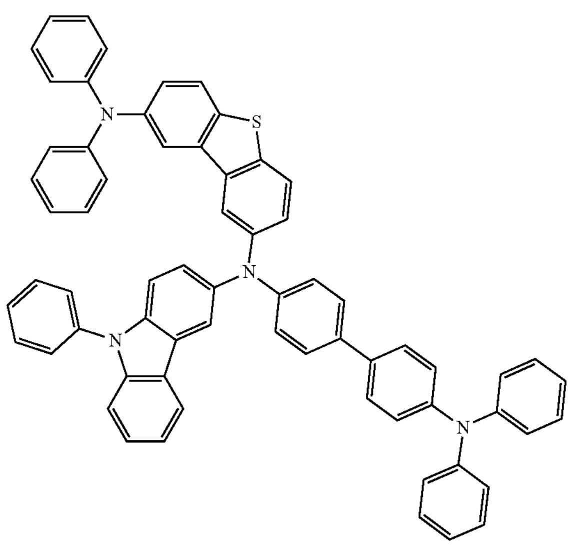

-continued
P4-134
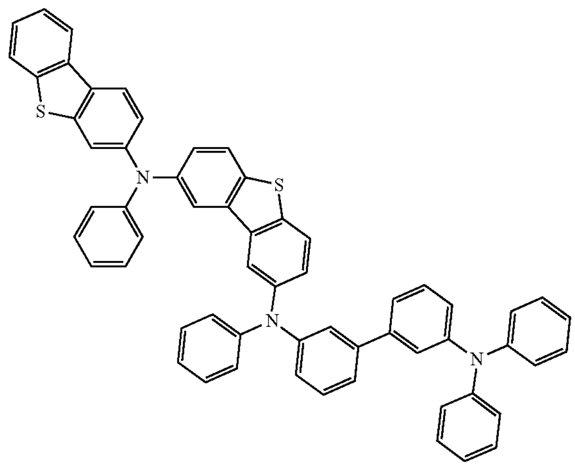
P4-135
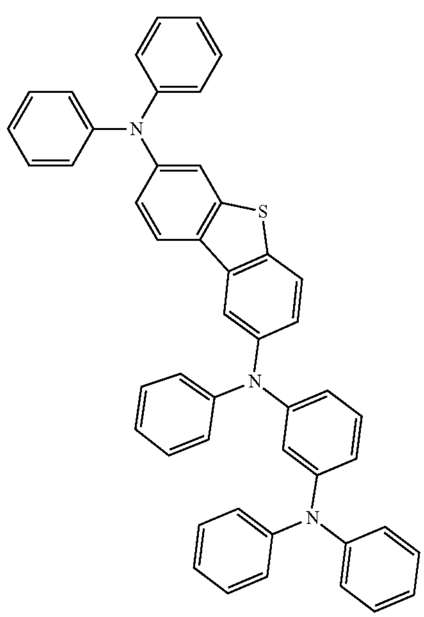

-continued
P4-136
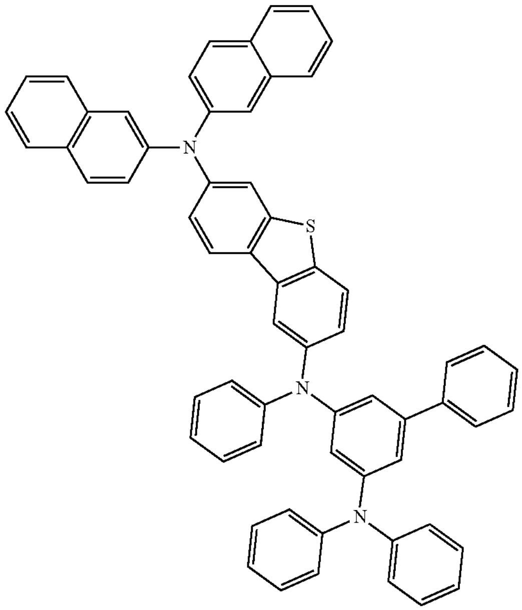
P4-138
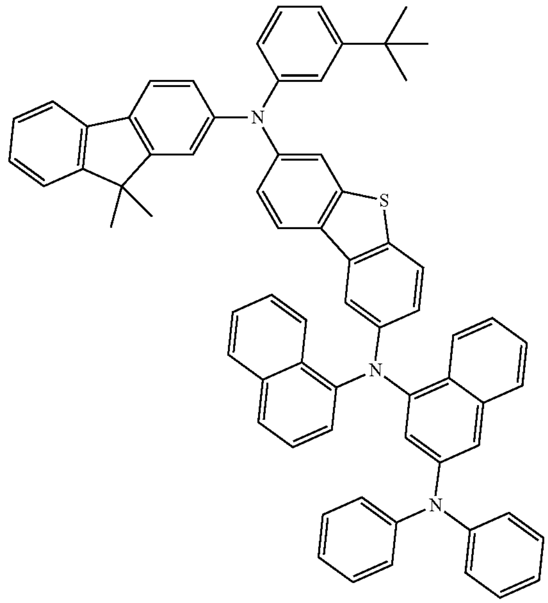
P4-137
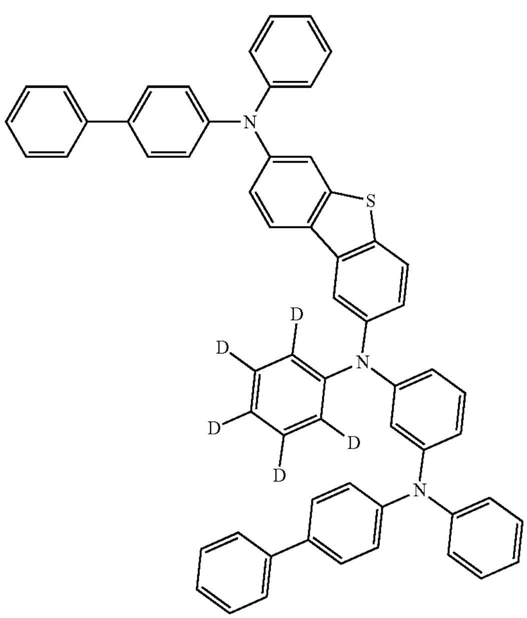
P4-139
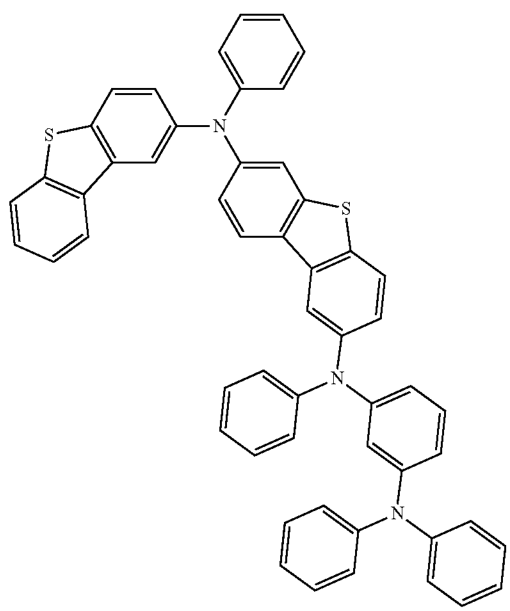

-continued
P4-140
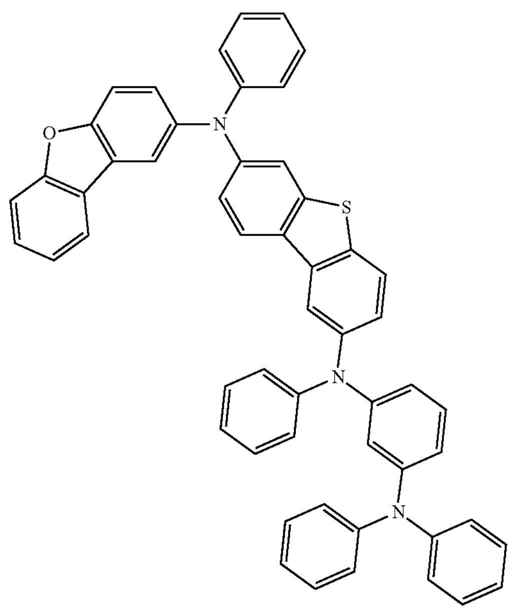
P4-141
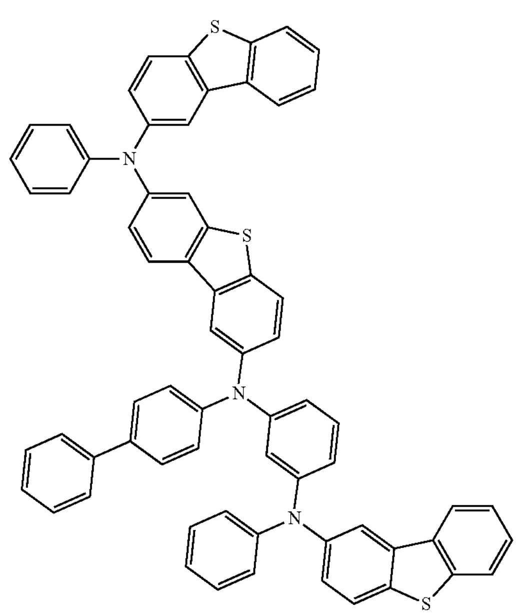
-continued
P4-142
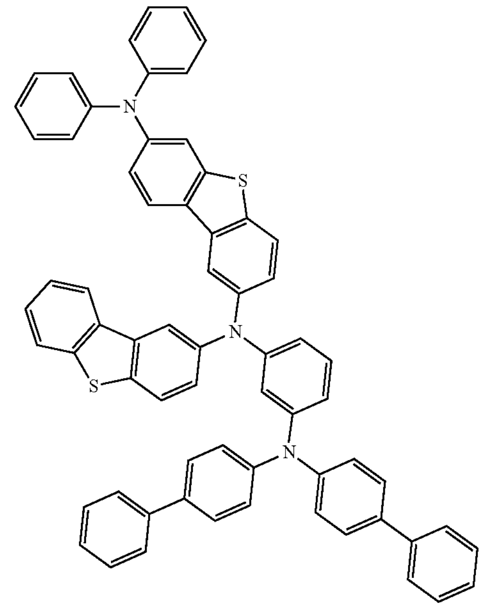
P4-143
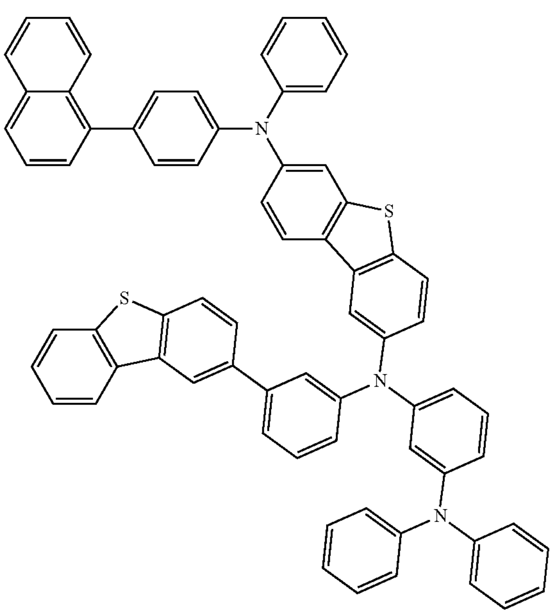

-continued
P4-144
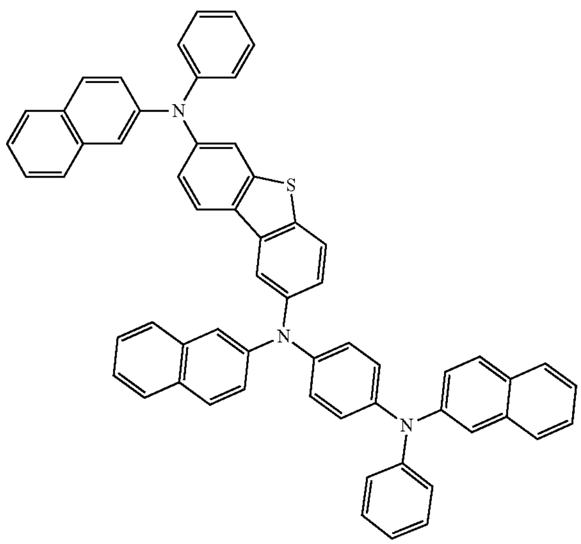
PF-145
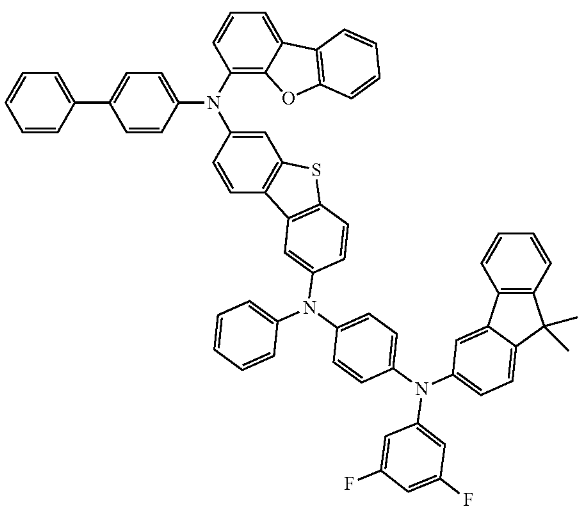
PF-146
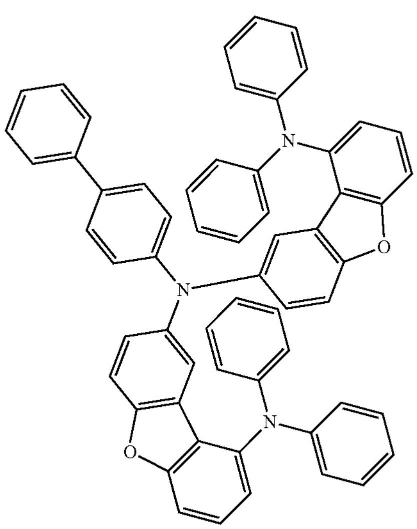
-continued
PF-147
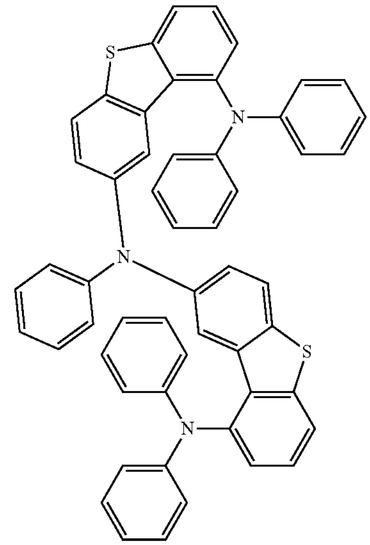
P4-148
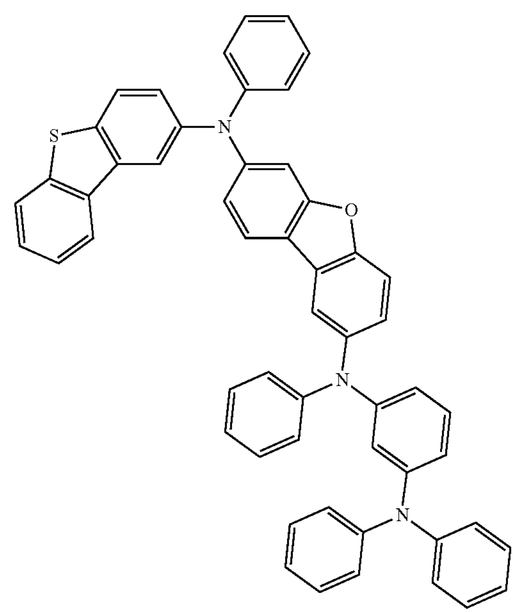

P4-149
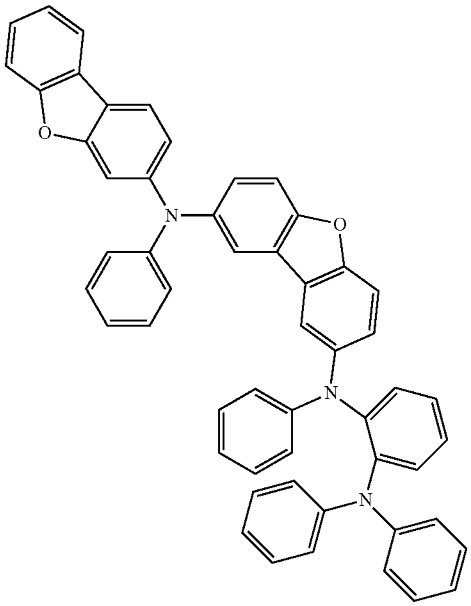
PF-150
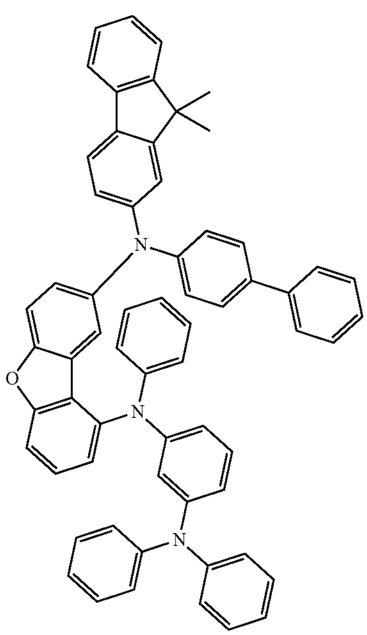
P4-151
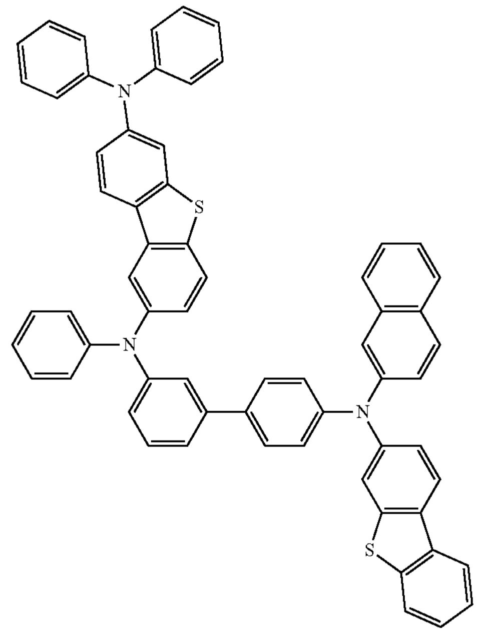
P4-152
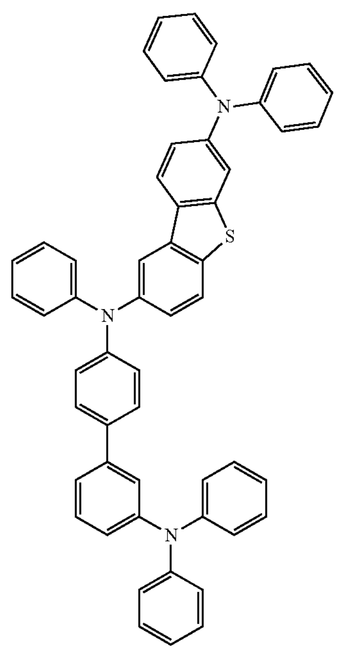

P4-153
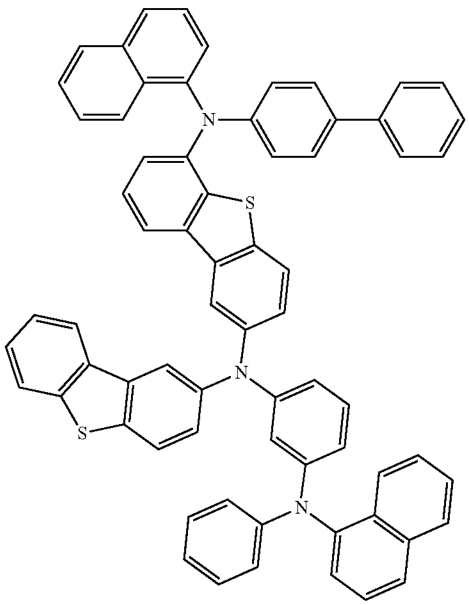
P4-155
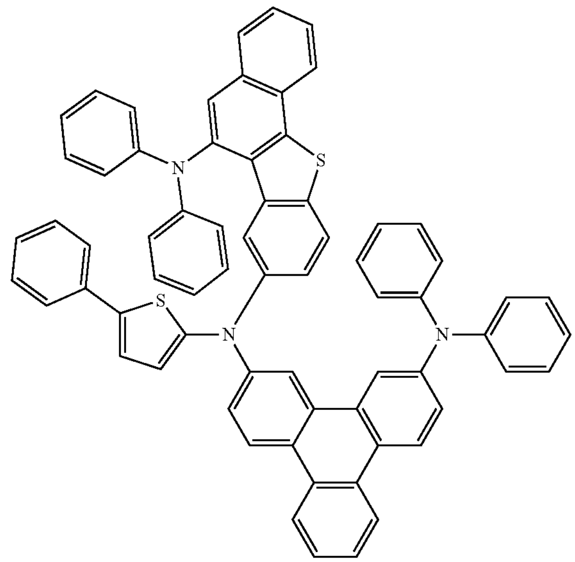
P4-154
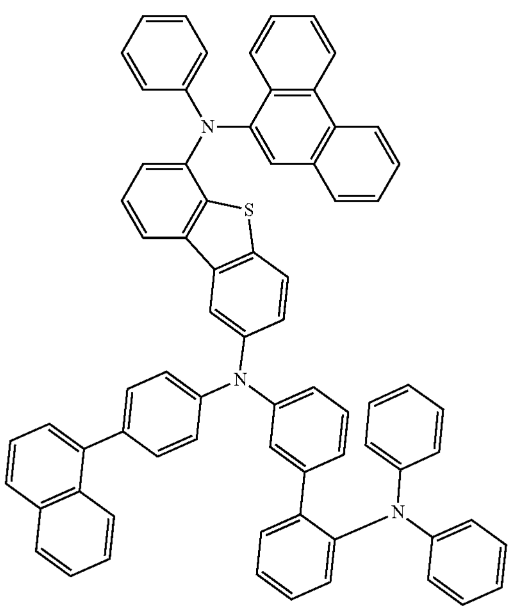
P4-156
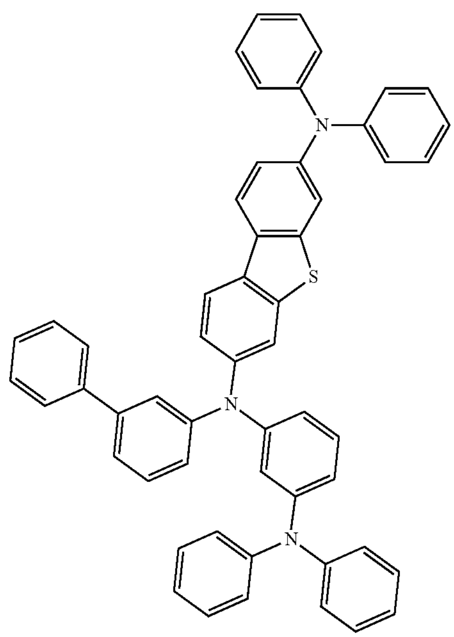

-continued
P4-157
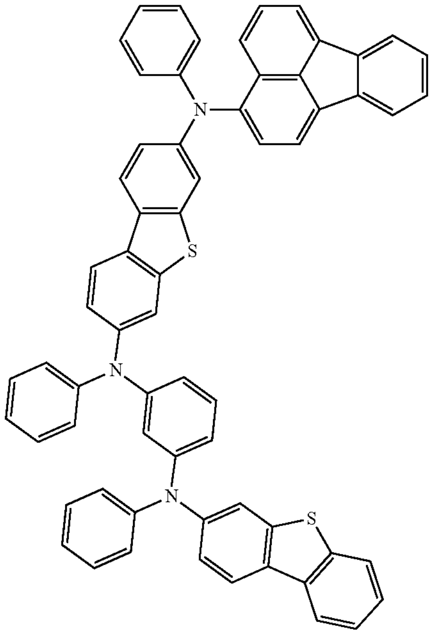
P4-158
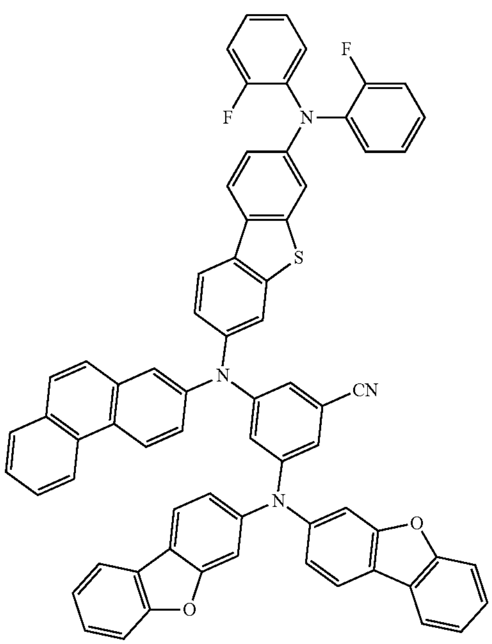
-continued
P4-159
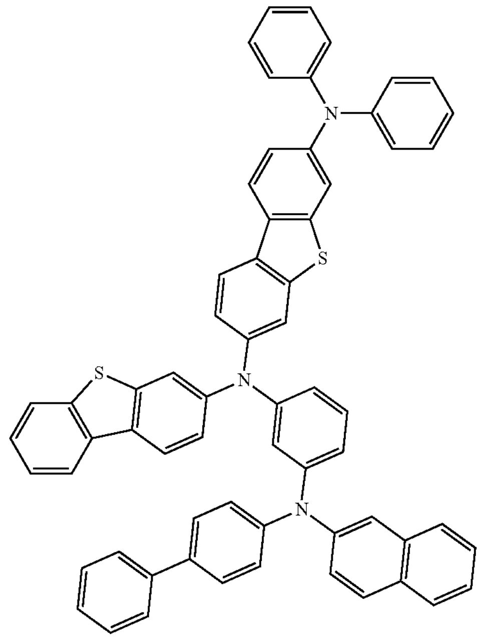
P4-160
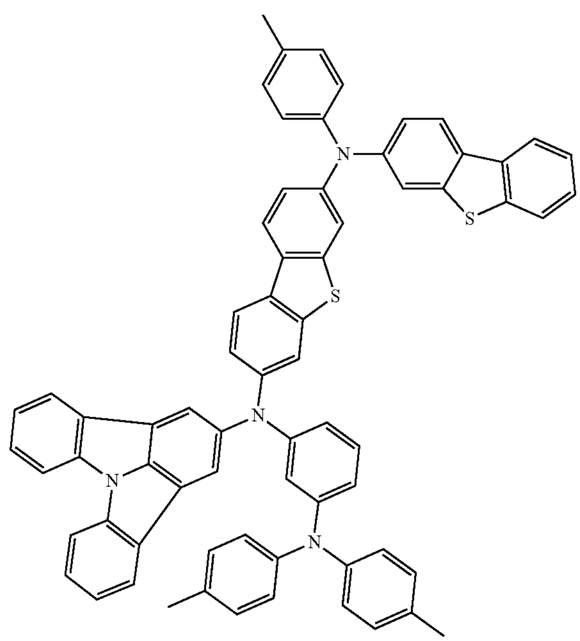

-continued
P4-161
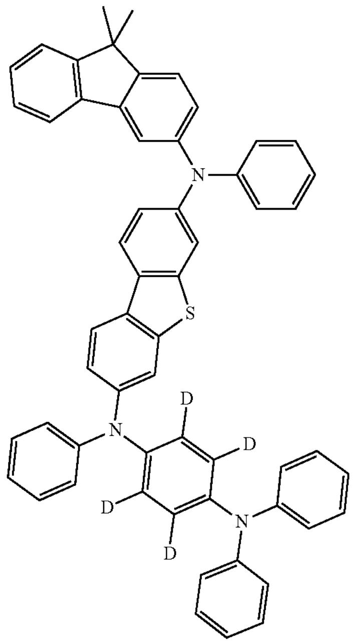
P4-162
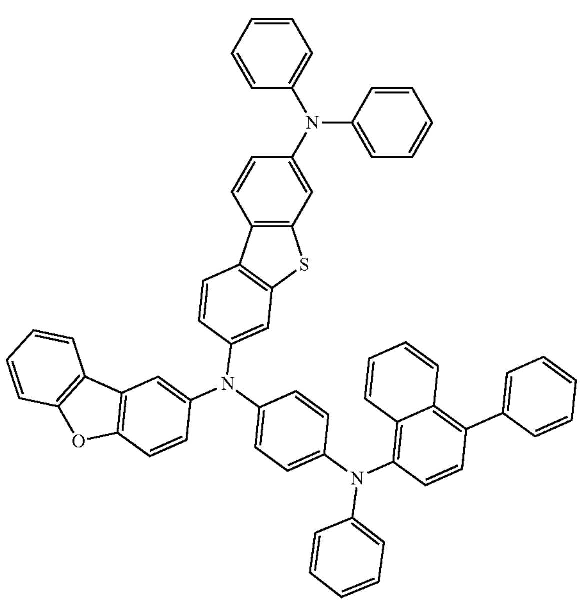
-continued
P4-163
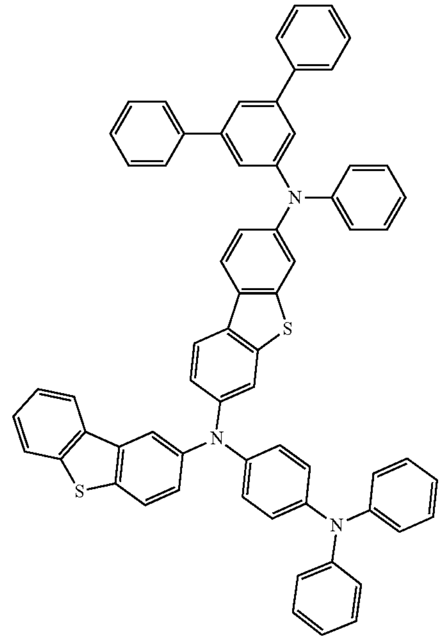
P4-164
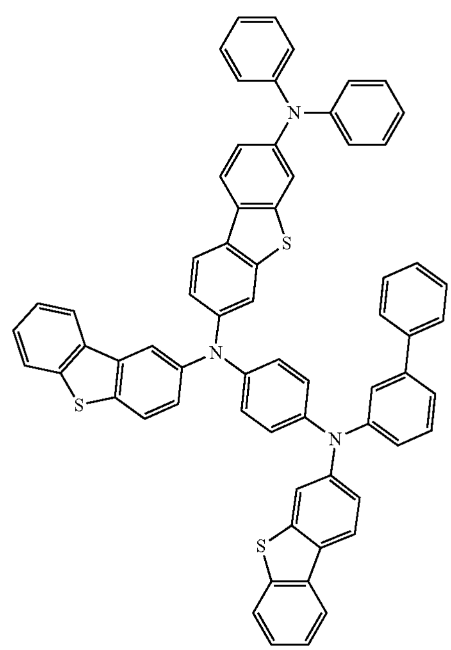

-continued
P4-165
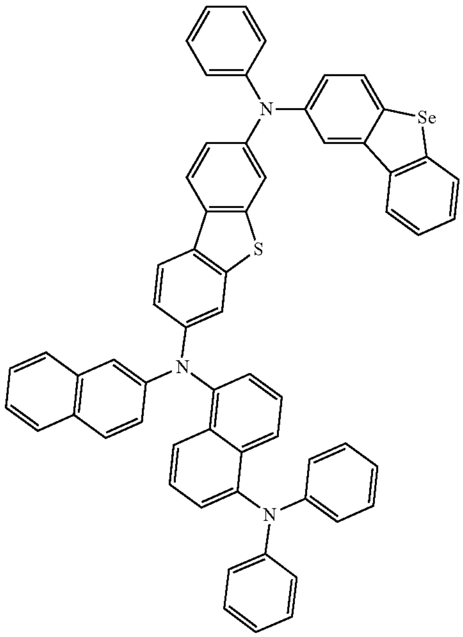
P4-166
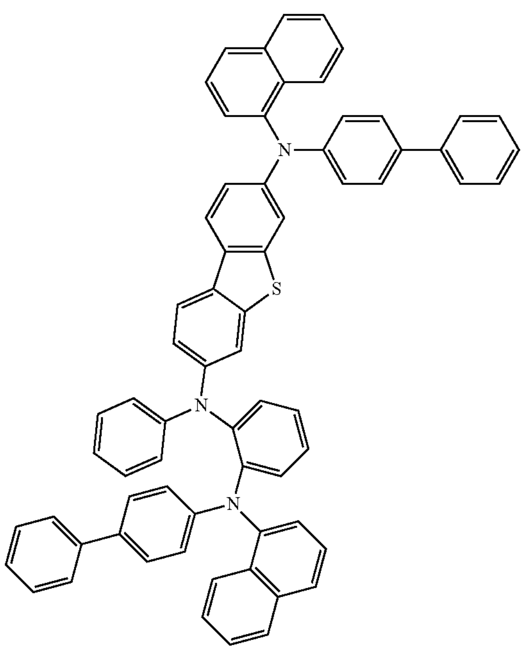
-continued
P4-167
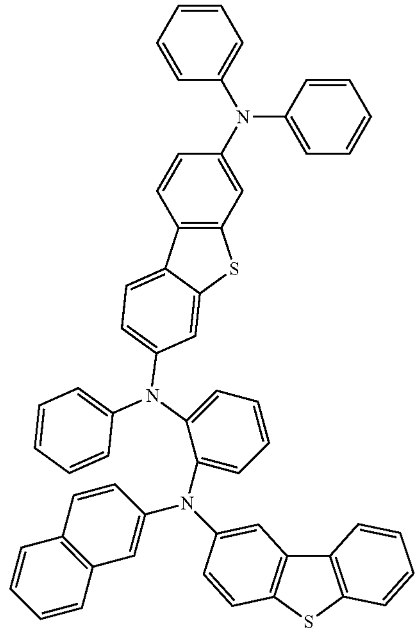
P4-168
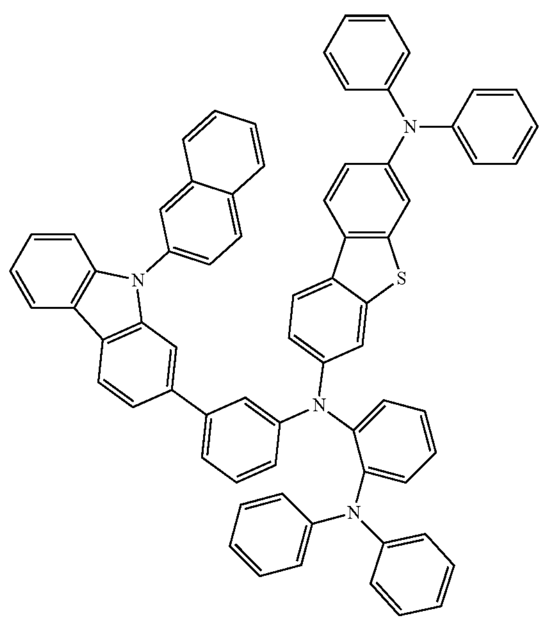

P4-169
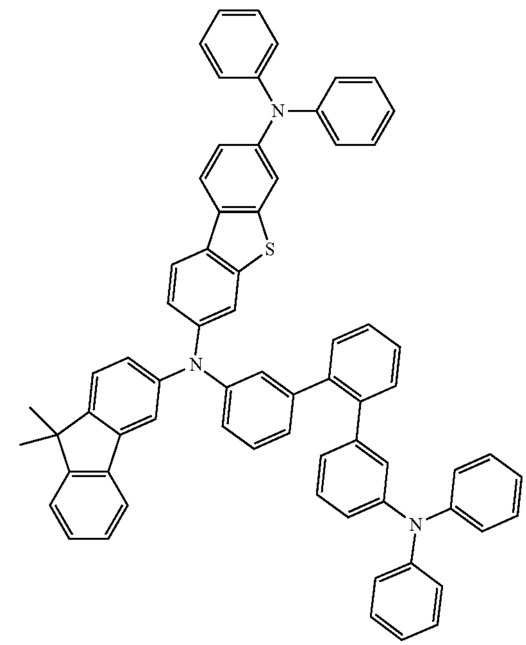
P4-170
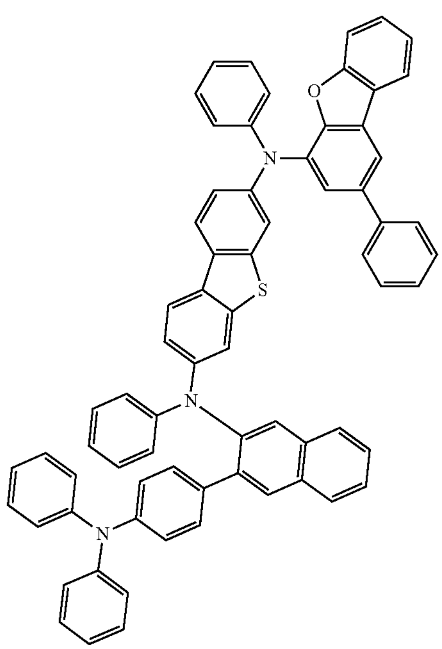
P4-171
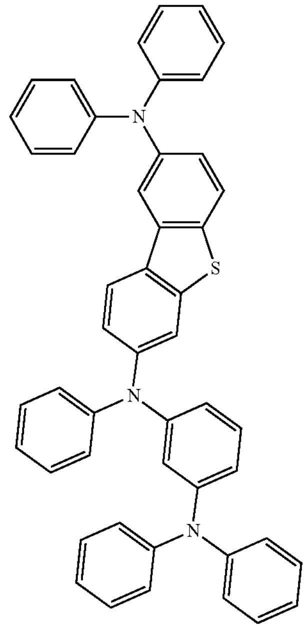
P4-172
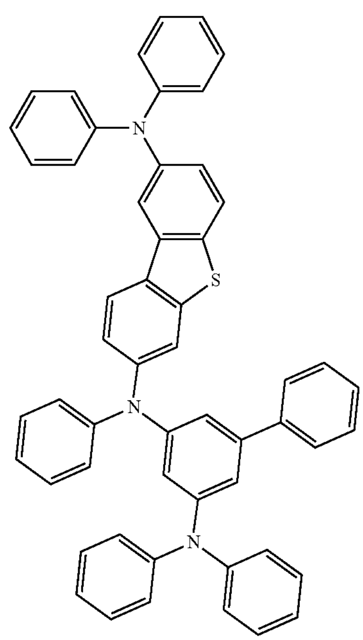

-continued
P4-173
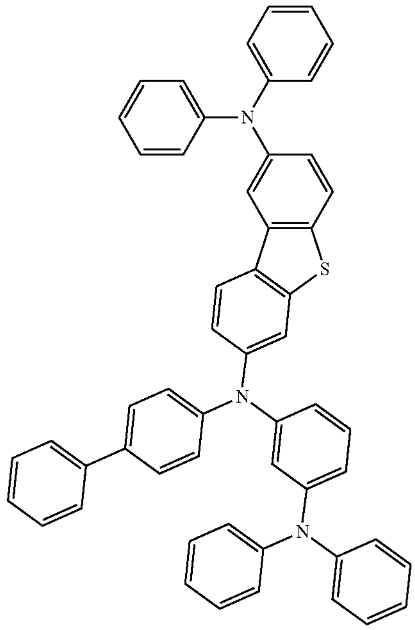
P4-174
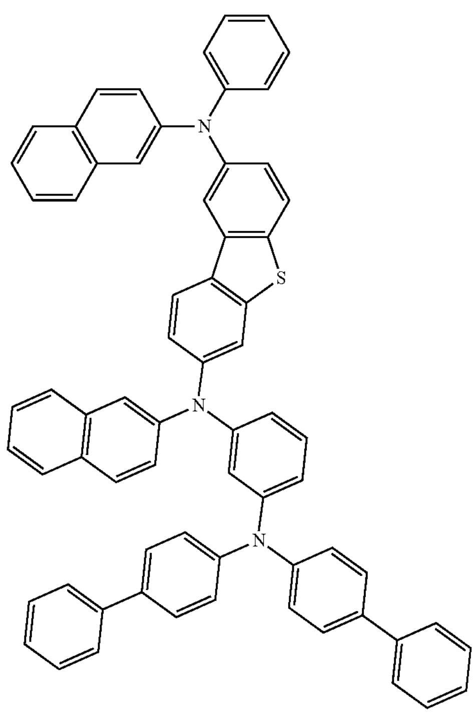
-continued
P4-175
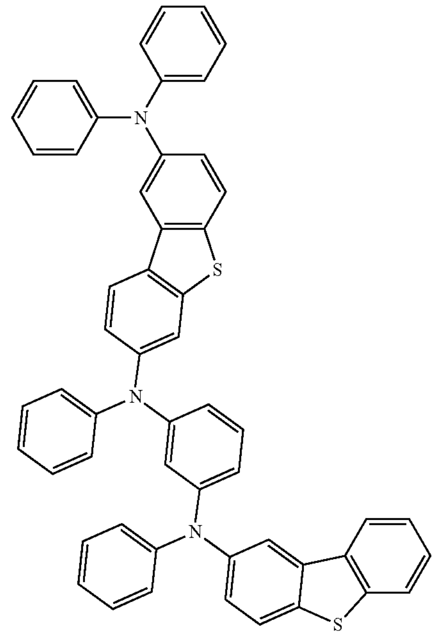
P4-176
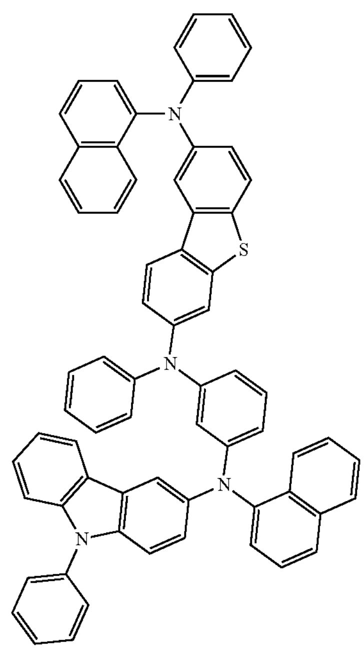

P4-177
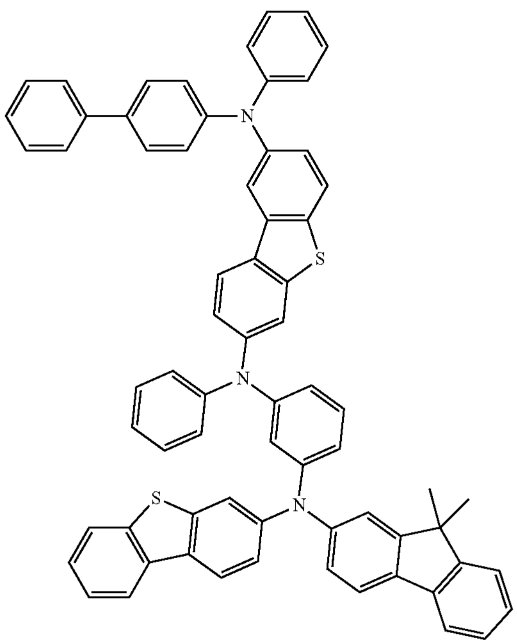
P4-178
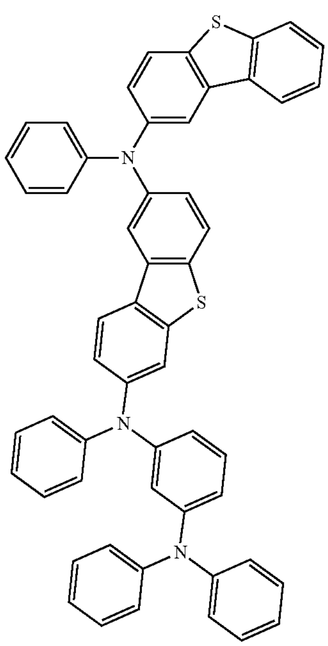
P4-179
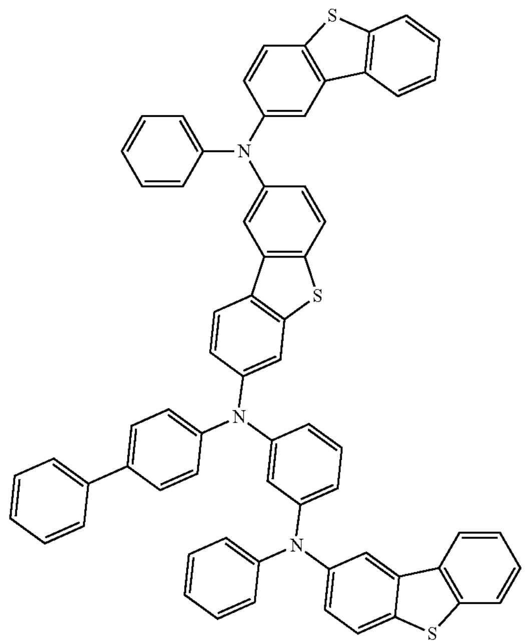
P4-180
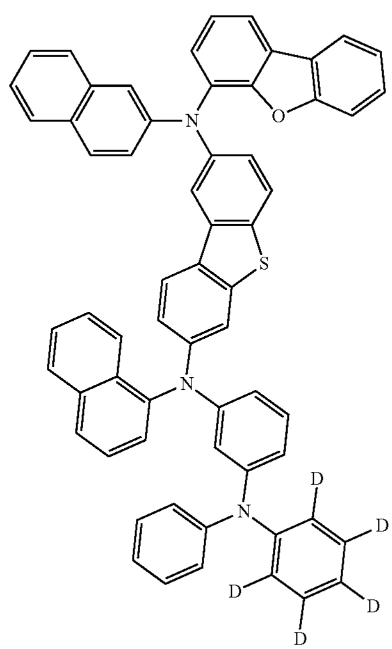

-continued
P4-181
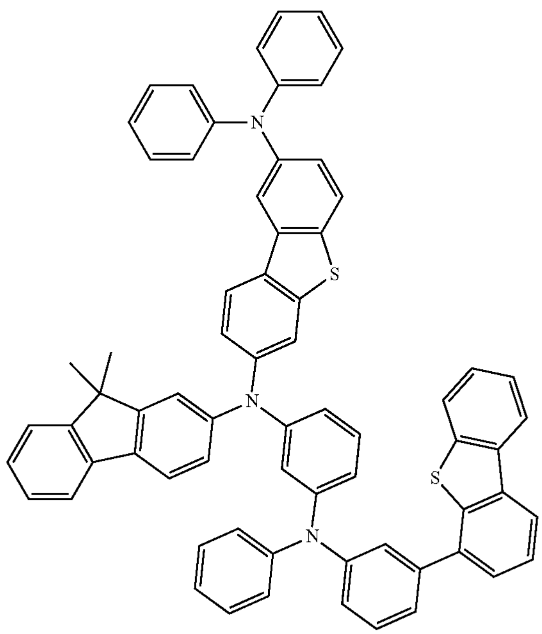
P4-182
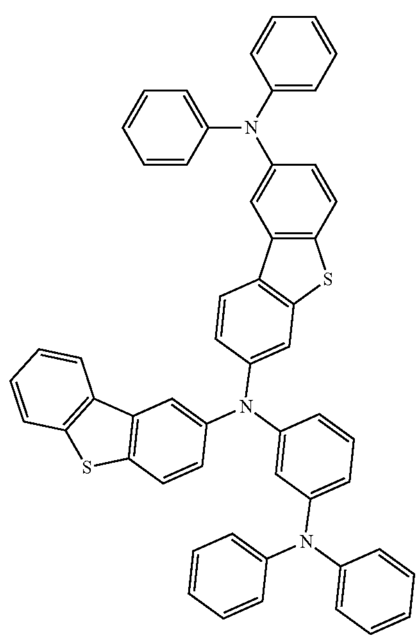
-continued
P4-183
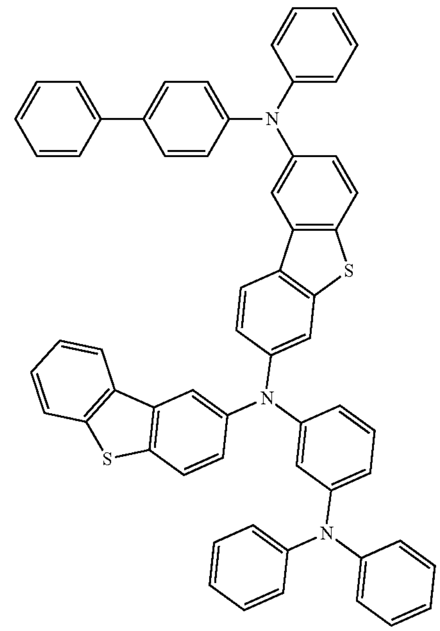
P4-184
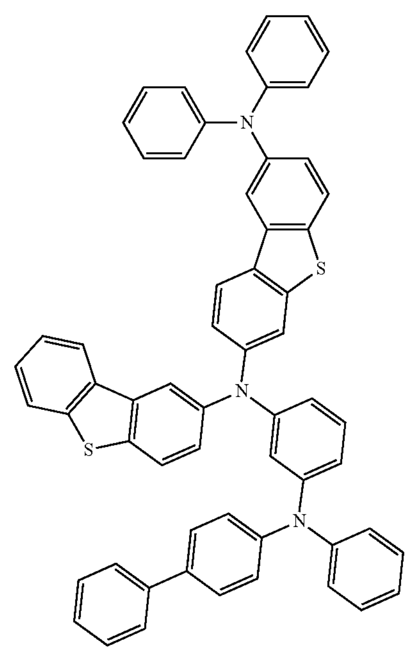

-continued
P4-185
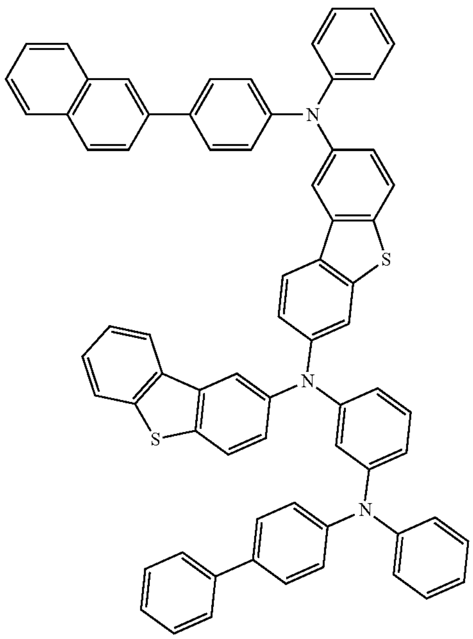
P4-186
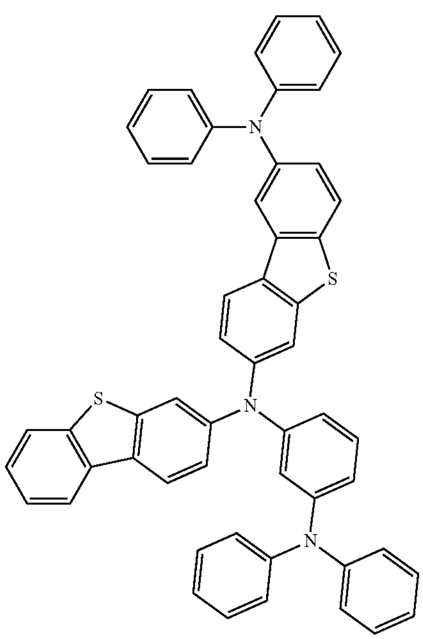
-continued
P4-187
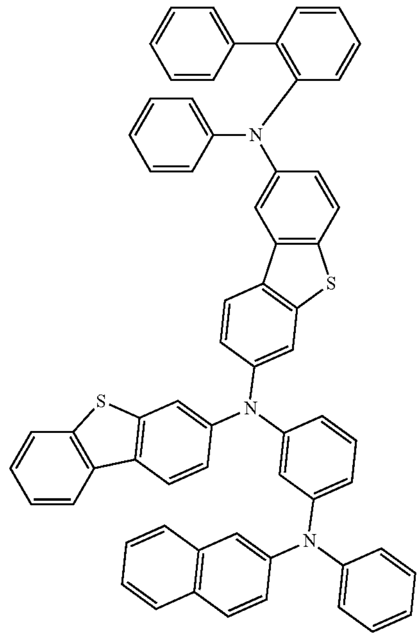
P4-188
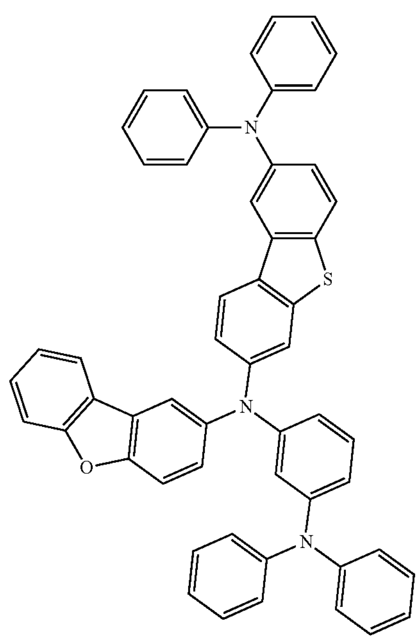

-continued
P4-189
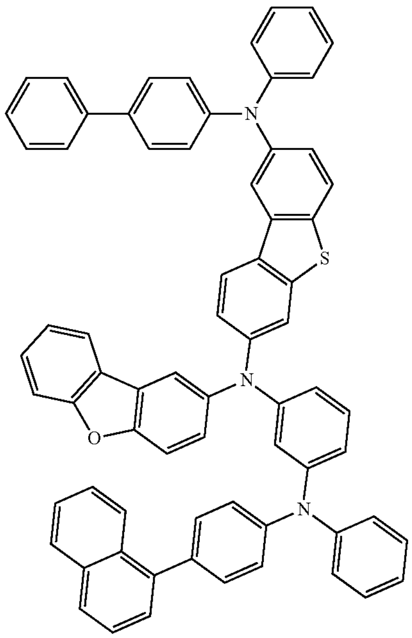
P4-190
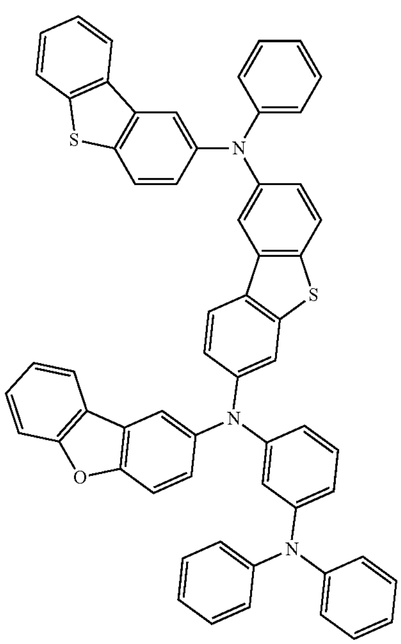
-continued
P4-191
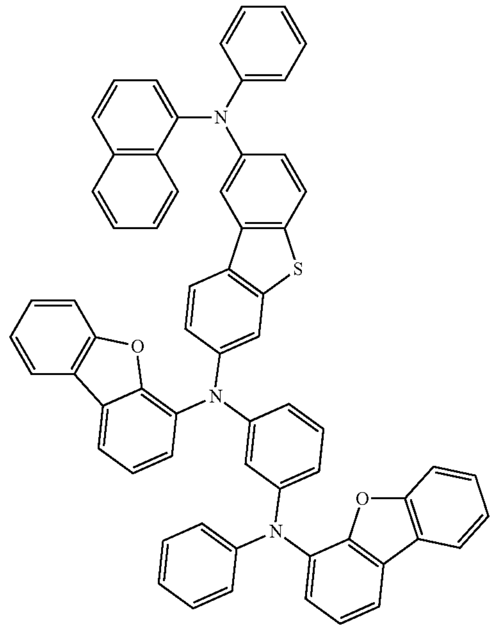
P4-192
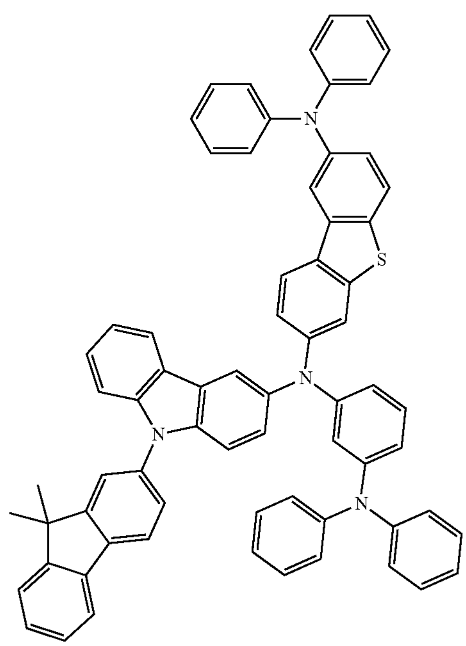

-continued
P4-193
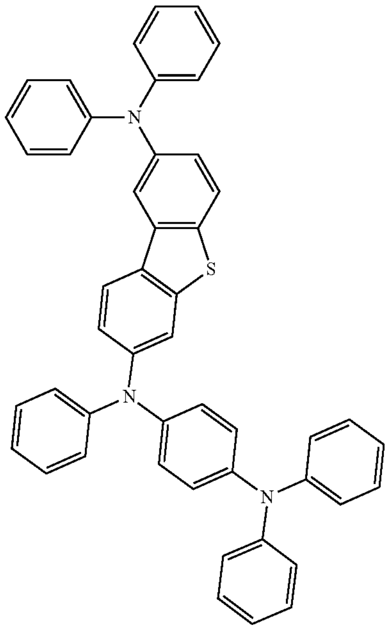
P4-194
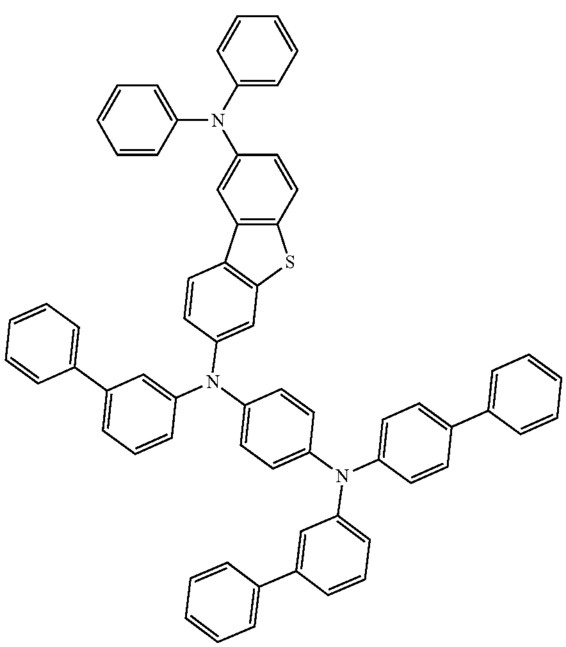
-continued
P4-195
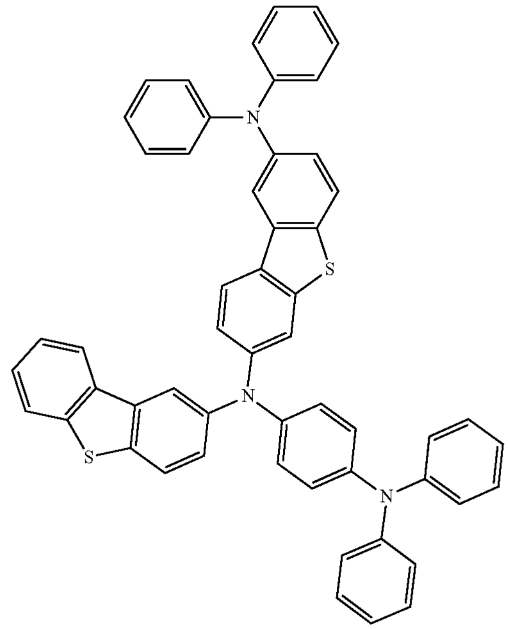
P4-196
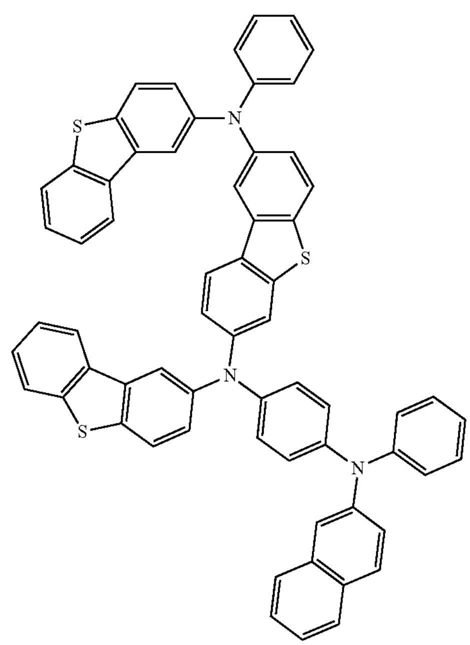

-continued
P4-197
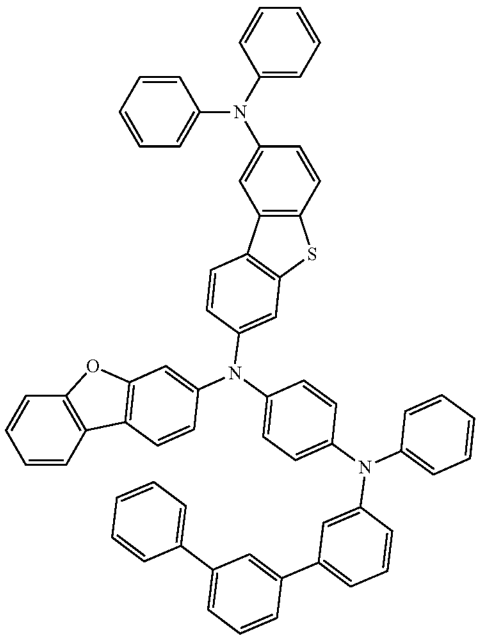
P4-198
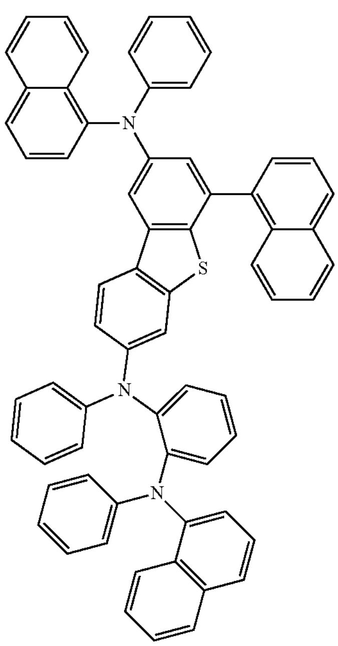
-continued
P4-199
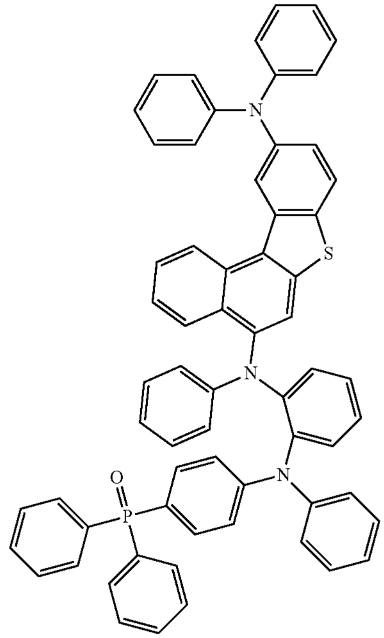
P4-200
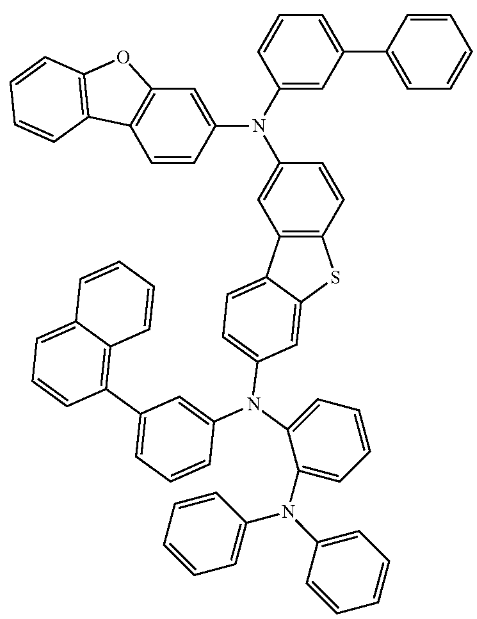

P4-201
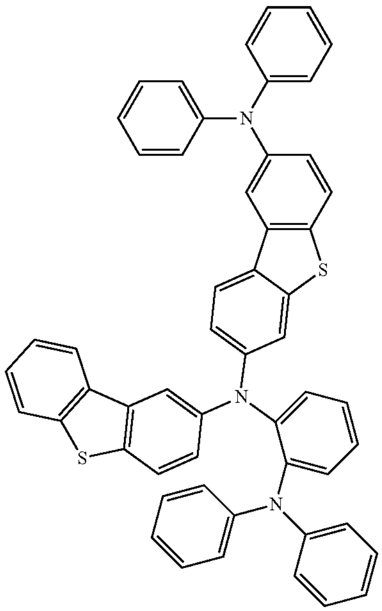
P4-202
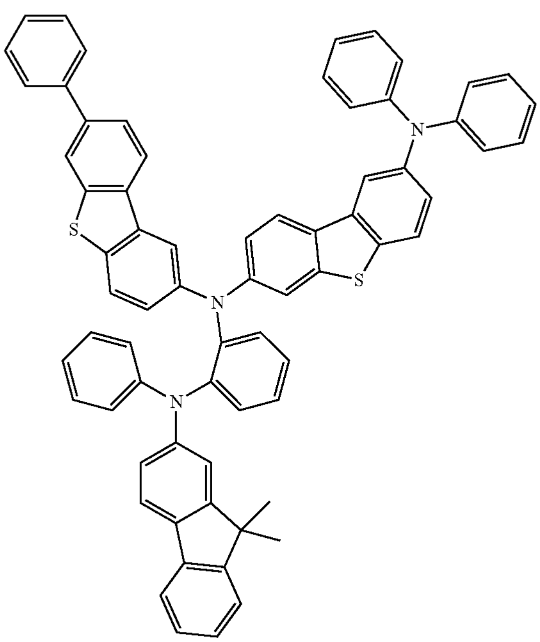
P4-203
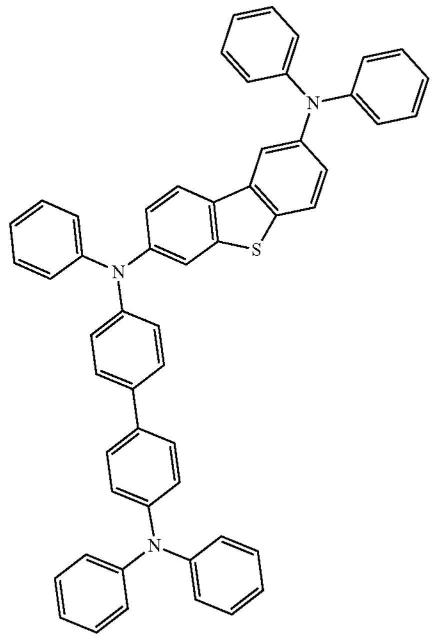
P4-204
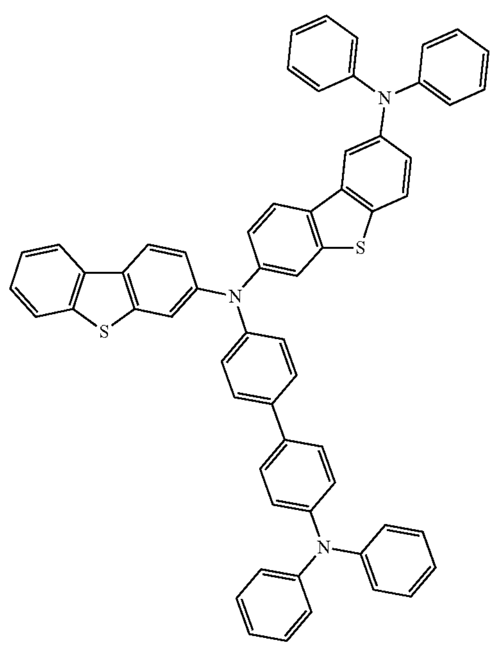

-continued
P4-205
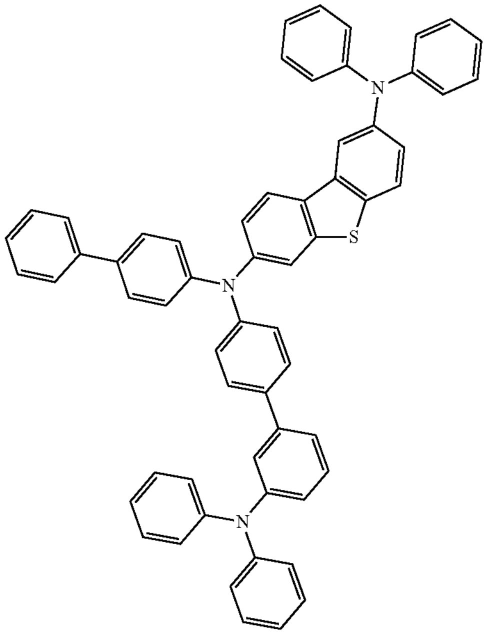
P4-207
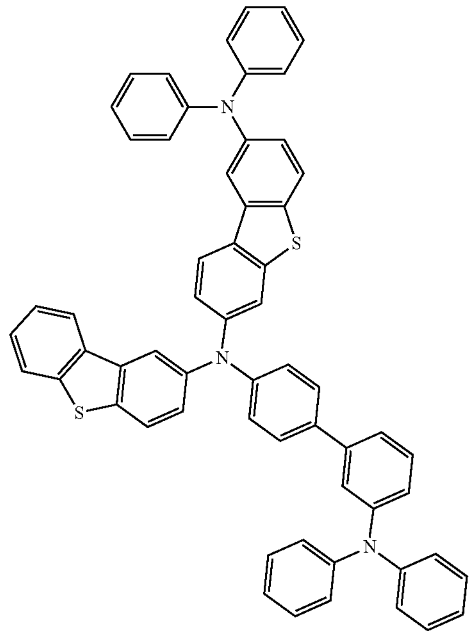
P4-206
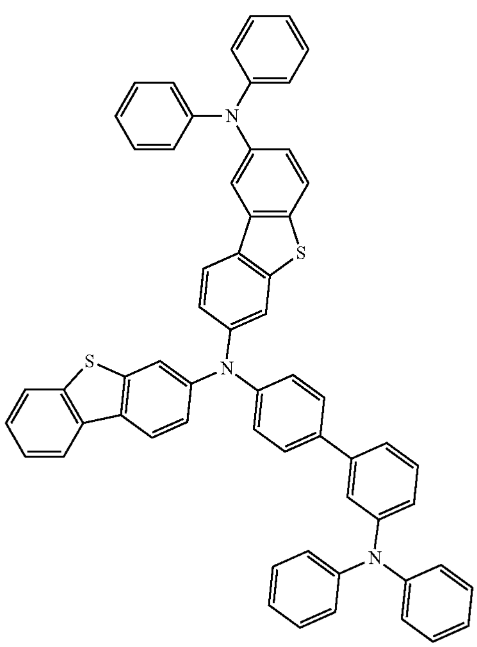
P4-208
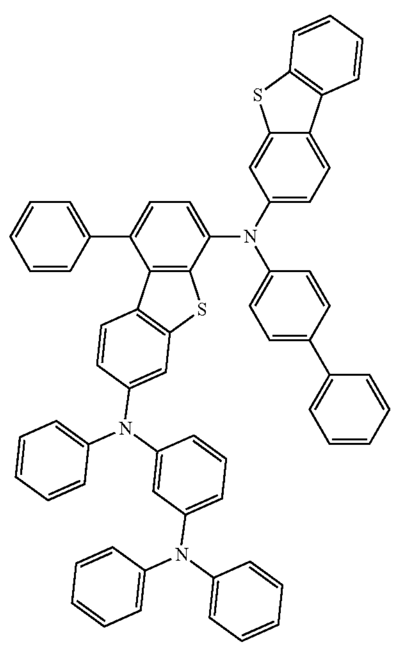

-continued
P4-209
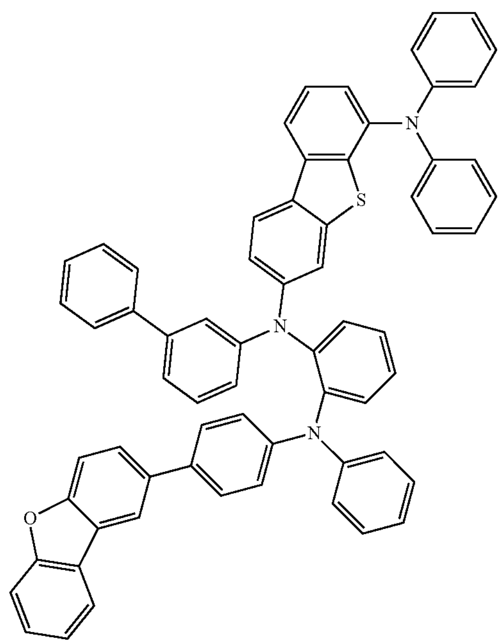
P4-210
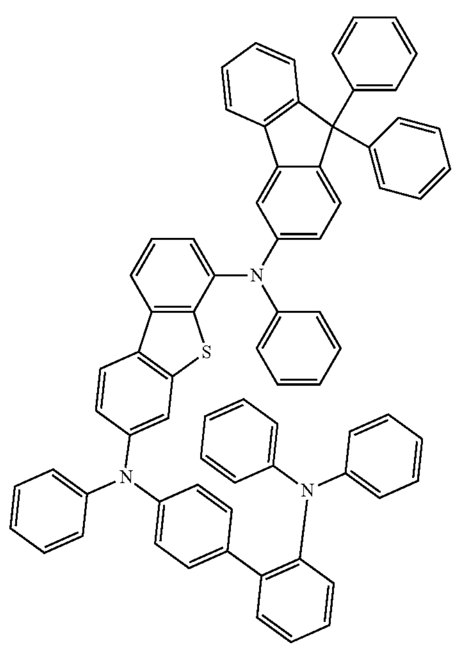
-continued
P4-211
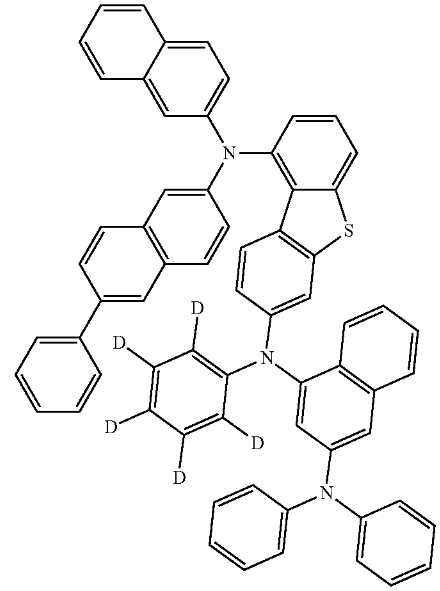
P4-212
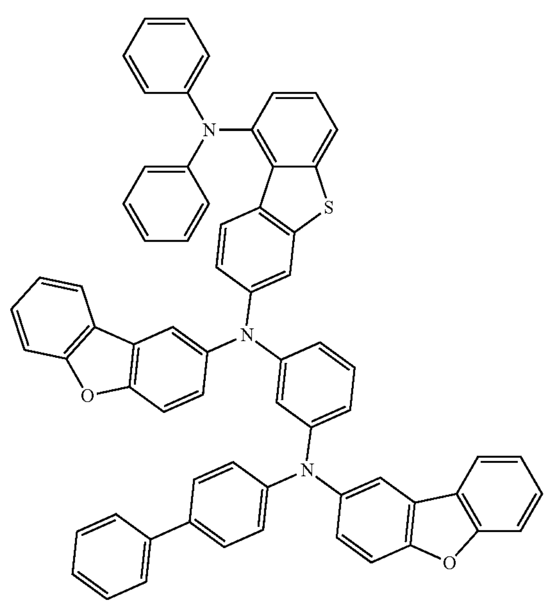

-continued
P4-213
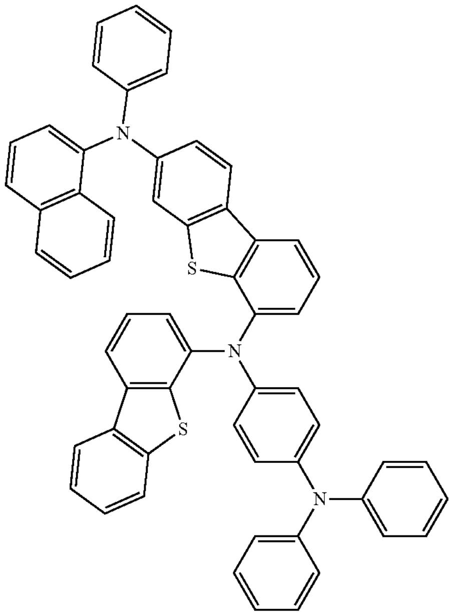
P4-214
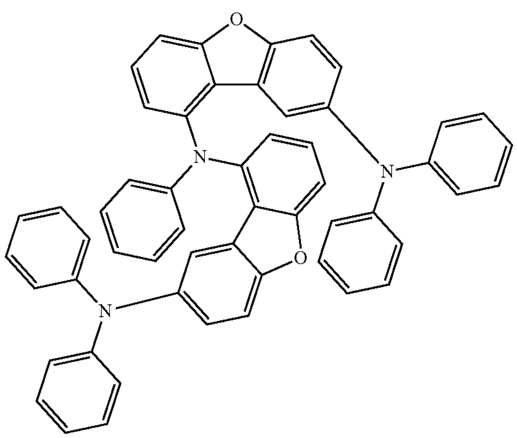
P4-215
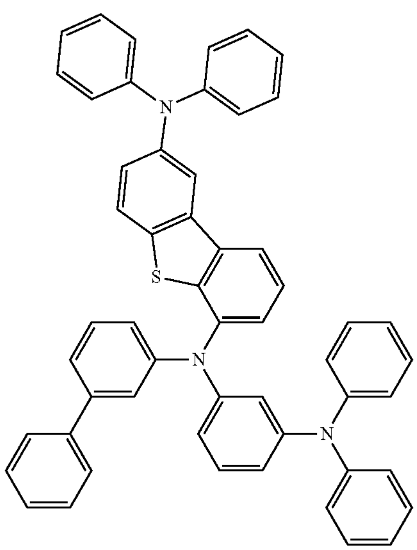
-continued
P4-216
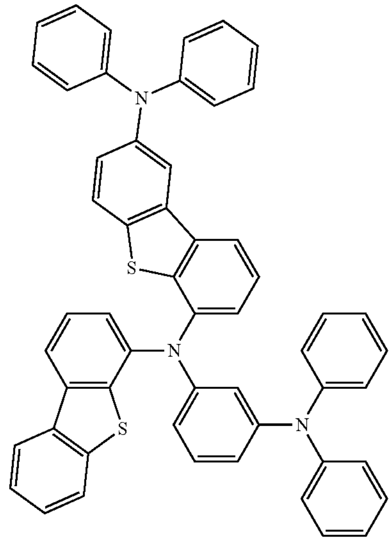
P4-217
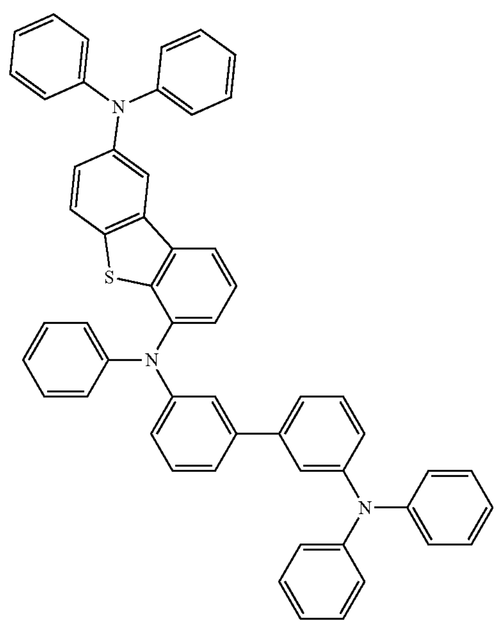

-continued
P4-218
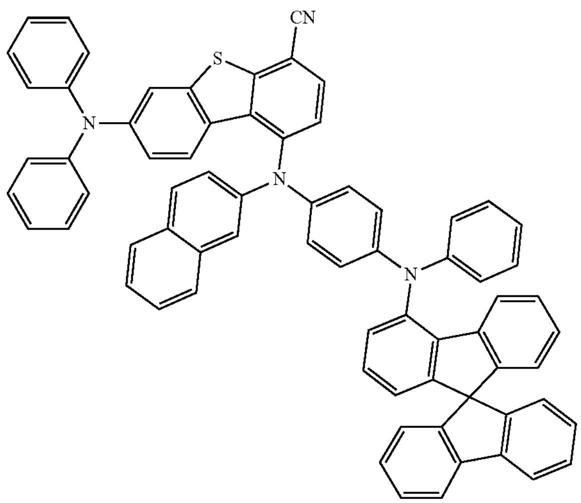
P4-219
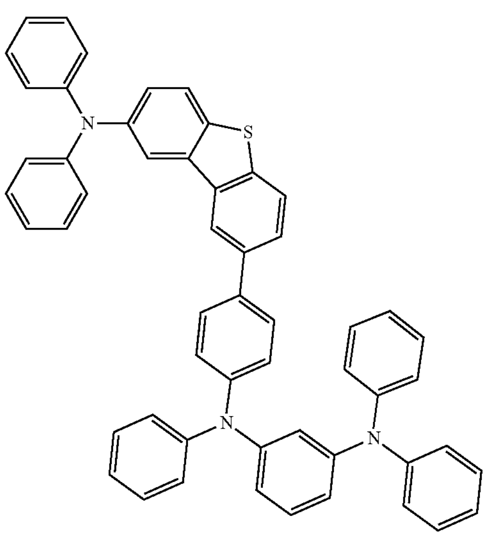
-continued
P4-220
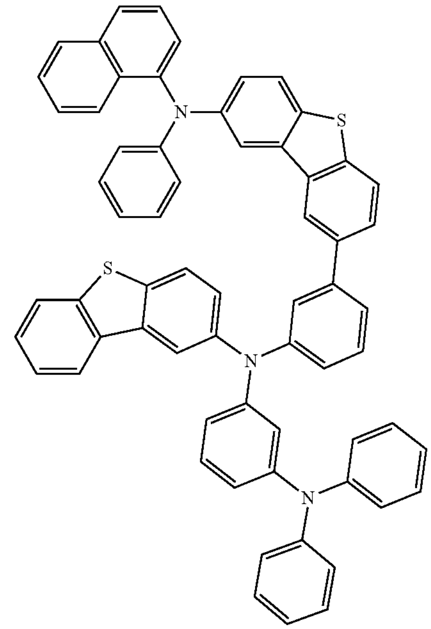
P4-221
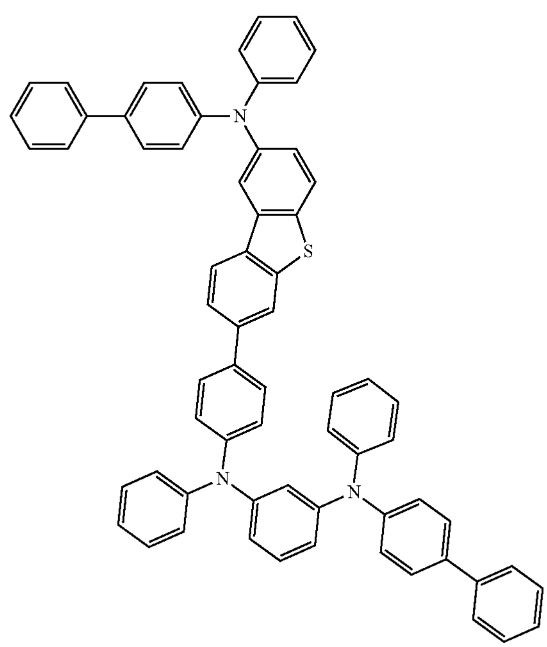

-continued
P4-222
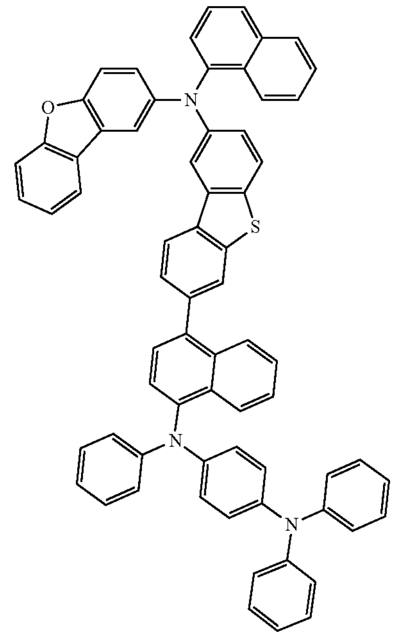
P4-224
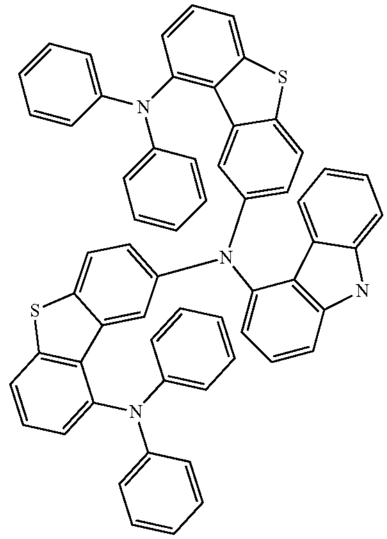
P4-223
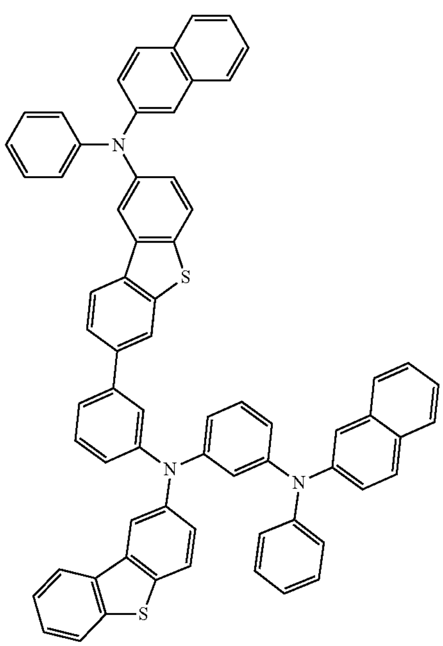
P4-225
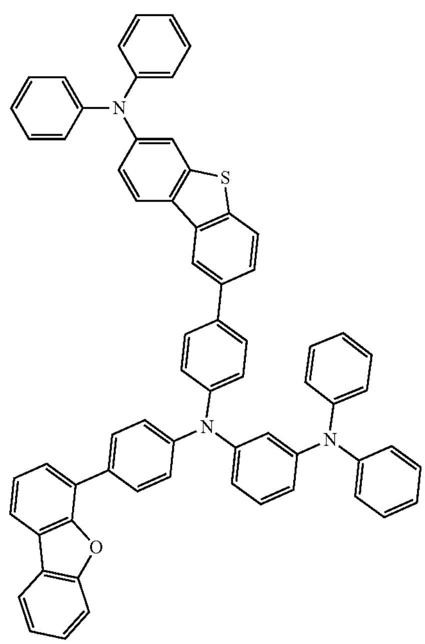

-continued
P4-226
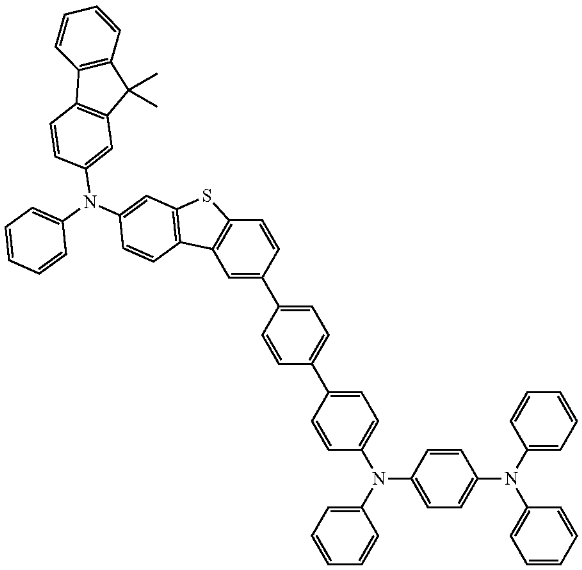
-continued
P4-228
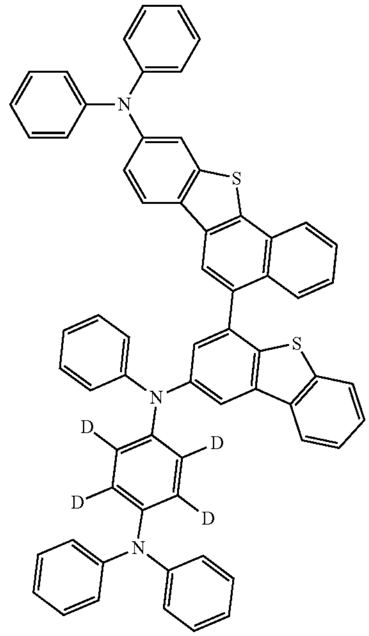
P4-227
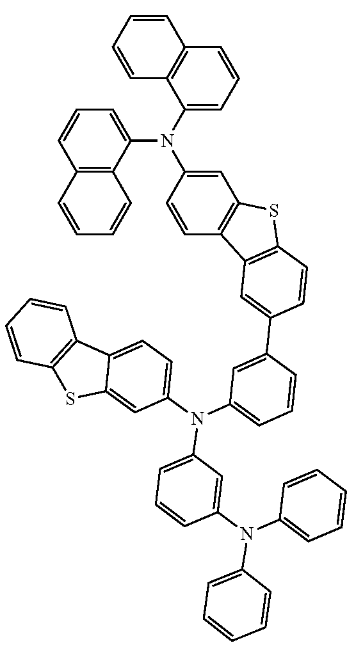
P4-229
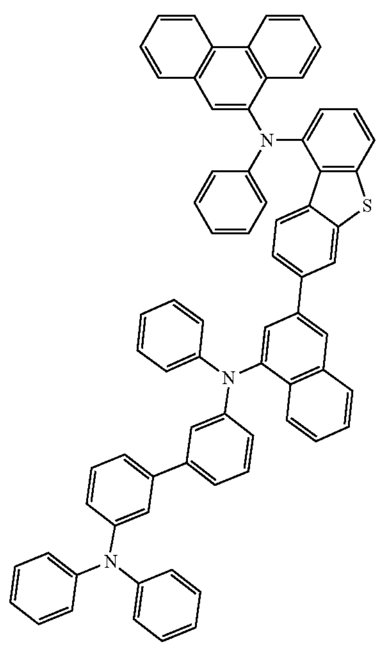

-continued
P4-230
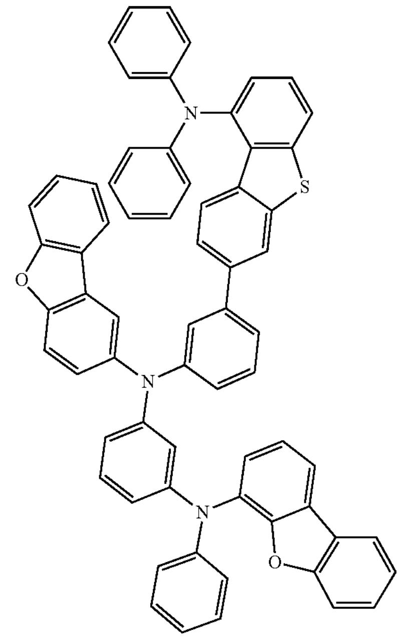
P4-231
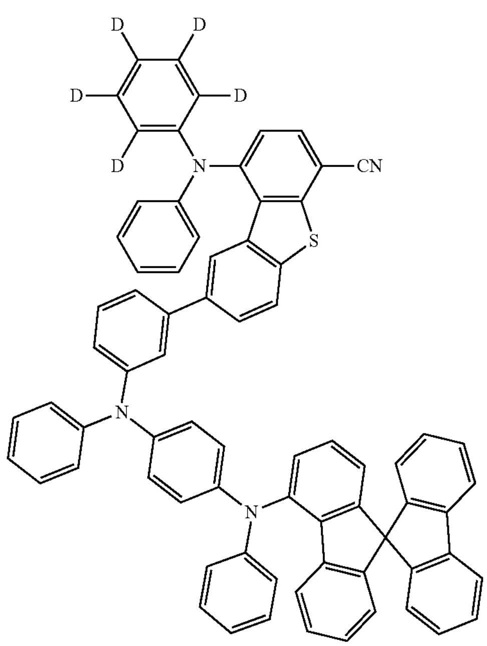
-continued
P4-232
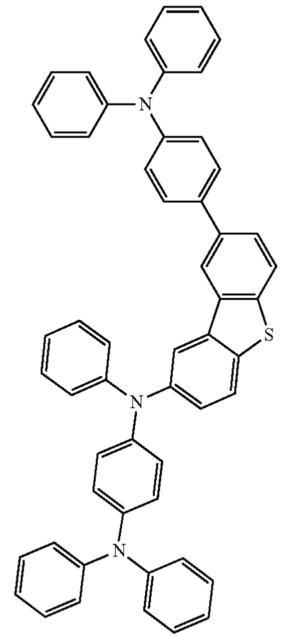
P4-233
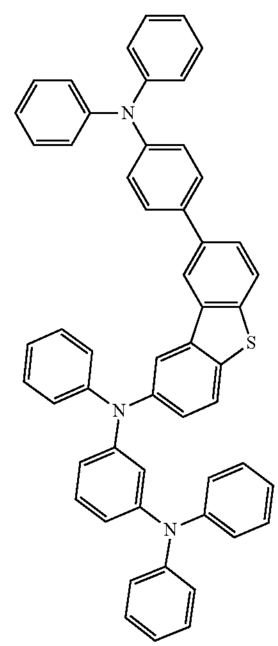

-continued
P4-234
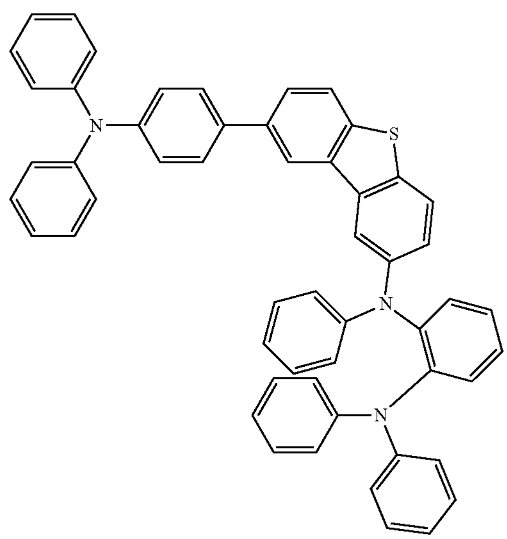
P4-235
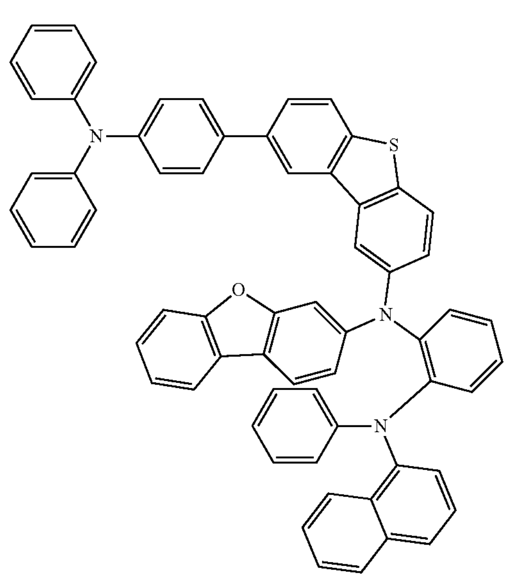
-continued
P4-236
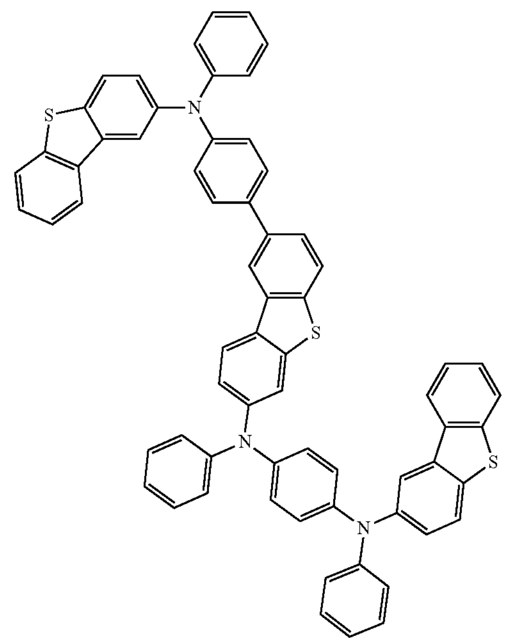
P4-237
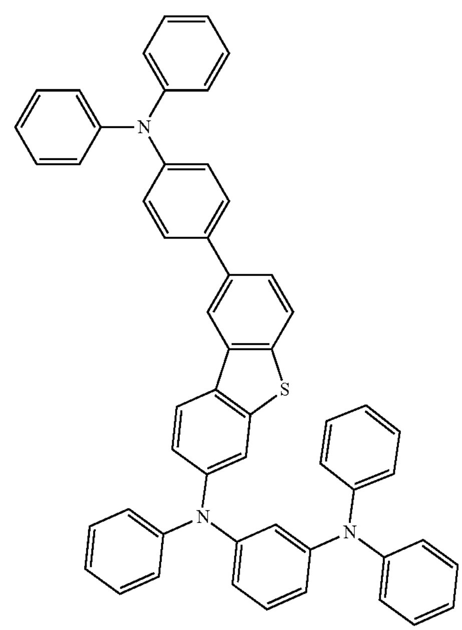

-continued
P4-238
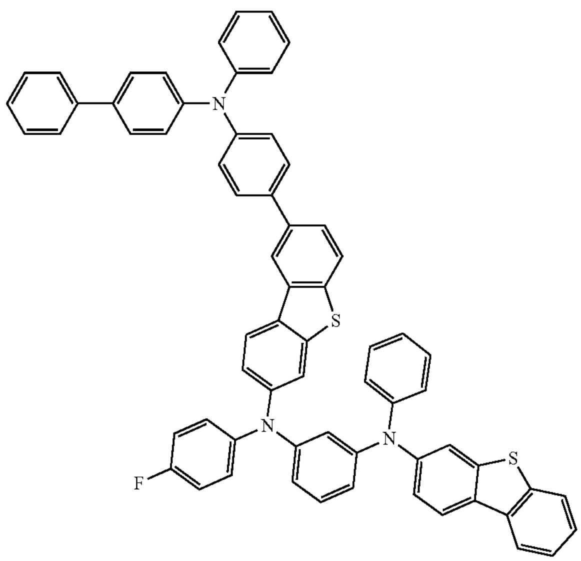
P4-239
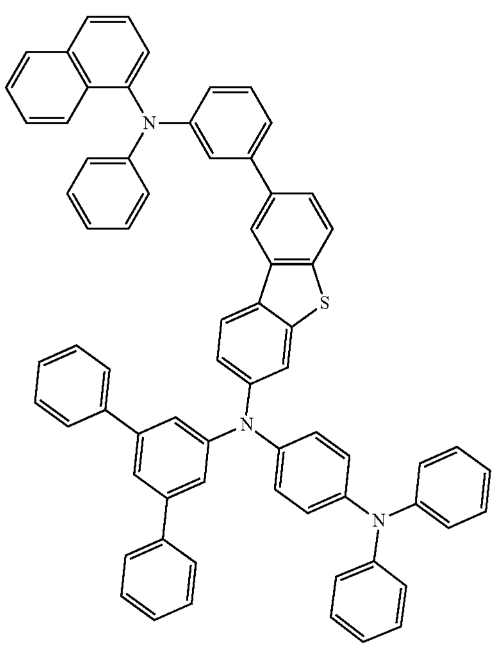
-continued
P4-240
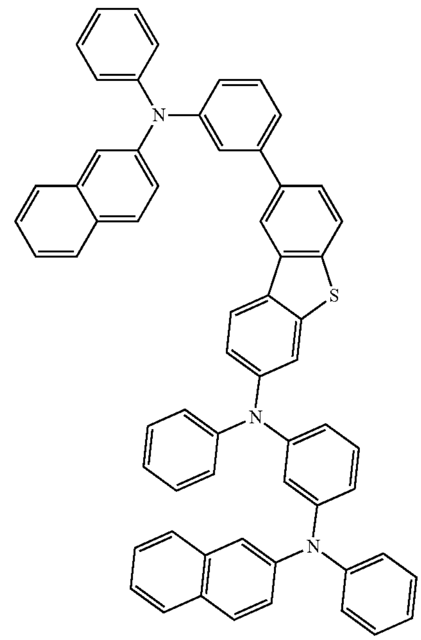
P4-241
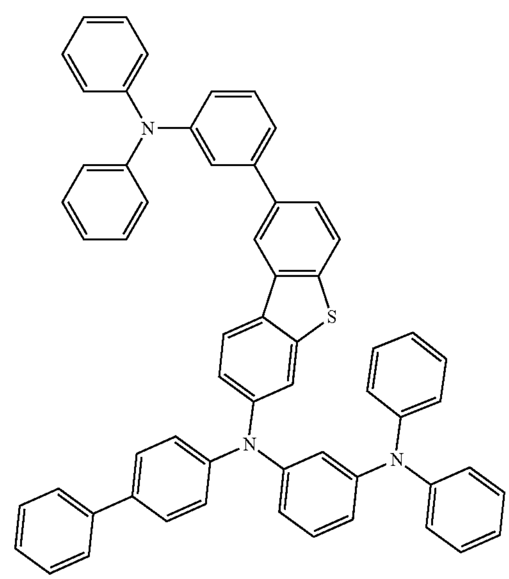

-continued
P4-242
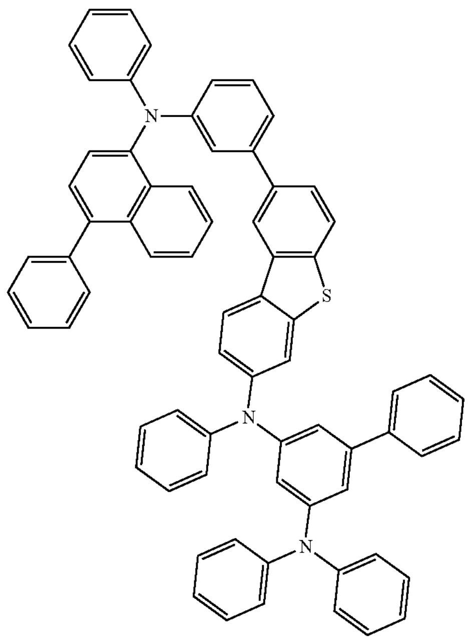
P4-244
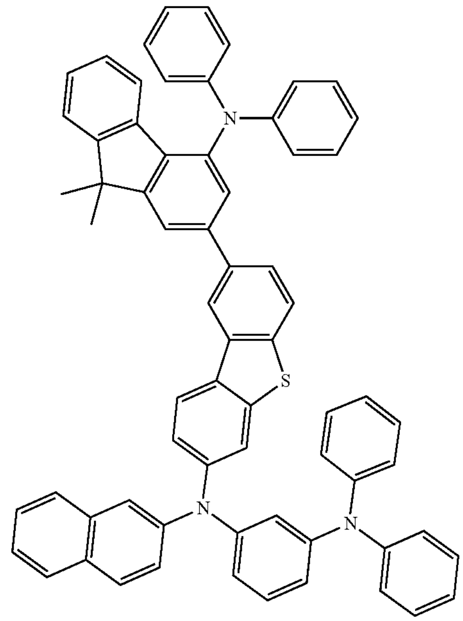
P4-243
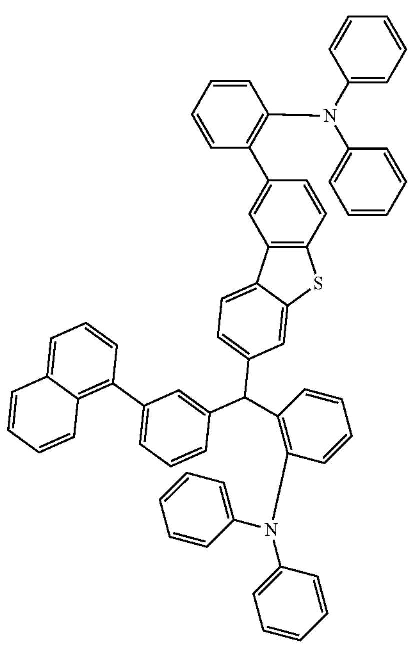
P4-245
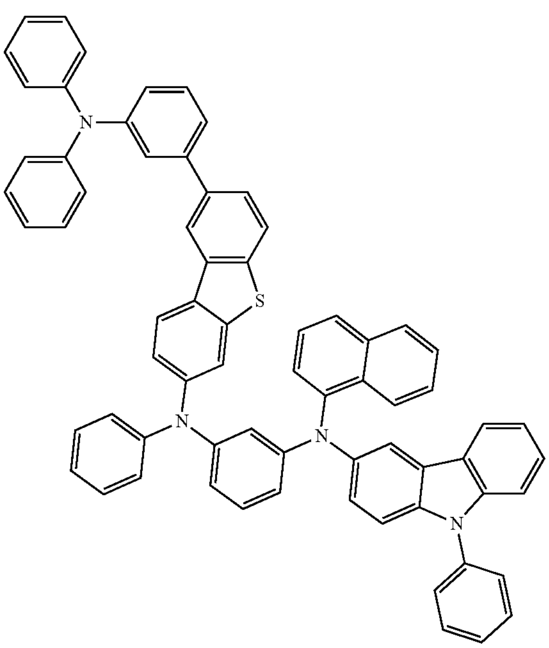

-continued
P4-246
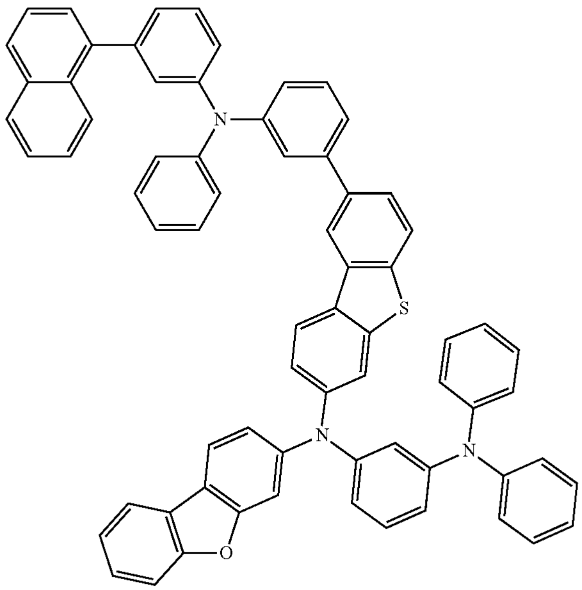
-continued
P4-248
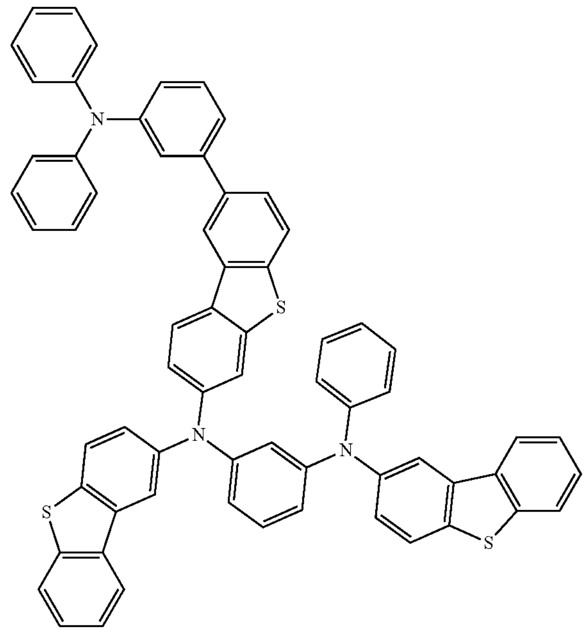
P4-247
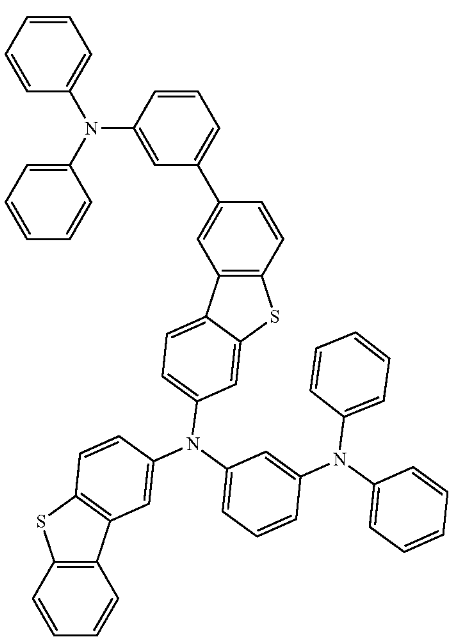
P4-249
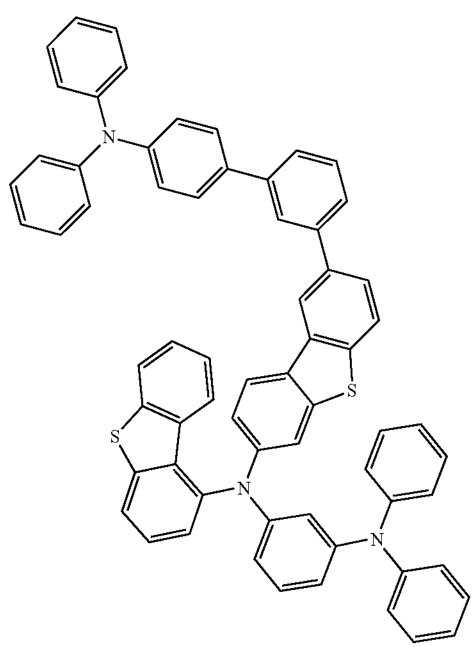

-continued
P4-250
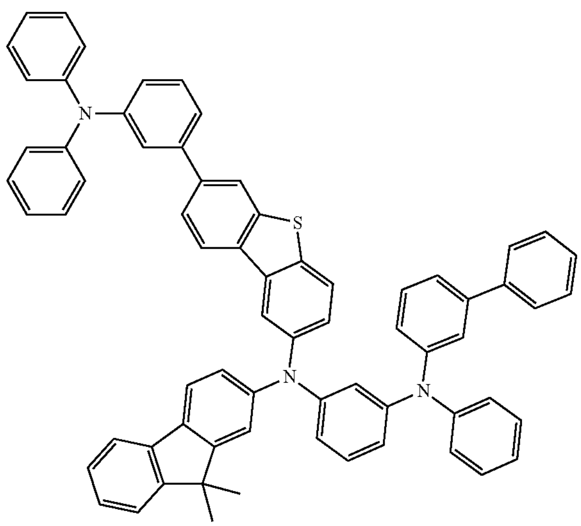
P4-251
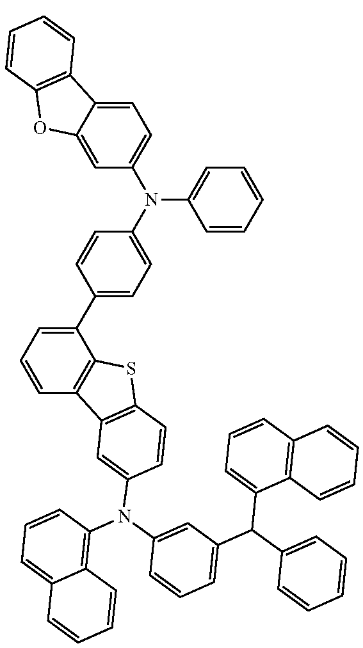
-continued
P4-252
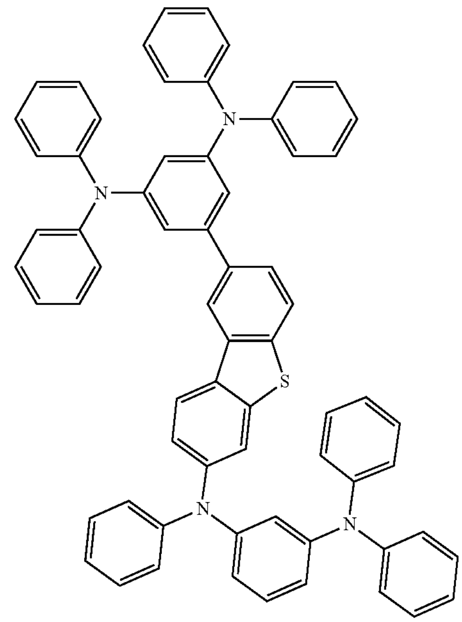
P4-253
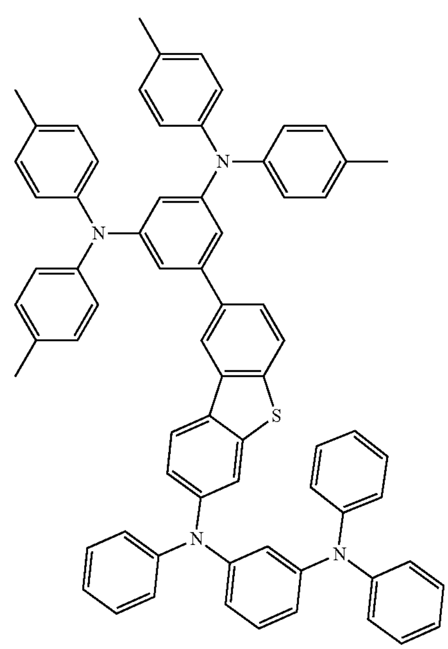

-continued
P4-254
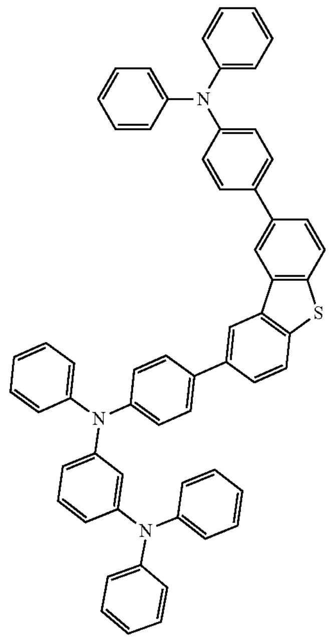
-continued
P4-256
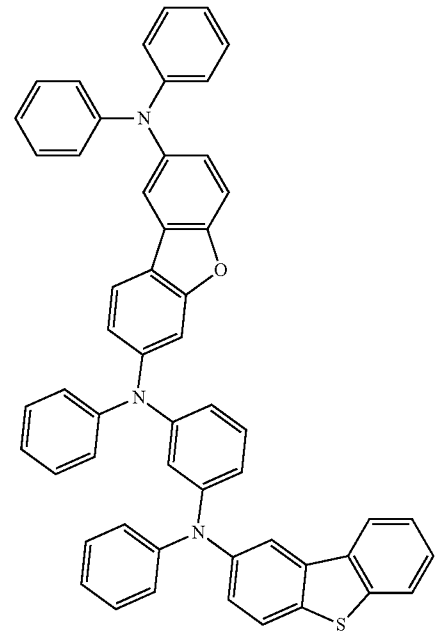
P4-255
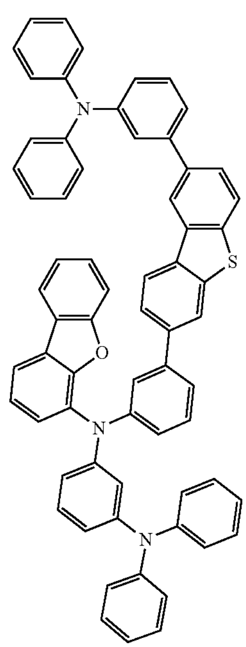
P4-257
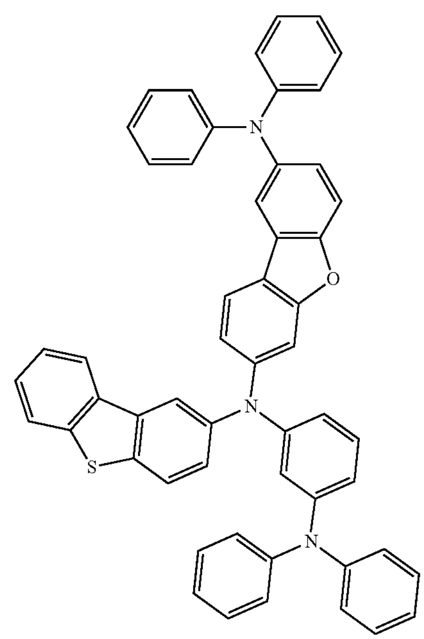

-continued
P4-258
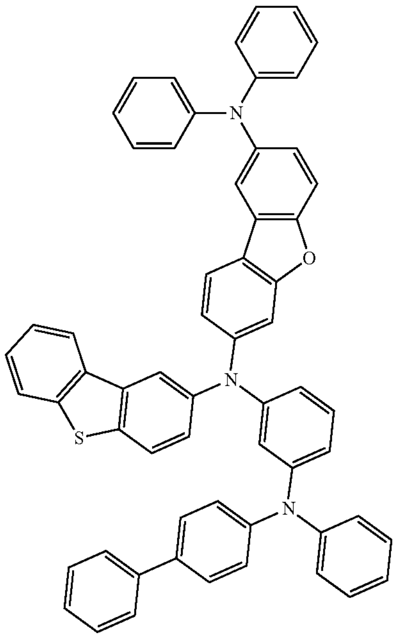
P4-259
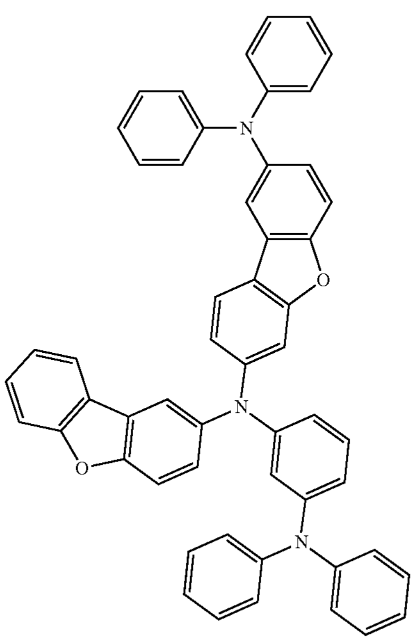
-continued
P4-260
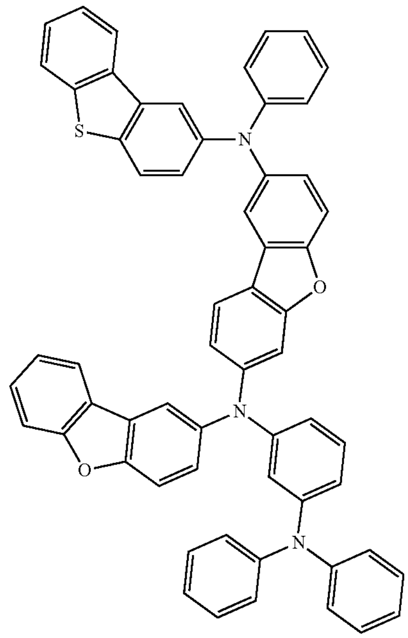
P4-261
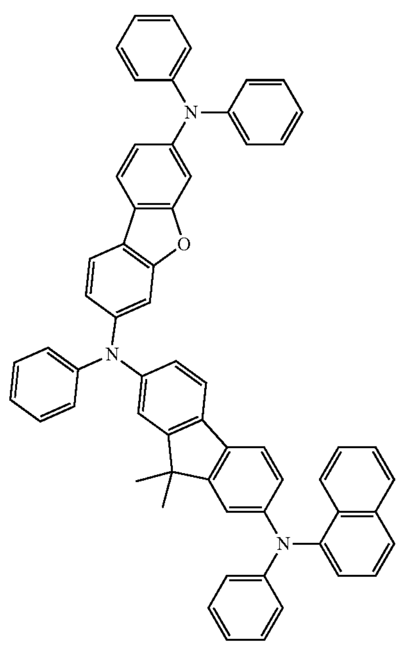

-continued

P4-262

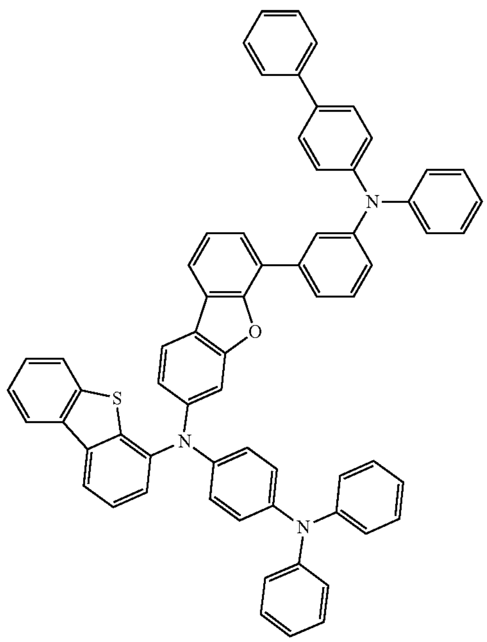

P4-263

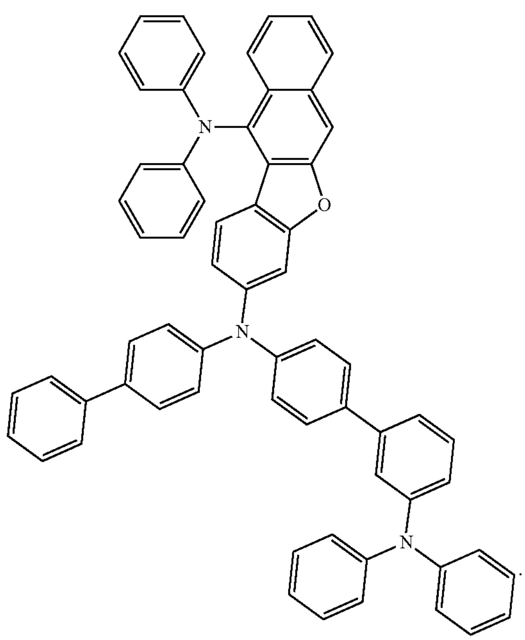

14. The organic electric element of claim 1, wherein at least one of $Ar^1$ to $Ar^7$ and $L^8$ is represented by Formula 3:

<Formula 3>

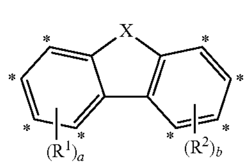

wherein:

* indicates the bonding position,

X is N, N-($L^a$-$Ar^a$), O, S or C(R')(R"), $R^1$, $R^2$, R' and R" are each independently selected from the group consisting of hydrogen, deuterium, halogen, a cyano group, a nitro group, a $C_1$-$C_{20}$ alkylthio group, a $C_1$-$C_{20}$ alkoxy group, a $C_6$-$C_{20}$ aryloxy group, a $C_6$-$C_{20}$ arylthio group, a $C_1$-$C_{20}$ alkyl group, a $C_2$-$C_{20}$ alkenyl group, a $C_2$-$C_{20}$ alkynyl group, a $C_6$-$C_{20}$ aryl group, a fluorenyl group, a $C_2$-$C_{20}$ heterocyclic group containing at least one heteroatom of O, N, S, Si, and P, a $C_3$-$C_{20}$ aliphatic ring group and -L'-N($R_a$)($R_b$), adjacent groups may be linked to each other to form a ring, and R' and R" may be linked to each other to form a ring, a and b are each an integer of 0 to 4, and when each of these is an integer of 2 or more, a plurality of $R_1$ may be the same as or different from each other, and a plurality of $R_2$ may be the same as or different from each other, $L^a$ is selected from the group consisting of a single bond, a $C_6$-$C_{20}$ arylene group, a fluorenylene group, a $C_2$-$C_{20}$ heterocyclic group comprising at least one heteroatom selected from the group consisting of O, N, S, Si and P, and a $C_3$-$C_{20}$ aliphatic ring, $Ar^a$ is selected from the group consisting of a $C_6$-$C_{20}$ aryl group, a fluorenyl group, a $C_2$-$C_{20}$ heterocyclic group comprising at least one heteroatom selected from the group consisting of O, N, S, Si and P, a $C_3$-$C_{20}$ aliphatic ring, and L', $R_a$ and $R_b$ are the same as defined in claim 1.

15. The organic electric element of claim 1, wherein $Ar^2$ and $Ar^3$ are each a $C_6$-$C_{24}$ aryl group when the second emission-auxiliary layer is formed of the compound represented by Formula A-1 or Formula A-2.

16. The organic electric element of claim 1, wherein the light-emitting layer is a red light-emitting layer or a green light-emitting layer.

17. The organic electric element of claim 1, further comprising a layer for improving luminous efficiency, wherein the layer for improving luminous efficiency is formed on one side of both sides of the first electrode or the second electrode that is not in contact with the organic material layer.

18. The organic electric element of claim 1, wherein the organic material layer comprises two or more stacks, and the two or more stacks each comprise a hole transport layer, a light-emitting layer and an electron transport layer formed sequentially on the first electrode.

19. The organic electric element of claim 18, wherein the organic material layer further comprises a charge generation layer formed between the two or more stacks.

20. An electronic device comprising a display device and a control unit for driving the display device, wherein the display device comprises the organic electric element of claim 1.

21. The electronic device of claim 20, wherein the organic electric element is an organic electroluminescent element, an organic solar cell, an organic photo conductor, an organic transistor, an element for monochromatic illumination or a quantum dot display.

* * * * *